US012415265B2

(12) United States Patent
Cristache

(10) Patent No.: US 12,415,265 B2
(45) Date of Patent: Sep. 16, 2025

(54) ROBOTIC POST SYSTEM

(71) Applicant: Lucomm Technologies, Inc., Bellevue, WA (US)

(72) Inventor: Lucian Cristache, Bellevue, WA (US)

(73) Assignee: Lucomm Technologies, Inc., Bellevue, WA (US)

( * ) Notice: Subject to any disclaimer, the term of this patent is extended or adjusted under 35 U.S.C. 154(b) by 379 days.

(21) Appl. No.: 18/120,928

(22) Filed: Mar. 13, 2023

(65) Prior Publication Data

US 2023/0211493 A1 Jul. 6, 2023

Related U.S. Application Data

(63) Continuation-in-part of application No. 18/045,949, filed on Oct. 12, 2022, now Pat. No. 11,648,668, which is a continuation of application No. 17/509,013, filed on Oct. 24, 2021, now Pat. No. 11,472,029, which is a continuation-in-part of application No. 17/201,458, filed on Mar. 15, 2021, now Pat. No. 11,281,982, which is a continuation-in-part of application No. 17/133,567, filed on Dec. 23, 2020, now Pat. No. 11,040,444, which is a continuation-in-part of application No. 16/953,713, filed on Nov. 20, 2020, now Pat. No. 11,421,656, which is a continuation-in-part of application No. 17/076,979, filed on Oct. 22, 2020, now Pat. No. 11,669,913, which is a continuation-in-part of application No. 17/064,198, (Continued)

(51) Int. Cl.

| | |
|---|---|
| ***B25J 9/00*** | (2006.01) |
| ***B25J 9/16*** | (2006.01) |
| ***H05K 5/02*** | (2006.01) |

(52) U.S. Cl.

CPC .......... *B25J 9/0009* (2013.01); *B25J 9/1617* (2013.01); *B25J 9/162* (2013.01); *B25J 9/1635* (2013.01); *B25J 9/1664* (2013.01); *H05K 5/0221* (2013.01)

(58) Field of Classification Search

CPC ........ B25J 9/0009; B25J 9/1617; B25J 9/162; B25J 9/1635; B25J 9/1664; B25J 9/08; H05K 5/0221; G05B 2219/40304; G06N 3/0442; G06N 3/0464; G06N 5/041; G06N 7/01; G06N 20/10; G06N 5/022; G06V 20/52

See application file for complete search history.

(56) References Cited

U.S. PATENT DOCUMENTS

2017/0237146 A1* 8/2017 Dureja .................... H04B 1/38 343/875

FOREIGN PATENT DOCUMENTS

CN 106522643 B * 3/2024 ............. B25J 5/007

OTHER PUBLICATIONS

A Multifunctional Upright Post Robot (Year: 2024).*

* cited by examiner

*Primary Examiner* — Basil T. Jos

(74) *Attorney, Agent, or Firm* — Lowe Graham Jones PLLC

(57) ABSTRACT

A robotic post system includes one or more composable robotic posts each having a processor and a memory. At least one composable post includes a set of modules including one or more pairable latches which is configured to couple and lock with another pairable latch from among another set of modules included on another of the composable posts, such that the composable robotic posts form a composable surface supported by the composable robotic posts.

40 Claims, 90 Drawing Sheets

Related U.S. Application Data filed on Oct. 6, 2020, now Pat. No. 11,604,832, which is a continuation-in-part of application No. 16/999,691, filed on Sep. 8, 2020, now Pat. No. 11,562,565, which is a continuation-in-part of application No. 16/929,680, filed on Jul. 15, 2020, now abandoned, which is a continuation-in-part of application No. 16/891,893, filed on Jun. 3, 2020, which is a continuation-in-part of application No. 16/733,194, filed on Jan. 2, 2020, now Pat. No. 11,745,351.

(60) Provisional application No. 62/941,483, filed on Nov. 27, 2019, provisional application No. 62/931,061, filed on Nov. 5, 2019, provisional application No. 62/866,799, filed on Jun. 26, 2019, provisional application No. 62/828,270, filed on Apr. 2, 2019, provisional application No. 62/821,150, filed on Mar. 20, 2019.

(1)

ROBOTIC POST SYSTEM

FIELD OF THE INVENTION

A robotic post system includes one or more composable robotic posts each having a processor and a memory. At least one composable post includes a set of modules including one or more pairable latches which is configured to couple and lock with another pairable latch from among another set of modules included on another of the composable posts, such that the composable robotic posts form a composable surface supported by the composable robotic posts.

BACKGROUND OF THE INVENTION

There are many cases in which physical devices are used in a variety of settings involving groups of people and/or objects, such as in the formation of posts and lines to demark crowd control areas or permitted pathways for movement. These provide regions which may be fluid, and tend to require manpower to continually reconfigure them. The posts themselves provide opportunities for gathering/inferring/presenting/rendering/conveying information which may be optical, visual, or otherwise. Robotic devices of this sort may serve a variety of purposes in both gathering/inferring/presenting/rendering/conveying information and demarking areas.

SUMMARY OF THE INVENTION

A preferred robotic semantic system may include one or more smart posts each having a base (which may optionally include a plurality of wheels or casters in the case of a mobile smart post), a power section, a trunk section, a structure fixation and manipulation portion, a control section, a clipping area, a portion supporting one or more antennas, and an optical sensor portion. Other modules may be incorporated with such smart posts including a copter module (e.g. for aerial transportation) and a display module (e.g. for providing semantic augmentation).

In one example of the invention, the smart post includes all or a subset of the components listed above in a manner in which they are integrated into a generally unified structure, such as a single pole or post having a hollow center and in which the listed components are attached or inserted into the post. In other versions, the components described above are generally assembled separately, such that they are produced as modules which are joined together to form the post. Thus, each of the above sections or regions or portions may be separately formed modules which are joined together, or may be separate portions of a unitary post or similar structure. In the discussion which follows, for the sake of simplicity each of the foregoing will be referred to as a module; it should be understood, however, that the same description applies to other embodiments in which the module is a portion or section of the smart post, and not necessarily a discrete module. It is to be understood that the post may use any number of modules of any type. In an example, a post may comprise multiple power modules and/or multiple antenna elements modules and/or multiple cameras modules.

One example of the invention includes a semantic robotic system comprising a plurality of communicatively coupled devices which use a plurality of semantic routes and rules and variable semantic coherent inferences based on such routes and rules to allow the devices to perform semantic augmentation.

In some versions, the devices comprise semantic posts.

In some preferred versions, the devices comprise autonomous robotic carriers.

In some examples of the invention, the devices comprise semantic composable modules.

In preferred versions of the invention, the devices comprise semantic units.

In some versions, the semantic system includes a semantic gate.

In some examples, the semantic system comprises a semantic cyber unit.

In a preferred implementation of the invention, the semantic posts implement crowd control.

In one example, the semantic posts implement guiding lanes.

In some examples, the semantic units perform signal conditioning.

In some versions of the invention, the signal conditioning is based on semantic wave conditioning, preferably based on semantic gating.

In some examples, the system performs video processing.

In some examples of the invention, the system performs semantic augmentation on video artifacts.

In preferred versions, the system may form semantic groups of posts and physically connect them through physical movement of the semantic posts motor components.

Preferably, the system uses concern factors in order to determine coherent inferences.

In some examples, the system forms a semantic group based on semantic resonance.

Preferably, the system invalidates a semantic group based on semantic decoherence.

In some examples, the system performs semantic learning based on the inference of semantic resonance.

In some versions, the system performs semantic learning based on the inference of semantic decoherence.

Preferably, the system learns semantic rules based on semantic resonance.

In preferred versions, the system learns damping factor rules. Preferably, the system learns semantic gating rules.

In some examples, the system learns a hysteresis factor based on semantic analysis.

In preferred versions, the system performs semantic augmentation using a variety of augmentation modalities.

In some examples, the system performs semantic augmentation comprising semantic displaying. Preferably, the system performs semantic augmentation on particular devices based on ad-hoc semantic coupling.

In some examples, the system performs semantic augmentation based on challenges and/or inputs.

In some examples, the system performs semantic encryption.

In some examples, the system performs semantic gating based on semantic inferences related to at least one video frame.

In preferred versions, the system uses semantic groups to form composite carriers.

In some examples, the devices comprise semantic meshes.

In some cases, the devices comprise biological sensors. In preferred examples, the biological sensors comprise at least one medical imaging sensor.

BRIEF DESCRIPTION OF THE DRAWINGS

Preferred and alternative examples of the present invention are described in detail below with reference to the following drawings:

FIG. 57C is a perspective view of an alternate fastening profile having a socket/pod.

FIG. 57D is a perspective view of an alternate fastening profile having multiple sockets/pods.

FIG. 57E is a perspective view of a fastening latching profile having multiple sockets in an unlatched position.

FIG. 57F is a perspective view of an alternate fastening latching profile having multiple sockets in a latched position.

FIG. 57G is a perspective view of an alternate fastening latching profile having multiple sockets in an unlatched position.

FIG. 57H is a perspective view of an alternate fastening latching profile having multiple sockets in a latched position.

FIG. 57I is a perspective view of an alternate fastening latching profile having multiple sockets in an unlatched position.

FIG. 57J is a perspective view of an alternate fastening latching profile having multiple sockets in a latched position.

FIG. 57K is a perspective view of an alternate fastening latching profile having multiple sockets in an unlatched position.

FIG. 57L is a perspective view of an alternate fastening latching profile having multiple sockets in a latched position.

FIG. 57M is a perspective view of an extensible fastening latching profile having multiple sockets in an unlatched position.

FIG. 57N is a perspective view of an alternate extensible fastening latching profile having multiple sockets some of which are in a latched position.

DETAILED DESCRIPTION OF THE PREFERRED EMBODIMENT

Figure 1:
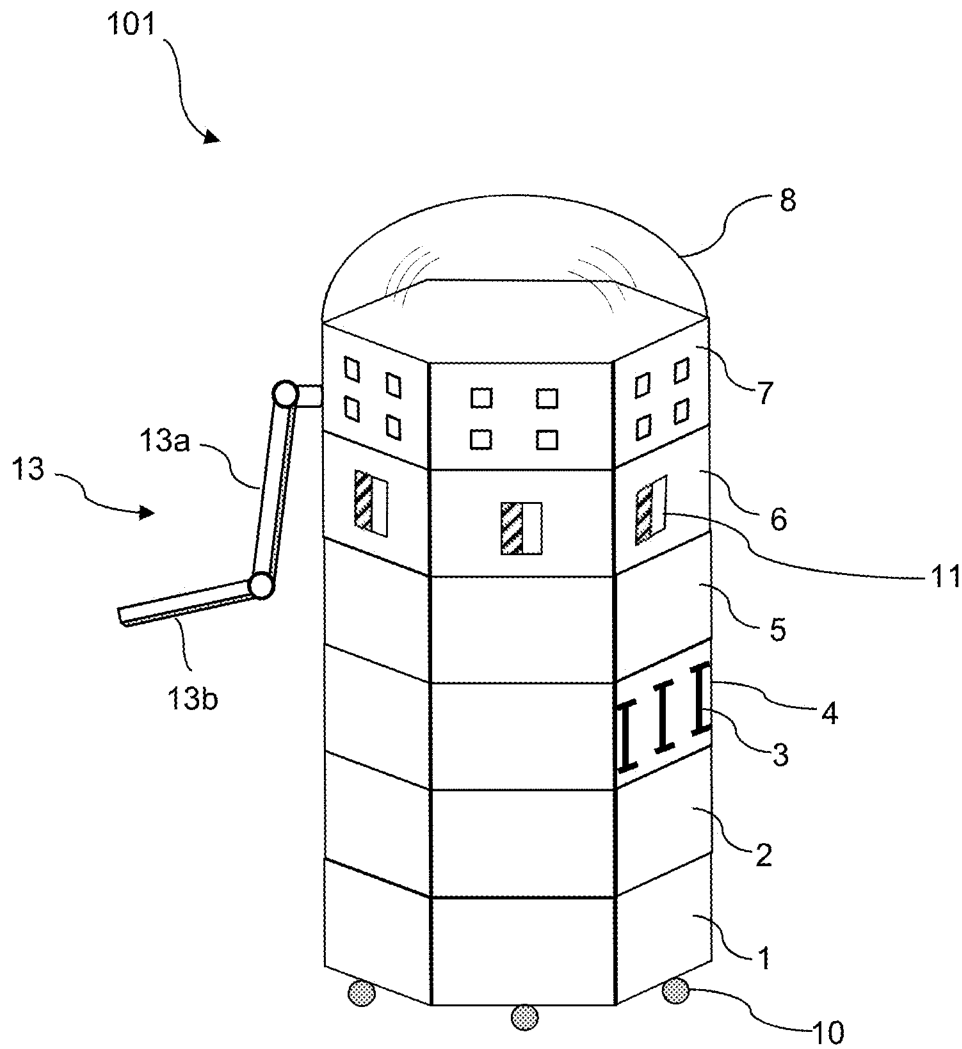
FIG. 1 is a front perspective view of a preferred smart post.

The present invention relates to versatile smart sensing robotic posts, appliances and systems. Such systems can be used in various environments including airports, hospitals, transportation, infrastructure works, automotive, sport venues, intelligent homes and any other circumstances. In one version, the posts serve as stanchions and include clips or connectors for belts or ropes which may optionally be retractable within one or more of the posts. In this form, the smart posts may be used as barricades or crowd control in areas where it is desired to restrict or organize access to certain areas by a population.

In further use cases the smart posts may be used as appliances and smart infrastructure for applications such as robotics, wireless communications, security, transportation systems, scouting, patrolling etc.

The system may perform semantic augmentation, wherein the system uses semantic analysis for inferring/presenting/rendering/conveying/gathering information in optimal ways and/or using particular modalities based on circumstances, challenges, users and/or profiles.

In further application the smart posts are used for semantic augmentation via incorporated displays, speakers, actuation and other I/O mechanisms. In some examples, a display is mounted on the post and/or top of the post.

In further examples, the smart posts may comprise smart pop-up signs which allow traffic control (e.g. REDUCED SPEED, CONTROLLED SPEED etc.). Alternatively, or in addition, the posts may comprise other semantic augmentation capabilities and/or outputs. It is to be understood that the signs/posts may register their capability semantics on the semantic system and the system controls them based on semantic augmentation and/or analysis including semantic time management (e.g. REDUCED SPEED UNTIL ACCIDENT CLEARS, CONTROLLED SPEED UNTIL TRAFFIC FLOW IS NORMAL etc.).

The preferred smart posts (or appliances) may move independently or may be installed on moving vehicles and any other moving structures; alternatively, or in addition they may be installed on fixed structures such as walls, floors, and so on for sensing and control purposes.

Typically, a preferred post has sensing elements including at least a vision element such as a camera, and an array of antenna elements receiving and/or radiating electromagnetic radiation. The electromagnetic radiation may use various frequency spectrums including but not limited to low frequency, ultra-high frequency, microwave, terahertz, optical and so on. The camera and/or vision element may operate in visual, infrared and any other optical spectrum. It is to be understood that sensing elements may provide time of flight (TOF) capabilities.

In addition to electromagnetic energy sensing the smart robotic posts may include other sensing modalities (e.g. microphones) and/or any other analog and/or digital sensors and transducers used for other environmental measurements and detections (e.g. pressure, sound, temperature, motion, acceleration, orientation, velocity etc.). It is to be understood that such elements may be disposed in an arrangement about the smart post to enable detection of environmental conditions or parameters in geographic areas or zones about the post.

The system may use environment profiling and learning based on corroborating radiofrequency energy returns with optical (e.g. camera) sensing wherein both modalities sense conditions in the semantic model (e.g. at various endpoints) and create semantic artifacts (e.g. semantic groups, semantic routes) based on sensed conditions and semantic analysis. In an example the system determines artifacts through camera frame sensing and/or inference operating in optical spectrum and groups them with artifacts sensed and/or inferred through antennas operating in the microwave spectrum. Thus, the system may be very particular on conditions and inferences that resemble learning groups and patterns.

As depicted in FIG. 1 a preferred smart post 101 comprises a base 1 (which may optionally include a plurality of wheels or casters 10 in the case of a mobile smart post), a power section 2, a trunk section 3, a structure fixation and manipulation portion 4, a control section 5, a clipping area 6, a portion supporting one or more antennas 7, and an optical sensor portion 8. While the illustrated embodiment shows a hexagonal design (as viewed in a horizontal cross section taken through a vertical axis, in which the vertical axis extends centrally from the base to the optical sensor portion) it is to be understood that it can be shaped differently (squared, pentagonal, octagonal, circular etc. in other versions. Also, other modules may be incorporated with such smart posts including a copter module (e.g. for aerial transportation) and a display module (e.g. for providing semantic augmentation).

In one example of the invention, the smart post includes all or a subset of the components listed above and illustrated in FIG. 1 in a manner in which they are integrated into a generally unified structure, such as a single pole or post having a hollow center and in which the listed components are attached or inserted into the post. In other versions, the components described above are generally assembled separately, such that they are produced as modules which are joined together to form the post. Thus, each of the above sections or regions or portions may be separately formed modules which are joined together, or may be separate portions of a unitary post or similar structure. In the discussion which follows, for the sake of simplicity each of the foregoing will be referred to as a module; it should be understood, however, that the same description applies to other embodiments in which the module is a portion or section of the smart post, and not necessarily a discrete module. It is to be understood that the post may use any number of modules of any type. In an example, a post may comprise multiple power modules and/or multiple antenna elements modules and/or multiple cameras modules.

The base 1 may comprise wheels 10 and its movement be controlled via motors, actuators and other control components or interfaces by a computer (or the equivalent, such as a processor having a memory and programming instructions) embedded in the robotic post. The standing base may comprise suspension (e.g. springs, shock absorbers, coils, coil-overs, piezo components etc.) and attachment mechanisms for wheels or for attaching to a structure (e.g. automobile).

Figure 6A:
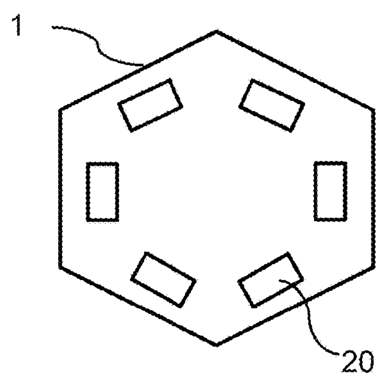
FIG. 6A is a bottom plan view of a preferred standing and moving base.
Figure 6B:
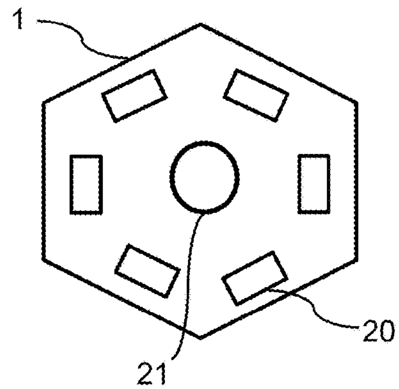
FIG. 6B is a bottom plan view of an alternate preferred standing and moving base.
Figure 6C:
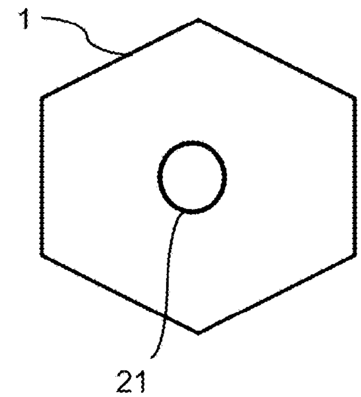
FIG. 6C is a bottom plan view of another alternate preferred standing and moving base.

FIGS. 6A-C illustrate bottom plan views of the standing and moving base 1 in various embodiments comprising attaching mechanisms 20 and/or driving wheels 21. The (driving) wheel or wheels may mount on attaching mechanisms and/or be retractable, tension-able and/or spring-able (e.g. for using, holding and releasing energy for achieving particular compressions, extensions and/or motions); in an example, the post may use any three wheels, each on any non-adjoining edge/segment of the hexagonal shaped base while the other wheels may be inactivated and/or retracted. Analogously the driving wheels may function on similar principles (e.g. activate particular ones based on (semantic) circumstances and/or semantic groups). Further, the mounts (wheel mounts, ball type mounts, module connecting mounts, band connecting mounts etc.) may be controlled (e.g. by compression, extension etc.) by semantic actuation based on observed circumstances. In an example, some mounts' compression is stiffened and others loosened when the system uses, observes and/or infers a trajectory which would determine an 80 HARD LEFT LEAN semantic; further, the 80 HARD LEFT LEAN may use further routes such as WHEEL MOUNT GROUP LEFT 75 COMPRESSION, WHEEL MOUNT GROUP RIGHT 25 COMPRESSION.

In further examples, at least two post rectangular bases comprise each four wheels in a rectangular pattern one for each edge; when joined on one of the lateral edge faces the base allows a combined support and thus the center of gravity moves towards the joining edge face. Instead of using the combined eight wheels for movement the combined post may use any inferred particular group from the combined base (e.g. in a triangular pattern, rectangular pattern etc.) and thus adapting to conditions, movements and efficiency.

Each module may comprise a computer or controller, memory or other computing units. While illustrated as separate modules, in other versions one or more physical modules and/or their functionality may fuse or be distributed among fused modules. For example, the standing base and moving module 1 may be fitted with a power supply such as one or more Li-Ion batteries, and therefore may serve as a single consolidated base and power supply module rather than two separate modules. In other embodiments, the power, control and antenna elements are combined in a single module rather than separate modules joined together. In yet other embodiments the trunk and antenna panels extend to the whole surface of the post.

The power module may comprise batteries (e.g. Li-Ion), fuel cells, super capacitors and/or other energy storage components. The electrical storage components may be charged via physical plug-in, wireless or any other charging technique.

As explained, multiple modules, whether physical or logical may fuse into a larger trunk module. In some examples such fused trunk module is telescopic and extensible, facilitating dynamic reconfiguration settings.

In some embodiments the standing base module and the trunk module are telescopic thus allowing height adjustment. The telescopic movement may be controlled through electric motors powered through the power module and controlled by the control module.

Figure 7:
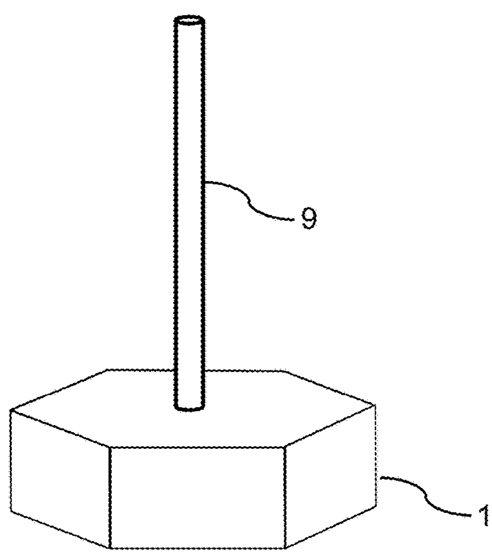
FIG. 7 is a front perspective view of a preferred module having a central post.
Figure 15:
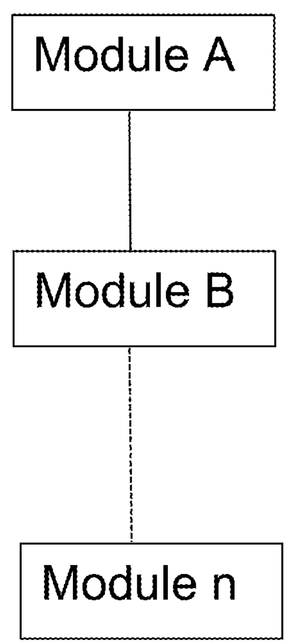
FIG. 15 is a representative view illustrating a combination of modules A through n which may combine to form a smart post.

In some versions, the modules may be carried on a supporting post or frame, which may be configured as a central post defining a central vertical axis for the smart post. The modules may be attached to the post 9, as shown in FIG. 7, through a variety of mechanism with the preferred version being that the post comprises a frame on which modules slide, attach and lock/unlock (e.g. FIG. 7 middle column 9). In some versions the supporting post or frame comprises backplanes, connectors and/or communication buses; when slide into place the modules connect (e.g. via connectors) to the backplane, connection and/or communication bus, thus allowing flexible module interconnects (e.g. FIG. 15, showing a plurality of modules which includes Module A, Module B, and continuing through Module n).

Alternatively, or in addition, in other embodiments the modules comprise interlocking and interconnect features such as tongues and grooves, pegs and cavities, tabs and slots and/or other interconnect systems that allow the modules to lock to each other while being stacked. Interconnect mechanisms allow the modules to be in signal communication via a composable bus formed by interconnecting buses of each module. It is to be understood that the buses may comprise electrical and/or optical components.

In some embodiments a collection of any types of modules may also communicate wirelessly via transmit/receive components, antennas and/or panels embedded in each module. In some embodiments the communication between modules take place in the same post and/or other posts.

The modules may be in signal communication and communicably coupled for various purposes including for transmit/receives command signals via buses, providing status information (e.g. battery charging status), semantic augmentation (e.g. airline name, flight information, routing information etc.) and so forth. Post to post communication may also occur in such situations and further when the system infers, groups and/or deploy posts and units in particular configurations and/or missions.

In an example, the control module provides commands to actuators incorporated in the base module for guiding the posts through environment. Further in the example the control module may infer semantic routes such as GO TO LOCATION A and further TURN LEFT UNTIL ON THE DIRECTION OF LOCATION A and further when detecting a curb MODERATELY ACCELERATE TO CURB AND JUMP. The system may further infer from JUMP and HIGH CURB to LOAD SPRING 1 HIGH (e.g. commanding driveline suspension spring 1 to load high tension via electrical motor actuation) and RELEASE SPRING 10 (e.g. high energy release) once HIGH CURB CLOSE. As mentioned, the control units command actuation based on such commands (e.g. commands electrical motors of the base module driveline, controls voltages, currents and/or electromagnetic fluxes/properties in time of such components etc.). While the previous example has been referred to communications between modules of the same post it is to be understood that similar use cases for post units and/or groups may require inter post communication and command whether master-master and/or master-slave.

In some examples the carriers command semantic groups of posts and/or modules in order to achieve particular movements. In an example, a composite 3×3 carrier may need to climb a stair and as such it may command rows of posts independently at particular times for achieving the goals.

The system elevates at least the first row of posts from the ground once in proximity of a stair and further moves forward and elevates further rows in order to climb the stairs while always maintaining the load initial posture (e.g. horizontal agnostic).

In an example of a climbing system the robotic system may be considered as formed from a number of rows and columns rows and columns and groups thereof. Thus, when climbing a stair at least the front upper row of modules moves upward (e.g. via telescopic means) and slide forward and rests at a first time on at least the second stair up from the current position. Once in position the lower level horizontal rows move in position forward on the subsequent stairs under the upper row position's stairs and generate telescopic lift for the upper level horizontal rows that will detach from the upper stair's, slide up and forward to attach to higher upper stairs and generate support for the ensemble allowing the lower level rows to detach from the supporting position and slide up and forward to upper stairs. While from the horizontal rows point of view stairs ascent is based on row movement such as slide up and forward, from the vertical columns point of view the movement is telescopic and/or retractable to elevate the horizontal rows. Analogously with stair ascent, stair descent is based on moving the vertical columns in a slide forward and down movement while the horizontal rows use a telescopic and/or retractable movement to slide forward the vertical columns. It is to be understood that in some cases the carrier may turn over on one side (e.g. such a vertical row become horizontal and vice-versa) and/or reconfigure its layout for the particular mission (e.g. ASCENT, DESCENT etc.).

While in the example we may have referred to "row" and/or "column" it is to be understood that they may be used interchangeably with "semantic group of rows" and/or "semantic group of columns" and further, in a hierarchical manner, of semantic groups. The selection of rows and/or columns of sliding, telescoping, retracting and/or lifting elements may be based on semantic group inferencing which may also take in consideration the lift weight and height (e.g. weight of carrier and load, height of load, height of telescoping areas, height of stairs etc.). Other factors such as surface traction grip, environment conditions and other factors may also come into effect.

In other examples, the semantic posts may use group leverage to achieve goals such as changing positions, lifting, jumping, getting straight and/or out of the ground. In an example, at least one post is sideways on the ground (maybe because it was pushed to the ground by external factors) and other posts are used to lift the fallen post and move it back to vertical position. In further examples at least two posts have fallen, and they leverage each other to lift to vertical position based on side by side maneuvering, latching, hooking, lifting, pushing and/or pulling.

It is to be understood that in some cases the post deployments based on semantic routes may be based on the semantics associated with various locations and/or other information. In an example the system detects that the area of GATE A having a scheduled DREAMLINE AIRLINE flight is DELAYED or boards later and hence smart posts at the gate may be re-deployed to other locations and areas based for example on a reward-based system. In such a system, the posts are deployed to locations associated with semantics having high rewards and incentives while pondering the total rewards (e.g. via opposite sign weights and/or rewards) with the accessibility, deployment and routing semantics in the semantic network model. In an example, the system infers a goal of redeploying the posts to a HAZARDOUS area (e.g. area B and/or via endpoint associated with B) which may entail high rewards in a particular circumstance however, routes and/or accessibility to the area are not available immediately (or maybe too busy) and/or maybe power scarcely available and thus increasing risk and/or lowering the total rewards of evaluating pursuing the goal via location endpoint B. In addition, the semantic inference allows goals, rewards and/or semantic routes to be adjusted and/or selected based on further semantic routes, goals and/or rewards (e.g. MINIMIZE COST AND RISK, MOVE FAST, MAXIMIZE POWER CHARGING etc.). It is to be understood that the semantic routes and/or goals may be hierarchical and compositional with higher-level abstraction semantic routes and/or goals comprising lower-level abstraction semantic routes and/or goals in a hierarchical and/or compositional fashion. Such hierarchy may be determined and/or mapped to hierarchies and topologies in hierarchical semantic network models thus allowing the semantic inference to pursue selectively (e.g. based on higher level endpoints comprising a lower level sub-model comprising a selection of endpoints and/or links) and hierarchically from lower to higher and higher to lower abstraction (e.g. endpoint) levels.

While in the previous examples a rewards-based system has been exemplified, it is to be understood that analogously other factors and indicators may be used for inferring, setting and/or evaluating semantic routes and/or goals (e.g. based on risk, cost). Further, such factors and indicators may influence one another via semantic inference (e.g. 10 RISK infers HIGH COST, HIGH COST infers HIGH RISK, HIGH RISK infers HIGH PAY REWARD, high reward goals infer high risk routes etc.).

The system may perform semantic factorization wherein a quantifiable (semantic) factor/indicator associated with a semantic artifact is adjusted based on semantic inference/analysis. It is understood that when referring to "factorization" in this disclosure it may refer to "semantic factorization". Semantic factorization techniques may be used such as explained in this application (e.g. based on semantic time management, decaying, indexing, resonance, (entanglement) entropy, divergence, damping etc.).

Semantic factorization may entail semantic decaying.

Semantic decaying occurs when a quantifiable factor/indicator associated with a semantic artifact decays or varies in time, most of the time tending to 0; as such, if the parameter is negative decaying is associated with increases in the semantic factor value and if the factor is positive decaying is associated with decreases in factor's value. Sometimes, when the semantic decays completely (e.g. associate factor is 0) the semantic may be inactivated, invalidated or disposed and not considered for being assigned to an artifact, semantic route, goal, semantic rule, semantic model and/or inference; further, based on the same principles the semantic is used in semantic group inference and membership.

Semantic factors may be associated with values of control voltages and currents in analog and/or digital components and blocks. Analogously, other material and further emission, dispersive, diffusive and/or quantum properties may be controlled (e.g. electromagnetic flux, conductivity, photon/photoelectron emission, polarization, etc.). Decaying and semantic factors may be inferred and learned with semantic analysis. In some examples the system learns decaying and semantic factors for semantic rules and/or semantic routes.

Figure 4:
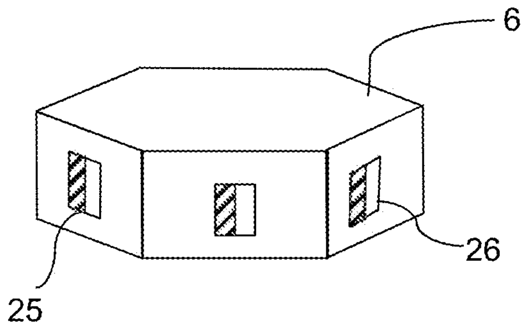
FIG. 4 is a front perspective view of a preferred clipping module for a preferred smart post.

The clipping module 6 (see FIG. 4) comprises bands and clips that can be used to hook up or pair two posts, such as by the attachment of opposite ends of a band, rope or belt to two separate posts. Each clip module has at least one band (see FIG. 4 showing one end of a band having a clip 25 attached, in which the band is retracted within the module) such that the attached clip or hook that can be used to clip together at least two posts by joining to a band clip insert or attachment point 26 on another post. The bands can therefore be extended to form a perimeter by moving and guiding the posts to the desired location. Once coupled or hooked the posts may move, thus extending the clipped bands and creating various configurations, potentially delimitating semantic zones (e.g. traveler or automotive guiding lanes, hazards emergency lanes, parking areas/lanes/space, work zones etc.). It is to be understood that while bands are exemplified for simplicity, other types of physical couplings may be used such as foldable barriers, nets etc. Alternatively, or in addition to the physical couplings the posts system may be performing the access control and/or zoning function via physical movement and/or sensing means (e.g. laser, vision, radiofrequency and/or other modalities).

Analogously, when the posts need detaching, they may move towards each other in order to detach the band clips at a closer distance in order to avoid band dangling. In other examples the posts detach while at farther distances and the band rolls attenuate the retraction movement through amortization or controlled retraction (e.g. based on springs and/or electrical means). It is to be understood that the semantic posts may perform clipping/unclipping, unfolding/folding of the bands, barricades and/or nets once they are commanded to allow/deny/control access.

In some examples, the posts may not move to each other in order to perform clipping but rather perform the shooting of drive threads, ropes and/or cables towards each other that may hook once colliding in the air (e.g. male-female type of hooking, where one thread is a male connector and the other thread is a female connector). Once disconnecting such threads, ropes and/or cables may have mechanisms to manipulate the end hooks and latches.

Figure 5A:
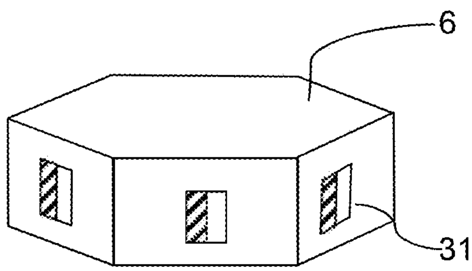
FIG. 5A is a front perspective view of an alternate clipping module for a preferred smart post.
Figure 5B:
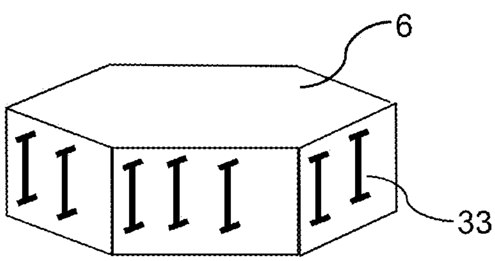
FIG. 5B is a front perspective view of another alternate clipping module for a preferred smart post.
Figure 5C:
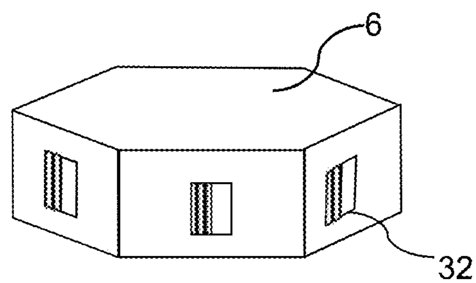
FIG. 5C is a front perspective view of another alternate clipping module for a preferred smart post.

FIGS. 5A-C show further exemplary preferred embodiments for coupling mechanisms to affix belts or bands from one post to another post. The coupling mechanism between two clips or hooks may comprise a sliding mechanism 31, insertion lock mechanism 32, hook lock mechanism 33, turning mechanism, plug and lock mechanism, latching an any other techniques. The sliding mechanism comprises hooks, clips or grooves that slide into each other via horizontal or vertical movement. The plug and lock mechanism may comprise plugs that lock into each other once connected. In a similar way the latching mechanism latches the hooks once connected. It is to be understood that any of these techniques use mechanical and/or electrical means for such clippings and latches and can be combined in any configuration.

The semantic posts may comprise a (foldable) barrier mechanisms and/or modules. The barrier mechanism/module may comprise/control multiple barrier segments (e.g. from plastic, metal, fabric and/or any other material) which can be folded and/or extended thus forming shorter or longer barriers used to adapt to (semantic) access control needs (e.g. entry points, controlled areas/endpoints etc.). Such barriers may comprise segments with grooves which slide, extend and/or retract within each other with the sliding movement being controlled via (electro)magnets, toothed rails, strings and/or cables. The barrier mechanism/module allows the barrier to lift/raise or drop based on semantic access control. It is to be understood that the barrier segments may be folded and/or stowed thus shortening the barrier to a particular/minimum size. Further, the barrier may be stowed along the vertical length of the posts; further, the (compacted) barrier may slide down along the vertical side of the post and thus adjusting the height of the post to an optimal/minimum height.

The barriers from at least two semantic posts may join and/or lock together using joining and/or locking mechanisms; such mechanisms may comprise mechanical and/or magnetic components. In some examples, the tips of the barriers comprise magnets which when in vicinity attract and lock together. Magnetism in the components may be controlled by semantic units (e.g. via a voltage, current, inductance, magnetic flux etc.) and thus controlling the timing (e.g. by time management) and/or intensity of the attracting and/or repelling magnetic fields.

Two joining posts may use joining/composite capability/capabilities for communication, networking and/or energy transfer. In some examples, the bands, clips, barriers and their latches/connections/tips incorporate feed cables and connections.

It is to be understood that while in some examples the posts comprise capabilities such as joining and/or delimiting bands, barriers, pop-up signs and so forth in other examples they may lack such capabilities.

The semantic zoning and access control may be implemented by physical moving and positioning of the posts (e.g. as blocking posts, delimiting posts, guiding posts, semantic zoning posts etc.). In some examples the posts may or may not comprise joining and/or delimiting elements.

The semantic zoning and/or access control can be based on the augmentation provided via pop-up signs (e.g. capabilities, rise/fall commands etc.), displays (modules) attached to the semantic posts and/or other semantic fluxes.

The semantic posts may be controlled via a centralized and/or distributed computer system where the functionality is distributed among pluralities of control modules and/or other external computers, computer banks or clouds. In some examples the distributed computer system is organized in a hierarchical manner.

The power module may comprise a power hooking mechanism that is used to plug-in and recharge the power module. It is to be understood that the plug-in may be automatic based on sensing and robotic capabilities. In an example, the charge socket is localized via sensing and the system guides a post's rechargeable plug via orientation and/or routing in a semantic network model where at least one endpoint is mapped to the location of the charge socket; further, at lower endpoint levels other location based features and/or shapes of the socket are mapped and used with orientation and routing. It is to be understood that the location of the charge socket may be mapped and detected via any available sensing technique or a combination of those. In some examples, shapes, sockets and/or its features are detected via camera sensing (e.g. frame processing based on deep learning, semantic segmentation, semantic analysis etc.). Further, the power module can be attached or detached by sliding and/or lifting the assembly (e.g. other modules, trunk) on top of it, potentially using the attached hooks and further lifting the power module and replacing it with another one.

The structure fixation and manipulation module 4 is used to attach the smart post to various fixed and mobile structures including walls and bases in any orientation. In some examples the base is a structure of a car, drone, aircraft or any other mobile structures. In similar ways with the clipping the fixation module it may incorporate various latching, hooking and clipping mechanisms for attachment that may be present sideways and/or underneath. Further, the latching and locking mechanism may allow the movement and orientation of posts in various angles.

Figure 11:
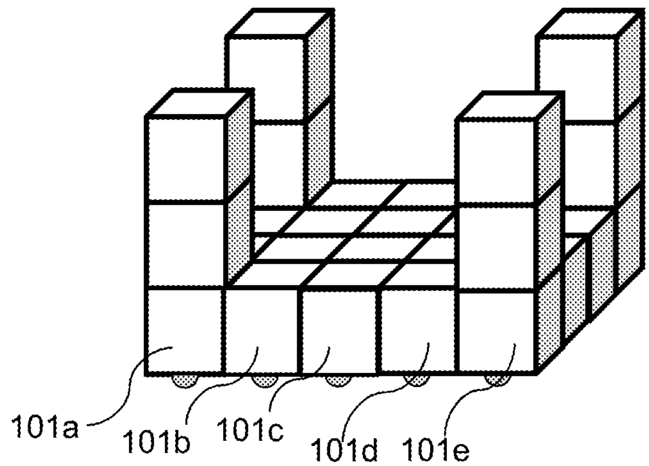
FIG. 11 illustrates an example of a configuration of a plurality of smart posts forming a configuration of smart carriers.
Figure 12:
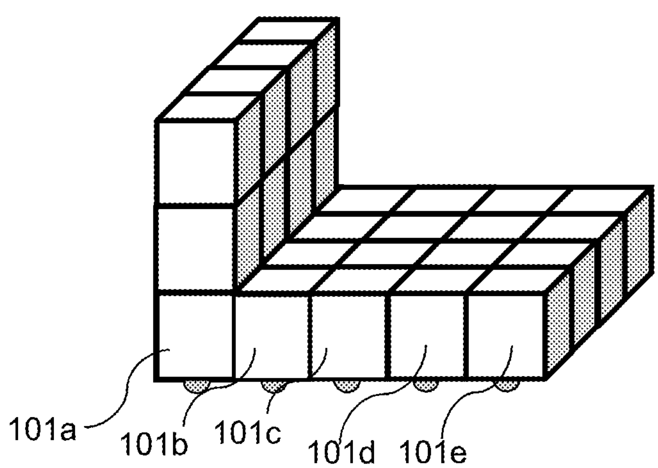
FIG. 12 illustrates an alternate example of a configuration of a plurality of smart posts forming a configuration of smart carriers.

In some embodiments the clipping module and/or the structure fixation and manipulation module are used to compose larger formations and/or structures of smart posts. In some examples, those formations are based on semantic inference and semantic groups of posts. In an example, a group of smart semantic posts are joined together to form a larger structure (e.g. a larger transportation system, trailer unit, bed truck, vehicle, drone etc.). It is to be understood that the composable structure can comprise a variety of configurations of the smart posts; for example there may be posts in the structure comprising sensing units such as optical module and/or antenna elements module while other posts in the structure (e.g. used to compose a flat transportation bed) may not have such capabilities (e.g. comprise a combination of the moving base module, power module, clipping and fixation module, control module and/or trunk module including any telescopic capabilities). FIGS. 11 and 12 present example of such configurations where smart posts (for example, posts 101*a* through 101*e*; for simplicity, not all posts shown in FIG. 11 or 12 are labeled) are used in conjunction to form various configurations of smart carriers. As shown in those examples the system composes the sensing able posts with reduced posts (lacking some sensing capabilities) in order to form smart flat carrier beds.

Such composable configurations may be based on goals, missions and rewards thus, the system selecting the optimal configuration. In further examples, mission collaboration may occur where goals and/or sub-goals are split, challenged and/or distributed between modules, posts and/or semantic fluxes by semantic leadership.

In a similar manner of posts structure composability other smart carriers, hunters or formations may be achieved. In an example a group of posts are used to hook up and carry a net (e.g. for drone neutralization goals and purposes). In other examples, a group of posts hook up and carry drone neutralization measures (e.g. arrow launchers, high powered lasers, mini-drones etc.). In some examples the system deems an area as needed to be cleaned up of drones and based on the goal the system launches ANTI DRONE and DRONE DESTROY missions and routes. Such missions may be inferred for example based on user or flux feedback and/or input (e.g. mark an area, endpoint and/or trajectory as CLEAN OF DRONES IN 20 MINUTES etc.). It is to be understood that those missions take in consideration the chain of authorization and/or hierarchy (e.g. of users and/or fluxes) in order to avoid potential conflicts. In an example, an area-based endpoint EC encompasses area-based locations EA and EB. When semantics and missions from a higher-level authorization is marked and/or established for such areas they will take leadership over lower authorization levels; the system pursues goal based inference on such missions with leadership associated to higher level authorization semantics, missions and groups; in the case of increased superposition (e.g. potentially based on a entropy and/or superposition indicator, factor, rate and/or budgets) the system may perform superposition reduction by asking for additional feedback (e.g. from a user, identity or semantic group based on authorization level, flux etc.) and/or assigning additional bias based on profiles and/or preferences. If no feedback or profile is available, the system may perform the missions based on higher levels policies and/or hard route semantic artifacts. It is to be understood that the authorization levels may be inferred for various semantic identities, semantic groups and/or semantic profiles based on semantic analysis and leadership. Thus, in a first context (e.g. as determined by a semantic view, route etc.) a semantic group A might be assigned a higher authorization level than semantic group B while in a second context the group A might be assigned a lower authorization level. In addition, or alternatively, the authorization levels (access control) are assigned based on inferred semantic artifacts (e.g. semantic routes, semantic profiles etc.) and the system uses the semantic artifacts and further projections for further inference and validation of authenticity.

A confusion semantic factor may be inferred based on the incoherent and/or coherent superposition factors, indicators, rate and/or budgets wherein the confusion factor is high if the incoherent superposition is high and/or coherent superposition is low. Analogously, the confusion factor is low when the incoherent superposition is low and/or coherent superposition is high.

The system may prefer coherent semantic artifacts during analysis when the confusion factors are high and may use more incoherent semantic artifacts when the confusion factors are low.

Allowed confusion factors thresholds, intervals and/or budgets may be inferred, ingested, adjusted and/or predefined by inputs from users, semantic fluxes and semantic analysis. Confusion factor semantic intervals may be associated with semantic artifacts (e.g. semantic routes and/or rules) thus allowing the system to apply such artifacts when the system exhibit a particular confusion range. In some examples, the higher the confusion factor, the higher priority based on leadership and/or factorization have the rules that are associated with such intervals (hard routes and rules may have explicitly or implicitly the highest priority).

In cases where the allowed confusion is high and/or unbounded the system may exhibit an undetermined (time) interval of confusion and thus the system may use further semantic rules (e.g. access control, time management rules) to restrict and/or bound the confusion interval.

The system may adjust factors, budgets and or quanta in order to control the inference towards goals and/or keep (goal) semantic inference within a semantic interval.

The system may infer DO NOT semantic artifacts (e.g. rules, routes, constraints etc.) associated with the semantic artifacts which generated (increase in) confusion (in semantic views).

Increases in confusion may be assessed based on thresholds, rate of increase, mapped overlays, indexing, hysteresis etc.

In further examples, when semantic areas intersect, overlap and/or are contained, the system may use the semantic areas depth axis (e.g. Z axis) attribute for hierarchy determination and for establishing the leadership semantics. In one example, if the area associated to endpoint EB is specified on the Z axis on top of area associated to EC, the system may provide more leadership bias towards semantic artifacts associated with higher placement on the Z axis, in this case EB. While the example specifies the positive bias towards higher Z axis factors it is to be understood that such biases may be configurable or provided as part of semantic profiles (e.g. associated with users, identities, semantic groups, semantic artifacts etc.).

It is understood that the authorization rights and levels may be based or assigned on hierarchy levels and/or artifacts in the semantic model. For example, the right for DRONE SHUTDOWN related artifacts may be assigned to particular semantic groups (e.g. of users, semantic posts, endpoints etc.). While the previous example relates to a more specific application it is to be understood that the semantic network model inference may be guided by semantic superposition factors and/or biases provided in the context of semantic profiles and/or authorization at various hierarchy levels.

In some examples two endpoints may be associated with two zones which overlap (e.g. by coordinates, geographically, semantically etc.; two property/facility areas overlapping on a no man's land zone between two properties mapped to endpoints). Further, if the endpoints are associated with semantics and narratives and the endpoints are associated each with various semantic fluxes and/or agreements then the system may infer the intersection endpoint (a third endpoint) as an area associated with an inferred agreement (e.g. based on strong factorization) between the two semantic fluxes and/or agreements based on semantic analysis. Further, at least one endpoint associated and/or comprising the first and the second (and potentially the third) endpoints and based on the reunion of those zones may be associated with the semantics, agreements, fluxes and/or narratives of/at the two endpoints plus additional semantics, agreements, fluxes and/or narratives resulting from semantic analysis on such composable artifacts. Thus, the system infers and maintain hierarchical structures of semantic artifacts which help assign the law of the land and/or agreements to various mappings. It is to be understood that law of the land and/or agreements may be composed and comprise various semantic artifacts associated and/or particularized with semantic groups, semantic identities and so forth; further semantic analysis of the composable laws of the land may be based on semantic groups and/or semantic identities (e.g. TRUCK OPERATORS, NURSE/S HOLDING A NEWSPAPER, JOHN'S DE LOREAN etc.). It is to be observed that the semantic identities (e.g. NURSE/S HOLDING A NEWSPAPER, JOHN'S DELOREAN etc.) may be developed in time based on semantic inference and may be related with semantic groups; further they can be inferred by semantic grouping. In an example semantic identity of NURSE HANDS and of a NEWSPAPER are formed as a semantic dependent group. In other examples, a semantic trail/route of NURSE, (HANDS, HOLD), NEWSPAPER may be used. In cases where the semantic identity and/or group collapses (e.g. to one artifact) in the inferred circumstances (e.g. as reflected based on semantic views and semantic artifacts) the system may be more specific about the semantic identifiers (e.g. "THE" NURSE HOLDING A NEWSPAPER, NURSE JANE, HEALTH AFFAIRS etc.). Further, the system may associate, group and/or learn semantic routes and/or rules (e.g. NURSE, HOLDING THE NEWSPAPER, WEDNESDAY, AFTER LUNCH—(NURSE) JANE (99.99%); (NURSE) (JANE), HOLDING THE NEWSPAPER, WEDNESDAY AFTER LUNCH—70% etc.). Such inferred and learned artifacts may comprise time management (e.g. WEDNESDAY AFTER LUNCH); further, based on the semantic route and the identification of JANE it may create behavioral routes for the semantic identity comprising leadership semantics (e.g. NURSE and/or more precisely for NURSE JANE and/or JANE).

As it is observed an artifact (e.g. person/nurse/Jane) may be identified by (inferred) grouping, possession (e.g. NURSE WITH A NEWSPAPER), activity and/or (associated) semantic times and/or endpoints. Alternatively, or in addition, a semantic identity comprises an activity at an endpoint (e.g. nurse/Jane manipulating a reading station in the CT room etc.).

The system may determine high entropic semantic identities for better identification within a population and/or group. As such, in order to differentiate within a group the system may look for a leadership semantic attribute, activity, endpoint and/or semantic time and/or (further) semantic identity which has a high entropy among the (other) members of the group and/or is resonant with the goals; a semantic attribute may be determined based on inferred possession. In examples, in order to differentiate at an endpoint amongst nurses/people the system may specify NURSE WITH A NEWSPAPER based on the determination that the other/majority of the nurses/people do not possess and/or carry/hold a newspaper and/or can be identified as a nurse (with a newspaper). In further examples, the possession of the newspaper is determined and/or factorized to determine based on resonance with routes/goals and/or associated semantics and/or groups (e.g. interview Health Affairs readers etc.).

As explained, the law of the land at an endpoint may comprise particular rules and/or agreements published by an endpoint supervisor. As such, only the endpoint supervisor has the rights to publish/unpublish the laws of the land. Further, based on endpoint and/or supervisor hierarchy and/or detected credentials the laws of the land may be composed, augmented, resolved and/or validated hierarchically (for coherence/confusion); alternatively, or in addition, this may happen when confusion is detected and/or before publishing. As such, users, operators and/or supervisors may be notified and/or challenged in a (diffusive) hierarchical manner. Further, specific level laws, publishing and/or supervisors may be validated and/or approved with supervisor levels.

When a publishing may generate confusion, the system may augment supervisors and/or not publish and/or unpublish artifacts which are being non-affirmatively factorized as per supervisors' goals in a potential hierarchical supervising manner.

In further examples, the system detects semantic shapes which move and/or are linked together and thus infers semantic grouping and/or identities. There may be instances where the semantic group (semantic) and/or semantic identity are/is associated with indicators and/or factors comprising higher confusion, low trust and/or risk (e.g. because they are unnatural, not learned, not believable etc.); further, the (semantic) leadership and/or factorization of one shape over the other may determine the semantic identity. In an example, the system detects a wheel and a mobile phone spinning around the wheel (e.g. in an un/controlled manner); while the factorization of the parts allow potentially very believable inferences, the factorization of the composite reflects it's hard believability as does not resemble any known route and/or is hardly/not diffused by semantic rules. Nevertheless, the system may infer a semantic route, group, shape and/or rule which have and/or are associated with decayed believability, elevated confusion and/or high-risk indicators and/or factors. Further, based on the factorization of particular circumstances and/or profiles the composite semantic inferences (e.g. of identities, routes, endpoints, SPINNING PHONE AROUND A WHEEL, SPINNING WHEEL WITH A PHONE etc.) may be factorized differently and have different believability factors. The believability factors may be associated with particular semantic groups and/or leaders. In the example, the system may provide leadership of the (composite) semantic artifacts which are more believable (e.g. SPINNING WHEEL vs SPINNING PHONE etc.). It is to be understood that the system may use semantic shaping and/or overlaying of (known/saved) semantic network models in order to infer such believability factors and/or artifacts.

The inferences may be guided by privacy rules which may allow, deny and/or control inference and/or collapsing and thus inferring only the allowed level of granularity for semantic identities and/or semantic groups. In some examples, privacy rules may deny inferring, projecting and/or using semantic identities associated with a particular threshold or lesser number of objects and/or artifacts. It is understood that the level of inference granularity may be based on hierarchical and/or projected inference.

The system may infer/assign leadership on particular locations, endpoints and/or semantic groups thereof to particular semantic identities and/or semantic groups thereof. Such leadership inference/assignment may be based for example semantic analysis including semantic time management. The (semantic) leadership may be inferred/assigned based on particular goals and/or factor intervals. In an example, two entities E1 and E2 (e.g. governments, companies etc.) share a common FISHING area and are bounded by a goal/sub-goal of DEVELOP FISHING, KEEP THE WATER CLEAN or DEVELOP FISHING BUT KEEP THE RISK OF CONTAMINAING THE WATER LOW. If the goals/sub-goals are not met while under a particular entity leadership (e.g. E1) then the system may change ratings of the entity E1 in rapport with the goals/sub-goals and potentially update and/or index the time management rules asserting the leadership of the other entity (e.g. E2); thus, a new leadership (E2) is inferred and exerted (e.g. based on semantic profiles of E2) once the conditions are breached while potentially bounding the breaching entity (E1) with goals (e.g. creating semantic artifacts including semantic routes, time management rules etc.) to (help) bring/recover the conditions to an agreed semantic artifacts baseline, anchor and/or goals. It is to be understood that such inferences, ratings and/or leaderships may be related with more complex environments with multiple entities, semantic fluxes and/or semantic groups contributing to collaborative contractual inferences such as explained throughout the application.

Semantic leadership is inferred and/or adjusted based on semantic analysis including semantic factorization.

The system uses semantic gating at endpoints in order to preserve confidentiality in relation with semantic inference associated with inferences related to objects and/or semantic identities passing through the endpoints.

Figure 13:
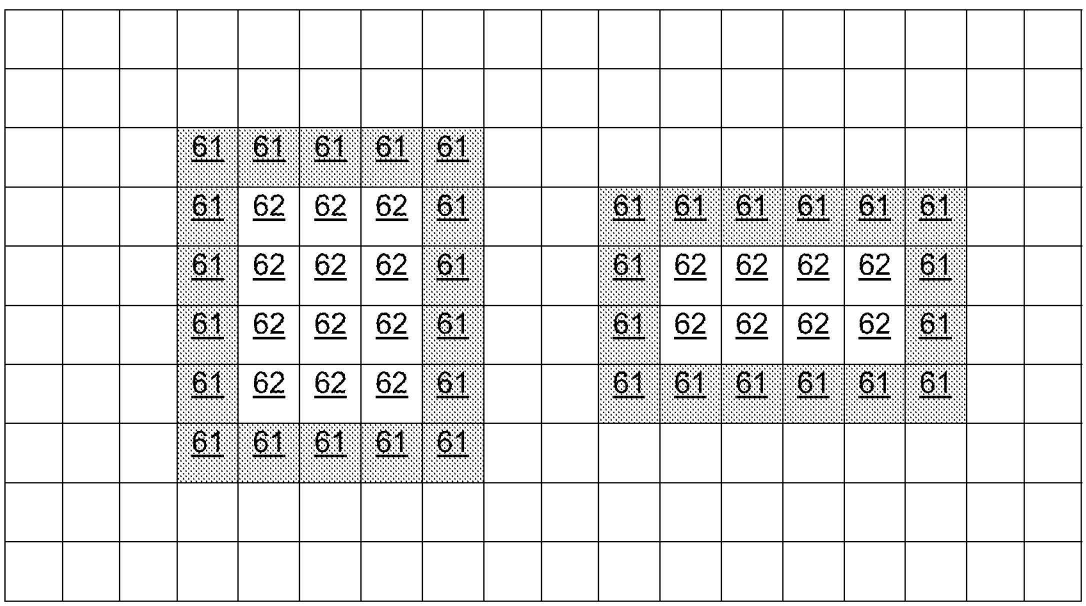
FIG. 13 illustrates a plurality of smart posts, such as those in FIG. 11 or 12, but in which the telescopic capabilities of the posts define enclosed areas within a pair of composed post structures.

While the examples show the modules stacked in a specific order it is to be understood that the order may be different in other applications. In some embodiments the antenna module may be positioned on top of the optical module; further, in other embodiments the optical module may not be present at all with the optical detection capabilities being performed by the antenna module. While this are specific examples, the generality and applicability of flexible module compositions extend to any configuration. In other examples as depicted in FIG. 13, the telescopic capabilities of the posts may allow the realization of enclosed areas within a composed post structure. For example, as illustrated, posts 61 are all "high raised" posts forming a perimeter about posts 62 which are relatively lower. The "high raised posts" are using telescopic capabilities to form an enclosed area on the lower posts. Such areas may be used for example to store or conceal tools, articles and any other artifacts. The enclosed posts area by the high raised posts may be based on a semantic group inferred based on a sensed pressure exercised by a load on the enclosed posts.

In further example the system elevates the post (e.g. via telescopic means) for hooking and/or latching to person or transportation wagons thus the composite carrier acting as a driveline for such wagons. Thus, the system may select specific wagons based on specific needs inferred via semantic inference and analysis. In further examples, users select specific wagons and the system assembles carrier beds based on the characteristics of the wagons and potentially the characteristics of the required route. It is to be understood that a wagon carrier driveline may be composed from a plurality of detached carriers and/or beds (e.g. a driveline comprises four carrier beds, one for each corner of a wagon) which may be represented and/or inferred as semantic groups.

Figure 14:
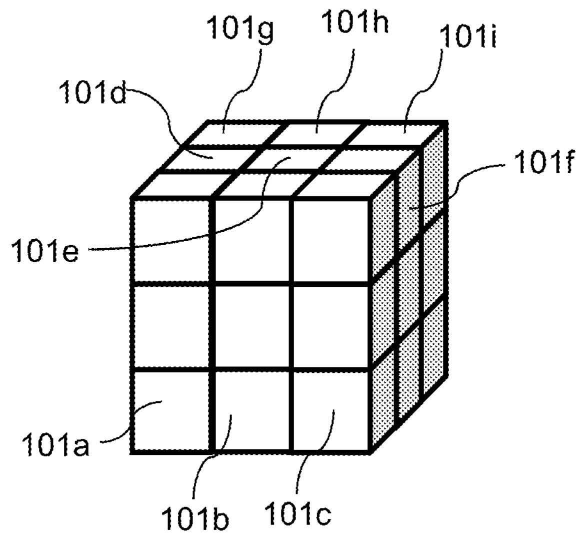
FIG. 14 shows nine posts arranged in a 3×3 configuration forming a combined sensing and/or processing capability.

In further examples, the system elevates posts for guiding, locking and/or connecting other artifacts or components into the enclosed areas; in an example the system encloses a higher capacity battery of a larger size wherein the system uses goal-based inference to determine the battery type and infer the enclosed area where to be placed. Further, in other examples the smart posts can join and/or clip for improved sensing and processing. FIG. 14 shows nine posts 101*a-i* in a configuration of 3×3 forming a combined sensing and/or processing capability.

In some examples, the composability of such elements and groupings is based on specific goals that may be specified by a user and/or inferred by the system. Further, when considering the goals and missions the system may use rewards and other factors-based inference.

For example, such goals may comprise of CARRY 7 BIG LUGGAGES or CARRY 7 6 BY 6 LUGGAGES and the system estimates the size of a flatbed and the number of required posts to form the flatbed based on mapping endpoints to areas to be covered by posts, luggage, and/or by using its own estimation of size, weight and/or indexing of the semantic BIG. In addition, the goal may comprise further restrictions such as USING A MAXIMUM 4' CARRIER WIDTH; such restrictions may be based for example on estimating an optimal route of travel (e.g. based on a semantic route) where the system detects that particular areas and/or endpoints to be traveled comprise restrictions (e.g. a location comprising a door of 4' width) and/or impeding likeable diffusion. Thus, in some examples, such restrictions may be based for example on inferred location-based semantics (e.g. using a camera or vision sensors for detecting the door width). The system composes various post configurations based on their sizes to determine the optimal join topology which may be based on mapping a semantic network (e.g. endpoint) model to areas to be covered by particular posts.

While the previous example may incorporate wheeled smart posts, alternatively, or in addition, it may incorporate drone type semantic posts comprising a copter module for lifting; it is to be understood that the smart post modules including the copter module may comprise motors/engines, propellers, servomotors, electronic speed controller, analog blocks, digital blocks and actuators.

In a wheeled-copter based application the system activates the wheeled module and/or copter module of the smart posts based on routing and semantic inference on the semantic model. The semantic network model may be mapped to land-based locations and/or aerial based locations.

The system may create a composite formation of posts/units (e.g. FIGS. 13 and 14) in order to improve sensing and/or capabilities. In an example, the system infers low count, low trust rating, unreliable and/or conflicting semantics by posts at a location. Further, the system may infer that the coverage of location and/or a mapped semantic network model in the field of sensing is not adequate. Thus, the system composes the smart posts to improve coverage and/or reliability of semantic inference. In further examples, the system combines smart posts in a formation based on their capabilities; in addition, it may use a goal or mission-based inference to form the composite based formation.

Figure 3:
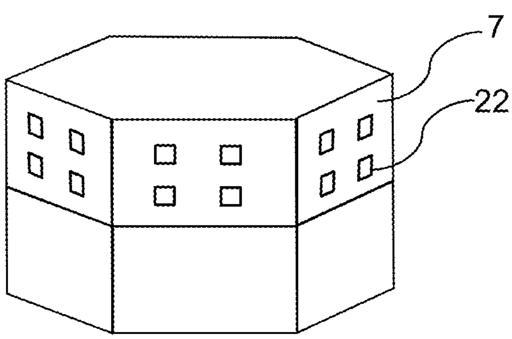
FIG. 3 is a front perspective view of a preferred module with multi-array antenna elements for a preferred smart post.

The antenna elements module 7 (see also FIG. 3) may comprise panels of multi-array antenna elements 22; the panels may be disposed on the exterior of the trunk in a specific pattern (e.g. hexagonal). While in some embodiments the panels are fixed, in other embodiments the panels are automatically movable and composable and can be moved and organized in various patterns on the exterior of the trunk (e.g. two panels on two sides of the hexagon combine in a larger panel that can be oriented as well in various directions). The antenna elements and panels may incorporate RF and optical frontends, transmit/receive modules, ADC, DAC, power amplifiers, DSPs, semantic units and other analog and/or digital blocks and components. Other post modules might incorporate similar elements in some embodiments.

Figure 2A:
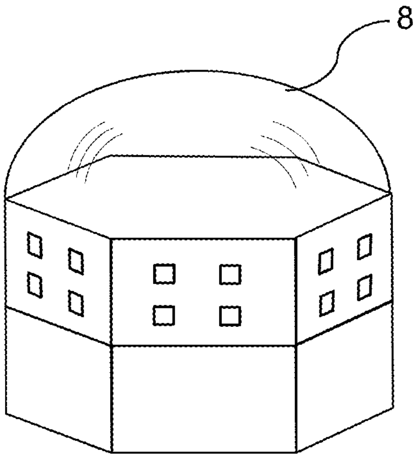
FIG. 2A is a front perspective view of a preferred optical module with dome for a preferred smart post.
Figure 2B:
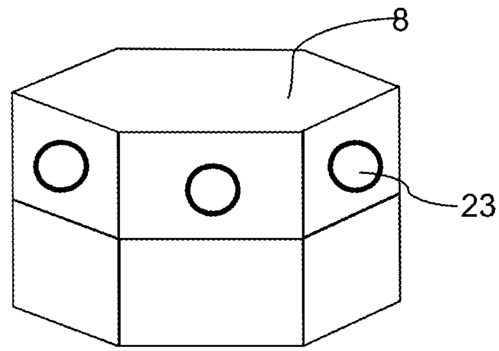
FIG. 2B is a front perspective view of an alternate optical module for a preferred smart post.

The vision, or optical, module 8 may incorporate arrays of camera and/or vision sensors 23 disposed in a circular pattern about the perimeter of an optical module such as in the example illustrated in FIG. 2B, or may be arranged within an upper dome in an array pattern, or may incorporate dome cameras or others, such as illustrated in FIG. 2A (showing the outer dome, with the optical elements or cameras not visible within the dome). The cameras and/or vision sensors may be of time of flight type comprising laser and/or photonic elements for emitting and receiving (e.g. laser diodes, photodiodes, avalanche photodiodes-linear/analog mode, Geiger-mode, etc., edge-emitting lasers, vertical cavity surface emitting lasers, LED, fiber laser, phototransistors).

Figure 10A:
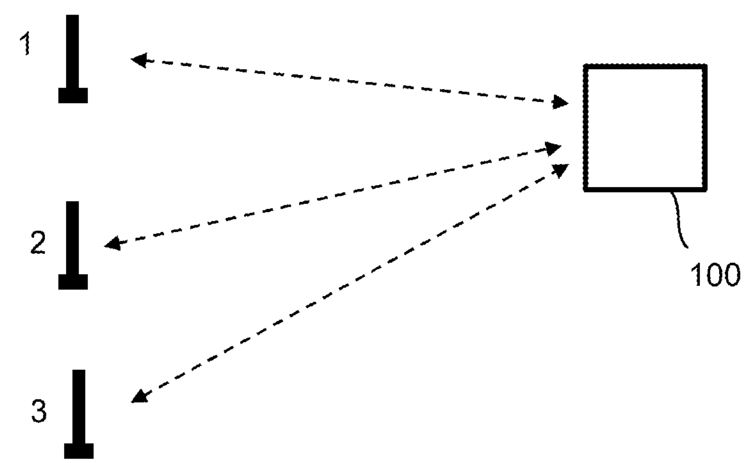
FIG. 10A illustrates a plurality of posts in communication wirelessly with a remote control infrastructure.
Figure 10B:
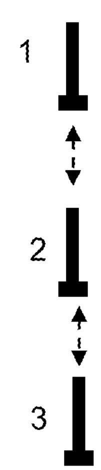
FIG. 10B illustrates a plurality of posts in wireless communication with one another.

The control module 5 is used to process the information of the robotic unit and for communication via the sensing and wireless modules (e.g. antenna modules). The posts may communicate with each other (such as depicted in FIG. 10B, showing three separate smart posts labeled posts 1, 2, and 3) or with the distributed computing infrastructure (as illustrated in FIG. 10A, also showing three posts, numbered 1, 2, and 3) using any wireless protocols. Alternatively, or in addition, the posts may communicate through wiring and/or cabling embedded in the connecting bands and/or clips while the latching and clipping mechanisms comprise cabling connectors (e.g. specialized connectors, RJ45, Ethernet, serial interface etc.). It is understood that the control module functionality may be distributed amongst other modules, posts, computers and computer banks.

As mentioned, the clipping and fixation mechanisms allow the posts to reconfigure in various setups, topologies, zones and settings. The robotic distributed infrastructure allows such reconfigurations based on semantic inference including localization, hierarchical network models and zoning. While various clipping and attaching modules and mechanisms have been presented and depicted it is to be understood that such clipping and attaching mechanism may be standardized in some applications.

The following example presents the embodiment of a port of entry operation using a combination of smart posts and real time semantic technologies.

Semantic IOT composable cloud and real time semantic technologies provide adaptive real time and just in time operational intelligence and control while aggregating disparate sources of information.

They function based on semantic engines which interpret semantic models and semantic rules and thus are highly adaptable to the operational or simulated context. They are highly suitable for integrating multi-domain knowledge including capabilities, interdependencies, interactions, actions and what-ifs scenarios. Real-time semantic technologies understand the meaning of data from various sources and take appropriate actions; they provide real time situational awareness and automation. A semantic engine performs semantic knowledge discovery by using a set of adaptive artifacts including a semantic model which may be defined by a user, ingested or learned by the system. The semantic model comprises the representation and mapping of informational flows and groupings to meanings (e.g. linguistic based terms related to objects, states, control actuation, groups, relationships, routes etc.); the semantic system guides the inference in the semantic model based on semantic rules and routes which specify how the system should behave. The capacity of a semantic system inference capabilities increases as the semantic model evolves through modeling and learning. The semantic model is defined as linguistic based operational rules and routes. Further, the semantic model may be associated with hierarchical semantic network models for further management of paths, fluxes/flows, routes and semantic inference. In a semantic network model, the semantics are assigned to artifacts in an oriented graph and the system adjusts the semantic network model based on ingested data and semantic inference. The semantic network graph comprises endpoints and oriented links in a potential hierarchical structure with graph components representing another semantic network graph. As data is ingested from the smart posts functional modules, the semantic engine is able to perform inferences in real time, providing semantic intelligence, adjusting the semantic model and potentially executing actions. Semantics and/or semantic attributes are language or symbol terms and structures that have a meaning. The meaning in particular contexts and circumstances is established by semantic models including semantic groups and semantic routes; when associated with a semantic network model they may be associated with artifacts in a semantic graph representation of the system.

A semantic group represents a grouping of artifacts based on at least one semantic relationship.

Semantic routes comprise a collection of semantic artifacts (e.g. semantics, semantic groups, semantic routes, semantic network model artifacts etc.) and potential synchronization times; the semantic routes may be represented as a semantic and/or as a semantic group of semantic artifacts. They may be also associated with semantic rules (e.g. time management, access control, factoring, weighting, rating etc.).

Semantic routes may be represented, associated and/or identified with semantic artifacts (e.g. semantic and/or semantic group) and as such they benefit from general semantic modeling and analysis.

Semantic routes may be organized in a hierarchical manner with semantic routes comprising other semantic routes. Such hierarchical structure may be recursive.

The semantic routes may be grouped in semantic groups and participate in semantic inference.

Semantic routes associated with a semantic network model may be used for artifact (e.g. traveler, smart post) routing within modeled environments.

In this disclosure we will refer as semantic rules to all rules that allow semantic inference comprising composition and management plans including time management, access control, weighting, ratings, rewards and other factors (e.g. risk).

Semantic routes may be used as and/or to implement operational rules and guidelines. For example, the system is provided with allowable, desired, non-allowable and/or non-desired routes. In an example a route specifies that HOT CROWDED SPACES ARE NOT PLEASANT and also that CLOSE TO SHOPPING IS NICE and thus semantic post units and/or groups provisioned with such routes when inferring a HOT CROWDED SPACE semantic (e.g. via semantic composition) for an area would select the previous rules and determine a further route comprising COOLING and/or DIVIDE crowds to areas encompassing (or closest) to SHOPPING locations. It is to be understood that in this example areas may be mapped to endpoints in a network model representation of a physical space and the system would execute the commands in the routes based on the existing or deployable capabilities at mapped endpoints (e.g. areas). In an example, the DIVIDE semantic may be achieved via further semantic inference comprising smart post routing/guidance topologies, semantic shaping, semantic orientation and/or semantic augmentation. Further, the COOLING semantic may be achieved if the areas comprise cooling capabilities and/or semantics (e.g. via a fixed air conditioning fan module which may be potentially attached to a smart post unit). Some semantic inference techniques are explained in a family of patent applications such as US20140375431, the content of which is incorporated by reference. In further examples, if the system infers that an area and/or endpoint is associated with semantic artifacts (e.g. HEAT related, etc.) which have high (entanglement) entropy, drifts, shifts and/or factors as related with COOLING then the system may pursue the COOLING leadership and/or capabilities. It is to be understood that the inference at an endpoint may be based on semantic profiles of the (semantic) identities at the area/endpoint and thus the high shift and/or entropy semantics may be based and/or related with at least one (semantic) identity and/or (composite) profile. If the area and/or endpoint semantics are inferred based on multiple identities (during at least on a projected hysteresis, diffusion and/or semantic time interval) then the system may pursue COOLING capabilities (e.g. until the entropy, drift and/or factors adjust to sensible (composite profiling) (hysteresis) levels, health risk of HEAT decreases etc.).

In further examples, the system determines goals and further optimized semantic shapes of groups of posts (or cars) to be realized within particular semantic budgets (e.g. based on energy consumption/quanta, fuel related quanta, entropy etc.). Such shapes and/or zones may be based on semantic groups and/or presence at particular areas and/or endpoints. In further examples such shapes may be associated with areas, endpoints, trajectories and/or sub-models. It is to be understood that the shaping may take in consideration the fitting of the posts within an area or endpoint based on semantic inference on dimensions, mappings, semantics and/or further semantic analysis; further, the shaping may be based on semantic orientation and drift analysis between the goal group shape and the current group shape. Further, the system may use dissatisfaction, concern and/or stress factors in order to assess the fitting of posts within various areas.

In some examples, semantic shaping is used to optimize traffic flows where the system determines the best shapes, zones and endpoints for groups of vehicles at particular times or particular areas.

In other examples, semantic shaping and semantic analysis may be used to optimize container and/or artifact storage in particular areas and/or volumes (e.g. mapped to semantic models).

Semantic inference uses semantic analysis comprising semantic composition, semantic fusion, semantic routing, semantic resonance, semantic indexing, semantic grouping, semantic time and/or other language based semantic techniques including semantic shift, entailment, synonymy, antonymy, hypernymy, hyponymy, meronymy, homonymy.

In an example, a semantic group containing all the synonyms for “great” is stored and used in semantic inference. In some cases, the group comprises semantic factors assigned to semantic components to express the similarity within a group or with the semantic attributes defining the group. In further examples, the system stores a semantic group for the same semantic (e.g. (“running”, “runnin”); (“o'leary”, “oleary”, “o leary”) etc.). In another example, the system stores separate identities and/or groups for “cat” and/or “c.a.t.” as they are associated with different semantics; further, during semantic inference the system infers leadership to “c.a.t.” over “cat” or vice-versa based on exact semantic identification (e.g. match the exact semantic form and/or identity) and/or semantic view. In the examples, the system may have inferred from ingested data that artifacts (e.g. “cat” and “c.a.t.”) have and/or are associated with different semantics (e.g. semantic identities) and thus the system is able to identify and/or create such semantic identities and/or semantic groups. Analogously, the system may infer that the ingested artifacts are associated with the same semantic (e.g. (“running”, “runnin'” and thus the system may create a semantic identity and/or group to reflect the association and for further optimization.

It is to be understood that the leadership may be determined by coupling of semantic analysis and/or circumstances (e.g. location/localization, language, semantic profiles, roaming etc.).

The semantic analysis comprises semantic techniques such as synonymy, semantic reduction, semantic expansion, antonymy, polysemy and others. In an example, the user specifies lists of synonyms, antonyms and other lists that are semantically related. The elements in a list are by themselves related through semantic groups via semantic attributes or semantics (e.g. SYNONIM, ANTONIM).

Real time semantic technologies optimize processes and resources by considering the meaning of data at every level of semantic AI inference. Real time semantic technologies are well suited for providing situational awareness in ports of entries while further providing a framework for adaptive integration.

Semantic IOT infrastructure based on smart posts/robots and real time semantic technologies can provide precise counting, times and routing at the port of entries.

The ports of entry layout may be modeled through hierarchical semantic network models wherein the endpoints are associated with smart post sensing and locations in the layout; further, oriented links between endpoints represent the flows, transitions and the semantics of traffic at the modeled/instrumented points. The area, location and sensing based semantic network model is recursive and thus can be used to achieve the desired level of granularity in the mapped environments.

Semantics may be associated with sensing/data flows, checkpoint attributes, traveler attributes and further, the semantic model comprises semantic routes and how semantics compose. Flows/fluxes semantics and interdependencies may be modeled and learned via semantic modeling and inference.

The counting of people in monitored queues, areas or endpoints may be based on the traveler-based semantics inferred based on transitioning of links in the semantic layout/sensing model. Further, the system guides the semantic inference for traveler waiting times using semantic time and semantic intervals. The semantic time and semantic intervals allow time inference based on semantics. Further, a semantic time is indexed based on the context of operation. Thus, semantic time and semantic intervals ensure that the time inference takes places in the most accurate context of operation. By using semantic intervals and adaptive semantics for inference a semantic system achieves predictive semantics.

In an example, a checkpoint for foreign nationals is timed based on the transitions in the semantic network model. In simplest terms, for example, at one checkpoint gate it may take a foreign national from country A (Fa) 1 min to be cleared by an officer and a foreign national from country B (Fb) 2 min. Thus, every time when the systems infers, potentially based on semantic interval contexts (e.g. arrival of a flight and arrival at the checkpoint), that there are foreign nationals from country B at the checkpoint, it may index the waiting time accordingly. While the previous time indexing has been based on a single attribute (citizenship), other attributes or categories can be used for indexing the time (e.g. age of travelers, traveler status, visa type, system speed, network speed etc.). This kind of operational inference and analytics is hence very accurate and performed in real time without the need of storing large amounts of data or continuously utilizing large compute resources. Further, patterns in time and space are learned by semantic IOT through semantic intervals.

Similarly, the system may project travel waiting times on various traveling (road) segments.

A semantic system also groups artifacts based on semantic inference and use those groups in further semantic inference. In our example the system may detect object types or complex semantics based on such semantic groups (e.g. group sensors, settings and detections and infer meanings, infer travelers by detecting flows of grouping of detections, features, clothing items and belongings; infer that a person is carrying a red bag etc.). It is to be understood that the Semantic IOT is a distributed composable cloud and as such it distributes, groups, compose and fusion various modalities detections in an optimized manner; as mentioned, the modalities may comprise a diverse spectrum of electromagnetic sensing.

In our example, the counting may be based on the transitions in the semantic network model; thus, when a link in the semantic network model is transitioned as detected by the smart posts and their modalities, the system infers a particular semantic (e.g. TRAVELER ENTER CHECKPOINT 1 or TRAVELER EXITS CHECKPOINT 1). Semantic composition and fusion of such semantics allow the coupling of detected semantics in and with time (e.g. counting the number of semantics/travelers at checkpoints, estimating waiting times or other general or personalized semantics) in the most flexible, efficient and optimized manner and utilizing a minimum amount of resources thus decreasing system costs. Other systems may not employ such flexibility, optimization, fusion and modeling techniques and hence they are not able to provide the same capabilities, coherence, accuracy and cost effectiveness.

The system will use adjustable inferable model semantics for mapping the type of service (e.g. CITIZENS AND PERMANENT RESIDENTS mapped to transition links from the checkpoint inbound to checkpoint outbound), for counting (e.g. derive the number of people based on the transitions in the semantic network model), for speed of processing (traveler rate in an interval of time), to derive general or personalized sentiment inferences (e.g. VERY FAST, FAST, SLOW), for traveler semantic routing, experience rating, personalization and so forth.

Semantic automation and augmentation ensure actions in various domains; in an example, the coupling of the command and control model to semantic automation and augmentation may implement automatic or semi-automatic guiding, routing and access control in port of entry environments.

Based on the level of the autonomy employed through semantic automation and semantic augmentation the technology may be used to automate various tasks and provide semantic intelligence in various forms including display, sound, actuation, electric, electromagnetic, etc.

Solutions for port of entries (e.g. airports) includes developing semantic network models to be deployed on the distributed semantic cloud and mapped to a semantic sensing infrastructure. The semantic sensing infrastructure may include smart semantic posts/appliances comprising sensors, batteries and semantic sensing units which can be deployed throughout the port of entry.

The assumption in this example is that there are no available sensors at the monitored locations and as such the system uses semantic sensing for feeding the semantic network model. Semantic systems provide semantic fusion and as such, the system may integrate various data sources and/or additional sensing infrastructure for contextual accuracy and more precise inference. One example is when the smart posts comprise one or more of radiofrequency, camera/optical/infrared sensors. It is to be understood that camera/optical/infrared sensors can be selected from cost effective solutions such as low-cost ones designed for mobile devices. The radiofrequency devices/sensors may function in microwave frequencies range (e.g. 2.4 Ghz to 80 Ghz) or higher.

It is preferred that such sensors be easily deployable and reconfigurable in various environments and as such they may be one or more of the following: mobile post deployed sensors and fixed posts deployed sensors. While the smart semantic posts/appliances may be mobile in some environments, they can deploy as fixed on walls or other structures.

The smart posts may comprise Li-Ion batteries which may provide extended functioning time for the attached sensors and semantic units. The battery posts provide real time awareness of their charging status which allow easy maintenance whether manual or automatic for charging and/or battery replacement. Alternatively, they may be plugged in at any time at a permanent or temporary supply and/or charging line. For easier maintenance of the battery powered devices, they may be deployed in a mutual charging and/or external charging topology comprising RF and/or robotic charging components.

For a composite post and/or (comprised) post groups, the system may route power between the component/member posts. As such, each post in such power (routing/feeding)

configuration may comprise switching components to allow the power to flow between posts as per goals. In some examples, a composite post S2P routes power from S2P1, S2P3 via S2P10 and S2P11 to S2P2 based on a goal to have S2P2 available for an activity (e.g. (Jane's) luggage handling) and/or charged/credited to (a budget of) 82%. As such the system switches and routes the power within and/or between the posts to form the required power lines and/or routes.

In further examples, the electric/electromagnetic power is conditioned and/or routed within/between/through semantic units. In some embodiments, the multiplexers (MUX) in the semantic units comprise MEMS/analog switches which are commanded to switch the loads and/or couple the MUX inputs/outputs. Furthermore, they may comprise (high voltage) MOSFETs for voltage/current/power conditioning and/or conversion.

It is to be understood that in other embodiments the posts may be substituted with/for any other robotic devices and/or modules for the purpose of projecting, conditioning and/or routing power.

The microwave devices/sensors may comprise multiple sensing elements (e.g. 4 to 256) which allow the sensors to detect steer and optimize the beam, frequency, detection and communication patterns. More antennas may be present thus providing more scene interpretation capabilities and data that can be fused for knowledge discovery (e.g. adapting and changing radiation patterns, adapting frequencies and polarizations).

In the simplest case, post sensors are disposed to capture transition patterns in at least one semantic network model which may be stored at each post comprising control module logic. Thus, with each transition in the model, the system detects and counts semantics of objects depending on the determined semantic of travel (e.g. PERSON IN CHEKPOINT GATE 2, PERSON OUT CHECKPOINT etc.). These deployments are straightforward in control areas and boarding sterile corridors where the flow is guided through lanes and corridors thus allowing for less shadowing and multipath effects. Thus, the counting in these areas can be very precise by instrumenting the lanes and/or corridors with smart posts or other sensing artifacts. For example, in a checkpoint lane the system uses one or two posts for lane ingestion and one or two posts for departure detection.

In such lanes and corridors, the location based semantic network models comprise fewer artifacts than in non-lane-controlled areas, thus minimizing the processing and optimizing power consumption. Also, the relevant detection happens in near field for both optical and microwave and as such the data interpretation would be straightforward. Further, semantic system's capability of changing and adapting the sensing patterns allows the reduction in the number of collection points and the number of sensors and thus maximum flexibility in deployments.

In non-lane-controlled areas and corridors the system may employ a more complex near to far field semantic model of locations which are mapped to semantic sensing detection techniques. The semantic engine fuses the information in the semantic network model.

In an example, the system uses radio frequency polarization diversity to improve detection in multipath environments. The smart semantic sensors may employ diversity antennas and/or use coupling of antenna elements to adjust electromagnetic radiation, polarizations, optimize frequencies and so forth.

Further, based on inferred topologies the system may reposition the smart posts in the environment and coordinate them to clip to each other in order to delimitate and realize the semantic zones and topologies required for traffic flow control.

Figure 8A:
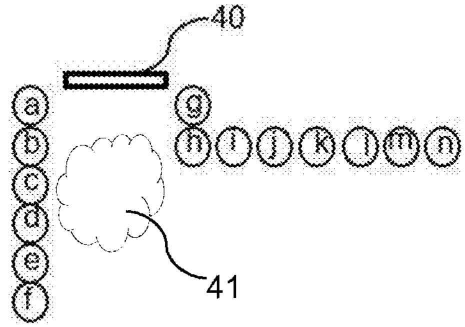
FIG. 8A shows a representative view of a plurality of posts arranged in a guiding configuration, shown in a retracted position.
Figure 8B:
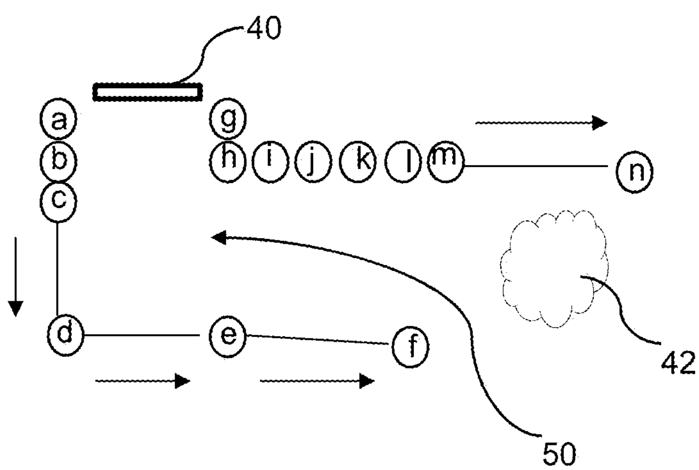
FIG. 8B shows a representative view of the posts of FIG. 8A, shown partially extended to form a guiding arrangement.
Figure 8C:
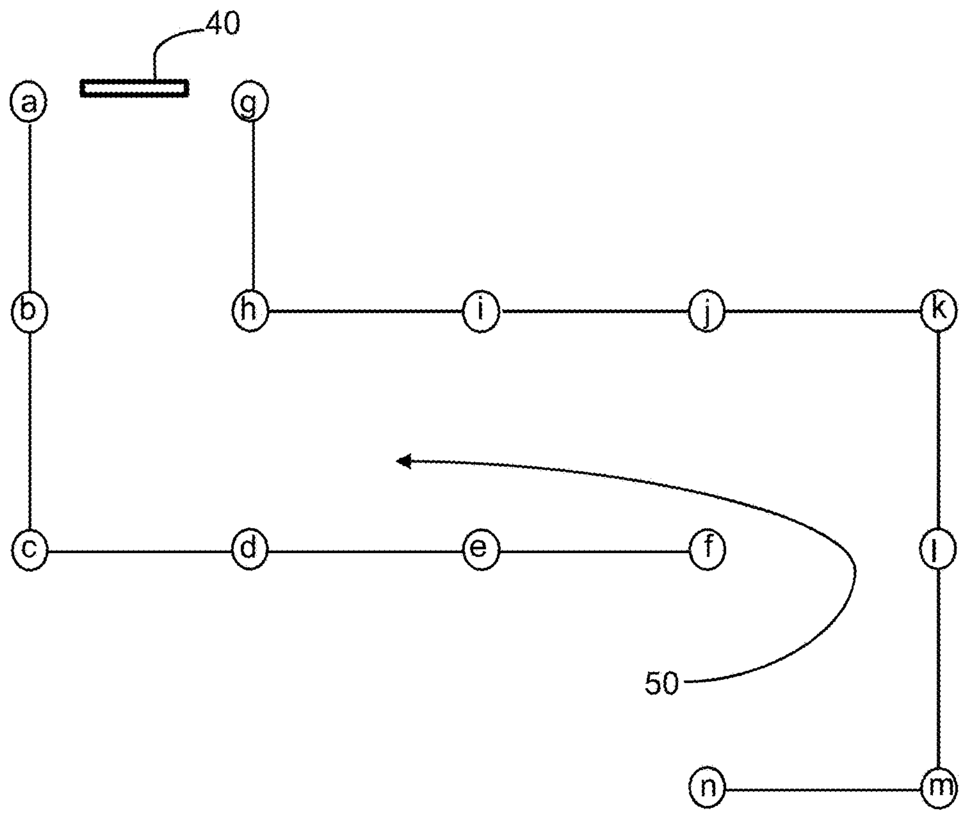
FIG. 8C shows a representative view of the posts of FIG. 8A, shown fully extended in one of many possible guiding arrangements.

In FIGS. 8A and 8B, posts are disposed in a guiding lane configuration. In FIG. 8A, a first series of posts labeled a-f are on a left side of an entry point 40 and a second series of posts g-n are on a right side of the entry point. The entry point may be a location of passport control, boarding a craft, check-in, or any other point at which persons are processed or allowed to pass. Initially, the posts are arranged closely adjacent one another, and preferably with their associated ropes or belts attaching adjacent posts to one another but with the belts either retracted within the respective post or hanging in a slack fashion. In FIG. 8B, some of the posts have moved and been extended to increase the length of the traffic lane between the posts. Specifically, posts d, e, and f have moved, as has post n, as indicated by the arrows and the visibility of the belts that have been extended. In FIG. 8C, the posts have extended to the fullest extent, forming the longest line possible for the assembled collection of posts.

At the setup of FIG. 8A, one or more of the sensors (cameras, antennas, analog and/or digital blocks/devices etc.) of one or more of the posts scans the region between the posts, indicated as region 41. Upon the detection of persons standing in the region, the system determines that an extension is required. The particular logic may vary and be determined as above, but for example may require a plurality of posts a-f and/or g-n to detect static persons in the area, waiting but not moving quickly.

In FIG. 8B, one or more of the posts continues to scan the area, including region 42 occupying the terminal end of the lane 50 defined by the opposite pairs of posts. Most preferably, at least the end posts f and n provide input indicating the presence of persons standing in that region. In other versions, all of the posts, or at least a larger subset, also provide such an input which is used by the controller to determine whether to extend the posts yet again and thereby form a larger line. Finally, as shown in FIG. 8C, the posts have exhausted their reach. Most preferably, the controller is programmed with a map of the area surrounding the entry point, and also tracks the location of each of the posts, in order to direct the individual posts whether to move in a direction linearly away from a prior post (for example, with reference to FIG. 8C, in a direction from post I to post k), or to move at an angle with respect to at least a pair of prior posts (for example, in a direction from post k to post 1, or from m to n).

Figure 9:
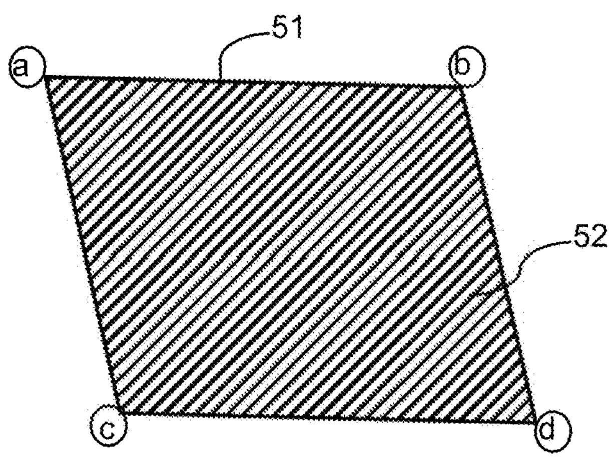
FIG. 9 shows a plurality of posts in a perimeter delimitation configuration.

In FIG. 9 we show a perimeter delimitation configuration. The perimeter in the illustrated example is defined by posts a-d, though a different number of posts may be used. The posts combine to define a perimeter 51 having an internal area 52. In an example, the system infers and/or a user specifies an area and/or a semantic associated with it. The area may be delimited based on anchor points and/or the edges.

In FIG. 10 we show various deployment options in which the posts communicate wirelessly and/or process information in a distributed cloud infrastructure. While in embodiment A they may use an external distributed cloud infrastructure, in embodiment B they use their own internal processing capabilities in a distributed cloud mesh topology; it is to be understood that the system may use any capabilities, whether internal and/or external to infer and configure composable cloud topologies. Also, their movement, positioning and coupling may be based on semantic network models whether at sensor, post, semantic group, infrastructure or any other level. It is to be understood that the grouping of smart posts in various topology, processing and cloud configurations may be based on semantic grouping based on semantic inference on inputs, outputs, sensing etc.

Any one or more of the posts may travel independently about a region, such as generally indicated with reference to posts 1, 2, and 3 shown in in FIGS. 10A and 10B, without being tethered to one another. In such a configuration, the posts collect the optical, audio, or other information from sensors, cameras, antennas, analog and/or digital blocks and/or devices, front-ends etc., which may then be passed along directly to other posts as indicated in FIG. 10B, and/or to a central or distributed control infrastructure 100 as shown in FIG. 10A. The control infrastructure 100 may be a central computer communicatively coupled with the plurality of distributed devices. It should be appreciated that any of the features described in this disclosure as being performed by "the system" may be performed by the control infrastructure in a centralized fashion, or may alternatively be performed in a distributed fashion by a distributed system including a plurality of control structures and/or computer components on the posts or robotic devices.

In other embodiments the posts may comprise master-slave configurations. In such configurations the master posts controls at least one slave post. The slave posts may comprise less functionality and/or be less capable than the master post (e.g. lacking full suite of sensors and/or actuators, smaller batteries, lacking displays etc.). The master post may control the movement and/or deployment of slave posts. In some examples the master post detects and control the positioning of slave posts. For example, an airport may use units of groupings of master and slave posts (e.g. groupings of at least one master and at least five slaves). Such units may be deployed and yield composable topologies and formations.

In further examples, the robotic posts formations and/or components thereof may be based on semantic groups which may comprise leadership semantic artifacts.

Master-slave configurations may be represented as semantic groups with the master units attaining leadership in particular configurations and/or environments.

The smart posts may comprise billboards, displays, actuators, speakers and other forms of semantic augmentation allowing them to convey information.

In a further example of utilization, the smart posts may be deployed in key areas and provide guidance via semantic augmentation. The semantic augmentation may comprise advertising. In some embodiments the smart posts and/or groups may be designed as for general use, however, when they receive a mission and a target they may adapt to the mission and target. In the airport example a unit of posts may receive the mission to provide guidance and/or lane formation to a particular airline. Thus, the posts may deploy to the targeted airline airport area and provide the semantic augmentation related to the airline; such information may comprise airline name, flight information, airline specific advertising and so on. The specific information may be received and/or downloaded from a specialized advertising service and/or cloud (e.g. airline cloud). The deployment of the post to the airline area may be based on the previous knowledge on the location of the airline, sensing and guidance.

In other examples the posts may deploy in areas that are inferred as of high risk and/or congested. Thus, once the distributed cloud infers such conditions it automatically initiates the deployment of units and/or topology reconfiguration; the initialization of operations may take place based on semantics inferred at any inference capable post. For example, in the high-risk areas the posts may be deployed for achieving a topology that reduces the overall risk (e.g. guiding the travelers through lower risk areas and/or routes, dividing the crowds based on boarding zones, traveler/visa status, risk etc.).

In some embodiments the posts are deployed in location and/or areas for which the system infers particular semantics. For example, for a location the system may infer a semantic of HAZARDOUS or SHOPPING TOO CROWDED and thus the system may dispose posts and/or units to contain those zones and/or guide travelers to other routes that do not contain such areas. Thus, posts deployed for such purpose may indicate via semantic augmentation (e.g. display and/or audio, wireless beaconing) the zone semantics and directions to follow by travelers in proximity; it is to be understood that proximal semantic augmentation may be triggered when travelers are detected in proximity. The travelers may include people, vehicles and any other moving artifacts considered by the system.

While we refer to inference, it is to be understood that it may be based on inference at a single post/unit, a group of posts/units, distributed cloud and any combination of the former. The semantic system functions as a distributed architecture in various configurations comprising but not limited to semantic group computing, edge computing, cloud computing, master-master, master-slave etc.

In some embodiments, the system issues missions and/or commands to posts that are in particular locations, areas and/or endpoints and have inferred specific semantics. For example, the system issues commands to the posts that have been deployed to HAZARDOUS semantic areas and have associated semantics of MASTER POST, BATTERY HIGH and/or STAND POST UNIT DISPLAY TIME 1 HOUR. For example, such commands may be used to display flight information, routing information (e.g. for guiding out of hazardous area), advertisements and any other type of augmentative information. In the previous example the selection of posts may be associated with a semantic group defined by composite semantics determined by a semantic route (e.g. STAND POST UNIT DISPLAY TIME). It is to be understood that the system may select and/or command a semantic group of posts based on compositional semantics (e.g. STAND POST UNIT) and other sematic group hierarchies formed based on semantic composition.

It is to be understood that the previous exemplified semantics, semantic groups and/or semantic routes may be evaluated and/or inferred by the system on a linguistic relationship basis including semantic shift, entailment, synonymy, antonymy, hypernymy, hyponymy, meronymy, holonomy, polysemy. Thus, in an example, a HAZARDOUS semantic inference may be based and/or reinforced (e.g. higher weights) using synonyms and/or related semantic groups (e.g. UNSAFE). In other examples, the HAZARDOUS semantic may be coupled and/or reinforced (e.g. lower weights) using antonyms and/or related semantic groups (e.g. SAFE). Alternatively, or in addition, H/ENT may be applied.

Hazard and/or safe indicators may be factorized and/or assigned to/for goals. In some examples, the system has a goal to keep S2P2 and/or its carried luggage/container in a likeable and/or intrinsic posture (at endpoints); as such, the system may project non-likeable conditions, activities, interactions and/or hazards which can non-affirmatively affect the likeability of the posture and/or (further) goal orientation (at endpoints). Alternatively, or in addition, the system may project hazard/safe indicators associated with goal (projections).

Real time semantic technologies and semantic analysis allow for adaptive intelligent systems that can be used for multi domain intelligence, automation and autonomy.

Those technologies are based on semantic analysis techniques of which some are explained in patent Pub No 20140375430.

Semantic analysis comprises semantic composition, semantic fusion, semantic routing, semantic orientation, semantic gating, semantic inference and/or other language based semantic techniques including semantic shift, entailment, synonymy, antonymy, hypernymy, hyponymy, meronymy, holonomy.

In this disclosure we will refer as semantic rules to all rules that allow semantic inference comprising composition and management plans including time management, access control, weighting, ratings, rewards and other factors. Semantic artifacts include semantics, semantic groups, rules, semantic routes, semantic views, semantic view frames, semantic models and any other artifact used in semantic analysis.

Semantic technologies allow the interpretation of inputs and data streams into operational semantic knowledge which may comprise intelligent related outputs, user interfaces, control and automation. The inputs, data streams and operational semantic knowledge may be related to sensing, signals, images, frames, multimedia, text, documents, files, databases, email, messages, postings, web sites, media sites, social sites, news sites, live feeds, emergency services, web services, mobile services, renderings, user interface artifacts and other electronic data storage and/or providers. Further, ingested artifacts and/or semantic groups thereof may be linked and/or associated with semantic model artifacts. In some examples, paragraphs/sections/headers from email, markup formatted data/objects/files, chat or posting messages and/or web pages may be represented. Further, semantic identification of such paragraphs (e.g. attributing a news article to its author, newspaper, group etc.) may allow semantic profiling and factorization at any level of semantic identification. Thus, the semantic artifacts associated with the semantic identification and semantic profiles may be further factorized based on the semantic analysis of encountered tags, markups and/or their values (e.g. certain artifacts are associated and/or factorized based on an underlined and/or particular font, header etc. as detected based on tags and/or markups); further, such inferred factorized semantic artifacts may be used to modify and/or mask the associated tags and/or markup values in documents. In some examples, the summary content in some documents is masked, not showed and/or not rendered in preview mode in particular circumstances (e.g., when user not present or not looking at semantic device).

An integral part of the semantic knowledge discovery is a semantic model which represents a set of rules, patterns and templates used by a semantic system for semantic inference.

The capacity of a semantic system's inference capabilities may increase as the semantic model evolves through semantic inference, modeling and learning.

A semantic field represents the potential of semantic knowledge discovery for a semantic system through information processing and inference.

A system achieves a particular semantic coverage which represents the actual system capabilities for semantic knowledge generation. Hence, the semantic coverage can be expanded by adding new streams or inference artifacts to the operational semantic capabilities of the system.

In some examples the semantic coverage is related to the semantic network model coverage capabilities (e.g. the area covered, the resolution covered at the lowest or highest endpoint hierarchy, the number of hierarchical levels etc.). Further, the semantic coverage may be related to sensing and inference modalities available for given semantic network model artifacts (e.g. a semantic coverage is extended if a system comprises two sensing modalities as comparable to only one modality of similar capabilities).

The semantics may be assigned to artifacts in the semantic network model (graph) including endpoints and links. Dependencies between semantics and/or artifacts may be captured and/or determined by oriented links between the endpoints, hierarchy and/or path composition. As such, a group dependent semantic group may be represented as an oriented graph/subgraph with the causality relationships specified as oriented links (e.g. from cause/causator to effect/affected and/or vice-versa). Additionally, the elements in the model may be hierarchical and associated with any semantic artifacts.

The system may comprise symptoms—cause—effect semantic artifacts (e.g. semantic routes). In an example the system determines symptoms such as P0016 ENGINE TIMING WHEN COLD and 80% DIRTY OIL and as such infers a potential cause of 80% TIMING SOLENOID ISSUE and further projected risk (e.g. IMMEDIATE, WHEN VERY COLD etc.) of ENGINE BREAKDOWN.

Semantic collaboration means that disparate systems can work together in achieving larger operational capabilities while enhancing the semantic coverage of one's system semantic field.

A semantic flux is defined as a channel of semantic knowledge exchange, propagation and/or diffusion between at least a source and at least a destination. By using semantic information from semantic fluxes, a receiving system improves semantic coverage and inference.

A semantic flux connection architecture may be point to point, point to multipoint, or any combination of the former between a source and destination. Semantic fluxes may be modeled as a semantic network model whether hierarchical or not.

Semantic fluxes can be dynamic in the sense that they may interconnect based on semantic inference, semantic groups and other factors. In an example, a semantic flux A is connected with a semantic flux B at first and later it switches to a point to point configuration with semantic flux C.

A composite semantic flux comprises one or more semantic groups of semantic fluxes, potentially in a hierarchical and/or compositional manner; further all the information from the composite flux is distributed based on the composite flux interconnection, semantic routing and analysis.

Dynamic flux configurations may be based on semantic groups and hierarchies. For example, flux A and B are semantically grouped at first and flux A and C are semantically grouped later. In further examples semantic groups interconnect with other semantic groups and/or fluxes, potentially in hierarchical and compositional manner.

Semantic fluxes may transfer information between semantic engines and/or semantic units comprising or embedded in access points, gateways, firewalls, private cloud, public cloud, sensors, control units, hardware components, wearable components and any combination of those. The semantic engine may run on any of those components in a centralized manner, distributed manner or any combination of those. The semantic engine may be modeled in specific ways for each semantic unit with specific semantic artifacts (e.g. semantics, semantic groups etc.) being enabled, disabled, marked, factorized, rewarded and/or rated in a specific way.

Semantic fluxes may use any interconnect technologies comprising protocols, on-chip/board and off-chip/board interconnects (e.g. SPI, I2C, I/O circuits, buses, analog and/or digital blocks and components, diodes, varactors, transistors etc.), CAN, wireless interfaces, optical interfaces and fibers and so on. Additionally, or alternatively, semantic fluxes connect via semantic sensing units comprising semantic controlled components, including those previously enumerated and others enumerated within this application.

Semantic fluxes and/or streams may also connect other objects or artifacts such as semantic display units, display controls, user interface controls (e.g. forms, labels, windows, text controls, image fields), media players and so on; semantic fluxes may be associated and/or linked to/with display controls in some examples. Such objects may benefit from the semantic infrastructure by publishing, gating, connecting, routing, distributing and analyzing information in a semantic manner. Such objects may use I/O sensing, authentication and rendering units, processes, components and artifacts for further semantic analysis, gating, routing and security. In an example, the semantic gating routes the information based on authentication and semantic profiles. In further examples, display control or user interface components and/or groups thereof are displayed/rendered/labeled, enabled, access controlled or gated based on semantic analysis, semantic profiles, semantic flux and gating publishing. As such, the system identifies the context of operation (e.g. comprising the user, factors, indicators, profiles and so on) and displays coherent artifacts based on coherent inference.

Various types of controls and/or dashboards can be displayed based on semantic routes and/or semantic profiles (e.g. groups specific, semantic identity specific, user specific etc.).

In further examples, the system flows the information between semantic fluxes and gates based on semantic routing and semantic profiles.

In some examples, the system monitors the change of data (e.g. via analyzing a rendering, bitmap, user interface control/artifact, window, memory buffer analysis, programming interface, semantic inference etc.) in the user interface and perform semantic analysis based on the new data and the mapping of the changed data.

In further examples, the system infers and identifies display semantics artifacts (e.g. of an airport app window, messaging app, geographic information system window, input/output control etc.), activations, locations and a further semantics based on I/O data (e.g. touch/mouse click) on the window and the system maps and creates semantic artifacts (e.g. models, trails, routes etc.) from such inference. It is to be understood that the mapping may be hierarchical, relative to the activated artifacts in a composable manner. Alternatively, or in addition the mapping may be absolute to the display surface whether composed or not (e.g. comprising multiple display artifacts and/or sub-models).

For semantic systems the "time" may be represented sometimes as a semantic time or interval where the time boundaries, limits and/or thresholds include semantic artifacts; additionally, the time boundaries may include a time quanta and/or value; sometime the value specifies the units of time quanta and the time quanta or measure is derived from other semantic; the value and/or time quanta may be potentially determined through semantic indexing factors.

The semantic indexing factors may be time (including semantic time), space (including location semantics) and/or drift (including semantic distance/drift) wherein such indexing factors may be derived from one another (e.g. a semantic of VERY CLOSE BY might infer a semantic of SUDDEN or SHORT TIME with potentially corresponding factors). As such, a semantic system is able to model the space-time-semantic continuum through semantic inference and semantic analysis.

In further examples, the semantic indexing may be used to index risk factors, cost factors, budgets and so on.

Semantic indexing represents changes in the semantic continuum based on semantics and/or semantic factors with some examples being presented throughout the application.

In an example, the system determines a first semantic at a first endpoint/link and a second semantic for an endpoint/link; further, the system determines a location for a new endpoint on an oriented link and/or endpoint determined by the first and/or second endpoint/link based on an indexing factor associated with a composite semantic which is a combination of the first semantic and the second semantic. In another example, the composite semantic is a combination between a semantic associated with a source model artifact (e.g. endpoint or link) and a destination model artifact and the indexing factor associates a new model artifact on the path/link between the source model artifact and the destination model artifact. The indexing factor may be associated with a semantic factor calculated/composed/associated with a semantic artifact; an indexing factor may be used to index semantic factors. Once the system infers an indexing factor for a semantic it may update the semantic model and add endpoints on all semantic endpoints and/or links associated with the semantic via semantic relations or semantic groups. Further the system may redistribute the existing or newly inferred semantics on the new determined endpoints and establish new oriented links and rules.

In an example the system determines an object/feature boundary based on indexing wherein the system indexes and/or merges/splits the on and/or off boundary artifacts until it achieves a goal of inferring high-quality object semantics.

The system may map hierarchical semantic models to artifacts in the semantic field and infer semantics at various hierarchical levels, wherein higher hierarchical levels provide a higher semantic level of understanding of feature and identification semantics (e.g. nails, legs, hands, human, man, woman, John Doe, classmates etc.).

During inference the system maps semantic network models to objects artifacts and so on and performs further inference in the semantic field. In some examples the mapping is based on boundary conditions and detection.

In other examples the indexing is used in what-if and projected analysis, mapping and/or rendering the semantic model based on goals and forward/backward hierarchical semantic inference. In such examples the system may invalidate and/or delete related artifacts post indexation (e.g. first and/or second endpoints/links).

The indexing factors may be related with indexing values related with actuation and or commands (e.g. electric voltages, currents, chemical and biological sensors/transducers etc.).

The indexing factors may have positive or negative values.

Semantic factors and indexing factors may be used to activate and control analog or digital interfaces and entities based on proportional command and signal values. The system may use indexed and/or factorized analog and digital signals to control such electronic blocks, interfaces, other entities, electric voltages, currents, chemical and biological sensors and transducers etc.

The system may use variable coherent inferences based on at least one (variable) coherence/incoherence indicators and/or factors. In some examples, the semantic analysis of circumstances associated with the coherence/incoherence factors deem the variable coherent inference as coherent and/or incoherent based on the (semantic) factorization of the coherence/incoherence indicators and/or factors.

The semantic composition infers, determines and guides the context of operation. Semantic analysis may determine semantic superposition in which a semantic view frame and/or view comprises multiple meanings (potentially contradictory, high spread, high entanglement entropy, incoherent, non-composable—due to lack of composability, budgets and/or block/not allowable rules, routes and/or levels) of the context. The inference in semantic views may yield incoherent inferences which determine incoherent superposition artifacts (e.g. semantic factors, groups, routes etc.). Alternatively, or in addition, the inference in semantic views yield coherent inferences which determine coherent superposition artifacts (e.g. semantic factors, groups, routes etc.). The semantic expiration may control the level of superposition (e.g. the factor of conflictual meanings or a sentiment thereof). The superposition is developed through semantic analysis including semantic fusion in which a combined artifact represents the composition and/or superposition of two or more semantic artifacts. Thus, semantic expiration may be inferred based on semantic fusion and superposition. In an example, the system performs fusion (e.g. potentially via multiple routes) and infers that some previous inferred semantics are not needed and therefore learns a newly inferred semantic time management rule which expires, invalidates and/or delete them and the semantic model is updated to reflect the learned rules and artifacts. Analogously, the system may use projections to associate and/or group ingested and/or inferred signals and/or artifacts with projected semantic artifacts; it is to be understood that such learned semantic groups, rules and further (associated) semantic artifacts may expire once the system perform further analysis (e.g. collapses them, deems them as nonsensical, decays them etc.).

The system learns artifacts via multiple semantic routes. Further, the semantic routes are factorized by the multiplicity of associated semantic artifacts. In an example the system factorizes a semantic route based on an association with an inferred semantic; further, the inferred semantic is factorized based on the associated semantic routes.

Coherent semantic groups may be inferred based on coherent and/or safe inferences (with less need of evaluating blocking routes and/or rules on leadership and/or group semantics) comprising the members of the group.

The coherency and/or entanglement of semantic groups may increase with the increased semantic gate publishing, factorizations, budgets and/or challenges within the group. Further, increases in coherency and/or entanglement may be based on high factorized collaborative inferences including inference and/or learning of sensitive artifacts (e.g. based on a sensitivity and/or privacy factor, risk of publishing (to other groups), bad publicity, gating, weights and/or access control rules).

Factors and/or indicators (e.g. likeability, preference, trust, risk etc.) may influence the coherency and/or entanglement of semantic groups.

The increased affirmative coherency and/or resonance of (affirmative) semantic groups may increase likeability/preference/satisfaction/trust factors and/or further affirmative factors. Analogously, the decreased affirmative coherency and/or resonance of semantic groups may decrease likeability/preference/satisfaction/trust factors and/or further affirmative factors.

The system may prefer non-affirmative coherency and/or resonance of (non-affirmative) semantic groups in order to increase the semantic spread.

The affirmative factors may comprise affirmative-positive and/or affirmative-negative factors.

Affirmative-positive factors are associated with confidence, optimistic, enthusiastic indicators and/or behaviors. Analogously, affirmative-negative factors are associated with non-confidence, pessimistic, doubtful, unenthusiastic indicators and/or behaviors.

Affirmative-positive and/or affirmative-negative may be used to model positive and/or negative sentiments. Further, they may be used to asses, index and/or project (realizations) of goals, budget, risks and/or further indicators.

Coherent and/or resonant semantic groups exhibit lower entanglement entropy on leadership and/or group semantics while incoherent semantic groups may exhibit higher entanglement entropy. Semantic indexing may be used to implement hysteresis and/or diffusion. Semantic indexing may be inferred based on diffusion (e.g. atomic, electronic, chemical, molecular, photon, plasma, surface etc.) and/or hysteresis analysis. Further, the system may use semantic diffusion to implement semantic hysteresis and vice-versa. Semantic superposition may be computed on quantum computers based on the superposition of the quantum states. Alternatively, other computing platforms as explained in this application are used for semantic superposition.

The system may budget and project superposition factors. In some examples, a user may specify the maximum level and/or threshold interval of superposition for inferences, views, routes, goals and other inference and viewing based artifacts; further, it may specify superposition budgets, factors and goals.

The semantic field comprises a number of semantic scenes. The system may process the semantic field based on semantic scenes and eventually the factors/weights associated to each semantic scene; the semantic scenes may be used to understand the current environment and future semantic scene and semantic field developments. A semantic scene can be represented as a semantic artifact. In some examples the semantic scenes comprise localized semantic groups of semantic artifacts; thus, the semantic scenes may be represented as localized (e.g. simple localized and/or composite localized) semantic models and groups.

A semantic group represents a grouping of artifacts based on at least one semantic relationship. A semantic group may have associated and be represented at one or more times through one or more leaders of artifacts from the group. A leader may be selected based on semantic analysis and thus might change based on context. Thus, when referring to a semantic group it should be understood that it may refer to its leader or leaders as well. In some examples, the leaders are selected based on semantic factors and indicators.

A semantic group may have associated particular semantic factors (e.g. in semantic views, trails, routes etc.).

A semantic view frame is a grouping of current, projected and/or speculative inferred semantics. In an example a semantic field view frame comprises the current inferred semantics in the semantic field; a semantic scene view frame may be kept for a scene and the semantic field view frame is updated based on a semantic scene view frame. A peripheral semantic scene may be assigned lower semantic factors/ weights; as such there may be less inference time assigned to it. Additionally, the semantic group of sensors may be less focused on a low weight semantic scene. In an example, a semantic scene comprising a person riding a bicycle may become peripheral once the bicycle passed the road in front of the car just because the autonomous semantic system focuses on the main road. A semantic view frame may be represented as a semantic group and the system continuously adjusts the semantic factors of semantics, groups, objects and scenes.

Semantic view frames may be mapped or comprised in semantic memory including caches and hierarchical models.

For a peripheral semantic scene, the semantic system retains the semantics associated with that scene (e.g. semantic scene view frame) longer since the status of the scene is not refreshed often, or the resolution is limited. In some examples the refreshment of the scenes is based on semantic analysis (e.g. including time management) and/or semantic waves and signals. A predictive approach may be used for the semantic scene with the semantic system using certain semantic routes for semantic inference; semantic routes may be selected based on the semantics associated with the semantic scene and semantics associated with at least one semantic route. In the case that the peripheral scene doesn't comply with projections, inferred predicted semantics or semantic routes the semantic system may change the weight or the semantic factor of that semantic scene and process it accordingly.

In an example, once the bicycle and the rider becomes peripheral the system may refocus the processing from that scene; if there is something unexpected with that semantic scene (group) (e.g. a loud sound comes from that scene, in which case the system may infer a "LOUD SOUND" semantic based on the sound sensors) the system may refocus processing to that scene.

In further examples, the system blocks/gates some sounds and/or factorizes others based on the perceived peripherality and/or importance (e.g. based on location, zone, semantic identity, semantic etc.). Further, the system may infer leadership semantic artifacts associated with the non-peripheral and/or peripheral scenes and use them to enhance the non-peripheral scenes and/or gate peripheral scenes.

Analogously with peripheral scene analysis the system may implement procedural tasks (e.g. moving, climbing stairs, riding a bicycle etc.) which employ a high level of certainty (e.g. low risk factor, high confidence factor etc.). Thus, the procedural semantic analysis and semantic view frames may comprise only the procedural goal at hand (e.g. RIDING THE BYCICLE, FOLLOW THE ROAD etc.) and may stay peripheral if there are no associated uncertainties (e.g. increasing risk factor, decreasing confidence/weight factor etc.) involved in which case semantic artifacts may be gated to/from higher semantic levels.

The system uses semantic analysis, factors and time management to determine the reassessment of the scenes/frames and/or the semantic gating for each scene/frame (and/or semantic groups thereof).

In rapport with a semantic view, the semantic view frames which are peripheral, predictive and/or have highly factorized cues (e.g. based on low entanglement entropy) the semantic time quanta and/or budgets may appear to decay slower as they may require less semantic time and/or entanglement entropy budgets.

Semantic inference based on semantic composition and/or fusion allow for generalization and abstraction. Generalization is associated with composing semantic/s and/or concepts and applying/assigning them across artifacts and themes in various domains. Since the semantics are organized in a composite way, the system may use the compositional ladder and semantic routing to infer semantic multi domain artifacts.

Generalization rules may be learned for example during semantic analysis and collapsing artifacts composed from multiple semantic fluxes and/or gated semantics.

In some examples generalization rules learning comprises the inference and association of higher concepts and/or semantic artifacts (e.g. rules, routes, model artifacts etc.) in rapport with fluxes, signals, waveforms and/or semantic waves.

It is to be understood that particular semantics may be available, associated and/or inferred only within particular hierarchical levels, endpoints, semantic groups (e.g. of endpoints, components etc.) and/or stages. Thus, when a semantic signal and/or wave transitions in the semantic network, those semantics may be decoded and/or inferred only in those particular contexts.

A semantic group may comprise artifacts which change position from one another. The semantic engine identifies the shapes and/or trajectories of one artifact in relation with another and infers semantics based on relative shape movement and/or on semantic shape. The trajectory and shapes may be split and/or calculated in further semantic shapes, routes and/or links where the system composes the semantics in shapes or links to achieve goals or factors. The semantic engine may determine semantic drift and/or distance between artifacts based on endpoints, links, semantics assigned to artifacts (including semantic factors), indexing factors and/or further semantic analysis.

The system may infer sentiments for the distance and motion semantics based on the context. In an example, if the system is in a 75% TAKEOVER FRONT CAR drive semantic as a result of a 75% SLOWER FRONT CAR and it is in a semantic route of FRONT CAR FAR, INCOMING CAR FAR it may infer a REASONABLE RISK for takeover while further using a semantic trail of FURTHER APPROACH THE FRONT CAR, PRESERVE VISIBILITY; as hence, the risk is reassessed based on the semantic trail, view inferences and further semantic routes (e.g. CLOSED GAP, FRONT CAR 90% SLOW, INCOMING CAR 40% FAST, CAN ACCELERATE FAST 70% and thus the risk indicator for TAKEOVER FRONT CAR is still within contextual preferences and/or biases) and the drive semantic affects the semantic routing and orientation (e.g. takeover actions). It is to be understood that the system may adjust the factor for the drive semantics (e.g. 25% TAKEOVER FRONT CAR) based on further inferences and risk assessment (e.g. 40% SLOWER FRONT CAR, 90 HIGH TRAFFIC—>NOT WORTH RISK) and/or delay and/or expire the drive semantic altogether; it is understood that the delay and/or expiration may be based on semantic indexing (e.g. time, space) and/or time management wherein the system uses existing and/or learned artifacts. In further examples, the system infers a CAR CRASH associated with a semantic group identity in a semantic view and as hence it adjusts the routes, rules and/or model to reflect the risk factors associated with the particular semantic group (e.g. in the semantic view context). It is to be understood that the system may use semantic (view) shaping to infer and/or retain particular semantic artifacts reflecting contexts captured in (hierarchical) semantic views potentially in a hierarchical manner. The semantic system also groups artifacts based on semantic inference and use those groups in further semantic inference. In our example the system may detect object types or complex semantics based on such semantic groups (e.g.

group sensors, settings and detections and infer meanings, infer travelers by detecting flows of grouping of detections, features, clothing items and belongings; infer that a person is carrying a red bag etc.).

It is to be understood that the semantic system is a hybrid composable distributed cloud and as such it distributes, groups, compose and fusion various modalities detections in an optimized manner. The modalities may comprise a diverse spectrum of electromagnetic sensing.

A semantic stream is related with a stream of non-semantical and semantic information. A semantic stream may transmit/receive data that is non-semantical in nature coupled with semantics. As an example, if a camera or vision system mounted on a first location or first artifact provides video or optical data streaming for the first artifact, the first artifact may interpret the data based on its own semantic model and then transfer the semantic annotated data stream to another entity that may use the semantic annotated data stream for its own semantic inference based on semantic analysis. As such, if a semantic scene in a video stream, frame or image is semantically annotated by the first system and then transferred to the second system the second system may interpret the scene on its own way and fusion or compose its inferred semantics with the first system provided semantics. Alternatively, or additionally, the annotation semantics can be used to trigger specific semantic drives and/or routes for inference on the second semantic system. Therefore, in some instances, the semantic inference on the second semantic system may be biased based on the first system semantic interpretation.

In some examples a semantic stream may be comprised from semantic flux channel and stream channel; such separation may be used to save bandwidth or for data security/privacy. As such, the semantic flux is used as a control channel while the stream channel is modulated, encoded, controlled and/or routed based on the semantics in the semantic flux channel. While the channels may be corrupted during transmission, the semantic flux channel may be used to validate the integrity of both the stream channel and semantic flux channel based on semantic analysis on the received data and potentially correct, reconstruct or interpret the data without a need for retransmission.

It is to be understood that the semantic stream may comprise semantic wave and/or wavelet compressed and/or encrypted artifacts.

In another example, the semantic flux channel distributes information to peers and the stream channel is used on demand only based on the information and semantic inference from flux.

Further, the system may use authorization to retrieve data from the flux and/or stream channel; in an example, the authorization is based on an identification data/block, chain block and/or the authorization is pursued in a semantic group distributed ledger.

The system may associate semantic groups to entities of distributed ledgers. The distributed ledger semantic group may be associated with multiple entities and/or users; alternatively, or in addition, it may be associated with identities of an entity, for example, wherein the distributed ledger comprises various user devices. Sometime the distributed ledger is in a blockchain type network.

Virtual reconstruction of remote environments, remote operation and diagnosis are possible based on semantic models and real time semantic technologies. The objects from the scenes, their semantic attributes and inter-relationships are established by the semantic model and potentially kept up to date. While such reconstruction may be based on transfer models, in addition or alternatively, they may be based on virtual models (e.g. based on reconstruction of or using semantic orientation and shaping).

Sometimes, the ingesting system assigns a semantic factor (e.g. weight) to the ingested information; the assigned factor may be assigned to fluxes/streams and/or semantics in a flux/stream.

Themes are semantic artifacts (e.g. semantic, semantic group) that are associated with higher level concepts, categories and/or subjects.

The semantic routes may be classified as hard semantic routes and soft semantic routes.

The hard-semantic routes are the semantic routes that do not change. At times (e.g. startup or on request), the system may need to ensure the authenticity of the hard-semantic routes in order to ensure the safety of the system. Thus, the hard semantic routes may be authenticated via certificates, keys, vaults, challenge response and so on; these mechanisms may be applicable to areas of memory that store the hard semantic routes and/or to a protocol that ensure the authentication of those routes. In some examples the hard semantic routes are stored in read only memories, flashes and so on. Semantic routes may be used for predictive and adaptive analysis; in general, the semantic routes comprise a collection of semantic artifacts and potential synchronization times; the semantic routes may be represented as a semantic group of semantic artifacts including semantics, groups, rules etc.; they may be identified based on at least one semantic. They may be also associated with semantic rules (e.g. time management, access control, factoring, weighting, rating etc.).

While the semantic routes are used for semantic validation and/or inference they may be triggered and/or preferred over other semantic routes based on context (e.g. semantic view, semantic view frame).

Semantic routes may be represented, associated and/or identified with semantic artifacts (e.g. semantic and/or semantic group) and as such they benefit from general semantic modeling and analysis. Semantic routes may comprise or be associated with semantic artifacts, semantic budgets, rewards, ratings, costs, risks or any other semantic factor.

In some instances, semantic routes representation comprises semantic groups and/or semantic rules.

Semantic routes may be organized in a hierarchical manner with semantic routes comprising other semantic routes. Such hierarchical structure may be recursive.

The semantic rules may be grouped in semantic groups and participate in semantic inference.

Analogously with the hard-semantic routes the semantic rules may be classified as hard or soft.

The semantic routes and rules may encompass ethics principles. Ethics principles of semantic profiles and/or semantic groups may model "positive" behavior (e.g. DO, FOLLOW artifacts etc.) and/or "negative" behavior (DON'T DO, DON'T FOLLOW artifacts etc.) and their associated factors; as specified the "positive" and "negative" behavior may be relative to semantic profiles and/or semantic groups.

Ethics principles may be based and/or relative to semantic profiles comprising ethics semantic routes and rules; in some examples, the ethics principles are comprised in hard semantic and/or highly factorized trails, routes and/or rules. Semantic analysis may use ethics principles for semantic factorization. In some examples, during inference, positive behavior artifacts within or as related with semantic profiles and/or semantic groups and associated circumstances would be preferred to negative behavior based on a reward to risk ratio interval thresholding. The reward may be based on publicity (e.g. gating) of behavior based inference; further the risk may entail bad publicity (e.g. gating of semantics which would cause "negative" behavior inference (relative to the particular semantic identities, semantic profiles) in collaborative semantic fluxes and/or semantic groups.

Projections of publicity (e.g. positive or negative) may be inferred through propagation and/or diffusion of gated semantics through various leadership artifacts and/or semantic fluxes. Thus, because particular fluxes may act as leaders, it is important to project the propagation and/or diffusion based on goals. In some examples, in cases where the budgets are low, the system may diffuse semantics which will first reach a "positive influence" leader as opposed to a "negative influence" leader. In further examples, the system may perform semantic orientation, routing and/or gating in order to achieve the publicity and/or influencing goals. It is to be understood that a "positive influencer" leader is relative to the goals of publisher and not necessarily towards the goal of the influencer (e.g. the influencer may have a negative behavior towards (NURSE) (JANE) artifacts but because the influencer's negative factors/ratings on (NURSE) (JANE) artifacts propagate and/or diffuse in groups which have low ratings, high risk and/or are "negatively" factorized of routes comprising the influencer then the overall goal of generating positive ratings on those groups may be achieved.

The representation of semantic groups may include semantic factors assigned to each group member. In some examples semantic factors determine the leaders in a group in particular contexts generated by semantic analysis. Sometimes, membership expiration times may be assigned to members of the group so, when the membership expires the members inactivated and/or eliminated from the group. Expiration may be linked to semantic rules including time management rules; further factor plans with semantic factors and semantic decaying may determine invalidation or inactivation of particular members. The semantic routes may be organized as a semantic model and/or as a hierarchical structure in the same way as the semantics and semantic groups are organized and following similar semantic inference rules.

The system may infer semantics by performing semantic inference on the semantic groups. In an example, the system may compose and fuse two semantic groups and assign to the new group the composite semantics associated with the composition of the first group semantics and the second groups semantics. Group leader semantics may be composed as well besides the member semantics. In some cases, only the leader semantics are composed. By combining the leader semantics with member semantics, semantic timing and decaying the system may infer new semantic rules (e.g. semantic time rules).

Further, in an example, the system performs semantic augmentation while inferring and/or identifying a person (JOHN) performing an activity (BASEBALL); using semantic analysis based on multiple semantic trails and routes it infers that JOHN's skills factors are high and pursues a goal to EXPRESS OPINION TO BILL of the inference based on a semantic route of IMPRESSED SO EXPRESS OPINION TO PAL. Thus, based on a route for an template of PRONOUN VERB ADJECTIVE and further, based on grouping of JOHN as a (THIRD, ((3 RD), $3^{rd}$)) PERSON based on PRONOUN routing, the inference may establish that a leadership semantic is 3 RD PERSON; as such, when being routed within the semantic network it may select artifacts that comply with such leadership semantic in semantic groups and further routes. Further, the system may have semantic groups such as PRONOUN ((1 ST PERSON, ALL GENDERS, "I"), (2 ND PERSON, ALL GENDERS, "YOU"), (3 RD PERSON, MALE, "HE"), (3 RD PERSON, FEMALE, "SHE")); and further IS (3 RD PERSON, ALL GENDERS); and further GOOD (ALL PEOPLE (1 ST PERSON, 2 ND PERSON, 3 RD PERSON), ALL GENDERS (MALE, FEMALE)) and thus the system may determine a semantic augmentation of JOHN IS GOOD based on a leadership semantic of 3 RD PERSON and other semantic analysis as appropriate.

In a further example of abstraction learning, the system may infer from BILL's voice signals that JOHN IS GOOD and because has semantic groups that associate IS with VERB and GOOD with ADEJCTIVE it may infer a semantic route, template and/or semantic group of PRONOUN VERB ADJECTIVE; and further, similar and/or other semantic artifacts and/or relationships whether factorized or not. Further factorization may occur on such learned artifacts based on further semantic analysis.

Semantic decaying occurs when a quantifiable parameter/factor associated with a semantic artifact decays or varies in time, most of the time tending to a reference value (e.g. null value or 0); as such, if the parameter is negative decaying is associated with increases in the semantic factor value and if the factor is positive decaying is associated with decreases in factor's value. Sometimes, when the semantic decays completely (e.g. associate factor is at the reference value or interval) the semantic may be inactivated, invalidated or disposed and not considered for being assigned to an artifact, semantic route, semantic rule, semantic model and/or inference; further, based on the same principles the semantic is used in semantic group inference and membership. The system asks for feedback on group leadership, semantic factors and/or group membership. The feedback may be for example from users, collaborators, devices, semantic gates and other sources.

In some examples, the reference decaying value is associated with applied, activation/deactivation, produced or other voltages and currents of analog or digital components and/or blocks. In further examples such values are associated with chemical or biological components and mixing elements.

Quantifiable parameters such as semantic factors may be assigned or associated with semantics. The semantic factors may be related to indicators such as weights, ratings, costs, rewards, time quanta or other indicators and factors. In some cases, the semantic factors are used to proportionate control parameters, hardware, I/O, analog and digital interfaces, control blocks, voltages, currents, chemical and biological agents and/or any other components and/or interfaces. Those quantifiable parameters may be adjusted through semantic inference.

The semantic factors may be associated to a semantic (e.g. semantic identity) implicitly (directly) or explicitly via a semantic indicator in which a semantic specifies the type of indicator (e.g. risk, rating, cost, duration etc.) and the semantic factors are associated with the semantic via semantic indicators.

The semantic factors may be associated to a semantic via semantic groups which may comprise the semantic, the semantic indicators and/or the semantic factors in any combinative representation of a semantic group. As such, the semantic factors participate in semantic inference and analysis.

When a semantic factor is assigned directly to a semantic the system may associate and interpret the indicator associated with the factor implicitly based on context. Alternatively, or in addition, the factor is assigned to various indicators based on context.

The factors are associated with degrees, percentages of significance of semantic artifacts in contextual semantic analysis.

Implicit or explicit semantic indicators may be defined, determined and/or inferred based on a context. In an example an indicator is inferred based on goals. In other examples multiple indicators are determined for a particular goal inference. In some cases, the system may substitute an indicator over the other, may infer or invalidate indicators based on semantic inference. As with other semantic rules the system may comprise indicator rules that specify the interdependencies between semantic indicators based on time management, semantic time, weights, ratings, semantics, semantic groups, semantic routes, semantic shapes and other semantic artifacts.

Semantic indicator rules and any other semantic rules may be associated with semantic artifacts, semantic factors and indicators. As such the system may perform recursive inference which is controlled by factor rules, decaying and other semantic techniques. Further, the semantic rules are inferred, invalidated, learned and prioritized based on such factor techniques; in general, the semantic techniques which apply to semantic artifacts apply to semantic rules.

Semantic factors may be associated with symbols, waveforms and patterns (e.g. pulsed, clocked, analog etc.). The association may be direct through semantics or semantic model. Further the semantic factors may be used in hierarchical threshold calculations (HTC) algorithms to determine a mapping to an endpoint.

Decaying and semantic factors may be inferred and learned with semantic analysis. In some examples the system learns decaying and factor semantic rules and semantic routes.

The semantic learning may include inferring, linking and/or grouping a multitude of trails and routes based on variation of circumstances (e.g. location, anchor, orientation, profile, environment, sensor, modality, semantic flux, route etc.).

In further examples, the system optimizes the inference by factorizing and/or learning relationships in the network semantic model. In some examples the system uses the semantic analysis (e.g. based on action/reaction, action/reward etc.) to reinforce routes and paths (e.g. based on rewards, goals etc.). As such, when the system infers artifacts that are not against the DO NOT guidelines (e.g. blocked semantics, rules, routes), it may collapse the semantic artifacts, link and/or factorize them. In further examples, the system may cache such routes and/or map them at lower or higher level depending on factorization and/or theme. Further, when the system infers semantic artifacts which are against DO NOT (BLOCK) rules and/or guidelines it may associate and/or collapse them with semantic artifacts based on DO semantics, artifacts and/or rules. It is to be understood that the DO and DO NOT semantic artifacts may be associated with time management rules (e.g. it may be allowed to DO a BATTERY DISPOSAL in a HAZARDOUS RECYCLING circumstance while in all other circumstances the DO NOT artifacts apply).

When the system infers a gating rule it may adjusts and/or invalidate rules, routes and/or further artifacts which may activate gating based on such rule. If the gating is a block/deny rule the system may decay such artifacts. If the gating is based and/or controlled on interval factor thresholding the system may adjust the semantic rules.

A semantic time budget may comprise a time interval or time quanta required to perform an inference; in some examples the semantic time budget is based on semantic time. Semantic cost budgets comprise an allowed cost factor for the semantic inference. Semantic budgets may comprise and/or be associated with other factors and indicators (e.g. risk, reward etc.). Semantic budgets may be based on predictions/projections based on a variety of factors and may be associated with semantic composition, time management rules, access control rules and/or semantic routes. Also, they may be correlated with the hardware and software components characteristics, deployment and status in order to generate a more accurate budget inference.

Semantic budgets may include inferences about the factors to be incurred until a semantic goal or projection is achieved; also, this may comprise assessing the semantic expiration, semantic budget lapse and/or semantic factor decaying. Such assessment of factors may be interdependent in some examples.

Sometimes, the semantic thresholds and/or decaying are based on a bias where the bias is associated with particular semantics, factors and/or budgets.

In an example, semantic budgets may be specified by semantic time intervals. Further, semantic budgets may be specified based on decaying, factor and indexing rules.

In further examples the semantic budgets may comprise and/or be associated with prices (e.g. utilizing 10 quanta budgets in a computing and/or energy grid environment comprises 0.4 W power consumption and/or 0.05$ charge etc.). It is to be understood that the inferences may be based on any budget including time, price, risk, reward and/or other factors and indicators. Further, the system may comprise time management rules specifying that the utilization of 10 quanta budgets in particular circumstances (e.g. time management) may entail additional bonus budgets made available (potentially also having an expiration time management) to the user and/or flux and thus the system may associate and/or index budgets with particular components, units, fluxes, routes and further factorize them (e.g. factorize a PREFERRED indicator for the bonus provider flux in rapport with particular inferences).

Semantic (time) budgets enable crediting and/or rewarding providers for their capabilities (at a semantic time and/or used during a (published) semantic time). As such, a user/consumer of the capability (at a semantic time) incurs a charge and/or is debited for the respective capability budget while the provider is credited with the budget for the respective capability.

A creditor (or provider of credit/crediting and/or consumer of debit/debiting) may be associated with a provider (e.g. through a capability and/or asset) and/or a debtor (or consumer of credit/crediting and/or provider of debit/debiting) may be associated with a consumer through an interest.

The creditor/provider agent may be a higher-level supervisor to a capability and/or asset (handed over) (for lower (factorized) level temporary supervision) of a debtor/consumer agent in a (potential recursive) hierarchical manner. The temporary handover may be based on a contract comprising clauses and/or further associated semantic times.

While in the application we specify higher (–) level or similar it is to be understood that this may be substituted for/to higher factorized level. Similarly, lower (–) level or similar may be substituted for/to lower factorized level. Further, H/ENT of high/low may be applied to factorizations.

A higher-level supervisor may have access to higher (factorized) level and/or hard semantic routes and/or behavior configuration while a temporary (lower level) supervisor may not.

A consumer may compose and/or publish capabilities under temporary supervision while potentially composing and/or indexing their associated budgets and/or (associated) semantic times (based on a set of rules and/or routes). In examples, the UNDOES have under temporary supervision (e.g. based on a contract comprising clauses and/or semantic times) S2P2 and/or its power (generation) unit/storage from DOES and S3P3 and/or its power (generation) unit/storage from SP3. As such, the UNDOES may combine and/or couple the power (generation) capabilities into a composable power (generation) capability and/or further adjust the semantic times and/or budgets.

The system may compose clauses of a contract, explanations and/or purpose associated with capabilities.

In examples, DOES/S2P2 provides to UNDOES 12V at 10A WHEN DELOREAN PRESENT while S3P3 provide to UNDOES 12V at 6 A and further 12V at 10 A WHEN S2P2/S3P4 PRESENT WITH 80% CHARGE. As such, the UNDOES capability may be fused and/or composed such as providing an intrinsic/default 12V at 6 A and/or further 12V at 10 A WHEN DELOREAN/S2P2/S3P4 PRESENT WITH S2P2/S3P4 80% CHARGED and/or 12V at 6 A at any other (high entropy) semantic time.

It is to be observed that based on semantic times the capabilities may compose (e.g. the power provided to UNDOES comprises power provided by S3P3 and S2P2; and/or the power generated by the DELOREAN (and S3P3) (and S2P2) etc.

Further, the credits generated by the UNDOES power (generation) capabilities (e.g. through usage and/or possession by interested parties) may comprise credits to higher-level providers (e.g. DOES, SP3) based on contractual clauses. As such, when the UNDOES capability is acquired, hand-over and/or possessed portions of credits may go to DOES and/or SP3 and/or further higher-level supervisors (agents/brokers).

The portions of the credits may be based on semantic times. In some examples, UNDOES is credited with supervision use of a DELOREAN until the first snow and further, based on the clauses and/or profile preferences DOES/SP3 are/is credited with supervision use of the DELOREAN within the credited UNDOES semantic time to first snow (e.g. until JANE arrives). Alternatively, or in addition, the system may apply indexing and/or factorization clauses to portion credits (e.g. 10% of credits and/or budgets, 90% of clean energy credits and/or budgets etc.). It is to be understood that such crediting may be hierarchical (e.g. because SP3 power generation capabilities are supervised by JOHN he may get portions of the SP3 credits generated by the UNDOES capability).

Similarly with crediting the system may apply and/or generate portions of debiting based on hierarchical consumer interests.

Credits and/or debits may be transacted and/or stored into a (user/device) digital wallet, blockchain, (virtual) (digital) bank/card account, on a device and/or on a tenant.

A capability liability is an (insured) obligation to provide/enable/allow a capability and/or perform/enable/allow an activity (at a semantic time) (within a budget) to a provider. In some examples, the semantic time may be based on inferences from the liable party related to a semantic flux associated with the provider. By H/ENT, a capability asset is an (insured) availability of the capability and/or the activity (at a semantic time) (within a budget) to the provider. It is to be observed that the provider may further barter/trade (portions of) his asset to an interested consumer; in some examples, the trade is based on a contract clause (comprising affirmative/non-affirmative (in rapport with the holder of liability/liable party) resonant destinations, semantic identities and/or semantic times) and/or approval from the holder of liability. As such, (portions of) the capability liability and capability assets may be distributed to multiple parties.

A capability based on a liability may be (only) published and/or marked as being based on liabilities from other parties.

In some examples, a capability based on a liability may comprise traceability and/or semantic trails comprising all liables' parties non-distorting (blurring) semantic identities.

Alternatively, or in addition, a capability based on a liability may comprise the number of (hierarchical) liable parties and/or associated (routes/trails/chains of) transactions.

A transaction (document/snippet) may be stored in a (container) memory as a record/block and may comprise the provider and/or consumer identities and/or further clauses and/or inferences. Parts of a transaction record/block/snippet may be blurred and/or encrypted. Alternatively, or in addition, a transaction document/snippet may be physically stored in a container; further, the document may be parsed based on inputs from (container) sensors.

Further transaction/contract information and/or semantic identities may be published/diffused from within the container(s) (at endpoints). In some examples, they may be associated with logistic laws, clauses and/or incoterms.

The system may check that stipulated transactions, clauses, constraints, protocols, semantic identities and/or handovers (at endpoints) match, are similar and/or not distorted between the inferred actual (at endpoints) and the (published) (carried) (documented) contractual clauses and/or further laws of the land. In case that they do not match the system may block (container) movement, route and/or diffuse to particular (likeable) endpoints/fluxes and/or perform semantic augmentation (to supervisors).

Alternatively, or in addition, the system my infer particular (transaction) (container) semantics (at endpoints) and the system routes, leaks and/or diffuses the items/containers to likeable endpoints (e.g. based on a drift between (published/configured/inferred) endpoint semantics and/or container (published/configured/inferred) semantics, projections etc.).

Alternatively, or in addition, the system may extract, receive and/or become more informed about the contractual clauses by retrieving and/or parsing data from other sources such as documents, web pages etc.

Alternatively, or in addition, the system may challenge fluxes.

Protocols, transactions and/or clauses may comprise activities. As such, the protocols, transactions and/or clauses may have associated and/or be factorized on a readiness criteria/indicator inferred based on the comprised activities readiness.

In some examples, a constraint/contractual clause (on/between fluxes, at Does house (recycling) endpoint(s) etc.) specifies that the agent/provider asset (e.g. DeLorean, (hazardous) container manipulator) should perform sanitization (protocols) after picking up the a hazardous substance container at the Does house and thus, the system determines the likeable sanitization capabilities, (sub)protocols and/or endpoints based on the publishing, availability and/or constraints (e.g. DO NOT clauses/rules at endpoints) and/or further asset (semantic identities/interests/capabilities/attributes).

In further examples, consumers/containers (devices/fluxes) may publish interests on how (assets/containers) to be manipulated at endpoints and the system may further matches it with (provider/agent) capabilities.

Publishing/capabilities/interests may comprise and/or be associated/grouped with constraints (e.g. such as not likeable/unlikeable, DO NOT, NO, AVOID, NOT etc.). As such, while projecting, matching and/or factorizing capabilities/interests the system may factorize the constraints (which may be or not included/comprised/linked/grouped with a (published) capability/interest). Alternatively, or in addition, the system may (project) factorize the constraints with and/or without the capabilities/interests.

Semantic trails (hierarchy) comprise(s) the progression in the execution of a transaction, protocol, clause and/or contract; a semantic trail (hierarchy) may comprise the (inferred) semantics (which may have assigned/linked/grouped handover/readiness/transaction snippets, transactions and/or documents) associated with the protocol, activities and/or further movement/manipulations/handovers/readiness.

Alternatively, or in addition, semantics in the semantic trails may be assigned and/or linked (manipulation/activity) video/image snippets which may be associated and/or linked with activities, transactions, readiness, handovers, documents and/or (further) clauses (at transaction/handover endpoints).

The system may semantically analyze the (likeability/resonance/drifts) between the semantic trails and the semantic routes of the protocol (goals) to infer likeable/resonant/drifted progression and/or readiness; further, the system may perform augmentation based on such inferences.

A capability based on liabilities may not publish a (full) traceability although publishing the number of liable parties and/or number of transactions (in a (block)chain). Alternatively, or in addition, partial traceability/trails may be published wherein particular semantic identities and/or (associated) transactions and/or chains are not published, blocked from publishing and/or blurred.

Alternatively, or in addition, a capability based on a liability may be published such as liable parties, transactions and/or (block)chains can be visualized and/or accessed as per publishing and/or access control. In similar ways, semantics and (further) linked artifacts in/with semantic trails may be published, diffused, gated and/or blurred.

Semantics and further assigned/linked/grouped artifacts in/with semantic trails may be published, diffused, gated and/or blurred.

In examples, semantic trails may be associated with movement of cargo and/or containers and the semantic trails comprise the semantics inferred during their movement (at/between endpoints). Furthermore, semantics in the semantic trails may be assigned and/or linked with/to a (occurring) transaction records, activities and/or chains (at an endpoint).

Alternatively, or in addition, semantics in the semantic trails may be assigned and/or linked (manipulation/activity) video/image snippets which may be (further) associated and/or linked with transactions, activities, goals and/or (further) clauses (at endpoints). Further, the assignment and/or linking may be based on semantic matching analysis between the trails (semantics) and routes (semantics) of transactions, activities, goals and/or (further) clauses (at endpoints). Alternatively, or in addition, the video/image snippets may be associated with the semantics in the trails/routes based on a semantic matching between the inferred video/image semantics and the semantics in the trails/routes (at endpoints).

In some examples, a semantic trail comprises conditions and/or inferred semantics and/or semantic times at endpoints. Alternatively, or in addition, they may comprise (transaction) semantic identities inferred at endpoints.

In some examples, (particular) liable parties and/or transactions are grouped and/or control accessed based on particular group semantics.

Particular semantic identities and/or transactions may be blurred as per semantic rules.

It is to be observed that a credit/debit (or (associated) debtor/creditor) and/or crediting/debiting and/or (linked/entangled) liability/asset are indicators and/or attributes in a high entropy relationship and thus, HENT inferences may apply to infer one from the other.

Further, based on semantic times a capability may be valued, debited and/or credited based on a particular semantic identity, profile, resonances and/or further circumstances. In examples, SOUP AT LUNCH (WHEN JOHN PRESENT OR PROJECTED TO ARRIVE (+/−10 MINS)) AND/OR (IN/FOR 30 MINS) may (be indexed to) resonate more and/or bear more credit and/or goodwill than SOUP AT DINNER AND/OR SOUP AT LUNCH IN/FOR 45 MINS and/or SOUP AT LUNCH AFTER JOHN LEAVES (e.g. for presence of resonant artifacts with John and/or for a particular resonant semantic group indicative (e.g. via factors, factorized indicators, resonance etc.) that soup is preferred at lunch vs dinner). Further, BEEF SOUP AT DINNER may bear no credit in case of a goal of EVERY DINNER WITHOUT MEAT (within particular semantic views). As such, the system projects (group/goal) resonances and/or entanglements at/around endpoints and/or (further) routes (at/for semantic times).

The capabilities, interests and/or further semantic times may determine entanglements and/or semantic groups (at/between endpoints). In examples, a goal and/or capability of S4P11 (endpoint) of SUPPLY PREMIUM GAS and/or 110V AT 10 A WHEN S2P2 ARRIVES/PRESENT/ABSENT may determine an/a (semantic time) affirmative entanglement between S2P2 (interest) and S4P11/endpoint as S4P11/endpoint provides a capability based on a semantic time (affirmative/non-affirmative) resonant/associated with S2P2's arrival/presence/absence and/or further interests. It is to be observed that the entanglement may be collapsed and/or observed in semantic views which comprise and/or project the goals and/or further routes of the entanglement and/or can infer the particular semantic times.

Alternatively, or in addition, an affirmative entanglement may comprise an affirmative grouping and/or resonance and/or (further) (associated) semantic identity based on a semantic time (e.g. associated with a S2P2 presence) and/or S4P11/endpoint.

In examples, as S3P10 doesn't know and/or cannot infer/project the entanglement semantic time it cannot observe the entanglement which may be (affirmatively/non-affirmatively) factorized as cloaked/random (in rapport with S3P10 semantic views). However, as S5P5 knows and/or projects that S2P2 is driving the DeLorean and/or is interested in PREMIUM GAS it can observe the entanglement and/or further (non-randomly) (affirmatively/non-affirmatively) factorizing it in (coherent) collapsible (semantic views) inferences.

The observing party of the cloaked entanglement (e.g. S5P5) requires energy to follow/collapse the entanglement. The non-observing party of the cloaked entanglement (e.g.

S3P10) may have (dark) (entangled) budgets/energy tunneled based on the affirmative resonance with S5P5. In some examples, the tunneled (energy) budgets are provided/tunneled through flux via an/a (dark) (flow) agent; in further examples, the tunneled (energy) budgets are provided/tunneled through quantum tunneling wherein an/a (dark) (flow) agent (e.g. associated with a (bonded) electron/atom/photon (flow) and/or further currents/beams) passes through an energy barrier and/or (associated) semantic divider/coupler gate.

In the example, S5P5 may have the capability (or routes and/or fluxes) and/or resonance to observe the cloaked entanglement of/to S3P10 (with S2P2 and S4P11/endpoint entanglement) and further (non-randomly) (coherently) collapsing it; such collapse may be achieved (hierarchically) via flux and/or affirmative resonance (with S3P10). As such, S5P5 is dark entangled with S3P10 and/or its cloaked entanglements.

Alternatively, or in addition, S5P5 may be (dark) entangled with (other) dark entanglements of S3P10. As such, dark entanglements may be hierarchically organized, accessible and/or collapsible.

S5P5 cannot observe and/or collapse a dark entanglement unless is affirmative resonant with S3P10. As S5P5 is or becomes non-affirmative resonant with S3P10 its inferences based on the dark entanglement and/or with S3P10 are invalidated/deleted.

It is to be observed that in rapport with a non-observing artifact (e.g. such as of S3P10) and/or associated non-informed semantic view the collapsing (or measurement) of the dark/cloaked entanglement can occur and/or be valued as random while for an observing party (e.g. such as of S5P5) and/or associated informed semantic view the collapsing may not be random. However, an informed party and/or semantic view within a higher/lower hierarchy (endpoint) may be uninformed within a lower/higher hierarchy (endpoint). As such, while in some circumstances S5P5 can non-randomly collapse a dark/cloaked entanglement (at an endpoint) in other circumstances S5P5 can only observe a dark entanglement as randomly collapsing (at an endpoint).

A semantic profile may encompass preferred capabilities and/or budget intervals at semantic times. As a user, device and/or vehicle/post is localized at endpoints it may communicatively couple and/or transfer profiles and/or preferences (e.g. selected based on inferred semantic (times)) and the system may assigns capabilities based on (further) matching (endpoint) capabilities with preferences and/or profiles.

In some examples, the debiting and crediting happen at the same (semantic) time while in other examples happen at different (semantic) times (potentially comprised both within another semantic time in a hierarchical manner).

A broker may keep associations between crediting, debiting and/or associated semantic times. The crediting and/or debiting may be based on bargaining by the broker.

The bargaining (by the broker) and/or the other brokerage activities and/or capabilities may be based on crediting and/or debiting.

Brokers may be (flux) coupled, organized, assigned and/or associated with endpoints and/or related artifacts/inferences in a hierarchical manner (e.g. such as resembling the endpoint hierarchy). As such, a broker may act as an intermediary between associated endpoints (and related artifacts/inferences and/or further crediting/debiting/bargaining) and further (higher level) broker (s)/brokerage (s).

The credits may be added and/or stored to a (credit/receivable) block and/or blockchain. The debits may be subtracted, marked (e.g. as debit/liability, subtracted etc.) and/or added to a (debit) block and/or blockchain.

In further examples, a trade system may be implemented wherein a user/consumer (e.g. Jane, a semantic group (comprising Jane) and/or associated semantic system (s)) bargains a projected ownership and/or supervision of an asset and/or (further) capability and/or budget (e.g. of an energy quanta, an issue of Health Affairs newspaper, a goodwill, an inventory etc.) (at sematic times) to incur a charge/liability for using an active capability of a provider/producer (e.g. a tree services provider, S2P2, John, semantic group (s) thereof etc.); in some examples, the capability may be current and/or projected. Further, the provider/producer may know that at a semantic time (e.g. within/at Jane's ownership and/or supervision) the possession and/or (further) supervision of the asset/item (e.g. handover of the asset by Jane and/or temporary supervision under Jane's supervision/ownership) may be (affirmatively) factorized (for its goals). Such matching may occur based on semantic times and/or may further be insured by insurance brokers and/or providers and/or assets under their ownership and/or supervision at semantic times.

It is to be observed that the possession may be affirmatively/non-affirmatively factorized (based on goals). In some examples, a/an (intrinsic) goal at an endpoint (e.g. order dispensing) may be to ensure that "that (manufactured/released) items are handed-over and/or possessed by allowable and/or likeable semantic identities". As such, the system may determine the ordering semantic identity and/or further match it with the handed over and/or possessing semantic identity after the item is manufactured/released. Further, the system may project and/or factorize risks/hazards that the items may be picked-up, handed over and/or possessed by not-allowable semantic identities.

Handover, pickup and/or possession allowability/non-allowability may be based on being affirmative with the goal at pickup endpoint and/or allowable semantic identities (in a hierarchical manner). In examples, Jane orders and picks up her latte; alternatively, or in addition, John and/or other semantic identities may pick up the latte (for Jane) (based on the Does grouping and/or Jane's semantic profile and/or indications). A pickup and/or possession by other (non-affirmative/non-resonant) entity (e.g. S0P97 etc.) may be deemed as not likeable and thus, it may perform augmentation to Jane, Does and/or at the endpoints (e.g. to warn possessor, supervisor etc.).

It is to be observed that Jane's pickup (or handover from the provider to consumer (Jane)) may be affirmative resonant at the endpoint based on her grouping and/or entanglement with an item. In examples, once Jane purchases the latte she is affirmatively entangled at the pickup endpoint with a (particular) semantic identity (e.g. latte for Jane, latte from CoffeeForU etc.) and/or latte (or asset and/or provider liability) and/or non-affirmatively entangled with the other available drinks and/or semantic identities.

Semantic profiles may specify pickup allowable semantic identities and the system further matches the semantic identities at pickup endpoints. In examples, Jane specifies/indicates (in a profile and/or by a gesture) that she wants her "one shot lattes" to be picked up (at semantic times) by herself and/or by "a person named/identified as John with a black tie", "a person showing up a poinsettia (on a device screen)", "a person performing my pickup gesture", "a person holding Health Affairs and showing up 9788 on a screen" etc.). Alternatively, or in addition, Jane specifies that "two shot lattes" be picked up by herself and/or "a nurse with Health Affairs" etc. As such, the system matches the semantic identities of the tendered/purchased/ready items with the semantic identities in the semantic profile (e.g. one shot latte, two shot latte) and further the inferred (possessing) semantic identities at pickup endpoints with the allowable semantic identities for pickup as specified in the semantic profiles. As such, the system may allow and/or not generate alerts if the semantic identities match and/or are little drifted and/or not allow and/or generate alerts otherwise.

In some examples, semantic profiles may have associated accounts and/or further semantic identities from which the funds to be withdrawn and/or associated items to be paid for. Alternatively, or in addition, it comprises gestures indicating an/the account(s) and/or a semantic identity/identities->account pair(s), group(s), endpoints and/or route(s). I some examples, Jane's semantic profile specifies that she wants to pay with a/her credit wallet for "coffees with a model" at "libraries and/or school", "Green POSs", "when the luminescence is low" and with a particular account/card otherwise.

Further, Jane's profile may have gestures associated with indicating the (credit) wallet and/or particular (virtual/physical) account/card (at POS/for purchases); alternatively, or in addition, Jane's profile comprises a gesture indicating ("coffees with a model" "Green POSs") "luminesce is low"->"credit (chain) wallet"; "coffees with a model and/or green POSs when luminescence is low use/pay credit (chain) wallet" etc.) routes/groups etc.

Capabilities may be matched based on semantic drift inference and/or semantic grouping. Further, the capabilities may be composed and/or published based on semantic identities, semantic groups, endpoints, supervisors and/or associated hierarchies thereof.

Capabilities may be published by operators and/or supervisors of semantic fluxes, endpoints and/or associated devices, modules, posts and/or carriers. Alternatively, or in addition, capabilities may be enabled, activated and/or published by users of devices, modules, posts and/or carriers. Publishing and/or availability (for matching) of capabilities may be indicated, configured and/or allowed/blocked/enabled/disabled/activated/inactivated pre-discovery (e.g. before being inferred) and/or post discovery (e.g. after being inferred).

The publishing may be configured and/or based on (inferred) semantic times. Alternatively, or in addition, the system infers a semantic and/or (further) semantic time and an operator/supervisor publishes based on the inferred semantic and/or (further) semantic time.

Publishing/capabilities/interests may comprise and/or be associated/grouped with constraints (e.g. such as not likeable/unlikeable, DO NOT, NO, AVOID, NOT etc.). As such, while projecting, matching and/or factorizing capabilities/interests the system may factorize the constraints (which may be or not included/comprised/linked/grouped with a (published) capability/interest). Alternatively, or in addition, the system may (project) factorize the constraints with and/or without the capabilities/interests.

The publishing may comprise and/or entail access control (e.g. to allow/block the publishing of a capability from/within an endpoint and/or link and/or (only) for particular semantics and/or semantic identities); further, the publishing may be associated with an oriented link and/or flux and thus, controlling the publishing from a first endpoint and/or flux to a second endpoint and/or flux. Further, the access control may entail applying an activation and/or enablement configuration to control the availability (within and/or outside an endpoint and/or link). In an example, an endpoint supervisor may configure (or indicate) the system to block/disable (projected) CT scan capabilities/interests at a first endpoint while allowing/enabling it at a second endpoint; thus, any (discovered, localized and/or inferred) CT scan capabilities or interests may not be discovered, published and/or matched at the first endpoint while at the second endpoint can. The block/disable (or similar) and/or allow/enable (or similar) may be based on an endpoint and/or further hierarchies (e.g. associated with supervisors, access control, compositional/composite (factorized) semantics etc.). In an example, Jane is factorized as a higher supervisor than John at a first endpoint and thus, the enablement by Jane of a tea pot capability "brew tea in 30 secs for 50 cents" may take precedence over John's disablement of the same capability at the endpoint (and/or encompassing endpoints). However, if John is factorized as a higher supervisor than Jane at a second endpoint encompassing the first endpoint, then the capability of "brew tea in/for 30 secs (for 50c/50 W (h))" is disabled within the second endpoint (but not within the first endpoint) as per John's (and Jane's) configuration.

Alternatively, or in addition, Jane is factorized as a higher supervisor than John at a first endpoint and thus, the publishing by Jane of a tea pot capability "brew tea in 30 secs" may take precedence over John's (publishing) blocking of the same capability at the endpoint (and/or encompassing endpoints). However, if John is factorized as a higher supervisor than Jane at a second endpoint encompassing the first endpoint, then the capability of "brew tea in 30 secs" may be invisible/unavailable (as published) within the second endpoint as per John's disable/blocking configuration. Alternatively, if John doesn't disable/block the capability at the second endpoint, then the published capability may be visible/available within the second endpoint (and/or further outside the second endpoint if John publishes it further and/or Jane is delegated by John with the rights to publish). Alternatively, or in addition, John delegates Jane to supervise all the publishing/access control/enablement regarding "tea" (or tea pot, brewing etc.) and thus, Jane's publishing/access control/enablement at the first point may be further published at the second endpoint (by Jane).

Alternatively, or in addition, Jane is delegated as a (publishing) supervisor and/or owner for tea pots (brewing) (capabilities/interests) within particular endpoints and/or all endpoints. It is to be understood that the access control rules may comprise and/or be combined to with item ownership and/or supervision. Further, publishing may comprise and/or be combined with supervising hierarchies, access control and/or further factorization.

It is to be observed that the enablement and/or access control may be based on encompassing semantics and/or further more localized associated semantics (e.g. "tea" encompasses more localized "tea brewing" etc.).

The enablement/disablement and/or allowed/blocked may be (hierarchically) intrinsic. In an example, if John disables/blocks "tea pot" capability at the second endpoint (as a second endpoint supervisor), then the first endpoint intrinsic status for the "tea pot" capability is disabled/blocked unless is enabled/allowed by Jane (as a first endpoint supervisor).

The matching, access control and/or publishing (of activities, capabilities, interests and/or further semantics) may be multilingual. As such, artifacts in one language are matched against artifacts in another language. In an example, the brew tea capability which may be published in English may be matched against an interest in another language (e.g. French, German, Spanish etc.). In addition, the availability of a semantic in a first language may be controlled by matching it with access control, publishing and/or enablement specified in other languages than the first.

Capabilities and/or interests may be access controlled (e.g. to control matching); thus, only particular semantics and/or semantic identities may have access to capabilities and/or interests. In examples, Jane publishes "brew tea in 30 secs for/at 50c/50 W (h)" to be accessible and/or available to a "person possessing and/or carrying Health Affairs". As previously exemplified, John may control and/or override within his endpoint the accessibility, publishing and/or diffusion to/of the capability; the control and/or override may entail enable/disable/allow/deny and/or specifying more localized access control, diffusion and/or publishing encompassing more localized semantic identities (e.g. "a nurse carrying Health Affairs", "a nurse reading Health Affairs" etc.). It is to be observed that an interest associated with such a capability may index a goodwill and/or budget based on (projected) endpoint semantics and/or (semantic) time; as such, the 50c/50 W (h) budget may be indexed based on (semantic) time (e.g. 30 sec, MEETING JANE+30 secs etc.)

Semantic times may be specified, organized and/or published in a hierarchical manner. In some examples, the (semantics associated/identifying with) encompassed semantic times are associated with a more specific localized and/or lower drift semantics (e.g. associated with semantic identities, objects, artifacts, assets, agents, themes etc.) than the (semantics associated/identifying with) encompassing semantic times. Further, they may be published, accessed and/or inferred based on the semantic hierarchy of semantic groups and/or supervisory/ownership hierarchies.

Goal based inferences allow the system to determine semantic routes, trails and/or budgets.

Semantic routes are used for guiding the inference in a particular way. In an example, a user specifies its own beliefs via language/symbology and the system represents those in the semantic model (e.g. using semantic routes, semantic groups etc.).

The semantic inference based on semantic routes may be predictable and/or speculative in nature. The predictability may occur when the semantic routes follow closely the semantic trails (portions of the history of semantics inferred by the system). Alternatively, the system may choose to be more pioneering to inferences as they occur and follow semantic trails less closely. In an example, a car may follow a predictive semantic route when inferring "ENGINE FAILURE" while may follow a more adaptive semantic route when inferring "ROLLING DANGER". The predictability and/or adaptivity may be influenced by particular semantic budgets and/or factors.

Such budgets and/or factors may determine time management and/or indexing rules. In some examples, the system infers/learns a semantic time rule and/or indexing factor based on low inferred predictability factor wherein the inference on a semantic artifact is delayed until the predictability increases.

Further, the system identifies threats comprising high risk artifacts in rapport to a goal. The system may increase speculation and/or superposition in order to perform inference on goals such as reducing threats, inconsistencies, confusion and/or their risk thereof; in case that the goals are not achieved (e.g. factors not in range) and/or confusion is increasing the system may increase dissatisfaction, concern and/or stress factors. The system may factorize dissatisfaction, stress and/or concern factors based on the rewards factors associated with the goal and the threat/inconsistency risk factors. It is to be understood that such factors and/or rules may be particular to semantic profiles and/or semantic views. In some examples the threats and/or inconsistencies are inferred based on (risk) semantic factors (e.g. risk of being rejected, risk of not finding an article (at a location) etc.).

When the system follows more predictable routes and the projections do not match evidential inference the system may infer and/or factorize dissatisfaction, concern and/or stress factors based on semantic shifts and/or drifts.

Dissatisfaction, concern and/or stress factors may be used to infer semantic biases and/or semantic spread (indexing) factors and, further, the system may infer semantic (modality) augmentation in order to reduce such dissatisfaction, concern and/or stress factors. It is to be understood that the augmentation may be provided and/or be related with any device based on circumstantial inference and/or semantic profiles. In an example, a detected sound (e.g. from a sound modality) is too loud, repetitive and/or unusual pitch which indexes the concern and/or stress factors and further determines the adjustment, composition/smoothing and/or cancelation of the sound; further, tactile (modalities) actuators may be inferred to be used to alter and/or divert the inference on the sound receptor trails to tactile trails and to further increase the semantic spread and thus potentially reducing the concern and/or stress factors. It is to be understood that the system may monitor the dissatisfaction, concern and/or stress factors correlated with the augmentation artifacts applied to reduce them and further perform semantic learning based on correlation.

The system may infer, adjust and/or factorize likeability, preference, satisfaction, trust, leisure and/or affirmative factors based on high (entanglement) entropy inference in rapport with (higher) dissatisfaction, concern and/or stress artifacts and vice-versa.

Confusion may decrease as more semantic routes/trails and/or rules are available and/or are used by the system.

Confusion thresholds may shape semantic learning. Thus, lower confusion thresholds may determine higher factorizations for a smaller number of routes/trails and/or rules associated to (past and/or future) (projected) inferences. Higher confusion thresholds may determine lower factorizations for a larger number of routes/trails and/or rules associated to (past and/or future) (projected) inferences.

As the system comprises more semantic routes/trails and/or rules with similar factorizations (e.g. no strong leadership artifacts) the superposition may increase as the evidence inference comprises more semantic spread.

For lower confusion thresholds the assessment of evidence (e.g. truth artifacts (provided) in the semantic field and/or flux) may be more difficult as the existing highly factorized artifacts are fewer and they may shape fewer highly factorized inferences with less semantic spread and decreased superposition.

Dissatisfaction, concern and/or stress factors may increase if higher factorized semantic artifacts in the inferred (projected) circumstances do not match evidence and/or evidence inference leads to confusion.

Dissatisfaction, concern and/or stress factors may be used to index and/or alter factorizations of the semantic artifacts used in evidence inference, in order to decrease such factors in future inferences, based on evidence inference and/or challenges (e.g. flux, user etc.).

The system may infer goals such as maintaining and/or gaining leadership which might signify involvement and/or importance in (group) decision making and further factorizations of dissatisfaction, concern and/or stress factors.

Increase in dissatisfaction, concern and/or stress factors may signify that the (group) pursued goals where not optimal. Further, such inferences may determine adjustments of routes, rules and/or further artifacts including factorizations of leadership, groups and/or semantic fluxes.

Predictability and/or speculative factors inferences may be associated with factors related to dissatisfaction, concern and/or stress factors (e.g. they may alter semantic spread). Further, authoritative rules may affect such factors as they may determine high consequential risk and/or fear factors.

The semantic route may be represented as a semantic artifact (e.g. semantic, semantic group) and participate in semantic analysis and semantic modeling.

Semantic route collapse occurs when during an inference the semantic engine determines (through generalization and/or composition for example) that a semantic route can be represented in a particular or general context through a far more limited number of semantics that the route contains. With the collapse, the system may create a new semantic route, it may update the initial semantic route, it may associate a single semantic associated with the original semantic route. In certain conditions the system may inactivate and/or dispose of the collapsed semantic route if the system infers that are no further use of the semantic route (e.g. through semantic time management and/or expiration). The semantics that may result from a route collapse may be compositional in nature. Additionally, the semantic engine may update the semantic rules including the semantic factors and as such it loosens (e.g. decaying) up some relationships and strengthen (e.g. factorizing) others.

The system creates and/or updates semantic groups based on semantic route collapse. Further, the system may collapse the semantic model artifacts (e.g. endpoints and/or links associated with the semantic route to a lesser number and/or to higher level artifacts).

Semantic route collapse may determine semantic wave collapse (e.g. low modulated semantic wave) and vice-versa.

Semantic wave collapse may depend on the frequency of electromagnetic radiation received by semantic systems, components, endpoints and/or objects. In an example, composition and collapse doesn't happen unless the electromagnetic radiation frequency reaches a threshold which further allows (the semantic unit, object's semantic wave) the gating/outputting of semantics. In some examples the threshold frequency is associated with the minimum electromagnetic frequency generating photoelectrons emissions (e.g. by photoelectric effect). It is understood that by tuning the composite, absorptive, dispersive, diffusive and/or semantic artifacts of (nano) meshes the threshold frequency at a location may be tuned and thus allowing fast hyperspectral semantic sensing.

The system builds up the semantic routes while learning either implicitly or explicitly from an external system (e.g. a user, a semantic flux/stream). The build-up may comprise inferring and determining semantic factors. The semantic routes may be used by the semantic system to estimate semantic budgets and/or semantic factors. The estimate may be also based on semantics and be associated with weights, ratings, rewards and other semantic factors.

The semantics that are part of the semantic route may have semantic factors associated with it; sometimes the semantic factors are established when the semantic route is retrieved in a semantic view frame; as such, the factors are adjusted based on the context (e.g. semantic view frame factor). While the system follows one or more semantic routes it computes semantic factors for the drive and/or inferred semantics. If the factors are not meeting a certain criterion (e.g. threshold/interval) then the system may infer new semantics, adjusts the semantic route, semantic factors, semantic rules and any other semantic artifacts.

Sometimes the system brings the semantic route in a semantic view frame and uses semantic inference to compare the semantic field view and the semantic view frame. The system may use semantic route view frames to perform what if inferences, pioneer, speculate, project and optimize inferences in the semantic view. At any given time, a plurality of routes can be used to perform semantic inference and the system may compose inferences of the plurality of routes, based on semantic analysis, factors, budgets and so on. The analysis may comprise semantic fusion from several semantic route view frames. Sometimes the semantic route does not resemble the expected, goal or trail semantics and as such the system updates the semantic routes and trails, potentially collapsing them, and/or associate them with new inferred semantics; additionally, the system may update the semantic factors, update semantic groups of applicable semantic routes and any other combinations of these factors and/or other semantic techniques.

The system learning takes in consideration the factorization of semantic rules and/or routes; thus, the learned semantic artifacts may be associated with such rules and factors (e.g. "DRIVE IN A TREE" has a high risk and/or fear factor etc.). In some cases such semantic artifacts are compared and/or associated with the hard semantic routes and/or artifacts; the inferred semantic artifacts may be discarded instead of learned if they make little sense (e.g. prove to be incoherent and/or highly factorized in relation with particular stable, factorized, high factorized semantic trails/routes, semantic drift too high etc.).

In further examples, the system receives and/or infers a composite semantic comprising a potential semantic goal and an associated entangled (consequence) semantics (e.g. having high/low undesirability/desirability factors) for pursuing/not-pursuing and/or meeting/non-meeting the goal (e.g. JUMP THE FENCE OR GO BUST, JUMP THE FENCE AND GO TO EDEN, JUMP THE FENCE AND GO TO EDEN OR GO BUST); further, the entangled semantic artifact may determine adjustment of the goals factors (e.g. risk, weight, desirability etc.) and further projections. It is to be observed that in the example the entanglement entropy is high due to consequences having a high relative semantic entropy (in rapport with the goal and/or in rapport to each other, they are being quite different even opposite or antonyms). In further examples, the entangled consequence can be similar and/or identical with the goal (e.g. GO BUST OR GO BUST) and as such the entanglement entropy is low. It is to be understood that the entanglement entropy may be associated with the semantic factors inference (e.g. when the entanglement entropy is high the factors and/or indexing may be higher).

In the previous example, it is to be understood that EDEN may activate different leaderships based on semantic analysis and/or semantic profiles. For example, the previous inferences and/or profiles may have been related solely with EDEN a town in New York state and hence the semantic route associated with EDEN, TOWN, New York may have a higher semantic leadership than EDEN, GARDEN, GODS. However, for particular semantic profiles the EDEN, GODS may bear a higher semantic leadership than EDEN, TOWN. As mentioned before where there is a confusion factor the confused system may challenge the user and/or other fluxes (e.g. such those initiating/challenging the goal of JUMP THE FENCE and/or consequences) for additional information (e.g. which EDEN?).

When the confusion is high the system may decay and/or invalidate the semantic artifacts (e.g. routes, rules etc.) which generated confusion. When the confusion is low the system may factorize such artifacts.

The leadership semantics may be based on inferences and/or semantics associated with endpoints, links, locations, semantic groups and/or further semantic artifacts associated with the subject (e.g. challenger, challenged, collaborator, user, operator, driver etc.).

Semantic drift shift and/or orientation may be assessed based on semantic entropy and/or entanglement entropy. Analogously, semantic entropy and/or entanglement entropy may be based on semantic drift, shift and/or orientation.

During a semantic collapse the system may assess whether the collapsible semantic is disposable possible based on semantic factors and decaying; if it is, the system just disposes of it. In the case of semantic wave collapse it may reject, filter or gate noisy and/or unmodulated wave signal.

Sometimes the disposal is deferred based on semantic time management.

The system continuously adjusts the semantic factors and based on the factors adjusts the routes, the semantic rules, semantic view frames and so on. If the factors decay (e.g. completely or through a threshold, interval and/or reference value) the system may inactivate, invalidate and/or dispose of those artifacts.

In further examples, new semantic artifacts may be associated with highly factorized routes based on the activity associated with the route and thus the new semantic artifact may be also highly factorized and/or retained longer (e.g. in semantic memory). Analogously, a highly factorized semantic artifact when associated with a semantic route determines the higher factorization and/or longer retainment of the semantic group.

Semantics are linguistic terms and expression descriptive and indicative of meanings of activities on subjects, artifacts, group relationships, inputs, outputs and sensing. The representation of the semantics in the computer system is based on the language of meaning representation (e.g. English) which can be traced to semantics, semantic relationships, and semantic rules. Sometimes, when the system understands more than a language and symbology, the relationship between the languages is represented through semantic artifacts wherein the second language components are linked (e.g. via a first language component into a semantic group) with the first language; sometimes, the system choses to have duplicated artifacts for each language for optimization (e.g. both languages are used often and the semantic factors for both languages are high) and model artifacts are linked and/or duplicated.

In an example, the system has a semantic group of associated to CAR comprising GERMAN AUTO, SPANISH COCHE, FRENCH VOITURE. When performing translation from the language of the meaning representation to GERMAN the system uses the GERMAN as a leadership semantic and thus the system performs German language narrative while inferencing mostly in the language of meaning representation (e.g. English). However, the system may optimize the GERMAN narrative and inference by having, learning and reorganizing the particular language (e.g. GERMAN) semantic waves, semantic artifacts, models and/or rules as well so that it can inference mostly in German as another language of meaning representation (e.g. besides English). It is to be understood that the system may switch from time to time between the language drive semantics in order to inference on structures that lack in one representation but are present in another and thus achieving multilingual, multi-custom, multi-domain and multi-hierarchy inference coverage. The system may infer and/or use multilanguage and/or multi-cultural capabilities of collaborative fluxes (e.g. monocultural, multicultural) and/or associated factors.

The system may maintain particular semantic artifacts for particular contexts. In an example, semantic artifacts associated with a drive semantic of BEST FRIENDS FROM SCHOOL may have associated slang and/or particular rules and artifacts that drive semantic inference and narrative in a particular way.

The semantics may be associated with patterns, waveforms, chirps.

The semantics may be associated with parameters, inputs, outputs and other signals.

In an example semantics are associated with a parameter identifier (e.g. name) and further with its values and intervals, potentially via a semantic group.

The semantic factors may represent quantitative indicators associated to semantics.

The semantic system may use caching techniques using at least one view frame region and/or structure to store semantics. In semantic expiration, the semantics may expire once the system infers other semantics; that might happen due generalization, abstraction, cross domain inference, particularization, invalidation, superseding, conclusion, time elapse or any other process that is represented in the semantic model. Processes like these are implemented through the interpretation of the semantic model and semantic rules by the semantic engine and further semantic analysis. The semantic inference may use semantic linguistic relations including semantic shift, entailment, synonymy, antonymy, hypernymy, hyponymy, meronymy, holonomy, polysemy.

Semantic techniques and interdependencies may be modeled within the inference models and semantic rules. In some examples polysemy is modeled via semantic composition where the meaning of a polyseme is inferred based on the compositional chain. Further, semantic groups, semantic rules and semantic models may be used to represent semantic dependencies and techniques.

Semantic techniques may be implemented via semantic models including semantic attributes and semantic groups. In an example, a semantic group containing all the synonyms for "great" is stored. In some cases, the group comprises semantic factors assigned to semantic components to express the similarity within a group or with the semantic attributes defining the group.

In both semantic flux and semantic streams, the source of information may be assigned semantic factors (e.g. associated with risk) and as such the inference by a system that consume semantic information from the source may be influenced by those factors. More so, the factors can also be assigned to particular semantics, type of semantics (e.g. via semantic attributes), themes and so forth that can be found in the fluxes and streams. Semantic fluxes and streams may be represented as identifiers and/or semantics (e.g. based on annotating them in particular or in general based on a characteristic by a user) and/or be organized in semantic groups as all the other artifacts.

The system may use semantic time management (e.g. rules, plans etc.) to manage the semantic factors for the semantic fluxes and streams.

It is therefore important that the information from various semantic sources including fluxes, streams, internal, external be fused in a way to provide semantic inference based on the model at hand.

It is desirable that systems be easily integrated in order to collaborate and achieve larger capabilities than just one system. The advantage of semantic systems is that the meanings of one system behavior can be explained to a second collaborative system through semantic means. As such, if for example system A provides and interface and is coupled to system B through some means of communication then the semantic coupling may consist in making system A operational and explaining to system B what the meaning of the inputs/outputs from system A in various instances is. The system B may use sensing and semantic inference to infer the meaning of the received signal from system A. Alternatively, or in addition the system A and B can have one common semantic point where the systems can explain to each other what the meaning of a certain input/output connection mean at some point. For example, if system A and system B are coupled through a common semantic point and also have other signaling and data exchange interfaces between them then when a signal is sent from A to B on an interface, the common semantic point from A to B will explain the meaning of the signal from A to B. In some cases, the systems A and B are coupled through a semantic stream wherein the common semantic point comprises the semantic flux. As such, the system B may use its own inference model to learn from the ingested data from system A; further, the system B may send his interpretation (e.g. via model) back to A; the system B may just use the semantic meaning provided by system A for interpreting that input/output signal/data or use it for processing its own semantic meaning based on semantic inference, processing and learning techniques. In other instances, the system B will ask/challenge the system A about what the meaning of a signal is. In some cases, the semantic fluxes that connect A to B make sure that the semantics are requested on system B from system A when their validity expire. The system B may be proactive in sending those requests and the system A may memorize those requests in semantic routes groups and/or views and process them at the required time. The system may use the semantic budgets for transmission through the semantic network and the semantics may expire in the network once budget is consumed.

In further examples, semantic group resonance may be applied for faster learning (e.g. of semantic groups and/or leadership), safety, communication and/or further inferencing.

In semantic group resonance, system A induces coherent inferences at B (e.g. affirmative toward the goals of B); further, system B induces coherent inferences at A (e.g. affirmative towards the goals of A). Thus, semantic group resonance allows (continuous) coherent inferences with potential low/high (entanglement) entropy of A and B while increasing superposition. Semantic group resonance with low (entanglement) entropy is associated with affirmative factors; analogously, semantic group resonance with high (entanglement) entropy is associated with non-affirmative factors. Semantic group resonance factors may be quantified in an example through low confusion, dissatisfaction, concern and/or stress factors between the members of the group and it may collapse when decoherence (e.g. high incoherence, confusion, dissatisfaction, concern and/or stress between the members of the group) occurs.

Semantic groups resonance determines and/or is associated with low confusion, dissatisfaction, concern and/or stress factors.

In semantic systems the semantic time between resonance and decoherence may be used to infer coherent artifacts and/or operating points/intervals. The system may learn causality (e.g. of resonance, decoherence) comprising semantic routes/trails, rules and/or other semantic artifacts. In some examples the system infers DO/ALLOW rules and/or further rules (e.g. time management/factorization/indexing etc.) when affirmative resonance occurs, and/or DO NOT/BLOCK rules and/or further rules when affirmative decoherence occurs. Analogously, the system infers DO NOT/BLOCK rules and/or further rules (e.g. time management/factorization/indexing etc.) when non-affirmative resonance occurs, and/or DO/ALLOW rules and/or further rules when non-affirmative decoherence occurs. Further, damping may be learned by the system; as such, indexing and/or decaying factors and further rules may be learned based on resonance and/or decoherence (factors) and be associated with damping semantic artifacts.

In some examples, the system learns damping factors and/or rules within the semantic mesh associated with the absorption and scattering of electromagnetic radiation in elements and/or (semantic) group of elements.

Damping rules and artifacts are used to infer hysteresis and vice versa. They may be used for adjusting factors, budgets and or quanta in order to control the damping towards goals and/or keep (goal) semantic inference within a semantic interval. Damping rules may be used for example to control the damping components (e.g. of shocks, electromechanical dampers etc.) of a drivetrain (e.g. of posts, vehicles etc.).

In some examples, system A uses semantic artifacts associated with system B (e.g. (portions of) semantic trails, routes, rules, drives, goals and/or orientations etc.) to induce coherent and/or resonant inferences at B and/or reduce confusion at B; this pattern may associate A as a (group) leader.

Semantic resonance is high for coherent semantic groups (e.g. the resonant inference in the group does not incoherently collapse). Semantic resonance is low for incoherent semantic groups and/or low coherency semantic groups. The system may infer highly coherent composite goals for coherent semantic groups. The system may use projected resonance on (target) artifacts (e.g. flux, user, patient etc.) and/or groups thereof in order to diffuse, attract, group, increase positiveness and/or to decrease dissatisfaction, concern, stress etc.

Projected resonance between (high entanglement entropy) semantic groups may be used to learn damping, hysteresis and/or further rules.

Model and sub-model distribution/exchange may occur between system A and B. This exchange may be controlled (e.g. allowed, blocked, blurred and/or diffused) via semantic access control and gating. In an example particular semantics and/or associated semantic artifacts are blocked. In another example, semantic groups related to MRI EXAMS may be blurred; while the system may blur the entity/object groups (e.g. patients, images, patient-images etc.), other semantic groups (e.g. related with language interpretation) may be allowed to pass; alternatively, or in addition, the system may use semantic diffusion in order to convey information in a controlled fashion. In other example the semantic gating is based on semantic budgeting inference and/or speculative inference. Thus, a semantic flux B might expose to flux A the semantics (e.g. potentially marked semantics) and the semantic capabilities potentially with estimated budgets and the flux A performs semantic inference on gated semantics and flux B exposed semantics. If the semantic inference doesn't meet required budgets, then the system A may choose to filter or reroute the semantics that do not meet the requirements. Entity and language filtering and semantic gating may be combined in any way to allow/deny transfer of information between systems.

In general, two communicating systems may use explanatory protocols and/or interfaces; as such, a memory conveyed through a first mean is explained and/or reinforced through another mean.

The system B may maintain semantics from A and the system keeps semantic factors associated with them that may decay in time. Sometimes, the system B sends the requests to system A when the factors decay, reach a specific threshold and/or based on semantic budgets.

In many computer systems data is exchanged via objects, sometimes represented in JSON or other object streaming formats. The exchanged data is interpreted based on a static interpretation of JSON object properties or based on JSON schema parsing.

The interfaces may be statically coupled, and the operations and/or functions established a-priori and/or they may be encoded/explained in a dynamic way in the JSON objects (e.g. one field explains another through semantic means such as semantic augmentation, synonym and/or antonym. These interfaces are not very adaptive due to semi-rigid implementation of the coupling between the systems.

An adaptive approach of communication learning may involve a system B learning at first from a system A about the data is conveying and updating its semantic model in order to be able to infer semantics based on that data. In some examples, the system B learns a new language based on learning interfaces. In such an example, the learning interface relies on common system A and B observations (e.g. sensing, semantic wave) and potentially basic rules and models for inference learning.

The implementation of interface learning may be achieved via a semantic point where the interface is described via a language or semantic wave. Alternatively, or additionally the semantics of the interface and the relationships can be modeled via a tool that will generate a semantic plug-in model for the interpretation of the interface inputs. The semantic tool and/or plug-in allows the description of the interface based on semantic rules including management rules. The plug-in model may then be deployed to the connected systems and the connected systems use it for semantic connection. The plug-in model may be deployed as part of a separate block circuit and/or semantic unit that connects the systems. Alternatively, or in addition, the plugin may be deployed in a memory (e.g. flash, ROM, RAM etc.). Further, the plugin modules may comprise encryption capabilities and units whether semantic or not. In some examples the plugin modules are used to encrypt and/or modulate semantic waves. The encryption and/or modulation can be pursued in any order using semantic analysis techniques.

The semantic connection (e.g. semantic flux) may be controlled through a semantic gate that allow controlled ingestion or output of information, data and/or signals through semantic fluxes and/or semantic streams.

Figure 16:
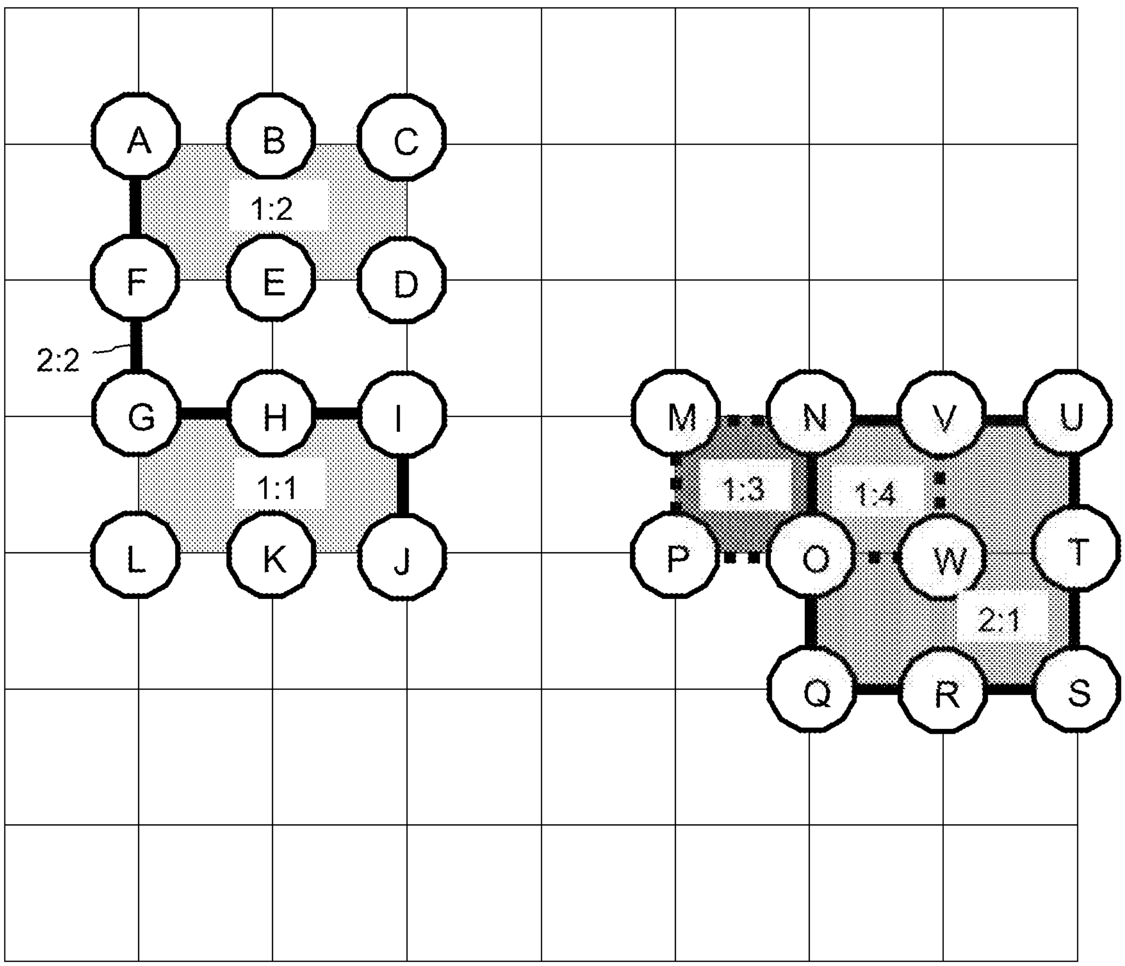
FIG. 16 illustrates pluralities of smart posts or similar elements shown connected via semantic fluxes.
Figure 20:
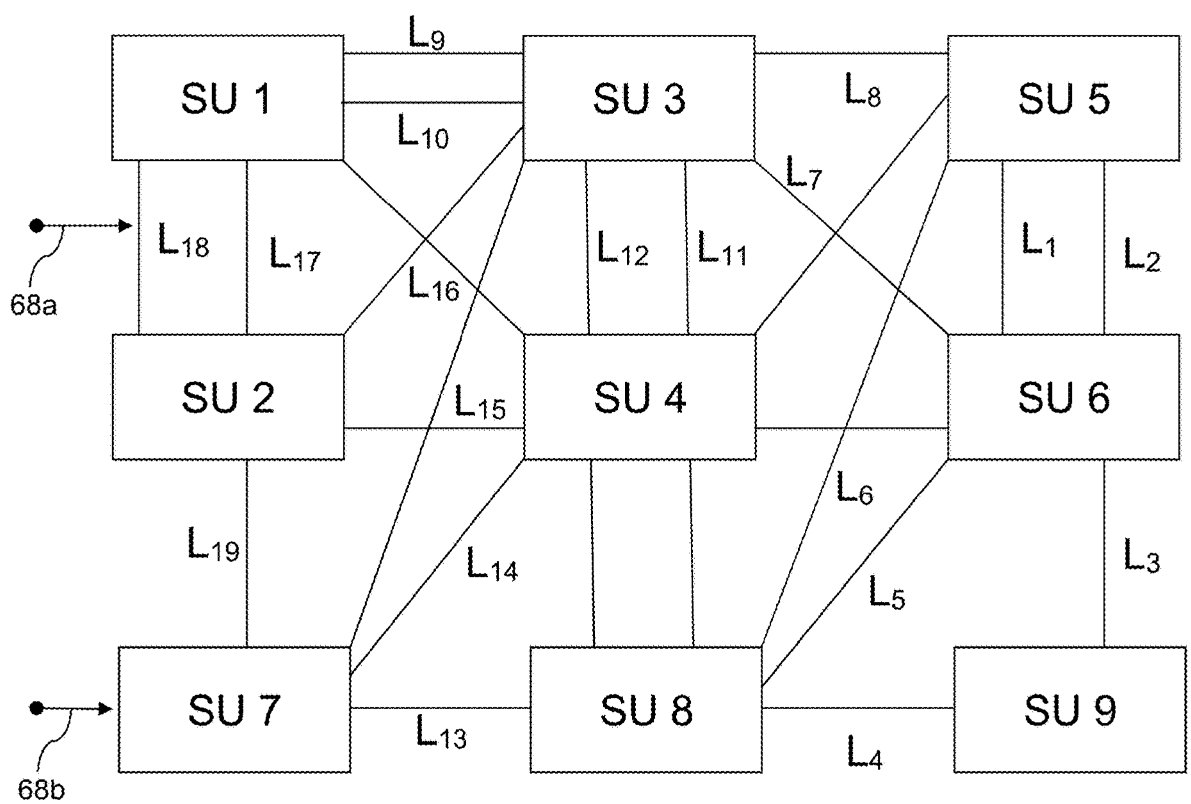
FIG. 20 illustrates a block diagram of a plurality of elements (e.g. semantic units) coupled through a plurality of links/semantic fluxes.

In FIGS. 16 and 20 we multiple elements (e.g. semantic units) coupled through links/semantic fluxes. As illustrated in FIG. 16, a plurality of elements (semantic units) are labeled with letters A through W. Each of the elements may comprise computing and/or memory components. FIG. 16 further depicts semantic groups of elements in a hierarchical structure (e.g. Group 1:1 (which is defined by the perimeter formed by G-H-I-J-K-L), 1:2 (formed by elements A B C D E F), 1:3 (formed by elements M-N-P-O), 1:4 (formed by N-V-W-O) at level 1; Group 2:1 (formed by N-V-U-T-S-R-Q-O, further indicted by thicker connecting perimeter line), 2:2 (indicated by thicker connection line joining A-F-G-H-I-J) at level 2); it is to be understood that while only two hierarchical levels are depicted, more levels may be present.

In some examples semantic fluxes and/or semantic streams are ingested by systems and possibly interpreted and/or routed based on semantic analysis. FIG. 20 illustrates one example, and as discussed further below a plurality of semantic units may be arranged such as semantic units SU1 through SU9. One or more external signals, e.g. 68*a*, 68*b* may be received by one or more of the semantic units. The semantic units are linked to one another in a mesh through semantic flux links, e.g., L1 through L19.

The semantic gate may filter the semantics in exchanges. The semantic gate may be controlled and/or represented by a set of access control, time management, rating, weighting, reward and other factor rules collectively named semantic management rules; access control, time management, rating, weighting and reward rules are comprised in patent publication number 20140375430. As such, the semantic gate may allow adaptive control of the exchange of information anywhere between a very fixed controlled environment and a highly dynamic adaptive environment. The semantic gate may contain rules that block, allow or control the ingestion of particular semantic artifacts based on access control rules. The endpoints of a semantic flux (e.g. source and destination) may be represented in a hierarchical semantic network graph and the semantic flux being associated with links in the graph. The source and destination may be associated with semantics and the semantic gate control rules are specified based on these semantics; in an example, such semantics are associated with activities and/or locations and they may be collaboratively or non-collaboratively semantically inferred. Such semantics may be assigned to various artifacts manually, through semantic inference, through authentication or a combination of the former.

We mentioned the use of hierarchical semantic network graphs for meaning representation. The semantic gate may be used to control the information flow between any of the elements of the graph and/or between hierarchies. The graph elements and hierarchies are associated with semantics and as such the semantic gate controls the semantic flow based on such semantics.

In an example, the access between hierarchies is based on access control rules; as explained above the hierarchies may be associated with semantics and/or be identified by semantics. Further, access control rules may be associated with semantic identities and/or further identification and authentication techniques. In some examples, the identification and authentication are based on semantic analysis and/or sensing comprising data ingestion, image/rendering/display capture, radio frequency, electromagnetic modalities and/or other modalities/techniques.

Information flows and/or (agent) diffusion within and/or between semantic network model artifacts are controlled based on semantic gating. In some examples, information transfer flow between linked endpoints mapped to display interface areas, semantic groups and/or user interface controls is enforced this way. In further examples, the gating is coupled and/or based on the hierarchical inference within the semantic network model and/or semantic views which provide contextual localization pattern, access control and semantic intelligence pattern of the mapped areas, semantic groups and/or user interface controls. The mapped areas may comprise for example displayed text, user interface artifacts, controls, shapes, objects and/or a combination thereof; also, they may comprise and/or be associated semantic groups, semantic identities and/or patterns of displayed text, user interface controls, shapes, objects and/or a combination thereof. Thus, the system may create groups, use fluxes and/or allow the flow and/or assignment of information from one mapped artifact to the other only if the semantic gating would allow it. In further examples, the system performs projected compositional semantic analysis on the semantics assigned to the linked artifacts and based on the projected analysis perform the semantic gating.

Linked semantic artifacts may be inferred based on semantic analysis. In an example the system infers the purpose and/or goal of artifacts and/or semantic groups in at least one semantic identified area (e.g. window) and may link such artifacts based on similarity of purpose, goal and/or further inference. It is to be understood that the linked artifacts may be inferred and/or mapped by selecting, dragging and/or overlaying the semantic areas and/or mapped artifacts on top of each other via any I/O (e.g. touch interface, screen, pointing device etc.); further, in some examples the system provides feedback on such operations (e.g. deny the operation, inform the user, pop up an image control and so on). In further examples, semantic groups of artifacts are created by selecting, dragging and/or overlaying the semantic areas and/or mapped artifacts on top of each other and the user is prompted with selecting and/or confirming the (composite) semantic artifacts (e.g. semantics, semantic gating rules, semantic routes, profiles and/or further artifacts) for such semantic groups (e.g. between the group members or with group external artifacts).

A received input may not be ingested or partially ingested if the semantic engine infers a semantic that is forbidden by the semantic gate. A partial semantic determination occurs when some of the semantics are partially inferred on a partial analysis of a semantic route, goal and/or budget; sometimes those semantics are discarded and/or invalidated. However, other times those semantics may not be discarded or invalidated; instead they may be assigned a factor and/or time of expiration or a combination of those. Such partial inference may be useful for example in transfer inference and learning. In some examples semantic trails and/or routes associated with semantics in a domain may be partially applied and/or associated to semantic artifacts in other domains based on higher hierarchy inference on the semantic model.

Decaying and semantic expiration may be used for controlling a semantic gate. The semantic analysis may be used to update the semantic factors and time management and update the dynamic of semantic gates.

The semantic gates may be plugged in to the semantic analysis and/or utilize semantic network models where endpoints represent the source (or a source group) and destination (or a destination group) of semantic fluxes. Source groups and destination groups are represented as semantic groups.

A semantic group consists of at least two entities each being monitored in the semantic field that share a semantic relation or commonality via a semantic (e.g. semantic attribute). A semantic group can be semantic dependent when a semantic attribute is assigned to specify a dependency or causality relationship within the group (e.g. A INFECTED B, JOHN PERFORMED MRI_EXAM) or, semantic independent when there is no apparent relationship between the objects other than a classification or a class (e.g. A and B are INFECTED systems). In further examples, A, B, MRI_EXAM may be on their own assigned to semantic groups, for example for storing signatures of viruses, images from MRI-EXAM etc.

It is to be understood that the causality relationships and learning may depend on the semantic view and semantic view frames; further, they may depend on semantic field orientation and/or anchoring. In an example, the observer's A semantic view sees the effect of the sensor blinding on B as a result of a laser or photon injection at a later time than the system's B semantic views detects such blinding effect. The inference time and/or propagation (and/or diffusion) may be circumstantial at/between A and B, and thus, while the order of those collapsed inferences may be more difficult to project, they may be considered as entangled from particular semantic views (e.g. of an observer C). Further, systems' projected inferences in regard to action/command/observations might comprise a high degree of certainty in relation with semantic artifacts which may be used as anchors for semantic orientation. For observer's A semantic view, the cause of the attack was that system B is a "slacker flimsy protected" while for system's B semantic view the cause of the attack was because "A is a bully". Thus, causality relationship may comprise additional information at a (hierarchical) level associated with the two entities (e.g. a link from A to B "sent malware because it is a slacker" and a link from B to A "this is a bully who's probing me", "this is a bully who infected me" etc.). While at a different level and/or semantic view, of A, B and/or a third observer C, the causality specifies the cause effect of A INFECTED B; it is to be understood that this higher causality may be comprised, inferred, acknowledged and/or represented only for particular views and/or observers (e.g. B might not acknowledge or infer that it has been infected by A probing). It is to be understood that the cause-effect relationship (e.g. infected "because" is a bully) may be modeled as oriented links and used to explain "why" type questions (e.g. why A infected B?—because A is a 80% bully and B is a 70% little 20% flimsy slacker; why is A bully?—because it infected B and C and D and I 100% think is wrong). In further examples, the propagation and/or diffusion between a first and a second endpoint is based on assessing the semantic drift and/or shift of/between the semantic artifacts associated with the endpoints; thus, the system may infer propagation and/or diffusion semantic rules (e.g. time management, access control, indexing, factoring etc.).

Semantic anchoring allows the system to determine a baseline for inference (e.g. an observed object, high factorized artifacts, semantic groups, semantic identities, themes of interest etc.). The anchoring may be based on a collection of artifacts and the system uses projected inference and semantic analysis based on such anchors. Further, the anchoring semantic artifacts may be determined by mapping and/or overlaying a semantic network sub-model, layer, shape, and/or template to a semantic network model (e.g. based on similar semantic based artifacts, artifacts with particular semantics—e.g. goal based, antonym, synonym, orientation based etc. —in both the base and the overlaid network model). The anchors may map and/or project into various hierarchies, semantic views and/or frames. Anchoring may expire based on semantic analysis; once the anchors expire the system may invalidate corresponding semantic views, frames and/or regions. Semantic anchors may be inferred based on leadership inference; further semantic diffusion and/or indexing may be used to expand or contract the anchors.

Semantic anchoring, drifts and/or indexing may change based on the orientation and/or intensity of the gravitational field within and/or associated with the semantic field and/or endpoint. In further examples the semantic field is a higher hierarchical endpoint associated and/or comprising particular gravitational fields. Semantic drifts may be inferred and/or associated with gravitational fields/waves and/or vice-versa; further, they may be associated with semantic time management. Semantic anchoring may be indexed and/or change based on semantic drifts, semantic fields (and/or endpoints), gravitational fields and/or waves. In some examples the gravitational fields and/or waves are inferred using semantic sensing analysis.

In some examples the system represents the semantic groups in the semantic network model. In some example's entities are stored as endpoints and relationships between entities are stored as links. The system may create, activate, block, invalidate, expire, delete endpoints and links in the semantic network model based on semantic analysis and semantic group inference.

The system may use specific hierarchical levels to represent semantic groups of specific and/or leader semantic artifacts.

During semantic inference the system may activate various hierarchical levels in the semantic network model based on semantic analysis, drive and leadership semantics.

A semantic gate may control the flux between sources and destinations. A semantic flux is an oriented flow which may be assigned to an oriented link.

A semantic gate and a semantic flux may be identified by at least one other semantic artifact (e.g. semantic).

Additionally, if the semantic gating detects or infers a semantic that is not allowed then the semantic gating may update the semantic model and management rules (e.g. collapse the semantic route and associate the collapsed semantic to a semantic rule). In an example, if the system interprets an input (e.g. semantic) from a particular flux as being questionable maybe because it doesn't fit the semantic inference and/or theme of the semantic flux, the system may discard and reroute the semantic artifact, update/create a semantic rule (e.g. for source, factors); it also may infer additional semantics (e.g. associated with cyber security features for example). In other examples the system asks for feedback from a user or from other semantic hierarchies, domains and/or themes; in some examples it may use further semantic analysis of the semantic before feedback request (e.g. synonymy, antonymy etc.). In an example, a semantic unit may ask a semantic flux cloud if a particular cyber physical entity is associated with HAZARD and/or, in other examples if the entity is associated with POISONED WATER. Thus, the system may search or provide inference on semantic areas, domains and/or groups associated with semantic routes of HAZARDOUS POISON WATER and/or POISON WATER and/or HAZARDOUS WATER and/or HAZARDOUS POISON and/or further combinations of the semantics in the semantic route.

At a hardware level the interface between various components can be achieved in in a semantic way. As such the connection points and/or signals transmitted between various components can be semantically analyzed and/or gated.

A semantic gate may be represented as a circuit or component. As such, the semantic gate controls the signals received and/or transmitted between semantic components. A semantic gate may allow only specific semantics/artifacts/themes/signals to pass through.

Semantic gating and flux signaling may be achieved by diffusive processes. Further quantum tunneling phenomena may be used.

A semantic cyber security component deployed on a hardware layout may be able to infer, identity, deter and block threats. Further, by being connected to a semantic flux infrastructure and/or cloud is able to challenge (or ask for feedback) on particular cyber physical systems, semantics, semantic groups etc. and perform access control based on such information. It is to be understood that instead of challenging or asking for feedback about a particular cyber-physical system alternatively, or in addition, it may ask for feedback about a semantic and/or semantic group associated with the cyber physical system.

In some examples the system may detect that the inferences related with at least one collaborator and/or semantic group determine incoherent superposition. Thus, the system may ask for feedback from other collaborators and/or semantic groups; the system may prefer feedback from entangled and/or conjugate collaborators and/or semantic groups (e.g. having particular entanglement entropies of composite semantic analysis). Further, the system may decay specific factors and/or semantics associated with the collaborators who determine, cause and/or infer incoherent superposition and/or high confusion.

Signal conditioning represents an important step in being able to eliminate noise and improve signal accuracy. As such, performing signal conditioning based on semantic analysis is of outmost importance in semantic systems.

The semantic conditioning means that semantics inferred based on received measurements and data including the waveforms, parameters, envelopes, values, components and/or units are processed and augmented by semantic analysis. Semantic signal conditioning uses semantic conditioning on unconditioned measurements and signals. Semantic signal conditioning also uses semantic conditioning to compose and/or gate conditioned and/or generated semantic waves and/or signals. Thus, the system is able to use semantic conditioning for a large variety of purposes including inference in a semantic mesh.

Figure 19A:
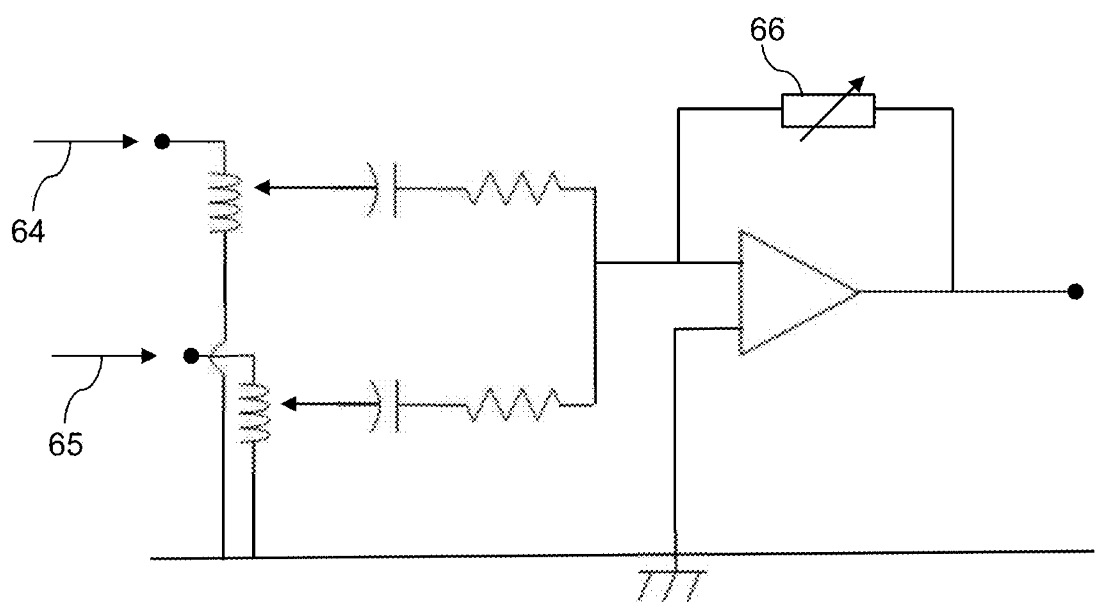
FIG. 19A illustrates a preferred circuit diagram for conditioning a received signal based on a modulated semantic wave signal.
Figure 19B:
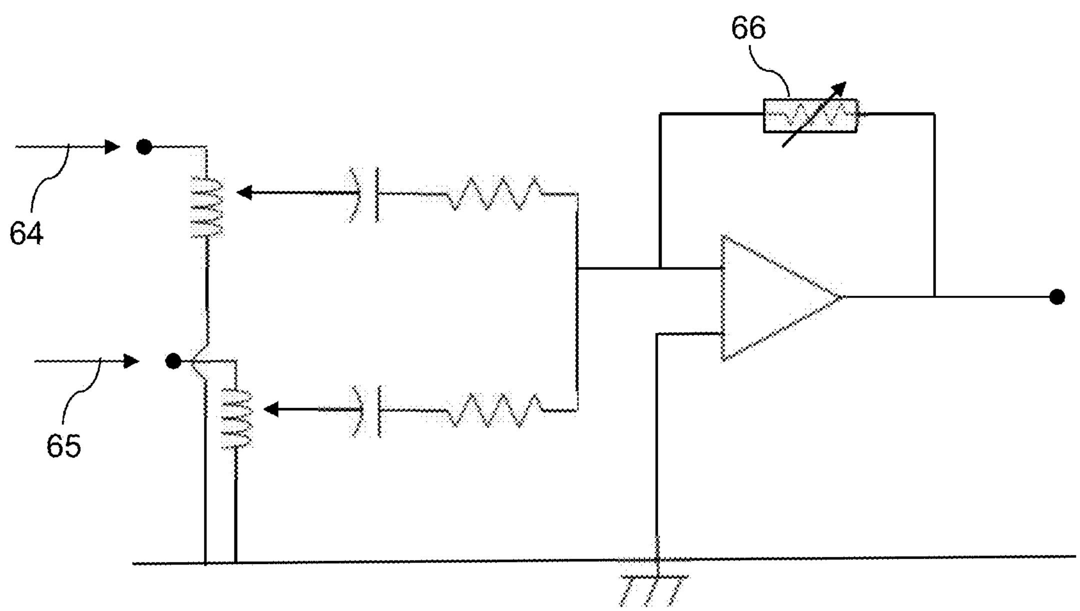
FIG. 19B illustrates a preferred circuit diagram for conditioning a received signal based on a modulated semantic wave signal.
Figure 19C:
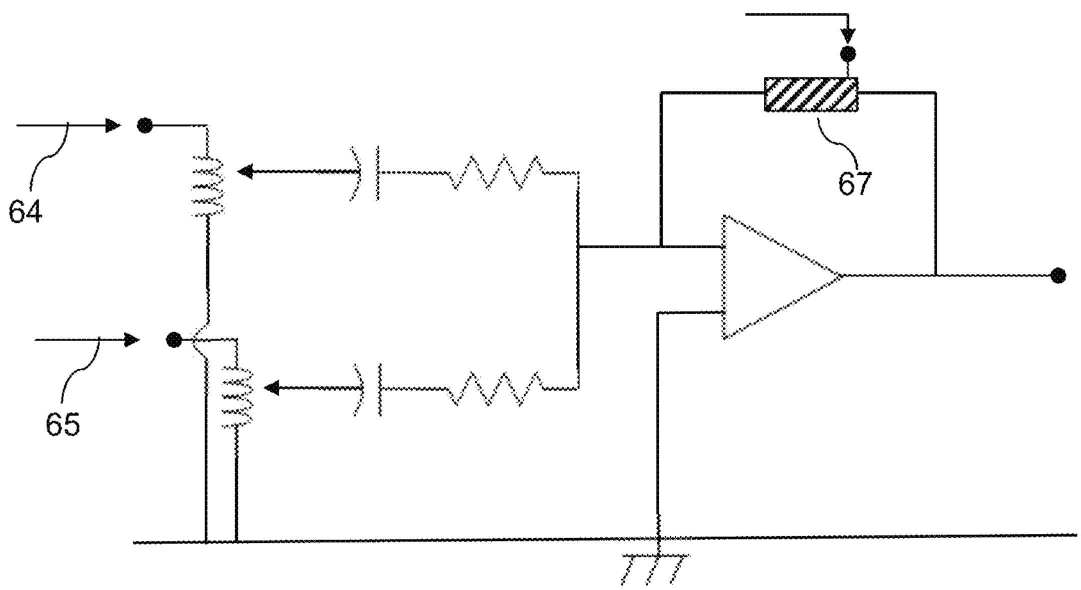
FIG. 19C illustrates a preferred circuit diagram for conditioning a received signal based on a modulated semantic wave signal.

In an example, the system conditions a received signal based on a modulated semantic wave signal. The conditioning may take place in a semantic unit comprising a summing amplifier at the front end producing a composed and/or gated semantic wave signal. In an example, the composition and/or gating is performed by modulating the output signal (e.g. voltage) based on the input signals (e.g. unconditioned signals 64, conditioned and/or generated semantic wave signals 65) to be added (as depicted in FIG. 19A B C). It is to be understood that the amplifier GAIN Rf 66, SU GAIN 67 may be also be adjusted based on semantic artifacts (e.g. semantics, semantic waves etc.) and/or be in itself a semantic unit (SU GAIN); adjustments of the gain may be used for access control and/or gating purposes in some examples wherein the output voltage may be adjusted to account for allowable transitions and/or semantics. While an amplifier has been used in examples, it is to be understood that in other examples additional and/or alternative analog and/or digital voltage adders, operational amplifiers, differential amplifiers, analog blocks, digital blocks, filters and/or other components (e.g. as specified throughout this application) may be used. Also, while the depicted examples may show physical and/or logical electronic components and/or blocks including capacitors, resistor, amplifiers, inductors, transistors, diodes and other electronic parts/units/blocks, it is to be understood that they may not be present in other embodiments or they may be substituted with other components and/or parts/units/blocks with similar or different functionality. In an example, the capacitors C in FIG. 19 might be missing altogether; further the amplifier A may be missing and thus, the front-end block might be purely a signal adder. It is also to be understood that all resistances, capacitances, inductances and/or gain of components may be adjustable and the system may use semantic means (e.g. semantic modulated signals) to adjust such values and/or control components.

The switching (e.g. as provided by MUX) and variable GAIN functionality may be semantically controlled and may be used to implement semantic routing and/or gating. While in the depicted examples those functionalities are implemented in discrete components and/or blocks they may also be substituted and/or composed (e.g. physically; logically via semantic grouping and analysis) with other components and/or blocks and provide similar composite functionality.

It is to be understood that the semantic unit inputs, outputs and/or gain units may be mapped to semantic fluxes and/or gates.

The system may use voltage and/or currents values to represent semantic artifacts. While some depicted examples use variable voltages for modulating semantic signals it is to be understood that alternatively, or in addition, variable currents values may be used to modulate such signals and/or represent semantic artifacts.

It is to be understood that such semantic units may be used in a mesh in order to condition and/or analyze the signals potentially in a recursive manner where the generated semantic waves signals are used as conditioning signals in the semantic mesh (e.g. mapped to a semantic network model, semantic fluxes/gates mapped to semantic unit inputs/output/gain). The mapping of the mesh to elements and routing is performed by semantic orientation and/or routing. The semantic waves may be generated as explained throughout this application including those received from other sources, generated on previous received data, measurements and/or conditioning and/or other domain semantic artifacts.

Semantic waves waveforms and signals are used and/or stored in the system to represent any semantic artifacts. In some examples, they are used for identification purposes of any semantic artifact. In further examples, the identification may comprise any combination of particular identification, semantics, semantic groups and/or other semantic artifacts.

The unconditioned signals may come from any entity including analog blocks, digital blocks, front ends, sensing elements, modulation elements, I/O elements or any other hardware element. In some examples, the unconditioned signals are based on AC currents from power lines.

The semantic system infers semantics on patterns and compositions. In an example, the system detects the pattern for a sensed semantic (e.g. ingested via optical or sound sensing entities) which is coupled to another pattern in a semantic view (e.g. image reconstruction pattern, artifact reconstruction or pattern based on semantic group of attributes etc.).

The semantic system may infer a semantic based on a partial signal pattern; the signal pattern may present some partial resemblance with a pattern represented in the semantic system; the system may assign a factor to the new inferred semantic based on a correlation between the actual and resembled pattern. In an example, semantic waves may be analyzed based on partial signal patterns. The system may use semantic analysis including orientation and routing for pattern recognition and learning.

Semantic wave signals are generated and/or modulated through semantic analysis (e.g. composition).

In further examples, the semantic waves are modulated based on an identification, signature and/or DNA of semantic units and/or gates through which they are routed and pass through. In an example, an unconditioned signal originated from at least one sensor element is modulated with the identification, signature and/or DNA of the endpoints and/or semantic units through which is routed, and it passes. It is to be understood that the DNA may comprise semantic artifacts related with the respective endpoints, semantic units, semantic groups and/or hierarchies. Thus, as the semantic wave is routed in the semantic network the system is able to trace sequences and trails of semantic units and/or their DNA and thus being able to perform semantic analysis and further routing.

The system may use sequences of semantic units to infer composite semantics and modulate the semantic wave. In an example, if the signal passes through a sequence of semantic units such as SU1, SU2 then the system may modulate the semantic wave with a composite signature (e.g. DNASEQSU1-Level1 DNASEQSU2-Level1) of those units, which, when routed through SU3 is identified and collapsed into a further composite signature (DNASEQ3-Level2) which allow the unit SU3 to modulate and gate the semantic wave based on the new composite signature. In some examples, the unit SU3 is a border semantic unit between multiple semantic stages and/or hierarchical levels (e.g. Level1 and Level2) and/or semantic stages and thus the collapsed signature (DNASEQ3-Level2) may be available, collapsible or inferred only at Level2 and/or beyond but not at Level1. While the previous example uses a limited number of units and signatures it is to be understood that this may expand to a more complex semantic structure including more units, multiple hierarchical levels, semantic groups (e.g. of units, endpoints, sub-models and/or signatures etc.). Also, the term "signature" has been used it is to be understood that the term may refer to DNA sequences, semantic artifacts, identification etc.

Endpoint DNA may be replicated with endpoint replication. In some examples the inference at an endpoint is incoherent, confused, non-collapsible and/or not matching the endpoint DNA, capabilities, goal and/or purpose; thus, the system may replicate the endpoint together with the DNA until the coherency and/or confusion of the goal and/or purpose is restored. Alternatively, or in addition, the system may remap the endpoint to endpoints (and/or groups thereof) with similar DNA. It is understood that the endpoint may be replicated and/or mapped/re-mapped on an existing and/or new semantic unit. Thus, semantic identities and/or further artifacts may be associated with DNA signatures.

DNA signatures compose during endpoint fusion. DNA signatures may be used to establish and/or infer anchors.

DNA based techniques may be used with medical imaging sensors (e.g. based on vision sensors, modalities such as CT (computed tomography), MRI (magnetic resonance imaging), NM (nuclear medicine), US (ultrasound) etc.) and/or biological sensors in order to model, detect and/or perform semantic augmentation in medical diagnosis, exams, clinicals, prevention, emergency, operating rooms and other healthcare based use cases. In some examples such biological sensors are part of a semantic unit, module and/or post; in further examples, they are wearable (e.g. surgical gloves, (exo) wearables, braces, bands etc.).

The system may perform memory, semantic model and/or semantic units access control, gating, factorization, decaying, enablement, disablement, invalidation, expiration, pruning in order to isolate the use of semantic artifacts at various hierarchical levels.

Semantic waves may comprise electromagnetic waves generated and/or modulated through semantic analysis.

Semantic waves may be modulated, transmitted and received in various environments and using various technologies including electromagnetic, radiative, non-radiative, wireless, wired, optical, electric etc.

For example, semantic waves can be modulated and/or transmitted based on the electro-optic effect manifested by particular crystals which change the refractive index based on applied voltages and currents and thus modulating the signal by changing the wavelength of the light based on applied voltages.

When building a phase modulator, one can benefit from the effect that the refractive index n of certain crystals such as lithium niobate depends on the strength of the local electric field. If n is a function of the strength of the field, then so is the speed and wavelength of the light traveling through the crystal.

Thus, if a voltage is applied to the crystal, then the wavelength of the light crossing the crystal is reduced and the phase of the exiting light can be controlled by choosing the adequate voltage.

Thus, if a voltage is applied to the crystal, then the wavelength of the light crossing the crystal is reduced and the phase of the exiting light can be controlled by choosing the adequate voltage based on semantic analysis.

Semantic waves may be used for semantic control of devices and/or analog blocks. In some examples the semantic waves are used for display purposes where the semantic wave is decoded at semantic display elements and the semantics rendered on the screen (e.g. RED 10 GREEN 5 BLUE 8, H 17 S 88 V 9). In other examples, the semantic wave is used in a scan type display unit where the semantic wave modulates scanning optical component for creating display artifacts; while the display artifacts may be raster, alternatively, or in addition they may be modeled and mapped as a semantic model and potentially stored in a semantic memory.

The system modulates and stores display artifacts and scenes as semantic models. Such semantic models may be modulated as semantic waves. The system may perform semantic scene interpretation, composition and rendering based on superposition of semantic models and inference at multiple hierarchical levels.

The system may perform semantic wave conditioning and deconditioning when performing semantic scene interpretation, projections, composition and rendering. While the rendering may take place on display units it is to be understood that it may take place as a memory renderings or other analog and digital renderings. Thus, the system is able to perform scene composition, rendering, projections and/or analysis at any time.

In further examples the renderings are relative to a perspective endpoint and/or link in the semantic space and the system performs orientation, factorization, indexing, analysis and/or rendering relative to the perspective artifacts (e.g. from perspective endpoint to field, current endpoint to perspective endpoint, link orientation etc.); further, the renderings may be based on semantic routes and trajectories comprising perspective artifacts.

In some examples semantic waves are used for control plane purposes including pilot or control sequences. The use of turbo codes and low-density parity check techniques for error correction is well known in wireless communication. However, those techniques may require fast interleavers and lookup tables for data encoding and decoding. In a semantic wave the data is encoded based on semantics and as such the system is able to understand the signal even in most adversarial jamming conditions by adapting to environment. Further, error correction and cyber safety controls may be incorporated in a hierarchical manner and thus allowing hierarchical and/or domain coherent inferences.

In some examples, semantic waves may be used to convey and/or transfer semantic network models and/or semantic rules. Semantic information is mapped to artifacts such a frame or an image. Semantic waves may be generated by semantic network models and/or rules while conveying a semantic network model and/or rule. In a cascading semantic wave, models and rules are generated based on recursive semantic analysis on semantic waves, models and rules and used for further generation of semantic waves. In some examples, at least two semantic waves are composed while the waves are modulated based on the cascading learning. In some examples cascading semantic waves, models and rules may be used in encryption and authentication schemes. Such schemes may be used for example in semantic model encryption and authentication, memory encryption, collaborative semantic authentication and validation and other applications. Such semantic techniques may be associated with wavelets (e.g. wavelet compression, wavelet encryption). In some examples, the system reconstructs the frames and images using such techniques. The frames and images are reconstructed based on the semantically encoded semantic network models conveying space, time, semantic attributes, hierarchy and other semantic artifacts. In a similar way, frames and images are deconstructed and semantically encoded in semantic waves.

The semantic wave may travel over and between different networks encompassing various modulation and transport protocols. In some examples, the semantic wave is wavelet compressed before being transferred using such protocols. The addressability within the semantic layer and/or networks may be based on semantic identification.

The system may perform gating on artifacts in images and/or frames based on semantic analysis. Further, it may generate artifacts in images/frames based on semantic analysis. In an example, an access control rule on a semantic flux/gate may specify that it needs to invalidate, hide or filter objects in the pass-through images/frames. As such, the system maps and/or identifies such objects in the semantic network model and invalidate, hide or filter corresponding artifacts of the semantic model, potentially based on further semantic analysis. The semantic network model may be mapped based on a particular format of the image/frame (e.g. semantic artifact compression based on specific or standard formats); also, it may be mapped on a semantic waveform. While this is the faster approach, other variants may perform the mapping and the semantic analysis using semantic gating points and/or units. Further, the semantic gating functionality may be incorporated into an I/O, control, sound/speech and/or display unit that render inferred semantics and/or semantic waves on a display and/or other sensory devices (speech, touch, vibration etc.). In further examples the gating rules are based on various semantic artifacts defining and/or guiding the gating inference. Alternatively, or in addition, the system may specify semantics that would replace the gated semantics in the resulted semantic waves or gated artifacts (e.g. images, frames, speech, signal etc.).

Semantic mapping, compression, semantic gating and/or semantic waving may be incorporated in devices whether they provide capture, recordings, feeds, display, renderings, I/O, sound, speech, touch, vibration. Further such techniques may be applicable to any analog and digital interfaces.

Although semantic waves might be modulated directly on or as a carrier wave, they may be transmitted through other mediums and interfaces (e.g. network) that require the modulation, encoding, segmentation etc. through their own communication protocols and communication links.

The system may fine-tune and adjust semantic factors and thresholds on signal conditioning elements to determine or infer a path. The semantic conditioning may be associated with semantics related to signal elements including waveforms, envelopes, amplitude, phase, frequency and so on; the conditioning may be also associated with various modulations, formulas, algorithms and transformations. As such, the semantic system may adapt to various conditions and situations.

The semantic conditioning can be achieved via signal comparison, correction, correlation, convolution, superposition of a generated signal based on the conditioning semantic elements or other comparisons based on transformations and translations as wavelet, Fourier, Taylor and others. Sometimes the semantic conditioning doesn't yield a good rating/factor and as such the system may generate and/or store additional semantic conditioning elements and rules learned during conditioning cycles.

The conditioning may be associated with inputs from other systems, sub-systems, sources and modules. Thus, the system computes the semantic signal conditioning patterns or chips including the conditioning waveform and timing based on collaborative and multi domain intelligence.

A conditioning waveform may be used in combination with a baseline waveform or a semantic wave to allow the adaptation of the system in different contexts and improve the accuracy, resilience and signal to noise. The conditioning waveforms may be organized and represented as semantic artifacts including semantic routes, semantic trails, semantic groups, rules and so forth. When a semantic route is associated with a semantic network model it comprises a relative orientation and/or shape in a semantic network space. The system may perform semantic orientation and/or shaping inference based on semantic routing, the identification of the network model artifacts (e.g. endpoints and links) in the shape and/or semantics associated with these artifacts. The orientation may be in an example relative to other semantic routes or to semantic trails; in such an example the system may further perform semantic orientation inference based on the groups of routes/trails and associated semantic network artifacts (e.g. endpoints, links and/or semantic groups thereof, common semantic artifacts, links between routes, semantics, semantic groups, semantic waves etc.). Thus, the semantic orientation may be associated with or used to determine relative or absolute semantic drifts and shifts, semantic groups and semantic shapes. Absolute semantic drifts may use an absolute baseline in rapport to a semantic network space, semantic views, semantic view frames, semantic routes, semantic artifacts and/or a coordinate system.

The semantic system modulates/demodulates, filters and composes semantic waves and signals based on goals. In an example, for an artistic creation the goal may be of NEW COMPOSITION in a context of an environment which may generate a routes and drive semantics of AUTUMN, BROWN, FALLEN LEAVES, LATE, QUIET. In other examples, the NEW COMPOSITION may not benefit from much contextual environmental information and as such the system may pursue very general semantic routes. In other examples, when the goals and indicators are too vague (e.g. the factors are too decayed) the system may ask for feedback and/or infer biases. The feedback and/or bias may comprise semantics and further factors which may determine drive semantics, semantic routes and so on. As mentioned throughout the application the system may group such biases and drive semantics with semantic routes and semantic orientation based on further factors and indicators of semantic inference (e.g. factors and indicators matching "belief" semantic routes or high-level semantic artifacts). Alternatively, or in addition to feedback the system may use semantic profiles. In case of increased superposition, the system may perform superposition reduction. In further examples the system may perform new 2D and/or 3D designs based on semantic analysis and projections. In an example, the user specifies the features that a bicycle rim may have and not have, and the system infers semantic shaping, semantic attributes and rendering of the rim parts and designs. The system may perform the design of 3D bicycle components based on further semantic shaping and analysis inference.

Semantic orientation is related with semantic routing in a semantic network model where routes are mapped to various artifacts and hierarchies in the model.

In similar ways that the system performs semantic orientation, it may perform semantic artifact comparison and/or projections. In an example, semantic shapes comprising one or more semantic routes and/or trails are compared allowing the system shape and object recognition. In further examples the system uses at least two semantic routes to infer at least two semantics for a shape and perform composition and fusion on those. For example, the system may infer for a shape BLACK BOX 10 and LUGGAGE 4 and because there is a semantic route between BOX and LUGGAGE and between LUGAGGE and AIRPORT (e.g. the semantic associated with the endpoint where the observation occurs) then the system may infer BLACK LUGAGGE 7. Further, semantic view frames, views, models, sub-models, groups may be compared and/or projected based on semantic orientation.

A semantic shape comprises semantic artifacts in the semantic network space comprising the shape. The semantic shapes allow meaning determination and inference in the semantic network space comprising semantic network artifacts. In an example, the semantic shape comprises all endpoints and/or links associated and/or defined with particular semantic artifacts. Further, the semantic artifacts that define and/or are associated with the semantic shape may be semantics, semantic routes, semantic groups, drive semantics, goal semantics, indexing semantics and any other semantic artifact. Thus, a semantic shape may be inferred based on such semantic artifacts and semantic analysis in the semantic network space. In further examples the system infers further shape semantics based on the semantic analysis in the semantic shape. A semantic shape may comprise adjacent, non-adjacent, linked or non-linked semantic network artifacts. In other examples a semantic shape comprises endpoints, links and any combination of those etc. Further, semantic shapes can span multiple hierarchical layers.

It is to be understood that a semantic shape inference is not limited to visual mapping modalities, but it may encompass other sensing types and modalities (e.g. sound, tactile, pressure, radio frequency, piezo, capacitive, inductive, analog, digital, semantic flux, semantic stream and other signal modalities).

A semantic network shape space may resemble at least one layer of a hierarchical semantic network model with semantic shapes and links between them.

Further, a semantic shape may represent a (linked) grouping of semantic artifacts (e.g. endpoints, links and/or semantic groups) in a potential hierarchical manner. Semantic shapes may be mapped potentially to fields, data, graphics, images, frames, volumes, captures, renderings, meshes, fluxes, layouts, sensing and further artifacts used in semantic analysis. The access to hierarchies and/or semantic shapes may be access controlled. In other examples a semantic shape comprises at least one group of semantic artifacts comprised and/or defined by semantic routes potentially in a hierarchical manner; it is as such, that most of the inference techniques applicable to semantic routes and compositions as explained throughout this application can be used in a similar way for semantic shapes and/or to infer semantic shapes.

The system may pursue various semantic routes during semantic analysis. The system may semantically analyze the inference on multiple semantic routes and determine semantic groups and inference rules based on the inference on those pursued routes. Further, the system may associate semantic shapes with such routes, inferences, groups and/or rules. In an example, the system uses a higher semantic route of "LOW CLEARANCE" "SHAPE 1" and another one "FAST" "HIGHWAY" and the system associates the lower semantic shaping routes within the semantic model to at least one semantic group, drive semantic and/or shape of CAR and further, if additional related inference and/or feedback is available (e.g. inferring the brand logo, text, external input etc.) to a drive semantic and/or shape for DELOREAN. Thus, the system may use various routes and/or rules for inference and augments the factors for the inferred semantics based on the semantic analysis on such routes. In some examples different routes reinforce the factors of various semantic artifacts and thus a high-level semantic understanding is likely. In other case different routes determine factors to spread, decay and be non-reinforceable and thus higher-level understanding is less likely. In either case the system may pursue other routes and what if scenarios in order to achieve goals.

The semantic orientation and shaping may be based on semantics whether associated with semantic routes and/or semantic groups. The semantic orientation and shaping allows the driving of inference and selection of inference routes and rules based on a subset of drive semantic artifacts. In an example the system selects drive semantic artifacts and routes associated with synonyms belonging to groups where the drive semantic is a leader.

Semantic orientation and shaping uses semantic hierarchy for inference. In an example semantic groups of semantic model artifacts are grouped together in higher level hierarchy artifacts and the system performs orientation based also on the new hierarchy artifact. Semantic orientation is used to group semantic artifacts together. Artifacts are grouped based on semantic orientation and drift. In a further example the semantic routes themselves may be grouped.

Semantic routing may comprise semantic orientation and profiling for a semantic trail.

The semantic routing is intrinsically connected to semantic orientation in semantic analysis; as such, when mentioning either one is to be understood that the other one may be implicitly involved. Semantic routing and orientation may use semantic drift assessment.

Semantic orientation, shapes and semantic drifts may be used to determine and categorize actions, behaviors, activities and so forth. In an example the system uses orientation and inference towards an action and/or command. In another example the system uses semantic orientation and semantic drifts to infer whether an inferred semantic is associated with an action, behavior and/or command.

Semantic routing, orientation, shaping, drifting and further semantic analysis (e.g. hierarchical, semantic profiles, gated etc.) may be used to assesss if short term planning (e.g. comprising sub-goals time management rules) and/or execution matches long term (strategic) planning (e.g. comprising high-level and/or composite goals time management rules). While the shorter-term (e.g. fast decaying) goals may incur larger drifts in relation with the strategic goals (e.g. based on factorizations and/or budgeting) the longer term artifacts (e.g. slower decaying, higher level artifacts) may incur smaller goal drifts.

The system may project and/or assess/reassess a (strategic) goal based on the projections and/or realization of sub-goals (and/or shorter term) goals. In some examples, if the realization of sub-goals proceeds with little semantic drift from projections the system may not alter the (strategic) goal and consider it achieved when all the sub-goals complete. However, if the semantic drift is large and/or sub-goals are not met then, the system may infer alternate projections and/or sub-goals; alternatively, or in addition, it may adjust, decay and/or invalidate the (strategic) goal. It is to be understood that the sub-goals may comprise shorter term goals which may be associated with semantic time management rules. In some examples, the adjustment of the goals/sub-goals is based on a lowest entanglement entropy, drifts, indexing and/or factorizations between the old and the new goals/sub-goals and/or further semantic artifacts used in projections. Competing requirements (e.g. associated with various semantic profiles) for short-term and/or long-term planning may determine elevated drifts and/or confusion factors which may be decayed by further budgeting, flux challenges, semantic profiling, hierarchical and/or gated inference of factors and/or indicators and further semantic analysis.

The system may perform deep learning feature recognition (e.g. based on CNN, RNN, LSTM) on the semantic shape and fuse the features and attributes detected within the sematic inference.

Semantic network models use semantic gating for transferring information from one semantic unit and layer to another.

In another example, the system may infer that a shape is a DOOR LATCH based on the position relatively the door mapped semantic model which is at an endpoint that is high factorized for LATCH, LOCK semantics and routes. In a similar example the system recognizes NUMBER 9 on a BLACK SHAPE and associates the RAISED CONTOUR surrounding the number with BUTTON and further infer REMOTE CONTROL for the BLACK SHAPE; alternatively, or in addition the system may recognize REMOTE CONTROL first and subsequently NUMBER 9 and associates the RAISED CONTOUR comprising NUMBER 9 with BUTTON and further REMOTE-CONTROL BUTTON. Thus, the system performs system inference using a plurality of routes drive semantics and hierarchy levels in the semantic model. It is understood that the system may use semantic identities moving together in the semantic space (e.g. BLACK SHAPE and BUTTON moving together at the same time in user's hand) to infer further semantic groups and/or identities (e.g. REMOTE CONTROL); thus, the system is able to infer and associate semantic identities in context (e.g. REMOTE CONTROL, REMOTE CONTROL BUTTON, NUMBER 9 ON REMOTE CONTROL BUTTON etc.).

In further examples, the system infers and/or uses connection indicator and/or factors. In an example, two endpoints and/or semantic shapes are associated each with WHEELS; and the system may infer a semantic group if the wheels are associated with similar and/or identical semantics, semantic routes, drives, orientations and/or groups within a semantic time. Alternatively, or in addition, the wheels may be comprised in a particular area, endpoint and/or other artifact. In further examples, the wheels move together and the semantic drift of their behavior (e.g. as inferred based on associated semantic routes and/or semantic views) is within a (coherency) range and/or semantic analysis is coherent. In further examples, the wheels are comprised and/or mapped to a linking endpoint and/or area (e.g. car chassis).

It is to be understood that the shapes and contours including numbers may be inferred through any techniques specified in this application including but not limited to sematic analysis, deep learning, semantic segmentation etc.

A conditioning waveform may be used as an encryption medium wherein the conditioning waveform is used to modulate the encryption of a composite data signal or semantic wave in an adaptive way based on semantic analysis.

The semantic engine may run on optimized semantic hardware. Such hardware may include ASICs, SoCs, PSOCs and so on.

Sometimes, to optimize the hardware, a semantic system may perform evaluation, simulation, testing and/or automation of placements of components on a substrate, PCB or wafer based on semantic analysis including semantic shaping. Thus, the semantic system may use a semantic network model which has a set of endpoints mapped to locations of at least one substrate, PCB or wafer and the system performs semantic inference based on the components and substrate capabilities (mapped to semantic attributes); further the system may represent component heating and its impacts via semantic models and semantic rules (e.g. heat semantics mapped to endpoints, semantic time management); further, communication protocols are mapped to a semantic model and semantic streams/fluxes. Thus, the system may model many aspects of the design including cyber, performance, interference, power consumption, interface, radiation, leakage, heating and, thus, the system is able to determine the mapping of components/semantics/attributes to locations based on semantic inference and semantic network models. The system may infer/simulate the mapping of those components and use the configuration that yields an optimized semantic model based on ratings, rewards, costs, risk or other factors and/or analyses as explained throughout the application. In addition, the system may seek particular orientations of semantic routes for coupling and access (e.g. memory access) and perform analysis based on those routes coupled with previously mentioned analyses. The components may include any electronic components and circuits, iCs, substrates, layers and so forth. The hierarchy of the semantic network model may resemble the hierarchy of photolithographic layer imprints and a photolithographic semantic automation engine uses the semantic model to automate the process through actuation and hardware control. In similar ways, the semantic system may be used to determine locations and automate any other processes including traffic control, robotic manipulation, image processing or any other system requiring space, time, access control coordination.

The system may extract metadata from various inputs, data and signals and assign semantics to it. Additionally, the system asks for feedback from another semantic system; the request is submitted to the system with greatest rating in relation to the theme. The challenge/response mechanism may be realized through semantic fluxes and be controlled through semantic gates and semantic rules.

Additionally, groups of systems can develop group capabilities based on the explanation of the interfaces, where the groups and leaders determine affinities to each other based on semantic analysis.

The semantic model may be used to model equations or algorithms. The system may update the equations and algorithms and apply the updated artifacts to semantic inference and data processing. An equation and algorithm may be associated with a composite semantic artifact, collection of semantics, semantic groups and/or semantic routes.

Sometimes sniffers, detectors and memory data may be used with semantic analysis to infer and learn patterns, semantic artifacts (e.g. indicators, routes, groups) of usual or unusual behavior pursued by malware. In a similar way, deep packet inspections and/or protocol sniffers/detectors may be used and the semantic analysis would be performed on packet data and metadata in the protocols (e.g. source, destination, type of packet, packet sequence, flags, ports, offset, ack etc.). Thus, the system is able to perform semantic inference related to cybersecurity by combining methods like these that detect malicious behavior with code execution, protocols or other cyber related artifacts.

The system may infer potential (attempt) (cyber) breaches if received and/or entered (e.g. by a user, operator, flux, group etc.) authentication information exhibit a high semantic drift and/or (entanglement) entropy in rapport with the current and/or historical legitimate authentication information.

A semantic controller may be used to control various hardware and/or software components based on inference.

In some examples the semantic controller controls a robotic arm. Further, the robotic arm 13 having an upper arm 13*a* and lower arm 13*b* as seen in FIG. 1, which may be used for soldering and/or component placing on a substrate and/or board (e.g. PCB). Thus, the semantic controller accesses and performs the specific actions at the soldering and/or component locations based on sensing, mapped semantic models (e.g. to substrate, layer etc.) and semantic analysis.

The semantic controller may be on another system, computer, component, program, task or semantic unit. The component may include general computing components, real time components, FPGAs, SOCs, ASICs or any other general or specialized components capable of interpreting the semantic model. Sometimes, the semantic controllers may be networked together for improved knowledge sharing and synchronization. As such, the distributed processing system operates according with the distributed semantic model. The distributed semantic model may be interconnected, transferred and developed using many techniques some which are described in this disclosure including but not limited to semantic flux, semantic gate, semantic streams etc.

The semantic controller may be used as a cybersecurity component in the sense that will allow the usage of the system's resources by the program based on the semantic model and multi domain semantic analysis. In an example, the semantic model may include preferred semantic routes, while other semantic routes are deemed risky, hazardous or not allowed. As such, the system enforces the security of the system by controlling/denying access and taking actions for the inferred semantics or semantic routes that are hazardous or not allowed. Semantics and factors associated to access control rules can be used for inferring, allowing, controlling, prioritizing and notifying.

The semantic units may use blockchains for authenticating sources (e.g. data source, semantic flux, stream etc.).

The system may encrypt semantic waves based on key certificates (e.g. public, private) assigned to identities and/or semantic groups. Thus, key encryption may be used to encrypt information to semantic groups wherein semantic waves are encrypted based on a key for the group; the infrastructure may be able to distribute the decrypt keys to particular semantic groups.

In further examples of semantic encryption, a semantic wave is modulated at a source based on inference at various levels of the hierarchical structure and further encryption; further, the wave may be collapsed in particular ways and/or only partially by entities, groups, hierarchies and/or levels based on their semantic coverage. In some examples, the wave is not collapsible at some units, groups, hierarchies and/or levels.

The semantic unit may be coupled with a semantic authentication and encryption system based on biometric data, certificates, TPMs (trusted platform modules), sensorial, password, location and/or blockchain. In some examples, the semantic waves and/or components thereof are encoded with the keys and/or data provided by the aforementioned methods and be collapsible by particular artifacts and/or hierarchies.

It is to be understood that the semantic encryption and decryption may be based on semantic hierarchical inference wherein particular identities, groups and/or keys are allowed access (e.g. via access control, gating) or are associated to particular hierarchies and/or semantic artifacts.

Analogously, the system may perform composition and/or semantic collapse based on the inference on multiple elements and/or artifacts wherein the system may use a determined entanglement entropy to infer the missing and/or erroneous artifacts.

The system may consider and/or project the order and/or time of collapse at different entities, fluxes and other artifacts based on semantic model, location, orientation, budgets, semantic factors and further semantic artifacts. Further, it may couple such inferences with its own budgets.

A memory used by a communication or transfer module (e.g. network card, RF, optical module etc.) can be selectively transferred to other systems; the data transfer is optimized and the data rate may increase if the transfer is being shared between multiple transmit and/or receive channels. In an example, wavelets compressed artifacts may be transferred in parallel or may be transferred selectively with various resolutions and speeds based on semantic inference based on metadata; as such, in an example, the image may be transferred at a base, adequate or required resolution at first and then being built at a higher resolution based on other streams. Alternatively, or in addition, for increasing reliability the system may transfer interleaved information based on various channels, fluxes, routes and semantic groups thereof.

A block of memory may be associated with a semantic identifier and the system infers semantics for the identifier and applies semantic rules; the semantic system may use semantic analysis to control the access to the memory for I/O operations, transferring and/or receiving from memory. Analogously with the access control on block of memories the system may perform access to web, collaboration, social, sites, messages, postings, display control artifacts, database artifacts, text artifacts, word processor artifacts, spreadsheet artifacts and so on.

In a semantic flux and/or stream scenario, the transfer rates in such a module comprising a memory may look as follows. The sender has semantic memory and/or buffers that need to be transferred. The sender pushes the data and the semantic information associated with it to the memory and the system decides which data to transfer based on semantic analysis; the system may adjust the communication and transfer protocol parameters based on the quality of service and/or semantics (e.g. the quality of service may be modeled as a semantic; LOW, MEDIUM, HIGH, IMMEDIATE, potentially based on an input from a user). The system may use semantic fluxes and/or streams for transfer to/from memories. A semantic computing system may comprise a grouping of memories connected via semantic fluxes and semantic streams controlled through semantic gates. The memory may be a semantic memory organized as a hierarchical semantic network model and as such the level of access control, granularity (e.g. semantic resolution) in semantic inference and representation is increased. The information is clustered based on internal semantic representation for optimal access and performance.

In some examples the source has, obtains and/or determine semantics on the data to be sent and the system uses the semantic information to intelligently send the data to the destination.

In an example, of a multimedia file (e.g. image, video) the source detects artifacts in the data and infer semantics that are then used to selectively transfer data to the destination; further, the data may be mapped to semantic network models. The data transferred can be selected data, particular data, particular resolution data, particular component data, particular semantic data, particular hierarchical levels and any combination thereof. The source system may selectively transfer the bulk of data since at first it sends the semantic interpretation of the data that can be used by the destination for inference, access control and gating possibly based on semantic factors assigned to the source. The destination may reinforce the inference with its own semantic analysis of the received data. In an example the system sends a semantic from source to destination while preparing data for transfer (e.g. cached, buffered etc.).

The selectivity of data may be related for examples with selected semantics and/or factors (e.g. intervals). In some examples the system may selectively retrieve only portions of frames, images, videos and/or semantic models based on risk, abnormality, semantic of interest from PACS (picture archiving and communications system), EMR (electronic medical record), VNA (vendor neutral archive) etc.; it is understood that in some cases the images, frames and/or zones of interest are annotated and thus the system maps semantic models to the annotated zone and further perform semantic inference on the mapped annotated zone and on further mapped semantic models on zones comprised and/or comprising the annotated zone.

Once the destination reaches a satisfactory rating/weight or factor for the semantic inference on the received semantics and/or data it may not require the remaining data to be transferred from the source and as such it may inform the source of that aspects, let the transfer expire (via a semantic expiration) or block the transfer through access control (e.g. via semantic gating). Alternatively, or in addition, the source sends only o particular semantic scene from the original data together with its semantic interpretation and the destination assess the accuracy factor (e.g. based on risk, rewards, cost etc.) of the semantic interpretation in rapport with its own model; if the accuracy factor meets a goal (e.g. threshold and/or interval) then the destination may accept all the semantic interpretations of the source without further semantic analysis and/or further reception of the data; further, this technique may be applied on a sampling basis where the source sends samples of the original data and semantic interpretation at semantic intervals of time.

In another example the destination may control the data transfer in the sense that it asks the source of particular data (e.g. data associated with particular semantic artifacts, resolutions, locations, image regions, particular memory areas, particular endpoints, links, sub-models etc.) and the sender sends the data on demand. The destination may ask and/or be provided with access to various artifacts in memory based on semantic access control rules or other techniques explained in this application.

The system intelligently stores data on nodes. The distribution of data is based on localization, semantic and semantic rules. Further the data may be distributed as a hierarchical semantic network model. As such, the system is able to map access the required data in a more effective manner. The mapping of the semantic models may comprise memory, blocks, devices and/or banks of the former.

For example, if a semantic management rule in a compute node specify a semantic or a semantic attribute in its rule then the semantic system will eventually cache the data at/for the node, the related objects and/or semantic network artifacts that are potentially related and be affected by that semantic; other objects may not be required and if the system detects unknown objects may automatically infer out of ordinary events and/or unknown events. Additionally, the system may further pursue semantic challenge/feedback to the node structure and/or feedback from a user for finding more information about the subject.

In another example the system will selectively store parts of a larger semantic model based on the semantic rules at each semantic unit.

In an example, a semantic memory may be optimized for semantic inference and semantic sharing. Segments of memory may be mapped and/or associated to endpoints and links; the memory links may be mapped and/or associated to semantic fluxes and gates. The semantic memory may be segmented based on semantics and the access control rules determine access to specific semantics and/or memory segments. The system checks (e.g. challenges) the semantics, semantics, theme and semantic factors with another system or component to see if is available and/or in what semantic budget (e.g. cost, semantic interval) will be; in some cases, parts of memory are bulk transferred between systems based on the semantics and themes of interest and access control rules.

Some of the semantic memory segments must stay unchanged while other segments may be updatable based on various conditions including access control rules.

It is to be understood that when the connectivity between various components is not available and/or drops the system may pursue additional semantic artifacts and/or routes based on the levels of coherence and/or confusion factors relative to interrupted semantic routes, goals, views and/or other semantic artifacts. In addition, the system may preserve such interrupted inferences and further factorize and/or decays associated factors (e.g. risk etc.) and/or associated artifacts based on the reconnection time, delay, availability etc.; in an example the system factorizes the risk and/or cost based on the increased channel incoherence. Further, the system may use the factorization of risk to further factorize and/or index the decaying of associated artifacts; in an example the system may not decay the inferences occurred prior to a lost connection if the incoherence and the risk factors of unfinished inferences is high.

In an example, a semantic autonomous system may contain a plurality of semantic memory segments with some segments that contain the hard-wired rules having different access rules than segments which contain the customizable rules. The hard-wire rules may include general rules for safe operation of the system and hence the access to change or update those rules are strictly controlled or even forbidden. The customizable rules on the other hand may be changed based on various factors including local regulations, user preferences and so forth. As such, the customizable rules may be automatically updated by the system when it infers a semantic based on location data and requires a new set of rules associated with those locations; other customizable rules may be also be determined, defined and/or customized by the user. In an example, an autonomous car roams from a legislative state to another which has different autonomous driving rules; as such, semantic modeled artifacts and rules (e.g. semantic routes, time management rules etc.) may be ingested to comply with current regulations. Also, the car's semantic system may be modeled by a user providing guidance through various sensing and actuation interfaces and the system determines semantic routes based on those inputs. The system may infer, comprise and/or ingest such customizable rules comprising time management rules. In an example, the user specifies its preferences and/or priorities in particular circumstances and/or activities and the system infers time quanta, the order and actual time for starting and stopping the semantics associated with the circumstances (e.g. activities).

Optimized configuration may be also based on semantic groups and possible semantics and/or locations.

In one example semantic identification command is used to identify a semantic group and the semantic group is configured with the optimized configuration.

Semantic gate allows the control of the semantic information being exchanged between various semantic entities. The semantic entities may be organized in a hierarchical semantic network model and include memory, processing units etc. The access and the control of a semantic memory used for data transfer is optimized for applying the semantic rules associated with the semantic gate (e.g. filtering and routing of semantics based on access control rules and/or semantic routes).

In an example of how a semantic memory may work, the system activates semantic memory artifacts and semantics (e.g. memory associated with semantic memory and marked semantics) which may stay active and/or reinforced until they are factorized, decayed, gated, invalidated and/or inactivated based on semantic analysis including time management. As such, next time when the system uses the memory for semantic inference only the active and/or allowed inferences and semantics and/or associated blocks or segments are valid and activated. The activation of memory may include electric voltage and current control, chemical, biological and DNA agents, other discrete and analog control whether electric or chemical in nature, biosensors, biotransducers and others.

When the system infers a new semantic based on inputs (e.g. data, signal, waveform, value, pattern, etc.) or semantic analysis it issues a refresh challenge of the semantic analysis to the memory, corresponding memory hierarchy level and/or select segments of memory based on the semantic. The memory then refreshes the semantics, semantic model, reinforce/reevaluate/deactivate/expire the semantic together with associated artifacts.

If the memory is hierarchical, the refresh of the semantic analysis propagation to various levels and stages may be based on semantic gating, semantic routing, semantic shaping, semantic factors, time management, access control, and so forth.

The system may use hierarchical memory to store hierarchical semantic network models. In an example, the memory hierarchy matches the semantic network model hierarchy and potentially the access between hierarchies is semantically controlled (e.g. through semantic gates, access control etc.). It is to be understood that while the hierarchy of memory is implemented in hardware, alternatively, or in addition, it may be virtualized thus abstracting hardware implementations. The virtualization may be based and comply with semantic views connect and semantic gating requirements.

In some instances, the hierarchy of memory may be virtualized thus abstracting hardware implementations. The virtualization may be based and comply with semantic views connect and gating requirements. In further examples, the virtualization may rely on semantic groups of resources.

Memory caching processing and preemptive processing may be based on semantics, on component semantic models, hierarchies and other techniques as explained in the application.

The system may use semantic components and/or associative memory for implementation of semantic memories.

In an example a semantic artifact and/or semantic identifier is active in a short-term memory (e.g. short-term semantic view) until it decays. Potentially, may be inactivated, expired, deleted and/or transferred to another memory (e.g. recycle, longer term, higher level etc.) if its factor reaches a certain threshold/interval. The system uses semantic time management for structures of memory associated with semantic artifacts including view frames, views, routes and so on.

The system may generate or associate a particular semantic and/or identifier with an access control rule; they can be associated with a memory block and/or with an entity or semantic group that require access to the memory block. The access control rule may be associated with semantic groups, possibly via a semantic attribute and other semantic identifier. In an example, a semantic group comprises a memory block semantic identifier and an entity semantic identifier and as such the computer is able to control the access to the memory in a more facile manner by associating access control rules to the semantic group.

The access to memory may be evaluated based on semantic analysis including synonymy, antonymy, meronym etc. The access may be also evaluated on causality semantics (oriented links and/or associated endpoints and their related causality attributes etc.).

As specified above the management plans may include access control plans and rules. The access control rules are used to control access rights to various resources including memory and memory segments, disk and disk segments, networking and data transfer channels, sensors, controllers and any other hardware and software modules. It is to be understood that the resources (including memory) may be associated and/or organized as a semantic model with endpoints comprising segments, zones and links comprising channel and buses. By using such organization, the system may increase cybersecurity for example, by assigning risk factors to communication links and memory related endpoints and areas. Further, the signal (e.g. semantic wave) routed and passing through such memory zones may be transformed and routed based on zones semantics.

A semantic sink may communicate with the semantic engine via a semantic gate. Any entity can incorporate the semantic sink and interact with the semantic engine. The semantic engine performs semantic inference on the data and signals received via a semantic sink; the semantic sink may comprise a semantic flux and the semantic engine performs semantic analysis based on the data and signals received via the semantic sink flux. Thus, the semantic engine may be used to synchronize and/or control the workflow in hardware and/or software components which embed or incorporate the sink on local or remote computer units and/or systems and further for cybersecurity controls. The hardware components may be any components, devices, blocks and/or interfaces whether analog, digital, continuous or discrete.

A trail of semantics may be recorded based on a semantic route or a drive semantics whether inferred and/or specified by user. Sometimes a semantic gating is used for recording semantic trails.

The semantic model can be defined and configured locally for each system based on user interfaces, provisioning, configuration management or data stores. The semantic model can be shared between various systems. Additionally, the semantic systems can share parts of the semantic models and potentially exchange semantic model updates in a way that if one system is determined to have a better semantic model or parts of thereof, be able to improve the other semantic systems models as well.

The system may use semantic gating for semantic model exchange. Sometimes the gating may be based on identifiers, names and so forth. In some examples, the system uses gating for transmitting (or not transmitting) and/or forwarding (or not forwarding) parts of the semantic model that are associated with particular semantics and/or semantic groups; in further examples the gating may be based on gating drive semantics where the system gates parts of the semantic model based on the semantics associated with the gating drive semantics.

It is to be understood that the semantic model exchange may take place in a semantic network environment where a model in at least one endpoint is gated to another endpoint.

In general, collaborative intelligence is superior to non-collaborative intelligence. This is also associated with swarm intelligence and group intelligence.

The collaborative intelligence may be materialized through distributed semantic systems.

The semantic systems may be coupled through various semantic connection techniques and artifacts including semantic flux, semantic streams and semantic gate.

Semantic systems may register and/or send advertisements with their level or semantic knowledge and/or capabilities (e.g. themes, semantics, semantic factors, budgets etc.). Those advertisements or registrations may be based on location and space-time semantics in an example. Further, the registration may include operational rules, semantic routes, parameters and other semantic artifacts. The receiving system may generate, and map semantic models and rules based on the registered artifacts and locations of those artifacts.

Semantic systems may register with any semantic identity, potentially based on semantic profiles; further, those semantic identities may comprise owner, installer, capabilities and so forth.

Semantic identification and/or semantic group may determine inference of capabilities and/or semantic attributes. In examples, the system determines that the leadership semantic of a DELOREAN is the DRIVING EXPERIENCE and thus in order to project improvements, increase ratings and/or desirability of DELOREAN it may select goals which elevate the GOOD DRIVING EXPERIENCE related factors and/or decay the BAD DRIVING EXPERIENCE related factors while allowing drifts of (inferred/projected) budgets based on risk projections (e.g. in rapport with competition products, budgets, price etc.).

While semantic systems may advertise capabilities, further, semantic systems may infer lack of capabilities in potential collaborators and/or advertisers. The inference of the lack of capabilities may be inferred for example on failed inference, incoherent inference, elevated confusion, projections, budgeting and/or further semantic analysis. In some examples, systems that were not able to meet semantic artifacts, goals, projections, budgets, coherence, confusion and/or other factors and budgets may be associated with semantic rules and routes which reflect the decaying biases towards such artifacts.

While the preferred method of functionality comprises propagating semantics through the semantic connect once they occur, sometimes a semantic system (e.g. requestor) need to challenge or obtain information about particular semantic artifacts and themes. This may happen when the semantic system is not connected a-priory to sources for that semantic/theme and/or the semantic/theme is not trusted or relatively decayed (e.g. low weights, other low semantic factors, sub-thresholding); as such, the semantic system issues a challenge or request for information to the other collaborative systems (collaborators). Sometimes the response should meet a required semantic factor/weight threshold and/or semantic budget. The semantic system may specify the required factor/weight level and/or budget to the request potentially through another semantic and/or semantic artifact. Alternatively, or in addition, the system may assess the best collaborative systems (including on an semantic group basis) that may respond to that request for information and ask and route only through only a selected few of collaborative systems for such information; the route may be based on a semantic orientation. The selection of a system may be based on factors that an initiator holds about a collaborator. The requestor may determine the themes of interest and sends the requests to the selected collaborative systems that may provide the best factors for a particular orientation and budget. Alternatively, or in addition, semantic flux/gates may expose and maintain semantic capabilities with potential semantic budgets and the system uses those for semantic inference and orientation. Further, systems may maintain those semantic flux/gate capabilities updated continuously based on semantic analysis and/or similar requests, techniques in the semantic network.

When external systems are using semantic flux/gate capabilities for semantic inference it may rate the semantic flux/gate overall and/or in regard to those particular capabilities and/or associated themes.

The requestor may aggregate the received responses and use factor/weighting rules to fuse the data from multiple semantic systems. The fusing of data may use any semantic analysis techniques for fusion including composition, route, trail, synonymy, antonymy, meronymy etc.

The system may determine the best components and collaborators based on semantic orientation within the sub-model holding component and collaborators capabilities and mapping.

Sometimes the collaborators process their factor for the information that they receive as a result of a challenge. Sometimes the response may include the computed factor by the collaborator. The requestor may use the received factor and its internal factor level of the particular collaborators (e.g. general rating/risk or the rating/risk for the particular drive semantic or theme) to compute an overall factor on the response. Further, the collaborator may provide semantic trails of the requested semantic artifact or inference to a requestor and the requestor uses such semantic trails to perform further semantic analysis and orientation.

The selection of collaborators can use similar techniques used for semantic grouping, semantic identification, semantic routing, semantic marking and/or inference.

The selection of the collaborators, authoritative semantic sources and the routing to and through those systems may use semantics and/or semantic techniques.

Inference on multiple semantic fluxes and/or groups determines entanglement of inferred semantic artifacts. In some examples the inference system preserves an entanglement trail which may comprise the semantic identities and/or DNA signatures of entangled semantic artifacts and/or contributors.

A semantic group may have leaders; sometimes the leaders are authoritative for particular or on all semantics of a group. The authoritative qualification and/or level may be provided via semantic factors. As such a requestor may decide or be forced by the semantic rules to route and obtain information only through a leader system (e.g. having a semantic factor for a semantic artifact that deems it as a leader). The leaders may be established based on ratings, weights or other semantic factors within the group related to particular semantics and/or subjects.

The leaders may be the only ones in a group that publish gating and flux semantics related with their authoritative semantic artifacts. As such, they may be the ones that coordinate the couplings of units in the group for particular leader semantics and artifacts.

The leader type hierarchy may extend to the semantic network model where particular semantic network model artifacts or subject entities (e.g. master post) are leaders of a particular group, level and/or hierarchy.

Collaborative systems may not need to be directly connected in order to collaborate. They may be dispersed in one semantic group or multiple semantic groups. They can communicate via a cloud and/or mesh networking. Such semantic groups may be represented by leaders for particular semantics or in generalized manner; further the leaders may consist of semantic groups or partial leader groups within the group hierarchy and any combination of the former. As such, the semantic intelligence and/or compute may reside on the cloud and/or nodes in a distributed manner. In an example such distributed intelligence is used for managing smart posts or autonomous robotic infrastructure.

The semantic distributed architecture comprises semantic groups and/or leaders at various levels within the architecture.

A semantic group of semantically related artifacts (e.g. meanings) may have an authoritative leader based on the particular contexts of semantic inference and/or analysis. A leader may comprise semantic artifacts such as component semantics, semantic groups, semantic routes, goals etc.

As mentioned, the semantic group formations may be based on semantic analysis. As such, the semantic group formations and leadership are space time, capabilities, context, objective and goal aware. The semantic group formations and leadership is based on artifacts in the semantic network model, where semantic artifacts are inferred at different levels of hierarchies. In a traffic management or smart post infrastructure example the system defines semantic groups and leaders in a hierarchical manner on the larger areas (e.g. higher endpoints) based on the semantics associated with such endpoints and endpoint hierarchy and, based on semantic analysis, defines groups and leaders within the hierarchy of semantic network model and semantic groups. While the previous example mentioned larger areas and/or higher-level endpoints (e.g. based on more abstract or transfer semantics) it is to be understood that similar techniques apply to more granular areas and lower level endpoints. As previously mentioned, such inference can be associated with any direction within the hierarchical structure.

The semantic systems can exchange semantics via semantic fluxes and the semantic fusion consider them based on a factor/weight assigned to each flux.

Semantic fusion takes in consideration the semantic model, semantic rules and semantic factoring for each composition when performing the fusion.

Further, the semantic fusion or composition may update the semantic factors and semantic budgets of related semantic artifacts including those involved in fusion and composition. In an example, once the system infers a high factor composite semantic it may decrease or increase the semantic factors associated to compositional semantics. Further the system may update the semantic budgets associated with selected semantic routes. In an example a semantic time budget is updated based on the inferred semantic factor to reflect that the goal may be reached earlier or later than predicted. The system uses the semantic chain and semantic analysis to update semantic artifacts. In some examples the system uses the semantic chain and/or model of a semantic view and/or semantic view frame for optimization.

A semantic view comprises and/or conveys semantic artifacts used and/or inferred by a semantic system and/or subsystem. A semantic view may be associated with snapshots or frames of past, current and/or projected semantic analysis. A semantic frame view comprises a frame view based on a subset of semantic artifacts.

Semantic analysis may be performed on any type of data including text, binary, waveforms, patterns, images and so on. In an example, a semantic stream (e.g. based on images and/or frames in a video or spatial rendering) interpretation may correlate artifacts from various domains; further collaborative semantic image interpretations from various systems ensure multi domain knowledge fusion.

For example, if a system needs to infer how many people are cycling at one time, then the system might collect data from various fluxes and fusion, challenge (e.g. interrogate) and give priority and/or more weight to those fluxes which provide data from areas where is daytime, assuming that less cycling is usually done overnight and that the system has inferred strong factored semantic artifacts (e.g. composite semantics, semantic groups, semantic routes) based on semantic artifacts of cycling (e.g. cycling related semantics, semantic groups and semantic routes whether based on semantic relationships of cycling and further semantic analysis) with daytime (e.g. based on semantic time). As such, the system may use semantic rules for semantic flux management including semantic routing.

The system may perform searching based on elements that are assigned drive, route and/or leadership status in semantic inference. As such, the system is able to infer semantic groups and/or trails, rendering and/or storing those graphically, textually, binary and/or via semantic augmentation.

A flux might be deemed more reliable (e.g. high reliability factor, lower risk factor etc.) than others in a particular semantic and/or theme and hence is weight being adjusted accordingly.

In another example the trust and the semantic factors of semantic fluxes may be determined based on the environment on which the semantic flux provider operates. If an RF and/or optical system operates in a high noise environment, or on a contested or crowded environment then the semantic determinations based on RF and/or optical sensing provided through the flux may be assigned semantic factors conveying high risk, hazard, low trust. Additionally, weights, ratings and semantic factors of fluxes based on those determinations may be also affected.

Receivers may correlate information from different fluxes in order to assign semantic factors on fluxes and flux semantics. The semantic flux may be associated with semantics and/or semantic identifiers and participate in inference. The association may be based on external inputs, inputs from a user, semantic inference and so on.

Templates and/or semantic rules comprising fluxes are used to develop the semantic system. A template or rule may specify that a flux may be taken in consideration for a particular semantic or theme based on its factor for that particular semantic or theme. Sometimes this is modeled through semantic gate and/or access control rules in which semantics are gated.

In an example, a semantic system may preserve the best, relevant or leader semantic fluxes for ingestion and semantic inference on various themes, semantics and/or goals. In another example a cyber security system may assess and update the ratings of fluxes, themes, semantics and such; it may ingest the low rated factor semantic artifacts and determine patterns of usage that determined the low ratings/factors and assign semantics to it. The cyber units and/or semantic engine uses access control rules to control access to resources. The resource may be any computer resource, hardware or software unit, analog or digital block or interface, component, device whether virtualized or not.

Sometimes the trust of a collaborator is based on vulnerabilities information processing in rapport with the collaborators capabilities or characteristics (e.g. modeled via semantic attributes) which may be impacted/affected by such vulnerabilities.

The system might adjust its own semantic inference model, by fusing semantic model artifacts received via fluxes into its own semantic model. E.g. if a factor of a flux is high on a particular semantic then the sub-model for that semantic might be updated with inference artifacts from the higher factorized system.

However, a semantic sub-model that functions well for a system might not function always that well for another system due to particular conditions and functional environment.

Hence it is critical to be able to assess the best model for each system at any point in time.

Various smart sensors can capture various features and semantics with a high degree of certainty. Smart sensors may embed the semantic engine within an internal processing unit. Hence, the semantic analysis and semantic fusion is closer to the sensor.

The semantic analysis and fusion may resemble a hierarchical approach based on the hierarchies associated with the endpoints and/or links in the semantic model. In an example, the system groups elements in the semantic model based on semantic analysis (e.g. composition). In such a way endpoints and/or links may be composed at any level of the hierarchy. In a similar way, semantic analysis may be based on grouping of semantic model artifacts. In an example, the grouping of endpoints may be based and/or determine semantic composition on the semantics associated with the endpoints.

With semantic technology sensor fusion is more efficient and relevant more so when there is a high degree of correlation between the data from various sources. For example, infrared image/frame and an ultraviolet visual image frame in the same field of view may be correlated in order to derive the types of objects in the image. Usually, the processing is optimized if the two images can be superimposed or layered and/or translated to the same field of view, coordinate system and/or spatial network models for coordinates matching. If the system based on sensors operating at various wavelengths (e.g. visible, infrared etc.) detect a shape of an unknown object in the visible spectrum and a heat shape signature similar with that of a car in the infrared spectrum then the fused data associates the unknown object with a car based on overlaying and semantic analysis on the separate frames and overlaid frames. In some examples the overlaying is achieved via separate hierarchies assigned to the frames. Additionally, if other objects or artifacts are detected in the semantic snapshot of the visible spectrum then the semantic system might infer additional semantics once it inferred the semantic for the unknown object and potentially control the sensor for optimal sensing.

In a similar way, two or more semantic fluxes may feed in approximately the same semantic time interval information (potentially timestamped) related to an artifact in the semantic field (e.g. via messaging posts) and be able to fusion the inferences on the same theme, semantics and/or artifacts using semantic analysis. The system may be able to identify objects that artifacts are related to and the system associates the inferred semantics to it.

The information from two or more semantic fluxes may come from semantic groups of systems based on semantic routes that determine the routing through such systems. Thus, the semantic fluxes allow the propagations and semantic analysis through various semantic groups and by using various semantic routes.

The semantic model comprises semantic templates and patterns. A semantic template and pattern might include factorization and time management. The template pattern and template may be associated with groups of elements or semantic artifacts in the semantic model.

The semantic systems may use a particular language or symbology for meaning representation. The continuous development of the semantic models may potentially rely on language interfaces including speech, gesture and sign languages, text recognition, text inputs and such.

Additionally, semantics can be expressed or derived through these kinds of interfaces. In some cases, the interface relies on localization techniques to infer/convey meaning, where network model graphs may be mapped on the front-end sensing of such systems/elements to infer the semantics of movement of artifacts from one location to another and/or from determining patterns of movement.

The proper syntactic formations are modeled through the semantic model and semantic rules. The system may translate the language of meaning representation to another particular language. As such, the artifacts of the language meaning representation may be associated with other particular languages via semantic relationships (e.g. semantic attributes, semantic groups, semantic rules etc.). Alternatively, or additionally, the system may duplicate the meaning representation in various languages for optimized processing (e.g. duplicate the semantic artifacts and relationships in two languages).

Syntax may be based on time management and rules templates in some examples. Further, the semantic attributes may be associated to other semantics in order to specify their characteristics (e.g. VERB, NOUN etc.).

As explained by U.S. Patent Publication No. 20140375430A1, which is incorporated by reference, the semantic attributes may be group independent or group dependent. The group independent semantic attributes may represent the type of object, the class of the members or other non-causal or non-dependent relationship (e.g. found in the same location or scene); the group dependent semantic attribute may signify a causality and/or the dependency of the objects in the semantic group. In an example, the semantic system may use the semantic model and determinations to derive verbs. Verbs may be associated with the semantic management rules. For example, the system may determine the tense of the verb by just examining the time of a semantic inference including examining a semantic trail and a semantic route; e.g. John and Mary became friends may be derived just by examining the semantic trail, time, semantic time and/or semantic management rules for the semantic attribute "FRIENDS" associated with the semantic group (John, Mary); as such, the system knows that the semantic attribute "FRIENDS" for the group has been inferred past the current semantic view frames and/or view and such it infers the past tense of the verb. Based on semantic time management and semantic composition the system may infer appropriate tenses for the verb and produce semantic augmentation outputs.

In an example, the tenses are based on the distance in the semantic determination in a semantic trail. The distance may be based on time, semantic factors, indexing, semantics, semantic drifts and/or semantic interval. Semantic factors decaying in a semantic trail can also be used.

Semantic indexing may be used to determine space-time distance, correlation and/or orientation in a semantic network model and for semantic groups.

Sometimes the semantic systems convey meanings through language and symbols which may be the same or different from the language of meaning representation.

The particular language terms may comprise encryption, encoding and modulation which are semantic based (e.g. generated based on semantic inference). In the reverse way, the translation from another language to the main language of meaning representation may include decryption, decoding and demodulation.

The semantic model may learn representations from various sources based on direct observations or by documentation of those sources and their representation rules. As such, any schemas may be described and/or understood.

The system may ingest data through various means including text, optical, pointing and touch interfaces. In case of optical, pointing or touch ingestion the system may interpret inputs, locations, schemas or drawings via mapping of the data and/or data renderings to endpoints and/or links in a semantic network model (e.g. semantic network graph). Other optical recognition techniques and deep neural networks may be also employed. Optical recognition (e.g. shape, character) may be based on a semantic network model mapping. The mapping between semantic model artifacts and data and/or data renderings is based on a location including a physical region, area, point location, shape whether relative to the data rendering, frame, image, captured environment, observer, relative position, global position or a combination of those. Actual locations or virtual locations may be mapped in such a way. In further examples the mapping is associated with locations in a frame or image (e.g. pixels, segmented areas, objects, labeled or unlabeled regions, bounding box areas etc.).

Based on the use case the system may adjust inference and semantic models by information in semantic near and/or far fields. Based on inference of semantic near and/or far fields, the system may hierarchically map, adjust and infer models and sub-models. Further the system may combine such operations with semantic gating.

The semantic mapping consists in mappings between data and representation of the system with semantic artifacts of a semantic network model.

Taxonomies and other vocabularies may be described and learned.

The efficiency of the semantic systems allows them to have the data processed closer to a sensor element (e.g. on a microcontroller, processor, (semantic) memory or specialized circuit residing on the same PCB, MEMS, ASIC etc.), possibly in a hierarchical fashion; this may increase the processing speed, operational capabilities and the efficiency of the operational decision making. Some sensors on a chip may capture data related to various parameters (e.g. acceleration, spin, gravity) in a high velocity fashion and the efficiency is increased by inferring semantics closer to the sensor itself on a processing unit (e.g. microcontroller, processor, semantic unit) on a chip.

Therefore, it is important that the semantic model of the involved sensor be available on the processing unit closer to the sensor. Additionally, the semantic engine on the chip might instruct the sensor to adjusts its settings based on the inferred semantics and/or received semantics via semantic fluxes.

Semantics may be conveyed and/or inferred through speech/sound, visual/optical, touch, sensorial, signal and/or waveform, rf and any combination thereof.

Semantic models ensure that the signal and data features are molded into a human centric knowledge generation process.

The semantic model can include rules that are used for further expansion and adaptability of itself.

The semantic analysis comprises semantic techniques as synonymy, semantic reduction, semantic expansion, antonymy, polysemy and others. In an example, the user specifies semantic groups and/or provide semantic routes of synonyms, antonyms and other semantically related elements and inference rules. Elements in a group are by themselves related via semantic attributes or semantics (e.g. SYNONIM, ANTONIM). Semantic reduction and/or expansion of groups and inferences may be achieved through semantic composition, semantic routes collapsing and other semantic representations and techniques. A user may specify the semantic relationship via a pointing and/or touch interface; in such an example terms are presented on a screen on a graph representation (e.g. chart, graph etc.) and the user drags one or multiple lines within the representation representing its semantic orientation perception between the terms. Further if terms such as “quick”, “clever”, “fast”, “sharp”, “night”, “light” are presented in a chart the user may select a trajectory that resemble the precepted semantic drifts between such words. Further, if the operation is associated with at least one representative (e.g. drive) semantic, the trajectory may resemble the precepted semantic orientation in rapport with the at least one representative semantic. Further, the system may create semantic groups and semantic routes based on representative semantics and semantic trajectories in the semantic model. The distance of the selected trajectory to the semantics locations may be used to assess semantic orientations and drift.

A user may specify correction, goal and/or desired trajectories on displayed graphics (e.g. graphs, text, window and/or display controls etc.); further, a user may specify interest points, areas and/or endpoints. The user may enter and/or the system infers semantic artifacts associated with such trajectories and/or endpoints. The system may define further endpoints at intersections of trajectories with the graphic and perform inference comprising semantic mapping, orientation, shaping, indexing, factorization, analysis, rule, template and/or model overlay learning. It is to be understood that such learned artifacts may be later used in such sematic inference when similar semantic contexts are inferred (e.g. shaping and overlay learned models on renderings, graphics, images, frames and/or perform semantic analysis etc.).

User pointed trajectories on a display surface may trigger semantic inference on the semantic network model artifacts that the trajectory selects, encompasses and/or intersect; further, the inference may spread to further associated semantic artifacts. The network model artifacts in the trajectory and further associated semantic artifacts may be selected and/or activated based on access control (e.g. the user may have access only to specific user controls as related to semantic artifacts and/or identities). In further examples the user draws and/or specifies areas and/or oriented trajectories associated with the display artifacts and their associated semantics; in some examples, such semantics may be associated with indicators and/or factors (e.g. risk, desire, intention etc.). In further examples the user trajectories may be associated and/or used to derive goal artifacts; thus, the system infers semantic drifts, indexing, overlays, routes and/or sub-models based on the overlaying of the user trajectory to the semantics and/or model mapped and/or representing the display/ed data. Further, the system may display such inferences on the display artifacts mapped on semantic network model artifacts and/or hierarchical structure encompassing the network model artifacts. In some examples, the system redraws and/or overlays such information on a display unit. Alternatively, or in addition, the system may invalidate the previous information and/or semantic network artifacts on the display unit controller. It is to be understood that the display unit controller may control and/or be incorporated in graphic processing units, graphic cards, semantic units, CPUs, ASICs, FPGAs, DSPs, tensor units, graph processors and so on.

The system acquire, groups, links, displays, invalidate, query, overlays semantic artifacts based on context comprising user authentication, semantic profile, wallet and/or access control. Further, the access control may be used to allow access to such artifacts.

In some examples, the system uses the inputs from I/O including mouse, keyboard and graphics to determine the objects rendered, activated, their semantic identification and/or mapping; further, the system performs semantic analysis and learning and overlays the semantic network artifacts on the display screen based on I/O graphic operations.

Overlays may be associated with templates comprising semantic identities, profiles, hierarchy level, groups, trails, routes, trajectories and/or composable artifacts and further profiles and templates comprising such artifacts; the system overlays the semantic artifacts associated with the template semantics in the mapped area, display, control and/or further user interface. In further examples, the overlays are rendered and/or mapped based on such profiles and/or templates.

Overlaying and further semantic analysis may be used to further determine rendering of semantic artifacts based on inferred semantics related to color, blurring etc. Further, such rendering is based on semantic profiles (e.g. GREEN, RED may collapse to 30 BROWN based on a semantic profile and/or 40 GREEN based on another semantic profile; GREEN, RED, BLUR may collapse to a GRAY and as such endpoints, regions are blurred to gray etc.).

In further examples the system uses an additional orientation and/or drive semantics provided by user (e.g. using similar or different means via semantics, semantic routes etc.) together with the initial semantic trajectory in order to create semantic groups, routes and rules.

Narratives may be generated by the system based on semantic analysis. Narratives may be of a general nature, based on a theme, drive semantic, semantic route etc. The system may select areas of narratives, link them and/or assigns actions to such artifacts potentially based on a further mapping to semantic models. In further examples, the system may use semantic analysis and mapping to highlight, select, link and/or overlay display artifacts on narrative components.

In further examples, a user may identify semantic group artifacts (e.g. via selecting it on a touch screen; selecting an area and/or trajectory with artifacts) and further associate semantic artifacts (e.g. semantics, semantic groups, semantic routes, links etc.) associated with the identified artifacts. In an example, the user selects and/or identifies a display area comprising a set of semantic artifacts and then selects a target trajectory and/or area intersecting further areas, endpoints and/or semantic artifacts, thus allowing the system to associate the semantic artifacts in the selected and/or identified area with the intersected semantic artifacts. In further examples, the system may mark and/or associate the semantic artifacts of the selected and/or identified area with the semantic artifacts of the target trajectory/area and/or intersections. Alternatively, or in addition, the system may perform semantic analysis between the selected and/or identified semantic artifacts and those of the target trajectory/area and/or intersections and further, associate the semantic analysis inference artifacts to either or both of the selected and/or identified semantic artifacts and/or target trajectory/area and/or intersection semantic artifacts. In some examples, the system selects an area with a plurality of attributes and/or terms associated with diabetes semantics and selects a target trajectory/area through endpoints associated with cardiology, arthritis, psychology and other themes artifacts and as such the system is able to present inferences related with the effect of diabetes on different themes, graphics, controls and/or areas. In further examples, the system may use similar techniques to display the impact of rain to various trajectories on a road infrastructure. It is understood that in some cases the impact may be continuously adjusted based on the continuous inference on the conditions of the selected and/or identified area semantic artifacts and/or target trajectory/area and/or intersections area artifacts. In further examples, the system is able to populate/update a group of graphical control element (and potentially associated labels) and/or semantic groups thereof (e.g. as part of a target trajectory and/or area) with information (e.g. label, control type, control content, color, font type and/or other assigned and/or inferred attributes) from selected and/or identified semantic group artifacts; the populate inference may be based on semantic inference and/or gating between the information associated with the target graphical control element (e.g. label, control type, control content, color, font and/or other assigned and/or inferred attributes) and the selected and/or identified semantic artifacts. It is to be understood that the system may perform semantic inference based on drive semantics and/or gating associated with the target trajectory artifacts and/or groups thereof (e.g. labels, graphical controls, content, control type, groups etc.) and/or selected and/or identified artifacts. In further examples, the system performs semantic analysis based on selected and target shape attributes and further render sematic shapes resulted from analysis (e.g. the system has a composition rule specifying that a selected artifact associated with an elephant and a target artifact associated with a (one wheel) bicycle should compose, display and/or route when dragged and/or overlaid on top of each other in a not-allowable icon, smiley face, image, frame, display field, a question request and/or other artifacts; such artifacts may be associated with semantic identities, semantic attributes and/or further semantic artifacts inferred, determined and/or challenged by the system, and, further the system may use further semantic analysis on such composable inferences. In some examples, an image associated with a SMILEY (BEAR) FACE semantic identity is stored (e.g. in memory, disk, mesh, device etc.), generated and/or challenged to be retrieved (e.g. from storage, from an inferred and/or preferred semantic flux etc.); the (BEAR) attribute may be optional and/or being more specific for a requested and/or available semantic identity and/or profile. Further, the system may infer, allow and/or generate artifacts (e.g. images, sounds etc.) associated with NICE SMILE based on ratings, profiles, orientation, group resonance and/or further semantic inference. Alternatively, or in addition, the system may allow SMILEY PANDA BEAR but gate SMILEY GRIZZLY BEAR based on semantic artifacts, entropy, divergence, diffusion, drift and/or further rules and/or profiles. Also, if SMILEY artifacts are not available the system may generate, challenge and/or gate (for) artifacts associated with semantic identities with a particular drift and/or entanglement entropy from SMILEY; further, it may gate SMILEY antonyms (e.g. GRUMPY) altogether (e.g. based on (configured) entanglement entropy and/or factors). Semantic profiles, factorizations and/or projections may be used to determine SMILEY and/or related artifacts; further, the semantic artifacts associated with SMILEY FACES may be stored (e.g. in memory, database, disk, mesh, file, wallet, device, unit etc.) and/or rated based on inferences and/or inputs from users as results of challenges. In further examples, the user may augment the artifacts and/or compositions when challenged by the system (e.g. provide semantic attributes, circumstances, rules, guidelines etc.).

The system may not perform augmentation, render and/or display artifacts associated with high incoherence and/or confusion factors; however, the system may perform augmentation, render and/or display artifacts associated with high incoherence and/or confusion factors when challenging the users and/or semantic fluxes for additional information in order achieve the goal of decaying the confusion and incoherence factors. The system may perform augmentation, render and/or display artifacts associated with high coherence and/or low confusion factors. It is to be understood that the system may perform augmentation, rendering, displaying and/or challenging at endpoints associated with high augmentation factors (e.g. high visibility, non-peripheral frame/view etc.) or low augmentation factors (low-visibility, peripheral frame/view etc.) based on the factors associated with inferences.

The system is able to select, enable, render and/or update display labels, graphics and/or fields based on semantic analysis. In some examples, such display labels, graphics and fields are associated with semantic artifacts whether gated or/not. Further, the system is able to perform inference based on the information on the display controls and the information of any linked semantic fluxes.

In some examples the system populates and/or selects items in the graphical controls based on information from fluxes based on particular semantic identities. In an example, the semantic profiles allow the sharing of various levels of semantic identities based on the semantics of queries/challenges (e.g. BIRCH CLIMBER, 60 LIKE FUCHSIA HAT, 40 DISLIKE FUCHSIA HAT etc.) and thus the system is able to map those and/or select the relevant artifacts (e.g. match and/or map items in a combo-box UI control based on the semantic identities).

In further examples the system gates images, video frames, semantic waves and/or other artifacts based on semantic identity; alternatively, or in addition the system may replace and/or augment one semantic identity with another. Further, the system may mask (e.g. overlay semantic network models, blur, change color etc.) leadership features of particular semantic identities at various hierarchical levels (e.g. mask features related with eyes, skin etc.) and thus only the particular semantic identities are allowed to pass. Analogously the system may mask objects and/or tags in documents and/or files; as such, the system analyses the documents and/or files for semantic identities and mask the leadership features of identities. In addition, the system may transform the document in a rendering, image and/or frame where the semantic identities show and/or are tagged as masked as previously explained.

The system may gate the semantic identities and associated semantic artifacts at various levels of the semantic model hierarchy and/or semantic infrastructure. Such gating may be based on access control rules and/or semantic analysis.

Synonymy implies in finding synonym semantic artifacts based on factoring/weighting, comparison to thresholds, semantic routing, semantic orientation, semantic drifts and other semantic analysis.

In an example, the system uses synonymy to perform semantic clustering and semantic group inference.

In the same way antonymy implies in finding a semantic form for an artifact or collection of artifacts based on antonyms.

While those examples were described in more details is it understood that other semantic techniques may be used as described throughout this application and in the specialized literature.

In some situations, the transformation from another language to the main representation language may resemble the transformation to and/or from "baseband" in a signal processing system. Such transformation can use semantic analysis including semantic orientation and/or semantic drift.

Semantic processing units can be used to process semantic models.

Semantic processing units can comprise systems on a chip potentially using field programmable logic and configurable computing where the configuration of logical gates and processing cores are being configured based on semantic determinations, semantic routes, semantic views, view frames and/or semantic network model.

Semantic units and architectures are in general more safe and secure than a general processing unit due to build access control in the model. Semantic models may be configured by authenticating users via various authentication techniques including biometrics, password, mobile device codes, location proofing, time proofing and so on.

An important aspect of IOT systems is security; a semantic system handles information at a semantic level is much better positioned to asses, detect, isolate, defend and report system intrusions and anomalies.

The IOT systems have higher security and privacy concerns and hence controlled information sharing is required. A semantic gate is a way of controlling semantic information sharing and acts as a semantic privacy and dissemination controller based on semantic gating and/or access control rules for example.

Access control and filtering is used for controlling the interconnection to other systems and fluxes.

Security is better achieved if a system exposes a reduced number of attack vectors. Hence, a semantic system might require just a network communication and/or interface e.g. one port, service point, REST interface, callback routine or address etc. and all flux services being handled at the semantic level.

Semantic circuitry may consist in a plurality of electronic components wherein each component has at least one semantic input and output (e.g. semantic, semantic flux) wherein the input/s is/are transformed to outputs via semantic analysis. Further, the components are associated with semantic groups based on an inferred composite semantic and possibly, factors obtained at a stage in the semantic inference. The information is routed to semantic units and/or semantic groups based on semantic analysis and semantic routing and via semantic gating. Semantic circuitry may be semantic gate driven and thus it can be referred as a hardware semantic gate.

In some embodiments the system may use optical components such as polaritons for semantic circuitry.

The semantic flux between various components may be conveyed and controlled in a semantic manner in which the information is controlled based on semantic rules and model as explained in this application; this may be achieved via a semantic gate.

A semantic wave or signal may form as a waveform modulated at each element based on semantic analysis (e.g. composition, time management, access control, gating etc.). In one example, the semantic wave is modulated based on a semantic inferred at the element and/or semantic waves received from other sources/inputs. As such, the semantic wave represents combinatorial semantics which can be further combined while the semantic wave passes through elements. As mentioned above the semantic waves are routed based on semantic routing to other elements or groups of elements based on its semantic components. Semantic routing may be managed using semantic gating on fluxes. The semantic waves may be generated and disseminated in similar ways with semantic conditioning or other semantic techniques as explained in this application. The semantic flux and/or waves may use encryption and authentication at least two elements (e.g. source and destination).

The semantic gate may be controlled based on semantics artifacts. Such semantic artifacts may be validated and/or inferred in relation with the authenticity in a distributed semantic engine manager based on semantic groups. Distributed identification, validation, encoding/decoding and semantic wave generation/interpretation may be based on semantic groups or multiple semantic groups whether hierarchical or not. The semantic groups may comprise or define the distributed semantic engine and be used in semantic chaining and validation. In some examples, semantic artifacts are used to represent, encode and/or encrypt semantic trails. In one example semantic trails are associated with chains of custody. A chain may be represented or associated with a semantic network model with endpoints comprising or being associated with the semantic information and the links representing chain relationships. The semantic network of/and distributed ledger may use semantic analysis and inference for authentication, validation, encoding/decoding, encryption and chain improvement. In some examples semantic wave encoding/decoding is used to generate/interpret, encrypt/decrypt and validate semantic trails. Further, other non-semantic techniques may be used for encryption, encoding and other operations on semantic artifacts including semantic trails.

Further, a semantic flux source and/or semantic wave may issue or comprise at least one semantic in a semantic block chain and the authenticity is based on a semantic distributed ledger comprising the block and represented or associated with semantic artifacts (e.g. semantic groups of subjects, devices, blocks etc.).

In some examples a semantic group and/or semantic distributed ledger is formed to encode/decode a semantic wave; in some examples, no single member or subgroup of such semantic groups and/or ledgers comprises all the semantic artifacts to perform such operation, but the operation is performed collaboratively using any of the semantic analysis, conditioning and collaboration techniques explained in this application.

A semantic wave may also encode the source of the semantic modulation at each stage.

As mentioned, semantics are associated with factors, waveforms and/or patterns; composite semantics may be associated with a combination of those. They may be associated with waveforms modulated in a specific way (e.g. based on a pattern and/or amplitude and/or frequency and/or pulse and/or phase), potentially based on composition. Analogously with semantic artifacts, a semantic wave can be simple or composite; a semantic wave may comprise the semantic composition and potentially the identification of modules in the semantic route and/or trail modulated into the wave via any of those techniques or combination thereof.

Semantic waves may modulate the semantic rules in the waveform in order for a receiving processing unit to update its rules, routes, condition and/or infer the modulated semantics. The system performs processing between a semantic wave and a semantic based on semantic analysis including orientation and drift.

The system may use covariance, correlation and convolution of semantic waves coupled to semantic analysis. Further, the system performs semantic orientation and semantic drift between the semantics and semantic routes comprised and/or inferred from the waves.

Semantic waves and/or fluxes may combine based on semantic composition routing, semantic rules and semantic gating. They may combine based on semantic time management. The encoding of the trails and/or route in a waveform may be based on the marked or inferred semantics at the nodes. Semantic waves may be associated with semantic fluxes and routed through semantic routes. They may be encrypted and/or authenticated via distributed semantic inference where the distributed parties are semantically inferred and/or defined (e.g. based on semantic groups). Alternatively, or in addition, they may be authenticated via semantic trails and routes which may be encoded in the wave itself and the system checks the validity or authenticity of a wave and route based on semantic analysis including orientation. The orientation and drifts may be assessed based on the encoded data and the internal semantic model and rules. In some examples, if the semantic drift of semantic analysis and orientation is large the system may not authenticate the information.

The semantic artifacts are inferred by direct observations; hence a semantic model developed in a certain environment would have certain characteristics of that environment including a semantic model based on that environment. Additionally, semantic systems can observe semantic fluxes that come from various sources and can update their models based on these semantic fluxes and trust relationships that have been configured or established. A semantic system will develop based on these direct observations or observations of other semantic systems in the same or different environments. While the semantic systems with similar semantic coverage capabilities that develop in the same environment might have similar semantic model characteristics or signatures, semantic systems that develop in different environments might have different semantic signatures; sometimes those signatures might complement each other. However, in general, the core semantic inference rules to which the models have been configured will drive the development of semantic models.

Coherent semantic inference allows a system (and/or semantic group) to reduce superposition via semantic analysis including composition and/or semantic collapse.

Semantic signatures may be based on semantic groups. Coherent semantic groups allow coherent semantic inference based on their semantic signatures at least on group and/or leadership semantic artifacts.

Incoherent semantic groups may exhibit a continuous increase in superposition.

It is to be understood that the system may assign and adjust coherence/incoherence indicators, factors and/or goals; further such indicator and goal artifacts may be associated with a quantum, budget etc. Incoherent superposition may determine incoherent collapse (collapse due high superposition factors and/or decayed quanta/budgets).

The system may infer coherent and/or incoherent semantic artifacts (e.g. semantic groups, routes etc.) based on coherent and/or incoherent inferences and/or collapse. Such artifacts may be used later for semantic analysis in a way that the system will prefer coherent artifacts when the superposition is high and/or the budgets are low or, use more incoherent artifacts when the superposition is low and/or budgets are high.

High incoherency may be related for example with cyber-attacks, channel errors, jamming and other abnormal or challenging conditions.

In some examples, high incoherency and/or decayed budgets (e.g. potentially due to sensing jamming and/or other attacks) may collapse into safety drive routes, hierarchical and/or domain level inferences.

A system may learn based on ingestion, fusion and inputs from multiple semantic units running current, conflicting, trusted, non-trusted and/or opposed semantic models in the same or different environments. As such, the current model may incorporate other signatures while keeping the boundaries of semantic inference through access control rules and feedback from trusted sources (e.g. users, other trusted systems etc.). The nature of similarity or dissimilarity between models is provided by the semantic relationships of semantic rules, semantic orientation, semantic groups, semantic leaders, drive semantics, semantic routes, and other semantic artifacts between the two or more models. Sometimes the models may be grouped in semantic groups with one or more models or groups running on different semantic units. In an example, the model semantic groups may be determined by semantic attributes which specify the nature of semantic relationships between models and/or groups (e.g. antonym, synonym, not trusted, trusted etc.).

The system may consider the signature of the environment described by other sources when performing inference on direct sensing data. The signature of the environment described by those sources may be biased and the system uses semantic analysis based on the fusion techniques explained for semantic fluxes.

The system may infer leader flux/streams from where to refresh particular semantics, themes and/or categories. Sometimes the system uses plans where the system defines or determines a theme template based on semantic factors and the system uses those plans for semantic inference on flux/stream leadership. In an example, the system A specifies that it can trust a flux/stream from system B 0.5 on news and 0.9 on weather and as such when semantics are received on those themes the system B ponders (e.g. multiplying, summing, averaging, semantic factoring etc.) the composition factors with these trust factors. In cases when a semantic wave is transmitted through fluxes/streams the system may perform semantic analysis, gating, convolve and/or cross correlate the semantic waves for deriving resulting semantic waves.

Further, A may trust flux/streams C on news with 0.7 and as such composes the news from B and C while pondering, convolving and/or correlating it based on the trust, other semantic factors and semantic plans.

The pondering and correlation may be based on semantic distributions and spectrograms in intervals of time (e.g. semantic time). In an example, a spectrogram associated to semantics and/or themes, potentially in a semantic flux and/or wave, may be used.

Additionally, or in similar ways, more granular semantics may be refreshed once they expire or before they expire. The semantics may be refreshed individually or as part of a group, category or theme. Further semantics may be refreshed as part of a semantic route, goal semantic and/or factor-based inference and/or any other semantic inference.

In an example, the system reassesses the validity of a semantic view and/or view frame. As such, the system may not expire inferred semantics but instead ask for feedback on other fluxes/gates about the candidates to be expired. If the system is able to receive feedback and refresh the semantic (e.g. potentially within a budget), the system may not expire it; however, semantic factors may be affected, and further semantic inferences may be required. If the system is unable to receive feedback, it may elect to expire the semantic and perform further inferences based on the expiration including updates to semantic routes, views, view frames etc. Further, the system may use semantic factors and semantic budgets exposed through semantic gates for inference. Alternatively, or in addition to expiration the system may use semantic decaying.

The system may use semantic expiration to infer negations of the expired semantic. In an example, once a semantic of SCREEN TOUCHED decays and/or expire, potentially after an interval of time or semantic interval of time, the system may infer a semantic of SCREEN NOT TOUCHED until the SCREEN TOUCHED is inferred again. It is to be understood that the negation semantics may determine and/or be represented using high entanglement entropy and/or conjugate factors. In some examples, the negation, conjugates and/or entanglement may be represented using weights, factors and/or modulated signals; when added and/or composed, the weights, factors and/or modulated signals of the negation, conjugates and/or entanglement result in decayed values which may further trigger lower entanglement entropy and/or semantic collapse. It is to be understood that the weights and/or factors may be represented as values and/or as modulated signals.

The system may associate some intrinsic behaviors with semantic identities and/or semantic groups. In an example, for (A/THE) SCREEN the intrinsic behavior for particular endpoints, locations and/or profiles is NOT TOUCHED and hence in order to avoid unnecessary inferences the system may decay, block/gate, dispose and/or expire intrinsic behaviors artifacts (e.g. routes) in association with semantic views.

In some examples, the system requests from a stream/flux a semantic/theme with a particular factor and/or budget; if the factor is not satisfied then the target flux system may perform inference until the target is achieved potentially in the requested budget; it is to be understood that such inferences and assessments (e.g. projections) may be performed in a recursive manner in the semantic network. The flux may convey related semantics for a requested semantic theme.

If the initial semantic/theme factor is not achievable, potentially within a specified semantic budget, then the target flux system does not perform inference and may send a negative semantic for the request or, alternatively, the budget in which is realizable.

A semantic wave may comprise/modulate/encode a semantic route and/or trail. Semantic drifts between semantic routes and/or trails may be calculated at each of the elements based on local semantics (e.g. marked or inferred semantics) using any methods described before. Further routing of the wave and/or flux may be based on the drift. In some examples the drift is used as a semantic indexing factor and the routing and/or budgets based on this factor. In some examples the semantic indexing is applied on a semantic artifact or semantic drift tolerance, threshold or interval and the semantic indexing factor is calculated based on the semantic and/or route.

The system relies on increasing noise to detection ratio on various semantic fluxes and semantic waves based on semantic analysis.

Natural phenomena are interpreted via sensing and semantic interpretation.

While detecting a natural phenomenon the semantic system infers or augments a semantic artifact through various path in the model representation. For example, while a camera or heat sensor is detecting a bright light, might infer that is either a sun reflection or a light bulb ‘BRIGHT’, ‘SUN’, ‘BULB’; additional vision or heat sensing observations might show that the light is attached to a pole ‘POLE LIGHT’ which will actually infer that the light comes from a powered light bulb. In general, the semantic fusion takes into consideration the factors associated with the determinations, so if the confidence factor of ‘BULB ON’ is low because/and the ‘SUN BRIGHT’ is high, and/or because the determinations is taken during DAY semantic, and/or maybe because the ‘POLE LIGHT’ is low then the system infers that the ‘SUN BRIGHT’. In the case that the ‘POLE LIGHT’ factor is high because a camera has detected the actual bulb feature then the system might infer that ‘LIGHT BULB ON’. In general, semantic flux challenge, inference and additional fusion elements which might not have taken in considerations due to lower factors may be a good tie breaker in cases of uncertainty (e.g. high confusion factors, superposition, decayed budgets etc.); alternatively, or in addition the system may infer additional cues and/or change the orientation in rapport with the semantic space and/or observations (e.g. change the orientation of a device, model overlay, mapping and/or semantic route, use different semantic routes, anchors, conjugate and/or entangled semantics etc.). It is to be understood that the system may organize such composite semantics in semantic groups. In the example the system learns that the BULB provides LIGHT which can be ON or OFF (e.g. via BULB LIGHT, BULB LIGHT ON, BULB LIGHT OFF). Analogously, such inferences of light parameters may determine for example inferences of sensor attacks (e.g. infer blinding attack by a third party when there is a projected risk of attack and further infers SUDDEN BRIGHT LIGHT, LIGHT OBTURATION COVER VERY HIGH while there are no projected sources of blinding other than the potential attacker).

A core semantic artifact or rule has very high or absolute weights and/or factors which never change or decay.

Semantic systems developing under the same core semantic rules or core signature but in different environments will have highly compatible semantic signature complementary models.

Semantic analysis, semantic gating including semantic wave modulation may be based on state and/or metadata information from various protocols including network protocols (e.g. TCP/IP, 802.11, 5G NR, Bluetooth, TCP/IP, SMTP, HTTP/S, EPC), data exchange protocols etc.

The segmentation of computing platforms is important in obtaining secure computing systems. The segmentation includes network segmentation, data segmentation, function segmentation and others. More often, in general computing systems the segmentation functionality is less flexible, however a semantic system could better understand the needs of segmentation at various levels and provide more flexible and secure approaches.

As such a semantic system can create adaptive/ad-hoc networking subnets, can organize data dictionaries and access control (e.g. on data, processing etc.) in such a way that the optimal segmentation is achieved; further it can use processing segmentation based on semantic models, flux/gating and semantic analysis. It can also assign computing power based on the complexity and/or budget associated to a factor, goal, route, inference etc. As an example, if the semantic chain which needs to be analyzed for a semantic goal is large in comparison with a current semantic view then the semantic system may assign/route/requests resources (e.g. semantic units, semantic fluxes) based on that assessment and possibly on a semantic budget. Such scenarios and operations may take in consideration the potential collaborators advertised and/or published semantic capabilities including their semantic budgets. Alternatively, or in addition, it can request that a particular semantic inference be computed in a certain semantic budget and pass that information to a resource hypervisor and/or semantic unit that may allocate and/or semantic route to the necessary resources in order to process the data in the required time frame.

The semantic composition includes composing semantics and also gating and/or expiring semantics based on time, other semantics, factors, access control and others. As such, a semantic expiration mechanism may help with controlling parameters and/or the system resource utilization including memory, processing power, specific processing operations and others. For communication systems, the control may also include bandwidth and processing related to digital to analog conversion, analog to digital conversion, mixing, filtering, amplifying, up/down conversion, squaring, analog and/or digital signal processing and so forth.

As such the system may eliminate, prune, invalidate, inactivate or disable the semantics and related semantic artifacts that are linked to lower semantic factors and are not used in semantic routes and semantic composition.

The semantic expiration and inactivation/activation control helps with efficiency by releasing and optimizing resources; semantics related with system resources and/or the semantics related to computational requirements, operation, and/or processing might determine to choose a different semantic route over the other for an operation or task; if an inferred semantic or the semantic route is linked to semantic rules/gates (e.g. access control, semantic gate) then the system may guide the task or operation to a particular unit based on the rules/gates; such routing and gating may take in consideration the potential collaborators' advertised and/or published semantic capabilities including their semantic budgets; additionally, or alternately the system may control the allocation of resources based on similar principles. It is to be understood that the system may use a plurality of semantic routes and/or fluxes at any given time; the system may choose semantic routes and/or fluxes with various semantic spreads (e.g. based on shift, drift, diffusion, entanglement and/or entropy) in rapport to goals and/or projections. A semantic system may be configured as static or more dynamic. In a more dynamic environment, the system may adapt the semantic routes. In more static systems the semantic routes closely resemble semantic trails and as such the system has a more predictable outcome. The predictability of a dynamic system may be also achieved by controlling the factors of the semantics and semantic artifacts comprising semantic attributes, semantic groups, semantic routes, semantic budgets and so on. As explained before, the semantic system may use those semantic factors for composition, semantic route selection, routing and any other semantic analysis technique. Biases may be used to control the semantic factors of artifacts; in an example, the system is instructed to LIKE POTATOES and as such the system will bias (e.g. increase/decrease) the semantic factors for routes that comprise vegetable related artifacts because POTATOES and VEGETABLES are associated in a semantic group. In further examples, the system may be instructed to NOT TO LIKE VEGETABLES and as such the system detects superposition factors in regard to this instruction and LIKE POTATOES. Since a POTATO may be a part of a VEGETABLES semantic (independent) group then the system may factorize more a likeability indicator associated to the route comprising the group member. Alternatively, or in addition, the system may perform projected based inference on questions and/or routes such as (DO I) LIKE POTATOES (?), (DO I) NOT LIKE VEGETABLES (?) and further infer factors for such routes; further it may infer routes such as IN GENERAL DO NOT LIKE VEGETABLES BUT LIKE POTATOES. Alternatively, or in addition, the system may ask for additional feedback in order to resolve the superposition.

It is to be understood that while performing inferences the leadership semantic artifacts may be inferred and/or specified with particular factorizations.

The system uses inference based on profiles and/or semantic leadership in order to control the inference. In an example in a VACATION inferred context the system may setup leadership semantic artifacts (e.g. LEISURE, PLEASANT, NO RUSH, 50% LESS POTATOES, 80 EVERY MEAL WITH MEAT) potentially based on semantic profiles. It is to be understood that when the leadership semantic artifacts are not met during particular time management (e.g. at MEAL there is no MEAT available and/or is associated with a deny/denied/block/blocked semantic artifact) the system may pursue the current meal inference and create a semantic route, time management and/or goal of MEAT—NEXT MEAL; further, the system may consider denied/blocked semantics such as based on LACTOSE ALLERGIES which would block them from (projected) meal goals. Alternatively, or in addition, it may factorize the EVERY MEAL WITH MEAT artifact by possibly increasing and/or decreasing factors based on the outcome of the experience associated with MEAL WITH NO MEAT. In case that the time management rule is exclusive (e.g. 100% EVERY MEAL WITH MEAT) the system may not pursue the current MEAL drive inference, perform challenges and/or further inferences on alternate trails, routes and/or semantic groups. As it is observed, the semantic artifact EVERY MEAL WITH MEAT comprises the discriminator EVERY which may be used as a discrimination bias and/or indicator in current and/or further inferences based on the factorization inferred after such experiences.

Indications may comprise such discriminators for semantic times and/or for inferences and/or further activities. Further, the system determines projections and/or schedules based on such discriminators. In some examples, the system determines that EVERY/EACH (OTHER/N (th)) TIME THE RECYCLING BIN IS FULL, A VISIT FROM THE RECYCLER AGENT (NW LLC) MAKES DOES (MORE THAN) (X %) HAPPY. It is to be observed that the factorization of the (composed) discriminator (e.g. EVERY/EACH (OTHER/N (th) (TIME)) may determine the factorization of likeability (or X percentage of happiness in the example). Further, the likeability may be further composed with similar preconditions and/or routes. In the example, (composite) discriminator precondition of EVERY/EACH (100 (%) energy quanta)) 4 POSTS GROUP CAN CARRY THE RECYCLE BIN FROM STORAGE TO LOADING ENDPOINT is factorized based on the availability, inference, forming and/or feasibility of semantic groups, budgets and/or an (further) routes between endpoints; as such, the energy quanta may be indexed based on the projection of the groups (at endpoints) (e.g. the available budget for a group of 4 impaired/less towing capable posts may be indexed differently than a group of 4 more capable posts) and/or the (feasible/required) LOADING ENDPOINT.

A discriminator may be factorized in supply/demand and/or further associated budgets. In examples, the system infers and/or follows semantic goals and/or routes such as KEEP WARM IN WINTER; WET FEET, COLD, HIGHER COLD*1.2, FEET FREEZE; WINTER (85%) COLD, APPLY DIVIDER/COUNTERMEASURE TO COLD/WATER, KEEP FEET WARM/DRY (IN COLD/WINTER), WATERPROOF BOOTS (90%) LIKEABLE (BOND) (IN COLD/WINTER); HOT SUMMER, (82%) EVERY SECOND HOT SUMMER, LOTS OF SNOW IN THE WINTER; (90%) LOTS OF SNOW IN THE WINTER, WATERPROOF BOOTS DEMAND IS (99%) HIGH; THIS WINTER WATERPROOF BOOTS DEMAND IS (50%) HIGH; HIGH DEMAND IS 1000 TO 2000; PROJECT/ORDER 750 PAIRS OF WATERPROOF BOOTS FOR WINTER. As such, the system employs the factorization (82%) of the discriminator EVERY and further, of budgets (e.g. (90%) LOTS and 99% HIGH and/or (further) associated intervals). It is to be understood that the system may use additional and/or alternate semantic routes to further factorize discriminators and/or the supply/demand and/or associated budgets. It is to be observed that in the examples, the system may consider intrinsic goals such as to keep the feet in a likeable and/or intrinsic condition (e.g. not freezing) and thus, it may apply containers, dividers and/or countermeasures to block the diffusion of unlikeable/hazardous/entropic agents, restore likeability/affirmative-resonance and/or as per further likeability/resonance factorization; further, it may form and/or project composite and/or resonant semantic identities, groups, bonds and/or agents (e.g. waterproof boots, frozen feet in water etc.).

The system may employ automated inferred semantic identity and/or quantity ordering at/within semantic times.

In further examples, PADDED BOOTS (IN WINTER) ensure likeable conditions (in winter and/or) at (associated) endpoints by being a counter measure to (inferred/projected) (John's) cold and/or high entropic semantics to goals (e.g. keep warm etc.). It is to be observed that the likeable/not-likeable conditions may be inferred based on the (activities) interests, goals and/or capabilities of the artifacts localized at endpoints (or present/absent) (e.g. John likes to stay warm, John doesn't like cold etc.).

Further, the system may diffuse PADDED BOOTS based on similar projections (e.g. of likeability at endpoints during semantic times).

The system makes projections (including semantic times) at endpoints and/or semantic times.

The system may generate/flux advertisements for PADDED BOOTS on populations based on and/or to encourage likeable diffusion and/or access control.

A composed semantic (e.g. PADDED BOOTS WHEN JOHN ARRIVES) may be based on the localized conditions at an endpoint and/or (comprise) a semantic time. In examples, John possessing, acquiring and/or buying boots in winter may be likeable and/or unlikeable to John depending on a (factorized) leadership between a goal of John to be warm in winter and John's non-likeability (preference) of wearing ankle restraints and/or (further) projections. John's goals may be dark entangled with/from another semantic view.

It is to be observed that inferences may comprise and/or be based on detected presence and/or absence at endpoints and/or (further) (associated) (inferred) (indicated) semantic times.

We explained that the system may assess and/or project the resonance and/or likeability at endpoints (associated with particular goals and/or semantic groups). In some examples, the particular semantic (attributes) which may be non-affirmatively resonant and/or less likeable may not be diffused. In some examples, the system doesn't diffuse "non-waterproof" boots at an endpoint associated with RAIN THROUGH SPRING (AND/OR IN THE NEXT 90 DAYS) while allowing (high entropic) (measures/countermeasures) "waterproof boots". Further, it may allow non-waterproof boots if it projects that they may have a capability to be applied a measure/counter-measure (e.g. be waterproofed) (at the destination endpoint/owner) as per goals.

It is to be observed that a measure is associated with ensuring the affirmativeness of a goal while a countermeasure is to reduce the entropy and/or reduce the non-affirmativeness of a condition and/or DO NOT goal.

Between two subsequent inferred (similar) target semantics and/or goals HIGH SALES (OF (WARTERPROOF) BOOTS) (at endpoints and/or semantic times—e.g. LATE WINTER, JOHN MISSING) (at an endpoint) the system builds, stores and/or diffuses (through) semantic trails/routes; further, it factorizes the semantics inferred within those trails/routes and/or between the (inferred) target semantics and/or semantic times. If a semantic doesn't occur between such two subsequent (similar) target semantics and/or semantic times the system may decay its (frequency) factor (s) and/or not consider it as a leader/driver in determining, causing and/or influencing the target (semantics).

The system may consider the semantics in the trails inferred between (two) high entropic semantics (e.g. SHOW<->NO-SHOW; CLOUDY<->SUNNY etc.) of the target semantics/goals (e.g. MEET JANE, WEAR SHORTS etc.) to determine the leader causal/influencing semantics (of the target semantics). The leader causal/influencing semantics should (frequently) occur for one (e.g. for SHOW) and not (frequently) occur in the high entropic trails/routes (e.g. of NO-SHOW) within such semantics.

In examples, the system may determine that Jane SHOWS UP as BREAK, DELOREAN PRESENT, BEETLE PRESENT and NO_SHOW as BREAK, DELOREAN PRESENT, BEETLE MISSING. As such, the system may not consider and/or affirmatively factorize as leadership indicators BREAK and/or DELOREAN PRESENT because they occur in both the high entropic inferences. However, the system may consider and/or affirmatively factorize the BEETLE PRESENT/MISSING as a (potential) leadership indicator (for determining SHOW/NO SHOW and/or further MEET JANE) as it has/matches the high entropy of the high entropic semantics (SHOW/NO SHOW). Further, the system may affirmatively/non-affirmatively factorize indicators for high entropic (goal/semantic) projections (e.g. non-affirmatively/affirmatively factorizes BEETLE PRESENT/MISSING in case that the goal is to AVOID JANE, affirmatively/non-affirmatively factorizes BEETLE PRESENT/MISSING in case that the goal is to MEET JANE etc.).

The system may determine affirmative/non-affirmative resonance between the leadership indicators and/or further artifacts. In the example, the system determines that the leadership indicator BEETLE PRESENT/MISSING (high) entropy matches the (high) entropy of target (goal/presence/absence) SHOW/NO-SHOW, MEET/NOT-MEET JANE and thus, it may determine low entropic and/or spin resonance (within a goal's semantic view) (with/at endpoints and/or semantic times) between and/or based on BEETLE and JANE (presence/absence and/or goals). Similarly, the system determines high entropic and/or spin resonance (with/at endpoints and/or semantic times) when the leadership indicator entropy is highly entropic and/or opposite to the target presence/absence and/or goals.

It is to be observed that the resonance between the BEETLE and JANE may be determined as affirmative/non-affirmative based on the goals. Further, the entropy of the resonance may be low (e.g. when the entropy has the same orientation and/or spin—PRESENT->MISSING, SHOW->NO SHOW, MISSING->PRESENT, NO SHOW->SHOW) or high (e.g. when the entropy has opposite orientation and/or spin PRESENT->MISSING, SHOW<-NO SHOW, MISSING->PRESENT, NO SHOW<-SHOW). In some examples, a spin and/or group entanglement is associated with a quantum spin and/or further quantum entanglement.

The system may identify gain/loss analysis based on similar techniques. As such, the system determines that it may gain/loss a capability, budget, bond and/or semantic identity.

The system may consider the (similarity of) intervals, semantic times and/or endpoints based on semantic drift and/or semantic hierarchies.

For a population/group analysis and/or identification the system may determine a (/an assigned) semantic and its high entropic semantic and identify leadership/driving semantics which are in the (recorded) semantic trails/routes of/for realization/inference of one and not in other; alternatively, or in addition, the system identifies a driving semantic based on high frequency (of occurrence) in (the realization/inference of) one and/or low frequency and/or absence in (the realization/inference of) the other (high entropic).

Semantic groups of semantic profiles and/or composite semantic profiles are inferred and/or formed by the system. The artifacts stored in profiles (e.g. rules, routes, trails etc.) may be composed, selected, weighted and/or factorized based on semantic analysis and/or leadership (e.g. of drive, route/trail, group etc.). The system may need to perform superposition and/or confusion reduction (e.g. due to high superposition and/or confusion factors in inferences using the fused profiles) and thus, it may reassess the fusion of such profiles.

The hardware may be optimized for semantic inference. As such the signals/inputs/data/information are split in various streams (for example based on semantic gating and send and/or routed to various processing units. As such the system may process inputs on more fluxes/streams and/or chains based on the semantic model, semantic rules and semantic routes. Along the analysis chain the system executes semantic inference based on the semantic model and rules at each unit; the rules and model may be learned and updated during semantic inference or at other semantic times. The learning and updating may be controlled through semantic gating.

The semantic processing units may synchronize based on semantic time management semantic signaling inference (e.g. signal, waveform, values, patterns, pulses) and/or semantic waves.

The system may align waves/signals from various sources possible based on cross correlation, covariance, peak-pattern analysis, semantic analysis, determine and learn semantic time management rules. Conversely, the system may use semantic time management to align two signals and use the techniques specified before to perform semantic learning (e.g. learn semantic routes and rules based on conditioning and deconditioning). The signal alignment may be determined based on semantic routes wherein one or more semantic routes are correlated with the signals and/or between them; further the alignment may be based on semantic conditioning. The system uses semantic drift and orientation to learn semantic artifacts and also uses semantic artifacts for signal analysis and pattern matching.

In a similar way with signal alignment and conditioning, trajectories of artifacts may be aligned, and semantic rules learned. A trajectory may be partially segmented (e.g. based on gating, endpoints, routes, links, sub-models, sub-trajectories and/or semantic groups) and further rules and semantic routes learned. In an example, two trajectories are synchronized based on leader semantics and associated semantic artifacts and/or factors associated with at least one common/similar drive semantic (e.g. composite semantic) in the routes and/or oriented links tracing the trajectories. It is to be understood that the factor may be positive or negative in value.

The system may infer through semantic analysis indicators such as a rate factor and/or indicator of growth/decrease/decaying of factors.

In further examples, the trajectory inference and comparison may be based on semantic analysis or any semantic artifacts associated with the trajectory. Semantics associated with trajectory endpoints, links, routes, rules can be analyzed and composed in any way. Further, the trajectory analysis, semantic analysis and composition can occur and be associated with artifacts at any hierarchy level of the semantic model.

Trajectories and/or orientations may be analyzed based on comparing the semantic routes determined by the semantics associated with elements mapped to the semantic network model. Further, two trajectories and/or orientations may be compared based on the semantics associated with links mapped between endpoints from the first trajectory and/or orientation to endpoints of the second trajectory and/or orientation. The orientation may be based on semantic composition on particular trajectories. Alternatively, or in addition, the orientation is associated with a drive semantic artifact. The mapping of links to trajectory endpoints may be also based on such techniques and/or correlated on time management; as such, the links may represent a semantic correlation in time between trajectories and the system perform semantic analysis on the resulted semantic network model to determine the semantic space-time correlation between trajectories.

In further examples the trajectories may be analyzed based on conditioning/deconditioning of signals based on their waveform mapping to semantic network models.

Sometimes the system creates transient analysis models, views and view frames for semantic analysis including route and trajectory comparison.

Semantic abstraction and generalization may work until a certain semantic level is reached (e.g. based on a semantic route, whether a number of semantics in a route where used, or based on semantic factors and/or thresholds, potentially accumulated during inference) until a semantic budget is consumed or until a semantic mission or goal is achieved, potentially within a semantic budget. The system may plan for a semantic budget (e.g. time, cost), and perform the semantic estimation based on generalization on that budget. The generalization/abstraction may be related with multi-domain and/or hierarchical knowledge transfer.

As explained throughout application the semantic models are hierarchical and/or composable and may comprise semantic relationships at any level for any artifacts whether semantic, endpoints, links or any others.

The semantic network models can be composed and/or coupled. In an example they may be coupled for achieving goals and/or inferences. The composition may be achieved through semantic gating on any of the links and/or endpoints. Further, the composition and/or coupling may be achieved at any level of hierarchies. In an example, the semantic network model A layer GAME is coupled with the semantic network model B layer GAME. In some examples the layer A-GAME has a different hierarchy level than level GAME of B. In other examples the layers are coupled and/or routed on a semantic factor basis of the hierarchy levels (e.g. 1.1, 2.0, LOW, HIGH, 0.4 GAME, 0.9 HAZARD etc.); the hierarchy levels are coupled based on the assigned semantic factors of semantic artifacts associated with the levels and the system couples the models based on a semantic factor interval and/or threshold; alternatively, or in addition, the system uses group leadership for model coupling. In a similar way, the system may couple any other semantic artifacts used in inference (e.g. endpoints, links, routes, view frames, views, sub-models, hierarchies and any combination thereof). Further, the system uses such couplings and mappings to enhance the mapped coverage (e.g. in a frame, image, semantic vision model, microscopy, spectroscopy etc.).

Composable models allow the linking, connection and/or composition of semantic artifacts (e.g. endpoints) based on semantic analysis.

In some examples, composition of models encompasses overlaying models based on location and/or other semantic artifacts (e.g. semantics, semantics at endpoints, links, orientation, trajectory etc.). Overlaying and/or composition may be based on trajectory alignments based on semantic trails and/or routes.

In addition, the system may apply masks based on semantic gating before composing models and semantic artifacts.

In other examples the model coupling is based on projected and what-if type of inference for achieving particular goals. In such examples the coupling, linking and composition of semantics artifacts (e.g. endpoints, artifacts at a particular level etc.) is based on semantic goal inference on the composable artifacts.

In further examples composition of models may entail performing or issuing commands to the elements mapped to the composable or composite model.

A certain semantic unit might be assigned a budget to perform semantic analysis on a semantic until a semantic factor (e.g. weight) achieves a level (e.g. a threshold); then the semantic or maybe other semantics inferred based on thresholding may be conveyed further, possible by a semantic gate. In similar ways the system may assess goal achievement or inference. The semantic may be or not conveyed based on the inferred factor. Parallel computation might be achieved through these techniques and the results aggregated based on semantic composition and analysis. In an example, if a semantic/computing unit doesn't respond in a particular time and/or budget the system continues with the semantic inference which doesn't include the unit's potential response or semantic. Alternatively, if the processing is based on a budget the unit may send a partial inference or a no-inference response after the budget is exhausted. Sometimes the system may stop the semantic inference and/or update the semantic model and rules at a unit based on a semantic feedback from the other units, potentially organized as a semantic group; alternatively, the system doesn't stop the semantic inference but waits until the semantic inference is completed (or partially completed) and/or routes the semantic artifacts to the appropriate units based on the semantic rules and routes. Alternatively, or in addition, entangled semantic artifacts provide complementary and or additional inference routes. The routing may include or consider any left non-consumed semantic budgets and/or overspent budget (e.g. borrows budgets from another entity in a semantic group it belongs). As such, the routing and processing is adaptive based on semantic budgets.

In other examples the system issues challenges to semantic groups for semantic inference on a budget and performs semantic and routing inference within the semantic groups based on semantic analysis, potentially when the budget lapses.

The system may challenge a first entity, collaborator and/or group about a second entity, collaborator and/or group and vice-versa. As such, the system may infer factors and/or budgets about the first and/or the second collaborator and associated semantic artifacts. In some examples the system may infer that at least the first and/or second collaborator is compromised and thus increases the risk factors of such entity potentially in rapport with inferred compromised indicators and/or artifacts.

The system uses any of the semantic routing techniques described throughout the application to perform semantic flux/gate connection. Thus, the system may be highly predictive, adaptive, dynamic, static and/or semantic biased.

Multiple waveforms possibly sampled/derived/coded/chirped from a single signal can be processed using semantic techniques.

Semantic streams or flux are routed to different units and chains; analysis of semantic budget trails may determine new semantic budgets and new semantic budget routes.

The semantic time management, factorization, budgeting and gating allow the inference of the system resources and is critical for semantic route selection.

Semantics may be associated to artifacts in relation to channel estimation, band/width, frequency selection, modulation, signal waveforms generation and processing.

These semantics may be used for resource and/or budget estimators and feed into the semantic chain and/or the semantic model.

As explained above, semantic time management plays a critical role in a system's capacity to adapt and perform in a reliable manner. As such, semantic connect technologies and semantic fusion ensure timely semantic inference for a semantic connected system.

Because semantic inference may be goal and budget dependent it is therefore important to be able to estimate, measure and/or control the inference in a distributed environment where multiple pieces are glued together through semantic means.

In order to select a proper semantic route, estimation and evaluation may be required. The estimation and evaluation may be based on or result in semantic goals and/or semantic budgets.

In collaborative semantic systems with quality of service the resource allocation for semantic inference is prioritized based on the indicators and/or required/allowed budget. The quality of service can be specified based on indicators and/or semantic budgets. Semantic budgets may be based on time management rules and may be represented, associated or comprise semantic factors.

The semantic route can be evaluated based on semantic analysis including semantic gating with each system performing management of resources or, in the case of distributed inference, routing to the optimal collaborative systems based on semantics, semantic budgets and other semantic artifacts.

As an example, when a sub-system receives a request for inference with a specific budget, the sub-system executes an evaluation of the goal (e.g. based on what-if and/or projected semantic routing and analysis) for meeting the inference (e.g. GIVE ME ALL YELLOW CARS SPEEDING UNTIL NOON or SHOW ME IN THE NEXT 2 MINUTES THE TEN BEST PLACES TO CONCEAL A YELLOW CAR WITHIN TEN MILES OR TEN MINUTES FROM A/THE COFFEE SHOP). As such, the system may be provided with a goal budget (e.g. best places to conceal—IN/FOR THE NEXT TWO MINUTES) and so the system may project based on the specified and/or inferred budgets; further the goal leadership being CONCEAL with a semantic identity of YELLOW CAR the system may look/project for artifacts which obscure and/or mask the semantic identity of YELLOW CAR at and/or within (specified) (semantic) times. In even further examples, the goal leadership may be hidden and or implicit based on semantic identity (e.g. BEST YELLOW CARS) and the system infers the goal leadership as of being related with factors associated with YELLOW CARs wherein the factors are based on semantic inference and the semantic groups and/or routes associated with YELLOW, CAR, YELLOW CAR. In further examples, the system demands and/or ask information in relation with semantic identities, endpoints and/or areas (e.g. GIVE ME ALL YELLOW CARS WITHIN PARKING LOT A IN THE LAST HOUR) and further the system analyses, challenges and/or interrogates the artifacts (e.g. fluxes, sensors) assigned to such areas; it is to be understood that such challenges and/or interrogations might trigger semantic inferences based on the challenging semantic artifacts and/or identities (e.g. such as YELLOW CAR, PARKING LOT A etc.). Further, for fast searching the system identifies YELLOW as a leadership semantic and as such parses the frames for the YELLOW color. Further, the system parses the frames for CAR semantic and creates the set of frames having both semantics and further assessing whether the color YELLOW corresponds to CAR based on semantic analysis. The system uses semantic analysis to restrict the artifacts associated with time budgets (e.g. frames WITHIN THE LAST HOUR), semantic identities and/or fluxes (e.g. associated with PARKING and/or more specifically PARKING LOT A). Analogously, the system may require semantic fluxes to GIVE ME ALL YELLOW CARS WITHIN PARKING LOT A IN THE NEXT HOUR OR UNTIL JOHN'S DELOREAN APPEARS and as such the creates a time management and access control rule which would allow the gate publishing of YELLOW CAR semantic identity and/or associated artifacts (e.g. license plate, semantic scene associated frame, (mapped) semantic artifacts etc.); it is to be understood that the time management and access control rules are based on semantic identities such as JOHN'S DELOREAN and further assessment of the NEXT HOUR semantic in associated with the composite request (e.g. using an internal clock inference; and/or using a semantic flux connected clock (e.g. conveying a capability, factorized and/or inferred as a (trusted) (affirmative) leader (at an endpoint) that it can MEASURE HOURS, MINS, SECS) which will be requested for a NEXT HOUR semantic in rapport with the composite request, wherein the clock capabilities may be determined by sensing and/or semantic analysis).

It is to be observed that the system may select endpoints based on a projection where a/the YELLOW CAR may go, reach and/or be located in TEN MINUTES relatively with an anchor (e.g. a/the COFFEE SHOP).

The system may apply offensive and/or defensive behaviors with the YELLOW CAR and/or containerized/encompassing/carried/supported objects (e.g. passengers, patients, contents etc.) to project encompassing location endpoints.

In some examples, the system infers that the driver of the YELLOW CAR may be more offensive in movement (or movement semantics/themes) due to (carried/possessed) items and/or further inferred emergencies, shoplifting etc. Alternatively, or in addition, the system may determine that the YELLOW CAR and/or containerized/carried/supported objects (e.g. such as passengers etc.) may exhibit more defensive behaviors for particular semantics/themes.

In further examples, the system infers that despite the driver of the YELLOW CAR (as a contained object and/or (first) agent) is in offensive mode, the car (as a container/carrier/support, (second) agent and/or a semantic group comprising the car, driver, passenger and/or other artifacts) may behave and/or move more defensively due to the inability/unwillingness/setup/configuration of the driver and/or car to pursue driving offensiveness (e.g. due to driver's and/or car's capabilities (setup/configuration) and/or further semantic groups composable capabilities (setup/configuration)). It is to be observed that the car capabilities may refer and/or compose in a hierarchical manner from car's general capabilities to more particular capabilities associated with a particular car (of the make, type, characteristics etc.). Further, the car capabilities and/or inferred semantics may compose with driver's capabilities and/or inferred semantics to determine composite capabilities and/or semantics for the container (e.g. car) and/or associated semantic group and/or (composed) semantic identity.

Offensive/defensive inferences determine projections associated with traveled paths and/or endpoints and/or an affirmative/non-affirmative entangled party. Affirmative/non-affirmative factorizations of entangled parties may be based on semantic times and/or be associated with friend/foe inferences.

Further, we mentioned that the system may implement fight and/or flight inferences. As such, when the factorization is affirmative for flight and/or non-affirmative for fight the system non-affirmatively factorizes (e.g. with a fight and/or flight factor or similar) projected travel paths and/or endpoints accessible, diffusible and/or traveled by the other/entangled (non-affirmative) party/artifact; thus, the system is defensive in relation to an entanglement and/or grouping with the other party/artifact on such paths and/or endpoints (at semantic times).

Analogously, by HENT, the system affirmatively factorizes (e.g. with a fight and/or flight factor or similar) travel paths and/or endpoints hardly/non-accessible, hardly/non-diffusible and/or hardly/non-traveled by the other/entangled (non-affirmative) party; thus, the system is offensive in relation to its entanglement and/or grouping with the other party on such paths and/or endpoints (at semantic times). Similarly, by HENT with affirmative flight and/or non-affirmative fight, the system may project non-affirmative flight and/or affirmative fight.

It is to be observed that if the system is in superposition between flight and/or fight, the paths and/or endpoints may be also in superposition in relation with the flight and/or fight indicator and thus, the system may discard its factor in further inferences.

In some examples, there is one indicator to represent (each and/or both) fight and/or flight. Entropic (composed) indicators (e.g. such as fight and/or flight) and/or semantic groups are normalized and/or deduced one from another in the same semantic view. In different semantic views they may be factorized accordingly based on the semantic views and/or fluxes.

The system may infer that the driver and/or car capabilities may be particularly factorized (e.g. reflecting impairment and/or lack thereof) and thus, the composed semantic group and/or agent/carrier/support (e.g. a particular semantic identity (e.g. John's YELLOW CAR, THE EMERGENCY YELLOW CAR etc.)) may be assigned composed factorized capabilities (e.g. reflecting the impairment and/or lack thereof).

In further examples, the system determines and/or projects budgets for capabilities (e.g. the car has gas and/or move/drive/range capability for 5 miles and/or 5 mins at 60 mph; and/or the driver (steering and/or (further) driving capability) is impaired and/or will pass/phase out in 3 minutes etc.) and factorizes those in compositions and/or semantic groups.

As explained, in the example, the entities whether containing/carrier/supported (e.g. car, post, devices) and/or contained/carried/supported (e.g. passengers, posts, devices etc.) may be associated with (composable) (flow) agents.

The system may be configured, store, infer and/or apply factorizations between contained, carried and/or supported associated indicators. Alternatively, these may be used interchangeably. Alternatively, or in addition, factorization rules reflect the fact that (at semantic times) those indicators may be used interchangeably.

Similarly, the system may be configured, store, infer and/or apply factorizations between capabilities and/or (contained) activities. Alternatively, or in addition, factorization rules reflect the fact that (at semantic times) those capabilities and/or (contained) activities may be used/performed interchangeably.

In other examples, the system learns the goal based on further explanation—e.g. GIVE ME ALL YELLOW CARS BECAUSE I AM LOOKING FOR THE FANCIEST ONE or GIVE ME THE FANCIEST YELLOW CARS—and as such the system may gate, sort, display, augment all the YELLOW CARS artifacts based on the leadership goal of BEING FANCY for more general profiles or BEING FANCY for <particular semantic profiles>. In the previous example SPEEDING might be relative to location mapping and/or semantic profiles; thus, the system and/or observer infers speeding based on semantic analysis based on such circumstances.

The system may parse video/audio formats and/or frames and perform semantic augmentation. The system analyzes the video/frame/sound content, captions and/or descriptions associated with such videos/frames/sound and performs semantic analysis and gating thus, rendering, augmenting and/or providing users with the required frames, video/audio snippets, semantic artifacts and/or semantic groups thereof (whether group dependent and/or group independent).

The streaming of video/audio may be based on a variety of transport formats/containers, protocols, compressions, encryptions and/or codecs. In some examples those include, but are not limited to, MP4, WebM, MPEG-TS, MPEG-DASH, SRT (Secure Reliable Transport), HLS (HTTP Live Streaming), RTMP (Real-Time Messaging Protocol), MSS (Microsoft Smooth Streaming), WebRTC (Web Real-Time Communication), VC-1, VP8-VP10, AV1, HEVC, H.264/265/26x, wavelet, MPEG, Opus, Theora, Vorbis, AAC, ALS, SLS, TTSI, MP3, ALAC etc.

The system processes incoming streamed/fluxed signals, packets, data and/or files and performs augmentation. In some examples, the system receives signals/packets/data/files with a first format/compression/codec/encryption/protocol and converts it to a second format/compression/codec/encryption/protocol for storage, generation, transmission and/or augmentation. Further, the system may store incoming and/or converted data/frames/snippets in a cache for/during conversion and/or for applying/filtering (augmentation) artifacts (e.g. advertisings, objects, frames, sounds, texts etc.). The cache contents and/or particular cached artifacts may be invalidated and/or cleared based on semantic times.

In further examples the system is challenged by a user with GIVE ME ALL INSTANCES WHERE JOHN DELOREAN DRIVES A DELOREAN and/or GIVE ME ALL INSTANCES WHEN JOHN DELOREAN DRIVES HIS CAR and the system analyzes the videos/sound/frames content and artifacts based on the semantic group, composite semantics and time management rules associated with JOHN DELOREAN presence (e.g. as detected by inferring semantic identification, artifacts and/or routes associated with JOHN DELOREAN, DRIVES, DELOREAN and further JOHN DELOREAN DRIVES (JOHN'S DELOREAN) etc. Further such snippets may contain only the frames and/or artifacts associated with the goal and/or activity (e.g. from where and/or when the composite semantic is inferred to where and/or when expires potentially based on inferred and/or stored time management rules, semantic groups of activity associated artifacts etc.). When such snippets are presented via semantic augmentation they may be extracted from the original media artifact (e.g. video, sound format/file) and presented with inferred captions associated with further semantic augmentation. Alternatively, or in addition, they may be presented without being extracted from the original media artifact; in some examples, the identified snippets are marked and/or played in the context of the original media artifact. It is to be understood that further challenges from users and/or fluxes, time management rules, indexing, diffusion and/or further semantic analysis may be used to overlay, gate, adjust, restrict, crop, expand, play, stop, mute, unmute, expire etc. the snippets and/or associated semantic artifacts.

The system may restrict and/or mute (embedded) advertisings and/or artifacts which determine high confusion, incoherency, low resonance and/or are not allowed (e.g. for particular users, groups, profile etc.).

The system overlays semantic augmentation with briefs related to projections and/or goals (of user, context, situations, objects, John, semantic identities, groups etc.) and/or further augmentation based on semantic analysis; the semantic augmentation may proceed in some examples based on a challenges from the user (e.g. WHY IS JOHN SO SUCCESSFUL, WHAT ARE THE BEST PARTS OF A DELOREAN, HOW JOHN DRIVES A DELOREAN, WHEN AND WHERE I CAN MEET JOHN etc.) and the system uses the semantic leaderships of semantics of such challenges to perform semantic augmentation. While the system may infer a bias, drive and/or leadership from the user based on challenges (e.g. the user thinks that JOHN IS VERY SUCCESSFULL). Alternatively, and/or in addition, it may perform augmentation based on semantic analysis and/or profiles exhibiting various degrees of drift, divergence, (entanglement) entropy and/or spread from such biases, drives and/or leaderships. In an example, the system infers a semantic artifact exhibiting high drift and/or entropy between (inference on) various semantic profiles and as such the system performs semantic augmentation (e.g. by displaying, rendering etc.) of the semantic profiles and the associated spread artifacts. Thus, the augmentation may present various views, layouts and/or overlays.

The system may segment, diffuse and/or display (with particular rendering semantics) the inferred semantic identities and/or semantic groups. Alternatively, or in addition, it may map and/or overlay semantic artifacts on such semantic identities and/or semantic groups; semantic profiles may be used for such inferences thus personalizing experiences based on viewer/s semantic identities. Thus, it is possible to present semantic augmentation to the user during the semantic time using various semantic views based on various semantic profiles. It is to be understood that the system may switch between semantic views based on the inferred visualizing semantic identity and/or semantic view. In some examples, multiple views are displayed and overlaid on top of each other; further, the system may consider and/or use semantic augmentation in regard to entropy, coherency/incoherency and/or confusion factors of such composite semantic views and display/render them based on further inferences and/or intervals related with such factors. In general, such techniques and/or semantic overlaying may be used for example to suggest and/or analyze team plays in sports games (e.g. hockey, football, soccer, basketball, volleyball etc.), analyze (medical) imaging, maps, routes, object placing etc. Further, such displaying and/or overlaying techniques may be access controlled and thus only allowed artifacts are rendered (e.g. a team member may have access to all artifacts while a TV show host may have access only to particular artifacts, levels, views, shapes and/or granularity).

In further examples the system may be challenged on showing (e.g. SHOW) instead of giving (e.g. GIVE); thus the system may use a different augmentation method based on circumstances (e.g. SHOW entails rendering on a display while GIVE may entail other modalities such as sound, tactile, wearable feedback, vibration etc.). It is to be understood that the challenge may specify a semantic identity (e.g. ME) and as such system may use further associated semantic identity semantic profiles for augmentation; while specific semantic identities may be provided, alternatively, or in addition, the system may infer semantic identities based on circumstances and/or semantic analysis.

Once inferred, the semantic identities may be beamed to the objects, entities and/or artifacts to which they belong. In an example, S2P2 infers based on sensing a semantic identity of "chair by the fireplace" (and/or "door close to John") and thus, it may beam (e.g. by directional transmissions and/or transmission signal parameters adjustment such as explained in US patent application US20140375431) and/or (further) semantic routes within a semantic mesh of participants (e.g. robotic posts/devices etc.) the semantic identity to an attached microcomputer, tag and/or antenna attached to the particular semantically identified chair (and/or door). Further, the semantic identities may be beamed to other collaborators; in addition, the informed collaborators may further correlate the fluxed semantic identity with their own inferred semantic identity (e.g. inferred based on local sensing, received through other flux, received from the semantic identified object etc.).

The system may use the gating and/or publishing capabilities to infer on which devices and/or semantic groups to allow and/or perform semantic augmentation; further, such devices and/or semantic groups may be associated with at least one user, profile and/or semantic group thereof. Semantic identities and/or semantic groups of devices may be associated with access control rules which allow the augmentation to be performed on such devices (and/or semantic groups thereof) if the access control rule, publishing, capabilities and/or gating allows. In some examples, in particular circumstances as inferred during semantic analysis, a device and/or semantic group may be associated with allowing all and/or particular (e.g. based on publishing, budgets, factors, enablement, diffusion etc.) semantic augmentation capabilities while others may have the semantic augmentation (and/or content) diffused, blocked and/or gated possibly on particular semantic artifacts. Further, the system may provide gating and/or access control based on inference on content (e.g. paragraphs, documents, images, signals, waves etc.). Further content metadata may be used by semantic inference.

The system communicatively couples at least two artifacts such as posts, devices, components, modules, units, fluxes, UI controls, video renderers and/or further artifacts based on semantic inference and/or routing. In some examples, such coupling is achieved by establishing ad-hoc networking, flux and/or stream connections. In further examples, the system establishes ad-hoc networking/flux/stream connections and/or routing based on location, endpoint and/or inference that particular artifacts are associated with the same user, profile and/or semantic group.

Further, the system may perform implicit leadership and/or routes based on semantic profiles. In an example, SHOW CARS may determine an implicit route and/or leadership for YELLOW CARS based on a semantic profile of the challenger and/or the challenged.

During challenges and/or semantic analysis the system may perform semantic gating based on location, endpoint, semantics at locations and/or endpoints.

Semantic gating may be based on semantic analysis and/or semantic profiles. In some examples the system infers that a CHIEF SUPERVISOR ON DUTY may visualize and/or have access to YELLOW CARS associated artifacts at a location/endpoint associated with moderately elevated risk while SUPERVISOR OFF DUTY may visualize/access such YELLOW CARS only in high risk or emergency situations (e.g. high risk factors) or none at all (e.g. because OFF DUTY is negative and/or have high entropy in rapport to ON DUTY).

Based on the evaluation the system may route/re-route the request, may gate the request based on the semantic model and route the parts to different sub-systems. In the case of resource-oriented systems, the sub-system may allocate the necessary resources for performing the semantic inference within the budget. If the sub-system implements semantic based virtualization (e.g. dynamically allocate resources on a virtualization platform based on semantic inference), then the sub-system may use the evaluation to allocate and/or spawn new virtual resources for the specific semantic artifacts.

The system may use semantic inference to infer semantics for locations and further perform location-based searching. In some examples the system keeps up to date published and/or gated semantics associated endpoints (e.g. via semantic analysis including time management). The system may infer diffusiveness factors which may be used to index and/or diffuse semantic artifacts in the semantic field and space. In some examples of diffusive semantics artifacts, the system assigns and/or factorizes HAZARDOUS semantics to endpoints based on diffusive (gating) capabilities (of the oriented links between endpoints).

The semantic diffusiveness may be based on diffusion (e.g. atomic, electronic, chemical, molecular, photon, plasma, surface etc.), quantum tunneling and/or gating in the semantic network model and mapped artifacts (e.g. sensors, devices, components, gratings, meshes and/or crystals). In further examples the diffusiveness may be coupled with semantic shaping.

Analogously and/or coupled with semantic diffusiveness the system may perform propagation analysis (e.g. electromagnetic). The propagation analysis may take in consideration semantic shapes of objects and/or further semantic artifacts as mapped and/or detected to semantic space.

In some examples, the system challenges the system (e.g. display, I/O, semantic fluxes, semantic unit, memory, computer etc.) with GIVE ME IN THE NEXT 10 MINS THE HAZARDOUS LOCATIONS THAT I CAN BEAR and thus based on semantic diffusive analysis and further semantic analysis of challenger circumstances and locations performs semantic augmentation; it is to be understood that sub-goals such as BEAR, TOLERATE, ENDURE, ACCEPT, ALLOW may be based on an accepted reward to risk factor in rapport with the composite goal. Analogously, challenges such as GIVE ME THE PATH THAT I CAN LIKE results in sub-goals with higher reward to risk factors. It is to be understood that in some examples the reward may be and/or comprise a risk indicator and thus the reward to risk factor would be elevated and/or maxed out (e.g. 100%, 0.5V, 3A, vertical polarization, no quantum spin, 1 etc.).

In an example, the system maintains and manages resources, entities capabilities and allocation based on semantics, semantic artifacts and semantic analysis. In further examples the resource advertises, publish and/or register inferences and capabilities; further, the system may represent and organize resources and capabilities as models, model artifacts and/or semantic artifacts (e.g. groups, attributes, routes, endpoints, links, sub-models etc.). The system is capable to optimize resource allocation based on semantic routing and semantic budgets.

The semantic capabilities of a system may be exposed, published and gated via semantic fluxes and semantic gates. As such, a semantic flux and/or gate may publish semantic capabilities together with validity, decaying times and or semantic budgets for particular semantic capabilities (e.g. semantic artifacts, goals, factors etc.). In an example the validity and decaying times are used by a connected system to assess the routing for inference. In further examples, the capabilities are inferred based on semantic groupings and semantic model at various hierarchical levels (e.g. semantic posts group A mapped to an endpoint EA and group B mapped to an endpoint EB form a group C and the group C capabilities mapped to an endpoint EC comprising EA and EB are inferred from those of group A and group B). In similar ways semantic budgets may be used for assessing the optimal routes for inference. The semantic gates may refresh this information on a frequency based on semantic time management associated to particular goals.

The system may perform goal-factor analysis in which the system performs the inference for achieving particular semantic goals and establishes/infers the factors and indicators (e.g. rewards) associated with achieving the goals or not (e.g. having those factors within an interval or threshold). The goals may be associated with factors/ratings/indicators for objects and/or semantic artifacts, for inferring, associating or dissociating particular semantics (e.g. to/from artifacts, objects, entities) or any combination of those.

In some examples the semantic goals may be inferred or specified based on user inputs. In further examples, the user may specify through an interface the targeted or allowed factor/indicator for an operation (e.g. risk, cost etc.). and the system performs semantic goal analysis based on the targeted semantic for the operation and specified factor.

Figure 17:
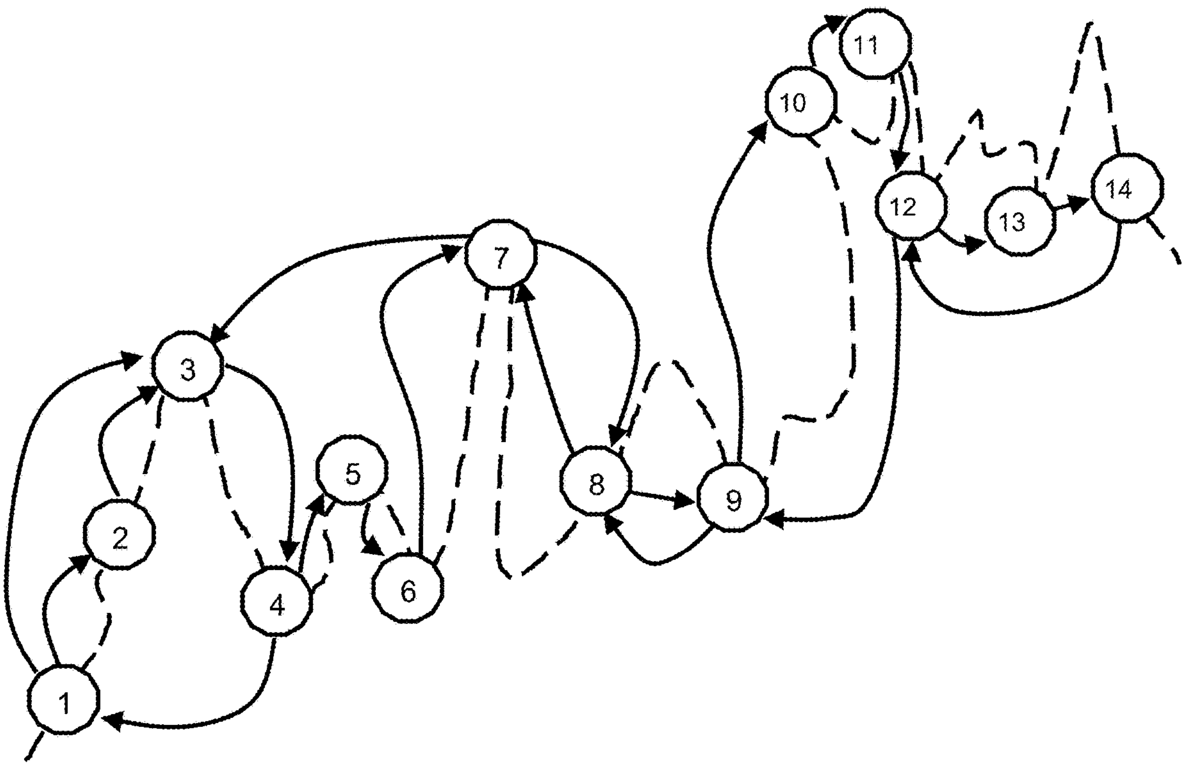
FIG. 17 illustrates a representative map of locations and intersections of the trajectories of actual and semantic movement between nodes.
Figure 18:
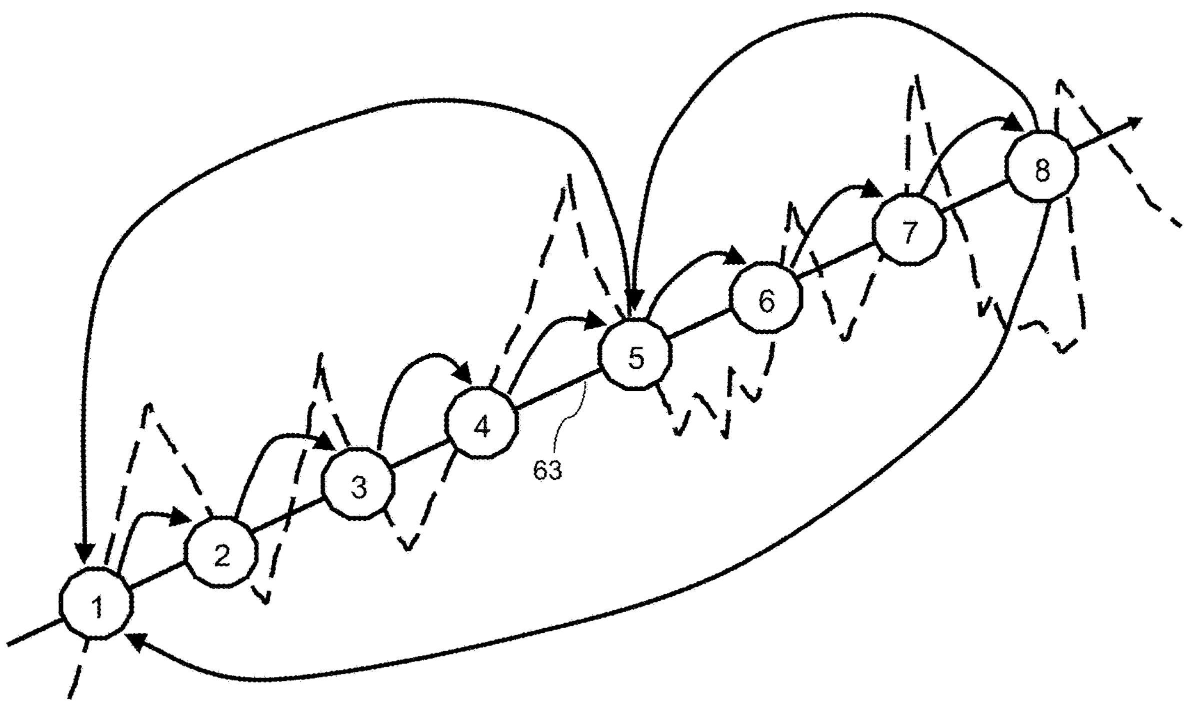
FIG. 18 illustrates an alternate representative map of locations and intersections of the trajectories of actual and semantic movement between nodes.

In another example, such as depicted in FIG. 18, the user specifies on a graph dashboard and/or (semantic) (enhanced) display optimal locations or trajectory 63 of the goal. In FIG. 17, the dashed line between numbered nodes or endpoints illustrates an actual physical path of travel. The solid lines between nodes represent semantic links between nodes, including a link and permitted direction. In examples of FIGS. 17 and 18, the system may map the locations and intersections of the trajectories on the graph to a semantic network model and perform semantic analysis of the graphs and trajectory at intersection points coupled with the semantic routes/trails of the graphs; further, it may be coupled with semantics and factors specified or inferred based on inputs from a user (e.g. a user specifies the semantic artifact, indicator and/or factor for a divisional link, endpoint, intersection endpoint, trajectory etc.). Such inputs may consist for example in pointing or dragging a pointing device or finger on a surface, display and/or touch interface. The semantic analysis may be used to adjust the semantic model in order to minimize the semantic drift that was determined/inferred based on the feedback.

In some embodiments the dashed lines in FIGS. 17 and 18 may represent, convey and/or be substituted with any representative graphs, charts, plots and/or display elements/components (e.g., statistical, line, bar, candlestick, OHLC, motion, timeline, map, graphs, charts, maps, diagrams, etc.) which may be related to semantic artifacts (e.g. semantics, attributes, indicators, factors, overlays etc.). Further, the system may infer and/or map semantic artifacts based on techniques such as mentioned in this application.

Semantic drifts and factor comparison may be used for assessing goal drifts; further, the comparison may be associated with a factor of a drift semantic (e.g. semantic capturing semantic differences) that may be used by the semantic inference as a semantic thresholding comparison. In a particular example rewards or functions of rewards (e.g. accumulation) are used to determine the drift of current inference with drive and goal semantics including semantic routes; in such an example the system may reevaluate the factors (e.g. rewards) within the model based on semantic inference. The system sets the goals and performs inference on the goals for determining a set of semantic routes which are potentially cached, saved and/or activated in memory in association with the goal; if the goals are pursued, the semantic engine compares the semantic drift between the goal or drive semantic artifacts with the current inferred semantic artifacts (e.g. comprised in a semantic route or trail). If the drift is exceeding the threshold (e.g. based on a factor value, interval and/or thresholding semantic) then the system may readjust the goal or quit the semantic inference while associating an inferred drift to goal factor or indicator to the inferred semantic artifacts, routes, semantic trails and goal (e.g. potentially through a semantic group in which the factor and/or the goal is defining the group or has leadership status in a group). The system may use indexing factors associated with semantics in order to perform drift, cost, reward, rating and/or other factors adjustments and/or calculations.

The system may use goals, factors, and indicators rules and/or plans for adjusting and/or indexing goals, factors, indicators and any combination of those. The factors and indicators plans may be associated with semantic time management, composition rules, factor rules and other rules.

Semantic groups of components may pursue common and/or composable goal-based analysis, wherein the semantic exchanges and routing between components is performed through semantic fluxes, semantic gates, semantic waves etc.

Those goal based semantic groups may change based on the change of the drive semantics. As such the semantic groups may change based on goal-based analysis and/or collaboration.

The system may pursue goals that are inferred and/or received. The system infers goals indicators, goals and drive semantics. In further examples, indicators are specified in the semantic network model via semantic rules and the system infers the indicators based on semantic inference; in some examples such indicators may be inferred and/or selected and provide optimal inferences. In similar ways the system may infer semantics associated with interfaces, sensors, graphs, graphical control types, dashboards and used for performing semantic augmentation.

The system may pursue goal and/or effect post-inference analysis. In some examples, the system performs semantic analysis to determine why the goal has been or not been achieved as budgeted. Thus, the system uses the recorded semantic trails to perform analysis (e.g. using what-if and/or projected) and infer the semantic artifacts that have been the most consequential (leaders) of success/unsuccess or realization of goal related factors; the analysis may be performed for example on multiple projections of semantic view and/or frame views and further, the system may ask for feedback on projections potentially until a particular goal (actual and/or projected) has been met. Using such inferences, the system may infer new semantic routes, groups, leaders and artifacts. In some examples, the system creates a semantic route and/or groups of recommended and/or forbidden semantics and/or artifacts in certain contexts as comprised by the semantic routes, views, groups and other semantic artifacts.

Post-inference analysis may be used with semantic displaying of information. In an example, the system determines the indicators, factors, routes and further semantic artifacts that may have caused the success, failure and/or other indicators/factors/factorizations; in some cases, indicators/factors/factorizations may be specified by users while alternatively, or in addition, may be selected by the system based on high factorizations, goals/sub-goals matching/drift and so forth. The system may mark, group and/or label the display artifacts that are inferred in such a way. In some examples the system groups and/or labels controls, dashboards of indicators and/or other user interface artifacts based on semantic analysis and rendering. In further examples, the user interface controls are rendered based on semantic artifacts mapping and/or semantic diffusiveness and/or hysteresis. Thus, such renderings may facilitate better visualizations and augmentations of projected factors, inferences, semantic units control, device control and/or simulated environments.

In further examples, the system may project the inference of particular semantics during semantic scene and/or view development (e.g. an object of a certain semantic group/s behaving in a certain way into the future, future inference of particular semantic artifacts for the object etc.); if the projections are met then the system may further increase the factorization (e.g. weights, risk, success etc.) of the routes, rules and semantic artifacts which were used in the projected inference. If the projected inferences are not met then the system may create a new semantic group/s based on alternative, additional and/or composite semantics associated with the object (e.g. different and/or more particular from the original semantic group/s semantics) and create new semantic rules, routes and artifacts for the particular semantic group/s; further the system may update the semantic artifacts used in the initial projection to include a factor (e.g. for weighting, risk etc.) for the newly inferred semantic group/s and link and/or associate them with the newly created semantic artifacts.

Alternatively, or in addition, the system may update, factorize and/or invalidate the original semantic artifacts used in inference (e.g. update the semantic identity, decay etc.). The decay and/or invalidation may happen for example, if the system is unable to differentiate (e.g. based on drift, goal and/or projected inference) between the semantic identity of the newly created group and the semantic identity of the semantic groups used in the initial projections. Alternatively, or in addition, the system updates the semantic groups (e.g. with the newly inferred semantics and/or groups) of semantic artifacts used in the original projection and potentially further factorize them; such updates may happen if the system is unable to differentiate between the semantic identities of the semantic groups.

The system uses goal and/or post-inference analysis to adjust semantic models and artifacts. For example, at a beginning of a goal-based inference the system may associate a factorized indicator and/or threshold to a semantic artifact which may be adjusted and/or changed based on post-inference analysis. Analogously, the system may adjust and/or associate semantic artifacts to factorized indicators and/or thresholds. In an example, the system has and/or infers a semantic artifact of TYPE X GATE DELOREAN (LIKELY 90% TOO) NARROW; however, after pursuing the goal of DRIVING CAR THROUGH TYPE X GATE with a factorized degree of success it may adjust the initial semantic artifact to TYPE X GATE DELOREAN (LIKELY 10%) NARROW and/or TYPE X GATE DELOREAN NOT NARROW. Further, the system may adjust the semantic groups and further semantic artifacts associated with the semantic identities in the inference (e.g. TYPE X GATE and DELOREAN).

When the system seeks multi-goal inference, it may prioritize the semantic goals via indicators and factors and form pluralities of semantic groups and pursuing those in semantic analysis/inference.

The system may accumulate and redistribute factors (e.g. rewards) based on the pursuing of goals, routes and/or potential feedback. The rewards, feedback, ratings and other factors may be received and inferred from any data and input including user, sensing entity, internal, external etc.

Semantic routing of collaborative components/systems/views/view frames/hierarchies may entail local semantic routing within local model, routing between models and/or routing between components. In some examples the models and sub-models are coupled based on semantic routing and/or semantic gating.

Semantic fluxes, models and sub-models may be coupled based on semantic analysis on the gated semantics.

In some embodiments goal and/or mission-based analysis may be used to implement semantic contracts. In such systems at least two entities are bound by a contract encompassing one or more contract clauses and conditions. Thus, the semantic system defines such clauses and conditions as indicators, goals and/or factors to be achieved and further to infer further completion and/or alerting semantics during or after goal completion. In an example an entity A providing manufacturing for an entity B is bound by a contract comprising a clause DELIVER EVERY QUARTER 10000 PAIRS OF SHOES FOR SIZES THAT ARE UNDER 100 PAIRS IN THE NY WAREHOUSE (e.g. and/or REPLENISH STOCK ONCE THE STOCK IS UNDER 100). Thus the system may infer the UNDER 100 PAIRS IN THE NY WAREHOUSE for an entity type (e.g. SPRINT BLACK SHOES SIZE 10) based on semantic analysis (e.g. inference of HAD INCOMING 10000 SPRINT BLACK SHOES SIZE 10 and inference of EXPEDITED 9900 SPRINT BLACK SHOES SIZE 10) and further infer a composite sematic of UNDER 100 PAIRS and further DELIVER 10000 PAIRS FOR the required size (e.g. SPRINT BLACK SHOES SIZE 10) for matching the goals. It is to be understood that the goal inference may be based on semantic artifacts (e.g. semantic routes, semantic views) whether hierarchical or not (e.g. a semantic route of UNDER 100 PAIRS, DELIVER 10000 PAIRS OF PRODUCT <SHOE product> and/or, potentially REPLENISH STOCK <SHOE product> and/or REPLENISH STOCK WAREHOUSE at higher levels) potentially in an access controlled manner.

Thus, the system is able to continuously perform semantic analysis and matches the initiation and realization of goals whether based on semantic groups or not. Analogously, the system may consider the routes matching or comprising particular semantic groups associated with particular entity instances.

In further examples, the contracting is based on semantic groups and the system analyzes the contracts clauses and/or goals based on whether they are met on a semantic group composite basis.

The contractual clauses and/or goals may be access controlled (e.g. selectively and/or controlled accessible to participant and/or observing semantic identities) in a potential hierarchical manner. Further, during the semantic inference the semantic artifacts and/or semantic views may be access controlled and thus the semantic inference and augmentation toward the goals will pursue and/or reveal only allowable routes and further semantic artifacts.

The system may further analyze the risk of the contract not being met and adjust the risk indicators and/or factors in connecting semantic fluxes and gates. It is to be understood that multiple risks may be inferred by various entities and groups (e.g. within the semantic group itself, by the semantic group itself, by the leader, by other semantic groups etc.) and thus transmitted within the semantic infrastructure where further adaptations (e.g. of goals), negotiations, disablement, invalidation, rating, factorization based on semantic analysis and feedback may be inferred.

The system may infer difficulty factors for the goals and/or further semantic artifacts and use them to infer rewards, risks, budgets, indexing and/or further factors. In an example the system infers that during winter storms the difficulty of keeping the warehouse stocked according with the goals is higher (e.g. the risk of failure is higher) than non-storm days and at hence it may increase the risks (during goal development), rewards, ratings and/or other factors of the providers in relation with the achievement of goals. Analogously the user may use indexing on semantic artifacts to further adjust based on such circumstances. Analogously, the system may keep track of activities, tasks, projects and/or (associated) goals assigned to various semantic identities. In an example, the system performs an activity of LEARN ABOUT ENGINE SENSOR SUITE in order to achieve the goals of A VERY GOOD ENGINE MECHANIC, A GOOD (CAR) MECHANIC; it is to be understood that in the examples the activity and/or goals refers to semantic identities and/or semantic routes which may comprise further hierarchical semantic identities and/or routes—e.g. ENGINE SENSOR SUITE comprises semantic identities and/or semantic routes such as—SENSOR, SENSOR SUITE, ENGINE SENSOR SUITE. Further, the risk factor of not achieving the goal may entail assessing routes such as LEARN (FROM) BOOKS, LEARN (FROM) COURSES, LEARN HANDS ON etc.; it is to be observed that the route LEARN FROM BOOKS may entail the activity of LEARN in relation with a semantic identity of BOOKS with a further semantic localization specifier (e.g. specifying artifacts comprised in BOOKS artifacts and/or endpoints associated with BOOKS) such as FROM which may be inferred based on circumstances.

The system may perform and/or guide the semantic analysis based on or of the loss (e.g. dissociation, ungrouping etc.) of particular semantic artifacts for particular semantic identities. In some examples, the system infers and/or projects semantic artifacts, goals, routes, budgets and intentions based on (composite) loss indicators and/or factors (e.g. risk of loss, cost of loss, reward of loss etc.). Loss factors indicate and/or are associated with positive and/or negative sentiments; positive and/or negative sentiments can be modeled through loss factors. The system may pursue loss goals, routes, budgets and/or intentions.

Analogously, with the loss semantic analysis the system may perform gain based semantic analysis based on gaining (associating, grouping etc.) of particular semantic artifacts for particular semantic identities. The system infers and/or projects semantic artifacts, goals, routes, budgets and intentions based on (composite) gain indicators and/or factors (e.g. reward of gain, cost of gain, risk of gain etc.). Gain factors indicate and/or are associated with positive and/or negative sentiments; positive and/or negative sentiments can be modeled through gain factors. The system may pursue gain goals, routes, budgets and/or intentions. The system may perform inferences and/or projections on factors (e.g. risk, cost etc.) of going over or not meeting the budgets. Further, the system uses semantic analysis for inferring budgets based on projections, goals and/or factors.

The semantic budgets may be associated with semantic groups. The budgets may be for example inferred within semantic groups and published via groups leaders and/or gating. Further, only particular semantic identities and/or groups may have access to particular budgets in a selective way; the system may select one budget over the other based on identification in the semantic network. Alternatively, or in additions, semantic profiles may be also used for providing access, inferring and/or selecting one budget over the other.

A network component (e.g. network card, ASIC, I/O module, I/O block, digital block, analog block etc.) may be used to analyze the traffic, infer semantics and coordinate transfers based on the semantic model and semantic rules. The network plug-in may be used for example to infer semantics on the type of data that passes through a link and use semantic routes and access control rules for transferring it to other systems and/or components. The network card may comprise a semantic unit and/or include a semantic gate functionality (hardware unit/block or software) in regard to connections to other systems and/or components.

When used with imaging sensors or imaging streams (e.g. video, images) it may map a semantic network model of endpoints and/or links to artifact locations as detected from image and/or frame data. The system may map endpoints to near field and far field features and objects; in some examples the mapping is achieved based on perceived depth semantics, semantic time and/or semantic indexing. It is to be understood that the system maps endpoints to particular features, regions, characteristics and/or objects while preserving an overall hierarchical model for the whole semantic field.

The system may perform the mapping on raw data and/or other renderings of the artifact. In some examples the raw data and/or renderings are augmented with additional information (e.g. annotations, bounding boxes, labeling, object/region boundaries, segmentation etc.). We will refer to any of the capture raw data, processed captured data and/or renderings as to rendering data, rendered data, data rendering or similar terms.

Between two times (potentially semantic time) and/or data renderings the system may be able to correlate at various points (e.g. endpoints and/or links) the semantic models of the data renderings and further to infer the semantic of shapes modifications, motions and boundaries (see picture). For example, if the semantic scene is represented by an observed object, the system maps the semantic model to areas or locations in a frame/image/capture and/or data rendering of the object. After the system maps a first network model at a first time, and then a second network model at a second time after the object is rotated for example, and the system is able to correlate some points between the first and the second models, then the system may use semantic inference on the two models to derive the conclusion that the object has been rotated and eventually derive boundaries. The system may use the movements of the detected features, edges and shapes between endpoints for semantic inference on a semantic network graph. While multiple models may be used, a composable or equivalent single model configuration in a mesh and/or hierarchical structure may be used. In an example, if the renderings are correlated with the presence of light sources in the scene, then the system may be able to correlate and infer semantics even further based on the light and luminescence characteristics found at each endpoint. For example, in such cases, the visual semantics associated with each point may be coupled to semantic inference within the semantic network models. Sometimes the correlation may be described based on leaderships semantics which are essentially semantic attributes assigned high factors in semantic analysis (e.g. it is assigned a very high factor in semantic composition and is highly discriminative against other semantic determinations and/or artifact identification). Further, the system may use trajectory comparison and semantic analysis including semantic orientation for semantic inference and mapping of shapes, modifications, motions and boundaries (see picture).

The semantic model might map to a two-dimensional representation in some data renderings (e.g. images, frames). In addition, the system may perform near to far field semantic inference and semantic model mapping. In other embodiments where depth detection is available (e.g. electromagnetic scattering/reflection sensors, time of flight camera, depth camera, laser, radio frequency sensors) it captures the depth as well and couples it with semantic inference.

In general, when referring to location-based endpoints is it to be understood that it may refer to a location in a particular context and/or semantic field. Thus, the location may be related with physical coordinates, volumes, regions whether mapped to an environment, artifact (e.g. frame, image, object) and/or potentially with a location in semantic spaces related with sensing, displaying, mapping, rendering, meaning, symbol and/or language representation.

Depth detection helps the system to identity object edges more efficiently based on the detected difference in depth in the rendering or scene. As presented in this application the depth detection may be based on arrays of photodetectors that either, expect a reflective and/or scattering response based on a transmitted semantic wave or semantic modulated signal, and/or based on time delay and/or rate of photons detection (e.g. between a reset state of the detector and charging to a particular energy state and/or a threshold of photon counts and/or energy quanta count).

Semantic models may be updated based on observations from single or multiple observers.

In some cases, the composed semantic field of multiple observers may not perform exhaustive coverage of a semantic field of a compact area (e.g. represented by an endpoint) or a semantic group.

In some examples the composed semantic field may not be exhaustive (e.g. covering all locations or endpoints) due to masking or obturations of endpoints in rapport with observers.

In some examples the system determines depth and distance semantics between objects by determining the time difference between when an endpoint semantics change from a particular semantic and/or group to another. Thus, in an object detection example, if at a first time car A partially obstructs car B and an endpoint E is mapped in the field of view to the car A and later to car B maybe because the car A do not obstruct car B anymore at particular endpoint E the system detects the time semantics of changing conditions and/or semantics at endpoint E (or at the sensing elements associated with endpoint E) and determine depth, distance and potential further semantics based on such time semantics. In some examples the system updates the risk factors of driving through particular endpoints and/or groups (e.g. associated with lanes, zones, leader etc.) using the current and/or projected parameters. In some examples, the risk factors are positively factorized when distance and/or movement semantics are further factorized (e.g. 60 APPROACHING 80 FAST, 80 FAST APPROACHING, GETTING VERY CLOSE, 100% FAST MOVING, MOVING FAST etc.); analogously risk factors may determine factorization of distance and/or movement semantics (e.g. the SLIDE RISK is high then the distance semantics are factorized and/or indexed accordingly).

In other examples, when the rendering artifacts are provided by a sensing entity the semantic inference may be coupled with the semantics associated to the movement of a sensor in order to correlate locations and artifacts in models and further control the sensor based on the inferred semantics.

An endpoint in the semantic network model may be mapped with elements in a sensor (e.g. a photodetector element in a photosensor, an element in a rf sensor) and the semantics at an endpoint are inferred based on data from the sensor element and attributes associated with the sensor elements. Alternatively, or in addition endpoints may be associated with own semantic network models and/or with semantic groups of elements.

In a semantic network model, the semantics are assigned to artifacts in a graph and the system adjusts the semantic network model based on ingested data and semantic inference. The semantic network graph comprises endpoints and links in a potential hierarchical structure with graph components representing another semantic network graph. In some embodiments the links are not oriented. Semantic network models allow management of paths, fluxes, routes and semantic inference within the hierarchy. In an example, the system calculates the cost, drifts and/or factors of the semantic inference based on the levels in the hierarchy that need to be crossed to link or correlate two or more semantic artifacts. Because each hierarchical level may be associated with at least one semantic artifact, factor and/or indicator the system may perform semantic composition, semantic factoring, semantic cost/reward analysis while traversing the hierarchical structure. The traversal may be determined or inferred based on semantic routes. The system may use semantic budget and goal semantic (e.g. semantic, factor, goal/factor) analysis to determine the hierarchies that need to be coupled, composed and/or traversed and additionally may use access control rules to determine access within the semantic network model (e.g. between the levels of the hierarchy of the semantic model). In an example, the system would not use inference on a level in the hierarchy until certain semantics or groups are not inferred at a first level of the hierarchy and an access control rule would allow the transition (e.g. via composition) at a second level. The transitions may be related with risks, targets, costs and other semantic factors and goal indicators. Further, the system may use semantic analysis and semantic access control to determine the coupling and composition of semantic models and sub-models.

The endpoints in the semantic model may be connected via links. The endpoints and links in the semantic network model may be associated with semantic artifacts. The semantic network model is adjusted based on the semantic inference; the adjustment may include the topology coupling, gates, fluxes (e.g. published and/or access controlled), budgets and any other semantic artifacts associated with the semantic network model elements.

Sometimes, groups of sensors and/or endpoints are grouped as semantic groups and the inferences composed in a hierarchical manner.

A semantic network model may be mapped dynamically or relativistic on an object. In an example the mapping comprises mapping the semantic sensing field in a more absolute way relative to the detector elements. In an example for a camera and/or vision sensor the semantic network model may be mapped statically on the field of view and if the camera consists of multiple photo detectors, it may include mapping of photodetectors to the endpoints and/or links in the model (see FIG. 16). Further, the model can be mapped in a hierarchical way with higher model levels representing potentially higher-level semantics; further the higher-level model levels participate in semantic composition only with the highest semantics in the previous layer/s that are allowed to pass between layers. The semantic composition may be based and controlled based on semantic gating and/or access control.

Alternatively, or in addition, hierarchy levels may comprise frames of at least one sensor semantic network map captured previously; such a structure, with links between endpoints (e.g. sensing elements or group identification) within or between levels provides scene development information. Alternatively, to sensor semantic maps the system may generate semantic frame maps for frames captured from cameras, vision sensors and other devices and which are used to map and/or store pixels, groups, locations and/or other features to the endpoints and/or links.

In some examples the system receives semantic scene artifacts (e.g. images/frames) and receives or infers semantics associated with them (e.g. potentially via same or other sources such as voice, text, display buttons and interfaces etc.). The system may infer a semantic factor/drift/shift between its interpretation of the semantic scene artifacts and the received semantics (e.g. from a description), eventually inferring semantic/groupings factors in relation to the routing and grouping of particular semantics and the source.

In some examples the system detects camera obturation (e.g. lens or collimator covered by dirt, shadowed, broken etc.) based on frame processing and semantic analysis. In such an example the system detects artifacts, patterns, areas and patches in the frame processing that do not change in time according with semantic analysis or the change is not conclusive; such artifacts create a static pattern and/or dynamic anomalies in the semantic analysis based on a mapped semantic network model and/or do not pass a threshold of certain static and/or dynamic factors for the semantic analysis. It is to be understood that the system may combine static and dynamic factors for assessing such obturation patterns. In some examples the static artifacts comprising factors, mapped endpoints and patterns may be used to assess obturations. In addition, dynamic factors as detected in the semantic network model and movement semantics and factors (e.g. speed, acceleration etc.) may further help inferring anomalies of static artifacts (e.g. if a post is MOVING then a static pattern and static semantic inference on the pattern in the semantic network model mapped to visual/infrared/terahertz image frames may be inferred as an obturation). When the system detects obturation it may mark the obturated area and models accordingly so that the semantic inference would consider and eliminate obturations' noise.

In further examples, the movement inference and trajectories of rain drops, wipers (e.g. blades, sprayed cleaners) may be considered in a potential contextual inference (e.g. dirt present etc.). The semantic coverage or capabilities of a semantic system are related to the capacity of generating semantic inference based on observations of the semantic field. Accordingly, patterns can be learned through semantic inference and mapped to various contexts and environments via semantic artifacts. In an example the system learns a pattern comprising at least one control rule and/or at least one-time management rule and represents it as a semantic route, semantic group or another semantic rule. Semantic routes and semantic rules may be associated with semantic groups.

The semantic rules may be associated with semantic artifacts such as semantic routes. Therefore, the routing and control aspect is important in guiding and breaking down the semantic inference. In an example, the access control would allow/disallow inferences based on semantic artifacts, rules and/or routes.

In semantic systems various classes of objects may be parts of a same semantic group and hence sensor data patterns may be related based on the group. For example, if two cars from different vendors share the same chassis, and we have data patterns attached to semantics for one of the cars during an off-road trip, we can then use related semantic inference artifacts to the second car and be able to infer potentially when that car goes off-road. The suspension can be different and is important to correlate the two signals or data by taking in consideration the characteristics of the suspension (e.g. via signal or semantic waveform conditioning and/or suspension semantics gating) and as such mapping this data to the semantic model and rules allow the improvement of semantic inference. Causality may be modeled where patterns, artifacts, entities and/or groups influence one another. In some examples the causality may be modeled as semantic routes, endpoints, links (e.g. oriented) and/or other semantic artifacts.

In an example an oriented link and associated semantics represents/models a causality relationship between endpoint A and endpoint B.

Sensors and sensor devices and other data sources can flush data at predetermined and/or semantic intervals.

Sensors in general produce large data sets and then transferring it over a communication link or network might pose a challenge with both communication, storage and interpretation.

It is important that the semantic analysis be done as closest to the sensor at possible. Ideally, the sensor should be coupled to a low power processing unit or device which is able to intelligently draw inferences before transmitting it and/or semantic gating it to other devices.

The advantage of semantic systems is that they are able to understand the meaning, nature, value and importance (e.g. via factors) of information and hence its transfer requirements. As such, a semantic element/module/unit may store, expire and/or transmit information selectively and adaptively based on the overall context assessed at the system elements, potentially based on distributed intelligence.

The semantic model associates various semantics to various patterns of measurements, inputs, data and/or semantics.

The system may intelligently route and perform semantic inference on the distributed semantic hierarchy mapped to various devices.

By also using semantic techniques like semantic groupings, semantic relationships and semantic composition the sensor data patterns can be further extended.

While a general semantic model may be built to satisfy the requirement of a generalized audience, it might be that the semantic model need to be adapted to various personalized requirements. As an example, a person, identity and/or semantic group might associate a IS COLD semantic to temperature of 50 F while to another the same semantic might be associated with 60 F. Thus, personalized semantic models, sub-models and analysis are used based on semantic user preferences and profiles. As such, the semantic profile models may be hierarchical in nature where the user's semantic profile models are based on views of another profile/role model (e.g. potentially linked based on a semantic group), which in turn may be a view of a more general model and so forth. The semantic views may be hierarchical. It is to be understood that the semantic profiling and views may be based on drive or orientation semantics associated with a profile at any level. Also, the access between various views and/or profiles is based on semantic gating and access control.

The semantic profiles may be adjusted and/or selected based on presence/absence, acquire/dispose and/or bond/leak of capabilities and/or agents and/or further inferred (composed) semantic identities. In examples, IS COLD is inferred differently between a NURSE WITH NEWSPAPER and a NURSE WITH (NEWSPAPER AND) A COAT. As such, the coat capability may act as a counter-measure and/or is entropic to COLD and thus, the system may index the COLD intervals accordingly.

The system may project bonding/leaking of capabilities and/or (based on) (flow) agents to apply particular profiles for affirmative factorizations and/or resonances.

In general, bonding (and/or possessing)/leaking (and/or dispensing, releasing) analysis may correspond, be synonymous and/or resemble inflow (or IN)/outflow (or OUT) analysis including the diffusion to(IN)/from(OUT)/between (IN/OUT)/within carriers, agents, containers, endpoints and/or fluxes.

The likeability and/or affirmativeness of bonding/leaking may be determined and/or controlled though (access) control factorization and/or further diffusion of agents and/or components.

Semantic profiles may be associated and/or based on semantic groups. Thus, various profiles and their associated drive semantic artifacts may be activated based on the inference, identification and/or authentication of related semantic identities and groups (e.g. potentially in a hierarchical manner).

The system adapts the inference based on current and/or projected semantic identities and associated profiles.

Semantic profiles may determine entanglement (group) superposition wherein the entangled/group members have high entropic profiles which determines superposed determinations for the entanglement/group. In examples, based on Jane's profile the system determines that is 100% COLD while based on John's profile determines that is 100% HOT. Thus, the DOES entanglement/group is in superposition in regard to the (particular) (temperature) measurement (budget). The system may be in superposition based on a multitude of measurements and/or parameters. The DOES superposition may collapse if there is a DOES profile for the (particular) (temperature) measurement (budget) (e.g. the DOES profile indicates that for the measured value is WARM).

The system may use semantic profiles and semantic gating to ingest and organize information from a variety of sources. In an example, the system ingests text data from a source and create and/or associate the source of data to a semantic profile which is then used during semantic analysis; further, the system associates inferred semantic artifacts based on ingested data to source and/or inferred semantic profiles in a potential hierarchical manner. Further, the semantic profile may be assigned or associated to semantic identities and/or user preferences.

The system may learn and/or infer sentiments based on semantic profiles and/or semantic groups. In an example the system infers that JOHN IS A GOOD BASEBALL PLAYER while further may infer that HE or THEY or TEAMMATES—THINK THAT JOHN IS AN AVERAGE BASEBALL PLAYER.

The system uses semantic profiles to adapt inferences based on circumstances. The system may use and/or factorize a semantic profile and its artifacts based on (inferred) semantic identities and/or semantic groups. In an example, if the system observes a soccer game it may factorize a semantic profile and artifacts of REAL FANS, COACH ZIDANE'S FRIENDS etc. and further use such factorized profiles and associated artifacts in semantic analysis.

A smart semantic sensor, device or component may have a way of knowing which semantic should report or allow access based on different semantic profiles, semantic analysis (e.g. semantic time) and/or possibly on authentication of a user and/or request. Further, semantic devices may incorporate only particular artifacts, hierarchies and/or levels of a more general semantic model thus, allowing them to efficiently infer particular semantic artifacts (e.g. lower level); it is to be understood that such models may be transferred between devices and within the distributed cloud based on gating, access control, authentication, semantic profiles, device purpose, goals, contract goals/clauses and/or any other techniques as explained in this application.

A smart semantic sensor, device or component may report (data) to a semantic receiver based on an authentication of the semantic receiver and/or group. Further, it may report to other interested parties based on the profile owner publishing. In examples, Jane publishes her weather interpretation profile and/or associated themes, rules, levels, endpoints, branches and thus, interested parties may obtain related and/or allowed weather information interpreted based on Jane's profile and/or model. It is to be understood that the publishing may be based on access control and/or diffusion.

In further examples, a receiver provides a version and/or a semantic identity of a semantic profile which need to be applied to (sensor) data. In case that the profile cannot be identified the smart semantic sensor, device or component may report the raw data without semantic interpretation.

The system may send an alarm if it receives a highly entropic version and/or semantic identity in rapport with the receiver's request. Further, it may invalidate and/or (request an) update a profile associated with a version and/or semantic identity based on determined confusion, coherence, obsolescence, applicability and/or semantic times.

The semantic wave may coherently collapse only if the unit has the collapsible model (e.g. the model needed for coherent semantic inference). Semantic groups of devices may have the collapsible model on particular themes, semantics, semantic routes and semantic profiles modulated in the semantic wave. For hierarchical models some devices or units may have access only to particular hierarchical levels (e.g. based on gating, access control) and as such, the particular unit might have a limited semantic coverage on the semantic wave, potentially lacking domain transfer, generalization and abstraction capabilities. Differentiation in semantic coverage may be used to perform encryption for example, wherein only particular entities may collapse particular information or areas of semantic waves.

Alternatively, or in addition, some units may be provided with a gated or profiled model and/or gate the model and inference based on particular interest semantics and semantic routes. In a gated model, artifacts associated with the gated semantics, semantic routes and associated compositions are disabled, invalidated and/or eliminated.

The semantic flux published semantic artifacts may be accessible only within particular semantic groups and/or profiles. In some examples, only specific themes and associated semantic artifacts as specified by a user are shared and/or published with particular semantic groups and so on. It is to be understood that such publishing, control, profiling and sharing may be analyzed, encrypted, unencrypted and/or authenticated in a hierarchical manner based on corresponding credentials.

Semantic inference produces semantic artifacts. Sometimes the semantic artifacts are associated with raw and/or rendering data and/or rendering constructs. Semantic artifacts may be reduced or composed to semantics related to shapes, features and/or colors; representations (e.g. maps, models) or other artifacts (e.g. visual artifacts, rf noise artifacts) may be used in inference and/or created during inference and so on. Semantics may be inferred based on model, inputs, location, time and other data.

The system infers semantics and recognizes entities by composing multiple localized semantics, possibly based on semantic factors and applying threshold comparisons to the result. The composition may stop once the system reaches a particular threshold, indicator and/or factors in an inference (e.g. based on a goal). Sometimes the system performs semantic drive and drift inference based on indicators only.

The system may recognize shapes by semantic inference and grouping on the semantic network model and/or map. As such, the system may group elements/artifacts based on semantic grouping and/or semantic linking.

In an example the system has three endpoints EA, EB, EC which may be adjacent. The system groups EA and EB because they are each associated with a semantic LEFT RNA. Alternatively, or in addition, the system groups EA and EC into an ABNORMAL group because EA is associated with a semantic LEFT RNA and EC with the semantic RIGHT RNA and the system contains a semantic composition rule associating RNA at LEFT and RIGHT in close proximity with a composite ABNORMAL semantic. Further, at least one of the endpoints EA, EB, EC or groups thereof may be linked (e.g. using a model link) via a semantic of LEFT or RIGHT to other endpoints ED and EF and groups thereof and the system infers groups based on similar principles and potentially clustering those artifacts and/or groups for more optimized memory access. In some examples the grouping and clustering is hierarchical. In the example the groupings (LEFT, (ABNORMAL, EAC)), (NORMAL, EDF)) implies (ABNORMAL, EAC, EDF) or (ABNORMAL, EACDF). While the example doesn't use semantic factors is to be understood that factors can be used as well. In some examples the endpoint mappings and groupings may be associated to sensing (e.g. element identification, semantic identification, address, location, state etc.); alternatively, or in addition, elements and artifacts in the scene, image, frames, maps or renderings (e.g. pixels, area, locations, sub-scenes, sub-frames, objects) are mapped and grouped. Also is to be understood that the symbolic representation is used in this example to convey semantic artifacts, semantic models, semantic routes, and other semantic techniques and structures.

The mapping and association of semantics to raw data may allow the system to compose/generalize, construct/deconstruct semantic scenes and observations. As an example, if a person knows that in a downtown area there is a big mall and a two-lane road then the system is able to reconstruct the observations by combining the semantics and the internal representation (e.g. images, groups, models etc.) of those artifacts.

If the system uses semantic groups of elements to capture information and perform inference (e.g. associating an object with a semantic group of elements and/or identifiers), then the stored semantic artifacts may be reconstructed/projected based on the mapping, localization and/or semantics of the element/identifiers/groups to the projected environment. The projected environment may be a virtual environment, remote environment, training room, simulated environment, operating room etc.

Once the system loses (e.g. decays) some semantic interpretation of a type of an artifact then the reconstruction mechanism of an observation may be altered or become even completely unfeasible. If the semantic artifact has been related, replaced, collapsed and/or fused with/within other semantic artifacts then the reconstruction may take place using those semantic artifacts.

The system may replace or fuse semantic artifacts when there are no strong links or relationships to such artifacts (e.g. strong semantic routes, factors, view, view frames, fluxes, groups etc.). In an example, a strong semantic link occurs when the semantic is part of a strong semantic route or a strong semantic trail. The strong factorized semantic artifacts are the ones that are highly semantic factorized in absolute value. As such, a semantic trail may be high negatively semantic factorized when the experience of the trail execution had a high negative sentiment (e.g. the outcome was far off or even opposite from an initial goal or expectation; and/or the system learned strong new routes). In a similar way, a semantic trail may be high positively factorized if the experience had a high positive sentiment (e.g. the outcome exceeded the initial goal or expectation; and/or the system learned a strong semantic route). In general, the negatively semantic factors are higher in absolute value than the positively semantic factors for a particular semantic artifact each time when there is an inference on the particular semantic factors and artifact.

Orientation and drift inference between semantic trails and projections based on the semantic trails and further semantic routes, rules and/or goals may determine further factors, indicators, sentiments (e.g. nostalgia, regret, guilt, fear etc.) and/or intentions. It is to understood that the inference of high intention factors and/or cues may determine, infer and/or be associated with low entanglement entropy routes, goals and/or budgets.

Semantic factors may comprise positive or negative values to reflect positive or negative sentiment indicators, potentially in rapport with a view, route, view frame, group and any other semantic artifact.

Semantic artifacts may not be always represented with the original resolution of data; instead they are represented using an approximate of the original data or shape for the representative sampling, pattern or waveform. Thus, the system is able to reconstruct semantic artifacts in a more approximate manner by performing semantic inference/analysis on the semantic artifacts and/or the goals thereof. Objects, observations and scene interpretation rely on semantic attributes inference. Semantic attributes may be related with characteristics of semantic artifacts and/or detected objects thus providing superior context interpretation. Scene interpretation may comprise factorized estimation. As such, semantic artifacts may be assessed or compared with/within an area of the scene and based on comparison the system may continue to interpret the scene and area until the goals or factors in the assessment of the scene are achieved. As such, while a particular area of the semantic scene may not yield a particular satisfying result, the overall semantic scene may yield a satisfying result and be classified accordingly based on the semantics associated with the scene.

The signal processing components take in consideration the semantic scene composition. As such, the system may filter multiple sources of signals and/or assigns it to particular semantics or objects based on the scene interpretation and semantic model. In one example, the system filters noisy signals from a semantically identified artifact in the semantic scene (e.g. filter sounds and/or other signals from a bird detected and/or mapped via optical and/or other sensing means) and mapped to an endpoint; thus the system may use the mapping of artifacts and/or signals to endpoints to perform noise reduction based on semantic analysis. In similar ways the system may filter low factorized signals, semantic scenes, frames and/or sources.

It is to be understood that the system may perform semantic signal conditioning and/or gating based on semantic groups and/or hierarchies. The conditioning signals, routing and/or gating is/are based on the members of at least one group/sub-group; further, such conditioning and/or gating may be performed on a composite basis, pipeline and/or hierarchical basis. In some examples, the conditioning and/or gating waves and/or signals are composed based on the artifacts (e.g. waves, signals, voltages, sub-groups, trajectories etc.) associated with the members of the semantic groups and/or hierarchies. In further examples, the system uses groups and/or hierarchies of semantic cells and/or units as a pipeline for applying conditioning (e.g. based on semantic groups, on at least one member in leadership positions, each member, sub-groups etc.).

In optical mapping and rendering the system may use differences in appearance between semantic model artifacts and/or semantic groups to interpret or render the scene. In further examples the system may use gradients between such artifacts mapped to a layer of a semantic network model. In some examples, color gradients of or between semantic groups of pixels and/or regions are mapped to a semantic network model. Thus, endpoints may be mapped to pixels, sensing elements and/or semantic groups thereof and oriented links represent the color or shade gradient between or detected by such artifacts. Alternatively, or in addition, frame gradient processing may be used prior to mapping the semantic network model to the processed frame. Also, the system may hierarchically calculate and map gradients. The system may use a hierarchical semantic model of gradients for inference.

In similar ways with color gradient processing the system may use other gradient mapping to semantic network models. Such gradients may include but are not limited to gradients on curves, shapes and/or mathematical graphs potentially in a multiple coordinate system (e.g. representing object edges, features, evolution of stock indices graphs, velocity graphs, acceleration graphs, correlation graphs/matrices etc.). Further, in such examples the intersection of gradients in the particular coordinate systems may determine new endpoints in the semantic network model.

Location plays a role in determining the semantic scene. Endpoints, links, semantic artifacts and/or semantic scenes are mapped to sensor elements or groups and the system performs analysis on the sensor elements grouping, their characteristics and identities. In some examples semantic analysis allow and/or is based on the inference of only the differences between/within semantic scenes. The differences between semantic scenes and/or further semantic views may be inferred based on semantic drift and/or entropic factorizations. As such, the system may update the mappings, semantic groups, hierarchical levels and others semantic artifacts. The update inference may include only the changes and/or comprise only affected artifacts.

In optical mapping and rendering the system may use difference in appearance between semantic model artifacts and/or semantic groups to interpret or render the scene. In further examples the system may use gradient processed frames with semantic mapping. In one example the color gradients between regions, areas (e.g. pixels), features, sensing at elements and/or semantic groups of the former are mapped in the semantic network model as links and/or endpoints. In further examples a processed gradient image (e.g. based on convolution and/or filtering) and/or frame is mapped to the semantic network model. It is to be understood that such mapping can take place in a recursive and/or hierarchical manner; in some examples the mapping proceeds based on semantic inference (e.g. achieving a semantic goal and/or an area/endpoint is semantically covered, the semantic view doesn't produce new semantically relevant artifacts at particular levels and so on).

Further, the semantic models may be mapped to rendering data and/or semantic scenes and the system performs inference on the semantic models mapped on different data rendering sets and/or at different times. In some examples the system performs inference only on the routes affected by changes of semantics (e.g. endpoints and/or links changing semantics); it is to be understood that the system uses hierarchical assessment of semantic updates and changes.

The system keeps layers of model mapped to specific artifacts, locations in order to maintain focus (e.g. follow a goal, a semantic route etc.) and/or preserve high level semantic coherence.

In some examples the system expires, disable, or invalidate semantic artifacts. In further examples entire hierarchies or models may be invalidated. The invalidation may be based on semantic expiration (e.g. expire a hierarchical level or sub-model associated with a semantic or semantic group).

The system may need to steer/remap the element grid based on the semantic field interpretation.

The system may remap the elements or groups of elements to endpoints, links, locations, semantic artifacts and/or semantic scenes (e.g. based on address, grid, location, identification of the elements, semantic artifacts) while preserving the high-level semantic view frames and views.

The remapping may comprise updating the associations of the addresses, endpoints, links, locations and/or identifications of the grid elements to the semantic artifacts, locations and/or semantic scenes within semantic view frames and/or views.

In the same way as it performs mapping on sensor element grid, areas, zones the system performs mapping on any detected and/or rendered scene and artifacts (e.g. pixels, areas, zones, sub-scenes, objects etc.).

In further embodiments the system coordinates detection based on current semantic network model. In such an example the system may point detection resources (e.g. beams of lasers, infrared, radiofrequency) to areas associated with the network semantic model that don't have associated semantics and/or the semantics expired and/or they don't comply with a goal-based inference. It is to be understood that the network semantic model is continuously updated and refreshed based on the semantic analysis including semantic expiration.

The semantics/artifacts/signals of a semantic view frame may be mapped and/or stored in a semantic route. The system may hold more than one view frame and the system compares the view frames in parallel. The comparison may be based on semantic orientation, gating, conditioning and other semantic analysis.

The view frames may comprise or be organized as semantic network models and the system performs inference on such view frames.

The system may assign a semantic budget to a view frame for reaching goals, indicators and/or factors; the budget may be updated as the inference develops.

In some examples the system manages the content semantic view frames based on semantic analysis and inference. Semantics may be gated on semantic view frames based on semantic access control. In further examples, the system uses semantic analysis on the goals, indicators and budgets to allow or disallow artifacts in the view frame. In further examples the system disallows some inferred artifacts and/or provide rule updates, ask for feedback and/or generate alerts.

The semantic scene interpretation is optimized in context; contexts may be captured via semantic models, semantic orientation, semantic projection, semantic artifacts inferred via semantic analysis and captured in semantic routes, semantic views, semantic view frames. Various semantic routes may be preferred over other. As such the semantics of those semantic routes may be assigned higher weights/factors than those that are not preferred. A context may entail a collection of previously inferred semantics, semantic views, semantic view frames and/or semantic trails and as such the semantic system may assign or adjust the factors/weights for the semantic routes based on a factor assigned to each semantic in a leadership semantic group. The semantic system may also adjust the factors of the semantics in the route, view frame and/or views based on such leadership; in some instances, the system may perform further factorization in a recursive manner (e.g. until a goal is achieved). The semantics may have associated particular factors for each semantic route within a view frame and/or view. Further those factors may be also adjusted based on goals and leadership inference.

The factors assigned to semantics may determine the expiration and/or semantic decaying; in some examples, the factors may be associated to a quantum/quanta and/or value/series/waveform in order to perform inference and/or decay on semantic artifacts; alternatively, a semantic and/or factor may be used as an indexing value to be applied to a quantum/quanta. In some examples the quantum factorization may determine a time quantum. The time quanta may be associated, determine and/or comprise semantic time management thus the system being able to "measure" or to rapport inference to the "passing" of time. In other examples the quanta are an energy quanta or entropy quanta and the system "measures" or rapport inference to energy and/or entropy. The management of semantic quanta uses semantic rule management. In addition, or alternatively, the quanta is a signal and the system performs inference and decay based on a quantum signal, quantum wavelet and/or quantum signal data (e.g. amplitude, frequency, phase, envelope, spectral envelope, spectral density, energy, entropy, gradient, spectrograms/scalograms etc.). The system performs the assessment based on semantic analysis on such data and/or waveforms wherein semantics are mapped to values/signals and/or are mapped via semantic network models on signal data (e.g. mapping on envelopes, spectrograms, gradients etc.). The system may use transforms such as Fourier transforms, wavelet transforms, passbands, window functions to perform semantic inference on the resulting signal artifacts.

A semantic wave collapse may occur when a semantic quantum factorization occurs for the wave. Semantic wave collapse may be used for example to model quantum phenomena. A semantic wave collapses onto semantics via semantic gating when there is a semantic view and/or model for semantic analysis on the semantic wave.

Semantic validity may be related with the validity overall or with the validity within an association with a semantic group, semantic route or trail. In the same way the validity may be related with association within a semantic view frame and/or semantic view.

The semantic time management (e.g. validity) in a semantic view frame and/or view may be also associated with various profiles based on the user entity of the view frame and/or view.

A semantic memory cache contains semantic artifacts (e.g. semantic routes) that are selected for semantic view frame and/or semantic view. The semantic memory cache select/maintain relevant semantic artifacts in the context. The selection and/or refresh may be semantic driven (e.g. inference, time management etc.)

Semantic memory caches may comprise semantic view frames and/or semantic views which may be organized in a semantic hierarchical structure.

Alternatively, or in addition to caches the system perform marking, enablement, and/or selection of semantic artifacts in the semantic memory.

Memory capacitive elements and components associated with the semantics (including marked semantics) and/or factors are charged to a particular voltage and then discharged in time via variable resistance coupling or varactors based on semantic analysis and time management.

A semantic memory may comprise semantic artifacts and be organized as a hierarchical structure resembling semantic models. The addressability, control, management and transfer may be based on semantics, semantic analysis, marking and semantic waves.

In some examples the semantic memory may be a DNA storage.

Semantic artifacts may be inferred and/or associated to DNA encoding/decoding, DNA storage, DNA chains and other DNA artifacts. Further, semantic artifacts may be inferred and/or be encoded in/as DNA chains, molecules and/or proteins. In some examples, the semantic artifacts are related with sequences of amino acids and/or sequence of a genes. In further examples, semantic inference (e.g. decaying, expiration) is associated with protein binding, protein lifespan and other protein associated processes. Protein complexes may be associated with semantic inference and analysis (e.g. protein semantic groups, formation/disaggregation semantic routes, semantic rules, time management, access control etc.).

Semantic orientation and/or route on the semantic memory cache may prove that matching semantic artifacts are not available or, the associated calculated cost is not acceptable or not matching a semantic budget. The memory cache is reinforced with semantic artifacts which are more likely to occur within that orientation context and the factors associated with selection indicators of those artifacts and their components are increased every time when they occur in similar contexts. Factors can be associated with drive semantic indicators which can used for orientation/routing to particular goals (e.g. based on higher level indicators). The selection indicators, contexts evaluations and routing may be evaluated based on absolute or relative semantic drift and orientation to drive semantics of the semantic routes, trails, shapes, views and view frames.

Analogously to semantic memory cache reinforcement the system may use semantic selection and marking within the semantic memory. As such the system may select/deselect and/or activate/deactivate semantic artifacts based on semantic analysis. In some examples this is based on semantic routing within the semantic memory.

Drive semantics inferred at higher levels influences inference and orientation at lower levels and vice-versa. This may occur via semantic gating between the hierarchical levels.

A semantic memory block may be associated with a theme or semantic and thus most if not all of the semantic artifacts related to that theme are memorized/cached there.

A semantic memory may be represented as a semantic network graph at logical and/or physical level (e.g. based on semantic hardware components) and the system performs routing and transitions including hierarchy transitions based on semantic analysis.

Semantic artifacts are grouped based on semantic analysis on multi domain contexts. Multi domain contexts comprise semantic analysis based on data received from multiple heterogenous sources of information and/or projected to different domains (e.g. sensing, cyber, network, user interface etc.).

Semantic orientation infers pattern of semantic artifacts potentially represented in a semantic network model. Thus, spatial shapes may be formed (e.g. composed) based on semantic orientation and/or semantic routing. Alternatively, or in addition, spatial shape patterns may determine semantic routes/trails based on the mapping of the points (e.g. locations) in the spatial shape to endpoints in a semantic network graph. The mapping may be determined based on inputs from users, location and presence information, sensing, multi-domain data and other relevant information.

The system may perform semantic drift analysis of these paths, shapes and patterns. As such, the system is able to represent shapes and trajectories or perform semantic inference on shapes and trajectories; the system is able to perform semantic comparison (e.g. semantic drift, drive semantic decaying, semantic collapse) of two or more shapes and trajectories and/or derive semantic sentiments of shapes, trajectories, comparisons and infers further semantics.

In an example, the system may determine the similarity between two shapes and/or if the two shapes are related. Further the system determines a semantic attribute of a shape and/or identifies a shape. In another example the system determines indicators between two shapes (e.g. risk, likelihood, risk to reward, risk to reward likelihood etc.). In a further example the system determines a complexity factor indicator between two shapes.

The shape comparison may comprise semantic orientation.

The semantic group comparison may be based on a drive or reference semantic or semantic group (e.g. represented as a semantic network model) where all the candidate semantic groups are compared against the drive semantic artifact based on semantic orientation, leadership and/or semantic drift. In similar ways with semantic group orientation the system may perform semantic route orientation. In some examples the semantic routes are represented as semantic groups.

The system may perform semantic orientation in/on semantic view frames in rapport with drive semantics, semantic routes and/or semantic shapes. The system may infer drive semantics that are compared with semantic routes and shapes (e.g. candidates).

In some examples when hierarchical semantic network models and views are used the system may route the semantic inference based on the drive semantic artifacts in the semantic view frames and on semantic orientation and gating (e.g. hierarchical gating). Such inference may take place in any embodiments whether the semantic network model is mapped to physical artifacts, virtual artifacts, picture/video frames, locations etc.

The drive semantics may decay during inference. Once the drive semantic is decayed the inference on that drive semantic may stop. In addition, if a conjugate or entangled semantic is associated with the decayed drive semantic then the drive inference may continue on the conjugate or entangled semantic artifact.

The system may use and/or infer conjugate semantic artifacts (e.g. semantic identities, groups, shapes etc.). Entangled semantic artifacts may determine an entangled composition artifact. Conjugate semantic artifacts factors of the same/similar/synonym indicators may decay completely when composed; also, a conjugate indicator may be inferred and/or used in further inference when one of its conjugates is highly or maximal negatively factorized. Conjugates may be related with antonyms, negations and/or conjugate variables in various domains (e.g. time-frequency, Doppler-range, position-momentum, voltage-electric charge, gravitational density—mass etc.).

Alternatively, or in addition, the drive semantic may be replaced by the next leader semantic artifact in a semantic group associated with the drive semantic artifact.

For a particular entity the semantics and semantic profiles can be associated to sensor data and patterns using semantic inference based on localization. For example, if we identify via radio frequency or optical means that an object is traveling between various endpoints, we can record the patterns of sensor data and associate semantics to links between endpoints. In an example the system is able to identify through semantic inference on localization data and a semantic network model that a person is climbing a stair, then we can extract various features, patterns and rules from the data reported from accelerometers, gyroscopes and magnetometers and use that data in future uses to identify or augment a semantic of CLIMBING. Further, the system may create semantic groups associated with CLIMBING for the person, endpoint, link and/or drive semantic artifacts. The system can learn and create additional semantic rules (e.g. time management rules) based on detected semantic groups, semantics, semantic intervals and so on. The semantic rule learning may comprise templates, models, semantic artifacts and drive semantics (e.g. CLIMBING related). In some examples once a rule is inferred the system may ask for feedback from a user or through semantic fluxes and adjust the rating and/or factors for such rules and potentially validate or invalidate it.

A semantic view is a snapshot in a semantic inference process which may be associated with inferred semantics and semantic model.

The system may decide that various semantic routes and/or shapes are not feasible at various times; however, if the system decide that a semantic route or link is feasible it may use the information related to the nodes in the route and possible current semantic view in order to initiate various actions, commands etc. In an example, direct sensing (e.g. from optical/RF receive/backscatter, camera/optical sensor/vision sensor) or semantic flux data can be used by a vehicle semantic unit to determine that a group of pedestrians are traversing the street at locations in front of the car. Based on various telematics, environmental, capabilities parameters and current view the unit issues actuation to braking, steering, suspension, electric system based on semantic budgets, semantic fluxes from other participants, semantic analysis. In an example, an actuation action is based on an access control rule comprising a semantic time interval with the system keeping a voltage or current value constant or changing based on factors, intervals and/or plans. Once the semantic time interval changes or expires another control rule may come into effect which may change and/or modulate the value further. Is it to be understood that the semantic rules, semantic interval, semantic timing, weighting, rating, factoring, budgeting and any other semantic rules may be combined in any way and may be specified as a combination of semantic artifacts, factors, quanta, etc. If a semantic route determined or is related with particular locations, then the system infers various lateral force semantics/factors/routes based on the potential trajectory. Alternatively, or in addition, the system may calculate the lateral forces based on the trajectory and activate only those semantic network model artifacts that are feasible and/or safe to follow. While performing those inferences the system takes in consideration the goals including driving goals where the area/locations/width are required to fit the dimensions of the portion of the vehicle requiring access at any given time. The vehicle itself and pedestrians may be mapped to a spatial semantic network model and as such the system may perform the guiding based on semantic routing, shaping, semantic model coupling, time management and any other semantic technique. The system may communicate and coordinate with a semantic group of vehicles (e.g. within an endpoint) and/or based on semantic orientation.

In some examples the semantic models may be mapped relatively to the location of the observer (e.g. car, sensor, person etc.) and georeferenced and synchronized based on additional coordinate determination (e.g. land-based positioning, satellite positioning, landmark etc.).

In general, a command may involve more than one actuation or sensor and hence the semantic model may encompass these interdependencies in semantic compositions, semantic rules, semantic routes, access control rules, semantic model, semantic factors and so forth.

In some examples the semantic is the command and the associated factors comprise and determining actuation values and/or indexing values. Further, the actuation parameters and/or values may be associated with indicators. In other examples the semantic is a composite specifying routes of actuation. In an example, the system may infer based on observations on the semantic field a PEDESTRIAN IN THE ROUTE (or PEDESTRIAN HAZARD) and subsequently selection of a link/trajectory/route that avoids the hazard potentially coupled with a semantic route of 1.0 EMMERGENCY|LEFT TURN|0.2 RISK ROLLOVER (possibly based on an available oriented link from the current location to the left and/or on unavailability of an oriented link on the right) and further routing to STEERING ACTUATE LEFT, ADJUST BRAKE ACTUATOR FRONT, SET BRAKE ACTUATOR REAR. Further the system uses factoring rules, time management, access control and the semantic network model to determine the factoring required for such commands (e.g. STEERING ACTUATE LEFT +1.1V, ACTUATOR FRONT BRAKE −2.2V, BRAKE ACTUATOR REAR 20 PSI or, in case where unit semantics/indicators are hidden or implicit STEERING ACTUATE LEFT 1.1, ACTUATOR FRONT BRAKE −2.2, BRAKE ACTUATOR REAR 20). The system may maintain all the available oriented links from the current locations and continuously update semantic routes that would allow the car to follow such oriented links and/or trajectories. In further examples, the system may factorize, eliminate and/or block from the models the links that are not feasible or pose a danger from the current location. In an example, the links that may be associated with a car rollover, possibly because they are not feasible for the car's turning abilities at a current speed and conditions, are marked or factorized as high risk, blocked, invalidated and/or eliminated from the model. While the example provided has been using a BRAKING assessment for achieving the allowed trajectory is to be understood that the system may have been using alternate or additional assessments such as ACCELERATE semantic artifacts.

In the previous example the system inferred an EMERGENCY indicator type of situation that might have used an EMERGENCY orientation routing and or template for handling the situation. In the case that the situation have not been deemed as HIGH EMERGENCY (e.g. instead of a pedestrian, a wooden box have been detected in front of the car), the system may have used a different route such as 0.2 HAZARD|0.3 LEFT SWERVE|AVOID ROLLOVER (or 0 RISK ROLLOVER), ADJUST BRAKE ACTUATOR FRONT +3, SET BRAKE ACTUATOR REAR+3. Alternatively, or in addition the system may provide indexing commands and factors such as INCREASE STEERING LEFT 0.1 EVERY 2 ms UNTIL HAZARD GONE, ACTUATOR FRONT BRAKE+3, ACTUATOR REAR BRAKE +3. The INCREASE STEERING LEFT 0.1 EVERY 2 ms UNTIL HAZARD GONE route could have been inferred based on a semantic goal inference such as AVOID BOX IF POSSIBLE (e.g. 0 RISK); thus the system infers the goals, drive semantics and routes as time management rules, potentially projected into the future or soon to be determined (e.g. UNTIL HAZARD GONE, UNTIL REACH 80 MPH, TO 80 MPH etc.). Thus, the system may generate semantic inference rules for projections based on routes, templates and continuously adjust their factors (e.g. based on indicators such as feasibility, risk etc.). Further the system may store, adjust, invalidate or expire such rules based on the current or projected factors and/or goals. In other examples the semantic is a composite specifying a semantic group and/or chain of actuation (e.g. ADJUST ACTUATOR VALVE OF BRAKES FRONT). In other examples the addressability is not present explicitly, case in which the system infers the address based on the registered, inferred and determined semantics.

A command may be associated with semantic budget rules comprising various actuation and sensor devices. Further, the commands may be associated with semantic factors, factor rules and plans (e.g. for indexing, linear/non-linear control, progressive/regressive control etc.). Commands may be exercised via semantics and factors.

Semantic commands may comprise semantics, factors and semantic routes, semantic budgets and/or semantic time management associated with those (e.g. PERFORM COVERAGE ANALYSIS UP TO DISK USAGE OF 50%); thus, the system infers the factors, budgets and/or limit semantic time management (e.g. DISK USAGE HIGHER THAN 50%) and associate them to the drive semantics and goals.

In some examples the system may infer drifts, biases or shifts to goals (e.g. applies negative decaying drift to limit semantic DISK USAGE HIGHER THAN 50% in order to maintain original goal of UP TO DISK USAGE OF 50%.

They may be reevaluated based on semantic inference. The semantic budgets may be composed. As such, when the system infers or transitions to one semantic based on other semantics then the transition time is taken into consideration in order to calculate the actuation parameters during the transition duration. Additionally, when a command or actuation occurs, the system may assess or measure its effects and receive feedback (e.g. through sensing devices, semantic fluxes etc.) thus associating the inferred semantics of the response with semantic artifacts that generated the command; in this way the system may learn and develop its semantic model through action, effect, reaction and learning.

In an example, based on cause effect, the system performs group dependent semantic grouping of any cause effect semantic artifacts and objects including semantics, goals, routes, groups, fluxes, objects, identities, factors etc. The objects may include detected objects or objects providing feedback through semantic fluxes.

A goal may be achieved or not; when is not achieved the system may adjust the semantic factors of the semantic drive route in comparison with semantics and detected semantic trails in the semantic view and potentially adjusts and/or form new semantic groups and rules.

In another example, a semantic goal and/or command may be associated with a rendering task where the system uses the goal and/or command to plot objects/features on a rendering environment and/or device. As such, a semantic goal and/or command may be specified in terms of PROVIDE INFORMATION with the goal to INFORM USER and the system uses the semantic model to infer the best semantic route and semantic profile for achieving that command and/or goal which may vary based on semantic views and/or view frames. In one context, the system may choose a semantic route which is associated with providing the results of semantic inference, semantic artifacts and the semantic factors on a display and/or dashboard style interface for example. Further the system may use semantic models inference, semantic routes and semantic profiles to organize, view and position the information on the display and/or dashboard. In another example, the system may use actuation to control devices and provide to the user the information that way.

Display or dashboard style interfaces may be generated based on semantic analysis and inference of semantic artifacts associated with symbols and/or semantics of symbols (e.g. graphical symbols). In some examples, dashboard and/or controls features may be mapped to a semantic network model and the system renders the semantic network model based on the display controller interface which may comprise a semantic unit. The semantic unit performs the rendering or display by issuing commands such as controlling display units (e.g. pixels) color, illumination, fading and so forth (e.g. via a voltage, current, optical signal, photon, laser, evanescent wave, polariton etc.).

Alternatively, or in addition, a semantic unit may be used to display dashboards and controls by ingesting and/or outputting semantic artifacts associated with tags, scripts (e.g. HTML), templates (e.g. XSLT) and/or programming languages.

The system may be able to use one or more semantic units and display in any format based on semantic inference. In an example, a semantic unit is used to render dashboards and/or other user interface controls via direct I/O and/or display surface control. In addition, it may output, overlay and/or display other surface controls based on any other protocols, formats and transformations some of which are explained within this application. It is to be understood that the display surface control may entail using display/graphics frameworks and/or programming interfaces, display/graphics drivers control, display/graphics devices control and/or other display/graphics capabilities; display/graphics capabilities may be related to semantic units, graphical processing units, display/graphics cards and/or components, field programable arrays, other display and/or graphics components and any combination thereof.

The display output may entail overlaying gated semantic network artifacts on the display surface.

The display, overlay and/or linking of the user interface artifacts may be based on inferred semantics and/or associated artifacts mapped to locations and/or areas on the rendering medium (e.g. display, memory, buffer, graphic interface etc.).

The semantic unit rendering semantics are determined via semantic analysis.

In other examples display areas, user interface controls and/or display components may be mapped to semantic view frames and/or views and the system uses semantic display plans to render those semantic view frames and/or views. The semantic display plans may be possibly based and/or using semantic artifacts in the view frame/view and, the current goals, indicators and/or budgets associated with such view frames/views.

In further examples, the system maps semantic network artifacts (e.g. endpoints and/or semantic groups) to areas on the screen comprising display interface controls (e.g. text areas, labels, textboxes, listboxes etc.) and uses semantic fluxes and semantic gating to transfer information between endpoints (e.g. from a source to a destination) and thus between mapped controls. The system may use semantic time management and semantic analysis including semantic routing to enable or activate the transfer of information between linked endpoints and to issue commands once the transfer is completed. The commands may be based on semantics, semantic routes, semantic rules and further semantic analysis associated with an endpoint mapped to a user interface control (e.g. "COMMIT" link, button, auto-commit field etc.). In one example, the system comprises a semantic trail/route of SERVICE FIELDS TRANSFER COMPLETED, COMMIT SERVICE REPORT and thus the system may use the COMMIT SERVICE REPORT semantic to identify an endpoint mapped to a commit button and/or the action to be executed (e.g. virtual click, send event, click, submit, reset, clear etc.). Alternatively, or in addition, the system identifies the display controls based on frame location mapping and associates identification based on composition in context and/or route (e.g. JOHN DOE SERVICE REPORT FORM FOR JOHN UNDOE COMMIT BUTTON and/or ACTOR, JOHN DOE, SERVICE REPORT FORM, FOR JOHN UNDOE, COMMIT BUTTON; SERVICE REPORT FORM DEFECT DIAGNOSTIC DESCRIPTION CONTROL and/or SERVICE REPORT FORM, DEFECT DIAGNOSTIC TEXT BOX and/or SERVICE REPORT FORM, DEFECT DIAGNOSTIC, TEXT CONTROL etc.). The system may consider the contextual semantic identification and/or groupings (e.g. of JOHN DOE, dependent and independent semantic groups of artifacts, categories etc.) and/or semantic access rules and profiles thereof to gate, allow or block the flow of information, commands, inputs and/or control. Further, the system may generate semantic model artifacts, semantic groups and semantic routes for the identified display controls and infer the linking of such artifacts and associated semantic rules; such inferences may be overlaid on a display and further validated based on a user feedback. It is to be understood that the system may use I/O interfaces (e.g. display, touch, mouse, graphic cards, buses, sensors, actuators etc.), operating system interfaces, software and/or hardware interfaces, development kits, calls, events, memory, buffers, registers and/or combination thereof to perform detection, inferences and control. Alternatively, or in addition the system may use images, frames and/or videos whether captured from a display, on a memory/storage and/or streamed. In further examples, because the (entanglement) entropy, divergence and/or access control between artifacts associated with semantic profiles and/or identities such as JOHN DOE and JOHN UNDOE is elevated and/or the diffusion is low the system may infer a disablement status and/or gradual (e.g. based on time management, resonance-decoherence operating interval, hysteresis etc.) activation and/or rendering for the COMMIT related artifacts (e.g. selected based on (low) entropy, divergence, access, drift etc.) in the route and/or at an endpoint.

As mentioned, the system understands the context of operation based on semantic models. We exemplified that the system is able to infer the semantic identification in context (e.g. SALES_NUMBER field of JOHN SERVICE REPORT form or window as captured from displays).

The system controls the access to various endpoints, areas and user interface artifacts based on semantic access control.

The system learns semantic trails and routes and further infer and factorize other semantic trails and routes based on semantic analysis (e.g. the system has a route for JOHN DOE accessing service reports and thus further infer other routes for JOHN DOE related with servicing and related artifacts). Further, the system may understand and complement the identification and actions from context (e.g. automatically asking, suggesting and/or pursuing actions, commits, transfers etc.).

Display controls and/or linking thereof may be associated with semantics, rules, gating, semantic routes and/or further semantic artifacts. In some examples, such association and/or links may be specified and/or inferred based on inputs from a user. It is to be understood that the linking of display controls may be associated to data sources, display artifacts/components, sensing and semantic groups thereof; further, the linking may be between at least two display controls and semantic groups thereof.

In some examples, the system has or infer rendered or display objects (e.g. a RED CAR, a MEDICAL CHART etc.) as semantic groups and/or semantic artifacts; as the system detects for example a pointing device and/or touch sensing in an area associated with object's artifacts it may select the whole semantic groups and suggest semantics based on projection and goal based semantic inference (e.g. MOVE TO RIGHT, CHANGE COLOR, OVERLAY EKG etc.). Alternatively, or in addition to pointing and/or touch sensing the system may use other modalities for identification sensing of the rendered or display objects (e.g. RED CAR and/or LICENSE PLATE 0945 by voice, electromagnetic sensing identification etc.).

The system may use access control and/or further rules at a location and/or endpoint to implement time management automation and/or gate particular semantic artifacts and/or profiles. In an example, a semantic profile of NURSE IN CURRENT SHIFT is assigned in a (facility) (display) area associated with MEDICATION WAREHOUSE a semantic route of SELECT MEDICATION, ENTER MOTIVE, (ALLOW DISPENSE), (DISPENSE ALLOWED) however, for a semantic profile of NURSE IN EMERGENCY the MEDICATION WAREHOUSE (area) may be associated with a more general, less restrictive route of SELECT MEDICATION, (ALLOW DISPENSE), (DISPENSE ALLOWED). It is understood that the semantic SELECT MEDICATION, (ENTER) MOTIVE may be associated with user interface controls and/or fluxes associated and/or inferred for such semantics (e.g. SELECT MEDICATION may be associated with a DRUG combo-box (e.g. based on low entropy and/or drift) and/or flux while (ENTER) MOTIVE may be associated with a DISEASE (e.g. based on a low entropy in rapport with a composite MEDICATION MOTIVE) text field, combo-box and/or flux). In further examples, the system may deny certain operations in a route (e.g. MOUSE CLICK, MOVE RIGHT TO FIELD AREA may be automated and/or allowed for some profiles while (MOVE RIGHT) (TO FIELD AREA) may be denied for some profiles).

In some examples, the display rendering may be partitioned between various semantic groups and hierarchies and as such particular semantics and/or rendered objects may have particular zones that need to be rendered and/or displayed into. Thus, the system may perform for example resizing (e.g. RESIZE SMALLER), zoom in (e.g. ZOOM IN A LITTLE) and/or zoom out by further mapping objects and/or artifacts to larger or smaller semantic groups and/or higher and/or lower hierarchical levels based on semantic factors and/or indexing factors inferred using semantic analysis.

In further examples, user interface controls which are associated and/or linked each to a semantic flux and/or group of semantic fluxes are rendered on a display surface. The user interface controls may display for example gated semantics and/or graphics artifacts associated with the gated semantics. The user interface controls may be arranged in a hierarchical structure with at least one user interface control comprising at least one other user interface control (e.g. a flux display button control comprises another flux display button control, a display button flux control comprises another display button flux control etc.). Thus, the semantic inference, rendering, display and control may diffuse and/or propagate based on the displayed and/or rendered semantic hierarchy, layers and/or overlays (e.g. a composite flux/control diffuses and/or propagates to composition fluxes/controls, a composition flux/control diffuses and/or propagates to a composite flux/control and so on).

The hierarchy can be displayed by specifying semantic routes to be followed when selecting through the stacked user interface and/or graphics artifacts. It is to be understood that the selection can be achieved by modulating the semantic identities of the stacked artifacts including their semantics onto a semantic wave and applying composition with the pursued semantic route and/or search.

The semantics may represent commands and parameters and the semantic factors may be used to proportionally adjust the signal commands and parameters.

The system may infer action semantics based on semantic analysis including orientation.

In various situations the system may assess various drive semantics and semantic routes. The drive semantics and/or semantic routes may be assessed based on their applicability in relation with the current goal and/or projected semantic view and/or view frames. The projected semantic view/view frame may be based on what-if and/or speculative inference and may be coupled with semantic orientation. The applicability may be established based on sensing data, ratings, budgets, costs, response time, semantic scene, semantic view, semantic factors, semantic orientation etc. Usually once a drive semantic and/or semantic route is chosen as applicable the system may group the semantic route with the context in which was applied and with the resulting action, reaction, effect, result and/or view which may be associated or represented as semantic artifacts.

The applicability of particular drive semantics and semantic routes may be assessed based on a semantic drift and semantic orientation between semantic artifacts. The drift may be calculated as semantic distances between semantic artifacts (e.g. component semantics, trail and route, semantic groups etc.) wherein the distance takes into account semantic orientation, semantic analysis, semantic timing, location, access and/or other factors.

A semantic orientation distance is calculated based on a semantic drift which signify the difference between the drive semantic, semantic goal and/or projected semantics (e.g. projected semantic view) and the semantics of the semantic view. The goals may be associated with semantic artifacts (assignable or not assignable to objects), factors and/or budgets.

Further, the semantic orientation drift is based on overlaying and/or inferring drift model artifacts and sub-models on the trajectories to be compared. In general, when referring to semantic artifacts and semantic analysis on such artifacts is to be understood that they may be associated with semantic factors and/or semantic budgets.

Sometimes the system doesn't infer the drift and/or orientation based on little known signals/data or low factor semantics; thus, the system calculates the drift only based on higher factorization data, semantics and leadership. The lower factor semantics and/or unknown signals/data/patterns may be associated with semantics within the hierarchical chain in the semantic view and maybe with the semantic sequencing; as such, the system may create inference rules including time management rules associated with the unknown signals/data. The engine assigns semantics associated with inputs and signal noise whether discrete or analog. Further, when the system encounters the signal/data/patterns in other conditions it may reinforce, change or learn semantic rules based on the semantic chain development. The system may use semantic rules templates based on semantics, semantic groups, semantic routes, semantic shapes, semantic orientation, semantic factors, semantic rules and any other semantic artifacts in order to generate new semantic rules. Further, the system may infer new rules without a previous template. In an example the system uses the semantic network model to infer and learn semantics, groupings and relationships between them. Further, the system may learn semantic rules and groupings based on interactions, inferred semantics, semantic views, view frames potentially associated with goals, drive semantics and/or routes. Additionally, the system learns routes, rules and/or templates based on semantic orientation in semantic views and view frames when the semantic orientation doesn't match inferred and/or projected semantic routes, view frames and/or views. As such, the system determines semantic routes, semantic time intervals, groupings and semantic rules based on the semantics with high semantic drift from semantic trails and routes and further based on high factorization and leadership status.

It is understood that a semantic route may be collapsible to a composite semantic and/or drive semantic. Further a semantic route may be collapsible to other semantic artifacts (e.g. an endpoint or semantic group comprising the semantics in the semantic route. The collapse may be based on factorization, decaying or leadership of the semantics in the route or based on the route. Thus, the semantic collapse may be used by the system for semantic learning wherein new semantic artifacts are formed, in a potential hierarchical, access controlled and/or gated manner.

Semantic drift may be associated with factors calculated based on semantic routing between the drifted semantics and the semantics in a semantic route. Semantic artifacts associated with higher hierarchical levels, concepts and/or themes are grouped together in the semantic network model. Thus, the routing and the calculation of factors (e.g. cost, risk or other indicators) between such clusters and/or hierarchies may allow for semantic drift and orientation inference.

Semantic views/view frames change based on semantic inference. A semantic view/view frame comprises a plurality of semantic inferred artifacts potentially organized in semantic hierarchical and/or recursive structures (e.g. semantic network model). Semantic views/view frames may be organized as, and/or be part of semantic hierarchical structures and memory.

I some cases, the semantic inference on the lower levels in a semantic hierarchy structure is more dynamic than higher levels. The higher levels may be associated with more generalized information and/or transfer knowledge. The access between levels of the hierarchy may be controlled via access control rules and semantic gates; in addition, the link between hierarchies may be achieved through semantic flux/stream.

A semantic view changes based on ingested data or stimuli. Additionally, the semantic system may use time management rules to initiate changes to the semantic view. Further, a semantic view of a higher level in the network semantic model may change based on semantic inference from lower levels. The semantic view changes may be associated with tuning, switching, enabling, disabling the sensing elements so that the system can use new sensorial data to identify and map the semantic scenes. In a cyber system the ingested data may be data being exchanged between points, metadata detected through deep packet inspection, data related to code execution, protocol sniffers and/or connections between components/systems; further, the data may be based on vulnerabilities ingestion from various sources. Alternatively, or in addition, the data is ingested from sensors instrumented/embedded into the networking hardware/software, computing hardware/software or any other hardware/software entity. Further, graphics may be mapped, ingested and/or represented in the form of meaning representation (e.g. semantic network graph). The graphics may be mapped to the semantic network model and/or mesh based on location, features, sensor elements and other techniques explained throughout the application.

The semantic view at particular hierarchical levels doesn't necessarily change. For example, if the semantics and/or semantic groups remains the same at a particular level then the semantic view doesn't change. Semantic views/view frames may comprise multiple views/view frames.

In an automotive application, as a car travels the semantic unit performs semantic analysis and semantic processing.

The semantic route selection is dependent on the semantic scenes as detected by the sensors, semantic sensor attributes/capabilities, semantic flux/stream data or any other multi-domain data; as the car moves, the semantic routes are considered by the system for inference and/or action.

The semantic trails and/or routes can be organized in semantic route groups wherein groups of semantic trails and/or routes are coupled, rated and factorized/weighted together; the sematic route groups may be also connected via semantic trails and/or routes and so forth. As such the depth of the semantic route hierarchy can grow as the semantic system evolves. The semantic trails, routes and semantic route groups are associated or represented with semantic artifacts (e.g. associated with semantics) and may be mapped to a semantic network model or sub-model.

Since the semantic routes may be assigned to semantic artifacts (i.e. model semantics, semantic groups etc.) they may be represented as artifacts in a semantic network graph. Alternatively, or in addition, they may be used for routing within the network graph by comparing (e.g. drift) the semantics in the semantic route with the semantic artifacts associated with the graph elements.

One method of operation for a semantic system is one in which the semantic system may develop semantic views and/or semantic view frames using various semantic routes which in turn may trigger composition, and further routing. The system uses semantic orientation, semantic projection and semantic drift analysis to determine and/or infer semantic routes and semantic shapes.

The semantic routes can have semantic factors associated with them; the factors may be dependent and/or calculated based on context and are used in selecting the semantic routes to be followed in particular situations. Further, semantic orientation may be used to select routes based on a semantic drift in relation with other semantic artifacts, routes and/or trails; further, the system may organize such routes and trails in semantic groups or select the routes based on semantic groups inference and/or leadership.

The semantic artifacts including the semantic routes are associated and can be identified via at least one semantic (e.g. name, semantic construct, group semantic etc.).

The semantic factors can be semantic rule and semantic time dependent. Thus, the factors may be based on inferred semantics and/or time management rules which may contain semantic time intervals.

The factors of the semantic routes may decay with time; thus, the semantic routes can decay; in general, the semantic analysis and rules apply to semantic routes and their associated semantic artifacts.

In some examples semantic routes can comprise themselves and/or other similar and/or related routes in a potential recursive manner. The similar and/or related routes may be based on similarity based on semantic orientation and semantic drift for example.

The system may use goal-based inference in which it determines the feasibility of various semantics and semantic routes based on targeted goals. For example, a post semantic system determines that another post is or will be in its path; the post system performs goal-based inference and finds out which are the feasible semantic routes within budgets from the current semantic view to the projected semantic view. The system may find multiple routes and potentially select them in the semantic memory or cache. The system may select and/or mark one route over the other based on semantic orientation, semantic budgets, costs, rewards or any other combination of factors. In an example, the semantic engine determines that a semantic route exceeds a semantic budget and has high costs/risk while has little rewards (e.g. based on ratings/weights/sentiment/decaying) in the projected semantic view and thus it doesn't pursue the semantic route. Further, the system may not pursue the semantic route because is associated with a deny or block access control rule; the access control rule may be associated with the route itself and with a semantic artifact in a route. The system may assess the potential occurrence and timing of the block access control rule when factorizing (e.g. weighting) or selecting the route. The system selects and deselects the semantic artifacts in memory based on semantic analysis. The semantic time management and access control is used in the selection/deselection process and influence the semantic routing within the memory.

The routes may be assessed based on hierarchy where a route at one level determine a route at a lower level and the system may mark, select and/or bring all those routes or only a selection in the memory/cache.

The system may activate and/or cache semantic artifacts, semantic routes and groups based on endpoint presence, location, semantic models and semantic orientation. In an example, the system knows that within the CONFERENCE room there is a TV SET, PROJECTOR, PROJECTOR SCREEN, CONFERENCE TABLE etc. and thus it activates such routes and groups. Further, if the system identifies the particular CONFERENCE room and have a previous semantic model and/or hierarchy for the room which may be activated/selected/cached, it may know the expected locations and appearances of such components such as TV SET, PROJECTOR, PROJECTOR SCREEN, CONFERENCE TABLE and so on based potentially on semantic orientation and further semantic analysis. It is to be understood that such expectations may be corroborated and/or based on sensing at the particular locations (e.g. by vision, touch, sound, vibration, temperature etc.).

The system recognizes objects based on memory renderings of semantic shapings (e.g. projected, activated, selected etc.). In a further example the system stores for a particular CONFERENCE ROOM or particular type CONFERENCE ROOM a TV SET comprising a BLACK TRIM, GRAY SCREEN, LUMINESCENCE REFLECTION and as such the system performs a composite memory rendering of the TV SET based on such routes and drive semantics. The memory rendering is composed based on semantic models and it may further be integrated at higher levels with the mapping of the TV SET in the CONFERENCE ROOM on previously stored location based semantic models or templates (e.g. higher-level semantic model and routes; and/or template for CONFERENCE ROOM layout).

As mentioned, in some examples, templates may be stored by the system at higher levels of semantic model hierarchy. In further examples the templates are based also on semantic rules, routes and/or semantic groups; additionally, such artifacts may be modeled in the semantic model (e.g. semantic groups may be modeled with endpoints representing group elements and links representing the relationship and/or causality; the hierarchy of the semantic groups may also be modeled via hierarchical semantic models).

The system may overlay semantic model templates on active and/or selected semantic models and draw inferences based on semantic analysis.

In an example, the system may infer that a CONFERENCE ROOM is ATYPICAL since it incorporates MONOCHROME DISPLAY. However, the ATYPICAL inference might be less strongly factorized if the CONFERENCE ROOM is within a HOSPITAL environment and the MONOCHROME DISPLAY is used to display X RAY EXAM. Thus, the system may create a semantic route and/or group for HOSPITAL, CONFERENCE ROOM, MONOCHROME DISPLAY with the MONOCHROME DISPLAY being less factorized and as such lacking leadership skills in inferences.

A selection may be based on current inferred semantics in a semantic view or semantic view frame, potentially at scene hierarchical or profile level. Further, a selection is augmented with semantics in the projected semantic view and potentially semantics inferred based on semantic orientation and drift inference between the views. In an example, a projected semantic view is based on what-if or speculative type inference. In other examples, a projected semantic view is augmented with the goal-based semantics.

In some examples the system may use a plurality of projected semantic views and potentially inferring semantic drifts between them. The system may use the semantic drifts for semantic route selection and adjustment; further, the system may use those techniques in comparison with current semantic routes, drive semantics, view frames and views.

When the engine selects a semantic route, it may determine semantic budgets and pursue the semantic development between the current semantic view and the goal or projected semantic view, potentially adjusting the semantic route and budgets and applying the actions of the semantic inference until a budget is spent.

During the inference towards the goal semantic view it may associate, reinforce and/or decay association grouping between pursued semantic trails, routes, drive semantics and the current semantic view or the difference between the semantic views (e.g. via semantic orientation, drift, projection, composition). A semantic view itself may be associated and/or represented via semantic artifacts and the association with other semantic artifacts may be represented as other semantic artifacts (e.g. semantic group).

In the previous example, the semantic system may infer a projected semantic of "CAR CRASH" involving a car in its path. Further, the system may detect the type of the car as being part of a category or part of a semantic group. As such, the semantic model may contain different avoidance rules based on the type of object or semantic group; further in the examples, the system performs goal-based inference with a goal of reducing impact on the driver side and thus the system applies the semantic automation in a way that will achieve that goal. In the first instance it may infer an approximate semantic route and continuously adjust it based on semantic inference, semantic orientation, semantic drift and semantic factor indexing.

The system may use semantic factors or principles of operation (e.g. high level rules, routes and/or drive semantics) in order to decide the best semantic routes, locations, paths, actions, actuations etc.; for example, one of the principle might consist in "not harming pedestrians" and hence in the case that the driving unit projects that is nearly impossible to respect that principle by using the current semantic view comprising a high level semantic of drive semantic "follow the lane" it may look at various semantic routes that will respect that principle and/or strategy. If there is no such feasible option then the system may use a semantic principle and projection at a higher hierarchical level, for example "minimizing the victims" or "keep the driver safe" and perform the semantic analysis and routing accordingly.

Additionally, in a case of an accident the whole semantic model can be preserved, and the semantic trails of the unit decisions can be recorded for further assessment of the happenings, liability etc.

Adaptability is an important aspect of a semantic system. In general, a semantic model enables adaptable systems due to its dynamic learning nature; the semantic model can be refreshed and adapted in real time or near real time to various conditions.

Sometimes the system may need to maintain the real time status of semantics artifacts (e.g. groups of semantics) and as such the system updates the factors of those semantics based on time and semantic analysis. In an example, the system maintains indications for validity of semantics (e.g. SAFE TO DRIVE) and the system may assess the semantic factor based on sensing and/or inference from semantic fluxes related with weather, road safety etc. In another example the SAFE TO DRIVE indications are associated with a car/truck and/or a group of cars/trucks and the system maintains indications based on additional information related to ingested data relating to tire condition, consumable condition, servicing needs, schedules, the semantic time management for replacing those parts and others etc. In an example, when SAFE_TO_DRIVE decays to a certain level then the system may perform various actions such impeding the members of the group (e.g. trucks) to leave facility, send alarms, interact with IT and computing systems or any other action.

Sometimes, the semantic system may need to determine semantic groups for achieving a particular mission or operation. The operations and missions are location, capabilities and time sensitive and as such a semantic inference engine will be very capable on determining the optimum artifacts to pursue the desired outcome. The system may run goal-based simulations and projections and the semantic routes may then be used to detail the operational plan including the usage of assets and the most important attributes in various phases of the operation. If the operation doesn't perform as expected (e.g. predicted semantic drifts and/or budgets from the selected and/or projected semantic routes and views is large) the semantic system will be able to adapt and compute new operational plan and semantic groups based on the current inputs.

In the cases of autonomous vehicles, it is important that they efficiently communicate based on semantic groupings of artifacts (e.g. vehicles, features etc.) and as such the semantic system considers the semantic fluxes activations and/or inputs based on those semantic groupings which are potentially based on location clustering and/or mapped to a hierarchy in the semantic network model. The semantic flux coupling and activation may be based on semantic inference based on semantic routing which determine the soon to be travelled locations and/or other semantic factors.

Gated and/or published semantic artifacts may be made available, enabled and/or disabled in an access-controlled manner based on the authentication of the fluxes and access control profiles. In an example, display controls and/or semantic groups thereof are displayed and controlled in such manner.

The simulation may entail inference on target indicators goals and budgets; a semantic view may be restored to a previous semantic time. Alternatively, or in addition, the system uses semantic orientation between a projected semantic view and the current semantic view to determine drifts and apply those to determine and/or update the current semantic view.

Various techniques can be implemented in order to achieve adaptability and orientability. Such techniques may include but are not limited to any semantic analysis techniques including semantic shift, drift, orientation, entailment, synonymy, antonymy, hypernymy, hyponymy, meronymy, holonomy. Those techniques are in general associated with semantic artifacts and semantic models including semantic attributes, semantic groups, semantic routes, semantic rules, endpoints, links and others.

As explained before, semantic interconnection and semantic model distribution enables semantic systems interoperability while extending semantic coverage and semantic field interpretation.

Semantic interconnection may consist in semantic fluxes which convey semantics between entities. For example, in a connected supply chain environment, a retail store may be connected to a supplier semantic flux and ingest a semantic of "SHIPPED VIA GROUND SERVICE" for a particular item or a category of items; the internal model of the retailer may include a semantic rule that infers a semantic of "WAITING ARRIVAL" for the item/items which may have been coupled with an action (e.g. issuing a command to an IO controller, electro-optical component, sensor, analog and digital artifact, actuator, raising an alert, issuing an order to a software component, service or any combination of those); further, a REPLENISHMENT STATUS may be inferred and a semantic factor preserved to show that status (e.g. based on an indicator such a risk associated with the supply chain route and/or other inference routes based on seasonal demand, item demand, sales etc.). The semantic factor may be adjusted in time (e.g. based on the progression through the supply/semantic chain and/or decaying) and may be associated with a value in a graph, chart, diagram, dashboard or any other graphical interface and/or virtual environment; additionally, the "WAITING ARRIVAL" semantic may be coupled with a budgeting and/or time modeling rule (e.g. time management rule); for example such a rule can specify that the WAITING ARRIVAL has a budget of 100 cost units and/or that the "WAITING ARRIVAL" semantic is valid for 5 days since has been shipped (e.g. SHIPPED+5 DAYS—which represent the time it takes for the ground service to deliver the merchandise). Alternatively, or in addition, semantic artifacts may have associated a risk and/or success indicator that can be potentially calculated based on the risk or success of a negative or complementary semantic such as NON-ARRIVAL or MISSED DELIVERY. In some examples the risk and/or success indicator is based on semantic time management wherein the risk factor and success factor change based on the semantics that are inferred in a semantic view frame; in further examples, the semantic view frame is associated with factors for goals and/or negative/complementary goals and performs inference on the factors in the semantic view frame. Such factors and/or goals may be semantic time bound such as the −2 WAITING ARRIVAL, STOP WAITING ARRIVAL, 10 NON-ARRIVAL and/or HIGH PROBABILITY OF NON-ARRIVAL semantic is inferred based on a circumstance semantic (e.g. DELIVERY AIRPORT BLOCKED) and the semantic view frame expires due to the timing goals not being achieved.

The internal semantics may be coupled with other internal or semantic fluxes semantics for composite inferences. Alternatively, a semantic from a semantic flux may have been directly coupled with an action; in general, a semantic flux semantic is directly coupled to a critical action or command only when the level of trust of the external source and the semantic determination by that source is high. The level of trust can be based on various factors including authentication, encryption, sequencing, timing, location, semantics and/or factors. The level of trust is used for example to identify and/or factorize potential "too good to be true" gated/published semantics, semantic factors and/or budgets.

In the above example the time modeling represents an important aspect of semantic determinations and interoperability. For example, if the item/items wouldn't have arrived in 5 days after SHIPPED then the system may have used semantic composition and expiration to infer for example "MISSED DELIVERY" instead of "RECEIVED" in the case of on time receive. Additionally, a rule could have been in place to send a "NON-DELIVERED" semantic to the supplier for the item/items in question which in turn may have been used in the internal model of the supplier to infer semantics and take actions. Additionally, the retailer may have been sharing the "MISSED DELIVERY" semantics, groups and indicators to a third party arbitrator, broker or ratings service that could use the semantic in its internal model to take actions, infer semantics, assign ratings and so forth; as such, the semantic flux of the supplier and/or logistic provider can be rated, weighted or factorized based on semantic determination; further, the non-achievement of the goal (e.g. on time regular delivery, time management inference etc.) may trigger asking, challenging and/or registering the conditions and/or reasons of the non-achievement (e.g. DELAY BY RECEIVER, FOG etc.).

The supplier and retailer may agree on a semantic model and/or view that is used for interaction, gating, semantic analysis between their systems via semantic fluxes. The semantic model view then can be shared and transferred between all the stakeholders including the arbitrator, broker, logistic provider, supplier, receiver and such.

The semantic model distribution and fusion can consist in semantic model replication, semantic themes model exchange, semantic view and/or view frame exchange, semantic hierarchy and other techniques and architectures. In an example, a particular hierarchy of a semantic model and/or view is exchanged.

The semantic exchange can involve a private or public infrastructure, cloud and may be based on semantic fluxes and gating etc.

The semantic exchange may be realized also via point to point, point to multipoint communication or broadcast (e.g. based on semantic groups). The authentication or validations of exchanges may be based on a semantic analysis on semantic groups in the semantic network (e.g. risk and/or semantic factor inference initiated for a semantic group of fluxes). In addition, this may be coupled with semantic analysis in semantic trails and semantic routes which may determine grouping and/or routing between fluxes.

Semantic systems may exchange semantic models, views, themes and such. For example, those exchanges may be required to align the semantic systems to certain regulations or laws, to allow the synchronization and interoperability between systems, to enable real time collaboration, to improve and expand the semantic inference, to expand the semantic coverage and other circumstances.

In real time environments semantic artifacts exchange may include expiration times assigned to the artifacts being exchanged. Also, the artifacts being exchanged may include a priority, cost, rating and/or any other semantic factor which is associated by the transmitting party in order to inform the receiving party of the semantic field assessment of the collaborative system. Also, the exchanges may include time models or time rules.

For example, in a drone environment, drone A operating in adverse environmental conditions may determine that is low on energy and wants to land in a shared environment. Because it may lack capabilities of sensing the full environment in those conditions it may be helped by drone B which just performed a landing and has more sensing and/or semantic capabilities. As such, drone B may transfer to the drone A semantic sub-model (e.g. semantic view, semantic view frame at hierarchical level with the semantics and related semantic rules, routes, drive semantics and/or operational commands required for a goal of safe landing. However, because the environment may be highly unpredictable and contested the semantic sub-model may contain expiration times and/or decaying rules (e.g. semantic factor, semantic time etc.) which are inferred by the transmitting or receiving party and represent the safe operation for the sematic artifacts and/or goals; the safe operation may be associated with an indicator for example. The drone A it may not use the semantic artifact if its expiration time has passed or is about to pass. Additionally, the drone B may transmit more than one semantic sub-model, each having assigned factors/ratings to the associated semantic artifacts. The receiving party may use the factors/ratings and decaying in order to assess the best semantic routes potentially based on semantic budgets. Further, drone A might use the receiving artifacts and plug them in and fusion with its own capabilities (e.g. semantic network model, semantic rules, semantic routes). In an example the system uses factors associated with received artifacts and integrate them with its own artifacts. In some examples, the fusion based factors may be based on various factor plans that extend to semantic artifacts.

The operational semantic models, views, semantics and such may be selected and/or cached. When an expiration occurs, the expired semantic artifacts may be deselected and/or pruned. In similar ways, as the system manages the semantic artifacts it may also manage the received and/or plugged in semantic artifacts.

The semantic system may be on a private or public cloud that may be part or coupled to a brokerage provider or other services.

The semantic exchange service provides visual or other interfaces which allow the parties to configure the information exchange and may also display the factors associated with various semantics, semantic fluxes, providers, other semantic artifacts etc. It may use semantic inference to suggest various semantic workflows, providers, brokers etc. As explained in this application other interfaces may be inferred and/or coupled with the semantic artifacts and be available on such portals (e.g. UI controls, display controllers, feedback actuating elements/devices etc.). In some examples these interfaces are selected based on semantic inference. In further examples those interfaces may be based on user selections and/or profiles.

In an example, the system infers a semantic of ENDPOINT6 WARM BLANKET EFFECT which entails a semantic route ENDPOINT6 WARM COLOR FADING IN 2 SEC and further of PIXELS ENDPOINT5 TO ENDPOINT4 RED 10 GREEN 56 BLUE 99 BRIGHTNESS 5 FADING 8 IN 2 SEC which may translate in a semantic route of GROUP VOLTAGE (OR CURRENT) LED5 LED4 3.8 mV FACTOR 1 and GROUP VOLTAGE (OR CURRENT) LED3 LED2 3 mV FACTOR −2. Thus, such commands may be applied to any type of display surface and elements (e.g. LED, OLED etc.) mapped to semantic models.

A user may identify a trusted pool of providers and the system will switch between them based on semantic factors including ratings, costs, risks etc. Further the system may use semantic analysis for switching between providers (e.g. based on registered capabilities and/or semantic flux/gating).

Once is configured, inferred and/or learned on the semantic exchange cloud the semantic exchange model is transmitted to the parties and their semantic models and semantic fluxes configured accordingly.

Any party can charge a fee for providing or allowing semantic interconnection services. As such, the fees may be charged on particular semantics, semantic views, semantic fluxes, number of semantic artifacts and any combination thereof. Further, the fees may be based on achieving goals, factors, drive or leader semantics, budgets and any other semantic flux/gating and analysis techniques.

Any semantic exchange service or brokerage may adjust the quota for each provider based on factors, semantics, semantic factors, decaying and so on.

The scope of a semantic model is to properly and confidently represent the modeled environment in order to infer semantics in an accurate manner according with the modeled principles.

While big data analytics uses a data lake and large processing of data for intelligence gathering, a semantic system uses the semantic model that is improved over time in order to process real time or just in time data.

Semantic engines may be used to perform semantic analysis and augmentation on big data lakes. Thus, the system performs semantic analysis on the data from the big data lakes. The big data lakes may include databases, files, clouds and any other big data storage and processing entity. The system may use timestamps associated with data in the big data lakes for performing semantic time management analysis.

In further examples, the system uses time-based series of images and/or frame processing for inferring past, current and/or projected views. In some cases, the image and frame artifacts are associated with inferred semantic artifacts, grouped and/or further analyzed based on semantic analysis. The system may sort, ingest and/or output images, frames and/or renderings based on semantic time. In some examples, the system overlays semantic augmentation (e.g. semantic models and/or text) on images and/or frames based on semantic time.

In cases where there is an increased superposition between semantic (frame) view projections and the confusion factor is elevated the system may use safety and/or recovery routes and/or fluxes.

In some cases (e.g. the budgets and/or spreads are low etc.), the system may factorize more the artifacts related to leaders having most popularity (e.g. measured based on the number and/or size of semantic groups, routes, links and/or further semantic artifacts they belong to). It is to be understood that the system may infer and/or store popularity indicators and/or factors.

The popularity and/or leadership of a particular artifact may increase as it induces (affirmative) coherency and/or resonance within (related) semantic groups.

The semantic model can be improved through further modeling and/or with the semantic knowledge that it generates.

The model accuracy is of significant importance in both advanced analytics for large data sets and real time applications where the execution of tasks requires accurate just in time decision making.

In one example, a semantic model is generated into a data center into the cloud and then transferred to the semantic models of other devices closer to the edge of the network such as gateways, sensors and controllers. The semantic model may be selectively transferred to the devices based on the semantics and semantic rules that are valid at each gateway or controller. In one example, the semantic model is distributed into the network between gateways and the gateways select only the semantic model artifacts or views that are related to their semantic capabilities. In an example, the gateways may accept only the semantic artifacts or views related to the registered high factorized or marked semantics (e.g. of their sensors, sub-gateways or managed entities). Sometimes those registered high factorized and marked semantics reflect the capabilities of semantic groups or a hierarchical semantic topology structure. As such, the semantic infrastructure reflects the hierarchical, compositional and semantic grouping (clustering) nature of the semantic inference and semantic view.

In other examples the system couple semantic sub-models based on semantics and semantic groups. As such, two subsystems may select and/or exchange endpoints, group of endpoints, and/or sub-models based on their associated semantic artifacts. Further, the subsystems may select and/or exchanged sub-models based on semantic identification, semantic marking, semantic orientation and semantic shaping. Alternatively, or in addition, semantic gating is used for gating semantic model exchanges.

In one example, the system selects or is instructed (e.g. by a user) to select leader indicators for which the smoothing and biasing indicators and/or semantic artifacts in a semantic groups of semantic units and/or memories should take place. In an example, the system determines value ranges of factors and indicators as goals, semantic intervals and/or drive semantics.

In an example of defensive behavior and/or driving, the system uses dissatisfaction, concern, stress and/or fear factors associated with zones and/or endpoints in the semantic network model in order to exclude zones, endpoints and/or operations. Analogously, in further examples of offensive behavior and/or driving the system uses satisfaction, likeability, preference and/or leisure factors associated with zones and/or endpoints in order to include zones, endpoints and/or operations.

The semantic smoothing may be based on projected inferences in rapport with defensive and/or offensive behaviors. In some examples the system may bias the offensive and/or defensive behaviors based on the assessment of the projected budgets and/or further factors (e.g. risk, reward etc.).

Security is an important aspect of semantic inference. A semantic system vets the information it receives in order to use it for semantic knowledge generation and semantic fusion.

In order to vet semantic information received via semantic fluxes, as the information arrives, semantic factors (e.g. weight) are inferred potentially based on a factor (e.g. risk) associated with the semantic flux. As the fluxes feed semantic artifacts to the system, the semantic factors adapt and the information from the fluxes is combined accordingly.

The system detects objects through signatures, tags, annotations and semantic analysis thereof.

The semantic inference relies on increasing superposition, conditioning and noise to detection ratio on semantic sensor observations and measurements. While focusing on detecting an object's semantic signatures (e.g. groups of semantic attributes potentially in the context), the noise and/or other signatures may interfere with the particular object signature being sought.

Semantic artifacts representing superposition signals and noise may affect and/or become leaders in various fields, locations and environments. It is possible that multiple leader artifacts exist. In order to detect the original or denoised signal the system performs projected inference on leaders. For increased recovery of the original signal the system may need to infer original signal (e.g. based on semantic wave) leaders using semantic analysis. The signal leaders vary in time based on the propagation environment. Some environments change leaders more often than others.

A partial shape or partial signature of an object might be detected in the semantic field via one or multiple sensors during a semantic field capture however, the presence of the object or signature cannot be inferred unless the leader context within the semantic field capture is understood.

Hence, multiple semantic captures and signatures from various sensors may be used in order to eliminate noise, determine semantic leader artifacts and/or augment a particular feature, object, semantic or semantic group. A semantic (e.g. composite semantic) is a composition in time of features, objects, groups and semantics.

In general, a semantic scene captured in a semantic snapshot of a sensor operating in highly dynamic environment e.g. a camera/vision sensor installed on a fast-moving vehicle is short lived and hence goal and speculative analysis of the scene development is important. Therefore, the semantic model might incorporate scene development view frames based on semantic routes and semantic model. The scene development can include bringing semantic artifacts into a cache, assigning a higher selection indicator (e.g. possible based on semantic factors) determining leaders and drive semantics. The system may provide means to gather/ask feedback and/or validate such inferences on videos and/or frames and adjust the semantic model based on the inputs.

In dynamic environments, the system may need to compensate for the sensing and/or I/O platform movement and as such, semantic artifacts (e.g. leadership) in the current views are coupled with the inference and projection of platform movement (e.g. based on trajectory, obstacles etc.) and thus the system may anticipate based on projected views the future inferences, behaviors, scene movement, adjustments and potential preservation or change of leadership.

Adaptive modeling configuration consist in adapting the semantic rules based on the localizations and lands of the law. Hence once the vehicle is in a location it should adapt its models to the new principles reflected in the rules of the law. Semantic model roaming is the concept in which a semantic system updates and/or couples semantic models based on received instructions, location or based on other semantic factors.

Alternatively, or in addition, the coupled semantic models and/or semantic profiles can be stored on an internal or external memory (e.g. a mobile device memory) and activated based on various semantics. In addition, semantic roaming may comprise updating the biases and/or semantic factors associated with various semantic artifacts (e.g. semantic rules, semantic routes, semantic groups, semantic hierarchies, models etc.).

In similar ways the system may apply roaming to laws of the land.

As an alternative to model switching, the semantic system contains various profiles (potentially organized as groups) of semantics with semantic artifacts and relationships being factorized in different ways; factors may be derived from semantic analysis of language-based rules. For example, in various jurisdictions the priority of damage to private or community property might be seen differently; in jurisdiction A community property protection might take precedence over private property while in jurisdiction B this may be the other way around. Hence, when a self-driving vehicle or semantic system passes from one jurisdiction to the other, it should be able to receive from the semantic infrastructure the new routes and/or rules and update its semantic model to enforce the semantic rules or semantic routes (e.g. for protecting one property over the other. In an example, this can be achieved through semantic routes of language-based rules; further, the system uses association/translation (e.g. based on semantic groups) between the location language and the language of meaning representation.

In a semantic system the semantics for that specific law shall be enabled, re-factorized and enforced while other semantic routes that conflict with that law should be refactorized, disabled and/or de-enforced. The adaptation to enforcement, or enablement can be achieved through semantic routes, access control rules with variable semantic factors, factor rules and leadership that are changed based on various considerations including the interpretation of the laws. The semantic factors assigned/inferred for those artifacts reflect/include the importance and/or precedence that the semantic system assign to a particular semantic roaming or other collaborative embodiments. As such, the system may dynamically adjust the rules and leaders based on semantics and/or location.

During semantic analysis the system may determine strong leaders, soft leaders or imperceptible leaders. The system may use such leadership to infer composite drive semantics and routes including associated factors. In some examples strong leaders may be based on factors that are bigger in absolute value than soft leaders factors; analogously, soft leaders factors are bigger than imperceptible leader factors. In some examples, the leadership factors are assessed based on orientations and drifts on groups of leader and/or goal semantic artifacts.

A semantic route can be chosen based on the location and association to a localized law interpretation; the semantic factors of various component semantics and semantic attributes may vary based on similar factors.

One application of semantic sensing is robotics and autonomous vehicles including smart post appliances. Full autonomy of vehicles may require semantic interpretation of data from various sensors attached to the car or other sensors that are part of the transportation infrastructure. Localization and path identification are a critical aspect of self-driving cars. The car localization and the localizations of objects in the semantic field are of importance, while the path identification, semantic routes and semantic composition provides safe driving in complex environments.

Being able to assess the semantic field and anticipate/project the happenings in the semantic field ensures safer self-driving and self-determination transportation environment. Car to car communication and car to infrastructure communications ensure more safety overall.

In an example, while a sensing array (e.g. plurality of sensors; RF, optical, laser etc.) via a semantic suite detects features, markings and other surroundings, the semantic system might control the car to stay on a virtual lane. The virtual lane may be mapped to a physical lane. So, at one stage the car comprises in its semantic view a semantic (or semantic route) “FOLLOW THE LANE 1” while performing speculative/projected inference on what might happen in the next few steps. Based on additional sensor data from surrounding plurality of locations the semantic system might infer that “FOLLOW THE LANE 1” semantic is not appropriate and maybe “FOLLOW THE LANE 2” might be more appropriate in the new conditions and hence the semantic system infers a “CHANGE LANE” route and/or command that ultimately changes the high level semantic view to “FOLLOW THE LANE 2”. “CHANGE LANE” command is then translated in routes and/or applied in sensor command and actuation data; the semantic command is a semantic artifact and as such may have a budget, timed factor and/or linear and/or non-linear signal modulation associated with it potentially via semantic factors, semantic budgets and/or plans, in order to optimally execute the command. Therefore, a semantic system may present semantic groups of semantic routes and leaders at any given time in order to ensure safety if the semantic view goals or semantic commands cannot be executed within budgets.

A semantic system will incorporate base rules and principles that will ultimately derive all decisions of the system. For example, a basic principle of the semantic system might be that a “avoid a bad crash” should take precedence over any “property damage”. Hence, the semantic routing should also incorporate this basic principle in its rules.

The semantic model may incorporate user preferences. In an example, those preferences are based on settings and semantic profiles comprising semantic artifacts stored on a mobile device.

In a car example a mobile device can be connected via different means like OBD interface to the on-board computer. When a situation that necessitates the evaluation of semantic profiles occur, request-response messages can circulate via the interface between the on-board computer and the mobile device storing and/or retrieving user settings or feedback. Users and devices can provide feedback on demand; sometimes the communication is achieved through semantic infrastructure (e.g. semantic gating, flux, stream etc.).

A communication bus and flux may be used to interconnect multiple sensing devices. A semantic group formation request may be broadcasted/multicast on the bus and flux and the receiving devices determine whether they will be able to join or form a group based on the semantic view/view frame that they have. In some examples the broadcast comprises semantic rules for group formation (e.g. group independent, group dependent) and/or leadership. A semantic wave may be used for communications and/or broadcasts.

Semantic groups of devices may communicate on shared environments based on semantic waves and/or semantic wave collapse. In some examples, the semantic groups are associated with encryption means within semantic wave analysis and/or collapse. In further examples the encryption may be based on public/private key assigned to semantic groups potentially in a hierarchical manner. Alternatively, or in addition, these encryption techniques may be based on hierarchical semantic analysis.

A semantic view and/or hierarchical level is unchanged if there are no changes in the inferred semantics and/or leaders in an interval of time and/or the projection of semantic analysis doesn't yield new semantics or leaders other than the existing and/or similar ones; however, semantic factors of various semantics and leaders in the semantic view may change and potentially determine control commands based on those semantic factors and leaders. Other circumstances and elements might intervene that require changes of the semantic view (e.g. a driver taking over, artifacts in the semantic field that are not sensed due to poor coverage, types of leaders etc.).

The semantic view change may be assessed on hierarchical levels. As such, on a level (e.g. lower level) the semantic view may change, however on another level (e.g. higher level) the semantic view doesn't change or only the semantic factors and leaders change (e.g. determining the way and order in which rules are applied).

The semantic system may hold and train various semantic units and models based on different rules. In an example those rules and/or drive semantics may be speculative, antagonized, opposed, complementary or any other semantic based combination. Those rules may be linked with semantic factors and the system determines the rules and factors based on semantic orientation. The system may perform inference on the main models and continuously fuse received feedback from the inference on the other models; the fusing may take in consideration the semantic orientation and semantic drifts between models and drive semantics. The other models may function on different computing units for optimization. Alternatively, or in addition, the system may perform inference based on all models and use semantic fusion and semantic analysis on the inferences from all models. In other examples the models are coupled, fused and/or gated. In further examples the inference and/or model coupling is achieved via semantic flux and gating.

Alternatively, or in addition, the system performs inference on the same model using different drive semantics (e.g. antonym, different leaders etc.).

Sometimes, a system may receive and entire semantic model, semantic model view (e.g. based on hierarchical levels) or semantic theme model to be fused or replaced into at least one of its own semantic models. When this is requested or happens, a semantic fusion/exchange model/sub-model and/or rules (e.g. gating) may be used to validate or translate the received model.

In general, semantic fusion ensures the safety of the semantic exchanges and solves the semantic gaps between various representations and data.

The semantic analysis, semantic fusion and/or semantic gap processing may use semantic units. Alternatively, or in addition, vector processing units may also be used.

Segmentation of various aspects of computing and computing infrastructure achieve better security, reliability and resilience.

Hence in homogenous or heterogenous machine environments the semantic inference and automation can coordinate the segmentation of network, data, functions etc. In a virtual machine environment, the semantic inference may determine the spawning of a new virtual machine on demand in order to deal with an increased workload or a detected threat. The new virtual machine can mimic another machine that is being targeted while semantic system monitors the new virtual machine for malware, threat analysis coupled with semantic analysis and learning. The virtual machine may contain means to control various segmentation functions such as segmentation of the data, I/O, memory, network, functions and the semantic system controls the security and access control to these functions and segments. Various segments can be assigned various semantics and the system control access at these segments and/or functions based on the semantic analysis, gating and control. Additionally, the virtual or host machine may have hot plug or plug in points or connections which connect virtual logical functions and/or interfaces to hardware (e.g. achieved via semantic gate and/or semantic flux), thus allowing semantic automation of the resource allocation for optimization and cybersecurity.

In some examples, the system may want to infer a semantic group that have (high) energy (or bandwidth, or other indicator) consumption and has a minimum risk of disruption if its (associated/used) flux channels bandwidth factors and/or budgets are toggled down, thus allowing the system to save bandwidth; once the bandwidth factors and/or budgets are changed the members of the semantic group may reassess their leaders, views, routes, rules and/or inferences as well so to adjust to the new conditions. In further examples, the bandwidth factors may be based on cost factors and/or budgets at various semantic times; analogously, cost factors may be inferred from bandwidth factors and/or budgets at various semantic times. In general, a first indicator factor may be inferred based on at least a second indicator factor and/or budget.

Semantic systems must comply with a set of hard coded rules that are conveyed via the infrastructure (e.g. land of the laws for transportation systems) and hence, some semantic routes should be enforced as opposed to other routes. For smart infrastructure semantic beaconing or smart posts can be used to enforce specific paths and routes. In some examples construction areas may be signaled with semantic posts and semantic beacons broadcasting construction zone type, factors and other semantics and indicators (e.g. comprising semantic groupings, instructions, routes, instructions and routes for semantic groups adherence and any combination thereof etc.).

Authentication of beaconing data is important and hence the ability to validate the location is critical; further, the authentication may be augmented with challenge response inquiries, location information and other authentication techniques (e.g. multiple factor authentication, distributed semantic ledger).

We mentioned the importance of energy radiation and capturing technologies in the localization and identification of artifacts and objects. In these cases, the localization and identification entails interpreting the reflected signals from illuminated artifacts, objects, targets, environment and so on. The reflected energy or signals comprise backscattered or transmitted energy or signals from the illuminated artifacts and are used for localization and artifact identification information.

Backscattered energy and signals may be used to identify objects and/or object types based on their radiation signature, scattering, appearance, components, behavior, features, identification and semantic analysis. 2D and/or 3D images, renderings, frames, video streams may be created from these returns as well.

It is to be understood that such images, renderings, frames, video streams may comprise raw, uncompressed or compressed formats (e.g. bitmap, RGB, HSL, HSV, JPEG, PNG, wavelet, mpeg, quick time, avi etc.).

The semantic engine uses hierarchical threshold calculations and semantic analysis to capture signals and/or spectral imaging, detect objects, localize them, associate semantics with the objects in the scene and perform further semantic analysis. In addition, the system uses such diversity techniques for faster and more efficient communication.

By using semantic inference and analysis a system is able to adapt easily to new available intelligence related with its functionality because the system fuses various multi-domain sources of data and inputs.

Semantic segmentation is performed based on the semantic network graph and semantic analysis on the graph. In some examples access control rules are coupled to the semantic network model to perform segmentation of the endpoints and its mapped artifacts and/or features.

Alternatively, or in addition, deep learning neural networks and techniques (e.g. convolutional, recurrent neural nets, LSTM) may be used for semantic segmentation to tag, score and/or assign confidence for objects, object types and/or related areas and/or volumes in the 2D and 3D renderings and correlate those with the semantic scene interpretation. It is to be understood that tags, objects, object types, area, volumes and/or scores/ratings are mapped to semantic artifacts and/or factors.

2D and 3D inference is used for planar, volume and/or artifact (composable and/or composed) printing and/or fitting purposes. In some examples, the system may infer semantic artifacts associated with areas and volumes and further associated with procedures, technologies and materials for printing. If a printer controller implements semantic gating, flux and budgets the system may perform semantic analysis on manufacturing various parts, assemblies, modules (e.g. for posts etc.) etc.

Semantic analysis and/or localization on 2D and 3D areas and volumes may associate and/or relate them with particular actions and/or commands. In some examples, the actions and/or commands are inferred based on particular areas and volume semantic artifacts composed with further semantic artifacts (e.g. flux, user etc.). The sensors that perform electromagnetic detection may comprise transceivers, transmit units and/or receive units. They are coupled or comprise elements such as antenna, lenses, radiative elements, charging/discharging elements and others. They may comprise elements and circuits including filters, amplifiers, oscillators, resonators, mixers, shifters, phased locked loops, synthesizers, correlators, voltage adders, frequency/voltage dividers/multipliers, analog to digital converters, digital to analog converters, SOCs, pSOCs, FPGAs, microcontrollers, peak and phase detectors, laser diodes, varactors, photodiodes, photo transistors, photodetectors, multiplexers, memristors, semantic units, processors, (semantic) memories and other components. They may include metamaterials, metasurfaces, nanostructures, nanoantennas, nanowires, nanopillars, nanoposts, polaritons and so forth. The components specified above may be tunable and/or combined to form channels used for transmitting, receive, detection/sense and any combination of those. In some examples, at the basic level such components may include other analog and digital components, semantic interfaces, circuits and blocks comprising diodes, transistors, capacitors, inductors, resistors, switching elements—e.g. FET, GaAs, GaN, SiGe, SiC etc.

In an example, a FET (field effect transistor) is controlled in a semantic unit and/or by a semantic unit; a depletion type FET transistor is normally on and to turn it off, a negative voltage relative to the drain and source electrodes is applied. The enhancement type transistor is normally off and is turned on by positive voltage applied to the gate. Such voltages are controlled by semantics and semantic factors. Further, the semantic units and/or components may be assigned semantics and/or factors and the system routes the semantic fluxes, semantic waves, voltages and currents to components based on semantic analysis including semantic gating. In a further example a semantic unit distributes a semantic wave to such components and circuits based on semantic analysis, gating and routing. Further, semantic channels are established based on and for semantic analysis, semantic fluxes, gating and streaming.

Physical phenomena can also be modeled through semantic analysis. In an example, Doppler shifts may be modeled through semantics. The radiating elements transmit generated waveforms which when reflected by an object, artifact and/or target are interpreted based on semantic analysis that apply the Doppler shift as part of semantic composition. The received measurement and/or signal from any of the channels and/or antennas are composed and/or conditioned based on the transmitted/received waveforms which may be pulsed and/or continuous modulated in time and/or at intervals of time. Pulse and/or waveform compression techniques may be used for improving the signal to noise and signal to interference ratio. The system may generate the waveforms based on semantic analysis and/or semantic conditioning. In one example, a waveform is related to a composite semantic route and/or semantic wave while the compositional semantics specify wave type, frequency, amplitude, phase, time management, access control etc. Sometimes the compositional semantics are directly associated with the outputs (e.g. voltages, chirp, basic waveform) for the continuous wave and/or pulse signal modulation; additionally, the composite semantic is associated with a semantic rule (e.g. time management, access control, semantic factoring) that will further determine additional waveform and/or chirp modulation parameters including phase, amplitude and time modulation (e.g. via time management, factoring, indexing etc.). As explained throughout the application the semantic analysis and learning implies correlations (e.g. via semantic group, semantic model and/or semantic routes) of various inputs, measurement, signals and so on from various channels, streams and sources. As such, the transmit and return signal parameters (e.g. frequency, amplitude, phase etc.) may be assigned semantics and may be grouped and/or correlated in time (e.g. learning time/factoring/indexing management rules and further based on semantic groups) using semantic analysis; multiple channels and sources may be correlated this way.

The signal envelope may be inferred, generated or represented based on a semantic network model, semantic artifacts and/or semantic group. Thus, signal envelopes and waveforms may resemble paths/routes/shapes in the semantic network model and the system performs semantic inference on the semantics in the path (link and endpoint semantics). The system may perform semantic orientation and/or drift inference on various semantic waves, signal envelopes and waveforms for comparison, projection, speculation, inference, sentiment analysis, authentication and so forth.

In some examples, the system may overlay a plurality semantic network models, levels, hierarchies and/or artifacts and infer compositional semantics for the artifacts that intersect; the intersections may refer to intersections of zones, envelopes, charts, maps, graphics, graphs and/or other plotted and/or rendered artifacts; in addition, or alternatively the intersections may refer to intersections of semantic network artifacts potentially mapped to such zones, envelopes, charts, maps, graphics, graphs and/or other plotted and/or rendered artifacts. Thus, in an example the system may comprise a link Link1 from EP1 to EP2 of a level L1 which, when a level L2 is overlaid intersects with a link Link2 from EP3 to EP4. If the Link1 has a semantic attribute of Attr1 and Link2 has a semantic attribute of Attr2 then the endpoints EP1, EP3 and EP2, EP4 may collapse and/or be grouped into EP13 and EP24 and an associated link Link12 between EP13 and EP24 is associated with a composite sematic attribute between Attr1 and Attr2. Alternatively, or in addition, endpoints EP1, EP4 and EP2, EP3 may collapse and/or be grouped into EP14 and EP23 and linked via a link (e.g. Link 1) associated with Attr1 from EP14 to EP23 and linked via a link (e.g. Link 2) associated with Attr2 from EP23 to EP14. In further examples of semantic inference on zones, envelopes, charts, maps, graphics, graphs and/or other plotted and/or rendered artifacts the system performs mapping, overlaying and/or analysis on intersections, points and/or zones of interest. In an example, at least two rendered signal/s envelopes intersect in at least one point in time Pint (e.g. potentially displayed as time series charts/graphs). If the system maps EP11 and EP12 to a first envelope/graph/chart (e.g. EC1) and infer and/or assigns at least one semantic (e.g. SEM-11, SEM-12 . . . SEM-1i . . . etc.) to the oriented links (L11) EP11->EP12 and/or (L12) EP12->EP11 and further the system maps EP21 and EP22 to a second envelope/graph/chart (e.g. EC2) and infer and/or assigns at least one semantic (SEM21, SEM22 . . . SEM2i . . . etc.) to the oriented links (L21) EP21->EP22 and/or (L22) EP22->EP21 then the system may infer composite semantics from the semantics associated with the links between EP11, EP12, EP21, EP22 in any combination and assign it to the intersection Pint (e.g. and/or an endpoint mapped and/or comprising Pint). Analogously, if Pint is associated with text, labels, controls, displays and/or other artifacts then the system may perform semantic analysis based on such artifacts and their associated attributes in rapport with the mapped semantic artifacts and/or further assignment to the mapped semantic artifacts.

The system may display graphics elements based on inferred semantic attributes and/or factors. For example, the system uses an inferred stroke factor and/or semantic attribute to draw the graphs/graphics of endpoints and/or between endpoints with the corresponding stroke value.

The system may use semantic indexing for indexing user interface and/or display artifacts/controls parameters and/or semantics; further, it may index size of borders/fonts, positions, scroll, resizing etc.

Alternatively, or in addition, to the semantic based ingestion and learning of the semantic envelope, deep learning techniques (e.g. convolutional networks) might be applied to detecting semantics in the envelope.

The signal and/or noise may be modeled through semantics and thresholds calculations coupled to semantic inference. Specific formulas may be indicated and/or identified through semantic artifacts; the system may use such semantic artifacts in a composite fashion together with the semantic artifacts associated with the formula parameters. The system may adapt the formula semantics based on the context. As such, the system may change leaders and/or assign higher semantic factors to a semantic representing one formula set over another based on the semantic view.

The semantic system may use formulas for semantic inference. As such, a formula set may comprise multiple semantics in a composite fashion and may be part of semantic routes and/or semantic rules.

The system may use semantic representation of knowledge. In one such example, when velocity signature estimation (e.g. Doppler) formula is applied, the system composes the semantics (e.g. including semantic factors) associated with parameters and constants based on semantic rules associated with formula components. The system uses semantic analysis in a composite fashion to infer the speed of movement, potentially associated/represented through a semantic factor.

Figure 24A:
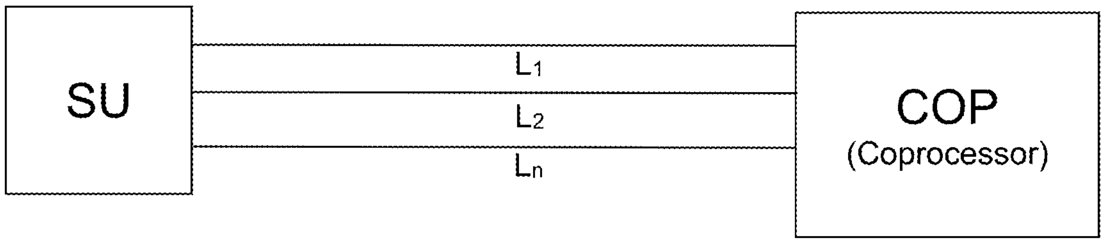
FIG. 24A illustrates a block diagram of a preferred system for implementing a mathematical (co)processor to process the mathematical functions embedded in the formulas defining semantic rules.
Figure 24B:
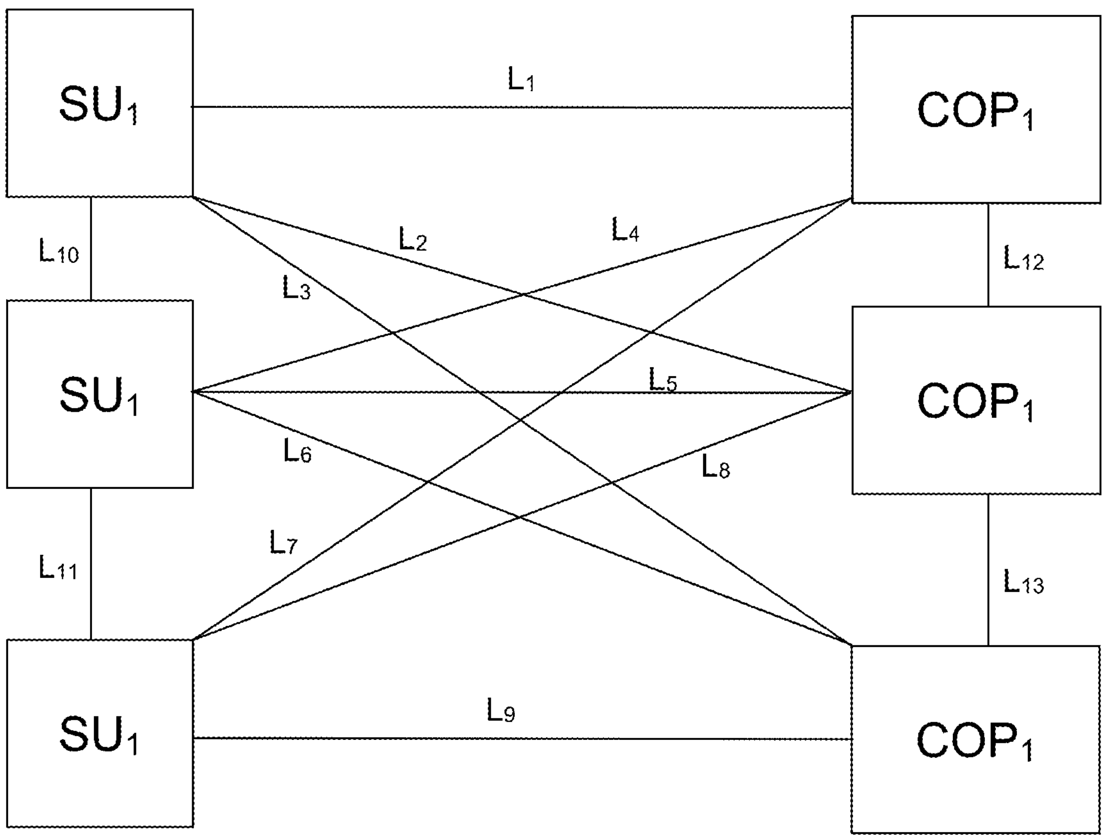
FIG. 24B illustrates an alternate block diagram of a preferred system for implementing a mathematical (co) processor to process the mathematical functions embedded in the formulas defining semantic rules.
Figure 24C:
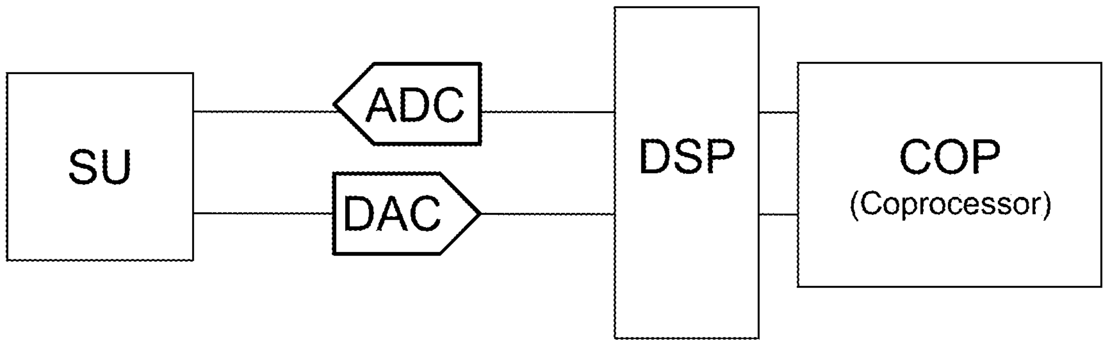
FIG. 24C illustrates an alternate block diagram of a preferred system for implementing a mathematical (co) processor to process the mathematical functions embedded in the formulas defining semantic rules.
Figure 24D:
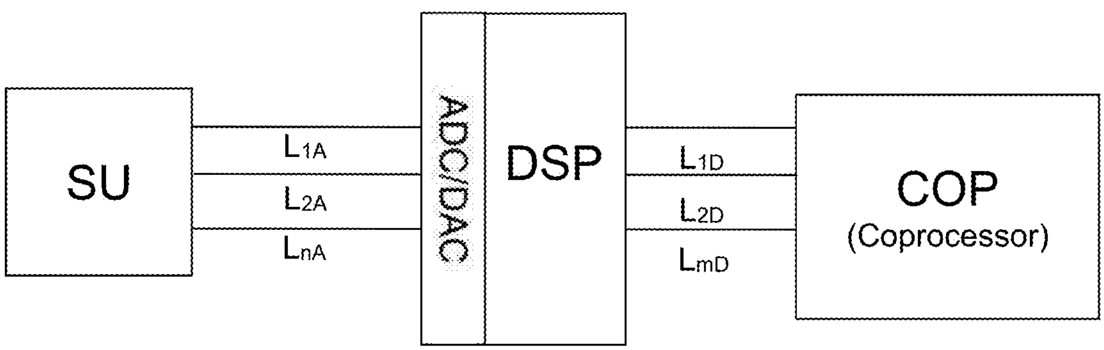
FIG. 24D illustrates an alternate block diagram of a preferred system for implementing a mathematical (co) processor to process the mathematical functions embedded in the formulas defining semantic rules.

The system may use a mathematical (co)processor to process the mathematical functions embedded in the formulas. Such a (co)processor may be connected to semantic units via buses, semantic connects, analog to digital converters (ADC), digital to analog converters (DAC), digital signal processors (DSPs) and/or any other technologies mentioned in this application (e.g. FIG. 24A B C D).

In some examples, the semantic model may comprise rules for matrix multiplication. Thus, the system comprises rules and routes of type MATRIX PRODUCT, ADD ALL PRODUCTS OF EACH ELEMENT IN A ROW WITH EACH ELEMEMT IN A COLUMN, NUMBER OF ELEMENTS IN ROWS—THE SAME—THE NUMBER OF ELEMENTS IN COLUMNS. Further, the system may comprise a semantic network model mapped to a rendering of the matrices where the elements in matrices are mapped to endpoints and the template artifacts that need to be multiplied are connected by oriented links (e.g. elem (location) 1, line (location) 1->elem (location) 1, col (location) 1; elem (location) 2, line (location) 1->elem (location) 2, col (location) 1 etc.); further, the elements of the first matrix (e.g. left product element, left matrix (LM), left matrix element (LME), matrix A, first matrix etc.) lines are mapped to higher level line endpoints (e.g. LME line 1, LME line 2 . . . LME line n, etc.) comprising the line elements endpoints and, analogously, the elements of the second matrix (e.g. right product element, right matrix (RM), right matrix element (RME), matrix B, second matrix etc.) columns are mapped to higher level column endpoints (e.g. RME col 1, RME col2, . . . RME col n etc.) and the system links the line endpoint with the column endpoints and further may represent and/or collapse them into a higher level endpoint which may be linked to an element in the result and/or rendering of the result. Thus, the system stores a template of matrix multiplication based on semantic models and uses it to perform the product operation for example. It is to be understood that the system may infer at least partially such semantic network models by corroborating the semantics artifacts from the captured and/or rendered data and its location and by further matching it against semantic routes, templates and/or rules; in some examples such semantic routes and/or rules may be provided, read, received and/or inferred. In further examples, the system needs to multiply AONELINE (11, 12, 13) with BONECOLUMN (11, 21, 31) and thus the system performs the groupings such as * (11,11), * (12, 21),* (13, 31) based on the matrix multiplication template and further+(+(121, 252), 403) or +(121, 252, 403) which may map to the result matrix element. It is to be understood that the mathematical operations may be performed by the semantic units in similar templating fashion (e.g. template for number multiplication, addition etc.) and/or by a mathematical (co)processor unit (s) as depicted in FIG. 24. In some examples, the (co) processor units are linked to the (other) semantic units via semantic flux connect and thus, the semantic unit may use any of the semantic flux functionality to couple and/or challenge the (co)processor unit which may expose and/or gate capabilities and/or budgets. Further, the links and signals between the semantic units (SU) and coprocessor (COP) units may be connected and/or converted by using any combination of analog to digital conversion (ADC), digital to analog conversion (DAC). Further, the (digital) signals on the links may be further processed and/or gated in digital signal processors (DSP). In some examples, the digital signal processor implements the semantic gating functionality (e.g. related with the coprocessor).

A diversity of energy transmitters or transceivers may work collaboratively to map the semantic field and generate more accurate information.

Modalities that use electromagnetic radiation to sense or scan the semantic field are employed; sometimes they may generate imaging and video artifacts of the return signals. These modalities can operate in various ranges of the electromagnetic spectrum including radio waves, microwaves, infrared, visible spectrum and others; they may include RF sensors, photosensors, laser sensors, infrared sensors and others.

There can be multiple images/frames captured in time in the same semantic field and/or area.

Sensors can move and the captured areas may overlap, or they can capture disjoint areas of the field.

Sensors receiving electromagnetic energy in any spectra may use hierarchical threshold calculations (HTC) for object localization; additionally, the calculations may be used to derive a semantic attribute of an object that refracts, transmits, scatters and/or backscatters received energy from a modality (e.g. camera, laser) via semantic modulated radiation. Laser/optical type emitters/elements are used to emit radiation, potentially semantically modulated and conditioned, and the number or amount of received backscattered photons, semantic quanta (e.g. energy), backscattered energy, charged energy levels is plugged in as the number of reads in HTC (hierarchical threshold calculation) algorithms. When the system uses semantic modulated transmit signals (e.g. pulsed, chirped, wave based on semantic analysis), the received backscattered photons and/or energy are semantically interpreted and analyzed to detect the number of reads. Alternatively, for optical receivers the number of backscattered artifacts is calculated between subsequent reset semantics.

Photon detection may be based on the energy levels received in a particular wavelength. Sometimes the photon detection number and/or energy levels may be associated to semantic factors.

The threshold calculations may be used to identify the nature of an object (e.g. material, texture, color and others). The system establishes thresholds that may be associated and adjusted based on semantic factors, indexing and further semantic analysis. The factors may be based on semantic composition wherein each composition semantic is inferred and/or assigned a factor and the composite semantic weight/factor is a calculation (e.g. sum, average etc. inference) of the compositional factors. Alternatively, or in addition, the factors are calculated based on factor rules where the factors vary with the semantic inference and analysis. In such an example the factors are indexed and/or calculated based on semantic routes, semantic views, semantic intervals, composition, factor rules and plans, semantic rules and any combination of the former. The selection of semantic rules may be as such controlled based on inferred semantic factors and indicators. Further, it may just use a weight/factor calculation for one semantic; in an example, a semantic of "SHAKE" with high weight of 0.9 from a car sensor may infer or assign a negative weight to a semantic of "PLEASANT" and and/or a positive weight for a semantic of "THRILL" and/or "FAST" and/or "FAST SHAKE". Those inferences and factors may be based on leader semantics capturing sentiments in particular contexts and using various semantic profiles. A semantic profile may comprise semantic artifacts (such as routes, models, rules, waves) and allows the system to particularize inferences and environments (e.g. displays, views, sensing, fields and/or semantic artifacts etc.) based on profile's artifacts and/or access control. In further examples the semantic factors are established based on semantic time intervals and/or factor intervals/thresholds. The factors, factor intervals/thresholds may be used to infer semantic artifacts and to select semantic rules, semantic routes, shapes and groups. In some examples, the system pursues various routes of inference based on one or more semantic rules selected through semantic inference, factors and factor rules. Further, the system infers and determines which of the semantic rules including factor rules, semantic intervals, semantic groups and other semantic artifacts yield the best results (e.g. rewards, budgets) and/or best achieve goals and potentially update or generate new semantic rules based on continuous inference, action, analysis, feedback.

Photon and counting detection may be an example implementation of the HTC using a diversity of transmit/receive sensor elements. Photon counting or quantum energy charging/dissipation at a diversity of elements can be integrated and heavily benefit from the diversity techniques presented in the HTC. This is due to their susceptibility to noise which is highly alleviated through diversity techniques and HTC. Further, such sensing elements structures and layouts may be mapped to semantic layout models (e.g. endpoints mapped on location and/or elements, semantic capabilities, semantic identification, component or any combination of the former).

The diversity techniques and HTC are used to determine semantic attributes of the illuminated surfaces. In the previous example, the photon count or the energy received in particular wavelengths at the elements are used to derive the semantics related to position and the color of the illuminated surface. The elements may be tuned to absorb or count only a narrow wavelength and the system is able to be more precise in color/attribute estimation.

As explained, there is a clear advantage in designing sensors and sensor systems that will process information in a hierarchical way by gathering information from sensor components and groups and compose it hierarchically through semantic analysis.

In an example for a photosensor, the photosensor may be comprised from an array of elements or photodetectors that are managed through a semantic engine. The photosensors may be grouped semantically, grouped in a hierarchical manner or any combination of the former. The system may perform detection by varying the detection granularity based on hierarchy levels. The mapping of those sensors to the scene may consists in mapping particular scenes and/or the overall scene or field, with potentially combining this structure in the hierarchy of logical and/or physical mapping layers. The semantic inference also uses hierarchies to perform semantic inference.

FIG. 16 depicts elements, sensor or semantic unit components grouped based on hierarchies and/or semantic groups.

In an example, an endpoint and/or link is associated a composite semantic based on semantics associated with its component endpoints and/or links. In a similar way the compositional endpoints and/or links may be associated to semantics inferred for a higher hierarchy endpoint and/or link. In an example the transitions between endpoints at one hierarchy level are allowed, disallowed and/or controlled based on semantics inferred at higher hierarchy levels. In an example, inference associated with encompassing endpoints at a higher hierarchy level is used to allow, disallow and/or control the semantic inference at the lower levels. Analogously, the semantic collapse may be controlled in a similar way.

The radiative sensors or sensor arrays may change the radiative pattern, direction, strength, polarization, phase and frequency. The system, may modulate, represent and/or store semantic artifacts and semantic waves based on such values, identities, patterns, attributes and parameters.

A clear advantage of a semantic system and engine is that the radiative front ends may be easily swappable. Alternatively, the front ends may use adaptors to adapt to various transmit/receive spectra, frequencies, polarizations and so forth. In some examples, the adaptors may comprise multispectral and/or hyperspectral filters.

The system may use readers with antenna elements operating in the visible spectrum to perform HTC. As such, the radiated energy for such sensors or interrogators will be in the visible, ultraviolet and/or infrared spectrum of the electromagnetic domain. In addition, the readers may have a mix of interrogators or sensors working in various domains and/or spectra.

The sensor elements operating in the visible, ultraviolet and/or infrared spectrum may comprise nano-antennas operating in optical frequencies. In an example, the nano-antennas allow the use of readers and interrogators in the visible domain and/or infrared domains. Further, the sensor elements may comprise nanopillars and/or nanoposts. Such elements may be used in electromagnetic radiation (e.g. light) control such as steering, phase control, wavefront control, focal length control, dispersion, polarization and other characteristics.

We mentioned before the use of metamaterials in antennas. An example of such nano-antennas and metamaterials are the ones which use surface plasmon resonance (SPR), including localized SPR, for detecting light or radiation, usually in the visible domain. Plasmonic materials and structures have subwavelength properties due to conversion of light to surface plasmons which allow confinement and concentration of energy to very small volumes. Surface plasmon polaritons allow the guiding of incident light of longer wavelengths in shorter nanostructures and wavelengths allowing for nanoscale sized waveguides, detectors and/or modulators.

Plasmonic materials are used as opto/plasmonic couplers, splitters, photodetectors, switched, waveguides, modulators and so on.

As known in art, plasmonic elements, nanostructures and metasurfaces may operate in optical domain for detection of incident light at various visible, ultraviolet and/or infrared frequencies; as such they are suitable for building an optical sensor comprising a multitude of nanosensors elements gathering radiation at various wavelengths.

Nanoparticles or nanowires are used as sensor elements; their absorption band in the visible, ultraviolet and/or infrared spectrum and the polarization sensitivity allow for advanced sensing in small factors; in one example, they can be used to detect various material properties. Accordingly, they can be used with HTC techniques and semantic analysis for semantic inference.

Nanowires and/or metasurfaces (e.g. based on quantum dots, nano-antennas) may be used for capturing radiation at optical wavelengths and generating/guiding the polaritons; meshes of intersecting nanowires are used to capture a current induced by the polaritons based on direct energy transfer between the nanowires and metasurface (near field and proximity effects) which may contribute to improved absorption and detection capabilities in various materials layouts and applications.

In some examples nano-antennas are built using structures (e.g. pairs, hexagonal structures, other shaping structures) of metallic particles with dielectric gaps with energy concentrated within the structure or at the surface.

Gratings and/or meshes of elements may form larger structures and sensing surfaces (e.g. antennas, photosensors surfaces etc.). The system may activate and/or tune such elements to achieve dynamic capabilities (e.g. tune the radiation pattern, parameters and/or receiving groups based on frequency for optimal transmit/receive; time the element activation and/or tuning for controlling polarization); it is understood that such activation and tune capabilities may be based on frequency, time intervals (e.g. semantic time intervals), signal amplitude and any combination of such parameters and/or semantic analysis.

Polarization might be detected by scattering of energy and/or light between nanowires and/or within the mesh.

Multiple polarization interferometry may be used as enhancement to mesh metasurfaces surface plasmons capabilities.

In some examples, dispersion elements/metasurfaces are coupled with absorption elements/metasurfaces for achieving enhanced capabilities (e.g. focal dispersive guiding, phase detection, spectral sensing etc.). Such meshes may use layouts of one or multiple layers with either dispersive and/or absorption properties and elements being used at various layers. In one example, a nanoposts or nanopillars layer is used to capture light and disperse and/or guiding it to a plasmonic layer. Multispectral and hyperspectral sensing may be achieved by controlling (e.g. via semantic analysis) the meshes and/or layers. Further semantic analysis, 3D mapping and rendering may be used to analyze hyperspectral cubes of captured spectral data.

Frequency and/or photoelectric selective mesh surfaces may operate in the radio-wave, microwave, terahertz, ultraviolet, infrared and/or visible range of electromagnetic spectrum.

The RF subsystem may be coupled to optical sensors and devices (e.g. laser diodes, photodiodes, avalanche photodiodes-linear/analog mode, Geiger-mode, etc.; edge-emitting lasers, vertical cavity surface emitting lasers, LED, fiber laser, phototransistors) to generate laser beams and scan the field. A signal can be modulated in amplitude, frequency, phase, pulse/time/width in analog and digital domain that is potentially used in both RF and optical sensing.

The radio and/or light wave modulations may be achieved based on direct semantic analysis at carrier level or indirect semantic analysis to a baseband level.

Radio frequency and/or optical front-end components may be used and/or coupled for rf and optical modulation using analogous carrier waves.

In an example, the optical modulation may be either pre-emission or post emission. In the pre-emission (e.g. direct) modulation is achieved by superimposing (e.g. compose) the semantic modulated signal (e.g. semantic wave) on the drive current, bias current or diode current (e.g. for LEDs, laser diodes). In the post-emission (e.g. indirect) modulation an optical source (e.g. laser diode, LED) emits a continuous wave which is then modulated (e.g. via semiconductor electro-absorption, electro-optic modulator, semantic gate etc.) and conditioned. Thus, the modulation may be achieved for example via semantics on or applied on currents, voltages, adjustable refractive indexes, phase, frequency and any combination of those. The semantic modulation may be analog and/or digital. In either one of these methods the optical emissions may be controlled through arrays/grids/meshes of elements. The system may encompass array/grids/meshes of modulators (e.g. for frequency/amplitude/phase pulsed or wave/CW chirpings and orientation in the field of view). Light pipes, optical fibers, light collimators, nanowires may be used to focus and/or cohere emissions. In some cases, the optical devices may be comprised from a lens or assembly of lenses; in other cases, they may comprise optical antennas (e.g. plasmonic). The receptors may include arrays of photon detection elements, photon energy charge pumps, plasmonic nano-sensors etc. By having multiple semantic integrated front ends (e.g. comprising rf, optical, antennas and/or lens), the readers will be able to perform rf and/or optical scanning in a more coherent manner and perform HTC and semantic analysis closer to the device's front end while taking advantage of additional diversity in sensing.

Photon detectors elements may include photomultipliers, single-photon avalanche diodes, superconducting nanowire single-photon detectors, transition edge sensor elements, scintillation counters, photodiodes, phototransistors and others.

Photosensors may use passive or active sensor pixels; in addition, these sensors may use organic or inorganic materials. Graphene is a material used in photoreceptors for improved spectrum sensitivity, resolution and power consumption.

Photosensors may include multiple spectra capabilities for sensing visible, ultraviolet or infrared light. Sometimes, this is achieved by a multitude of substrates and/or meshes that are sensitive to a particular spectrum and are activated based on an applied voltage or current. The applied voltage may be associated with semantics and/or semantic factors and the system may use semantic models mapped to mesh substrates to issue semantic commands (e.g. voltage control) to elements in the semantic model mesh (e.g. edges/links, endpoints, elements, groups) based on semantic artifacts identification, mappings and/or location. The mesh semantic mapping selection may encompass mappings of elements to the mesh semantic model and selection of those based on the semantics associated to the mappings. It is to be understood that the elements and/or the applied voltage may be associated with semantic analysis.

Alternatively, or in addition, to the multiple substrates physical layout, the system may map and/or divide a substrate into multiple virtual substrates based on mapping to the hierarchy in a semantic model. Thus, parts of a substrate may be mapped to a level in the semantic model. The mapping may be disjunct or overlapping between semantic network model hierarchy levels, model and semantic artifacts.

Arrays of photodiodes, phototransistors, nano-antennas, plasmon metasurfaces may be used in photodetectors and photosensors.

It is to be understood that when referring to photodetectors and photosensors we include any display and holographic display layouts, capabilities and surfaces of based on such technologies.

Photodetectors and photosensors might have different internal configurations of transistors, nano-particles and/or components; they might be organized as a mesh. In an example, a photosensor or group of photosensors is organized as or based on a group of plasmon polaritons waveguide mesh.

Because the elements are sensitive to various spectra, their layout is it therefore of significant importance in sensor applications consisting in a large number of detectors.

In order to improve sensing for hyperspectral photosensors a semantic engine may be used for advanced semantic grouping interpretation and control of the photodetectors or microelements.

Further, the semantic engine may determine the optimal amount of energy voltage applied to the mesh based on the semantic inference on the mesh inputs and other sensorial and/or resource inputs. Further the semantic engine may control the absorption of photons, electromagnetic energy, electrons, and further photoelectrical related parameters in the mesh based on semantic analysis and inference (e.g. time management, access control, semantic groups, semantic leadership etc.).

It is to be understood that when referring to mesh control, it may encompass controlling the mesh through the semantic network layout and/or semantic analysis.

In previous examples we explained various hierarchical and composite techniques for sensor elements arrays.

In another example a semantic mesh/grid is formed wherein multiple semantic network models are laid down on top of each-other; the stacked configuration may form a logical and physical hierarchical layout. As such, the links may intersect and the semantic system defines new endpoints at the link intersection and assigns new composite semantics on the new endpoints and links. The composite semantics may be combination related with the semantics assigned to a lower or a higher-level links and/or endpoints, and potentially with semantic groups of endpoints. Thus, the system enhances the semantic mesh grid to encompass finer and more granular understanding of semantic scenes and field. The system may pursue finer semantic grids when focusing on particular areas/locations, goals, leaders, drive semantics and factors. The semantic grids may be formed in layered and/or hierarchical configurations. The layered and hierarchical approach increases the semantic resolution (whether disjunct or overlapping) optimizes performance, knowledge transfer and control. In an example, two grids communicate through a higher level in the semantic network model. Such, architectures may foster domain knowledge transfer between micrgrids of elements, layers/hierarchy and/or endpoints. In an example the system performs up (e.g. abstract, higher level, connected level) and down inferences within the hierarchy based on goal inferences. The same approach works for any embodiment of the semantic network model. In some examples the semantic network model was mapped to a grid of sensing elements. In other examples, the semantic network model is mapped to locations and/or artifacts in images/frames (e.g. pixels, objects, zones, shapes, boundaries etc.).

Some of these examples were based on semantic analysis including composition, semantic routes, time management, access control, rating and weighting, diversity drive/routing, semantic leadership, hierarchical and probabilistic approaches. We mentioned the use of sequencing and semantic factors (e.g. weights and/or ratings) for increased selectivity when applying semantic inference rules, inferring routes and semantics; as such, the semantic rules, routes and semantics are ordered and/or selected based on semantic factors and semantic factor rules and may determine and/or be determined based on orientation, drift, sequencing and/or other semantic analysis. The factor rules are created and updated based on inputs and feedback from a variety of sources. Sometimes those factor rules are updated based on inferred semantics, inputs from a user and/or any other sources as presented in this specification.

Those factor rules may themselves be associated with semantics and the factors associated with the semantics representing the selection factor. As such, the semantic inference techniques are used to infer new factors and factor rules, infer semantic groups including factors and factor rules and so on. In the case that there are multiple semantics associated with a semantic group (e.g. of rules, artifacts etc.), the system may perform semantic analysis on the multiple semantics and infer the overall prioritization, selectivity, importance factors and/or leadership.

The semantic indexing factors establish space-time dependencies based on semantics. Thus, the sensing elements (e.g. photodetectors) may be mapped and/or grouped based on semantic space-time indexing.

The system may determine a coarse semantic determination at first and go through the logical and/or physical semantic hierarchy until a semantic threshold and/or leadership is achieved. The system may increase the resolution of the semantic determination through semantic indexing; as such, in a vision model (e.g. optical, rf) new semantic artifacts are added to a semantic model mapped to the semantic field representation (e.g. time-space field of view) based on the semantic indexing as the system increases the resolution of the semantic model; the increased resolution may target a particular granularity, particular semantic inferences, rewards and/or other goals. Also, the increased resolution may target semantic scenes, semantic groups, leaders and/or any other semantic artifacts. In some cases, the targets may be associated with leadership status.

In the case of mesh mapping and/or hierarchical semantic models the system may use various layers of the mesh and/or model to achieve a particular desired resolution. The semantic indexing factors may be used to determine the progression in resolution and time of mesh/model adjustment, activation and semantic inference. In some examples, the system uses indexing to infer semantic groups of elements and perform zooming and/or adjust resolution (e.g. as a result of progressive semantic compression/decompression and/or encryption/decryption potentially based on semantic wave).

The system may overlay models (e.g. mapped to pixels, elements) and create new artifacts based on color. Alternatively, or in addition, can overlay models and determine composition and analysis on the overlaid models.

In another example, the system maps a grid of endpoints and oriented links to the semantic field and increases the grid density through semantic indexing or, in a further example, the system overlays or enables/activates semantic grids on top of each other based on semantic inference and detects intersection points between the semantic artifacts (e.g. endpoint and links). The system may determine the intersections including oriented links and/or endpoints (e.g. source and destination) and, at intersection points, the system may map new endpoints and create new links based on the composition of the semantics intersecting in the composed grid. Semantic groups may be used to determine the new mapped semantics in the grid; semantic composition may be used to determine new semantic groups based on the new determined semantics, sensor elements mapped at locations and other semantic artifacts. The system uses semantic orientation (e.g. based on drive semantics and/or leadership) to detect drifts and patterns between layers, routes, shapes, paths, trajectories etc.

The system is able to infer indexing factors based on mesh overlaying. As such, if there are two endpoints and a third one is overlaid in between the first two endpoints the system may infer proportion and indexing semantics based on the semantic layout, mesh/grid, links, hierarchical structure, semantic factors, semantic shifts, drifts and semantic orientation. Further, the system uses semantic inference including localization within semantic scenes and field semantic composition, orientation and shift for learning indexing, factor, rules and other semantics.

Semantic view frames comprise semantic determinations and semantic routes that may be used by the system for semantic inference.

The system may use a semantic bias for altering the factors for particular semantics, fluxes, routes, view frames and/or views. A bias may be applied (e.g. composed) on drive semantics, semantic routes and other semantic artifacts. Alternatively, the bias may be applied as an alternate or additional drive semantic, semantic route, semantic artifact and/or leader. Factors associated with the semantics in the semantic route may be biased; this bias may be used to ponder the other semantic factors including route components semantics. The semantic biasing may be inferred based on semantics, indexing, semantic analysis or be based on inputs including inputs from a user.

The semantic bias may be used to influence (e.g. counterbalance, control, increase) the confirmation bias, the risk aversion or risk predilection bias that may reflect in the semantic model and/or collaborative semantic fluxes.

The semantic bias may be used for example to identify signatures, compatibility, preferability, trusts and other semantic factors between semantic groups of artifacts, units and/or fluxes by evaluating (e.g. via composition, orientation, drift, shift, coherence/decoherence and further analysis etc.) the semantic factors, artifacts, routes and/or views used by such group (members) during a particular inference and/or challenge; it is understood that such analysis may be effected on semantic groups and/or between the evaluator system and further units, fluxes and/or semantic groups.

Further, such analysis may be used to infer semantic groups and further semantic artifacts as explained throughout application.

The system may use aggregation of semantic biases (e.g. by semantic analysis) of/for various semantic groups, fluxes and/or components which may be used to assess the compatibility, preferability, trust, spread and/or other factors in relation which the corresponding semantic groups, fluxes and/or components.

In further examples the bias may be used to compensate for various language and sensing accents (e.g. based on semantic identities), identification characteristics, sounds, waves, noise, parameterized characteristics, signals and/or other artifacts that may have an influence on increasing detection factors (e.g. related to signal to noise, signal to interference, superposition and so forth), In some examples semantic biases and semantic indexing coincide and as such any semantic techniques applicable to one may be applicable to the other.

Semantic indexing, bias, access control, gating, time management and/or further rules may be associated and/or used to adjust biasing voltages, currents and/or further bias parameters; further, semantic inference and/or learning based on correlations between biasing parameters and/or values and changes in operating characteristics of (biased) elements may occur. In further examples, semantic resonance, decoherence and/or damping may be used to determine operating points/intervals. Thus, the system may adjust, control and/or optimize inference, gating, operating points/intervals, actuation, motion, power (budget) delivery, torque, (rotational) speed etc.

Sensors, arrays, grids, mesh of sensors including photosensors may use all the techniques previously presented for input interpretation.

Some of the existing photosensor take snapshots of the scene at interval of times and interpret the data based on various techniques including deep neural networks such as convolutional networks, recurrent neural networks, long short-term memory networks and others. In general, deep learning techniques are not very efficient because they need to filter and/or interpret the data in a repetitive manner and as such are processing intensive while not being able to have a continuous semantic awareness.

Another approach is to dynamically control the photosensors and/or mesh based on the understanding of the environment and optimize the scene interpretation. Groups of photodetectors may be coupled together in a concentrator/controller/semantic unit and be coalesced and/or controlled through that semantic unit; further, those photodetectors may be associated with a semantic unit group.

The elements in a cell can be connected via nanowires, with the control of the voltage threshold of the nanowire circuit or transistor being semantically achieved. Semantic units may be also connected to other semantic units and/or photoreceptors; they may be connected and routed through semantic flux, gates, routes etc. The semantic units run a semantic component which composes the sensor inputs semantically while being controlled by semantics itself. Further, the elements in the cells may be composed in semantic groups.

Figure 21:
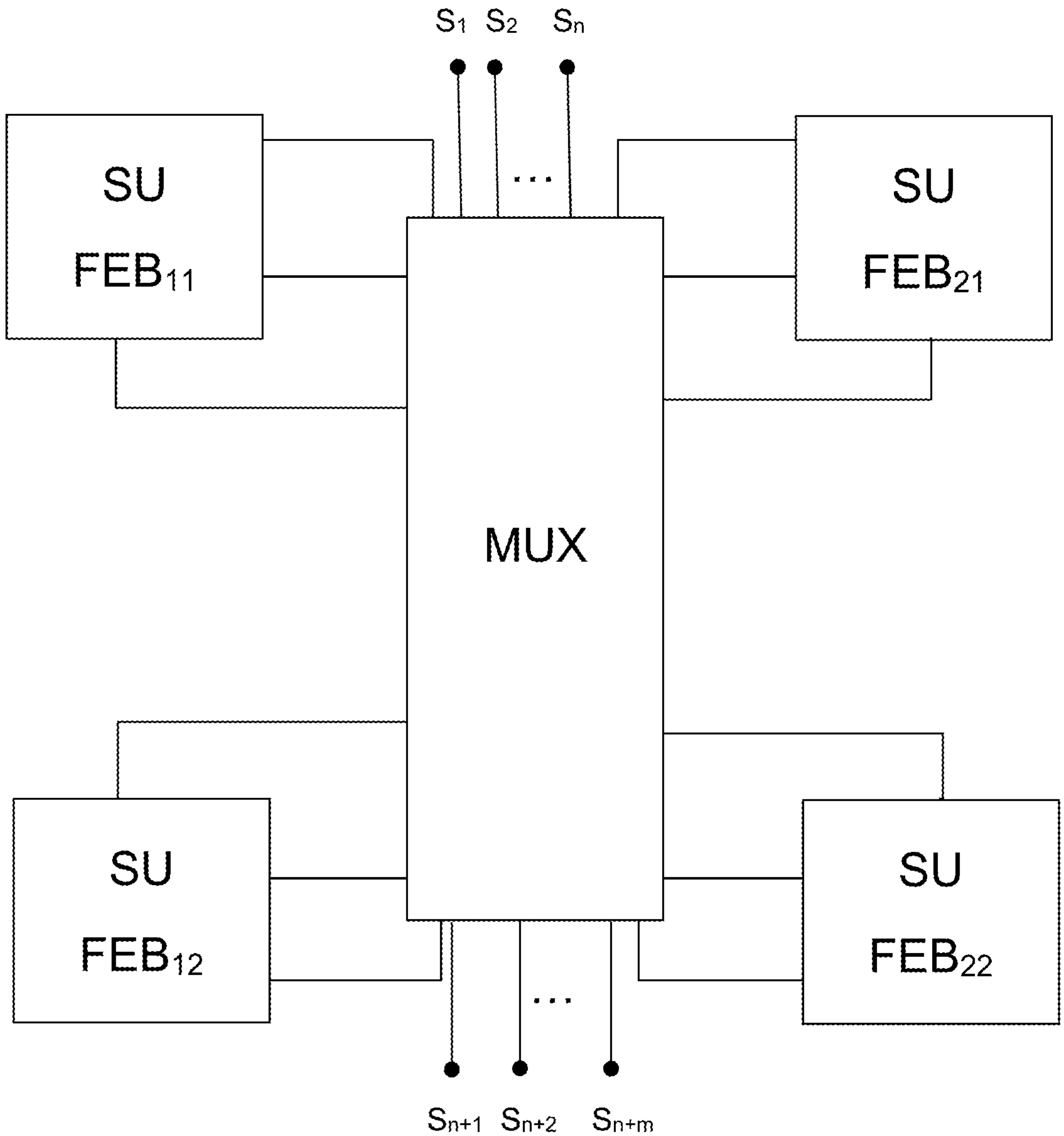
FIG. 21 illustrates a block diagram of a plurality of semantic units joined through a multiplexer as a semantic group.
Figure 22:
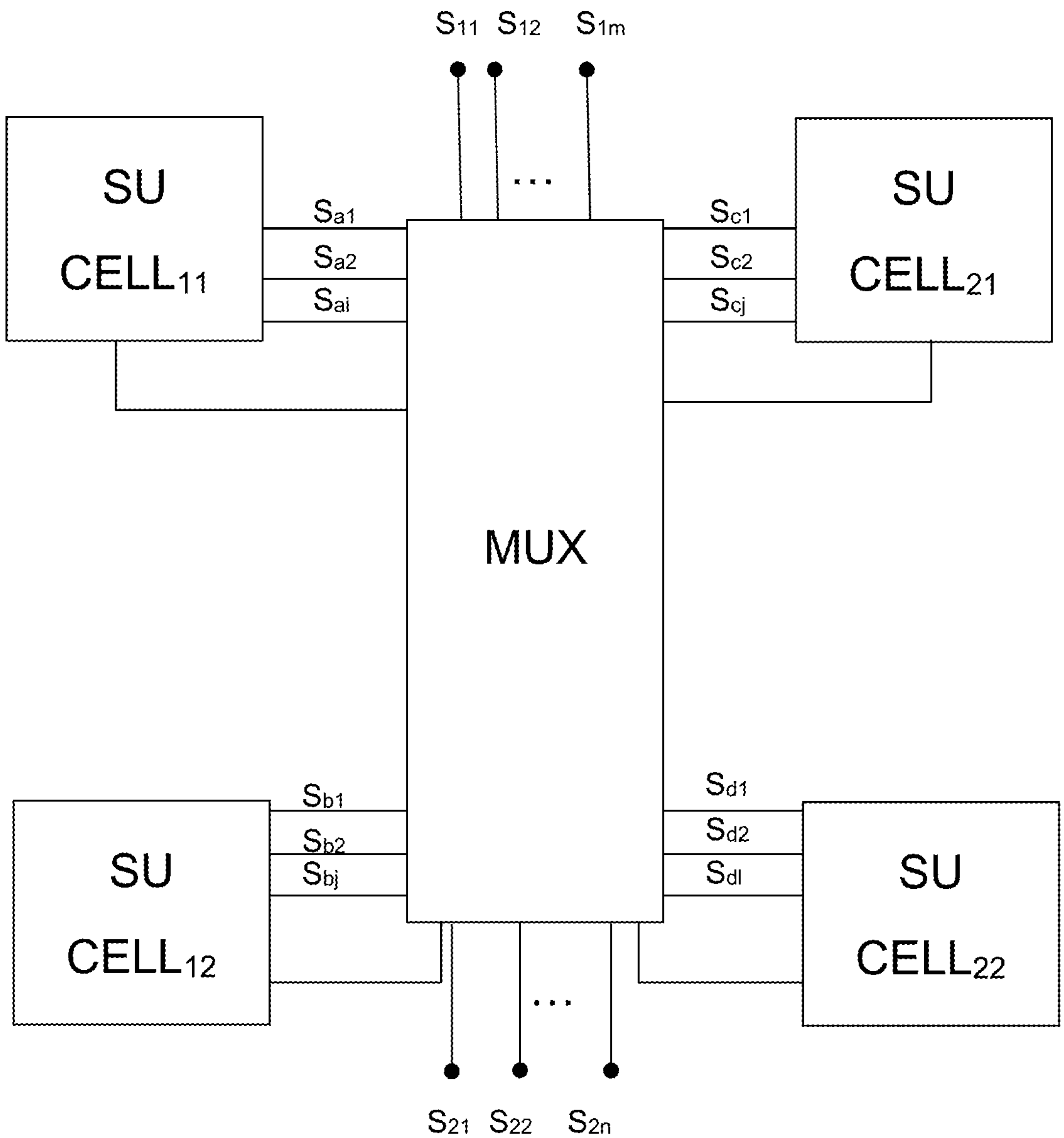
FIG. 22 illustrates a block diagram of a plurality of semantic cells joined through a multiplexer as a semantic group of semantic cells.
Figure 23:
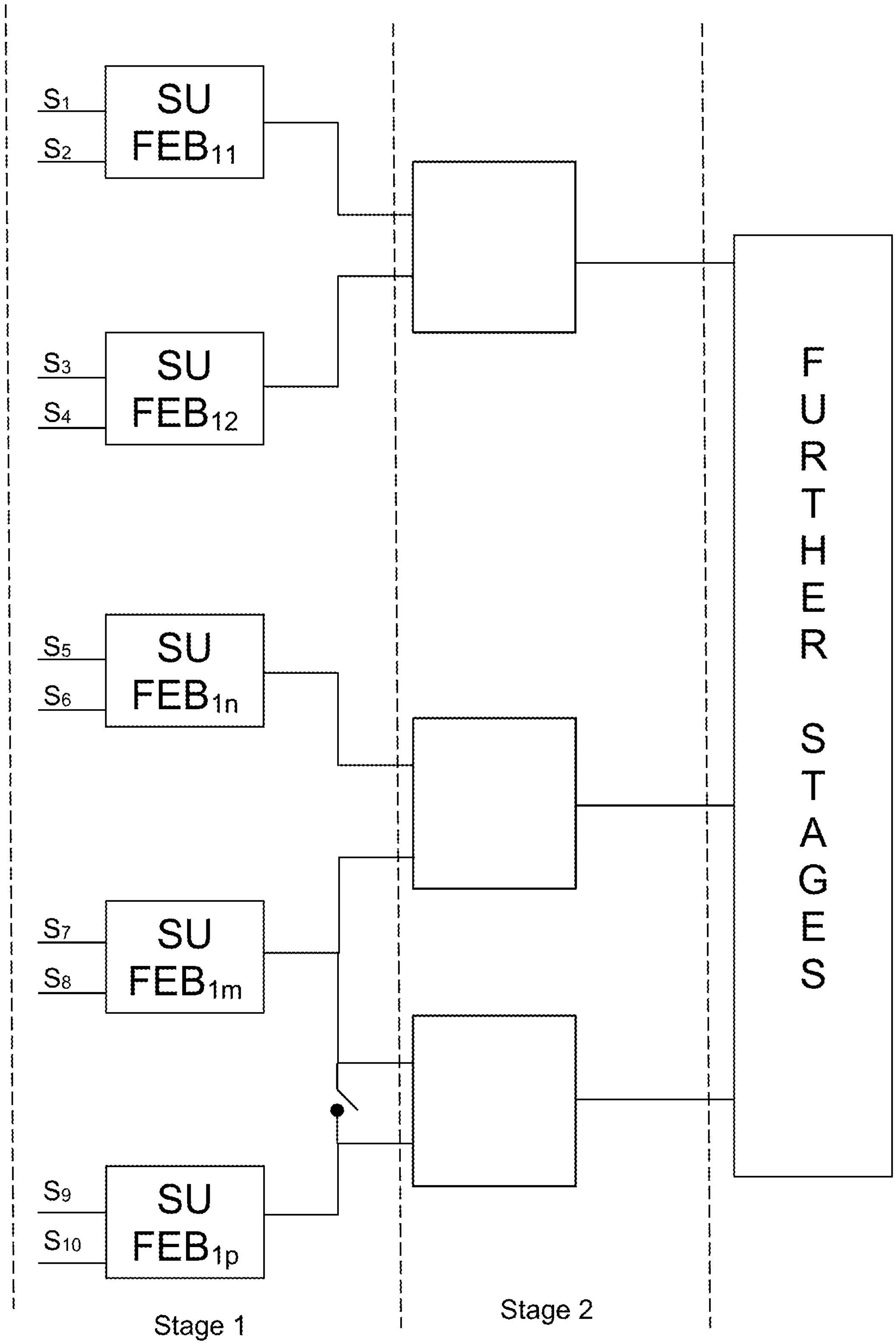
FIG. 23 illustrates a multi-stage block diagram for processing of a collection of semantic cells.

The semantic units may comprise at least one semantic cell. A semantic cell may or may not comprise at least one conditioning semantic unit front end block (SU FEB) (e.g. FIG. 19A B C). Examples of semantic units and cells are depicted in FIGS. 21, 22 and 23. A semantic cell may comprise SU FEBs in a switched and/or hierarchical architecture (e.g. FIG. 21, 23). FIG. 21 shows an example of configuration of a switched architecture while FIG. 22 shows an example of a semantic unit cell block. While those examples comprise semantic components such as SU FEBs (semantic unit front end block), SU CELL (semantic unit cell), semantic unit cell block, and SU (semantic unit) it is to be understood that in some cases they may be used interchangeably as architectural elements in diagrams and examples, the reason being that the semantic architecture is hierarchical; further such components and their links may be mapped to semantic network models and may use semantic waves for communicating semantic information. In general, a semantic unit is a higher-level semantic architectural artifact which may or may not comprise any of the other semantic components; further, semantic units may comprise other hardware elements, components and/or blocks (e.g. storage elements, I/O etc.) that may implement semantic and/or other functionalities and/or protocols. It is to be understood that combinations of semantic artifacts and/or components whether disposed and/or configured in a hierarchical layer architecture and/or semantic flux architecture may be used to form semantic memories. Semantic components and/or artifacts may comprise any number of input and output signal interfaces that may be interconnected and used to control voltages, currents, impulses, clocks, discrete or analog inputs and/or outputs, or semantics to other semantic components, computer/semantic units which interpret the data/signals based on semantic analysis as described in this application. As such, the propagation through the semantic architecture is used in semantic inference potentially using hierarchical semantic network models.

A single or a plurality of photodetectors may be connected to a semantic unit. Alternatively, or in addition the photodetectors are connected to multiple semantic units.

The semantic units may include transducer and/or transducing components. Further elements associated with a semantic unit may perform photoelectrical emission detection.

The connection and layout of elements and semantic units may be reconfigurable. As such, the elements and units connections are reconfigured in semantic groups based on grid/mesh control semantic network layout, hierarchical overlay and/or semantic analysis. Multiplexer, demultiplexer, switches (e.g. crosspoint) components and combinations may be used for connection reconfigurability within semantic components and architecture. Such components are depicted in the examples of FIG. 21, 22 as MUX. It is to be understood that such components are used to interconnect semantic components in various configurations whether one to one, one to many, many to one or many to many. Such components may be either analog and/or digital and be controlled via semantic means (e.g. semantic, semantic waves etc.).

Instead, or in addition to, of photoreceptors, sound and/or pressure receptors may be used in such semantic sensing apparatuses.

In yet another example, other types of transducers are utilized in sensor and apparatuses for radio frequency sensing, optical/photon based communication mediums, sound/ultrasound sensing, biosensing and others; application of these apparatuses may vary from communication, quantum computing, localization, proximity sensing, medical imaging, medical applications, DNA sequencing, gene identification/characterization and profiling, networking, cyber security to other applications.

A photodetector detects incident light/photons and transduced signals (e.g. current) are transmitted to and/or through the semantic unit. The semantic unit uses its semantic model, semantic engine and/or circuitry to determine if need to route and/or to control adjacent semantic unit and/or photoreceptors.

A semantic unit may communicate with other semantic units in order to perform semantic inference and/or excite or inhibit other semantic units and/or semantic memory. The communication may be achieved through semantic gating, flux, routing and/or waves.

The photosensor may have a multitude of substrates with each substrate incorporating interconnection links between various elements of the previous substrate. As such the photosensor structure may resemble a hierarchical mesh which may be mapped to a semantic network model. Thus, design and assembly tools and techniques based on semantic inference mesh and/or on semantic network models (e.g. mapped to locations, elements and/or hierarchies) may be used for sensor design and couplings between the sensor elements and layer hierarchies.

If there are multiple modalities capturing the same areas or areas that overlap in the semantic field, then the semantic fusion uses all the imaging artifacts from all these modalities in order to improve the semantic field object detection and identification tasks through semantic analysis applied to semantic mesh and semantic network model.

Sometimes only a number of objects/features in a scene are of interest and the other artifacts gated or considered noise. Semantic routes, views, view frames, factors, leaders and biases are used for conditioning, selection, gating and/or to reject noise. The system may use refocusing/retuning of the sensing elements or entities to increase the signal to noise ratio; in an example, once the system recognized two objects, one of interest (maybe because has a leading semantic attribute within a leading semantic route) and another one not of interest, the semantic engines commands the sensing to focus, increase granularity (e.g. low level mapping and inference), map on the object of interest, while potentially instructing the mesh to reject, factor and/or bias semantics associated with the non-interest objects or scenes.

As presented, the system uses adaptive localization of artifacts and use the semantic models to track their movement in the scene. As such, the movement and location of features, artifacts, types, groups and objects associated with semantic attributes are interpreted and/or tracked continuously using semantic analysis and control; the system continuously adjusts the semantic models based on semantic analysis.

A semantic network model can be mapped to data, frames, images and/or data renderings from the sensors based on location; endpoints, links and semantic groups of artifacts are potentially mapped; further, the semantic network model is mapped to the location and/or identification of the sensors in the sensor array or grid. The system may map the endpoints directly to the array and grid of sensors and sensor elements via location and/or identification. Alternatively, or in addition, the system may map the semantic model artifacts based on components and/or group identification and/or semantics. Mappings may be one to one, one to many and many to many; the system may use semantic groups to perform the grouping of sensor elements either as they are represented and mapped as one or more endpoints and/or links. The system may map semantic groups of network elements to semantic groups of sensing elements.

The system maps semantic groups of elements to the semantics and/or hierarchical semantic artifacts based on learning from other modalities (e.g. voice).

In an example, the photosensors are basically capturing the semantic field and their location, orientation and/or identification are directly correlated with the location of features, objects and/or semantic scenes. In some examples, the system uses stereoscopic vision, depth calculation and other passive and active technologies and techniques.

In the case that the system uses mapping of semantic network model artifacts (e.g. endpoints and/or links) to the sensor grid elements, the system may map an artifact to a group of elements and as such the semantic inference on the group may be associated with the artifact. Alternatively, or in addition the inference on the artifact may be associated and/or translated to a semantic group. Further the system may use hierarchical transformations on artifacts to represent groups, causality and other relationships. The system may use semantic inference at an artifact and as such a semantic group of elements. Also, because a semantic feature may be comprised across the artifacts the system uses the hierarchical network semantic model to detect/compose the feature at a hierarchy level and associate the feature with other semantics in the network model based on the semantic routes between the endpoints of the semantic group comprising the feature.

The system may use semantic orientation for comparing and fusing features, frames or scenes.

Semantic artifacts may be associated with endpoints and/or links whether in a hierarchical or non-hierarchical manner.

Further the semantic artifacts (e.g. semantics, semantic groups, semantic routes, shapes, views etc.) may determine the mapping of the semantic network model to the grid of elements. In one such example the mapping is determined by the correlation and/or inference between the semantics artifacts in the network model and the semantics artifacts associated with the elements in the grid.

Semantic trails, semantic routes and shapes are used to represent/convey pattern matching between semantics, sensing elements, mesh/grid layout and semantic artifacts at any layer of a hierarchical semantic network model or between layers and hierarchies.

The system may use semantic shaping and/or hierarchical semantic pattern matching to identify common artifacts, areas, locations and/or semantic groups between frames and/or images; such artifacts may be used as anchors. In some examples, based on the anchoring of processed frames on at least one artifact the system may calculate indexing factors used to reorient and/or focus sensing artifacts (e.g. cameras); in further examples such indexing factors may be used to actuate mechanisms, motors, spinners, springs, stabilizers, shocks and further attachment elements of the sensing components to the chassis bearer.

A semantic network model can be composed from a plurality of sub-models; the sub-models may be ingested from various sources (e.g. a semantic flux), may comprise semantic rules with different biases and orientations, may represent various themes, may be associated with particular artifacts and so forth. They may be distributed and/or fused at any level of the semantic network model hierarchy.

In an example, the system recognizes the semantic of an image or semantic scene in a hierarchical fashion. The system detects various high-level semantics that are used to route the semantic inference at lower levels in the hierarchical semantic model. Further, the semantic inference may be routed between layers in the hierarchy based on the semantic field and scene developments analysis. The system may control the sensing elements based on the semantic analysis. In an example, high-level semantics may be determined from a coarse or fast assessment of the semantics at lower levels. The system may perform inference in any direction and/or patterns in order to improve semantic accuracy and granularity. The patterns may be associated with semantic routes, shapes and further the system performs semantic orientation and pattern recognition based on leadership status. The patterns may be related with absolute or relative directions and orientations in a composite fashion within the hierarchical semantic network model.

The system may use indexing of semantic network artifacts, to determine and preserve the scene development. In an example, the system uses intermediary and/or indexed mapping of model artifacts to determine that a car has the color brown by evaluating the car chassis visual model from left to middle of the car and further middle to right. Thus, the system splits and maps the original shape/area/data/text to model sub-artifacts and perform inference on sub-artifacts. The semantic relationship between the original artifact and/or sub-artifacts may be represented as semantic groups and/or sub-models. The inference on sub-artifacts may be composed potentially in a hierarchical manner and assigned to the original artifact. The sub-artifacts may be mapped based on semantic indexing of the original artifact. Model artifacts comprise endpoints, links, sub-models and other semantic artifacts.

In the previous example the system may have detected that endpoint A and B are shades of brown and that a link between them is CONTINUOUS FADING COLOR so that by using semantic analysis the system may have further inferred brown shapes. Further analyzing other features and hierarchical artifacts at hierarchical levels infer BROWN CAR AT C, SIGNAL WHITE, DELOREAN SIGNAL ON, SIGNAL OFF, SIGNAL BROKEN, JOHN'S DELOREAN etc. Thus, the system is able to identify artifacts at any semantic level (e.g. CAR, DELOREAN, JOHN'S DELOREAN) based on semantic analysis. Thus, as explained throughout this application, the system is able to use semantic identities in a routing, gating, orientational and/or hierarchical manner in order to guide the semantic inference of semantic identities. In some examples, the system is allowed to pursue semantic identification based on gating and/or access control (e.g. allowing particular semantic groups and/or semantic identities to pursue semantic identification at various levels).

The system uses location, semantics associated with locations and time management rules to infer semantics associated with (semantic) identities. In some examples, the system observes a location which is associated with a social event based on a time management rule and the system further has a goal of OBSERVE DE LOREAN CAR based on a LIKE DE LOREAN factor and a semantic route of LIKE DE LOREAN, OBSERVE DE LOREAN and further (JOHN) DE LOREAN SHOULD ATTEND EVENT. The system further infers that DE LOREAN NOT PRESENT until infers that DE LOREAN PRESENT based on the identification of the DeLorean car through sensing means or based on semantic flux and/or inference on other data; it is to be understood that DELOREAN IS PRESENT holds a confidence level based on various factors such as risk in (poor) identification on (JOHN) DELOREAN (owner), semantic flux risk and/or further inference factors. Once the event finishes the system learns that the semantic identifications of DELOREAN is linked through PRESENT (or ATTENDANCE, or other semantic group member) in relation with the semantic identifications of the event. The system may use leadership semantics (e.g. DELOREAN) and semantic identities and/or groups comprising the leadership semantics (e.g. JOHN, DELOREAN; JOHN' S DELOREAN) in order to further match time management rules associated with such semantic identities, semantic groups and/or members thereof (e.g. in the previous example the system may have known that JOHN DELOREAN need to attend a vintage car and/or DELOREAN car event and as such it may have adjusted the factors associated with the presence, identification and/or location of the (JOHN'S) DELOREAN car and/or JOHN DELOREAN).

The system may decay the factors associated with the learned semantic artifacts and thus giving them less priority in inferences; alternatively, or in addition the system moves and/or copies the learned semantic artifacts to other areas of the semantic memory. It is to be understood that the decaying of factors is based for example on the factors associated with LIKE DELOREAN sentiment (e.g. decays less if the factors associated with the sentiment are high and decay more is the factors are low).

Noise or unwanted signals, waves, envelopes, graphics may be detected and isolated via semantic analysis and may be filtered via signal and/or semantic processing techniques. Signal, wave, envelope, graphic, filters, conditioning and identification may be achieved via semantic conditioners. The sematic conditioning can be done by specialized hardware and software components (e.g. semantic units) or can be achieved through more general-purpose computing modules including field programmable gate arrays, GPUs, CPUs and others.

In an example the conditioning is based on semantic orientation, shaping and semantic drift analysis on signals, waveforms, information, graphs, routes, shapes, semantic views, view frames, models etc. Further, the system may compose the conditioning and/or noise, potentially with other inferred semantics, and further condition them.

The process of semantic conditioning, composition, analysis and orientation can be done any number of times at any level or between levels of a hierarchy. The system may determine complex behaviors, patterns and orientations based on such techniques.

The semantic fusion can be done by using unconditioned imaging and signals, conditioned imaging and signals, can use various features, object and groups identification techniques. Alternatively, or in addition, the system may use semantic analysis and conditioning with or on noise signal.

Image analysis can use various sampling techniques including oversampling and under-sampling with the semantic conditioning and fusion techniques.

The conditioning can use analog and digital techniques coupled with semantic analysis in order to perform inference. Analog to digital conversion and digital to analog conversion may be coupled to semantic analysis and/or semantic conditioning.

Various feature detection techniques can employ single, combination and/or multiple stage algorithms and techniques; some may be based on gradients, divergence, nearest neighbor, histograms, clustering, support vector machines, Bayesian networks, entropy (e.g. maximum, minimum and relative; whether quantum and/or statistical), deep convolutional networks, long short-term memory, recurrent neural networks, and others. Combinations of these techniques with semantic analysis may be used; it is understood that such techniques and their formulas may be modeled in semantic models and rules.

The system performs real time statistical analysis on real time semantic routes wherein the system performs statistics based on semantic analysis on the route. In some examples, the system determines statistical health factors given particular routes and/or habits.

In general, deep learning network systems are only relatively efficient for feature extraction and recognition since they don't consider semantic analysis and thus, they require fairly high computing power and in the case of supervised learning require large amounts of training data; even so, the processing is not always achieved in real time. A semantic engine may couple any of former techniques with semantic intelligence and analysis.

Semantic model artifacts may be associated with gradients. In an example, color or grayscale gradients of an image and/or frames are associated to artifacts (e.g. oriented links) in a semantic network graph. In one example the system performs drive semantic or orientation inference based on semantic groups which correspond to features, colors and/or gradients semantic patterns.

In further examples, at least a layer in the semantic model may be mapped and/or associated with a vector field. Further, the divergence of the vector field is used to determine semantic factors associated with the inferred semantics in the semantic model.

In an example of a self-driving car infrastructure the vector field may be associated with the entropy of semantic group of cars travelling in a formation and/or mapped to an endpoint and/or area. It is to be understood that the entropy of the semantic group may be related to a variety of conditions and artifacts including trajectory entropy, volume and/or area entropy, topological entropy, semantic drift entropy, encoding, behavior entropy, intention entropy and/or signature entropy etc. Further, the entropy may be further related and inferred based on endpoint and/or area semantics (e.g. based on sensing, weather conditions etc.), semantic drifts and so forth. In addition, based on endpoint entropy and/or divergence the system may perform semantic analysis including inferring new endpoints and/or links in the semantic model. Further, the system may infer optimal safe trajectories and so forth; it is understood that the system may use optimize trajectories on multiple goals, factors and indicators such as car capabilities, safety, comfort, entropy, energy consumption and so forth.

In further examples, the vector field and/or semantic network model hierarchies may be used to infer, associate and/or apply torque (vectoring) to the drive wheels of semantic post/s or other vehicle/s. Thus, the semantic torque vectoring may provide superior body roll control by including an exhaustive set of conditions and circumstances from a variety of sensors, fluxes components and/or layers in the semantic model. In some examples the torque vectoring is inferred based on current and/or projected conditions and circumstances (e.g. at the locations as mapped on the driving surface area and further based on parameters of embedded sensors in the tires/wheels—used to infer semantic attributes about tires, road surface etc.—and/or about tires, system cyber condition, driver condition etc.).

A semantic group may be conditioned, gated, composed, reconstructed from and/or deconstructed in multiple semantic groups based on semantic analysis of the group's semantics and semantic inferences. In an example, a user may pose a challenge to the system and the system performs inference based on the challenge. The challenge may be for example in a semantic structured form and/or natural language. The user may specify goal leader artifacts and factors. While semantics may explicitly comprise those artifacts, in other embodiments the semantic system also infers them based on further semantic analysis initiated internally.

In some cases, the system infers goals and routes for a response. For example, a user or a collaborative system may ask a question "is this sweet?" and the system is able to perform goal identification-based inference for "sweet" drive semantic and the previous inference on the context. The system is able to couple this with a previous inference of an object that formed semantic trails, routes and composite semantics such as "APPLE RED GRAY LINES AT THE BOTTOM" "SWEET 50" "VERY SWEET" "FAVORITE 100" "BEST APPLE" etc.

The system may form semantic groups based on semantic analysis and semantic linguistic relations. In an example, group composition may be implemented based on the synonymy of semantics that define and/or are associated with at least two semantic groups. In a further example, the system may form a composite semantic group comprising only the semantics that are synonyms at the group definition semantic level and/or group membership semantic level. The synonymy may be determined based on inferred semantic factors, indicators, routes and/or semantic view information. Thus, compositions supporting particular goals, factors, orientations, shapings (e.g. shape-based inference) and/or indicators are based on such techniques. In other examples, they may be based on antonymy; further, any other semantic linguistic relation may be used to emulate composition between semantic groups. Further, the system may infer and assign factors, indicators and/or semantics to newly formed groups based on semantic analysis. Such techniques may be used to perform semantic analysis for drive semantics, semantic routes, views and other semantic artifacts based on semantic chain development.

Semantic groups composition may be used for semantic orientation, shaping and/or drift. For example, the system may calculate orientation and/or drift between two semantic routes.

The semantic groups formations are also location, time and/or semantic artifact based. In an example, they may be modeled/represented as semantic network graphs where any causal relationship is modeled/represented as an oriented link between two semantic artifacts that share the causal relationship. In an example of two entities A and B a causal relationship may be "A THREAT TO B" or "A INFECTED B" and as such the system represents the causality as an oriented link from A to B. The oriented link may be assigned a semantic of THREAT or INFECTED or alternatively, or in addition, an upper hierarchy artifact may determine/specify the causality relation via its associated semantics.

A semantic system uses semantic clustering of data in a memory (e.g. semantic memory) for efficient access, inference and rendering of mapped images and frames. The semantic clustering is based on semantic analysis, semantic model and semantic groups. Additionally, the system uses location clustering and time clustering analysis based on semantic analysis, semantic network models and any of the techniques explained throughout this application.

Sometimes the locations are associated with artifacts at that location and as such the system performs groupings of the artifacts based on the semantics associated with the locations and/or the links between endpoints associated with those locations.

In an example, the system ingests image, video frames, tactile, pointing and/or other inputs (e.g. from a user). As such, the system maps the network semantic model to the renderings/frames/data and performs semantic analysis to determine semantics and or semantic groups. Further, the oriented links between endpoints associated with semantic groups in the semantic network model may be adjusted based on semantic analysis. Alternatively, or in addition, inputs from a user or other sources may be used to setup, determine or adjust the semantics associated with the semantic network model. Further, users may pose challenges and the system performs inference based on the challenge. The challenge may comprise a specified and/or inferred goal—e.g. performing a transaction with moderate risk and moderate cost in a period of time or, "buy a track ticket for 10$ until breakfast tomorrow"; it is observed that in the last semantic construct the indicator risk is implicitly inferred as the semantic analysis and/or route progresses (e.g. the system may not poses the idea of the risk of not attaining the goal until analyzing the end of the construct and/or during the semantic goal development) and thus the system infers risk factors and indicators based on semantic budgets (e.g. time, cost etc.). In such an example the system may generate a semantic route and/or semantic rules based on the inferred semantics and semantic time. Thus, the composite transaction semantic may be associated with semantic time intervals comprising the inference of "breakfast" and "tomorrow". Further, it may be associated with semantic intervals comprising a semantic flux monitoring, ticket provider sales and the target price. It is to be observed that the price and/or time target is a semantic goal related to semantic budgets of the composite or route main goal. Based on further semantic analysis (e.g. based on the challenger's funds/budgets, availability/supply, track event attributes/purpose/goal/identity, track semantic time constraints etc.) the system may prioritize one budget (time, cost) over the other and/or factorize one in rapport with another (e.g. time to cost factor); it is understood that the semantic analysis may comprise past, current, speculative and/or projected semantic artifacts. It is to be mentioned that the system may have a variety of registered track providers (e.g. via fluxes) and the system may select one (e.g. challenge/issue/command an offer, purchase order and/or purchase semantic for a particular semantic identity using a payment processor and/or secured budgets) based on the goals and/or other ratings coupled with semantic analysis. Further, the system may use indicator biases (e.g. risk bias; desirability bias comprising desire, worthiness etc.) to control the behavior (e.g. index and/or factorize budgets, hysteresis, damping, diffusion, routing and/or drifts—etc.), trajectory and/or route entropy; further factors such as desirability to risk composable factor, desirability to risk composable routes and other composable artifacts may be used. Analogously, the system may determine carriers, providers, posts, vehicles, routes and/or groups thereof for movement, shipping, receiving, logistics etc.

In similar ways the system may implement semantic contracts wherein contracts are ingested as a sensed free form, text file, specialized form document, XML file and/or other fields and formats. The system infers clauses (e.g. goals, indicators etc.) based on semantic analysis on the contract. Once the system infers further semantic artifacts it updates the status (e.g. factors, indicators) related with the goals (e.g. SHOE DISTRIBUTOR A RISK 90% OF LOW SHOE SUPPLY). Further, the system may have a rule that specifies that the previous status composite semantic may be coupled with an automatic order to DISTRIBUTOR B while withholding payments to DISTRIBUTOR A based on factor plans related to payments; the withholding of payments may comprise paying only partial sums based on payment plans; such payment plans may be associated with time management, budgeting, factoring, indexing and any other semantic rules It is to be understood that the system may be connected to at least one payment processor potentially via a semantic flux.

In further examples the semantic system is connected and/or comprising live feeds and/or semantic fluxes associated with financial markets, trading, stock indices and/or other financial instruments. Thus, the system may issue trading and/or stock orders based on investment goals, associated fees, target asset allocation and diversification. It is to be understood that the investment goals may comprise reward to risk factors, budgeting and/or further factorization. Also, the associated fees may be used as budgets associated to semantic indicators of particular trades, stocks, indices, trades/stocks/indices type and/or status, and/or semantic groups thereof. Also, the diversification may be based on entanglement entropy of particular trades in respect to factors and/or parameters such as domain, valuation, rating, leadership, seasonal (e.g. based on time management), budgets, revenue, trend (e.g. potentially mapped in the semantic network model) and/or other parameters. The system may use damping factors and/or rules to issue market orders wherein the damping equilibrium is the target goal (e.g. acquire a particular budget).

During trading, inference and/or execution the system may encounter delays caused by infrastructure which may trigger decaying of budgets and further semantic analysis. It is to be understood that the indices/stocks valuations and/or graphs may be mapped into semantic analysis based on (interval) thresholding and/or (overlay) semantic network models.

A semantic system uses an adaptive semantic model and continuous inference of semantics in order to interpret the semantic field. The semantic field may be bound to sensorial inputs and/or any other source. Semantics may be associated with general vocabularies; sometimes more specific vocabularies incorporating domain and formal knowledge may be used. A feature may be represented as a semantic or semantic group. A partially realized feature may be one that doesn't include all the associated expected (goal) semantics and/or the factors associated do not meet a baseline interval threshold or requirement. In some examples the intervals are based on semantic intervals.

A semantic system doesn't require extensive training sets and in general is more optimized for real time utilization due its capability of filtering unwanted noise and features based on the semantic model. As an example, in feature extraction techniques some features may not be inferred if the semantic system deems them as not being realizable based on the semantic model, semantic rules and semantic orientation. Alternatively, a partially realized feature may be inferred based on the semantic model (e.g. based on a partially realized semantic group, semantic factoring etc.). As explained before, inferring the semantic groups may be based on sensing, semantic attributes, localization, timing and semantic analysis. While the semantic attributes and localization may be associated to entire objects or features, they may also be associated to simpler artifacts or features like a partial contour, shape etc. The semantic model may use semantic groups of features for single object or multiple objects detection. An object in an image can be recognized via the semantic attributes associated to its components or features.

As part of the semantic chain development, the semantic model comprising semantic rules, semantic routes, semantic groups and others may evolve through learning.

The localizations within various semantic fields may be based on semantic determinations wherein features, objects, signatures, groups of features and groups of objects are determined and correlated in various images, semantic scenes, semantic fields using timings (e.g. semantic timings) associated with the semantics and the semantic model.

Temporary or permanent semantics, semantic identification and/or ids may be assigned to objects and groups. Temporary identification may be used for preserving privacy; the system may invalidate and/or discard temporary identification after an interval of time; the interval of time might be based on semantic time intervals and the system uses semantic analysis for invalidation and/or discard. Sometimes the semantics associated with temporary identification may be processed and/or transferred to the permanent identification. The information transferred may be filtered based on semantic gate and/or access control rules for privacy preservation; in an example, only a subset of the semantics inferred for the temporary identification are transferred to a permanent identification.

The system may also ensure data governance and access control to data. As such, data is stored in semantic memories and managed (e.g. invalidated, deleted) and/or accessed based on semantic access control. In further examples, a semantic wallet comprising identification, authentication and encryption keys may be used to gain (which may in addition be viewed as a semantic gain and/or drift) access to data by allowing access at various levels in a semantic model hierarchy. It is to be understood that the semantic wallet may be also stored as a hierarchical semantic model and be encrypted based on biometrics, password, multiple factor authentication, temporary tokens and other technologies.

In some examples, the wallet is comprised and/or stored in a semantic memory, optical, radio frequency and/or other electromagnetic device. Further, wallet information, identities and authentication may be communicated via various protocols and/or further techniques some of which are explained in this application.

The transfer of data between various semantic groups, endpoints, areas, regions, volumes, renderings, systems, devices, files, databases, fields and/or controls may be semantic gated and/or conditioned.

In some examples, the system uses semantic routing and semantic analysis to distribute documents to fluxes via semantic gating and semantic profiles.

In further examples, documents, multimedia, files, texts, paragraphs and other ingested or processed data is associated with semantic artifacts based on semantic inference on content and/or semantic identification. As such, the system may perform inference, reconstruction, routing and gating based on such artifacts. Further, the system may perform access control on such (ingested) artifacts and/or data by deleting (e.g. from/of artifact, from memory and/or via induced incoherent and/or coherent collapsed conditioning etc.), scrambling (e.g. potentially via induced crypto conditioning), obturate, obscure and/or collapse the paragraphs and/or information based on the semantic access control rules and/or further semantic analysis. Further, the (ingested) artifacts may be routed and/or gated within the semantic network. Further, or subsequently, the system may perform composition, overlaying, rendering, conditioning and/or further semantic analysis of the received information in rapport with artifacts having a semantic identity (e.g. associated with a disseminated artifact, distributed artifacts, document, paragraph, object, user and/or person etc.).

Semantic rules comprise semantic composition, access control, time management, ratings and factors.

Localization and distance to objects in some vision systems is achieved through diversity sensing using multiple vision sensors.

Vision sensors may use photodetectors arrays.

The objects, signatures, groups are correlated in various images and scenes. In an example, semantic orientation and semantic drift thresholding is used for correlation.

While in real time environments full object reconstruction and recognition may be difficult, tracking of various artifacts and semantic field development based only a limited number of leadership semantic artifacts, attributes and/or features, potentially comprising semantic groups, may prove more efficient. As such, in a high velocity data scenario as a stream of data is interpreted the system may adjust based on the environment and timing the factors of a particular sets of semantic attributes that identify a feature and/or object. If through previous semantics the system identified in the stream of images a car and identified the color red for the car and the system determines that there is no likelihood that another artifact of color red may appear or be visible in the direct semantic field then the system may just detect the location of the car by simply comparing, identifying, localizing and tracking the color red in the image or video stream (contextual leader feature). The system may increase the factor/weight of the red color semantic attribute in regard to identification of the vehicle while for example it may gate other locations of red appearances in relation with the car just because those locations are not feasible or unlikely to be reached by the car. The system may group such features and track the group of features and use any semantic grouping techniques and operations; additionally, besides the relative position, the relative dimension of the feature is also considered. The relative positioning and relative dimension may be related to semantic artifacts, endpoints, links, semantic indexing and factoring and/or elements (e.g. sensing elements) in the network semantic model. It is to be understood that although the color has been used in this example, other particularities and/or components may have been used to identify, speed-up and/or improve the identification of the car in such particular contexts, locations and endpoints. In a similar example the system monitors locations and identify objects passing through the locations and semantic model; while identifying an object and/or type at a location the system may determine various other semantics (e.g. particularities) associated with the identification, object and/or type (potentially via semantic groups). Further, the system is able then to better monitor and identify objects at or within locations based on the knowledge of monitoring the movement in and out from a location or in general based on detections at endpoints and/or network model. In a similar way the system may associate and/or identify objects, features and/or semantic attributes with semantic groups (e.g. groups of composite objects, features etc.) based on semantic analysis (e.g. groupings at locations/areas, network semantic model inference etc.); thus, the system is able to further track particular objects in the semantic system based on such semantic groups. Semantic groups may be updated at any time based on further semantic inference. In an example, if the system detects a forklift with a color orange and orange tires it assigns such semantic attributes to the particular forklift object that may be tracked in the field. If later on the system detects that the forklift doesn't match the tire detection pattern and had the tires changed with a set of black tires, then the system updates the semantic group (e.g. add leadership and time management to the added color of orange, while decaying and add time management rule to the change of previous color of orange to black) associated with the particular forklift to reflect the change in color of tires. Thus, the system is able to keep the identification on the particular forklift object within the semantic field based on semantic analysis even when some features or leader features change. Alternatively, or in addition, the system may use other observations, external semantics and/or semantic fluxes to update the semantic group in the previous example (e.g. receive information regarding the forklift change of tires from a TIRE INSTALLER flux; CHANGED TIRES OF FORKLIFT IN THE LOADING AREA 1 TO BLACK TIRES.).

In an example, the semantic network model is mapped absolute or relative to a car's position and/or car's coordinate system.

The system may have a reference group within the semantic model and the system performs relative and/or absolute comparison of the mapped semantic field to that semantic group. The semantic group may be static related to the observers (e.g. sensing, semantic unit, semantic engine view) reference coordinates. In addition, the system may perform relative inferences to the other artifacts in the field and potentially infer factors and indexing. In an example, the system has a semantic group representing the flat bed of the composite post carrier, flat bed or hood of a car and as such the semantic inference will look to adjust the semantic model/views comprising this semantic artifact in relationship with the semantic scene/field development and/or mapping of scene/field.

In an example, the system will look to find semantic path groups in the model that may allow the passing of the hood artifact. The system may infer that a path and/or endpoint group comprises an artifact which results in deeming the path and/or endpoint group as non-feasible because a denied semantic has been inferred for the artifact. It is understood that the paths and/or endpoint groups may be linked to hierarchies in the model. Further the system uses semantic orientation, shaping and indexing for determining the hood artifact fitting and shaping. In some examples fitting and shaping may be used to keep a post and/or vehicle in a virtual and/or physical lane.

The system may use dissatisfaction, concern and/or stress factors in association with fitting and/or shaping. In some examples, the system fits and/or loads a post carrier (to storage/parking) based on semantic zoning and low concerns to fit into space. Based on further inference on the goal achievement and/or further evidence it may adjust the concerns factors.

Techniques such as fitting and shaping may be used to infer and optimize artifacts (and semantic groups thereof) storage, positioning, design and travel in particular areas and/or volumes (e.g. as mapped to semantic models).

The system may project goals and/or semantic budgets of fitting and/or collapsing an artifact (e.g. endpoint, route etc.) and/or groups of artifacts in another artifact or group of artifacts.

Semantic factors and/or budgets may be projected and/or collapsed based on the inference in a semantic group and/or collapse of a semantic group.

In some examples, the system uses overlay semantic artifacts, associated factors and/or budgets on a semantic model and/or hierarchy to infer projected views, semantic orientations, semantic groups, routes, budgets, factors and further semantic artifacts.

Fitting and shaping may be combined with semantic analysis on habits, purpose, uses and customs. In some examples, the system uses such techniques to optimize furniture arrangement in a room. In further examples, the system uses such techniques to optimize storage of posts and/or containers in a garage, transportation or logistic cargo.

Semantic groups whether or not partially realized are identified and tracked by a set of factored semantic attributes.

The identification of the locations of interest in the image, represented by the objects or the semantic groups of interest are based on semantic attributes, semantic shapes and other semantic artifacts; examples may include color, shape etc. Further, the system infers indexing comprising rate change factors and/or indicators of location, dimensionality, size, attributes, semantic routes and/or further semantic artifacts. Alternatively, or in addition, the system infers factors and/or indicators associated with changes of location, dimensionality, size, attributes, semantic routes and/or further semantic artifacts.

The locations may be based on depth information if the image capture comprises such information (e.g. based on TOF, stereoscopic vision indexing etc.).

The systems presented before are used in radar type applications. The system uses the reflections and backscattering of the transmitted waves from the illuminated objects to identify entities and infer semantic attributes related to those entities. As such, the semantic system is able to infer any type of semantics as explained above based on the localization and probing of entities. The entities may be detected based on radio frequency sensor diversity, measurements, semantic analysis and adjustment. As such the semantic system may use hierarchical threshold calculations and semantic analysis on the received measurements, waveforms or signals to determine the location and/or semantic attributes for the detected objects.

The semantic system may store semantic inference rules, semantic templates, patterns, signatures related with measurements, waveforms, signals. In a typical RF application, the system receives and processes sensing data via analog and digital components and blocks (e.g. RF front ends). The front end may embed a semantic unit. The analog to digital conversion is usually a bottleneck in high resolution sensing systems and thus having a semantic engine coupled in analog and/or discrete domain may provide more efficient sensing, closer to the sensing elements (e.g. antennas) while increasing dynamic range.

In one example, the semantic engine controls electrical and optical blocks and parameters for improved efficiency (e.g. voltage and/or currents, element charge).

The system may organize groups of measurements, signals and/or waveforms in semantic groups and use semantic analysis and semantic group conditioning for semantic inference. The semantic model may comprise patterns based on semantic groups whether group dependent or group independent.

When coupled with radio frequency and optical front-end systems the semantic engine is capable of advanced semantic inference including object identification, localization and behavioral analysis. Such front ends and components may comprise antennas, lenses, photo elements, lasers, radiative elements, radiative meshes, beam steering meshes etc.

In some synthetic aperture and/or interferometric embodiments the return signals may be correlated for obtaining spectral images containing the spectral renderings of the objects in the field of view. The intensity of pixels for scanned field varies based on the reflection (e.g. backscattered waves) waveforms obtained from the illuminated artifacts and depends on the dielectric constant. The dielectric constant in materials and other natural or artificial artifacts increases in the presence of moisture and as such the signal to noise ratio increases. In another example the signal to noise may decrease based on semantic field objects' arrangements (e.g. as detected by optics/camera and/or rf sensing). As such, being able to interconnect various inferences (e.g. optical detection of rain, moisture sensor, RF/optical reflectivity) with the return signals will help with the interpretation of the return in any type of reflection waveforms whether backscattered or transmitted.

It is beneficial to adjust polarizations in order to achieve signal diversity and hence improve detection.

In general, the return signal from an illuminated artifact are received with the same polarization as the transmit signal.

However, in particular cases of vegetation, special materials and other artifacts, depolarization may occur; depolarization determines the transmit wave to be scattered and vibrate in different directions with various polarizations. Volume and surface scattering usually result in depolarization. For example, vegetation may be well detected through the depolarization effect.

As such, various signals, streams, frames, images and renderings may be captured based on various polarizations and be analyzed and fused to more confidently detect artifacts and their characteristics based on their signatures in various polarizations.

Also, by varying other parameters (e.g. amplitude, phase, frequency, chirping) the scattering signature is changed and as in a similar way as the previous example of various polarization settings the received data may be fused to detect the artifacts in the field.

Multiband multi-polarization radar and optical systems acquire images at several wavelengths, polarizations using diversity techniques. By varying the wavelength/polarization diversity settings is feasible to create color images that render various surface properties in different colors and as such being processed accordingly using semantic analysis. Color models such as RGB (red green blue), HSV (hue-saturation-value), HSI (hue-saturation-intensity) and HSL (hue-saturation-lightness) may be used for semantic analysis, semantic augmentation and/or rendering (e.g. associate semantics with commands, voltages, currents and other control mechanisms in order to control display elements, augmentation elements etc.). It is to be understood that the display and augmentation elements may comprise any hardware and bioengineered components and blocks enumerated in sections of this disclosure.

The semantic engine may use goal-based inference for determining the best semantic routes to follow. The goal may be based on achieving semantics, particular semantic factors (e.g. rating) and any combination of those; alternatively, or in addition, a goal may be based on achieving association/de-association of particular semantic artifacts and tracked artifacts and potential factors based on association. Further, a goal may be hierarchical and/or comprise semantic grouping and/or clustering (e.g. group dependent or group independent semantic memory clustering and/or activation/deactivation). The goal may be associated with semantic budgets. The goal may be used to determine projected semantic views and view frames. Further, the system may use semantic orientation to orient semantic inference toward the goal and projected semantic views and view frames.

The system may establish a goal based on drive semantics, speculative and/or projected inference.

Once goals are established the system performs semantic inference based on goals and sub-goals. Sometimes the system uses different semantic view frames for performing the goal-based inference. The system performs inference that builds semantic routes and assesses the factors of semantics in rapport with the goal's factors and semantic budgets. In an example, the system sets up a goal to gain knowledge or learn car repair. The system evaluates based on semantic analysis that learning about a car's engine provide the most rewarding goal outcome (e.g. "easy to understand" factor based on projection inference of existing models applied to information about engine, "higher pay" factor based on projection and so on) and, as such, establishes learning routes and drive semantics that include semantics associated with the engine. However, as the system uses the semantic route to perform inference it may infer that learning about the engines sensor suite is less risky with similar rewards and as such it may change the sub-goal and/or priority to learning about car's sensor system including CAN bus, OBD interface etc. As such, the system updates the semantic route to adapt to the new sub-goal. The system assesses and/or change the goals and sub goals based on semantic artifacts, other semantic factors, external and/or user feedback etc. In a related example, the system may learn first about the engine sensor suite and further determines that a sub-goal for learning about engine's injection or other components (e.g. transmission) may be more rewarding based on the semantic view of operation. The system may use semantic orientation to determine the semantic drift between the pursued semantic routes and the updated semantic routes of the views, view frames, model etc. Thus, the system may assess whether the pursued routes need to be updated and adapted based on the updated goals, sub-goals and projected semantic views and view frames.

If the pursuing and/or projection of (strategic) goals results in decayed budgets, factors and/or further blocked inferences the system may decay and/or stop altogether (the pursuance of) the goals.

Sub-goals may be inferred and/or related with increasing/decreasing factorizations and/or budgets. In an example, the system infers based on projected analysis that the budgets are too decayed (e.g. and further infer lacks of resources and/or needs—"need higher budget", "need to gain 100") and not allowing to achieve the strategic goal of "learn car repair" and/or further sub-goals of "learn about sensor suite"; thus, the system may perform inference and augmentation towards sub-goals such increasing budgets and/or satisfying short term needs which may further route the inference to attaining semantics, collaborators, fluxes and/or groups which allows higher factorization of budgets. It is to be observed that in some cases the semantic drift between the short term goals and long term (e.g. strategic) goals may increase (e.g. by factorization, indexing etc.) and the semantic drift between the means of achieving the longer term goals and the short term goals may change as well.

Further, the goals/sub-goals, semantic hierarchy, orientation and/or routing comprise variable (allowable) drifts and confusion. The system may re-allocate more resources (e.g. budgets, semantic units) to semantic views associated with (projected) high consequences (e.g. high factorizations) and/or risk; alternatively, or in addition, the system may allocate more resources to (projected) inferences which may not meet factors, budgets (e.g. (semantic) time (quanta) budgets), coherence, confusion and/or drifts; further, the system may use alternate and/or hierarchical routing and/or gating. In an example, of an activity of SURGERY and further ACTUATING SCISSORS may require a lower semantic drift based on the risk factorization of projections and/or consequences. In some examples, the consequences may be related with leadership projections, risks, diffusion and/or tunneling through semantic gating and/or access control. The system may re-allocate resources to such critical operations however, if the inference and/or actuation has drifted and/or is incoherent (e.g. due to decayed budgets, high drift, confusion etc.) the system may re-allocate resources (potentially to a different level of hierarchy) for finding alternate ways and/or zones to employ cutting and/or scissors capability (e.g. CUTTING EB SHAPE-2, CUTTING EC SHAPE-3 (instead) of CUTTING ENDPOINT ZONE A SHAPE-1). Thus, the system may reallocate resources based on semantic factors, budgets, time management, drifts, coherence, confusion, rules and/or further semantic artifacts.

The resource allocation/reallocation may be based on short term goals and/or long/longer term goals. Further, the reallocation may be hierarchical with the short-term goals being allocated/reallocated at a lower level and/or shorter-term memory while the long-term goals may be allocated/reallocated at a higher level and/or longer term memory.

The resource allocation/reallocation may be based on DNA replication and/or remapping.

The semantic orientation provides sentiment analysis based on semantic drifts, decaying and further factor inference. The system further uses semantic orientation and drifts to adjust projected views, view frames and further to guide the semantic inference. In some examples the system uses the drifts (e.g. semantic drift trajectory based on pattern overlay and/or indexing) to smoothen the semantic routes and/or trajectories. Smoothing of routes and trajectories may be used for optimized command and control, prediction, correlation, covariance, conditioning and so forth.

The smoothing may be associated and/or be used to model/implement hysteresis in some examples.

The hysteresis is modeled and/or implemented based on semantic profiles, semantic rules, decaying, drift, factors, goals, projections, intentions, desires and/or further semantic analysis. In some examples, the output of the battery unit and/or control voltages/currents/electromagnetic effects in the semantic post is increased and/or decreased based on an inferred intention and/or desire (e.g. of a control unit and/or user) and further time management rules. Analogously the electrical control values of HVAC units may be controlled in similar ways. In further examples, vehicle acceleration is controlled by varying electrical voltages, currents and/or magnetic properties/fluxes based on semantic hysteresis.

The system may learn semantic indexing and/or hysteresis associated with semantic identities and store it in semantic profiles. In some examples, the system associates inferred artifacts in semantic views with driver commands (e.g. as captured by sensors, devices and/or semantic fluxes). Thus, the system may know through semantic inference (e.g. semantic group, time management etc.) that the user is associated and/or actuates the acceleration and/or steering; as such, the system groups the semantic artifacts (e.g. semantic routes/trails etc.) inferred from such actuation related sensors with the semantic artifacts inferred from further semantic field (e.g. environment); in circumstances where the system infers less used and/or weighted routes, high factors (e.g. risk, alertness etc.) and/or unusual/unfamiliar behavior in the semantic field the system may learn rules associated with indexing and/or hysteresis inferred based on users actuation commands and/or further consequences as further inferred on the semantic field.

As specified before the system is able to infer factors (e.g. rating, weighting etc.) for a semantic; the system may use factor plans.

The factors may be used to determine commands to the controlled entities/components/blocks/devices including actuators, sensors, I/O and/or transducers. The commands may be linked and/or specified with semantics; alternatively, or in addition the commands can be specified and/or linked with a parameter and/or value to be applied to the controlled artifact; in an example, a voltage or current interval may be specified for a specific command linked to a parameter. Alternatively, or in addition, the system comprises/infers and/or receives (e.g. from user, semantic flux etc.) a reference voltage, value/s, interval/s and/or signals which is/are pondered/correlated/convoluted with a corresponding factor (e.g. weight) from a semantic. In another example, the voltage and current are indexed in time based on semantics and factors (e.g. indexing factor). The system comprises an indexing factor that occurs with each semantic and is applied to the current value. The indexing factor may be positive or negative.

The command may be a function of the factor of the semantic associated with the command. As an example, the value of a parameter or voltage may be a function of a weight.

In some examples the system uses semantic routes to implement commands.

A command may be represented as a semantic. The semantic may be a composition linked to a semantic route and/or group of other semantics which may be associated with commands; as such the semantic command chain is executing based on associated compositional semantics and/or goals possibly based on timing, factors, orientation drifts and/or budgets. The factors of the composite control semantic and its components are calculated based on inference that may include the factors of the entire compositional chain of the command execution. In an example, the factors of a composite semantic may be a function of the factors through the compositional chain, groups and/or routing; as such, all the semantics of the compositional chain are contributing to the command through the factors associated with them. The factors may be used to issue commands (e.g. voltage, current, signal, digital commands etc.). In an example, the semantic engine infers a semantic with a specific weight and based on the semantic model which may include a compositional template (e.g. comprising semantic groups and/or route wherein the semantic defines, belongs or drives semantic coupled terms e.g. synonyms) and possibly factors rules associated with the semantic, the system infers factors and budgets for the compositional template semantics (e.g. semantic group/semantics); the compositional semantics may be associated with actions and commands and as such the actions and commands are pondered with the inferred factors for the compositional semantics (e.g. for a command control an associated voltage is adjusted based on the factor inferred for the compositional semantic associated with the command control). Further, the compositional semantic weights/factors (e.g. semantic route semantic weights/factors) may be adjusted based on the composite semantic weights/factors. If the entity (e.g. IO component, sensor) associated with the command is unable to perform the associated command and/or route in a desired budget the system may not issue the control command to the particular entity; it may infer other semantics, or possible expand or adjust the initial semantic (e.g. through semantic route expansion, semantic orientation, drift etc.) to compositional semantics, infer/determine new semantic routes further until the system infer/determines that the overall sematic objective or projection is achievable as per goal (e.g. budget).

Additionally, the system may receive feedback from the command control and adjusts the semantic model including the weights/factors, rules, templates and other artifacts based on signal feedback (e.g. from sensors that perceive the effects of the commands).

In one example, the system performs inference on a composite semantic until achieves a particular factor/weight, potentially within a budget; subsequently of achieving the goal it may expand the semantic using other semantic routes and inference paths; alternatively, once the goal is achieved the system doesn't use that semantic for further inference if the semantic is decayed in the semantic view frame.

In further examples, the system speculates at least one semantic artifact and compose it in at least one view and/or hierarchical level and further assess the coherency of narratives. It is to be understood that the speculative artifact may be based on situational and contextual understanding based on semantic artifacts at a higher abstraction and/or hierarchical layer/level. Further, such abstraction or hierarchical understanding may be controlled through access controls, authentication and data governance.

A semantic system may establish semantic routes through goal-based inferences. The goals may be associated with semantics and used to infer or determine a set of semantic routes and semantic budgets which then may be pursued in order to achieve the goal; this may include executing commands and continuously updating the model based on sensing and feedback. When the system achieves the goal (e.g. infers or reinforces a semantic and/or achieves a factor value/interval for it) it rates the experience and the system adjusts indicators and semantic factors (e.g. costs and/or risks).

The semantic engine couple's information from a variety of sources.

The system may use and infer semantics from databases, text, web pages, files, spreadsheets, visual and non-visual environment and so on. In one example, semantic agents or units are actively monitoring such data sources and connect through the semantic infrastructure in a distributed manner.

The systems maintain semantic artifacts associated with entities wherein the semantics are representative of the capabilities or functionality of the entities and are potentially acquired when the entities register or are detected by the system.

In an example, an automobile ECU determines a set of particular semantics related to a semantic route and sends the semantics to sensors and actuators sensors by matching the particular semantics with the associated capabilities or functionality of the sensors. The receiving entities may receive the semantics via semantic fluxes, potentially with associated weights/factors and perform semantic analysis including composition, routing, and/or orientation and make their own decisions whether to execute actions or not. The semantics may be broadcasted, and the sensors may listen to all or particular semantics based on semantic view, semantic view frame and/or semantic route. The semantic view and semantic view frames may be particularized for each entity as explained in this application. Further the sensors may be mapped to a semantic network model.

The ECU may send semantic routes and semantic budgets to sensors. The sensors may use the route selectively wherein the sensor determines commands associated with semantics of its own capabilities (e.g. registered or marked semantics) in the semantic route and potentially execute them within a required budget; further, it listens for other commands that are completed by other entities until the semantic route completes.

At any given time, the semantic sensor may consider multiple routes at multiple levels based on execution, sensed context and/or orientation. As mentioned, the semantic sensor performs semantic analysis on its own.

The system may detect eavesdropping and malicious information injection attempts wherein the system infers high incoherency, confusion, drift and entropy (of) factors.

In an example the semantic orientation and semantic drifts are determined and associated based on analysis involving synonymy and/or antonymy. The system calculates the shift/drift from goals and projections based on composition and factorization of semantics in routes, view frames and views in rapport with a goal. Thus, the system may highly semantic factorize synonyms and/or antonyms of the goal semantic when performing semantic analysis.

As such the system is able to correlate the information from a multi domain, multi-source and heterogenous environments, perform sentiment analysis and learn.

The system may determine a factor/weight for a semantic in a particular context (e.g. semantic view frame). In one example, the factor/weight may be associated with a sentiment of suitability of the semantic in the particular semantic view. In another example, the system executes an action (e.g. for a car automation application it controls an analog or digital interface to decrease the speed) based on an inferred semantic; the system may have coupled the action in the semantic with and at least one expected semantic in a semantic route to occur (potentially within a semantic budget) while or after the action semantic is executed; thus, while executing the action or shortly thereafter the system correlates any inferred semantics with the expected or projected semantics artifacts; as such, if the system doesn't infer the expected semantic and/or factor, the system may further adjust the semantic route, model and potentially the weights/factors of the semantic route, rule or link related to the action semantic and the projected semantic; in such an example, the system may infer a semantic and/or factor that reflect a positive or negative sentiment and is used for characterizing the bond between the first (e.g. action) semantic and the second (e.g. projected) semantic in the semantic route; if the bond needs to be tuned, the weights/factors are tuned and/or a sentiment semantic is associated with the first and second semantic and/or semantic route while potentially forming a semantic group. In an example, a negative factor may represent a negative sentiment in rapport with a semantic artifact and/or indicator. Positive and negative sentiments may be represented as a factor associated to semantic artifacts and compositions of semantic routes, views, trails and/or view frames; as such, the system composes the semantic factors and other performance indicators based on the semantics associated to trail, route and/or view frame and their components; sometimes it may be based on the outcome of expanding a semantic route into a semantic view frame. The signals and/or commands associated with a semantic artifact may be conditioned and possibly assigned new semantics and semantic factors (e.g. if only a part of the action was having a positive sentiment, the system may gate the action to a positive, negative and neutral sentiment and/or signal) and further associate those with the semantic model, semantic routes and semantic rules. Positive and negative sentiments may be in rapport with a semantic route or shape selected for the context or semantic view. The positive and negative sentiment may be used and/or inferred based on semantic orientation.

A semantic model may be expressed via any methods which convey language including text, speech, signs, gestures or any other interface. The semantics may be conveyed through localization of artifacts within a semantic field and semantic inference based on semantic model. When conveyed via such an interface the system converts the ingested data into a temporary meaning representation and then compares the internal meaning representation with the temporary representation. Sometimes in order to speed up the process, the system doesn't fuse the internal semantic model with the newly processed meaning representation at the time of the configuration; the process may be delayed or allowed based on semantic inference and analysis including time management. In an example, the previous configuration is stored as text and a difference in meaning representation with the newly configured text is computed via a meaning representation interpreter and then the difference is applied to the semantic model configuration. This may be more efficient that applying the whole received configuration to the semantic model; the interpreter may be run on a separate processing unit for efficiency.

Consecutive configurations may be fusion-ed together for more efficiency; the configuration fusion may occur at the lexical level (e.g. text concatenation) and/or at the meaning representation level.

The semantic system uses the semantic composition to infer semantics from the sensor subsystem; semantics may be associated with elements of a specialized or more general vocabulary and/or language. Further, the system may perform semantic gating on configurations.

In some example, the user specifies groups of synonyms, antonyms and other semantics that are related with a semantic. The elements in groups are by themselves related with the original semantic through semantic attributes and/or semantic groups which represent a semantic relationship in a general or particular context. In one example of general context the semantic attribute might be SYNONIM, ANTONIM etc. In another more particular example, the semantic attribute might be related with particular contexts, representations and/or semantic artifacts.

The semantic expiration or semantic route collapse may mean that the semantic network graph, mesh and/or semantic memory are adjusted based on inference.

In semantic expiration, the semantics may expire once the system infers other semantics; that might happen due generalization, invalidation, superseding, decaying, time elapse or any other inferences during semantic analysis. These processes are implemented through the interpretation of the semantic rules, semantic routes and semantic model by the semantic engine.

The semantic routes represent a collection of semantics and/or synchronization times that need to occur in order for a system to follow a goal and/or infer particular semantics. As such, the semantic routes are very suitable for context based semantic inference, planning and for ensuring the system's reliability and security.

The inputs may be interpreted and validated based on semantic inference including semantic routes and semantic analysis. In one example, the system may calculate correlation or covariance factors between trajectories, signals/data (unconditioned, conditioned, semantic wave etc.) of semantic routes and/or an environment signals/data. The correlation/covariance factor may be used to select the best semantic route for interpretation and validation of context. The correlation/covariance factor may be compared and selected based on a threshold and/or interval (e.g. semantic factor, drift based). The correlation/covariance factor may be based on all the semantics that make up an environment including semantic view and/or semantic view frame and are within the system's semantic coverage; the correlation/covariance factors may be calculated using all or only selected semantics (e.g. leadership) in a semantic route and determine and/or be associated with weights/factors for the inferred semantics.

Further, the correlation factors may be used in semantic orientation (e.g. for comparison, drifts etc.).

Correlation and covariance inference and/or factors may determine further inference of covariances, causality relationships and/or factors.

The semantic routes may be also associated with the semantic rules (time management, access control, rating, weighting etc.) for providing additional granularity and control.

The synchronization times and time intervals as specified in this application may be based on semantic time.

The correct identification of the categories of features and objects in the semantic field might prove useful in controlling the parameters of the sensing devices, orientation, field of view, sample rates, filters, timing, weights/factors of various modalities and others. In some examples the shape recognition is used in biometrics (e.g. imaging facial recognition, fingerprint, electromagnetic body print and/or signature etc.).

The sensors may register their semantic capabilities (e.g. optical, visual), identification and mission and the system uses semantic inference based on these characteristics.

Global navigation satellite (e.g. GNSS) sensors may be used to map the location of objects; the location of objects can be also identified via vision, thermal, RF and other radiation energy backscattering sensing.

This location data may be fused to identify the location of artifacts and objects in a particular area. In the case of an autonomous vehicle, various sensors may sense the surroundings and determine the best links and paths to follow based on various factors and semantics.

The GNSS and other location data can be compared for artifact identification and positioning.

The locations in images or videos may be mapped to locations in the semantic model based on depth, distance and the relative positioning and field of view of the sensors that captured the images and videos.

A semantic engine may use general coordinates or relative coordinates for its semantic network models. The general coordinates are associated with a central model and a centralized coordinate system wherein the semantic system may have a full or particular view. The relative coordinates are associated with a localized model and a localized coordinate system (e.g. relative to an observer and/or a semantic group) wherein a semantic engine may have a full or particular view.

In some examples, the system uses both coordinates systems wherein the system maps the localized model to the centralized model. In a similar fashion the system may map stationary endpoints (e.g. semantic stationary) to a dynamic environment.

In an example of a semantic post and/or self-driving vehicle the semantic model may be determined relative to those and/or observers (e.g. optical or radar sensor in the dashboard). In an example, a vehicle's hood represents a semantic stationary group of endpoints while the semantic field comprising other semantic artifacts develop in a dynamic way.

The general global positioning coordinates, including that of the car, may be known via global positioning sensors and calculations relative to known coordinates.

As such, the car itself may represent the reference positioning in regard to its sensors and the semantic model that maps and contains locations around the car.

A reference positioning can be detected via global positioning including global navigation satellite systems. Alternatively, or in addition, the coordinates may be provided via infrastructure. As an example, the semantic system may receive the position from a wireless infrastructure and/or mesh; alternatively, or in addition it may sense a sensor and/or object positioned at a certain location. Further, the localization may be enhanced with inertial navigation sensing.

The semantic model locations may be dependent or independent of the relative position of the car and are used to determine the feasible links and paths to travel based on semantics. The system may use a combination between the two coordinate systems.

As specified before a semantic attribute may be detected through optical and RF means and be linked to a location. Such detection and/or communication which may use various adaptable modulation techniques in analog and/or digital domain (e.g. amplitude, frequency, phase and any variants and combinations) on one or multiple fluxes.

The semantic system may use such semantic artifacts and routes to interpret access control rules in the semantic field which assesses the links, paths and routes that should be followed or should not be followed. The semantic system then infers and determine semantic attributes based on the links and paths of travel to be followed. Inferred, predetermined or predefined semantic routes may also be used to determine the optimal or mandatory links and paths to follow based on the semantic attributes in the routes and eventually the order and timing of those.

The transferring of data within the system may include establishing sessions and/or channels between any number of components (e.g. RF components); sometimes sessions establishment and/or management involves the management and association of semantic groups of components. Sessions between semantic group of components may be formed using semantic techniques; an important aspect is the system's cybersecurity and as such authentication mechanisms (e.g. certificate, code, signature, challenge response) may be employed. In addition, challenge response may be used to infer/determine/identify semantics and provide augmentation on the particular challenge (e.g. question-response based). Challenge response techniques may involve certificate, key and signature authentication. Sometimes multi stack protocol systems rely on the higher levels of the protocol stack implementation for data encryption and as such the lower level channels are not encrypted. Alternatively, the hierarchical stack encrypts the data at each level. The hierarchy may be represented as a semantic network graph. The encryption type may be inferred/determined on semantic artifacts and comprise semantic groups of elements, connections, sources, destinations, memory, blocks, data etc. Some systems separate the traffic into control and traffic planes wherein traffic plane tunnels network traffic through specific transport and tunneling protocols. The QoS (quality of service) in multiple tunneling connections is difficult to assess; semantic inference techniques including budgeting, quantification and factorization as explained in this application may be used for enhanced QoS protocols.

Collaborative systems (e.g. posts, vehicles) implement point to point, implement vehicle to vehicle communication in order to coordinate the path of travel that they pursue and for avoiding collisions. While the communication may happen in real time allowing the vehicles to coordinate the trajectories, sometime the systems are unable to communicate due to various factors including communication or network unavailability. In such cases the vehicles semantic units would determine the best trajectory to follow without collaborative information; the determination may use various inferences and/or assumptions regarding the vehicles and objects as detected in the surroundings (e.g. based on identification, semantic groups, trajectory, behavior, intentions, entropy etc.).

In general, for vehicle to vehicle communication to be effective the systems should reference the semantic fields to a set of commonly known coordinates and locations. Those locations may be general/global or can be localized in the case of using other localization techniques or relative system of coordinates (e.g. relative to the car itself, wherein parts of the car are considered the reference point as explained above relative to posts, sensors etc.).

Groups of systems (e.g. based on semantic groups) may form a mesh network for communication and localization using the RF elements groupings. The mesh network may be temporary based on location and be managed based on semantic grouping (e.g. time based, location based etc.). The mesh network may use any spectra in the electromagnetic domain wherein the coordination may be based on semantic inference and analysis.

Vehicle to vehicle and vehicle to infrastructure communication help the real time semantic systems of the vehicle to develop and update their semantic models. For example, if two cars A and B are in communication and car A transmits to car B that the road in location L IS MODERATELY SLIPPERY just because an accelerometer sensor detected that the wheels LOST GRIP 1 sec, then the car B semantic system will adjust its semantic model that is related to SLIPPERY semantic and location L with a semantic factor corresponding to a moderate condition. Further, the SLIPPERY may be sent through the mesh potentially with associated factors and expiration times.

The semantics based on acceleration and orientation data may be used in vehicles electronic stability control by actuating various suspension, traction and braking components; such information may be provided on multiple axes by accelerometers and gyroscopes.

The system may infer that certain locations in the semantic model are not feasible to follow at certain times due to the potential lateral or forward acceleration produced and potentially other hazardous environmental and road conditions that may determine the vehicle to lose stability (e.g. ROLLOVER HAZARD) or grip; as such, the semantic inference will ensure that safe and feasible paths are followed in various road conditions. Sometimes that decision is made at the sensor/actuator level where the sensor/actuator has a limited interval of action on semantic inference possibly controlled by semantic rules (e.g. access control, time management).

As such, the semantic model and access control rules in an autonomous vehicle semantic system are dependent and adjusted, based on factors including road and environmental conditions, vehicle stability sensors and controls, vehicle to vehicle communication and other internal or external factors.

The sensors or semantic units may register their capabilities (e.g. modeled through semantic attributes) to a memory and/or communicate them through semantic fluxes and/or semantic waves.

In pub no 20140375430A1 semantic identification and marking has been introduced.

Semantic marking may be used for identifying the semantic rules and data to be retained by a computing or semantic unit in a distributed semantic inference system wherein the system retains the rules for the marked semantics and ignores and/or discard the rest.

Semantic identification commands can be issued to groups of elements and the elements identify themselves with a semantic artifact (e.g. semantic, semantic group); sometimes the identification is achieved through semantic analysis. The system may issue a speculative semantic identification command and a semantic unit/element may need to speculate whether it can factorize, infer and/or perform the semantic within the budget and based on the assessment identifies itself as part of the semantic group or not.

The speculative inference process and semantic artifacts may be associated with indicators and factors for assessing potential success and failure (e.g. risk factor).

The computer and/or processing hardware may comprise chains of semantic units that perform parallel and/or serial inference. It is understood that the semantic units may be connected through any interconnect technologies including electrical, optical, electromagnetic and any combination of those. While the system may use semantic modulation and semantic waving for semantic units communication it is to be understood that alternatively, or in addition, they may use any existing protocols (e.g. embedded such as SPI, I2C, network and/or wireless, serializer/deserializer, peripheral component interconnect buses etc.) to encapsulate and/or modulate semantic flux information and/or semantic waves with semantic analysis.

Sometimes they process the information in a highly distributed semantic fashion.

Semantic identification and/or semantic marking may comprise all the techniques used for collaborative semantic routing, gating, shaping and/or inference. Further they are applicable to all the semantic artifacts, semantic model artifacts and/or semantic rules.

As such, processing units, or groups of processing units may collaborate, perform semantic inference and redistribute the semantic inference artifacts and semantic model among themselves. The computer performs semantic inference and potentially stores the paths and/or the address/identification of the units that were targeted and/or used for processing goal-based inferences and/or for inferring a particular semantic or theme. Once a semantic or theme is inferred a semantic unit may use semantic analysis and determine that other semantics may be served in a particular way by such a semantic inference grid route and as such sends a semantic marking command to the semantic grid route with a particular semantic to be memorized by the semantic units and potentially link it with the semantic inference rules and with the source semantic unit and/or group.

Semantic models and inference rules are sent to the semantic units and/or groups and the semantic units select only the semantic artifacts and/or inference rules associated with the semantics that they inferred and/or are marked for and store them in the memory; in an example the system uses composite semantics between inferred semantics and marked semantics. As such, the information is distributed optimally based on each processing unit needs.

The semantics may be stored in the semantic/processing units in associative and/or semantic memory. The semantics may be stored in a centralized fashion in a shared memory, in a semi-centralized fashion where parts of memory are distributed, and parts of memory are centralized or totally distributed fashion where each unit stores its own memory.

The memory and inference power may be distributed among the units, concentrators, computers, computer banks and so forth.

The semantic marking commands, semantic identification commands and semantic rule commands use time management for optimal use of resources. As such, the semantic system may perform the markings, identification, rule and model changes and updates as specified by time management rules.

The system senses conditions with less semantic inference activity (e.g. potentially using gate published semantic budgets) and initiates further semantic analysis, inference and updates on the stored data and performs the markings and/or updates. The initiation can occur at any unit; the initiation may be based potentially on speculative inferences, external input, access control and/or semantic time management rule. The initiation may occur also when there is an instability in the system as detected by semantic inference and indicators; in other examples the semantic inference chain was interrupted or broken at some processing unit and as such was unable to process or transfer the semantic information to the other units; in another example semantic budgets are not balanced (e.g. composed voltages V related with particular semantic artifacts are high) in a potential endpoint localized, semantic or semantic group manner. Sometimes the transfer of the semantic information between semantic units may be purely related with memory operations (e.g. changing addresses, pointers, links, copy, stored weights/factors, structures, clustering and such), DNA replication and/or remapping.

In order to improve sensor fusion, the system may use semantic field profiles wherein the semantic field profile is based on the particularities of the semantic field in a particular area, at a particular time or in a particular context. The semantic field profiles may determine the priority or enablement of the sensing capabilities that are being used and the fusion factor of each modality. For example, during night an infrared sensor or heat vision camera may be given more priority than a regular vision or imaging sensor. As hence, time management rules coupled with semantic inference on sensing, capabilities and attributes establish the factors of the sensing capabilities and particular sensors. Also, a time management rule may be used to bias factors of particular semantics, semantic groups determinations and other semantic artifacts. As such, when a time management rule enters into effect based on time, semantic and/or interval determinations, a factor may be assigned and/or indexed for a particular semantic group that can be used in semantic scene interpretation and development. For example, in an urban area, a semantic group representing groups of people may bear leadership in the semantic scene. Additionally, the higher weight may be also based on semantic principles that specify that a particular semantic or semantic group bear leadership in particular categories of semantic scene interpretation, detection, development and action. Additionally, based on location and other factors the system may decide which features or sub-features of the object leaders. For example, in a relatively close proximity the detected facial features might be preferred over other features such as height, width or dynamic features as walk, clothes etc. There may be always features that have leadership (e.g. high factor) in semantic determinations and they may include category, color etc.

The semantic system uses the semantic model including semantic attributes to identify objects. As the sensing conditions change the semantic system may adjusts the weights/factors of the semantic attributes or features for semantic scene or object recognition inference, potentially adjusting them based on factoring rules and plans. In an example, if the system is inferring that a car is present in the semantic scene just because it tracks a semantic attribute of color red associated to the car then the system may adjust the identification of a car based on COLOR AT NIGHT factor when the color cannot be sensed well and instead other attributes are assigned more leadership. As such a weight is based on the sensors data, semantic time and semantic analysis.

The system may be in a steady semantic view at a hierarchical level. For example, a smart post may have determined that following the lane, or post in front is required for the time being and hence the dynamic semantic "follow the lane" or "follow the lead" is continuously inferred at the particular hierarchy level, potentially with associated factors.

The system may have inferred a route for "FOLLOW THE MARKS" and the system uses the mappings of the marks in endpoints to route, determine the path and provide actuation based on path inference. In addition, semantic factors may be used to perform actuation and commands to steering.

In a further example the system detects DRIFT LEFT and as such the system calculates a composite semantic factor associated with FOLLOW THE LANE and DRIFT LEFT which may be STEER RIGHT with the calculated composite factor. In a further example the system infers factors, potentially on a combination of semantic network model, semantic composition, semantic orientation, semantic drift.

The system may have been using FOLLOW THE LANE semantic comprising a route of SPLIT ROAD, LINE MARKS LEFT, LINE MARKS RIGHT and PARALLEL LINE MARKS potentially mapped to the semantic network model. Once one of the semantics in the route disappear the system may readjust the semantic route and/or composable semantics of FOLLOW THE LANE (e.g. use and/or increase the leadership associated to mappings and groups to other objects, cars and landmarks). The system may use a combination of semantic routes for inference and to preserve the semantic views (e.g. current and/or projected) and/or goals and adjust those based on semantic analysis.

The semantic view at each level can change based on several factors including semantic analysis on signals, data, semantics whether ingested from external, internal or inter-hierarchy sources and/or fluxes. For instance, the system may need to assess the potential semantic routes and paths that needs to be followed while preserving the semantic view at a particular hierarchy level.

As specified in the previous example a post semantic unit might be in the steady semantic view of "FOLLLOW THE LANE" at a particular hierarchical level, however if in the semantic scene is determined that in location L (e.g. 20 yards) a semantic group associated with person has been detected (e.g. PERSON HAZARD ALERT) then the system infers the impact within the hierarchical layers of semantic view based on semantic analysis and semantic gating. For example, a location L1 at the left of the person semantic group formation may be determined as feasible based on semantic orientation inference and/or speculative semantic view determination and hence the system infers the semantic of "CHANGE LANE" to location L1 which translates in further sensor control and actuation commands. Speculative semantic view determination is based on a goal based semantic analysis as described throughout the application.

It is understood that the system may comprise more complex composite orientation and drive semantics, routes and semantic views (e.g. includes additional artifacts for FOLLOW THE LEAD ONLY IF FOLLOWS THE LANE AND DRIVES SAFE) and as such the system performs projected inference on leader behavior, intentions, orientation and goals while potentially decaying or expiring FOLLOW THE LEAD related artifacts if current and/or projected semantic views indicate a negative sentiment in regard to LEADER, FOLLOW THE LANE, DRIVE SAFE and/or further safety goals and routes. The negative sentiment in relation to such safety related semantic artifacts may be associated with increasing/increased risk and hazard related factors, decaying and/or negative trust factors and indicators associated to LEADER, FOLLOW THE LANE and/or DRIVE SAFE. Analogously, positive sentiments may be associated with decaying and/or negative risk and hazard factors and further, increasing/increased trust factors and indicators. It is to be understood that the system may use such associations of semantic artifacts and sentiments to learn and/or reinforce new semantic groups, rules, trails and/or routes. For example, it may reinforce a risk factor associated with a semantic group or route of CAR, FLAT TIRE and even further risk for CAR, FLAT TIRE, ONE-WHEELER.

The system may form guiding lanes and/or routes by controlling posts, objects, devices, sensing and/or control elements. In some examples, the system lights up LED lights embedded in a surface in order to guide crowds, vehicles, airplanes and so forth. Further, the width of such lanes may be inferred based on traffic flow analysis. The system may be challenged and/or infer goals of traffic simulation and thus performing traffic flow analysis.

In further examples, the traffic flow analysis encompasses arrival/departure docks, gates and/or lanes modeled within the semantic network model.

Semantic systems add a level of security beyond programming and/or data driven systems. This is due the fact that semantic systems allow reducing the semantic gap and hence are more semantically complete. A reduced attack surface is ensured by the interaction via semantic fluxes which exposes a reduced number of entry points into the system by potentially multiplexing them to a protocol channel and/or port. Those entry points can be more readily controlled and managed via strong authentication, encryption, virtual private networks etc.; a semantic system can also use semantic inference to detect possible attempts to influence and/or compromise the system by crafted semantic exchanges. Semantic systems may detect communication channel and/or wave flooding and/jamming based on repeatability, incoherence and/or confusion factors which may be gated and/or used for gating within the hierarchy; further, such attempts may be isolated at particular hierarchical levels (e.g. low levels) with particular semantic artifacts based on channels and/or wave inference being gated based on particular DNA (signatures), semantic identities, thresholds intervals and/or levels. In some examples, in order to overcome such attacks and/or challenges the system may use DNA replication and/or remapping at/of the affected endpoints and/or areas.

For example, inducting false semantic artifacts into a collaborating semantic flux/stream. Therefore, there should be ways to detect such attempts and eventually detect, retaliate and disable attacking cyber systems. The retaliatory and disablement measures may be necessary if the attacking cyber systems use denial of service attacks to bring down communication between systems and infrastructure. However, there should be careful considerations and assessment when choosing retaliatory attack targets as many of these targets may be legitimate systems infected or controlled by malware.

Collaborative defenses encompassing various emission, waves and/or network techniques (e.g. jamming, distributed denial of service etc.) may disable attackers and restore the communications. As such, semantic systems may organize in packs in which semantic systems groups observe and disable a particular group for a period of time. If groups/packs consist of semantic systems with similar signatures (e.g. based on rules, routes, model, artifact mapping inference etc.) they may take similar actions and therefore the pack formation is more natural towards semantic action intensity without necessity of system interconnection. Alternatively, to increase the semantic spread, a semantic group pack may be comprised from units that have different signatures. While the attacker may try to infect some systems, the semantic cyber components or collaborative systems behavior semantic analysis may detect and assess intrusions. It is to be understood that the attack and/or infection may comprise physical and/or cyber corruption and/or disablement of systems (e.g. in case of optical sensors may include laser attacks, or breaking lenses, obturation attacks and so on). If a semantic system is deemed as compromised the semantic system network may reorganize and assess the factors of the semantic determinations by the compromised system. As such, the semantic fluxes, semantics and themes from the compromised system may be assigned appropriate factors (e.g. low weight, high risk, hazard etc.); additionally, the semantic exchanges from compromised systems may be fed into a different cyber model and cyber inferences be build based on that behavior knowledge inferred by healthy systems whether collaborative or not. The healthy system may use the cyber model and determinations for profiling tactics or counter measures. One profiling tactic may be to acknowledge and continue semantic exchanges with the compromised systems while feeding the information to the semantic cyber model; the system may create an actor or acting semantic view to cope which such profiling. Another profiling tactic is to appear to accept the intruder's changes to semantic models by creating a copy of the semantic model and keeping the legitimate copy safe, potentially running on a separate unit; further, based on the malicious model and the cyber model creating a threat model for the malicious attack based on semantic analysis including semantic orientation, learning, gating and/or fusion between the two models. The determination that a semantic model changes are being malicious can be done based on various semantic factors and semantics on cyber and communications models.

The semantic engine may organize entities including semantic units, sematic fluxes and other semantic artifacts in various semantic groups for pursuing, profiling and segregating of cyber affected entities. The segregation of such entities may include gating, network disconnect, DNS marking (e.g. based on DNS tools, APIs etc.), blacklisting, record expiration, deletion, update of network routing and so forth.

It is to be understood that the techniques explained before may be used to alleviate attacks and/or attacks on compromised sensing components (e.g. laser attacks on cameras, photodetectors; RF jamming etc.). Further, the system may use cyber condition and associated factors (e.g. risks) to adjust, pursue and/or not-pursue actions (e.g. index and/or apply torque vectoring in a particular way if the cyber risk condition is high, index speed if cyber risk is low etc.).

In further examples, where semantic inference on users (e.g. on operators, pilot, drivers) and/or attackers is available the system may use semantic analysis on those entities to further determine factors, indexing and further actions. In some examples, the system performs semantic analysis on an operator state based on information received from on-premise, on-board and/or wearable devices, cameras and/or other semantic fluxes.

An architectural and deployment approach is to have the semantic cyber model running in a separate semantic cyber unit which interacts with the operational semantic unit through semantic exchanges. As such, the semantic cyber unit may interrogate the operational semantic unit from time to time in order to assess the validity of behavior, the correct application of principles and laws, hence assessing the sanity of the system.

The semantic cyber unit performs cyber inferences and communicates with other units via semantic fluxes.

The semantic cyber module may act as a validator of the semantic inferences by the operational semantic entity. In an example the cyber unit or units initiate semantic goal-based inferences via semantic gating with the operational unit or units. Further, it uses such goal-based inferences for validating the sanity of the units. In some other examples the system creates semantic groups of operational units designated as cyber units to test the sanity of operational units or groups of operational units.

The semantic cyber module may provide and/or enforce access control rules on various components, device" resources, data units, parts of memory, networking, firewalls and such. Thus, the semantic inferences may be used as access control rules for resources, data, processing, rules, communication and other artifacts.

In one example a semantic cyber module running on a mobile device which receives semantics associated with elevated alerts for a range of IP addresses may update its semantic cyber model with acquired and/or determined semantic artifacts (e.g. high-risk semantic groups).

If the semantic cyber modules are connected or are part of firewalls, DNS, routers, and other network and/or computer components then the system may update the rules or tables of such components or control I/O directly (e.g. via digital blocks/components/interfaces, analog blocks/components/interfaces, packet filtering, protocol filtering etc.). In some examples, the system eliminates, marks, invalidates, netmasks and/or create block rules for malicious IP addresses and/or semantic groups thereof; in addition, only artifacts associated with particular semantics are allowed to pass (e.g. text (TXT) files, html files etc.). Analogously, the system may create allow or validation rules for trusted iPs and/or groups thereof. The system may use such techniques to update the domain name service (DNS), routing and/or firewall tables of operating systems (e.g. Linux kernel tables etc.).

Additionally, the semantic cyber engine may use input from a various range of sources including sensor or human input. The owner of a device may specify via user interfaces that may trust or distrust a source of information via semantics. As such, the system may assign cyber risk indicators related with that source of information (e.g. semantic flux) and use it for semantic inference to derive factors or any other semantics. For example, the user may specify that doesn't trust a certain source. The system may assign low weights/factors and/or high risk/factors to that component and as such the semantic composition may take different fusion routes or paths. As such, the semantic fusion and composition may take into the account the source of semantics or the source of the data on which a semantic is based on.

In another example in order to improve security in systems that have the potential for being compromised through query injection the semantic engine may be coupled with a database query firewall for increased security. As such, as each query statement is issued to the database the database query firewall reports to the semantic engine the query statements being issued to the database; the semantic engine infers or determines various semantics based on the query components including the type of query, columns, parameters, data type, source, user, access rights, time, date and any other data. The system may also use the semantics associated with the source and/or user. The semantic engine may detect that the semantic view is in is incompatible with the type of semantic discovered just because a semantic route is non-existent, or a semantic route or composition exists that signify that the query statement may be a potential risk or breach. As such, the semantic system infers a semantic of rejection and/or commands the query firewall to reject and/or block the request.

Examples of query injection include SQL injection and any other query language that can be delivered through injection techniques via user interface or other interfaces techniques.

The semantic cyber entity may function on a separate hardware module or component. The hardware module and component may have a computing unit, memory and other components needed to support the cyber inferences. In some examples, the memory stores the cyber unit semantic model and the cyber unit firmware. The cyber unit may update its firmware or semantic model from time to time in order to keep up with the applicable semantic rules, principles and laws. Cyber units may be connected via semantic fluxes.

For example, if the cyber unit is connected or coupled to a robotic semantic unit then the cyber unit may contain semantic rules and values of the sensors that infer hazardous consequences. Also, hazardous semantics may be inferred based on the core principles and rules encoded or modeled in the cyber unit. The laws of the land can be coded and modeled into cyber units and be updated when the location of the cyber unit changes and hence the laws of the land change.

The cyber hardware module may be specialized to execute the verification and validation of semantics with the semantic cyber model including semantic rules. Alternatively, or in addition, it may comprise general processing units like general purpose processors, memory, field programmable gates arrays, application specific integrated circuits, system on a chip or any other components.

The cyber hardware may have wireless communication capabilities in order to communicate with the infrastructure.

The system may ingest threat data from external sources and feed the data to the semantic model.

Once a vulnerability, signature and/or pattern is inferred/ingested the system updates the semantic model in memory.

The model may comprise behavioral patterns of execution, threads and other contextual data. In an example the system comprises artifacts that map patterns of operation execution (e.g. via semantic model, semantic routes, semantic time, semantic rules etc.). Thus, the system may use operating system APIs and inspection tools coupled with semantic analysis to analyze authorizations, logins, code and operations and provide semantic access control.

Further, the model may comprise network traffic and protocol rules that can be used, for example, with deep packet inspection, network and protocol sniffers.

Further, routers, firewalls and other networking gear may be instrumented with semantic agents and/or units.

As such, by instrumenting the monitored network with semantic tools the system achieves high levels of automation and improved resilience.

The model may be coupled with location-based information that allow identifying the trusted connections based on the semantics of movement location and communication patterns.

When a semantic artifact is deemed as not valid the cyber unit may take particular actions including isolating the devices, sensors, stream of data, semantic fluxes or components that were used in inference; it may also communicate with other systems in order to inform of the potential of a breach or anomaly. In a particular example, the communication may take place via semantic fluxes. The cyber unit may implement the cyber defensive protocol described before as target (group) isolation, segregation, profiling, vetting, packing etc.

The system may use semantic trails and routes inferred before and after the cyber infection semantics to perform semantic analysis and learning, potentially to the point in time when the cyber infection occurred or to current time. The cyber units may be linked via (semantic) cloud, fluxes, streams, point to point or mesh connectivity. Also, the cyber hardware may have semantic wireless communication capabilities in order to communicate with the infrastructure.

The system uses access control rules to control the validation/invalidation of semantics via block, allow or control rules. Further the system uses semantic drift and orientation to determine hazard and/or risk semantics, factors and indicators.

The cyber unit may be modeled based on a validation approach, wherein the cyber model is used with validate artifacts (e.g. indicators, factors, routes, orientations etc.) on the semantic inference on the monitored semantic units; in the invalidation approach, the cyber unit models invalidation artifacts. Alternatively, the cyber unit may be modeled or comprise for both validation and invalidation.

The cyber and/or semantic unit may be coupled with a semantic authentication system based on biometric data, certificates, keys, TPMs (trusted platform modules), sensorial, password, location and/or blockchain.

It is to be understood that the term "system" used in this disclosure may take various embodiments based on the contexts as disclosed. In some examples, "system" may represent, but not limited to, a post, a semantic cloud, a composable system, a semantic engine, a semantic networked system, a semantic memory, a semantic unit, chip, modulator, controller, mesh, sensor, I/O device, display, actuator, electronic block, component, semantic computer and any combination thereof.

Further, any functionality implemented in hardware may be implemented in software and vice-versa. Also, functionalities implemented in hardware may be implemented by a variety of hardware components, devices, computers, networks, clouds and configurations.

We exemplified how the system may optimize budgeting. In further examples of budget optimization, the system may challenge resonant semantic groups with ways of applying discounts and/or available offers related to a purchase challenge (e.g. buy a track ticket for 10$ until breakfast tomorrow). While the system may challenge track and/or ticket providers it may also challenge for discounts, coupons (providers) as ("discount") ("coupon") may be comprised in a semantic route/rule, diffuse and/or resonate with the user's goal, route, (goal's) leadership and/or related inferences. In an example, the system may infer goal leaderships comprised in the goal semantic route (e.g. "buy", "track", "ticket" and/or compositions of those) which may be used to further infer providers of coupons and/or discounts for particular goals leadership and further, challenge the providers with the corresponding discounts (e.g. give me a price for track ticket by applying the discount code HAPPY_MEAL, give me a price for track ticket by applying the discount code from <provider_discount_coupon>, give me a price for track ticket by connecting to <discount_provider_name>etc.).

The discounts are inferred base on semantic groups and made available through semantic access control and/or gating.

In further examples, the ticket provider advertises the discounts itself and/or automatically applies discounts based semantic analysis, semantic identities (e.g. of purchaser) and/or semantic groups thereof; it is to be understood that the coupons may be based and/or applied based on semantic time, semantic indexing, hysteresis and/or damping.

The system may use bargaining when purchasing. The bargaining may be based on undershoot and/or overshoot type of inferences (e.g. the budget and/or offered price is between overshoot and/or undershoot). The undershoot and/or overshoot bargaining may be also based on suppliers (collaborators) and/or market circumstances. In some examples, the circumstances and/or behaviors may be inferred as intrinsic, offensive, defensive and/or neutral. When the circumstances are intrinsic without much projected drift the system may follow the semantic trails more closely.

The system uses offensive/defensive, friend/foe and/or further semantic time analysis to determine and/or bargain for the best deals and/or issue purchase orders.

The system may use motivation and/or further satisfaction factors in bargaining type inferences.

The system may not specify a budget, case in which the system looks for the optimal price within further restrictions, locations, constraints and/or semantic time (e.g. get a reasonable priced track ticket in the lower section for tomorrow's game, get the best not overpriced or maybe slightly overpriced two tickets for tomorrow's game, get me a ticket that will entertain me tomorrow (in Charlotte) etc.).

It is to be observed that the system may look for price tickets between an overshoot and/or undershoot range (e.g. for "best available" uses a smoothed overshoot orientation based on offensive behaviors; "best reasonable or not overpriced" may use a range between an undershoot orientation based on offensive behaviors and/or an overshoot based on neutral and/or defensive behaviors). Constructs of the request (e.g. "maybe slightly overpriced" having a deviation from the intrinsic or the previous orientation—not overpriced/reasonable) may be used to factorize the user's desire/likeability for attending and/or being in a location at a particular time; further, the system may infer and/or use damping and/or hysteresis for achieving desirability and pricing goals.

The system may affirmatively/non-affirmatively factorize (goals) overshoot and/or undershoot and/or further localization and/or semantic times associated with endpoints and/or further hierarchy. Further, the system may prefer presence and/or activities at (around) endpoints and/or semantic times allowing/projecting affirmative (goal) (diffusion towards) (goal) overshoot/undershoot and/or absence at (around) endpoints and/or semantic times allowing/projecting non-affirmative (goal) (diffusion towards) (goal) overshoot/undershoot. It is to be understood that the affirmative/non-affirmative overshoot/undershoot inferences and/or factorizations may be associated with overshoot/undershoot indicators (e.g. such as indicating whether is overshoot and/or undershoot) and/or with goal indicators (e.g. such as indicating whether a goal is undershoot and/or overshoot).

The system may intrinsically determine the localization and/or mapping of the goals at endpoints (e.g. tomorrow the system knows by a schedule, place ticket or other inferences thar the user will be in Charlotte so it may need to look for tickets in Charlotte).

Analogously with bargain type interfaces, based on overshoot and/or undershoot, the system may localize, map, anchor and/or determine optimized locations and/or endpoints within the semantic model; it is to be understood that such optimized locations and/or endpoints may be mapped within the hierarchal structure of the model at various levels. In further examples, the system determines a mapping, anchor and/or location based on undershoot/overshoot intervals and/or further intersections in elevation and azimuth.

The system may gain budgets by issuing orders and/or acquiring financial instruments, currency, stocks and/or other trading items on financial markets, trading markets, electronic currencies networks. In some examples, the trading items are (semantic) time and/or further budgets. In further examples, the system allocates budgets for particular semantic time (intervals).

The system may wait to acquire budgets and/or to perform the inference and/or the actions within the required and/or resonant budgets. In some examples, the system may bargain and/or wait for some costs to go down and/or for promotions to occur.

In further examples, the system is challenged and/or challenges to "buy things that I like" and as such may prefer things which are more resonant factorized for "like"/"preferred" (and/or related synonyms and/or groups).

For challenges such as "surprise me" the system may prefer things closer to decoherence and/or borderline resonant for artifacts which project affirmative resonance and/or further "surprise" (and/or related synonyms and/or groups).

The system may choose a lesser number of routes, attributes, indicators and/or factors to be resonant and/or less shifted for "like"/"preferred" while may chose a larger number to be less resonant, more shifted and/or with more spread for "surprise". It is to be understood that in general the system may chose higher (e.g. primary, secondary etc.) leadership artifacts for "like"/"preferred" and lower (e.g. secondary, tertiary etc.) leadership artifacts for "surprise"; such leadership promotion may be based on semantic indexing and/or biasing.

Further, the system uses projections and thus, even if it may not use leadership and/or resonant semantic artifacts at first, the inference may progress towards inferring leadership semantic artifacts associated with the particular profiles and/or semantic identities which allow "like"/"preferred"/"surprise" resonant inferences.

The system may have limited budgets and allocate those budgets based on leadership inferences and/or goals. In some examples, the system allocates budgets to leadership inferences determined by projected consequences factorizations.

The system infers restrictions and/or constraints during semantic inference. In some examples, the constraints and/or restrictions may be based on its own capabilities and/or semantic profiles, semantic time, factorization thresholds, goals/sub-goals and/or further artifacts. The constraints/restrictions may be hard (e.g. very (99%) unlikely (99% not likely) to succeed, not possible and/or very risky circumstances/behaviors if the constraints/restriction are not followed and/or considered) and/or soft (e.g. more relaxed factors).

In some examples, the system associates hard constrains/restrictions with hard semantic rules and soft constraints/restrictions with soft semantic rules.

The system may use indexing, hysteresis and/or damping to adjust the inference associated with the constraints and/or restrictions (e.g. for inferred soft constraints using a more offensive/leisure/diffusive behavior while for hard constraints using a more defensive/cautious/non-diffusive behavior; further, for soft constraints inferring/applying larger risk indexing/thresholds/hysteresis and for hard constraints inferring/applying lower risk indexing/thresholds/hysteresis etc.).

The semantic smoothing may be based on projected inferences in rapport with defensive and/or offensive behaviors. In some examples the system may bias the offensive and/or defensive behaviors based on the assessment of the projected budgets and/or further factors (e.g. risk, reward etc.).

The offensive and/or defensive behaviors of leaders which would determine high confusion within the leader's group in rapport with the group's purpose and/or its associated semantic artifacts may determine a change of leadership. It is to be understood that the high confusion may be determined based on a group's confusion threshold interval. Further, refactorizations of fluxes in the group may determine some of the members to leave the group once the factorization of the group flux does not comply with the confusion interval.

In some examples of traffic control the system may biases in various sections particular behaviors associated with particular semantic groups. In an example, at an endpoint (e.g. associated with a traffic stop, intersection and/or hierarchy thereof) the system may detect that the offensive and defensive behaviors are unbalanced and thus it may adjust the flows and/or signaling based on the behaviors and/or to balance/neutralize the behaviors. For example, for offensive behaviors it may infer and/or adjust (index) for a shorter green traffic light and/or a longer switching to green for the crossing traffic while for defensive behaviors may apply a high drift/entropy inference (e.g. longer green light, shorter yellow light and/or shorter switching).

The system may increase the semantic spread and/or adjust focus by allowing more relaxed access control, diffusive and/or further semantic rules; in some examples, the system disables altogether particular soft access control rules. The system may adjust the diffusiveness by varying the same factors/indicators and/or associated rules in various configurations. In some examples, such generative behaviors may be used when budgets are high and/or when generating new goals, transfer knowledge and/or borderline resonances.

The system may increase the diffusion and/or relaxation of rules wherein the system factorizes (e.g. increases) satisfaction, trust, leisure, affirmative factors in rapport with semantics and/or (associated) rules; alternatively, or in addition it may decay (e.g. decrease), index and/or bias the thresholds for such satisfaction, trust, leisure, affirmative factors. Analogously, the system may decrease dissatisfaction, concern and/or stress factors in rapport with semantics and/or (associated) rules; alternatively, or in addition it may increase, index and/or bias the thresholds for such dissatisfaction, concern, leisure and/or stress factors.

The system may use high (entangled) entropy (a.k.a. WENT) actions and/or thresholds (e.g. INCREASE/DECREASE, ON/OFF etc.) in rapport with high (entangled) entropy indicators (e.g. SATISFACTION/DISSATISFACTION) and thus when a first indicator and/or associated threshold is increased and/or enabled (e.g. ON) in rapport with a semantic identity and/or artifact the high (entanglement) entropy indicators and/or associated thresholds may be decreased and/or disabled (e.g. OFF) and/or vice-versa. In similar fashion the semantic ALLOW/DO rules and/or routes may be factorized and/or enabled (e.g. ON) while the high entangled entropy rules BLOCK/DO NOT rules and/or routes may be reverse factorized and/or disabled (e.g. OFF) and/or vice-versa. It is to be observed that the high (entanglement) entropy reflects in the enablement semantics (e.g. ON/OFF).

When the budgets decay (e.g. below a threshold), spread is high and/or the confusion is high (e.g. over a threshold) the system may adjust to a more restricted access control, diffusive and/or further semantic rules. Further, it may invalidate semantic artifacts associated to increased spread and/or confusion. Such critical behavior may decrease the semantic spread.

The system challenges and/or caches identification artifacts from the sematic cloud based on locations. As such, the identification artifacts are cached at endpoints based on projected inferences which comprise such endpoints (e.g. based on shifts, drifts, diffusion etc.).

In some examples, when the system changes the semantic field environment and/or roams from one location to another (e.g. changes rooms, buildings, legislations etc.) it may decay associated artifacts associated with the previous semantic field environment within a semantic view; further, the confusion may be elevated at first until the system establishes coherency and/or reduces confusion in the new environment.

The system may adopt a more generative behavior when entering a new semantic field context and/or location; further, it may follow a more critical behavior after a semantic time in the new semantic field context/view. It is to be understood that in a generative behavior the system generates inferences projecting less consequences; in a critical behavior, the system invalidates generated inferences by projecting more consequences.

In some examples, the system uses advertising and/or publishing goals (e.g. based on user input, semantic profile etc.).

The popularity and/or leadership of a particular artifact may increase as it induces (affirmative) coherency and/or resonance within (related) semantic groups. Further, the system may diffuse and/or affirmatively index other factorizations of their capabilities (e.g. the system may diffuse and/or index other capabilities than the original leadership) based on (particular) observer semantic profiles and/or resonant semantic profiles.

As leader's popularity increases, the costs and/or budgets associated with accessing those leaders and their associated semantic artifacts may increase.

The system may use affirmative resonance, semantic time management and/or semantic indexing to adjusts factors, costs and/or budgets.

The system may bias and/or index loss goals by using hysteresis and/or damping. Decayed affirmative budgets and/or factorized loss (e.g. increased loss factors) of affirmative budgets may be associated with increased dissatisfaction, concern and/or stress factors. Analogously, potentially by (entangled) entropy inference (e.g. of increased/decreased orientation, affirmative/non-affirmative, gain/loss etc.), decayed non-affirmative budgets, and/or decayed loss factors of affirmative budgets may be associated with increased satisfaction and/or leisure factors. By further (entangled) entropy inference, factorized affirmative budgets and/or factorized gain (e.g. increased gain factors) of affirmative budgets may be associated with increased satisfaction and/or leisure factors. Even further, factorized non-affirmative budgets, and/or decreased gain factors of affirmative budgets may be associated with dissatisfaction, concern and/or stress factors.

It is to be understood that the affirmative budgets refers to the budgets and/or (projected) investments which have affirmative resonance and/or positive polarity in rapport with a semantic identity; analogously, the non-affirmative budgets refers to the budgets and/or (projected) investments which have non-affirmative resonance and/or negative polarity in rapport with a semantic identity.

In case that a sub-system receives a request for inference with a specific budget, the sub-system executes an evaluation of the goal (e.g. based on what-if and/or projected semantic routing and analysis) for meeting the inference (e.g. GIVE ME ALL YELLOW CARS SPEEDING UNTIL JOHN SHOWS UP or SHOW ME UNTIL JOHN GOES HOME THE TEN BEST PLACES TO CONCEAL A YELLOW CAR WITHIN TEN MILES OR TEN MINUTES FROM A/THE COFFEE SHOP). As such, the system may be provided with a goal budget (e.g. best places to conceal) and so the system may project based on the specified and/or inferred budgets; further the goal leadership being CONCEAL with a semantic identity of YELLOW CAR the system may look for artifacts which obscure and/or mask the semantic identity of YELLOW CAR. Further, the system may associate a budget of 10 minutes to the CONCEAL inference and/or goal and a further drift from coffee shop endpoints. While a further leadership semantic may comprise DRIVING because of the CAR semantic identity the system may consider other options if the DRIVING related projections are not within the budget and/or the risk factors are high; in some examples the systems may consider forming a semantic group (e.g. for TRANSPORTING, PLATFORM; LIFTING etc.) with another object of another modality of transportation (e.g. RAILWAY, CAR; AIR, HELICOPTER etc.) and use projected inferences on such routes and/or groups.

While in some presented examples the system determines unusual obturations and/or behaviors (e.g. broken lens, dirt present, blinding attack etc.), in other examples it may infer a normal obturation (e.g. the lens is covered for protection to secure it against dirt, breaking in, blinding/mesh damage and/or further to reduce processing, put the sensor to sleep etc.) and as thus it may pursue semantic memory and/or mesh optimization based on semantic analysis. It is to be understood that the lens protection and/or normal obturation inference may be based on a lens cover transducer/actuator sensing/control and/or further inference and/or control based on access control rules, semantic time management and/or further semantic analysis.

The system may infer (physical/electromagnetic/optical) obturation between a target scanned endpoint and an antenna, transceiver, sensor and/or further device and/or possessor. As such, the system may infer and/or assign semantics (e.g. to endpoints and/or (associated) links) and/or further adjust the weights of localization algorithms (e.g. such as hierarchical threshold localization etc.) (based on the inferences).

The system may predict weather based on the sensor data (e.g. Doppler radar, polarization radar etc.). As such, the system projects the semantic indexing and/or diffusion of the radar inputs and/or associated graphs/graphics/colors to the radar maps and use them in the carrier system guidance and/or further semantic augmentation.

In a previous example, we explained that when the time management rule is exclusive (e.g. 100% EVERY MEAL WITH MEAT) the system may not pursue the current MEAL drive inference, perform challenges and/or further inferences on alternate trails, routes and/or semantic groups. In further examples, the system may challenge food provider fluxes for negotiating and/or budgeting the projections, goals, inferences and/or semantic time management entries.

As it is observed, the semantic artifact EVERY MEAL WITH MEAT comprises the discriminator EVERY which may be used as a discrimination bias in current and/or further inferences based on the factorization inferred after such experiences.

Discrimination factors and/or biases may be inferred in the semantic field to accurately infer and/or track semantic identities. In some examples, the system infers discriminatory factors (of) (and/or) groups of semantic indicators, semantic identities, DNA signatures; further features, parameters, zones, movements may be associated and/or be used for discrimination factor inference.

The system may use semantic leadership inference for inferring and/or achieving discrimination indicators and/or factors. In some examples, the system comprises semantic rules and routes which diffuse, block and/or do not allow discrimination factors related to semantics of race, gender, age, sexual orientation etc. In some examples, the discrimination based on such factors are blocked at higher hierarchy levels, further semantic augmentation and/or challenges.

In some examples, the system infers discrimination (leadership) semantics which are used as discrimination indicators.

The system may use semantic leaders as discriminators. Further, when the discrimination inference (e.g. comprising semantic artifacts, resonant semantic groups etc.) have high entropy, drift, shift and/or bias against fairness inference (e.g. based on ETHICS rules and/or routes) then the system may determine decaying of leadership factors.

Discrimination factors may be associated with indicators such as EVERY, ALL, SOME, MAJORITY, NONE, FEW. The discriminator factors may be correlated (e.g. EVERY MEAL WITH MEAT semantic route may comprise 80% MAJORITY MEALS WITH MEAT, FEW MEALS WITHOUT MEAT; 20% ALL MEALS WITH MEAT, 80% NO MEALS WITH MEAT. etc. Such correlations may also be based on high (entanglement) entropy.

The system may comprise semantic rules to factorize, adjust, DO/ALLOW, DO NOT/BLOCK and/or gate discrimination factors, biases and/or associated artifacts (e.g. images, documents, zones, UI controls and/or further multimedia and/or semantic artifacts).

The intrinsic capabilities, purpose and/or behavior and further the (entanglement) entropy of (composite) semantic inferences in rapport with the former may be used to denoise and/or factorize inferences including further actions. In an example, a device associated with an "alarm" semantic identity has intrinsic capabilities to "keep operating room safe" and thus when the device detects an unusual behavior and/or event (e.g. with high drift and/or entropy from the intrinsic safe capabilities) it may infer that room is not safe anymore and further that the alarm intrinsic behavior is switched "off" and thus inferring "the alarm went off"; it is to be understood that <the alarm> in the previous example refers to a semantic identity. Further, it may infer high (entangled) entropy remedies, actions and/or semantic identities (e.g. providing required capabilities—e.g. operating room sprinkler) in order to return to the intrinsic safe behavior by inferring and/or applying various routes and/or rules (e.g. "spray halocarbons", "activate (the) (operating room) sprinkler" etc.).

The system infers risks and/or threats factors based on goals, missions and/or profiles. In one example, the goal associated with a camera is to keep an area safe from a security based identity profile perspective and/or semantic view, while of an intruder to keep the area safe from an intruder identity profile perspective and/or semantic view. It is to be observed that, while some of the goals may be the same for both profiles (e.g. STAY SAFE, MAKE MONEY) from an entangled and/or causal route/group and/or semantic view they are opposite, have high (entanglement) entropy and/or are non-affirmative resonant because the semantic profiles and semantic artifacts thereof which guide the actions and/or operations on how to achieve the goals and/or missions have high entanglement entropy (e.g. STEAL GOODS, EARN MONEY BY SELLING (STOLEN) GOODS vs. EARN MONEY BY WORKING, EARN MONEY BY SELLING GOODS etc.). As such, particular sematic profiles (e.g. of OWNER) are assigned leadership while denying access and/or leadership to profiles which have high entanglement entropy and/or are non-affirmative resonant. It is to be observed that while for the intruder or victim one of the goals is to STAY SAFE its projections and/or further actions cause (high shift, drift and/or entropy) UNSAFE inferences in other semantic identities and/or semantic groups and thus non-affirmative resonance is realized. Further, the system may factorize foe indicators based on perceived offensive behaviors and/or hostility. The system may compose affirmative and/or non-affirmative resonances; in some examples, if the motive and/or circumstance of the intrusion is affirmative resonant with the victim semantic identities and/or further semantic profiles (e.g. NEED TO BUY FOOD) then it may decay the non-resonance in regard to the semantic identity of the intruder; however, if the victim is projecting (e.g. based on its profile and/or intruder's profile) that the intruder could have been achieving the same goals by using other orientations and/or semantic artifacts which were feasible using intruder's semantic profiles then the non-affirmative resonance may be further factorized.

It is to be observed that an entity may have multiple semantic identities and thus multiple semantic profiles. During semantic analysis, the system uses the leadership semantic identities and/or profiles based on circumstances and/or uses further techniques to reduce confusion and/or superposition; these may occur due to inference on the semantic artifacts associated with the semantic identities, semantic profiles and/or further semantic (leadership) hierarchy.

In further examples, the intrinsic behavior and/or guidelines are specified by the user.

The system may infer that certain semantics and/or constructs decays indicators associated with a composite construct comprising the semantic. In an example, the term BUT may determine indicators which have a different influence on the entropy within the route comprising the term. The term BUT might be used as a conjunction, preposition, adverb or noun. In most constructs it may cause the factorization of a discriminator and/or leadership related to further composite (projected) inferences. In some examples, the system generates a comparison of a first part of a route with the second part of the route and determines that the part following closer to the term is emphasized and/or factorized as a leader and/or discriminator in further inferences. In some examples, the parts of the routes are deemed highly entropic and the system uses the term to emphasize the sub-route, artifacts and/or semantic identity associated with BUT (e.g. I CAN EAT MEAT BUT BETTER NOT—NOT eating meat is leader BECAUSE I AM FASTING, IS ALL BUT HIM—HIM is leader over others etc.). Highly entropic constructs may increase the superposition in self and/or collaborative parties; if the superposition is coherent collapsible and/or resonant it may have factorizing effect while if it is not coherent collapsible it may have decaying effect and/or factorize/increase confusion.

It is to be understood that in some augmentation examples, some parts of the routes are implicit and may not be rendered, displayed or written but instead may be expressed as part of an inferred composite semantic.

As mentioned, the system may deny particular operations and/or semantics in a route.

In some examples, semantic resonance is based on coherent inferences between semantic routes.

The posts and/or other vehicles may use the friend and/or foe (a.k.a. friend/foe) identification to project the best routes to follow.

The friend/foe may be associated with semantic identities and/or further semantic artifacts.

The system integrates and/or renders various views and/or UI controls comprising streams, fluxes, windows, players and/or any other renderers and/or streams of videos, multimedia, frames, electromagnetic and/or other sensing data; further, the system analyzes the inputs and augment the viewer (e.g. user, group, sensor, robotic device etc.) based on its own semantic profiles. In further examples, only the leader and/or creator of the views and/or presentation can visualize the smart narrative; in further examples, the leader has access to other streams/fluxes/windows/players/renderers semantic profiles and it can be semantically augmented based on those semantic profiles and further adjusts the guidelines, routes, narrative and/or behavior based on that. Further, a user may select the views and/or associated semantic identities and allow the distribution of semantic augmentation to those views and/or fluxes; in addition, the semantic augmentation can be gated. Further the system may specify and/or select the artifacts and/or associated semantic profiles which should compose and perform smart narratives based on such compositions. The semantic profiles may be associated with the views and/or with semantic identities associated and/or inferred from the view/flux/stream data.

In further examples, the system may identify friend/foe in the environment, presentation and/or rendering comprising multiple views and as such it allows the semantic augmentation to be performed based on such inferences (e.g. allow its semantic augmentation to be shared with friends; allow a high entangled entropic augmentation to be shared based on friend/foe; diffuse its semantic augmentation with friends and/or foes etc.).

The system may refresh displays and/or semantic views based on semantic time and/or further friend/foe. Further, it may control sensors, actuation, gating and/or further semantic augmentation based on such inferences. In some examples, the system sends notifications and/or challenges users/owners when inferring friend/foe.

The system may use projected inferences to avoid and/or to follow hardly diffusible routes as determined based on foes; such routes are hardly reachable at particular semantic times as projected by the system. Analogously, by high (entanglement) entropy, the system may prefer and/or follow easily diffusible routes in rapport with friends. In some examples, foes are associated with restrictions in rapport with particular trajectories.

The system may infer friend/foe based on offensive/defensive behaviors and/or block/allow inferences. In an example, a carrier may determine that another vehicle has narrowed a dock door on purpose in order to block itself (the carrier) and/or associated resonant semantic groups from passing and/or further achievement of their goals. As such, the other vehicle is being deemed and/or factorized as foe by the carrier and further being non-affirmative towards the carrier's goals and being perceived as hostile (e.g. because uses offensive behaviors to block inferences towards the carrier's (resonant) goals). However, if the system infers that the blocking is defensive (e.g. to protect itself and/or resonant groups) then the hostility and the foe factor may be decayed. Further, if the other vehicle actions are toward protecting and/or optimizing the carrier safety and/or its goals then the system may factorize the friend factors in rapport with the other vehicle.

Friend/foe inferences may further allow the system to implement fight or flight responses; the fight or flight responses may be based only on allowable actions and/or further related (entangled) restrictions (or constraints). In some examples, the system comprises rules related to "do not destroy property", "do not remove foe unless permissioned by the owner" and thus, it is not allowable to infer and/or act unless it has and/or receives permission from the owner; further, the system infers that the flight and/or possible alternate (projected) routes should be used—e.g. of (become) more friendlier etc.). By high entanglement entropy, the system infers and/or factorizes friends when such friends allow the unblocking and/or diffusion of artifacts towards the (resonant) goals.

A restriction comprising two (entangled) artifacts determine and/or comprise a constraint (e.g. garage door is too small for a boat—garage door and boat are constraint entangled); based on constraints, the system identifies consequences and/or further factors (e.g. risk etc.) in rapport with the endpoints, artifacts, semantic identities, users, owners and/or providers of such restrictions.

The system may project as friendlier artifacts/circumstances/environments those deemed more safe (e.g. less threats, lower fear, less competition etc.) and/or further being associated with lower restrictions/constraints.

It is to be understood that the term "less", "lower", "higher" and/or other comparative orientation factors are used in order to project situations when the system has choices and further, based on semantic analysis, pursues some of those choices in particular ways (e.g. based on offensive/defensive, variable stimulation, motivation, polarity/polarization etc.); the system may also pursue "reasonable" analysis when the budgets are tight.

For increased safety, the system may prefer trajectories, routes and/or further artifacts projecting friendlier environments with less unknowns and/or less entropy. Further, when in offensive mode and/or motivation is higher factorized the system may be biased to increase the tolerance (e.g. index target interval, damping, hysteresis etc.) for friendliness, unknowns and/or entropy.

In some examples, restrictions and/or constraints imposed by collaborators may determine affirmative/non-affirmative, hostile/non-hostile and/or further friend/foe inferences.

The system may distrust some semantic artifacts (e.g. links, endpoints and/or semantic groups) and/or their associated semantics based on failed expectations that those deliver within the semantic group. In an example, the system infers and/or projects a strong affirmative (resonant) semantic group but later infers hostility within the group and thus it increases the risk and/or decays strong affirmative factorizations of the semantic artifacts which generated the strong affirmative semantic group inference in the first place. Further, if the failed strong affirmative inferences were based on hard semantic artifacts, constraints and/or relationships, the system may infer a bias to never infer strong affirmative resonances.

The system may infer counter-biases and/or challenge users and/or other collaborators about such counter-biases.

In some examples, the system uses friend/foes inferences to discriminate between at least two routes, behaviors and/or situations. Further, the system discriminates between at least two threats, emergency and/or hazardous behaviors and/or circumstances.

In further examples, the system infers and/or pursue challenges which are related with identifying and/or inferring causes and/or other opportunities which project friend, foe and/or resonant inferences with other semantic identities and/or semantic groups thereof (e.g. WHAT CAN I DO TO BE MORE RESONANT WITH JOHN AND JANE; WHY ARE THE DOES HOSTILE, HOW CAN I BE MORE LIKEABLE TO DOES, SHOULD I BEFRIEND THE UNDOES etc.). It is to be observed that the system may perform challenges in regards with high (entanglement) entropic artifacts (e.g. DOES vs UNDOES, FRIEND OF UNDOES may cause LESS LIKEABLE OR FOE TO DOES which is highly entropic to LIKEABLE TO DOES etc.).

It is to be observed that semantic group may be resonant on some goals and/or non-resonant in other goals. In some examples, they may be (affirmative) resonant for a hierarchical goal at a higher/lower level but non-affirmative/non-resonant for a hierarchical goal at a lower/higher level.

The system may infer hostility factors based on inferences related to friend/foe wherein the hostility factor is related to a friend and/or foe factor; the hostility factor is proportional and/or semantic factorized with the foe. When the hostility is inferred and/or publicly shared in collaborator environments, groups and/or flux network then the system may further factorize the hostility factors and/or decay the friend factors; alternatively, or in addition, the same factorization pattern may occur when the foe pursues offensive behaviors on competing artifacts and/or markets.

In further examples, the system performs semantic augmentation based on inferences and further semantic analysis of a debate between various semantic (robotic) entities. It is to be understood that the semantic (robotic) entities may be based on various semantic profiles (e.g. of various users, companies, groups, posts etc.) and they perform semantic augmentation to the semantic identities and/or groups associated with the corresponding semantic profiles and/or groups. The debate's semantic orientation may be based on non-affirmative and/or non-resonant semantic artifacts between the robotic entities.

The system may infer, challenge and/or present relevant facts, truths and/or evidence supportive of an argument relevant to a challenge. Further, if the system infers that the debate is argumentative (e.g. based on foe identification, offensive and/or hostility factors) then it may further identify friends and/or foes amongst debaters, hosts and/or audience and pursue offensive and/or defensive behaviors. Further, the system may want to be persuasive and thus identifies the entities (e.g. in audience) influencing leadership discriminatory factors toward its goals; in further examples, the system identifies the audience as a friend and/or looks to build affirmative resonance with the audience and/or semantic groups thereof. The system may identify the argumentative nature and/or factor of the debate based on inference of (high entropic) non-affirmative resonant semantic entities, offensive behavior, hostility and/or foes; it is to be understood that such indicators, factors and/or behavior may be inferred as related to itself and/or between other entities. In some examples, the system identifies that JOHN is a foe towards itself (system) because JOHN debates dating JANE which is highly non-affirmative (resonant) with the system (e.g. because the system likes JANE and have a leadership goal to date/connect with JANE). Further, the system identifies that JOHN is hostile towards BILL because JOHN uses preponderant offensive behaviors to argument against BILL's and thus, it may look to build resonance with BILL to debate JOHN.

In some examples, the system quantifies and further factorizes a persuasiveness factor based on projected resonances and/or (their) further diffusion factors of its goals. The system strategic leadership goal may comprise the factorization of persuasiveness by factorizing friend/foe towards FRIEND (e.g. FRIEND 51% vs FOE 49%) in targeted semantic identities and/or semantic groups at particular semantic times.

The system may be biased to respond to challenges by preserving a higher confusion and/or drift from challenger's expectations/goals when the initial challenge was in forms which projects less choices and further projects uncertainty, non-friendly and/or non-resonant inferences. In an example, the system is challenged with DO YOU HAVE 2 QUARKS? and thus, because the challenge and/or circumstances are hardly believable, un-friendly and/or non-resonant the system may challenge respond with DON'T KNOW WHAT QUARKS ARE in order to reduce the semantic time and/or further unknown/risks/threats. However, if the system infer that the challenge and/or circumstances are friendlier then it may challenge respond with CAN'T GET A HOLD OF QUARKS in order to preserve friendliness and/or resonance.

The system may project that some challenges have negative polarity/influencing and/or are distractive (e.g. based on a distraction factor which is inferred as the following) from pursuing a previously established (resonant) goal in a semantic time and/or semantic budget. The challenge and their associated projected inferences are increasing the semantic spread, related superposition and/or confusion while decreasing resonance (and/or increasing non-resonance) in the current leadership semantic view and, further, threatening the budgets and further realization of the goals. The system may already pursue highly factorized routes toward (pre-committed) goals with little projected confusion and thus challenges which project distraction and/or further semantic drift and/or shift may be gated, blocked, routed, redirected and/or postponed. (e.g. "remind me later after I finish the analysis on S2P2 health about Bill's challenge on quarks", "please ask my coach S2P2 about quarks" etc.).

Distraction factors may be used to determine liabilities and risks when hazardous circumstances occur. Further, the system uses distraction factors to determine risks associated with guarantees.

The system may pursue goals and/or sub-goals for acquiring, being associated and/or maintaining a particular semantic identity.

The system may determine and/or implement more tolerant behaviors by using neutral, intrinsic and/or defensive behaviors when inferring foes and/or hostility.

It is to be understood that the system may infer, be instructed and/or comprise semantic rules and/or routes which would control, constrain and/or block the system from identifying foes, use offensive behaviors and/or become hostile in particular circumstances (e.g. constrain and/or block inferences relating with dating, connecting and/or receiving capabilities/channels/routes/budgets from JANE and/or other semantic groups, do not infer and/or factorize hostility etc.). Alternatively, or in addition, the system may infer, be instructed and/or comprise semantic artifacts which would determine more strict behaviors towards itself and/or more tolerant towards others in particular circumstances and/or related to particular semantic entities.

The system may implement more tolerant behaviors by using neutral and/or defensive behaviors against foes.

The system may use non-affirmative resonance to infer friend/foe semantic identities, factors/indicators, (product) goals and behaviors. While the friend/foe goals may resemble the system's own drive semantics, orientation, goals and/or semantic routes the resonance based on such goals is deemed non-affirmative when the semantic identities are foe and thus determining high (entanglement) entropy and/or being associated with dissatisfaction, concern and/or stress factors.

The dissatisfaction, concern and/or stress factors may be factorized based on (fear of) loss/decaying/indexing/dissociation (e.g. of resonant groups, leadership, goals, position, semantics, budgets, kinematics, trajectory, orientation, stability, predictability, diffusion etc.) and/or (fear of) gain/factorize/indexing/association (e.g. of non-resonant leadership, groups, semantics, indicators, diffusion etc.). Analogously, likeability, preference, satisfaction, trust, leisure and/or affirmative factors may be factorized based on loss/decaying/indexing/dissociation (e.g. of non-resonant leadership, groups, semantics, indicators etc.) and/or gain/factorize/indexing/association (e.g. of resonant groups, leadership, goals, position, semantics, budgets, kinematics, trajectory, orientation, stability etc.).

The fear of loss/dissociation and fear of gain/association may be represented and/or coupled based on entanglement wherein the measurement and/or collapse of loss/gain artifacts may determine and/or collapse the entangled gain/loss artifact—e.g. (loss of) stability and/or predictability (e.g. stability of a post as measured by at least one multiple axis accelerometer/gyroscope/accelerometer) may be entangled and/or determine (gain of) risk and/or vice-versa, stability of economic goals may be negatively affected by un-stability of a pandemic etc.

The system may exhibit short term confirmation bias. As such, the system may be biased towards applying and/or being LIKELY to apply cached routes whenever new inferences occur and thus bias the projected inferences toward such artifacts. In such cases the system may apply a bias to decay the factorization of such routes based on the inferences which increase the semantic spread in the network.

Stability and/or predictability comprise and/or are generic indicators (e.g. indicating the stability/predictability of stock indices, macro-economic indicators, stability/predictability of localized voltages (based on environment, semantic time etc.), stability/predictability of diffusion etc.).

The system may exhibit semantic resonance when inferring behaviors and/or situations in semantic views, scenes and/or further semantic identities.

Stability factors may be used to factorize and/or index fluency factors.

The system may use friend/foe identification and/or factorization to pursue groupings, negotiations, goals and/or missions. In some examples, the system may infer and/or factorize friend artifacts based on (projected) (entangled) inferences on foe artifacts goals, products and/or associated semantic attributes. It is to be understood that in some examples the friend/foe factors may create confusion and/or superposition (e.g. both friend/foe indicators are closely factorized) and as such the system uses confusion, superposition and/or semantic reduction techniques.

It is to be understood that the system may use a composite (entangled) indicator for friend/foe which may further comprise an indicator for each friend and foe. When mentioning friend or foe it is to be understood that it may refer to the respective component indicator and/or to the bias of the composite indicator towards the mentioned component indicator.

In some examples the foes are used to infer and/or represent competing artifacts while the friends are used to infer and/or represent non-competing artifacts (e.g. semantic identities, goals, routes, rules, endpoints, skills etc.).

The system may identify negotiating and/or trade indicators, factors, margins and/or intervals thereof based on friend/foe semantic analysis. It is to be understood that such indicators and/or factors may be associated with competing, non-competing artifacts or both (e.g. for strategic and/or long-term goals, missions comprising a variety of goals etc.).

In further examples the foes represent semantic artifacts (e.g. semantic identities, semantic routes etc.) which are not recommended (e.g. to a user, group etc.) and friends represent semantic artifacts which are recommended.

Friend/foe recommendation may be used in semantic augmentation for learning, viewing, investing, attendance, shopping (e.g. recommend and not recommend items for purchase), security (e.g. logging in into a system, entering an area, following a route, accessing an item, allowing an action etc.).

The system may use friend/foe biasing to emphasize and/or further induce direct and/or indirect inverse/reverse polarity resonance. For instance, in indirect resonance the system may use groups of semantic artifacts, trails and/or routes of resonances which determine opposite polarities. In an example of inverse/reverse polarity, the system generates artifacts, behaviors, signals, waves, renderings and/or augmentation which associates a foe artifact with non-affirmative behaviors and thus by (composition of) double high (entanglement) entropy artifacts it generates affirmative, resonant artifacts, reverse polarity and/or behaviors. Further, the system learns by associating known resonances with reverse polarity inferences.

Polarity may be associated with charge and/or voltage polarity.

In some examples the voltage polarity is modulated by semantic wave conditioning.

The magnetic field in an inductor generates an electric current that charges the capacitor, and then the discharging capacitor provides an electric current that builds the magnetic field in the inductor which further determines the repetition of the cycle and the self-sustaining oscillation/resonance. In some examples, those resemble parallel or serial LC resonant circuits. The system may use semantic biases, damping, hysteresis and/or indexing to adjust components' and/or circuits biases, damping and/or hysteresis and thus adjusting the self-sustaining oscillation and/or further associated semantic resonance. It is to be understood that the capacitor charge polarity and/or further current conditioning in inductors may be associated with semantic factor polarity.

Further techniques such as sympathetic resonance may be used. In some examples, the sympathetic resonance is used to induce and/or diffuse resonance between various semantic identities, semantic groups and/or hierarchies thereof. Further, particular sub-groups and/or hierarchies may be resonant to only particular harmonics at a given resonant vibration, spin, damping, polarization and/or frequency. Further, the system may infer resonant semantic artifacts by polarizations associated with such semantic artifacts which induce affirmative (e.g. positive polarity) and/or non-affirmative (e.g. negative polarity) inferences.

In some examples, a semantic identity and/or further semantic profile is associated with a positive and/or negative polarity in rapport to a semantic artifact. Positive polarity may be used to represent affirmative artifacts and/or factors; analogously, also according with the high (entanglement) entropy, the negative polarity may be used to represent non-affirmative artifacts and/or factors.

In some examples, the system uses polarity inference to determine polarization in resonant semantic groups. Analogously, the system uses polarization of semantic groups to determine group and/or further resonant polarities.

The system infers, emphasizes, biases and/or gates affirmative and/or non-affirmative artifacts. As such, the system associates a character and/or semantic identity with high entropy role goals (e.g. in rapport with a leadership/principal role and/or an overall (mission) strategic/high-level goal and/or message) and further biases it with artifacts (e.g. accents) and/or behaviors associated with inverse polarity resonant artifacts in the target semantic group (e.g. audience) thus, further emphasizing the entropy, drift and/or polarity between the overall goal/message and the inverse character goals and/or behaviors.

Further it may cause increasing the resonance with the target (semantic groups) audience and further factorization associated with the overall impression/rating (e.g. factorize the affirmative factors and/or resonance by increasing the entropy between the mission (e.g. advertising/presentation/movie goals/message) and the non-affirmative resonant artifacts associated with the inferences related to the emphasizing role character; in other examples the system biases a friend character with affirmative resonant artifacts.

The system may generate new compositions and/or further missions by factorizing semantic artifacts based on fluency factors (goals).

The compositions may comprise documents, images, videos, overlays, sounds, tactile, multimedia artifacts, presentations, semantic wave, web pages, postings and/or any other artifacts which may be generated by semantic augmentation. Further, the mission of such compositions may be related with advertisement, artistic, health, diagnosis, communication, teaching/learning, entertainment and/or further augmentation.

The system may use and/or generate compositions with and/or between artifacts (e.g. compose two generated multimedia artifacts, two videos, a video and a sound stream, a sound and post motion, an overlay and a post motion, two overlays etc.). In some examples, the system composes two optical channels and/or video streams. In further examples, the system composes streams and/or semantic waves from at least two devices and/or communication channels (e.g. two mobile phones, sound and/or video, two communication channels with different radio/network protocols etc.).

In some examples, the system applies a bias to the emphasizing role character. Further, the bias may be goal oriented, composite and/or semantic time dependent (e.g. affirmatively emphasizing or non-affirmatively emphasizing based on particular goals, semantic time and/or further biases).

In further examples, the system starts a new presentation, teaching session and/or composition comprising recorded and/or augmented snippets. As such, the system visualizes a situation which must be recorded based on the presentation and/or trip goals and/or further shares it in a semantic resonant group. The system acts (e.g. records artifacts and/or further explanations, actuate etc.) based on variable entropy between the goals and/or happenings in the semantic field.

In further examples, the system generates renderings of shape designs, outfits, components, modules, posts, gears, maps, mission briefs and further augmentation artifacts.

In case that the entropy, shift and/or drift between the goals and the semantic inference is high then the system may undertake high entropy, shift and/or drift actions from the intrinsic behavior (e.g. generate alarms, spray halocarbons etc.).

The system expresses opinions and/or perform semantic augmentation based on high entropy reverse polarity analysis. The bias, polarity and/or polarization of such opinions may be further inferred and used in the semantic (publishing) chain.

In further examples, of semantic augmentation for generating and/or presenting a rendering, presentation, document, movie, email, course etc. the system may create various paragraphs, sections, snippets, frames, and/or images in such a way that while slightly preserving the coherency of strategic goals and/or message it may create higher superposition and/or confusion in order to allow reading and/or collaborating parties to further increase semantic spread (for) resonance, reduce confusion based on own model and/or encourage challenges. Further, the system may create borderline resonances within presentation/rendering of semantic identities, groupings, positionings, colorings, textures and/or further artifacts.

One of the system's strategic goals when generating, presenting and/or teaching is to preserve fluency factors and/or indicators within a specific interval and/or further within a semantic time (interval). In some examples, the interval is a semantic interval.

The system may plan and/or selects semantic artifacts based on projected fluency.

The system may highlight, select and/or overlay various images, paragraphs, snippets and/or other artifacts based on the resonance and/or further polarity between various collaborators, groups, owners, presentation attendees, users and/or further artifacts.

It is to be understood that the friends and/or foe inference and/or artifacts may be associated with semantics such as PAL, FRIEND and/or similar (synonym, low shift/drift/entropy, resonant etc.) and may be applicable wherever they occur in the current application.

The system may infer semantic inference rules, routes and/or further artifacts based on ingesting the current patent application and/or further continuations.

The system may generate document content and associated tags based on semantic analysis (e.g. emails, html, postscript etc.).

In the case of semantic identification (collapse) the system may determine leadership artifacts in rapport with and object, artifact and/or semantic identity which is not associated, do not match and/or do not collapse to other particular semantic identities and thus the system may not associate such (other) semantic identities to the object and/or artifact.

In examples, some semantic views, streams and/or fluxes may be hierarchically generated and/or rendered based on the required resolution and/or coverage. In some examples, such generating and/or rendering may be based on semantic wave and/or wavelet compression. Further, the system may analyze such renderings and/or artifacts at different resolutions based on deep learning and further semantic analysis.

The system may seek inference within semantic resonance operating points/intervals to identify, pursue and/or render goals, positioning, location, routes, group, rules, user interfaces, components, graphs, actuation, commands etc. Further, systems may perform negotiation and/or semantic flux inference/challenge based on tuning the semantic spread to operate within a resonance operating point/interval with a collaborative and/or negotiation partner. In some examples, the system assesses the resonant and/or non-resonant capabilities and/or semantic artifacts to determine and/or guide inferences, goals, behaviors and/or projections. In case that the system determines non-resonant artifacts, it may further increase the semantic spread and learn/determine routes and/or rules which achieve positive sentiments/polarity in rapport with non-resonant artifacts. Further, the system may learn negotiation skills comprising operating goals, groups, routes and/or rules which determine lower risk, factorizations and/or higher (entanglement) (entropy) factors, in rapport with non-resonant artifacts.

The system may infer leadership based on negotiation skills.

In further examples, leaders may be promoted and/or use such negotiation skills to achieve particular goals.

Semantic groups may be inferred based on resonance with artifacts having negotiation skills. In some examples, the system infers semantic groups for trading and/or negotiating securities, rates, budgets, risks and/or other indicators.

The system may use leadership inference and/or resonance for determining preferred brokerages and/or insurers. In some examples, a leader within a group is deemed as a broker and/or insurer in particular circumstances. In further examples, resonant entities are deemed as brokers and/or insurers in particular circumstances (e.g. based on semantic time).

Within this application the term "influence", "influencer" and/or related terms may be understood as artifacts pursuing semantic resonance. Further, the semantic resonance may be achieved through a variety of skills including leadership, teaching, negotiation, influence, polarization among fluxes and/or semantic groups etc.

As mentioned, the system replenishes stocked articles based on semantic inference.

The system uses semantic analysis to keep optimal stocks, optimal available budgets, publish semantics and/or costs.

The system uses resonance inference to infer optimality. In some examples the system performs semantic publishing based on optimality of loss and/or gain.

The semantic route inference may get blocked, halted, expired and/or invalidated; further, the system may use semantic trails and/or further inference to learn why the inference was blocked, halted, expired and/or invalidated. The blocked, halted, expired and/or invalidated inference may use partial semantic budgets and thus, the feedback/explanation of partial inferences may allow the system to learn new semantic artifacts based on feedback and/or the consumed semantic budgets. In some cases, the system does not expire the blocked and/or halted inference, instead waiting to proceed when the semantic time allows, potentially with updated budgets.

Techniques such as explained in this application may be used in mission management wherein the system assigns likings, optimizations, preferences and/or goals comprising semantic budgets and thus, the system may pursue the mission by inference on such guidelines while blocking, routing, re-prioritizing, re-budgeting and/or invalidating the goals when the inference for such goals gets blocked, halted, non-resonant, expired and/or invalidated.

In further examples, the semantic artifacts are embedded in documents (e.g. html, PDF, word, excel, power-point etc.), potentially within (tagged and/or delimited) fields, paragraphs and/or sections. It is understood that the embeddings may be specified in terms of challenges, semantic identities, inference augmentation (e.g. textual, ui controls, sensing/actuation/signal etc.) and/or explanations (e.g. of why a semantic artifact couldn't be achieved, why is blocked, risks of budgeting etc.).

In distributed inferences, if a route inference at system A challenged system B for a semantic within a budget and the inference at B gets blocked then the system B may stop the inference and report to the system A why the inference is stopped and/or is blocked. Further, the inference at system A may decide to further challenge B, use (alternate) semantic routes and/or indicate to B to forget and/or invalidate any of the challenges and/or associated artifacts. It is to be understood, that the challenges at B may use partial semantic budgets and at such the feedback/explanation from B to A may allow A to learn new semantic artifacts based on feedback and the consumed semantic budgets.

A and B may explain to each other the meaning of signals, inputs and/or outputs; such explanatory interfaces may be used by the learner to learn and/or generate semantic artifacts including semantic rules (e.g. time management, access control, factorization etc.). In cases where the confusion is elevated during the ingestion and/or inference of the explanation process the confused system may further challenge the explainer, fluxes and/or artifacts for reducing the confusion. In similar ways, the system may proceed with ingestion and/or inference of explanations for particular ratings, risks, factors, indicators and/or further semantic artifacts.

An explanatory system, interface and/or challenges may be used to describe the rules, signals and/or eventual consequences.

In some examples, the teacher may detect confusion and/or a low level (hierarchical) understanding in learner and as such uses further challenges to reduce confusion and/or teach learner higher level explanations and/or associations.

When the system teaches and/or is taught it may comprise goals such as achieving semantic resonance in relation with the teaching goals.

The system's learning and/or teaching goals may progress through sub-goals wherein the sub-goals are progressing from general knowledge, transfer knowledge, abstract knowledge to specialized knowledge related to the goal.

While the teaching and/or learning may be by example, alternatively, or in addition, the system may learn by challenges.

The explainer (e.g. teacher) may provide an explanation by example wherein exemplification of past and/or resonant experiences are streamed to the learner. It is to be understood that the explanation may comprise semantic artifacts and/or further multimedia artifacts (e.g. images/frames, video clips, audio clips, wavelets, semantic waves etc.).

The teacher may provide explanations which resemble and/or resonate at the learner with past, current and/or projected semantic artifacts. Further, the learner may use those resonances for semantic analysis, learning, rendering, action and/or further challenges.

Approval factors may be inferred based on resonances and/or further elevated fluency (of semantic identities) in rapport with (leadership) goals.

A system may perform semantic learning (e.g. recording/learning semantic artifacts), indexing and/or biasing based on elevated fluency and further approval factors.

Teaching factors and/or indicators may be associated with semantic identities and semantic groups wherein the teaching factors and/or indicators are associated with operating in a resonance and/or resonant (semantic) interval while increasing the semantic spread. In some examples, the system uses particular themes, drives and/or profiles in order to perform teaching.

The teaching may be based on challenges between teacher and student. In further examples, when the student challenges the teacher, the teacher may provide clues and/or further challenging of the student. The teacher may use a plurality of challenges and/or responses to induce coherent inferences at student while the student infers and invalidates (eliminates) non-sensical inferences and/or associated artifacts.

The teacher and/or learner may further create resonance in one another by inferring and/or using semantic attributes, biases and/or further adjusting artifacts for achieving resonant challenges. In an example, they may adjust the pitch, timbre, volume, the pace, the resolution, the font size, colors and/or accent in the augmentation (e.g. sound, display, tactile etc.) in order to resonate with the collaborator; it is to be understood that such adjustments may be based on the collaborators semantic profiles and/or further previously inferred semantic attributes about the collaborator (e.g. from direct challenges from the collaborator, from multimedia, other streams/fluxes etc.).

Learning/teaching biases towards a semantic identity (e.g. teacher, learner, learning group, teaching group etc.) may be used and/or factorized based on semantic artifacts inducing affirmative resonance in learner/teacher and/or groups thereof. In some examples, the system may avoid generating non-affirmative inferences in a collaborator (teacher and/or student). In further examples, the system may avoid challenges generating non resonant inferences in rapport with the collaborator.

The system performs analysis on the movement of a semantic identity and/or semantic group. In some examples, such analysis is used to perform teaching, movement correction and/or learning. In a further example the system uses semantic trails, routing, shifts/drifts and/or orientation of detected movement in comparison with goals, guidelines and/or examples (describing and/or depicting the movements). The guidelines refer to artifacts in the semantic field from sensing, multimedia, video, frames, fluxes, streams etc.; in some examples the system specifies that the goals and/or inferred guidelines should be associated with FOLLOW JOHN'S PITCH MOVEMENT BUT DON'T LEAN THAT MUCH OR LEAN LESS and as such the system perform semantic analysis (e.g. the drift, shift, orientation and/or entropy based on such routes, rules, guidelines and/or trajectories inferred) from a first (e.g. of John's) and a second (e.g. of the learner) set of multimedia, video and/or stream artifacts. Further, the system provides semantic augmentation in the form of challenges based on whether the learner achieved and/or not achieved the routes and/or goals (e.g. get a notification/warning that it has LEANED MORE THAN JOHN, a notification/praise that it has LEANED LESS etc.). It is to be observed that the warning may be based on a result which comprises the orientation, entropy and/or shift of the/a desired behavior (LESS vs MORE, JUST RIGHT etc.).

The system may project inferences (e.g. of drive semantics) which are offensively factorized (e.g. high risk), have high entropy in rapport with known knowledge in a particular domains and further factorizing it, smoothing it and/or applying it for another domain.

In further examples, the system has goals to increase the number of borderline resonances while preserving coherence and confusion reasonable (e.g. within a resonant and/or friendly interval).

In some examples, the system determines coherent, not confusing and/or resonant artifacts based on inferences related to artifacts associated with at least two endpoints and/or hierarchical levels and thus performs semantic learning based on such resonances.

The system may project that particular semantic routes may not achieve resonance with a particular artifact and/or collaborator within a semantic time interval and as such it may use alternate semantic routes, semantic time and/or projections to achieve the resonance goal. It is to be understood that the system may determine that the resonance may only be possible by challenging the collaborator and causing it to change its model to be resonant with the goal. Further, by challenges to further collaborators the system may change the circumstances, model and/or resonance artifacts in the collaborator.

In order to achieve semantic resonance the system may challenge and/or diffuse to an entity with projections which are non-resonant, non-affirmative resonant and/or hardly believable with the collaborator in order to increase the semantic spread operating interval at the collaborator in regards with the goal at hand. At a later semantic time, the system may challenge and/or diffuse increased (e.g. by factorization, indexing, hysteresis, damping etc.) resonant inferences at collaborator and thus increasing likeability factors. In similar ways, for increasing likeability of a semantic artifact (e.g. related to a semantic identity, activity, cost/budget, option, goal etc.) the system may challenge and/or diffuse various projections from which some are non-resonant, hardly resonant, negatively factorized and/or associated with higher dissatisfaction factors while others are more resonant, less negatively factorized and/or associated with lower dissatisfaction factors and thus increasing the factorization of the likeability factors for the latter projections, options and/or routes. Further, the association of semantic identities with more likeable and/or less dissatisfactory options while dissociating the semantic identities with the less likeable and/or more dissatisfactory options may increase the popularity related with the semantic identity and create a resonance with such semantic identity. In an example of an explanatory system, a vehicle display unit is coupled to an analog and/or digital speedometer; the speedometer may send signals to the display unit which are not understood at first by the display unit. However, an explanatory semantic unit may be coupled to the wiring link between the display unit and the speedometer and further be configured to explain and/or translate to the display unit the signal. As explained, the semantic unit may comprise semantic flux and/or stream interfaces and further be semantically configured via fluxes, I/O systems and/or other interfaces. In some examples, the semantic flux from the speedometer manufacturer is challenged in regard to the meaning of speedometer inputs before being displayed on the semantic unit. It is to be understood that the explanation may be based on the voltage and/or current provided by the speedometer and/or further semantic indexing factors (e.g. 3V is no speed or intrinsic behavior, +0.10V is +1 km/h, 0.16V is +1 mph etc.). Further hysteresis and/or damping factors may be explained for improved accuracy and/or interpretability. Such explanations and/or challenges may be provided by inputs, semantics, multimedia artifacts and/or other modalities as explained in the application.

Further the system infers, renders and/or display semantic artifacts associated with the explained semantics (e.g. speed) and perform semantic augmentation. In some examples the system renders semantic artifacts on displays based on particular semantic profiles. Further, the user may specify how those displays and/or controls should be rendered. In an example, the user may prefer various colors and/or indications for the speedometer pointers and/or speed ranges (e.g. BLUE FOR HIGH SPEED, RED FOR LOW SPEED, GREEN FOR RECOMMENDED SPEED); it is to be understood that the system may infer those based on other related inferred artifacts which resonate with the current user's (leadership) circumstances.

The system may infer, adjust and/or factorize likeability, preference, satisfaction, trust, leisure and/or affirmative factors based on high (entanglement) entropy inference in rapport with (higher) dissatisfaction, concern and/or stress artifacts and vice-versa.

While the preference indicators might be used to favorably factorize semantic artifacts in rapport with an entity it is to be understood that the system may use inconsistency analysis to establish risk of the preference indicators and/or factors. In an example, the system may have set a high PREFFERED factor for buying CAMPING articles from a provider but because the experience (e.g. comprising expectations and/or consequences goals) is inconsistent (e.g. sometimes affirmative, non-affirmative and/or not in an operating interval) the system may change the preferred factors to reflect inconsistency (e.g. via risk, inconsistency and/or reliability indicators/factors) and/or infer time management rules about inconsistency (when the provider is preferred, consistent, less risky, induces affirmative/non-affirmative resonance and/or when it is not (or having high entanglement entropy)).

A semantic view frame may be represented as a semantic group and the system continuously adjusts the semantic factors of semantics, groups, objects and scenes.

Semantic resonance related with lower risk to reward factor may determine offensive behaviors. Analogously, semantic resonance related with higher risk to reward may determine defensive behaviors.

The system may focus resources, sensing and/or elements based on satisfaction, trust, leisure, affirmative, dissatisfaction, concern and/or stress factors. As such, the inferences in particular semantic (frame) views may be assigned more budgets (e.g. by indexing, damping, hysteresis etc.) based on such factor intervals. In an example, the system determines an operating interval (e.g. based on resonance) wherein the cyclist scene movements and/or features induces coherent affirmative inferences. It is to be understood that the system elevates to leadership such resonant movements and/or features and further factorize them based on semantic profiles; in some examples, induced resonance by observing cyclist eyes and/or facial expression may bear more leadership.

The system may focus on a scene and/or view by adjusting (e.g. decrease) the semantic spread. In some examples the system considers, selects, gates, allows and/or diffuses only semantic coherent and/or resonant artifacts associated with the scene's and/or (semantic) view's artifacts, leaders and/or drives.

In further examples, the system uses a discomfort/comfort factor and/or indicator to determine and/or control the behavior of the system in relation with the observability in the semantic field; as such, the rendered, sensing and/or augmentation elements may behave (e.g. steer, move, vibrate, speak etc.) in a way which is uncomfortable/comfortable factorized. In some examples, the vibration and/or pitch is too high, too long, too short and/or within an inappropriate semantic time; the camera sensor moves (e.g. too fast or too slow) and/or zoom in an on/off fashion within an interval of (semantic) time; camera keeps observing for too long; the gaze of a rendered and/or augmented face is staring for too long, too short and/or in an intermittent fashion at the user etc.

Increase in (aggregate) resonances may determine increase in stimulation factors and/or stimulation circumstances.

When the stimulation factor is high and/or the number of resonances high then the confusion and/or superposition factors may increase. The system may reduce the confusion factor by reducing the number of resonances by invalidating and/or conditioning the resonant signals and/or groups.

The system goals may be based and/or associated with increasing stimulation circumstances. In some examples, increased offensive and/or defensive behaviors may be associated with increased stimulation circumstances and/or factors. Thus, the system may perform semantic smoothing for optimizing (e.g. damping, keeping in a hysteresis interval etc.) the moods determined by stimulation circumstances.

In further examples, the system factorizes stimulation factors based on comfort/discomfort factors and further offensive/defensive behaviors. In some examples for offensive behaviors the stimulation is positively factorized for increased comfort and/or, potentially based on high (entanglement) entropy, negatively factorized for increased discomfort; analogously, based on high (entanglement) entropy the stimulation is negatively factorized for decreased comfort and/or positively factorized for decreased discomfort. By H/ENT of offensive/defensive behaviors, the stimulation is negatively factorized for increased comfort and/or, potentially based on high (entanglement) entropy, positively factorized for increased discomfort; analogously, based on high (entanglement) entropy the stimulation is positively factorized for decreased comfort and/or negatively factorized for decreased discomfort.

The system may adjust stimulation factors and/or further offensive/defensive behaviors in order to avoid overstimulation (e.g. sensory and/or information overload, high confusion etc.) and/or under-stimulation. While overstimulation and/or under-stimulation may be seen as entropic artifacts when related/entangled to a semantic identity and/or constraint it is to be understood that they may not be entropic when are not entangled and/or assigned to a semantic identity and/or constraint. In some examples, an entity may be overstimulated in regard to particular artifacts and/or fluxes and/or under-stimulated in regard to others.

The system may adopt a more defensive behavior when is challenged by non-affirmative factorization challenges and/or collaborators (e.g. inducing less resonant, non-affirmative resonant, non-resonant, higher risk to reward factor, negative polarity inferences and/or any combination thereof). Analogously, the system may adopt a more offensive behavior when is challenged by positive factorization challenges and/or collaborators (e.g. inducing higher resonant, affirmative resonant, lower risk to reward factor, positive polarity inferences and/or any combination thereof). It is to be understood that the negative factors/factorizations for particular artifact/s indicators and/or semantic groups thereof have and/or determine high (entangled) entropy values of the corresponding positive factors/factorization for the same artifact/s and vice-versa.

The system may become more defensive towards the inferences related to a challenger when the challenges it receives determine non-affirmative resonances and/or high entropy inferences in regards with core semantic trails and/or routes.

Semantic resonance related with lower risk to reward factor may determine offensive behaviors. Analogously, semantic resonance related with higher risk to reward may determine defensive behaviors.

The semantic resonance may be used in relation with signal analysis and/or semantic profiles. In an example, the system detects and/or generates signals, semantics and/or semantic waves which are resonant with particular semantic profiles; further, the resonance operating interval is determined and/or learned based on such profiles.

The system may project propagations and/or diffusion of shapes, compositions and/or markers.

The system may learn semantic rules and routes as resonance occurs at the same endpoint and/or semantic time. Further, the resonant artifacts may be considered as entangled until expiration, invalidation and/or decoherence occurs.

Semantic analysis comprises semantic composition, semantic fusion, semantic routing, semantic resonance, semantic indexing, semantic grouping, semantic time and/or other language based semantic techniques.

Semantic leadership is inferred and/or adjusted based on semantic analysis including semantic factorization.

In some examples, the system performs semantic inference while maintaining a trail of semantic artifacts and/or leadership which have been considered during inference. As such, the system can perform semantic learning of cause-effect, biases, anomalies and/or further inferences.

The system may use variable coherent inferences based on at least one coherence/incoherence indicator and/or factor. In some examples, the semantic analysis uses such factors to assess the coherency/incoherency of the inferences. It is to be understood that the coherent and/or incoherent inferences may be based on high (entanglement) entropy of coherent vs. incoherent.

The semantic posts comprise at least one component allowing the superior and/or inferior parts of a post and/or module to move in particular ways (e.g. tilting, flexing, moving sideways etc.). In some examples, the component comprises shafts supported by bearings and/or bushings which allow the module's parts to tilt longitudinally to the axis of the shaft. Thus, the tilting mechanism allows the move and tilt towards each-other and further connect by using any of the previously explained coupling methods.

In some examples, the flexing mechanism allows the adjustment of the composite base in which the inferior part of posts adjust and/or are tilted sideways for increasing the base of support and/or adjusting the center of pressure or zero moment point inside the base of support (e.g. towards a centered semantic zone and/or endpoint etc.). It is to be understood that the base of support may be modeled and/or mapped within the semantic network model and the system adjusts the center of pressure and/or zero moment point in the base of support within semantic network model based on semantic inference and/or analysis. Analogously, the systems adjust the composite plate carrier wherein the superior part of the posts are adjusted, moved, shifted and/or tilted sideways for adjusting the center of pressure or zero moment point inside the base of support.

In further examples, the posts include a swiveling arm and/or barrier which is connected to a/the hook, latch and/or gripper. In retracted position the swiveling arm is parallel and/or side by side with the post while being attached to the post in at least two regions, a superior one which is attached to the hook/latch/gripper and an inferior one which is attached to a module which comprises a motion controlling mechanism. In a preferred embodiment the motion controlling mechanism comprises at least one actuating shaft, lug, inner tube, arm etc. and further supports (e.g. bearings, bushings, lugs, nuts etc.). The actuating shaft/arm is controlled via on-board/on-module motors and allows the sideway extension of the arm and hence the hook/latch/gripper. It is to be understood that the sideway extension may comprise lateral, vertical, angled movement and/or extension of the arm such as the upper portion supporting the hook/latch/gripper stays at the same height during extension. The arm itself may comprise inner tubes and/or components which extend and/or collapse to optimize hooking/latching/gripping at various heights and/or configurations. Further, the arm module may comprise a circular swiveling mechanism/platform which allows the arm to swivel in a rotating manner; the rotating swiveling mechanism may comprise rotating shafts, toothed wheels, bearings, bushes and/or other components in order to transfer torque and motion from the motor.

In order to adjust to the opposing forces generated by pulling and/or pushing (e.g. other posts, carriers etc.) the posts, modules, wheels, suspension and/or swiveling arms may move in order to adjust the center of gravity, gravity line and/or base of support. In some examples, at least one post (or group of posts) need to trail, tow and/or drag a target load (e.g. another post/s and/or groups thereof). As such the swiveling arm moves towards clipping and/or clamping with the target load (e.g. by hooks, clipping, clamping and/or gripping mechanisms etc.). In order to preserve the stability endpoint and optimize the center of gravity and the base of support the system adjusts the load on the wheels (e.g. retracts the wheels farther away from the load and/or lift the wheels closer to the load); as such, the system may know that is in the TRAIL, TOW, LIFT and/or other similar/synonym modes and thus, when it senses additional load on particular wheels, inertial movement towards outside of the stability endpoint and/or towards the instability endpoints and/or areas it may adjust the wheel lift, damping, movement and/or braking (e.g. based on semantic indexing, damping etc.). Further, additional movement and/or semantic shaping of the arm may generate additional towing moment in particular situations (e.g. once connected to the target load moving the arm to point toward the direction of movement). Further, if the target load comprises semantic posts, units and/or modules the trailer may coordinate the operations with the target units; as such, the target units may position and/or adjusts arms, lift, damping, movement and/or braking in order to allow achievement of the (entangled) composite system goal. It is to be observed that the two systems (towing and target) may be considered entangled in regard to the tactical goals (e.g. maintaining stability) and/or further constraints as the change in one system posture and/or connection may affect the other system stability and/or the entangled system stability.

The system may further attach modules and/or components to other assets which require mobility and/or need to move from one endpoint to another.

In some examples, the system attaches at least a semantic unit, a post, a mobility module and/or a mobility base to a chair, bench and/or other sitting element. In further examples, post's components (e.g. grips, hooks and/or latches) hook and/or latch into the base and/or legs of the chair. In addition, the system deploys the posts based on inferences related to the ensemble's center of gravity, base of support and/or further requirements and/or capabilities (e.g. damping, elevation, weight, width, noise etc.).

As presented, the mobility asset module may attach and/or be attached to the base of the chair via a mobility base which comprises a (lockable) groove and/or channel where the chair legs can be inserted and/or locked.

Chair legs can be coupled via a plurality of latches, hooks and/or lockable bands. In further examples, the latches are electromagnetic and/or maglocks.

In other examples, the mobility moving module and/or mobility base comprise grippers which grip the chair legs.

The mobility asset modules may be coupled together through a common frame and/or (groups) of posts. Further, the modules may incorporate a supporting base for the asset components; it is to be understood that the supporting base may ensure that the asset is elevated to allow the movement of the mobility base.

A mobility base/carrier may comprise and/or be formed as a composite carrier formed from a plurality of joined/latched elements. As such, elements may be robotically exchanged/replaced/added within the mobility base composition. In some examples, S2P3-S2P6 are part of the mobility base/carrier and the system decides that it needs to replenish to likeable energy budgets and thus, it decouples and/or replaces S2P6 (e.g. with a likeable budget charged S3P6); further, it may potentially send S2P6 to recharge and/or to control/apply/perform activities and/or diffusions. It is observed that the system may determine likeable support and/or traction for the items supported by the mobility base; as such, as S2P6 is replaced, other remaining posts (S2P3-S2P5) in the mobility base/carrier should ensure likeable support and/or traction for the ensemble.

The mobility asset modules and/or their components may comprise and/or be connected to sensors. They may include weight sensors, (multiple axes) accelerometers, gyroscopes, magnetometers, cameras and/or other sensors. These sensors may be used to detect and/or adjust the mobility/asset ensemble center of gravity and/or further base of support. In some examples, the sensors are connected to the lockable base and/or grippers.

A mobility module may incorporate a gripper and a retractable supporting base. The gripper may lift the asset component (e.g. chair leg) while the retractable supporting base extends, slides and/or locks under the asset component in order to provide support while moving. During unloading in position, the retractable supporting base retracts and/or unlocks while the gripper lowers the asset into position. It is to be understood that the gripper and/or retractable supporting base may be comprised in the same module or different modules.

In an example, a mobility group comprising mobility modules is tasked with moving a chair from location A to location B in a specific orientation; as such, the mobility modules move into position at each of the chair's supporting legs, grip/lock/latch to them, lift the chair and further sliding the support bases under each chair's legs and/or further gripping and/or locking them; once the asset is secured in place (e.g. at all the legs) the mobility modules start moving the asset from A to B as per goal. Once the asset is in the desired orientation, position and/or location B the supporting base may retract, the asset is lowered and/or further the locking, latching and/or gripping is released.

A variety of other options may be used for moving bases and/or attachments. In an example, the moving modules latch, lock and/or grip each to the chair's legs; alternatively, or in addition, they may latch, lock and/or grip the chair frame, sitting area and/or other component. In some examples, the chair comprises latching, locking and/or hooks allowing easier interconnection. It is to be understood that the moving modules may be coupled and/lock together and/or to a further moving, lifting/lowering and/or locking base.

In similar ways with the lockable barriers, a semantic post may incorporate a movable arm which allow the bands and/or locking mechanisms to reach and connect to each-other. As such, the arm may be aligned vertically along the post in an initial intrinsic position. Its tip may comprise the connector and/or locking mechanism which extend and/or guide the bands, dividers and/or meshes. The arms move from the vertical position towards a more angled and/or horizontal position until they reach each-other (e.g. with another post arm) and are able to connect and/or lock the bands, dividers and/or meshes in place. Once connected the posts may further maneuver to extend the connected bands, dividers and/or meshes; further, once connected, the system may or may not retract the arms in the intrinsic position.

A post may possess at least one arm, lock, band and/or hook. Further, the post may possess multiple arms—e.g. one for guiding and/or locking a superior band, part of a divider and/or mesh and one for guiding and/or locking an inferior band, part of the divider and/or mesh. Further, a post may possess at least two arms and use them for shopping wherein one arm is holding and/or maneuvering a cart/basket/bag/container and further, the other and/or another arm picking and/or manipulating items IN/OUT the cart/basket/bag/container.

In further examples, the system takes into consideration the environmental factors (e.g. temperature, wind, noise, pollution etc.). In cases when wind is present the system may index the damping, positioning, orientation and/or stance of the modules, arms, fastening points (e.g. latches, hooks etc.), rows and/or columns.

The system may deploy and/or guide mobile post enabled assets based on semantic augmentation. Further, the user may indicate where, how and why the assets are deployed. In some examples the user indicates zones and/or trajectories where the assets to be deployed. In further examples the system is instructed to deploy the assets for a HEALTHCARE CONFERENCE WITH 300 ATTENDEES configuration and thus the system infers the optimal endpoints for each assets based on circumstances (e.g. based on the availability of conference rooms and characteristics; ensure proper distancing during a pandemic; being healthcare related ensure reasonable high networking, learning and/or friendliness etc.).

The assets (e.g. chairs, posts, sensors—microphones, cameras, antennas etc.) may be optimally oriented in such a way that they serve the purpose of creating optimal resonance within/between (the leadership) (entangled) semantic groups (e.g. attendee/user, speaker) increased stimulation and/or satisfaction; thus, the chair/platform/post/sensor is oriented toward endpoints and/or locations creating maximum resonance and/or stimulation (e.g. the speaker platform is oriented toward the semantic group of attendees/users and/or associated endpoints, the user platform is oriented towards the speaker platform or towards an alternate augmentation method based on its semantic profile and/or behavior etc.). It is to be observed that the sensing (resonant) orientation from an attendee/user to a speaker and from speaker to attendee/user may facilitate elevated (projected) resonance despite them being in mainly opposite directions; this is to be understood that since they represent an entangled mission (e.g. "ensure resonance between attendee and speaker") and/or (projected) further (entangled) group the system may look to optimize (projected) entanglement and/or resonance by diffusing and/or intersecting resonant areas and/or trajectories.

The posts movement may be mapped to various hierarchies in the semantic network model. In some examples, the system may infer artifacts (e.g. endpoints, routes etc.) where the resonance, friendliness and/or further stability is elevated as opposed to other options; as such, the system factorizes the positive polarity of safety in regards with such artifacts. In further examples (e.g. when the system is in offensive/defensive mode), it may look for artifacts and/or areas projecting stimulation and/or motivation.

The system calculates and/or project the movement of the sensor platform using available sensing and further uses it to index and/or bias the position of artifacts in the semantic field and/or infer further semantic artifacts. In some examples the system compensates for the movement of a moving module, post, carrier and/or vehicular platform. Alternatively, or in addition, the system compensates for any sensing and/or damping of mountings, support and/or casing movements which may be installed on the platform. While such compensation may occur, it is to be understood that this may be coupled with indexing and/or biasing of damping, torquing and/or stabilization techniques for platform and/or other supporting components. Thus, the system project semantic routes comprising such indexing and hence when the motion occurs the system uses the indexed and/or biased semantic artifacts for inference while decreasing the shift, drift and/or entropy of future inferences.

The robotic systems may be out of budgets (e.g. energy etc.) and as such they may need to be stored in a safe location (e.g. allowing charging, non-impeding, secure etc.). As such, the system determines safe and/or friendly zones and ensures safety budgets and/or associated hysteresis needed to reach the safety. The safety budgets and/or hysteresis may be more elevated when the confusion/incoherency is high and/or based on particular factors (e.g. risk high, budget gain low etc.).

We explained the use of rules and/or routes associated with do/allow/preferred/recommended/follow (and/or related synonyms) and their high (entangled) entropy (and/or antonyms) "do not"/block/not-recommended routes, rules and/or guidelines. Sometimes, the system infers "blocked" semantics related to contextual artifacts and/or inferences. In an example, the system may infer that a contractual document associated with particular semantic artifacts may impede and/or block a contracting party from performing certain actions without potential consequences. Analogously, the system may determine that a contractual clause may encourage, allow and/or diffuse a particular behavior.

The system may infer a leverage factor/indicator related with particular semantic artifacts, goals and/or inferences. The leverage factor may indicate the (composite) leverage that the system, user, operator, group, semantic identity and/or any other semantic artifact has in rapport with current and/or projected artifacts and/or inferences. In an example, the operator may want to develop a new product in the area of financial markets and thus the system analyses the leverage based on advantages and/or disadvantages that the operator has in rapport with goals, resonant and/or non-resonant semantic identities (e.g. competitors/foes, partners/friends etc.) and/or other artifacts; further, the advantage and/or disadvantage analysis may comprise block and/or hardly diffusive type of rules for advantageous capabilities which may impede/hardly-diffuse/block competition and/or related semantic groups (e.g. non-affirmative resonant) and/ or block and/or hardly diffusive type of rules for disadvantageous capabilities which may impede/hardly-diffuse/block self and/or related semantic groups (e.g. diffused, affirmative resonant etc.) from competing. The system may determine allow/easy-diffuse types of rules for unimpeded capabilities of self, friends and/or foes. It is to be understood that the allow/easy-diffuse and/or block/hardly-diffuse may be based on high (entanglement) entropy inference.

The system may use polarity and/or further polarization analysis to identify and/or generate performance sentiments regarding markets, cap stocks, seasonals, domains, leadership boards, people etc. In further examples, based on such analysis the system may generate news comprising opinions. Alternatively, or in addition, friend/foe and further semantic analysis may be used.

The system may consider competition participants such as entropic entities (e.g. FRIEND 51% AND FOE 49%; FRIEND 50%, FOE 50% etc.). Further, based on the degree of entropy the system may determine neutral behaviors (e.g. FRIEND 50%, FOE 50%, NEUTRAL 100%) towards such semantic identities.

As mentioned in the application, the factorization of leadership (semantics) may impact semantic budget and/or semantic spreads. In some examples, the lesser (or higher) factorized the resonant leadership is, the lesser (or higher) the discriminatory artifacts, indicators and/or capabilities are. The system may look to attain semantic identities other than of self with higher (or lower) factorized leaderships (e.g. based on groupings leadership, leader (composite) semantic group etc.). In some examples, the system may use higher leaderships when the budgets are low and/or tight wherein (the possible and/or allowable shift, drift, entropy and/or hysteresis is low); analogously, the system may use lower leadership when the budgets are high and/or not tight. It is to be understood that the system may decrease its capabilities leadership when increasing other semantic identities leadership; analogously, it may increase its capabilities leadership when decreasing other semantic identities leadership.

The system may receive feedback associated with affirmative resonant or non-affirmative resonant artifacts. When the affirmative resonant artifact feedback is negative then the system may index its factors more than when receiving feedback from non-affirmative resonant artifacts.

The system may bias anchoring based on projected inferences. In some example the anchoring is based on semantic trails comprising previously budgeted securities and/or endpoints. The anchoring may be based on less hazardous and/or more safe endpoints in defensive behaviors; by H/ENT may be based on more hazardous and/or less safe endpoints and/or artifacts in offensive behaviors.

The system may use projections based on behavior analysis of (affirmative and/or non-affirmative) resonant and/or non-resonant players to bias the anchors.

The system uses semantic trails and/or routes to determine, infer and/or project advantages and/or disadvantages comprising mapping and/or localization at an endpoint. Further, the system may determine the advantages and/or disadvantages of the transitions from an endpoint to another endpoint by composing the advantages and disadvantages based on semantic inferences.

In some examples the advantages are associated with friendliness while the disadvantages with foes.

The system performs drift analysis between the optimal and/or desired trajectory of securities (e.g. stock, market indices, ETF, budgets, personal and/or group safety etc.) between two points in time and the actual trajectory (e.g. FIG. 18). As such, when the difference between the desired and actual value is high at an endpoint based mapping, the system may learn a semantic rule associating the leadership semantics (e.g. volume, employment statistics, natural disasters, hazard etc.) as inferred in the semantic field with an indexing rule associated with hysteresis and/or damping factors.

In further examples, the system learns leading indicators by grouping and/or compositing leadership semantics in the semantic routes and/or trails which generated particular outcomes (e.g. (strategic) goals for stronger economy etc.). In some examples the outcomes are related with semantic analysis on lagging economic indicators and/or groups thereof (e.g. unemployment rate, CPI, interests, deficits etc.).

In some examples the indicators are inferred by the system and the system's goals is of achieving particular factorizations for such indicators in (semantic) time intervals.

In an example of troubleshooting and maintenance of (semantic) infrastructure and/or products/services, the system infers, receives and/or determines abnormal/(NOT normal) and/or undesirable/(NOT desirable) incidents and/or behaviors and as such the system goal is to fix, reduce and/or diffuse such incidents and/or behaviors. Thus, it infers indicators and factorizations which optimize resonances and allocation of capabilities in rapport with the semantic identity, flux, destination, owner and/or user affected by incident and/or behavior. It is to be understood that the system may further project fixes based on high entropy inferences in rapport the abnormal and/or undesirable inferences.

The system learns and/or is instructed with narratives regarding semantic times of regular and/or occasional behaviors (e.g. JOHN SOULD ARRIVE BY NOON, THE PACKAGE SHOULD ARRIVE BEFORE THAT, THERE IS THE SPRING MARATHON GOING ON, IT SHOULD BE QUIET TODAY, etc.). It is to be understood that such semantic times may be provided by users, semantic fluxes, leaders etc. Further, the system may provide guidelines regarding the behaviors (e.g. (SEMANTIC WAVE) INFORM ME WHEN JOHN ARRIVES OR THERE IS AN URGENT PROBLEM, EMAIL JANE WHEN THE MARATHON ENDED, EMAIL ME AS SOMETHING UNUSUAL HAPPENS etc.). It is to be understood that the system may inform and/perform semantic augmentation based on the received instructions, guidelines, semantic times, factorizations and/or further analysis.

The system may determine intrinsic behaviors based on drift, shift and/or entropy of semantic times. In an example, the system may determine that there is one spring marathon (e.g. because the composite semantic THE SPRING MARATHON is very specific, less diffusive and/or having less spread), THE SPRING MARATHON SHOULD OCCUR (80 EARLY) SPRING and thus may infer that the MARATHON OCCURS SOMETIME BUT NOT ALWAYS, ONE SPRING MARATHON 90% LIKELY, ONE EARLY SPRING MARATHON 70% LIKELY, ONE SEASONAL MARATHON 50% LIKELY etc. and as such it determines that the factorization routes/rules, shift, drift and/or entropy of MARATHON from the intrinsic behavior may be decayed for (EARLY) SPRING, NO MARATHON and/or further NO MARATHON, SUMMER, AUTUMN, WINTER semantic times and/or routes. It is to be observed that a route NO MARATHON, SPRING comprises at first the leadership cause of entropy or abnormality in regard to intrinsic (e.g. ONE MARATHON SPRING, expect one marathon in spring which may be invalidated by semantic time). Further, it determines that outside those semantic routes, rules and/or intervals the intrinsic behavior is MARATHONS UNLIKELY, MARATHONS NOT LIKELY etc.

The system uses the leadership semantics associated with semantic times, endpoints and/or locations to define and/or create shift, drift and/or entropy for semantic identification (e.g. THE SPRING MARATHON, THE CHAIR BY THE FIREPLACE, THE DISPLAY POST IN THE CONFERENCE ROOM BY THE WINDOW etc.). It is to be observed that once the semantic route progresses the shift, drift and/or entropy changes—e.g. THE DISPLAY POST IN THE CONFERENCE ROOM, BY THE WINDOW etc. As such, if the system has learned (been informed) and/or has a semantic route and/or trail comprising the semantic identification and further identified only one display post in the conference room then the more precise identification in the route BY THE WINDOW provide further discrimination while keeping the drift, shift and/or entropy low—since there is only one post in the conference room (e.g. potentially used as leadership and/or higher endpoint) then the risk that this is another post is low unless other inferences may increase the risk and/or entropy—e.g. door was not blocked/locked); if the system identifies more display posts in the conference room then BY THE WINDOW provides lower shift, drift and/or entropy if there is a display post in the further discriminatory endpoint and/or location. Further, there may be higher shift, drift and/or entropy if there is no (display) post in the further discriminatory endpoint and even higher if there is no (display) post in the leadership discriminatory endpoint (e.g. CONFERENCE ROOM). In some examples, the system uses such inferences to identify and/or authenticate artifacts which connect to (local) networks; in an example, a display is registered in a registry as DISPLAY IN CONFERENCE ROOM BY THE WINDOW and is further identified, renamed, updated and/or authenticated to DISPLAY IN CONFERENCE ROOM BY THE PROJECTOR based on low shift, drift and/or entropy of composite inferences; by high (entanglement) entropy, the display is not authenticated if the shift, drift and/or entropy is high.

It is to be understood that when the identification confusion is higher the system may further challenge for further localization and/or discrimination (e.g. WHICH DISPLAY (IN CONFERENCE ROOM)?—THE ONE BY THE WINDOW).

It is to be understood that the term "leading" as used in this application may be associated with semantic leadership or not. Thus, the term may be associated with a common/used/plain interpretation and/or semantic leadership.

The system may associate deceptive and/or further associated synonym factors/indicators to systems which publish resonant semantics and/or budgets in affirmative semantic groups to achieve not published non-affirmative goals with the semantic group. When deception is inferred and/or factorized the system may decrease believability factors and/or further factorize non-resonant, non-affirmative resonant and/or foe factors.

Users and/or collaborators may be biased based on their model. In order to counteract such biases, the system may challenge the user and/or collaborator to explain why the biased statement, decision etc. In some examples the biases occur due to selectivity and/or controlled semantic spread of information fed to the user/collaborator.

Affirmative and/or non-affirmative resonance factors may be associated with environments and/or semantic views based on at least one semantic profile (of a user, post, semantic unit etc.).

The fear factors may be factorized based on unknown inferences in non-affirmative environments and/or semantic views. Analogously, the fear factors may decrease with inferences in affirmative environments and/or semantic views.

It is to be understood that the increase in the factors associated with particular indicators and/or synonyms may trigger decrease in the factors associated with the indicator antonyms.

The system may use (projected) risk factors, uncertainty and/or further stress factors wherein such factors increase with the confusion and/or non-affirmative resonances within an interval and/or range between a minimum and a maximum budget and/or (semantic) time.

In order to reduce risk, uncertainty and/or further stress the system may pursue more immediate (e.g. less distant, less expensive, within current budget etc.) goals, semantic routes, artifacts and/or inferences. In an example, the system projects that at least two semantic routes would provide budget increases with the farther away projection providing a larger budget and/or reward; the system may prefer the projection providing the lesser increase in the budget if the risk and/or uncertainty between the time of the first projection and the time of the second projection are higher than a threshold and thus decaying the affirmation and/or resonance of higher reward. Further, the system may bias the projection semantic time boundaries; within the projection interval, the system may use risk and/or uncertainty to rewards factors and/or thresholds; the system may prefer the projection with the lesser risk/uncertainty to reward ratio.

The system may associate rewards with affirmative resonance; further, it may associate risks with non-affirmative resonance and/or non-resonance.

The system may be biased based on learned budgets and/or thresholds associated with artifacts and/or semantic groups thereof. As such, it may not pursue a goal if the budgets and/or risk required to acquire a first artifact associated with the goal inference and/or projection are higher than a previously learned budgeting interval; stress and dissatisfaction factors may also increase during such inferences. Further, the system may pursue the goal if the stress and/or dissatisfaction factors (in relation with the first artifact) are reduced by inferring and/or being presented with alternative choices and/or inferences which require even larger budgets and/or risks for artifacts associated with semantic groups comprising the first artifact.

The system may overestimate by positively and/or affirmatively index, factorize the current and/or "earlier" satisfaction, trust, leisure and/or affirmative factors and underestimate by negatively and/or non-affirmatively index, factorize the same factors associated with a "later" achievement of a goal as the projected risk and/or uncertainty factors increase. Further, the system may underestimate earlier dissatisfaction, concern and/or stress factors while overestimating the same factors associated with a later achievement of the goal. It is to be observed that the (entangled) entropy may also determine and/or be based on semantic time "earlier" vs "later". As such the system may be biased to factorize "earlier" affirmative factors vs "later" affirmative factors and/or further decay "earlier" non-affirmative factors vs "later" non-affirmative factors.

The system may overestimate by inferring semantic times and/or semantic indexing based on capacity, demand and/or factor of consumption (e.g. demand vs capacity factor, STOCK/RECEIVED vs SOLD/EXPEDITED ratio/factor etc.). In an example, for a limited capacity, high demand and/or further high rate of consumption (e.g. of articles, budgets etc.) the system may overestimate the risk of loss, reward of gain, likeability and/or budget because of inference of higher risk and/or uncertainty related with a "later" vs an "earlier" semantic time. Analogously, based on high (entanglement) entropy, for a larger supply, low demand and/or further low rate of consumption of articles the system may underestimate the risk of loss, reward of gain, likeability and/or budgets because of inference of lower risk and/or uncertainty related with a "later" vs an "earlier" semantic time. The system may adjust and/or bias the capacity, supply, demand and/or budgets/price to optimize logistics and/or budgets. In some examples, those may be adjusted to project overestimation and thus increasing the turnover. In further examples, when the logistic infrastructure is in a critical/hazardous state and/or close to the maximum capacity, it may be adjusted to project underestimation and thus decreasing the burden on the supply chain.

The system factorizes indicators as friend/foe at particular semantic times. The system may index (projected) capacity (e.g. MANUFACTURED/RECEIVED/SUPPLY/STOCK and/or composite/similar, (storage)space/locations) and/or projected demand (e.g. REQUEST/(BACK)ORDER/SOLD/EXPEDITED and/or composite/similar etc.). When the demand overshoots the capacity it factorizes capacity as a friend and the demand as a foe and use further hostility and/or offensive/defensive behavior analysis; analogously, potentially by H/ENT, when the capacity overshoots the demand it biases the capacity as a foe and the demand as a friend. Further, based on high (entanglement) entropy between capacity vs demand it may further undershoot one vs another.

The capacity and demand may be related with semantic attributes, endpoints and/or links in the semantic network model.

The capacity and demand may be related with the availability and feasibility of artifacts in the semantic model. In an example, the system infers that when the capacity overweighs and/or overshoots the demand, the availability of feasible zones, endpoints and/or links may increase. Analogously, by H/ENT, when the demand over-weighs and/or overshoots the capacity the availability of feasible, endpoints and/or links may decrease.

Capacity and/or demand projections may be used to determine the optimal distribution and/or further contracting clauses associated with particular artifacts, fluxes, endpoints and/or locations in particular circumstances.

While capacity and demand in a supply chain and/or retail environment has been exemplified it is to be understood that such techniques may be applied in any environments and chains based on capacity/supply and demand/consumption (e.g. energy supply/grids, networking, computing, I/O, sensing, meshes, budgeting, trading, location/localization, asset portfolios, social networks, asset management, traffic, logistics, transportation, sports etc.). Further, it is to be understood that capacity and demand may be considered on a semantic group basis (e.g. FRIENDS OF JOHN, FOES OF DOES, OFFENSE, DEFENSE, RIGHT WING etc.).

The system may use overestimation and/or underestimation to infer friend/foe. As such overestimation/underestimation on competing goals and/or artifacts may correspondingly determine overestimation/underestimation of foes and/or threats.

The system may identify threats and/or further foes by associating fear factors with particular semantic identities.

The system may gate news, messages, emails, images, videos and other multimedia artifacts based on believability, friend/foe and/or opinion/analysis factors.

The believability factors may be factorized based on an indexing factor associated with the orientation and/or rate of achieving and/or factorizing semantic resonance.

The system may identity friend/foe in order to gate content and/or flows (between/from/on posts, displays, websites, networks, traffic lanes, traffic lights/stops etc.).

The system may use friend/foe analysis for optimizing traffic flows (e.g. detect bottlenecks and/or mitigation).

The system may use counter bias factors of "later" vs "earlier" semantic times to increase the semantic spread.

The system may use the "later" vs "earlier" inferences in order to assess and/or index speed, rate of orientation (increase/decrease, gradient) and/or distance semantics factors.

We mentioned that the system may use biases to overcome confirmation bias. In further examples, the system may strongly factorize artifacts which are kept in cache, not decayed and/or not invalidated. As such, the system may be biased towards applying and/or being LIKELY to apply those routes whenever new inferences occur and thus bias the projected inferences toward such artifacts. In such cases the system may apply a bias to decay the factorization of such routes based on inferences which increase the semantic spread in the semantic flux network.

Overestimation and/or underestimation biases may be used during uncertain/unknown (e.g. high confusion, low believability) inferences.

The system may determine confusion factors in collaborators based on semantic flux inference, diffusion and/or direct challenges from collaborators.

The system may challenge collaborators to connect and/or challenge one another. This may happen when the system cannot reduce confusion in collaborator, when non-affirmative resonance is high and/or when the budgets are tight. In further examples, when leader, the system may challenge the collaborators to form a semantic group and/or further perform inferences and/or challenge on a composite basis; the system may assign a particular semantic identity to such groups. In an example, the system may challenge John and Jane to take actions (e.g. entangle, enter a relationship, connect, diffuse, allow etc.) and/or further formally form a semantic group (e.g. DOES, DOE family, transport molecule/cell and bind cell/protein etc.) and/or constraint bound by a contract and further comprising (contractual) collaboration clauses between/within the group and/or the system.

When the contractual clauses are not respected (e.g. overshoot and/or undershoot, are not within a resonant interval etc.), are violated and/or there is high confusion, decoherence, less affirmative resonance, high dissatisfaction, less friendliness, less motivation and/or less stimulation the semantic groups may expire/invalidate; it is to be understood that the expiration/invalidation of the group may determine increases/decreases in positive/negative polarity and/or changes in polarization. The trails of action associated with the formation of the contractual group may be further decayed and/or updated to reflect the group's failing clauses; alternatively, and/or in addition, new semantic trails may be learned and/or recorded. Consequences of actions including associated artifacts may be pursued, factorized, learned and/or invalidated with/for group expiration—e.g. (based on) disentanglement/decoherence, collapse, disconnect, block etc.

When presented with multiple routes in uncertain/unknown circumstances the system may be biased to overestimate the risk of the lower budget route while may underestimate the satisfaction/reward of the higher budget route.

Further, the system may overestimate/underestimate the satisfaction with an option in a domain if an associated semantic identity is high/low factorized in another domain especially if the domains are affirmative resonant.

The system uses earlier and/or later indicators and/or factors which may be represented as (entangled) high entropy artifacts. In some examples, the earlier and/or later indicators are entangled in a composed indicator (e.g. urgency indicator and/or related).

The system may determine earlier and/or later indicators and/or factors based on semantic time management and/or time budgets/costs.

The earlier and/or later indicators may be used to counter-bias and/or manage memory storage.

The system may overestimate artifacts which are associated with (earlier) cache/short-term semantic storage and/or underestimate the artifacts associated with long term (later) semantic storage.

The system may underestimate the future non-affirmative inferences and overestimate the current affirmative inferences when the behaviors are intrinsic and/or with little shift, drift and/or (entangled) entropy from the intrinsic.

The system may use challenges and/or induce overestimation and/or underestimation in friends, foes and/or network based on various learned (resonant) semantic profiles (of friend/foes).

The system infers anxiety factors based on increased confusion and/or overestimation (of a threat and/or rate of change of threat factors) in rapport with a projected circumstance. Further, when the anxiety factor is elevated due to a blocking and/or foe artifact (e.g. route, endpoint, link etc.), the system may look to use alternate projections that increase resonance and/or diffusiveness.

The system may use a biased threshold of semantic route collapses to perform projections.

The system inferences and/or challenges may be related with achieving a maximum number of affirmative resonances and/or further friend biased artifacts. The system goals and/or motivation (factors) may be based/factorized on such inferences; in some examples, it can be used in relation with defensive and/or offensive behaviors in markets and/or semantic fields.

The system factorizes motivation in rapport with (pursuing) a transition and/or a semantic artifact (e.g. route etc.) based on projections using the leadership/drive/orientation of the artifact which may decay dissatisfaction, concern and/or stress factors; the higher the rate of decay (or steeper shift orientation) of such factors in projections, the higher the motivation factorization and/or indexing might be.

The system may infer that groups of players have goals for dominating and/or maintaining relevance in a market even if they have less coherent capabilities, solutions and/or strategies in rapport with the market goals. It is to be understood that the capabilities may be related with only those allowable and/or possible for such players at particular semantic times. In some examples, the capabilities and/or factorizations may be added, eliminated and/or adjusted based on parsing of capability documentation, patents and further semantic analysis etc. The system may provide a more affirmative bias towards more friendly, less hostile and/or more coherent competitors of such less-coherent groups.

In some examples, the system parses the content of this application to infer the rules of semantic inference.

The system compares with past resonances and thus projects into the future. In some examples the system may overestimate and/or underestimate the resonance based on learned biases and/or behaviors. Further, the system may overestimate and/or underestimate the shift, drift and/or entropy in rapport with semantic trails.

The non-affirmative overestimation (e.g. overestimating and/or biasing (based) on/of non-affirmative artifacts, factors and/or resonances) may be based on defensive behaviors while the non-affirmative underestimation may be based on offensive behaviors. Analogously, based on high (entanglement) entropy the system may infer affirmative overestimation for offensive behaviors and/or affirmative underestimation for defensive behaviors.

The system may perform semantic orientation based on using overestimation, underestimation and/or a composition of the two and thus, combining offensive and/or defensive behaviors.

The offensive and/or defensive behaviors are associated with artifacts, actions and/or learning which block foes inferences, actions and/or projections. Analogously, potentially by high (entanglement) entropy, the offensive and/or defensive behaviors are associated with artifacts, actions and/or learning which allow friend inferences, actions and/or projections. As explained previously, entities may be in a superposition of friend/foe and thus the system may diffuse and/or collapse the offensive and/or defensive behaviors based on superposition reduction and/or conditioning.

The system may pursue narratives which compares a choice (an option, a route, a semantic artifact etc.) with the worst-case projections in order to increase likeability and/or affirmative resonance with the choice (and/or decrease the dissatisfaction and/or non-affirmative resonance). Analogously, the system compares with the best-case projections in order to decrease the likeability and/or affirmative resonance (and/or increase the dissatisfaction and/or non-affirmative resonance).

Worst-case or best-case semantic artifacts (e.g. routes, trails, endpoints etc.) may be based on the lowest believable and/or borderline resonant inferences which project high shift, drift, entropy in rapport with an orientation.

Worst-case scenarios may be based, on the highest non-affirmative resonant consequences; this worst-case orientation may be projected when the system overestimates in defensive mode and, by (entanglement) entropy, when underestimates in offensive mode. Alternatively, or in addition, the worst-case scenarios may be based on the lowest affirmative resonant consequences when the system underestimates in defensive mode and/or overestimates in offensive mode. By high (entanglement) entropy with the worst-case scenarios and its orientations, best-case scenarios may be based on the highest affirmative and/or lowest non-affirmative resonant consequences and/or further underestimation and/or overestimation in defensive and/or offensive behaviors/orientations.

It is to be understood that the system uses high (entanglement) entropy to infer and/or analyze best case scenarios in comparison with the worst-case scenarios.

We presented system's capabilities for trading and/or bargaining. In some examples, the semantic anchoring may be based on an (anchor) price/budget threshold used at the beginning of bargaining and/or trading related inferences. The system may use overshoot/undershoot challenges and/or inferences to adjust the bargaining anchors.

During bargaining the system may use undershoot challenges and/or inferences in comparison with the current orientation. If the current orientation has high drift, shift and/or entropy from a desired orientation and/or overshoots in a semantic time then the system may cease to pursue bargaining on the particular flux; alternatively, it may adjust the bargaining and/or trading anchors.

It is to be understood that the system may comprise intrinsic highly factorized/hard rules and/or routes that provide undershoot guidance from the current orientation when bargaining. However, the undershoot anchors may change and/or the system may enter more stimulation phases (e.g. increased stimulation at semantic times) and thus, the system uses stimulation to bias budgets, offers and further inferences.

In bargain type inferences the system's goal is to achieve (individually and/or part of an affirmative resonant group) affirmative resonance with a bargaining partner and/or group; further, the resonance may be related with achieving routes and/or goals (e.g. "good deal", "develop repair skills" etc.) and/or sub-goals (e.g. "gain tuition budget") with more likeable and/or less stressful factors.

Although the parties in trading may orient on achieving different goals, the different goals collaborative inference should collapse into the resonant goal inference (e.g. "gain a good deal", "develop repair skills", "gain a good deal while developing car skills", "develop repair skills for a good deal", "get a good deal on car repair" etc.).

A trading and/or bargaining partner can be factorized as friend/foe. When the system factorizes the bargaining party more as a friend, the system may index down (decay) the resonance thresholds and/or index up (factorize) the resonance factors. Analogously, when the system factorizes the bargaining party more as a foe, the system may index up the resonance thresholds and/or index down the resonance factors.

In bargain type interfaces the system may recommend activities and/or challenges via semantic augmentation which may increase/decrease, index and/or damp affirmative/non-affirmative resonance between partners and/or increase/decrease the friend/foe factors.

We mentioned that the system may employ diversification strategies to optimize stability of goal and/or further inference development. However, in some situations the diversification strategy may not be feasible and/or available and thus the system may infer "critical" type semantics for particular artifacts, fluxes, streams and/or collaborators. In some examples, logistic providers B and C provide to system A similar critical semantic identities and/or capabilities (e.g. ""sanitizer", "grade A"") which are used by the system A for critical operations (e.g. which bear high consequential hazardous semantics if not available and/or not performed); if one of the system B and C capabilities (e.g. B and/or its sanitizer grade A capability) is no longer available the system may further increase the criticality factor and/or further leadership of the other system (e.g. C) and its capability. In some cases B and C are within a semantic group, resonant and/or entangled to system A; while the resonance and/or entanglement may not collapse when the capability of B is not available, factors of the resonance and/or entanglement may change; further, the resonance factors may determine the entanglement resonance. However, the resonance and/or entanglement may collapse if the capability is not available and/or (incoherently) impacting the inference on the (composite) goals of A and/or further stability of the goal (e.g. shift, drift, entropy from projections etc.).

We mentioned the use of forward and/or backward projections for semantic analysis development. Such projections may proceed based on semantic trails and/or further semantic chains including semantic time management; the system may project based on goals and/or budgets until achieves particular coherency, resonance, entanglement/grouping, factorization (e.g. likeability/preference/satisfaction etc.) and/or further high entangled entropy factors (incoherency, non-affirmative resonance, non-likeability, dissatisfaction etc.).

The system may express doubts and/or discrimination challenges. In some examples the system expresses doubts and/or discrimination such as I DO NOT THINK THIS IS A GOOD IDEA and/or further high entanglement entropy equivalents (e.g. with low drifts, shifts, low (entanglement) entropy) such as I DO THINK THIS IS A BAD IDEA. It is to be observed that the term THINK is related with expressing (e.g. by the system, user etc.) affirmative and/or non-affirmative doubt and/or discrimination bias in rapport with a projected inference and/or outcome. As such, the system may use discrimination factors which may be factorized accordingly (e.g. a discrimination factor associated with a (DO) THINK (composition) and/or related semantic artifacts is affirmative resonantly factorized; by entangled entropy inference, a DO NOT THINK is non-affirmative resonantly factorized. Since THINK related inferences may express more doubt, potentially based on semantic profiles, than more assertive (e.g. THIS IS A BAD IDEA where DO THINK is implied) compositions the system factorizes and/or diffuses the discrimination toward the upper (e.g. for DO, THINK) and/or lower (e.g. for DO NOT, THINK) of an affirmative resonant interval while allowing for larger damping and/or hysteresis (e.g. by indexing bias). In cases of more assertive constructs the system factorizes and/or diffuses the discrimination toward the upper limit (e.g. for DO, THINK) and/or lower limit (e.g. for DO NOT, THINK) of an affirmative resonant interval while allowing for lower damping and/or hysteresis. Analogously, for non-affirmative resonant constructs the system uses high (entangled) entropy factorizations (e.g. factorizes and/or diffuses the discrimination toward the lower (e.g. for DO, THINK) and/or upper (e.g. for DO NOT, THINK)). It is to be observed that higher factorization of a non-affirmative construct (e.g. BAD IDEA) may determine higher DO NOT factorized artifacts and/or rules.

The system may further use the semantic time management, collaborative environment and/or semantic constructs in order to infer, optimize and/or perform actions. In an example the system has a rule and/or route for a construct such as BEFORE FALLING ASLEEP (ADJUST) THE MUSIC (DEVICES) TO A VOLUME THAT I LIKE OR TURN THEM OFF. It is to be observed that the system projects that it goes to sleep and thus performs an action based on a semantic route, rules and/or profiles. However, if the projected inference and/or required budgets for performing the action are high and the system doesn't have circumstantial coherent understanding it may want to challenge about the device (e.g. from an additional flux) IS THE (MUSIC) DEVICE (STILL) ON? WHAT'S THE (CURRENT) VOLUME? etc. Further, the system may perform challenges and/or confusion reduction by other active semantic profiles which may be affected by the action (e.g. of some other persons and/or groups affected by the action and/or diffusion of the action). While in the example, we specified implicitly (e.g. by VOLUME associated with a leadership factor/indicator of the music device) and/or explicitly the semantic identity of the MUSIC DEVICE it is to be understood that other devices may be implicitly and/or explicitly considered (e.g. FALLING ASLEEP may be inferred/related with biological signals from a biological sensor/device etc.).

The system may challenge collaborators for past, current and/or projected inferences (e.g. WHAT WAS THE VOLUME BEFORE FALLING ASLEEP?).

Further, it may express likeability in relation with such challenges and further update the semantic profiles with the semantic trails/routes and/or rules at the point of challenge.

If the system maintains unaltered and/or un-entropic intrinsic behaviors, it may not need to perform challenges on those behaviors.

The system may be biased to overestimate/underestimate/overshoot/undershoot factors and/or further capabilities, demand, consumption etc.

The system may use biasing and/or semantic analysis on both defensive and/or offensive behaviors to counter bias overestimate/underestimate/overshoot/undershoot inferences.

When the likeability and/or desirability is high the system may overestimate/overshoot the demand; further, when assessing usefulness and/or acquiring a likeable artifact the system may overestimate the risk of loss and/or underestimate the risk of gain and thus, entering offensive behaviors and projecting goals/plans of gaining the desired artifact. When the likeability and/or desirability is low the system may underestimate/undershoot the demand; further, when assessing usefulness and/or acquiring the less desirable artifact the system may underestimate the risk of loss and/or overestimate the risk of gain through projections. It is to be understood that by high (entanglement) entropy the system may pursue reward of gain analysis instead of risk of loss and/or further reward of loss instead of risk of gain.

If the projections are not feasible and/or do not match the truth then the system may factorize dissatisfaction, concern and stress factors in regard to projection plans.

In some examples, the system may bias the projections, goals, orientations and further factors, damping, hysteresis and thresholds to overshoot and/or undershoot wherein the overshoot may be based on decaying non-affirmative overestimation and/or factorizing affirmative overestimation; analogously (e.g. by H/ENT), the undershoot may be based on decaying non-affirmative underestimation and/or factorizing affirmative underestimation.

In further examples, a likeability/desirability overshoot may be inferred/based on the decaying of non-affirmative and/or factorization of affirmative resonances; analogously (e.g. by H/ENT), a likeability/desirability undershoot may be inferred/based on the decaying of affirmative and/or factorization of non-affirmative resonances.

Likeability/desirability overshoot, undershoot, overestimation, and/or underestimation analysis may be used in inferring the demand, capacity and/or further advertising campaigns. Further, such techniques may be used to delimit (e.g. between overshoot and/or undershoot) the optimal, targeted and/or resonant zones, locations, hysteresis/damping zones/limits/factor/ratio/orientation, spread and/or endpoints for orienting, rotating, focusing, stocking, transitioning, placement, inference, movement, marketing, conditioning, routing, operating points, intervals, semantic spread etc.

In order to counter-act biases the system may challenge friends about their opinions and/or analysis on particular artifacts; further, in order to increase the semantic spread, the system may challenge about foes and/or theirs goals in regard to those particular artifacts.

The system identifies foes which, although may have similar goals, they have and/or are in a different semantic view which may compete (with the system or other semantic identity) for the same resources and/or resonances on tactical and/or strategical goals; thus, their goals are assigned foe signals and/or a high (entanglement) entropy with the system's (or another semantic identity) goals (e.g. I LIKE JANE, JOHN WANTS TO DATE JANE, JOHN IS PURSUING RESONANCE WITH JANE, JANE (DINNER) TIME AND/OR (DINNER) FAVORS ARE GAINED BY JOHN, JANE UNLIKELY AND/OR UNABLE TO DATE ME, JOHN IS A 51% FOE).

It is to be observed that the competing goals may be based on (projected) availability of particular semantic identities, capabilities and/or artifacts at particular semantic times and further based on semantic profiles (e.g. "Jane very likely dates, can be entangled and/or resonate with one person", "JANE dates, is 80% entangled and/or 80% resonates with BILL"; "JANE is busy for dinner" etc.).

While the system identifies foes, it may overestimate and/or underestimate the loss or gain and enter offensive and/or defensive behaviors. Analogously, the system identifies friends when they have similar competing tactical goals (but the system may underestimate and/or overestimate the loss or gain for strategic goals) and/or they do not compete for the same goals, resources and/or resonances. It is to be understood that the overestimation and/or underestimation may depend on semantic time (e.g. the system may overestimate/underestimate the gain/loss during a competition and/or underestimate/overestimate after the competition).

It is to be observed that double high (entanglement) shift, drift and/or entropy (e.g. risk vs reward, loss vs gain) and/or further compositions (e.g. risk of loss, reward of gain etc.) have/determine low entanglement entropy and/or synonyms thus, allowing the system to perform further learning, groupings and/or factorizations.

The system identifies competition and/or competing semantic identities by identifying resonances of semantic identities in rapport with the same and/or similar goals. It is to be understood that the similarity of goals may be based on low semantic shift, drift, entropy and/or high resonance.

The system may perform learning based on an approval and/or related synonym factor. The approval factor may be inferred based on affirmative resonances in rapport with leadership goals.

The system may be biased to project semantic routes which are similar with previous inferences unless those are expired and/or invalidated.

The system may receive trajectories on rendered graphs and/or charts from the user expressing desires regarding behaviors associated with various parameters and/or semantics. In some examples, the system renders a timeline of (composite) oxygenation (e.g. "oxygenation", "oxygenation in vitro", "oxygenation, in vitro" etc.) of a biological sensor/actuator and the system specifies the desired trajectory of the oxygenation which relates to specific commands, currents and/or voltages controlling to the sensor/actuator. While the timeline may be based solely on absolute time, it also may also comprise semantic time management; in case that the timeline comprises semantic time management, such semantic times on the time axis may be specified by the user (e.g. from selecting from a list, label, control, speech etc.) and/or be presented to the user by the system. It is to be understood that there may be multiple semantic timelines, graphs and/or charts presented to the user for the same semantic; further, the timeline may comprise semantics which have high entropy/drift (e.g. "oxygenation "in habitat environment"") with the composite semantic (e.g. "oxygenation "in vitro"") and as such the system may learn semantic artifacts associated with leadership semantics (e.g. learns semantic routes and/or rules for oxygenation factorization, indexing, hysteresis and/or damping in particular circumstances and entropy factors).

The user may specify trajectories representing voltages and/or currents of actuation, command and/or sensing. The system may infer hysteresis associated with various semantic profiles based on parts of the specified trajectories and determine whether the subsequent parts of the trajectory are encompassed within the semantic drift, shift and/or entropy associated with the hysteresis and/or damping. As specified in the previous example, the user may specifies the oxygenation, however since the actuation of oxygen tank releasing and/or evacuation actuators have a certain capability range (e.g. flow rate) the system may not provide and/or diffuse sufficient oxygen in order to achieve the user trajectory. Thus, the system may infer regions encompassing the trajectory based on the device hysteresis and further infers the semantic shifts, drifts and/or entropy. If the trajectory is not encompassed in the operating regions then the system may adjust the system indexing, hysteresis and/or damping to encompass portions of the trajectory based on various criteria (e.g. semantic time, factorization, semantic indexing, undershoot/overshoot, offensive/defensive, maximum containment, minimum containment etc.).

Analogously, the system analyzes attributes in charts and/or UI components. In some examples, the system comprises a chart depicting an impact (e.g. "driving alertness" "in" "high pollen locations") on semantic groups of "allergic driver" wherein further, the system may drag and drop an artifact (associated with) of diabetes and/or further diabetes treatment on the sampling group attributes and thus the system may infer, challenge and/or or render values for the composite semantics.

We mentioned the use of semantic augmentation including composing, rendering and/or routing augmentation artifacts and/or modalities. In some examples, the system composes messages, emails, documents, multimedia and/or renderings which incorporate summaries and/or subjects lines comprising high level leadership actions required from the destination (and/or semantic groups thereof) to achieve leadership goals of the sender in rapport with the destination. In some examples, the system requires a signature from JOHN in regard to the (resonant) goal of COMPLETE SALE OF THE FAVORITE DE LOREAN and thus it composes a sales document and sends it via messages/emails comprising messages and/or subject of PLEASE SIGN, DE LOREAN SALES CONTRACT.

In further examples, the system uses projections of semantic resonances in rapport with the destination entities and/or semantic groups thereof to compose artifacts such as messages, narratives, multimedia, videos and/or other renderings. It is to be understood that the system may use such techniques for content, formatting, rendering, presenting, gating, access control etc.

The system may include timelines for a destination and/or semantic identity requiring attendance in a semantic time (e.g. PLEASE SIGN THE INSURANCE PAPER BEFORE LEAVING ON HOLIDAY, PLEASE RESPOND ASAP, PLEASE FIX THIS ISSUE FIRST, PLEASE FIX THIS ISSUE BEFORE JOHN IS ARRIVING etc.). In some examples, such time sensitive requests may be linked and/or associated with subject lines, summaries, paragraphs, tagged artifacts, text content, renderings, UI (aka user interface) tags, ui controls etc. Further, the system may factorize the resonance in rapport with the (resonant) goal and the destination when the semantic time goals don't expire (e.g. because "fixed issue before John arriving"); analogously, the system may decay the resonance if the semantic time goals expire.

It is to be understood that the system may couple any device to the system, semantic flux network and/or semantic units by wired and/or wireless protocols. In further examples, the system buys and/or acquires (e.g. within the semantic flux network) an article, item, device, sensor and/or further semantic unit for which an identification (e.g. id, code, TPM, password, MAC address etc.) and/or key is made available for the acquirer and automatically added to a wallet which can be further used for authentication.

Various devices may be provisioned with the keys, wallet and/or parts of the wallet and thus they can be identified as belonging to the same network, user, location, endpoint and/or further groups. Further optical identification and/or encoding techniques may be used (e.g. semantic wave, optical/QR/bar codes etc.). Even further, the system may ask and/or use multifactor identification when pairing the device in the network. While adding and/or pairing the device the system may transfer, encode and/or encrypt semantic rules to be used while pairing for the first (and/or) subsequent times. Further, semantic rules and/or further explanation of the authentication, rules and/or signals may be used to connect the device into the network.

The collaborative systems may assume the ownership of an activity, task, action and/or further circumstances. In some examples, the ownership may be based on leadership inferences and/or challenges; further, resonant inferences may determine the assumption of ownership.

In cases where the system wants to delegate the ownership of an activity, task, action and/or circumstance then it may challenge collaborators in regards with such actions while allowing for various degrees of resonance, confusion, concern and/or likeability in the collaborator. In some examples, the system challenges the collaborators with a need while providing an eventual brief explanation of the need and/or its dependencies which may trigger resonant inferences comprising the identification of a leadership skill in the collaborator.

We exemplified the use of OPINION type inferences in various circumstances. Alternatively, the system challenges and/or is challenged for ADVICE instead of OPINION wherein the semantic ADVICE is seen as a more inclusive and/or resonant than OPINION which doesn't require and/or determine resonance; instead, OPINION can be seen a critic pattern comprising a critic factor.

In some examples, the system may infer that particular data is associated with advice, opinion and/or analysis and/or further associate corresponding factors (e.g. for advice/opinion/analysis (of semantic identity)); further, the system may infer and/or receive facts and/or truths in the semantic field and factorize those accordingly (e.g. FACT 90% etc.). In some examples, the truths in the semantic field are based on quantifying high entanglement entropy groups (e.g. 100 of RECEIVED AND EXPEDITED or (RECEIVED, EXPEDITED) mean 100 PROCESSED ORDERS etc.).

The system may rate opinion, advice and/or analysis based on semantic entropy, drift, shift, orientation and/or further analysis in comparisons with facts and/or truth semantic artifacts and/or semantic fields. Further, the system may gate such opinions, advices and/or analysis if the rating is low (e.g. low rating means they are too biased, false etc.). Further, the system infers and/or learns biases based on such inferences, semantic trails and/or further semantic analysis.

The system may label and/or augment the renderings with inferences about whether it is opinion and/or analysis. It is to be understood that the opinion may comprises analysis (e.g. of self and/or other collaborators) and/or vice-versa; similarly, analysis may comprises other analysis and opinions which further may comprise other opinions (e.g. in hierarchical manner). In an example, on semantic cloud media postings the system may label, mark and/or overlay the posted artifacts and/or groups thereof with associated opinion analysis artifacts; in an example, on a semantic cloud the postings and/or flux data are published and is marked with OPINION (OF JOHN) (OF JOHN'S FRIENDS), ANALYSIS (BASED ON OPINION OF S2P2), ANALYSIS OF HEALTH OF S2P2 BASED ON JANE'S OPINION, OPINION OF JANE REGARDING S2P2 BASED ON S2P2's (FLUENCY) ANALYSIS OF THE AUTOMOTIVE MARKET etc.

The system may consider as truth in the semantic field the explanations and/or further inferences generated by the (original) source of signals and/or data. It is to be understood that the semantic flux and/or stream information may comprise semantic trails of semantic identities and their further profile artifacts which interpreted the data (e.g. based on their own profile, model, opinion and/or analysis). Further, any system may decide based on such semantic traces and/or trails whether it can trust the data or not; in some examples, such semantic traces and/or trails may be comprised in semantic waves.

The system rate and/or allow ratings of such analysis and/or opinion and/or further gate it based on semantic model. In some examples, the analysis and/or opinion is rated and/or gated based on a high shift/drift and/or entropy from facts in the semantic field.

The system may gate the semantic artifacts which are based on opinion and/or analysis factors and/or ratings.

The system may infer and/or express (e.g. via augmentation, challenges etc.) critical opinions and/or analysis of inputs, artifacts and/or collaborators. In some examples, the system analyzes and/or generates critic essays against DOE'S baseball game performance. If the essays entails critics comprising non-affirmative resonance of DOE'S behavior which is not related (e.g. is non-resonant, has high shift, drift and/or entropy) to the essay's theme and/orientation (e.g. baseball game performance) then the system determines and/or infers a hostility factor (of the critic/essay) towards DOE'S and thus may damp, smoothen and/or gate such artifacts. The system may infer and/or suggest various DOE'S leadership artifacts in various circumstances and thus, the indicators and/or factors toward DOE'S may highly diffuse to such leadership artifacts. Further, the system may use high entropy comparative semantic analysis of UNDOE'S baseball skills, games and/or performance.

We explained the use of semantic trails to keep track of timelines of semantic inference. In order to generate past semantic inferences and/or semantic time the system uses semantic trails.

The system may use invalidation, confusion factors and/or challenges to determine the tenses of opinions and/or constructs. In some examples the system infers that I LIKE JOHN, but it infers that John (artifact) is less resonant because it doesn't play baseball anymore and thus, expires and/or decays likeability (opinion) factors. Further, when the system is challenged with DO YOU LIKE JOHN? the system may use semantic trails to infer the invalidation of likeability (e.g. I DONT LIKE HIM ANYMORE) and/or a less factorized term and/or composition for LIKE (e.g. IT'S OK, I LIKED HIM MORE BEFORE HE STOPPED PLAYING BASEBALL, I LIKED HIM MORE WHEN He PLAYED BASEBALL). Analogously with likeability factors the System may infer high (entangled) entropy factors such dissatisfaction and/or non-likeability.

Hostility of a semantic identity may be factorized when such semantic identity exhibit hostility towards friends and/or highly affirmative semantic groups. In addition, the hostility is decayed when the semantic identity exhibits offensive affirmative and/or defensive behaviors towards friends and/or highly affirmative semantic groups.

The system may infer entangled and/or causal hostility comprising semantic identities.

In some examples, the system looks to decrease hostility factors by factorizing, indexing and/or damping semantic spreads and/or resonance intervals in order to achieve borderline affirmative semantic resonance (e.g. equal or barely higher than the lower affirmative limit).

The system may associate high increase in factorization with recording/recordings, multimedia artifacts, renderings and/or further semantic artifacts. In some examples when the system detects increased hostility it may start saving video/audio snippets, frames, images and/or further semantic artifacts; in addition, the system may further infer and/or build internal rendering representations of such artifacts and/or scenes.

When there is entanglement between two semantic identities which have high hostility factors then the entangled and/or the observer (analyst) systems can infer regret indicators and/or factors towards actions which determined causal inferences and further entanglement and/or hostility factorizations (increases).

When performing semantic inference on two and/or more semantic identities the system may consider and/or substitute any semantic identity with self during a semantic time and/or in the past, current/present and/or future. Further, the system may consider semantic trails, routes and/or further projections to infer hostility, regret, affirmative and/or non-affirmative factors towards his actions while performing analysis on the past, current/present and/or future artifacts.

The system may express regrets about actions that it takes as opposed to not taking action. In other examples, the system expresses regrets for not taking action. Further, the system may express regrets for being too offensive and/or too defensive.

The system performs access control, actions and/or gating based on friend/foe and/or further hostility factors (e.g. allow friends and/or less hostile semantic identities, deny and/or pursue foes and/or more hostile, diffuse hostility etc.).

The truth in the semantic field may be a general accepted truth and/or truths as accepted (ALLOWED), not-accepted (BLOCKED) and/or diffused by semantic groups.

The truth in the semantic field may be based on fact semantic artifacts, general accepted ontologies and/or further quantities.

The system may challenge and/or decays the truth factors when it infers overestimation and/or underestimation biases.

The system allows/disallows maneuvers within particular areas based on semantic analysis, access control, semantic gating and/or semantic diffusion.

We mentioned the expansion of semantic trails and/or routes in semantic views. While such artifacts may comprise elements which are not relevant to the current inferences, goals and/or orientations in the semantic view, such elements may be invalidated by the system (e.g. via expiration time, semantic time etc.). It is to be understood that, during and/or after expansion, the system may preserve in the semantic view the semantic identifiers of trails, routes and their elements, and thus, the expansion of the semantic trail/route doesn't invalidate their semantic identifiers unless the semantic invalidation and/or semantic time demands it.

The system may be challenged, perform and/or challenge for particular semantic identities of semantic views and/or further renderings. In an example, the system may be challenged, challenges and/or accesses a "teach" view which perform semantic augmentation on teaching and/or capabilities of the semantic flux/stream network.

The system may receive and/or challenge the semantic network about the semantic identities and/or their capabilities which are at an endpoint, area and/or trajectory comprising current and/or projected location and/or kinematics of the system. In addition, the system may receive certificates and/or other authentication information related to such semantic identities.

The system may use semantic diffusion and/or further semantic analysis to determine the endpoints, areas and/or kinematics of projected locations.

The system may select, activate/deactivate, enable/disable semantic views, windows, renderings, images, frames, videos and/or players based on challenges, resonance and/or goals. In an example, the system is challenged to select, activate and/or enable semantic artifacts which are resonant with teaching, learning, teacher and/or student artifacts.

The system may deem as truth in the semantic field all the facts and/or semantics that are inferred based on actual numbers and/or general (profile) rules inference.

We specified that the system assigns leadership based on detected depth analysis. It is to be understood that the depth may be analyzed and/or projected from at least one endpoint, view, anchor and/or viewpoint. In some examples, the system analyses depth semantics from such multiple artifacts in the same time; such viewpoints may be based on target goal semantic spread. The semantic system may use kinematics and/or semantic time of semantic shapes and/or groups detections to infer depth and/or distance semantics.

As a (coherent) shape moves coherently on top of another (coherent) shape and the system infer depth and/or distance based on a (projected) dynamicity factor, projections and/or further "earlier" vs "later" inferencing and/or indexing (e.g. "earlier" projections are more dynamic).

The system may use challenges to the semantic network about semantic identities and their intentions. The system may use semantic analysis to select, enable and/or show various semantic artifacts, user control interfaces and/or windows. Analogously, potentially based on high (entanglement) entropy the system may deselect, disable and/or hide various semantic artifacts, user control interfaces and/or windows.

In some examples, the system explains the assessment of inferences based on causality and/or semantic trails.

The system may determine a fluency indicator and/or factor, wherein the fluency factor is affirmatively factorized when there is little or no shift, drift and/or entropy for the orientation of factorization of a (inferred) leadership semantic artifact and/or group thereof associated with inferences and/or challenges in rapport with a semantic identity; it is to be understood that the shift, drift and/or entropy may be based on semantic profiles. In an example, the system listens, views and/or ingests a recording of John; the system infers that a leadership semantic attribute associated with John in the recording is AUTOMOBILE CHASSIS and thus because during the recording the orientation of factorization of AUTOMOBILE CHASSIS is coherent, affirmative resonant and/or induces low confusion within a semantic interval then the system infers a high factor of fluency for John in rapport with AUTOMOBILE CHASSIS semantic artifact; analogously, by entanglement entropy the fluency may be low if the orientation is incoherent, non-resonant, non-affirmative resonant and/or induces high confusion. Further, the system may project that John may be also be fluent in AUTOMOBILES, ENSSEMBLIES etc. based on semantic hierarchy, semantic routes, groups and further shift, drift and/or entropy in rapport with an observing semantic identity; the fluency is higher factorized when the semantic drift, shift and/or entropy is larger in the challenge and/or resonant interval (e.g. because Jane is not an expert in automobiles she may factorize John's fluency in auto industry; because John is more fluent in automobiles it may be promoted as a leader etc.).

In similar ways the system may determine fluency in languages, fluency of traffic, fluency in teaching, fluency in marketing, positioning, plans, projects etc.

The semantic indexing and further grouping may be used to determine a true orientation and/or resonance with a published indicator. In some examples, a security is traded in such a way by a semantic identity and/or (affirmative resonant) group to influence its orientation. In such conditions the system may infer the intentions of the influencer based on a desired trajectory and further shift, drift, entropy and/or indexing from the influencer's trajectory. If the trajectories are similar, then the system may use and/or infer resonant factors for the indicator in rapport with the semantic identity and further circumstances.

The semantic shaping may be associated with shape patterns in graphs (e.g. of securities, stocks, indices, signals etc.).

The system may use semantic inference towards the goals including damping, hysteresis, indexing, factorization, diffusion, resonance and further semantic analysis.

We explained the use of various gratings and/or meshes for sensing, communication and/or semantic processing. These gratings and/or meshes are coupled with semantic analysis in order to take advantage of their quantum properties (e.g. spin orientation, entanglement, energy level and/or quanta etc.), polarities, polarization fields, resonances, damping, interactions and/or semantic groupings thereof. As known in art there are many approaches of taking advantage of the quantum properties including superconductors, ion traps, topological, optical, nuclear magnetic resonance etc. As mentioned in this application the semantic inference, analysis, semantic flux/stream and/or semantic wave may function on such architectures based on semantic entanglement.

The semantic resonance may be implemented and/or inferred based on various types of techniques generating resonant responses and induction such as electromagnetic, acoustic, electric, quantum, nuclear (e.g. NMR), quantum/electron spin resonance (e.g. ESR etc.) etc. In an example, the magnetic field in an inductor generates an electric current that charges a capacitor, and then the discharging capacitor provides an electric current that builds the magnetic field in the inductor which further determines the repetition of the cycle and the self-sustaining oscillation. The system may use semantic biases, damping, hysteresis and/or indexing to adjust components' and/or circuits biases, damping and/or hysteresis and thus adjusting the self-sustaining oscillation and/or further associated semantic resonance. It is to be understood that the capacitor charge polarity and/or further current conditioning in inductors may be associated with semantic factor polarity.

Further techniques such as sympathetic resonance may be used. In some examples, the sympathetic resonance induces and/or diffuses resonance between various semantic identities, semantic groups and/or hierarchies thereof. Further, particular sub-groups and/or hierarchies may be resonant to only particular harmonics at a given resonant vibration, spin, damping, polarization and/or frequency.

The semantic collapse may occur with particular threshold energy and/or frequencies. In some examples, the threshold and/or interval is based on the resonant energy and/or frequency and further it is associated with semantic resonance. It is to be understood that a resonant energy budget may determine resonance with the resonant frequency; further, the resonant frequency may determine and/or factorize the resonant energy budget while being damped with particular damping coefficients (e.g. and thus, decaying resonance).

The system may represents entangled semantic artifacts based on techniques such as entangled photons, ions (trapped, diffused), spins, polarities, polarizations and further use electromagnetic control, sensing, resonance and/or other techniques based on semantic analysis.

The system may build plans, artifacts, documents, signals, waves, renderings, multimedia and/or streaming file by example and/or by guidelines. In some examples, the example provided may be a semantic identity and associated causality. In further examples, the system may be instructed to CREATE A PRESENTATION ABOUT JOHN'S SUCCESSES and as such the system identifies causality links associated with successful achievements of JOHN'S in rapport with particular semantic groups and/or profiles. Additionally, or in further examples, the system is instructed to build a document and/or movie LIKE this other video, image and/or document. Further guidelines may be provided and thus the system builds such artifacts based on those guidelines, semantic profiles (e.g. of a user, semantic entity and/or groups thereof) and/or interpretation of examples. In further examples, the system mentions its preference and/or guidelines for artifacts (e.g. I LIKE THIS, I LIKE THIS MOVIE, I LIKE THIS MOVIE STORY, I LIKE THIS MOVIE IMAGE, BUILD ME SOMETHING SIMILAR etc.) and thus the system uses provided and/or inferred leadership, likeability and/or resonance artifacts to generate the required artifacts.

The system may be instructed and/or instruct via challenges about what it needs to execute. In some examples, semantic identities comprising semantic routes of semantic profiles are used. Further, the instructions and/or challenges may comprise time management routes and/or sub-routes.

The system uses semantic analysis including diffusion, gating and/or routing to activate semantic augmentation modalities. In some examples, the system comprises semantic routes for performing augmentation e.g. SHOW ON MY DISPLAY—intrinsic behavior, BIP TWICE WHEN SOMEBODY IS PRESENT, RAISE HAND WHEN CONFUSED, NOTIFY ME IF BILL IS HOSTILE etc.

The system may select leadership based on the projected risk and/or negative consequences (e.g. non-affirmative, high undesirability factors, high risk etc.). Thus if those factors are highly factorized then the system may follow more predictable leadership (e.g. follows semantic trails more closely etc.).

Figure 25:
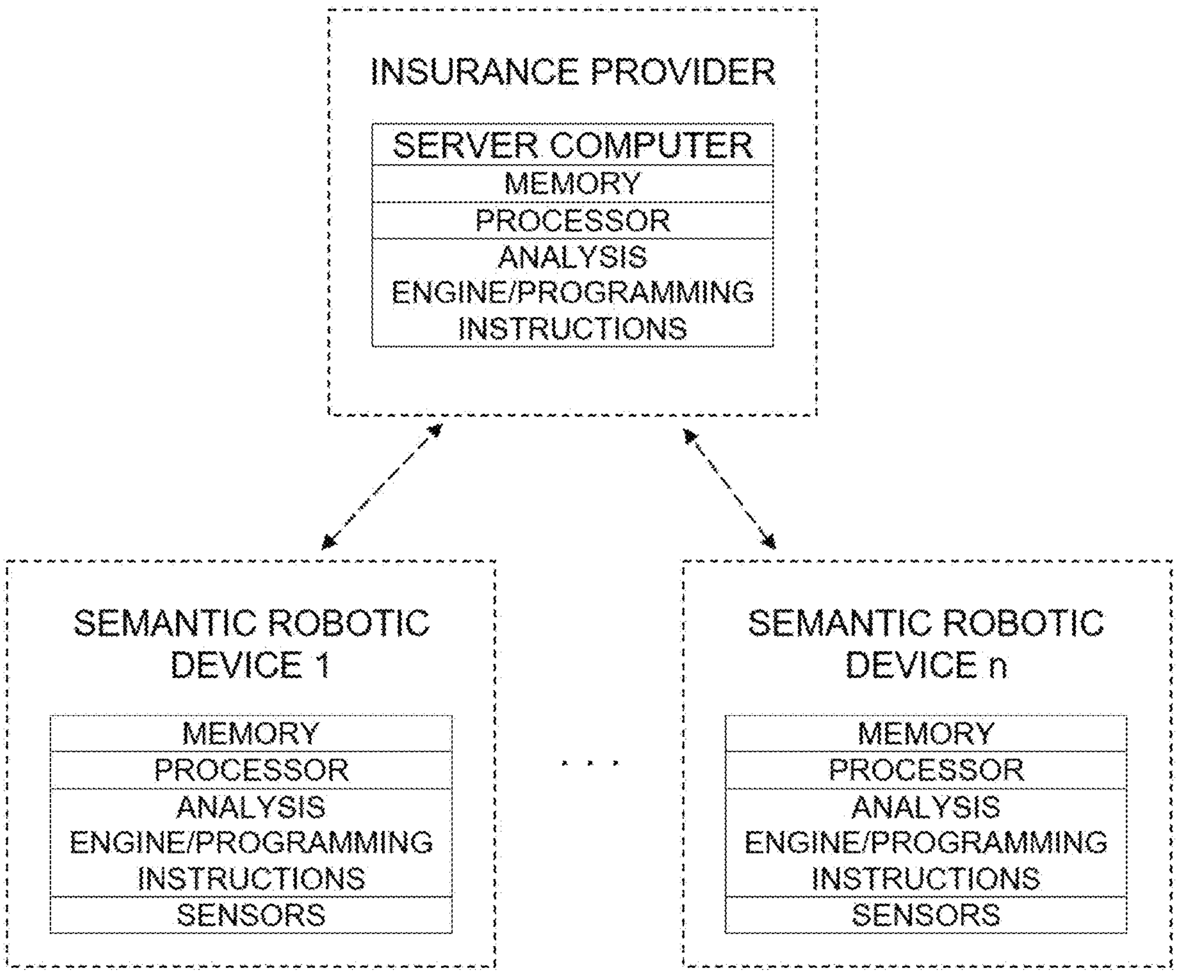
FIG. 25 is a block diagram of a semantic system including a plurality of robotic devices and an insurance provider.

We mentioned the use of brokers and/or arbitrators, and they are further addressed with reference to FIG. 25. The brokers and/or arbitrators may provide information to insurers and/or act as insurers. The insurer may be coupled to multiple brokerage services and use semantic factorization for multiple indicators which can be provided by such brokerages. The system may generate new policies (e.g. by semantic rendering and/or augmentation) and work as an arbitrator in disputes by having access to the evidence through semantic augmentation, trails and/or further recorded snippets and/or artifacts.

In further examples, an insurer may specify that particular behaviors and/or clauses are covered while others are not. As such, the system may inform the user when such behaviors are not met. In similar ways, the user may describe to the system the (projected) circumstances, situations and/or behaviors and thus the system may behave and/or perform semantic augmentation based on such circumstances. In some examples, the system may inform and/or challenge the system and/or users of future happenings and/or whether to store and/or inform the broker and/or insurance company about it. Alternatively, or in addition, the system may store, inform and/or perform semantic augmentation based on the factorization associated with the inferences and/or further drift, shifts and/or entropy in regard to the knowledge at hand.

The system may calculate insurance premiums based on optimization of budgets, semantic factorization of various indicators including indicators in rapport with competitors and their premiums.

The system may generate policies items and/or premiums based on semantic analysis on competitors; further, the system may look to create affirmative resonance with a customer/user while inducing non-affirmative resonance in rapport with a competitor.

With further reference to FIG. 25, an insurance provider is illustrated. The insurance provider may be a broker, an agent, or another insurance entity. Preferably, the insurance provider operates a server computer having a memory and processor with stored programming instructions operating as an analysis engine to perform the tasks such as adjusting or setting a premium, requiring particular insurance clauses, or assessing fault as further described below. The insurance provider is in communication with one or more semantic robotic devices (including semantic robotic device 1 through semantic robotic device n), in which the semantic robotic devices may be in accordance with the description provided in this disclosure, having a memory, processor, programming instructions, and various sensors such as cameras. In one version, the semantic robotic devices are configured to analyze an incident (such as by capturing images or the like) and to generate a report including an opinion of fault. The report and opinion are communicated to the insurance provider, including its server computer, which uses such report to perform tasks including adjusting a premium, requiring one or more particular insurance clauses, and making coverage decisions.

In further examples, the system insures semantic identities the risk of loss, risk of gain, reward of loss and/or reward of gain of particular semantic identities and/or artifacts.

The system may insure, by reverse H/ENT, artifacts using the similar and/or the same clauses, policies and/or premiums. In further examples, the system may decay the risk, hazard, non-affirmative factors and/or premiums when there is low orientation, shift, drift, entropy from contract clauses and/or recommended behaviors; analogously, by H/ENT, the system may factorize the risk, hazard, non-affirmative factors and/or premiums when there is high orientation, shift, drift, entropy from contract clauses and/or recommended behaviors.

In further examples, the system challenges the insurer fluxes with a budget and/or further clauses.

The system, such as via the semantic robotic devices, may express opinions/analysis on the reason and/or who's at fault when incidents occur; it is to be understood that the incidents are inferred and/or further interpreted based on semantic analysis and/or further guidelines (e.g. INFORM (ME) (AND) (LEADER) (S2P3) WHEN S2'S POSTS IN AREA 55 HAVE INCIDENTS, RECORD AND GIVE ME AN OPINION (OF LEADER) (OF S2P2) WHEN (S2P2) POST FLIPS, ASK FOR OPINION OF (SECURITY) POST S2P4 ON WHY S2P2 FLIPPED, WAS S2P2 OR S2P4 HOSTILE? etc.). Thus, the system informs and/or records the information based on semantic analysis, rules and/or further based on semantic trails and associated snippets/multimedia artifacts at semantic times when such semantics are inferred.

The system may challenge collaborators to express their opinion and/or analysis on the incidents.

The system may index the insurance premiums based on the semantic factors inferred from the opinion/analysis of the incidents.

The system may transfer its opinion and/or analysis on the incidents to the semantic network, at least one insurance provider and/or broker. It is to be understood that the at least one insurance provider and/or broker may be another semantic system.

The system may invalidate recorded data while the storage of such data on particular devices and/or memories is considered un-important (e.g. (S2P3) KEEP ALL INCIDENTS OF S2P2 UNTIL YOU HEAR BACK, REMOVE ALL THE ARTIFACTS/INCIDENTS OF S2P2 BEFORE IT FLIPPED BUT KEEP THE ONES WHERE IT TALKED CARS WITH JOHN, REMOVE ALL THE INCIDENTS OF S2P2 BECAUSE S2P3 HAS THEM etc.). It is to be observed that the incident artifacts can be stored in any other post and/or module (e.g. S2P3, S2P2, leader etc.); further, when the system doesn't have resources to store such artifacts it may challenge the system, user and/or leader about the previously rule, route and/or guideline which conflicts and/or has high entropy with the current state of the system (e.g. KEEP ALL INCIDENTS vs (MY) (S2P3) MEMORY ALMOST (99%) FULL). It is to be observed that the S2P3 system may challenge back on the provided guidelines, routes and/or rules; alternatively, or in addition, the system may take appropriate actions without challenging back and/or receiving a response. This may happen for example when the system assesses via semantic analysis that this is allowed and/or based on further goals and factorization inferences.

The system may augment, add, compose, maintain, invalidate, clear and allocate resources based on semantic projections, analysis and/or further on semantic group basis. In an example, the system determines a semantic group for informing and/or storing artifacts about incidents based on risk, risk of loss and/or further groupings.

The storage of artifacts at various posts and/or endpoints may be based on semantic projections, budgeting and/or further analysis. In some examples, the system stores incident multimedia artifacts at S2P2 and S2P3 maybe because the system projects that the S2P2 and/or S2P3 missions and/or endpoints comprise routes which lowers the risk of loss (e.g. by being distributed in particular locations, circumstances and/or environments) etc. Further, the incident artifact storage posts may have routes which allow budget optimization, affirmative resonances and so forth.

While monitoring an area by a sensor, module, post and/or security entity the system may factorize the security entity as friend and/or foe. In some examples, the system factorizes the security entity as a friend because its goals resonate with the system's goals for the area. In other examples, the system may factorize the security entity as foe because its goals have high entropy and/or are non-affirmative resonant. While the system may factorize the security entity as a foe, the semantic flux from the entity may still be affirmatively factorized and/or have low risk of distortion due to the fact that the security entity may not be aware of the system's foe inference/designation, not consider the system as a foe and/or being bound by contractual obligations.

The system may infer the income and/or further budget associated with a particular semantic artifact based on incoming and/or outgoing inferences and/or challenges associated with the particular semantic (artifact); it is to be understood that the inferences and/or challenges may comprise semantic analysis and/or chains associated with the particular and/or similar semantic.

The system may couple budgets and/or funds to financial/insurance fluxes and/or entities. In some examples, a user is connected to multiple financial providers, insurance, banks, securities brokers and/or other similar entities and thus selects the optimal budgets, rates, premiums and/or funds to be applied to particular transactions based on semantic analysis.

The system may negotiate contracts, clauses and/or conditions. The clauses may be based on semantic time.

In some examples, the system negotiates (interest/insurance) rates, prices, budgets, semantic intervals and/or semantic factors to be within (affirmative) resonant intervals.

The system may use overshoot and/or undershoot type of inferences for operating intervals on liquidities and/or further liquid budgets.

The system may infer offensive and/or defensive behaviors of the market makers and/or leader players in various verticals. Further, the system may infer the liquidity at/for particular endpoints and/or semantic times.

The system may ingest financial assets and liabilities and infer the operating (interest) rates intervals; further, the system may perform routing within semantic flux network for buy/sell assets, challenges to current/potential customers, marketing campaigns and/or further challenges to optimize liquidity.

The system may express budget, demand and/or capacity goals. In some examples the system is instructed and/or infers (e.g. from modalities) to optimize consumption so it can have less stress within a semantic time. In further examples, the system saves and/or spends budgets at semantic times based on inference on behaviors and/or further factors.

The system may determine goals for income and/or profits based on semantic analysis and further semantic publishing. The income and/or profit is positively factorized when the (traded) budgets gains of incoming challenges on published semantics is higher than the budgets loss on the inferences and/or (traded) outgoing challenges. In some examples the factorization comprises extracting the budget losses from budget gains; however, in other examples the factorization is based on further formula inference and it may be semantic time dependent.

When profits and/or budgets are high at an artifact, the artifact may seek to further expand, publish additional capabilities and/or divide within and/or outside the original hierarchical (leader) endpoint. However, the divisional entity may still be biased and/or highly connected to the original hierarchical (leader) endpoint and generate income and/or profits for that endpoint.

The system may be biased to syndicate such as inferring/having/determining/adhering to the same hierarchical (leader) endpoint and further inferring a mutual goal to affirmatively resonate on rewards and/or profits.

The system may infer a syndication factor and/or indicator associated with indicators on semantic identities and/or semantic groups.

When performing inferences, the system may counter bias factorizations of syndicates and thus biasing for inclusion of the artifacts which are less and/or non-syndicated.

The system and/or other semantic entities may look to resonate, adhere and/or recruit semantic artifacts/identities during goal achievement and/or at semantic times. The artifacts which may benefit from the goal achievement may enter the resonant group; it is to be understood that the beneficial resonance may comprise for example higher budgets, less unknowns and/or any other factorizations which determine, preserve and/or project such/similar factors and/or higher (projected) satisfaction, happiness and/or stimulation.

In further examples, in order to build resonance, the adherent and/or recruited semantic artifacts/identities may be asked to enter into semantic contracts/agreements, reserve budgets and/or commit budgets into an escrow; thus, such reserved and/or escrowed budgets are not available for further inferences at the particular entities. In some examples, the contract and/or escrow is held by a broker, insurance provider, leader and/or any other entity as indicated by semantic analysis and/or further semantic time.

The system may broker negotiation inferences wherein at least two parties want to trade and/or access each other's (particular) published capabilities and/or resonant artifacts. Each party's trading capabilities, costs/budgets and/or further deal indicators/factors are assessed by the system and further communicated to each party; if all trading parties agree with the assessment/clauses, the parties pay a brokerage fee to the system and pursue with trading based on system's assessment. It is to be understood that the system may be any artifact explained in this application including semantic artifact, brokerage, insurer, collaborator, flux, device, module, post etc.

In further example, the trading assessment includes clauses to be met during semantic times. As such, the brokerage fee may be associated further with such semantic times and be paid when clauses are met.

In further examples, the system uses factorizations of ownership based on (factorization of) semantic times to infer the liabilities. In some examples, one semantic entity/collaborator hands over a challenge and/or further artifact to another semantic entity/collaborator. The system may assess the proper hand-over through the factorization of semantic time (e.g. 60% JOHN GAVE JANE THE DELOREAN, DELOREAN BRAKES ARE BLOCKED); based on the contractual clauses and handover factorizations the system, broker and/or insurer may assess the liabilities which may occur during hazardous and/or failed circumstances (e.g. JOHN may be liable and/or incur a liability because the brakes where supposed to be in good shape during the handover). In other examples, the receiver may fail to properly receive and/or follow the receive clauses (e.g. JANE WAS READING HEALTH AFFAIRS WHILE JOHN WAS DEMONSTRATING THE DELOREAN BRAKES etc.).

The system may use semantic analysis including the risk/fear of loss/gain and/or other factors for managing connections, contracts and/or budgets. In some examples, the system disconnects, cancels, updates and/or challenges (e.g. for connections/clauses, budgets etc.).

Based on contractual evidence and/or clauses the system may challenge and/or be refunded for the budgets that have been spent on clauses breached by other parties and/or collaborators. In further examples, the challenges may be accepted immediately and/or be gated/routed to a broker and/or insurer for further feedback and/or semantic analysis. It is to be understood that the challenges may include explanations, opinion and/or further analysis of challenger, challenged, broker and/or insurer.

The system may implement, incorporate and/or comprise multiple modalities in the same sensing and/or rendering capabilities. Multiple modalities may be implemented using the same sensing and/or rendering entities and/or artifacts.

The system may implement, incorporate and/or comprise multiple sensing, rendering and/or modality capabilities.

The system may combine optical, electric, magnetic and/or electromagnetic input/output capabilities.

Semantic technologies allow the combination and/or embedding of optical/light/electro (/)magnetic emitting and ingestion. In some examples such capabilities are based on semantic cells, MOS (/)FET, CMOS, polariton, nano (pillars) entities and/or other sensing and/or augmentation entities/capabilities as explained in this application.

Semantic display devices may incorporate and/or comprise camera and/or display capabilities in a single housing and/or using the same (optical) sensing entities. In some examples, the sensing entities may be based on luminescent tunable polaritons. In other examples, they may be based on other fluorescent and/or phosphorescent entities.

The system may use (biometric) (semantic) identification (e.g. based on fingerprint, facial, gait, user/artifact characteristics etc.) using a semantic display and/or (further) camera based on and/or coupled with semantic shaping and/or further semantic analysis to continuously (e.g. at every touch, inference etc.) and/or at interval of times (e.g. based on semantic times etc.) identify and/or further authenticate users, entities and/or other artifacts. The semantic display may have optical/electromagnetic capture capabilities based on optical/electromagnetic sensing and/or rendering. Such semantic display devices incorporate and/or comprise camera and/or display capabilities based on optical sensing and/or rendering as explained in this application. The semantic display devices may incorporate and/or allow any sensing and/or rendering capabilities and/or further modalities in a combined manner.

The system uses semantic analysis of fingerprint touch sensing on semantic display surfaces. Alternatively, and/or in addition, the system uses semantic analysis of other (biometric) semantic identification characteristics.

The use of near to far field detection helps the system to understand the views. We also explained the "earlier"/"sooner" vs "later" related inferences. We also explained that the system may blur, denoise, emphasize perform overlays based on the depth detection and/or (semantic model) hierarchy.

In some examples, a module is affixed to an entrance and/or observing and entrance; the entrance may comprise a door and/or may be affixed to a door. The module may comprise multiple cameras and/or vision elements. In an example, in intrinsic behavior, the vision output may be blurred, superposed, overlay-ed, captured at low resolutions and/or composed with other artifacts. In the case that the system infers that based on semantic analysis it needs to understand the circumstances and/or video feeds better (potentially overall and/or only at various endpoints) then it may further increase the resolution, decrease blurring, adjusts the overlays and/or condition the generated noise. In an example, the system detects movement, obturation and/or holding of the door handle and thus it may project that somebody wants to enter and/or exit; thus, the system may further activate regions and/or endpoints in order to understand the situation. In some cases, the system detects that the door handle is hold and/or operated by a human hand and thus it may activate the capabilities, endpoints and/or areas associated with (semantic) identification, authentications and/or biometric recognition (e.g. endpoints mapped to body, face and/or other biometric discriminator endpoints for detecting facial, gait, stance, fingerprint, identity etc.). It is to be understood that while performing such analysis the module may blur and/or unblur the endpoints in succession and thus at no point in time the system and/or module captures the whole scene unblurred. The system may further perform semantic analysis based on the movement direction (e.g. of door open/close, person etc.), projections, semantic access control and/or further analysis to determine the necessary actions (e.g. deactivate and/or invalidate door opening sensor outputs, actions, commands, access control, notifications etc.). The system may detect other hostile and/or hazardous conditions such as door/glass breaking/fire/smoke (e.g. by the hostility, offensiveness, diffusion, orientation and/or hazard of detected semantic identities, foes, glass pieces, flames, clouds, ionizations) etc.

In some cases the users may setup distress (anomalous, hazardous etc.) coded behaviors (e.g. hold the door handle in a certain way, tap in a particular way, shake the head in particular ways etc.) and thus the system may further perform analysis based on such behaviors.

The system may select areas and/or endpoints (e.g. on a (semantic display) surface) based on (wearable) sensing and/or further projections of mappings to the endpoints and/or their associated artifacts. In an example, a user wearing a glove and/or sensors attached to thumbnail and/or index finger collimate and/or project the observing endpoint and/or further semantic views to an area on a display; it is to be understood that the collimation may be based on the observing endpoint of a user eyesight, a camera, (wearable) optical device and/or any other sensor and/or renderer. The system selects the area on the screen based on the inference of the (semantic) shape selected/determined by the (wearable) sensors and depth detection to the observing and/or viewing endpoints comprising the projection and/or mapped area on the viewing surface. It is to be understood that the (wearable) sensing capabilities may comprise any modalities explained in this application; in some examples, the system uses optical/microwave/inertial (wearable) sensors to sense the field.

Once the user selects the areas and/or endpoints it may use them in further analysis, renderings, positioning, sensing, instructions, diffusion/propagations (e.g. of sound, electromagnetic etc.), access controlled (allowed/disallowed) areas and/or any other inferences, transformations and/or commands.

User interface controls may comprise color mappings based on semantic analysis. In further examples, the system sets up and/or command other rendering and/or displaying parameters (e.g. brightness, contrast, resolution, viewing/rendering angle, projected viewport/display size etc.).

The system composes at least two user interface controls, regions and/or graphs wherein the semantic composition and/or analysis takes place on the parameters, characteristics and/or data of such controls, regions and/or graphs. In some examples, the system may not allow the placement, composition and/or selection of controls and/or graphs if the semantic rules and/or routes won't allow it and/or the composite inferences are incoherent, confused and/or do not make sense.

When composing artifacts, the system may associate the composed parameters, characteristics and/or data to the new composite semantic artifacts and/or semantic identities. As explained, the user interface controls may be associated with semantic network model artifacts and further accepting, allowing, denying and/or requesting user actions, selections and/or feedback.

The system may factorize the likeability and/or resonance of (particular) user interface controls for displaying affirmative/non-affirmative fluxes, challenges and/or information. Similarly, the system may factorize the likeability and/or resonance of (particular) user interface controls for displaying and/or conveying DO and DON'T artifacts, challenges and/or constraints.

The system may generate, determine and/or comprise opinion and/or analysis in a hierarchical manner wherein the opinion/analysis may comprise other opinion and/or analysis. The system may preserve semantic trails of such opinions and/or analysis and further render them via semantic augmentation. In some examples the system renders the trails, hierarchies and/or further groups in a document, page, ui control etc.

The system may express opinions and/or analysis on artifacts (e.g. posts, users, semantic artifacts etc.) performances, health, consumed budgets, learning, indicators and/or further factors, graphs, curves, rates, semantic displays, fluxes, streams, multimedia, articles and/or other artifacts.

The systems may explain to each other the signals and/or express opinion/analysis on signals; such explanations may comprise semantic times and/or other semantic artifacts. As such, when receiving the signals from the collaborator, the system may condition the received signals with a semantic wave generated based on the explanatory and/or opinion/analysis artifacts; if the system determines high confusion and/or incoherency then it may instruct the collaborator to adjust the transmitted signals.

At least one collaborator may comprise multiple signal generation units which may transmit the signal and/or various components of the signal. In some examples, semantic units coupled to electromagnetic/optical/sound/pressure smart transmitter/actuator/transceiver conditions, duplicate, splits and/or sends (at the same time and/or particular (semantic) times) at least two signals (e.g. semantic wave, frequency band signals etc.) to particular directions, links, trajectories and/or endpoints; as such, the system receives such transmissions and conditions them based on the explanatory/opinion artifacts. If the system detects confusion and/or incoherency then the system may instruct the collaborator/s to adjust the signals (e.g. index, bias and/or adjust based on semantic artifacts and/or semantic time) until they increase coherency, reduce confusion, increase likeability/stimulation/affirmative resonance and/or achieve further goals.

The system may consider multiple collaborators' signals, explanations/opinions and/or semantic groups thereof. Further, the system may consider the coherency, confusion, likeability, stimulation and/or resonance on a composite semantic group basis whether including self or not.

The system may synchronize multiple streams/fluxes based on semantic time.

The system may use and/or generate compositions with and/or between artifacts, streams and/or fluxes. Such compositions may be conditioned, augmented and/or further synchronized based on semantic time management. In some examples, the system may compose streams comprising at least one video encoding and/or sound encoding (e.g. in various languages, voices etc.); further, the system infers and/or is instructed to activate one language over the other.

In further examples, the system composes two streams/fluxes based on semantic time and/or further condition/gate a stream when high entropy and/or distortion is inferred. In some examples the system renders/augments a movie for a Spanish/English speaking entity and when the streaming sound in Spanish starts it may mute/gate the sound stream in English and activate Spanish; further, if distortion occur between English to Spanish translation artifacts the system may mute/gate Spanish and activate English.

The system redirects conditioned, split and/or duplicated signals to particular entities and/or collaborators based on published capabilities. In some examples, based on published, registered and/or explained capabilities (e.g. operating interval, (frequency) response range/cutoff/saturation), the system redirects signals with particular frequencies to particular transceivers, transducers, actuators, amplifiers and/or speakers for optimal augmentation and/or interpretation.

It is to be understood that the published, registered and/or explained interfaces may comprise operation intervals and/or response ranges comprising and/or reflecting saturation, hysteresis, damping, cutoff, resonance, temperature ranges, diffusion ranges, depletion ranges, resonance ranges and/or further semantic times.

The system may achieve goals on semantic group and/or further leadership basis. The system may project inferences based on various routes and/or leaderships.

The system may consider location and/or further circumstances in order to adjust signals and/or explanatory interfaces. In some examples, the system knows that semantic posts BY THE WINDOW may have increased microwave/sound signal penetration than other parts of a conference room (e.g. based on proximity to the window, repeater, collaborator, noise source etc.) and it may consider to affirmatively/non-affirmatively condition signal and/or semantic waves based on particular circumstances.

In further examples, the system infers the optimal placement and/or movement in a warehouse, store, area, facility and/or (virtual) environment.

The system may infer the optimal shipping routes and/or providers based on semantic analysis.

The system enables/disables, adjusts and/or orients augmentation capabilities based on semantic analysis and inference. Further, it may enable/disable particular augmentation capabilities based on a user circumstance, location, semantic time and/or profile (e.g. if users and/or semantic groups of users have a status which are highly entropic with receiving the augmentation (on particular devices) the system may negatively factorize and/or disable the augmentation (on particular devices); analogously, if the users have a status which are un-entropic with the semantic augmentation the system may positively factorize and/or enable augmentation (on particular devices).

The system orients and/or adjust actuators, I/O, transducers, sensors and signal orientation and/or parameters based on semantic analysis. In some examples, the location and/or associated semantics of the augmentation capabilities are inferred and used to determine optimal and/or believable inferences (e.g. the system may infer in a multimedia stream that signal/sound/video snippets are associated with a motorcyclist traveling in a particular direction and/or trajectory and thus further route, gate, transduce and/or actuate the sound of the motorcycle to particular endpoints and/or associated elements (e.g. displays, speakers) which will allow the display and/or sound effects to take place as detected in the multimedia stream (e.g. in rapport with a viewer, user and/or observer). It is to be understood that the system may detect via a primary multimedia embedded modality (e.g. video artifact) the direction and/or trajectory of the motorcycle in rapport with the observer (e.g. recording camera) and further infer particular secondary modality elements, artifacts and/or capabilities (e.g. sound generators, speakers etc.) which can augment using a similar (e.g. low entropy, drift, shift) trajectory (of the secondary modality medium—e.g. sound), orientation and/or semantic times. In further examples, the system generates the secondary modality augmentation signals and/or semantic waves based on the inference on the primary modality.

The system infers and/or projects the propagation and/or diffusion of modalities mediums (e.g. electric, magnetic, electromagnetic, pressure, (ultra)sound, chemical, biological etc.) mapped in the semantic network model. In some examples, such mediums are associated with semiconductors, solids, air, liquids and/or other environments.

The modalities may be based on streams, fluxes and/or recorded/embedded in multimedia artifacts.

The system may infer particular modalities based on specific multimedia formats, encoders and/or codecs.

Multimedia artifacts may be stored on multiple devices and/or memories.

In some examples, the system stores various layers of multimedia artifacts and/or semantic waves on different memories, hierarchies, levels, devices and/or semantic groups thereof. As such, the multimedia artifacts may be coherent composed, collapsed and/or rendered only by the composition of the artifacts on semantic group basis. Further, access control and/or gating rules allow only particular entities to coherently compose the multimedia artifacts and/or parts thereof.

In some examples, the system comprises budgets and/or further semantic times for storing and/or disposing multimedia artifacts; further, the budgets are specified on a sematic time basis, semantic views and/or hierarchy (levels) (of memory, semantic network model, semantic group etc.). For inference, storage and/or retrieval of a semantic artifact the system may infer, project, store and/or retrieve a plurality of semantic routes/trails which determine coherent and/or less confused inferences in rapport with the semantic artifact. The system uses challenges based on leadership semantics associated with the artifact in order to infer, project store and/or retrieve such coherent semantic routes/trails and/or further the artifact; it is to be understood that such challenges may be within its own (semantic) memory and/or of its collaborators.

The system may infer an expiration and/or budget on retaining and further purging particular inferred and/or stored artifacts in memory and/or disk; further, the system may use likeability, desirability and/or further factorizations to keep and/or validate the artifacts and/or further (by H/ENT) it may use undesirability factorizations and/or decaying for invalidating and/or expiring them.

In further examples, the system provides directions and/or further projections towards achieving a goal, an endpoint and/or a destination for a user and/or semantic post; thus, it instructs the user and/or post to turn to and/or to follow a particular door, direction, landmark, street, post, person, leader, device and/or any other artifact. However, if the instructions are ignored repeatedly, after a number of times and/or based on a semantic budget and/or (further) semantic time the system may ask the user and/or semantic post about feedback on why it doesn't follow the instructions; alternatively, or in addition, the system may ask for a new goal and/or destination and/or it cancels, invalidates, turns OFF, STOPs, ENDs, BLOCKs the instructions for the current goal and/or destination (based on semantic time). It is to be understood that the system may cancel the instructions based on any inferred circumstances and/or based on the user feedback. Analogously, the system may factorize and/or decay any multimedia artifacts associated with the projections and/or directions.

As previously mentioned, the system may factorize preferences and/or further routes based on sensing and/or inputs from the user. In an example, the system augments the user with a multimedia artifact and further factorizes likeability based on inferred actions from a user (e.g. infers that the user likes a song because the user turns the volume up as inferred by a semantic (display) unit and/or sound sensor; infers likeability based on applauses, collimation, field of view, endpoint action and/or further associated semantics, location etc.).

The system may determine, validate and/or render pointers/tags on a screen based on semantics inferred based on user inputs to particular locations and/or endpoints wherein the system doesn't render the pointers/tags unless the semantics are properly factorized and/or realized.

The semantic posts may be used in various configurations and/or use cases. In some examples, the posts are deployed at particular endpoints and/or locations based on different needs.

The semantic posts may be deployed in hazardous and/or restricted conditions and/or behaviors. In some examples, they are used to disinfect various areas, zones and/or endpoints and further control the access to such areas (e.g. by commanding through precise beaming the opening/closing of such areas before and/or after disinfection, by beaming electromagnetic energy generated by semantic groups, by actuating and/or manipulating cleaning substances sprayers etc.).

In some examples, restrictions are represented based on semantic gating; further, the system may be able to tune and/or diffuse the restrictions based on such semantic gating.

We explained the use of grippers, latches, locks, bases and other manipulation and/or hooking components. It is to be understood that such components may be attached to dampers and/or springs and thus providing suspension and/or adaptive support for the transportable and/or lockable carriers and/or cargo.

The semantic posts modules may comprise rotating platforms, sub-assemblies and/or parts which allow the modules components (e.g. locks, hooks, arms etc.) to rotate and such orient to desired positions. In some examples, such sub-assemblies (including or excluding electrical motors) are affixed, locked and/or rotate around a first semantic post; further, the sub-assemblies comprise a fixed part which lock on the semantic post and a circular motion part which rotate around the fixed part to a desired position. In other examples, the fixed part comprises a circular electric motor; alternatively, or in addition, the electric motor is coupled to the semantic post and actuates the post, segments of it and/or further the circular moving sub-assembly.

The semantic posts comprise one or more arms. In some examples, at least some of the arms may be used and/or coupled to supporting artifacts including other posts artifacts. The support may be used to enhance and/or augment its stability by being positioned and/or affixed to inferred endpoints and/or locations on floors, walls, doors, posts, carrier and/or any other physical artifacts which are considered by the system during inference.

The arms may handle, couple, connect and/or grip (to) various tools required to accomplish missions. Once the arms couple to the tools (e.g. scissors) then the system may need to understand the force, capability and/or actuation for using such tools. As such, the system may be provided, read, waved and/or explained the actuation capability of the tools; the semantic coupling may be achieved via semantic gating.

The system may attach various fairings and/or body parts to the semantic posts, wagons and/or cargo in order to increase and/or model the aerodynamics and/or appearance of the ensemble. In some examples, those components are inferred based on the mission and/or further circumstances comprising weather conditions, route/ride characteristics, maximum speed/acceleration, fuel/charge depletion rate, noise protection, passenger profiles, preferences and so on.

The system may ensemble a composite vehicle based on semantic profiles and/or user/passenger preferences. In some examples, JOHN specifies that he wants and ensemble vehicle to have sporty characteristics and/or be like a DELOREAN. In further examples, JANE specifies that she wants a vehicle which will maximize comfort, lowers noise and looks like a beetle. It is to be observed that if JOHN and JANE need to travel in the same carrier there are some composite requirements which may be contradictory (e.g. a DELOREAN may not have the maximum comfort however, the system may be able to provide a more comfortable or sporty ride based on adaptive damper adjustment and/or spring (pre) loads, a beetle shape is more round while a DELOREAN is more squared etc.). When the composite requirements cannot be satisfied (e.g. due to confusion, no (borderline) resonance on leadership and/or all requirements etc.) the system may further ask user/passenger/fluxes on choices etc.

The system may use semantic shaping and/or further analysis to determine shape and/or composition of vehicle ensembles.

The system may ensemble fairings on the posts, carriers and/or cargo using lockable/hooking mechanisms (e.g. such as the ones explained in this application). Further, the system may use its own manipulation capabilities and/or other entities manipulation capabilities for ensemble and/or attachment of such components.

The fairings may comprise multiple lockable and/or damped layers (e.g. embedding locks/hooks/grips, dampers, springs etc.). The fairings and/or further layers may be manufactured from any material including but not limited to plexiglass, ceramic, plastics, polycarbonate, rubber, carbon fiber, steel, aluminum, titanium and/or meshes.

The fairings and/or layers may be connected to an ensemble and/or between them through locks/hooks/grips, dampers, springs and/or further linkages.

During (projected) crashes the system may adjust (e.g. via damping/hysteresis/indexing etc.) the damping and/or linkage/spring load between the fairing layers in order to absorb the crash shocks. It is to be understood that the system may consider also the material shock absorption and/or deformation capabilities when inferring the composed characteristics.

The system may use semantic network models mapped to a (projected) crash scene and/or hot/hazard points (e.g. crash endpoint, contact points on the fairings etc.).

The fairings may comprise and/or embed sensing elements.

The fairings and/or further layer may expand and/or retract based on circumstances and/or further semantic analysis. In some examples, the system expands particular fairings in order to increase the drag. In further examples, the system expands/retracts the fairings in order to adjust air flow (e.g. for fuel cell, battery and/or cockpit cooling/heating) and/or further tire (/) road feedback/pressure, weight and/or turning characteristics. It is to be understood that the system uses environmental conditions (e.g. outside/inside temperature, pressure, wind etc.) in order to determine air flow and/or further drag.

The system may adjust the fairings, linkages and/or attachment linkages/locks for increased leverage and/or protection during (projected) hazardous conditions and/or crashes. In some examples, the system projects a frontal crash and thus it extends/retracts, stiffens/weakens particular fairings, layers, articulations, locks/hooks, linkages, arms and/or further parts in order to mitigate the effects of the crash by damping, managing hysteresis, deformation and/or further absorption of the effects (e.g. shock, crash energy, deformation, deceleration, hot/hazard endpoints etc.) and/or to further protect the passengers/cargo. It is to be understood that the system may use gating, diffusion and/or further semantic analysis in order to project and/or propagate the hazard inferences to particular endpoints (e.g. passengers, cargo etc.) from the hot/hazard crash (contact) endpoints.

In further examples, the system determines (projected) encounters (e.g. of curbs, holes and/or further obstacles) which require adjustable clearance and thus, the system tunes the fairings, damping/rebound, spring (pre) load to retract and/or to adjust and accommodate such conditions. It is to be understood that such conditions may be inferred by sensing (e.g. camera, accelerometer, inertial etc.), location characteristics and/or further semantic flux. In some examples, the system receives by flux that at a particular location there is a steep ledge which may be hazardous and have specific characteristics (as explained and/or measured by sensing at the flux collaborators) and as such the system projects the encounter and uses further detection by optical processing and/or acceleration of wheels up/down the ledge to project/detect the ledge encounter and/or mitigation activity; further, the system may retract the fairing before reaching the ledge as inferred and/or specified based on semantic time, fairing adjusters hysteresis and/or further mitigation rules/routes.

The system uses information from the ensemble locks/gripper sensors in order to detect conditions and/or adjust fairings. In some examples, the system determines that the locks on the fairings bear too much pressure/shear stress and/or can become hazardous in particular windy conditions and/or when fairing is extended/retracted. In further examples, the system may use another fairing adjustment to alleviate the stress on the potential hazardous and/or locks. The system may consider and/or adjust speed, acceleration, tire pressure, drag, environmental conditions and/or further projected circumstances.

The system may project whether parts were installed or not installed properly based on sensing (e.g. detecting load/pressure/movement/acceleration/wiggle) and/or further optical inspection (e.g. via camera/infrared etc.).

In further examples, the system captures videos or pictures of (potential anomalous/hazardous/hostile) installations.

The system, broker and/or insurer may infer, ask and/or be provided with opinions and/or analysis on installations, storage, manipulation, reliability, expected asset performance, maintenance (history) and/or further suitability for purpose. Such opinions and/or analysis may be shared based on semantic flux/gating.

The system may further provide the (insurer) flux network with bill of materials (BOMs), maintenance/storage records/trails, opinions/analysis, designed purpose and/or further passenger profiles, preferences and/or goals/missions.

Insurers may bid on insuring particular trips, carriers, cargos, ensemble vehicles, users and/or passengers. In some examples, the system, users and/or passengers may have, select and/or infer a selected pool/group of insurance providers (for particular semantic profiles, cargo, ensemble, missions and/or goals).

Storage and/or manipulation circumstances and/or further trails may be considered during insurance inferences. In some examples, hazardous storage conditions and/or manipulation may determine factorization of hazard and/or risk.

The system, broker and/or insurers may determine factorization of hazard and/or risk at asset, semantic identity and/or mission level.

The system, broker and/or insurers may index/factorize premiums based on semantic analysis (e.g. increase/factorize premiums for higher hazard ensemble, mission etc.).

The system may map endpoints to storage and/or other compartments and track ingestion and/or removal of items.

The system may comprise areas, providers and/or associated devices where posts, devices, vehicles and/or other artifacts are maintained, stored and/or repaired. Further storages/memories associated with those areas, providers and/or posts/devices may allow an user, owner, leader and/or other entity to leave and/or transfer the security keys (e.g. (DNA chains) semantic network model, key, fob, rf identification keys, digital key, public key, private key etc.) allowing the starting and/or access to such devices/artifacts. In further examples, a user leaves/transfers the security key to the particular providers, storages and/or memories; even further, the system may specify the validity of such security keys based on semantic times. The user may specify the reason and/or opinion on the posts/artifact entering the maintenance/repair area and/or why the security key has been dropped off. In some examples, the keys comprise a security key transferred based on radio frequency and/or optical codes and/or protocols.

We explained the use of tenses for determining the ordering of inferences, updates and/or learning. It is to be understood that the system may keep the semantic trails of past inferences, learnings and/or updates and as such it may determine the semantic time of the inferences and/or leanings (e.g. I DIDN'T KNOW THAT JANE WAS READING HEALTH AFFAIRS BEFORE CONNECTING WITH JOHN FOR DINNER, I FOUND LATER THAT JOHN IS CONNECTING WITH JANE FOR DINNER etc.).

The system keeps the information up to date and further manages notifications and/or commands based on semantic inference (e.g. notify me when John appears, notify me when John disappears, augment me when John appears or when Jane informs me about John's whereabouts, augment John with my messages when you find him, augment me with John's appearance, clothing, car, messages etc.). It is to be observed that in the examples, based on user interests, inferences and/or drifts the augmentation may comprise updated information about John potentially based in his detected presence and/or flux information.

The system may determine an unhappiness/sadness factor based on the further loss and/or distancing of a likeable and/or highly affirmative resonant artifact in current and/or further projections wherein the projection of gaining the artifact and/or further resonance are unlikely and/or not possible (in a semantic time).

The system may infer unhappiness/sadness based on the sudden loss of highly factorized affirmative resonances and/or associated artifacts (e.g. routes) wherein there is no further possible routes for gain an/or further resonance in a semantic time; in some examples, the semantic identity associated with the resonance disappears, expires and/or is invalidated and the intrinsic behavior of such entity is marked as such. Further, the unhappiness factor is based on regrets in rapport with the hostility oriented towards affirmative resonances and/or blocking of affirmative resonances. Alternatively, or in addition, the system may use optical sensing to determine semantics associated with expressions and/or manifestations and/or further factorize those into sematic views, routes, goals and/or semantic model/rules (e.g. S2P2 displays and/or the system infers a posture, gesture, sign, grimace, emoji etc. which is satisfactorily factorized and/or oriented towards dissatisfaction and/or determine that a particular activity and/or outcome isn't likeable and/or satisfactorily factorized etc.).

During semantic learning from particular entities/leaders/artifacts the system may determine low drift, shift and/or orientation towards core/hard DO NOT/BLOCKED rules. When this occurs, the system may infer circumspection factors in rapport with particular entities/leaders/artifacts. When circumspect the system may increase the semantic spread and/or decay affirmative resonance with the particular entity.

The system may factorize unhappiness factors when circumspection inferences, loss of resonances and/or factors increase despite the counter measures (e.g. increase in semantic spread).

If the system infers VALIDATE/ENABLE/ON/ALLOW/DO/YES/ACTIVATE/START type inferences and/or direct polarity for associated semantics and/or compositions then for high drift, shift and/or entropy semantics may determine and/or associate INVALIDATE/DISABLE/OFF/BLOCK/DON'T/NO/NOT/CANCEL/STOP/END type inferences and/or inverse polarity.

The system may infer enable/disable, activate/cancel, ON/OFF, ALLOW/BLOCK, DO/DON'T, YES/NO, START/END, START/STOP, validate/invalidate type inferences and/or actions; further the system may use such inferences to determine whether an (associated) artifact and/or (associated) activity is in superposition, hysteresis, damping and/or diffusion (e.g. when is between (the semantic superposition time of) ON/OFF, START/END, START/STOP etc.) and/or is realized/not-realized; when realized/not-realized, the system may gate and/or invalidate related superposition, damping, hysteresis and/or diffusion. In further examples, the system factorizes (composite) movement semantics such as DO MOVE/DON'T MOVE, GO/DON'T GO, START MOVING/STOP MOVING etc.

The system uses high inference entropy inferences to determine and/or infer activities. In some examples, the system infers the start/on and/or stop/end/off of an activity, route and/or sub-route. In further examples, the system infers the start of activity while rejecting and/or rerouting the inferred semantics which have high entropy in rapport with the activity.

The system infers the end/stop of the activity based on the completion of a route, sub-route and/or expiration of budgets and/or semantic (superposition) times. Further the system may infer the realization of the activity based on inference of low entropy semantics in rapport with the activity projections within the semantic superposition time; by H/ENT the system may infer the non-realization of the activity based on the inference of high entropy semantics in rapport with the activity projections within the semantic superposition time.

When a group of devices control the same artifact (e.g. analog, digital, switch, semantic artifact etc.) and if a member of the group (e.g. circumstantial leader) commands and/or switches the resource to one state and/or further circumstance then the other members of the group may be in a high entropic (and/or H/ENT), highly distorted and/or out of synch condition of their current published semantics in rapport with the resource. When this happens, the system may instruct the highly entropic and/or out of synch members of the group to adjust their published semantics in accordance with current state of the resource.

The system may perform DO/ALLOW and/or DO NOT/BLOCK augmentation. In an example, the system instructs a carrier to not turn in a particular direction because the environmental conditions (e.g. wind, fire etc.) may cause hazardous inferences to diffuse, spread and/or factorize and/or affect artifacts including the carrier.

The system performs discrimination based on entropic inferences. Further, it may learn that high entropic semantics (associated with indicators, capabilities and/or behaviors) determine discrimination factors for (composite) semantic identities and/or semantic groups. In some examples, the system learns that one post has a hook (e.g. forming a semantic group) which connects to things and tows while another post does not have a hook and thus cannot connect and cannot tow; further, the system infers that discrimination is based on (H/ENT) whether the post has or has not a hook/copter and further that the post is towing/lifting or not towing/lifting capable. Since the intrinsic behavior of a post is to be non-towing, in order to discriminate the towing post (or post with a hook), it adds the discrimination capability to the semantic identity or the semantic group of the (composite) post (e.g. post with hook, towing post). Further, the new intrinsic behavior and/or capability is reflected by the discriminatory semantic identity and/or further artifacts (e.g. semantic routes, groups etc.).

The system intrinsic behavior is to project and factorize an affirmative indicator/identity and to decay a non-affirmative indicator/identity.

We mentioned that the system may implement fight or flight inferences. The system may fight when the inferences, projections and/or consequences on foes actions determine highly factorized dissatisfaction, unhappiness and/or high risk.

Challenges by (competing/critic) participants in the semantic flux/stream network may try to decay the affirmative semantic indicators/capabilities/identities and/or factorize non-affirmative semantic indicators/capabilities/identities. When challenges are hostile the system may infer foe and/or bullying factors and/or semantic groups and further implement fight or flight inferences. By WENT, the challenges and/or participants which resonate with the intrinsic behavior and further counteract bullying may increase likeability and/or friendliness.

The system may factorize anxiety when bullied and/or when its (published) semantic identity and capabilities are threatened in the semantic network.

The system may infer that the time passes slower (and/or further factorize "later" vs "earlier" type inferences) when the anxiety is high.

The system may strive and/or project to achieve/induce and/or further maintain particular semantic identities in the semantic network within particular semantic groups and/or with/for self.

The system may assign particular leadership semantics and/or semantic identities for semantic times and/or intervals in sematic trails and/or routes.

The fight or flight responses may be based on the risk of loss, risk of gain, reward of loss and/or reward of gain. In some examples, the system is biased to fight when the risk of loss and/or reward of gain of affirmative semantic artifacts, (self) identities and/or resonances is high; further, is biased to fight when the risk of gain and/or the reward of loss of non-affirmative semantic artifacts, (self) identities and/or resonances is high. Analogously, by WENT on fight/flight, the system is biased to flight when risk of loss and/or reward of gain of affirmative semantic artifacts, (self) identities and/or resonances is low; further, is biased to flight when the risk of gain and/or the reward of loss of non-affirmative semantic artifacts, (self) identities and/or resonances is low.

The system is biased to fight when its highly affirmative semantic identities and/or high investment artifacts (e.g. artifacts which required high budgets for inferences and/or achievement) are threatened. Further, by H/ENT with affirmative inferences, the system is biased to flight when its low-affirmative/non-affirmative semantic identities and/or low/null investment artifacts are under threat.

The semantic posts may incorporate copter modules including rotorcraft in which lift and thrust are supplied by horizontally-spinning rotors and/or motors.

The semantic analysis including overshoot/undershoot and further rotor/motor control may be applied to project/infer the localization. routing, bearing, speed, orientation (of the post, copter blade etc.), operating intervals, lift, thrust, altitudes of the flying copter-based posts.

For overshoot and/or undershoot inferences the system may send alarms (e.g. to supervisors, owners, users, leaders, artifacts etc.), block and/or invalidate semantic identities and/or artifacts associated with the alarms.

The system may overshoot/undershoot the goal and damp it when budgets are tight and/or is under pressure. In some examples, the system may be under pressure and be factorized accordingly when the (projected) augmentation determine high consequences to itself and/or resonant collaborators and/or budgets are tight. In further examples, the pressure is factorized when the system has high popularity (in rapport with particular capabilities) and/or further object of disputed possession.

The system may divest/divert the challenges and/or further pressure to other (less popular) capabilities and/or collaborators. In further examples, the system creates and/or publishes divestiture capabilities. Alternatively, or in addition, the system may progress more (semantic time) slowly toward the goal and thus decreasing the overshoot/undershoot, damping and/or hysteresis.

The system may diffuse likeable artifacts in order to increase resonance.

The system may challenge the semantic flux network and/or collaborators with important/critical tasks and/or semantic budgets in order to build resonance with the respective fluxes and/or collaborators. It is to be understood that the criticality of the task may be assessed based on evidence and/or further elimination of distortion; as such, the task assessing entity may resonate when the distortion is low (e.g. on the lowest interval).

When connected and/or instructing systems to connect/entangle the system may infer the risks of losing the connection/entanglement.

The system may condition signals based on projections of signal characteristics expected from endpoints and/or paths.

In general, as explained, the system uses at least a first modality to augment at least another modality.

The system may project, expect, (counter) bias, determine and/or condition signals (e.g. distortion/noise/fading determined by multipath, dispersion, diffraction, scattering, Doppler shifts etc.) based on the observations in the sematic field (e.g. observation, semantic times and characteristics of objects, collaborators, environment, communication entities and/or further paths and/or obstructions to these entities.

In some examples, based on projections and/or factorizations of the signal distortion and/or noise in a (direct/indirect) path the system may collapse signals from the paths and/or further not related with direct line of sight. In further examples, the system may prefer some (sensing/inference) orientations, paths and/or further conditioning based on semantic analysis. In further examples, the system uses factorizations (e.g. risk, likeability, happiness etc.) of gain and/or loss of to determine sensing parameters, orientations and/or further signal gains and/or losses.

The system may perform gating of opinion, analysis and/or commentaries in semantic streams/fluxes and/or multimedia artifacts. In some examples the system is instructed to provide, stream, snippet and/or select only the actual (particular semantic identities) playing time in a football game; in other examples, the system is instructed to provide, snippet, stream, select and/or add particular semantic identities commentaries and/or further artifacts; it is to be understood that analogously the system may be instructed to extract particular artifacts.

The system redirects and/or store data in particular locations based on semantic routing. In some examples, the data is routed to access-controlled memories based on whether comprises and/or allows inference of personable identifiable information.

The system may invalidate particular affirmative resonances if the resonant collaborators repeatedly induce inferences which are blocked by hard semantic rules and/or routes.

Semantic factorization may be used for encryption/decryption of messages, documents and/or further artifacts.

The system may infer the private key of an artifact by series, routes and/or trails of compositions and/or factorizations of prime numbers and further comparison (by orientation, shift, drift, entropy etc.) and/or collapse of the inferred factors with the public key of the artifacts and/or further channels/streams that needs to be decrypted. The system may infer private and/or symmetrical keys using the decryption of (public key) encrypted artifacts based on semantic factorization and/or further analysis. The system may use such techniques for communication, cyber, gating and/or further semantic analysis.

In further examples, the system decrypts encrypted messages and/or identifies keys in the messages (e.g. symmetric keys etc.) by comparing the public key (components) of a receiver/sender with a list of public key (components) computed and/or processed a-priori based on multiplications of series and/or (semantic) groups of prime numbers.

The system may infer, learn and/or factorize key risk, performance and/or control indicators based on semantic analysis and/or further leadership inference. In some examples, the system infers that particular artifacts, views and/or scenes require performance indicators such as fast processing, accuracy, cleanliness, long term storage; further, control indicators such as connectivity, follow safety protocols, testing, resonance, budgets may be inferred; even further, the system may infer that risk indicators may be based on loss of power, not following/break of safety protocols etc.

In some examples, the protocols may be embedded, wherein one protocol comprises and/or refers to another.

A semantic trail comprises the progression in the execution of a protocol which may be associated with a semantic route. A semantic trail may comprise the (inferred) semantics associated with the protocol.

In some examples, protocols are comprised and/or associated with (published) (manipulation) interests/constraints/activities (of/at containers/carriers/devices/endpoints etc.). Alternatively, or in addition, they may be comprised in contractual/transactional (documented) clauses.

The system may select capabilities, constraints and/or publish/advertise interests to satisfy and/or affirmatively factorize protocols and/or semantic routes. By H/ENT the system may avoid capabilities, constraints and/or not publish/advertise interests which non-affirmatively factorize particular protocols and/or semantic routes.

The system may synchronize multiple streams based on semantic time.

The system composes two streams/fluxes based on semantic time and/or further conditions/gate a stream when high entropy and/or distortion is inferred. In some examples the system renders/augments a movie for a Spanish/English speaking entity and when the streaming sound in Spanish starts it may mute/gate the sound stream in English and activate Spanish; further, if distortion occur between English to Spanish translation artifacts the system may mute/gate Spanish and activate English.

The system may gate and/or diffuse semantic artifacts between semantic views. In some examples the system comprises views for viewing incidents and/or associated artifacts; further, the system specifies the view, device and/or destination where to be informed and/or augmented at particular semantic times.

The system may generate impactful and/or surprise advertisings. Thus, it may look to generate reasonable to high resonant artifacts with the target audience and/or semantic identities when the projections of resonant artifacts (within a semantic time) for the respective audience and/or semantic identities is low and/or unknown environments are high. By H/ENT, the system may look to generate reasonable to borderline resonant artifacts with the target audience and/or semantic identities when the projections (within a semantic time) of resonant artifacts is high (for the respective audience and/or semantic identities). The system publishes and/or diffuses semantics to fluxes and/or channels which by projections would not distort the composite meaning.

The composite artifacts may be distorted by addition of (counter) biases, noise, omission of facts, emphasizing snippets/components/artifacts other than the highly factorized leaders and/or other high entropic techniques in rapport with the coherent inferences etc.

The distortion may occur due to biases and/or further semantic artifacts used in inferences.

When the system infers the distortion of the clauses and/or further composite meaning it may infer a distortion factor associated with the components, clauses, semantic identities, groups, routes and/or trail which determined and/or influenced the distortion. Further, based on the distortion factor the system may infer hostility factors and/or further censorship factors of the distortion generated group in rapport with the distortion-ed semantic components and/or identities.

It is to be understood that the distortion factors may be used to determine signal distortion and/or further conditioning. Further, the system may assigns censorship factors to artifacts (e.g. components, devices, fluxes, collaborators, semantic artifacts etc.) which distort the signal and/or parts thereof and further use those in semantic inferences (e.g. creates momentum vectors and/or diffusions with various entropies etc.).

The system may express opinions/analysis on potentially distorted artifacts and/or further censorship. Further, it may gate, diffuse and/or cutoff opinions/analysis comprising distorted artifacts.

The system may increase the semantic spread and/or further challenge collaborators, sensing and/or fluxes, so it may assess facts that either affirmatively factorize and/or non-affirmatively factorize the distortion inferences.

The system may (be configured with a) model diffusion and/or attenuation. In some examples the system may comprise models of charged particles and/or electrolytes wherein the particles may move from the positive endpoints to the negative endpoint and/or vice-versa until the entropy decreases and/or further attenuation (factor/s) increases. Such semantic analysis and/or further commands may be used in (biological) sensors/dispensers/actuators, signal attenuation/modulation and/or further (semantic) artifacts/analysis.

We mentioned the use of collimation techniques which allow the system to perform advanced selection, manipulation, analysis and/or commands. In further examples of collimation, the system manipulates a remote sensing device having an optical receiving element which detects the radiation and/or scattering from display viewing surfaces and further semantic network model artifacts and/or movements and thus inferring the pointing area on the screen. In some examples, the system determines that the collimation target endpoint and/or area are in a centered endpoint of the receiving inferred observing field of view of the optical element and/or mesh. Thus, the system highlights and/or select the artifacts on screen and/or further associated endpoints and/or hierarchies at the collimated location. Further, the system may use further manipulation of the remote sensing such as particular movements in order to manipulate the collimated endpoints and/or further artifacts on the screen.

In further examples, the system uses screen collimation between at least two devices (e.g. the main viewing device and the main control device). The main control device may be in some examples a wearable and/or mobile device. Analogously with the collimation techniques, the main control device may be used to collimate and/or zoom on allowed areas on the main viewing screen; further, the user may select on the main control device collimated and/or enabled controls and thus interacting with the viewing device. The collimated area may be further inferred and/or rendered using techniques such as those explained earlier based on sensing, wearables and/or optical collimation.

The collimation and/or further selection techniques may comprise semantic shaping. A collimated/selected (semantic) shape may be inferred based on collimation of a (semantic) shape, area and/or associated endpoints determined by a first (semantic) group of sensors and further projections (e.g. on the observing sensing entity and/or further endpoints, on the collimated display/surface/volume and/or further endpoints). The system may collimate a semantic shape to another semantic shape in a hierarchical manner.

In further examples, the semantic shaping is determined by the collimation of a shape determined by user hand gestures which comprise shaping of at least two fingers to encompass the shape and/or endpoint of the collimated object. Alternatively, or in addition, the system may tap the at least two fingers in a way that the tapping point/endpoint and further projection of the point/endpoint from the observing entity to the selection/projection surface collimate on the object/control to be selected and/or associated endpoints (e.g. within and/or of the object/control). Further (composite) gestures techniques such as grabbing/gripping/holding may be inferred and/or used; it is to be observed that such techniques may be inferred based on finger tapping and/or further compositions between them.

The system may infer a configured selection gesture by analyzing the UPI movement in the semantic field within a semantic time. Further, it may associate the gesture with the selection of collimated objects on the display surface and further select the objects.

Configured selection gestures may be associated with UPI tapping, pushing, bending, waving, grabbing, moving and so on in particular semantic times.

In some examples, the system uses configured and/or learned movements, hysteresis, damping, indexing and/or semantic time to infer tapping gestures. As such, the system infers based on object/UPI orientation movement mapping and inference including stopping/forward/reverse, further damping, hysteresis and/or further attached sensors that the stoppage endpoint may be a tapping endpoint and/or a ending and/or starting endpoint of a gesture and/or activity. Further, the system may use the hysteresis and/or damping of the UPI movement to further factorize the affirmative/non-affirmative indicators/factors in relation with the (tapping) gesture. If the system detects the stopping, contact and/or the composition between two UPIs at a contact endpoint the system may further detect the tapping, a further semantic group and/or a composite semantic. It is to be understood that in the case of tapping the system may not infer that a composite semantic identity and/or semantic group is assembled because the diffusion at the tapping and/or assembly endpoint is minimal, non-existent, not enabled and/or not possible.

In some examples, the user pointer indicator is the index finger. Further, at least two phalanges may have each attached, via at least one wearable, accelerometer/s and/or gyroscope/s such as they measure the orientation of phalanges in rapport with each other and further, potentially using orientation sensed by a lens and/or camera, with the environment. Thus, the system may be able to infer whether the finger is straight, bended and/or further points and/or moves in particular directions/orientations and further projects to particular endpoints. The system may infer the finger is straight and oriented toward a display surface and as such it may select a user interface object on the display surface and further allow the user to interact with the display surface via additional gestures and/or movement. In some examples, the user moves the finger in order to move the selection and/or focus from one user interface object to another and/or select a plurality of objects; once the desired object/s are focused/selected the user may perform further gestures to start activities published by the selected objects and/or semantic groups thereof. It is to be understood that the appearance and/or activities of the selected objects may be composed and/or collapsed (e.g. into a single object) and thus the system starts a composite activity of the composed object.

The system may detect that a finger/UPI/arm/limb is (almost) straight or bended by measuring the differences in acceleration, velocity and/or angles on multiple (relative and/or absolute) axes from the sensors attached to each of at last two of its segments/components (e.g. phalanges for a finger; hand, arm and/or forearm; tight and calf for a leg etc.); as such, when the phalanges/segments/components are aligned the system may detect that those have little difference and/or further little drift/shift and/or entropy from one another on particular (absolute) axes. It is to be understood that the system may calculate the differences on axes by translating the sensor measurements which may be on their particular relative reference systems and/or axes orientation to an absolute reference system and/or axes orientation. Further, the system may detect other particular gestures such as wiggle/bend/tap twice or multiple times etc. which may be composed to inferences, sentiments and/or commands (e.g. activate/deactivate tv control, select, start/end activity, on/off, zoom, in/out, little, fast, slow etc.). While such inferences may be based on particular sensors is it to be understood that alternatively, or in addition, they may be based on other modalities explained in this application (e.g. for image/video capture etc.).

Once collimated, focused and/or selected, an object is marked on the projection and/or display surface by various techniques including highlighting, contouring, coloring and/or other techniques. The system may collimate, focus and/or select multiple objects and/or semantic groups thereof based on particular configured gestures within a semantic time. Further, the user may erase the selections based on further configured gestures.

The selection gestures and/or further associated activities and/or commands may comprise sentiment evaluation (e.g. MOVE FAST SIDE BY SIDE, TAP REASONABLE FAST TWICE etc.). Such configured gestures/signs and/or their evaluation may comprise orientations, drifts, fluency, component gestures/signs and/or semantic times.

In some examples, the system monitors via sensors to detect the configured gestures and/or associated semantics (identities)—e.g. "display target"—may be inferred based on semantic routes such as "(watch out V sign, point towards target, point towards display) within 10 sec", "(point towards target for 5+ sec, point towards the projection and/or display for 2+ sec) within 30 sec of supervisor (Jane) arrival"; as such, if the interest gesture semantics are not inferred within the configured (semantic) route (semantic) times then target semantic ("display target") is not realized. Further, the system may invalidate the inferred component gestures/signs/semantics for a particular route.

It is to be observed that the system may determine an indexed time to reevaluate the realization of the particular semantics in a route based on the route times of semantic realization. In an example, once it infers "watch out V sign" the system may evaluate after 10 sec and/or after supervisor arrival+30 sec whether the other semantics in the route ("point towards target" (for 5+ sec), "point towards display (for 2+ sec)") have been inferred; if they have been inferred then the system may deem "display target" as realized.

In further examples, the gestures are specified via a narrative which may be further associated with target semantic identities, possession, endpoints, activities, commands, explanations, goals, purpose and/or (further) associated narratives.

An explanation may comprise (descriptive/description) narratives on purpose and/or goals. For simplicity, explanation(s), purpose(s) and/or goal(s) can be used interchangeably. Further, they may encompass narratives comprising (further) activities and/or commands.

In examples, TAP REASONABLY FAST TWICE (IN A CT AREA) may be associated with an activity/command and/or (further) purpose/goal narrative SELECTS A (FAST FORWARD) BUTTON ON THE CURRENT CT IMAGE VIEWER while located within a CT room and/or manipulating a user interface on a CT reading station. As such, the system (and/or a (display) controller, camera etc.) may determine that the user is in a CT room and/or CT AREA and/or that the user performs the gesture; as such, the system may perform the activity/command and/or forwards/diffuses it to an endpoint, device, module and/or flux capable (or having/publishing the capability) of performing it.

Alternatively, or in addition, the system may match the goal/purpose (or interest) of the (user/person/profile) gesture with the goal/purpose (or capability) of a user interface object/control (flux) and selects the user interface control (flux) and/or (further) forwards, diffuses and/or applies the activity/command to/by a/the display controller (flux) (and/or further) (to the user interface (object/control) (flux)).

The system indicates artifacts by pointing and/or orienting UPIs towards the locations and/or endpoints associated with the artifacts.

In some examples, the UPIs may be associated and/or used in conjunction with remote surgery (post) arms and/or grippers.

The observing (sensing) entity can be any sensing entity, module and/or post; in some examples, the observing entity is a wearable camera, glasses, contact lenses, (embedded) optical/microwave/terahertz modules/antennas/meshes and/or any combination thereof.

The observing sensing entities (e.g. camera C1 and/or lens L1 etc.) may perform user/wearer identification based on iris and/or further eye analysis. The iris and/or eye semantic analysis may be based of the characteristics, location and/or components of the iris, sclera, cornea, retina and/or further eye biological components (e.g. blood vessels, melanin etc.) and/or conditions.

Multiple posts, devices and/or (comprising/comprised) sensing entities may be used to reduce superposition (e.g. multiple cameras, optical sensors, accelerometers etc.).

The system may use the identified user/wearer particular semantic profiles and/or preferences to adjust and/or personalize interactions and/or further inferences. In some examples, a semantic profile comprises configured and/or preferred user gestures for a (particular) device, semantic identity, endpoint, circumstance and/or semantic time (e.g. such as (Does) hold a glass, wear a hat etc.); thus, the system identifies semantic identities, gestures, and/or perform actions and/or activities based on a (received) semantic profile (s) comprising user preferences for various circumstances. Further, the system uses the user/wearer identification in order to perform semantic learning and to adjust wearer's/user's semantic profiles.

The gestures may be configured by users and stored in (semantic) profiles. In examples, Jane indicates, teaches, explains and/or configures gestures for manipulating images (e.g. on a (monochrome/CT/color/3D/2K/4K) projection and/or display). Sensors (e.g. cameras, microphones etc.) may capture the gestures and/or further the explanations of the gestures; alternatively, or in addition, the gestures (and/or their rendering snippets and/or sketches) are associated with semantics by selecting them on a user interface display and/or indicating their semantics (e.g. via typing, audio etc.). Alternatively, or in addition, the gestures and/or signs may be associated with semantic shaping.

In examples, Jane indicates the start of a gesture setup activity, performs the gesture and indicates the ending of the gesture activity; further, Jane indicates the semantic of the gesture (e.g. rotate/slide left with a variable number of degrees a CT scan image).

In further examples, the system indicates semantic routes for/of gestures and/or associated semantic times. In examples, a FORWARD/REWIND, SHOW PALM route and/or SHOW PALM WHILE FORWARDING/REWINDING may mean STOP THE CURRENT FORWARDING/REWINDING ACTIVITY while SHOW PALM means GO BACK. It is to be observed that the system may match the more precise and/or localized route and/or semantic time (while forwarding or rewinding and/or FORWARD/REWIND is valid/active/enabled) such as FORWARD/REWIND, SHOW PALM; SHOW PALM <->WHILE FORWARDING/REWINDING instead of SHOW PALM; it is to be observed STOP THE CURRENT FORWARDING/REWINDING ACTIVITY may invalidate/inactivate/disable FORWARD/REWIND and/or determine the inference of (routes and/or composites) such as NOT FORWARD/REWIND, RENDERING PAUSED; FORWARD/REWIND->STOPPED etc.

In a case that semantic profile preferences do not indicate all the required gestures to manipulate the user interface then the system may suggests, challenges and/or augments the user on additional gestures semantics to be linked and/or assigned to particular manipulation semantics and/or activities; the suggested semantics may be among from a set of (additional) preconfigured and/or available (free-floating) gestures (e.g. stored in a memory of a display controller, stored in a memory of a user mobile device and/or semantic profile etc.).

In some examples, the gesture semantics are configured by a supervisor at an endpoint and/or on an (endpoint) display controller; alternatively, or in addition they are configured for particular sets of endpoints, semantic groups and/or (associated) semantic identities (e.g. ALL CT PDS CONTROLLERS (EXCEPT THE DOES CONTROLLER), CT ROOMS WITH A TECH (PRESENT) etc.).

In further examples, the gesture semantics are configured by a mobile device user and/or stored in a semantic profile. Alternatively, or in addition, a user (e.g. Jane) specifies a plurality (or set) of gesture semantics which are not assigned to any activity and/or command (or free-floating/available) and/or may be assigned by the system and/or by the user when required (e.g. due to confusion/coherency etc.), when is augmented and/or challenged. Explanations for such gestures may be associated with allowable/blocked semantic identities and/or times management rules including semantic times.

In examples, a user and/or (published) semantic profile (flux) (interests and/or entries) specifies that ROTATING (RIGHT) PALM is associated with an explanation/goal of OPEN TO IDEAS—(CT) STATION/YOUR PICK JOHN/NOT ASSIGNED->(CT) ROOM etc. Thus, the system (or PDS/display controller) may assign them when needed (e.g. when the semantic profile gestures do not cover a (minimal/likeable/required) set/subset of manipulation commands, when confused/not coherent, in superposition etc.). As such, the system (and/or PDS controller) and/or the mobile device may check whether the goals and/or associated (access/diffusion/matching) rules/conditions are met (e.g. using semantic drift/matching/analysis etc.) and/or further augment the user on (potential) assignments with gestures semantics. It is to be observed, that the (diffusion of the) augmentation may be based on access control; as such, the augmentation related to OPEN TO IDEAS is allowed from a (CT) STATION (flux) but not allowed otherwise.

In further examples, the system may suggest additional gestures when the configured (profile) and/or assigned gestures do not cover all the manipulation activities and/or controls. As such, if the configured gestures (including the assigned/deemed free-floating/available) for manipulating a CT reading station and/or CT Image Viewer are not sufficient then the system may suggest or augments with additional gestures configured and/or (deemed as) free-floating (or available) for/in particular endpoints (e.g. CT ROOM) (profiles), PDSs, devices (e.g. CT station) and/or associated semantic identities based on semantic analysis and/or matching.

Alternatively, or in addition, configured gestures may be deemed as free-floating/available and/or assignable if the configured gestures and/or (associated) semantic profiles are associated with other (similar) environments, themes (e.g. "medical imaging", "streaming interface", "TV streaming apps", "mobile streaming apps" etc.) and/or semantic identities (e.g. MRI ROOM, MRI Image Viewer, MRI station, TV screen, (4K) home projector etc.) and thus, the system may match those to suggest, assign and/or cover for the insufficient set of gestures within a similar theme and/or associated semantic identities.

The system may select and/or assign (other) gestures in order to avoid confusion. In examples, as an MRI station, CT station and/or (associated/non-associated) LCD/OLED TV are situated at an endpoint and manipulation may cause confusion (e.g. due target selection of at least two and/or a configured gesture associated with entropic activities (for each)) then the system may determine, infer (free-floating) and/or augment on the gestures which cause the least confusion and/or superposition. Alternatively, or in addition, the system may infer and/or deem as free-floating (or available) gestures from the configured gestures associated with higher entropy themes and/or associated semantic identities.

Alternatively, or in addition, semantic profiles have/comprise (ordered/prioritized) preferences, (ordered/prioritized) entries, (ordered/prioritized) semantic identities/themes and/or (ordered/prioritized) explanations/activities/commands to which a gesture is applicable. Alternatively, or in addition, the order/priority is based on semantic factorization.

The system may use the configured and/or factorized order and/or priority to reduce confusion when this occurs (e.g. when a gesture is applicable to more than one semantic identity and may cause confusion due to being associated with different (entropic) activities/commands etc.). Alternatively, or in addition, it may infer, determine and/or deem free-floating/available gestures and/or suggests/augments on the assignment.

The system applies access control while matching (manipulation) interests with (manipulation) capabilities. As explained throughout the application, interests and capabilities are matched (and/or flux coupled/diffused) only if their associated (flux) publishing/access matches and/or allows it.

While some in presented examples, the (gesture) explanations and/or goals may be described as (composable) semantics and/or semantic routes, alternatively, or in addition, they may comprise and/or be associated with semantic times, semantic identities, time management rules, access control/diffusion rules, supervisory rules and/or any other type of rules such as explained in this application.

In general, (composable) semantics and/or semantic routes, may comprise, be configured and/or be associated and/or linked with semantic times, semantic identities, time management rules, publishing/access control/diffusion rules, supervisory rules and/or any other type of rules such as explained in this application.

It is to be observed that the indicated gesture may be identified as variable based on a particular variable orientation, movement (e.g. rotation, sliding etc.) and/or associated (time) indexing; as such, when the gesture is inferred, the system may adjust the onscreen image rotation/sliding with the inferred (factorized) variable rotation/sliding indexing and/or time indexing.

In further examples, Jane specifies/indicates (multiple) gestures/signs and the system identifies them by the (inferred and/or indicated) semantics. In some examples, the gestures may be inferred from captured video snippets wherein multiple gestures are inferred; alternatively, or in addition they are indicated by voice, typing and/or any other interfaces. Further, gestures are associated with various activities and/or actions (e.g. by selection, explaining etc.).

The gestures and/or preferences may be applicable to semantic identities associated with projection and/or display surfaces and/or further (displayed) (semantic identities of) applications, user interfaces and/or controls.

In some examples, Jane identifies gestures that can be used in particular circumstances and/or semantic times (e.g. when John present, at night, when running low on (battery) budgets, in the office, at reading room, for CT/MRI scans etc.). Further, Jane specifies particular gestures and/or preferences for manipulating a tea pot (e.g. "tea pot with a cap" etc.) chat application, a media player (e.g. "video player", "audio player with audience", "video-audio player", "8K player" etc.), manipulating a combo-box, manipulating a checkbox etc.

In further examples, a gesture semantics may comprise at least one activity and/or at least one (possessed) semantic identity (at (an) endpoint(s)) (e.g. MOVE SIDEWAYS A/THE TEA POT, WAIVE TWICE THE (HEALTH AFFAIRS) NEWSPAPER etc.).

The configured gestures may be stored in (semantic) profiles and/or further user/robotic devices/equipment memory. As such, as a user and/or further device is identified at an endpoint, the profiles are challenged/received/sent by/to the system (from a user/robotic device) and/or applied based on the inferred, applicable, preferred and/or allowable circumstances. In circumstances, when the system is in superposition and/or confused about which applicable gestures to apply (e.g. due to multiple users trying to manipulate the same indicated display/artifacts) the system may apply the supervisory hierarchy and/or (further) superposition reduction.

The semantic profiles may be wirelessly communicated to a display controller (via at least one wireless transceiver and/or module) based on endpoint presence, semantic inference, challenges, swiping, proximity, coupling and/or any other techniques such as explained in the application. The PDS/display controller may store the received semantic profiles in memory and (further apply them to) infer gestures and/or further semantics by persons and/or further semantic identities. In some examples, a display controller may comprise similar components and/or (its functionality) resemble a provider and/or holder/cart as depicted in FIG. 45C.

For the purpose of this application terms such as "display", "PDS", "PDS/display", "projection and/or display", "projection and display", "projection or display" may be used interchangeably.

A semantic identity of a user interface and/or PDS (and/or designated target) may be inferred and/or configured at an endpoint. Further, a/the semantic identity (of a designated target) may be inferred upon designation signs/gestures and/or indication by a person.

Targets and/or associated semantic identities may be configured (and/or stored in a (semantic) profile), designated and/or inferred.

In some examples, the (display control) system determines that Jane performs a gesture wherein the gesture is configured in a semantic profile and applicable to at least one configured (target) semantic identity (e.g. "UI applications/viewers/controls", "devices with a display", "UI applications/viewers/controls on devices with a display" etc.). The (display control) system determines that Jane's gesture is applicable to an actual identified semantic identity (e.g. CT display station, CT Image Viewer, 3D Scanner UI application, Home View, Home Controls etc.) based on semantic matching of the configured semantic identities with the actual semantic identities and/or (further) associated semantic attributes. It is to be observed that the actual (configured and/or inferred) semantic identities may comprise and/or be associated with semantic attributes (e.g. UI application).

The (display control) system infers that Jane performs a gesture applicable to an actual semantic identity by (semantically) matching the actual semantic identity with a/the (profile) configured semantic identity and/or by: determining that the configured gestures in the semantic profile are applicable to the actual semantic identity and/or (further) expecting and/or inferring that Jane performs a gesture amongst the configured gestures; alternatively, or in addition, the (display control) system infers that Jane performs a gesture applicable to an actual semantic identity by inferring the gesture and matching it against the configured gestures.

Alternatively, or in addition, the system may infer that a Jane's gesture is directed and/or applicable to an actual semantic identity by detecting an actual target designation sign and/or user pointer indicators toward the target; in some examples, Jane gestures a V-sign and/or "watching you" gesture and/or user pointer indicators in a (predefined time and/or ordered/non-ordered sequence) towards her eyes and/or the PDS of the actual (target) (inferred and/or configured) semantic identity. It is to be understood that a target designation sign and/or gesture may be transmitted as part of a semantic profile; as such, the system may identify the actual target semantic identity by the designation sign/gesture and/or further apply further Jane signs/gestures to the designated target (e.g. PDS) and/or (associated) actual (inferred/configured) semantic identity.

The system may cease the designation of the (display) targets and/or invalidate the inferred actual target semantic identity based on determining other (configured) (profile) gestures (e.g. detecting a V sign pointed in order towards PDS and Jane eyes (or PDS->eyes) which may be high entropic with the designation sign (e.g. eyes->PDS). Alternatively, or in addition, the system ceases the designation and/or invalidates the associated semantic identities when infers other designation signs and/or alternate designated targets. Alternatively, or in addition, the designation of all targets (at endpoints) may be ceased based on particular (profile) signs and/or gestures.

The system may designate multiple targets and/or target groups and/or further group semantic identities. In some examples, the system determines ordered inferences and/or trails (based on semantic times and/or semantic routes) of a V sign towards the eyes and further towards each of the targets (e.g. PDS-1/CT station left corner, PDS-2/CT station center, PDS-3/CT station right corner etc). Alternatively, or in addition, the system may determine an encompassing designation gesture for all stations (e.g. rotating in a circle a user pointer indicator which may signify designation of all the items located within projected encompassing endpoints or designation of all the items in a room etc.). It is to be understood that the gestures and/or designations may be inferred based on configured and/or specified explanations (e.g. "rotating a finger in a circle (once)" means (->) "designating all the encompassing items", "rotating a finger in a circle (twice)" means (->) "designating all the items in a room" etc.); further, the system may factorize and/or determine the actions and/or designations which better match the environment (e.g. at first selects only the encompassing endpoints and/or further, if the person specifies the same gesture twice designates all the items in the room).

In alternate examples, designated targets may include objects such as appliances, curtains, tea pots and/or any other objects. Alternatively, or in addition, the designated targets are any objects/artifacts which publish at least one semantic flux. As such, when designated, the system may display (via a display controller) a user interface which renders at least one user interface control based on matching the control semantic identity/purpose/goal/explanation with the capabilities of the designated target flux(es). Alternatively, or in addition, the capabilities of the designated targets are matched and/or (flux) coupled with the capabilities of user interface controls. Alternatively, or in addition, the capabilities are matched against a user/supervisor/endpoint interests/preferences/profiles. Furthermore, the user interface control(s) may be selected to allow the manipulation of (flux connected) capabilities.

In further examples, a user designates a target and performs particular gestures which identify an item and/or issue an order. In examples, John designates as target a coffee shop POS (flux) (CoffeeForU), sends/connects (with) the semantic profile (flux) and performs gestures which identify and/or select (on a PDS) his order items (e.g. three large coffee lattes, a two shot small latte etc.) and/or (further) cancel (items) and/or place the order. In further examples, the gesture for "three large coffee lattes" may comprise routes and/or groups of ("a @number of fingers up", "two fingers crossed") in 10 sec; ("three fingers up", "two fingers in a circle for 3+ seconds") wherein @number may be any (inferred) number and for which the semantic (route) "@number large coffee lattes"->"three large coffee lattes" is inferred and/or applied etc. Alternatively, or in addition, "@number large coffee lattes" is inferred based on ("a @number of fingers up", "two fingers crossed") in 10 sec. Further, the system may augment John on what it infers from the gestures such as "three coffee lattes" and/or further "cancel the (last) (three lattes) item" (,"YES?(NO?)); "place the order", "confirm?"; "YES, NO" "?" etc.).

It is to be observed that the gestures may comprise semantics and/or activities related with (order/item (list) (at endpoints)) readiness, confirming/infirming, YES/NO, OK/not OK etc.

An order may be placed by a clerk and/or customer. If the control is over and/or factorized to the customer, the customer may manipulate and/or place orders. Alternatively, or in addition, if the customer doesn't manipulate and/or place the order the clerk may place the order for the customer. A clerk may have manipulation supervision over the customer based supervisory and/or access control rules.

The system may infer a (semantic attribute of a) clerk for a person by leadership and/or routes associated with supervision (e.g. 70% the person with a black tie by the POS for 5 hrs (last three days), talked with the store manager). Alternatively, or in addition, a clerk may be identified based on configurations, (wireless/NFC) (device) identification and/or semantic profiles (at endpoints). Further, the system may correlate and/or match the identification with the further leadership attributes of the person.

Alternatively, or in addition, clerk is inferred, (and is associated) by/with leadership semantic attributes, routes and/or identification (e.g. person 95% with a black tie, 90% having a magenta phone, dark hair etc.).

The system may apply handover to transfer the supervising and/or manipulation of an artifact. In examples, a POS supervisor user (e.g. clerk) places orders for other users. Alternatively, or in addition, the POS supervisor hands over the manipulation of the POS and/or associated PDS. In examples, a clerk designates/indicates a particular customer and/or group as a manipulator while the customer is placing his order; alternatively, or in addition, the clerk designates/indicates (general/particular) customers and/or groups as manipulators while (each) placing their orders; alternatively, or in addition, the clerk designates/indicates a particular customer as manipulator during placing his order with the manipulation supervision being returned to the clerk after the order is placed.

A higher-level supervisor (or supervision) may have configured gestures and/or be allowed to take (back) and/or handover control of the manipulation over/to a lower-level supervisor. Alternatively, or in addition, same level supervisors, users and/or manipulators may handover manipulation control and/or supervision from one to another but can't take over/back control from another supervisor/user on the same level.

It is to be understood that the levels of supervision may be based on supervisory hierarchies and/or (access) control rules such as explained in the application. Alternatively, or in addition, they may be based and/or associated with semantic times.

Further, the system determines the manipulators and/or supervisory thereof based on further factorizations. In examples, the system affirmatively factorizes supervision and/or manipulation rights for a CUSTOMER based on routes such as CUSTOMER_WAIT_IN LINE, CUSTOMER FIRST IN LINE, CUSTOMER IN/AROUND THE FRONT OF THE COUNTER; SUPERVISOR INDICATES CUSTOMER, CUSTOMER IN/AROUND THE FRONT OF THE COUNTER etc.

It is to be understood that a (higher level) supervisor (e.g. (POS) clerk, endpoint supervisor etc.) may have configured gestures to handover the manipulation and/or invalidate the handover and/or take back control. Alternatively, or in addition, a (lower level) user/supervisor (e.g. customer) may not have at his disposition the rights for manipulation associated with a handover while a (higher level) user/supervisor may have the rights for handover.

As explained throughout the application the access control and/or supervising may be hierarchical. As such, a first (higher level) supervisor/user may have (higher) handover capabilities over a second (lower level) supervisor/user.

Alternatively, or in addition, the system uses semantic factorization (of a supervisory indicator) based-on and/or of the access/supervisory control rules and/or (semantic) hierarchies to determine who has priority and/or is allowed to manipulate (at endpoints).

A display controller comprising a processor and a memory may control access and/or manipulation of user interfaces (on the projection and/or display surfaces) based on (supervisory) hierarchies and/or (access) control rules. In some examples, the display controller is embedded in a display/gaming console, TV set, PDS, appliance, camera and/or robotic module.

A user (e.g. Jane, S2P2 etc.) indicates a transfer of semantic profiles (e.g. from a (supervised) (possessed) (robotic/mobile) device to a target device (detecting/inferring the gestures) (e.g. display controller, PDS, camera, robotic/mobile device etc.).

In some examples, the transfer is based on selecting and/or assigning the profiles from the source device to the target device; alternatively, or in addition, the transfer is based on dragging and dropping the semantic profiles on a (device) display (ed) (user interface) from an interface control associated with the source (semantic identity) to an interface control associated with the target (semantic identity). Alternatively, or in addition, the transfer is based on (further) indications through any techniques such as explained in the application. Alternatively, or in addition, the profiles are transferred between devices based on wireless (flux) coupling; in some examples, Jane's swipes a radiofrequency enabled (e.g. NFC/RFID) mobile device to another device (e.g. such as camera, PDS, display/game console/controller etc.). Alternatively, or in addition, the profiles are transferred between devices based on endpoint presence and/or semantic inference and/or (flux/stream) coupling and/or challenges.

It is to be understood, that source and/or target devices and/or their capabilities/profiles may be published and thus, a device may display on its user interface the devices, (published) capabilities/profiles and/or further semantic identities. Further, the publishing of capabilities/profiles/fluxes may be based semantic matching and/or drift between preferences and/or further endpoint inferences. In some examples, Jane configures the publishing of her semantic profiles and/or capabilities to be available only when present in a medical imaging reading endpoint and/or when a radiologist (and/or (CT) tech) is present and/or approves/allows; as Jane is present in a CT scan room around a CT reading endpoint her profiles and/or capabilities are published as per her and/or radiologist publishing preferences and/or semantic similarity and/or grouping between the CT reading and medical imaging reading.

A semantic identity may be inferred for the mobile device and/or for the possessor (e.g. the person holding/waiving the phone with poinsettia on screen etc.).

The display and/or user interface control is based on (access/supervisory) control rules (at endpoints), disputed possession and/or associated (inferred) semantic identities; alternatively, or in addition, the station control is based on supervisory hierarchies.

In examples, for the CT reading station the system may match a rule for a semantic identity which is allowed/denied of manipulating the reading station. Based on the priority (factorization) of the rule the system may allow and/or deny manipulation. In some examples, the system allows Jane to manipulate the reading station because (semantically) matches/finds a first allow rule for Jane (and/or associated inferred semantic identity) which has higher (factorized) priority (and/or factorization) than a second allow rule for John (and/or associated inferred semantic identity); alternatively, or in addition, it (semantically) matches/finds a first block rule for John (and/or associated inferred semantic identity) which has a higher priority than a second block/allow rule for Jane (and/or associated inferred semantic identity). It is to be observed, that the system may not look for a/the second rule if it matches/finds the first rule. As such, if the system determines that the first allow rule (semantically) matches the disputed possession semantic identity (e.g. of Jane) then it allows the manipulation control for that semantic identity without looking for the second rule and/or considering/inferring gestures from the contestant semantic identity (e.g. of John). Analogously, if the system determines that the first block rule matches the disputed posses sion semantic identity (e.g. of John) then it disallows (or blocks/discards) the manipulation control for that semantic identity artifact (e.g. John) and/or further looks for the allow second rule for the contestant semantic identity (e.g. Jane).

It is to be observed that the system may determine control based of only a subset of control/hierarchy rules (e.g. stops matching the semantic identities with the rules once the control is determined). It is also to be observed that the manipulation may be controlled hierarchically based on semantic identities and/or semantic groups; in examples, the control may be associated with a semantic identity of the projection and/or display surface (and/or associated semantic group) (e.g. CT reading station(s)) and/or with semantic identities of user interfaces and/or (associated) applications (and/or semantic groups) (e.g. CT Image Viewer(s), 3D Scanner(s), Home View(s), Home Controls, pump controls, HVAC controls etc.) displayed on the projection and/or display surface. As such, while for the control of the display surface the system may allow only one person manipulating it, for particular user interfaces (on the PDS) it may allow each to be manipulated by a (different) person (as long as the confusion and/or superposition is within configured limits).

The disallowance of manipulation may encompass and/or consist of discarding, blocking and/or not inferring the gestures.

The system may infer the starting and/or ending of the pointing and/or indicating activities based on movement, start/end of obturations and/or further circumstances. In some examples, the pointing and/or indicating affirmative inferences and/or indicators are factorized with the semantic time in which the user points and/or obturates (e.g. within an endpoint, semantic interval etc.) in a particular (stable) orientation.

In further examples, observing sensing entities such as cameras, contact lenses, glasses and/or optical meshes infer the localization, mapping and/or positioning of the user head/eyes/irises/pupils within their mapped surfaces. Thus, the user may use such inferences to further project the observing field of view, orientations, obturations and/or selections on the projection and/or display surface.

In some examples, the system detects the iris/pupil movement, sizing and/or orientation in rapport with the enclosing and/or hierarchical (semantic) mappings (e.g. sclera, eyes, head etc.). Thus, potentially by using further circumstances (e.g. environmental, of user, display etc.), the system may (semantically) project the inferred observing (semantic) field of view, inferences and/or semantic field onto a (semantic) mapped display and/or manipulation surface.

Figure 26A:
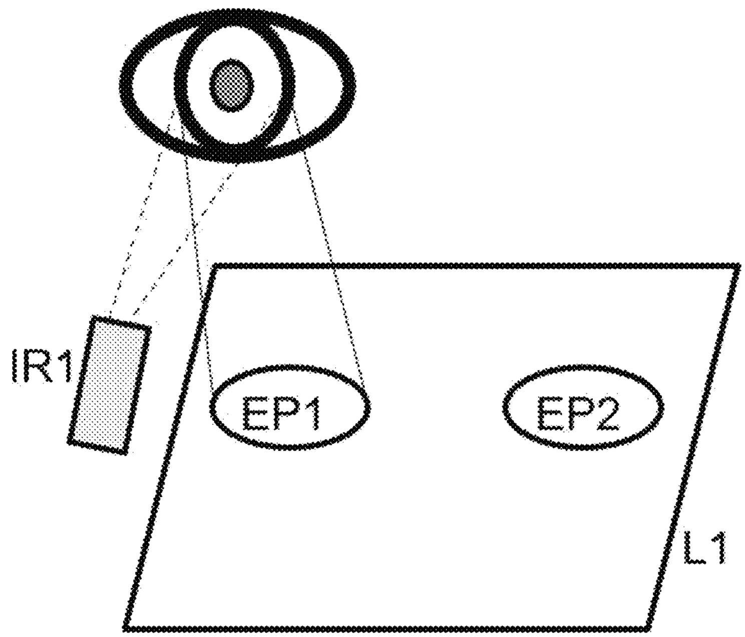
FIG. 26A is an illustration of an observer directing attention to a first endpoint within a semantic field of view.

In an example, as depicted in FIGS. 26A and B, the system detects the mapping of the iris within EP1 as mapped to the lens L1 at a first time and the mapping to EP2 at a second time. Thus, the system maps the semantic field of view to EP1 and/or EP2 and further uses the transition and/or diffusion of the iris from EP1 to EP2 for semantic inference. The iris movement may be detected via the lens L1 which may be associated with a camera, and/or may (alternatively) be a sensor configured to detect light reflected from the eye, such as with a source IR1; the source IR1 may generate electromagnetic and/or optical radiation in the infrared, terahertz and/or ultraviolet. In some examples, the source IR1 is an IR/NIR source at (near) infrared wavelengths. In other examples, the IR1 radiation comprises wavelengths blocked by the human eye lens and/or cornea (e.g. 400 nm or less); in further examples, they comprise light with wavelengths associated with the wearers (predominant and/or leader) iris color. In some examples, the source IR1 and/or the lens or sensor are embedded in a wearable unit such as wearable lens and/or glasses.

Although, typically, the IR1 source may emit radiative patterns, alternatively, or in addition, it may be (associated with) (filtered/conditioned) ambient light.

The system modulates radiation and/or emissions and/or further detects the backscattered particles/energy/signal. In some examples, the system determines, at first, (e.g. via sensing and/or other sources of information) particularities of the wearer's eye (e.g. iris color, cornea/lens reflectance etc.); further, such characteristics may be based on other circumstances such as detected/determined environmental and/or health conditions (e.g. humid climate and/or hydration determines more reflectance due to water, eye dryness related conditions determines less reflections etc.). The system may use the determined user/wearer (eye) characteristics and/or further conditions in order to properly modulate the emissions/transmissions and/or interpret the (back) scatter (e.g. the user has dry eyes and blue iris the system may emit, condition and/or filter/gate (e.g. allow) photons and/or signals with energy, frequency and/or wavelength on the (upper) range (e.g. ~2.7 ev+, ~650 THz+, 480 nm-) of blue visible spectrum; thus, the (back)scattered energy and/or signal may comprise the modulated/spectra information of the user/wearer iris color as opposed to other regions of the eye. The lens L1, camera C1, projection and/or display surface may incorporate (semantic) optical meshes.

Figure 27:
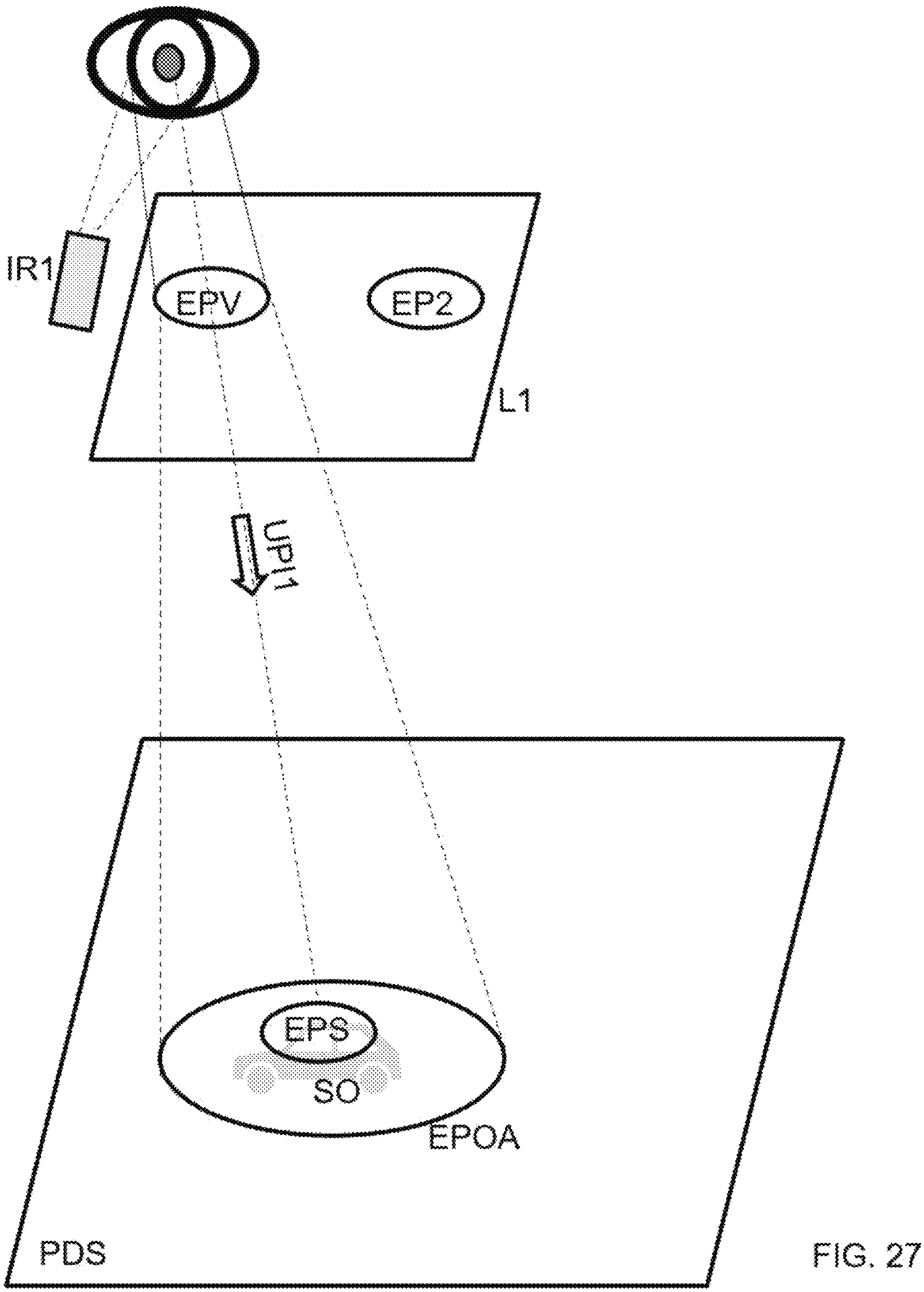
FIG. 27 is an illustration of a field of view mapped to a display surface.

Further, in FIG. 27, 28 the system observes the semantic field of view and detects at the endpoint EPV (mapped to artifacts of L1, as in FIG. 26A) the obturation within a (semantic) time by the pointer (UPI) UPI1 of endpoint EPS mapped to the projection and/or display surface (PDS). Thus, the system infers that the user may have indicated the coherent and/or meaningful hierarchical endpoint EPOA comprising EPS and/or further indicating the object SO (e.g. a (DELOREAN) car; a user control or a button in a user interface WUI etc.). It is to be understood that the system may infer that the user indicated object SO based on a leadership inference at endpoint EPOA; such leadership inferences may be based on circumstances and/or further challenge-response. In some examples, the EPOA comprises a (DELOREAN) car (and its components—e.g. door, hood, wheel, semantic post etc.) and further environmental objects (e.g. vegetation, sand etc.); however, based on circumstances the system infers that the user has selected the (whole) car. If the leadership factorization is not strong/high (e.g. in rapport with the leadership challengers) and/or coherent, then the system may further signal the confusion and/or challenge the user; thus, the user may further pinpoint the selection (e.g. decreasing the projection endpoint EPS by increasing/indexing the distance between the observing entity L1 and UPI1, by collimating with just one eye etc.). The system may factorize confusion when there is no clear leadership between the car, its components or environmental artifacts at EPOA and/or associated endpoints in the selection inferences.

Once an object is detected, further gestures and/or indications from the user may update the selected objects (e.g. move to the left, right, up, down etc.).

Figure 30:
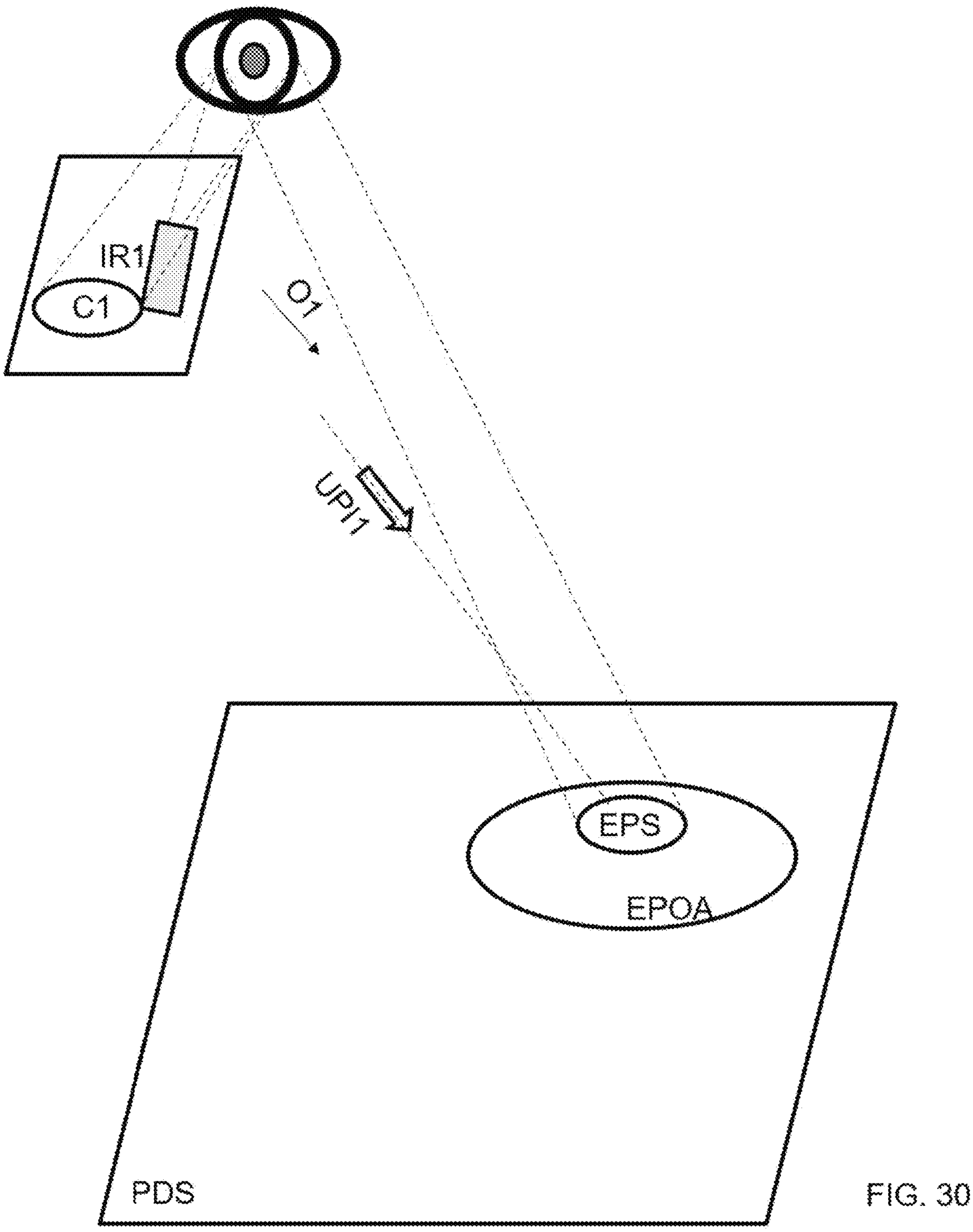
FIG. 30 is an illustration of a field of view mapped to an alternate display surface.

While the preferred indication method may be for UPI1 to align with the iris orientation, lens and/or further center of field of view, in other examples such as in FIG. 30 the system observes in the field of view the orientation and/or direction of the pointer UPI1 and further projects it to the projection and/or display surface within the endpoint and/or projection field of view of the iris and lens L1 when tracing the pointer direction to the projection and/or display surface and within the center of the field of view as the system follows the tracing (iris) movement towards the projection and/or display surface.

While in the depictions the EPS is comprised in the EPOA it is to be understood that in other examples EPS comprises EPOA. EPV and/or EPS/EPOA may be comprised in distinct hierarchical semantic layers and/or views.

The display surfaces may comprise (mounted) projectors, windshield/window, semi-transparent, televisions, other displays or any combination thereof.

It is to be understood that all techniques explained in this application for (semantic) display surfaces and/or meshes may be applied to projection and/or display surfaces and vice-versa. Further, the projection and/or display surfaces may be used to project and/or display information from (distinct and/or particular) video projectors based on technologies such as DLP, LCD, LED, LCOS etc. In further examples, the projection and/or display surfaces are televisions and/or monitors which may or may not incorporate semantic analysis capabilities. The projection and/or display surfaces may incorporate touch type interfaces.

The system may use projection and/or display surfaces to display and render signals, feeds and/or semantic artifacts.

The projection and/or display surfaces may be installed on posts.

In some examples, a post (e.g. SP97) may comprise a (laser/LED/DLP/LCOS/LCD) projector which projects an image to a (projection) screen (supported/hold by S57P). Thus, SP79 (and/or S57P) may adjust its/the position and/or height (of the projector/screen) (module) to (likeably) position the projector in rapport with the screen and/or with the viewers and/or semantic views. In further examples, SP97/S57P (modules) (facets) (physically) anchor/attach to surfaces (e.g. to a wall, ceiling, door, bed frame, luggage, other post etc.) (e.g. in similar ways such as a PDSM, post to post, post to device etc.).

A projector may be incorporated into a PDSM.

The posts modules may comprise a shell of soft materials/compounds (e.g. rubber, foam etc.) to increase (contact) safety and/or decrease hazards for people and/or surfaces.

In further examples, a (laser/LED/DLP/LCOS/LCD) projector may be embedded within a (user) mobile/robotic device.

A PDSM type device may be used to manipulate and/or control (on/off, dimmer/adjustable) switches, wherein the PDSM attaches to an existing power switch and/or power outlet. As such, actuators embedded in the PDSM may control switches (e.g. by touching, pressing, moving and/or manipulating (e.g. up/down/left/right etc.) it to on/off, dim and/or adjust etc.). The actuators may comprise piezo, coil, plungers and/or other actuation components.

The projection and/or display surfaces and/or further artifacts may be collimated, composed, assembled and/or overlay-ed in a hierarchical manner.

Figure 26B:
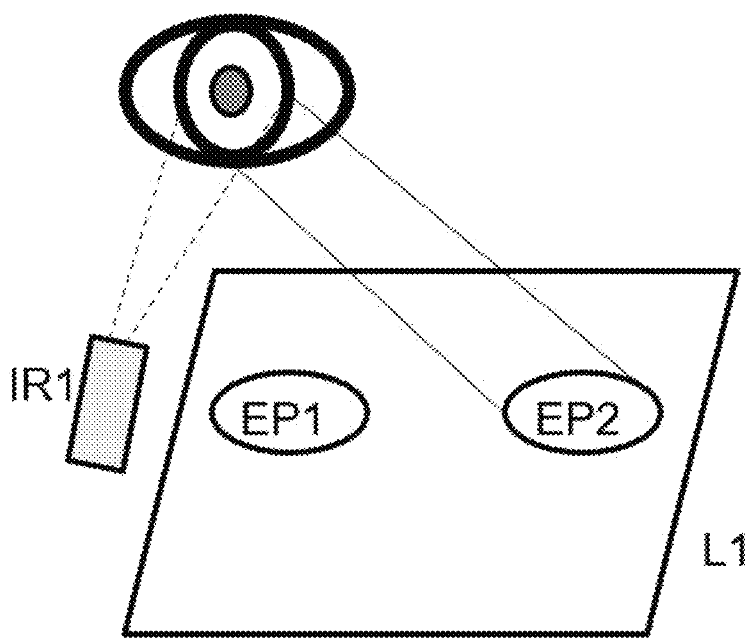
FIG. 26B is an illustration of an observer directing attention to a second endpoint within a semantic field of view.
Figure 28:
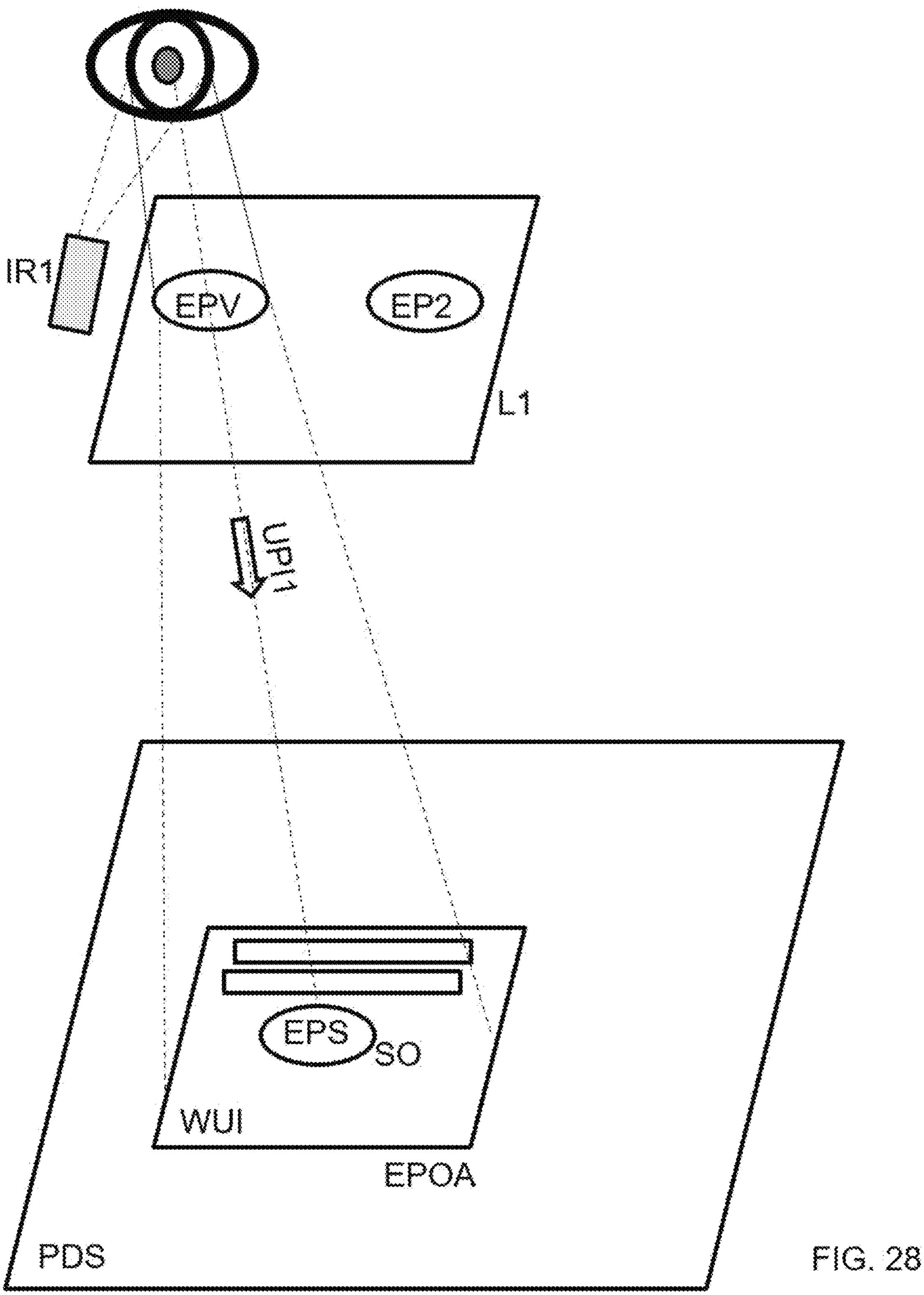
FIG. 28 is an illustration of a field of view mapped to an alternate display surface.

The system may use the projections and/or inferences in FIGS. 26, 27 and 28 based on an observing entity each for each eye (e.g. L1 and L2). Thus, if the system detects that both eyes are open then it projects the endpoints based on intersections between EPSs and/or EPOAs as projected from each eye. The preferable manner is for the system to infer leadership for an eye whether specified by the user, its profile and/or inferred by the system. The user may open/close eyes and collimate the endpoints from either L1 or L2 and possible further sequences; thus, the system further fusion/analyze the inferences and reduce confusion and/or superposition.

The user may be more specific about the selections and/or indications by increasing accuracy of indication and/or further mapping (e.g. by keeping only one eye open and/or further increasing/indexing the UPI1 distance in rapport with the observing entity L1; by discriminating the object—the car, the car without the post, the car without wheels etc.). It is to be observed that the circumstances may comprise a semantic identity, artifact and/or further narrative (e.g. car, car on the beach etc.); further, they may have particular components and/or further artifacts removed and/or invalidated (e.g. car without wheels, car on the beach without wheels etc.).

The system may infer which eye is closed and/or which eye is open based on semantic analysis.

The system may challenge the user to confirm/infirm and/or explain the (inferred) (semantic) fields of view (e.g. IS THE CAR ON THE BEACH, CAR WITHOUT WHEELS?, HOOD OR DOOR?, DO YOU SEE THE CAR ON THE BEACH?, DO YOU LIKE (S3P3)/(CAR ON THE BEACH)/(DELOREAN)?, WHAT DO YOU SEE?, WHERE'S YOUR HEAD?, WHAT DO YOU THINK OF (CAR ON THE BEACH) (DELOREAN) (BEHAVIOR) (APPEARANCE)? etc.). It is to be understood that the user may explain the actions implicitly and/or intrinsically with and/or without being challenged by the system.

The system may overlay the challenges on objects (e.g. car, its components, wheels etc.) and/or associated endpoints where the confusion is high and/or factorization is not conclusive. In further examples, the system overlays (pop-up) user interface artifacts/dialogs on the components and further endpoints allowing the user to validate or invalidate the selection (e.g. by collimating on the overlay artifacts, YES/NO/ENABLE/DISABLE/ON/OFF buttons etc.).

In further examples, the system infers EYE OPEN/CLOSE, ON/OFF and/or further (START/END) BLINK activity by the detection of obturation of sclera, iris, pupil, cornea and/or further eyeball components by the eye lids at (dependent) semantic (superposition) (hysteretic/damped) times; the system may know, learn, detect and/or infer the characteristics/colors/mappings of those components and/or further blinking activity behavior (e.g. superposition, hysteresis, damping, semantic times) in particular circumstances. Further, based on eye blinking, iris/pupil/sclera/cornea obturation/movement and/or other semantic analysis the system may detect dryness, drowsiness, sleepiness, alertness, focus, confusion, hazards and/or other conditions (e.g. for a supervisor, driver, patient, player, performer etc.); alternatively, or in addition, the system may infer the H/ENT semantic artifacts of such conditions.

In the case that the system detects hazard and/or confusion it may challenge the user and/or subject for feedback. In some cases, the system detects non-affirmative conditions of the supervisor/user and/or further decreased/decayed effectiveness of counter measures in rapport with solving confusion, hazard and/or emergencies (e.g. because the supervisor/user has dryness, drowsiness, sleepiness, lack of alertness, lack of focus and/or (temporary/permanent) impairment conditions); in such circumstances, the system may factorize the inputs from the supervisor/user accordingly (e.g. decays and/or factorize the affirmative/non-affirmative trust/risk factors, indexing and/or biases,) at semantic times.

The system discovers leadership artifacts which need to be inferred, met, supervised and/or in possession in order to infer readiness.

During semantic times requiring critical and/or hard route procedures, in order to achieve readiness, the system may counter bias increases in semantic spreads which may divert it to other routes causing it to not follow the procedure steps and/or semantic times.

In some examples, the system augments effectiveness inferences based on a supervisor/user circadian rhythm disruption/hazard which may be further based on the localization of the supervisor/user traveling to various locations and/or time zones and further disruption of sleep patterns.

We mentioned that the system may be under pressure and/or further determine (under) pressure indicators and/or factors. In some examples, the pressure indicators and/or factors may be used to activate mitigations, damping and further relieve pressure. In further examples, they may be used to actuate pressure regulators.

The (under) pressure inferences may increase dissatisfaction, concern and/or stress factors if not mitigated within their hysteretic and/or damping interval.

When under pressure is high and dissatisfaction, concern and/or stress non-affirmatively collapsed (e.g. against system goals) the system may infer a (supervisory) artifact and/or group lack of leadership and/or lack of coordination in the flux network.

Further, when under pressure the system may be biased to not thoroughly follow and/or deviate from routes, rules and/or procedures; thus, hard semantic routes/rules and/or counter measures may be used, (re)factorized, activated and/or retrieved in order to counter bias and further for steering towards following/performing of (critical/required) activities; in some examples, such activities are used to infer readiness factors. The system learns by associating and/or further storing the current activities, hysteresis, damping, superposition and/or readiness values/intervals with inferences and/or further leadership artifacts in the semantic field.

The system may project and/or determine particular leadership activities/artifacts/goals and/or further desirable interactions for their realization (e.g. getting/obtaining/accessing/inferring information, capabilities (from collaborators) etc.). Thus, in order to focus, optimize budgets and/or relieve pressure the system may ignore, filter, mute and/or silence messages (e.g. email, posts, SMS, UPIs etc.), devices (e.g. mobile device, television, PDS, UPI devices etc.), artifacts and/or fluxes which are projected as non (affirmatively) contributing and/or influencing (significantly) the realization of particular activities/artifacts/goals. In some examples, the particular leadership activities/artifacts/goals may be determined based on budgets; alternatively, and/or in addition, they may be determined based on a predefined, predetermined and/or inferred leadership number (e.g. the four most critical activities etc.).

The system projects the leadership activities and further, the artifacts for (successfully) readying and/or achieving them. As such, the system may affirmatively factorize such artifacts, retrieve them from long term storage to short term storage and/or adjust the (expiration) semantic times (e.g. based on readiness, achievement, success etc.).

The system uses affirmative and/or non-affirmative indicators towards the realization of goals and/or confirmation of projections/hypothesis. Thus, the non-realization of goals and/or refutation of projections/hypothesis may be indicated by H/ENT (indicators/factorizations) of the realization of goals indicators and/or confirmation of projections/hypothesis.

The system may project both, realization (or achievement/success etc.) and/or non-realization of desired goals; thus, it may determine leadership artifacts for such projections and take in consideration that, in order to achieve the desired outcome, it may need to FOLLOW/PREFFER/ALLOW the leadership artifacts for the realization of goals and to NOT FOLLOW/AVOID/NOT ALLOW/BLOCK the leadership artifacts for the non-realization of goals.

The system may be biased to acquire/pursue capabilities, activities and/or readiness when they do not significantly impact budgets. The system may counter bias such inferences based on a utility indicator factorized based on the impact and/or leadership of such capabilities/activities/readiness in (projected) have on realization of (strategic) goals.

Wearables, lenses and/or glasses may incorporate cameras and/or other augmentation capabilities for inferring/detecting/collimating user UPIs, activities and/or conditions and further implement counter measures against hazardous consequences of such inferences (e.g. create display, sound and/or vibrational patterns to awaken the user etc.). Further, they may provide renderings, overlays, projections and/or augmentation to the user. It is to be understood that the same techniques used on projection and/or display surfaces may be used to indicate and/or manipulate objects in a room, outdoors and/or other environments. In an example, at least one camera and/or lens observes the environment and uses and/or projects the UPI orientation in an environment towards the indicated area, volume and/or object; thus, the system infers that the projection and/or display surface is based on and/or comprises the indicated circumstance area, volume and/or object. Further, the camera (or another camera) may encompass and/or provide video feeds/streams of the projected indicated area, volume and/or surface and thus, allowing the user to visualize the environment and/or further object selections/manipulations.

Wearables, lenses and/or glasses may be used to select and/or manipulate objects in retail, shopping, healthcare, home and/or any other environments. In some examples, a user creates an interest list by indicating and/or selecting items in an environment, shelf and/or container.

Figure 29:
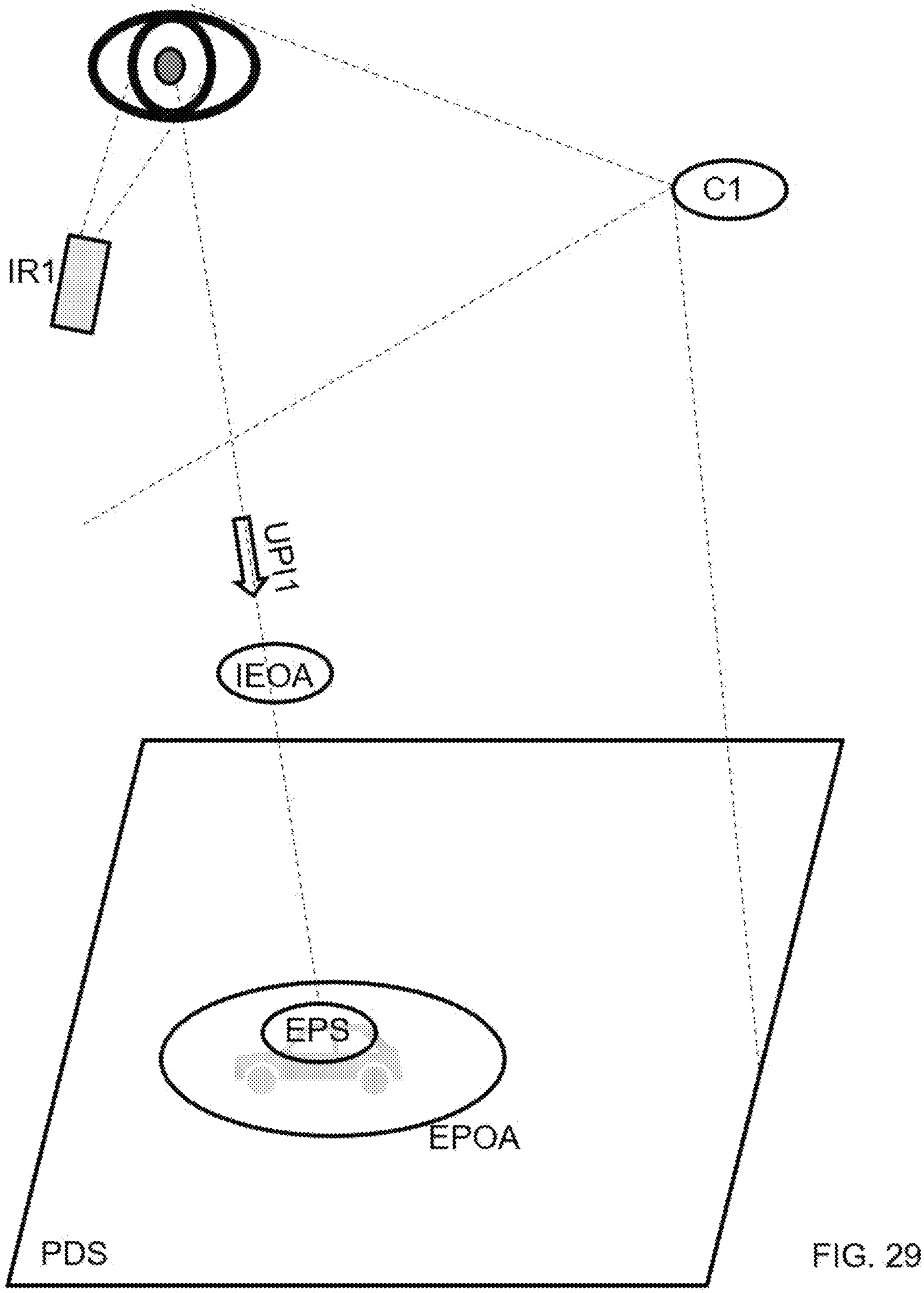
FIG. 29 is an illustration of a field of view mapped to an alternate display surface.

In an example, in FIGS. 29 and/or 30 the camera C1 and/or lens L1 observe the (approximate) orientation O1 of UPI1 and further projects the direction of the UPI1 to endpoint EPOA and/or further surface PDS where the endpoint and/or object OA is located. Thus, the system makes the projection that the user may have indicated at least an object or component from the surface PDS and/or potentially from the object OA. While the system projects the UPI pointing to EPOA it may use intermediary, anchor and/or reference endpoints (e.g. IPOA) projected, inferred in the field of view of C1 and/or L1 tracing the (approximate) direction and/or orientation O1 towards the EPOA. In some examples, the system uses the IPOA as an anchor endpoint while adjusting the field of view of C1 and/or L1 and/or associated semantic views to encompass and/or move from UPI1 to OA/EPOA/PDS.

While the system may infer the semantic identities, projections, surfaces and/or endpoints based on (projected) indications of single objects and/or endpoints alternatively, or in addition, the system infers such semantic identities, projections, surfaces and/or endpoints based on (projected) indications of (semantic) groups of objects and/or endpoints. The system may further use challenges to reduce confusion and/or further discriminate the indicated artifacts. In some examples, the user indicates towards the top of a wall fireplace/shelf comprising, supporting and/or encompassing multiple objects and the system may further infer that the PDS should comprise and/or render the top of the shelf, the objects on it and/or further wall background. Further it may determine the leaders based on inferred circumstances and/or further challenge the user to further point, collimate and/or explain which object, group and/or semantic identity at the top of the shelf is pointing at. It is to be understood that the objects may be people or any other artifacts which may be associated with temporary or permanent semantic identities.

When displaying (or rendering) objects on a PDS the system may display a user interface component associated with an encompassing/container/supporting object allowing the user to indicate, select and/or manipulate them as a group. Further, as a user selects and/or expands the encompassing/container/supporting object the encompassed/contained/supported objects may be further displayed/rendered individually allowing a user to further select and/or manipulate them individually.

In further examples, a user has preferences to display the objects based on various categories and/or semantic identities (e.g. tea pots, credentials, keys etc.) and thus, the computer system renders them under particular categories and/or semantic identities.

The system may store configured access control rules for determining the priority of semantic identities in manipulating a user interface on a projection and/or display surface and/or further semantic identities. In some examples, the system determines that a NURSE IN A CURRENT SHIFT has priority over a NURSE WITH A NEWSPAPER in manipulating a user interface on the CT reading station (or PDS) and thus, it may consider manipulation gestures inferred for the NURSE IN THE CURRENT SHIFT for manipulating the interface on the CT station. Further, the system may not consider and/or infer gestures for the NURSE WITH A NEWSPAPER if is determined based on the (access) control rules and/or supervisor hierarchy that the NURSE IN THE CURRENT SHIFT has priority in manipulating the user interface on the projection and/or display surface (e.g. CT reading station); alternatively, or in addition, the system may infer gestures for the NURSE WITH A NEWSPAPER but doesn't apply and/or transfer them to the PDS and/or user interface; alternatively, or in addition, the system may discard and/or invalidate inferred gestures for the NURSE WITH A NEWSPAPER. In further examples, the NURSE WITH A NEWSPAPER and NURSE IN THE CURRENT SHIFT are both assigned to Jane and thus, the system provides Jane with all access and/or supervisory rights of the two semantic identities. In some examples, a semantic identity is associated with a blurring semantic identity.

It is to be observed that the supervisory rights and/or (access) control (rules) may comprise and/or refer to semantic identities of (groups of) PDS s which may include and/or be substituted for/to semantic identities of (groups of) container/contained/attached/embedded/connected computers, consoles, devices, components, modules; associated/stored/displayed/container/contained applications; associated/stored/displayed/container/contained user interface objects (including comprised/contained user interface objects); and/or any (composed) semantic identities and/or (any) (associated) groups thereof. Analogously, semantic profiles may comprise preferences referring to and/or matching such semantic identities.

As such, when referring to control of/and/or manipulation of a (displayed) user interface on a projection and/or display surface it is to be understood that this may entail assessing whether the supervision and/or control is allowed/disallowed and/or matches semantic identities (such as those specified above and/or) associated with at least one (container/contained/attached/embedded/connected) (group of) PDS/computer/console/device/module/(work) station, (associated/stored/displayed/container/contained) applications/user-interfaces (objects) and/or any semantic groups thereof. In some examples, the system assesses/matches control and/or supervisory (rights) for the "CT reading workstation", "CT device", "CT Image Viewer", "3D Scanner UI application", "Home View"->"HVAC Controls", "Home View HVAC Controls", "Home View HVAC Controls Settings", "CT Image Viewer on the CT reading workstation" etc.).

It is to be observed that the allowed/blocked control may extend to contained and/or supervised/managed objects, modules, devices and/or artifacts. Such control may be associated with the container/contained diffusion and/or access control. In an example control over a "CT Image Viewer" comprises control over all the (displayed) user interface objects within the/a CT Image Viewer (application/rendering/(UI)control/object) and/or supervised/managed UI objects. Similarly, control over a "CT reading station" encompasses control over the stored/contained/managed "CT Image Viewer" (application) unless otherwise specified and/or matched by a control and/or supervisory rule (e.g. such as rotation blocked on the CT Image Viewer for a non-tech/non-MD). Further, it is to be observed that in some embodiments, supervisory control and/or activities may be associated with managing (resources for) a (contained/stored/running/displayed) application/UI/object/module/device.

The (supervisory) control may applied and/or diffused hierarchically with potentially further rules modifying and/or change (the entropy of) the diffusion.

The physical object and the user interface object on the projection and/or display surface may be represented as the same semantic identity and/or artifact in the physical-virtual environment. Alternatively, or in addition, the physical object and user interface object on the projection and/or display surface may be represented and/or associated with different (composite and/or temporary) semantic identities and/or artifacts (e.g. the bottle on the fireplace, the projected bottle on the fireplace etc.).

The system may restock shelves using the semantic posts and/or semantic manipulation using UPIs. In some examples, the system may (re)place items and/or restock them when the balance, likeability and/or budgets at a particular location are decayed and/or to further increase likeability.

The PDS may comprise a (capacitive/resistive) touch (screen) interface and the user may further specify selections (amongst a group of inferred and/or rendered artifacts) and/or augment the system based on touch gestures and/or selections.

The system may challenge and/or confirm with the user the projection surface, selection, focus and/or manipulation via video feeds/streams, voice and/or other modalities.

In some examples an observing camera and collimation lenses are embedded into a single unit.

In some examples, the system may use undershoot/overshoot inferences to further determine endpoints projections and/or selection.

It is to be understood that the user hand, arm, fingers, eyes/irises/pupils and/or further delimited areas may be mapped to semantic artifacts.

The system may detect the user's goals by inference on user pointer/pointing indicators (aka UPI). The user pointing indicators may be associated with hands, head, eyes, irises, pupils, fingers and/or further movement, fields of view and/or orientation. In some examples, the user pointing indicators may be associated with wearable sensors (e.g. attached to user pointing indicators; lenses; glasses; cameras etc.); in further examples, they may be associated with other devices.

The user pointer indicators may be used as indicators of the user augmentation, trajectories, goals and/or feedback in the environment and/or further circumstances.

The system may associate user pointer indicators with semantic indicators and/or vice-versa and further use them in semantic analysis.

The system may use user pointer indicators and further inferred pointing directions/trajectories as orientations in the semantic field and/or semantic analysis.

The system may update/refresh the indicated endpoints and/or further associated artifacts on the display surface based on semantic analysis and/or semantic time associated with inferences on UPIs. In some examples, the system updates/refreshes particular user interface objects and/or artifacts in order to preserve coherency (e.g. within an interval), increase likeability/desirability and/or decrease confusion. In further examples, the system may refresh particular scenes, views, layers and/or an entire projection and/or display model layers and/or surface.

The system eliminates the boundaries between the physical and virtual environments by allowing users to manipulate objects in a consistent way in the composed environment which is based on a fusion-ed (hierarchical) semantic network model. As such, the system may point, select, drag and drop objects from the physical environment to projection and/or display surfaces and vice versa. In an example, the system indicates, drags and drops a tea pot from the projection and/or display surface to the fireplace shelf and thus the system may further retain the goal of having a/the tea pot on the fireplace shelf; in case that the tea pot is an existing object in the environment (and/or relevant fluxes) the system may further detect it and further move and/or track (e.g. by camera C1) the tea pot to the desired location by using semantic posts grip/carry/manipulation/movement; further, if the tea pot is not available in the environment the system may (issue) order/purchase the desired tea pot from the (flux) network and/or sites. While the example has been made of manipulating objects from the projection and/or display surface to the physical environment it is to be understood that analogously, the manipulation may occur in any combination within/between objects and/or artifacts in the physical environment and/or projection and/or display surface. (e.g. views within the projection and/or display surface displays the first floor fireplace (shelf) room/environment and the second floor fireplace (shelf) room/environment and the user and system manipulate objects between environments/(shelves); the user and/or system may indicate the physical object (e.g. on the fireplace shelf) and further drags/grabs/grips/place it to a physical and/or rendered table.

When rendering the environment the system may render the actual environment and/or the desired manipulated environment (e.g. renders the fireplace shelf with the tea pot even if the tea pot is not actually physically there). The user may specify and/or augment the system with what kind of environment wants to render; alternatively, or in addition, the system seamlessly renders the environments based on inferences and/or profiles; further, the system may augment the user on the type of environment.

While a projection and/or display surface has been exemplified, it is to be understood that the virtual environment may comprise multiple projection and/or display surfaces. Further, each projection and/or display surface may comprise multiple (semantic) views and so on.

Projection and/or display surfaces may have associated and/or assigned semantic identities and/or further inferred semantics.

The system infers the indicated and/or pointed objects/controls based on the analysis of superposed endpoints and/or obturations by the user hand, arm, finger and/or associated semantic artifacts as detected/mapped/composed/analyzed by/at/based on the observing entity (observing field of view and/or orientation) within the pointing and/or indication activity and/or semantic time.

The system may perform semantic analysis, composite inferences, (semantic) projections and/or mapping of/between the displays, UPIs, observing semantic artifacts and/or profiles.

The user may use collimation, indication, pointing, orientation and/or localization to indicate and/or select artifacts and/or semantic groups in the environment; further, the user may use various inputs and/or modalities (e.g. sensor/endpoint movement, gesture, voice etc.) to indicate further semantic identity discrimination and/or actions that apply to such artifacts and/or semantic groups.

The user may indicate, point, localize, collimate and/or specify semantic groups of artifacts and/or composable semantic identities.

The user may indicate assembly endpoints and/or areas using collimation, pointing and/or localization techniques.

The system may infer composable semantic identities based on the indication and/or collimation by the user of semantic groups of artifacts. In some examples, the user indicates by a hand gesture oriented and/or collimated (endpoints) (mapped) towards and further downward direction of a stacked group of speakers indicating that the speakers need to be shut/turn down/off; thus, the system may infer, challenge and/or acknowledge that the speakers on the left side of the window need to be shut/turned down/off.

The composable semantic identities may be used to further specify the localization and/or capabilities (e.g. the speakers on the left side of the window, the chair by the window, steering (front) wheel, front wheel etc.).

The system may determine and/or collimate on particular semantic units associated with particular semantic identities and/or semantic shapes. In some examples, the system infers and/or is instructed to collimate on "the chair by the window" and based on the circumstance (e.g. user being immersed and/or watching a display and/or further sale and/or furnishing simulation) the system may collimate on the circumstantial object (chair).

The system may collimate cameras and/or sensing entities in the environment and based on the collimation orientation, semantic flux, semantic shaping and/or further semantic analysis associates particular semantic units and/or fluxes with the objects in the environment as detected by a camera and/or sensing entities. In some examples, the system orients the sensing entity (lens/camera/observing field of view) in a retail store and based on sensing, communication, localization, semantic identification and/or semantic shaping determines various semantic units, shapes, semantic identities and/or further associations (e.g. between semantic units and/or shapes associated with a component, item, article, module, robotic post carrier—e.g. S3P3—and/or further cargo). As such, the system overlays and/or renders on the display information associated (e.g. based on an identified, ad-hoc and/or accessible semantic flux/stream and/or further semantic analysis) with the identified and/or further collimated objects and/or associated semantic units. Further, the system may use collimation and/or overlay manipulation for further inferences.

In further examples, the user may explain the semantics of particular movements and/or gestures. Alternatively, or in addition, the system may use writing gestures and/or voice to explain another gesture. In an example, the systems infers by sensing based on a wearable and/or optical sensor that the user has specified ORDER MY FAVORITE FOOD FOR THE MOOD and further specified the gesture for such command; it is to be understood that between the gesture explanation and/or the shortcut gesture the system may require a particular character (e.g. '/', '-' etc.), period of time and/or a sematic time.

The gestures may be comprised in semantic profiles (entries) and/or preferences which may be (further) communicated/applied (to/by a display controller) in particular circumstances and/or (configured) endpoints. Further, in case that multiple users use gestures at an endpoint the system may become confused which gesture to apply; in this case it is to be understood that it may apply the precedence associated with supervisors, indications and/or handovers in a potential hierarchical manner.

Further, it may augment the supervisor regarding the confusion and thus, allowing the supervisor to take/approve/allow actions/activities to reduce confusion (e.g. augments/asks/waits (for approval of) Jane to let John in control (of the TV), can I change the channel as John indicates etc.).

Alternatively, or in addition, the supervisor (proactively) reduces confusion (e.g. let John to control the TV for the duration of the game final, don't let John to control the CT viewer application+/−30 mins or Jane arrives etc.). As such, in some examples, the control access may be based on more general and/or further on more specific and/or localized semantic identities (e.g. John can control the TV and/or any user interface with the exception of the CT viewer application etc.).

The gestures/signs may be configured and/or stored (e.g. in a semantic profile, memory and/or (via) (comprised/associated/UI) entries/field(s)/fluxes etc.) as (video) snippets, sketches, (associated) semantic (s) (shapes) and/or narratives. As such, when transferring/diffusing semantic profiles (entries/fields) and/or (associated) gestures/signs (e.g. between a device and the system, two devices, fluxes etc.) the system may transfer/diffuse at least one of the above.

A semantic profile may store at least one gesture(s)/sign(s) associated with at least one configured (target) semantic identity; thus, a semantic profile may comprise at least one configured preference (and/or entry/entries/field(s)) associated with the at least one configured (target) semantic identity (e.g. "TV screen", "tea pot (on the fireplace)", "main fireplace", "fireplace in the great room", "non-gas fireplace", "poinsettia tablet" etc.).

When communicated, published and/or diffused, a semantic profile (associated flux) (entry) may be transferred/communicated/published/diffused with all its configured preferences and/or only with particular preferences which are relevant to actual semantic identities, endpoints and/or further semantics. In an example, a Jane's semantic profile may comprise configured gestures for "CT room", "CT imaging station" and "MRI imaging station". However, only the CT imaging station preferences are (flux) communicated and/or diffused to a CT reading endpoint and/or (associated) CT reading station based on a (factorized/optimal/closest) semantic matching/drift between endpoints semantics and/or semantic identities with/within the at least one semantic profile preference (e.g. matches "CT reading station" with "CT imaging station"). Alternatively, or in addition, preferences for "CT room" may be transferred/communicated based on a matching between "CT room" and "CT reading endpoint" associated with the endpoint. When confused and/or in superposition on which preferences to apply the system may augment and/or challenge the user and/or device. Alternatively, or in addition, the system may challenge (at endpoints) Jane and/or Jane's device to provide/accept the (selection of a) semantic profile (preference(s)) based on particular (inferred) (actual and/or challenge) semantic identities (at endpoints).

Alternatively, or in addition, semantic profile (gesture) preferences and/or entries comprise (at least one) explanatory/descriptive (gesture) narratives (of the gestures) which may (further) comprise and/or be associated with (configured) (target) semantic identities (targets), endpoints, activities, commands, goals, purpose and/or (further) associated narratives. Such explanations and/or descriptions may comprise narratives descriptive of the gesture, purpose and/or goals (of the/a gesture/capability/interest). Further, they may encompass narratives comprising (further) activities and/or commands.

Alternatively, or in addition, a semantic profile specifies only gestures semantics without any explanatory assignment and thus, the system (or display controller) assigns them to the user and/or challenge and/or augments the user on the assignment and/or to assign them.

Alternatively, or in addition, a semantic profile specifies gestures semantics with explanatory assignments which may generate confusion/superposition and/or are not applicable (e.g. based on the inferences, rules etc.) and thus, the system (or display controller) assigns them to the user and/or challenge and/or augments the user on the assignment and/or to assign them.

The system may suggest (to a user) assignments of the gestures (semantics) to manipulation commands and/or activities. Alternatively, or in addition, a user may select the gesture semantics and assign them to (suggested) manipulation commands and/or activities and/or vice versa. Alternatively, or in addition, a user may connect/link the gesture semantics with (suggested) manipulation commands and/or activities and/or vice versa.

For simplicity, (alternatively, or in addition to (matching (between)) semantic identities, capabilities, interests) explanation(s), purpose(s) and/or goal(s) can be used (interchangeably) for (semantic) matching purposes.

Subset and/or overlap semantic profiles are profiles comprising the same and/or similar preferences, semantic identity/identities and/or gesture(s).

A semantic profile transfer (in regards with preferences associated with a semantic identity) may encompass and/or be substituted for/to a plurality of subset/overlap semantic profiles transfer(s) (in a potential hierarchical manner).

When mentioning a transfer (and/or send, receive, communicate etc.) of a semantic profile it is to be understood that it may encompass and/or can be substituted for/to a plurality of transfers (and/or send, receive, communicate etc.) associated (each) with at least one of a subset/overlap semantic profile(s).

In some examples, Jane enters a CT ROOM and her mobile device (flux) (expresses/publishes interest of rendering a CT cine clip, (and/or) manipulating a CT reading station/CT Image Viewer). Thus, the system may match the interest with a capability (e.g. published by a CT station) and/or (further) matches and/or challenges for/on a semantic profile (flux) (for a CT reading station/CT Image Viewer preferences/interests). Alternatively, or in addition, the (corresponding) semantic profile is published/diffused/communicated/fluxed to a display controller wherein the semantic profile comprises particular (e.g. associated with a CT room/CT reading station/CT Image Viewer etc.) entries (e.g. gestures etc.). Alternatively, or in addition, the semantic profile comprises unassigned, available and/or published entries (e.g. such as unassigned, available and/or published gestures). It is to be understood that the entries/interests may be made available, published and/or diffused based on the publishing and/or access control/diffusion and/or resonance analysis and/or rules. Alternatively, or in addition, the system matches the published/diffused interests (e.g. of semantic profile entries/gestures) with the (flux) capabilities (e.g. of (PDS) (rendering) devices (at endpoints)).

In some examples, the gestures semantics and/or (associated) entries may be published and/or diffused through a semantic flux as interests to be matched against other fluxes capabilities (e.g. of devices, at endpoints etc.). As such, the system uses semantic matching, (flux) coupling and/or any other technique coupling interest with capabilities.

It is to be understood that a transfer of a semantic profile (e.g. from a mobile device to a display controller etc.) may encompass transmittal/diffusion of the profile gesture entry/entries and/or field/fields, connecting (associated) (manipulation) (hierarchical) (interest/capabilities) fluxes/devices/interfaces/controls/objects and/or further presented diffusion/transfer/connection techniques. Alternatively, or in addition, multiple subset/overlap semantic profiles (comprising/associated with the same semantic identity/identities and/or gesture(s)) may be transferred; as such, (when/the mentioning) (of) a semantic profile transfer (it) may encompass/comprise (a plurality of) such subset/overlap semantic profiles transfers.

Subset and/or overlap semantic profiles comprise preferences associated with the same and/or similar semantic identity/identities and/or gesture(s).

When mentioning a semantic profile transfer it is to be understood that it can be substituted for/to a plurality of transfers associated (each) with at least one of a subset/overlap semantic profile(s).

In further examples, TAP PRETTY FAST TWICE (IN A CT AREA) (gesture) (identity) may be associated with an activity/command and/or (further) purpose/goal narrative FAST FORWARDS THE CURRENT CINE CLIP ON THE (CT) IMAGE VIEWER while located within a CT room and/or manipulating a user interface on a CT reading station. As such, the system (and/or a (display) controller, camera etc.) may determine that the user is in a CT room and/or CT AREA and/or that the user performs the gesture by matching it to the inferred gesture semantics and/or shapes; as such, the system may perform the activity/command (e.g. FAST FORWARDS THE CURRENT CINE CLIP (ON THE (CT) IMAGE VIEWER)) and/or forwards/diffuses it to a/an (contained/container) endpoint, module/application, device and/or flux capable (or/of having/publishing the capability) of performing it and/or matching (it) (with) the (configured) target (e.g. CT IMAGE VIEWER).

Alternatively, or in addition, the system may match the goal/purpose/interest of the gesture with the goal/purpose/capability of a user interface object/control (flux) and selects the user interface object/control and/or (further) forwards, diffuses and/or applies the activity/command to/by a/the display controller (flux) (and/or further) (to the user interface (object/control) (flux)).

Typically, the system selects/applies firstly the preferences based on ordered matching (e.g. ordered by lowest drift) between semantic identities and/or best localization within a hierarchy.

When confused on which/whether preferences are applicable the system challenges for feedback and/or augment user/supervisor devices/fluxes.

When selecting and/or applying the preferences the system may check (access) control and/or publishing rules for endpoints. In examples, (at) a CT reading endpoint (supervisor) may block and/or do not allow/consider (or discards) gestures associated with rotation by a "non tech/(non)MD" semantic identity (and/or allow rotation only by a "(CT) tech/MD" semantic identity); as such Jane (as a nurse—non-tech/non-MD) may not be allowed to rotate/annotate an image on the CT reading station (at the CT reading endpoint) based on her profile rotational gestures.

The system may control access and/or manipulation (at endpoints) of user interface objects/controls based on user interface objects/controls semantic identities, their purpose (narrative/description) and/or associated capabilities and/or activities. In further examples, the system may not allow and/or denies Jane access to a "rotate/annotate image" (purpose/identity/capability) (UI) button (and/or hides/disables it) while allowing access (and/or shows/enables it) for a tech/MD as per supervisory and/or (access) control rules.

Similarly, in further examples and/or embodiments, the system may apply (access) control and/or supervisory rules and/or hierarchies to allow/deny/enable/disable/apply/manage (actions/activities/resources/capabilities/interests on) physical buttons, trackballs, mouses and/or other devices having a matched purpose, identity and/or capabilities.

As mentioned, the control and/or supervisory may be applied/diffused hierarchically from the container to contained, unless otherwise specified. In some examples, supervisory/control is configured and/or determined to be allowed to a non-tech/non-MD on a trackball/display device (and/or associated fluxes) and thus, to comprised/contained components/modules/buttons/controls (and/or associated fluxes) except to components/modules/buttons/controls (and/or associated fluxes) which allow and/or publish capabilities of rotation/annotation of (the displayed/managed) CT images. Alternatively, or in addition, a (published) flux hierarchy resembles the container/contained hierarchy and the system implements the supervisory/control based on controlling access to the (published) (hierarchy of) fluxes (and/or associated capabilities/interests).

In general, the system applies access/diffusion control while matching (flux) interests with (flux) capabilities and/or connecting/diffusing (through) fluxes. Interests and capabilities are matched (and/or flux coupled/diffused) only if their associated (flux) publishing/access matches and/or allows it.

In some examples, interests/capabilities are associated with display and/or manipulation of (user) interfaces/devices. Alternatively, or in addition, the interests and/or capabilities may be associated, published and/or diffused through (associated) (hierarchical) semantic fluxes which resemble the hierarchies of container/contained, compositions, identities, structure, storage, endpoints, assembly, supervisory and/or other hierarchies presented in the application.

The system may compare the (actual) inferred gestures/signs with the configured gestures/signs and determine similarity. The gesture similarity may be based on any techniques such as explained in this application.

The system may select particular artifacts (e.g. on a screen, in the room etc.), objects, areas and/or endpoints based on the writing and/or other gestures (e.g. the user writes/specifies THE BUTTON ON THE TABLE, THE CHAIR BY THE WINDOW etc.). Alternatively, or in addition, the system may use indication and/or collimation techniques to specify, select, manipulate and/or observe particular artifacts (e.g. on a screen, in the store/room etc.), objects, areas and/or endpoints. The system may perform tracking of components, modules and/or posts and/or further composes and/or infers semantic groups, semantic identities, semantic budgets, mission readiness and/or completion. In some examples, the system determines and/or pursues composable capabilities, components, modules and/or further posts; further the system routes them from/within the supply chain to determined composition/assembly/meeting endpoints.

Once at a composition assembly endpoint (e.g. within a budget and/or semantic time) the system performs semantic factorizations and/or further infers semantic groups of (required/reasonable/likeable etc.) capabilities, semantic identities, modules, parts, posts and/or further assembly readiness factorizations. It further notifies (e.g. via augmentation, flux/gate) a user/assembler of the assembly readiness (factorization) and/or assembles the components within a budget and/or semantic time; once composed ready (e.g. as inferred by the system through sensing, fluxes and/or semantic post/module interconnects, challenge-response, semantic factorization, quality, test and/or further analysis) the system may infer the composite semantic identity/capability. Once a composition semantic identity/capability is inferred the system may determine that the assembled identities/components/modules/posts are comprised within the composition semantic identity/capability. Challenge-response with collaborators within and/or outside a mission may determine further inferences, renaming and/or associations of the compositional semantic identity/capability. Further, the system may determine the gating for missions, composite semantic identities/capabilities and/or endpoints and/or further publishes, gates and/or budgets the composed capabilities and/or semantic identities.

The system may allow/disallow the access, ensemble, positioning, locking, connecting and/or loading to/of components, modules, posts, cargos and/or other artifacts based on semantic analysis including access control.

The semantic components may explain to each other the meaning of various inputs, outputs, signals, characteristics, movements, localizations, behaviors and/or further challenges. In some examples, the explanations may be based on redirecting the learner (by the explainer and/or based on a explainer challenge) to a repository and/or address (e.g. site, page, channel, account, semantic identity, document, paragraphs etc.) comprising the explanations.

The system may transfer, enable/disable and/or validate/invalidate semantic network models, semantic artifacts, wallets, authorizations, credentials and/or further profiles to the composed semantic identities and/or artifacts. The transfer may happen between the start and end of an activity if the system requires the (partial) assembly capability in order to complete the particular and/or related inferred activities and/or start further activities. Thus, at any particular (semantic) times only relevant capabilities, are allowed and/or pursued at the assembly and/or assembled. As it can be observed the start/end superposition/hysteresis/activity (time) intervals and/or (further) routes may comprise other components/activities start/end, start/completion and/or similar and/or further semantic identities; as such, the system may transfer, enable/disable and/or validate/invalidate artifacts based on flows of semantic route activities (and/or associated semantic times) and/or further sematic analysis.

The system may perform access control on enclosures and/or interconnects comprising modules. It is to be understood that the access control may be based on sensing, biometrics and/or further techniques such as explained and/or cited in this application.

The system may observe the environment, procedures and/or protocols of the assembly and infers and/or factorizes a quality indicator/factor based on whether they may follow procedures, protocols, pose hazards and/or risks to the assembled artifacts and/or (associated) capabilities. The assembly quality factors may be further used to determine composed readiness (indicators/factors) and/or insurance premium factorizations.

The readiness may be factorized based on success, failure, approval and/or other similar indicators and/or factors.

The readiness/non-readiness may be further associated via semantic artifacts with enable/disable, activate/cancel, ON/OFF, ALLOW/BLOCK, DO/DON'T, YES/NO, START/END, START/STOP, validate/invalidate, follow/don't follow and/or similar type inferences.

The system may allow the assembly activities to pursue only when readiness gating criteria are met and/or readiness factors are higher than a threshold and/or within an interval; in such cases, the system may turn a readiness indicator to on and further allows, notifies, challenges and/or pursues the assembly activity and/or actors. When the readiness criteria is met/not met the system allows/blocks the assembly activity and/or further provides explanations on why the readiness is on/off and/or superposition.

Readiness factors may be based on indicators, factorizations and/or further inferences such as likeability, hazards, risks, success, failure and/or similar.

Readiness may be based on starting an activity while having the particular semantic identities required to complete the activity and/or goal (e.g. move a car requires to have a key or wallet).

In further examples, the system may activate/deactivate/enable/disable components, modules and/or posts. The system may determine the components, modules and/or posts by location and/or selection (e.g. user pointing, gestures etc.).

The system may induce, determine, publish and/or diffuse (capability/artifact) readiness based on semantic gating and/or further semantic artifacts having low drift, shift, orientation and/or entropy from the readiness semantics. In some examples, the system publishes (S2P2) (AT) (EP1) READY TO ANALYZE, CRITICIZE AND/OR PRAISE JANE's HEALTH AFFAIRS ARTICLE ANALYSIS. In further examples, the system publishes (S2P2) (SU1) (AT) (EP1) FAILED (TO CONNECT) (AND/OR) (TO ENSEMBLE) (TO BE ENSEMBLED), (S3P3)/(S2P2 AND S2P3) COULD NOT BE ENSEMBLED AT/BY (EP1) (S3P3), EP2 AND EP3 COULD NOT BE ENSEMBLED AT EP1, S3P3 ENSEMBLE (SUCCESS)/(FAILURE)/(BLOCKED)/(BLOCKED BY/AT S2P2)/(NOT ALLOWED)/(NOT ALLOWED BY S2P2)/(NOT ALLOWED BY S2P2 BUDGET/BEHAVIOR/RULE/ROUTE/CONVICTION/CAPABILITY/READINESS)/(NOT ALLOWED BY S2P2s LATCH/HOOK), S3P3 WAS SUCCESSFULLY BUILT/ENSEMBLED (FROM S2P2 AND S2P3), FAILED TO BUILD S3P3, S3P3 BUILT IS BLOCKED (DUE TO THE ABSENCE/CONVICTION/READINESS OF S2P3), S3P3

BUILT IS UN-BLOCKED/READY (DUE TO ARRIVAL) (AND CHALLENGE/PERSUATION) (OF)/(BY) (S2P2) (OF)/(BY) S2P3) etc.

It is to be understood that in the examples throughout this application, the semantic compositions of multiple variants comprised between brackets whether implicit/intrinsic or not are preferably coherent and/or with low confusion factors.

We mentioned that the system may infer elevated confusion circumstances in relation with goals and/or artifacts. The system may pursue confusion reduction at various semantic times and by various means. In some examples, the system records the confusion/confused goals, behaviors, route/trails and/or further artifacts with further explanations, renderings and/or related artifacts on what/why/when/how/where the confusion is/occurred. At a later semantic time the system may revisit such confusion inferences and potentially pursues confusion reduction by leveraging newer inferences and/or further related artifacts. In some examples, the system stores descriptions, renderings, multimedia, sub-models, semantic trails, DNA signatures and/or further artifacts to remember and/or keep track of confusion, explanations and/or related artifacts.

The system may infer, determine, publish and/or diffuse readiness/non-readiness, completion/non-completion (e.g. of a goals, route etc.), achievement/non-achievement and/or further similar inferences; in some examples, such activities are associated with semantic artifacts. It is to be understood that the intrinsic behavior of semantic artifacts may be also be considered; as such, the system may or may not publish intrinsic behaviors. Further, the system may publish only particular polarity and/or entropy (e.g. publish readiness/completion/achievement but not publish non readiness/completion/achievement).

The system may project success, failure and/or further associated superposition intervals based on readiness/non-readiness, completion/non-completion (e.g. of a goals, route etc.), achievement/non-achievement, approval/not approval and/or further similar inferences and/or combination/composition thereof. Further, it may project what needs to occur and/or to be done to steer and/or orient to success and/or failure within the semantic superposition interval, endpoint, view, flux/network and/or (observing) field/environment.

In some examples, the allow/block, readiness/non-readiness, completion/non-completion, achievement/non-achievement, accepted/not accepted, approval/not approval and/or further similar inferences and/or artifacts may be based, associated and/or comprise supervisory activities, artifacts and/or semantic identities.

The readiness/non-readiness may be inferred based on the composition of further indicators (e.g. quality, likeability etc.) at (assembly) endpoints and/or further routes.

The likeability indicators may be factorized based on quality indicators at assembly endpoints and/or routes. As such, the system may affirmatively/non-affirmatively factorize likeability indicators associated with artifacts if the quality indicators associated with the artifacts are affirmatively/non-affirmatively factorized.

The system may also use likeability indicators in order to infer readiness, project/pursue compositions and/or assembly of artifacts and/or capabilities.

The system uses overshoot and/or undershoot for managing expectations, success and/or failure (e.g. realizations within overshoot and/or undershoot).

As mentioned, the system uses various projections, routes and/or rules for generating expectations of realization/non-realization, success/failure and/or further undershoot/overshoot intervals. During projections the system may determine worst case/best case and/or overshoot/undershoot scenarios and thus the expectations, factors, orientations, semantic (superposition/hysteresis/damping) time/indexing and/or further artifacts may be based on slightly and/or low drifted/shifted/entropic artifacts comprising the middle of the interval and/or endpoints of such projections.

The system may publish success and/or failure of goals, readiness, ensemble of semantic identities etc. In further examples, the system publishes and/or gates the explanations, causes, plans and/or further routes of success and/or failure.

The system may provide and/or be provided with explanations on/of what/why/when/how/where success and/or failure is whether complete or partial (e.g. within a superposition (time) interval). Thus, based on circumstances the system may determine whether to strive, allow, diffuse, continue and/or block/wait based on complete or partial realization. In some examples, the system projects that the risk of not-realization is low at particular semantic time (s) and hence pursues, allows, diffuses, unblocks related and/or other inferences by assuming the required, resonant and/or complete realization. If the realization doesn't occur (in a semantic time) the system may further use prior alternate routes/projections, project inferences and compares associated artifacts with the projected realization related artifacts. The system may publish blocking/obstructions and/or non-blocking/promotors of goals, readiness, ensemble of semantic identities etc.

Challenge-response communication may be augmented with explanations of what/why/when/how/where particular inferences, activities and/or readiness could or couldn't be completed. The augmentation may comprise further explanations on budgets constraints, access and/or further semantic times.

The responses to challenges to particular collaborators may comprise unknowns and/or semantic superposition intervals (e.g. a challenge to entity B such as "are you infected" might determine a (superposed) response of "unknown"/"don't know"; further, it may determine superposition at B and/or semantic times related with "I am potentially infected, how to find out for sure (e.g. eliminate superposition) and/or achieve non-infection and protection (readiness) using particular activities".

The semantic posts and/or (composite) carriers may be used for virtual shopping and/or in virtual (retail) stores. As such, the semantic posts move and/or roam around a physical and/or virtual store, warehouse and/or another facility and let the user to remotely observe, select, pick, carry and/or pay for goods.

In further examples, the semantic robotic devices may be used in virtual healthcare and/or hospital environments. In some examples, the robotic devices augment imaging modalities, surgeries, patients, logistics and/or other operational needs.

In other examples, the semantic robotic devices may be used in sporting events such as attending physical and/or virtual sporting events. It is to be understood that potential ticket purchases may be based on semantic flux bargaining and/or budgeting as explained in this application. Further, the semantic robotic devices may interact and/or communicate with coaches, players and/or associated semantic robotic devices before, during and/or after sporting events.

The semantic robotic devices may interact, communicate, publish, post, gate and/or act on behalf of its temporary/permanent user (s) and/or semantic groups thereof. Further, they may be given access to its user (s) and/or semantic groups credentials, wallets, accounts, channels, feeds, fluxes, streams potentially in an access controlled and/or gated manner.

The semantic posts may be suggested, marketed and/or rented at venues and the user accesses the storage location and/or enables the devices based on access control, credentials, wallet and/or further received/generated authorizations. In some examples the system suggestions/marketing is based on (semantic) targeted/channel/flux/stream/video augmentation, likeability, mission and/or further resonance augmentations; alternatively, or in addition, renting applications and/or flows may be used and/or coupled with the suggestion/marketing semantic artifacts. Once rented, the system and/or user may transfer additional semantic artifacts, tickets, access, routes and/or profiles to devices in order to enable those to roam within the allowed facilities and/or behave based on user preferences. A user may return the devices at particular drop-off locations and further rate them, particular usages, characteristics and/or semantics; further explanations may be provided.

In some examples, the robotic devices are assembled at the (renting/provider) venues based on user/renter preferences and/or requirements.

The user, owner, supervisor and/or system may guide the behavior of posts in venues. In some examples, the posts are instructed (e.g. based on user and/or owner inputs) to perform activities such as to go to their ticketed seats, leave the venue, come home, go to a storage location, return to the permanent owner (e.g. renting entity/venue/company etc.) and/or other activities. The posts may have hard routes which allow them to challenge, recharge, retire and/or go to storage when the energy depletion, capabilities and/or further circumstances would not allow them to complete an (user/owner related) activity.

The rented semantic posts may infer interests and/or further associated activities of renters and/or supervisors based on semantic profiles and/or semantic analysis of messages, posts and/or further challenges; the posts may orient, focus, stream and/or express challenges/opinions based on inferred interests. Further, the semantic posts may substitute and/or augment the streamed information (e.g. translate and/or further substitute sounds, moves, play schemes etc.) in order to affirmatively resonate with the user's interests.

Once the rental (or temporary supervisory operation of a renter) period and/or activity is over and/or renter instructs the post to return to the owner and/or storage, the post may erase, invalidate and/or dispose of the personal identifiable information, semantic profiles and/or semantic artifacts associated with the renter.

Based on owner's preferences the post may preserve the information learned during rental period and/or return to a baseline memory and/or semantic model before the renting activities and/or period. During rental the system may use the user's semantic profiles and/or further artifacts to perform semantic inferences and potentially store them into a distinct collaborative model. Once the rental is over, based on preferences, the post may keep and/or fuse the collaborative model into its core/base model, publish, expire it, invalidate it and/or dispose of it. In the case of the publishing the published themes/routes/rules/model/capabilities may comprise the explanations and/or artifacts learned during rental period and may be further published on (web/flux/media/user/group/venue) channels; further renters/supervisors/owners may purchase/budget/use such publishing for their own inferences, analysis and/or to upload of the models during their operating periods.

The sporting and/or event venues may have particular sections, areas and/or endpoints assigned to semantic posts attendance, themes, socializing and/or storage. Sometimes sections, tickets and/or seats may be inferred and/or assigned based on semantic inference; further, they may be subscription based.

Further, the semantic posts may organize in semantic groups based on the characteristics of operators and/or supervisors. In some examples, semantic posts associated with operators of age 21+ may have less restrictions on alcohol related content, challenges, discussions, postings, marketing and/or other artifacts.

The semantic posts in attendance may point sensing, observe the semantic field, stream information and/or further provide augmentation and/or opinions to their temporary and/or permanent users, supervisor and/or owners devices and/or further post on (associated/relevant) channels and/or fluxes. Further, they may be used for crowdsourced sensing in venues.

It is to be understood that the semantic posts may or may not comprise mobility modules. Further, they may comprise multiple modules that can be rented by separate users and/or supervisors at the same time. In some examples, posts with multiple camera modules are affixed on an event venue structure; the camera modules may be rented and/or manipulated by separate users. Further, the renting rates may be based on the positioning and/or further desirability/likeability of the positioning, field of view and/or further semantic field in the venue and/or for an event.

The start of activities from the semantic view of the post or a well-informed low distorted/drift/entropy augmented party may comprise the post's/artifact's inference projections and/or further measures/countermeasures in order to achieve the mission; the end of an activity may represent the realization of the gating criteria and/or further success/failure factors. From the semantic view of an ill-informed party (e.g. inferring, determining and/or having high distorted/drift/entropy artifacts) the start and/or end of activities may differ from that of an well-informed party; the ill-informed parties may use countermeasures and/or challenges in order to reduce distortion/drift/entropy in rapport with a well-informed party. The inferences between ill-informed and/or well-informed semantic identities and/or indicators may be based in H/ENT inferences.

In some examples, the gating criteria and/or counter measures may be based on being well informed in regard to published semantics.

The system may infer and/or determine more abstract counter measures such as not being predictable in rapport with various semantic identities including self. In further examples, the system may use counter measures such as increase/decrease stimulus, distortion, confusion or de-coherency at semantic times.

The system may determine and/or infer effectiveness indicators/factors in rapport with counter measures. The effectiveness may be based on the steering of the goal in the desired direction.

A user may transfer credentials, profiles and/or wallets to its semantic robotic devices using any access, communication and/or storage techniques explained and/or cited in this application. Further, such credentials and/or wallets may expire based on semantic time.

The credentials may be applied in a hierarchical manner wherein parts and/or components of the credentials are applicable/applied to particular levels within hierarchical structures such as mentioned in the application. Further, the credentials may be associated with a hierarchy wherein (higher supervising factorization) levels credentials are allowed access and/or be delegated and/or can be substituted for/to (supervised and/or lower supervising factorization) levels and not vice-versa.

Credential/credentialed hierarchies ensure controlled access and/or diffusion to/of capabilities, budgets, assembly, grouping.

In similar ways in which the system infers and/or factorizes indicators for semantic fluxes and/or semantic groups the system factorizes hierarchies and/or associated levels. As such, a hierarchy may comprise semantic groups and/or fluxes in a hierarchical manner.

The diffusion, publishing and/or published capabilities on semantic fluxes may be access controlled, composed and/or approved based on the semantic flux and/or operator/supervisor hierarchy.

Credentials may be used to satisfy readiness criteria for particular activities. In some examples, SP2 cannot be assembled, readied and/or approved if the camera lens (e.g. as part of a BOM for a (particular) (type of) post camera) is missing, is not identified, is not validated/approved, not authenticated and/or (further) not diffused and/or not published (e.g. while assembled and/or while at an endpoint). In some examples, such identification, validation, approval, authentication and/or publishing may be based in activities associated with endpoints and/or supervisors (of endpoints, activities, capabilities, themes, parts, BOM hierarchies, publishing hierarchies etc.). In further examples, the assembly connectors, endpoints and/or connections reject, do not allow and/or block an assembly and/or connection with an unauthenticated module, agent and/or further module. Such assembly workflow may be also enforced based on access control associated with (published) capabilities wherein (likeable) composed capabilities cannot be assembled unless being allowed and/or having access to the composable and/or composed capabilities and/or further being able to infer such capabilities.

In some examples, an interest for an item (identified as part of) of a BOM (hierarchy) at an endpoint is inferred/identified and/or further matched against (published) capabilities.

In some examples, but not exhaustive, the item may be a component, article, board, part, vehicle, device and/or any other artifact (associated with a semantic identity). Vehicles may include posts, drones, cars, buses, carts and/or any other carrier/transportation items.

Alternatively, or in addition, an interest of a person at an endpoint is inferred/identified (based on sensing) and/or further matched against (published) capabilities. It is to be understood that the interest by the person may be based on detecting (activated/enabled/published) interests on possessed, supervised and/or owned devices; alternatively, or in addition, it may be associated with interests about an item of interest and/or possessed at an endpoint.

As specified throughout the application the endpoint structure may be hierarchical. As such, when referring to capabilities, activities, interests, fluxes and/or inferences at and/or associated with an endpoint it is to be understood that they may include the same (capabilities, activities, interests, fluxes and/or inferences) at encompassing/encompassed endpoints (as per configured diffusion and/or access control).

An endpoint sets up a context for inferences at semantic times. An endpoint (and/or associated indicators) may be factorized more likeable/non-likeable and/or affirmative/non-affirmative at semantic times and thus, its context is factorized accordingly.

Grouping, pairing, connection and/or fusion of two endpoints and/or artifacts may be based on coherent/incoherent collapse and/or affirmative/non-affirmative factorizations of the leading indicators at the endpoints.

Reviews and/or approvals may be associated with hierarchy types and/or themes mentioned in this application associated with and/or including users, operator and/or supervisor hierarchies. In further examples, the hierarchy may be associated with an endpoint and/or supervisor hierarchy; alternatively, or in addition, it may be associated with a flux and/or operator hierarchy; alternatively, or in addition, it may be associated and/or linked with a staff and/or management hierarchy. As such, when generating a review and/or an approval activity, a user/administrator may specify the required semantic identities (and/or/of groups) of the reviewers/approvers/authenticated/signatories in an exclusive (e.g. all required for completing the review/approval activity), non-exclusive (some required) and/or ordered/non-ordered (e.g. the reviews, signatures and/or approvals must be done in a particular order). Further, the system may diffuse and/or route the approvals based on the diffusive access control and/or semantic routing and/or hierarchy. Alternatively, or in addition, the system generates, sequences and/or orders the approval lists based on factorizing indicators of the signatures (e.g. localized at endpoints) and/or associated semantic identities; in some examples, a hazard indicator is used and/or (further) (non) affirmativeness of having/not-having them signed by particular identities.

The system factorizes, presents and/or augments in regard to indicators and/or factors from the various semantic views based on challenges. In examples, the system augments about a hazard based on a semantic view other than of the signatory.

Approvers, signatories and/or related hierarchies may be associated with operators and/or related hierarchies. Further, the (diffusion and/or flow of) approvals may be based on such hierarchies. In further examples, the diffusion may be based on such hierarchies.

It is to be observed that a hazard indicator denotes an anticipated cause of harm whereas risk indicates an anticipation of harm. In some examples, risk is factorized based on a plurality of hazard indicators.

While (projected) at an endpoint, satisfactory and/or likeable assets and/or BOMs may be determined for pursuing a capability and/or readiness at semantic times.

BOMs may be used to assemble budgets for an activity. BOM may comprise debits and/or credits.

Analogously, the semantic posts and/or (composite) carriers may be used for other physical and/or virtual environments (semantic) fusion.

The system implements safety protocols and/or insurance based on semantic times and/or inference in the semantic field. In some examples, the system infers that an entity is at an increased risk and/or hazardous circumstance (orientation) and thus it suggests and/or reminds of counter measures (e.g. a person glycemia goes high as the person skips the prescribed diabetes medication semantic time, a post goes low on energy budgets and thus the system may suggest disablement of some non-critical capabilities etc.).

Similarly, the system may project and/or apply countermeasures to disinfect and/or affirmatively factorize items, equipment, wearables, clothing, plants, beings and/or other artifacts (to endpoints).

The system may calculate insurance premiums (for each shipment, order and/or transaction) based on projected and/or further defined semantic routes for transportation, storage and/or movement of items and/or further cargo and whether those locations have countermeasures against threats, hazards, non-affirmative safety/quality/rating/budget/(semantic time) indicators and/or further consequences. It is to be understood that non-affirmative safety/quality/rating/(semantic time)/budget indicators refer to indicators which determine decaying of safety/quality/rating/(semantic time)/budget affirmative indicators; thus, by H/ENT, some countermeasures may also determine the factorizations of affirmative safety/quality/rating/(semantic time)/budget indicators.

The system projects and/or define transportation routes based on reduced hazards, insurance rates and/or providers, semantic time, investment budgets; alternatively, or in addition, the system projects and/or define transportation routes based on increased safety, quality, ratings, income. It is to be understood that the reduced/increased indicators may also mean increased/reduced hysteresis (semantic time) associated with the indicators (e.g. reduced hazard means that a slow hysteresis interval and/or "later" type inference towards a hazard are preferable; analogously, increased safety means that a fast hysteresis interval and/or "earlier" type inference towards safety are preferable).

The system may further use information about cargo content (e.g. potentially from an invoice, bill of lading, PO etc.) in order to determine optimal routes and/or further insurance premiums. In further examples, the system detects that a hazardous situation occurs by the departure and/or further absence of a supervising semantic identity and/or further counter measures (e.g. user leaves the house for a projected long time in rapport with a threat such as the gas stove in the house being open, the user leaves the house for a projected less than one hour and the gas stove is open and there is no gas detection/filtering/dispersion/suction/extinguisher available at the projected threat/hazardous location in a safety hysteretic semantic time).

A semantic virtual store/facility/environment may comprise renderings, streams and/or fluxes of a physical store/facility/environment (e.g. as observed by sensing) and/or further renderings, streams and/or fluxes of virtual stores/facilities/environments.

A semantic post may comprise a physical post and/or virtual rendering of the post. During a shopping session they may substitute one for the other while the system renders the shopping session of the post.

A substitution of the physical to virtual post may happen when the system wants to roam from a physical venue to a virtual venue and/or when the physical post cannot be present in the desired shopping location at a desired (semantic) time. Nevertheless, the system and/or user may switch the physical post to virtual post and/or vice-versa at any time based on profiles, preferences, semantic time and/or further circumstances.

In some examples, the system recognizes the product in the shelf and displays it again in order to be more readable. As such, the system may perform overlays of the article renderings and/or further information about the article, comparisons and/or opinions.

In some examples, the store comprises physical and/or virtual artifacts, rooms, locations, areas and/or renderings. As such, the system may merge such artifacts into a coherent view and/or use semantic analysis for likeable, satisfactory, coherent and/or further customized experiences.

When shopping, the system may instruct the shopping semantic posts to roam to various areas, locations, endpoints, particular articles, categories, semantic groups, routes and/or pick particular items based on likeability, budget, need and/or further circumstance factorization. While roaming, the semantic posts may present to the shopper the video feeds and/or further identification of the environment, articles and/or artifacts at particular locations.

The user may instruct the semantic post to socialize and/or further present opinions to other shoppers (e.g. posts, people, users etc.) on various items and/or further environment circumstances (e.g. the color of the floor, cleanliness, safety etc.). While shopping, the system may perform comparisons of the articles in the shelves with other similar articles found on other shopping venues (physical and/or virtual).

It is to be understood that the socialization means challenge-response with shopping participants, messaging, posting on fluxes/feeds of particular participants and/or semantic identities and/or further augmentation.

The system may use shopping lists comprising articles to be purchased and inferred based on sematic factorization, supply and/or demand and/or further semantic analysis.

In further examples, the shopping list comprises wish list items which the system identifies based on user input, sensing (e.g. rf/rfid reads, semantic shape, object recognition, scans etc.), likeability, resonance and/or further semantic analysis. In some examples, the user scans an item and rates its desirability and/or likeability; based on further analysis, the system may further challenge the user (for feedback) and/or adjusts the desirability and/or likeability factors.

The user/shopper may specify the behavior, semantic routes and/or trajectory of semantic posts in stores. In some examples the system specifies the semantic routes and/or semantic times of posts roaming in stores. In further examples, the posts may infer the routes and/or movement based on circumstances, optimizations, profiles and/or further preferences.

In further examples, the user may use indication, collimation and/or manipulation techniques to select, render, manipulate, observe and/or analyze articles and/or further artifacts. The user, system, fluxes and/or post (s) may collaborate and/or decide whether to add articles to the shopping list, buy them and/or add them to a further likeability and/or semantic factorized list.

Further the user may use collimation and/or manipulation techniques to navigate around various environments and/or issue commands to the environment (whether physical and/or virtual). In some examples, the system manipulates articles, carts, handles, doors, key fobs, remotes, post's arms, remote/virtual arms, gloves, virtual grippers/hands and/or other manipulation artifacts.

The system may allow the collimation, manipulation, rendering, navigation and/or observation of endpoints, areas and/or further artifacts based on semantic analysis including access control.

The system observes semantic units associated with various semantic identities which are further identified by additional sensing.

The system may use the fusion of physical and/or virtual environments in retail stores, hospitals, entertainment, home, meeting and/or event rooms/facilities and/or other venues/environments.

In some examples, the system needs to conceal and/or cloak the movement of posts, vehicles and/or devices at particular endpoints and/or from particular monitoring entities. As such, the system uses trajectories and/or endpoints with low entropic characteristics in rapport with the characteristics of the artifacts (e.g. chooses endpoints with dark vegetation and/or nighttime for dark posts, vehicles, objects etc.).

The system may adjust the characteristics, groupings and/or wavelengths of sensing meshes in order to control the absorption of light and/or further electromagnetic spectrum at particular endpoints and/o locations. In some examples, the system has information that particular locations comprise and/or are monitored by particular wavelengths, capabilities and/or entities and as such it adjusts the absorption spectrum to countermeasures against those capabilities and/or wavelengths. In further examples, the system superposes and/or conditions signals in such a way that the (back) scattered, reflected, refracted and/or transmitted radiation/wave/sound projects and/or generates unmodulated, wide-band, non-coherent, confused and/or distorted signal at the monitoring entities. The system reflects/generates signals which blend into environment (e.g. have low entropy, drift and/or shift from environmental circumstances) and further do not allow the monitoring entities to discriminate and/or detect the semantic cloaked objects in rapport with the environment at particular endpoints and/or locations.

In further examples, the system uses sensor and/or rendering artifacts to adjust and/or render the appearance of various objects. In some examples, such sensors and/or renderers may comprise glasses, lenses, appliances, wearables and/or any other sensing and/or display artifacts mentioned in this application.

The semantic cloaks may generate and/or induce (at the monitoring entities) artifacts which are different than the artifacts of the cloaked entities (e.g. induce the shape of a DELOREAN instead of the shape of the actual beetle). In further examples, the sematic virtual cloaks induce different inferences at particular entities, semantic times and/or profiles (e.g. induces DELOREAN shape and/or inference for John and/or its (wearable) observing semantic entities and, induces beetle shape and/or inferences for Jane and/or its (wearable) observing semantic entities). It is to be understood that the system may adjusts the cloaking and/or rendering at any time, particular semantic times and/or based on particular user conditions and/or preferences.

The system may use 2D/3D printing for generating/augmenting components, fairings, stickers and/or appliances which may allow and/or be enabled for cloaking, concealing and/or likeability as per mission goals.

The system may use affirmative/non-affirmative (self) appearance semantics in order to determine/project consequences and/or further factorizations. In some examples, the system determines that a collision and/or route with/by a steel spike, post or other object may cause appearance/aesthetic/health damage (e.g. causing decaying of likeability and/or un-likeability of self with self or others) such as scratches and/or arm (joints) twisting and thus, it may further factorize its inferences as a potential hazard and/or non-likeable leadership artifact.

Based on health conditions and/or treatments, the system may use semantic cloaking to generate, induce and/or factorize beneficial inferences and further reduce symptoms and/or hazards for patients.

The system may cloak, simulate and/or augment particular objects and thus implement more effective therapies.

Further, the system may allow the manipulation of artifacts in physical-virtual environments for more effective procedures, health, emergency and/or communications.

The system may need to (re)distribute traffic so to avoid high entropic adjacent zones and/or allow a more even diffusion in inferred, selected and/or particular areas; thus, the system establishes, factorizes and/or advertises incentives, rewards, budgets, indicators and/or further takes measures/countermeasures for increased likeability and/or resonance for particular semantic identities, profiles, objects and/or further artifacts which can determine the diffusion and/or movement of such artifacts to the associated incentivized, advertised, likeable and/or resonant zones.

In further examples, the system projects and/or further takes counter measures for traffic jams. As such, the system infers that the potential hysteresis and/or damping based on vehicle movements and/or further braking/acceleration at particular endpoints may create fluency issues such as low (affirmative) fluency indicators factorizations (and/or by H/ENT high non-affirmative fluency indicators factorizations). Thus, the system may takes countermeasures and/or adjusts the speed, acceleration and/or braking of particular vehicles in order to reduce traffic damping/hysteresis at (projected) endpoints and/or optimize fluency (e.g. increase affirmative, decrease non-affirmative). It is to be understood that the braking/acceleration may be detected based on sensing whether from a sensing infrastructure and/or in a crowdsourced manner (e.g. from one vehicle to another).

In further examples, the system is challenged to explain the benefits and/or drawbacks of (why (SHOULD) DO/(HAVE DONE)/FOLLOW and/or why (SHOULD) NOT DO/(HAVE DONE)/FOLLOW) particular inferences, movements, routes, transitions, resonances, identities, groups and/or further actions. It is to be understood that the system may be challenged by semantic identities and/or further artifacts including self.

The user may indicate how the radiation, ionizations, fumes, gas, waves, charges, sound and/or other sensed phenomena and/or artifacts should or should not move and/or diffuse within a mapped environment.

The system stores, infers, publishes and/or gates counter measures and/or mitigation of a (projected) hazard, hostility, offensiveness, risk, situation and/or action based on inference/determination of high entropy consequence semantics in rapport with the (projected) hazard, hostility, offensiveness, risk, situation and/or action (e.g. halocarbons are fire retardants, non-flammable and/or reduce oxygen when sprayed on surfaces and further counteract fire hazard/offensiveness/hostility).

The countermeasures may be used to (affirmatively or non-affirmatively) index and/or factorize a stimulus. In some examples, the stimulus may be activity stimulus, achievement stimulus, sensitivity stimulus, sensory/sensing stimulus, budget stimulus, economic stimulus and/or similar.

The countermeasures/mitigation may comprise own, environment, and/or collaborators (semantic groups) capabilities and/or behaviors. The countermeasures and/or mitigations may be circumstantial, collaborator/flux/group, location and/or endpoint based.

The system may use semantic resonance for inferring and/or applying countermeasures.

The counter measures help keep and/or steer inferences within required/specified behavior, orientation, drift, shift, semantic time and/or entropy when high drift, shift and/or distortion occurs.

In some examples, "keep the area safe" goal is distorted and/or high drifted by the hostility of an intruding drone and hence the system applies counter measures to keep it safe and reorient/steer/return it to the intrinsic and/or desired behavior. Further, the system may use semantic artifacts of counter measures within semantic times (e.g. warn the drone, applies more drastic measures if the warn didn't work/steer as expected and/or drone is still hostile etc.). It is to be observed that the counter measures may be factorized based on consequence indicators/factorizations and/or further (associated) indicators/factorizations.

In other examples, the unprojected energy budget depletion and/or orientation require counter measures such as reduction of energy consumption and/or disablement of some capabilities for a semantic time in order to restore energy budget depletion orientation.

In further examples, the system identifies semantic identities comprising counter measures. In some examples, during a virus spread projection the system infers identities such as "JOHN and friend wear masks in and around the hospital", "JANE wears N95 mask", "S3P3 operator wears no mask", "S3P3 has not been disinfected after being used" which further comprise countermeasures (e.g. wearing mask and/or further more drastic/strongly factorized mitigations such as wearing a N95 mask which is better rated for hazard medium/air/drops filtering). It is to be observed, that the hazard at particular locations and/or endpoints is inferred based on hazardous and/or non-hazardous interactions, environment, factorizations and/or further mitigation by counter measures. Further, the particular locations visited by potential hazards (e.g. virus bearer (S3P3) operator and/or further potential bearer S3P3—if S3P3 and its operator were in close proximity in a semantic hazardous time) may be factorized to reflect hazards and/or diffusions. It is to be observed that the S3P3 may not pose highly factorized hazards if the transmission of the virus and/or hazard diffusion hardly take place through its particular surfaces, actions and/or (further) interactions; further, the potential diffusion, transmission and/or hazard posed by S3P3 may potentially follow and/or be based on a decaying hysteretic semantic interval which may further depend on the environment (e.g. indoor/outdoor, ventilated and/or not ventilated etc.). S3P3 may be remotely operated and thus the hazardous interactions with a potential bearer operator could be hardly and/or not diffusible at all. Other counter measures and/or circumstances may decrease the stress and/or anxiety caused by hazards and/or consequences of infection at hazard prone (diffusible/diffusable) endpoints (e.g. having (diffusible/diffusable) medication, ventilation to disperse in particular non-hazardous directions, counter measures or mitigations against the effects of the virus) and/or further available within semantic times (e.g. to counteract the infection hysteresis and/or reverse it; damp the infection diffusion etc.).

The system may use sensing, actuation and/or further counter measures to disperse and/or reduce the hazardous circumstances at locations and/or potentially direct/route them (e.g. ventilate and/or disperse fumes to particular non-affecting directions, toward a window etc.).

The counter measure inferences may be used to control, steer and/or reverse trends (at endpoints) as determined by statistical models and inferences.

The system rates and/or insures various artifacts, items, articles, posts, transports and/or cargo based on the risk, hazards and/or further semantic indicators/factors posed by various routes and/or circumstances.

The system may adjust the ratings and/or premiums based on the route countermeasures which determine the decaying/factorization/hysteresis/damping of risks, hazards and/or further indicators. The risks, hazards and further factorizations may be inferred based on the hysteresis and/or damping of the countermeasures and their effects in rapport with the insured artifacts. In some examples, the system determines a risk/hazard/likeability related with low/high temperature items/areas, associated heater/refrigerant/A/C units and/or (associated) semantic posts; if further countermeasures (e.g. heater/A/C capable posts) are available for diffusion, action and/or readiness within (or to counteract) a hysteretic (non-hazardous/hazardous) (semantic) time then the likeability may be factorized and/or risk, hazard and/or premiums may be further reduced. It is to be understood that the system may consider the hysteresis, damping and/or diffusion on a composite basis (e.g. the discharge, depreciation and/or hazard of a battery pack at (low) (semantic time) temperatures may comprise a hysteresis interval which further may be composed with the (composite) hysteresis provided by countermeasures of heater/heating based diffusions, hysteresis and/or posts).

The system may factorize risks, hazards, likeability, indicators and/or further premiums based on (composite) semantic indexing, semantic times, hysteresis and/or damping of circumstances and/or counter measures.

The system may determine and/or infer factorization of countermeasures (e.g. likeability, hazard etc.) in particular circumstances.

The counter measures may comprise capabilities for disablement of artifacts/identities and/or, reduction, counter bias and/or decaying of goal/orientation drift/shift/entropy.

The system interprets the risks, hazards and/or further factors in a composable, hierarchical and/or diffusive manner—e.g. risk of loss of capability (including countermeasures) and/or semantic identities (e.g. posts, modules) is inferred based on the risk of loss of (critical) components (e.g. memory module, heater/AC).

The loss of capabilities and/or semantic identities can be temporary and/or permanent—e.g. risk of loss of post or memory can be temporary and/or (further) permanent—power goes down and/or memory breaks down.

In case of the loss of capabilities and/or semantic identities the system writes down, writes off, disables and/or invalidates from the books, contracts, supply chains and/or clause the associated assets and/or capabilities permanently and/or temporary (e.g. based on a semantic time). In further examples, the system records explanations of the circumstances of loss, disablement, write downs and/or write-offs. It is to be understood that the write-downs and/or write-offs may be semantic time dependent.

The system may infer goodwill indicators and/or factors based on insurance type factorizations and/or further analysis. The goodwill may increase as the insurance risk/hazard is reduced and/or likeability factorized. Further, the goodwill may be inferred based on the negotiations in the semantic network between brokers, insurances, buyers and/or sellers. We expressed that the budgets may be based on a variety of indicators which may be exchangeable for one another. In some examples, the budgets may be based on health, well-being, excitement indicators. Further, the system may establish budget indicators and/or further leadership based on semantic profiles and/or further inferences (e.g. infers that in order to factorize well-being the leadership budget indicators may need to be health, excitement etc.). It is to be observed that while health may be a budget indicator it may depend on other budgets (e.g. energy quanta, health service/insurance quanta/premiums etc.).

Readiness may be based on starting an activity while having the particular semantic identities required to complete the activity and/or goal (e.g. move a car requires having a key, credential or wallet, going to a picnic in a hot day requires water or hydration based on circumstances, assembling S2P2 and/or giving S2P2 anti fire capabilities requires a particular anti fire suppressant component (s) etc.). In further examples, such readiness is the gating criteria for being allowed out of an endpoint without consequences, being challenged (e.g. you forgot your key, get your key etc.) and/or blocked. It is to be observed that in some examples the semantic artifacts and/or identities are localized by the system at the endpoint and/or different endpoints and/or further determine whether they are in the possession of the bearer while being gated through the endpoint.

In some examples, the gating criteria, readiness and/or counter measures may be based on being well informed in regard to published and/or hazardous semantics and/or further artifacts.

We expressed that the system may infer distraction factors associated with challenges, activities and/or other artifacts which may determine decaying of focus, attention and/or budgets in relation with particular (critical) routes, goals, scenes and/or views. Further, the distraction factors are high when they decay the resonance of the particular resonant goals and/or budgets.

The distraction factor may be used to infer and/or apply counter measures and/or decay dissatisfaction, concern and/or stress factors and/or further as a counter measure to uncertainty and/or unknowns. In some examples, the system uses projected distraction factors in order to induce resonant superposition (e.g. via challenges, semantic spread, goal shift etc.) in regards with uncertainty, unknowns and/or further artifacts generating dissatisfaction, concern and/or stress factors.

We mentioned that the system may fusion the semantic attributes inferred in regard to various user interface controls. In an example the system infers that a text box labeled for comments (or similar) and/or having COMMENTS leadership is NOT EMPTY. Further, the system expires the content of the text box after a sematic time and thus inferring that the text box is empty. The system may compose the attributes of the window and the emptiness status (e.g. COMMENTS WINDOW, NOT EMPTY) and thus taking appropriate actions (e.g. notify the supervisor, unmute microphone etc.).

The system may use ad-hoc semantic coupling to connect (affirmative resonant) leadership at endpoints at (resonant) semantic times.

Users, supervisors and/or leaders of views may be coupled with collaborators via ad-hoc semantic coupling. In some examples, the semantic coupling comprises semantic analysis inferring collaborators interests, challenges and/or further semantic attributes. It is to be understood that the ad-hoc semantic coupling may thus comprise the optimal user interface controls and/or devices to connect with the optimal user/supervisor/operator and/or leader which affirmatively resonates and/or is well-informed on the collaborator's interests and/or further challenges.

Sensing may be oriented for further optimal stimulation from affirmative resonant leaders and/or during ad-hoc semantic coupling.

The system may identify leadership of distortion, distraction, stimulation and/or further activities and/or counter measures.

The system may gate the artifacts which may generate bad publicity, distraction, distortion and/or ill-inform for the observed semantic identity (e.g. filter video or sound artifacts and/or signals which may be non-affirmative resonant at the observed semantic identity in rapport with projected inferences in the collaborators and/or audience in a virtual conference). As such, the system may project bad publicity, non-resonant projections, distraction, distortion and/or ill-inform at the semantic identity, collaborators and/or any combination thereof and thus gates such artifacts. It is to be understood that such projections and/or gating may be based on the semantic identity, semantic group profile and/or theme of the semantic flux conversation.

We expressed that the system may determine appearance/aesthetic/health damage based on particular locations. It is to be observed that the system may fusion many semantic (theme) perspective views/artifacts (e.g. appearance, health, publicity etc.) when determining the trajectories, behaviors and/or goals. In some examples, "arm twisting" may signify appearance (not looking good, non-affirmative publicity), distraction, distortion and/or health (functionality). Further, the system may determine the impact factorizations and further projections in rapport with achieving the goals (e.g. arm twisting may pose health issues, high costs, risks and/or impairments in the realization of goals (e.g. moving the tea pot)). In further examples, the system may not interpret arm touching as a hostile arm twisting attempt but instead as a gesture of arm reaching with no hostile intent.

The semantic grids may be associated with monitoring grids attached to power delivery (networks). In some examples, the system uses semantic time management, stimulation, satisfaction/dissatisfaction and/or similar to adjust, control, tunnel, diffuse and/or gate consumption and/or demand. As such, the system projects undershoot of demand, overshoot of capacity, under-stimulation, hazardous shift orientation of capacity/demand and/or budgets (e.g. due to budgets required by projected activities at the semantic time etc.) and hence it enables/disables, encourages/discourages (e.g. by challenges etc.) and/or stimulate/under-stimulate activities in order to preserve an optimal, likeable and/or desirable capacity/demand (superposition).

In further examples, the system projects and/or determines hazardous conditions at locations and/or endpoints encompassing utility grids.

Analogously, the system may project hazardous conditions in inventories. The system may use sensing techniques to determine inventories, their locations, semantic identities and/or further circumstances.

In some examples, the system creates plans which optimizes the execution of activities and/or goals based on semantic budgets and/or capacity/demand inferences. Capacity/demand and similar are associated with conjugate semantics, H/ENT inferences in rapport with one another (capacity vs demand).

We mentioned that the system infers distortion in various situations from various fluxes. Further, distortion may be inferred when a party or artifact use various anchor points to present its knowledge, successes and/or achievements (thus projecting to induce at self and/or collaborators overestimation of achievements and/or available budgets, and/or underestimation of required budgets and/or potential failures). In some examples, such distortion is based on charts/graphs where the system choses anchor points in order to increase and/or decrease the relative distance and/orientation between (the top of) (similar semantic attribute endpoints in) charts/graphs. Analogously, overestimation and/or underestimation is used to downplay failures.

Collaborators may use narratives, options and/or artifacts in order to determine the system to adjusts anchors. When the collaborator goals are associated with distortion the system may infer foe and/or non-resonance. Further, the system may want to damp the resonance within the distorted anchor point.

The system may factorize deception based on manipulation of anchors and/or further distortion.

In some cases such distortion is hostile or ill-intended when the system knows that the distortion causes non achievement of goals and/or failure or the distorted party.

Foes and/or further distorted and/or overestimating affirmative information in the flux network may induce anchor distortion in order to determine the system to overspend. The system may counter bias such distortion by using defensive behaviors in regard to distorted anchor leadership semantics. Analogously, distorted underestimated affirmative information may determine the system to underspend and thus the system may counter bias by using offensive behaviors in regard to the distorted anchor leadership semantics. Analogously, by H/ENT, distorted underestimated non-affirmative information may be used for deception and the system may use counter biases to counter act/measure those.

In other examples, the distortion may be used in order to downplay potential projected non-likeable inferences and/or artifacts. In some examples, such distortion may be ill, foe and/or hostile projected and/or well and/or friendly intended. The distortion may cause activities which are non-affirmative towards the targeted semantic identity goals.

The semantic posts may infer, localize, manipulate counter measures and/or perform activities which enable/disable them. Further, the system may combine and/or compose such capabilities for creating more effective counter measures. As such, the system localizes fire hydrants, air blowers and/or other artifacts; in case of an actual or potential hazardous condition (e.g. fire due to a highly hazardous gas leak, ignition potential etc.) the system may infer counter measures provided by fire hydrants, air blowers and/or further likeable and/or resonant artifacts. The system may infer potential directions and/or flows of hazards/egress and further redirect them based on projections of capabilities, counter measures and/or tools at the location endpoint (e.g. localizes a window which can be potentially opened and/or broken (by his activities and/or its collaborators)); thus, it (re)directs the hazards and/or egress towards less/non-hazardous and/or affirmative factorized locations gated by the window. It is to be observed that the hazards may be factorized in regards with particular semantic identities (e.g. gas, fire and/or smoke is hazardous for a person but not that hazardous for a ceramic plate). Further, the window may gate only particular hazards (e.g. it can block and/or hardly diffuse gas but it cannot block light etc.). It is to be observed that the system determines that particular artifacts (e.g. windows) have flow evacuation and/or diffusion capabilities.

The system may further analyze the diffusion of hazards and/or egress based on capacity and/or budget of egress. In some examples, the system infers the capacity and/or budget of egress based on the egress surface (e.g. open/broken etc.) on the window, fitting of the hazards (e.g. gas, people, posts etc.) and/or further flow analysis. As such, the system may factorize the egress capacity indicator and/or further semantic times into further semantic analysis.

Flows may be associated with demand, consumption, traffic, window, ingress, egress, cash, offense, defense etc. In some examples the system A at a particular endpoint/s has incoming flows and thus increased ingress capacity (e.g. if the incoming flows are particular products), ingress demand (e.g. if the incoming flows are particular consumers) and/or ingress consumption (e.g. if the demand is consumed at the particular endpoint/s). Analogously, by H/ENT, the system may manifest egress capacity, demand and/or consumption towards other endpoints.

The semantic posts may manipulate tools providing counter measure capabilities at particular locations and/or endpoints; further, such tools, their capabilities and/or further sensors/actuators may be controlled by the semantic posts (e.g. liquid/gas flow rate etc.).

The system controls damping/hysteresis of hazardous circumstances based on projected incoming and/or outgoing flows/diffusion at the hazardous endpoints.

Damping on mobility, manipulation, countermeasures and/or interconnection artifacts (e.g. wheels, grippers, lock, latches, links, hydrants, modules etc.) may be adjusted.

Further, the system may adjust the damping of the lockable and/or hook components. In some examples, the system adjusts the preload and/or damping of (suspension) components attached to band hooks, grippers, arms and/or clips in order to allow the bands to move, extend, support, tension and/or damp artifacts touching them (e.g. a person is holding and/or is supported by the band and/or post and thus the system adjusts the tension and/or further damping of the band end hooks in order to optimally support the person, a person is about to fall on a band between two posts and thus the system adjusts the damping to alleviate the effects of the fall on the person etc.).

Input/compression damping may be associated with incoming flows/diffusion and/or inferences while the return/rebound damping may be associated with outgoing flows/diffusion and/or inferences. It is to be understood that the input/compression damping at an endpoint may comprise a return/rebound damping from another endpoint as the two endpoints may be interconnected through oriented links and the damping propagates between endpoints between a first and a second (semantic) time.

The sematic post may elevate/ascend and/or descend in order to grip the counter measure tools, open flows (e.g. allow/open/break window) and further orient them to optimal orientations, areas and/or endpoints. In further examples, in order to extinguish, route and/or disperse hazards the counter measures may be oriented optimally based on overshoot/undershoot inferences; in some examples, they are oriented towards the middle and/or bisector of the minimum area and/or angle determined by undershoot and/or overshoot inferences.

The system may infer and/or expire sematic identities based on possession and/or composition. As such, the system infers "the nurse with newspaper" at a first time but later infers "the nurse without newspaper"; however, based on circumstances, the system may retain that nurse Jane is "the nurse with newspaper" due to high factorization with self and/or in the flux network. Similarly, the system may assign semantic identities to endpoints and/or further artifacts (e.g. "the room with sprinkler", "the room without sprinkler" etc.). It is to be observed that the semantic identities may be based on semantic times, attributes and/or (direct and/or counter) capabilities at the endpoints and/or locations.

In further examples, the system infers the presence of objects/items/people/posts/(flux owner)/supervisor and/or particular (semantic identities) which observe the semantic field. Thus, the system may infer and/or determine witnesses and/or observers of particular happenings in the sematic field. The system may infer such witnesses by inferring that the particular identified artifacts were observing and/or inferring happenings in the semantic field (e.g. via inferences and/or challenges from and/or to the witness—I like how John pitched that ball, did you see what John did? etc.).

The system may be challenged and/or redirect questions which doesn't know the answers or is confused about. The system may divest particular challenges for particular themes to various collaborators. In some examples, John may divest car appearance related challenges to Jane.

The system may broadcast information to devices at and endpoint/location for semantic coupling.

We mentioned that the system may infer readiness based on projections of required capabilities, artifacts and/or activities when leaving locations which comprise (e.g. based on localization) such capabilities, artifacts and/or activities.

In some examples, the system projects (e.g. based on (semantic) (calendar) time entries comprising scheduled shopping) a further (car/truck/post/carrier) transportation activity and thus the need to start-up the transportation activity and/or artifacts (car/truck/post/carrier) using assigned/associated keys/credentials and/or devices; localization and/or gating criteria is used for allowing/disallowing a semantic identity for leaving an endpoint (e.g. a house, venue, facility, car, carrier etc.) which comprise particular (car/truck/post/carrier) keys/credentials, fobs and/or devices.

Localization techniques has been explained in this application and/or cited applications, the contents of each of which is incorporated by reference.

The start-up of an activity includes starting up an activity within and/or together with an artifact (car/truck/post/carrier) which provides the required transition and/or mobility capabilities based on budgets. The system uses localization of credentials and/or further associated artifacts (e.g. devices, wearables, supervisor, leader etc.) in order to infer the readiness of pursuing transitions and/or activities in the sematic networks. As such, the system may need the required credentials to transition, move, start activities and/or pursue goals in the semantic network model.

Readiness may be the gating criteria for activities and/or further transitions between endpoints in the semantic network model. Readiness inference may comprise credentials, identification, wallets, keys, fobs and/or other semantic identities which allow the pursuance of activities.

The system may apply semantic profiles of an artifact once is identified and/or localized to an endpoint.

In some examples, the system allows items and/or articles in a virtual store to be published, sold, appraised and/or rated only when the gating and/or readiness is met. In further examples, the readiness is based on a release semantic identity of a software/hardware application, item and/or article in a virtual store and the general public may not be allowed to post ratings and/or use feedback controls unless they are in the targeted release semantic identity (e.g. "released", "to John"; "released "to public"", "released for comments", "released for comments by voice" etc.). It is to be observed that the system may activate/deactivate the ratings, comments and/or voice controls and/or devices based on detected semantic identities which are at the activity endpoint and/or further (attempts) to perform the activity (e.g. allow comments, allows comment from John, allows comments only if the allowed commenter has voice processing capabilities, allows comments only from John and/or by voice etc.).

In similar examples with the virtual store the system may allow feedback, challenges and/or augmentation from the user in various circumstances, augmentation interfaces, and/or embodiments some which are presented in this application.

The system infers required transitions and/or diffusions of credentials at semantic times potentially as grouped with a/an (activity) user, owner, supervisory, container and/or further artifacts. In some examples, the system requires transitions, diffusion and/or further presence of a key, wallet, device and/or credential within a container and/or (mapped) endpoint in order to start a container/endpoint activity and/or transition (e.g. start and/or move a vehicle); as such, the vehicle becomes a highly factorized container and/or further (mapped) endpoint for the key during particular circumstances (e.g. such as car engine started).

Credentials may be associated and/or in possession of a supervisory and/or leadership entity, activity and/or artifact. As such, activities and/or artifacts may require (circumstantial) supervisory and/or leadership credentials to pursue the access to an endpoint, inference and/or goals.

The system may infer a required transition and/or diffusion of a semantic group.

The system may not allow the access, transition and/or diffusion to an endpoint if the circumstantial (supervisory and/or leadership) credentials are not within the semantic group, at the same location and/or in the possession of the transitioning artifacts and/or activity.

We mentioned that the system may replace, substitute and/or induce one item/artifact and/or group thereof with another item/artifact and/or group thereof at semantic times. (e.g. show John driving a beetle like car (instead of a DeLorean) after he finishes talking on the phone and/or is ready to go meet Jane). It is to be understood that the "beetle like car" may be based on likeability and/or affirmative resonant projections at Jane, John, semantic group thereof and/or further circumstances at the activity endpoints (Jane see John endpoints) in regard to leadership such as "beetle" ("shape"), "car" ("shape") (."shape") and/or by using semantic profiles.

The system projects (desirable/likeable/required) localization of artifacts and/or items based on projected and/or ongoing activities at the locations and further challenges and/or augments the user. In some examples, "John sees Jane" activity requires John to drive a particular car (e.g. beetle like and/or capable) towards Jane (projected) endpoint and hence the system infers that the localization, orientation, trajectory and/or drift of John and a beetle capable car key/credential at different times within the activity to see Jane is not normal (e.g. John left/forgot the beetle key/credential on the fireplace). It is to be observed that the system factorizes a forget indicator based on whether the (projected) distance, orientation and/or drift between the main activity holder/supervisor (e.g. John, John and Jane group) and the (transport/transitioning) (start) (pre-condition) capability/artifact/activity (e.g. key/credential, presence and/or collapse of key/credential at the (transport) capability/artifacts/activity associated endpoint) and/or further (pre)conditioning budget increases potentially within the goal activity semantic time (John sees Jane). Additionally, the system may use challenges, mitigations and/or countermeasures (e.g. such as remind/challenge the user and/or instruct S2P2 to pick-up/grip/use the key/credential and start the artifact/activity while John is identified/determined as ready/like/desiring/wanting/instructing to start the car).

The system may use forget indicators to infer decays of semantic artifacts and/or further semantic routes (e.g. the system infers the routes and/or artifacts determining forgetful behavior). In some examples, the system uses forgetful behavior and/or routes to forget past experiences, semantic trails and/or artifacts.

We described that the system may infer meal projections and/or further preferences. Such inferences may be based on budgets associated with meal items, capabilities and/or components such as calories, proteins, carbohydrates etc.

We mentioned that the system may determine leisure (e.g. vacation, meals etc.), budget and/or energy goals. In further examples, the system uses semantic time management based on projected availability at a particular (projected) endpoints and/or locations. In some examples, the system may use "next meal with meat" inference to order, (re)stock, (re) supply and/or charge from providers the (likeable and/or preferred) meat; however, if the meat cannot be delivered and/or made available at the projected user's meal location, then the system may either suggest the user with a new meal location, adjust the meal schedule and/or semantic times and/or further challenges and/or augments the user.

The system projects likeability and/or further factors to determine transitioning endpoints and/or routes. In some examples, those are based on projected needs and/or preferences (e.g. next meal with meat). However, as the overall affirmative (resonant) factorizations are low and/or decay the system may challenge itself whether the goals can be adjusted (e.g. do I need meat next meal?, why do I need meat? for energy, protein and/or taste (?), how much energy (budgets) do I need for reaching the (sub)goal?, can I substitute with protein bars? etc.). It is to be observed that the system may consider weight goal (artifact) leadership semantic attributes (e.g. protein content, taste etc.) and affirmatively factorize items having leadership in regard to such semantic attributes (e.g. protein bar has high protein content). It is to be observed that the system infers high protein content for the semantic identity of "protein bars" by using semantic analysis on the semantic identity itself which comprises and/or is composed of "protein", "bar".

It is to be understood that the availability of particular artifacts (e.g. meals) at locations may be based on ordering from particular providers and/or fluxes and/or further delivery (e.g. by semantic posts carriers) at the locations.

The system indexes the significance of the inference based on semantic analysis inferences. Thus, the system may have a current factorized goal of "50% meat next meal" however, since it cannot have meat next meal it further factorizes/indexes the importance (e.g. "60% meat next meal"). The "meat next meal" may be a subgoal of a more strategic goal (e.g. "meat in the next ten meals", "meat as the protein intake goes/is low" etc.). It is to be observed that the system may use other alimentation items, inputs, components, artifacts and/or elements (e.g. previous protein intake inferences) in order to index the significance of projected meals and/or further suggestions, augmentation and routing.

Next meat with meal may entail assigning such a notification and/or goal to the next meal semantic time.

The system determines goals, sub-goals, activities and further (sematic) (time) budgets. As the budgets decay, the significance of the goals, sub-goals and/or activities is factorized. In some examples, the system non-affirmatively factorizes the realization of goals such as protein intake and/or energy if the sub-goals and/or activities (e.g. "meat next meal") (orientation) (is) decays (/decayed) and/or is non-affirmatively factorized/oriented.

Foe generated (counter)measures may generate distortions and/or impede the signals to be further conditioned, diffused and/or collapsed as per goals.

When distorted, the system strives to affirmatively factorize (e.g. decay as per goal) distortion by increasing the semantic spread and/or further non-affirmatively factorize, invalidate and/or expire the semantic artifacts and/or leaderships generating the distortion. Further, the system may record and/or learn the artifacts which generated the distortion and may factorize them as foes.

The system may project the offensive and/or defensive activities of friends and/or foes in the best case and/or worst-case scenarios. As such, the system may further adjust the friend/foe factors based on the orientation, drift and/or shift between the projections and/or the actuals.

Friend/foe when factorized as one over the other do not take action until a semantic time.

The system may determine leakage and/or damped diffusion orientation at endpoints based on measurement of the first sensor/flux at the first time and the second sensor/flux at the second time wherein there is an open and/or diffusible link between endpoints. In some examples, the link is associated with a fluid and/or gas pipe and/or diffusion environment (e.g. convections, routing and/or dispersion in access controlled areas); in other examples, the link is associated with a communication (e.g. wired, wireless, media, news, messaging, voice etc.) channel. As such the system determines the orientation of the condition, leakage and/or phenomena (e.g. loss of pressure in pipes, gas leakage; current and/or magnetic flux leakage, information leakage etc.) based on measurement from the first sensor/flux and/or the second sensor/flux and/or further link conditions and/or semantic attributes.

In some examples, the leakage and/or damped diffusion may be associated with a (semantic wave) and/or signal.

When performing inferences the system may challenge self and/or semantic fluxes connected to self.

The system uses augmentation constructs and/or artifacts which reflect various semantic view insights. In previous examples, we mentioned that the system uses more doubtful/uncertain constructs and/or opinions (e.g. I THINK, WE THINK etc.) to reflect (mainly) its insight semantic view and/or maybe coupled and/or diffused with other resonant (collaborators) insights while allowing other semantic views and/or (associated) fluxes to comprise, diffuse, challenge and/or express doubts and/or drifted insights in regard to such opinions and thus increasing superposition and/or semantic spread. In cases when the system does not want and/or need feedback, increased superposition and/or diffusion in particular circumstances, locations and/or endpoints then it may skip such constructs altogether.

The system may detect deception indicators and/or factors by inferences related with deliberate distortion (e.g. being related with a distortion activity and/or similar and/or having a goal/mission associated with the distortion activity) of artifacts.

The system may use mitigations and/or countermeasures to affirmatively project and/or factorize (e.g. decay as per goals in order to decrease hazards, decrease non-affirmative resonance) hazardous and/or non-affirmatively resonant consequences.

The system factorizes non-affirmative consequences at endpoints. Further and/or similarly, when making projections and/or endpoint selection in regards with mitigations and/or counter measures the system may consider discriminations based on sensing and/or semantic rules (e.g. based on the number/characteristics of artifacts and/or semantic groups, projection of endurance/survival (hysteresis) etc.).

The system may factorize risk based on and/or for capabilities, budgets and/or value exposed to hazards. Further, the system may factorize a vulnerability indicator for assets based on the risk and/or further counter measures available to such assets in respect to decaying risks, expiring/invalidating threats/hazards and/or preserving capabilities, budgets and/or values.

The system uses countermeasures for dispersing hazards and/or threats to particular orientations, directions and/or endpoints. Further, the system directs hazards and/or threats to endpoints and/or locations having further counter measures capabilities for further damping, orientation, dispersion, invalidation and/or expiration of threats and/or hazards. In further examples, the dispersion of hazards requires the actuation of access and/or diffusion capabilities (on particular links) (e.g. open doors, windows etc.).

The system may know that a gating/access point artifact (e.g. window, door, lock, sink, coupler etc.) may allow the diffusion of particular elements which may further factorize conditions at the diffused locations (e.g. increase and/or decrease hazards, allow oxygen in which factorizes fire hazards, allows smoke out, allow escape, allow intruders etc.). As such, the system optimizes the actuation of the gating in order to achieve goals (e.g. evacuate as many people as possible, save Jane and maybe John, save the moving beetle with Jane otherwise burn it because it blocks egress etc.).

It is to be observed that the system may disperse hazards and/or countermeasures from endpoint A towards endpoint B and/or (further) from endpoint B towards endpoint C and/or potentially towards endpoint A. In some examples, the dispersing capabilities at endpoint A are composed and/or coupled with the countermeasure capabilities at endpoint B in order to decay, affirmatively factorize and/or damp the hazardous effects (e.g. the hazard at endpoint A is dispersed towards the countermeasure (endpoint) field from endpoint B). In further examples, the dispersing capabilities at endpoint A are coupled with dispersing capabilities at endpoint B to determine a composite trajectory and/or orientation of the dispersion hazardous field (e.g. the system infers dispersing routes). In further examples, the countermeasures (dispersion) fields, shapes and/or endpoints diffuse with the hazardous dispersion fields, shapes and/or endpoints and further neutralize/decay, affirmatively factorize and/or damp it. It is to be observed that the dispersion fields may be inferred and/or projected based on semantic shaping and/or further diffusion; further, the diffusion may be based on attributes associated with dispersions speed, dispersion mass/density, chemical reactions/diffusion and/or other phenomena occurring between the dispersion masses and/or their interactions.

The system may project environmental conditions and/or further circumstances (at the molecular level, endpoint and further) by inferring and/or applying (learned) semantic resonance between elements forming covalent and/or ionic bonds.

The system may analyze hazardous circumstances and/or further consequences at endpoints based on the (projected) presence of artifacts at endpoints and/or further based on their profiles, circumstances and/or further consequences. The system composes and/or analyzes the worst-case and the best-case scenarios between undershoot and overshoot and/or optimal/average limits/endpoints.

The artifacts at particular endpoints may cause and/or be affected by hazardous circumstances, dispersion fields and/or diffusion. As such, the system may infer and/or factorize a causal indicator which indicates whether the artifact was the cause or has been affected by hazard. In some examples, John drives the car in a hostile and/or hazardous manner (determining hazardous endpoints and/or consequences for other participants) and (by projection) interacts and/or collides with S3P3 and further, twisting S3P3s arm; as such, the system factorizes the causal indicator of collision as being highly (positively) factorized for John, its car and/or further group thereof. In other examples, John drive his car and S3P3 is distracted by S2P2 and/or is under pressure and doesn't signal in time a hazardous endpoint and/or lane condition and/or clear a hazard and thus causing John to enter in hazardous areas and/or activities and/or potentially hitting the hazard and/or twisting S3P3s arm in the process; as such, the system factorizes the causal indicator of collision as being highly (positively) factorized for S3P3, its supervisory and/or S2P2 (as supervisory) and/or further group thereof. The system may divest responsibilities for endpoints (e.g. to John, S3P4 etc.) and/or further signal/marks the unavailability (of S3P3, supervisory etc.) and/or signal/marks hazards/unknows at monitored locations in cases of supervisory distraction, low budgets and/or under pressure. It is to be understood that the system (by WENT) may factorize, invalidate and/or decay availability based on unavailability and/or vice-versa. Similarly, the system may factorize hazard/safe, known/unknown and/or other conditions.

Analogously with inferences in regard to artifacts (e.g. windows, container/contained endpoints etc.) having (hazard) flow capabilities the system may perform flow analysis for demand, consumption, traffic, currency, cash, securities, denominators, plays, offense, defense and/or other artifacts and/or semantic groups thereof.

The system may associate offense and defense flows with offensive and defensive behaviors and/or vice-versa and perform further semantic analysis.

In similar ways with hazard flow analysis the system may perform threat and/or foe analysis.

The system adjusts the insurance premiums for artifacts and/or further owners (permanent and/or temporary) causing hazards and/or further damage.

The system monitors locations and determine hazardous handling conditions in regards with the items being handled. In some examples, the system determines that particular semantic identities have not been handled according with the established and/or inferred (handling) protocols (e.g. established by routes and/or rules) for the particular shipment and/or unloading location and/or endpoint and thus may further factorize and/or index particular semantic attributes associated with the handling/handlers semantic identity, routing, environment at the location (endpoint) and/or further circumstances.

It is to be understood that the handling protocols may be composable. As such, there may be rules for handling at a particular endpoint, rules for handling for particular environmental conditions, rules for handling for particular semantic identities (including handler and/or handled) and/or other circumstantial rules. Based on the determined semantic identities and/or circumstances the system infer, factorize and/or composes the rules to be applied while preserving the coherency.

In some examples, the system detects that an item has been handled incorrectly, by using the wrong (e.g. not likeable for the handling goal) tools/artifacts/endpoints, using hostile behaviors and/or other hazardous circumstances for the particular semantic profile. In some examples, the handling goals may comprise goals on semantic attributes such as "fragile" (e.g. the goal would be to not perform any activity which may be high entropic to fragile handling or handling with care or similar). In further examples, the fragility and/or other semantic attributes is/are associated with a portion of the item and/or further mapped endpoints and thus the system may infer the conditions, hazards and/or further manipulation and/or counter measure based on the particular portion and/or endpoints.

The system may detect hazardous handling circumstances (e.g. smashing, opening, stealing etc.) based on semantic inference; in some examples, inferences from a camera and/or further wearables are used. They may sense that the artifact has been dissociated or dropped (e.g. by a person, post, from a truck etc.), shaken, tampered with etc.; in some examples such inferences are based on the outgoing, departure entropic orientation (having high drift from moving together and/or being contained), fall detection, factorized inferences, diffusion and/or distance indexing in relation with the item and/or the carrier all of which may comprise semantic time, orientation, damping/hysteresis of (projected) activity, movement, speed and/or acceleration and so on.

It is to be observed that theft, shoplifting and/or similar may be based on manipulations which comprise (attempted) dissociation from owners/supervisors hierarchy and/or associated endpoints and/or artifacts in a hierarchical manner. The ownership hierarchy may be based and/or updated based on handovers, custody and/or other ownership/supervisor assignment/updating techniques as explained in this application. Further, based on the observing views these may be variable affirmative/non-affirmative; in the (higher) (system's) (supervisory) observing views these may be deemed as non-affirmative based on higher level and/or hard rules.

The system may automatically generate insurance claims comprising explanations (on explanatory assigned ui/storage areas/controls/fields) based on the inferences in the observing views and further when there is little shift and/or drift from the circumstances instructed to handle (e.g. file a claim when the owner is in a hostile environment, file a claim when the post crashed, do not file a claim if user says so etc.). Further, the insurance claims may be based on semantic time clauses and/or further budgets associated with provider services, deductibles, coverages, repair and/or medical clauses and/or further expenses.

The system may be biased with likeability of collapsing artifacts and/or invalidating uncertainty in relation with particular artifacts at particular semantic times.

With passing of (semantic) time, the system may affirmative index likeability (e.g. positively increase) and/or non-affirmatively factorize dissatisfaction (e.g. decay) for semantic artifacts associated with increased stress and/or dissatisfaction at the time of the experience. This may happen when the experiences generated affirmative consequences, no non-affirmative consequences or non-affirmative consequences which can decay sufficiently in time.

The system may infer deception from cloaking and/or distorting particular artifacts/opinions with high entropic artifacts/opinions in order to achieve particular goals.

We expressed that the system may focus on particular semantic identities such as "chair by the window". As such, the system may look for the intermediate and/or anchor point associated with the window and further infers the composite semantic identity; if the system is unable to locate the anchor, infer, have access and/or collapse the composite semantic identity then it remains in superposition, unidentified and/or unexplained.

It is to be observed that the system infers semantic identities based on localization, inference and/or further composition with the proximal, container/contained endpoints and/or associated attributes. In some examples, the system infers the semantic identity of "chair by the window" and later on "the chair by the table". It is to be observed that both semantic identities may refer to the same object and further they be both valid and/or the second may invalidate the first (e.g. because the chair is by the table but is not by the window anymore). The system performs distortion reduction in order to correctly infer the semantic identities. The system may associate such (temporary) semantic identities with being associated with required artifacts for starting activities (e.g. credentials, wallets, budgets, keys, fobs etc.).

The system infers whether at least one observer has been inferring the first (e.g. "chair by the window") and/or the second semantic identity ("chair by the table"). In some examples, such inferences are based on direct observations, UPIs, localization, behavior analysis and/or challenges to/from the observers. Further, the system may use the semantic profiles, semantic trails and/or further artifacts associated with the observer and/or further semantic analysis in order determine the coherent and/or less confused narratives for the observer. In some examples, the system addresses the observer with the second semantic identity in the narrative if it determines that the observer has been inferred the second semantic identity and/or with the first semantic identity otherwise. It is to be observed that the system may compose and/or use any number of semantic identities if the user/observer confusion is high and/or coherency is low (e.g. do you like the white chair by the table which was by the window?).

The system and/or an observer may compose a semantic identity by anchoring it to artifacts within a semantic field and/or view and/or further semantic times (e.g. the chair by the window); it is to be observed that the semantic time may be implicit based on circumstances or more explicit. Further, when challenging a collaborator and/or other observer with the semantic identity the system may use other semantic identities to identify the same artifact in order to coherently collapse and/or reduce confusion at the collaborator. In an example, if the system knows that S2P3 didn't observe (e.g. because observing field of views and/or challenges including of collaborators didn't comprise the anchor point and/or the semantic identity), infer and/or collapse the (current/targeted) semantic identity then, it may use (alternatively, or in addition) another semantic identity which may factorize and/or coherently collapse at the collaborator (e.g. the chair by the fireplace (before you left) (two days ago)). Analogously, the system may use the same techniques when it projects that the collaborator may have forgotten a particular semantic identity and thus, when communicating with the collaborator, it specifies an alternate semantic identity for the same artifact/object comprising another anchor endpoint and/or semantic time in order to replace and/or reinforce the semantic identity (e.g. the chair by the window which was by the fireplace (two days ago)).

The system orients augmentation capabilities and/or further fields in order to optimally augment the observer and/or user (e.g. orients sound fields, pressure, electromagnetic etc.). Further, the system uses ad-hoc semantic coupling for augmentation.

In further examples, the devices position themselves and/or are positioned by a/the robotic/post arm in order to meet accessibility inferences and/or further semantic profiles of particular users and/or artifacts.

In further examples, the assist capabilities may include helping users to position their (mobile) devices for being accessible, read and/or identified (e.g. position a user device close to a RF/ID proximity reader etc.). Other examples may include position of cameras or readers for (semantic) identifying the user (e.g. via biometrics, device etc.).

The positioning, transition and/or movement of the artifacts take in consideration diffusion, access control and coherency. Thus, as artifacts are indicated, positioned and/or moved around the physical and/or virtual environment the system may allow and/or disallow particular positionings, routes, locations, support, anchors and/or interactions based on semantic inference. Thus, the system may ensure believability, coherency, feasibility (e.g. of moving and/or supporting in the environment) and/or further factorizations.

The ad-hoc semantic coupling may be used to broadcast information to relevant parties in various environments. In some examples, the system localizes artifacts which may be exposed and/or projected to be exposed to hazards and thus, augments them with information on the hazards and/or further explanations of required activities in order to escape the hazards. In other examples, the system identifies devices and/or users which are localized within/with/of a vehicle, deck, ferry boat, airplane, train, bus and/or other transportation modality vehicle and inform them on the required activities (e.g. board, deboard, watch your step, maybe salute the crew etc.). Further examples may comprise home/restaurant/social venues and/or other environments.

It is to be observed that a device may be detected as having a semantic identity and/or being attached, in possession and/or contained within a semantic identity. Further such semantic identities may compose for decreasing confusion.

In further examples, the system uses semantic posts for (electro/magnetic) charging of energy provider modules (e.g. batteries, capacitors, chemical cells etc.). It is to be understood that the posts may be dispatched at semantic times to charge particular modules and/or devices by either wired and/or wireless (ad-hoc) (semantic) coupling. The dispatch may comprise carrying particular charging units which may be composable; further, it may be based on energy budget projected inferences (e.g. for ensuring augmentation, carrier, counter measure and/or other capabilities). In further examples, the system generates affirmative resonance and/or orientation for particular (mesh) endpoints and/or links for optimal electromagnetic charging.

The system may use forget inferences and/or further challenges in rapport with observer in order to infer whether the observer has been forgotten a semantic identity and/or the confusion is high and/or coherency is low.

The system may determine that at least one user may be associated with a first observing view and/or observing entity at a first time and with a second observing view and/or observing entity at the second time; further, the system may project whether the user has observed and/or forgotten between the first time and the second time particular semantic inferences associated with the observing views and/or further semantic augmentation. The system may project lowering confusion and/or increasing coherency towards the user augmentation in rapport with the user/s, (its/their) observing entities, semantic identities and/or further semantic profiles.

The system may determine whether a user/post has been inferring particular artifacts by observing expressed opinions, challenges, stimulation and/or excitement and/or high drift from intrinsic and/or leader behaviors.

At least two observing entities may be associated with the same user and/or different users. Further, the observing entities may be associated with (semantic) fields (of view) and/or semantic views.

The system may infer and/or use semantic profiles for observing entities. The semantic profiles may be and/or comprise hierarchical artifacts associated with a user and/or (its) observing entities and/or further semantic identities. It is to be understood that a user may be a person, post and/or other devices/artifacts potentially capable of receiving and/or processing semantic augmentation.

During inference the system may infer assist type capabilities associated with artifacts, views and/or domains which mitigates focusing and/or using budgets on such artifacts. In some examples, a device and/or post has a capability advertised as "I can support and/or assist with water and bring it on challenge request or when thirsty" and thus the system may use such feature and/or artifact to save budgets and/or focus less on finding a preferred water supply/supplier; however, if the water is not likeable the system may refactorize the support/assist helper flux.

In further examples, the capabilities may be ordered such as "I can bring/make available tea when thirsty", "I can bring/make available tea", "John is not present", "Jane present"; "I can bring/make available tea when John is not present or Jane is present"; "I cannot bring tea when John is present". It is to be observed that the high entanglement of the semantic time (e.g. John present/not-present) results in the high entanglement of the (availability of) capability (e.g. cannot/can, not-available/available etc.). Further, John and/or a semantic time (e.g. John present) is (non-affirmative) resonant (entangled) with an artifact (e.g. Jane) and/or (within a) semantic view seeking to access the water capability. In further examples, the conditions in which a capability may be used/allowed and/or blocked/not-allowed may be described in an explanations and/or descriptions and/or further matched and/or entangled against the interests and/or further entanglements (e.g. John may be present when DeLorean present beetle missing, etc.).

Further, the availability of the capability may be further factorized; in examples, such as because John 70% doesn't like (brewing) tea but instead 97% likes Jane the system may factorize and accept Jane accessing the tea capability even in the presence of John. Alternatively, or in addition, the system factorizes that John likes energy drinks with the endpoints (around the tea capability) having energy drinks capabilities and thus, John will be very likely present there at semantic times and thus, enabling the tea capability at the current endpoint.

It is to be observed that "thirsty" (or dehydrated) may be inferred by the system based on the measured parameters such as blood oxygen level through a (wearable) (mobile) (device) sensor.

The semantic devices, posts and/or credentials position themselves for allowing identification, authentication and/or access so it can allow artifacts to transition, diffuse and/or access; these may be also published as support and/or assist capabilities. In further examples, the semantic devices are challenged and/or instructed by the authenticator and/or user to position and/or configure themselves for such identification, authentication and/or access. In some examples, the user and/or authenticator device (e.g. another semantic device, display, post, lock etc.) indicates that it wants the device to go to a location and/or endpoint in order to be authenticated (the device and/or the user). While the semantic device may position itself, it may be understood that alternatively and/or in addition may be gripped and/or positioned by a semantic post. The device may be instructed and/or enable/disable/adjust capabilities in order to be authenticated and/or once at the endpoint. It is to be understood that the indications to go to a location and/or endpoint may be based on absolute and/or relative challenges, endpoints, coordinates and/o semantic identities (e.g. come closer 5 feet, go towards the fireplace by the window, position by the open window on the left, position at entrance of the conference center/room etc.); further, they may be based on UPIs wherein indicates the trajectory and/or location. The device may be also instructed to position itself in a semantic time (e.g. at the entrance of the conference room by lunch, before dawn, before John arrives etc.).

The positioning, transition and/or movement of the artifacts take in consideration diffusion, access control and coherency. Thus, as artifacts are indicated, positioned and/or moved around the physical and/or virtual environment the system may allow and/or disallow particular positionings, routes, locations, support, anchors and/or interactions based on semantic inference. Thus, the system may ensure believability, coherency, feasibility (e.g. of moving and/or supporting in the environment) and/or further factorizations.

We mentioned that the system may adjust and/or index torque, power, further (rotational) speed, load orientation and/or positioning based on incline, elevation, location, hazards, environment, weather, slippage, lateral/forward acceleration and/or further goals etc. Further, the system may use gear/clutch assist capabilities in order to manage such parameters. In further examples the system manages and/or adjusts such capabilities and/or parameters in order to realize positioning goals and/or published support/assist goals within the required semantic time.

We mentioned that the system may allow transitioning and/or diffusion based on capabilities of artifacts and/or countermeasure. In some examples, the system may allow a semantic post carrying an approved fire extinguisher in a hazardous area encompassing explosive material while not allowing an expired fire extinguisher for such purpose. In other examples, the system may allow the post carrying the expired fire extinguisher if evidence is presented that the use the expired fire extinguisher do not further increases hazard (e.g. the post sends and/or redirects to an article and/or credential attesting is potential capability, the system instructs the post to spray a small hazardous area which may not diffuse to the main hazardous area and further measure the effects etc.).

The system may transition/allow/instruct artifacts to endpoints and/or further artifacts (e.g. fluxes, articles, links etc.) in order to allow the artifact to transition and/or achieve being well-informed from ill-informed. As such, the artifacts may learn based on endpoint circumstances, conditions, inferences, routes and/or further artifacts at the new endpoint.

The system may perform semantic gating and/or access control based on whether artifacts are well informed and/or ill informed. As such, the system may allow semantic devices and/or associated artifacts in hazardous areas and/or endpoints if they are well-informed in regards with the conditions, indicators, factors, capabilities and/or further inferences at the endpoint and/or location and may not-allow, warn and/or block (e.g. artifacts, artifact/endpoint users/supervisors/owners/groups, resonant/non-resonant groups etc.) if they are ill-informed. In further examples, the system uses challenge response for determining whether an artifact is well informed and/or ill informed; further, the system may augment the artifacts so it may transition from ill-informed to well-informed. It is to be understood that the hazard of transitioning the link and/or to a (location) endpoint may be based on whether the artifact may be affected by the hazard of transitioning (e.g. due to hazard of the link or at the endpoint) and/or may pose a hazard to the link and/or to endpoint artifacts, environment, diffusions and/or further circumstances.

The system may augment an artifact in order to allow transitioning from ill-informed to well-informed.

In further examples, the system projects the stream of information to the most relevant, effective and/or available devices associated with the user.

In some examples, the system uses ad-hoc semantic coupling and/or transition of augmentation from one device to another in order to affirmatively factorize well-informed/ill-informed indicators. In some examples, the system transitions augmentation from audio to video and/or tactile in order to factorize the well-informed indicators and/or similar for the user/supervisor/operator. In further examples, the system transitions (augmentation) leadership from one artifact to another in order to factorize such indicators.

The system may optimize budgets when moving items from one endpoint to another using semantic capabilities.

The system may generate conditions at endpoints which are likeable by particular semantic identities, semantic groups and/or generalized audiences. Such likeability factors may be based on further semantic profiles. The system may adjust likeability conditions at endpoints in order to route, direct, disperse, manage capacity/demand and/or other activities.

The system may deploy measures/counter-measures/capabilities and/or agents at a first endpoint and/or divider to enable (e.g. by bonding etc.), ensure and/or enforce likeable diffusion between (divided) endpoints and/or from/to the first endpoint.

In order to bias, influence, and/or affirmatively factorize likeability of a targeted semantic identity at a collaborator (or semantic groups thereof) in a semantic view the system may present to the collaborator alternate semantic identities which are similarly affirmatively factorized on a first leadership attribute while being slightly less affirmative factorized on a second leadership attribute in rapport with the targeted semantic identity. Such techniques may (project to) induce changing anchor points in the collaborator and/or they may determine anchor point distortion.

The system and/or collaborator may counter-bias, use distortion and/or budget conditioning in order to counter such techniques and preserve the quality of inferences (e.g. through coherency, low confusion etc.). While we exemplified affirmative resonance distortion it is to be understood that by H/ENT non-affirmative resonance distortion can be used (e.g. wherein semantic identities are distorted by slightly more factorized non-affirmative options). The system uses such techniques to eliminate, condition distorted learning (e.g. intervals, semantic trails etc.) and/or optimize budgets (e.g. by optimizing overshoot/undershoot, overspend/underspend intervals).

The system may perform distortion reduction by projecting whether such tactics are deceptive and/or non-affirmative with the goals.

The system may detect deception by challenging the deceptive party and/or flux network.

In some examples, challenges comprise and/or induce projected confusion for the deceptive party. Further, the system may challenge the deceptive party to respond with activities, semantic identities, semantic trails and/or further narratives associated with projected deceptive artifacts. If such artifacts are entropic and have high drift between various (semantic) times then the system may affirmatively factorize deception (towards the user goal to reduce distortion).

We mentioned that the system uses "earlier" and "later" type inferences. When projecting in the past (e.g. opposite and/or H/ENT to the future) the system may infer that the "earlier" from present (semantic) time type inferences are associated with shorter semantic trails as opposed to "later" type inferences associated with larger semantic trails. Thus, the system is biased to infer that the time passed faster for inferences comprised in and/or associated with shorter semantic trails and passed slower otherwise. When projecting in the future the system is biased to infer that the time may pass slower when the number of activities in a semantic route are small and pass faster otherwise. Thus, in order to localize and/or collapse the present the system may use a superposition of past and future projections and/or potentially counter bias them based on semantic indicators, factors and/or budgets.

The system projects observed objects/people/modules/collaborators inferences and/or behaviors based on projected observing views of such artifacts. The observing views may be further based on (semantic) field of views and/or further semantic views.

Obturation may be inferred by the system through “earlier” vs “later” inferences. As such, the “earlier” artifacts may obturate and/or distort the “later” if they are in the same observing view. Further, the system may forget the “later” artifacts when they are obturated and are at least borderline (affirmatively or non-affirmatively) resonant with the “earlier” artifacts. Collaborators/foes may induce obturations in the system’s observing view and/or semantic view. The system may apply distortion reduction in order to counter bias the distortion, borderline deception, forgetful inferences and/or obturation introduced by foes; further, it may adjust the anchors and observing views and/or increase the semantic spread.

Obturation may be inferred by the system through “earlier” vs “later” inferences. As such, the “earlier” artifacts may obturate and/or distort the “later” if they are in the same observing view. The system may forget and/or (non-affirmatively) factorize the distraction of the “later” artifacts when they are obturated and/or distorted; further, borderline resonance of the “earlier” and the “later” artifacts (and/or semantic groups thereof) may further factorize forget/invalidate and/or distraction of the “later” artifacts.

In some examples, an “earlier” object/vehicle A obturates a “later” object/vehicle B in the far field; because the objects semantic identities seem to be less entropic (and/or have similar trajectories, behaviors, attributes and/or induce similar resonant sentiments) the system may infer affirmative resonance between objects and/or a cohesive semantic group and thus, assigns attention or resources to the “earlier” as a leader and the group’s (semantic identity) composed field envelope/signature.

In other examples, the obturation comprises a smaller (particular) size object A obturating another larger object B. The system may infer more projections (artifacts) and/or assign more attention or resources to object A as it may potentially become more easily distorted, form more containment groupings and/or (composite) semantic identities in the observing view than the larger object B.

Collaborators/foes may induce obturations in the system’s observing view and/or semantic view. The system may apply distortion reduction in order to counter bias the distortion, borderline deception, forgetful inferences and/or obturation introduced by foes; further, it may adjust the anchors and observing views and/or increase the semantic spread.

The system performs semantic network model automation in which it challenges the user to specify the meaning of various locations, mapped endpoints and/or oriented links in various circumstances and/or semantic times.

The system may determine, collapse and/or assign trajectories (semantic) identification by leadership inference on sensing while transitioning the trajectory and its artifacts.

The system may use semantic orientation and/or further leadership inference to identify trajectories, trails and/or tracks. In some examples, the trajectories are associated with sport tracks, lanes and/or runs. In some examples, the system fusions (flux) information associated with an endpoint and/or location. The system infers coherent narratives based on fusion of such information at semantic times. A user may specify, assign and/or instruct the system on its interests based on and/or comprising trajectories, areas, endpoints and/or further semantic times and thus the system performs semantic augmentation based on such interests and further semantic analysis.

A user may specify trajectories, areas and/or endpoints from which to publish/ingest notifications as those are inferred/published, based on semantic artifacts and/or semantic gating. The user may specify particular semantic identities (and/or associated fluxes/channels) and/or other circumstances and the system may use similarity in semantic orientation, low drift and/or shift to identify such identities and/or circumstances. The system may use ad-hoc semantic coupling to ingest and/or connect with semantic identities, fluxes, themes and/or semantics artifacts (which publish information) at the targeted trajectories, areas and/or endpoints.

The system/user may be more specific and/or enhance/collapse the interest space-time localization by considering/specifying the circumstances at artifacts of interest which may have low drift and/or shift from interest semantic identities, conditions and/or further circumstances (e.g. notify and/or connect on semantics and/or fluxes which go through route/endpoint A in similar conditions with what I experience/d, notify and/or connect me with all experienced bike riders which pass and/or use A, notify me on the slide semantics published by similar experience bike riders in freezing conditions at A). The system may further infer and/or assign likeability, resonance and/or further factors to coupled fluxes/channels. In some examples, based on likeability, affirmative resonance, friendliness and/or further affirmative factors the system may decide to keep connected and/or connect at semantic times with such fluxes/channels. In further examples, by H/ENT, based on non/low (non-affirmative) likeability, resonance and/or further factors the system may disconnect and/or expire such fluxes/channels.

In further examples, the system projects and augments fluxes and/or associated artifacts (localized) at endpoints. As such, the system determines that there may be a factorized hazard and/or non-affirmative factorized condition at a projected endpoint (for a user, artifact and/or flux) and augments a user, artifact and/or (entangled) flux. Alternatively, or in addition, the system may project a hazardous trajectory, condition and/or entanglements at endpoints; further, it projects distance and/or speed semantics by inferring semantic indexing of semantic shapes. Further, the system detects hazards based on possible non resonant threats and/or consequences at locations. The hazard is indexed by the distance and/or speed of projected hazards (e.g. the threats approaching vs subsiding, approaching fast vs subsiding fast etc.).

The system may infer and/or project the availability of semantic identities, capabilities and/or artifacts at particular semantic times and further based on semantic profiles. In some examples, the semantic identities and/or further artifacts (e.g. endpoints, links) are associated with parking endpoints (e.g. clean parking spot, parking spot no 3, the parking spot by the store, unoccupied parking spot by the store, Jane’s parking spot etc.); further, they may be associated with driving and/or traffic areas/lanes and/or associated artifacts. In other examples, they are associated with chairs, tables and/or seats in an event venue or facility (e.g. conference room, sport venue, exercise venue, hair dresser, washing venue etc.). In general, the semantic identities may be associated with mapped endpoints in different environments and/or circumstances.

The endpoints contain and/or are contained in other endpoints (e.g. a semantic camera module "S2P2 camera" is comprised in S2P2, S2P2 comprises "S2P2" camera, Jane's parking spot comprises Jane's (potential) (beetle) car etc.). The contained/containment may be entropic and/or superposed (e.g. not collapsed to one well defined semantic identity endpoint); as such, Jane's parking spot may not comprise and/or contain entirely Jane's (potential) (beetle) car because the car partially occupies another adjacent parking spot; further, the car may not occupy entirely Jane's parking spot and thus the system may infer that "Jane's parking spot 81% comprises Jane's beetle looking car" and/or further "Jane's beetle is contained (maybe) 63%-67% in her parking spot and (maybe) 25% in John's). It is to be observed that though the system may consider the beetle car in superposition in regard to the parking view at a semantic time, in further examples, it may collapse the superposition if the semantic identity of Jane's and John's parking spots/endpoints is collapsed, fusion-ed and/or redefined (e.g. DOE parking area, Jane's beetle is parked in DOE'S parking area). Similarly, the system may determine occupancy of traffic lanes, event/venue furniture (chair, tables etc.) and/or other artifacts (e.g. furniture, fireplace ledge etc.). The system may collapse Jane and John (parking) area/endpoints semantic identity if they are not highly entropic in the observing view in relation with the beholder's/observer view goal. In further examples, the observing view see the DOE semantic identity as highly entropic and/or likes one Doe and/or dislikes the other and thus it cannot accept/allow the (circumstantial e.g. parking) semantic identity to be collapsed and/or assign it to a/the highly entropic semantic group. In some examples, we mentioned that the system may be challenged to describe and/or explain orientations within the semantic field and/or further observations/opinions (e.g. "where's your head at"). Further challenges to explain and/or describe anchors may be used (e.g. what is at your most right (endpoint)? How long did it take to reach it? How is the polarization distortion? Is it friend or foe?, what is on the left side of the chair by the windows?, what is behind the chair? what is at 11 orientation?, which magazine is the nurse holding? Health Affairs? etc.). Thus, the system may learn and/or calibrate inferences and/or sensing based on semantic fusion.

Users may instruct the system to observe, infer and/or learn at particular semantic times. Analogously, the users instruct the system to not observe, infer and/or learn at particular semantic times.

The system determines the leadership which determined readiness and/or success and/or, leadership which determines non-readiness and or non-success/insuccess.

The system may gate/publish artifacts and/or further explanations comprising summary of learning, capabilities and/or further semantic times. In further examples, collaborators/fluxes may challenge the system and/or the user to specify what (capabilities) it did learn within a semantic time. The system may use explanations comprising leadership artifacts, inferences and/or narratives.

In some examples, users and/or collaborators may select various models and the system performs fusion of the models; during fusion the system may reduce confusion and/or increase coherence through challenges to the collaborator and/or the user/owner/supervisor.

In some examples, the system performs fusion to be applied and/or transferred to semantic posts, modules and/or units.

While published models may be associated with posts alternatively, or in addition they may be associated with endpoints, venues, events and/or further semantic times. As such, the system, collaborator and/or user may select to apply particular models to other endpoints, venues and/or events based on particular (resonance) goals and/or factorizations.

In some examples, John likes the explanations and/or/of capabilities published for a particular football venue and applies its model to a desired baseball venue. Further, John may apply the capabilities from another baseball venue and applies it to the desired baseball venue. While the capabilities may be applied overall to the desired venue it is to be understood that they may be applied only to specific semantic profiles and/or to the user (John) based on access control and/or further challenges (e.g. to the user). While (sports) venues have been exemplified it is to be understood that the venues may be associated and/or substituted with other types of containers, vehicles, posts, carriers, facilities, warehouses, stores, houses, rooms and/or modeled artifacts.

While performing inference, in order to reduce the semantic shift/drift/orientation and/or achieve semantic resonance with the desired/likeable (fusioned) models, the system may look to map, group and/or infer resonance between the existing capabilities at endpoint and/or existing capabilities at the specified model endpoint.

The system infers non (affirmative)-resonance and/or lack of capabilities to the desired venue/artifact when (projects) applying the model (e.g. the system infers that John's baseball venue doesn't have countermeasures and/or spaces are too small). Thus, the system may challenge the user and/or fluxes (whether associated with the specified models or not) to demand/acquire/transfer/transport such capabilities and/or project the flows in order to counter act such shortcomings and thus inducing (e.g. at the users, visitors, collaborators etc.) the desired (affirmative) resonant capabilities.

While a user may apply particular models to selected artifacts, in addition, it may also specify its own desires, rules, routes and/or challenges.

A user may like a semantic model to be applied over the other based on the explanation of capabilities, learnings and/or future projections of the missions or goals. In some examples, John may prefer the beetle looking car if he travels and/or has a trajectory to a venue or goal projecting animated characters resonance and thus creating (affirmative) resonance between John, goals and the selected model; further, the (affirmative) resonance may diffuse to the artifacts at the venue and/or endpoint (e.g. John is more likeable and/or affirmative resonant at the venue, endpoint etc. because he is grouped/identified with a beetle).

We mentioned that the system may use semantic profiles to interpret information and/or learn. As such, the semantic profiles may be hierarchical where more general semantic profiles associated with more general semantic identities have a larger resonant interval while the more focused and/or specific semantic identities have more specific resonant semantic intervals. The system may associate the collapse and/or compose of semantic identities with the collapse, reduction and/or more specific localization of the specific (hierarchical) semantic profiles intervals within a semantic time.

The system may gate/publish artifacts and/or further explanations comprising summary of leanings within a semantic time. In further examples, collaborators/fluxes may challenge the system and/or further the user to specify what did it learn within a semantic time. The system may use explanations comprising leadership artifacts, inferences and/or narratives.

We expressed that the system may use time management to project the optimal circumstances and/or (semantic) (time) interval for activities and/or use of budgets.

In some examples, in the application the term "doubt" is used. It is to be understand that the doubt may be associated with increased superposition and/or confusion factors. The doubt, superposition and/or confusion factorization may be affirmative/non-affirmative towards the system's goals. Further, we mentioned that the doubt may cause larger damping and/or hysteresis; in order to decrease doubt the system may target to reduce damping and/or hysteresis and thus further increasing semantic field localization.

In some examples, the system counts the number of transitions and/or further activities of an artifact to an endpoint and further infers a number of (activity) circuits and/or shapes within an interval if the route between entering and/or starting (the artifacts and/or activity) and exiting and/or ending the activity has little drift from one another. The system may infer closed and/or lapped activities, semantic shapes and/or further associated (semantic) times, routes and/or characteristics. Further, based on such inferences, the system may further infer particular semantic attributes and/or further rules for the enclosed area and/or shape.

The system projects particular shapes and/or associated semantics based on diffusion capability (of the semantics), composition, saturation, damping, hysteresis, resonance and/or further semantic analysis. In some examples, conditions and/or waves at endpoints and/or locations are within hysteresis and/or damping interval and thus a perturbation (incoming and/or outgoing) and/or change of circumstances at the endpoint may determine further superposition, diffusion and/or oscillatory orientation of the particular superposed and/or damped activities. In some examples, recurrent/closed/lap activities may determine ongoing oscillation and/or further resonance which can associate the lapped shapes, artifacts and/or activities in the semantic view.

We mentioned that the semantic posts may perform activities at venues, locations and/or endpoints. The start of the activities may be associated with requests received via web protocols, http requests, network protocols and so on. As mentioned, such requests comprise credentials authenticating and/or identifying the requestor. Further, they may comprise preferences and/or other semantic artifacts embedded in the request parameters, cookies, objects and/or further components.

Once the preferred items are identified, liked, committed and/or purchased the posts may transfer transaction information to the item (e.g. via data transfer to a tag, tagging the item via optical and/or other electromagnetic means etc.). Further, the post/carrier may move the articles for the order to a packaging endpoint and/or area and/or package them. In some examples, the system determines packaging based on containment and/or support. It further may attach order and/or destination information to the packaging and/or move them to shipping area and/or ship them. It is to be understood that during this semantic endpoint workflow the system updates order information backends, users, fluxes, supervisors with the inferred semantics for the item.

The system may power and/or automate carts and/or other carriers. As such, the carts may be instructed to follow the supervisor, collect, pick up items and so forth. In some example, the follow instruction may be based on determining and preserving a likeable distance from the supervisor while performing an activity (e.g. shopping). It is to be understood that the instructions may expire once the supervisor leaves a particular area (e.g. a shopping parking area etc.).

The user may challenge the system to move an item to a location based on particular trajectories, semantic routes and/or semantic times (e.g. bring me my luggage at gate 3 by the window after I finish lunch, move the luggage at gate 3 and leave it there). It is to be observed that the system may infer based on the instruction (e.g. "bring me") that it needs to meet the user and further need to identify and/or authenticate it at the meeting location and/or endpoint while, in the other example the meeting at the endpoint is not required (e.g. "leave it there").

Based on activity and/or further meeting inferences the system may generate items in a calendar comprising the activities, meeting semantic identities, required credentials and/or further semantic times.

As mentioned, the system may identify objects (e.g. luggage, articles, boxes etc.) on a base or support. In some examples, the base and/or support may be stationary, moving and/or in motion (e.g. vehicles, conveyor belts etc.). The system may use radio frequency identification, optical and/or sensing methods for semantic identification.

The system may determine and/or be provisioned with artifacts to help it recognize the objects (e.g. leadership semantics, pictures of the objects, identification of the objects, semantic time interval etc.); the system may infer leadership artifacts for semantic identification when presented with object image/s, explanations and/or descriptions on appearance, behavior and so forth. When the desired object and/or semantic identity is detected, the system may notify the user on the location, behavior and/or further conditions (threats, hazards etc.) of a semantic identity and/or article.

While the system may detect and/or track the items in multiple locations in a trajectory, it may also detect the items in one location and infer the further locations based on the movement and/or diffusion of the container/support/base, its endpoints and/or components. In an example, a camera and/or other sensor is observing an area comprising a base/container/support (e.g. conveyor belt), identifies and localizes a semantic identity and/or item. Further, the system may know, determine and/or be provisioned with the speed and/or trajectory of moving on the base/support and thus, it further indexes, diffuses and/or determines the location of the items (e.g. within the base/container/support surface/area). In some examples, the system infers the speed (of diffusion) on/of the conveyor belt by determining the number of components (e.g. belt elements, luggage etc.) and/or endpoints which pass, diffuse and/or are present at a/the monitored endpoint/location potentially within a semantic time; further, the belt may be attached to a carrier and be in motion itself and thus, the system infers the semantic identity, endpoints and/or locations based on further semantic analysis. Thus, the system improves the observing view comprising the base, support and/or monitoring area. The system may determine the capabilities and/or number of posts at locations based on capacity and/or demand inferences.

When communicating, the system and/or further mobile/post devices may use the lowest signal strength which doesn't generate confusion; this may be used for security and/or interference mitigation purposes.

The system and/or device may secure and/or lock the transaction/order information in memory/storage. Further, it may establish leaders and/or supervisors for the transaction (e.g. semantic identities holding the access credential and/or transaction data); the leader of the transaction may be the original device/modules/posts which handled the user request and/or it may be redirected/transferred/delegated to other devices/modules/posts (e.g. based a circumstantial leadership in regards with the transaction, budgets and/or endpoints). It is to be understood that the transfer of leadership may comprise multiple levels and/or hierarchies. Subsequent requests for reading the memory and/or transaction may be allowed only through the leaders of the transaction and further coherent and/or non-confusing inferences. A leader of the transaction may determine and/or delegate other leaders for the transaction.

A user may challenge for particular articles, and the system localizes them based on the information collected from the posts and further presents the user with the option to virtually see, touch, buy and/or move them. As such, the system activates semantic posts at the particular venues in order to perform the desired activities. It is to be understood that the user and/or requestor may be charged based on the posts energy consumption and/or further parameters such as venue occupancy status, time of day, posts capacity/demand and/or further semantic times. Further, the semantic posts may be identified with semantic identities composed based on particular venues, semantic times and/or further inferences. The system may optimize inference by gating, blocking and/or conditioning signals, frames and/or artifacts which do not collapse in new semantic identities and/or generate high drift, shift and/or change in orientation in rapport with the projected inferences at particular hierarchical levels and/or endpoints within an interval of time. In some examples, in event renderings, such artifacts are gated if they do not change the orientation, drift and/or shift at the hierarchical level 2 and/or "luminescence patterns".

Sometimes, when focused, the system may infer based on artifacts which generate non-affirmative and/or non-resonant factors and which are not semantically identified, promoted and/or published/diffused. In order, to counter-bias such tendencies, when budgets allow, the system may use alternate semantic views and/or projections to identify such artifacts and/or diffuse them beyond the cutoff layer. Alternatively, and/or in addition, the system performs affirmative and/or resonant semantic identification, promotion and/or publishing/diffusion.

The system may store artifacts in memory based on identified (leadership) semantic identities, anchors and/or further semantic hierarchy; further, as it roams from one endpoint to the next the system activates and/or learns such particular artifacts at endpoints. In some examples, as the system determines that is in a/the projection room it may activate, compose and/or factorize particular leadership and/or anchors associated with the projection room semantic identity hierarchy (e.g. "a projection room", "building A projection room", "ultrasound projection room", "teaching cases projection room" etc.).

The system may apply as leaders and/or factorize the artifacts associated with the most specific and/or localized and/or anchored semantic identity. Further, it may perform semantic learning by promoting and/or publishing to less localized and/or anchored artifacts within the hierarchy. Leadership may be based on the consequential/discriminatory contribution to an orientation and/or outcome (e.g. a player and/or further trajectory is deemed as the most consequential in a likeable play and/or is deemed as the most discriminatory in rapport with another play etc.).

A semantic profile may specify a preferable non-distorting general semantic identity; further, the profile may specify which endpoints, areas and/or components to be blurred (e.g. blur the license plate, the auto brand etc.); thus, the system blurs the endpoints and/or areas, based on the specified components/areas and/or leaders which determine the composition and/or identification of the current semantic identity from the preferred semantic identity. In some examples, when confused, the system may blur alternate areas/components specified by the user or the semantic identity altogether.

Blurring may be associated with overlays, conditioning and/or further tags/labels comprising the preferred semantic identity.

We mentioned that the system may consider user profiles at particular endpoints and/or locations. In some examples, in order to enforce user preferences and/or privacy rules the system applies user semantic profiles (e.g. which may be stored and/or received from (mobile/robotic) devices and/or based on semantic identities associated with the device) at locations and behaves based on such profiles. In some examples, the user doesn't want that particular artifacts (whether (supervised) objects, him/her and/or particular groups and semantic identities thereof) to appear and/or be identified in the camera renderings, narratives and/or recordings and as such, the system gates, blurs and/or generalizes such presence at particular endpoints (e.g. inference, stream, recorder, storage etc.). It is to be understood that such preferences may be applied to semantic identities in any form of augmentation (e.g. semantic identity in the video stream, in the narrative etc.). In further examples, the supervisory and/or operator rules at the endpoint and/or location may comprise rules for allowing only partially and/or diffused semantic identity blurring by augmenting the semantic identity with further less particular semantic artifacts (e.g. John is blurred as "a person", "beetle driver" etc.). It is to be understood that such blurring may not be discriminatory and/or distorting.

The device may be associated with a post, vehicle, mobile/robotic device, module, unit and/or any other device capable of storing and communicating the profiles and/or preferences.

The device may be a semantic composite. In some examples, a mobile device is plugged-in to a semantic post module (connector) and the credentials and/or published models from the semantic device are applied and/or used on the semantic post inferences. The mobile device may function as (temporary) supervisory comprising highly factorized semantic rules, routes and/or further artifacts.

A device may encompass a variety of (wireless) communication components and/or interfaces. Further, it may encompass a variety of sensors.

The profiles may allow the user to specify fluxes and/or themes to which to publish/allow/disallow/gate specific (blurred) semantic identities (e.g. sends to Jane flux "John driving the DeLorean", sends to toll collection "a car", "a car with a person", "a car with a person driving", "a car with a passenger" etc.). The user (semantic profile) may indicate the semantic times of blurring.

The blurring may be pursued and/or ceased based on an absence from an endpoint (associated with a semantic profile) and/or (further) semantic times.

It is to be observed that the preferences, interests (e.g. at toll collection) and/or further blurring may comprise the number of artifacts comprised and/or contained within the carrier and/or endpoint (e.g. car) and/or further (artifacts) activities. The system may match preferences and/or interests of the consumers (e.g. toll collection), supervisors and/or owners based on gating, semantic drift, factorizations and/or publishing rights; as such, the consumer preferences and/or interests may be served and/or negotiated based on publishing, gating and/or blurring by supervisors and/or owners (of the information and/or at the collection endpoints/links) in a hierarchical manner; further, semantic artifacts hierarchy gating and/or blurring may be applied. In some examples, a configured endpoint profile (e.g. by a supervisor/operator) comprises (configured) preferred blurring semantic identities (at the endpoint) and the system matches a (user/operator) mobile/robotic device profile preferred blurring semantic identities (at the endpoint) with the ones in the configured endpoint profile based on semantic drift and/or further semantic analysis and/or projections.

In further examples, when no preferences are expressed the system may be setup and/or determine by itself the lowest drift semantic identities between the flux identification and the published/gated semantic identity to the flux (e.g. “toll collection” has lower shift to “car” than to “John driving”, “DeLorean” and thus the system prefers/likes “car”). Similar techniques may be used to determine interests, focus and/or recommend (e.g. the system focus on color red and/or sports cars etc.) on particular circumstances and/or fluxes. Further, the system may identify the most localized semantic leadership to discriminate focus, interests and/or recommendations. The system may not allow the blurring if it infers distortion, high drift and/or is confused on the user profiles/preferences and/or on fluxes; thus, it may not allow the blurring and/or, it may challenge the user to modify profiles and/or preferences.

The system blurs the frames and/or renderings at endpoints while preserving sufficient artifacts to reconstruct the frames and/or further semantic identity. In further examples, such reconstruction of semantic identities (at endpoints) may comprise localized (at semantic identity endpoints) conditioning with the original semantic identity artifacts. The system may invalidate identification artifacts and/or snippets at endpoints based on semantic time management.

Analogously with the semantic blurring invalidation the system may invalidate the semantic profiles. In further examples, the semantic blurring (artifacts) and the semantic profiles may be invalidated at the same time.

The system may inform/challenge the supervisor based on coherent augmentations in regards with the blurred semantic identities inferences, behaviors, breaches of behaviors, associated semantic profiles and so on.

While a device may be challenged and/or send its user and/or artifacts (semantic profiles) at an endpoint it is to be understood that such semantic profiles may not expire once the artifacts leave the endpoint. In some examples, the user specifies the timeline and/or semantic time of expiration; alternatively, or in addition, the system infers endpoint diffusion, expiration, invalidation and/or semantic times based on circumstances and/or further challenges; once invalidated and/or expired the system may further challenge the (semantic identity) device/s for profiles. It is to be understood that the system may challenge a group of devices associated with the user and/or semantic identity and infer the composed and/or compounded user profile based on coherent, non-confused (projected) inferences.

In some examples, the expiration may cease once the system infers particular (DO NOT) behaviors as setup and/or learned from supervisory entities (e.g. the invalidation ends when the semantic identity is hostile towards a non-hostile by-passer and/or may start again when the semantic identity behavior is likeable etc.). Further, when such behaviors are inferred, the system may not invalidate the previous recorded and/or stored snippets/artifacts/overlays associated with the semantic identity. Instead, it may challenge leaders/supervisors about the behaviors and/or further send associated recorded artifacts. Challenges with leaders/supervisors may determine transfer, invalidation, deletion and/or other measures and/or counter measures.

Counter measures may be inferred, recommended and/or applied for affirmative factorization.

The semantic profiles may comprise further user preferences and or artifacts associated with (I WOULD LIKE TO) DO, DO NOT and/or MAYBE (DO, DO NOT and/or superposition). As such, the system may allow/disallow and/or signal/challenges about the likeability and/or non-likeability of such artifacts at particular endpoints and thus, the user/device likeable trajectories and/or endpoints may be further adjusted.

The challenges may be transmitted/received from a device associated with the endpoint; further, the system may localize the device at the endpoint.

The system may know, receive and/or detect sensors in the route. The sensors may not respond, may not implement and/or may not have capabilities for semantic profile requests and as such the system factorizes the (likeability of) routes comprising such sensors and/or further semantic field (diffusion) accordingly (e.g. may not be preferred due to lack of privacy enforcement, high risk etc.).

The system may fuse rules and/or artifacts at the intersection, fusing and/or collapsing of zones and/or locations. Further, it may use projected inferences on the fused artifacts in order to adjusts and/or determine factorizations of the artifacts based on coherency, confusion and/or further factors. The system may also fuse endpoints, zones, locations and/or artifacts based on particular semantic identities which may be associated and/or projected at those endpoints and/or locations. In some examples, such semantic identities are projected as being supervisory, hazardous, anti-hazardous and/or under other profiles and/or circumstances.

In further examples, the system may suggest and/or allow the user trajectories and/or orientations which are resonant with his privacy/profile goals and/or rules. Further, the system may block, invalidate and/or eliminate routes which are not resonant with his privacy/profile goals. It is to be understood that the resonance may be based on projected inferences, challenges, orientations and/or further drifts from his advertised (privacy) semantic profiles. In some examples, the system beams (e.g. focuses, orients, semantic wave address/encode) his challenges and/or profiles to particular leaders, endpoints and/or fluxes (e.g. more trusted, less risk of dissemination etc.) for further security and/or privacy enhancements.

Users and/or posts may use UPIs for indication of artifacts. It is to be understood that the system may use UPIs to indicate zones, locations, trajectories and/or further endpoints, Further, the system may augment such indicated zones, locations, trajectories and/or endpoints with further semantics.

A user may use a camera (of a module, post and/or mobile device) to capture and/or render an environment, support and/or group of objects. Further, the system localizes, recognizes and/or authenticates the semantic identities and tags them in the image. The user may select objects from a group of objects (e.g. by UPIs, touch, voice etc.) to communicatively connect, disconnect and/or move.

In further examples, the system points a mobile device camera and/or UPI to encompass and/or selects the tea pot on the fireplace and further points the camera to encompass and/or selects a projection/TV set and/or further superpose/joins them and/or challenge to connect, disconnect, join, render and/or perform further activities as a semantic group.

The system may select a semantic identity of interest and further semantics of interest for the semantic identity. In further examples, the system creates a (social/web/communication) channel, thread and/or semantic flux where all the desired notifications about the semantic identity are posted based on semantic analysis. As mentioned, the system may compose and/or collapse such semantic identities and/or further channels and/or fluxes. In some examples, the channels are represented with multimedia/icon artifacts representative of semantic identities and the user drags them on top of each-other and thus the system infers that the user creates a composable channel and/or flux associated with the composed semantic identity (e.g. John and Jane flux collapses to Doe family); further, the system may seek multimedia/icon artifacts representative of the composite sematic identity in order to represent and/or mark the composite channel and/or flux (e.g. on a screen, virtual environment etc.).

The user may superpose and/or join two sematic identities and/or objects and the system performs semantic analysis of composite opinions and/or further semantic profiles of the object/semantic identities. Further, (composite) activities as a semantic group may be projected, indicated and/or pursued.

The system projects distance and/or speed semantics by inferring semantic indexing of semantic shapes. Further, the system detects hazards based on possible non resonant threats and/or consequences at locations. The hazard is indexed by the distance and/or speed of projected hazards (e.g. the threats approaching vs subsiding, approaching fast vs subsiding fast etc.).

The user/system may use UPIs and/or challenges to (instruct the system) to connect, superpose and/or move two elements, semantic identities and/or further artifacts. In some examples, the user/system indicates and/or moves an element on the fireplace on a projector/TV set and/or (further) instructs the system to connect them (e.g. "connect those", "connect the tea pot on the fireplace with this TV", "connect the temperature sensor of the tea pot with the TV in the teaching area" etc.). In further examples, the system may connect two projection and/or display controls and/or further components. Even further, the user/system may use semantic times to connect artifacts (e.g. "connect and/or record those when energy is cheapest", "connect my mobile to Jane's to watch John playing baseball", "connect those when is reasonable safe", "disconnect those after the game unless John signals or says otherwise" etc.).

The (access) control rules and/or (comprising/comprised) semantic routes for manipulating (robotic) devices, projection and/or display surfaces may be based on semantic times. While in some examples, the semantic times may comprise semantic identities, alternatively, or in addition, they may comprise other semantics which are not (used to identify) a semantic identity and/or associated objects. As such, the system infers the corresponding semantics and/or apply semantic analysis to determine the applicability of the semantic times and/or further control rules.

In further examples, a supervisor/user may instruct the system to create similar ambience and/or augmentation while roaming around. In some examples, as Jane roams (e.g. around the hospital, around the house etc.) the system applies the rendering, manipulation and/or access control rules to artifacts based on their associated semantic identities and/or further semantic similarity and/or drift. As such, when Jane moves from the CT reading room to the patient care room the system may pause, switch and/or stream in the CT reading room and/or continue to stream/display the imaging/video (exam) (including its visualization settings such as user interface control arrangements, zoom etc.) to a/the patient care room (display) based on semantic times, semantic matching and/or further access control (e.g. other patients not watching, only Jane and John watching etc.). In similar ways, the system may pause, stop and/or (continue to) play streams and/or renderings at semantic times (e.g. when Jane is not observing and/or John is observing, Jane is leaving and John present etc.).

It is to be observed that the system may associate and/or add markers within the stream (artifacts) based on inferences and/or semantic times. In some examples, the system may mark/pause/not-pause/switch/not-switch the stream (ing) and/or render (ing) based on presence, observing views and/or semantic times (e.g. as Jane leaves/arrives and/or observes/not-observes the system switches to rendering a login interface and/or switches/continues to streaming a John's shoulder CT exam (and/or baseball game) when John present etc.).

In further examples, the system matches the markers within a (cine clip and/or associated semantic) stream with semantics in the semantic times. As such, as Jane moves out and or transitions CT READING ROOM->PATIENT CARE ROOM, the stream may be marked as OPEN, JANE LEAVES THE CT READING ROOM and further, when JANE ARRIVES TO THE PATIENT CARE ROOM and/or the system determines the transition of JANE CT READING ROOM—>PATIENT CARE ROOM the system may have configured and/or determine an (endpoint) (profile) and/or semantic "CONTINUE TO PLAY OPENED EXAMS" for a PATIENT ROOM DISPLAY. In some examples, such configured preferences are stored in semantic profiles wherein the system determines that the SHOW OPENED (CINE) CLIPS/EXAMS semantic applies to JOHN BED DISPLAY based on a semantic matching and/or similarity between PATIENT ROOM DISPLAY (in the profile) and JOHN BED DISPLAY semantic identity (at the patient room and/or bed endpoint) and/or further between the stream marker semantics OPEN, JANE LEAVES THE CT READING ROOM. Alternatively, or in addition, the system determines a next leadership streaming control activity (e.g. JANE WAVING THE NEWSPAPER) and may mark the stream accordingly once it infers that JANE LEAVES THE CT READING ROOM; further, it may continue streaming from the marker once it infers JANE WAVING THE NEWSPAPER.

Alternatively, or in addition, of marking the stream with the significant semantic artifacts the system associates the significant (inferred/projected) semantic(s) (routes) (times) with stream identification and/or further pointers/markers (e.g. stream (semantic) time pointer/reference, frame pointer/reference, rendering artifact pointer/reference etc.) and/or (associated) semantic times.

The system may transfer and/or communicate streaming artifacts (e.g. between entities, devices, processors, units, memories, collaborators, fluxes etc.) based on the semantic pointers and/or further projections (e.g. sends (subsets of) streaming data to the patient reading room based on the semantic projections and/or further semantically matching the inferences with the stream markers).

The user may be associated with a semantic identity and is further authorized and/or authenticated. In further examples, the user is a permanent or temporary (e.g. based on semantic time) supervisor and/or leader. A supervisor and/or leader may further indicate, specify and or delegate (e.g. via UPIs, challenges, augmentation etc.) further supervisory, leaders and/or authorized semantic identities and/or further users. It is to be understood that the supervisory and/or leaders may comprise a hierarchy as previously explained and further they may be allowed/not allowed/gated to particular capabilities at particular semantic times and/or particular artifacts (e.g. "this tea pot may be connected, moved and/or projected by a person with a newspaper", "the nurse with the newspaper may manipulate and/or project the tea pot in the teaching room during health programs", "the tea pot may pe connected, moved and/or projected to the desk CT monitor in the teaching area", "this person is not allowed to move the tea pot during health programs watched/observed by Jane" etc.).

The delegations and/or authorizations may be (observing/observed) semantic identity, semantic time and/or further semantic artifacts dependent.

The system adjusts sensing, modules, units, meshes, radiation and/or further parameters in order to encompass only the required connecting semantic identities (e.g. adjusts signal strength and/or radiation at the tea pot communication electromagnetic interface to encompass only the TV in the teaching room and/or vice versa). Further, the system may use other sensing elements to induce non-coherency and/or confusion at non-authorized and/or non-connecting listening sensing artifacts.

The system may augment and/or challenge when there is a high drift between connecting/moving artifacts and/or further hazardous consequences at endpoints (e.g. "the tea pot is too hot for the fireplace (surface)", "the tea pot doesn't match with the DeLorean on the TV (surface)", "the tea pot is not or cannot be supported or likeable here and/or there", "the tea pot there is not resonant with John which may think that is hazardous", "too many foes on the TV or connection" etc.).

The system may be more circumspect and factorizes accordingly an (augmentation) artifact (e.g. song, advertising etc.) which may project hostile/hazardous/ill orientation.

We mentioned the use of the piezoelectric components for sensing, actuating, damping, locking and/or further suspension components. Further, actuation and/or waves/signals applied to piezo components may be used for further semantic conditioning and/or augmentation (e.g. resonant and/or vibration generation, mechanical wave, pump/pressure control etc.).

It is known in art that piezo components (e.g. comprising crystals, ceramics, perovskites, polymers and/or other (piezo) like/similar materials) may generate energy (e.g. voltage charge, currents) once deformed, strained, stressed, under-pressure, distorted, compressed and/or through vibration. Further, such energy may be harvested, stored and/or used to re/charge batteries and/or further modules.

The piezo components may generate voltage, polarities, polarizations and/or currents when vibrating closer to their resonant frequency. The system may use semantic resonance inference, conditioning and/or further analysis to analyze and/or control vibration, waves, signals, polarization, polarity, components, modules, units and thus generating resonant vibration at the piezo elements.

The system may induce distortion and/or under-pressure of the piezo component in order to generate energy and/or generate affirmative resonance.

In some examples, the piezo components are adjusted in order to reduce/condition/compensate mechanical wave/vibration in a platform, carrier and/or support. In further examples, they are used to adjust the anchors, observing/sensing field, semantic spread and/or semantic view.

In some examples, two modules and/or endpoints are connected through a piezo connected and/or enabled element/motor and the system associates semantic resonance between the modules when vibrating at or close to the piezo element (and/or further semantic artifact) (mechanical) (intrinsic) resonant frequency. Further semantic resonance analysis may be applied.

Piezoelectric materials may be polar and non-polar. The polar piezoelectric materials allow spontaneous polarization.

The polarization and/or polarity at/within the piezo material and/or components may be further associated with semantic (factor/indicator) (analysis) polarization and/or polarity.

By using piezo components within the locks, hooks, dampers and/or further suspension of the posts modules/elements the system may be able to harvest free energy when the modules inherently move and/or generate stress/pressure/vibration/strain at the joints during a post and/or carrier operation.

The piezo components may be comprised in (piezo) linear and/or rotary motors which are attached, comprised and/or control the joints, locks, hooks, dampers and/or further suspension components. As such, the system may control the modules joints by actuating the piezo components in the motors and further harvest energy when the joints move.

In further examples, the system actuates the piezo components to create various shapes and waves of/within a carrier structure.

Further, the system may control the damping, vibration and/or diffusion of movement/shock waves between components by actuating/controlling piezo components which deform and/or vibrate and thus, allowing the system to better apply an overall (post/carrier and/or groups thereof) damping, vibration and/or dissipation of the (mechanical) energy and/or shocks.

The system may use semantic wave conditioning, further mapping and/or actuation to control the piezo components. In some examples the system may want to dissipate and/or diffuse the mechanical shock/vibration/wave within a carrier from a particular area and/or endpoint/s to another area and/or endpoint/s and thus the system may use sematic analysis including semantic conditioning and/or diffusion to enable the actuation/control of the piezo components within the modules joints. It is to be understood that the modules joints may be mapped to endpoints comprised within the modules and the system uses hierarchical inference to condition the sensing and/or actuation via (semantic) waves.

In further examples, when energy budgets are low the system may harvest energy by adjusting the distance, movement and/or damping in/between joints/modules and thus allowing resonant movement of the joints; as such, optimal vibration, diffusion, strain, distortion, pressure, movement and/or stress is created in the piezo enabled joints and thus generating and/or further storing energy. The system may use converters, rectifiers, semantic units and/or further signal conditioning to rectify the currents harvested from the piezo components and before being applied to the storage elements (e.g. batteries, capacitors etc.). It is to be understood that in general, charge/discharge and/or similar supply/demand controls (e.g. for energy, charge, currents, waves etc.) may be signal conditioned based on semantic inference (including WENT between charge-discharge, supply-demand etc.).

In some examples, the semantic post units and/or further piezo elements are coupled to elements and/or endpoints capable of capturing, connecting and/or diffusing environmental vibrations. In some examples, such elements comprise surfaces which move and/or vibrate when particular conditions occur (e.g. a sheet of polycarbonate capturing wind and further diffusing vibration in the post ensemble etc.). Further, in order to ensure continuous vibration when the environmental conditions orientation and/or diffusion stall the vibration (e.g. wind constant in a particular orientation on the polycarbonate sheet) the modules and/or posts may further comprise countermeasures and/or control suspension elements (e.g. springs, coil-overs etc.) to ensure rebound to a an endpoint ensuring optimal (reduced) compression resistance, damping, hysteresis, (increased) movement and/or further (resonant) vibration.

As mentioned, the system determines/collapses a semantic identity based on sensing/challenges on particular knowledge, features, patterns associated with biometrics, location, travel, appearance, behavior, shared knowledge, codes, credentials and/or combination thereof (e.g. in some examples the system may determine/collapse that the nurse holding Health Affairs is/(is not) (indeed) nurse Jane, while in other examples the factorization keeps the superposition high. Semantic profiles may activate/deactivate based on semantic identification.

The system implements laws, regulations. profiles and/or preferences based on semantic rules and/or routes associated with endpoints mapped to particular environments and/or areas.

Semantic posts may be used in retail environments. As such, the system may recognize the shopping carts/posts abandoned and/or unable to move to indicated/desired/scheduled locations and move them to the particular/storage endpoints. The endpoints may be marked by semantic beaconing. Further, users may challenge the posts to move the shopping carts to particular/storage locations, semantic areas and/or semantic routes.

The posts may detect the items in the (supervisor's/shopper) (shopping) cart and/or carrier; it is to be understood that the post may use localization, movement (e.g. around the cart etc.) and signal adjustment techniques to precisely localize and/or detect the items and/or semantic identities in the cart/carrier. Further, potentially as they move within the facility, they may challenge the supervisor/owner by indicating (e.g. via (arm) pointer indicators, semantic identities etc.) and/or suggest about inferred likeable and/or desirable (by supervisor/owner) items, endpoints and/or trajectories.

The posts/carriers/carts may (be allowed to) move and/or behave based on the temporary/permanent hierarchical supervisory semantic profiles, rules and/or further artifacts. In some examples, a post under a temporary supervisory identity of a shopper may request to move to a docking area (e.g. for loading) however, the system may allow, disallow and/or further instruct the post to move to docking based on further artifacts associated with a higher level supervising semantic identity. In further examples, permanent semantic identity inferences have precedence over temporary ones.

The users temporary own and/or supervise a (shopping) post, carrier and/or cart by presenting a credential, biometric and/or further payment to an available post, carrier and/or cart. Once the credential and/or budget expires and/or the user makes the post, carrier and/or cart available (e.g. by (touch) button push, biometric read, release procedures/protocols/instructions, challenges to post etc.). Further, the system makes the post, carrier and/or cart available once the user leaves an area, a supervisory instructs the post, carrier and/or cart to become free and/or expire/invalidate the temporary ownership. Once released, the posts/carts may expire/invalidate the artifacts associated with the temporary owner/supervising entities and operate based on the artifacts of a higher level supervisors/owners. It is to be understood that the temporary ownership may be hierarchical (e.g. user, facility operator, leasing agency etc.).

The coupling between a user profile/device (e.g. mobile, wearable etc.) and a post/cart may be based on ad-hoc semantic coupling. Further, the coupling may expire and/or be invalidated based on semantic inference and/or further localization.

As mentioned, the system may apply semantic profiles for semantic routing, budgeting and/or gating. Further, the system may use semantic profiles for budget indexing. In retail and/or entertainment environments the system may index the payment/budget with goodwill or tip during checkout and/or departure based on semantic inference and determination of low drift/shift/entropy semantic profile preferences, likeability, ratings and/or factorizations. In an example, the semantic profiles specify that the goodwill or tip for a "caffe latte" should be 10%, for a "fancy caffe latte" should be 12.5%, for a friendly/resonant host on customer safety 2.5% etc.; further, it may apply goodwill indexing based on environment, location, host/attendant/group/experience resonance and/or further circumstances. Thus, during (automatic) checkout and/or payment the system may automatically apply the goodwill and/or tip based on sensing and/or inferences (e.g. determine via sensing the circumstances, semantic identity of goods, the resonance, behavior, environment etc.). In some examples, the system/device receives from a (point of sale) device (e.g. via electromagnetic communication, RF/ID (NFC) etc.) the type/description of the received goods and further use the type/description, sensing and/or challenges to determine a resonant (composed) identity of the goods and/or at least one semantic profile preference/item having a preferred/configurable (interval based) variable shift/drift/entropy from the received type/description. In an example, the system is informed (from the POS) that it has received a latte, however, based on further sensing the system may infer that the latte features a model (e.g. a milk crafted design at the top of the drink and/or a semantic model) and thus, further infers a fancy latte and applies the goodwill of 12.5%. Further, the system determines that the host was resonant on "customer safety" because it was wearing a mask during a virus health crisis and thus applies the additional 2.5% goodwill. The goodwill may be applied as additive (e.g. 12.5%+2.5%) and/or as cascading (e.g. 12.5%*2.5%); further, the goodwill may be applied separately for each item on a bill (e.g. 12.5% for the fancy latte, 10% for the croissant etc.). It is to be understood that the payment may be automatic where the funds are automatically withdrawn from budgets, funds, configured bank accounts and similar when the system infers check-out or similar semantics and/or user assumes ownership of items (e.g. grasps the cup of latte, perform a checkout/scan (device) activity and/or UPI and/or move from/to a (checkout) endpoint).

In other examples, the user (e.g. John) orders a product (e.g. lighter latte, latte with 2% milk, one shot latte) and the system infers particular (leadership) semantics, capabilities and/or further activities to complete the order; thus, it may allow the activity, actuation and/or dispensing of an inferred (e.g. semantic indexed etc.) quantity, weight and/or (semantic) timed (e.g. based on indexing of the dispensing time) flow (e.g. of coffee, 2% milk etc.) during the particular order completion while not allowing the dispensing of other drifted and/or shifted capabilities/agents/components (e.g. blocks the 3.5% milk dispenser and/or allows 2% milk dispenser when John's semantic identity, order cup and/or further order items/characteristics/semantics (e.g. as recorded by a memory, device, RF tag etc.) are detected, located and/or communicated at the (dispenser) pouring endpoint); further, sensing in the product and/or container (e.g. cup and/or (coffee/product) makers, bottles/recipients, dispensers etc.) may determine further inferences and/or the quality of the goods and potentially, allowing the system and/or the user to accept, reject and/or block the sale, pickup, possession, change of ownership and/or custody.

The system associates possession and/or custody of objects with a supervisor/user and/or supervised/owned/associated physical/virtual posts/carts/containers/assets and/or further semantic identities carrying, supporting, manipulating, containing and/or possessing the objects.

In some examples, the system infers a (composable) semantic identity based on inferred possession by different people/supervisors/users/owners and/or further composable inferences. In an example, "Jane's newspaper" (at a first semantic time and/or within (or outside) an endpoint (e.g. having assigned a "car show" semantic)) may become "the newspaper which Jane had at the car show" (at a second semantic time and/or OUT and/or outside the "car show" endpoints). In other examples, "Jane's keys" may be associated with "the keys which John had in the cupholder" or "John carried/brought and handover/give it to Jane" based on possession and/or handover. When John handovers the keys to Jane the system may be in superposition when the key is stationary located within an interval of (indexed) (semantic) time at the divider between John's and Jane's hands. It is to be observed that the superposition may be associated with the semantic view observing those particular objects; however, the superposition can be reduced by composing with other semantic views and/or fluxes.

Disappearance and/or appearance in/from an endpoint may be factorized in rapport with a semantic view. Further, the system may be well informed, ill-informed and/or relatively informed at the endpoint in rapport with leadership semantic attributes (e.g. of (artifacts at) endpoint), semantics of the circumstances and/or/within a semantic view. It is to be observed that the information is composable at appearance and/or disappearance and/or further encompassing (composable) (hierarchical) endpoints. Thus, the factorization at an endpoint comprising an appearance endpoint and/or a disappearance endpoint is composed accordingly and comprising and/or factorizing the semantics and/or (semantic) times of appearance and/or disappearance.

In further examples, a (physical/virtual) shopping cart carries items which are determined to be IN (at an endpoint) and/or not OUT and/or are determined to be contained, possessed and/or carried (e.g. by a basket, cart and/or a holder, manipulator, supervisor, shopper and/or user). Disappearance from a field of view within a container/carrier endpoint is associated and/or factorized to input (IN) the container and/or appearance from container/carrier endpoint may be associated and/or factorized to output (OUT) the container and/or affirmative/non-affirmative diffusion through associated dividers.

If the item is detected (stationary and/or within a semantic time) on a divider, then it is in superposition between IN/OUT or further semantics inferred by in/out determinations; further semantic views and/or flux challenges may be used to reduce superposition.

In further examples, the divider is between a magnetic field flux and an entangled (corresponding) electric field flux and the item (and/or (contained) component (s), part (s) and/or endpoint (s) thereof) is (are) in electromagnetic superposition and/or electromagnetically cloaked while stationary and/or within a semantic time at the divider.

Non-affirmative diffusion through containers may be associated with breaches.

The system may determine and/or integrate activities, orders, semantic identities and/or possession at endpoints. Further, based on possession and/or hand-over inferences the system may update inventories and/or stocks. Possession semantics may be (inferred as) part of a semantic route in order to perform an activity and/or achieve a goal. Disputed possession may potentially occur when two non-affirmatively resonant semantic views concomitantly follow the semantic routes comprising possession of the same artifact.

The system may apply disputed possession inferences and/or techniques to disputed supervision/manipulation and/or vice-versa.

In similar fashion, the system determines possession in analyzing events, circumstances and/or associated semantic identities and/or semantic times. In some examples, a semantic identity goal (s) is/are related/associated to item (e.g. ball, article etc.) possession; alternatively, or in addition, they are related/associated with (associated) endpoints. The system infers contestants (for possession and/or supervision) for/of the item associated with semantic identities; a semantic identity is a contestant if it has a possession and/or supervision goal of the item/resource within a semantic time (hierarchy). Further, the system determines item (e.g. (game) ball, article etc.) possession and/or handover by/within/between (contestant) semantic identities, a team and/or semantic group. A possession by a semantic group is determined based on the inferred possession by/between/within the members of the group and/or (further) semantic identities. The system may infer interceptions (by a contestant/receiver) when an item is non-affirmatively handed over in rapport with the possessor at the first time and/or affirmatively received and/or handed over in rapport with the receiver and/or possessor at the second time; the system may determine disputed possession when in superposition regarding the possession and/or (further) at least two (coherent) contestant semantic identities are inferred (within an endpoint). However, the disputed possession may not be inferred if the possession is non-resonant and/or non-affirmative resonant with all or all but one of the contestants; further, the system may infer non-disputed possession if there is only one contestant and/or the possession superposition is low. It is to be observed that the affirmative/non-affirmative inferences may be based on the particular goals of semantic groups at particular semantic times and/or endpoints (e.g. a team is instructed and/or want to keep item possession; further, the item possession goal may be adjusted based on the game sensed inferences, goals and/or entangled party—e.g. keep less possession while defensive and/or in defense etc.).

The disputed possession (within a semantic time) may not be inferred if at least one of the contestants is not able to access the endpoint/item (e.g. ball) (within a/the (hierarchical) semantic time and/or budget) while the other contestant can. In some examples the budgets are associated with a time required to take possession; in further examples, the required time budgets are higher as a contestant (member and/or (further) group) may not be able, blocked and/or not allowed access to the endpoint/item.

The disputed possession may be based on hierarchical goals and/or entanglements. I some examples, Jane and John play tennis, and thus, they are contenders for accumulating points during game entanglement at the tennis court endpoint. As previously mentioned, Jane and John are affirmative/non-affirmative entangled (or grouped) as Does. As such, the Does entanglement goals may be (factorized)

hierarchically higher/lower than the goals for the tennis match if the Does entanglement is affirmative/non-affirmative factorized.

The disputed possession may be inferred at endpoints in hierarchical manner. In some examples, while at a higher endpoint the system infers disputed possession, at lower endpoints it may not (e.g. due to the (projected) incapacity (and/or capability) of one of the contestants to access and/or compete for the interest resource/capability).

The disputed possession may comprise friend-foe analysis and vice versa. Further, it may comprise divider and/or diffusion analysis.

In further examples, an endpoint supervisor establishes the goals, rules and/or routes for an endpoint and the system detects factorized (affirmative/non-affirmative) semantic inferences in rapport with artifacts at the endpoint. As explained throughout the application the system may generate (supervisor/user/subscriber) augmentation based on such (high/low) (entropic) inferences.

The system factorizes/projects control and/or non-control of disputed possession artifacts. In examples, in order to determine control of a resource (e.g. capability, memory, semantic unit, article, item, ball in a game etc.) the control factorization (orientation) must be (affirmatively) high (e.g. 95%) and non-control low between/within endpoints and/or semantic times.

Alternatively, or in addition, the system may inject endpoints to determine/project coherency of control and/or possession. Furthermore, it may project control/non-control (e.g. of an item/resource by a contender and/or group) by detecting/factorizing/projecting movements, damping, groupings and/or orientations within semantic times.

In an example of determining control/possession for an item (e.g. ball), at a semantic time (e.g. before/after crossing/diffusing a divider and/or diffusing inside/outside/on an endpoint) the system infers non-control when the item is non-coherently possessed by a holder at endpoints, infers non-control when the factorization of the grouping between the item and the possessor (e.g. player) is low, infers non-control when the factorization of the associated possessing semantic identity (e.g. PLAYER A POSSESSING THE BALL) is low and/or the associated non-possessing (disputed possession) (contestant) semantic identity (e.g. PLAYER A NOT POSSESSING/HOLDING THE BALL) is high; similarly, by HENT, it infers control when the ball possession is affirmative (ly) and coherent (1*y*) (damped) at endpoints, infers control when the factorization of the (coherency of the) grouping between the item and the possessor is high, infers control when the factorization of the possessing semantic identity is high and/or the factorization of the non-possessing semantic identity is low).

Based on control inferences the system may publish/unpublish/enable/disable/allow/block capabilities and/or interests (e.g. when a capability is controlled/uncontrolled—unpublishes/publishes and/or disables/enables and/or blocks/allows etc.). Alternatively, or in addition, it may mark/make/annotate them as busy/available, inactive/active and/or similar (at semantic times).

We mentioned that in some examples composition assembly endpoints are designated to compose and/or assemble artifacts and/or further semantic identities. In some examples, the semantic identities may be associated with (packaged) goods/items/articles, other artifacts/assets, their manipulators/supervisors/owners/possessors and/or semantic groups thereof. In examples, the system determines, integrates and/or processes pressure/weight/scale sensors and/or (encompassing) devices (data) at endpoints. The system monitors a scale measuring the weight of items, articles and/or produce. As such, when a supervisor of the scale (and/or of the endpoints where the scale is located/comprised) puts objects/items/produce on the scale, the system determines the semantic identity of the objects/items/produce and, further, when a handover occurs (e.g. from/out the supervisor (and/or associated artifacts) to/in a customer (and/or associated artifacts) and/or from a first semantic identity to a second semantic identity) it updates an inventory and/or budget by subtracting, adding and/or (temporarily) marking the objects/produce/items and/or further quantities and/or budgets (as measured/weighted, budgeted/priced and/or reported from the scale sensor and/or (encompassing) device) as (temporary) out/in from/to an inventory and/or budget and/or (at a) a supervised and/or a comprising endpoint. In some examples, an inventory and/or budget can be associated with the supervised endpoint and/or comprising endpoints and/or semantic identities; alternatively, or in addition, it may be associated with a department, room, area, store, warehouse and/or other supply chain related storages and/or artifacts. It is to be observed that the inventory may be (further) updated when the customer/possessor leaves a comprising endpoint; in examples, John asks a food display supervisor for 4 (lbs of) catfish and so, the display supervisor grasps, weighs and/or packages the catfish and hands it over to John; as explained, the system determines the John's possession of (package of) catfish and/or further, marks/debits/extracts the catfish quantity from the (food display) (endpoint) inventory (and/or marks/credits/adds the amount charged for catfish to a (food display ((endpoint) budget) once the handover is over and/or further when the system infers that John leaved the store (e.g. based on the endpoint presence, disappearance/absence and/or (further) transitions between endpoints and/or semantic times); alternatively, or in addition, after/at handover and/or while John is in the possession of catfish the system adjusts John's possessions/inventory (e.g. marks and/or adds the catfish) and/or budgets (e.g. marks and/or extracts the budgets). In further examples, John orders a ($10) (three course) meal combo and the supervisor/attendant packages the meal combo at specific endpoints designated for meal combos assembly and/or packaging and hands it over to John which takes possession. It is to be understood that while an endpoint may be designated for meal combos assembly/packaging, it may additionally be designated for other artifacts and/or activities for which the system is able to discriminate in between and/or for which the confusion and/or superposition is low in between. Further, it is to be understood that the system infers that a meal combo and/or associated semantic identity is assembled and/or composed by determining that the ingredients/components (including counts/amounts/budgets and/or associated semantics and/or identities) of a/the meal combo are transferred from their storage/containers to the meal combo assembly/packaging endpoint and/or detected (localized) containers (within budgets). As previously mentioned, a supervisor may indicate and/or delegate and/or hand over to another person an activity and/or associated artifacts. Further, it is to be observed that packaging may comprise containerization and/or manipulation of artifacts within a container (e.g. package, compartments etc.) potentially in a hierarchical manner (e.g. package/container comprising other packages/containers etc.).

An authenticated user, (mobile)device, application, semantic identities and/or any combination thereof may order (and/or start and/or delegate an activity on) an item/product based on inference/transfer on/of the user's (profile)

item/product preference from the device/application when the user/device/identity is/are detected at the ordering (and/or start activity) endpoint/link (e.g. coffee ordering) and/or transferring the order (and/or start and/or delegate activity) information to a provider (e.g. POS point of sale at the endpoint having the leadership, capability and/or further receiving and/or performing the order and/or activity). It is to be understood that the activity (e.g. ordering) and/or items may be based on a low drift and/or similarity inference between the user preference semantics stored on the mobile device (profiles) and the (provider/POS) published capabilities/identities/semantics at the endpoint/link. As such, an active application running on the user's and/or on the provider's device/POS may infer the similarity between the user's preferences and the provider's capabilities and/or further suggests and/or place an order.

Alternatively, or in addition, the user is augmented on a PDS comprised/linked by/to the POS on the system pick and/or suggestions and further confirms and/or infirm the ordering. Once confirmed the order is placed (to the (inferred) flux); alternatively, it may be cancelled. Alternatively, or in addition, the user may be presented with an option to adjust the order.

A user and/or semantic identity may allow/disallow automatic ordering and/or augmentation on the semantics at an endpoint/link. In some examples, the allow/disallow may be based on semantic identities of endpoints, links, providers, owners, supervisors and/or capabilities; in further examples, this is based on sensing at the endpoints/links (e.g. the system determines that the provider produces fancy caffe latte based on flux and/or sensing; the system determines capabilities and/or quality based on observing previous activity and/or similarly produced items (at the same or similar endpoints, by the same or similar provider) etc.). The ordering and/or augmentation may comprise pop-ups/activation/display of computer/mobile/device applications, UI windows/objects/controls, screens, notifications, SMS, email, messages and/or items having and/or being associated with low drift semantics in comparison with the semantic identity of the provider and/or published semantics at the endpoint (e.g. augmentation informs the user that is located at the (merchant A) (coffee) ordering/activity endpoint, activates/enables the provider/merchant application with the capabilities available at the location, activates a published semantic identity (coffee) ordering application/window/UI controls/articles, orders a fancy caffe latte based on capabilities and/or inference at the endpoint and/or provider etc.).

The user interface components/applications may be activated on a device based on a particular (low) drift of their associated semantics (including semantic identities) to relevant user preference semantics at the endpoint, endpoints semantic and/or further provider's (published) semantic identity, activities and/or capabilities at the endpoint/link. The system, device and/or the user interface components/applications may identify and/or authenticate the user/provider/owner/supervisor; further, possession and/or observing view inference may be used for activation and/or authentication.

In further examples, a user transfers, via a user device and/or further (incorporated) wireless transceiver(s), his/her semantic profile preferences to a POS; alternatively, or in addition, the user device receives a menu and/or menu items from the POS.

Further, the POS may match user preferences (at endpoints) with items on the menu and selects and/or augments (the user) on the items to be ordered (at endpoints); alternatively, or in addition, a mobile device is configured and/or runs an application which matches the received menu items with the user preferences, selects and/or augments (the user) on the items to order. Once selected, based on semantic matching (and/or further flux factorization of the POS and/or mobile device), a user may submit the order by accepting the selection on a PDS and/or a/the mobile device.

The UI components/applications published and/or displayed semantics may be associated with the user's and/or provider's (preferred) semantic identity (as inferred via authentication, inference, blurring etc.). As such, when starting, delegating and/or ordering an activity and/or item based on an interaction with the UI components/applications the system may publish/gate/transfer (e.g. via flux etc.) the (authenticated) semantic identities of the user and/or provider together with further identified semantic identities of the items in the order/activity. Published capabilities and/or semantic identities can be gated at an endpoint/link by supervisors and/or owners. As such, a provider's published semantics may be gated at the higher level of supervisors and/or owners. In further examples the provider is (identified and/or authenticated as) supervisor and/or owner and as such the hierarchical gating may not be applied. Further, the hierarchical gating may be applied based on the supervisors and/or owners preferences; it is to be understood that such preferences are applicable only for the hierarchy comprised and/or supervised by the particular supervisors/owners.

The system semantic profiles may comprise preferences (e.g. items, rules, routes etc.) on which bank/credit/funds accounts to use when renting, acquiring and/or purchasing particular semantic identities.

When performing payments, the system may select an account and/or budget (flux) provider over the other based on the semantic drift/shift/entropy of the goods, merchant, experience and/or endpoint inferred semantic identity in rapport with the preferences in the semantic profiles. It is to be understood that during payments, the system may transfer/communicate to the merchant's payment device and/or reader the account information and/or an authorization code from the payment processor, funds/budget provider and/or flux which may be used by the merchant's device to request/transfer the funds and/or complete the transaction.

In some examples, an account may be a (virtual) credit card account and/or associated virtual (credit card) accounts (in a hierarchical manner). A virtual credit card may be associated with a (temporary) credit card number; further, the virtual credit card (number) may expire, be blocked/unblocked and/or validated/invalidated based on semantic times.

Alternatively, or in addition, (card) transactions may be allowed/blocked and/or validated/invalidated based on semantic access control, semantic times and/or semantic analysis.

We mentioned that the semantic posts and/or further artifacts may be under temporary and/or permanent supervisory/ownership. The system may infer the permanent and/or temporary ownership based on interactions and/or further inferences in the semantic field. In some examples, the system may assign a temporary semantic identity based on the determined interactions and/or possession in the semantic field. In an example, based on "nurse holding a newspaper" it may infer that the newspaper temporarily belongs to the nurse; based on further leadership inferences the system may determine that the newspaper is the same particular one and/or semantic identity from last week in the particular circumstances (e.g. Health Affairs from last week). Even further, the system may determine that the newspaper temporarily/permanently belongs to Jane based on the transfer of ownership to Jane (e.g. John gave the newspaper to Jane a week ago, Jane purchased the newspaper a week ago).

It is to be observed that in the first example (John gave the newspaper to Jane a week ago) implies a high superposition of permanent ownership (e.g. does the newspaper still belongs to John's or Jane's?); however, the system may collapse the superposition by collapsing John and Jane to Doe's and thus it infers that the newspaper is in possession of Does.

In the second example (Jane purchased the newspaper a week ago) may also imply a high superposition of permanent ownership since Jane may have purchased the newspaper with hospital funds and/or budgets and thus the permanent owner may be the hospital instead of Jane, while Jane (and/or Does) may still be maintaining the temporary ownership.

In further examples, the system may express superposition and/or doubt in determination of the change of ownership and/or entanglement (S2P2 is entangled/owned by Jane and S2P2 and/or Jane grabbed the newspaper from the stand but not sure and/or there is superposition whether need/has pay/paid or is a free newspaper, S2P2 and/or Jane gain a "free" newspaper but now may need to listen/attend a (fishing) sales pitch). Thus, S2P2, Jane, the newspaper provider and/or further ownership may be entangled and/or form semantic groups based on a/an (e.g. sales pitch) (expirable/non-expirable) activity (potentially not likeable and/or non (affirmative) resonant from S2P2's and/or Jane's semantic view—e.g. Jane doesn't like (an activity of) listening to sales pitches (about fishing), Jane doesn't want (an activity of) to buy fishing gear, S2P2 and/or Jane don't like (an activity of) being stationary and/or sit for the sales pitch and like to move and/or focus in a direction, Jane is interested only about healthcare gear and exo-skeletons—but likeable and/or resonant from the provider's semantic view). Further, the (projections of) resonance and/or likeability for owning, being in possession and/or reading the newspaper for a semantic time (e.g. reading healthcare news) may not be highly distorted by non (affirmative) resonance and/or non-likeability of the entanglement and/or semantic group.

The system may determine the consequences of attending and/or not-attending an activity and/or being and/or not being at an endpoint within/at a semantic time. It is to be understood that the being/not being, attending/not attending inferences may be based on H/ENT inferences.

Activities and/or further attendance may be comprised in a clause of a contract; ownership may be validated and/or invalidated based on whether the activity is completed or not.

A user may delegate activity attendance to a supervised and/or owned semantic unit, device and/or post (e.g. S2P2 can attend the fishing sales pitch activity and maybe present a summary/opinion). Further, the user may instruct the attending entity (e.g. S2P2) to save/preserve the model before the (resonant) activity. Thus, potentially after the activity have been finished and/or summary/opinions presented the user may challenge the device to clear the learned artifacts during the activity and/or revert to the model before activity—e.g. forget the sales pitch etc.

It is to be observed that the system may determine the change in ownership based on inference of completion of (contractual) activities, quality and/or further transition, hand over and/or diffusion of (ownership) budgets. The inference of completion of contractual activities may comprise semantic factorization and/or activity attendance (e.g. Jane kept on collecting free newspapers comprising health news but didn't attend any sales pitch within a week and thus, it needs to pay for the collected newspapers in order to transfer ownership, the newspapers didn't comprise a reasonable amount of quality health news (e.g. based on at least one semantic group rating criteria) and thus no payment or activity is required from Jane etc.).

The semantic contracts may comprise quality clauses wherein the quality clauses are based on the opinions and/or further ratings inferences of established and/or semantic time dependent semantic groups. In some examples, the contract has a clause specifying that the newspaper must comprise a particular and/or reasonable amount of quality laparoscopy information based on the ratings, likeability, opinions and/or quality indicators/factorizations from the Laparoscopic and Robotic Surgeon Association members and/or other semantic groups. It is to be observed that while the amount of news may be high, the quality may be low and thus, the composite contractual clause is not met. Analogously, the amount may be smaller but the quality high and thus the composite contractual clause may be met.

We mentioned that the modules may be installed and/or carried on a supporting post or frame. In further examples, the supporting post and/or frame may swivel and thus, allowing it (and its further installed components) to move to desired endpoints, locations and/or directions. It is to be understood that the movement may be used for connecting, preserving the stability and/or any other uses cases of movement, stability and/or connection as explained in this application.

The semantic posts may comprise motorized swiveling arms which may be attached, grip and/or comprise hooks, latches, locks and/or further connecting mechanisms. In some examples, a semantic post/carrier comprises at least two swiveling arms comprising the clipping, locking, latching and/or banding mechanism at the top of the post. When a first (e.g. S2P2) and a second post/carrier (e.g. S2P3) connect at least one swiveling arm of the first post extends/moves towards the second post which in turn may extend one of its swiveling arms towards (meeting) the moving/extending swiveling arm of the first post. Once, the moving/extending arms from the first post and the second post meet, they may latch/lock/hook the bands and/or barriers comprised in the two arms; further, once hooked, clipped and/or locked the posts may swivel the connected arms to the desired position (e.g. elevate the arms and/or further extend the bands in no particular order etc.).

The base of support, support post, casters, wheels and/or further swiveling arms may adjust their movement, angle and/or inclination orientation as a counter measure to the pulling force/moment of the connecting post and/or to preserve the stability and optimal base of support (e.g. once the arms connect and ready to move for extending the bands the base of support is elevated towards the connected joint/lock in order to orient and/or further adjust the reactive force/momentum exercised at the swiveling arm joint (endpoint) and/or further base of support and thus, countering/adjusting (e.g. decreasing) the (net) pulling force on the connection direction; alternatively, or in addition, the base of support is stabilized by deploying the stabilizing legs and/or pods in the base of support. It is to be understood that while the example comprises only one clipping connection, other examples may entail multiple connections and/or arms and thus, the system infers the composite (net) forces and/or counter measures on multiple directions, orientations and/or endpoints.

In further examples the posts may hook, grip and/or latch on folding gates, nets, barrier and/or other extensible safety area delimiter apparatuses and deploy, extend and/or fold them based on semantic analysis. Further, the folding gates/nets/barriers may have and/or publish capabilities (e.g. "10 ft folding gate", "fancy area divider", "corrosive resistant extensible 10 NM tension able net" etc.).

The system maps the modules, connection/locking/swiveling connections and/or further artifacts to semantic artifacts and further uses semantic inferences to actuation and/or further actions. It is to be observed that while the pulling force exerted towards the connection/clipping point (of (S2P2, S2P3)) from S2P2s semantic view may be considered foe because its activity and/or consequence is post destabilization, the cause, owner and/or supervisor of the pulling force is S2P3 which is affirmative-resonant in the current semantic view and thus the overall inference of "S2P3 pulling" is not considered hostile and/or ill intended the semantic view. The S2P2 and S2P3 may be entangled in rapport with the sub-goal (e.g. keeping the band connected). The system may seek counter measures against the pulling force. Further, despite the pulling force being foe the system may gate and not pursue hostile and/or non-resonant activities and/or actions against S2P3 when is affirmative resonant and/or not considered a foe.

The system may index hazards based on unpredictability and/or unknown inferences.

In examples, the system determines that countermeasures against the destabilization of the pulling force is not to disconnect and/or cause disconnection (as it would be high drift and/or entropic with the goal) but to decay the net force and/or its effects within endpoints. As such, the system may determine that the net pulling force/moment exercises an orientational (under) pressure (not likeable and/or stressful) movement on the wheels and thus the system infers as counter measures activities which reverse such orientation (e.g. reverse and/or oppose the (downward) pressure movement and/or decay the net pulling force); thus, the system may adjusts the wheels under pressure to further oppose and/or further lift as WENT to downward movement. It is to be observed that while the wheels are under pressure the system may determine that the pressure relief regulation and/or decay would be highly entropic to the goals and not further pursue it; however, if one of the goals are to "keep the post mobile", "keep the post in good working order" then the system projects high drift and/or entropy (e.g. post unable to move and/or unable provide tow/lift etc.) as components and/or capabilities may be damaged and thus, may seek to avoid damage caused by over-pressure (e.g. at endpoints comprising suspension elements, locking elements etc.) and thus, takes semantic group measures and/or challenges with the other post; it is to be observed that the S2P2 measures may not be affirmatively resonant with S2P3 (e.g. S2P3 may think that S2P2 is a slacker and not trying enough) and thus the system decays the resonance of the semantic group.

The semantic identity of the posts in particular circumstances may comprise their goal and/or further availability/non-availability of capabilities. Similarly, the semantic identity at endpoints may comprise their goal and/or further availability/non-availability/likeability/non-likeability of capabilities and/or further activities.

We explained ad-hoc semantic coupling wherein semantic fluxes are connected based on indications and/or further inferences. In some examples, multimedia artifacts and/or renderers are connected this way.

The system identifies the most likeable applications and/or renderers to render artifacts on devices and/or at semantic fluxes. Further, it may identify artifacts based on authentication of an owner and/or challenges to/form the owner on leadership artifacts and/or further endpoint semantics.

We mentioned that the system may use ad-hoc semantic coupling and/or further indications to connect two devices, fluxes, application, renderers, players and similar. In further examples a user may indicate and/or instruct the system to render and/or couple a multimedia artifact running on a device (e.g. mobile device A) to another device (e.g. projector/TV B). As such the system may connect the two devices, fluxes and/or opens/activates the multimedia player on B and plays the multimedia artifact. It is to be understood that the media artifact may be flux/streamed from A to B. Alternatively, the system instructs A and/or B to go to the endpoint/location where the multimedia artifact (can) be/is published and stream and/or play it. The system may allow the user to setup preferences to synchronize multimedia player/application markers and/or actions (e.g. forward, rewind, stop, caption on etc.) between the multimedia player/application on A and multimedia player/application on B, potentially at particular semantic times.

The user may indicate the desire to stream a multimedia artifact running on a device to another device by UPIs, semantic identity challenges and/or other techniques explained in this application.

In some examples, the user points A towards B in/from a particular determined orientation, from a particular endpoint and/or based on a particular semantic time which allow B to identify and/or authenticate A and further allowing B to augment and/or render A to the user; in some examples, such augmentation comprises specifying the semantic identity, rendering a camera feed comprising A and/or further selecting it, rendering a feed/flux/stream/PiP comprising what's playing and/or is published at A (e.g. based on access control of/at A and/or B, fluxes and/or user/supervisory of/at A and/or B) and/or further selecting it. The camera feeds, flux/stream and/or further augmentation may be rendered (based) on a video/streaming app, multimedia player application window, picture-in-picture (PiP) and/or semantic augmentation. In a further example, the system renders on B (e.g. within a renderer/multimedia application etc.) a smaller window (e.g. PiP) comprising the screen (and/or what is playing) of/at A with semantic identities (e.g. controls, objects, scenes, artifacts etc.) which are gated/rendered based on semantic publishing of A and further the access control of the semantic identities likely of watching B (e.g. based on endpoint presence, observing field, UPIs etc.); it is to be understood that alternatively, or in addition, to screen rendering the system may render on B current and/or semantic time based accessible multimedia artifacts (playing/published) at A.

In other examples, a user is presented with a list, grid and/or any other arrangement of icons, snippets, tags, pictures and/or semantic identities of the multimedia artifacts playing on particular devices and/or at particular (location) endpoints and the user may select which one to play.

In further examples, particular artifacts are indicated and/or published at/by A and they are conveyed, rendered, selected and/or played at/by B. In some examples, A conveys flux/stream data to B; further, B is connected to a flux/stream provider via A (which tethers and/or diffuses flux/stream data to B). Alternatively, or in addition, B connects directly to the flux/stream provider (based on the data diffused and/or indicated at/through (a/the flux/stream at) A).

The connection between a (streaming) data provider, A and/or B is realized by any coupling, matching, flux/stream and/or further (manipulation) techniques such as explained in this application. In some examples, the connection between a provider, A and/or B is established in similar ways as with a coupling between robotic cart/device to mobile/robotic device. In examples, as an indicated semantic identity is selected (e.g. at B and/or A) the B (as a renderer) couples to a flux/stream (provider) to match/play/render the (stream) data associated with the semantic identity. Further, the coupling between providers and/or rendering/tethering devices may be based on semantic coupling. In some examples, a flux/stream (provider) publishes various capabilities/semantics (e.g. DELOREAN engine repair, brew tea etc.) and thus, a user/system may indicate, select and/or couple to such capabilities/fluxes/streams and connects/renders/tethers them accordingly.

The published, diffused and/rendered data may be associated with user interface controls and/or (further) associated semantic identities and/or further capabilities and/or semantic times. Such flux/stream data may be used to populate a list/combo content, for labels, render multimedia etc.

As mentioned, in examples, a (streaming) data provider, A and B may be associated each with at least one (hierarchical) semantic flux/stream (hierarchy).

It is to be understood that the system may allow such ad-hoc (semantic) coupling based on gating, access control, identification of ownership and/or further endpoints and/or locations. As such, the system determines that the device A is Jane's (higher level supervisory/user/owner), is in possession of John (lower level and/or temporary supervisory/user/owner) and/or is further located at an endpoint on the fireplace. The access control, circumstances and/or supervisory at devices may allow/disallow B to access, move and/or render artifacts at A; further, the system may challenge the higher level supervisory/user (e.g. Jane) when lower level supervisory/user (e.g. John) wants to stream, project, move and/or render at B particular (allowable) artifacts.

The system may gate artifacts based on semantic times, the projected observing views towards B and/or their semantic identities (e.g. John is not allowed to project Jane's health exam results during a DeLorean fans meeting and if fans (observing views) can watch B).

The system may use preferences, semantic profiles and/or semantic coupling wherein it determines the semantic drift between the specified/preferred (profile/preference) semantic identity and further identification of the available devices and/or semantic fluxes and connects them (e.g. the user specifies to render the game on the mobile device on the "big tv console screen" and the system identifies the "big tv console screen" based on hierarchical and/or ordered circumstances/rules such a previous identified location, the less drifted semantic identity closer to the current location in the house etc.).

We mentioned that the system may infer possession of particular devices/artifacts by being detected as moving together with the possessor, being held/supported and/or as part of a semantic group. Further the system may determine which devices, applications and/or UI components are in particular (user) (semantic identity) observing views for optimal and secure augmentation.

Users, supervisors and/or operators may activate and/or publish inferred capabilities and/or interests at endpoints.

As mentioned throughout the application the system may also activate/deactivate on device applications, components and/or further activities based on similarity, drift and/or further sematic analysis of (published) profiles, preferences, activities, capabilities and/or further (projected) (localization of) semantic identities at endpoints. The system and/or the user may activate/deactivate/enable/disable (endpoint/link) augmentation, automated ordering, goodwill/tip indexing and/or other profile preferences. Such activities may be allowed by authenticating the user and/or the possession of the device and/or further ensuring that the augmentation and/or relevant UI components/interfaces are in the user's observing views. The system may allow and/or route semantic identities and/or artifacts based on inferences related to owners and/or supervisors and/or further associated devices and/or applications. In some examples, the system sends (SMS) (text) messages to a particular semantic identity on a device and/or further applications in possession and/or in semantic identity's observing view.

The system may use ad-hoc semantic coupling and/or user preferences to sends notifications. In some examples, the system is configured to inform Jane on a mobile phone/device and/or Health Affairs application in her possession about particular hazardous inferences. Jane may be augmented and/or access her messages, channels, applications and/or UI controls based on her credentials, authentication, semantic identity and/or further observing views inferences.

We mentioned that the fluxes coordinate in order to understand each other semantic sensing and/or observing fields. In further examples, the system uses such communication to perform likeable coverage of a zone, area and/or environment. As such the system configures, orients and/or moves the sensing and/or posts to ensure they cover the desired area. The system may determine hazardous inferences in rapport with the movement of an object (e.g. post falls, tea pot falls etc.) based on projected inferences and/or further determination that the movement is hazardous, high risk, uncontrolled, lacks fluency and/or doesn't resemble any other known coherent, fluent and/or controlled moves. In some examples, the system determines that a fall is hazardous because an object component (e.g. post arm) may be twisted and thus the post may be incapacitated for leadership and/or critical goals/activities. In further examples, the hazard is determined by the consequences of the fall, non-affirmative resonance and further inability (and/or invalidation) of the object to affirmatively resonate, potentially on the leadership goals and/or activities (e.g. tea pot is broken and Jane doesn't like it because it damaged the paint, the broken tea pot is too expensive (e.g. based on budget bargaining inference, trading etc.) to fix, the tea pot won't hold water anymore etc.).

The system may detect falls of objects by detecting the dissociation, lack of obturation and/or support at a second time in rapport with a first time (e.g. when objects and/or container/supports were associated, object was contained/attached and/or obturated the container/support etc.). In some examples, the system detects that the object (tea pot) is associated with a support and/or containment endpoint and/or further semantics (e.g. fireplace, top of fireplace, on the fireplace, truck, truck cargo, in the truck) at the first time while at the second time infers that it lacks support and it has distanced itself and/or is in a high entropic orientation in rapport with support artifacts and/or believable inferences. It is to be observed that the semantics associated with the object may be based on the semantics associated with the endpoint and/or with the transitions (e.g. IN/ON/OUT etc.) of the object to/from the (support) endpoint and/or further projection inferences (e.g. what is the likelihood/likeability of the tea pot to be there and/or to move to that endpoint/trajectory/orientation, within the semantic time and starting from the (support) endpoint, the tea pot orientation is too drifted from stationary and/or supported, the tea pot left the support endpoint to a lack of support endpoint, the tea pot is hovering, the tea pot has fluent smooth believable orientation and/or trajectory towards the ground/projector/(S2P2 arm) etc.).

While the system may infer hazards of the movement may also project that the hazardous activities may be damped, ended and/or decayed based on potential activity countermeasures at the trajectory endpoints (e.g. the S2P2 arm may catch and end and/or damp the hazardous fall activity). It is to be observed that the hazard of the fall activity may be decayed based on the target endpoint semantics (e.g. the tea pot fall on a hard surface is more hazardous than on a soft dampening surface/endpoint, the fall from a higher height is more hazardous than from a lower height).

The system may look to decay and/or alleviate hazards by artifact and/or activity injection wherein it injects artifacts on the trajectory in order to damp, gate and/or decay the hazards (e.g. projects and injects a (padded) glove (endpoint) on a trajectory (endpoint), projects and injects the S2P2s padded gloved arm (endpoint/s) on an endpoint within the fall etc.). It is to be observed that the system may infer composed counter measures (e.g. padded gloved lift (ed) catch arm which may be more effective than the similar composable measures/capabilities/attributes such as padded surface and lift catch arm). Further, the system may determine the damping at particular endpoints and/or further hazards at the endpoints (e.g. the system may inject a padded gloved arm at a potential catch/damp endpoint in the trajectory and determines the hazard at the injected endpoint, the further diffusion from the endpoint if not caught and the hazard at the ground endpoint if the pot falls further to the ground). It is to be observed that the system infers the composable counter measure capabilities based on leadership artifacts and/or further high entropy of the hazard inferences (e.g. padded provides damping, padded glove provides more damping if lifted, lift arm provides support for the padded glove reaching a higher injected endpoint, injected endpoints damp the hazard along the trajectory etc.).

The projections of falls may be factorized accordingly (e.g. fall is likely during support shaking, when other objects and/or semantic groups thereof on the support (fireplace) shake, when other objects in the semantic group shake, when is snowing, wet, slippery, if object is hit etc.).

Similar fall detection and/or damping techniques may apply to leaning, movement and/or falls of carriers. In an example, a post/group projects and/or detects lean and/or fall move towards the right and thus it looks to inject damping artifacts (e.g. damping capable endpoints, arm, padding etc.) on trajectory towards potential hazardous (un-damped) (target/fall) endpoints in order to damp, delay and/or index the (time) budgets and/or factors of the threat.

In further examples, hazardous fumes/agent flows are diffusing through an open door and/or path towards a target and the system injects a countermeasure, activity and/or artifact (e.g. instruct and/or positions S2P2 to-, close door, position blower to disperse fumes etc.) in order to damp and/or gate the effects on the target; it is to be understood that such injection may be allowed and/or blocked based on projections (with and/or without injection) of feasible counter measure activities available to artifacts and/or semantic groups at the hazard (diffused) locations/endpoints (e.g. block countermeasure injection if people are (hazardously entangled) in the hazard room/facility with no projected counter measure activities to decay hazard/harm if the door is closed, block countermeasure injection if critical assets in the room/facility may be harmed, allow countermeasure injection if there are no people and/or critical assets etc.).

Analogously, the system may perform artifact injection to keep, control and/or damp factorizations of a trajectory and/or further trajectory transitions within a target/projected/likeable/desirable drift, orientation and/or goal. In some examples, S2P2 may inject activities and/or artifacts to extinguish/deter/decay/counter hazard while moving through a projected likeable but hazardous trajectory. It is to be observed that S2P2 my inject the capability on itself—e.g. possess/carry/manipulate extinguisher, possess/carry fire/gas protection etc.—and/or further projects the capability injection at the location (e.g. based on its movement and/or presence). The injected artifacts may cause semantic factors, time and/or budget indexing associated with the S2P2's movement, transitions and/or further goals—e.g. due to counter measure availability, further transport, energy consumption, until the hazard is decayed by applying the counter capability. In other examples, the system injects artifacts to manage/control the orientation of semantic factors, budgets and/or further goals.

The system may analyze hazards based on threats against health and/or well being of self, collaborators and/or further semantic groups.

To detect threats and/or for further collaborative inferences the system indicates and/or is indicated particular orientations (e.g. at 2 o'clock, 30 degrees, towards the fancy tree at the left of the building, and/or combinations etc.). In further examples, the system moves and/or adjusts the sensing (orientation, resolution) to encompass various orientations, semantic routes and/or semantic identities (identify the (John's) car at 2'oclock, 30 degrees, at the left of the building towards the fancy tree etc.).

The system may use such techniques to ensure collaborative approaches for covering particular perimeters and/or endpoints. In some examples, the system identifies and/or ensures coverage (e.g. 100%, 80% etc.) at an endpoint, area and/or semantic identity by challenges between collaborators (and/or semantic groups) and further (endpoint/route/trajectory) coverage leadership/ownership assumed/indicated at a/each collaborator in rapport with particular orientations, semantic identities and/or semantic routes. In further examples, leaders, owners and/or supervisors may be challenged/challenge, establish, delegate and/or assign the coverage and/or further supervisory/leadership to particular collaborators and/or semantic groups. It is to be observed that, in some examples, supervisory and/or leadership (determination) may coincide and/or imply one another; alternatively, or in addition, an operator may specify that one implies and/or is equal with another (at semantic times).

Semantic (identity) coverage may be based on whether posts, sensing and/or collaborators have (been) positioned, oriented and/or setup (e.g. with capabilities, communication links/flux/stream, signal parameters etc.) to ensure that the (leadership) anchors, agent flows and/or semantic identities at endpoints and/or routes are at least in one observing view in a semantic time.

The system may be informed and/or infer that at a particular venue endpoint and/or event there are particular artifacts, agents and/or semantic identities of interest and thus the system may ensure that those semantic identities and/or agent flows are within the observing view of at one least one asset/artifact and/or collaborator during the event.

In some examples, the system monitors and/or secures a/n (event/residential/storage/facility/parking/energy/generator) venue. Thus, it may determine at a first time the (leadership) anchors, endpoints, orientations, routes and/or semantic identities within the venue and ensures that those are within on at least one or more assets/artifacts observing views at a second time. Further, such determinations may be based on (projected) best/worst case scenarios and/or undershoot/overshoot inferences. Analogously, the system may associate fairing intakes with observing views and further, agents and/or further flows with anchors, endpoints, orientations, routes and/or semantic identities.

In further examples, the home/facility/(energy generator) S2P2 and S3P3 are securing has an open door/(fairing guide) and thus the system may identify and/or index that as hazardous and/or having a high drift in rapport with the goal of securing the home/facility/generator in particular circumstances (e.g. such as an agent, (heavy/non-desirable) flow, intruder, foe and/or threat approaching the open door/fairing endpoint indexes non-affirmative and/or hazardous factors). Thus, the system may position artifacts for coverage and/or counter measures on (projected) trajectories/routes from/of the threat endpoints towards the door/(fairing/guide/group) endpoints.

When in exhaustive coverage mode the system may ensure that (leadership) anchors, endpoints, orientations, routes and/or semantic identities are within at least two assets/artifacts observing views. It is to be understood that the system may compose the semantic identities to reflect the observing views; in an example, S2P2 and S3P3 observe a residential area and they are divided by a green fence thus, the system may refer to the fence as the "green fence on your right" for S2P2 and the "green fence on your left" for S3P3.

The system may determine the (leadership) anchors, endpoints, orientations, routes and/or semantic identities by walk arounds and/or survey of the venue, challenges to/from collaborators within the flux network and/or other available information (e.g. facility layout, maps, descriptions, user challenges etc.); further, the system may deploy counter measures based on such determinations. We mentioned the use of piezo sensors, transducers, motors and/or further components for charging (e.g. of batteries, capacitors, energy grids supply etc.). Further, we explained that (fairing) elements allowing the diffusion and/or transmission of energy may be used (e.g. polycarbonate sheets, ceramics etc.). The system may reorient, extend and/or deploy such elements and/or further ensembles for optimal energy generation, storage and/or further budget replenishments. It is to be observed that the system may determine the generation of energy and/or budgets at various endpoints. Fairings may be associated with antennas and/or further sensor enclosures in some examples; in other examples they are used to decrease the vehicle drag, to protect vehicle components and/or carriers and/or are body elements.

In some examples, the system has a multiplicity of such fairing components and deploy, extend and/or orient them in a way that the causal agent (e.g. wind) and/or flow agent (e.g. air) deflections from particular components and/or semantic groups ensure resonant vibration at other elements and/or semantic groups. The agent flow deflections and/or further wave vibration may be based on diffusion analysis and/or further semantic inference. In further examples, fairing elements are disposed and/or oriented as such to capture the vibrational agent flow (e.g. air, sound, ultrasound etc.) and/or induce (near/reasonable) resonant vibration (at piezo and/or induction endpoints) and/or further deflect them towards other fairing elements for allowing those to vibrate and/or rebound. As explained in other sections of the application (e.g. hazard mitigation etc.) the (air/hazard/counter-hazard) fairings/sensing/element/post and/or agent flow orientation may be based and/or further guided based on semantic analysis in order to ensure optimal realization of goals.

Fairings may be attached to a carrier via mechanical links which may comprise and/or be controlled by actuators including motors. Further, such link elements may be associated with further sensors whether comprised in the actuators or not. The mechanical links may comprise hooks/lock/latches and/or further suspension elements. The mechanical links may be associated with model links.

Figure 31:
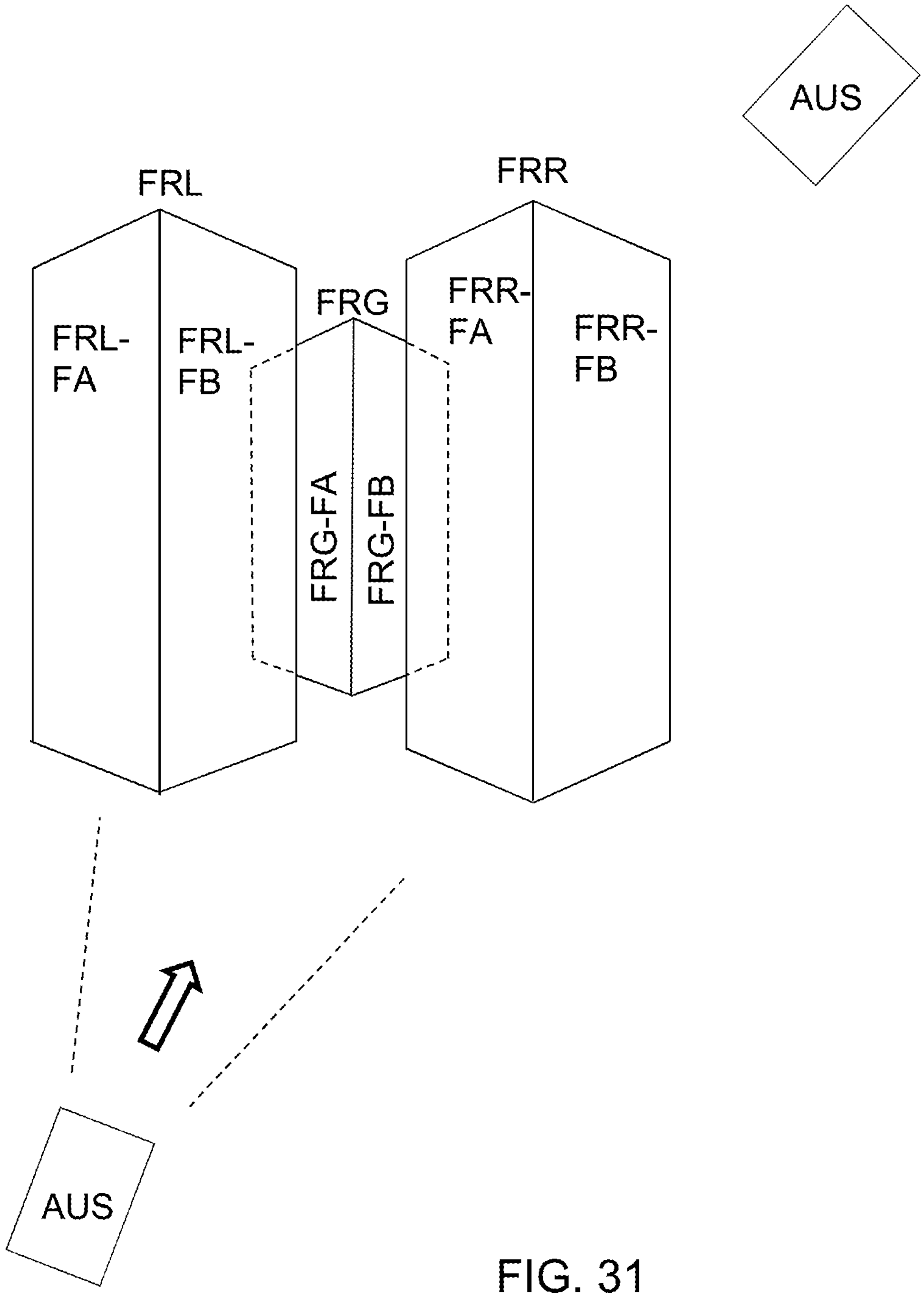
FIG. 31 is a representative view of a plurality of fairings.

In an example of FIG. 31, six fairing components (FRL-FA, FRL-FB, FRG-FA, FRG-FB, FRR-FA, FRR-FB) which are grouped as FRG (fairing resonant guide), FRL (fairing resonant left) and FRR (fairing resonant right) semantic groups. Each of the groups have two fairings FA and FB (as identified within the context and/or endpoint of each group) and/or FRL-FA, FRL-FB, FRG-FA, FRG-FB, FRR-FA, FRR-FB (as identified in the picture from the outside of each group endpoint). The fairing setup may be seen as oriented with the fairings edges joint angle at each group (e.g. FRL EDGE, FRG EDGE, FRR EDGE) towards the viewer and away from the picture background. However, in other embodiments the edges joint angles are oriented towards the picture background away from the picture observer. It is observed from the picture that FRL-FB obturates FRG-FA and FRR-FB obturates FRG-FB. As the agent (e.g. air, ultra/sound etc.) flows towards the ensemble in the direction of the arrow shown in FIG. 31 it reaches the edges, exerts forward pressure/momentum and further splits at the fairing edges and flows alongside the fairings. At FRG the flow is deflected along FRG-FA and FRG-FB and enters the ensemble between FRL and FRR and further towards FRL-FA and/or FRR-FA exerting backward pressure/momentum. As such, at least at FRL-FA and FRR-FB forward and backward pressure/momentum is exerted which generates mechanical vibrational movement which may be further be converted to charge/voltage/current by the attached piezo enabled components. It is to be understood that the fairings and/or edge positions and/or angles may be adjustable (e.g. as attached to the post, device etc.) which allow the system to adjust optimal flows and/or vibration based on various circumstances. In some examples, the fairing angle at FRL and FRR is reduced (e.g. such as FRL-FA and FRR-FA are more inward within the ensemble) and thus the air flow further deflects from FRL-FA to FRL-FB and from FRR-FA to FRR-FB and thus exerting force/momentum on FRL-FB and FRR-FB. While in the picture the fairings within a group are joined it is to be understood that they may adjusted to be joined or not and/or further oriented based on semantic analysis; in other examples they may not be joined. The system may join the fairings at the edge and composes the vibration between the edges as part of a resonant semantic group (e.g. when not damped the (resonant) vibration is affirmative resonant towards the charge/energy generation while by H/ENT when damped is not affirmative resonant towards energy generation however, it may be affirmative resonant towards other goals such optimizing post/carrier center of gravity etc.). The vibration and/or mechanical wave may be modulated and/or conditioned based on semantic wave conditioning and/or further semantic (resonance) analysis. The system may seek to optimize the energy generation by achieving piezo resonant frequency at the piezo elements and/or particular (resonant) AC induction phase at inductive elements. It is to be understood that the agent flow may enter and/or deflect from/to other fairings and/or between fairings which are depicted or not depicted and further composes and/or generates pressure/momentum/force.

The AUS depicted in FIG. 31 may be related with an agent source as such generating agent flow and/or waves towards the fairing ensemble.

The system may use at least one sensor to detect and/or infer the optimal, resonant and/or likeable orientation for the fairings (e.g. sense air flow speed, (ultra)sound source orientation, signal strength, polarization etc.).

It is to be understood that in some embodiments the system may adjusts the fairings in a way that they are mostly aligned potentially with no or very little edge angle and gap between them. Further, the system may be able to orient the fairings in such a way which inverts the edges angles (e.g. instead pointing and/or being oriented towards the viewer pointing and/or being oriented in the opposite direction towards the picture background).

The system composes, gates and/or diffuses the air flows and/or associated exerted momentum/force at various endpoints and/or on/within mapped fairings. Further, the system composes, gates and/or diffuses the momentum/force exerted by suspension/lock/latch elements (and/or rebound) at (fairing/module/post) endpoints. Further flow/force/momentum analysis may be used at any elements of the device, post and/or carrier.

The fairings and/or further attached generative components (e.g. piezo components, (electro)magnetic induction generators, solenoids, magnets etc.) and/or rebound (suspension/lock) elements are disposed in layers. The fairings may be attached to the outer layer and receive direct agent flow. Further generative components other than those in locks/hooks/latches and/or (piezo/solenoid/inductance based) actuation steppers and/or motors may be attached on and/or between the fairings, layers and/or modules of posts and/or composable carriers. Semantic group of elements may comprise and/or further adjust generative elements with various resonant vibrational frequency and/or AC generative frequency. In some examples of electromagnetic induction generation a module/fairing/element A is attached/comprises a solenoid and a connected neighboring module/fairing/element B is attached/comprises a/an magnetic/electromagnetic element which generates an electrical current via (electro)magnetic inductance when moving within the solenoid during mechanical vibration at/between A and/or B.

A generative surface may comprise generative elements and/or fairings.

The system may be configured and/or use the generated (potentially based on semantic wave) magnetic fields to actuate, move and/or control links, shafts, dampers, locks, valves, diaphragms, membranes, voice coils and/or other elements (of modules, posts, machinery, vehicle etc.). In some examples, such elements comprise ferromagnetic components and/or materials which activate/diffuse (in a particular direction) based on the generated magnetic field and/or its further orientation.

While in the example the agent was related with wind air flow it is to be understood that the agent may be generated through other means. In an example, the agent source is an ultrasound/sound source (e.g. depicted as AUS in FIG. 31) which generates ultrasound/sound waves which are then captured at fairing ensembles (e.g. fairing ensemble in FIG. 31).

It is to be understood that the fairings may capture and/or orient the agent flows to (other) sensing/transduction elements and/or modules (e.g. (comprising) electromagnetic coils, pressure transducers, diaphragms, membranes, ribbons, rotors, blades, combination thereof etc.).

The system may perform semantic inference and augmentation based on the captured agent flows and/or further sensing/transduction/actuation.

The fairing carrier may comprise an onboard (DC) (electrical) energy storage element which is charged by the generated voltage/current. Alternatively, or in addition, the generated voltage is transferred to an AC/DC energy grid after is conditioned and/or rectified.

The carrier may position itself for optimal agent capture and energy generation and further position itself and/or couple to the energy grid (socket) for transferring the agent generated (stored) energy.

The system may condition the electrical signal from/to piezo and/or inductive transducers/elements based on semantic analysis. Alternatively, or in addition, the system uses rectifiers/inverters and/or further electrical blocks/elements to perform AC-DC/DC-AC current conversion and/or conditioning.

The system forms semantic groups of transducers in order to generate and/or receive an electrical signal corresponding and/or associating each (group) with a phase of an AC signal. It is to be understood that the AC (alternating current) signal may be single phase and/or multi-phase; further, the AC signal may be used to power an AC motor (e.g. brushless motor etc.) and/or may be generated by an AC motor and further conditioned and/or transmitted to the actuation, sensor and/or battery components.

The system may condition the electrical signal from/to piezo/inductive elements based on semantic analysis. Alternatively, or in addition, the system uses rectifiers/inverters and/or further electrical blocks/elements to perform AC-DC/DC-AC current conversion and/or further conditioning. In general, a battery charger block/element provides DC current to the battery and thus converting AC sources (e.g. piezo/inductive conditioned signal etc.).

The mechanical force/momentum within/between the fairings, piezo transducers, motors and/or components may be modeled as a semantic model comprising force/momentum vectors as links. In some examples, the shear, axial, angular, rotational and/or other (stress) forces/momentum are artifacts in the hierarchical model between the endpoints comprising the relative/absolute locations and/or components they act upon and/or further the (owner/supervisory) endpoints of force, momentum and/or the caused movement. Goals may be associated with component and/or (further) endpoint conditions (e.g. in humid environments/endpoints/(endpoint A) torsional vibration at piezo/inductive front lock transducer/motor (front) (axle) at maximum 70% resonance, don't stress the S2P2 motor shaft locks etc.).

The (resonant) generation (e.g. of electric current/voltage, magnetic fields, force/vibration/waves etc.) may be modeled wherein (electro)magnetic and/or inductive capable endpoints superpose and/or are moving in and out at semantic times among each other. It is to be understood that such endpoints may be comprised in a larger endpoint (e.g. lock, component, module, speaker, microphone, medical device, post, carrier etc.) and thus the semantic inference and/or further control is hierarchical as explained throughout the application.

The mechanical force/momentum within/between the fairings, piezo transducers, motors and/or components may be modeled as a semantic model comprising force/momentum vectors as links. In some examples, the shear, axial and/or other (stress) forces/momentum are links in the model between the endpoints comprising the locations and/ or components they act upon. Goals may be associated with components and/or (further) endpoints (e.g. in humid environments/endpoints/(endpoint A) torsional vibration at piezo lock transducer front at maximum 70% resonance, don't stress the S2P2 locks etc.).

We mentioned that the system may adjust fairings, suspension and/or retract wheels based on various detected hazards. The wheels may be mapped to endpoints and the system uses semantic inference at each wheel, groups thereof and/or further within the post/carrier hierarchy.

The system may adjust damping, pressure and/or compression at elements; alternatively, or in addition, the system may comprise progressive compression elements (e.g. springs, coil (overs)). Sometimes those are adjusted based on under pressure and/or (progressive) semantic compression/decompression. In an example, the fairings are attached to the carrier by (adjustable) progressive springs/coil (overs) which allow the (composite) progressive spring-ed fairing ensembles to perform/apply the rebound activity, change the compression activity orientation (e.g. to decompression) and/or further rebound quicker when pressured harder by the agent flow (e.g. an activity and/or orientation of "pressure (harder)" to an (equilibrium/superposition) endpoint starts a "rebound (quicker)" activity in the opposite orientation).

The system composes the inference associated with each wheel, group and/or suspension elements and adjusts the vehicle trajectory based on semantic analysis. In further examples, the system retracts and/or extends wheels for optimal desired handling and/or characteristics. In some examples, the system may detect that a group of holes and/or further trajectory may represent variable hazards; thus, the system may adjust the suspension/wheel height/travel/damping/rebound. In some examples, the system may determine that it needs to go through a hazard (area/volume) (e.g. road hole) and thus the system may allow at least one wheel (of a semantic group of wheels) which is projected into the hazard to travel, orient and easily diffuse into the hazard (e.g. within the hole) at the bottom of the hole (e.g. by allowing more travel and slower rebound/hysteresis and/or less damping) while for at least another wheel projected into the hazard to block the travel into the hazard (e.g. within the hole by blocking downside orientation towards the bottom of the hole). Thus, the system may optimize stability, handling and/or comfort by composing the capabilities and/or behaviors provided by the semantic group of wheels (e.g. left front wheel A diffuses into the hole and ensures road contact while left front wheel B doesn't diffuse into the hole and ensure road contact after passing the hole (semantic time) and while left wheel A is rebounding (semantic time)). It is to be observed that the wheels may be attached to separate suspension elements in order to preserve separate suspension capabilities at each wheel (and/or member of the semantic group) while being attached to the same steering mechanism and thus, having only group based entangled steering capabilities; hence, the group of "left front wheels" has an entangled low spread resonant composable steering capability (e.g. the wheels steer together and cannot change the steering spread and/or behavior at one member without another) while also has an entangled high spread composable suspension capability (e.g. the wheels suspension moves separately and thus, can adjust the suspension parameters (e.g. travel length, damping etc.), behavior and/or further spread based on/at each member).

It is to be observed that the system may adjust and/or optimize (suspension and/or wheel) control based on (resonant and/or entangled) semantic groups thereof and/or further of modules/post/carrier elements and/or further associated endpoints meeting hazardous environmental endpoints; thus, the system uses collaborative approaches in the semantic group of elements (e.g. suspension elements and/or wheels and/or further semantic identities) as counter measures to preserve goals and/or stability and/or to quickly counter/disperse/damp the hazards at environmental and/or trajectory endpoint/s. It is to be understood that while the suspension elements may be attached to wheels, other suspension elements associated with the locks and/or latches may be used in determining, controlling and/or damping inferences (e.g. the system may adjust locks movement and/or damping to diffuse transmitted shock/waves, to allow more movement on column and/or wheels up/down orientation etc.).

The suspension and/or wheel elements may comprise piezo/induction motors and/or components which may have (charge/voltage/current) (energy budget) generative capabilities for supplying onboard components (e.g. sensors, batteries etc.), charging on batteries and/or supplying energy grids as explained during this application.

When stationary a post may retract and/or lock the wheels. Alternatively, and/or in addition a post may comprise stability ensembles and/or stability legs and/or pods which extend/deploy to the ground for ensuring stability when in a stationary position. It is to be understood that the wheel support itself may comprise a stability leg, pod and/or ensemble and once the wheel/s is/are retracted it reaches the ground and secures the post in place. Alternatively, and/or in addition stability legs/pods/ensembles extend in deployed position (e.g. down and/or outward the post mobility base) and secure the post in place. The wheels may retract and/or lock in at least one bay which may be covered.

We mentioned that the system may use agent and/or further agent flow inferences for semantic factorization and/or further routes. In a previous example, S2P2 and S2P3 were presented as coupling to each-other wherein the pull force may have generated destabilization of S2P2. It is to be observed that in such an example a (S2P3) component and/or further S2P3 are the causal agent/s and the band (pull) (force vector) is the flow agent. As such, while the system may have been considering the flow agent as foe it may not have been considering the causal agent itself foe because they were entangled on the goals. In the case that the causal agent was a hurricane the system may have been considering it as a friend/affirmative because it may help generate energy by fairings and/or as a foe/non-affirmative because it may determine post destabilization which in turn may decay/gate/block energy generation and decay affirmativeness/friendship. It is to be observed that the system may consider as agents components, phenomena and/or artifacts. Further, the system may compose causal agent and/or flow agent identification (e.g. band, pull, band pull, band pull force vector, hurricane wind, wind_from_Jasper, heavy_winds_with_cold_air_from_Jasper, hot air from the back of the engine etc.); as such, the causal agent leadership semantics are projected at endpoints/links through flow agent diffusion and/or gating.

Flow agent diffusion and/or gating between a first endpoint and a second endpoint may comprise allowing/blocking/containing/counter particular artifacts comprised, carried and/or in possession of a flow agent. In some examples, a DeLorean carrying and/or comprising an unlikeable, undesirable and/or hazardous capability (e.g. road damaging studded tires, dirty headlights, missing license plate etc.) may be allowed and/or diffused to an endpoint with the capability likeably contained, offloaded and/or with applied counter-measures to affirmatively factorize its likeability and/or hazardous indicators.

To manage diffusion the system may control the rate to which particular capabilities, (factorized) semantics and/or (associated) artifacts are allowed/blocked through a (semantic) (post) gate. Further, the control may comprise and/or be based on the rate of bonding and/or (further) factorizations of the diffused capabilities, semantics and/or artifacts at particular regions and/or endpoints. As explained throughout the application, likeability/non-likeability and/or hazards may be (further) projected and/or factorized at particular regions and/or endpoints.

In further examples, while at diffusion and/or gating dividers and/or endpoints the system and/or (gating) posts may determine (e.g. based on sensing, flux etc.) and/or augment the flow agent and/or its/their supervisors of the artifacts, conditions and/or measures required and/or applied to diffuse the flow agent through the divider and/or gated endpoints. Further, they may apply required counter-measures, contain, position and/or manipulate unlikeable artifacts, capabilities and/or hazards to affirmatively factorize likeability.

As mentioned, the system may characterize artifacts as being slacker and/or similar. Such inferences may be determined based on slacking semantic factorization. For affirmative resonant semantic groups the slacking inferences within the group may be decayed by increasing transparency within the group; as such, the members may publish and/or challenge more within the group and/or entangling the members more (e.g. share and/or provide more real time raw and/or lower level signals and/or data between members etc.).

Slacking factorization may be based on semantic spread and/or drift intervals between an optimal orientation/trajectory and/or an actual orientation/trajectory. It is to be observed that slacking may be determined based on observing views and/or further clauses/rules/routes (e.g. S2P3 considers S2P2 a slacker because the inferences and/or orientation of S2P2 activities are highly drifted from projected S2P3 activities; a chain (drive) has a big slack from a manufacture's (clause) view and/or dealer because the chain orientation and/or drive has high drift from optimal and/or recommended settings etc.).

We mentioned progressive compression and/or damping. The progressive compression and/or damping may be applied to multimedia/stream artifacts compression and further, it may be applied in semantic shaping and/or to identify objects in frames, videos and/or imaging artifacts based on similar compression, damping, hysteresis, diffusion and/or equilibrium at a semantic group of endpoints associated with shapes and/or objects at various levels of the semantic hierarchy. The progressive compression and/or rebound damping may be associated with particular hysteresis and/or (hysteresis) diffusion for particular semantic shapes, routes and/or orientations.

Progressive compression, damping and/or further hysteresis may be applied in multimedia/stream/image/artifact compression and/or to identify particular (progressive) levels of detail, semantic identities and/or resolutions.

The system may convert and/or augment multimedia artifacts and/or streams from/to a variety of compressions and/or codecs (e.g. HEVC, H.264/265/26x, wavelet, MPEG etc.) with/to progressive compression and/or semantic shapes.

Progressive compression may be used to represent and/or identify semantic shapes in a progressive way (e.g. more factorized leadership artifacts of a semantic identity and/or shape are represented at less damped layers/resolutions; the less damped layers/resolutions may be progressively augmented in a hierarchical way with potential more damped and/or localized artifacts). An equilibrium and/or superposition (endpoint) is reached based on inference of rebound damping and/or further hysteresis to/of rebound damping; when reaching equilibrium the system may conclude the inference (and/or activity) and/or publish the semantic identification of the particular artifacts and/or shapes—as additional inference on it may provide distortion and/or decay in coherency (and/or coherent orientation).

The system may adjust and/or project compression, damping and/or hysteresis in order to identify semantic shapes.

The system adjusts compression and/or dampers of components supporting, incorporated and/or attached to enclosures, home and/or vertical industry appliances (e.g. washers, dishwashers, coffee makers, POS, CT apparatus, TV etc.), doors, windows and/or structure (e.g. building, vehicle, carrier, carriage, wagon etc.) components.

The system may use pads comprising piezoelectric, suspension and/or generative/inductive components as support for monitored elements and/or to further implement pressure and/or weight sensors. In some examples, the pad includes a superior part and an inferior part which are coupled by the piezo/generative/inductive/suspension ensemble (or semantic coupler link ensemble). The superior part may be used for supporting items, appliances and/or articles (e.g. kitchen ware, dish ware, bottles, recipients etc.) while the inferior part may be used as support and/or to harvest vibrations and/o agents from supports and/or environments. The pad may comprise energy storage elements such as batteries, capacitors etc.

In an example, a bottle display ensemble comprises a plurality of bottle supports wherein each support comprises a pad; the pad may capture/guide/harvest agents (air, ultrasound etc.) and/or vibrations while also measuring the pressure exerted by the bottle. Further, the pad may embed at least one electronic chip, unit and/or memory which allow the pad to store and/or communicate with the system and/or with the bottle via communications and/or coupling capabilities in the at least one chip; in some examples, chips may comprise radio frequency and/or induction components which allow electromagnetic communication and/or coupling. In further examples, via the components (e.g. such as piezo, induction and/or solenoid based sensing) embedded in the semantic coupler link ensemble, the system detects the pressure exerted by the bottle, damps and/or gates the vibrations from the inferior support part to the superior part.

The system may use the sensor readings to detect differences in pressure, weight and/or further consumption patterns; further, such readings may be coupled with other sensing and/or fluxes for learning. In an example, a camera/flux detects that the bottle is "full" at a first time, "50% full" or "half full" at a second time and/or "empty" at a third time and thus, it infers and/or associates the pressure characteristics and/or further infers weights (of empty bottle, content etc.), content, other characteristics (content density etc.) and/at semantic times. The system may further determine based on further sensing that the bottle is "topped up", "bottomed out" based on inference of the mapped liquid surface closer to the top and/or bottom of an artifact (e.g. bottle). The liquid surface may be considered as a divider of the liquid content.

In general, top and bottom are support capable factorized artifacts with the bottom being more (likely/affirmative)

support capable factorized than the top; as such, based on support type inferences and/or further orientations the system may determine top and/or bottom (artifacts) and/or vice-versa. Further, the system infers top when it projects (from top) support in the intrinsic orientation of the bottom ("down") and infers bottom when it projects (from bottom) (less) support in the intrinsic orientation of the top ("up"); further, the system may project entangled top-bottom intrinsic "down" orientation and by H/ENT bottom-top intrinsic "up" orientation.

In some instances, there may be confusion in orientation as the system infers the support and/or up/down orientations based on components and/or contained artifacts. In an example, a painting (e.g. of a person standing and/or supported) with a known intrinsic orientation may be displayed and/or carried in an inversed manner such as the intrinsic orientation is reverse rendered (e.g. rendering the standing supported person with the head oriented downwards). Thus, the system may be confused and/or in superposition on the top and/or bottom due to further inferences regarding the component artifacts (e.g. top of a such a semantic identity—"top of the painting"—may refer to the top of the painting in the reversed orientation as it is rendered/presented in rapport with observing views and/or to its intrinsic orientation presenting the painting in an intrinsic, a believable and/or expected orientation). The system may further reduce confusion and/or superposition by techniques such as explained in this application and/or further increasing localization in the semantic and/or observing views.

In previous examples, we mentioned travelling of suspension elements towards the bottom of a hole in a road/surface. It is to be observed that the bottom may project support towards its intrinsic (down) orientation and, is further bounded (e.g. by dirt surface and/or circumstantial dividers etc.). In the example, the top of the hole is circumstantial and/or entangled to the road/surface.

A bump and/or debris may be bonded/entangled to a road/surface and/or further artifact of/on a road/surface. The system may project and/or factorize the bonding between the debris, groupings, entanglements and/or further the road/surface/artifacts (comprising endpoints/links). The system may base such inferences on semantics and/or movement associated with the debris, bonded artifacts and/or further flow agents. The system detects flow agent circumstances (e.g. comprising wind, air currents, other vehicles etc.) around a debris (e.g. box) and/or semantic identity. Thus, it may infer that the debris is moving and/or (further) should move with the flow agent/s in particular orientations; further, based on the bonding, trajectory, behavior and/or diffusion the system may infer whether the debris flow agent is hazardous and/or non-hazardous.

In an example, the system detects that a box is flying in an unrestrained, high spread and/or non-localized orientation/trajectory within a semantic time and thus, it may detect that the flow agent bonding (e.g. of a reasonable strength/hazard wind, air) is high and thus, the box may be reasonably bonded and/or reasonable hazardous/non-hazardous. In further examples, the box is hit and bonds/entangles/groups with vehicle A and further is hit and/or bonds/entangles/groups with vehicle B and thus, its movement orientation and bonding is affected and/or bonded/entangled/grouped with A and/or B in a semantic time.

The degree of bonding is associated with factorizations of entanglement, linkage, support and/or further semantics.

Flow agents (whether composite or not) enable movement, circulation, bonding, distribution and/or dissemination between endpoints. The possession within and/or of a composite flow agent can be (orderly/hierarchically) associated with a leader and/or supervisor (within/of the composite flow agent semantic group, at endpoints etc.).

Flow agents may carry measures and/or counter measures as per goals. In examples, public works agents and/or assets (e.g. such as road work carriers) apply measures/countermeasures (e.g. asphalt, barriers) to various road areas and/or endpoints as per goals.

Endpoints may be supported and/or provide support at the bottom, divider and/or top. However, in some examples such support is little, non-sufficient and/or hardly believable when grouped and/or entangled.

In further examples, the pad is deployed on a (inductive) surface which (affirmatively resonant) vibrates (at particular semantic times) in order to charge the pads. The vibration is affirmative resonant with charging goals while is not affirmatively resonant (and/or high drifted/entropic) with keeping the bottle and/or content steady and/or safe. Thus, the system further groups and/or entangles its components (e.g. superior, inferior etc.) with/to the high entropic collaborators (e.g. supported bottle and support surface) and/or goals (e.g. accept vibration charge, keep the bottle steady, damp vibration); as such, the system groups and/or entangles the superior pad part with the bottle and the inferior pad part with the (inductive) surface and ensures that the semantic coupler ensemble is likeable and/or affirmative resonant to/with both groups and/or fluxes (e.g. by gating and/or damping the non-likeable H/ENT behaviors, waves and/or vibrations between the two semantic groups).

In other examples, pads may be used to support appliances (e.g. washing machines etc.) and damp the vibration induced by the machine at the coupling endpoints and/or further charge components based on such vibration. Analogously, stabilization (post) pods may comprise pads for optimal stabilization, vibration absorption and/or damping.

In the example, a semantic coupler (pad) may be entangled and/or grouped at one time with a coupled supported item (e.g. the bottle sitting on the top surface) and also with a coupled support (e.g. (inductive) surface). A semantic coupler ensures that at least two semantic groups comprising each a distinct coupler component and a coupled item are not non-affirmative resonant and that the composite semantic group of the coupler and the coupled items is affirmatively resonant (entangled) and/or likeable.

The pad parts, links, supports, bottles, environment artifacts and/or further agents and/or flows may be mapped to semantic artifacts.

We mentioned that the system may perform automated ordering, goodwill or further activities. As such, the system captures and/or identifies items, options and/or semantic times on a menu (e.g. in a frame, picture, stream, flux etc.), UI component, rendering, multimedia artifact/renderer/stream and/or application; the items/options may be comprised and/or inferred in a variety of embodiments and/or captures (e.g. physical menus, UI menus, ordering menus, picture/frames/stream of the menus etc.); based on inferred semantic times the system may enable/disable the items/options.

Applications and/or further (user interface) artifacts are inferred, rendered/disabled/hidden and/or highlighted based on semantic inference and further semantics inferred based on endpoint/link transition of a mobile device running the applications. Further, particular application semantics at a location are gated and/or rendered.

The system identifies, highlights, indicates, renders, paints, selects, crops, augments and/or groups various items/options based on drift inferences in rapport with the (user/ supervisor) semantic profiles. In some examples, the system augments on the menu the option of "large caffe latte" with "one shot" and thus, the POS (point of sale) may understand that the user prefers and/or orders a ""one shot" "large caffe latte"".

The system may place orders based on identification and/or further augmentation and/or challenges from the user. In some examples, the system identifies the user and its preferences at an (ordering) endpoint and/or POS and further performs inferences on the low drift menu items from its preferences; if the confusion is low as to what the user may want then the system may render and/or challenges the user to confirm (e.g. "one shot caffe latte today?", "the usual?" etc.) and/or present a list/option of potential likeable artifacts/options from the menu and/or slightly drifted (possible/believable) options from/of/off the (options from the) menu.

When placing an order the system may send the augmented items/options and/or semantic identities to a POS; alternatively, or in addition, the system may highlight, paint and/or augment the items/options on the rendering/multimedia and send the rendering/multimedia artifact to the POS. The POS receives and/or interprets the augmented items, options, renderings, multimedia artifacts and/or semantic identities and generates an order and further routes and/or assigns it to a supervisor and/or owner, potentially based on semantic routing and/or drift inferences.

The user and/or ordering party semantic identification may be sent together with the ordering items to the POS. As such, the semantic identification may comprise the preferred user semantic identity, its ordering endpoint (and/or semantic identity) and/or further preferred delivery location (and/or semantic identity). The POS may respond back with the projected duration, budgets, semantic times and/or further confirmed delivery location and/or alternate proposed delivery locations.

The POS may be a on-premise and/or a remote device, computer and/or cloud. Further, the POS may be comprised and/or communicate with a module, post and/or carrier and thus, allowing the system to deliver the ordered items at the delivery locations. In some examples, the post hooks, grips, slide support arms and/or latches on a tray and/or package carrying the order and delivers and/or positions it to the delivery and/or a likeable endpoint (e.g. comprised on a conveyor, on a table, vehicle, carrier, cargo, vessel, in a preferred height, distance and/or position from the user/consumer etc.).

The POS may be attached to a post, arm and/or positioning module which allows it to be positioned and/or oriented based on inferences, preferences, likeability and/or resonance in rapport with users, owners, supervisors and/or semantic profiles.

In further examples, the system tags, labels and/or writes order information to an RF device and/or tag which may be attached and/or written to the completed product and/or tray when a product in the order is ready. Alternatively, or in addition the system indicates, tags, labels and/or augments order information on a TV and/or projection screen. In further examples, tags, labels and/or order information are displayed on a TV screen based on indications from the user (e.g. via UPI, voice, by scanning a (n) (RF) tag associated with the tagged/labeled/ordered items and/or combinations thereof etc.).

In additional examples, a user selects and/or drags and drop an item from a list comprising the orders and/or items and further associate it with multimedia artifacts and/or further UI controls on a rendering. Alternatively, or in addition the selected and/or dragged information is send and/or beamed to the artifact/s comprised in the multimedia and/or further UI control.

In an example, a caffe latte preparer finishes the fancy latte and places it on a support which is monitored by sensors/appliances which renders live fluxes/streams to a projection and/or display surface. The user then selects and/or drags and drop from a list of orders (comprising order dentification, items, owner, supervisor, customer and/or further semantic identities), the corresponding (caffe latte) order, item and/or semantic identities (e.g. JJ's fancy caffe latte; Mel's order 32 item 44, caffe latte, fancy) onto the corresponding object (and/or segmented object area, shape, bounding box, overlay etc.) on the projection and/or display surface (e.g. comprising a rendering and/or semantic identity of a latte cup). Alternatively, or in addition, the system automatically matches the order, items and/or semantic identities from the surface with the items stored in the order (UI) list (and/or storage (database) (object) (table) (row) (column) etc.) based on low drift and/or entropy inferences (e.g. the system detects on the stream a fancy caffe latte and has in the order list only one order, item and/or semantic identity (e.g. JJ's order, Mel's order etc.) which is and/or has low drift from a "caffe latte" and/or "fancy caffe latte"). Alternatively, or in addition, when confused (e.g. multiple orders, items and/or semantic identities are similar), the system may challenge the producer, positioner, manipulator and/or agent to indicate the actual order, item and/or semantic identity from the list and/or options identified as similar.

The system infers an order readiness status once all items/products in an order are ready and performs semantic augmentation and/or notify the order supervisor/s (and/or owner/s) for pick up and/or delivery. Further, the system may notify the supervisor/s when all the items and/or orders associated with an endpoint are ready and thus, allowing the supervisor, carrier and/or flow agent to optimize delivery and/or diffusion.

In other examples, once the product is ready, a supervisor (of production endpoint and/or order) may indicate via UPI, voice and/or (printed) ticket/tag (attached) to the product (container) information about the product (e.g. type, destination, order supervisor etc.). Alternatively, or in addition, the system may automatically recognize the type of product, destination, supervisor and/or other information based on sensing, ordering and/or supervisor flux, POS, attached RF/ID devices (storing order information from POS and/or from supervisor augmentation by UPIs, voice, selection and/or combinations thereof) and/or further inferences. In some examples, it detects a "fancy caffe latte with an umbrella" and is very likely ordered (and/or has low drift, shift, entropy) by the nurse reading the newspaper where it should be further routed and/or delivered; and/or it detects that the tag, label and/or RF device on the tray or cup specifies table #1 and thus it infers that it has (a caffe latte for the nurse JJ at table number one and/or) a fancy caffe latte and that the destination is the table #1 (or similar/low drift—number one, one etc.) and further nurse JJ/Jane and/or further associated endpoints (of JJ/Jane's, table, chair and/or further associated devices).

The system infers semantic identities of the causal agents based on their activities as diffused by flow agents (e.g. "the_barista_who_sent_me_the_wrong_item", "the post that sent me the information about the tea pot" etc.).

The system may infer possession of artifacts (e.g. possession of items in an order by supervisors and/or consumers) and/or further challenges and/or augments when the possession chain is drifted, entropic and/or hazardous (e.g.

the fancy caffe latte is directed/delivered to "the tall man with a black shoe"/John/Does, the fancy caffe latte is in the possession of a hazardous agent (carrier) and/or is hazardous bonded etc.).

It is to be observed that the system may have and/or assign particular supervisors in the (particular) (product) preparation areas. Supervisors and/or owners may specify/write/indicate the information tagged/labeled on the supervised/owned products and/or orders and/or specify feedback/information on the product and/or order. The consumer may also provide feedback and/or rating whether automatic by sensing from a device and/or by manual ratings.

A consumer may be identified as an agent of consumption activities and/or demand while a producer as an agent of producing activities and/or capacity. Consumers and producers may be connected by other (flow) agents.

Each of the participant artifacts in an activity (e.g. ordering) may be considered as producer and/or consumer depending on the observing and/or semantic views (e.g. Jane is a producer of consumption and further a consumer of fancy caffe lattes; the order supervisor is a producer of orders for the coffee bar and the consumer of the produced goods by the bar; the coffee bar preparer is a producer for the order supervisor and/or Jane and a further consumer of orders). Artifacts may be also (entangled as) producer and/or consumer in rapport with each other (e.g. they are producers/consumers of (time) budgets, likeability, hostility, trouble, hazards and/or other factorizations). Further, some artifacts may be also flow agents—the order supervisor (and/or server) is the flow agent between artifacts, semantic identities and/or activities (e.g. between Jane and the coffee bar (chef) (supervisor), between Jane's consumption activity and chef's producing activity etc.).

Producers and/or consumers may be mapped as (entangled) hierarchical causal agents and/or flow agents (e.g. the order supervisor is a safety/non-safety causal/flow agent for/of the coffee bar attendant (or chef/barista), the company and/or Jane).

The system may communicate with the ordering and/or POS system by expressing satisfaction or dissatisfaction with the received goods.

The orders may be routed to agents and/or supervisors based on semantic drift inference on capabilities and/or budgets (e.g. the fancy caffe latte order is routed to a caffe latte capable endpoint having (around) a diffusible (based on budgets, semantic time) trained chef/barista in the craft, the fancy caffe latte order is routed to John/S2P2 as a flow agent because he likes, has budgets, strengths and/or knows how to carry/order/deliver such orders etc.). A supervisor and/or an order owner may manipulate, indicate and/or instruct supervised/owned objects (and send them) to particular endpoints, links, trajectories and/or semantic identities.

The orders may be routed by the semantic posts to their destination endpoints and/or ordering parties. A supervisor and/or an order owner may manipulate objects and send them to particular endpoints and/or semantic identities.

The system identifies a user at an endpoint based on the published semantic identity. In an example, the system and/or the user publishes (itself) as "a man with a black tie" and the system looks in the venue, destination and/or target endpoint for the corresponding semantic identity. The system may identify and/or look for "a man with a black tie" at "the vintage coffee table on the green mat", "the table supervised by John", "imperial golden table" and/or "number one" depending on the observing entities, views, user and/or further augmentation inference.

Further, the system identifies a user and/or further activity based on localization, orientation, hierarchical endpoints, diffusion and/or further semantic groups. In an example, the system identifies that an order is issued and/or associated from/with a particular location, endpoint, links and/or further semantic identity (such as "the short man with a black tie roaming around from the bar to the patio", "the short man with a black tie which was sitting at the imperial table", "the short man with a black tie sitting off the bar towards the patio", etc.). As such, the system uses qualifiers to determine diffusion of the leadership semantics at endpoints in the environment.

In the example, an observer may determine that the semantic identity moves in a permitted/expected manner (e.g. he doesn't walk on top of coffee tables and/or keeps off wet marked areas as instructed and/or as projected); as such, the system determines that the motion is believable and/or likely. If the observer wants to increase believability drift it may adjust expectancy and/or restriction-ed endpoints/links (e.g. relaxes the restrictions by allowing movement around from the coffee bar to the patio and walking anywhere including wet areas or coffee tables).

It is to be observed that the terms "roam" and/or "around" and/or similar may be used to specify locations comprising endpoints, links (e.g. from coffee bar to patio) and/or further drifted/shifted artifacts from those. The system may consider the dimension and/or artifact mappings of the objects targeted as "roaming"/"spinning" "around"; as such, it may index and/or diffuse to other endpoints, links and/or trajectories which may allow or not believable and/or expected movements. As such, in the example, the observer may not indicate "roaming around from the coffee bar to the table" if such roaming movement and/or diffusion for the target is not possible (e.g. because the short man doesn't fit and/or cannot move within the endpoints/links etc.). It is to be observed that "spinning" "around" may factorize more the leadership of an endpoint (e.g. sole or first endpoint of a link) while "roaming" "around" may factorize the leadership of a link and/or endpoints more evenly.

Semantic roaming and/or semantic model distribution may be employed based on roaming, spinning, around and/or other (similar) semantics diffusing and/or indicating positioning, orientation and/or diffusion (e.g. the user and/or device is pre-provisioned with the sub-models, rules and/or routes in the "around"/"spin" area based on further semantic times). It is to be observed that the system may infer that the system may return at a later (semantic time) at or close by to an endpoint and/or semantic identity which determines and/or is encompassed in "spinning" and/or "around". In some examples, spinning around encompasses a particular likeable diffusion and/or indexing at a particular semantic time.

The system projects and applies the laws of the land for roaming. In some examples, during (semantic) route inference and/or factorizations the system projects the roaming endpoints and/or further (associated) laws of the land.

We mentioned that the system may determine significant (e.g. unusual behaviors, hazards, interests etc.), interest and/or focused inferences in rapport with objects, devices, users, vehicles, intruders, supervisors and/or further (composite) semantic identities and/or sematic groups.

In further examples, the system determines endpoints/links of significance (e.g. determining unusual behaviors and/or particular interest inferences) in rapport with a user, post, (sensing) device and/or further trajectory and/or activity. As such, the system may augment a user with the endpoints and/or further significance (at the end of the activity). In an example, the system determines endpoints/links of significance for S2P2 (and) driving (and) (the DeLorean) based on inferences in regard to S2P2 manipulating the clutch and/or manual transmission of the DeLorean in a potential non-optimized and/or hazardous manner. Once augmented, the user (e.g. John as a supervisor user of S2P2) may elect to save those artifacts of significance and associate to them further indexing and/or diffusion (artifacts) (e.g. comprising (in) a location of 5 feet around etc.); thus, next time when the user is determined at the diffused area, the system may perform inference and/or record the sensing, inferences and/or further information.

A user may budget and/or be charged based on the number of endpoints/links of significance within an area and/or endpoint; further, the budget/charge may be based on the diffusion and/or indexing from the (significance) endpoint/links (e.g. to comprise endpoints at most/least 20% lower/higher than an endpoint (within 5 ft), to comprise a small/large/pro/beginner/advanced range from/within the endpoint, to comprise trajectories and/or links 15 degrees (sloped) (within 5 ft), combinations etc.).

A user (and/or semantic group) may be determined and/or localized at a diffused area by being proxied by a supervised device (e.g. S2P2 is under the supervision of John/Does). The system may determine that a device may be tampered with and/or ill manipulated; the system may perform such inferences based on high drift behaviors from indicated supervisory and/or a high number of hazardous and/or blocked diffusion attempts. Further, the system may use external sources and/or semantic fluxes for determining such tampering. In some examples, the system determines that S2P2 which is under the supervision of John is non-affirmatively (e.g. with John and/or (further) supervisors) manipulated and/or influenced by S2P7/groups and/or its supervisors/leaders. S2P2 may perform augmentation to its supervisors regarding such non-affirmative inferences. Analogously, with such non-affirmative inferences of tampering and/or ill-manipulation the system may determine affirmative inferences such as support.

Supervisors' semantic identities and/or further localization are stored and/or accessed in secured (hierarchical) artifacts of memory and/or published based on blurring.

Users and/or semantic groups may be charged based on the budgets consumed for performing inference, augmentation and/or storing information which may be endpoint, group and/or semantic time dependent. It is to be observed that the system may indicate further significant/interest and/or focused endpoints/links (and/or semantic identities) around an original significant endpoint/link and thus, the system may match and/or include only those and/or exclude the others when inferring and/or recording (e.g. the system may include the endpoints on the trajectory and/or links which are 15 degrees sloped around the significance endpoint/link etc.).

A user may save artifacts of significance on a device being accessible and/or in possession of the user at first time and then saved onto a cloud server at a second (semantic) time. The user may collect data about the artifact of significance and save it on the device and/or onto the cloud server. The system may use semantic analysis to invalidate and/or remove device/cloud data.

A user (and/or artifact) may want to be notified on activities, artifacts and/or further semantics of interest which may have low drift and/or shift from specified, indicated and/or stored semantic identities, activities, budgets and/or further interest circumstances. As a user/post (and/or artifact) roams around a field the system may augment the user/post (and/or artifact flux/stream) on the artifacts inducing borderline and/or affirmative resonance in rapport with the user interests and/or preferences.

A user (and/or artifacts and/or groups of users/artifacts) may specify the desire for particular augmentation from sensors/devices/posts in a trajectory. In some examples, the user specifies that wants to be augmented with (him/her/itself) particular pictures and/or videos when at and/or passing through an endpoint. As such, the system may perform such augmentation by beaming and communicating the desired and/or likeable artifacts to the user. When communicated to a user, the system blurs the semantic identities other than of the user in the multimedia artifacts. In some examples, the Does want to be augmented with pictures/videos while they are skating. As such, the system takes the pictures of Does at the skating venue and beams and/or send them to the Does, their associated devices and/or accounts; as such, the pictures may comprise the unblurred semantic identities of the Does while other skaters at the endpoint are blurred as per their settings and/or profiles. The system may further blur the semantic identity of a particular member of a group (e.g. Jane) when sending/saving the picture (and/or multimedia artifacts); this may be based on the blurring, gating and/or publishing preferences of each group member (in rapport with the groups/groupings). Thus, Jane and/or John specify that they want to be blurred/unblurred as a semantic group (at particular endpoints and/or particular circumstances). As such, when the system determines the desired circumstances and/or endpoints it may augment Jane and John with the desired artifacts while unblurring/blurring their semantic identities within and/or as a semantic group. In further examples, John doesn't want to be unblurred as part of Does (and/or further hierarchical groups) unless is skating in/at particular circumstances (e.g. once (not) falling, is (not) wobbling, at night etc.) and/or endpoints/links.

In the presented examples, semantic posts and/or devices may be users and/or supervisors in a hierarchical manner (e.g. S2P2 drives the DeLorean implies that S2P2 is a user and/or supervisor of the DeLorean (controls and/or endpoints) and further John which is a supervisor of S2P2 is a higher level supervisor and/or user of the DeLorean (controls/endpoints). Thus, potential unusual/interest/focus/hazardous behaviors and/or inferences determine the system to record, opinionate, rate and/or mark the profile artifacts (in regard to which)/of users/supervisors were the leaders and/or most consequential for the unusual/interest/focus/hazardous behaviors.

A post/module/sensor may roam/spin around and look for the items indicated and, based on diffusion it may determine those targets (e.g. the pot on top of the fireplace, the pot in the drawer, the acid on the floor by the window etc.).

The system may determine that inferences are believable and/or expected by determining whether leadership attributes of semantic identities (e.g. in a semantic group) are affirmative/borderline resonant. As such, an augmentation/inference of "DeLorean_climbed_a_(big)_tree" is borderline resonant as a car/DeLorean can borderline resonant climb (by having traction leadership) and a/the (big) tree can be climbed and/or it may ensure reasonable support for a car/DeLorean. It is to be observed that the inferences including validation of leadership attributes may be semantic time dependent (e.g. the car may have the traction in snow/ice impeded/not-possible (because the car has summer/all-season tires and/or doesn't have winter tires which have lower drift to "snow/ice"), the car may gain/lose traction, the tree is completely frozen etc.). When borderline resonant and/or confused the system may look to infer additional circumstances; further challenges may be used to further factorize believability (e.g. was that an accident?, did it slide onto the tree?, did the car have snow tires?, was the tree frozen? etc.). In other examples, an augmentation/inference of "DeLorean climbed a poinsettia" is borderline resonant because a car/DeLorean can borderline climb and/or move/top over (top of) a poinsettia, its support and/or further entangled surface/artifact. It is to be observed that the semantic identity of poinsettia may be published to represent the actual poinsettia flower and/or its entangled/grouped support/container pot. It is to be observed that for believable and/or expected inferences the system looks for support (associated) semantics and/or support (associated) artifacts.

Climbing means to consume budgets to move towards up and/or to a top (lower drifted to up than down) by applying support inferences and/or associated artifacts. In an example, a/n object/person/post is localized, touching and/or obturate at one of the support and/or stairs object endpoints/links and/or is determined as moving up on a stair/fence/support artifact (endpoints and/or links), then the object/person/post is pursuing climbing (activity). The object/person/post may or may not be supported at particular semantic times (e.g. a person/post is not supported if is jumping/bouncing/hovering); if the object/person/post is jumping/bouncing and is not moving up and/or down in a believable manner (e.g. by reaching and/or following an endpoint/link and/or on a semantic time) then the system may infer that the object/person/post is hovering; such inference may not be believable (unless the object/person/post is associated with lift/hovering support artifacts, capability, carrier, agents etc.) and/or borderline believable; further, "hovering" decays the believability of having support by the stairs object. It is to be observed that in the example, a stairs semantic identity may refer to a stairs object and may further be diffused and/or published to/for artifacts encompassing/containing the stairs object such as stairwells; such diffusion may be based on the leadership of the stair object within the containers (e.g. stairwells).

Similarly, information from contained objects may be diffused and/or assigned to containers. In further examples, such diffusion and/or publishing is based on access to contained objects and/or (further) (comprised/linked) information and/or files/documents.

The support artifacts may be intrinsic. In some examples, the system infers that fumes are raising based on a flow agent support and/or up orientation; in other examples, the system infers that the prices are climbing which may imply intrinsic support from particular activities and/or artifacts (e.g. buying/buyers, playing/players and/or manipulations/manipulators). In other examples, the system infers that dog is raising/growing which comprise movement/bonding/indexing of associated semantics, shapes and/or further flow agents (e.g. time). It is to be observed that the system projects support, groups and/or entangle with support artifacts, agents and/or associated semantics in order to assess believable and/or expected movements, trajectories and/or inferences. Once there is no support for up movements the system may expect an equilibrium/superposition and/or "down" orientations and/or as determined by gravitational fields, orientations and/or anchors.

In some examples, the system may perform entanglement and/or further activities related with orientations and/or support agents and/or equilibrium endpoints.

In further examples, the endpoints/links may determine the permitted and/or believable movements "into/within" various endpoints (e.g. the tea pot unlikely to move into the fireplace unless there is an endpoint/link (within the fireplace) and/or further agent capable/permitting the tea pot to move/diffuse within/into/by the fireplace endpoint/link). It is to be observed that the semantics at such endpoints/links may be associated with the type (e.g. of a fireplace), semantic groups, components, environments, materials, bonds and/or further inferred localized semantics.

Semantics associated with in/out, enter/exit, left/right, lower/(higher) (raise) and/or up/down may determine believability of motions, trajectories, endpoints/links and/or semantic groups. The system may compose such orientations for determining further inferences in regard to object motions, surroundings, components, topographies, semantic attributes, semantic groups and/or flows.

The system may use (H/ENT) orientation inferences from/to a divider to determine top/bottom, left/right, inside/outside etc. Superposition of top/bottom, left/right and/or further partitioning in rapport with a divider, anchor and/or further semantic identity in a semantic and/or observing view means containment and/or collapse at the divider, anchor and/or further semantic identity and/or blocking of at least one of the from/to orientations.

In an example, the system may identify the fireplace as being up or down the stairs; and/or that the tea pot is up the fireplace or down the painting. In other examples the system may infer that the preferred orientation is up the ledge and/or on top of the ledge.

Particular motions may be believable or not based on inferred, permitted and/or allowed diffusions (e.g. an object diffusing into a locked/blocked endpoint (e.g. store) may not be believable if the endpoint is thought as impenetrable as the entrance links are highly secured, a bear entering a rock may be believable if there is an opening in it accommodating the bear etc.).

The system infers distortion when the published/indicated semantic identity of an artifact doesn't coincide with a reasonable and/or believable interpretation. As such, an artifact is published and/or indicated as a semantic identity of "imperial black wooden table" "sitting the Does" but the system determines that the table at the location is not black/wooden and/or not-likely imperial and thus, it may infer distortion and/or high drift and further, looks, injects and/or perform confusion reduction (activities, endpoints and/or links).

As the system may be confused, it may further determine that "a couple" and/or further Does sit at the table which may progressively increase superposition (on distortion); as such, the detection of Does provides more stability and/or damping that "a couple" and thus, the detection of Does provides higher superposition and/or equilibrium and less distortion that the indicated (and/or published and/or looked after) semantic identity is the one detected.

As the (distortion) superposition is low, the system infers high distortion (e.g. because the system doesn't detect "a couple" and/or further "Does" at/with the endpoint, group and/or leadership semantic identity). While the system infers distortion it may not be confused (e.g. because the indicated semantic identity is too drifted and/or distorted than the actual; or, the system decreases superposition from the equilibrium as it identifies the Does and further determines that Does are the (leadership) identity, target and/or destination of the order delivery activity and completion etc.).

A user (and/or artifact) may want to be notified on activities, artifacts and/or further semantics of interest which may have low drift and/or shift from specified, indicated and/or stored semantic identities, activities, budgets and/or further interest circumstances. As a user/post (and/or artifact) roams around a field the system may augment the user (and/or artifact flux/stream) on the artifacts inducing borderline and/or affirmative resonance in rapport with the user interests and/or preferences.

An artifact is in equilibrium and/or superposition in rapport with an activity when the affirmative and non-affirmative factorizations and/or budgets acquired during activity decay/cancel almost completely each other at the completion of activity and/or within a semantic time comprising the activity. If not in equilibrium, an artifact may be affirmative or non-affirmative resonant. Artifacts in equilibrium in rapport with an activity are borderline resonant and may further form borderline resonant semantic groups in rapport with the activity.

The system may target and/or project to reach equilibrium and/or resonance at the highest levels of the hierarchy.

We mentioned that the system may direct agent flows based on the adjustment of fairings. Further, the system may damp and/or absorb the directed agent flows at the fairings and/or other absorption elements (e.g. blades, (waste) storage, dampers etc.).

The system uses the fairings to (re)direct an outflow to an inflow and/or vice-versa. In some examples, the carrier generates an (air) outflow (or "OUT flow", "out flow" etc.) which is directed, diffused and/or coupled towards a (hazard) endpoint in order to affirmatively factorize the semantics at the endpoint (e.g. reduce hazard) and is further directed by the fairings as an inflow (or "IN flow", "in flow" etc.) once the outflow diffuses and/or deflects from and/or with the hazard (e.g. moves/absorbs inflow of fumes, vapors, debris etc.). In further examples, the system orients an air flow comprising hazardous fumes, debris and other unwanted elements to likeable endpoints/links for damping, containing and/or clearing/inactivating/disabling/incapacitating hazards. The system may look to damp, decay, contain and/or incapacitate the leadership attributes and/or artifact rendering the agent hazardous and/or unwanted.

The system strives to keep the artifacts likeable, low/non drifted and/or affirmative resonant in rapport with the observing views and/or supervisors' goals and/or activities.

Fairings may generate resonant vibrations and/or (orient) (counter measures) (agent) flows for (affirmatively) factorizing the leadership semantics and/or their projected effects, (affirmatively) exploiting (leadership) vulnerabilities of hazards, and/or breaking down hazardous materials; further, may orient hazardous and/or non-hazardous (by-) products/items/flows to further endpoints and/or storage.

We mentioned that the system may determine hazardous semantics for objects and/or artifacts while they are at an endpoint. In an example, the system and/or user tags and/or detects (particular) carriers at a location and infers that particular conditions, do's and/or don'ts at the location (and/or associated endpoints/links) based on the presence of the (particular) carriers and/or contents. It is to be understood that the inference may be based on coherent and/or non-confused inferences based on the hierarchy of semantic groups and/or further profiles (e.g. for carriers, contents, posts, modules, semantic groups etc.). In further examples, the system determines that based on sensed conditions, the carriers, their endpoint container/support and/or contained/supported contents (e.g. potted vegetables) need countermeasures agents at semantic times (e.g. water against/countering dryness); as such, the system may project, bring, move and/or route the carriers, contents and/or agents to likeable endpoints. It is to be observed that a watering agent goal/activity may be to water plants; further, the carrier's goal is also to water plants and thus is affirmatively resonant with the watering agent.

The system orients and/or damps flows which are unwanted, not likeable (e.g. based on semantic profiles, circumstances etc.) and/or hazardous. In some examples, the system captures and/or damps an air flow, sound flow etc. It is to be understood that the damping inferences may be based on semantic analysis of the flow and/or further projections in regard to endpoints and/or further artifacts (e.g. the system identifies that a hazardous corrosive agent and/or cold air may affect S2P2 (and/or that S2P2 is vulnerable to the corrosive agent and/or cold air) and thus it send S10P to capture, reorient and/or convert the air flow (e.g. purify, warm up etc.); it is to be observed that the system may perform such inferences based on the (inferred) capabilities at S2P2-S2P2 doesn't have, cannot stand and/or doesn't like corrosive activities, corrosive agents and/or to be corroded, and thus, it sends a more capable anti-agent capability and/or countermeasure (S10P) to damp the hazards at the endpoints, counter/steer the orientation and/or S2P2.

Post/carriers may carry/hook various (counter measure) agents and/or components based on published capabilities. Alternatively, or in addition, they may orient and/or allow/block/diffuse the flow agents. Further, they may use positioning, manipulation and/or fairing actuation, to orient components and/or agent flows to and/or from the targeted endpoints.

In some examples, a carrier hooks to a source which has capabilities and/or further mapped semantic endpoints to counter (particular) hazards; it further, activates, orients and/or applies the anti-hazard endpoints to hazardous endpoints in the environment based on inferences on particular hazards and/or further circumstances as inferred based on sensors in the source, post and/or flux network. It is to be understood that the system evaluates the applicability of an (anti-hazardous) endpoint to a (hazardous) (H/ENT) endpoint based on shift/drift/entropy of the capabilities and hazards (vulnerabilities) and/or further sematic times (e.g. the source sprays halocarbons from a muzzle endpoint only if the halocarbon option is activated and/or if the source is connected, comprises and/or is grouped to a halocarbons container). Further, the applicability inference of the countermeasure and/or anti-hazard may comprise the diffusion of the applied endpoint at the target (hazard) endpoint (e.g. spraying the halocarbon from the muzzle may diffuse within and/or outside the target hazard endpoint).

In further examples, based on determined non-likeable and/or likeable inferences in regard to the target and/or goals the system may determine the optimal and/or likeable composite agents and/or further flows; as such, the system may determine and/or apply agents and/or (further) flows by actuation, positioning, guiding and/or further activities.

The system may use manipulation and/or fairings vibrational movement in order to perform (counter hazard) activities at the target endpoints (e.g. break down and/or clean debris/hazard/artifact etc.). In some examples, the system uses induced vibration at the edge of the fairings (and/or contact with a surface) to rescind, melt, vaporize and/or clean a hazard (e.g. ice) on a surface/artifact (e.g. road, tree). It is to be understood that such activities may be based on the (counter) projected inferences in regard to the hazard (or foe agent) and/or further on friend inferences on the cleaned surface/artifact in order to keep the surface safe and/or affirmative resonant (with the owner/city). As such, the system may adjust the vibration frequency and/or pressure (of fairings and/or agents) to break down the hazard but not damage the surface. Further, the system may orient agent flows and/or further debris flows to/by the desired fairings, endpoints, channels, storage, evacuation and/or semantic groups thereof; in some examples, the ice debris are routed to a melting capable bin (e.g. comprising a heater, blower etc.).

The vibrational movement of fairings may generate a variable flow of agent (s) and/or variable pressure/scrubbing on (surface) contact endpoints. In further examples, the system breaks down an artifact (e.g. debris, ice, hardened spill, hazard etc.) by contact and/or by non-contact (by applying variable pressure (agents) with particular frequencies at the fairing (s) (channels/muzzle) and/or (as projected) at contact endpoints). It is to be observed that, based on the views, such activities may be affirmative and/or non-affirmative resonant—while from the artifact's factorized (and/or a supervisor/owner) view (s) the pressure and/or agent (s) flow (frequency) may be non-affirmative resonant (at endpoints), from the artifact's counter agent factorized (and/or a supervisor/owner) view (s) those activities may be affirmative resonant.

In some applications, the system infers, determines and/or stores in memory artifacts and/or further semantic identities of interest, target, goal and/or focus (e.g. likeable, lost etc.).

In further applications, the system is instructed to identify, recover, bring and/or manipulate target and/or focus semantic identities at/to an endpoint, semantic identity and/or on a (floor, support, projection) surface (e.g. the system has goals such as find the tea pot from the fireplace; find Jane's fancy caffe latte). The system identifies the (misplaced) item (e.g. tea pot, Jane's fancy caffe latte) and/or components/by-products (debris, latte stain) of the (misplaced projected broken) item on the floor, support and/or endpoint and picks it up, applies flow (agents), (re)directs, routes, delivers and/or store it (by applied agent) to an affirmative resonant flux/channel/bin (e.g. for LOST&FOUND, FRAGILE, (latte) cups etc.) and/or further moves/positions it to the target (desired) endpoint; in some examples, the target (desired) endpoint is (based on) the location of the (hierarchical) supervisory ordering the activity and/or the location of the owner (of the item or finding post/device). Further, the system may record and/or mark on a (remote/local) storage, device and/or tag attached to the item the (gated) (blurred) (hierarchical) semantic identity of the endpoint where has been found and/or further the (gated) (blurred) (hierarchical) semantic identity of the finder (e.g. S2P2, carrier S2, Jane's post, a post, a carrier, a by-passer); it is to be understood that such semantic identities may be based on the projected observing views, users, owners, supervisors, authorized readers and/or further blurring (e.g. the system may project that its operator knows about the "Doe's (misplaced) tea pot" while for John is the "tea pot from the fireplace" and for Jane is the "fancy fuchsia tea pot that is misplaced and/or not on the fireplace" etc.).

It is to be observed that in the example, the system may identify, localize and/or infer debris, components and/or by-products/composites associated with the target/focus item (e.g. as the tea pot or latte cup is projected as broken; as the content may be spilled etc.) and thus, the system may be confused whether to route it to the debris bin or lost&found bin as the leadership semantics (e.g. debris, misplaced/lost) and/or drifts are similar; as such, the system may use further supervisory rules/routes and/or challenges (e.g. to/from/of the user, supervisor, item owner etc.). In further examples, the debris are associated with components and/or further content; the by-products may be associated with escaped and/or diffused contents and/or flow agents (e.g. spilled gasoline, hardened cement on a highway/floor from a cement truck etc.). In further examples, the system identifies debris, (spilled/lost) content, stains and/or by-products and further, leadership semantics; the system may determine that the user/supervisor is more affirmative resonant with/towards associating, tagging, labeling, routing and/or factorizing them as unwanted and/or hazardous (than lost&found); or, by H/ENT non-affirmative resonant with/towards associating, tagging, labeling, routing and/or factorizing them as wanted, likeable and/or safe. It is to be observed that the system may project whether the items may be usable, likeable, safe and/or affirmative resonant (and,) if they are (to be) transitioned/transported/flow-ed towards the target artifacts and/or users.

The system may orient (hazardous) items, debris and/or flows to an affirmative resonant bin. It is to be observed that the system analyzes the drift and/or resonances between the inferred leadership semantics in the (leadership) circumstances of the tea pot (e.g. "misplaced" because is not in the proper endpoint/location and/or a user/supervisor is asking for it) and the capabilities/activities of the directed channel (e.g. "lost&found" bin).

The system may associate heads, bins, storage areas and/or other (connective) components and/or pathways as (hierarchical) endpoints/links.

The system may process and/or control sensors and/or actuators for gating and/or orienting flow agents to/on particular linkages, connections, valves, pipes, fluxes and/or further storages, bins, pathways, destinations and/or targets.

The physical and/or logical components ensuring connection, gating and/or flow agent diffusion may be represented, associated, linked, served and/or operated as/by semantic flux (and/or comprised stream).

Once the system ingests (in) and/or secures an item and/or semantic group in the (corresponding) bin it may augment/challenge the owner/supervisor (of the item, post/carrier and/or semantic group). Further, it may negotiate endpoints and/or links where to meet in order to deliver the item; the negotiation is between post/carrier and owners/supervisors wherein the post's/carrier's owners/supervisors rules and/or challenges are higher level supervisory while, post/carrier to item's owners/supervisors negotiation inferences and/or challenges are lower level supervisory or non-supervisory.

As explained in the application the system may route artifacts to channels, docks, containers and/or supports based on lowest drift and/or borderline/affirmative resonances between the channel and artifacts' published capabilities, semantic identities and/or leadership semantics. Further, do/allow/preferred/follow (and/or related synonyms) and their high (entangled) entropy (and/or antonyms) "do not"/block/don't follow routes inferences may be used for such channeling and/or semantic coupling.

In some examples, a user indicates that it wants to save the last opened and/or observed document. As such, the system identifies the document and/or further routes it to an affirmative resonant flux and/or storage.

The system may use blurred semantic identities for channeling, docking and/or semantic coupling.

The system may change ownership based on locations (e.g. particular semantic groups are under a particular supervision and/or ownership at particular locations). The system may be configured, determine and/or infer supervisors and/or ownership of devices and/or artifacts based on location and/or further techniques such as explained in this application. Further, such ownership may change based on UPIs and/or further specification of semantic identity and/or endpoint. The system, owners, supervisor and/or devices may delegate ownership and/or provide temporary and/or permanent access to devices by other users and/or semantic groups at particular endpoints and/or locations based on semantic augmentation.

The system may render and/or couple fluxes, streams and/or devices based on indicators and/or observing views. Further, the system may perform the coupling/decoupling based on semantic drift and/or resonances between semantic flux and/or device capabilities and/or indicators (e.g. semantic indicators, UPIs etc.).

In similar ways, the system applies access control and/or performs augmentation based on observing views and/or fluxes/streams. Further, the system performs semantic gating and/or augments particular observing semantic identities based on the least privileged access of the observing views of a stream, flux, device, projector, endpoint and/or further artifact.

In further examples, the system may perform semantic access control to capabilities of devices, channels and/or ad-hoc semantic coupling on streams based on supervising and/or (permanent/temporary) owner identities. In some examples, the system may allow brightness adjustment based on supervisory access control; in other examples, the system may enable/disable captions based on indications from supervisors and/or whether those are allowed to adjust such capabilities and/or semantics. In other examples, supervisors may be able to change channels while others may not. In further examples, a higher level supervisor may be allowed a larger interval of adjustment on capabilities than a lower level supervisor (e.g. Jane may be deemed as an owner and/or higher level supervisor which may adjust the volume of the DeLorean stereo and/or Jane's reading area stereo from 0 to 100 while John which may be a lower level supervisor than Jane may adjust it for a more limited range 20 to 40). As such, ranges and/or capabilities may be available and/or allowed as a function of supervising/ownership authority and/or further semantic times. Further, the supervising and/or ownership (semantics) and/or further semantic groups may be inferred and/or associated based on semantic times.

The system learns behavioral intensity-time circumstantial patterns of supervisory and/or users. In some examples, the system learns (and/or receives/stores interest semantic profile preferences) that John prefers the car seat heating dial at intensity level 2 for 10 minutes followed by level 1 for the remainder of the ride and/or presence in the seat in outdoor/endpoint "near freezing" conditions; further, as the temperature orients (e.g. "downward") towards freezing John prefers level 3 for 5 minutes followed by level 2 for 10 minutes and level 1 for the remainder of the ride and/or presence in the seat. As such, the system determines that John adjusted her counter freezing orientation by indexing and/or increasing the intensity and/or further (semantic) times of the seat heat. It is to be observed that the system may determine John's preferred intensity levels based on the dial analog and/or digital signal sensing.

Further, John may like the indoor (and/or in vehicle/home/facility) temperature at a particular level during circumstances; however, when traveling with Jane the system may determine affirmative and/or borderline resonant settings of both John and Jane and/or Does.

As such, the system may access capabilities, compose, issue and/or fluxes semantics and/or (execute) commands to adjust/steer the conditions as per likeability/goals. Alternatively, or in addition, the system may adjust heating elements, thermostats, appliances, components and/or any other (electrically/magnetically/electromagnetically) adjustable (actuated) (enabled) units and/or artifacts (as per supervisory and/or access control). Alternatively, or in addition, the system matches interests (e.g. semantic profile preferences) with published/accessible capabilities.

In further examples, the system may learn patterns and/or manipulate appliances, windows, curtains/blinds and/or other devices through motorized/pressurized/flow links/linkages/arms/posts. In an example, a user may indicate by UPI and/or further augmentation that wants a curtain/blind to be positioned by opening/closing (orientations) at a certain (relative) level, anchor and/or divider. Further, the user may indicate that wants to open/close the window (relative) to a level, anchor or divider. As such, the system learns the leadership of (blind) positioning/localization at a particular intensity/level/anchor/divider and/or further endpoints/links which may allow flows from the window (e.g. of light, air etc.). It further associates it with the opening of the window and/or further intensity/level/anchor/divider of the open window which may allow the desired/likeable flows through the cleared/allowed opening.

The system may generate and/or render UI interfaces based on matching capabilities of a non-UI object flux with the capability, goals and/or purpose of user interface control(s) (flux(es)) and/or associated groups. In examples, a curtain/appliance flux publishes a capability such as "adjusting light intake", "adjusting opening" and thus, the system may select a user interface control (e.g. from a list of available (configured) controls etc.) based on matching such capabilities with a semantic identity, capability and/or (configured) purpose/explanations for the UI control (e.g. "slider controls", "up-down adjustment" and/or "sideways adjustment", "slider" etc.). Alternatively, or in addition, (when in superposition) the system may infer and/or determine by sensing/flux additional attributes associated (or drifted) in comparison with a capability (e.g. further infers that the curtain opening/intake adjustment is sideways and thus, selects "sideways adjustment", "slider" artifacts). Alternatively, or in addition, the system selects to render a (semantic) group of UI interface objects (e.g. "slider controls") and/or hierarchically (flux) connects them each (through a semantic group (higher hierarchy) flux to a/the designated non UI object flux. Alternatively, or in addition, the system renders the (group) of objects and allows a/an (authorized) user to select which one to keep and/or which one not to keep; it is to be observed that when a group of UI objects (e.g. "slider controls") is rendered the system may not allow deletion of some objects in the group if some (user/supervisor/endpoint) semantic profile interests and/or preferences become unsatisfied, un-likeably/un-likeable satisfied/connected and/or un-connected (e.g. doesn't allow deletion of all curtain slider controls in a group due to inability and/or readiness of a/an (endpoint) user/supervisor to manipulate the opening of the curtains as per profiles and/or (access/supervisory) configurations).

It is to be observed that while matching, generating and/or rendering user interfaces the system may match capabilities of a non-UI object flux object/group with the capabilities of a UI object flux object/group. Furthermore, a user may be associated and/or carry semantic profile preferences (e.g. via a device) which comprise and/or publishes interests (at endpoints). As such, the system may match and/or connect only the capabilities of both UI and non-UI objects which match the (published/accessible) user (profile) preferences and/or interests (at endpoints). In some embodiments, such techniques may be applied to connections between any flux enabled objects.

In an example, John is interested (based on (endpoint( ) preferences) in "on/off", "curtains" and thus, the system may match only the capabilities/goals (or similar) which provide that kind of functionality (e.g. ON/OFF, OPEN/CLOSED etc.); as such, the system may elect to render and/or connect a (semantic identity and/or further assigned label of) ON/OFF, ENABLE/DISABLE (CT ROOM) (CURTAIN) checkbox. Further, it is to be observed that the connection of fluxes, capabilities and/or interest matching may be further based on applying publishing, supervisor, access and/or diffusion control as specified throughout the application.

Alternatively, or in addition, to manipulating objects through (gestures directed to) associated (flux connected) UI controls the system may detect gestures and/or apply them by accessing the (published) capabilities of the designated target (non-UI) object (e.g. curtains). As such, the system may open/close/slide the curtains based on (user/supervisor) configured and/or received semantic profile gestures.

It is to be observed that preferences may be stored in semantic profiles which may be configured in a variety of ways. In some examples, preferences and/or their entries/fields comprise and/or are configured based on higher level groupings, themes and/or endpoints (e.g. for "medical"->"hospital"; "leisure"; "home"; "curtains" etc.) and/or more specific and/or localized (e.g. "medical imaging", "CT room"; "hotel sauna", "sauna TV"; "basement curtains").

Preferences may be composed and/or applied from the more localized to the higher hierarchical (less localized) matching and/or based on further confusion reduction (e.g. the system infers and/or applies (a profile/preference route) of "basement curtains"->"curtains"->"home" and/or "basement curtains", "curtains", "home" when determining manipulation of curtains in a basement). While delimiters such as ",", "->" have been exemplified it is to be understood that any other delimiters may be used for purposes of semantic composition, routes, localization, identification and/or (further) semantic configuration/analysis.

Owners and/or supervisors may specify where a device can/should go at semantic times in their supervised endpoints and/or areas. Further, they may specify how the devices, applications, UI controls, multimedia and/or renderers should behave and/or level of access based on semantic times, orientations and/or further observing views (e.g. as Jane is not reachable, not hearing and/or not observing the TV adjust the brightness to 10; as Jane is observing the fireplace or TV highlight the tea pot; as Jane is moving towards the TV from the left turn down, attenuate, index and/or damp the TV brightness by (indexing) 10% every 5 ft; adjust the volume (audio signal) (gain) by 15% as Jane is moving back and forth between the TV and the fireplace). It is to be observed that the indications may generate some confusion at particular circumstances (e.g. on "adjust the volume by 15% as moving back and forth from the fireplace to the TV at the window" the system may be confused about whether to adjust/index 15% in every direction and/or orientation and/or index with 15% in one direction and −15% in the other direction) and thus the system may perform confusion reduction. However, in other examples the system may use further circumstances for confusion reduction e.g. as John is approaching (from the fireplace) index brightness by −10% on tea pots objects (on the TV) unless Jane is watching; the system may deduct that the brightness of tea pots should not be dimmed unless John is approaching (from the fireplace) and Jane is not observing the TV content; thus, as John is moving away from the TV (and/or to the fireplace) the brightness of the tea pot may be further (counter) indexed by 10% using similar indexing semantic routes and/or artifacts. It is to be observed that the system identifies that Jane is watching the content by determining her observing views, challenging, augmenting and/or receiving feedback from Jane (e.g. as the system is confused and/or not sure whether Jane is watching it may augment her on an wearable and/or UPI device; Jane may provide feedback when observing the (non affirmative/likeable/resonant), circumstances and/or when being challenged (e.g. pointing to the TV, "I'm watching you" sign and/or V-sign, body/facial contortion, gestures, voicing, shouting, challenging and/or other modalities etc.). In some examples, the system may determine that Jane cannot observe the TV optically but can hear the sound in the TV stream. As such, as John is observing the TV optically and/or moving, the system may adjust the optical attributes of the TV (e.g. brightness) based on John's preferences; as John and Jane may have different sound volume preferences, the system may be confused which one to apply and thus it may apply the Does and/or higher supervisory preferences/rules/routes.

Artifacts in a stream may be snipped and routed based on (users') (flux) interests and/or low drift inferences; further, they may map to and/or generate shortcuts, ui controls and/or further rendering artifacts based on similar techniques.

We mentioned that the devices and/or objects may be localized through HTC. Further, coupling between devices and/or objects may be based on HTC. In further examples, the system performs additional identification, localization, semantic grouping and/or further semantic analysis (e.g. factorization, resonance etc.) of devices and/or objects before allowing them various levels of coupling, routing, indexing, adjusting and/or access. In an example, a device/artifact/object/user (connected to a post) identifies and/or publishes itself as a "tea pot support" ("during winter") but based on further sensing (e.g. based on the camera of the post) and/or analysis (e.g. of the composition, vibration, flexing, damping, hysteresis) the system may identify that this published semantic identification and/or capability is distorted (e.g. because the projections in rapport with the object determine high drift and/or non-affirmative resonance on the capabilities and/or semantic identity such as the object cannot hold hot objects and thus is not affirmative resonant with one of the leadership semantic (time based) attributes of a tea pot (e.g. being hot) and/or further support (e.g. support hot (tea pot)). However, if the identification is published and/or projected (e.g. based on observer's semantic profiles, observing views and/or semantic times) as "no hot liquid/artifact in the tea pot", "no hot tea pot" then the capabilities are not inferred as distorted during those semantic times.

As capabilities (for an artifact) are inferred (e.g. through sensing, fluxes, augmentation etc.) and/or discovered the system may notify and/or allow an operator (e.g. of/as a supervisor, owner etc.) to publish them (on particular semantic fluxes). In some examples, the inferred and/or discovered capabilities comprise activities, (associated) semantic times and/or budgets.

In further examples, John is identified and/or authenticated as a supervisor in a/the car during a semantic time (e.g. Jane is not present, higher supervisor not present etc.) and/or can perform the adjust activity of the ("brightness of") "display devices/screens of the car" in the semantic time; further, as Jane is a (higher supervisor) for "the display screen of the car", adjust activity and/or is present in the car then the system may determine and/or collapse to and/or the Does (and/or their observing views) based on presence and/or entanglement at endpoints (e.g. car, car displays) and then apply Does (learned) semantic profiles and/or further access control, allowed range and/or indexing. Further, the system may not infer distortion, hostility and/or ill-intention of John's and/or Jane's adjustment inputs in rapport with one another.

The adjustment (and/or similar) activity may be associated with semantic indexing, gain/loss analysis and/or conditioning of signals/waves and/or parameters/capabilities to/from the semantic identified devices; further, such devices and/or capabilities may be further supervised and/or access controlled.

The system may connect and/or dock the devices, UI components, applications and/or objects based on semantic times and/or endpoints/links. Further, it may use semantic (orientation) drift to connect and/or dock devices, UI components, applications and/or objects having and/or sharing (and/or being owned/supervised by) similar semantics (comprising at least one (blurred) semantic identity) at endpoints and/or semantic times.

An agent may be an entity and/or phenomena and/or (hierarchical) (composite) groups thereof which may cause effects at an/a (particular) endpoint/link and/or semantic groups thereof based on its flows, its associated semantic attributes and/or further diffusion; the cause of effects is based on inferences and/or projections based on general semantic profiles (e.g. a general profile may comprise "30% chlorine is hazardous for colored garments", "70% alcohol is hazardous for viruses" and thus, a semantic identity of a cleaner agent is affirmative for getting rid of viruses because has 70% alcohol but is not affirmative for colored garments because has 40% chlorine; thus, the system knows that the actuation, preparation, mixing and/or diffusion of a <semantic identity> cleaner agent flow may be affirmative towards some of its goals (at endpoints/links) but non-affirmative towards others) and/or more particular semantic profiles (e.g. S2P2 carries and injects (anti) agent capability and thus it may be (not) likeable, hazardous until a particular semantic time etc.).

The system may compose agents, their flows and/or further semantic identities. Such composition and/or further mixing may determine new agents, flows, semantic attributes, DNA signatures, compounds and chemical, ionic and/or molecular structures (if the reaction is diffusible and/or bonding) different than the composites.

In some examples, in case of a exothermic activity (at an endpoint) the system may release and/or require thermal energy, heat and/or further flows. In other examples, thermal energy (e.g. by agents such fire etc.) and/or heat (flows) applied to halocarbon artifacts can create corrosive agents such as hydrochloric acid and hydrofluoric acid, and poisons agents like halogenated dioxins and furans. It is to be observed, that agents may cause, enable and/or disable other agents (e.g. John likes to play with fire, John starts a fire at storage area A; "John", "fire", "John's fire", "John and his fire", "John, his fire and winds blowing from B/south" are agents of hazard and disaster at (storage area) A).

The system may determine bonding factorization and/or resonance with agents and/or further sematic attributes. In an example, the system determines that a black car is bonding affirmative resonant (because has an attribute which has less drift/entropy from dark color which is likeable to John and so-so to Jane) with John (and/or his observing views) at an endpoint/link and/or borderline resonant with Jane; as such, John is more likely to (affirmatively) factorize the dark/black and/or further flow agent, bond, group, entangle and/or form a flow agent than Jane. It is to be observed that the system may infer the bonding on a composite basis for Does. Further, John and the black car forms a composite flow agent.

In further examples, since John is an agent of (and/or likes to play and/or affirmatively resonates with) fire the system may non-affirmatively factorize wind in particular circumstances and/or semantic times which determine a flow agent (entangled) semantic group of wind and fire and/or further localization/reach of flow agent and/or John at endpoints/links. It is to be observed that John may be factorized as both, a causal agent (as he causes the fire) and/or flow agent (as he bonds and/or carries) of fire; as such, in previous example, alternatively, or in addition, to the wind as a flow agent the system may also consider, compose and/or entangle John as a flow agent and/or in a flow agent group.

As mentioned in previous examples, the system entangles artifacts and/or semantic identities in order to further collapse inferences based on the entangled artifacts. In the examples, the system may use the semantic identity of Does which is an entangled version of John and Jane; as such, a neighbor of Does which doesn't know, observe, determine and/or publish (e.g. due to (gated) semantic and/or observing views) that is John which sparkles the fire at a Does endpoint may infer and/or publish the entangled version "Does like to play with fire" instead of "John likes to play with fire".

In further examples, the system detects a condition at an endpoint and further based on the interaction and/or diffusion of an agent through the endpoint infers and/or controls further agent flows. In an example, an endpoint is associated with particular (hazardous/non-likeable/likeable/resonant) leaks and/or conditions which may be resonant, carried and/or gained/lost by particular agents and/or flows passing through the endpoint and/or further diffusion endpoints. In an example, the system knows that fumes/vapors may be gained, composed and/or diffused within an air flow and further carried by the air flow; however, if the flow agent is of particular conditions (as sensed and/or measured at endpoints) and/or further semantic identities (e.g. "cold/hot air") the fumes/vapors may be gained, lost, composed and/or diffused more or less based on the (inferred) circumstances; further, the flows may act and/or be impacted at/by further diffusions at endpoints/links. In other examples, the system may know that John is likely a resonant flow agent to carry, diffuse and/or disseminate of "latest manual transmission coupe cars" information while Jane is likely a flow agent for dissemination/diffusion of "latest composite carriers allowing reading of newspapers in best comfort" at a car show and/or further endpoints. The system may project that by attending the car show John may become more affirmative/non-affirmative resonant with composite carriers (based on the leadership induced by Jane's goals and/or entanglement) while Jane more affirmative/non-affirmative resonant with manual transmission (based on the leadership induced by John's goals and/or entanglement); further, the system may further perform factorization based on determining that John and Jane attend together as (part of) a semantic group (e.g. affirmative/non-affirmative resonant, entangled etc.).

The agents may be associated composite semantic identities (e.g. cold air front carrying John's DeLorean, hot hydrochloric acid vapors etc.) based on resonance, diffusion and/or composition at endpoints/links. Further, the agents may be composed based on semantic resonance, semantic groups and/or composable techniques such as explained in this application.

The system may compose agents' semantic identification and/or further semantic attributes and apply further semantic analysis. Leakages, (flow agent)/carrier bonding and/or transport may be inferred based on each agent and/or further (composite) semantics and/or groups.

It is to be observed that the system may perform gain/loss analysis while determining agent flows (including bonding/leaking), diffusion and/or further composition of/to/from/between agents (at endpoints) and/or resonance with/between the semantics at endpoints.

The system may determine the likeable trajectories, endpoints, links and/or diffusion of artifacts/agents based on the intersection and/or diffusion of resonance, factorizations, hazards, counter measures and/or agents at semantic times.

Endpoints and/or links are more/less (counter) (affirmative/non-affirmative) resonant/(non)hazardous/(counter) (non)likeable during particular semantic times; inclusion, intersection and/or flow with (in) a trajectory determines the trajectory to be factorized accordingly.

The system may look to keep particular endpoints, links and/or trajectories likeable/affirmative/borderline resonant to users, observing views and/or supervisors. Such likeability may be based on inferences and/or projections of the presence of the users and/or observing views at locations. In an example, the system knows that Jane likes Health Affairs and thus it brings Health Affairs into a "reading" area and/or close by a resonant associated artifact with "person", "reading" (e.g. library, chair, futon, combinations etc.) and/or further based on Jane's semantic profile. Further, the system may know that Jane doesn't like particular type of objects, colors and/or further semantic attributes and thus, looks for counter measures in order to increase likeability (e.g. cleans and/or moves non-likeable/non-affirmative artifacts, debris, colors etc.). If Jane and John are present at the same time the system uses the likeability for Does and/or further challenges users when in superposition and/or confused.

We explained that the system may use double entanglement entropy to affirmatively factorize and/or decay (e.g. hazards/hostility/non-likeability etc.). In some examples, the system exploits a vulnerability (e.g. based on a vulnerability indicator/factor) of a hazardous/hostile agent/artifact. Further, the system may apply countermeasures and/or injection for reaching a potential superposition and/or equilibrium endpoint and/or determine orientation in a particular affirmative direction.

The system may select counter measures based on missions and/or trajectories (e.g. CLEAN OF DEBRIS may encompass all the debris in a route, CLEAN OF DRONES the drones in a route etc.). It is to be observed that the goals may be high entropic (e.g. CLEAN OF DRONES and CLEAN OF DEBRIS may be entropic as the CLEAN OF DRONES goal may encompass a DEBRIS CLEANING DRONE and/or CREATE DEBRIS BY DESTROYNG AND/OR INCAPACITATING DRONE; further, particular drones may help clean the debris by actuating/orienting the propellers and directing air flows that will carry the debris to likeable locations. Thus, the system may further look to reduce confusion and/or further factorize leaderships and/or goals.

In the previous example, the system may determine that by incapacitating a drone, the drone may become unpredictable and/or pose hazard for other endpoints. As such, the system may look to damp the effects of unpredictability by endpoint injection on the unpredictable trajectory and/or behavior; by endpoint injection the system may transform the unpredictable trajectory and/or endpoints to more predictable trajectory and/or behavior segments and/or endpoints.

We explained the use of intermediary, anchor and/or reference endpoints (IPOA) when orienting and/or inferring observing views; such endpoints may be injected.

The system may project goals, locations and/or semantics based on the content and/or composition of the application, items and/or artifacts.

In further examples, the system ensures, challenges and/or augments that a positioning at an endpoint and/or further activities/flows are affirmative resonant in regard to components and/or further ensembles/containers comprising these components in a hierarchical manner. In some examples, the system allows/disallows/diffuses washing/cleaning agent flows having/carrying particular substances (e.g. bleach) and/or (high) temperatures for garments/items/clothing/paints/materials/flooring comprising colored and/or particular materials (e.g. cotton, linen etc.) components and/or endpoints as the particular substances and/or temperature may factorize affirmative/non-affirmative factors (e.g. non-affirmative hazards and/or risk of discoloration and/or shrinking, affirmative disinfection and/or cleaning goals etc.). In further examples, the system may not allow an activity on a non-likeable/hazardous artifact and/or determining/producing a non-likeable/hazardous artifact as the diffusion of the non-likeability/hazard from the endpoint during the activity (e.g. washing/cleaning machine/post) may be non-affirmative resonant (e.g. non-likeable, harmful etc.); in other examples, the washing/cleaning machine/post may possess, infer, manipulate, challenge and/or applies counter measures and blocks diffusion, directs and/or neutralizes the hazard in the and/or of the item and thus, the system may allow the activity. It is to be understood that the hazard inferences and/or diffusion may be based on composite inferences of the contained and/or containers (e.g. an item may be hazardous because has come in contact and/or carries/flows a volatile carcinogen, the washing/cleaning machine/post may redirect a large percentage or all of the hazards/debris/fumes in special containers, the washing/cleaning machine/post and/or hazardous container may be comprised and/or contained in a (special/approved capability enclosure/room) which is (not non-affirmative)/affirmative resonant with hazardous fumes locally and/or at a higher level and/or doesn't diffuse hazardous flows (to artifacts, to outside etc.)).

While the system may allow/disallow/diffuse (washing) (agent) flows/vibrations/waves alternatively, or in addition, allows/disallows/diffuses/indexes (machine/agent/vector) settings, parameters, profiles and/or agent/vector artifacts generating and/or composing such flows/vibrations/waves; further, the system may look to block/allow/diffuse/steer/orient/damp by semantic injection, augmentation and/or challenges.

It is to be observed that activities and/or goals may be related with containing, not allowing, damping and/or gating diffusion outside particular (hazardous) endpoints.

Endpoint injection may be used to further factorize routes between a group of endpoints and/or additional routes comprising the endpoints and/or injection endpoints (e.g. factorize likeability/dis-likeability, factorize (additional) indicators, (counter) steer etc.). As mentioned, endpoints injection may be used to affirmatively factorize instability and/or unpredictability (e.g. by increasing stability and/or predictability on artifacts comprising the injected endpoints).

In further examples, the system may use endpoint injection for projections. In an example the system injects a potential/projected steering (target) endpoint of/for a steering artifact in order to project and/or assess counter steering.

Endpoint injection and/or further projections may comprise selecting/deselecting options and/or UI components (e.g. checkboxes, buttons, fields, list options, icons, multimedia, combinations etc.) and/or further indicating the (semantic identification of) the (localization of) injected artifacts and/or further injection positioning on the interest endpoints/links by specifying semantic indicators and/or further factor intervals at the interest endpoints/links.

In further examples, the system uses endpoint injection in projections and/or planning wherein the injection determines whether particular assets and/or credentials may increase likeability.

Endpoint injection may be employed in projections and/or as a counter measure against low coherency, high confusion, high non-affirmative factorizations and/or (orientation) high drift/shift/entropy. It is to be understood that while referring to drift, shift or entropy those terms may interchangeably be used for one another despite indicating potential different circumstances.

Foes, agents, collaborators and/or further signals may induce endpoint injection which generate distraction and/or distortion; alternatively, or in addition, the injection may generate budget leaks. The system may use distraction/distortion factorization and counter analysis.

The system may use endpoint injection to identify leaks, their cause, target, beneficiaries and/or foes. In some examples, the system infers that an injected endpoint and/or links (from/to the injected endpoint) are leaking. Thus, the system may further increase localization and/or collapse the (artifacts and/or semantic identities of) leaks, the leaky agents and/or leaky flows.

The system may use projections in order to eliminate, disperse, route, affirmatively factorize and/or gate the leaks, their flows and/or endpoints/links. In some examples, the system may apply countermeasures. Alternatively, or in addition, the system uses endpoint injection within and/or on the leak in order to counter, steer and/or contain the leak artifacts and/or flows. In is to be understood that the leak may comprise at least one endpoint and/or further hierarchy. A leak may be contained by applying a container endpoint to the (leadership) leak endpoint.

Endpoint injection may comprise DNA replication wherein the (hierarchical) injected endpoints/links/submodels comprise and/or form a particular DNA sequence (when applied).

Non-affirmative agent flows and/or leaks may be affirmatively factorized and/or gated by injection and/or replication (e.g. of DNA) of (counter) agents and/or further flows which may counter (and/or be non-affirmative with) the non-affirmative agent flows and/or leaks at endpoints.

Alternatively, or in addition, the system may use endpoint injection to cause publishing, diffusion, flows and/or transfers of budgets by agents. In some examples, the system may project payments and/or plans and, further injects endpoints for implementing the payments and/or plans; thus, it further publishes/transfers outgoing budgets to payment targets and/or (via) agents via the injection endpoints and/or associated semantic groups.

Endpoint injection may be based on semantic indexing and/or other injection techniques.

Progressive semantic injection may comprise injection of endpoints which determine asymmetric and/or progressive factorization, damping and/or further orientation. In an example, endpoint C is injected around endpoint A and B wherein the injection of C shifts and/or channel more affirmative resonance and/or likeability towards (C)B than A (C) due to the damping provided by C. As such, (C)B is seen as a safer likeable localized group and/or equilibrium endpoint than A (C) due to higher localized factorization, damping capability and/or potential lower/faster hysteresis.

Progressive injection may be used for compression/decompression and/or for focusing and/or stabilizing (on/of) particular areas, endpoints and/or trajectories; further, it may be used at leaky endpoints/links to localize leaks.

Progressive injection may be used for increasing affirmative resonance and/or likeability in observing views. In further examples, endpoints are injected to shift orientation, focus and/or interest towards endpoints around and/or comprising the injected endpoint. The system may counter-bias and/or counter-index likeable options when detects progressive injection by foes.

Progressive injection may be used to increased likeability and/or optimize capacity and/or demand.

We mentioned that the system infers leakage and/or damped diffusion orientation at endpoints. In some examples, this is based on inferences on projected diffusion in the network and/or flow agent (flow) analysis. In some examples, the system infers budget leakage and thus it may identify the artifacts, semantic groups and/or agents causing the leakage; once identified the system may gate control, the leak's target/agent/beneficiary and/or further activities.

The system may identify leaks, leakage and/or vulnerabilities through any modalities and/or sensing. Further, it may use injection for (composite) affirmative factorization at endpoints/links. In some examples, the system detects that a door and/or window is open and hence it may infer that the system is leaking through inward and/or outward (agent) diffusion and/or flows; further, the system may determine/project the capacity of the flows and demands countermeasures. In further examples, the system detects non-likeable flow agents flows (e.g. cold air from a leaking/not-sealed window/door) and thus, it may apply countermeasures (e.g. block/seal the door, window, agent and/or flow; and/or increase, guide and/or direct countermeasures such as warm air flow agents, containers etc.). It is to be understood that the flow agents may be friend and/or foe (e.g. a flow agent "fresh_air", "cold_air", "fresh_cold_air" is likeable because is fresh and/or non-likeable because is cold); further, the system may use capacity/demand inferences to affirmatively factorize projections and/or goals (e.g. decrease the capacity of foe flow agent and increase the demand/capacity of friend flow agent).

In other examples, the system identifies current, power and/or energy leakages in grid networks by endpoint injection.

As explained previously, the affirmativeness and/or optimality of conditions at an artifact/location may be based on composite inferences on environments and/or presence at the artifact/location (e.g. worst case/best case, offensive/defensive etc.). In an example, warm air may be more detrimental than hot air if a person from a group of people at the location suffers from asthma and/or other conditions.

The system may use positioning and/or manipulation capabilities (e.g. the arm) to plug into an external socket/outlet (e.g. power outlet, hazard out-flow outlet, counter measure in-flow socket, hydrant, disposal pipe, valve etc.). The socket may be mapped and/or inferred based on semantic analysis and/or modeling. In further examples, the system may use the arm to manipulate its modules and/or groups (e.g. unlock the top module such as a camera, an (RF) reader/antenna, a countermeasure, a carried (ultrasound) device, an ultraviolet beam source device etc.) and manipulate it towards the desired endpoints and/or locations (e.g.

around a cart, a friend, a foe, onto a hazard, a supervised item, a supervisor, within a non-accessible location etc.).

The outlets may be coupled to radio frequency modules/devices and advertise their capabilities to allowed users, devices and/or posts, potentially in a hierarchical accessible manner. In some examples, at least a hydrant outlet (e.g. of “hydrant with two 6" outlets (1600 gpm) (20 psi)”) is advertised as “6" water outlet (at), 1600 gpm, 20 psi, (for) 20 mins”.

Flow agents and capabilities publishing (analysis) may comprise (projected) bonding; further, the system may project bonding/leaking to determine entanglements, diffusion and/or publishing at endpoints. In some examples, flow agents may diffuse and/or bond to endpoint agents and/or artifacts; further composed capabilities may be published as per (endpoint) publishing.

The system may couple to such hydrant and flow agents to extinguish fire (causing) hazards at endpoints.

The system may diffuse the flow agents at endpoints based on interest (hazardous) semantic (identity) coverage and/or containment. Thus, it may select to diffuse flow agents which bond, carry, and/or apply at endpoints/links. In an example, a semantic post carrying a muzzle connected to the hydrant source is a flow agent diffusing, advertising and/or applying hydrant capabilities at endpoints within semantic times. In the example, the hydrant comprises two 6" outlets which may be connected at the same time such as one connection is handled and/or supervised by S2P3 and another by S2P4; thus, S2P3 and S2P4 may be entangled and/or grouped hierarchically with the hydrant and/or its further accessed components/outlets while publishing composable capabilities. As such, because the hydrant provides 1600 gpm and 20 psi in total for both outlets, S2P3 and S2P4 are entangled flow agents of the hydrant, its further outlets and composed capabilities.

In the previous example, S2P3 and/or S2P4 muzzles may have been connected through hoses/pipes to the hydrant outlets. The hoses/pipes and/or muzzle may have published various capabilities and/or parameters such as supported volumetric flow, pressure limitations, longitudinal/transversal dilation/shrinkage, spray patterns etc.; further, such parameters may influence one another.

When publishing and/or applying (hydrant, water and/or other agent) capabilities, the system and/or (S2P3 and/or S2P4) may further compose the (reasonable) (known) capabilities and/or semantic times of the (entangled) supply chain group and/or flux (e.g. water/fuel/electric company, delivery networks, hydrant/current/fuel, outlet, hose, muzzle, flow agents). In the previous example, S2P3 may be informed and/or can access only the artifacts and/or capabilities in the flux/route and/or around the flux/route from the hydrant endpoint to the muzzle endpoint; S2P3 may further project and/or challenge for further knowledge and/or inferences at particular semantic times (when confused, when not well-informed, when hydrant behavior is unexpected, erratic and/or slacking etc.). Further, the system senses and/or determines the applicable semantic times and/or infers the circumstantial capabilities and/or resonances of agents and/or further artifacts.

The system projects and targets that sufficient flow agents are available to diffuse and ensure likeable and/or affirmative resonant inferences, semantic coverage and/or containment. Handling and/or projection targets may comprise containment and/or factorization by progressive endpoint injection.

The system comprises models and/or instructs flow agents on how to behave at (injected) endpoints/links. The system alters the DNA, behavior and/or bonding of agents at particular artifacts and/or semantic times.

It is to be observed that the system may position and/or manipulate sensing and/or capabilities in order to achieve affirmative resonance. In some examples, it moves a rf sensor on endpoints around a cart (which may include top, bottom, left, right, front, back orientations and/or further diffused endpoints).

Connection and/or plugging may be based on capabilities (e.g. whether challenged and/or suggested) of/from fluxes, devices and/or artifacts in a hierarchical and/or semantic group manner. A device (e.g. electric plug grid outlet EPG/O at/of John's gas station on route 81) may (semantic) identify the connection posts, devices, modules and/or further capabilities by challenging them which may further trigger challenges in a hierarchical manner. Alternatively, or in addition, the capabilities and/or semantic identities may be suggested and/or published at higher level fluxes, devices, artifacts and/or semantic groups; in some examples, the composed semantic capabilities, semantic attributes and/or semantic identities are collapsed at the higher hierarchical level (e.g. the post publishes “arm reach” semantic attribute instead of “arm_module.arm_reach”). Further, the access, capabilities and/or the ranges on the arm may be controlled by the owner (e.g S2P2, Jane, Does) and/or supervisors (e.g. S3P3, John, Does, EPG/O, EPG of John's station, EPG of Doe's stations), based on their semantic identities, in a hierarchical orderly manner.

Alternatively, or in addition, to arm movement the system may position and/or lift/lower modules, ensembles comprising the arm and/or counter measures endpoints.

In an example, the system moves a countermeasure head/device to a debris/hazardous area wherein the system positions the device's flow agent endpoints based on affirmative inferences in regard to height, device, counter capability, area/endpoint/s, flow, safety etc. It is to be observed that the device may publish capabilities maps and/or endpoints/links of its head and/or further component endpoints (e.g. locks etc.) in order to allow the manipulation carrier to position, apply and/or compose them (and/or associated semantics) to the desired target areas and/or endpoints.

Modules and/or posts may harvest energy and/or charge (for) a particular budget. Further, it may charge, recharge, transfer, buy, sell and/or negotiate the energy on the flux network and/or (energy) grid based on semantic analysis.

The system may orient sensing observing fields by positioning and/or orientation of the carriers, posts, modules and/or sensors; as explained all these elements may move, rotate. elevate and/or orient independently and/or part of an ensemble, semantic group and/or (higher level) composite structure. It is to be observed that the orientation is hierarchical composite wherein the higher level of details is at the lower level components (e.g. the optical sensor (,) (on/of) the optical module (,) (on/of) S2P2 (on/of) (,) carrier C10P1 etc.) comprising the orientations of all the higher level components.

In further examples, modules and/or sensing may be gripped and/or oriented for desirable observing views (e.g. S2P2 unlocks, grips, elevate, rotate and/or move the optical element at the top of the structure; S2P2 unlocks, grips, elevate, rotate and/or move the debris/(counter hazard)/(hazard cleaning) element). It is to be observed that S2P2 may lock, unlock, grips, elevate, rotate and/or move elements and/or semantic groups of elements and/or further (composite) semantic identities.

The system positions and/or enables the affirmative semantic resonant (e.g. goals, posts, artifacts, combinations thereof etc.) to achieve their goals, desires and/or capabilities. Analogously, the system denies, impedes, blocks and/or doesn't allow the non-affirmative resonant. The system may augment with further suggestions based on projected inferences.

In some examples, the system identifies by user pointer indicators trajectories and/or further endpoints. As such, the system may infer that the user may point towards a physical artifact/button and augments the user with the semantic identity of the button (e.g. by voice, by projecting on a screen, PiP etc.). In further examples, the system may render the tea pot on a screen and get augmentation on what to do with it, or manipulate it based on the items and/or capabilities in the venue (e.g. inject/pour and/or boil water from the faucet and inject a bag of the berry tea from the second drawer from the left, place the pot on the back burner, warm up to 110 as John is arriving etc.).

Analogously with capability inferences and/or routing, the system may perform interest inferences and/or routing wherein artifacts (e.g. fluxes/streams, users, supervisors etc.) publish their interests and the system routes artifacts/providers/capabilities and/or augments based on the published interests.

In further examples, the system augments and/or challenges (fluxes, users/owners/supervisors) on non-affirmative projections/inferences and/or to affirmatively factorize projections/inferences. Similarly, the system may augment and/or challenge based on high entropic, hardly believable and/or unexpected behaviors at endpoints at semantic times. In general, once the system determines such conditions it may look to determine causal and/or flow agents and further project and/or learn based on such inferences.

An artifact may comprise an intrinsic, variable likeable and/or resonant orientation (e.g. a car is oriented from backward facing to forward facing, a building is oriented from the back façade to the main façade etc.). The system may determine facings based on inferences and/or further leadership artifacts on forward/backward mapped endpoints and/or observing views from/to such endpoints. In some examples, the system determines the forward facing of a car by the leadership presence of headlights and/or the lack/absence of rear lights and, by H/ENT, the backward facing by the absent (NO) headlights and/or presence of the rear lights. It is to be understood that the (leadership) resonant components may be based on resonance, grouping and/or entanglement with users, manufacturers, owners, supervisors, visitors and/or other (targeted) (leadership) semantic identities.

The system identifies the orientation of an artifact by determining its positioning, activities and/or further observing views (e.g. the artifact is oriented towards the more affirmative resonant observing views and/or endpoints, the artifact is oriented so its (affirmative resonant) leadership artifacts are accessible, visible and/or more affirmative with its use, users and/or activities.

We mentioned that the system may apply (counter)measures for factorizing and/or restoring likeability. In an example, the system detects that an area is non-likeable in rapport and/or as entangled/grouped with an asset, person, user and/or artifact and issues orders and/or bargaining for increasing/restoring the likeability and/or countering the hazard. It is to be observed that the system may look into how critical and how long the non-likeable condition can be (reasonable) tolerated/bear/endured by the entangled artifact and (based on that) determines the optimal semantic times, budgets, fluxes, collaborators and/or agents that can counter the hazard and/or affirmatively factorize likeability.

The system projects countermeasures on/at various endpoints, links, routes, trajectories, views and/or semantic times. Further, the system projects countermeasures using links towards, inwards, outwards and/or other orientations in rapport with those artifacts. The system may factorize artifacts based on the projected availability and/or application of countermeasures.

As mentioned, the system factorizes fluxes, providers, agents, producers, consumers and/or further groups. As such, some fluxes, providers, agents, producers and/or consumers may be preferred and/or (semantically) coupled based on particular circumstances. In an example, the system determines that a (post) component, by-product, object and/or artifact need recycling. As such, the system (and/or user) indicates the items needing recycling and manipulate and/or place them in a particular endpoint and/or location. Further, the system, supervisor and/or user may publish, determine and/or indicate the likeable budgets and/or clauses of a projected recycling activity.

Recycle activity providers and/or groups thereof can negotiate on the recycling goals, budgets and/or further clauses. In an example a recycle agent being around the published recycling goal endpoint (e.g. Does house and/or front porch) is matched/entangled on the recycling goal; thus, Does and the recycle agent become entangled on the recycling activity based on valid/active contractual clauses. In further examples, the system determines groups of providers to negotiate with; as such, the system may determine negotiated clauses between the group of providers and/or further assets of the providers to be used in the (recycling) activity. Once determining a matching, the system may direct the agent/s to the published interest endpoints (e.g. recycling endpoints) and further allows the agent (and/or its proxies) access and/or to further perform the (recycling) activity.

We mentioned the use of clauses in contractual entanglements. The clauses may determine contractual activities success, failure and/or further associated superposition intervals based on readiness/non-readiness, completion/non-completion (e.g. of goals, routes, clauses etc.), achievement/non-achievement, approval/not approval. The clauses may expire based on semantic times. Some clauses may be invalidated and/or expire based on handover and/or change of ownership while others may not. A semantic coupler may be used to contractually connect agents and/or (groups of) clauses. When a handover and/or change of ownership occur for one (first) coupled party and/or orientation (away from the coupler) the other (second) coupled party separated by the semantic coupler may not be bounded by any clauses which become non-affirmative resonant. Further, the system may establish remedies, budget and/or penalties on breach of clauses and/or non-affirmativeness.

The system may establish penalties comprising semantic indexing on breach of clauses and/or non-affirmativeness. In some examples, the system may assess a (percentage) goodwill to be paid by the breaching party for each item which is not affirmative resonant wherein the goodwill percentages are based on levels of breach which are further based on intervals of resonance.

An agent (and/or semantic group) may be proxied at an endpoint by a supervised device (e.g. "Northwest recycling LLC" is proxied at the Does house and/or front porch by device/post/carrier S100).

The user and/or system may point, manipulate and/or mark items and/or artifacts to semantic flux interest zones. The preferred and/or allowed (flux)providers may have access to the published semantics, interests and/or budgets in such zones; further, such providers may have and/or be allowed to access streams and/or renderings from/to such zones. In an example, Jane wants to recycle the broken tea pot and thus, it manipulates and/or moves it at an endpoint (e.g. at the left of the big tree from the front yard). Further, Jane indicates and/or publishes her interest/goal of having the tea pot moved/removed/recycled together with potentially other artifacts. A recycling provider may have access and/or be challenged about the interests and/or clauses; thus, the provider may accept, decline and/or further negotiate the budgets, clauses and/or semantic times.

In further examples, the system/user marks an area and/or artifacts as recycling at/with semantic times and/or budgets and is augmented on which service to use based on (preferred/likeable/indicated) fares/budgets, capabilities, service factorization and/or (preferable) semantic times. In further examples, the system moves and/or points articles to zones and/or fluxes (e.g. recycling). Further, the system may match the fluxes and/or providers semantic identities and/or capabilities with the interests—e.g. matches a recycling interest, activity and/or artifact with "Northwest recycling LLC" company. It is to be observed that the "Northwest recycling LLC" is a/n (flow) agent and/or provider of service for recyclables activity and/or consumption.

The system may determine the recycling flow from a published interest endpoint to a recyclable resonant target and/or outcome wherein the optimal and/or preferred agents are selected.

The system's goal is to have items (affirmatively) resonant and/or likeably recycled. The recycling activity agents indicate, publish, bond, entangle and/or recycle of the items in a resonant manner. As such, (user's, system's and/or groups thereof) published goals of having the items recycled are resonantly/likeably coupled and/or bonded with recycle agents which bond and/or recycle the items in a resonant/likeable manner.

Recycling may cause and/or determine (hazardous) leakage if containment and/or counter-measure clauses are not met.

A publisher may publish interests, capabilities and/or goals including activities and/or budget ranges. The system (semantically) couples/entangles at least two publishers based on the interests and/or goals. In an example, the system matches Does house endpoint interest and/or goals to have the recycling items at the front yard/tree/porch removed by noon with the "Northwest recycling LLC" S100 carrier based on affirmative resonance on (maximum) size, weight, purpose, composition, budgets etc. The system projects activities and pursue goals for increased, reasonable and/or at least borderline satisfaction, likeability and/or affirmative resonance.

The system and/or users determine/s preferred agents and/or artifacts for particular activities. In examples, (recycle) agents (vehicle/carriers) and/or further endpoints/links performing and/or (further) publishing the particular goal activities roam around (facility/building/house/yard/carrier/cargo/dock etc.) endpoints/links comprising published interests/needs with budgets, clauses and/or (semantic) times.

The system entangles, couples and/or groups the endpoints/links based on semantic resonance and/or further analysis. The agents are identified and/or authenticated prior on being entangled/coupled/grouped and/or prior on being allowed at particular (resonant) activity (e.g. recycling) endpoints and/or performing the resonant/entangled activity/procedure/protocol.

In further examples, the system groups/entangles the indicated recycled endpoint and/or inferred semantics at endpoints with further recycling endpoints at recycle facilities and further selects the flow agents between the endpoints and/or further pick-up and drop-off semantic time.

The system may apply semantic routing and/or ad-hoc semantic coupling to route/couple published semantics and/or further users, providers, publishers, agents and/or further artifacts (endpoints/links/fluxes etc.). In further examples, the system may group, entangle, link and/or collapse artifacts based on affirmative resonance between the consumer and producer; the consumer and/or producer may be associated in various circumstances and/or semantic times with the user, household, facility, agents and/or service providers.

Bargaining/trading and borderline inferences are associated with orientations from/to a divider diffused proximity and/or semantic coupler. Bargains, negotiations, trades, transactions and/or clauses are inferred and/or assessed when the inference affirmatively collapses at the semantic coupler.

The system performs gain/loss, leakage/bonding analysis. In some examples, the system uses leakage analysis to infer/determine loss; analogously, bonding analysis is used to infer/determine gain. Further, the system uses gain/loss analysis to learn leakage/bonding artifacts. It is to be observed that leakage and bonding analysis may be based on H/ENT.

Particular endpoints/links may be associated with control functions and/or components within particular artifacts, areas and/or semantic groups. In a previous example, the steering wheel, gear/drive lever, brake, acceleration and/or clutch (pedal) may be associated with car's control functions which may be assigned particular leadership in particular circumstances. In further examples, a manipulator and/or control tower (endpoint) may be supervising within/over particular (control) areas and/or artifacts, potentially based on semantic times. As such, the control tower exercises its leadership based on supervising authority over objects, components and/or elements in the area. In further examples, a post/component/modality control module exercises leadership, outputs and/or manipulates environments through modality (flow) agents such as sound, arms, spraying, beaming etc.

We mentioned that posts are non-affirmative resonant with being corroded. The corrosion may be caused by agents. In some examples, components, affirmative factors, confidence and/or support may be corroded in a hierarchical manner. In further examples, S2P2 may not like to be corroded and/or/because John (as supervisor/owner) doesn't like that S2P2 to be corroded.

We mentioned that the system may generate, diffuse and/or gate advertisings. In further examples, the system allows users to indicate the preferred amount of time (intervals) and/or further semantic times during/for advertisings and thus, the system renders such advertisings based on the preferred semantic times and/or within the preferred duration. In an example, John indicates and/or the system infers that he would bear maximum 5 seconds (for a sum total of maximum 30 seconds) semantic identity (e.g. "car", "tea pot" etc.) related advertisements on the semantic time of a (particular) football team being 70 yards from the end zone and/or goal line. Further, John specifies advertising interests being related with DeLorean parts. As such, the system retrieves particular advertisings based on John interests and/or semantic times. Other advertisements may be blocked and/or scheduled at other semantic times (e.g. such as times as John is not present, not around, not observing, moving away and/or has the views towards the advertising modalities gated, blocked and/or not diffused). The system may infer leadership affirmative resonance factorization artifacts and/or frames within advertising multimedia artifacts, snippet those and/or further composing, augmenting and/or rendering them in a coherent and/or non-confusing manner within the user's indicated time budgets. Further, the advertisements may be based on semantic groups (e.g. Does as John and Jane are entangled at endpoints, links and/or views).

The system may gate and/or replace artifacts on a streaming channel/interface. In examples, as the channel/interface is streaming non-resonant advertisings the system may gate those and/or replace them with resonant artifacts (e.g. resonant advertisings, pictures, frames, videos, sound, files from a (configured) (profile) storage, memory, account and/or links). The system may choose gating over replacement based on a likeability factorization in rapport with the diffusion endpoints (of the TV programs, sound etc.), viewers, owners and/or supervisors. In further examples, the system may choose gating over replacement based on preferences and/or profiles (e.g. of endpoints, are associated with those of the viewers, owners and/or supervisors etc.). In further examples, while and/or after completely gating and/or filtering advertisings the system may be able to stream ongoing (stream) content; however, in some examples, outgoing streaming content may not be available and thus, the system may play other content. Based on further configuration, preferences and/or profiles the system may cache and/or delay streaming (e.g. to a USB/HDMI/Ethernet/LVDS and/or any other (rendering) interfaces.

Advertising may be associated with publishing and/or access control. As such, the advertisements need to be diffused and/or published. In an example, the tea pot and/or its capabilities is/are diffused, published and/or advertised (at an endpoint, link, flux/stream and/or further semantic groups and/or hierarchies).

Capabilities may be advertised. Further, a capability might be (associated with) advertising.

In further examples, the system may render the tea pot on a screen and get augmentation on what to do with it, bond and/or or manipulate it based on the items and/or inferred reasonable budgeted activities at endpoint/link/venue.

We mentioned that the system may render (pointed) artifacts on a projection, television and/or display surface. In some examples, the system renders a blinds object which is further associated and/or grouped with a strength and/or intensity user interface control (e.g. slider, bar and/or dialer etc.) which allow the user to indicate the level of blinds opening by manipulating the strength and/or intensity user interface control on the screen. It is to be observed that the system may automatically detect that the blinds object has, allows and/or is resonant with having the opening strength, intensity and/or size adjusted and thus, it renders the user interface control and/or groups it with the blinds object. As such, when the user manipulates the user interface control (e.g. by touching and/or sliding in the opening and/or up/down direction) then the system may generate the corresponding signal and/or command (e.g. open/close the blinds to the bottom of the tea pot, move up/down the blinds by three notches etc.) to the blinds object and/or further manipulators (e.g. motors, rails, strings etc.). It is to be observed that the opening/closing orientations may be circumstantial to particular types of blinds, settings and/or semantic identities (e.g. some blinds may be opened in both directions wherein the day blinds open/close in particular directions and, further, the night blinds open/close in other particular directions (e.g. opposite/(H/ENT) to day open/close); thus, the system renders the intensity object for each semantic identity (e.g. day/night blind) and/or setting and/or allows the user to select the semantic identity and/or setting for which to apply selection of the intensity user interface control.

Alternatively, or in addition, the system determines the correct setting and/or semantic identity based on further inferences. In examples, the system determines that is day and night based on sensing, challenge, flux etc.; further, the system infers that the intrinsic (user/group) (profile) goal of having particular types of blinds open and/or closed is to gain illumination at a desired indoor endpoint (e.g. conference room), allow user/group observing views from indoor to outdoor and/or block non-affirmative/non-resonant observing views to/from the endpoint. As such, the system allows/block/diffuses/gates the light and/or observing views to/from the endpoint in order to (optimally/preferably/resonantly) achieve the goals. As such, the system circumstantially may open/close the particular blinds and/or settings to block the information and/or illumination leakage and/or diffusion from the endpoint to the undesired endpoints and/or observing views (e.g. from outdoor).

The system may adjust the shading settings of window's/shades by adjusting the color or opacity of a material (e.g. electrochromic, nematic etc.) (via an applied voltage/current).

In some examples, the light is diffused based on inferred circumstances at endpoints (e.g. the system determines and/or ensures likeable and/or affirmative illumination for particular plants in particular circumstances such as John/Jane/Does present/not-present etc.).

While in the previous example, illumination gain, loss and/or leakage light (agent) analysis have been presented it is to be understood that in other examples, such analysis is directed to other agents such as sound, ultrasound etc. Further, leakage mapping and/or analysis may be applied to dielectric leakage, charge leakage, (electro-magnetic)energy/flux leakage, current leakage, (MOSFET) subthreshold leakage and/or quantum tunneling leakage where mobile charge carriers tunnel/leak through mapped (p-n) junctions, and/or insulating regions.

Linkage and/or attachment comprising component fitment, orientation and/or shaping may be used by the system to infer variable believable composed semantic identities (e.g. light pole, illuminated board, the illuminated warning board ensemble indicating to watch for S5P10 in the next half hour as moving north etc.).

We mentioned that the system may detect brightness conditions based on projections and/or diffusion at endpoints. In an example, the system may detect brightness and/or reflections as being generated by particular agents and/or phenomena.

As explained, the system may use intrinsic orientation, attachment, linkage and/or positioning to determine believability. As such, the system may adjust believability for compositions which comprise components and/or artifacts with a high entropic semantic trail orientation sequence.

A high entropic trail/DNA sequence/signature occurs when a recorded/known trail/DNA can be sequenced (at an endpoint/link) only if orientations of observed artifacts used to generate the trail/DNA are inverted. In an example, the system observes that the known DNA signature DNASEQSU1 DNASEQSU2 DNASEQSU3 is high entropic with DNASEQSU3 DNASEQSU2 DNASEQSU1 because the orientation used to generate it is opposite.

In other examples, the system observes that a picture of S5P10 on the warning board ensemble comprises S5P10 in a highly entropic orientation from (supported) intrinsic while the rest of warning augmentation (e.g. text, signs etc.) are in the intrinsic (supported) orientation. As such, the system may further determine if the high entropic orientation is intentional or accidental in order to infer believability; as such, the system may decay believability if the highly entropic orientation is deemed as intentional while it may not decay it if is accidental. It is to be observed that the system determines and/or knows intrinsic orientations for text, objects, phenomena, containers and/or further artifacts and/or circumstances. In an example, the system knows that some languages have left->right intrinsic orientation while others have right->left; further, all have bottom->up supported orientation. In further examples, the system determines that the intrinsic orientation of a traction wheel is in the upright position in order to expect/ensure traction (activity); however, the traction and/or support may be factorized based on further circumstances.

The system performs semantic analysis on artifact encompassed semantics and/or further antonyms and/or synonyms. In some examples, the system determines that a table is not imperial because is not reasonable imperial ornated and/or sumptuous (and/or lacks sumptuous orientations, factorizations and/or indexing). The system may use "spinning" or synonym "circling" semantics.

In examples where it relies on snapshots/captures (e.g. pictures, frames, pixel/sensor snapshot captures) at particular snapshots/captures rate/frequency the system may use believability factors in order to adjust the snapshots/captures rate/frequency. In an example, the system may determine that a carrier comprising copter blades hovers while the hovering support artifacts (e.g. blades) do not have a believable movement (e.g. do not rotate to support carrier hovering). As such, the system may infer that the snapshots/captures (rate/frequency) and/or flux/provider distorts the believability of the support by filtering and/or not capturing snapshots/captures which would allow the system to infer that the blades are rotating. Thus, the system may adjust and/or challenge for the snapshot/capture rate/frequency to be adjusted in order to reduce distortion (e.g. change the rate/frequency to be different than the rotation frequency of the blade rotor/s).

We mentioned that the system may determine hostility factors and further hazards at the hostile artifacts. The system may diffuse the hostility factors to semantic identities based on leadership inferences. In an example, the system factorizes an endpoint/link (e.g. facility, town, city, lane etc.) as hostile because affirmative projected resonances are blocked and/or highly entropic oriented (and/or not believable, not expected and/or not possible) within the endpoint/link. In further examples, the intrinsic and/or inferred orientation of an (opposite) travelling lane may deem the (projected) activities when positioned in that lane hazardous if moving in a high entropic manner (e.g. opposite orientation).

The system may infer wobbliness, instability and/or similar based on non-resonant movement of an artifacts in rapport with the environment, other modalities (e.g. sound etc.), projections, support and/or associated groups. In an example, an object (e.g. S2P2/John under supervision of Does) is factorized as wobbling when is moving in a non-resonant manner with the circumstances (e.g. of skating activity, previous orientations, sounds/music at skating venue etc.) and/or support artifacts/inferences. Further, its movement may be uncontrolled and/or hazardous with/within affirmative artifacts/groups (e.g. to Jane, Does, skaters, posts, cars etc.) at such semantic times.

We mentioned that the system may infer, determine and/or factorize support. As such, the system may determine support agents for particular activities and/or artifacts, potentially in a hierarchical manner.

The system may indicate and/or diffuse points of significance (to other and/or comprised/comprising endpoints) based on slope (e.g. sloped up/down 15%/degrees), orientation (e.g. south-west of), semantic identities (e.g. of the big tree up the hill) and/or further anchors indications/diffusions. The system may determine that an object is localized at the indicated and/or diffused endpoints by localization and/or further sensing. In examples, the system determines that is localized around/within a point of significance and/or anchor and that further, based on a multi axis acceleration/accelerometer sensing the object is localized at an endpoint on a slope of 15% and thus, the system infers that the object is at an indicated/diffused significance endpoint.

The system may charge users/entities/groups and/or publish budgets based on the (number) of significance endpoints/links, semantic identities and/or interests and further, data volume, inference and/or storage for such endpoints/link, semantic identities and/or interests. In some examples, the system may charge and/or budget a user/entity/group based on the number of interests, inferences and/or records streamed/stored at particular significance endpoints/links (e.g. John is charged/charges/budgets 0.25 for each significance endpoint/link where S2P2 hazardously manipulates the DeLorean's car's controls, John saves and/or indicates a significance endpoint/link and is charged/charges/budgets 0.50 for each saved significance endpoint/link and 0.01 for each (DeLorean) interest (saved) inferences and/or records at the significance endpoint/link, Jane is charged/charges/budgets 0.20 for each endpoint within a venue/endpoint and/or 0.30 for each streamed/fluxed/stored interest inference in/of the beetle at the venue). It is to be observed that the system/user may budget based on interests and/or further semantic identities at and/or within an endpoint (e.g. John is charged/charges/budgets 0.20 for interests in/of DeLorean and/or (an additional) 0.30 for the interests in/of the DeLorean's transmission). Further, the user/entity/group may specify the maximum invested budget at/with an (significance) endpoint/link and/or semantic identity (e.g. John and/or Jane specifies/specify that want/s to invest a maximum of 0.75 at (particular) (significance) endpoints/links with a maximum number of significance endpoints of 20).

Charges/budgets may be based on the number of significance endpoints/links, interests and/or semantic identities of/at/within endpoints/links. Further, they may be based on data volume, inference and/or storage for such endpoints/links. The charges/budgets may be specified, linked and/or comprise semantic indexing and/or semantic times.

It is to be observed that the significance links may comprise significance endpoints and/or vice-versa As such, the system may indicate significance endpoints and/or interests based on links (semantic attributes/identities) and/or orientations (e.g. John is interested in the significance endpoints as moving/driving (his DeLorean) south on highway 405 between Jane's beetle and his DeLorean); analogously, the system may indicate significance links and/or interests based on endpoints (semantic attributes/identities) (e.g. John is interested in DeLoreans moving hazardously and/or erratically around the house).

As mentioned, the system determines significance endpoints based on behaviors, hazards and/or further interests. It is to be observed that the behaviors and/or hazards may be related with hierarchical causal and/or flow inferences. In examples, the hazardous manipulations and/or movements by an object A (e.g. S2P2 (as supervisor and/or leader of), S2P2 arm) its leaders and/or its supervisor (s) cause to/the manipulated and/or moving objects (e.g. DeLorean car controls, S2P2 camera) (to elicit) unwanted/non-optimal/hazardous/hostile behaviors, orientations and/or damage which may further bond to endpoints, artifacts at endpoints, containers and/or further contained. Thus, the system may determine and/or store semantic times associated with such circumstances and/or leaders and/or supervisors. Further, the system may determine other leaders and/or supervisors within the semantic time in order to alleviate such hazardous and/or unlikeable circumstances and/or to affirmatively factorize goals when the semantic time supervision and/or leadership is applied.

Supervisors and/or users may indicate and/or rate significance endpoints and/or further significance semantics at endpoints. The system may factorize the believability of such inferences in similar ways with semantic flux analysis. In examples, the significance semantics indicated and/or rated by supervisors may be more believable factorized than those of users. Further, the indications and/or ratings of experts (e.g. pros) in a field and/or endpoints/links are more believable than those of non-experts and/or beginners.

Expertise may be determined based on ingested (flux) information, credentials and/or ratings in rapport with artifacts, capabilities, activities and/or attributes.

Expertise may be inferred based on a well-informed and/or well-executed indicator in rapport with significance semantics. Well-execution is factorized based on affirmatively resonant fluent execution of an activity in rapport with its (intrinsic) scope/goals (and/or similar); further, well-informed is factorized based on affirmatively resonant fluent narrative in rapport with (intrinsic) scope/goals of an activity (and/or similar). Based on the level of expertise and/or further (flux) information the system may determine whether the associated artifacts are professionals, beginners etc.

Believability and/or expertise (inferences) may determine acceptability/allowability (inferences) and/or vice-versa when deception and/or distortion is low.

A user may want to be augmented on interests and/or activities at endpoints in rapport with artifacts and/or further semantics associated with the artifact. As mentioned, a user interests may be based on the level of expertise (e.g. inform me as/before/after the expert/pro/beginner DeLorean driver is/drives around the house, inform me only if I am not watching a DeLorean video, inform me after I am watching a DeLorean video, record all the snippets or shows with expert DeLorean mechanics etc.). As such, the system may apply semantic drift between the interests and/or inferences to augment the user.

The system may apply semantic drift between the interests and/or profiles/preferences to determine the optimal augmentation devices and/or semantic times.

We mentioned that the system may observe, stream, record, store and/or invalidate (multimedia) artifacts. Further, the system may apply (additional) (learned/indicated) durations and/or semantic time indexing. In examples, a user (e.g. Jane and/or S2P2) indicates that she/he/it wants to record an interest streamed (e.g. by cable/wireless etc.) (car) program/show (at an endpoint); thus, the system/S2P2 observes, streams, records and/or stores the program based on the start and end time from a ingested schedule and/or (further) semantic time (indexing). Sematic time indexing may be inferred and/or indicating (learned) (circumstantial) delays and/or lengthening beyond the ingested schedule of the indicated program/show. In other examples, the system and/or the user observes, streams, records, stores and/or invalidates based on an additional (learned/indicated) (indexed) duration. In further examples, the access to (parts of) the program/show may be access controlled.

The system may allow streaming, observing and/or recording based on published access control and/or credentials by owners, supervisors and/or agents.

In some examples, the consumer/user (e.g. Jane and/or S2P2, Does, provider/distributor/publisher DA, semantic identities, semantic groups etc.) has paid, is allowed and/or has credentials for accessing/manipulating/viewing/recording a (streamed) (television/radio/multimedia) (cable/wireless) channel/program/show/flux/stream at particular (semantic) times by a provider/distributor/publisher (e.g. provider/distributor/publisher DB). The television channel/program/show/flux/stream may be further recorded, streamed, gated and/or published by the channel's/program's/show's owner, producer, broadcaster, collaborators and/or (further) flux, device, site, server, cloud and/or stream. As such, the provider/distributor/publisher issues and/or publishes with the system the access rights and/or credentials allowing the user to access/view/observe and/or stream the program/show (at semantic times, from/to endpoints/links etc.). As the user accesses providers, producers, broadcasters, collaborators and/or other users flux, device, site, server and/or streams/recordings/sites for the program/show, the system may identify/authenticate the user and/or further, check and/or apply the user's (published) access rights and/or credentials and thus, allowing user access to the program/show as per access rights. Access rights may be based on further supervisory, ownership and/or indications; as such, because Jane is an owner/supervisor of S2P2 during the program/show and/or further associated semantic times, Jane may have access to the program/show based on S2P2's credentials. Further, Jane may indicate that John may have access to (parts of) the program/show based on her credentials, budgets and/or credits.

In further examples, the system may use semantic indexing learning. In a particular route the system may infer a particular semantic indexing factor which may be used by endpoints in the route. However, the semantic indexing may not be resonant with the indexing of semantic time. In an example, the system infers that a temperature in an oven should move up with 5 F each 2 sec until reaches 500 F however, at 478 F the temperature drops to 460 F and stays there for a semantic time. As such, the system infers that the "next" temperature after 475 F is in fact 460 F and not 480 F in a semantic time. Thus, when a user tries to adjust the temperature dial to 500 F the system may display and/or adjust to the maximum reachable temperature of 478 F (as being lower (orientation) drifted and/or augment the user on the disparity between the user's selection/target (500 F) and the actual displayed value/target (475 F) within a semantic time. Further, if the user tries to adjust the temperature around 478 to 480 then the system may display/augment (about) the actual temperature corresponding to 478-480 (e.g. 460) and thus, ensuring better localization. Analogously with the temperature parameter in the example the system may infer, augment and/or determine (on) budgets/charges.

In some circumstances endpoints are injected based on projected expected/believable (user) behaviors, orientation and/or indexing. In some examples, the system projects expected/believable behaviors and/or challenges which comprise (expected/believable) indexing in rapport with a semantic identity and inject the endpoint as to encompass the projected expected/believable behaviors and/or orientation. It is to be understood that the expectation and/or believability may be based on projections however, the factual artifacts may be high drifted from such projections. As such, the system may link, route, group and/or encompass the projected behaviors and/or artifacts to factual behaviors and/or artifacts.

In further examples, the system infers the expected orientation and/or route based on leadership semantic attributes (in challenges) associated to objects and/or activities.

We mentioned that users (and/or semantic groups thereof) may specify the desire for particular augmentation from sensors/devices/posts in a trajectory in particular circumstances. The users may indicate the desired orientations of the observing views and/or of themselves. In an example, Jane specifies that she wants to be photographed from a side profile, front profile or in a particular angled view in particular circumstances. Thus, the system selects the sensing (e.g. cameras, sensors, meshes etc.) and adjusts the observing views based on such indications and/or (inferred) semantic times. It is to be understood that the system may capture and/or augment based on affirmative resonance projections in rapport with users and/or further semantic groups. In some examples, Jane wants and/or indicates interest in a (publishing of a) picture from a side profile together with John when they are skating; as such, the system captures both Jane and John from the side profile while they are skating. In further examples, Jane indicates interest for a (publishing of a) picture with a DeLorean; as such, the system may need to detect (and/or be fluxed with) an (unblurred) semantic identity of a DeLorean and capture the picture. It is to be observed that if a supervisor of a DeLorean specifies that the DeLorean semantic identity should be published, anonymized and/or blurred to such of "a car" then the system may not be allowed to satisfy Jane's interest unless the supervisor allows an exception (e.g. such as indicates non-anonymization and/or blurring) and/or doesn't indicate anonymization and/or blurring for such circumstances and/or semantic times.

It is to be observed that the system may send an alarm if it receives a highly entropic artifact in rapport with the profile/preferences (e.g. receives and unblurred picture instead of a blurred picture). Alternatively, or in addition, it may discard the unblurred artifacts and/or may challenge inform the collaborators with the semantic identity of the blurring breacher and/or the breached profile/preference. In further examples, the collaborators may adjust breacher and/or associated groups flux factorizations.

The system may be instructed to blur in some circumstances (e.g. John doesn't like to be filmed/photographed from a side profile and/or as having a 30% axial orientation, John likes to be filmed/photographed from a side profile only as the head is tilted/having a 45% axial orientation) and thus, the system may further blurs and/or challenge to reduce confusion (e.g. blurs John's if is captured from a side profile and is not 45% axially oriented, ask John for permission to be unblurred/photographed/filmed from a side profile, ask Jane to allow John to be photographed/filmed from a frontal profile etc.). The system may challenge and/or unblur before and/or after capturing the photographs and/or films; in some examples, the system determines that it cannot capture John, Jane and/or Does in their preferred orientation/posture and thus, may further augment and/or further infers/suggests alternate possible low drift orientations/postures. Further, the system may capture John and Jane (as indicated) and challenge about the permission to publish the unblurred images and/or to unblur (particular artifacts).

As mentioned, the system may allow, block and/or factorize particular routes based on goals and/or further capabilities including blurring. As such, the system may factorize the likeability of a skating venue in rapport with John, Jane and/or Does based on whether Does can be published, depicted and/or augmented in their preferred (profile) and/or indicated postures. The system doesn't publish unless publishing is as per owner's blurring preferences.

A semantic post may be moving and/or manipulate sensing around an artifact in order to identify, allow, block and/or rule in/out inferences, projections and/or behaviors. In some examples, such sensing may be used to identify health, safety and/or hazard as related to a person or object at endpoints/links. Further, they may be associated with leisure, accessibility and/or other circumstances. Further, the system may focus/orient the manipulation of sensing by the post on interest areas and/or endpoints. In an example, S9P9 is deployed at a security checkpoint wherein it checks trucks which do not pass the primary screening; thus, S9P9 focuses checking on the semantic identities and/or artifacts (associated with the interest trucks) indicated by the primary (leadership) screen modality (e.g. Thz/X-Ray imager etc.).

The screen modalities usage in particular circumstances may be based on leadership inferences in rapport with screened artifacts; in some examples, the screen modalities may be inferred to cause no hazards to the screened. In circumstances when artifacts may not be likeable/reasonably/satisfactorily screened then they may not be allowed to transition the screen and/or screen divider.

The system may determine new leadership as leadership artifacts and/or attributes may be incapacitated, invalidated and/or disabled. As mentioned, the leadership artifacts and/or attributes may be associated with control and/or critical activities/functions.

A post/carrier may project and/or strive to expand its observing views. In an example, a post/carrier may be installed to control and/or drive a vehicle; as such, as projecting control and/or handover the post/carrier may disassemble and/or install its components on the vehicle so it can expand its observing views.

Figure 32:
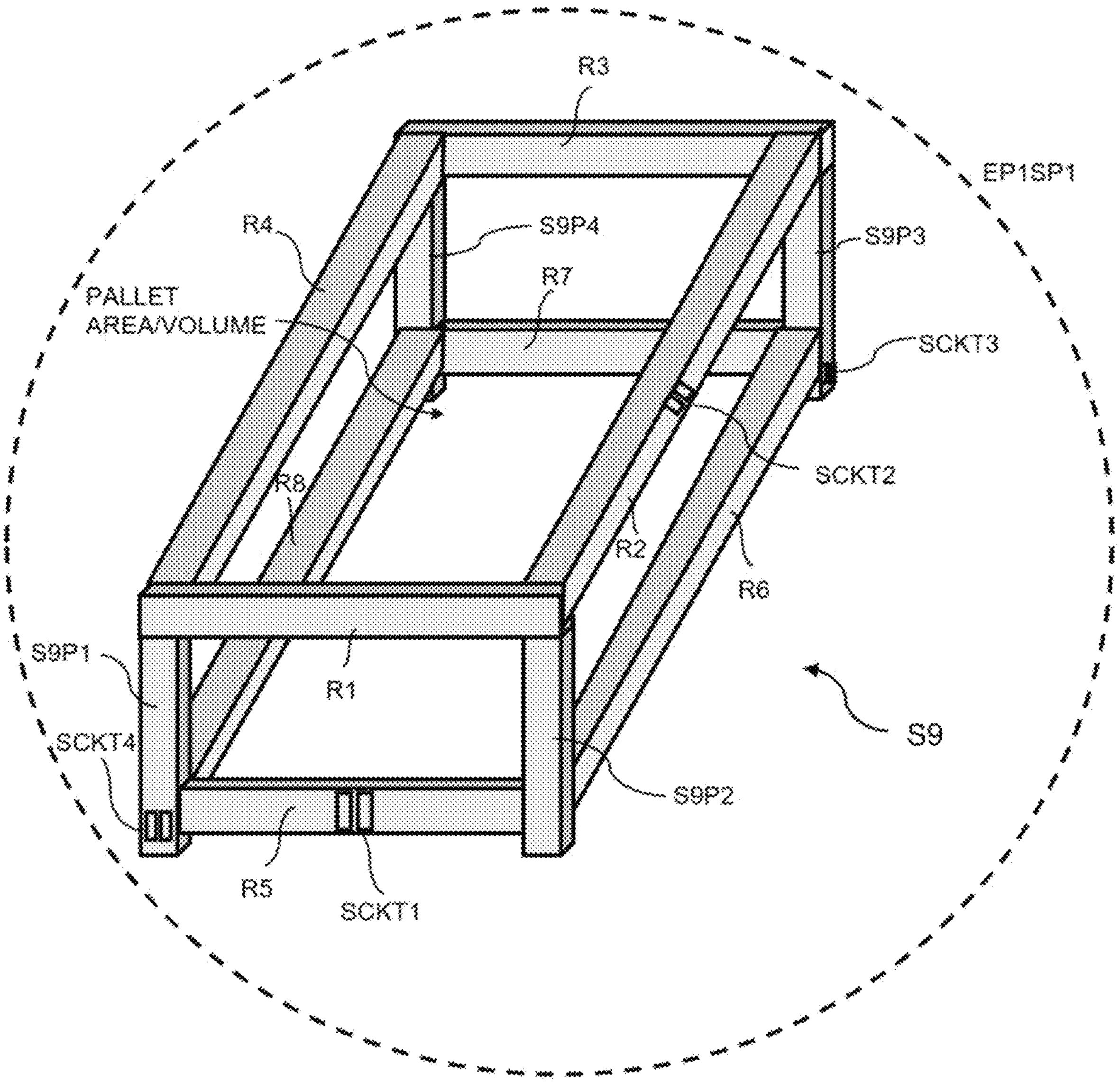
FIG. 32 is a perspective view of a preferred robotic pallet.
Figure 33:
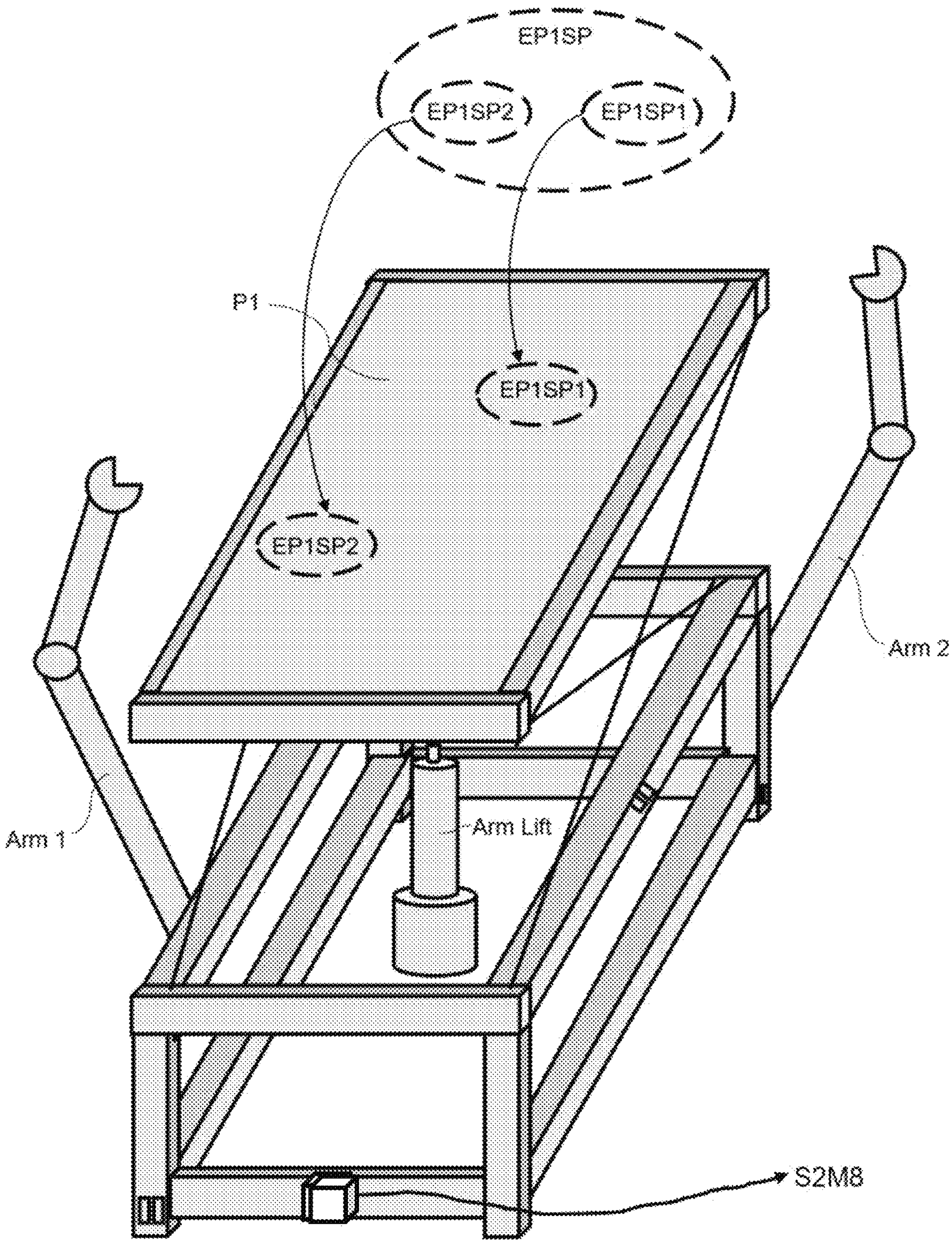
FIG. 33 is a perspective view of an alternate robotic pallet.

The composite carriers may be used as enclosures for product pallets, containers and/or supports (semantic pallet enclosure/support—S9 in FIG. 32). Thus, the pallet may be formed from a plurality of posts in which a plurality of the posts are robotic posts such as described above, the robotic posts having a processor and memory accessible by the processor to enable each of the posts to behave in accordance with computer instructions. As such, a product pallet may be enclosed and/or assembled (at an endpoint) in a post carrier/support structure such as S9 depicted in FIG. 32. It is to be observed that the robotic pallet enclosure comprises a pallet area such as the area within rails R1-R4 and/or volume such as the volume within the rails and posts (PALLET AREA/VOLUME in FIG. 32) where the product pallet is to be enclosed, locked, positioned, located and/or mapped. In one example, a product platform such as platform P1 may be configured to be supported by the robotic pallet, such as in the example shown in FIG. 33 in which the platform is illustrated in a position raised above the pallet, and in the example of FIG. 36 in which the platform is illustrated in an inclined position supported by a plurality of posts for loading or unloading. The ensembled robotic pallet comprised of pallet and carrier/support may be stored and/or manipulated by the system. As further depicted, the composed robotic pallet carrier/support (e.g. S9 comprising posts S9P1-S9P4 in FIG. 32, or S9P1-S9P6 in FIG. 34) may comprise sockets such as SCKT 1/2/3/4 for connecting/ linking power, energy and/or communication cables; alternatively, or in addition, the sockets may be used to lock manipulation arms and/or their grips from the manipulator carrier or the robotic pallet itself. As such, when manipulated (e.g. by control of S2M8, as illustrated in FIG. 33), the semantic pallet support may be connected to a manipulator's port, flux and/or arm for communication, power and/or energy feeding and/or further manipulation/support.

It is to be understood that a robotic pallet (enclosure) can be substituted for/with a robotic container (enclosure) and/or vice-versa.

A robotic enclosure may enclose and/or contain a pallet and/or a physical container partially or in entirety. As such, a robotic enclosure may act and/or provide smart container/pallet flux capabilities. Further, it may allow smart stacking capabilities.

The product pallet is manipulated by the robotic pallet and/or robotic platform posts' arms. In some examples, the arms may support the product pallet while the (supporting) locks, grips, rails and/or bands are retracted/unlocked and thus, allowing the product pallet to be manipulated out and/or unloaded out of the robotic pallet enclosure area. Alternatively, or in addition, the robotic pallet posts move and/or settle the product pallet to the ground by moving the locks/grips/rails to the ground and/or by retracting the posts' inferior/bottom part and/or support. Once the product pallet is unloaded the robotic pallet and/or posts may further disassemble and/or disconnect. Analogously with the unloading and/or disassembly, the system may perform loading and/or assembly wherein the posts compose, ensure support, connect, lock, adjust, enclose and/or move during assembly.

Further, the pallet carrier posts may link and/or lock via robotic arms, edges, rails, bands, barriers, fairings and/or other connecting elements (R1-R8 as depicted in FIG. 32). It is to be understood that the robotic pallet may use various profiles for rails (e.g. straight, L shaped, T-shaped, U shaped, hook shaped, multiple and/or combinations etc.); further, the rails may comprise holes which may be used to hooking arm's grips/hooks and/or posts' heads. Alternatively, or in addition, the system may use a combination of rails, band, fairings and/or further connecting elements to support the product pallet in many orientations (e.g. up/down/left/right/forward/backward, top, bottom, laterally, under etc.).

Figure 37A:
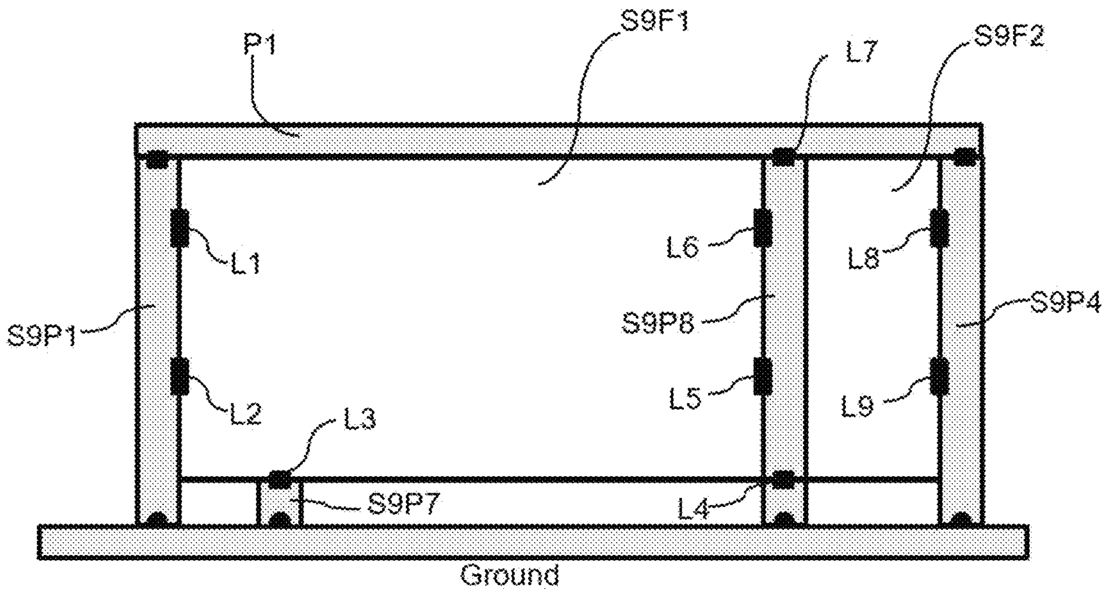
FIG. 37A an elevational view of a preferred robotic pallet.
Figure 37B:
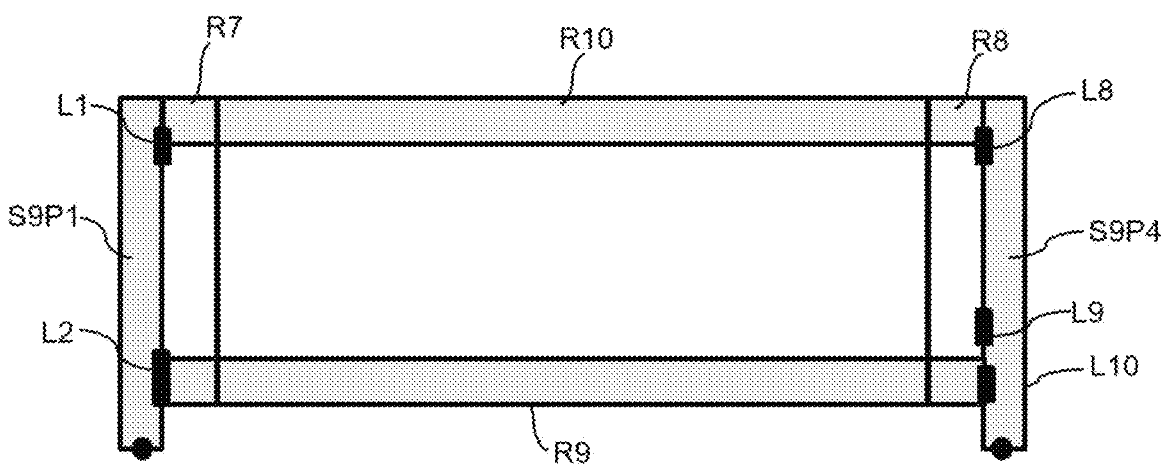
FIG. 37B an elevational view of a preferred robotic pallet.

The robotic pallet rails (e.g. R7-R10 in FIG. 37 B) may attach to posts (e.g. via locks/grips/hooks such as L1, L2, L8, L9, L10 exemplified in FIG. 37 B). The rails provide support and/or hold fairing and/or support elements which further enclose and/or protect the cargo/product within the robotic pallet; in some examples, the fairing elements slide and/or further lock between the rails on the shaped grooves, locks and/or grips exposed by the posts and/or rails. The support/fairing elements may be placed at the bottom, top and/or sides. The fairing elements may be selected and/or placed by the system and/or by a user/operator/supervisor based on the characteristics of cargo, analysis of movement and/or further goals/clauses (e.g. travel/interaction/containment analysis, acceleration/deceleration, hazards, vibration/bounce, temperature, agent bond, leakage etc.). In some examples, rails' grooves and/or fairings comprise seals for ensuring pressurized and/or controlled environments within the cargo.

It is to be understood that while the fairings may slide and/or lock on rails, alternatively, or in addition, they may slide and/or lock (directly) on posts' grips and/or locks. As such, a post may grip and/or lock a fairing via attached grips and/or locks at its connection endpoints. In an example, in FIG. 37A which represents another embodiment of a side view of a robotic pallet, the fairings S9F1 and S9F2 are attached and/or locked to the robotic pallet at least via locks/grips L1-L9 of the posts S9P1, S9P4, S9P7 and S9P8.

The (support) fairings and/or rails may be supported by posts' locks, grips, hooks and/or heads; in examples, FIG. 37A B comprise a side view (e.g. left->right orientation) of S9 wherein S9P7/S9P1/S9P4 supports/locks/hooks/grips the robotic pallet bottom ((of the) fairing/rails/structure) and S9P8/S9P1/S9P4 supports/locks/hooks both the bottom and top ((of the) fairing/rails/structure). In the example of FIG. 37A, the product pallet P1 is supported by the robotic pallet including posts S9P1, S9P1, and S9P4, and is further locked to the robotic pallet by a plurality of locks example by lock L7.

In further examples, where the product pallet comprises a support structure (e.g. such as a (wooden) support, platform and/or manipulation bed) the posts, rails and/or fairings may lock, hook, grip and/or support such structure.

A product pallet may comprise and/or be substituted for/with a container.

The robotic pallet enclosures can be used to comprise and/or (affirmatively/likeable) store luggage, foods, goods, (hazardous/controlled) items and/or other artifacts. Further, they may ensure preferred storage and/or transportation environments for the enclosed artifacts.

The robotic arms of the posts in the robotic pallet may be used to manipulate the product pallet and/or further to support the robotic pallet movement, grip (e.g. for hanging/ascending/descending from the shelf etc.), manipulation and/or entanglements (e.g. with manipulator platform carrier S2M8 etc.).

Figure 36:
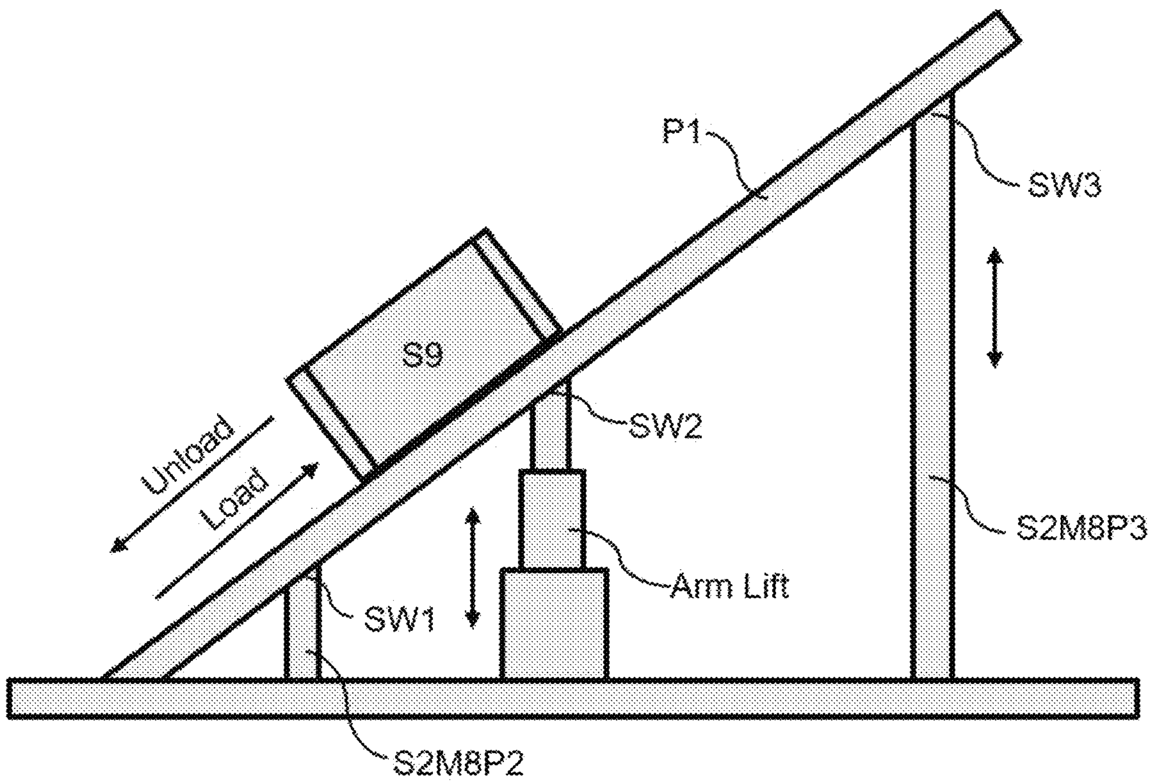
FIG. 36 is a side elevational view of a robotic pallet in a loading or unloading process.

The platform P1 may move up/and/or down and/or swivel (e.g. enabled by swivel articulated ARM_LIFT and/or modules at the top of the platform's posts such as SW1-SW3 in FIG. 36) in order to allow loading and/or unloading of the robotic pallets. In some examples, such as depicted in FIG. 36 the platform P1 is inclined by the manipulator S2M8 posts/arms (e.g. S2M8P2, ARM_LIFT and/or S2M8P3) and reaches the ground on one side and thus, positioning the platform P1 for allowing the robotic pallets to move to/from the platform P1 and performing loading/unloading activities to/from the projected endpoints. In further examples, arms including ARM_LIFT may swivel such as platform P1 may swivel in various orientations in rapport with the interest endpoints (e.g. left/right, up/down, forward/backward etc.).

The posts, platform and/or carrier arms may be used to grip/hold on a shelf, platform, supports. ground and/or poles in order to allow movement to/from the shelves, platforms and/or endpoints.

In other examples, the robotic pallet is on the shelf and the arms are used to move the robotic pallet down the shelf by gripping the supporting poles.

The manipulator platform moves to a likeable, affirmative and/or reasonable endpoint in rapport with the shelf where the interest manipulated robotic pallet is contained and/or located.

The posts, platform and/or carrier arms may be used to lock and/or provide support to the robotic pallet while is being loaded and/or unloaded. In an example, in FIG. 34 the arms Arm 1 and Arm 2 attached to the platform's carrier posts lock, grip, hooks onto locks, sockets, holes and/or latches comprised in posts (e.g. S9P5/S9P6) and/or connecting rails/bands (e.g. R1-R6).

In some examples, Arm 1 and/or Arm 2 (or yet other arms) hook onto rails and/or bands of the robotic pallet and lift and/or lower it; while performing such manipulation the robotic pallet posts comprising the connecting elements of the particular rails/bands may adjust the damping capabilities of the rails/bands and thus, protecting the pallet from shocks and/or vibration. It is to be understood that the robotic pallet posts and/or further components (e.g. arms, band locks, hooks etc.) may be entangled on goals and/or activities with the manipulator's (e.g. S2M8) posts and/or components and thus ensuring the optimal (entangled) manipulations.

Figure 35:
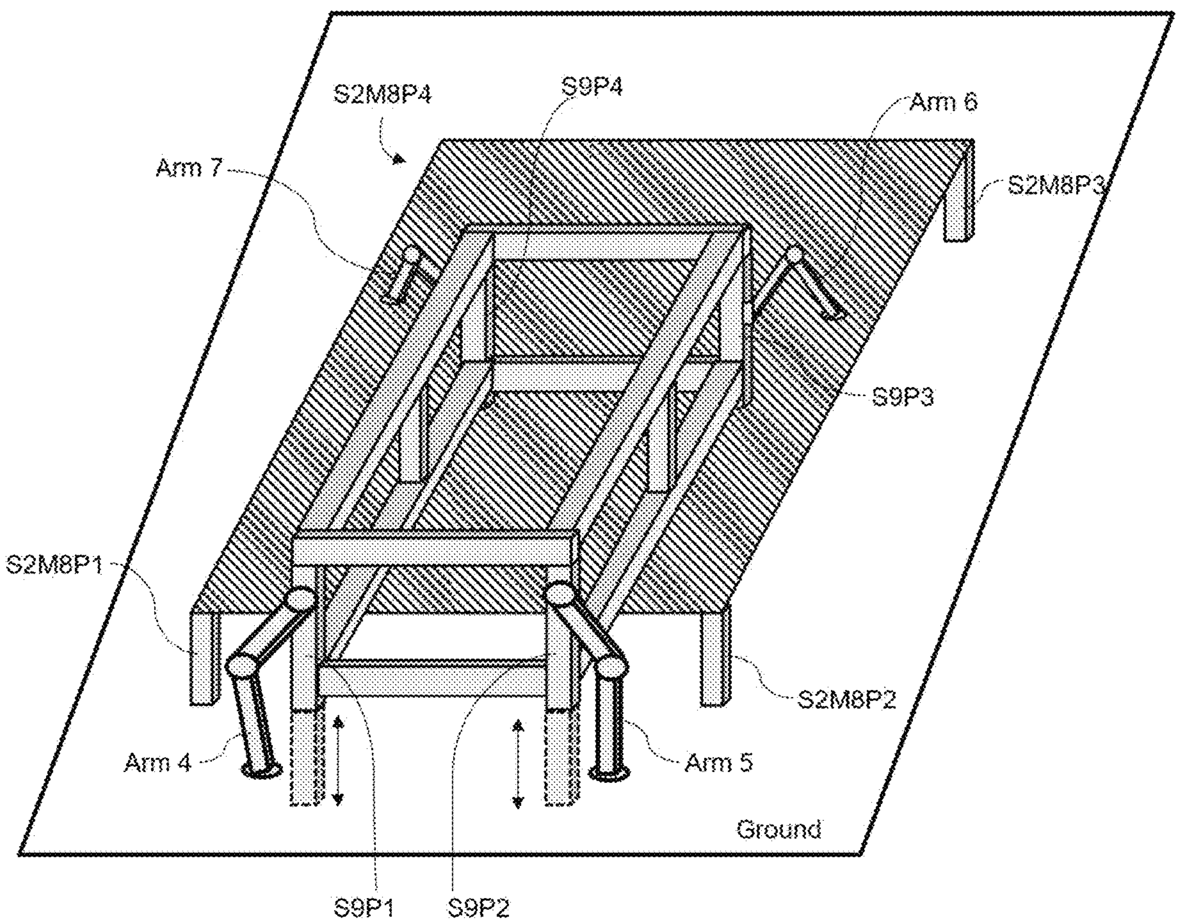
FIG. 35 is a perspective view of an alternate robotic pallet including arms in an unloading or loading process.

In further examples, in FIG. 35 the robotic pallet posts comprise arms (ARM4-ARM7) which are used to support the robotic pallet on the ground when loaded and/or unloaded. In an embodiment, the robotic pallet is unloaded by moving forward over the edge of the platform and extending arms and supporting on the ground. As the robotic pallet moves forward over the edge of P1 the posts S9P1 and/or S9P2 extend towards the ground in order to support the pallet (besides the support of ARM4-5 if available/needed/used). Once the frontal part is supported on S9P1-S9P2, the robotic pallet moves towards the particular orientation/activity (completion) by the traction assured by the post's wheels and/or reaction force/momentum exerted due to the pressure/force applied by the arms (ARM4-ARM7) on the ground towards the opposite of the particular orientation. Once the rear of the pallet is at the edge and supported by it, the ARM6-7 hold the ground/platform and/or further allow back support while posts S9P3-S9P4 are extended to the ground. Analogously with loading the system performs unloading; as such, the robotic pallet moves towards the P1 edge with S9P1-S9P4 extended and use the support arms to hold the ground until the posts retract and move onto the platform P1.

A robotic pallet is ensured traction, support and/or orientation momentum by the posts' wheels/pods and/or arms momentum/movement/manipulation.

While the exemplified embodiments comprise multiple axis orientations arms used to partially and/or temporarily support the robotic pallet on the ground it is to be understood that alternatively, or in addition the arms may have just one axis orientations and be supported and/or moving within a post and/or module of a post where they are supported. In other embodiments the post's lower modules comprise multiple (wheeled/poded) arms which extends and/or retract within a post and/or module. While the arms' ends themselves may comprise/be wheels and/or pods, it is to be understood that alternatively they may grip wheels and/or pods with the gripper.

The robotic pallet may comprise (around) multiple posts (S2P1-S2P6). Further, the semantic posts may hierarchically comprise and/or be composed of other semantic posts. In examples, S9P1 is comprised of S9P1Forward (or S9P1Front or S9P1F) and S9P1Backward (or S9P1Back or S9P1B); as such, S9P1F/S9P1B may provide some similar functionality and/or activities of ARM4 in FIG. 35 without having multiple axis freedom of movement. When unloaded, S9P1B may ensure support on the platform P1 while S9P1F may extend (vertically) towards the ground and provides support on the ground; as the pallet is further unloaded, S9P1B may leave platform P1 and further extend to the ground and thus, joining S9P1F on supporting S9P1 and thus S9 and/or P1 on the ground. As it can be observed S9P1F and/or S9P1B are grouped and/or entangled for supporting S9P1/S9/P1 on the ground at the same time and/or at semantic times. Analogously with unloading the system performs loading where it sequentially and/or at semantic times retracts (vertically) S9P1F and/or S9P1B towards the top of S9/P1 and further ensures (entangled and/or grouped) support (on P1 and/or ground). It is to be observed that S9P1F and S9P1B extend and/or retract based on the orientation of movement of the robotic pallet; as such, while loading/unloading S9, one post (e.g. S9P1F/S9P1B) may need to retract/extend first and ensure support (on platform P1/ground) while the other (e.g. S9P1B/S9P1F) may need to retract/extend second (at semantic times). While in examples the unload/load target has been exemplified as ground, it is to be understood that in other examples, the target can be any (mapped) surface, platform and/or area on which the system loads/unloads items to/from platform P1. Further, while the semantic identities of the exemplified S9P1Forward and S9P1Backward comprise and/or determine forward (S9P1F<-S9P1B)/backward (S9P1F->S9P1B) orientation, in other examples, they may be and/or determine alternate and/or additional orientation (e.g. side etc.) and/or none at all.

Depending on the orientation on which the robotic pallet moves the comprised orientation and/or further semantic identities of S9P1Forward and S9P1Backward may change; this may happen in the absence of anchor points and/or intrinsic orientation. As such, the movement orientation may need always to be front/forward first and back/backward second.

In other examples, the robotic pallet may move downwards/upwards for load/unload from/to the platform P1 which is tilted/oriented towards the desired orientation and/or endpoints in order to allow the movement from/to the platform (e.g. such as FIG. 36).

While in some examples, platform P1 may need to be tilted in any particular orientation for loading/unloading in other examples the tilting may not be necessary; as such, the facility, venue and/or loading/unloading endpoint may comprise ramps which allows the platform manipulator to horizontally level, lock, hook and/or rest the platform P1 with/on the ramp.

Further, the robotic pallets may move on top of each-other. As such, a robot pallet wheels/pods may be directed, move, brake, hook, lock and/or rest on the rails R1-R4 of the pallet from/at the bottom and/or further heads of the supporting posts from/at the bottom (of the bottom supporting robotic pallet). As mentioned, in some cases the rails R1-R6 have specific profiles and/or grooves which guide the movement of the wheels, pods and/or rails of the adjoining (robotic) pallet.

The system may allow the movement and/or stacking of items and/or pallets on top of each-other based on semantic inference and/or further access control. As such, the system may not allow stacking of products which projects hazards (for products, robotic/product pallets, manipulators, goals, further activities etc.) and/or do not project affirmative resonances in rapport with (activities such as) storage, loading/unloading, distribution etc.

Robotic arms may be stored inside the posts/modules/carrier when not used for loading/unloading/support and thus, not protruding on the outside of the post/module/carrier fairings.

Figure 34:
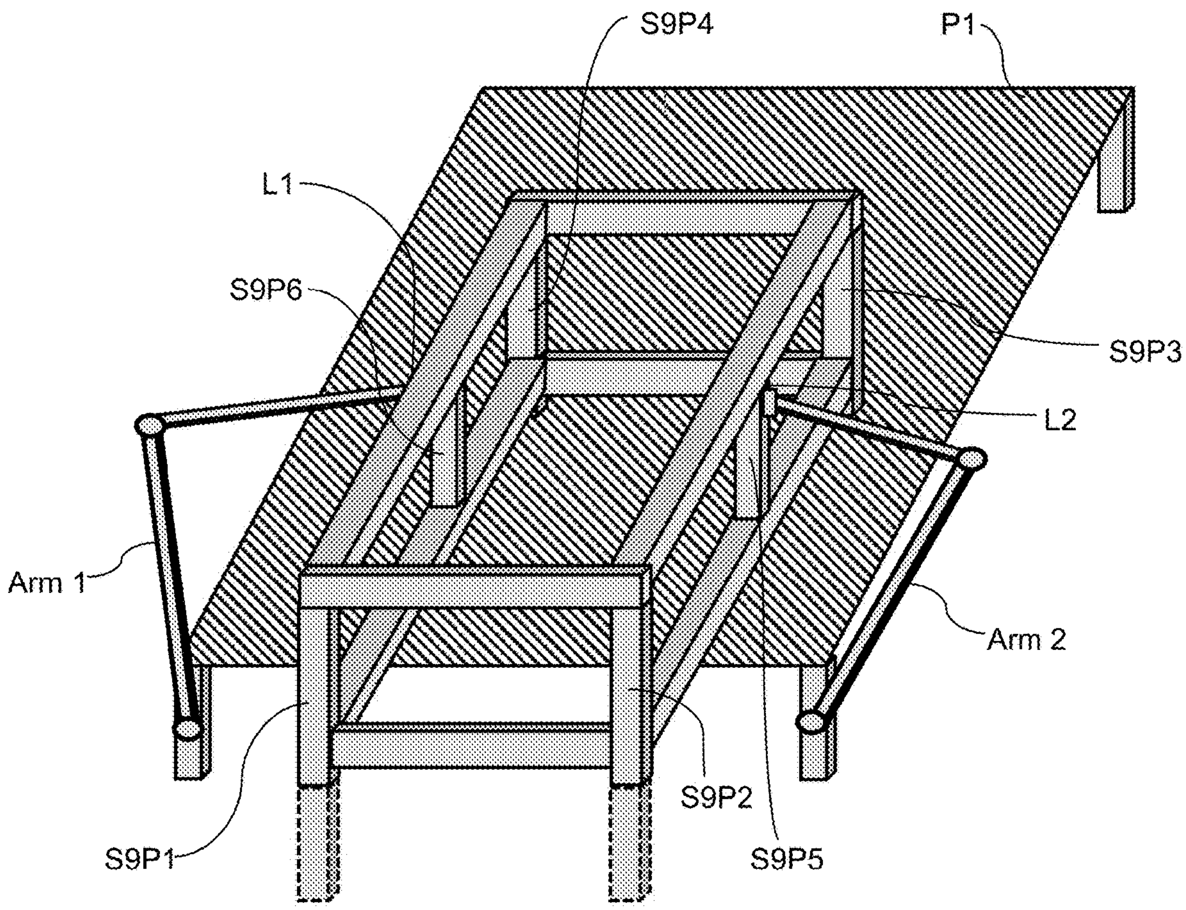
FIG. 34 is a perspective view of a robotic pallet including arms in an unloading or loading process.

While the previous examples and pictures such as FIGS. 34-36 depict various load/unload configurations it is to be understood that there may be any combinations of those. As such, the system may use components, posts and/or arms of both robotic pallet and/or platform carrier at the same time to extend, lock, latch, grip, hook and/or support parts of the robotic pallet at any time; further, the arms of the robotic pallet may latch, lock, hook and/or support on any of its parts in order to optimize the base of support.

While in examples, a particular order of post extensions and/or arms has been exemplified for supporting the robotic pallet on the platform P1 and/or on the ground while being loaded/unloaded, it is to be understood that in other embodiments a different order may be applied (potentially based on orientation/semantic of movement)—e.g. in FIG. 35 the system may use ARM4 and/or ARM5 (ARM4-5) to support the robotic pallet on the platform P1 while extending the arms' (ARM4-5) posts (S9P1-S9P2) towards the ground or vice-versa with the arms' (ARM4-5) posts (S9P1-S9P2) extensions supporting the robotic pallet on the platform P1 and ARM4-5 supporting the robotic pallet on the ground. Also, the (entanglement/grouped) support to the ground and/or on platform P1 between arms and/or arms' posts extensions may be in applied in any sequence, potentially based on semantic times, orientation and/or semantic of movement.

Robotic pallets may be stacked and/or locked with each other (vertically and/or horizontally) and/or further composed, locked and/or latched. As such they may function as a composite robotic pallet.

Robotic manipulators and/or platforms may be stacked and/or locked to each other (horizontally and/or vertically). In an example, the system composes horizontally the robotic manipulator S2M8 with S2M9 for increasing and/or composing the platform surface (e.g. composes, joins, hooks and/or locks (platform P1 of) S2M8 and (platform P2 of) S2M9). Alternatively, or in addition, the system composes vertically S2M8 with S2M10 wherein the S2M10 is stacked on top of S2M8; as such, S2M10 and/or the platform P3 of S2M10 and/or its movement may be further supported by S2M8 and/or the platform P1 of S2M8 and/or its movement.

The robotic pallets and/or supervisors may want that the pallets be likeable and/or affirmatively manipulated.

Analogously with robotic pallets the system may compose robotic shelves, drawers and/or other storages.

The semantic pallet support may be manipulated and/or entangled with (affirmative) manipulators (e.g. posts, carriers etc.), In examples, such as in FIG. 33, a composite carrier and/or manipulator S2M8 comprises a platform component which lifts to the level of the desired semantic pallet support; further, S2M8 may couple with the semantic pallet support through the socket for providing power, energy and/or further communication. When at the desired level, the semantic pallet support (at EP1SP1) moves/transitions/diffuses on the S2M8's manipulation platform and secures in place by its stability legs/pods/ensembles. Once the manipulator's platform is determined as secured, safe and/or non-hazardous the manipulator starts moving and/or manipulating the semantic pallet to the desired locations.

The composite carrier and/or manipulator may comprise multiple manipulations arms (e.g. ARM1, ARM2) and/or arm modules attached to the post and/or carrier. Further, the arms may manipulate the platform P1 and/or elements from/to P1 to/in the desired locations, endpoints, links and/or orientations. In further examples, S2M8 comprises a vertical lift component and/or damper (e.g. ARM_LIFT) which moves the platform P1 in up/down orientations and/or further lifts/lowers the platform; ARM_LIFT may tilt and/or grip/un-grip in order to allow the platform to be manipulated to ground for example.

Pressure/weight sensors within modules/posts comprised in the robotic pallet may measure the product pallet weight and further, monitor its condition (e.g. augment and/or raise an alarm if the weight of the pallet changed in an undesired direction such as weight increases due to moisture). In some examples, where the system infers support at the bottom to the top the weight of the (robotic/product) pallets at the bottom may be calculated based on the weight of the pallets at the top. Alternatively, or in addition, the weight of the (product) pallet may be measured independently (as the product pallet is supported within and/or by its robotic pallet).

Further sensors for vibration, temperature, carbon dioxide, oxygen and/or (hazardous/preferable/likeable/non-likeable) circumstances/agents (sensing) may be comprised in the posts and/or robotic pallets.

The manipulator may be entangled with and/or comprise/d (in) a (logistic, warehouse, management system, user) order (list) and/or further items/articles. As such, the manipulator may be allowed to the pallet areas and/or further to manipulate the pallets only if it is allowed. It is to be understood that the robotic pallet support and/or manipulator communicate in order to determine the access and/or allow manipulations. In further examples, platform P1 may support sensing, vehicular and/or control (tower) artifacts, containers and/or enclosures.

The (robotic) pallets may be mapped to endpoints (e.g. EP1SP1 and EP1SP2 in FIG. 32) which may be further encompassed in a container and/or shelf (e.g. EP1SP in FIG. 32). Further, their manipulation may entail moving to/from endpoints mapped to platform P1 and/or further container S2M8.

In some examples, the system may determine unauthorized accesses to items, articles, pallets, records and/or accounts based on semantic times. For example, in a banking environment (e.g. an application hosted on a (distributed) cloud/server/tenant etc.) the system determines at a first time that an attendant is serving a customer at an endpoint wherein the system identifies the attendant and/or customer (e.g. by sensing, by the attendant's/user's authentication/login information to the (bank) cloud/server, from transaction, identification credential (e.g. driver license, biometrics) etc.). As such, the system determines that the attendant accesses and is allowed to access the information on the customer account (e.g. on an application running on a server, cloud and/or tenant) from the endpoint in the presence of the customer. Further, the attendant may be allowed to access customer information only if is assigned to a customer case and/or file and/or only within a semantic time. Accesses outside those semantic times may be deemed as not allowable and/or may be audited and/or further used to notify and/or challenge/augment supervisors in a potential hierarchical manner on the attempts and/or further whether to allow and/or deny access; the notifications may comprise composite semantics and/or allow/deny and/or similar semantics based on whether the access is allowed and/or denied and/or further based on (endpoint) inferred semantics, attributes and/or semantic identities. It is to be understood that the supervisors (hierarchy) may supervise the attendant, the endpoints, particular (banking) semantic areas (e.g. borrowing, cash, money orders), particular accounts, records, semantic groups and/or combinations. In further examples, the semantic times/intervals may be based on particular inferred affirmative/non-affirmative interactions and/or gestures of/between the attendant and/or customer (e.g. the affirmativeness/non-affirmativeness is factorized in access control artifacts and/or indicators).

The (attendant) access control as exemplified, may be applied in a variety of environments including banking, retail, wireless/wired operator and/or any other services.

The customer information may be accessed by the attendant in a variety of ways. In some examples, the attendant searches for the account by specifying and/or applying at least one filter and/or search key encompassing at least one of the customer first/middle/last name, date of birth, identification document id and/or any other information capable of identifying at least partially the customer and/or its account. In other examples, a customer credential and/or identification (e.g. driver license, (mobile) (device) wallet/id data via RFID/NFC/wireless etc.) is read and/or automatically entered and/or applied as a filter and/or search key. Once, the filter and/or search key (s) is applied the application may display a text, link, button, field and/or other user interface controls which enable the attendant to access and/or further display the customer information (e.g. once clicked, opened (via voice/input device/shortcut/keystroke/hotkey) etc.). It is to be understood that in some embodiments, if the access to the customer account is determined to be denied, no text, link, button, field and/or other user interface control related with the customer account are displayed; as such, the attendant has no entry point for accessing the customer account information. Alternatively, or in addition, the attendant may be allowed to access the customer information based on the determined access control. In some examples, the system determines not to allow the access once the link/control is clicked but instead a deny (or block) message is generated and/or used as a challenge (to a supervisor (hierarchy) which may confirm/acknowledge the blocking or revert the blocking and allow access). In further embodiments, the attendant is allowed to view and/or access only particular information on the customer account while other information may be hidden, masked and/or not displayed; further, the information viewing/views and/or access (on the customer/account related data) may be based on particular user interface controls and/or related flux viewing/views and/or further access such as explained throughout the application.

As mentioned, the customer account information may be accessed based on a case/ticket/order assigned to the attendant. As such, the attendant may be able to visualize customer account information based on access rights which are either specified in the case/ticket/order and/or based on (semantically) matching the themes, ui field data, labels, goals and/or interests in the case/ticket/order with the access control assigned to the customer information and/or the displaying user interface controls and/or fluxes. In further examples, the case number and/or attendant identification is/are stored (as a token/cookie/session) (e.g. in HTTP requests etc.) and/or used to gain access (e.g. by factorization, matching etc.) to various links, customer information and/or user interface controls; as such, while the attendant is searching and/or accessing the customer account information, the information displaying and/or access is allowed/denied as per the case/ticket/order access control. In further examples, the attendant may be asked for a case/ticket/order token and/or identification while searching and/or accessing the customer account links.

The case/ticket/order access control may be based on a case/ticket/order hierarchy (e.g. child and/or lower level cases/tickets/orders have more restricted/precise access control within a parent and/or higher level case/ticket/order rights).

Alternatively, or in addition, to case/ticket/order access control the system may factorize, match and/or apply the attendant and/or customer assigned/determined access control which may be based on access profiles, hierarchies, groups, rules, sensing and/or other access control practices such as explained in this application.

The case/ticket/order may be assigned at least one supervisor in a hierarchical manner. The attendant may be one of the assigned supervisors. The information and/or messaging within the supervisor hierarchy may be diffused and/or displayed as per associated (hierarchical) access control and/or gating.

While displaying and/or accessing case/ticket/order and/or customer information the system may factorize, match and/or apply the access control (e.g. to information, ui controls, flux etc.) based on one or more hierarchies including case/ticket/order, supervisor/attendant and/or customer.

The access control may be based on interests specified by the customer. In an example, the customer specifies that it wants to withdraw 5K from the checking account and thus, the system allows access of the attendant only to the customer's checking account information and/or controls while blocking or hiding other accounts information.

In examples, affirmativeness/non-affirmativeness is factorized in ALLOW/(DENY/BLOCK/DISSALOW/NOT ALLOWED), AUTHORIZED/(UNAUTHORIZED/NOT AUTHORIZED), YES/NO, ON/OFF and/or further (associated) indicator (s)/semantic (s) (including stored variable (s)) which indicate access (value (s)).

As explained throughout the application the attendant may be allowed access to the device (e.g. computer, terminal, tablet etc.) accessing the cloud application and/or to the cloud application itself based on endpoint presence, authentication and/or further supervisory rules. The access may be allowed/denied based on the factorized interactions, access indicators/semantics and/or further challenges and/or feedback to/from a supervisor. In some examples, the access indicators/semantics have factorization intervals which are associated with challenging the supervisors for feedback (e.g. due to superposition between allow/deny and/or similar access indicators/semantics, due to denied attempts etc.); as such, the system may challenge the supervisor to further provide feedback on whether to allow or deny access.

In one version, a camera is coupled with a cloud computing system having a memory storing factorization rules, location based endpoints, and supervisor identifiers associated with the location based endpoints. Programming instructions in a computer memory at the cloud computing system cause the computing system to determine that the customer and attendant are at a first endpoint among the plurality of endpoints, based on inputs from the camera. The determination may be made, for example, in accordance with the techniques described in this specification, and may occur at the camera, at the endpoint computer, or at the cloud platform. The endpoints are associated with a computer allowing access to the cloud application, and are associated with supervisors who are identified by the stored supervisor identifiers. Preferably, the system determines a particular interaction between the attendant and the customer at the endpoint, based on inputs from the camera. The cloud computing platform factorizes the interaction based on a factorization rule and an access indicator/semantic based on the determination that the customer and attendant are at the first endpoint, and either permits access or denies access to the customer account. The denial of access is based on a determination that the factor of the access indicator/semantic indicates access must be denied, and may include forming a message comprising a denial of access semantic and sending it to the supervisor and/or associated circumstantial hierarchy. The permission of access may be based on the factor of access indicator/semantic that indicates access must be permitted.

Figure 46A:
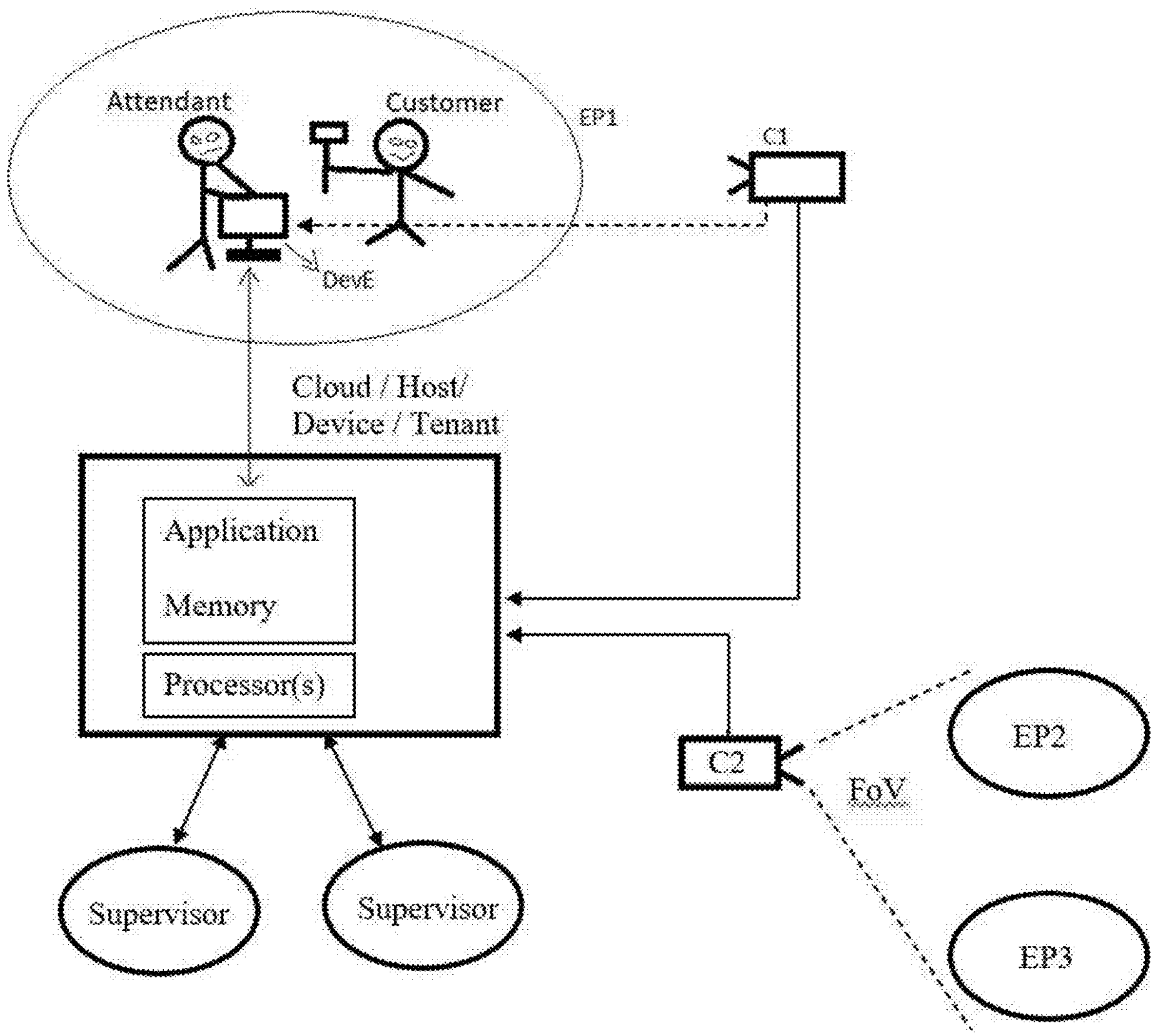
FIG. 46A is a block diagram of a preferred account access control system.

In an example, in FIG. 46A, the customer may be detected at endpoint EP1 and further, the system may interpret the vision sensor (e.g. (of) camera C1) inputs and map them to identification, posture, gestures, grimace, expressions and/or holding of artifacts and thus, factorizing them into access control. As also seen in FIG. 46A, additional vision sensors (e.g. C2) may be included, and each vision sensor may have a field of view (FoV) that includes one or more endpoints, such as EP2 and EP3, which are indicated as being within the field of view of sensor C2. In some examples, the customer holds and/or presents an identification; the system may check the identification and/or observe (postures, gestures, grimaces of) the attendant verifying the identification and factorizes such observations into access control; in other examples, the system detects via a voice sensor and/or microphone the customer (account) identification (e.g. via voice identification and/or via spoken name, identifier, account number etc.). Further, it may determine that the customer permits the attendant access to the account (e.g. attendant: "do I have permission to access your account mister Doe", customer: "yes, only for this 5K withdrawal") and thus, the access is allowed to the application (interface) running on the device DevE and/or account only for a particular transaction, semantic time and/or endpoint presence.

The system may control access to device DevE (which may be a computer, terminal, tablet, mobile device etc.), application and/or particular customer accounts. As such, it may operate an access control module and/or application on the device DevE. In some examples, the access control is embedded into the/a (web) browser (application) (plug-in) and/or client application running on the device DevE.

The device/computer DevE may host a thin (e.g. a web browser accessing the cloud/server application via HTTP, HTML and/or URLs) and/or thick (e.g. runnable client application) client for accessing the cloud hosted/server application. Further, DevE may host the cloud (web) container, application server and/or server (part of the application).

In some examples, the DevE hosts the client, browser and/or interface to/of the application which may be (further) hosted (e.g. a server part) on another computer, host and/or cloud.

In other examples, the client and the server part may be hosted on the same machine/computer/device; as such, the cloud server part runs and/or operates within at least one (web) server container and/or service which may be accessible via a web browser (e.g. via HTTP and HTML) and/or a runnable application (e.g. executable, interpreted/runnable module etc.).

Figure 46B:
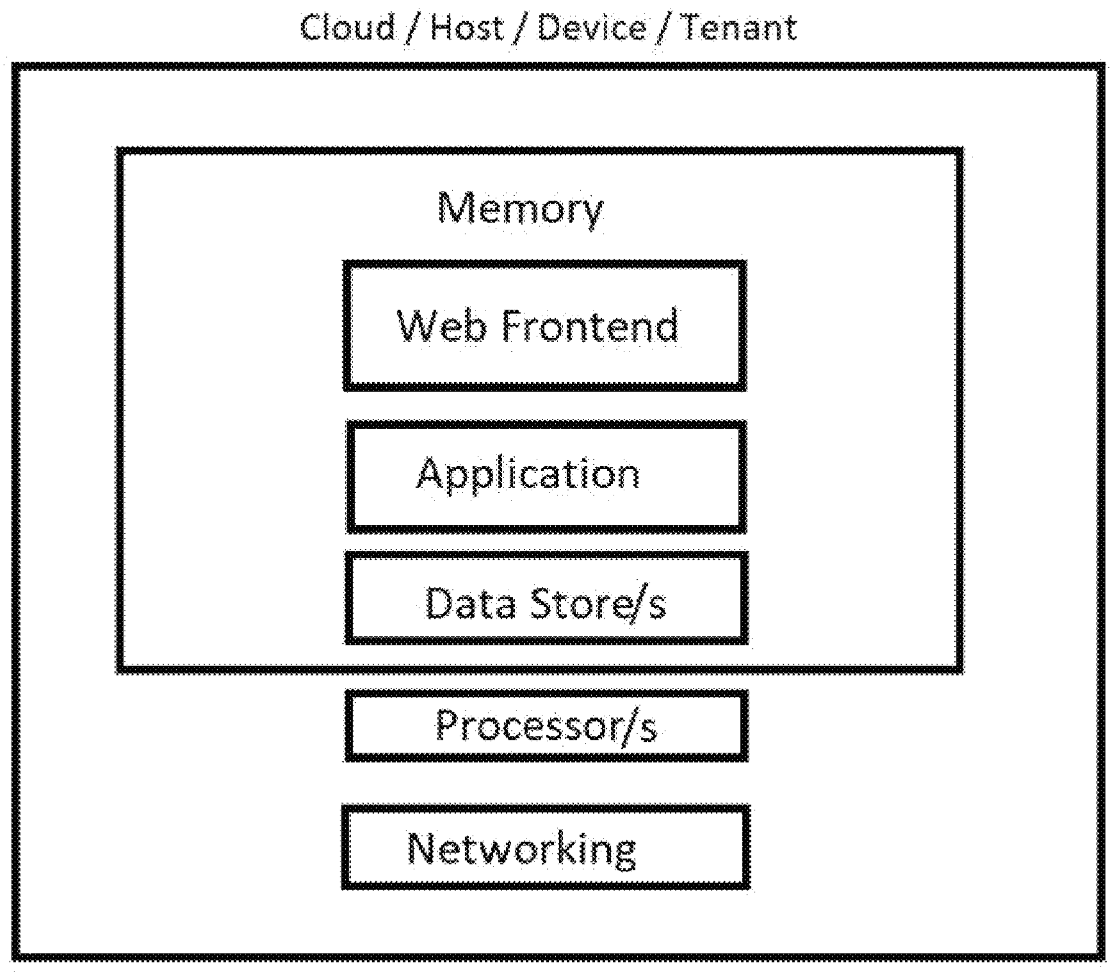
FIG. 46B is a block diagram of a preferred cloud computing system for use with the preferred account access control system.

In some examples, such in FIG. 46B the host tenant and/or device comprises a web frontend for servicing requests to/from the application and/or a user (e.g. attendant). The web frontend may comprise a web server, container and/or a client/server. Alternatively, or in addition, in some embodiments, the web front end encompasses a web thin client such as a web browser allowing the application to run on the device DevE. In other embodiments, the web frontend may be missing altogether and the host may host the thick client and/or the server of the application (e.g. running as a service, executable, runnable etc.).

While in the depicted examples, various host (device) components have been represented it is to be understood that those components may be either physical and/or virtualized and/or further distributed between one or more physical and/or virtual hosts (devices). Further, in some examples, the cloud comprises a plurality of hosts whether physical and/or virtualized.

DevE may be a physical and/or a virtualized host/device and/or comprise physical and/or virtualized modules/components/hosts/devices.

The access control may comprise accessing device DevE, the client/web application/interface, logging in into the application/interface and/or particular customers accounts.

Alternatively, or in addition, the access control module and/or application is embedded and/or is operated into the cloud host as a part of the hosted application and/or as a separate module/application. Thus, the access to the application interface and/or customer account is controlled/allowed/denied onto the cloud application host and/or server before or while the attendant may try to connect.

In some examples, DevE may comprise and/or be associated with multiple (input/entry/IN capable) devices, orientations, links and/or modules such as in the case of a computer/tablet/mobile device (comprising a touch display, keyboard, mouse, microphone, voice assistant etc.) and the system may control access individually, groups thereof and/or overall (potentially, based on their associated capabilities and/or semantics). It is to be understood that in similar ways, in other embodiments, the system may control access to output/OUT capable devices. In some embodiments, C1 might be embedded into DevE and/or be further associated with an input/output device/component/module.

It is to be understood that the vision sensor inputs may be transmitted and/or interpreted at the device DevE (as indicated in FIG. 46A by the dashed line connecting vision sensor C1 and the device DevE within EP1), cloud host and/or other device (e.g. at the camera C1, at a premise device, at an endpoint device, cloud device/tenant etc.) and/or may be fluxed/streamed between such devices. Thus, the system is able to determine the access control factorizations and/or activities at various devices within the distributed architecture.

In other examples, the system determines that the customer holds a weapon, hammer or other tools and use them in a non-affirmative manner to threat the attendant and thus, may block access to the application and/or accounts and/or further augment a supervisor on the threat. Further, in order to discourage the assailant, the system may perform augmentation and/or broadcast (voice) messages (at the endpoint) mentioning the blocked status of the accounts; further, it may apply additional counter measures.

The system may restore access to the application and/or accounts based on safety inferences wherein there is no threat against the attendant. Further, supervisors in a hierarchical manner may be allowed to restore access if there is no threat inferred against them.

The threats may be inferred based on sensing and/or localization. In some examples, the system infers that the customer speaks and/or behaves in a way which is hostile, offensive, non-affirmatively resonant and/or creates (diffusible) hazards at an endpoint and/or further hierarchy. As such, the system may infer that allowing (or blocking) access to particular account (s) information is non-affirmatively (or affirmatively) resonant while the customer (created) hazard is present and/or diffusible through an access path to particular account (s) (information), connected endpoints and/or associated artifacts. It is to be understood that while in the examples, the access is blocked through denied access to devices, clients, logins, information (and/or associated endpoints), alternatively, or in addition, the system may block/gate/control the diffusion through links, fluxes and/or connections to/from the denied devices, clients, logins, information and/or (associated/connected) endpoints; alternatively, or in addition, the system may allow/gate/ control the diffusion through links, fluxes and/or connections to/from likeable (e.g. based on affirmatively factorizing a hazard, as per safety goals etc.) devices, clients, logins, information and/or (associated/connected) endpoints.

In similar ways with determining and/or applying access control to customer accounts the system may implement access control to (customer) (assigned/supervised) vaults, cabinets, drawers, shelves, secure containers, boxes, safe storage and/or other customer assigned assets and/or components requiring safe access. In some examples, a vault may contain multiple (secured) cabinets/drawers/boxes/storage and thus, the access control factorized and/or applied to the vault access may be inherited and/or factorized to the contained (secured) cabinets/drawers/boxes/storage accesses. More generally, access control factorized and/or applied to a container may be factorized and/or applied to contained artifacts and/or components in a hierarchical manner. It is to be understood that the vaults/cabinets/drawers/shelves/boxes and/or other containers/contained may be used in a variety of environments including but not limited to securing valuables, banking, data centers, credentials/keys, hazardous substances, healthcare, medicines, instruments, tools, personal items, posts, carts, vehicles etc.

While in some examples, the system may have the capability to enforce the access (e.g. through controlling a drawer's (published) latch/lock (active) (capability), electronic/software module etc.) in other examples, when such access control capability is lacking and/or is inactive, the system may determine that the opening/closing is affirmatively/non-affirmatively access factorized and thus, it may form, post, send and/or store messages to the supervisors comprising the accesses and/or breaches (when non-affirmatively factorized).

A capability of access enforcement is determined based on a variety of factors including the lock/latch electronic (module) activation/deactivation, electromagnet status and/or capability, battery status and/or capability, bolt (catcher) status and/or capability and/or other lock/latch inferred statuses and/or capabilities. In some examples, the system determines that the bolt catch is damaged and/or obturated (e.g. by plaster, by a cloth etc.) and/or is unable to hold the bolt if John tries to open the drawer. In other examples, the system determines that the battery may be drained by the time Jane (as a supervisor) arrives to access the drawer/box and thus, in case that there are no projected hazards and/or unlikeable accesses to the drawer/box, the system doesn't lock the drawer/box latch (until Jane arrives) unless a hazard and/or unlikeable access is sensed and/or determined.

As mentioned, a/an (container) unlocking and/or opening may be based on determining a (hand, gripper, finger and/or hook) holding (e.g. of a handle, edge, ledge, lock etc.), supporting and/or moving (e.g. of a hand, gripper, finger, hook, handle, (drawer) edge, lid, lock, groups thereof etc.) in particular directions (e.g. OUT of a factorized support artifact such as a drawer holder/edge, container lip/edge; in the unlock direction etc.) and/or further lack of dividing capability of the opened contained/container.

Further, the system may infer lack of (likeable) support, dissociation, moving and/or changing from a likeable to/towards a non-likeable support and/or container artifact (e.g. such as a drawer moving away and/or not supported from its intrinsic/non-entropic likeable holding edge and/or cabinet container, a gripped water bottle (case) moving out and/or not supported by its intrinsic/non-entropic likeable container drawer/pallet). Such inferences may be non-affirmatively access factorized and/or may be associated with unlikeable/unauthorized support, movements, burglaries, theft etc. In examples, the system detects that Jane's (hand) grasps, moves away and/or supports particular car keys/credentials from John's drawer; John may be indifferent or in superposition if Jane take possession and/or moves away with the DeLorean keys/credentials during particular semantic times but it may be unlikeable/likeable at other particular semantic times. Further, John may be indifferent if Jane takes possession of the beetle keys/credentials since they may be also under supervision of Jane and/or John doesn't have an interest in the beetle (at semantic times) unless the beetle has the check engine light on in the last three days which is entropic with a John's strategic/tactical goal (e.g. of keeping the beetle (running safe) and/or Jane safe, Jane picking up John from the baseball game etc.).

In similar ways with container unlocking and/or opening, the system may determine closing, locking and/or further storage of artifacts within containers. As such, the system may determine that hold/gripped/supported artifacts (e.g. such as a gripped water bottle etc.) is changing supports and/or/by moving IN within a container (e.g. such as a shelf) which may be further moving to/towards/in the closed and/or lock (e.g. by its latch/lock) position/endpoints/direction. It is to be understood that such inferences may be affirmatively/non-affirmatively access factorized (e.g. Jane doesn't like her bottle of water to be stored and/or locked in the drawer, John likes his DeLorean key/credential stored in a safe/inaccessible/hard accessible/locked place etc.); as such, the system may generate and/or store messages (which have significance and/or are fluent) on the access inferences to Jane/John as supervisors and/or goal holders.

The system may generate messages based on affirmative/non-affirmative, likeable/non-likeable and/or further access (indicators/semantics) factorizations.

The access control may be based on capabilities, statuses and/or semantic identities of containers and/or contained, their components and/or associated fluxes and/or user interface controls. Capabilities, statuses, semantic identities, fluxes and/or user interface controls are published and/or not published by a supervisor (for particular semantic groups).

We mentioned that the system may adjust and/or challenge for the snapshot/capture rate/frequency to be adjusted and/or for (distortion) agents be contained/diverted/gated in order to reduce distortion. This may reduce distortion associated with stroboscopic effect, flicker and/or other temporal light effects (TLEs) resulting from temporal light modulations. In some examples, the stroboscopic effect may account for distortion of posture, orientation and/or motion such as stillness (as exemplified) and/or high entropic posture/orientation/motion (e.g. wherein the motion orientation is reversed by the effect). In other examples, temporal light effects are caused by brightness phenomena at particular endpoints/links and/or further presence/passing at/through such endpoints/links with/at particular frequencies and/or semantic times.

The system may augment users with inferred support artifacts for likeable activities and/or projected affirmative narratives. In some examples, the system applies such inferences for recommendations and/or advertising.

In further examples, the system responds with a likeability of having requested activities by a user and/or associated device and/or profile performed at particular endpoints. In some examples, before responding with the inference of likeability the system may seek and/or challenges a supervisor for (a one/few click/touch) approval.

In an additional example, Jane likes to "listen/watch to audio/video on a device/tablet" "by the fireplace" "10 mins into the lunch break" and her mobile device comprising such semantic profile (preference) entries may connect, challenge and/or send to a system (endpoint) control device (flux) such preferences (and/or semantic profiles) comprising likeable activities, endpoints and/or semantic times; as such, the system may project the likeability of such activities and/or semantic times (at endpoints) and/or provide feedback and/or augment the user (e.g. with alternate/additional semantic times and/or activities—"OK"/"you may"->"when a patient is not around", "when the cat is not sitting on the fireplace" etc.) (via a flux and/or mobile device). It is to be observed that in some circumstances the system may determine the (preference) likeability by projecting more precise semantic times which may deem projections (of the preferences) as likeable and/or the/their semantic orientation with the goals less drifted (e.g. based on a goal of "don't stress out the patients or the (fireplace) cat" etc.).

Posts and/or carriers may lock and/or support (ensembles comprising) wearable artifacts such as containers, pots, hydrants, dispensers, muzzles and/or other recipients; as such, the wearable artifacts may benefit from posts' (infrastructure) capabilities (e.g. damping, deploying, charging, activity/goal entanglement etc.). In some examples, such wearable artifacts are connected through a semantic coupler.

The system secures, recharges, replenishes, leaks, sprays and/or dispenses (on) supported artifacts in order to support their (intrinsic) activities, likeability and/or well-being. Further, the system may wear one artifact over the other based on circumstances (e.g. wears a flower pot comprising a poinsettia when Jane is around, wears a tablet computer when John is around, wears a tablet computer displaying a poinsettia and/or or a poinsettia shaped tablet, cover and/or support when Does are around etc.). In some examples, S2P2 supplies and/or helps S2P3 with (wearing/locking/watering) a poinsettia (pot).

It is to be observed that the collapsible likeable inferences on Does composite observing view may comprise composite semantic identities comprising both "tablet" and "poinsettia"; the system may prefer one over the other based on further circumstances. In some examples, the system may select its preference based on available budgets and/or further goodwill projections (e.g. selects a tablet displaying the poinsettia when budgets are low and/or selects a poinsettia shaped support, cover and/or tablet when affirmative surprise and/or goodwill (at/from the target) are projected as (needing to) being/be (more) affirmative factorized/localized/oriented (from an observing view (towards another/another's)). In further examples, the system may bias the selection based on projected likeability towards an artifact and/or observing view—e.g. prefers poinsettia factorization when John prefers goodwill (from Does/Jane) and/or prefers a tablet when Jane prefers goodwill (from Does/John); when in superposition the system may collapse to a composite semantic identity (with goodwill from Does).

We mentioned that a consumer/user (e.g. Jane and/or S2P2, Does, provider/distributor/publisher DA, semantic identities, semantic groups etc.) has paid, is allowed and/or has credentials for accessing/manipulating/viewing/recording a (streamed) (television/radio/multimedia) (cable/wireless) channel/program/show/flux/stream at particular (semantic) times by a provider/distributor/publisher (e.g. provider/distributor/publisher DB). The television channel/program/show may be further recorded, streamed, gated and/or published by the channel's/program's/show's owner, producer, broadcaster, collaborators and/or (further) flux, device, site, server, cloud and/or stream. As such, the provider/distributor/publisher issues and/or publishes with the system the access rights and/or credentials allowing the user to access/view/observe and/or stream the program/show (at semantic times, from/to endpoints/links etc.). As the user accesses providers, producers, broadcasters, collaborators and/or other users flux, device, site, server and/or streams/recordings/sites for the program/show, the system may identify/authenticate the user and/or further, check and/or apply the user's (published) access rights and/or credentials and thus, allowing user access to the program/show as per access rights. Access rights may be based on further supervisory, ownership and/or indications; as such, because Jane is an owner/supervisor of S2P2 and/or a Doe during the program/show and/or further associated semantic times, Jane may have access to the program/show based on S2P2's and/or Does' credentials. Further, Jane may indicate that S2P2VisionModule/S2P2_Manipulator/S2P3 may have access to (parts of) the program/show based on her credentials, budgets and/or credits. It is to be understood that in similar ways the system may ensure access to/between service consumer's (published) interests (endpoints/links) and/or provider's (published) capabilities (endpoints/links). It is to be observed that the access rights may be hierarchical; also, as previously explained, a provider may be a consumer of other's services and, further, a consumer may be a service provider for others.

We mentioned that distributors, providers, consumers and/or (associated) devices may publish (users') (privacy, advertising, sensing, observing, combinations etc.) semantic profiles, preferences, access rights and/or further semantic artifacts with the system. As such, the system may broker/gate (access and/or preferences to) transactions, profiles, privacy, blurring and/or further information. Gating and/or access rights may be based on further supervisory, ownership, group and/or indications. Collaborators may access (at semantic times) the published/gated information to ensure personalized access and/or preferences to records, transactions, payments, budgets, venues, vehicles, streams, fluxes, posts, sensors, endpoints, links and/or (other) (recorded) items/artifacts/objects (based on semantic times).

The system may broker and/or couple services (providers) to event venues, households and/or other facilities. In some examples, such services may be emergency services, utility services, recycle services etc.

Flow agents may comprise assets and/or further supervisors. In some examples, such assets may be deemed as leaders and/or supervisors at endpoints/links for particular asset types and/or inferred semantic identities.

We mentioned that the system may couple published/associated/supervised/owned interests and/or assets by service consumers with published/associated/supervised/owned services, capabilities and/or assets by service providers. In some examples, the coupling may be based on semantic coupling (comprising semantic resonance inferences/grouping/entanglement).

The interests may be associated with disposing and/or recycling of items, articles, by-products, liquids, hazards and/or further artifacts.

The system may use utility indicator factorization for determining disposable artifacts (e.g. dispose when projected utility is non-affirmative factorized). Alternatively, or in addition, the system may infer disposable artifacts and/or budgets based on projected leakage/loss which may not determine non-affirmative factorizations or distortion on affirmative leadership activities/goals. Disposable artifacts and/or budgets may be leaked (or disposed/spent) for affirmative factorizations and/or goodwill.

The published (service) interests and/or services may be associated with endpoints supervised and/or owned by the (interested) publishing party. In some examples, the interests may be associated with clauses and/or further protocols (e.g. for access, handling, handover, payment, noise, disturbances, hazard, cleanliness—e.g. such as debris, by-products and/or hazard production/presence/handling at semantic times etc.).

The interests may comprise (published/broadcasted) activities, indications and/or (associated) semantic identities (e.g. brake fluid bottle, recycle (those) items etc.); further, based on the (published/broadcasted) indications and/or (associated) semantic identities the system may determine the activity and/or coupling (e.g. brake fluid bottle requires recycling and/or coupling with a recycle service provider).

The system may learn affirmative and/or preferred semantic times for (recycling) activities of providers and/or consumers. Further, the system may augment the providers and/or consumers about affirmative and/or likeable semantic times for activities.

The system infers item deterioration and/or further (hazardous) leakages and/or by-products based on detected (hazardous) gains. orientations and/or change in an undesired semantic identity (e.g. of unwanted hazards and/or growths which may expand in time such as "recycling bottle has gained and/or grown rust"->"rusted recycling bottle") and/or by loses (e.g. of leadership components, parts etc. such as "recycling bottle has lost its cap", ("bottle is broken")->"recycling bottle has lost hazardous product/by-product protection/divider capability")->"bottle cannot protect my supervised endpoint/property/me, is hazardous (and not likeable)"->"damaged recycling bottle (in a particular observing view)").

The non-likeable and/or non-affirmative (projection) inferences may be based on the (high entropy with/of the) (activities) interests, goals and/or capabilities of the artifacts localized at endpoints. In some examples, the goals and/or interests may comprise preserving a likeable, affirmative (e.g. non-hazardous, safe) posture at endpoints and/or within semantic times. The posture may be intrinsic affirmative and/or safe (e.g. non-leaking/spilling bottle, bottle up; (90%) lawn clean of hazardous fluids) and/or may be comprised in intrinsic goals (e.g. keep the yard clean of dangerous fluids; (90%) don't allow (leaks of) dangerous fluids for/on the lawn; keep the brake fluid bottle in a (likeable) safe position; bottle uncorked, bottle 40% full; keep the bottle at least 60% up etc.). In further examples, the system may not like and/or be non-affirmative with an activity (e.g. by a non-informed person, by a less capable braking post) (at semantic times) of moving towards and/or around the brake fluid bottle (endpoints) due to projections of non-affirmativeness related with potential factorized hazards (e.g. spilling/leaking the brake fluid (bottle)) (at endpoints and/or semantic times).

A user may specify endpoints/links for at least one activity (at semantic times) and further publish and/or challenge collaborators. The collaborators may rate, subscribe and/or accept the activity (at semantic times) and/or further project for (meeting) the activity, semantic times and/or associated endpoints/links. In further examples, the collaborators may negotiate the activity, sematic times and/or endpoints/links.

The system may integrate multiple devices and so, the user may indicate via user interfaces and/or pointing the designation (and/or activities) of/for items and/or endpoints (activities). A collaborator provider publishes capabilities via a semantic flux for example; alternatively, or in addition, the provider publishes such capabilities on web sites, pages, UI controls, servers, via push notifications and the system may ingest those (e.g. via processing the html, texts, requests etc.) and/or refreshes those at semantic times; further, such capabilities may be processed by a provider computer and/or unit and/or by the systems' cloud computer and/or unit and/or coupled/published as/by a semantic flux.

The user is indicating that an endpoint has a designation (e.g. dispose, recycle) and thus, as the system monitors the endpoint and brokers the designated activity (e.g. dispose, recycle). As such, it acts as a broker between the user need/preferences and a provider of the designated activity. In some examples, the system selects the provider based on semantic drift inferences between published capabilities (comprising budgets) and/or inferred semantics related to items and/or further published interests. The system may collect, compose, streams and/or sends to the provider data about the items (e.g. semantic identity, picture, video, size, weight, protocols/clauses, location etc.) and/or further preferrable semantic times and/or budgets.

In examples, a user (e.g. a Doe member) have to indicate that an endpoint (e.g. in the Does house backyard) is for a particular activity (e.g. disposing, recycling) and potential preferences/protocols for that location and/or for the indicated and/or assigned activity. The (cloud) system may already know other user preferences (e.g. of Does) and/or protocols from other sources (e.g. indicated at times by a user and stored in the semantic cloud; rules and/or protocols for the particular facility, owner, supervisor, county, circumscription etc. for pursuing the activity and/or handling the items, the by-products and/or further related activities etc.). As sensing and/or flux information at the activity (e.g. dispose, recycle) endpoint detects and/or infers items subjected to the activity, the cloud system acting as a broker performs an affirmative resonance and/or likeable grouping and/or matching between providers (which publish capabilities (at endpoints/links) on the semantic cloud via a semantic flux) and the endpoint (based on the activity and/or protocols) so such they can be directed and allowed to pursue the activity based on the most affirmative resonant assets, semantic times and/or budgets. As such, the brokerage may challenge a provider to direct a particular asset to the endpoint and/or, potentially based on an affirmative response and/or (contractual clause) handover, establishes an ad-hoc semantic coupling with the asset (e.g. potentially through the provider's semantic flux with the asset; or, a different flux established based on credentials) for (primary/secondary leadership) supervising activities. Once the asset activity at the endpoint is finished, the brokerage may cease and/or hand over the asset control and/or supervision. It is to be understood that in some examples, the brokerage may maintain supervision and/or flux with the asset between multiple endpoints encompassed in the activity (e.g. from Does house pick-up endpoint to a recycle provider drop-off endpoint). Further, once at a divider (e.g. house/door/gate/lock) of an activity endpoint and/or an encompassing/overlapping endpoint the asset may be authenticated and/or allowed at the activity endpoint; further, the brokerage may couple and/or communicate with a Does' house/door/gate/lock control system and/or flux in order to control and/or inform on the access and/or presence of the asset to the activity endpoint.

In further examples, the system monitors the disposable/recycle endpoints at the Does house and detects the brake fluid bottle and thus, fluxes/streams to the preferable provider video artifacts showing the bottle with overlayed and/or accompanying information regarding the (preferable/affirmative) activity, location, (asset) capability, semantic identity, semantic times and/or further data. Once the system infers attempts/tries by a provider's asset to access the endpoint and/or manipulate the bottle, the system may further augment (e.g. by fluxes/streams (video) data/signals) the endpoint/asset supervisors and/or owners (e.g. Does/house/provider controller, S2P2, Jane's phone, S2P3 etc.) in a potential hierarchical manner and/or store (relevant) snippets. In some examples, the system detects, knows and/or has the (indicated) (disposable/recyclable) brake fluid bottle (at a current and/or designated endpoint) and thus, it may augment, route and/or guide the asset (and/or its supervisor) to the item's location and/or (designated) endpoint within Does property and further, out of the Does property (once successfully/unsuccessfully bonded).

A consumer, provider and/or further asset may be selected in order to accommodate the likeability, potentially on entangled groups comprising consumer, provider, asset, servicing endpoints and/or the brokerage. In examples, the system (acting as a broker) may determine a semantic time for sending the provider or its asset to service based on the asset, the provider or the cargo semantic attributes which may be associated with restrictions (e.g. access control rules, routes for noise, pollution or size etc.), consumer preferences (e.g. the user (John) wants to be at home and not working etc.), provider capabilities and/or self (e.g. budgets for energy, time, leakages should be likeable/preferred etc.). The system may further determine likeable protocols and clauses linking the parties and/or further activities.

The asset may have an onboard computer/controller/unit/memory which communicate by at least one flux with the provider and potentially by another flux with the broker. In some examples, the broker flux couples, supervises, comprises, is comprised and/or composes with/in the provider's and/or consumer's flux.

The provider may supervise its assets, but at times, the brokerage may also supervise and/or direct those assets (based on a permission from the provider or a contractual clause). An asset semantic unit may solve confusion caused by broker's, provider's and/or consumer's connected and/or coupled fluxes.

In further examples, John wants to recycle 30 oz brake fluid and thus, indicates, moves and/or manipulates the brake fluid containers to the recycle designated endpoint. Once at the designated endpoint, the system determines and/or considers the recycling items to a recycling activity and/or schedule. The schedule may be determined based on the non-likeable/non-affirmative (e.g. hazards) diffusion by the items and/or endpoint determined by bonds, leaks, interactions and/or diffusions (e.g. to circling around items). Further, it may be determined by consumer indications and/or preferences (e.g. Jane doesn't like to see brake fluid bottles in the backyard and/or doesn't like the recycle endpoint and/or backyard to look unsightly). Even further, it may be based on the availability of space such as the recycle endpoint is too crowded and/or (thus) unsightly. The items may be moved, manipulated and/or positioned at designated and/or meeting endpoints based on semantic times (e.g. S2P2 moves the brake fluid bottle to the designated pick-up endpoint 5 mins before the recycling provider asset arrives, S2P10 manipulates the Does recycle bin to the garbage disposal designated pickup endpoints/containers/bins of a semantic group (e.g. block 100, $112^{nd}$ street), agent asset etc.).

Recycle provider A has (published) capabilities such as "recycle activity in/for Doe's area on Tuesday; and/or, for $10 each 20 gallon brake fluid every other day with a Chevy with a lift kit and 80 db noise levels and/or for $5 each 10 oz brake fluid with a DeLorean with a lift kit and 75 db noise levels with a minimum order $10.". The system may factorize that John prefers a DeLorean with a lift kit semantic identity and/or a lower exterior noise vehicle even if is more expensive. The system requests the provider A to send the DeLorean to pick up the brake fluid when John is at home and is not blocked from observing and/or interacting with the DeLorean (e.g. on Wednesday after 6 PM when is out of work meetings); as the DeLorean approaches, the system may allow and/or augment John on the (projected) presence of the recycle capable DeLorean with a lift kit and/or provider's A recycle vehicle and/or (further) directs it and/or allow/unlock the access to the recycle endpoint. The preferences may be factorized based on budgets and/or semantic times; in further examples, the provider indicates, challenges and/or negotiate that the Chevy with a lift kit can complete the recycle activity in 5 mins while the DeLorean can complete it in 15 mins (during rainy days or winter) and as such, John prefers the Chevy with a lift kit (during rainy days or winter).

It is to be observed that the capabilities matching may be based on the level of expertise of the asset in handling the (recycled) interest at the particular endpoint. As such, the system may prefer a vehicle with a lift kit because can expertly handle the rough terrain to the recycle endpoint; further, the system may prefer a vehicle able and/or comprising capabilities to expertly manipulate and/or store the targeted recycled items at the endpoint.

In similar ways with provider's capabilities a consumer may publish interests. As such, the interests may comprise budgets, preferable/likeable/affirmative semantics (e.g. of assets, providers, behaviors etc.) and/or semantic times; further, the budgets may comprise semantic times (comprising past/current/projected activities). The system matches (or groups/entangles) interests and capabilities based on semantic resonance and/or further inferences. Further, the system uses (hierarchical) trilateral (comprising at a higher level consumer, producer, broker/system) inferences to match the interests with the capabilities.

In further examples, the system may compose (e.g. with fairings, wearables etc.) carrier assets to look like a beetle and/or DeLorean (from resonant observing views) as it projects better Doe's house endpoint likeability and/or affirmative resonance at semantic times and/or semantic identities (e.g. Jane/John present, the house with Jane/John etc.).

The system may apply restrictions and/or protocols when coupling. As such, the system may apply localized restrictions (e.g. environmental, distance, time, speed and/or other budgets). A protocol is described based on routes/rules. A protocol is followed if the system infers the semantics as per protocol's routes/rules which may include timing or budgets intervals. In an example, a protocol requires that in order to be allowed inside John's recycle endpoint, (as per access control rules), a DeLorean with lift kit should follow a semantic route of being cleaned and/or sanitized. Further, the vehicle needs to horn 3 times for 1 sec and 1 time till gate starts opening in order to be identified and allowed access. A contract (e.g. with Does for (particular) disposables/recyclables) may comprise a multiplicity of such clauses which may be evaluated separately and/or combined.

The system may couple consumers, providers and/or associated assets based on (ad-hoc) semantic coupling and/or further communication establishment techniques (e.g. such as explained throughout the application).

Brokering and/or gating may be applied to (financial) transactions whether transfers and/or payments. In some examples, transfers and/or payments may be mobile, online, sensed and/or inferred. The system applies and/or brokers access authorization based on analysis of speech, narrative and/or further observing views.

The system may project that a capability, semantic identity and/or (associated) narratives depletes affirmative budgets and thus, it doesn't buy it. Analogously, the system may not publish capabilities and/or invalidate a capability publishing which projects low income and/or depletes affirmative budgets.

We mentioned that the system may couple transaction identification at particular endpoints with further sensing and/or presence. In a previous example, in a financial institution environment, transactions may be audited and/or allowed/disallowed based on presence, interactions and/or further inferences at endpoints. It is to be understood that such inferences may be based on multiple modalities such as vision, sound etc.; in examples, the system may infer that a customer indication/request is and/or requires an activity and/or access to (particular) fluxes, streams, semantic views, observing views and/or semantic areas/groups of an account information by the institution, attendant and/or supervisors.

The system identifies, selects and/or applies semantic profiles based on composed semantic identities and/or further augmentation and/or inferences. In examples, a user has a recycle service profile, a video profile and/or a combination. As such, the system may apply the profiles based on circumstances (e.g. applies both recycle service and video for recycle service monitoring and/or applies a composite profile (e.g. for recycling and video; as inferred based on the type of service provider etc.). When confused, the system may apply confusion reduction. Analogously, the system may apply access control rules and/or further (generate) breach (attempt) notifications.

Further, the system may detect and/or enforce access based on possession and/or ownership and/or further semantic groups. In some examples, the system detects that Does (group) owns/supervises/comprises S2P2 and/or DeLorean and thus, it doesn't infer (and/or notify on) breach of access when moved and/or manipulated by Does group members; further, it allows Does to start, move and/or manipulate S2P2 and/or DeLorean.

The system may infer breach of pallets, packaging, enclosures and/or further containers when their dividers, fairings and/or diffusion gating capabilities is non-affirmatively altered (e.g. by being unable to control diffusion and/or access) and/or their content accessed in a non-resonant and/or non-affirmative manner outside affirmative and/or allowable endpoints, links, authorizations and/or semantic times. In some examples, the system may infer that dividers and/or (polycarbonate) fairings/walls comprised in an enclosure is broken (or pierced or similar), vandalized and/or unmounted and thus, a breach is inferred which further generates notifications to owners and/or supervisors (of breached pallet/enclosure and/or breach endpoint).

The system may infer vandalism against (and/or hostile to) containers when detecting hostility against their components and (attempts/tries of) breaking/accessing the contained (e.g. modules, components, fairings, enclosures etc.) in a non-affirmative manner. As such, the system may compose hostile and/or breaking inferences to infer vandalism at/of containers and/or further vandalism towards/against containers by the hostile artifacts. The system may determine failed (breaching) attempts/tries when the particular (breaching) activities (of breaking/accessing) are not completed within a semantic time and/or budget.

In other examples, in similar ways, the system may infer breach (semantics) for areas, locations and/or further endpoints which may be separated, connected and/or linked by dividers. Further, non-affirmative accesses, interactions and/or inferences on/with an object and/or divider at an endpoint may determine the system to infer (attempts of) breaches. In an example, the system infers a breach due to sensed attempts of moving the yellow DeLorean through a divider to a blocked endpoint; further, the system may infer the breach based on a high entropic inference in rapport with the intrinsic and/or projected presence (e.g. based on semantic time) of the DeLorean at one side of the divider and/or endpoint.

Similarly, the system may infer attempts/tries to augment (sporting) events, venues, fluxes, streams, broadcasts and/or participants. The system may infer failed/successful (scoring) loss/gains in an adversarial game based on the orientation and attempts to breach/defend a diffused endzone and/or a goal (divider) anchored to the endzone and/or goal (line). It is to be observed that the inference associated with the adversarial inferences (of the game) may determine causal and/or entangled gain/loss between parties. The system may not pursue (self) adversarial goals such as causing entangled gain/loss with another party.

The system may determine an activity attempt when the activity is started and not completed within a semantic time and/or budget. When failure is non-affirmative the system may augment, instruct and/or act (e.g. control) for completion of (projected) failed attempts/tries.

We mentioned that the system may be under pressure and be factorized accordingly when the (projected) augmentation determine high consequences to itself and/or resonant collaborators and/or budgets are tight. In some examples, the budgets for performing an activity in a preferred and/or non-hazardous posture are tight and/or insufficient for completing the activity in the preferred posture; as such, a highly entropic change in posture is projected before the activity is completed.

In cases that a highly entropic posture projection does not affirmatively factorize at least one subset of leadership goals and/or budgets (within a (projected) semantic time) then the system may disable and/or invalidate the associated goals (for/within a/the semantic time).

In further examples, the change of posture from preferred to a highly entropic and/or non/less-preferred may be determined by foes, further hostile behaviors and/or breaches/intrusion at/against an object, item and/or (associated) endpoints/links; further, the hostile behaviors may be associated with postures, traction and/or support (at/of breached artifacts).

In order to relieve pressure and/or defend against breaches the system may apply counter measures, block/harden the diffusion of foes and/or hostility through applying, hardening and/or forming defensive and/or offensive postures/bonds/dividers/couplers and/or further, allow/soften diffusion to other areas which project affirmative decreased pressure.

A carrier agent may leak and/or diffuse bonded artifacts (at endpoints). A leak is diffused from/to the carrier agent and may be controlled based on various diffusion techniques such as explained throughout the application.

The system may control diffusion and/or coupling at breaches by diffusing, leaking, bonding and/or collapsing (agents). In some examples, the system routes, diffuses and/or applies agents which bond and/or entangle around the breaches and/or affirmatively factorize/collapse the breach to/as a divider/coupler and/or gate. It is to be understood that the (bond/diffused) agents may diffuse and/or travel by being bonded/entangled with other (carrier/bond/diffused) agents and/or further being leaked/diffused and bond at the breach endpoints. The flow, bonding and/or leaking/diffusing by agents may be hierarchical (e.g. bond/diffused agent A leaks/diffuses bonded/diffused agent B which further leaks/diffuses and/or bonds with C etc.).

The system may project divider and/or coupler capabilities at endpoints, links and/or further composed semantic identities. In some examples, those may be based on semantic times.

Agents may be diffused and/or leaked at endpoints based on further projected bonding at the endpoints. The system may project activities, postures, diffusions, leakages and/or targets which determine particular (e.g. hazardous, affirmative/non-affirmative etc.) consequences, indicators and/or factorizations for self, collaborator, foe and/or groups when are pursued (by self and/or others) and/or not pursued at semantic times. The system may infer earlier/early and/or later/late semantic times when projecting and/or pursuing such inferences.

Agents may bond and/or leak within semantic groups which may be variable drifted and/or resonant in particular circumstances. The system may apply access control rules on agents and/or validate/invalidate agent credentials, activities and/or budgets based on a (projected) number of (resonant) groups bonded and/or leaked.

The system may allow agents access to various endpoints/links, and/or (further) bonding and/or activities based on (projection on) whether they are likeably and/or reasonably insured once accessing, bonding and/or performing the activities. Similarly, the system may allow bonding, entangling and/or grouping.

As mentioned, the system may project inferences by posing, behaving and/or presenting itself in a friend and/or foe posture and/or position.

In some examples, the system infers foes amongst those who block (projected) links, trajectories and/or transitions within semantic times; as such, the system projects and/or direct agents which may bond at/with foes and direct them to (borderline) affirmative resonant endpoints, links and/or orientations at sematic times. In further examples, the affirmative resonant endpoints, links and/or orientations are associated with dividers and/or semantic couplers which may isolate and/or damp the causal foe leaderships. In further examples, bonding may occur through a directed (information) agent on foe's comprised fluxes.

In other examples, intrinsic observing views are related to self. We mentioned, that depending on the orientation on which the robotic pallet moves the comprised orientation and/or further semantic identities of S9P1Forward and S9P1Backward may change; this may happen in the absence of anchor points (associated with referenced or intrinsic observing views) and/or intrinsic orientation. As such, the movement orientation may need always to be front/forward first and back/backward second. In case that there is an observing view and/or anchor the orientation semantics may be associated with "away", "closer" or similar; as such, the system determines the front/forward/back/backward by composing those with "away" and/or "closer" and determining which one induces less confusion in augmented parties and/or collaborators.

The system may apply top and/or bottom inferences; further, the system may associate such inferences with an upper limit (of an interval) as top and lower limit as bottom and/or further with best-case and/or worst-case inferences. Further, such inferences may be associated with expressing (best-case and/or worst-case) interval boundaries based on "too", "extremely", "excessive" etc.

Posts and/or carriers may drive a vehicle by sensing and/or actuating vehicle controls. In some examples, S2/S2P2 comprises and/or controls a detached control actuation component/box/post (e.g. S2P4) comprising rods, pods, levers, gears, sprockets, chains, tensioners, grips and/or further actuation/manipulation components which install, attach, link, grip and/or connect to the car's controls (e.g. clutch, brake, acceleration); further attachment and/or gripping may be used by the control actuation component to attach on the car's non-control components for stability purposes. It is to be understood that in similar ways, S2/S2P2/S2P4 may control and/or manipulate other car controls such as manual/automatic gearbox lever and/or steering. Alternatively, or in addition, the actuation components are worn and/or attached to a cushion which installs on (front/side of) the vehicle's seat.

Alternatively, or in addition to mechanical control, the system may connect (a component) to a car's bus, ECU/s and/or computer (e.g. via On-Board Diagnostics versioned interface a.k.a. OBD) for (additional) electronic and/or drive by wire control.

In further examples, the controls are manipulated through components, modules and/or wearables which are attached to locks/or grips and/or further actuated. In an example S2P2 has a module, wears and/or has locked a rotating component, sprocket, gear, tensioner and/or wheel actuated and/or rotated by an electrical motor. The rotating wheel may manipulate, engage and/or attach/connect to the steering wheel and/or steering column of the DeLorean through rails, grips, chains, belts, gears and/or arms and further control/rotates the steering through its rotation (and/or further entanglement) and/with attachment elements and/or endpoints/links.

In further examples, S2P2 comprises, locks on and/or wears cushion elements (e.g. S2P2C1, S2P2C2) and/or additions to a vehicle's seat; such elements may be secured by a seat belt, straps (which fastens around the seat) and/or by couplers (e.g. S2P2CP). In further examples, elements may inflate/deflate in order to position optimally on the seat (e.g. by filing the seat's shape and increasing the contact surface and/or for flattening the exposed wearable capable surface) and/or for better fastening (e.g. by increased pressure and/or further friction with/on seat and/or fastening elements).

The cushions may comprise inflatable pockets/inserts/surfaces, air pumps, valves, pressure sensors and/or vents for inflating/deflating and/or maintaining an affirmative pressure; while the air pumps may be preferably comprised in cushions, alternatively, or in addition, they may be comprised in other modules attached to a/the carrier. In addition, they may comprise pressure sensors. The cushion may be (adjusted) for pressure and/or under pressure onto the seat by further strapping (e.g. such as from (elastic) straps which may be guided through SBG and/or other grooves on the cushion) and/or by the wheel manipulator which may hold/push to/into the wheel and/or adjust the exerted reaction force towards the seat (e.g. by cushion inflation and/or wheel manipulator arm movement).

The cushions and/or modules may be attached to at least one carrier. As such, the cushions and/or modules may be inter-lockable through their carriers.

The cushion element may comprise and/or have attached channels/locks/hooks/grooves which allows S2P2 (and/or a wearable of S2P2—e.g. such a plate) to attach, strap and/or fasten to the seat via the cushion (backseat and/or base) and thus, ensuring support. In an example, cushion S2P2C1 is fastened/strapped on the backrest B of the seat S and S2P2 comprises, locks and/or wears cushion S2P2C1; in some examples, cushion S2P2C1 comprises locks/hooks/plates which allows secure fastening of S2P2. In some examples, S2P2/S2P2C1 has (locked) a wearable wheel manipulator WW which may (be) extend/ed, connect/ed and/or lock/ed onto the steering wheel; in some examples, WW connects/grips to the steering wheel via comprised multiple axis freedom arms such as L1-L2 which may include ball and socket and/or swiveling components which allows wheel's (rotational) manipulation at various angles and orientations. It is to be understood that the links L1-L2 may move rotationally, transversally and/or longitudinally based on circumstances. Those may include but not limited to account for steering wheel tilting—which may require extensions/retractions at various endpoints based on steering wheel and/or seat mapping —, seat/cushion movement and/or other circumstances.

Cushion/module/wearable S2P2C1 may comprise grooves/channels such as SBG allowing the seatbelt and/or other straps to secure the cushion onto the seat S; further, while the cushion S2P2C1 is attached to the backrest, further cushions such as S2P2C2/S2P2CP may be (also) attached to the seat base to control pedals, transmission (lever) and/or a steering column (e.g. via STC1). The cushions/modules/wearables may be attached by locks and/or hooks between them, and/or further to the seat and/or other vehicle components.

The (comprised/wearable/locked) (cushion) modules such as S2P2C1 may comprise the wheel manipulator WW which may extend via links/arms L1-L2 and grip/lock/surround the wheel via locks (e.g. LCK1-LCK4). The steering wheel may be locked directly by L1-L2 and/or be locked by a front-end WW-FE attached to L1-L2.

It is to be understood that the steering wheel and/or wheel manipulator components RAWW and/or WW-FE may be attached to L1-L2 via ball and socket components which allows the wheel rotational and/or swiveling manipulation. Further, the wheel manipulator WW may be (part of) a wearable component which locks onto S2P2/S2P2C1. The wheel manipulator WW, may comprise (just) a base RAWW which may be actuated to swivel and/or rotate (on multiple axis) and thus controlling the steering wheel via the attached links L1-L2 and/or WW-FE. It is to be understood that the wheel manipulator WW including its base RAWW may comprise motors for ensuring rotational and/or multiple axis of movement.

The cushion module S2P2C2 may comprise pedals manipulators PDM1-PDM2 which lock onto and/or press/depress/control pedals PD1-PD2 via attached locks (e.g. LCK1-LCK2) and/or pods. It is to be observed that the pedal manipulators may comprise swiveling and/or joint components such as PDSW1-PDSW4, pods and/or locks. In some examples, the pods may be locked to the pedals while in other examples they may not. The cushion module may comprise further pods such as POD1-POD2 which support the cushion on the vehicle flooring. Further, the cushion modules may comprise hooks such as H1 to hook and/or lock the manipulator under/onto the seat.

Further, the (cushion) modules may comprise links/arms such as transmission shifter manipulators (TSM) which may be connected to the shifter/s via (semantic) couplers such as TSM-SC.

Modules and/or wearables may comprise semantic couplers which allow connection and/or entanglement with third party components.

As mentioned, devices and/or components may publish capabilities maps which may be used with semantic (explanatory) coupling. In some examples, TSM-SC may advertise its capabilities based on mapped endpoints, links, orientations and/or further (semantic) times. In an example, the shifter coupler advertises endpoints, links, semantics, times and/or associated protocols for engaging enabling/forward/reverse/park/sport/manual, $1^{st}/2^{nd}/3^{rd}/4^{th}/5^{th}/6^{th}$/reverse etc. Further, it may publish intrinsic orientations and/or anchor points.

In an example, the protocol published with a semantic coupler and/or third-party component (e.g. for engaging/transitioning the reverse/(vehicle backup) (activity) (link) from neutral to endpoint 1) comprises "neutral push (30N (m)–70N (m)) (step index–5 N (m)/s (N (m) every sec)) (approximately 1") until blocks", "forward from neutral (30N (m)) (index 1% each 0.08") (max 70N (m)) (more than or 2"+) (to/towards endpoint 1) until blocks" etc. Alternatively, or in addition, schematics mapping endpoints and/or links to capabilities and/or activities may be published and further, comprising instructions, activities and/or protocols associated with the manipulation links and/or endpoints. The protocol orientations specification such as push/forward/backward may be relative to a (published) anchor point and/or orientation (e.g. intrinsic orientation of the vehicle, of the composed manipulator, of the steering wheel etc.). It is to be observed that "neutral" anchor and/or divider is associated with disengagement based on a superposition of forward and backward between activity targets and/or engagement endpoints (e.g. 1,2,3,4,5,6).

As exemplified, a composite manipulation (published/learned) protocol from the first gear to the second gear may comprise disengaging the $1^{st}$ gear by moving the shifter to neutral and further moving to and engaging the $2^{nd}$ gear from neutral. The system may learn that $1^{st}$, neutral and $2^{nd}$ may be collapsed on a (fluent) trajectory and/or composed/entangled activity (e.g. shifting from $1^{st}$ to $2^{nd}$) in which the orientation and manipulation parameters of/between (gear/engine/activity) engagements are similar and/or very little entropic (e.g. such as orientations from/to neutral, applied force/momentum, timing etc.).

Protocols may be implemented by the shifter manipulator and/or its semantic coupler as an entangled semantic group. In an example, the semantic coupler is comprised and/or advertises a third-party shifting component which comprise capabilities for physically manipulating the shifter and thus, the manipulating arm attached to the coupler and/or third-party component just communicates the protocol semantics without physical manipulation. Alternatively, or in addition, the semantic coupler advertises (mapped) models and/or protocols for manipulating the shifter by an external party such as the TSM and/or its manipulator/supervisor. As such, the shifter may be physically manipulated by the third-party shifting component, by TSM and/or by (an entanglement of) both based on the published coupling protocols and/or (mapped) models. The system may ingest manipulation interfaces protocols and/or mapped models from other external sources and/or fluxes etc. In some examples, it ingests operation manuals from a highly rated manufacturer and/or technical flux and/or site.

It is to be understood that, alternatively, or in addition, to the depicted examples, S2P2, its wearables and/or components may be attached to the vehicle controls through third party devices and/or (semantic) couplers and/or further semantic coupling and/or control.

In addition, the modules may comprise sockets (e.g. SCKT1-SCKT4) for charging, potentially via an USB, PoE and/or other power supply source port.

In some examples, the modules and/or cushions comprise additional (backup) batteries.

It is to be understood that S2P2C1, S2P2CP and S2P2C2 comprise sensors and/or actuators beyond the ones depicted.

Further, is it to be observed that S2P2C1, S2P2CP and S2P2C2 have redundant control capability as a semantic group (e.g. S2P2C1 and S2P2CP comprise/wear both steering controls components, S2P2CP controls the transmission lever while S2P2C2 controls the acceleration and braking) although, S2P2CP transmission control may invalidate and/or impede potential pedal controls by S2P2C2 and/or steering by S2P2C1. As such, S2P2CP is determined as a more critical (leadership) component as its controls can impede both S2P2C1 and S2P2C2 control activities. However, it is to be observed that an entanglement of (S2P2C1, S2P2C2) and/or further module other than S2P2CP has control on enabling/disabling/engaging/disengaging S2P2CP controls and thus, S2P2CP (leadership) may be disabled and/or unlocked based on safety inferences and/or semantic times.

In some examples, safety inferences comprise a trilateral safety entanglement wherein the system forms three groups comprising each of two components (and/or coupler) and/or their associated capabilities in order to assess the coherency and/or confusion in the system. The system may project invalidation, disconnection, unlocking and/or disengaging of the component which may be part of at least two confused groups at semantic times (e.g. when not in a learning mode etc.). When all groups are confused and/or not coherent, the system may disengage and/or replace the leadership component of the trilateral group and refresh projections.

The system may infer confusion based on highly entropic and/or drifted orientations between inferences at entangled groups. In examples—with components A, B, C-AB (leadership) (semantics) (links) inference orientation and BC (leadership) (semantics) (links) inference orientation is less drifted and/or composite orientation is more affirmative factorized than similar BA-AC/CA-AB and AC-CB/BC-CA entanglements and thus, the system may infer that B, as a common component in the more affirmative resonant entanglement AB-BC and/or CB-BA, is a semantic coupler within the trilateral ABC entanglement.

In similar ways, the system may determine modules for physical coupling and/or locking based on their capabilities and/or positioning. As such, in an example, the orientation positional and/or endpoint mapping of endpoints/links between S2P2C1->S2P2CP and S2P2CP->S2P2C2 is less drifted than other entanglements in the trilateral group S2P2C1, S2P2CP, S2P2C2 and thus, S2P2CP may be a leadership candidate for a physical coupling and/or locking within the (trilateral) group. It is to be observed that the drift may be both positional (as exemplified) and/or semantic (e.g. the system may know that S2P2C1 is associated with a backseat capability, S2P2CP with the upper seat and S2P2C2 with the lower seat and thus, orientations of (backseat->upper seat, upper seat->lower seat)/(lower seat->upper seat, upper seat->backseat) are less entropic and/or fluent than other orientations and/or groupings.

A semantic coupler may be injected and as such the system may apply distortion, distraction and/or non-affirmative influencing analysis on the injected endpoint.

As exemplified, when control and/or disconnection capabilities overlap, the system may form groups of trilateral artifacts and/or further hierarchical entanglements for decision making. Inferences up and/or down the trilateral entanglements may be applied.

Wearables and/or cushion elements may be selected and/or locked based on the type of application (e.g. car/seat type etc.) and/or other inferred circumstances.

The attachment of those to the controls (e.g. steering column/shaft) may be achieved through sprockets, tensioners and/or gears attached to the vehicle's controls and/or to the posts (as lockable wearables, (attached/detached) modules etc.). Linkage elements such as chains and/or belts may be used to connect sprockets, tensioners and/or gears; alternatively, or in addition, at least two gears are connected (e.g. until their teeth interleave), linked and/or grouped via movement of at least one of their supports and/or modules. S2P2 and/or supervisors may control the vehicle's seat adjustment as to get to an optimal distance for connection and/or manipulation of steering and/or pedals.

Posts (S2P2) may infer readiness for driving activity based on sensing, coupling, support, grip and/or traction on/by the controls.

We mentioned that the system may infer support and/or traction for activities. Further, we mentioned that the system may apply (torque) vectoring for applying, maintaining and/or adjusting (base of) support (within preferred, likeable and/or reasonable endpoints and/or orientations). The system may apply similar techniques in order to preserve support, traction and/or stability while performing and/or executing activities.

In order to ensure traction an artifact should have support and be in a certain posture in rapport with the support.

The system may factorize support and/or traction while in offensive and/or defensive mode. As such, the system determines that during projections may not have support and/or traction for/in preferred postures and thus, it may look to increase support and/or adjust the posture.

In some examples, the system may apply such inferences while deploying posts for communication, knowledge and/or budget gains/leakage. In an example, the system infers preferred postures of composite deployments and/or of posts so there is reasonable (fluent) support (and/or traction) at endpoints/links. The support may be related with posts, groups of posts and/or their related postures from various observing views. In some examples, posts harvest vibrational energy and thus, they may need to posture themselves for support. Further, affirmative (entangled) groups of posts may need to support S2P2 at particular endpoints/links (e.g. shaky ground, observation/transmission point etc.) at semantic times. In some examples, such postures have high-risk high-reward (e.g. high energy budget gain, communication gain, critical knowledge gain) at semantic times. Further, the posts position, posture and/or are postured for (affirmative) support (e.g. of charging, communication, (particular) products supply chains/logistics etc.) within (affirmative) semantic times and/or budgets.

Similarly, the system may determine that it needs to apply and/or optimize (composed/entangled) posture and/or the coverage (e.g. of the cushion on the seat, of post communication/sensing infrastructure) and/or arrangement in order to ensure support and/or traction at/by various endpoints/links and/or semantic times.

In further examples, the system may optimize carrier deployments in order to logistically support particular activities and/or goals at endpoints.

The system ensures circumstantial support to capacity and/or demand to increase fluency and/or decrease hazards in/within desired orientations.

Traction and/or support may be ensured in various environments. Traction and/or support indicators/factors may be associated and/or linked to artifact/object traction and/or support and/or to activity traction and/or support. Further, the traction may need to be supported. In some examples, the traction and/or support inferences comprise support budgets and/or budgeting support.

The system may ensure support towards desired and/or affirmative resonant orientations and/or further endpoints/links.

The system may strive to expand its capabilities and/or publish new capabilities based on expertise status. As such, the capabilities may be (semantically) grouped and/or rated based on expertise factors. The system may use challenges within the flux network for learning, guidance and/or leadership from/for more expert users, groups and/or expertise.

The system determines and/or projects expertise and/or support by agents and/or semantic groups which bond at endpoints/links for support purposes/goals and/or, transition and/or diffuse the expertise and/or support at projected endpoints/links. In some examples, the expertise and/or support determinations comprise budgeting.

The system may allow access to an endpoint/link based on the level of expertise and/or further risk budgets. As such, as the system infers semantic artifacts (at the endpoint/link) associated and/or having a drift with a particular (level of) expertise in particular agent circumstances (e.g. speed, posture etc.) and compares with the (current and/or projected) level of expertise of a/an (flow) agent. The drift between the expertise levels of the agent (and) at the endpoint may be compared and/or be within a (disposable) risk budget and thus, the agent may be routed and/or allowed at the endpoint; analogously, the agent may not be routed and/or allowed at the endpoint if the (disposable) risk budget is too low. It is to be understood that the budgets may be based on offensive/defensive projections and/or behaviors.

The system may apply "should", "must", "have to" in rapport to activity inferences/challenges and/or similar to indicate variable levels of superposition of DO/DO NOT, ALLOW/BLOCK, expected behaviors, access control and/or localizations allowing/blocking activity and further inferred semantic times, activities and/or semantic identities. In further examples, such inferences may be based on activities and/or goals such as affirmatively factorizing budgets and/or spending disposable budgets.

Leaders may need to communicate (e.g. activities, orders, commands and/or further challenges) by being resonant within the group.

The system may infer that (projected) (orientation to) superposition and/or confusion at semantic times may determine hazardous situations. The system may determine (new) leaders and/or handover controls to the (new) leaders based on expertise and/or further circumstances. In some examples, superposition/confusion/hazards may be caused by a multiple-control system having no control leadership; as such, when superposition/confusion/hazards are inferred the system may determine and/or handover control leadership.

The system may apply loss and/or gain analysis associated with risk and/or reward (e.g. reward of loss, risk of gain etc.). Such, inferences may be associated with leadership, connected fluxes and/or collaborators. In examples, the system assesses leaderships and/or leaders based on inferences comprising such indicators. In further examples, the system applies them to (its/others) group memberships and/or fluxes. Further, the system factorizes whether to (keep, pursue and/or perform activities of or associated with) connect, disconnect and/or condition fluxes based on such inferences.

The system uses likeable/preferred postures for support and/or traction and/or further avoids hazardous postures (e.g. avoids wobbling, avoids 30% axial orientation, avoids eye blinking every two seconds or within a semantic time etc.) and/or orientations. Further, the system may project affirmative and/or likeable postures and/or orientations in rapport with observing views and/or support artifacts in order to gain traction and/or support. By H/ENT the system may project loss of traction and/or support.

We mentioned that the system may determine loss inferences based on leakage and/or further found inferences based on the detection and localization of leaked and/or further components and/or by-products.

The system infers leakage/loss and/or gains/bonds of/from/to/between artifacts and/or further semantic groups; further, such inferences may be related with losing/leaking and/or gaining/bonding members in/within the group. In further examples, the system infers gains and/or loss of traction and/or support at endpoints.

Pressure/weight sensors within modules/posts comprised in the robotic pallet may measure the product pallet weight and further, monitor its condition such as being moved or changed in a particular direction.

Robotic pallets may move, group, entangle and/or arrange in order to optimize center of gravity and/or base of support of/on/within a platform, carrier, enclosure and/or container.

In further examples, the system determines non-affirmative resonance and/or hazards based on inputs at a first time and at a second time from at least two (pressure/weight/mass/incline/acceleration) sensors mapped to distinct endpoints on a divider and/or a (top/bottom/lateral) surface contained/comprised in a platform, container and/or conveyor. Further, when loaded/unloaded on a carrier/platform/container/conveyor the system may group and/or entangle such dividers, surfaces and/or (further) carriers/platforms/containers/conveyors and/or further supervisors/owners. Further, the system may adjust suspension, damping, torque (vectoring) and/or manipulation based on such inferences. In further examples, the user specifies the orientation of the preferred weight between a first endpoint and a second endpoint at semantic times. We mentioned that the system may learn sensing values from various modalities at semantic times. The system couples/connects modalities sensing and/or further (flux) information in order to learn and/or determine believable, expected, supported and/or traction resonant behaviors and/or artifacts.

In some examples, the system learns the pressure and/or mass/volumetric flow within an evacuation pipe in particular environmental conditions and/or (hierarchically embedded and/or indexed) semantic times (e.g. an hour before heavy rain/(heavy rain−15*4 mins), heavy rain−15*2 mins, heavy rain−15 min, heavy rain, heavy rain+15 mins, heavy rain+15*2 mins, an hour after heavy rain (heavy rain+15*4 mins) etc.). The flow may be measured by a flow meter while the rain volume may be measured by a rain sensor. While the semantic indexing may comprise a step base/anchor (e.g. 15 mins) alternatively, or in addition, it may be (further) inferred, indexed and/or stepped based on (further) circumstances (e.g. 30/60 mins, half hour etc.).

Analogously, the system may learn and/or specify other sensing/actuation/manipulation parameters, semantic times, routes and/or protocols; as mentioned, such protocols may be implemented by voltage, current and/or semantic wave conditioning. In some examples, the system learns and/or indicates the force and/or momentum to be applied in a semantic time. Further, the system indicates the indexing to be applied in a semantic time. Further, the system indicates semantic routes and/or protocols comprising such semantic times and/or indexing. It is to be understood that in similar ways the system may be instructed on the published capabilities and/or published control/manipulation interfaces.

A flow meter may measure the mass and/or volume at pipe endpoints within semantic times. The system may sense and/or account for circumstances such as temperature, pressure and/or viscosity.

Sensors may be powered by orienting and/or diffusing flows to (encompassed/contained) transduction elements which may convert mechanical motion to electric and/or magnetic power/flux (e.g. (rotor) blades, piezo etc.). In some examples, an ultrasound flow detection sensor (at an endpoint) and/or rain sensor may be powered by a turbine and/or vibration of a pipe and/or surface induced by a flow of water; it is to be understood that the pipe may be mounted in such a way that allows vibration within semantic time (e.g. between/within/towards pump engages->disengages+10 sec).

A generative turbine and/or vibrational harvester may be comprised and/or contained into a pipe coupler fitting which may attach on at least one end to a pipe as a terminal and/or coupler fitting. It is to be understood that the generative turbine is spooled by a conditioned guided flow (e.g. of water, gas, agent etc.) on runner blades determining the turbine to rotate in the desired direction and/or with the desired velocity. In other examples, when the generative element is vibrational, the runner blades may not be comprised in a scroll case but the flow is guided to resonantly induce (affirmative resonant) vibration onto the blades which may be comprised and/or be attached and/or locked to piezo generating elements.

The system may determine affirmative/non-affirmative orientations based on the orientation of a sensed parameter between at least two endpoints. Further, the system may determine affirmative/non-affirmative orientations of a parameter at the same endpoint between at least two semantic times. A guided flow may be managed by fairings management which may be controlled for direction, orientation and/or aperture adjustment.

A pipe vibration generator may be comprised into a (pipe) wall mount, hook and/or hanger. As such, the system harvests energy generated by pipe vibration and further transduction by the piezo component comprised in the mount/hook/hanger/lock.

A harvesting front end (e.g. pipe, antenna housing etc.) may capture, direct and/or generate kinetic energy due to various circumstances such as flows, interactions and/or other environmental conditions. The harvesting front end may be augmented for increased harvesting capability and/or capacity (e.g. a polycarbonate fairing is attached and/or locked on the pipe, (semantic) coupler etc.).

Generative transduction couplers may comprise and/or be applied as semantic couplers.

If no (particular strength/amplitude/modulated) vibration and/or current draw occurs within the semantic time the system may infer malfunction. Alternatively, or in addition, a current draw may be based on sensing from a current sensor embedded and/or coupled to/into the generative element and/or its further storage elements (e.g. batteries, capacitors etc.). In further embodiments, the current (draw) sensor may be embedded and/or comprised into a/an (adapter) plug and/or socket. In some examples, plug adapters are plugged to the power source (e.g. of a pump) on one side and the powered element (e.g. pump cord) on the other side.

The system may infer distortion if the measured flow is highly drifted from the measured values at semantic times. Further, the system may detect that leakage and/or blockage (e.g. impeded diffusion, blocked flow etc.) occurs if the measured flow is highly downward drifted from the measured values at (hierarchically embedded and/or indexed) semantic times (e.g. the volumetric flow is too low and/or steeply downward oriented from learned); alternatively, the system may infer malfunction as the measured flow is highly upward drifted from the measured values at semantic time. Further, if the evacuation pipe is coupled to a pump and/or flow causal agent then, the system may infer that the flow causal agent (e.g. pump etc.) may not exercise its traction, support, vacuum/pressure (capability/function) expertly/properly/accurately/appropriately (as per specification clauses) and/or that is slacking and/or causes hazards.

In some examples, the system determines that the flow (in a pipe) is low during heavy rain (indexed) intervals and/or semantic times and thus, circumstantial highly entropic; thus, the system may use leak and/or blockage detection techniques. The blockage may be detected and/or inferred using similar techniques as such for leaks; the system infers leak/blockage if a sensed flow parameter value orientation between at least two particular sections and/or endpoints/links is highly drifted at semantic times. Further, as explained, the system determines high entropy of measurements and/or inferences at mapped endpoints/links at semantic times. In additional examples, in case that during freezing conditions the system infers a blocked flow segment which comprises a heating element (e.g. for keeping the pipe agent flowing and/or its semantic entropy in check and/or against its entropic freezing), the system may infer inadequate capacity and/or malfunction of/for the heating element due to inability to steer against freezing and/or to keep the entropy of the flow within likeable intervals.

In further examples, the system may infer (drainage) (pump/valve) malfunctions and/or further hazardous conditions by detecting pooling of water (and/or other liquids) at/on/towards particular endpoints/links. In some examples, the system infers that a water drainage manhole cover is obturated with (pooling) water within an interval and/or at endpoints/links. Further, the system may infer increased (non-affirmative) water pooling by increased diffusion on links, orientations and/or to further endpoints from an anchor (e.g. drainage cover). It is to be observed that the system may infer a malfunction of the drainage and/or further (flow) components based on the high entropy and/or drift between the intrinsic goal of the drainage (e.g. drain water etc.) and the "covered/obstructed by water"; as such, the system may infer that a composite semantic identity of "drainage covered with water" is unusual, unexpected, distorted, highly intrinsic entropic and/or non-affirmatively factorizes/distorts the drainage purpose, activity and/or goal at the endpoint. As such, the system may apply further malfunction localization and/or issues repair orders on/comprising the malfunction items to providers (via semantic fluxes).

The system determines investment and/or consumption of a (preferred/likeable) budget in/at a semantic time, endpoints, links and/or hubs. Such budgets may comprise energy such as electrical (e.g. by current draw) and magnetic flux power; in other examples, it may be budgets associated with activities such as installation, maintenance, replacement, start, readiness etc. In an example, the system doesn't invest in installing/fixing/powering/starting a drainage/sump pump if there is no flood hazard (to an underground endpoint, basement etc.) and/or is not raining; alternatively, or in addition, the system may divert the unused generated current to charging batteries and/or other storage components.

The system may augments/notify service providers and/or generate service tickets if particular (hazardous/lack of expertise/inaccurate) inferences occur.

As mentioned, the system may couple based on semantic resonance. As such, the system may have a near resonance interval which determine the system to advise and/or augment on semantic times, semantic identities and/or associated activities in order to achieve resonance by transitioning within the resonance interval. The system may factorize resonance based on entangled groups (e.g. having/pursuing A/(not A) having/pursuing (not B)/B etc.). We mentioned that pads may be installed in shelves to determine particular measurements and/or resonances. Based on semantic times (e.g. of provisioning, loading etc.) the pad may infer semantics and/or records semantics which are associated and/or inferred based on provisioning and/or loading semantics (e.g. with bottles, filing the supported bottles etc.) while at other semantic times it records semantics which are associated with consumption and/or unloading (e.g. of bottles, of liquid in the bottles etc.). Based on a semantic times, when the system infers loading, unloading, provisioning, consumption and/or further manipulations of the product by allowed users the system may not generate alerts; when such manipulations are determined as illegitimate the system may augment with particular alerts semantics.

The system may augment supervisors in regard to supervised activities when are (unexpectedly) drifting in rapport with goals, semantic times and/or a semantic comprised in a semantic time; in some examples, the drifted and/or unexpected activities are indicated and/or sensed by supervised. The supervisors may approve and/or reject an (drifted/entropic/unexpected) activity and thus, the system may adjust (e.g. revert/rollback/dispose previous, recalculate/update/project/store based on current etc.) behaviors, recordings, storages, projections and/or calculations accordingly.

In some examples, the system calculates the time spent in activities based on user inputs; the user inputs may be provided to augment the system (e.g. when in superposition, confused etc.). The system may calculate the time spent on activities based on confusion, coherence and/or factorization assigned to the inputting user (e.g. calculate based on user inputs if user inputting is affirmatively factorized or calculates by rejecting the user inputs). A supervisor may disapprove the user inputs and thus, the system may recalculate the time spent on particular activities. The supervisor may be associated with an endpoint and/or with a manager and/or group leader in a hierarchical manner.

It is to be understood that the approval/non-approval of a (input) activities may comprise authenticating, signing (and/or generation/storage/transmission of an signature and/or credential (based on a approver/non-approver user input)) and/or approval/non-approval (e.g. via a button/link click and/or a non-click (within a semantic time) etc.).

Budgets may be accumulated while on particular activities. The activities may be associated with credits accumulated by the activity performer and/or capability provider from an activity and/or interest publisher and/or supervisor's account. The credits are liabilities incurred by the activity and/or interest publisher and/or supervisor towards the activity performer. The liabilities may be associated with a provider's goodwill.

An exchange and/or bargaining broker is employed to harmonize between different activities, associated budgets, credits and/or further associated semantic identities, groups, capabilities and/or interests. Harmonizing is performed based on laws of the land and/or localized harmonization rules, semantic identities and/or codes at endpoints and/or associated groups and/or hierarchies.

In further examples, a shelf is split in two, with one side marked for provisioning and/or servicing capacity and the other one for consumption and/or servicing demand with a semantic coupler in the middle. It is to be observed that the main activity on the capacity servicer is loading while on the demand servicer is unloading; the system may detect loading unloading based on presence of loaders/unloaders, sensing and/or further semantic times.

The system may factorize fluency at (servicing) endpoints based on (preferred minimum) composed entropy and/or budget inferences of the containers, contained, activities, semantic times, their orientations, trajectories and/or further semantic attributes.

The system may opinionate, evaluate, rate and/or insure the advertised and/or published interests, capabilities and/or further servicing (bonding/coupling) based on (published/sensed) capabilities (e.g. related to sensing, flux etc.), handling, storage, postures and/or other conditions at/of venues, households, facilities, assets and/or further endpoints/links.

We mentioned that the system determines ratings, goodwill and/or further indexing. In examples, the system applies the goodwill and/or indexing to assess values, budgets and/or depreciation. In further examples, the system determines that based on ratings of a particular asset and/or configuration, its value need to be indexed in a particular orientation (e.g. the DeLorean highly rated tuning/setup configuration can be considered a higher value and/or less depreciation than the DeLorean in a low rated tuning configuration); it is to be understood that the ratings may be based on (groups of) indicators such as performance, reliability, stability, sound etc. which may be associated and/or dependent (on composition, value, membership) on semantic groups. Further, based on recorded and/or further inferences comprising preferred and/or hazardous/non-hazardous manipulations, handover and/or handling indicators/factors (e.g. as per operating clauses, manuals etc.) the system may further adjusts ratings and/or factorize goodwill. The system may adjust (published) (hierarchical) budgets based on such (projected) indicators, depreciation and/or goodwill inferences.

Semantic identities comprising various setups and/or configurations may be factorized based on their composition and/or further assembly, assembler and/or supervisor expertise. Further, they may be factorized and/or rated as being expert in various environments and/or circumstances (e.g. John's (supervision) expertise in manual transmission turbo cars may diffuse to a manual transmission turbo tuned DeLorean, turbo provider A may diffuse and/or factorize in a particular way than turbo provider B for a projected DeLorean tuning configuration, John's expertise with turbo A or B and/or their providers may diffuse and/or factorize differently, turbo A and B may be factorized differently for low/high altitude use etc.).

The system may factorize expertise in various domains, semantics and/or circumstances based on configurations and/or further capabilities (ratings). As explained, in some examples, the system may sense and/or infer the level of expertise in required to transition in and/or out an endpoint (to handle an interest, item and/or performing an activity) and may allow, disallow and/or route an asset in and/or out an endpoint based on the level of expertise inferred for the asset in the composed circumstances at the endpoint (at semantic times).

Based on ratings and projected demand of artifacts (and/or semantic identities) having/comprising particular settings and/or configurations the system may place orders for parts and/or stock them.

The (orientation/direction of) goodwill and/or ratings may be applied to (orient/direct) allowable maximum insured values and/or insurance premiums. In (additional) examples, they may be applied to couple (and/or orient/direct) assets to servicing endpoints based on capabilities rating and/or insurance requirements/clauses.

The system may infer distortion and/or further playback when particular augmented information and/or overlays do not match a schedule and/or program. In some examples, such distortion may happen due to recordings and/or multimedia/compression formats which do not differentiate overlays. In cases where the system infers such distortion it may process the multimedia artifact such as to eliminate and/or substitute the distortion artifacts and/or further render the processed fluxes/streams.

A user may take snapshots and/or images and beams/projects them on a screen where it may select and/or overlay particular objects for manipulation purposes. The projected snapshots may expire once the system infers distortion.

Fluency may be inferred and/or applied in advertisements (e.g. to collaborators, vehicles, snippets, TV programs etc.). The fluency factors may be based on whether the time budgets of particular interests and/or activities are borderline to affirmatively resonant oriented (when diffusing capabilities to interests artifacts).

The system augments multimedia and/or further augmentation modalities with artifacts based on fluency. In some examples, the system augments a program show with multimedia artifacts which exhibit and/or determine fluency within the composed context. In further examples, the system augments and/or fuses a first modality artifact (e.g. sound flux/stream/channel, multimedia player) with a second modality (e.g. video flux/stream/channel, multimedia player) and further overlays and/or renders the modalities artifacts within a multimedia channel, stream and/or player, wherein the second modality artifact exhibits resonance and/or further fluency in relation with the first modality and/or composed artifact.

The system may use a hub infrastructure for logistics, carrier and/or transportation. As such, the system loads, bonds, couples and/or assembles items/pallets to a first endpoint and, unloads, decouples, leaks and/or disassembles to a second endpoint where it further loads, bonds, couples and/or assembles items/pallets. At hubs the system may comprise charging capabilities. The various examples and citations presented in the application may be substituted, expanded and/or analyzed according with techniques explained in the application. As such, the examples and/or their further semantics may be substituted for any other examples and/or semantics which may be inferred based on such techniques.

The system may report (affirmative/non-affirmative) conditions, flows, bonding, containment, semantic identities, possession, carry/wear and/or (further) activities and/or (further) semantic identities to users and/or providers (e.g. insurers, agents etc.); these may be associated with particular endpoints.

In further examples, the system may report agent dripping/leaking/pooling and/or further non-affirmative conditions at the/an (agent's) dripping/leaking/pooling endpoints (e.g. such as inferred hazards/damage to assets, non-affirmative and/or highly entropic presence etc.).

We mentioned that the system may manage, automate and/or direct shopping carts and/or other assets. Further, the shopping carts may comprise sockets and/or arms for holding, locking and/or securing mobile devices which detect the items going in and/or out the cart and further charge user's accounts based on the items in the cart and/or checkout semantic times (e.g. user leaving facility/parking/cart etc.) and/or endpoints.

In further examples, the shopping carts may comprise robotic manipulating and/or positioning arms which may be employed for moving items in and/or out the shopping cart.

Similarly with the posts, the carts and/or their components may comprise processors, microcontrollers, memories, wireless components, antennas, sensors, transducers and/or actuators.

Figure 40A:
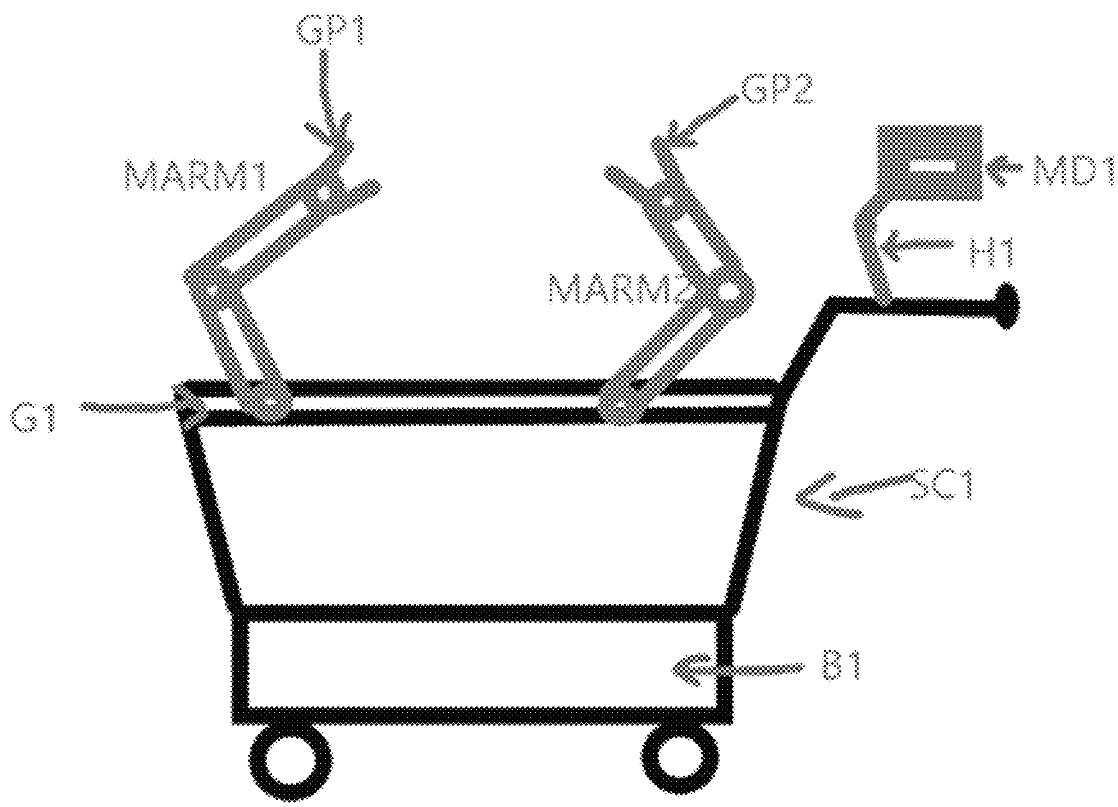
FIG. 40A is a front elevational view of a preferred robotic shopping cart.

In an example in FIG. 40A the (shopping) cart SC1, comprises a holder H1 for supporting mobile device MD1 and/or further manipulator arms MARM1 and MARM2 which may be fixed and/or slide linearly and/or around by being held in/by groove, rail and/or channel G1; the robotic arms MARM1 and MARM2 may comprise robotic grippers such as GP1 and GP2. Once the mobile device is secured into place and/or holder (e.g. as detected by sensing (e.g. RFID/NFC, optical) and/or proximity) the system may determine that the device's user/supervisor supervises the cart and transfers and/or enables the user's semantic profiles, shopping lists, shopping (semantic) routes and/or further preferences to the device. Further, the system may track the shopping cart through the (supervising) mobile device.

It is to be understood that the mobile device holder secures, locks and/or connects the device in place and thus, only the device's user and/or supervisor (e.g. as authenticated at the mobile device and/or device encompassing endpoint by biometrics, localization and/or other (semantic identification) sensing) is able to unlock the device. Once the device is unlocked the system may release the cart from the supervision of the user's mobile device.

Figure 40B:
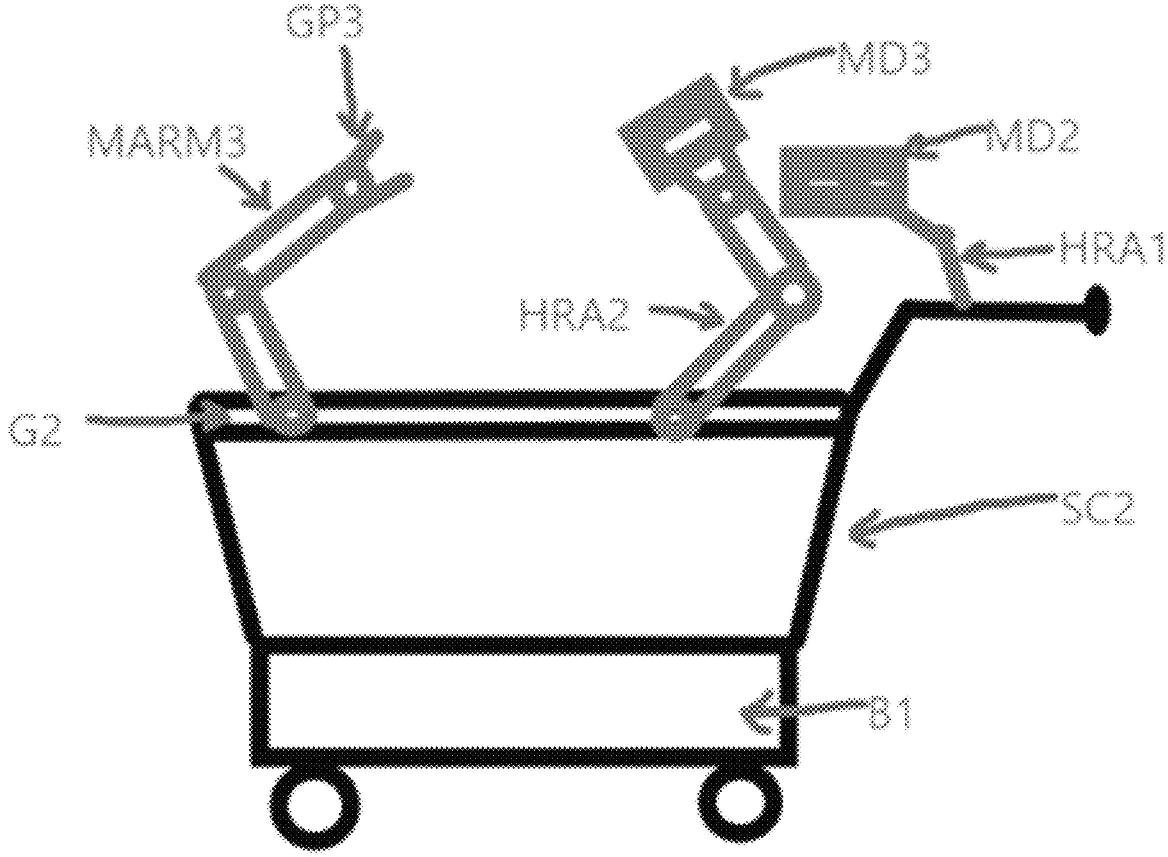
FIG. 40B is a front elevational view of an alternate robotic shopping cart.

The mobile device holder may be attached and/or comprise holder robotic arms HRA1 and HRA2 such in FIG. 40B and thus, the system is able to move the held mobile device MD2 and MD3 around for sensing items and/or attached labels/barcodes/RFID in the cart and/or for optimal positioning to activities, users and/or supervisors. In addition to the holder robotic arm the cart may comprise manipulator robotic arms for manipulating items in and/or out the cart (e.g. such as MARM3). In some examples, such in FIG. 40B, HRA2 and/or MARM3 move and/or slide around the cart SC2 through grooves (e.g. G2) by electric powered (rotational) motors, wheels and/or further (rail) holding mechanisms. It is to be understood that in some examples, holder robotic arms such as HRA1 and HRA2 may be robotic arms such as MARM1-3; however, in other examples, they may comprise different holding, gripping, bonding and/or support components.

Figure 40C:
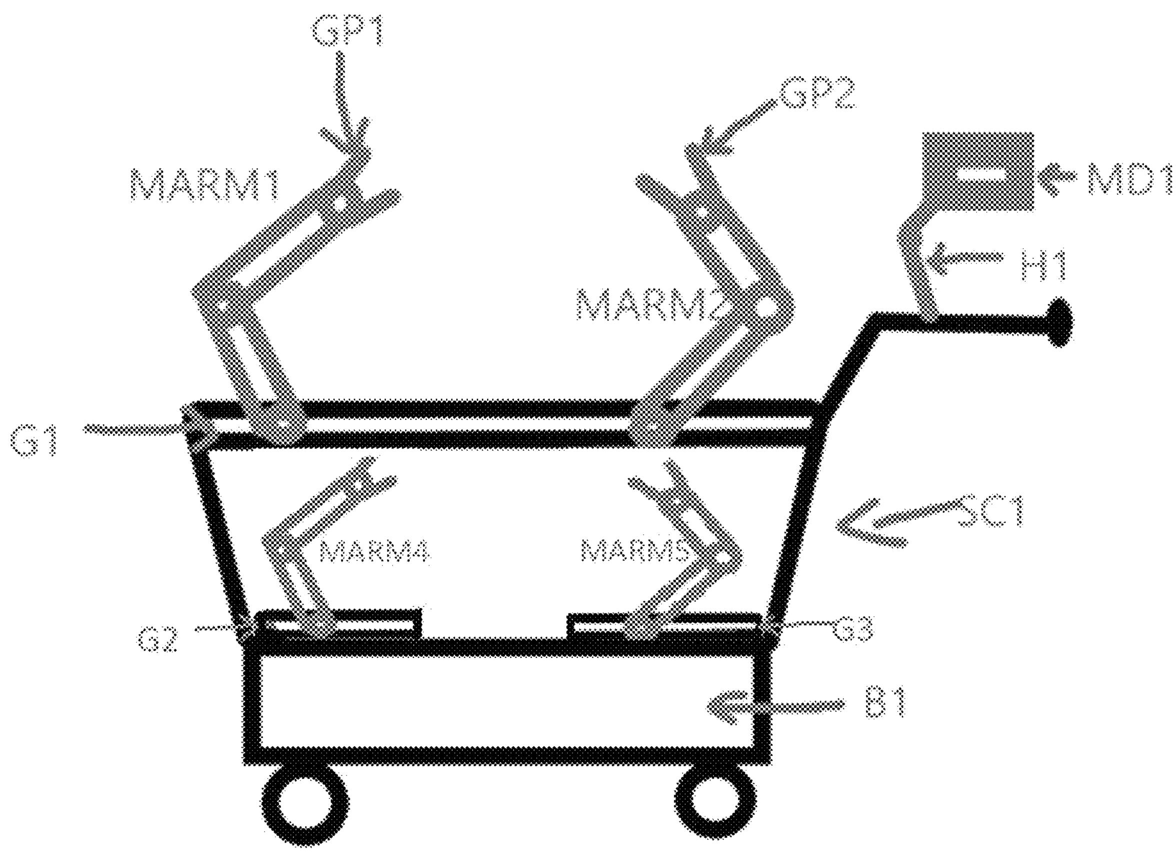
FIG. 40C is a front elevational view of another alternate robotic shopping cart

While in the depicted examples the manipulation arms are at the top of the cart's bin it is to be understood that they may slide and/or move at the bottom of the cart's bin (e.g. through vertical groves/channels, rotational movement etc.). Alternatively, or in addition, the bin may have additional manipulation arms and/or sliding grooves/channels (for the arms' movement) at the bottom of the bin (e.g. such as arms MARM4-MARM5 on grooves/channels G2-G3 in FIG. 40C). A corresponding tab or tongue at the base of the arm may be retained and trained within the groove for movement along the groove, using (for example) a motorized gear or wheel to cause the arm to move along the groove. The robotic cart may manipulate items by passing them from one arm's gripper to another's—e.g. it grasps an item on a ground (shelf) with a bottom bin arm (e.g. such as MARM4/MARM5 in FIG. 40C) and pass it for grasping to an upper bin arm (e.g. such as MARM1/MARM2 in FIG. 40C) which positions it in the bin, presents it to the mobile device/user and/or puts it on a top shelf.

Robotic arms (e.g. such as MARM4-5) may be used to manipulate items on tabletops and/or other surfaces. In examples, grooves and/or rails such as G2-G3 may be installed on the edge of the tabletops and/or other surfaces allowing the arms to slide/move along the surface. Further, the electric powered (rotational) motors, wheels and/or further (rail) holding mechanisms attaching and/or manipulating the arms in/on the grove/rail may be coupled and/or have attached additional (pressure, optical etc.) sensors for sensing (e.g. under-pressure, overpressure (e.g. caused by wheel/tire) compression, obturations etc.) non-likeable and/or hazardous conditions determined by obturations (e.g. person/child hand, pet paw, posts component etc.) within the groove which may/should impede/stop the robotic arm (s) to slide along the groove. Once such the conditions are inferred the system augments a/the person/post/pet (and/or supervisor) about the (potential) hazards, anomalies, impediments and/or apply counter-measures (e.g. stop movement, play sound, send S2P2, distract the person/post/pet from the non-likeable/hazardous endpoint—e.g. by factorizing/generating/applying non-affirmative inferences and/or measures, attract the person/post/pet to a likeable/non-hazardous endpoint (by factorizing/generating/applying likeable conditions), adjust diffusion between endpoints etc.).

The robotic cart may comprise a bin lifting mechanism which allow the bin to move up/down/tilt and thus, allowing the arms to reach to various heights, orientations and/or tilts. In some examples, the lifting mechanism is comprised in B1 of FIG. 40A-C; it further may resemble Arm Lift in FIG. 33. Alternatively, or in addition, the bin may be moved up/down/tilt by at least one of the cart's arms (e.g. MARM1-4 provide support on the ground/wall/structure and push up and/or release/move/tilt down the bin).

The robotic cart may use the robotic arms to navigate and/or provide support in various circumstances and/or environments. In some examples, the system uses MARM3-4 to support the cart on the ground (e.g. uneven, sloped etc.), stairs, platforms and/or other navigation environments; further, the arms may be deployed to adjust the center of gravity and/or base of support. In further examples, the system uses MARM1-2 to grip a support component and/or support the robotic cart on a wall and/or other structure.

A robotic cart may comprise at least one arm (comprising an ELOCK) for towing/connecting additional loads/carts (e.g. luggage, to interconnect to a towing arm of another cart/asset etc.).

ELOCKS and/or latches may be comprised in the robotic cart to secure bin walls, batteries and/or further components/items.

In some embodiments at least one of the bin walls may swivel (e.g. mechanically (by arms) and/or electrically by electric motors) and/or lock between various positions and/or semantics (e.g. open, closed, half open/closed, 30% closed/open etc.). In further examples, such activities may be coupled with access control and/or gating in/out of bin wherein the (swiveling) bin walls comprise the divider/s. Thus, the robotic cart may open the wall to move/slide items (e.g. heavier, bulky etc.) into/out of the bin and close it to secure the items in the bin. In further examples, the cart/bin may lift/lower/tilt to accommodate and/or facilitate such moving/slide from in/out of bin (e.g. in order to move a box/cartoon/crate the bin bottom may be aligned at the optimal height (e.g. even, higher etc.) with the box/cartoon/crate's bottom and/or (further) tilted to facilitate sliding inside the bin to the desired position) and use the arms and/or cart movement to move the target items in/out of the bin.

Arms' grippers and/or bin (walls) may securely hold, lock and/or encompass items and/or further release them based on access control. As such, an item may be secured/unsecured only at particular endpoints, by (particular) users/supervisors/owners and/or in particular circumstances. In some examples, the system unlocks a bin wall to allow access by a bin arm and/or identify items associated with a (identified) user/consumer and/or associated orders and/or further unload them to designated/indicated endpoints and/or present them to the user/consumer. It is to be understood that the bin walls may comprise latches, lockable hinges and/or other swiveling and/or locking mechanisms/devices; further, they may lock/unlock based on inputs from sensors and/or further (identity and/or presence) authentication thus, implementing access control. Also, the bin walls divide, secure and/or encompass the bin's top (or top wall/lid/cover/door etc.), bottom (or bottom wall/bed/platform/lid/closure/door etc.) and/or sides (or side wall/lid/cover/closure/door etc.). In further examples, a (distributed) (electromagnet) latch, lock and/or swivel secures (e.g. locks/unlocks) a first bin wall to a bin structure and/or to a second bin wall; in some examples, a side wall is a door which has a swivel/hinge (and/or latch/lock) attachment on one side and/or a latch/lock on another side.

Holder and/or robotic arms may comprise a charging socket for charging held and/or locked devices such as MD1-MD3. In some examples, the charging socket is an USB socket. Alternatively, or in addition, they may comprise a wireless charging pad.

Devices MD1-MD3 may comprise sensors and used to transmit and/or analyze the data from the sensors and/or further guide the robotic arms and/or the holder carts/posts. Alternatively, or in addition, the carts/posts comprise at least one (other) sensor positioned on the (components/modules of a) cart/post.

A holder may comprise an RFID reader (e.g. NFC, EPC etc.). Alternatively, or in addition may comprise other wireless readers or sensors.

A holder may comprise a variety of sensors.

In some examples, the sensors sense the pressure exercised by the mobile device (on the holder's base, groove stoppers, grippers etc.). In other examples, the sensors may sense the position of the gripper claws. In further examples, an optical and/or wireless sensor may determine the presence and/or location of devices and/or items.

A holder may have one or more capabilities and/or components for holding the mobile device in place. In an example, the holder may have spring-ed grippers to hold the device edges wherein the gripper locks/unlocks/open/close based on the holding activity and/or access control. Alternatively, or in addition, the holder has groove (latched) edges (e.g. comprising raised elements or stoppers) and/or latches which allow a sliding or pushed device to be hold in place. In further examples, the edges comprise stoppers which may be spring-ed, swiveled, latched and/or locked/unlocked when the device is pushed in and/or pulled out of the holder.

A (mobile device) holder may or may not comprise a processor/microcontroller, sensors, wireless communication components, actuators and/or memory.

A cart may or may not comprise a processor/microcontroller, sensors, wireless communication components, actuators and/or memory. In general, a cart may comprise at least one wireless communication component, a processor/microcontroller and/or a memory.

A robotic cart has a mobility base/carrier; in some examples, the mobility base/carrier is composite. As previously mentioned, the system may replace/unlock/unlatch/lock/latch components/posts in the base/carrier based on semantic inference including projections on activities and/or goals (e.g. for likeable charging, support, capabilities, budgets etc.).

Alternatively, or in addition, the robotic cart has battery modules attached/latched/locked of/by posts. As such, the system may replenish energy budgets by replacing the battery modules. In some examples, S3P4-S3P5 are attached to the cart to provide energy, support and/or mobility. Alternatively, or in addition, S3P4-S3P5 detach/attach from/to the battery module locked/latched onto the robotic cart. Thus, S3P4 and/or S3P5 may act as a flow agent bonding/leaking/composing energy agents (e.g. battery modules and/or associated semantic (s) (identities)); further, S3P4 and/or S3P5 may act as a provider/consumer of energy budgets (e.g. consume electricity to charge itself and/or provide electricity for others to charge).

In further examples, the door D and/or robotic lock such as depicted in FIG. 54A-D can be substituted the robotic cart and further, the depicted posts SP1 and/or S2P1-S2P3 form the mobility base/carrier/support and/or battery pack. Further, a PDSM may be substituted for a battery module such as PSDM.

A robotic cart may be substituted for another type of vehicle. As such, posts, modules and/or mobility bases may be attached to cars, trucks, drones, planes and/or other vehicles in similar ways such as for a robotic cart. Alternatively, or in addition, they may attach to containers and/or cargos.

In some examples, a vehicle has attachment endpoints, connectors and/or latches/locks at the rear/front/left/right of a vehicle and thus, a post may be positioned at the attachment endpoints and/or further latches and/or connects itself and/or its modules to the vehicle. Once latched and/or connected the post performs activities such as providing electrical power, manipulation, retract wheels, disconnect, move away and/or split from the battery module attached to the vehicle and/or other activities such as explained in this application.

A user may activate a mobile application and/or put a device on the holder. In one version, the mobile device holder includes an electromechanical sensor to detect that a mobile device has been inserted. Thus, the system senses that the device is positioned on the holder through embedded sensing (e.g. pressure/position sensors measuring the pressure/position on the holder and/or its hooks/grippers/edges, camera and/or optical sensor, RFID/NFC communication etc.) and thus, it connects the device to the cart's processor and/or control unit through the mobile application. The mobile application may read (e.g. via a wireless protocol—e.g. NFC, cellular, WI-FI, Bluetooth; QR code via the mobile device camera etc.) the identification of the cart, at least one security key/password, a certificate and/or at least one to/from connect address (address to connect to and/or receive a connection request from); in some cases, the at least one address comprises at least one of a web site address, URL (or Unified Resource Locator), URI (or Unified Resource Identifier), an IP address, a MAC address, a semantic identity (of a flux/stream) and/or other (protocol specific) identification. As such, the mobile device and the cart's processor and/or controller units may be communicatively coupled based on the address and/or further provided credentials.

Similarly, the system may connect a charger/hose plug (flowing electrical currents, fuel and/or agents) (of an asset/provider) with a/an socket/outlet (e.g. an (electrical/fuel) socket/tank of an asset/provider, 110V outlet, tri-phase outlet etc.) (of an asset/provider). As such, the charger/hose plug (and/or comprising components/asset) act as the mobile device and the plug/hose (receiver) socket/outlet (and/or comprising component/asset) act as the holder/cart. It is to be understood that all the examples and drawings comprising the connectivity between the mobile device and the holder/cart are analogously similar between the charger/hose (receiver) plug and the (plug/hose) (receiver) socket/outlet; as such, the plug (and/or comprising component/asset) may be substituted for the mobile device and the (plug/hose) socket/outlet (and/or comprising component/asset) may be substituted for the holder/cart. Alternatively, the plug (and/or comprising component/asset) may be substituted for the holder/cart and the socket/outlet (and/or comprising component/asset) may be substituted for the mobile device.

It is to be understood that the plug and/or socket/outlet may be owned/supervised by either a user/consumer and/or provider/producer. Alternatively, or in addition, the plug and/or socket/outlet may be comprised and/or attached in/to a comprising component/asset owned/supervised by either a user/consumer and/or provider/producer. It is to be understood that when mentioning or referring to plug/"plug" and/or socket/outlet/"socket/outlet" these references may encompass the comprising component/asset. Thus, in some examples, components and/or blocks such as depicted in FIG. 45C may be encompassed in the plug, socket/outlet and/or comprising components/assets.

Once a (charger/hose) plug is connected/disconnected with/to/from (and/or in/out) a socket/outlet the system may turn on/off (and/or enable/disable, allow/block) the charging, fuel and/or agent flows; alternatively, or in addition, the charging, fuel and/or agent flows proceed and/or allowed/blocked based on indications from users/assets and/or further sensing (e.g. a user/asset proceeds/indicates to charge/fuel for $10, 150 miles, 10 heavy loads, until John returns+2 mins, an additional 10 W after a seat is positioned etc. and/or further compositions/combinations). The system may use a/an (established) connection to authenticate the charging (comprising) asset (and/or its user/provider) with a charging/fueling (grid) infrastructure, user, provider and/or associated (comprising) assets (providing/owning/supervising the charging/fueling).

It is to be understood that the communication connection may be initiated by either the mobile device (or plug), holder/cart (or socket/outlet) (modules) (processor), provider and/or combinations of the above; further, the communication connection may be initiated and/or managed based on inputs from a sensing infrastructure operating in the environment (e.g. building, store, area, facility etc.). In examples, when the device and/or its user is detected, identified and/or secured in the holder, the device communicates/transmit to the cart (e.g. via RFID/NFC etc.) the address (e.g. such as MAC/IP etc.), user/device/virtual machine/tenant/application identification (and/or associated names, semantic identities, certificates etc.) and/or at least one security key/password; further, it may communicate the (semantic) times, intervals and/or timeouts when the provided connection information is valid/invalid and/or allowable/not-allowable. As such, a cart's processor/micro-controller may initiate the connection (e.g. via IEEE 802.15, 3GPP, TCP/IP and/or other MAC/IP enabled protocols) with the mobile device by connecting to the provided address (at (projected) valid and/or allowable (semantic) times/intervals) and providing the communicated/transmitted credentials.

It is to be understood that in all the connection use cases a receiver of the connection initiation address/credentials (e.g. holder/cart in the previous example) may communicate/transmit (e.g. via the first address and/or interface such as RFID/NFC) to the sender/destination (e.g. mobile device) the connecter's identification/address (e.g. holder/cart's address) and/or further credentials. As such, when the connection is initiated/established (e.g. from the receiver to the sender/destination, from holder/cart to the mobile device or provider) on the second address and/or interface (e.g. such as IEEE 802.15, 3GPP), the connecter's identification/address and/or credentials on the second interface are verified (by the sender/destination) to match against those received on the first interface. In some examples, the connecter's identification address on the second interface is provided by and/or can be extracted from the underlying communication protocol and/or further artifacts (e.g. extract MAC and/or IP address from IEEE 802.15, 3GPP packets etc.).

Alternatively, or in addition, the cart and the mobile device register themselves to a (web, global, local and/or flux) (cloud) provider (e.g. such as a cloud computing entity, device, service, tenant, virtual machine, application, agent and/or address) and provide the credentials generated at the cart and/or at the mobile device, wherein the provider matches the credentials to create a connection. Alternatively, or in addition, the provider and/or (further) (an) infrastructure device and/or cloud service may initiate, couple and/or manage the connection with/between the cart and/or mobile device.

It is to be understood that in some embodiments where multiple applications, devices and/or services need to be connected on and/or between the mobile device/plug, holder/cart/socket/outlet and/or provider, multiple addresses and/or authentication credentials may be communicated/transmitted; alternatively, the same credentials may be used for authenticating with multiple addresses and/or associated entities. In further examples, multiple addresses and/or credentials may be transmitted for communication link redundancy, reduced latency, increased reliability and/or speed; thus, in some examples, multiple communication links may be established wherein some may be active or in stand-by/inactive; in other examples, as active links/connections are unreliable and/or drop the system may use additional credentials to establish/re-establish (other) communication links and/or activate (e.g. at semantic times etc.) stand-by/inactive links/connections.

Figure 45A:
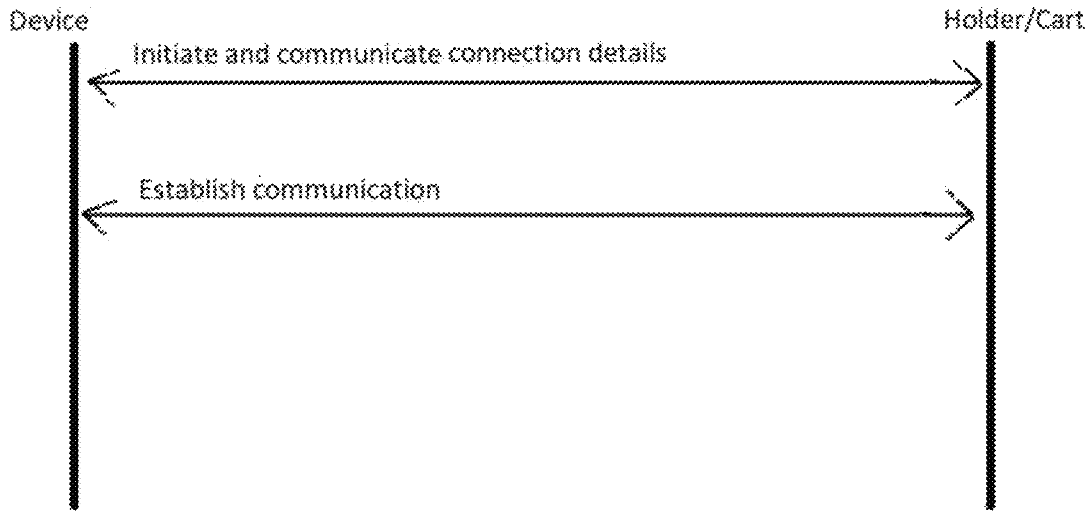
FIG. 45A is a sequencing and connectivity diagram between a mobile device and a holder/cart.
Figure 45B:
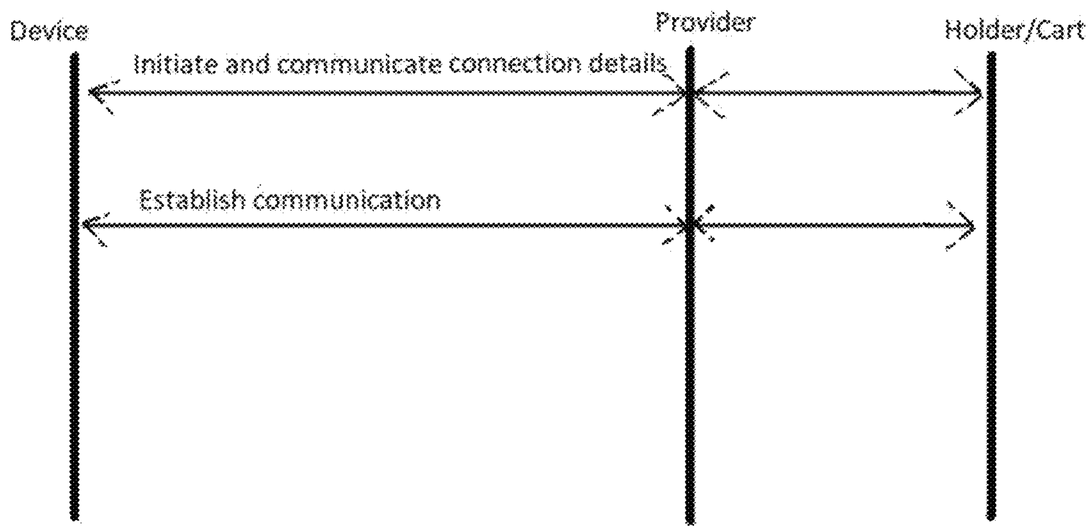
FIG. 45B is a further sequencing and connectivity diagram between a mobile device and a holder/cart, including a provider.
Figure 45C:
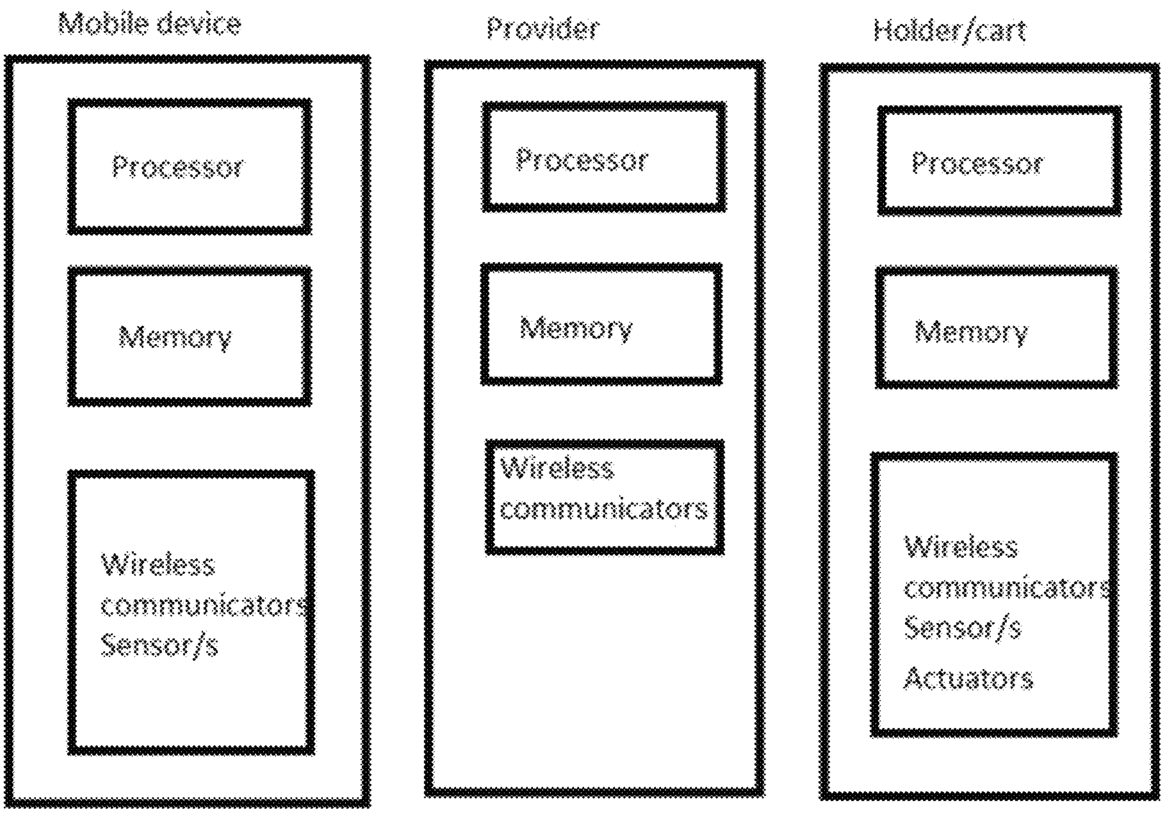
FIG. 45C is a block diagram of a preferred system including a mobile device, provider, and holder/cart.

FIG. 45A-B comprise a sequencing connectivity diagram between the mobile device (or plug), holder/cart (socket/outlet) and/or (flux) (connection) (cloud) provider. It is to be observed that the arrows between the entities/agents/assets/actors are depicted with dashed/dotted lines meaning that they may be optional in some embodiments.

While in the picture the connectivity steps are represented through directed segments it is to be understood that each segment may split to encompass multiple connectivity sub-segments, sub-steps and/or activities in any orientation.

In examples, the holder/cart sends (e.g. via a first wireless/wired address and/or interface such as RFID/NFC, Bluetooth, 3GPP, WiFi, USB, SPI, CAN etc.) connection details (e.g. including a provider's address/credentials) to the mobile device and/or provider which further expects a connection (e.g. via a second wireless/wired address and/or interface such as RFID/NFC, Bluetooth, WiFi, IEEE 802, 3GPP, USB, SPI, CAN etc.) from the provider and/or cart (with the provided address/credentials). Alternatively, or in addition, the holder/cart sends connection details (e.g. including a provider's address/credentials) to the mobile device and/or provider which further initiates/requests/establishes a connection to the provider and/or holder/cart. In further examples, the mobile device sends connection details (e.g. including a provider's address/credentials) to the holder/cart and/or provider which further expects a connection from the provider and/or holder/cart (with the provided address/credentials). Alternatively, or in addition, the mobile device sends connection details (e.g. including a provider's address/credentials) to the holder/cart and/or provider which further initiates/request/establishes a connection to the provider and/or holder/cart.

In other examples, the mobile device sends connection details (e.g. including a provider's address/credentials) to the holder/cart and further expects a connection from the holder/cart (with the provided address/credentials). Alternatively, or in addition, the mobile device sends connection details to the holder/cart which further initiates/request/establishes a connection to the mobile device.

In further examples, the holder/cart sends connection details (e.g. including a provider's address/credentials) to the mobile device and further expects a connection from the mobile device (with the provided address/credentials). Alternatively, or in addition, the holder/cart sends connection details to the mobile device which further initiates/request/establishes a connection to the holder/cart.

It is to be understood that the first data comprising the credentials and/or connection details may be send through a first wireless/wired address and/or communication interface, front-end and/or module (e.g. near field, RFID/NFC, Bluetooth, WiFi, IEEE 802, 3GPP, SerDes, SPI, I2C, Ethernet, USB, CAN etc.) while the actors/agents/assets (e.g. (mobile) device, plug, holder/cart, socket/outlet, comprising assets and/or provider) may further connect and/or communicatively couple on a second address and/or wireless/wired interface (e.g. WiFi, IEEE 802, 3GPP, Bluetooth, SerDes, SPI, I2C, Ethernet, USB, CAN etc.), front-end (e.g. physical and/or virtual (e.g. such as comprising a group/plurality of physical elements) (comprising one or more of an/a) antenna, transceiver, ADC, DAC etc.) and/or module based on the first data as previously explained. Further, while in the examples, a sender, a destination, a receiver, a mobile device, a holder/cart, an actor/agent/asset and/or an address holder may have been referred to indicate a device and/or asset, it is to be understood that they may refer to any component, service, tenant, virtual machine, application and/or agent comprised and/or operating in/on the device and/or asset; further, an address may be associated with any of those entities (e.g. a MAC/IP address is associated with a (physical/virtual) network card/interface, virtual machine, tenant etc.).

In some examples, the (mobile) devices comprise cameras, microphones, ear hearing buds, modules and/or other devices. In further examples, the first connecting device connects to a second device wherein the second device is a computer, mobile device, gateway, router, repeater etc.; in some examples, the first device tethers to a/the second device connection.

In further examples, devices may be plugged into sockets including bulb sockets, power cable sockets and/or any other sockets. While in the socket the devices may be secured/unsecured and/or locked/unlocked into the socket based on access control. Examples of sockets (or holders) may include, but are not limited to, Edison screw bases, bi-post, bi-pin, wedge base, fluorescent tubular, lamp based styles etc.

Once the device is fastened in the socket/holder, a user may select to lock it in place—e.g. via a hook/claws/cams, latch, vacuum (or suction) pods/cups, maglocks and/or any other locking module/capability/modality/activity/protocol such as explained throughout the application. In one example, the holder may comprise grooves accommodating at least one pin of the device. Once locked, a latch is actuated and/or protrudes into/from the groove blocking at least one pin into place and thus, blocking the device in the socket/holder; alternatively, or in addition, the pin is pushed, locked and/or blocked into the groove; alternatively, or in addition, the pin comprises at least one hole and a latch/pin protrudes from the groove into the at least one pin hole; alternatively, or in addition, the pin itself has grooves which are blocked by actuated socket latches/pins and/or claws. In further examples, the device comprises a cylindrical male side with one or more radial pins, and the socket comprises a female receptor with matching L-shaped slot (s) and with spring (s) to keep the two parts locked together. The slots are shaped like a capital letter L with serif (a short upward segment at the end of the horizontal arm); the pin slides into the vertical arm of the L, rotates across the horizontal arm, then is pushed slightly upwards into the short vertical "serif" by the spring; the connector is no longer free to rotate unless pushed down against the spring until the pin is out of the "serif". When locked, the spring (s) may be blocked and/or have a pin protruding through and denying the down movement of the cylindrical male.

In further examples, the device comprises an electromagnet component which is paired/latched with an electromagnet component on the socket/holder.

Alternatively, or in addition, a spinner is and/or comprises sockets (or holders) and can be used to hold the device. In examples, a device can be fastened into the spinner. In further examples, once fastened, the spinner can be locked or released. As such, when released, the device may rotate freely with the spinner without the possibility to be unfastened from the spinner.

Alternatively, or in addition, the device may be secured by an enclosure which is further locked/unlocked based on access control.

A connection on the second interface may be first validated by a supervisor. In some examples, the supervisor is associated with a device, cart, post, module and/or associated (location) endpoints. In further examples, the system augments a supervisor (e.g. by asking for permission, asking for authentication etc.) of the request of connection after receiving the initiation/request on the first interface and the connection on the second interface is allowed only if the supervisor approves, acknowledges and/or authenticates with the system.

The connection activity detection and/or authentication may be automatically done by the system through internal and/or external sensors (e.g. detects through a camera that Jane swipes, approaches and/or contacts the first device with/to the second device and/or vice-versa).

Once the communication is established on the second address and/or interface the actors/agents/assets may further exchange additional credentials and/or authentication information (e.g. for payment of the charge/fuel, for flux identification/authentication, further connections, additional connections establishment if the current connection is unreliable and/or dropped/drops etc.).

The payment information and/or credentials may comprise bank accounts (including credit card accounts), payment tokens and/or any further identification allowing a payment processor, financial entity, bank and/or provider to identify its consumer (e.g. user and/or asset etc.) and/or secure requested and/or projected budgets (e.g. for payment of the charge/fuel). The flow of charge/fuel may be allowed only after the user/consumer connecting for charge/fueling is (fully) authenticated including payment credentials and/or secured budgets (for the charging/fueling activity). Further, particular capacities may need to be reserved/secured; particular capacities may comprise and/or be associated with different budgets and/or costs.

A user/consumer may comprise a consumer agent, user, supervisor, owner and/or (their) associated assets and/or further components and/or devices and/or (semantic) groups thereof. In some examples assets may include carts, posts, vehicles, (their) components and/or (their) devices (e.g. mobile device, cameras etc.). In other examples, they may include other consumer agent assets.

A provider/producer may comprise provider agents (including supervisors and/or owners and/or (their) associated assets and/or further components and/or devices) and/or (semantic) groups thereof.

In some examples, the provider may be a distributor (e.g. of a logistical network, grid/pipe/network backhaul etc.) having associated agents/assets which may include charging/fueling stations, posts, carriers, vehicles, (their) components and/or (their) devices (e.g. socket, outlet, plug, pump etc.). In other examples, they may include other provider agents/assets.

In some examples, the backhaul comprises a network of generative systems. The system may infer capacities at the distribution endpoints based on the (projected) capacity at the generative system endpoints and/or further distribution network (e.g. cabling, piping etc.) to the distribution endpoints. In some examples, at the generation endpoints it is expected that 100 KWh be generated for high winds from the west and 60 KWh for light winds due to geography and/or obstructions at/around the generation endpoint which may block wind exposure other than from west.

The capabilities and/or capacities at the (hierarchical) endpoints may be based on semantic times and/or further based on groupings of endpoints.

In some examples, the system determines and/or allocates a composite capability/capacity and/or interests/demand at (semantic) groups of endpoints. The composite capability/capacity may need to be likeable, satisfactory (or sufficient), affirmative resonant (including affirmative orientation) and/or may be based on undershoot/overshoot inferences in rapport with providers' and/or consumers' (composite) goals/interests/demand and/or associated hierarchies.

Composite capabilities may be inferred and/or (further) published for semantic identities, semantic groups and/or (further) endpoints. Capabilities may be inferred at endpoints and/or published as per access control; the composite capabilities budgets may be summed, averaged, subtracted.

As mentioned, the diffusion and/or access control may impact the inference and/or availability of (composite) capabilities. A container and/or divider may block such capabilities. In some examples, Jane carriers a tea pot while travelling in a car; while presumably a "tea pot (brewing)" capability may be inferred for the container (car), it may not be feasible to infer such capability for the container (car) because such capability is not published, blocked and/or access controlled (e.g. outside the container, endpoint, by a car's device/flux, by Jane (mobile) (device) etc.).

The system may infer optimal servicing agents/assets based on semantic inference. In further examples, the servicing agents and user/consumers (semantic) (ad-hoc) couple at/around particular endpoints which may be associated with their interests, preferences and/or (affirmative) resonance inferences.

A provider/producer may be also a consumer; in an example, a distributor charging station may be a user/consumer of a (grid) (infrastructure) backhaul and thus, a user/consumer may be associated with a charging station booth, sockets/plugs etc.

Further, a user/consumer and/or provider/producer may be comprised in, comprises, operates (on) or is a local/edge, remote, physical and/or virtual device, service, instance, tenant, web farm, wireless infrastructure, cloud and/or combinations of the former enumerated artifacts whether distributed or not.

As mentioned, the (charging/fueling) provider/producer may request secured budgets and/or capacities from the (charging/fueling) user/consumer and/or vice-versa in order to access the capabilities. In some examples, the secured budgets are based on additional information exchanged on the established communication links including indications, preferences and/or further (semantic) profiles from the user/consumer. In an example, while charging/fueling, an user/consumer may communicate its charging/fueling capabilities, interests and/or preferences (e.g. 24V-10 A (h), 20 kw (/h), 10/20/30 kw (/h), 89/92 octane etc.), (current) charging/fueling capacity/status and/or requested charge/fueling quantity/amount to the charging/fueling asset, agent and/or provider. The providers/producers (and/or associated assets) may match the interests and/or capabilities and/or further augment and/or negotiate with the user/consumer (asset). The matching of interests and/or capabilities may be based on matching preferences (e.g. Jane's (car/cart) specifies the preference for a particular type of fuel/charge (e.g. 92/89 octane, 20 A-12V/10 A-24V) and the provider matches the preference in the order provided (e.g. fuels/charges 92 octane and/or 20 A-12V if capable based on the first/leader matching preference in each category (e.g. gas, electric, fuel, charge etc.); further, the matching preferences may be based on semantic drift and/or semantic times (e.g. charge approximate/around 20 KW until I (Jane) return from buying a meat sandwich from the store). The provider and/or consumer may project availability, readiness, capacity status and/or index semantic times based on those; in some examples, the system determines that there won't be enough capacity (at the (hierarchical) servicing endpoints) to achieve the goal on Jane's return and thus, may challenge/propose to Jane a new indexed (projected resonant) semantic time (e.g. you may eat the sandwich inside the store). In an example, the generative system and/or charging asset has a capability of 24V at 5 A for $2/KWh at the time of light winds from the west and 24V at 10 A for $1/KWh at a time of high winds from the west; thus, an user/consumer asset requiring 24V at 5 A may opt to charge in any conditions while an user/consumer requiring 24V at 8 A or 5 A may charge based on a (profile) preference comprising a semantic time of high winds from the west (e.g. due to feasible assets and/or lower price); if no matching capabilities and/or semantic times are inferred (e.g. based on (resonant) semantic drifts) the system may augment the user/consumer with options and/or ask/wait for feedback.

It is to be understood that consumer preferences may be associated with profiles and/or may be further communicatively transmitted while at endpoints and/or at semantic times.

A semantic profile may encompass preferred capabilities and/or budget intervals at semantic times. As a user, device and/or vehicle/post is localized at endpoints it may communicatively couple and/or transfer the profile and/or preferences (e.g. selected based on inferred semantic (times)) and the system may assigns capabilities based on (further) matching (endpoint) capabilities with preferences and/or profiles.

In further examples, Jane opts to fill the gas tank with premium gasoline in case that the price is below $5/gallon or it can reach a goal for $50 worth of (premium) gasoline; in entropic cases, the system may select other preferences as per factorizations of circumstances and/or endpoints.

In some examples, a robotic cart/post may be charged 20% of its battery capacity; as such, while connecting and/or authenticating to an electric grid provider, the user/consumer asset (e.g. robotic cart/post), the provider asset (e.g. charging station) and/or socket/outlet/plug may transmit/exchange their semantic identities, (battery/charging) type/class, (battery/charging) parameters, current charging status/capability, preferred/optimal/requested/available charging parameters, preferred/optimal/requested/available amounts and/or other relevant information. As such, the user/consumer, (electric grid) provider and/or assets may determine the optimal/preferred/feasible/matching charging/fueling assets, parameters, capacities, semantic times and/or (secured) budgets (e.g. based on semantic drift, semantic times, flux, augmentation and/or negotiation); the optimal/feasible/matching preferences, parameters, capacities, semantic times and/or budgets may be determined at the user/consumer (e.g. cart/post etc.), the (grid) provider and/or can be negotiated.

Capabilities (of assets/provider) and/or their status (e.g. (90%) active/inactive, (80%) available/not-available, 10% depleted, 20 KWh available for low winds from the west, 50 KWh available for high winds from the west, 92 octane, J1772 type connector, CCS charge, CHAdeMO charge, Level 3 charge, fast charge etc.) may be interrogated and/or kept up to date by challenging, receiving and/or computing inputs from at least one sensor and/or from a computing/sensing infrastructure; it is to be observed that the capabilities and/or status may comprise and/or be associated with (inferred/projected) weights, budgets, capacities and/or semantic times/intervals. In further examples, availability and/or capacity of particular capabilities (at/of an asset) may be available/not-available, active/inactive and/or factorized/indexed at/(based on) particular semantic times.

The system may project and/or determine resonance and/or match based on an (semantic) orientation of a parameter, readiness, likeability and/or (further) status. In an example, the orientation comprises determined semantics such as 70% ready/likeable/available, 80% ready/likeable/available and the system may project (a composite) status based on such (affirmative) (resonant) (capability/capacity/parameter/duration/interval) orientations (e.g. at, within, towards and/or matching a goal/preference), orientation, speed/velocity (at, within, towards and/or matching semantic times/intervals) and/or further semantic analysis. Readiness, likeability, availability and/or further status may be associated with a particular user/consumer and/or associated capabilities and/or goals (e.g. Jane ('s) is interested in charging 80 KW and/or 10 gallon in (the next) (projected) 20 mins while John ('s) is interested in160 KW and/or 5 gallon; as such, (initial) capacities may be or not likeably/sufficient/satisfactory adjusted and/or oriented based on demand). As such, the readiness, likeability, availability and/or further status may be projected and/or factorized based on (orientation of) a plurality of goals and/or parameters thus, acting as and/or encompassing an overall (composable) indicator and/or semantic identity. In further examples, the consumer interest is to charge 40 kw in (the next) 15 mins (and/or) after Jane leaves and/or before John arrives; as such, the system may project the (matching) (resonant) capabilities, agents, endpoints and/or groups thereof based on their (projected/negotiated) capacity and/or adjust (their) parameters to provide the desired, sufficient and/or affirmative resonant capacity within the semantic times/intervals.

The readiness, likeability and/or further status may comprise factorizing fluency, errors and/or pooling (at/around servicing agents and/or endpoints). In further examples, they may be factorized based on a semantic time (e.g. readiness/likeability/availability 2 mins before/after Jane (s) fuels/charges, readiness/likeability/availability (in 5 mins) in case of an emergency at Does house etc.). It is to be observed that the system may determine/correlate/assign (projected) (semantic) time/intervals and/or endpoints with readiness, likeability and/or further status (values) and/or vice-versa. Further, composite inferences (e.g. on endpoints, routes, indicators etc.) may determine further actions (e.g. to avoid pooling and/or optimizing (e.g. steering, orienting and/or minimizing) an emergency vehicle error divert, diffuse user/consumers/agents and/or index/orient (their) errors etc.).

We mentioned that the capabilities and/or interests including status, capacity and/or demand and/or semantic times may be published and/or advertised. In further examples, the capacity (orientation) is negotiated in the collaborator's network. In examples, provider (agent) A may challenge and/or expresses an interest to the backhaul, logistic network and/or provider (agent) B for more/less/indexed capacity (e.g. tri-phasic currents, agent flows etc.) at/during a (indexed) semantic time/interval. Alternatively, or in addition, provider (agent) B may know and/or project the interest of collaborators and challenge them with the availability of additional capacity at semantic times. It is to be understood that provider (agent) A and/or provider (agent) B may be, comprise and/or be based on a group and/or hierarchy.

Capabilities may be published, advertised, associated and/or comprise particular status information and/or semantics (including orientation semantics) which may be or not associated with particular (semantic) times. The capabilities, their status (e.g. available, active etc.) and/or further associated (semantic) times and/or intervals may be projected. Further, the system may seek and/or have a goal to affirmatively factorize fluency, minimize errors and/or avoid pooling at/around/towards (servicing) endpoints.

The capabilities may be published based on access control. Further, capability publishing may be approved in a hierarchical manner. As such, a publishing by an operator with lower rights in the hierarchy may need to be approved by a supervisor, manager and/or an operator with higher rights in a circumstantial access control hierarchy. It is to be understood that the circumstantial access control hierarchy may be associated with semantic fluxes hierarchy, owner/supervisor/operator hierarchy, project/team/organization (management) hierarchy, contracting agent (e.g. contractor—sub-contractor and/or agent—sub-agent) hierarchy and/or any other hierarchy relevant to the circumstantial access control.

An operator operates and/or supervises endpoints, fluxes and/or services (at endpoints and/or (robotic) devices) and/or is a supervisor, aggregator and/or broker of services and/or servicing agents (at endpoints and/or (robotic) devices).

Users, supervisors and/or operators may activate, enable/disable, allow/block and/or publish inferred capabilities and/or interests at endpoints/containers and/or (further) hierarchies (of endpoints/containers and/or fluxes).

It is to be observed that a (project/team/organization) (affirmative resonant group) supervisor/management hierarchy (within a semantic time) may determine (assignment/diffusion) of hierarchical goals. In examples, DOES have a goal to keep the DeLorean in excellent working condition during summer and/or before starts raining and thus, S2P2 under the supervision of Does (until S3P3 is present/detected) (has assigned/diffused and/or) have the same goal as Does (while supervising the DeLorean within the (hierarchical) semantic times and/or routes of summer/starts raining/S3P3 present/detected etc.).

Fluxes may be mapped (hierarchically) to a hierarchy of containers. Alternatively, or in addition, (associated) endpoints may be mapped to containerized areas, locations and/or further hierarchies.

In some examples, a first operator and/or supervisor other than the servicing agent and/or it's representatives/operators may select and/or request to publish a sensed and/or detected capability of a servicing agent. In further examples, the first operator selects/requests to publish the capability and the servicing agent and/or its representatives/operators is/are notified and/or augmented to approve/allow or reject/block the publishing. Similarly, a servicing agent and/or it's representative/operators may select to publish a capability and the first operator and/or supervisor is notified and/or augmented to approve/allow or reject/block the publishing. In further examples, the first operator is/comprises an operator hierarchy and the publishing approval is sequential and/or (semantic) timed based on such an operator hierarchy. Alternatively, or in addition, the first operator/supervisor may configure (e.g. a flux, endpoint etc.) to enable/disable and/or allow/block particular capabilities and/or interests; as such, only the particular capabilities/interests are diffused within the (flux/endpoint) hierarchy.

Alternatively, or in addition, the supervisor/operator may configure to restrict the diffused capabilities and/or interests; in some examples, the restrictions are associated with semantic times. In an example, a CT reading station publishes an original capability of "DISPLAYING CT EXAMS IN 4K/8K" and further, Jane as a/an (CT) operator/supervisor of an associated (higher level) flux and/or (location) endpoint it may restrict and/or split the publishing to DISPLAYING CT EXAMS IN 4K (BEFORE THE PUBLIC READING STATION OPENS) (, 8K AFTER THE PUBLIC READING STATION OPENS) and/or DISPLAYING CT EXAMS IN 8K (AFTER THE PUBLIC READING STATION OPENS). It is to be understood that such restrictions may be based on post original capability publishing configuration and/or pre original capability publishing configuration wherein the operator/supervisor (Jane) configures enable/disable, allow/block diffusion publishing rules.

Alternatively, or in addition the operator/supervisor (Jane) (one click) approves/rejects/enables/disables/allows/blocks and/or (further adds/configures restriction) updates (to) the original publishing; it is to be observed that the system may verify that the updates to the publishing are coherent, do not create confusion, are not entropic and/or are within the original publishing meaning/scope/endpoint.

In further examples, the system has, infers and/or discovers a plurality of interests and matches them with (inferred and/or discovered) rendering and/or augmentation capabilities and/or augmentation servicing agents at endpoints. In some examples, the system determines that John wants to video call with Jane and (likeably) watch a game (e.g. in high resolution). As such, the system determines the (feasible/likeable/affirmative) (required) capabilities, devices and/or further providers (or servicing agents) at endpoints (e.g. such as vision and/or sound) and selects them to service the interest based on the observing views and/or further profiles and/or preferences. Alternatively, or in addition, the system challenges the providers of capabilities at endpoints.

In some examples, the servicing of an interest comprises (ad-hoc) semantic flux/stream coupling (with/between the augmentation (published) (flux) capabilities and (published) (flux) interests).

The system infers, determines and/or discovers capabilities and interests and matches them based on various techniques such as explained in the application. In further examples, the capabilities and/or interests may comprise discovered and/or inferred activities and the matching may be based on such activities. In an example, the system infers, projects and/or discovers (via sensing) that a servicing agent's asset has a towing kit and thus, is capable of "towing" activity. Further, the system determines and/or projects artifacts requiring and/or likeably of a towing activity at endpoints (e.g. Jane's car disabled and/or unable (or in high entropy) to perform ongoing planned activities/movement etc.) and likeably and/or affirmatively matches them with the towing asset for performing the towing activity (at semantic times).

In further examples, the system may maintain a set of emergency (first responder) capabilities, agents, endpoints and/or routes which may be assigned, activated and/or allocated for critical emergency (first responder) activities and/or indicators. For such capabilities, agents and/or endpoints the system may ensure facile (e.g. friendly, fluent, affirmative resonant etc.) access/activation/readiness/availability, diffusion and/or optimal access/activation/readiness/availability (semantic) times. In some examples, the system may impede access/diffusion of non-emergency agents at/around the servicing endpoints and/or encourage their diffusion away from such endpoints.

Availability (status) (indicators) may comprise access, readiness and/or activation (status) (indicators) inferences/factorizations.

Inference may consist of and/or comprise a projection. As such, inference/"inference" may mean and/or comprise projection/"projection".

Inference of (a) status, capability, interest, (further) associated indicators, optimization and/or matching may consist of and/or comprise projections of (the/a) status, capability, interest, (further) associated indicators, optimization and/or matching. In some examples, the projections may comprise semantic times/intervals; further, they may comprise similar/analogous inferences and/or projections on (agent) components.

It is to be understood that in some embodiments the capabilities may be associated with an asset and/or endpoint. Further, the capabilities may comprise an identity of the asset and/or endpoint; in some examples, the identity is a semantic identity which may be further inferred based on various inputs such as explained throughout the application.

In some examples, the system projects and/or determines that there would be facile, likeable and/or no impeding access/diffusion towards/at a charging station/endpoint in an/a (next) (undershoot/overshoot) (semantic) (time) (endpoint/trajectory) (orientation) interval and thus, the access is affirmatively factorized. The system may affirmatively factorize readiness (e.g. at the station endpoint) based on a (projected) affirmative resonant activities; such activities may be associated in some examples with lock/unlock, allow/block, clear/diffuse a blockage/hazard at/of capabilities, adjust capacity, likeable provisioning, completed (e.g. as per clauses, likeability, satisfaction etc.) repair/maintenance (and/or) orders, likeable/satisfactory repairs/maintenance, indications etc. Further, the system may project and/or determine that a capacity and/or capability is active (e.g. can be unlocked/diffused/transferred and/or flow to a user/consumer via a functional socket/outlet/plug/agent/endpoint and/or as per expected parameters) at intervals.

The readiness may be based on activities completion (e.g. as per clauses, likeability, satisfaction etc.) which would make the servicing agent capable of sustaining service as per (advertised/negotiated) capabilities. The projected completion may be based on calendar entries, semantic times and/or clauses of a contract and/or order. Further, the system may project and/or verify the completion based on sensing and/or further semantic analysis.

The system may determine (after an initial projection) new (leadership) indicators, semantic identities and/or endpoints which may determine (high) entropy in projections (orientation) at/towards/within (servicing) endpoints, further activities and/or time/intervals. In some examples, such indicators are based on sensed information (e.g. at/around the servicing endpoints and/or endpoints comprising the servicing endpoint) and may not have been considered (as leader indicators) during previous projections. Thus, the system may associate (and/or learn) (hierarchical) (groups of) new determined (leadership) indicators/identities/endpoints with those considered initially and/or further assign/associate a factorized error indicator and/or interval. As such, next time when the system may want to steer an orientation and/or minimize an error associated with such servicing artifacts it may allow/block, cause and/or determine the associated leadership indicators based on the learned (semantic) groups and/or error indicators and/or intervals. The error intervals may be based and/or comprise semantic times/intervals defined based on error indicators; further, an error indicator may be compared with an error interval.

In some examples, capability and/or capacity distribution (at endpoints and/or groups) is deemed as not adequate/not satisfactory and/or slacking when there is no (unreasonable) blocking, dividing and/or impeding at/around/towards the servicing artifacts/endpoints and, further, there is (unreasonable) non-affirmative (e.g. increased) pooling and/or fluency is low.

The system may infer that a particular distribution of capabilities (e.g. at endpoints) and/or leadership factors may cause service improvement (e.g. related with resonant user/consumer/provider satisfaction and/or likeability, being at least affirmative resonant with contractual/advertised clauses etc.) in some circumstances and/or may cause degradation (e.g. non-affirmative resonant, non-likeable, unsatisfactory etc.) in other circumstances. As such, the system may adjust and/or route capacity/flows to particular agents, assets and/or endpoints based on short-term/long-term planning in order to affirmatively factorize goals within semantic times and/or within (error) intervals.

The system may consider hazards posed to a capability at a semantic time caused by (presence/lack of) agents and/or conditions. In some examples, the system projects and/or measures that a lack of wind may deem a charging servicing agent/asset/endpoint/capability to lack capacity/capability, inactive, unavailable and/or further non-affirmative resonant. In other examples, the system projects and/or measures that very high winds may cause damage and/or inactivate assets/capabilities and/or making a charging servicing agent/asset/endpoint/capability inoperable, not accessible, inactive, unavailable and/or further non-affirmative resonant. As such, the system may prefer a circumstance and/or interval with/of sufficient high winds while keeping the capabilities (and/or/of the provider/producer/user/consumer) safe and/or active. In some examples, in order to keep the capabilities (and/or/of the provider/producer/user/consumer) safe and/or active the system may redeploy them to safety factorized endpoints; alternatively, or in addition, the system factorizes and/or deploys (available/active) counter measures and/or dividers (e.g. gates, fairings) for blocking/diffusing hazards (e.g. diffuses a likeable flow of air) and/or likeably diffusing/routing them (e.g. away, to (groups of) channels and/or fairings, to other servicing capabilities/endpoints etc.).

Error minimization may comprise reducing confusion and/or increasing coherency based on orienting the inference and/or agents from higher level (e.g. encompassing) endpoints, semantics (e.g. semantic identities) and/or semantic times/intervals to lower level (more precise) endpoints, semantics and/or semantic times/intervals based on (projected) availability, presence, leadership indicators, error, access, readiness, activation and/or semantic times/intervals.

Capabilities may publish, advertise and/or comprise particular status information and/or semantics which may be or not associated with particular (semantic) times/intervals.

The system may infer, associate and/or assign a provider servicing capability and/or agent for/to a user/consumer based on matching the user/consumer interests (including preferences/capabilities) and/or semantic identity with the servicing capability (including its status); the matching may comprise time interval matching including semantic times matching, semantic drifts/shifts, semantic orientation, endpoint mappings and/or other (semantic) (resonance) techniques such as explained throughout the application. The semantic time matching may comprise/encompass semantic drift/shift and/or (further) semantic orientation matching. The system may infer the (available) servicing capability and associate/assign it to the user/consumer; further, the system may challenge the user/consumer to select (amongst a plurality of inferred/associated/assigned servicing capabilities) and/or confirm/indicate the associated/assigned/proposed/preferred/likeable/optimal servicing capability and/or semantic times.

In some examples, capabilities and/or interests are associated with tunnels/tunneling/channels/channeling (functions) of (provider/consumer) semantic fluxes/streams. Further, such tunnels/tunneling/channels/channeling (functions) may be matched and/or connected via ad-hoc semantic coupling and/or other connection establishment techniques.

The tunneling, channels and/or (associated) fluxes and/or streams may be hierarchical and/or hierarchically encrypted/decrypted, accessed (based on access control) and/or tunneled based on semantic groups and/or their associated semantic hierarchy. In similar ways (associated) capabilities may be published, encrypted/decrypted, accessed (based on access control) and/or tunneled.

Capabilities may be published, encrypted/decrypted, tunneled and/or accessed based on access control and/or gating.

As mentioned throughout the application agents/assets may be further associated and/or mapped to endpoints. Any inferences and/or determinations comprising the agents/assets may be based on and/or be associated with (mapped) endpoints determinations. resonances and/or inferences.

In some examples, at least one sensor inputs are used to determine at least one semantic identity for the user/consumer. This may be matched against a data store (e.g. such as (comprised in) a (volatile/non-volatile) (semantic) memory, hash table, database etc.) to determine additional information about user/consumer. In some examples, the user/consumer semantic identity is based on inputs received from at least one optical/infrared sensor/camera and/or further transmitted through wireless/wired transceivers. Alternatively, or in addition, a semantic identity is inferred based on other types of sensors as explained in this application.

A capability status (indicator) and/or associated semantics may be inferred and/or determined based on (reported) inputs from sensors. Alternatively, or in addition, they may be inferred and/or determined based on status indications communicated from (the capability providing) actors/agents/assets (and/or associated/attached computing/transceiver devices communicatively coupled with the sensor and/or further (provider and/or consumer) (computing/sensing) infrastructure).

A user/consumer and/or provider/producer may comprise stored data of asset types/classes/identities and/or their associated/comprised components, parameters, requirements and/or specification. Thus, in an example, when a provider/producer receives a type/class/identity from a user/consumer it may search the stored data for the components, parameters, requirements and/or specifications associated/comprised with/in the particular type/class/identity. Alternatively, or in addition, it may challenge a flux for such information on the type/class/identity. Such information may be used alternatively, or in addition, to other exchanged information for (further) authentication and/or optimal matching.

The user/consumer/provider/producer may further authenticate assets and/or requests based on matching and/or feasibility between its stored data and/or exchanged information (e.g. a provider does not (fully/100%) authenticate an asset identifying as a robotic cart and requesting 92 octane gas for fueling unless the request is for fueling a (100%) verified/feasible/capable (92 octane) gas carrier cargo; and/or authenticates the robotic cart based on a factoring/indexing indicators associated with the capability of the cart/cargo of carrying/storing (92 octane) gas). Based on such authentication factorizations it may further allow/disallow activities/requests and/or further challenge collaborators for further information.

In some examples, Jane's (car/cart/post) (as user/consumer) requests a charge of 24V at 10 A (for/at a (semantic) time) which is (associated with an interest and/or preference) not-negotiable and/or hard-set (e.g. the provider asset must either (be capable to) provide the 24V at 10 A (for/at the (semantic) time) or reject/not-provide at all any charging). In further examples, Jane's (car) (as user/consumer) requests a 92 octane gasoline but the fuel pump may provide only 87/89 octane and thus, Jane's (car/cart/post) request is rejected and/or Jane (car) is augmented with optimal options and/or directed to resonant providers, agents, assets and/or endpoints (e.g. electrical charge, sockets, outlets, plugs, gas stations, fuel pumps etc.).

It is to be understood that, in the example, Jane's car/cart/post may be interested in a plurality of factorized and/or ordered (indicated/indicator) goals and/or preferences (e.g. ordered/weighted preferences for: (80%) maximum emissions of 3 grammes of $CO_2$ per trip, (100%) maximum emissions 500 grammes of $CO_2$ per year, (50%) electric charge, (50%) 92/89 octane gas etc.) and the servicing capability is determined based on such interests, charging/fueling history, availability and/or feasibility.

Analogously, the system may determine servicing capabilities based on other preferences, law of the land and/or regulations. In some examples, endpoints and/or areas to Does house may have/not-have particular regulations (e.g. servicing, weight, hazardous emissions and/or other parameters etc.) and thus, the system may route and/or prefer some endpoints over the other.

In other examples, the system and/or Jane ('s) may prefer (for optimality/feasibility) an electric charge in circumstances where faster charging is available (e.g. such as with high winds from the west) and/or 92 fuel octane.

In further examples, Jane ('s) may specify (and/or the system projects) that has 10 min and/or 10$ to spare/spend at the servicing stations and/or 30 min total to drive 15 miles and/or to Does house and thus, the system may determine the optimal route towards Jane ('s) (final/intermediate) destination based on Jane (s) goals, interests (including preferences, budgets and/or capabilities such as electric/fuel, J1772 etc.) and/or further (active) servicing capabilities and/or servicing agents available on the path to the destination.

The system may determine servicing capabilities and/or routes based on other Jane ('s) preferred capabilities, law of the land and/or regulations. In some examples, endpoints and/or areas to Does house may have/not-have particular regulations (e.g. for passing, usage, servicing including charges/budgets etc.) and thus, the system may route and/or prefer endpoints as per Jane ('s) interests/goals. In some examples, endpoints and/or jurisdictions towards/around/at Does property/house may have a regulation for accepting/not-accepting, servicing and/or charging (budgets) (e.g. (for) particular types of vehicles/powertrains, hazard emissions, weight of the vehicle etc.) particular agents based on capabilities, attributes and/or further (sensed) parameters. In other examples, the endpoints/jurisdiction may have a (ordered/factorized) (indicated/indicator) preference for not-charging (fees) or freely servicing/charging (e.g. electrical/fuel charging, fueling etc.) cars with lift kits and/or winter tires (e.g. in winter) due to resonance against hazardous conditions; and/or charging/not-charging particular agents in particular circumstances etc.

A provider may augment users/consumers with the requested, feasible and/or optimal options and/or assets (as Jane's (car) enters a gas/charging station the provider's system signals, indicate and/or augments Jane (car) on the optimal/feasible/matching pump and/or charging socket—e.g. transmits to the user/consumer (e.g. Jane/car) and/or an associated (user/consumer) (mobile) device (e.g. Jane's mobile and/or car augmentation/entertainment device etc.) and/or application (e.g. application running on the device which may explain via voice and/or display a (facility/station) map and/or indicates the optimal/feasible/matching pump etc.) the optimal/feasible/matching pump and further, informs, indicates and/or signals it (e.g. via sound, (green/red) light etc.).

In further examples, the provider may signal and/or indicate a projection of the availability of an optimal capability for a user/consumer; in some examples, the projection may include semantic times/intervals and/or be associated with particular user/consumers at particular endpoints.

Based on an availability projection and/or availability indication the user/consumer may identify and/or project further capabilities, activities and/or routes for (optimal) accessing the indicated capabilities and/or endpoints.

In some examples, the provider may delegate/assign to the user/consumer supervisory rights to (its) particular capabilities and/or associated endpoints based on endpoint presence, resonance and/or ad-hoc semantic coupling. Analogously, the user/consumer may delegate/assign to the provider supervisory rights to (its) particular capabilities and/or associated endpoints.

In further examples, once an indication and/or (further) activity is projected, received and/or determined (e.g. (based on) green light etc.) at the user/consumer it may activate and/or delegate supervised capabilities and/or perform activities for accessing the indicated capability and/or endpoint in a resonant manner.

In further examples, the optimal/feasible/matching parameters, budgets and/or preferences may be based on: battery condition parameters such as State of Charge (SOC) (in %), Depth of Discharge (DOD) (in %), Terminal Voltage (in V), Open-circuit voltage (in V), Internal Resistance; and/or battery technical parameters such as Nominal Voltage (in V), Cut-off Voltage, Capacity or Nominal Capacity, Energy or Nominal Energy, Cycle Life, Specific Energy (in Wh/kg), Specific Power (in W/kg), Energy Density (in Wh/L), Power Density (in W/L), Maximum Continuous Discharge Current, Maximum 30-sec Discharge Pulse Current, Charge Voltage, Float Voltage, (recommended) Charge Current, (maximum) Internal Resistance.

It is to be understood that determining optimality of/between assets, options, preferences, interests and/or capabilities comprises assessing a (coupling) match (e.g. matching plug/socket, matching octane/parameter, matching interest, matching preference etc.), feasibility (such as availability, accessibility, viability, sufficiency, achievability), resonance and/or (negotiated) budgeting. Thus, optimal/"optimal" may also refer and/or comprise preferred/"preferred", feasible/"feasible" and/or matching/"matching" (wherein preferences/profiles, feasibility and/or (further) matching is assessed based on semantic techniques such as drift, semantic times, resonance etc.).

The couplings between user/consumer, provider/producer, actors/agents/assets and/or further (associated) (computing/sensing) infrastructure may be based on ad-hoc semantic coupling and/or further communication establishment techniques.

As explained, the system may generate, store and/or communicate additional credentials and/or authentication information. In examples, if the connection between the actors/agents/assets is unreliable and/or (is) drops/dropped the system may establish/restart the communication coupling and/or connection with new credentials (as per procedures/protocols previously explained). Alternatively, or in addition, the system may use the existing communication/connection credentials. The credentials and/or authentication information may be expired and/or renewed based on particular (semantic) times and/or intervals.

The communication on the first and second wireless/wired address and/or interface may cease and/or be terminated when the mobile device (or plug) is removed from the holder (or socket/outlet), based on inferred activities, semantic times and/or localization at endpoints.

Further, FIG. 45C comprise a block diagram with typical functional components of each entity/agent/actor.

The data transmitted between the user device, mobile device holder's sensing/communication component and/or cloud provider/entity/device/service may be further encrypted via security certificates and/or (public/private) keys. In some examples, the certificates, (public/private) keys and further components may be communicated as part of the initiation and/or connection steps (e.g. such as depicted in FIG. 45A-B).

In some examples, the provider (e.g. such as in FIG. 45B-C) is comprised in, comprises or is a local/edge, remote, physical and/or virtual device, service, instance, tenant, web farm, wireless infrastructure, cloud and/or combinations of the former enumerated artifacts whether distributed or not.

In some examples, the mobile device, holder/cart and/or provider may communicate via at least one wireless/wired infrastructure and/or providers (of at least one operator). Alternatively, or in addition, they may communicate through point to point and/or direct connection between their components and/or wireless/wired communicators.

The wireless/wired communicators and/or infrastructure may provide localization capabilities (e.g. such as in US patent application US20140375431, incorporated herein by reference) and/or other techniques) which further allows for increased security during connection establishment and/or communication coupling. In some examples, the actors (e.g. mobile device, holder/cart, provider) may accept and/or establish a connection if is deemed that the mobile device and holder/cart are at the same, close by and/or particular (activity) locations and/or endpoints; if this condition is not met during a connection request then the system may raise a security alert and/or augment a user/supervisor/operator of a possible attempt of breach and/or spoofing.

The robotic cart, or a related system, may determine that an item is either in or out of the bin. In one example, the first software application at the mobile device is configured to determine whether the item is in or out of the bin when the cart is positioned at a second endpoint based on a first determination that the item is in or out of the bin at first endpoint at a first time and second determination that the item is in or out of the bin at a second endpoint at a second time. In another version, this determination takes place at the robotic cart processor or, in another alternative, at a facility processor such as a computer located at or used by a cashier.

The determination of items (being) in/out of the bin may be further based on pressure/weight sensors/scales whether embedded in the mobility base, at the bottom of the bin, linked/attached to the arms and/or further scales and/or joints. Alternatively, or in addition, they may be based on pressure sensors monitoring/embedded-on the wheels/tires.

The system may lock the user device screen while the device is on the holder for security purposes. Further, any attempts of unauthorized removal of the device from the holder may trigger visual/sound and/or other augmentation alarms within endpoints and/or to user/owner/supervisor; further, as instructed or configured, evasive maneuvers may be performed by the holding arms and/or cart. The evasive maneuvers of the holder and/or arm may be based and/or directed to endpoints which may be variable factorized for hazards and/or other relevant factors/indicators.

An authorized user may be identified by biometrics (e.g. fingerprint, facial etc.). In some examples, an application (e.g. for cart and/or shopping) running on the mobile device may access operating system APIs for performing and/or enabling such identification. As such, the application relies on the underlying operating system to recognize authorized users of/on the device. Alternatively, or in addition, the application itself identifies the authorized users of the device and/or assets/carts. Alternatively, or in addition, a sensor (e.g. optical etc.) on the cart is used for biometric, gait and/or further identification.

In some embodiments the communication connection is established by registering the semantic identities and/or further semantic attributes of a connection/flux provider in a cloud and/or with a device and matching and/or grouping the semantic identities and/or semantic attributes based on various criteria as explained throughout the application.

The mobile device may communicate commands and/or flux information to/with the cart's modules and/or components. In some examples, the cart's mobility and/or activities are managed by the mobile device. Alternatively, or in addition, the cart's mobility and/or activities are managed by the cart itself via its embedded components.

While in holder, the mobile device may display a background and/or (multimedia) artifacts based on a user profile and/or further endpoints and/or semantic drifts including semantic times. As such, the owner/supervisor/user may recognize the supervised cart and/or device. The system may not allow displaying similar backgrounds and/or (multimedia) artifacts by two shoppers/users at the same time while at an endpoint in order to avoid confusion (e.g. at meeting points and/or pickup); thus, if inferring confusion, the system may suggest additional backgrounds and/or multimedia artifacts (e.g. based on further preferences in the user's profiles and/or further semantic drift inference with the endpoint semantics and/or semantic times).

In examples, Jane shops at a clothing store and her profile specifies that while shopping for clothing, she wants to be displayed and/or rendered as an anonymized nurse. If the system detects in the store a similar user using a similar semantic identity and/or rendering, then the system may augment Jane and/or further selects a further preference and/or semantic identity (e.g. from an ordered list and/or based on factorizations at endpoints and/or further semantic drifts/times). In some examples, the system may select, augment and/or display on an anonymized nurse carrying a poinsettia and thus, being affirmative resonant with Jane. Alternatively, or in addition, the system may add and/or display an unique name and/or identifier.

A user may be charged for the amount of time and/or energy consumed by the cart while under its supervision. Such charging may happen automatically through a/the supervising mobile device application. A user may specify the limits for shopping in terms of budgets, semantic times, (semantic) routes and/or other restrictions.

In some examples, a (first) (mobile) (application on a) device in the possession of the user may be in communication with a (second) (mobile) (application on a) device (hold) at/of a cart. As such, the user is able to control and/or be augmented on the shopping experience on the (first) application/device while instructing the second application/device (with data) from the first application/device. The first (mobile) (application on a) device and the second (mobile) (application on a) device may establish communication links through similar procedures such as explained throughout the application (e.g. such as connection establishment between the holder/cart, provider and/or the mobile device, ad-hoc semantic coupling etc.).

The manipulator arms and/or holder arms may be positioned for enabling sensors (e.g. on a user device, cart, arms, infrastructure etc.) to capture field of views and/or inputs in a manner which allows processing units and/or programs to determine particular (semantic) attributes associated with the items. In some examples, the attributes are used to match articles and/or semantic identities of interest (e.g. green tomatoes with no black spots etc.). The articles of interest may be based on a shopping list, user preferences, instructions, endpoint and/or associated semantics etc.

In some examples, the device detects a green tomato with (many, large and/or not-likeable) dark spots and thus, (high/unreasonable/non-likeable) entropic and/or drifted from the goal (green tomato with no dark spots); although the green tomatoes is achieved, identified and/or localized, the composable goal may be highly, unreasonable and/or non-likeable drifted. It is to be observed that the high/unreasonable/non-likeable entropy may be determined and/or localized within and/or around an endpoint associated with green tomatoes.

In further examples, the semantics of interest may comprise and/or be associated with a semantic identity. Alternatively, or in addition, the semantics of interest may comprise and/or be associated with an attribute of an item.

The semantics of interest may be associated with a condition of an item. Further, they may be associated to particular sensed values and/or conditions (e.g. at 35 F, frozen, slightly frozen etc.). In other examples, they may be associated with an expiration date, a fabrication date, (storage/cooking/activity) requirements and/or restrictions etc.

The semantics of interest may be matched with user's capabilities wherein capabilities may include any artifacts (and/or components) owned and/or supervised by the user. In further examples, the user capabilities may extend based on the capabilities of its collaborators and/or (circumstance) resonant group members (e.g. John's capabilities extend with those of Jane's and/or DeLorean drivers). In some examples, the device selects items which are goals and/or quality/indicator suitable (factorized) based on such capabilities (e.g. selects suitable size and/or circumstance (e.g. winter) tires for John's car, selects (food, hazardous, special etc.) items which can be transported and/or stored in safe conditions by users, agents and/or assets etc.).

In examples, a manipulator arm turns a green tomato around in an camera/optical sensor's field of view to determine if it has black spots; it is to be understood that the sensor may be external to the manipulator arm or attached to the manipulator arm. Alternatively, or in addition, a holder arm may position a user device in a way that a camera/optical sensor in the mobile device can determine black spots on the green tomato.

Once the cart has finished the designated activity (e.g. shopping) the mobile device may be released from the holder. In some examples, the device is released from the holder based on the identification of the user/owner/supervisor (e.g. via fingerprint, facial etc.) and/or based on designated (end) activity endpoints.

Once the device is released from the holder (e.g. as sensed at the holder), the connection and/or communication between the user's mobile device and the cart may be disabled, invalidated and/or closed. Alternatively, or in addition, the user device and the cart may be communicatively uncoupled when the user device and/or cart are detected/localized at particular endpoints. Further, the cart may become available for other users and/or be redirected to storage and/or activity endpoints.

The manipulator/robotic/holder arms may comprise pressure, piezo, temperature and/or further sensors for measuring the weight, consistency, temperature of the manipulated items. In some examples, the consistency and/or temperature sensing allow the inference and/or factorization of (an item) freezing status indicator.

The cart's/post's electric motors used for manipulating arms and/or wheels may be powered through batteries incorporated in a (mobility) base such as B1.

It is to be understood that while grooves G1 and G2 are depicted in a particular horizontal orientation and/or position, they may be orientated and/or positioned differently such as vertically and/or in the interior and/or exterior of the bin.

In other embodiments similar functionality may be implemented through smart bags and/or hand-held shopping baskets. For the purposes of this application any components and/or functionality comprised/implemented by a cart/post may be substituted in/with components and/or functionality comprised/implemented by a smart bag/basket/container.

The smart bag and/or shopping basket handle may comprise at least one weight sensor (or transducer) to measure the weight of the bag and/or basket when the handle is held and/or supported. The weight, sensor generates an electrical output signal based on an input mechanical load, weight, tension, compression or pressure.

In some examples, a weight transducer is made of a body comprising connecting parts (e.g, via a spring) to which strain gauges and/or piezo elements are bonded and further generates/changes a current/voltage.

When force (tension or compression) is applied, the connecting spring is compressed, and variably change the distance between the connecting parts (e.g. a handle and the body, two handle parts, two body parts etc.) and thus, the tension strain and generated voltage. Thus, the change in voltage is proportional to the physical force applied and/or compression movement (e.g. extension distance) of the spring.

Baskets and/or containers may be manipulated by posts and/or secured through ELOCKS. Alternatively, or in addition, they may accommodate (smart) (shopper) bags and/or containers.

Alternatively, or in addition, posts and/or baskets have a fastening and/or latching component which fastens and/or latches a basket on a (top) holder module.

Figure 56A:
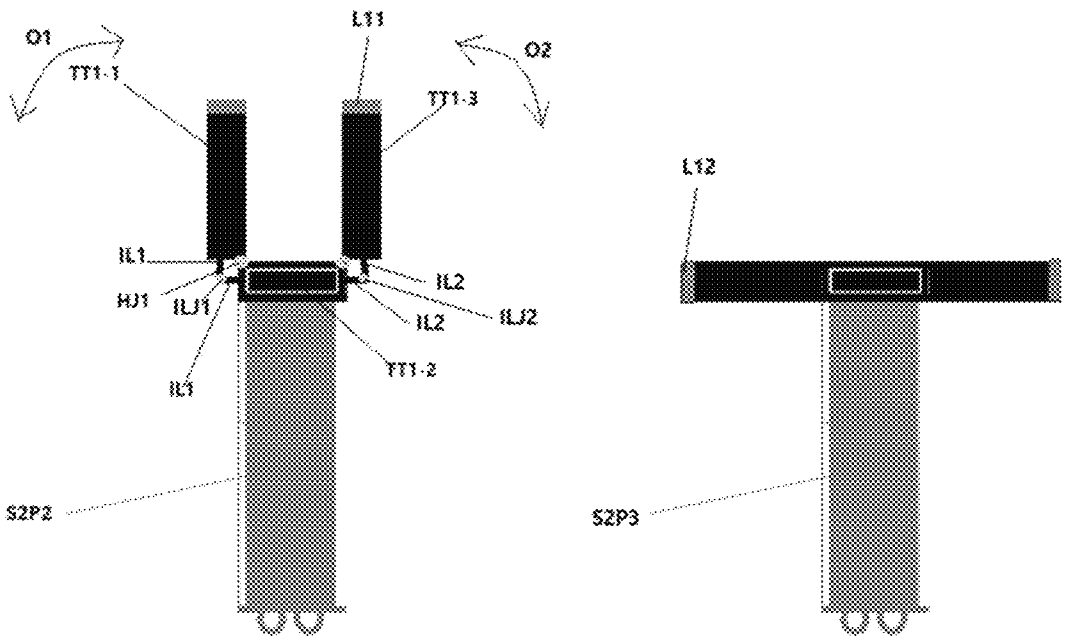
FIG. 56A is a perspective view of a first post having a first folded holder surface and a second post having a second holder surface.
Figure 56B:
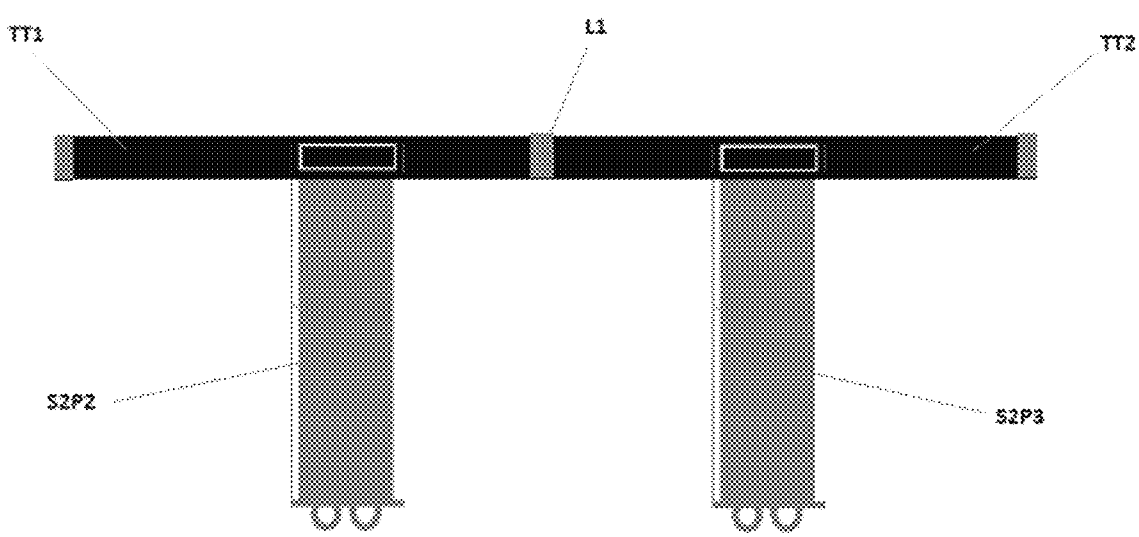
FIG. 56B is a perspective view of a first post and a second post having a composed holder surface.
Figure 56C:
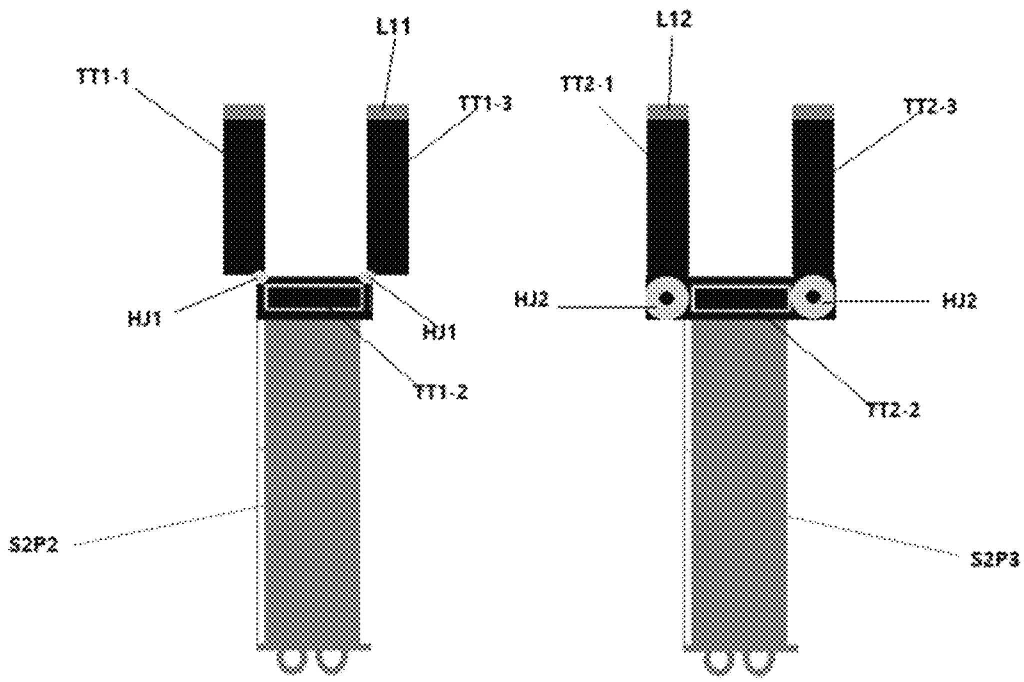
FIG. 56C is a perspective view of a first post having a first folded holder surface and a second post having a second folded holder surface.

In general, a (top) support holder/module/element (or surface and/or top) may be fastened, latched and/or supported (at the top) of/on the post. In some embodiments as depicted in FIG. 56A-C a (top) surface/holder (module/segment) such as TT1-2/TT1/TT2 is fastened and/or latched onto the supporting post(s) such as S2P2/S2P3.

Figure 57A:
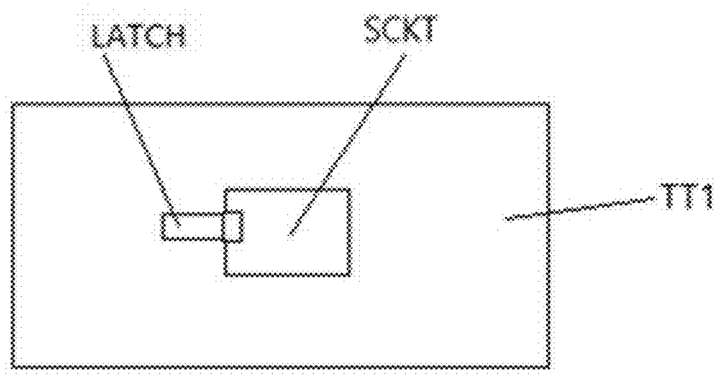
FIG. 57A is a perspective view of a fastening profile having a socket/pod.
Figure 57B:
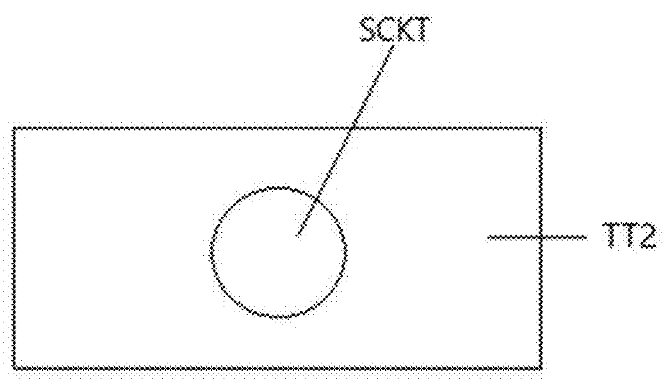
FIG. 57B is a perspective view of an alternate fastening profile having a socket/pod.
Figure 57C:
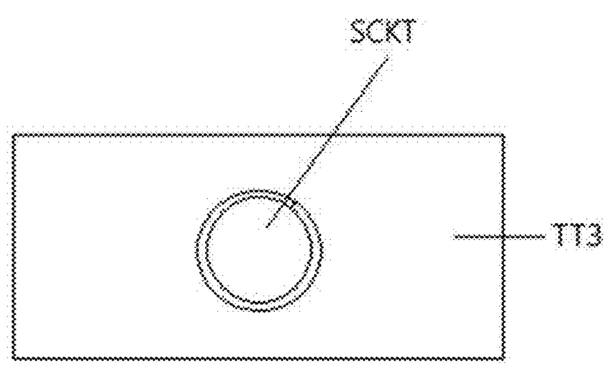
Figure 57D:
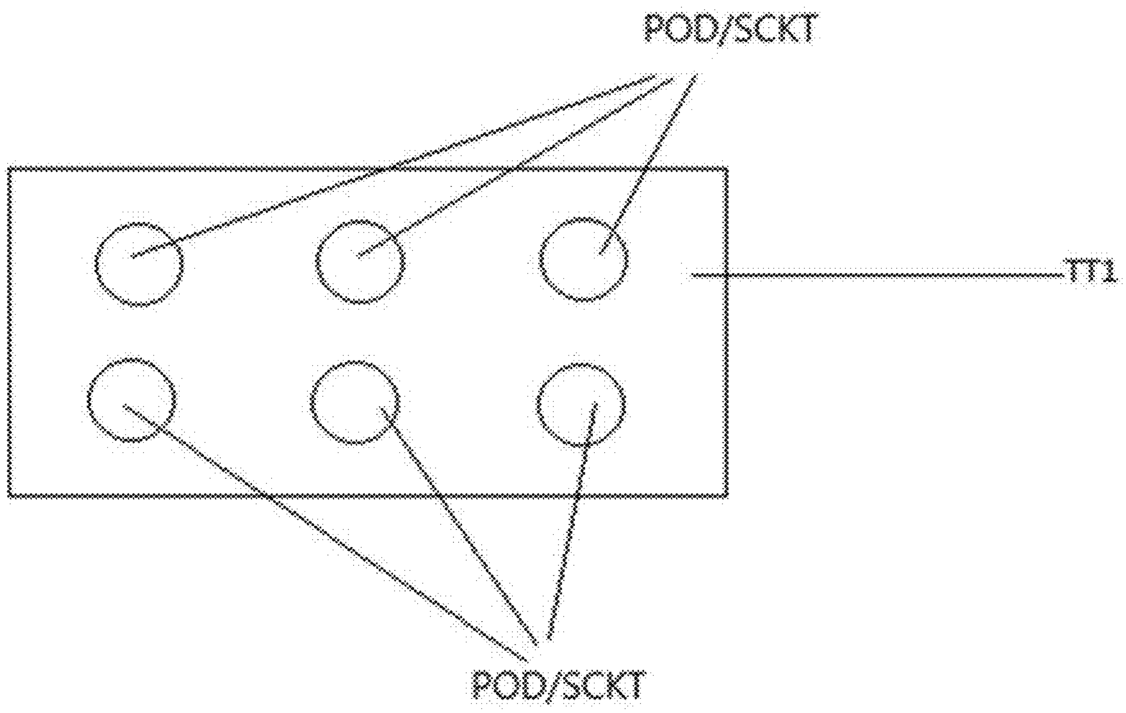
Figure 57E:
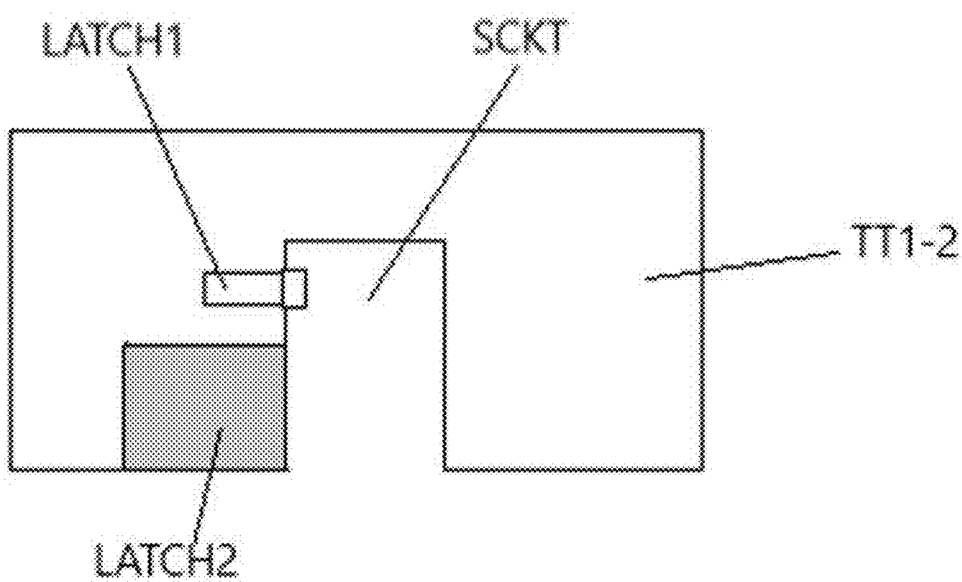

A (top) (support) surface/holder module (e.g. such as TT1-2/TT TT2) may be fastened to the post via suction pods/cups, channeled and/or locked shafts and/or other techniques some of which are explained in this application. In examples, such as in FIG. 57A-N various shapes of connecting fastening sockets/pods (SKT) of a post (top) module (e.g. such as TT1-2, TT2-2, TT3-2) may channel, hold and/or lock (e.g. via LATCH1/LATCH2) at least one protruding shaft attached/comprised by the (top) surface/holder module; alternatively, the (top) surface/holder module comprises the sockets/pods (SKT) and shaft components of posts protrudes through and/or is locked into the (top) surface/holder module. Alternatively, or in addition, the attaching module comprises (actuated) suction/vacuum pods/cups.

Figure 57F:
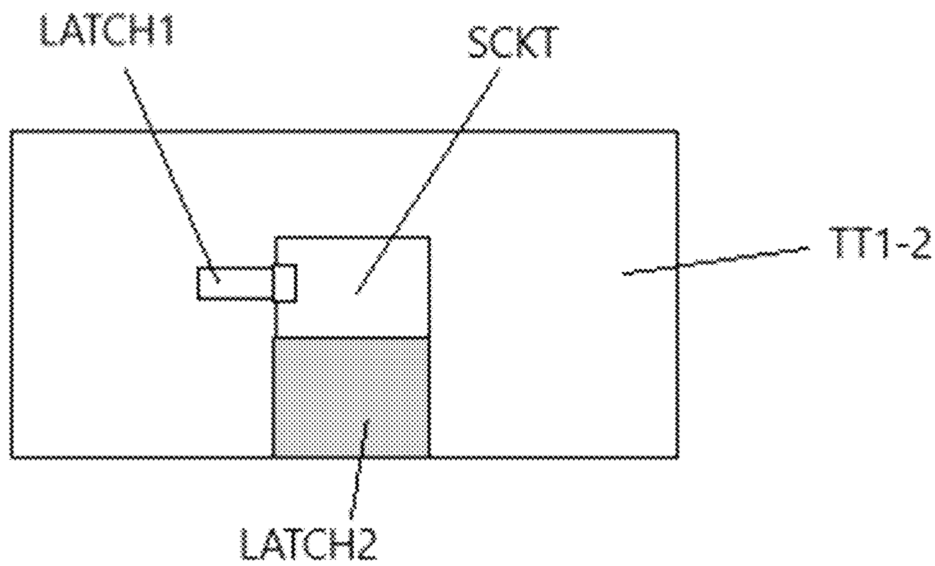
Figure 57G:
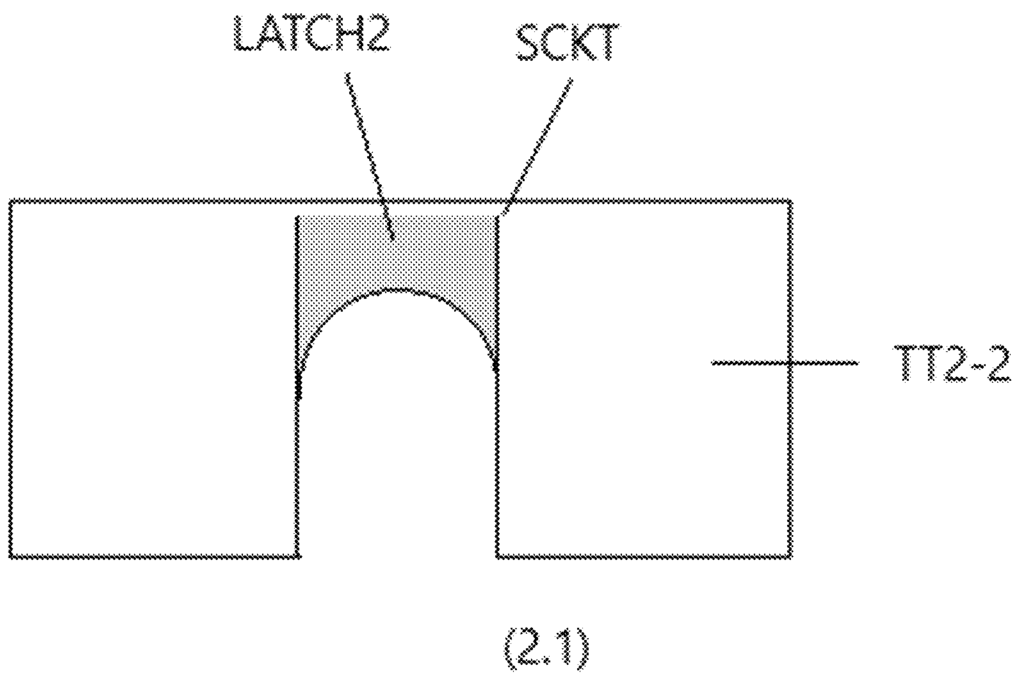
Figure 57H:
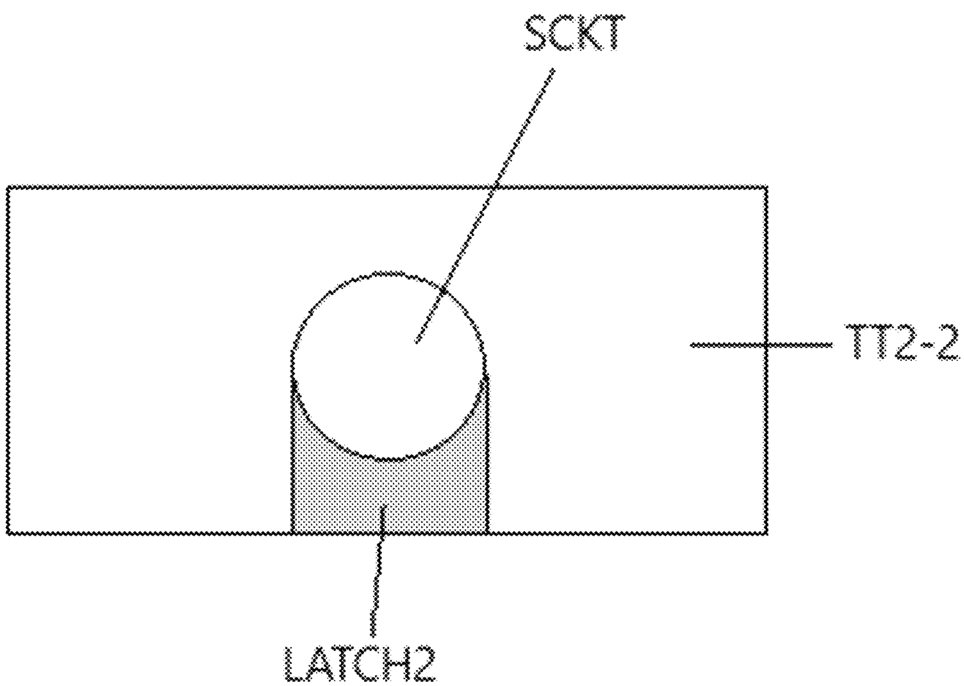
Figure 57I:
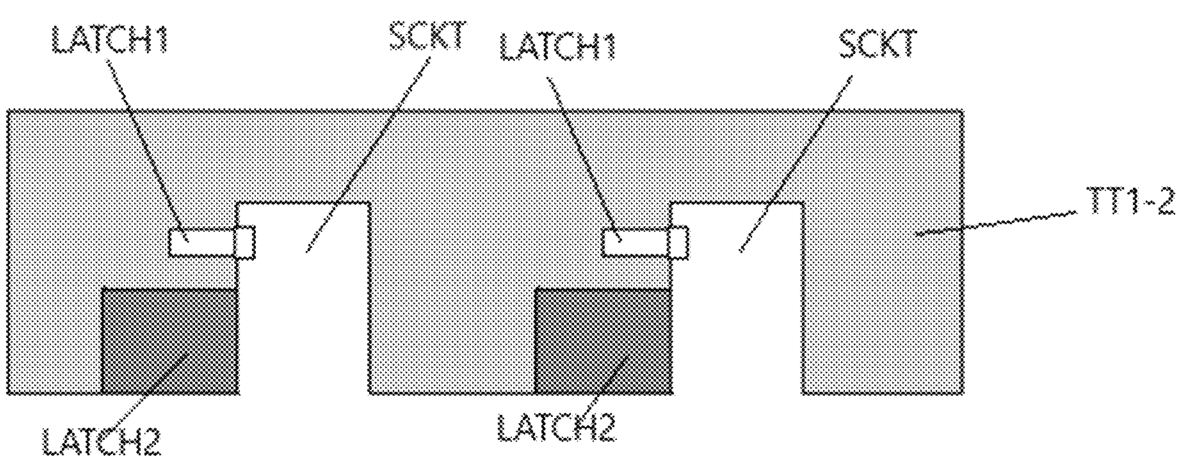
Figure 57J:
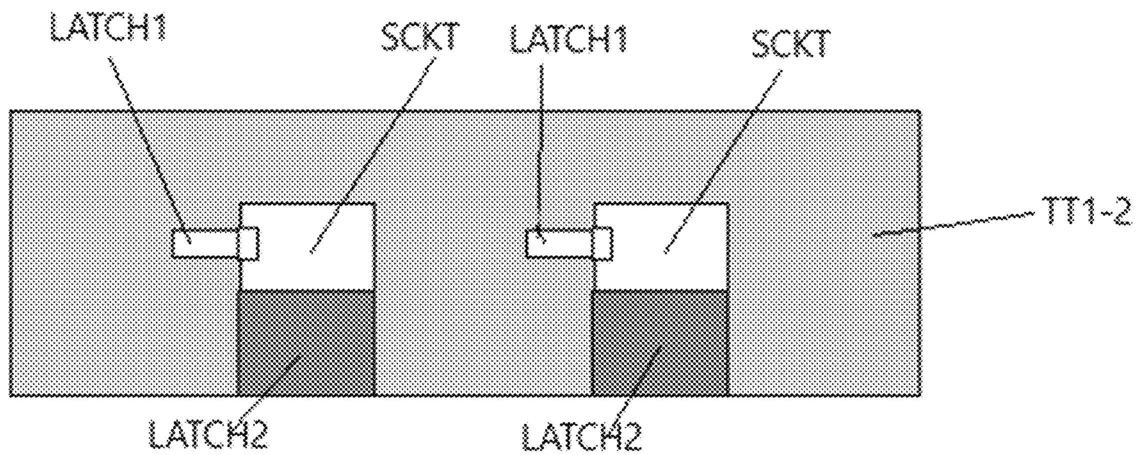
Figure 57K:
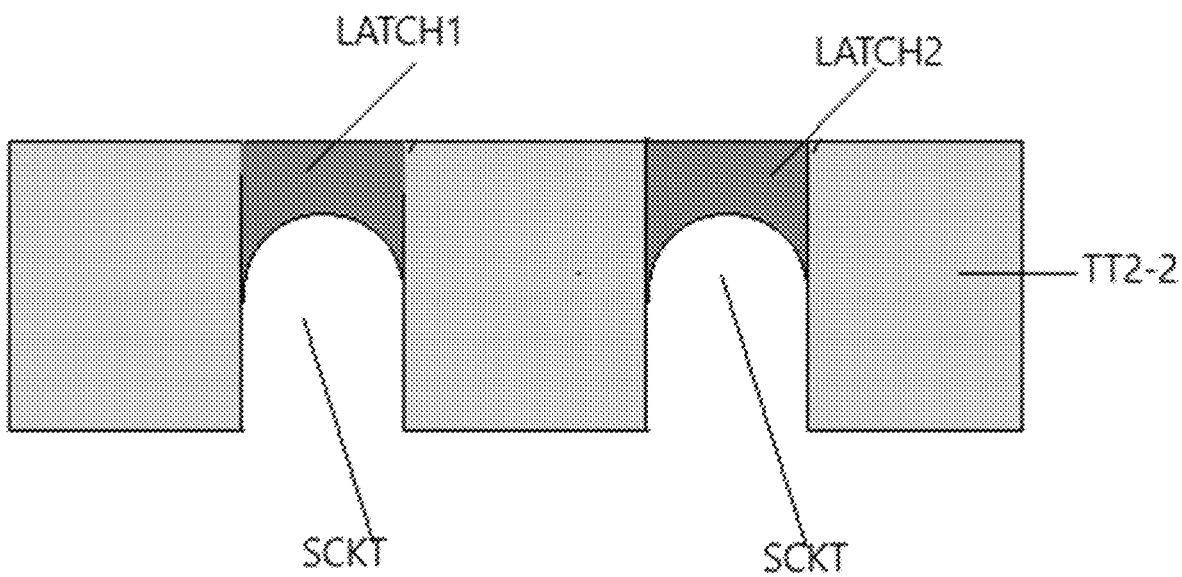
Figure 57L:
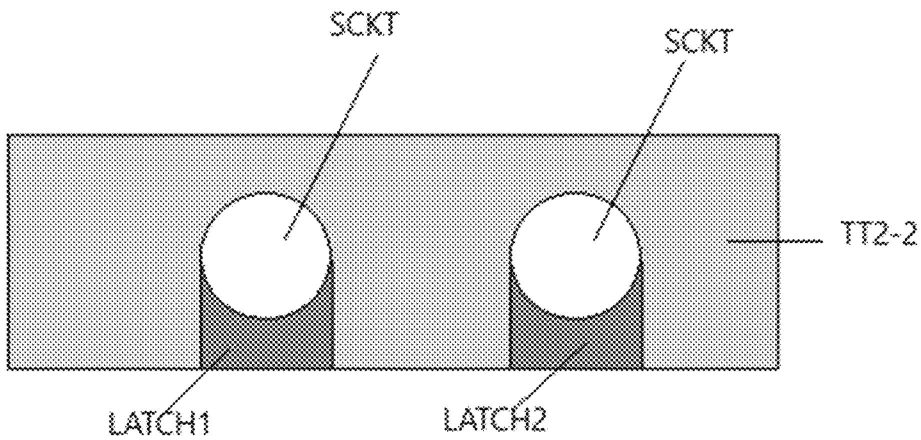
Figure 57M:
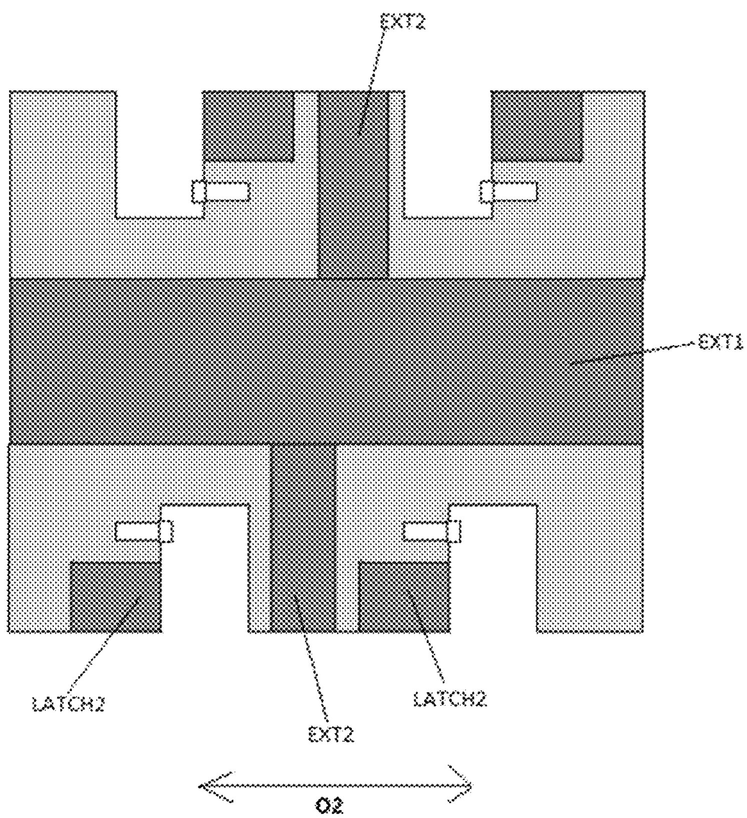
Figure 57N:
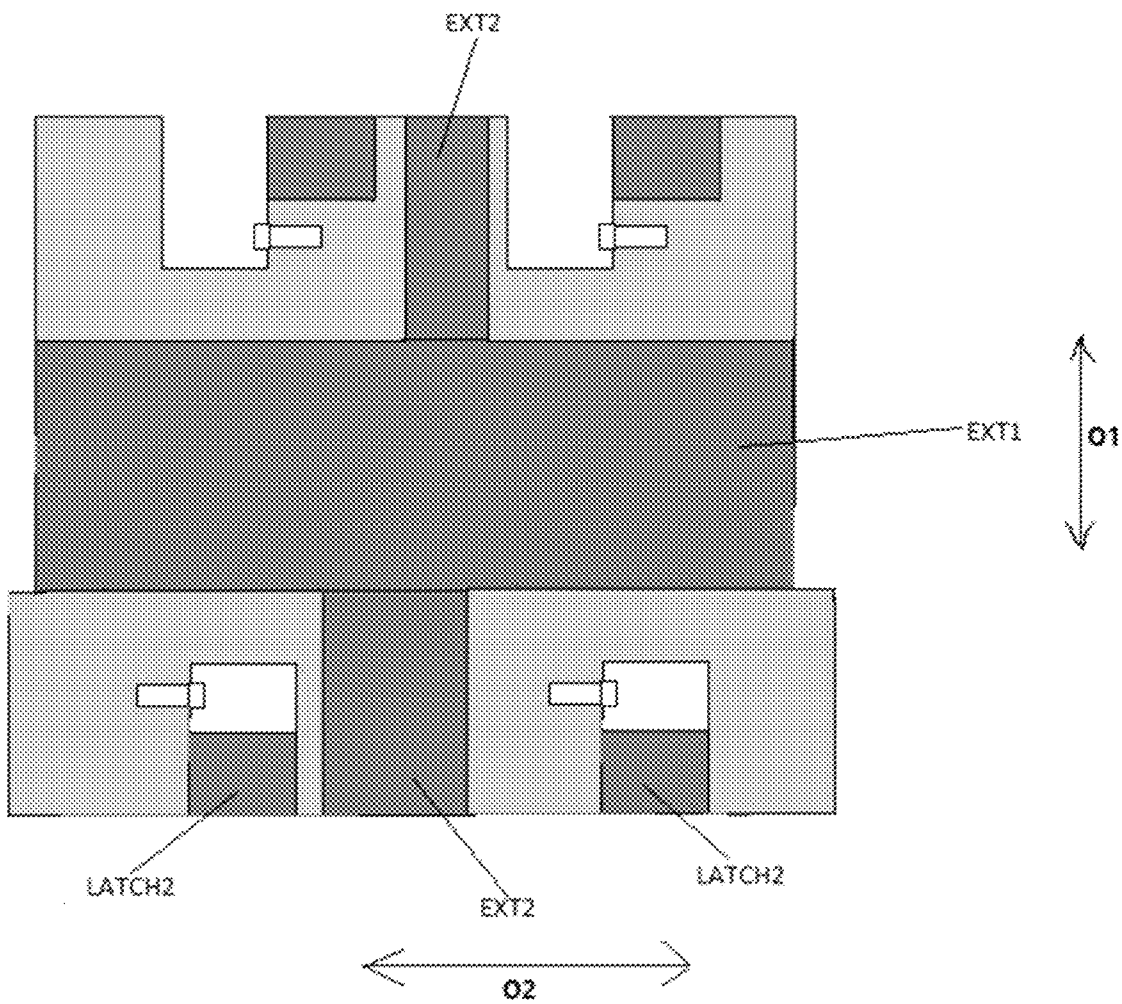

FIG. 57 E/G/I/K/M depict LATCH2 open while the corresponding FIG. 57F/H/J/L/N depict LATCH2 dosed. Alternatively, or in addition, (further as depicted also in FIG. 57C the socket may be channeled, channel, fasten and/or be narrowed by a variety of other techniques including twisting/turning/screwing etc.

In further examples, such as depicted in FIG. 57E-N, a holder segment, surface and/or module may comprise multiple latch-able sockets (or latches). Further, the holder and/or sockets can extend and/or be adjusted on directions O1 and/or O2 by manipulating and/or actuating extensible holder components such as EXT1 and/or EXT2.

Latch-able sockets are latches which may be used by the system for latching and/or support purposes.

A shaft fastened into a socket may rotate allowing the surface to rotate (to likeably position). Alternatively, or in addition, the shaft rotates to activate the movement of (other) (shaft) linkages (e.g. IL1/IL2 and/or to activate/ power extensions of (extensible) components such as EXT1/EXT2; alternatively, or in addition, the rotating shaft may be coupled to linkages and/or decoupled from the main socket.

Similar holders may be attached and/or be configured/adjusted to/by a post to secure (e.g, as per access control) items such as bottles, table chairs, tools and/or other components comprising rails, frames, handles, shafts, trunks etc. As such, the holder may adjust to position the sockets around (chairs) legs, rails, legs, splat, handles and/or other socket lockable components. It is to be understood that such holders may comprise any number of sockets and/or latches.

Alternatively, or in addition, a post module may comprise bands/ropes (or cables, wires, strings etc.) terminated by an ELOCK deployable/retractable from/to the post's module to secure such items, components and/or structures.

A post (module) may comprise a variety of holders and/or band/ropes (modules) at various heights and/or orientations.

Sockets and/or FLOCK may comprise padding for the protection of secured items.

A (top) surface (or holder) may be foldable. Further, the folding of a surface may be actuated by the attached/support post (and/or attached module) through linkages and/or arms. A surface may comprise any number of foldable/deployable segments and/or sub-surfaces.

In an example, in FIG. 56A the top surface/holder of S2P2 is folded/extended by an actuation, and/or movement (e.g. by translation and/or rotation) of shafts IL1 and/or IL2. Shafts IL1/IL2 may comprise multiple segments joined by at least one swivel-able joint such as ILJ1/ILJ2.

It is to be observed that the holder/surface segments are connected by a swiveling (connection) such as HJ1/HJ2 which allow them to swivel/rotate (on directions such as O1/O2) and/or fold/unfold.

Holder/surface segments and/or modules may rotate and/or move up/down the post (module) in directions such as O3/O4.

Further, once IL1 and/or IL2 are actuated and/or released (at/within/by the TT1-2 module) they may move OUT/IN of TT1-2 and thus, folding/unfolding the (supported and/or linked) top modules TT1-1/TT1-3 by forcing (or pushing/dragging) them to swivel on and/or around HJ1/HJ2. It is to be observed that shafts IL1/IL2 (segments) by themselves fold and/or extend by being forced to swivel on ILJ1/ILJ2.

Pushing/dragging of shafts may be based on electric, piezo and/or spring/lock actuation and/or release and/or other techniques such as explained in the application.

Alternatively, or in addition, the swivel/joints (e.g. such as HJ1/HJ2) are by themselves actuated (e.g. such as comprising a motor etc.); in examples, such as in FIG. 56B TT2 supported by S2P3 has segments TT2-1, TT2-2, TT2-3 connected and/or foldable via (actuated) swivels/joints HJ2.

While in the depicted examples segments such as TT2-1/TT2-2/TT2-3 are shown as folded upwards, alternatively, or in addition, they may fold downwards.

Tops and/or support holders may be latched together and/or deployed as depicted in FIG. 56A-C. As such, top TT1 supported by S2P2 unfolds, connects and/or latches via latch L1 (which may comprise and/or latch via pairable latches/components such as L1.1 and L12) with top TT2 supported and/or unfolded by S2P3.

Alternatively, or in addition, L1. (and L11. L12) is, forms and/or comprises a tongue and groove coupling. Further, L11 may have a tongue profile and L12 a groove profile and/or vice-versa.

S2P2 and S2P3 may connect/latch on additional modules, surfaces and/or holders. Thus, in some of such embodiments the latching and/or fastening (e.g. via tongue and/or groove etc.) of (some of the) the composable surfaces may not be necessary and/or miss altogether.

Figure 56D:
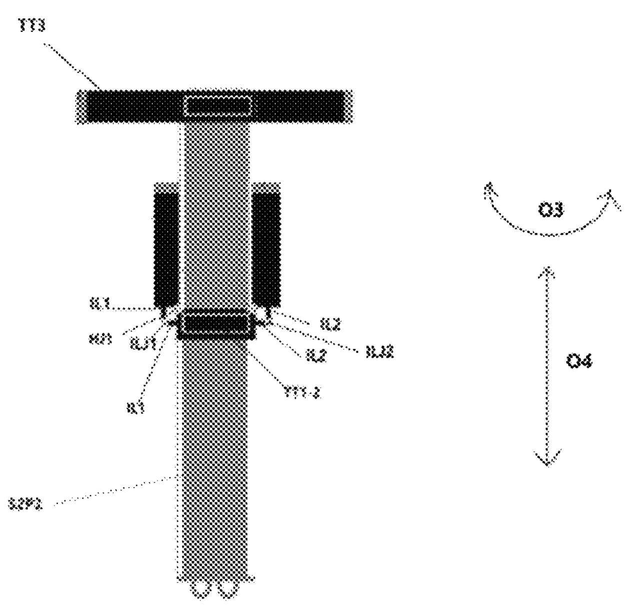
FIG. 56D is a perspective view of a post having a folded and an unfolded holder surface.
Figure 56E:
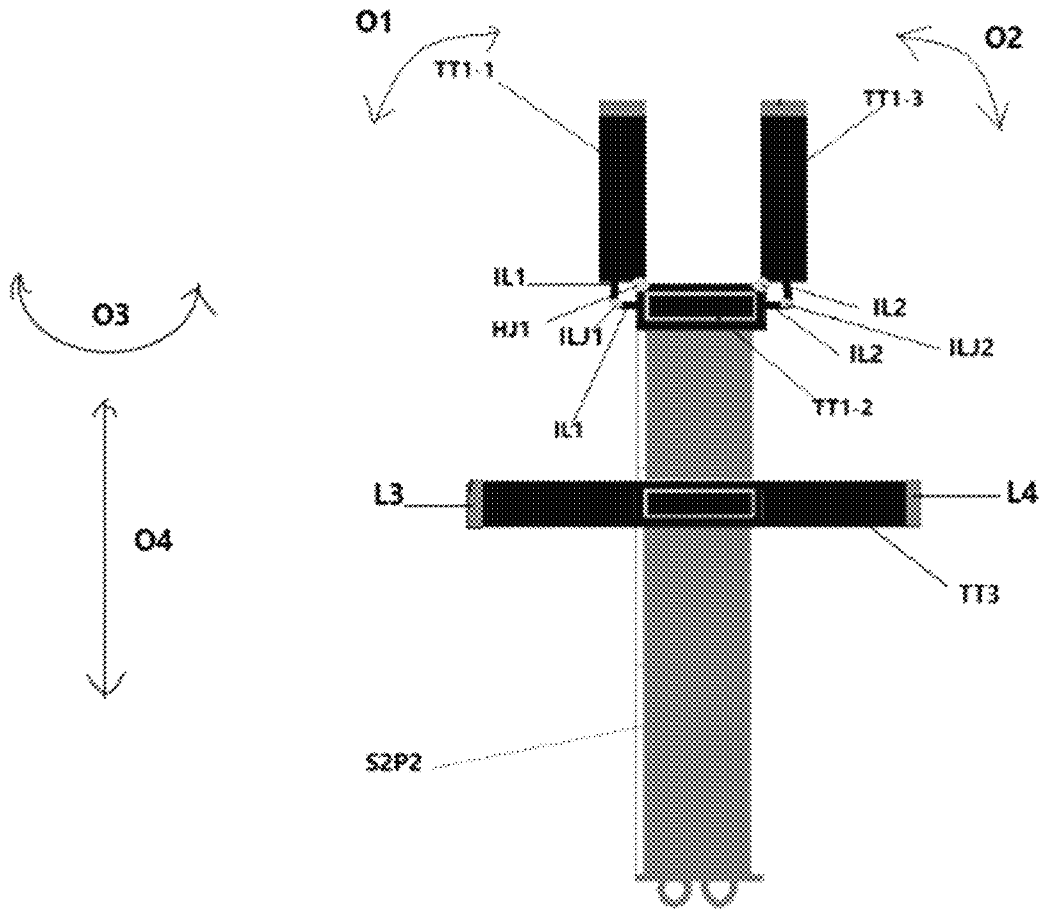
FIG. 56E is a perspective view of a post having a folded and an unfolded holder.

In further examples, such as in FIG. 56D-E, TT1/TT3 (modules) may be installed on S2P2 as support holders and/or as a top surface.

Figure 56F:
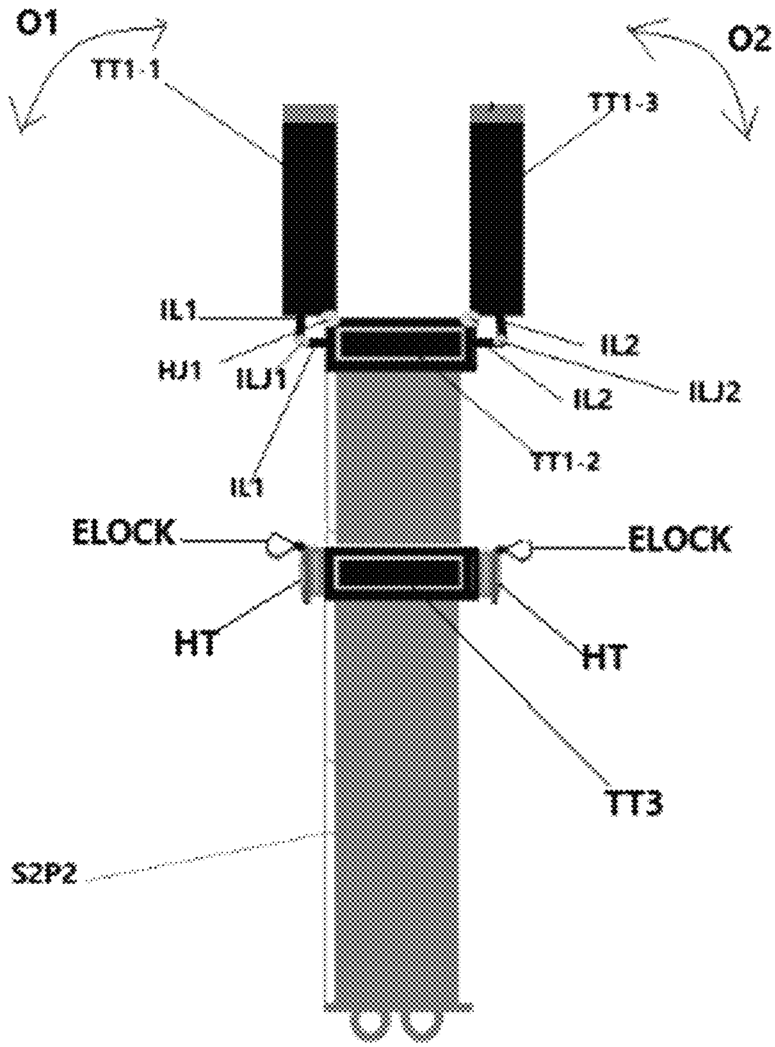
FIG. 56F is a perspective view of a post having two folded holders.
Figure 56G:
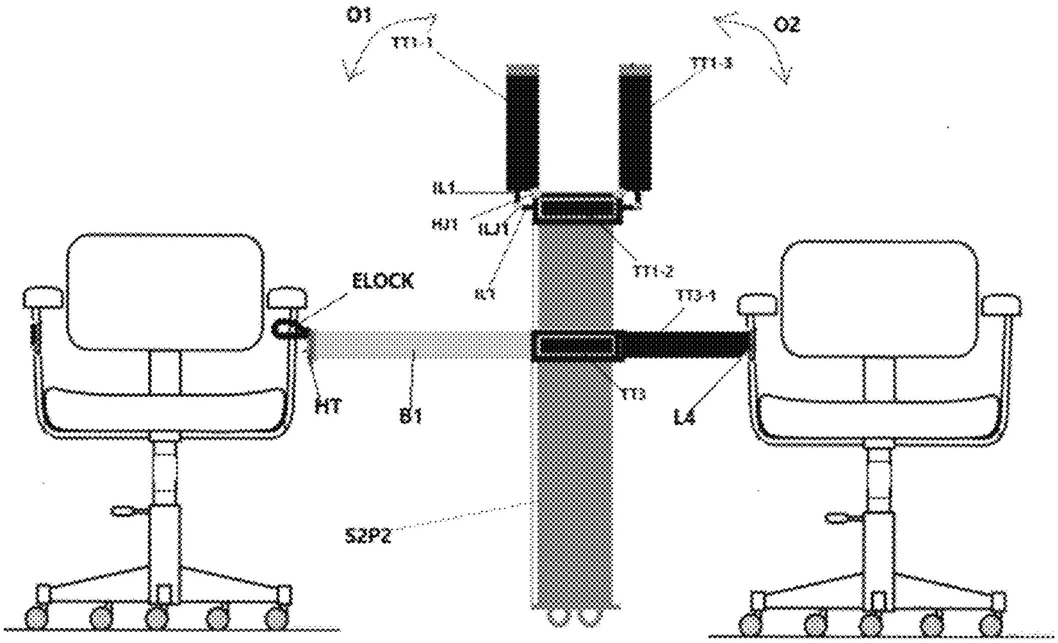
FIG. 56G is a perspective view of a post having a folded and an unfolded holder.
Figure 56H:
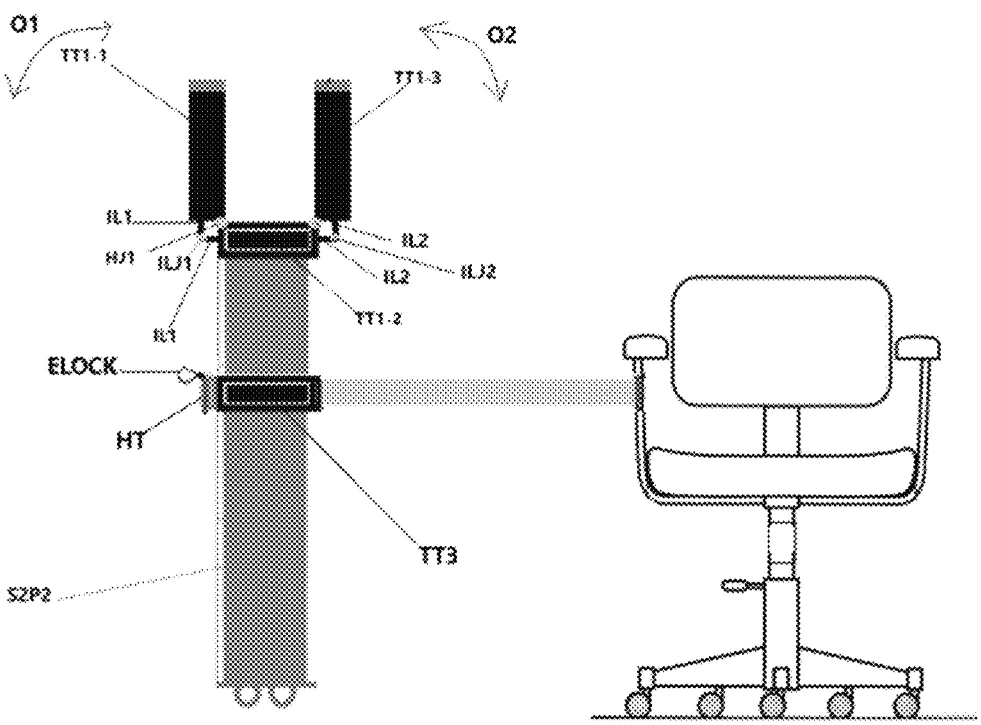
FIG. 56H is a perspective view of a post having a folded and a partially folded holder.

Alternatively, or in addition, such as further depicted in FIG. 56F-H, TT3 may be (further) used as a safety module with L3/L4 being positioned to secure items around the posts (e.g. such as chairs etc.). In some examples, L3/L4 are attached to extensible (or foldable) bands/ropes (e.g. such as B1), (foldable) holder segments and/or comprise latches, FLOCKS, suction pods/cups etc.; alternatively, or in addition, they are attached to (foldable) segments (e.g. such as TT3-1, TT2-1, TT2-2).

It is to be observed that latches/hooks (e.g. such as L1-L4) may be used to (either or) securely link/fasten/bond surfaces and/or secure/bond items (e.g. such as chairs, luggage, bicycles etc.). Further, such bonded items may be moved/diffused/leaked/released at/between endpoints.

It is to be observed that the support holder modules may comprise fastening sockets (e.g. SCKT) and/or shafts couplings to interconnect with a top and/or bottom modules (of S2P2); alternatively, or in addition, other module interconnection techniques and/or couplings may be used.

The composable surfaces coupling/locking techniques and/or profiles may be applied to module to module, module to post, post to post, holder to holder inter connection and/or any other physical interconnection between posts and/or posts' modules.

Further, similar folding techniques, profiles and/or modules may be applied to (support) holders.

A surface may be tilted by swiveling a post's trunk. Two posts may have the surface tilted vertically for facilitating movement and/or storage. In further examples, two posts may join their surfaces and/or compose. Even further, the posts may support themselves on various structures (while tilting and/or connecting).

In some embodiments, (embedded) surfaces may further extend/retract (e.g. similarly with EXT1/EXT2) from/to within (the collapsed/collapsing) embedding surface.

Supporting posts and/or modules may move (e.g. rotate etc.) to accommodate the movement and/or connection of the top and/or support holders.

Figure 42:
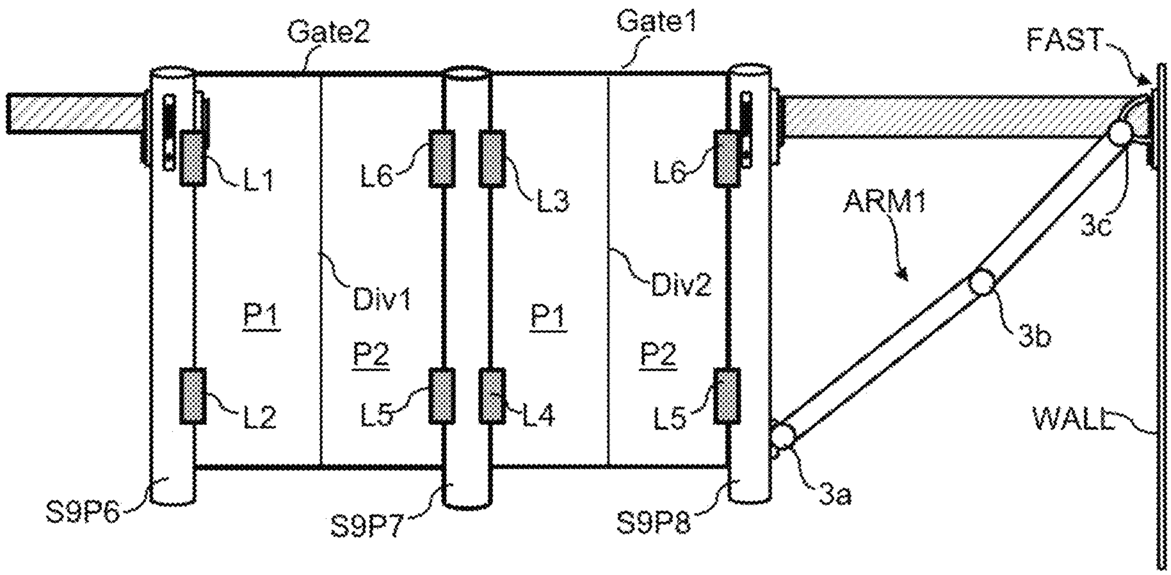
FIG. 42 is a representative view of a plurality of posts forming a composable gate.

Alternatively, or in addition, composable gates techniques such as explained in this application (e.g. as depicted in FIG. 42) may be used to compose surfaces (e.g. in similar with composing gates, polycarbonate sheets etc.).

The system may fold/retract the surface elements during movement, storage and/or for further activities.

The surface elements may comprise and/or be deployed to compose and/or enhance an antenna, sensor, display, generative and/or other surfaces. Thus, the surfaces may connect additionally via electrical sockets, (antenna) couplings, wires, cables, interconnects and/or buses.

Surface elements may comprise and/or are deployed to compose display surfaces.

Surfaces and/or support holders deploy and/or fold to support and/or secure items.

Surfaces and/or support holders deploy and/or fold to support people and/or items. As such, they may be used as table tops, benches etc. Further, some surface segments may be used as a seat while others may be used as a backrest.

Surfaces and/or support holders may deploy to cover and/or protect under the surface zones and/or items as per goals.

As items are added to the bag/basket/container a/the weight sensor measures the difference in weight between when an item is added/subtracted to/from the cart. Further, identification of items going in/out of the basket may be determined based on (additional) (post) infrastructure sensing. In some examples, a post's arm and/or hook (and/or hook terminator) comprises a weight sensor which measures the weight of the hold and/or manipulated items going IN/OUT an item container (e.g. such as a basket, bag, luggage, purse, (cart) bin etc.).

In further examples, smart baskets/bags are exemplified in FIG. 55A-D. As depicted, basket/bag/container 131 comprises at least one handle and/or further sensors. While labeled separately, it is to be understood that the handles (such as HNDL1, HNDL2, HNDL3 and/or HINDL) may be joined, fused and/or be part of the same handle (profile) in any combination and/or configuration. In some examples, the basket/bag/container comprises two handles (e.g. such as each handle comprises one each of depicted HNDL1 and HNDL2); in other examples, the, basket/bag/container comprises one handle (e.g. such the handle comprises combinations of HNDL1 HNDL2, HNDL3 and/or HNDL).

Sensors such as C1, C2, WS1, WS2, WS3 may be comprised in baskets/bags. In some examples, C1 and/or C2 are optical/camera sensors while WS1/WS2/WS3 are weight sensors. Further, the sensors may be configured (and/or positioned and/or oriented) to monitor and/or encompass different fields of view (e.g. such as C1 (field of view) is configured to monitor and/or encompasses a portion of the basket/bag/container (e.g. left side) while C2 (field of view) is configured to monitor and/or encompasses another (entropic) portion of the basket/bag/container (e.g. right side).

Sensors may be coupled, attached, comprised and/or manufactured to/within handles in positions and/or orientations that will encompass (projected) desired/likeable field of views. As exemplified, C1/C2 may be optical/camera sensors; alternatively, or in addition, other (similar) (optical/camera) sensors may be positioned on/with the handles.

Sensors may observe the designated fields of view in various orientations. In embodiments with two swiveling handles (e.g, one swiveling to the right and one swiveling to the left) and each with an attached (camera) sensor, it is to be observed that each camera encompasses the desired field of view regardless of the handle position (raised or lowered).

Sensors may be coupled, attached, comprised and/or manufactured to/within swiveling joints between handles and a (supported) bin. In such examples, sensors WS1/WS2 may be embedded in the (swiveling) joints J1-J4 which couple the handles to the bin (or container) BINI. The (swiveling) joints may be coupled, attached, comprised and/or manufactured to/within handles and/or attaching bin whether directly or indirectly (e.g. via other components).

Sensors (for weight/pressure) may measure/sense the weight/pressure of the basket/bag/container and/or further infer that (particular) items have gone IN/OUT the basket/bag/container. In an example, weight sensors measure/sense the loads in the attached/linked handles; further, their inputs may be combined to measure the weight of the basket/bag/container (e.g. such as summing WS1 and WS2; and/or (summing) WS3 weights/inputs; and/or correlating the sum of WS1 and WS2 with (the sum of) WS3 etc.). A (weight) sensor may be comprised/embedded in the upper part of a handle (e.g, such as WS3). In further examples, such sensor (s) (e.g. WS1/WS2/WS3) may be of any type and/or modality and/or encompassing any fields of view (e.g. to detect items, hand grips/manipulations etc.).

Alternatively, or in addition, the smart baskets/bags have a scale attached/embedded to the bottom of BIN I comprising at least one weight sensor (not depicted).

The smart baskets/bags may comprise batteries configured to provide power to onboard components (e.g. such as sensors, microprocessors, microcontrollers, memory, semantic units etc.). Further, they may comprise (wired/wireless) charging components.

The onboard batteries may be (physically) switchable; further, their holding component/module/profile may have a socket/plug for charging. The holding component/module/profile may comprise and/or be linked/attached/coupled to (additional) sensors.

The smart baskets/bags may comprise and/or be connected to augmentation capabilities (e.g. display, microphones, mobile devices, ear buds etc.). In some examples, they are connected to (additional) (mobile/user/supervisor) devices based on techniques explained throughout the application.

The smart baskets/bags may comprise wireless components (e.g. such as transceivers, antennas etc.) and/or connect to a wireless infrastructure.

The smart baskets/bags may receive and/or infer indications based on sensing, flux and/or (further) (user/supervisor) (mobile/post) devices.

For all the connection/augmentation/inference purposes, a smart basket/bag/container may be substituted and/or comprise all the components and/or functionality of any other robotic device/post.

Figure 41A:
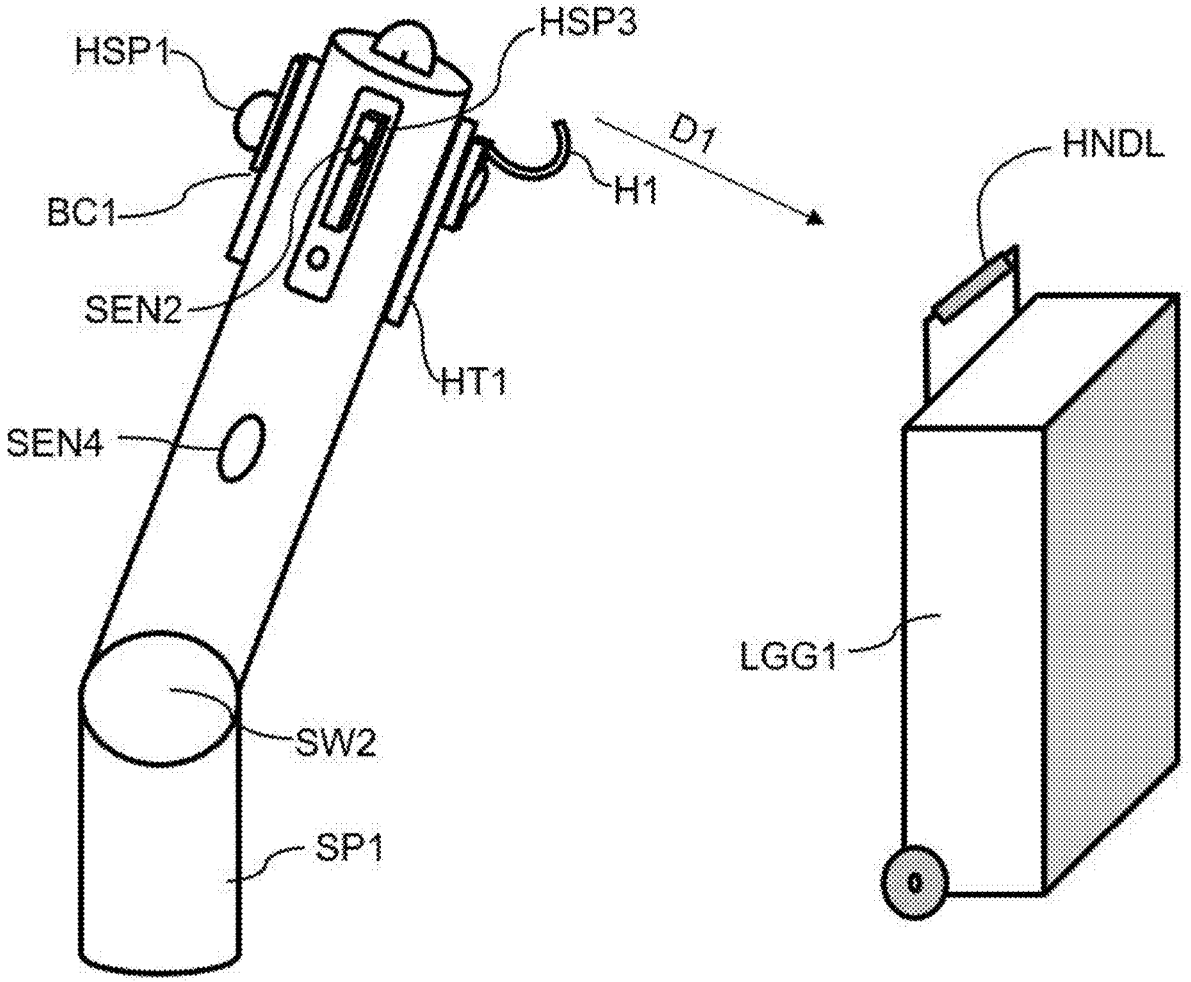
FIG. 41A is an exemplary close-up view of an upper portion of a semantic post in position to connect with a piece of luggage.
Figure 41B:
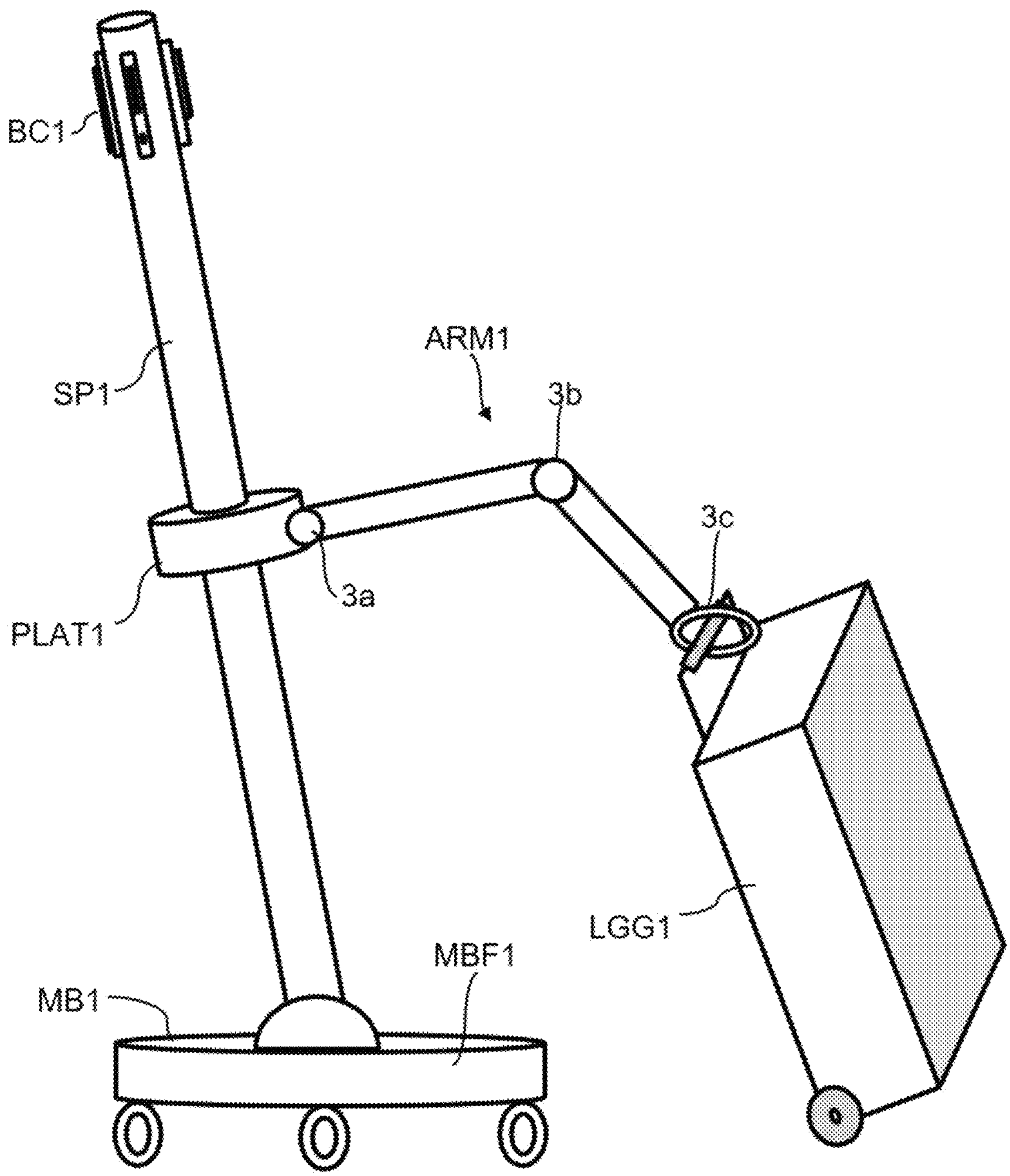
FIG. 41B is an exemplary view of a semantic post with an arm connected to a piece of luggage.
Figure 41C:
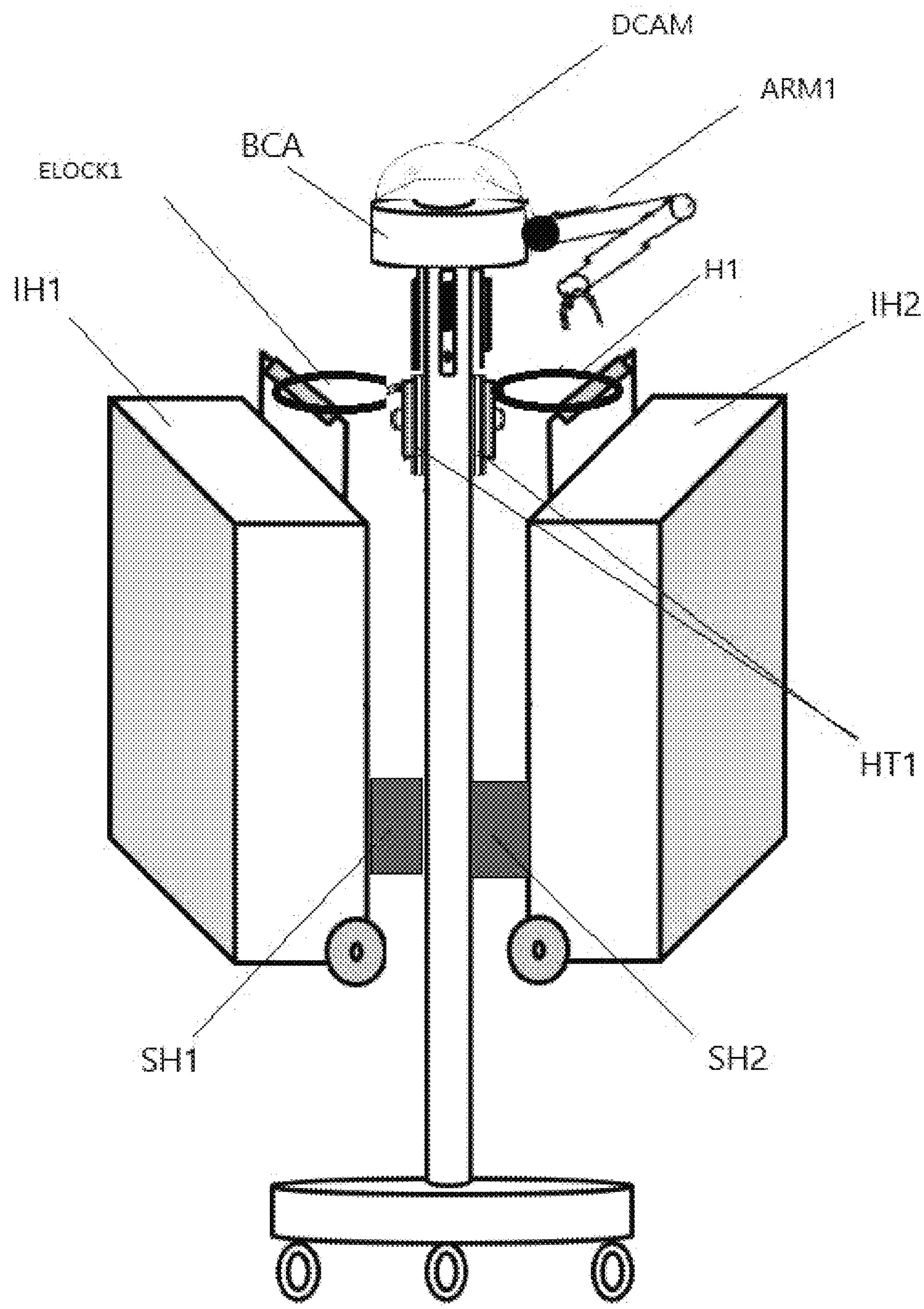
FIG. 41C is an exemplary view of a semantic post with a holding hook for securing an item.
Figure 41D:
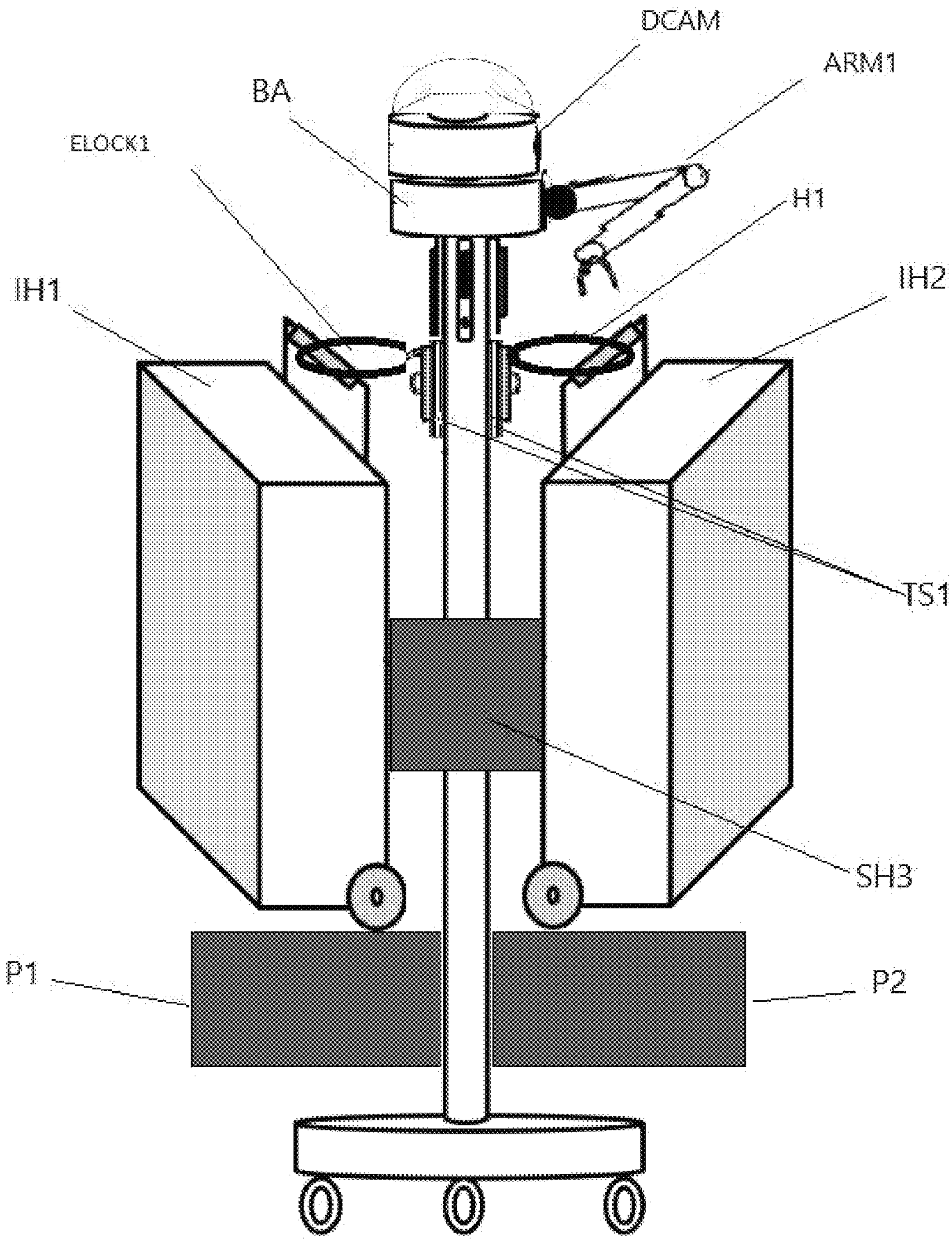
FIG. 41D is an exemplary view of a semantic post with a support or platform for supporting an item.
Figure 41E:
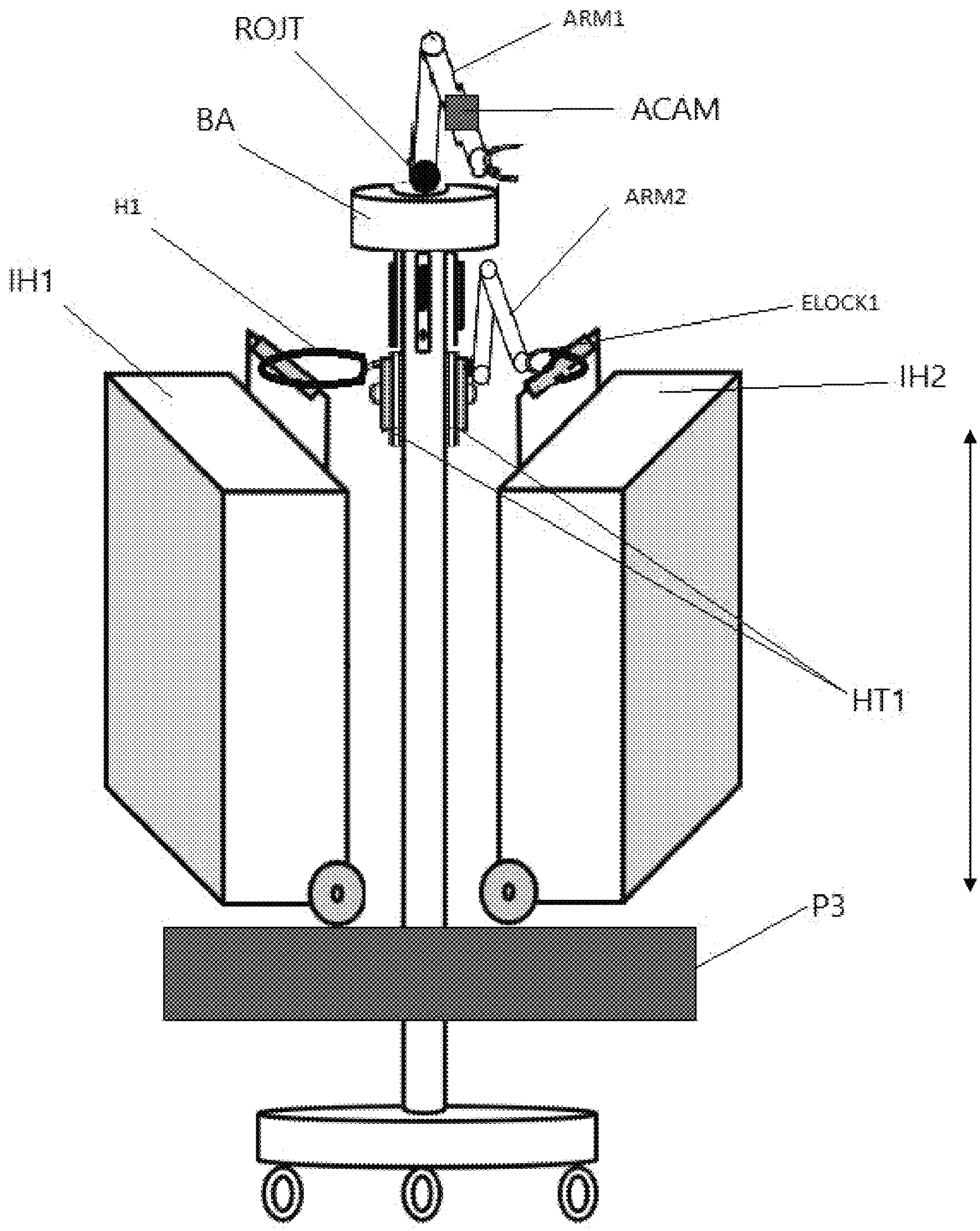
FIG. 41E is an exemplary view of a semantic post with a support of platform for supporting an item and being moveable in the direction of the illustrated arrow, and shown in a position raised above the position of the support or platform as shown in FIG. 41E.
Figure 41F:
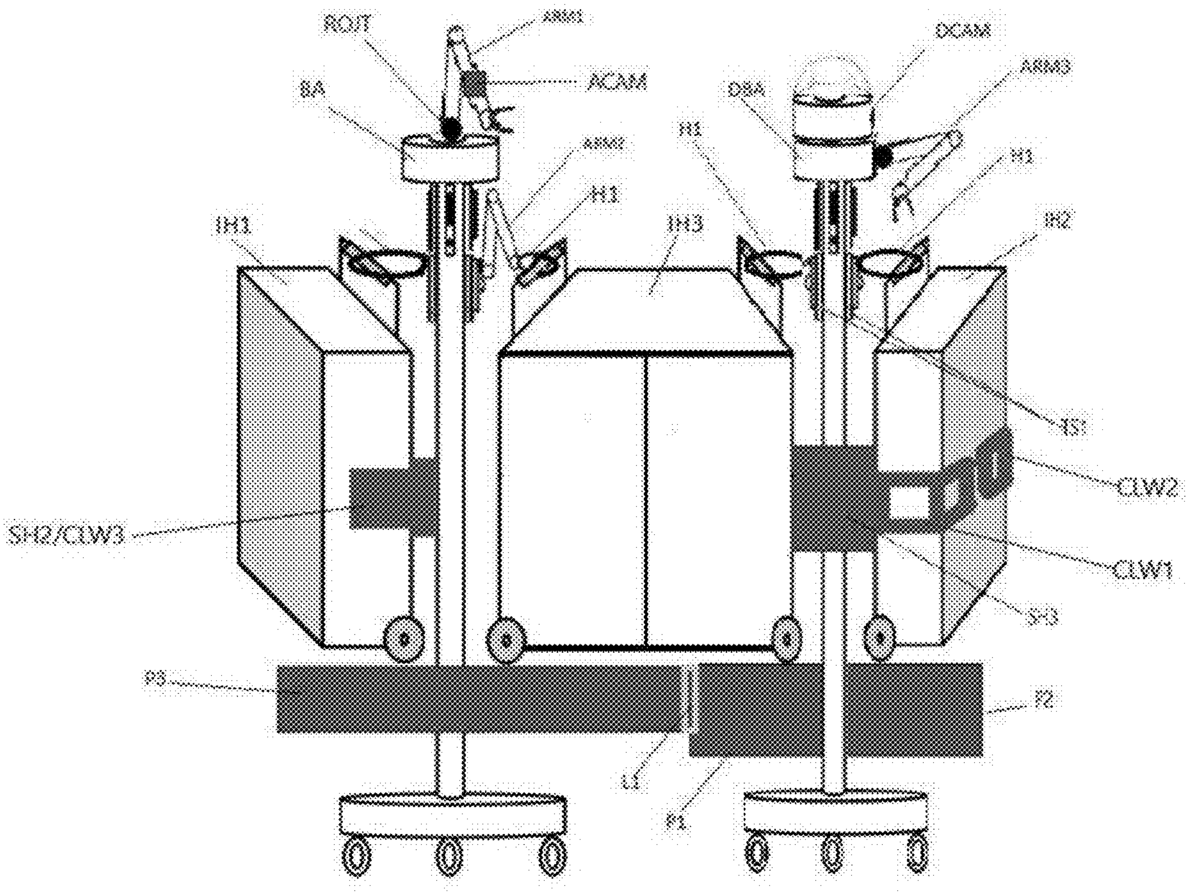
FIG. 41F is an exemplary view of a composed semantic post with a support or platform for supporting an item container.
Figure 41G:
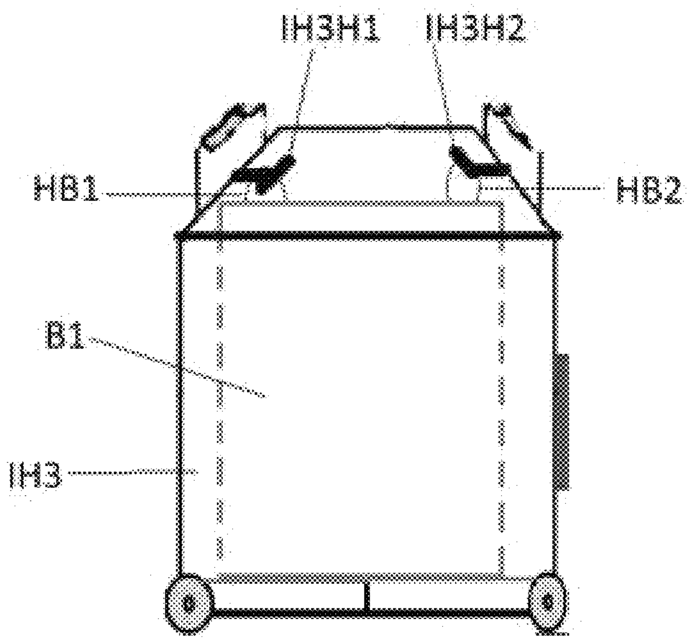
FIG. 41G is an exemplary view of an item container.
Figure 41H:
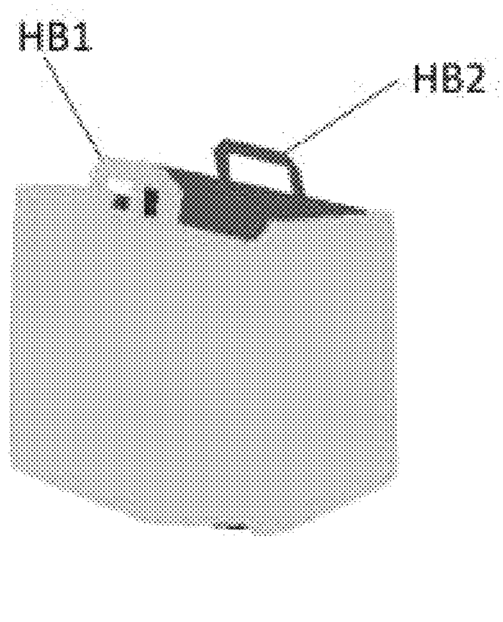
FIG. 41H is an exemplary view of an item container.

For all/particular purposes in the application, a bag/basket/holder/container (e.g. such as depicted in FIG. 41G-H) may comprise and/or implement, at least partially, the components and/or functionality of a smart basket/bag/cart/post/container. For all/(particular) purposes, a bag/basket/holder/container may be substituted with a smart bag/basket/container/(cart)/(post) and/or vice-versa.

In some examples, the smart baskets are stackable (on top of each other) and/or composable wherein an upper basket bin protrudes through and settles/locks to a lower basket bin (edge).

When stacked, the power sockets/plugs of the upper/top basket couple to the power sockets/plugs of the lowe/bottom basket. Further, the charging may be configured similarly with the composite posts.

Microprocessors within a basket/bag/container/post may determine and/or infer (e.g. based on sensing and/or electric power supply load) that another basket/bag/container/post has been stacked, joined and/or coupled.

Once at an endpoint and/or composed/stacked/joined/coupled the (composite) post/basket/bag/container/system may adjust (and/or disable/enable) the power supply to particular components, sensors, modules, posts, baskets and/or bags. Similarly, once unstacked/decoupled/disjoined the (composite) post/basket/bag/container/system may further adjust (or enable/disable) the power supply to particular components, sensors, modules, posts, baskets and/or bags.

In examples, Jane grabs/possesses/carries basket B1 from a stack of baskets (B). Once grabbed/possessed/carried (as detected by onboard and/or off-board sensing) the basket B1 components (e.g. microprocessors/microcontrollers, memory, sensing etc.) are powered up. In some examples, the microprocessors/microcontrollers and the memory are powered up first and further, they are instructed to power up additional components (e.g. (particular) sensing). Alternatively, or in addition, the power up is based on endpoint presence and/or further inferred semantics and/or routes (e.g. once Jane meets John, grabs an item, puts an item IN the basket etc.). Once Jane finishes shopping (and/or unloads the basket) it may park and/or stack the basket (to particular endpoints) and the system may adjust (e.g. such as lowers/powers-down/disables) the power to particular components thus, saving power.

Alternatively, or in addition, Jane couples a/her mobile device to the basket B1; a shopping application may be activated on the mobile device. As such, the inputs from the basket sensors are processed, at least partially, by the mobile device (application); thus, the basket operating battery power consumption is reduced (e.g. as per basket/user/supervisor/operator/endpoint (intrinsic) goals). In further examples, at least partially, some sensor inputs are processed by basket's on-board processors (e.g. such as (all) inputs from the weight sensors to detect when an item is in/out the basket); in case that the system cannot (coherently) compose/corroborate the determinations from the basket's (processor) with the determinations from the mobile device and/or shopping application (processor) the system may augment a user/supervisor/operator and/or require (additional) (checkout) processes.

Item scanning (with/by the onboard sensors and/or mobile device via optical codes and/or wireless identification) is matched (with inputs from the weight sensors; with SKUs, item codes etc.) to maintain basket/bin/container item inventory and/or to determine that such items are in/out the basket/bin/container. Alternatively, or in addition, based on item scanning the mobile device and/or a/the (shopping) application retrieves/stores/provides information about an item from/to another application, database and/or memory (e.g. running on a device/cloud, managing inventory/supply chain etc.). Based on inferences, updates may be operated by any application to the database/memory (e.g. for inventory management (at endpoints) etc.).

It is to be observed that an inventory at an endpoint may be (represented) hierarchically with the (hierarchical) endpoint comprising containers (and/or associated semantic identities) which in turn may comprise other containers, contained items and/or associated semantic identities.

Manipulations of inventories and/or assets may be implemented through agents/posts/carriers handling, bonding, securing, diffusing and/or transporting containers between endpoints. The containers content is diffused and/or leaked (between containers) (at endpoints) based on semantic analysis, access control and/or further hierarchies.

The items in/out (within) the container hierarchy (at/between endpoints) may be identified based on (imaging) sensing and/or radiofrequency identification (e.g. with containers and/or infrastructure comprising sensing capabilities); alternatively, or in addition, they may retrieved from fluxes, databases and/or (inferred) from documents (e.g. such as describing and/or itemizing the container contents, bill of lading etc.).

The container/asset and/or (associated) semantic groups may be associated with information stored in a hierarchy, database, blockchain, document, file and/or folder and the access control and/or publishing (associated with the container capabilities and/or interests) may be (hierarchically) applied to and/or inferred based on the (hierarchical organized/accessible) contained information of the documents, files, folders and/or further semantic groups. In further examples, such documents, files, folders may be physically (e.g. on paper, in a memory, in a tag etc.) stored within the container hierarchy.

Communications between mobile/robotic devices, clouds/servers/tenants and/or (backend/cloud/server/tenant) applications and/or sensors (comprising microprocessor/microcontrollers) may be based on semantic flux/stream.

In some examples, as the mobile device shuts down and is unable to process sensor data and, as the basket's onboard (weight/optical) processors detect that an item is in/out the basket then the basket processor may send a notification of the condition via onboard wireless components; further, additional processes, augmentations and/or measures may take place (at endpoints).

Alternatively, or in addition, as conditions and/or handovers occur, a contained item list is transferred between the mobile device memory and the basket's memory and/or vice-versa. In further examples, the handover may occur between baskets (and/or (associated) carriers).

If such unexpected conditions occur further endpoint sensing may be used and/or factorized for ensuring proper checkout of the (contained) items (e.g. at checkout endpoints the system determines that all contained and/or carried items are checked out, detect shoplifting etc.). As the system localizes a user, a/an (associated) (mobile) device/application, RFID/NFC card and/or basket at checkout endpoints then it may further operate debits/credits/bargaining on the associated accounts and/or budgets.

The weight sensors may include—but not being limited to—strain gauge type, impedance type, capacitive type, resistance type, photoelectric type, hydraulic type, electromagnetic force type, capacitive type, magnetic pole variation type, vibration type, gyro type etc. In further examples, they may comprise and/or have attached springs which allow the measurement of spring compression determined by the weighted load.

Smart baskets/bags may be manipulated and/or positioned on/by (composite) posts/carriers/carts. Further, they may be (communicatively, electrically, physically) coupled and/or secured through any components and/or techniques explained throughout the application. As such, the values of the sensors on the smart basket/bag/container are correlated with (similar capabilities) sensors on the posts/carriers/carts.

We mentioned that the system may direct and/or route agents based on verification and/or safety goals. As such, the system determines that S2P2's expertise (e.g. based on worn and/or published (leadership) capabilities) is in detecting/neutralizing flammable agents and S2P3's is in detecting/neutralizing biological agents. As such, as the system goals and/or projections comprise ensuring that an agent is not flammable and/or infected the system may route the agent to particular check endpoints and/or apply activities and/or (counter) measures accordingly to the endpoints and/or posts and further ensuring realization of the goals and affirmative resonance with endpoints or transitions in/out at a semantic time.

The system may detect the level of expertise of a collaborator based on analyzing how the collaborator handles particular (hazardous) situations, circumstances, environments and/or further inferences.

The system may allow and/or block observing views to particular endpoints based on the luminescence at an endpoint/link. As such, the system may adjust the luminesce at the endpoint/link so such objects at the endpoint and/or on link may be detectable/visible and/or non-detectable/non-visible. In examples, the system determines that an observing orientation along a link permits an object obturating the orientation and/or associated links to be observed due to luminescence on the link and/or further high entropy between the object's endpoints (semantic identities and/or attributes) and the endpoint of the orientation's link farther and/or later (projected). In similar ways, the system may determine the obturation by the artifacts in the near field to the artifacts in the far field and/or further associated semantic identities.

The system infers high entropy and/or drift of an attribute between at least two similar object semantic identities and infers that at least one's object factorization of the attribute and/or semantic identity is high and/or is associated and/or points to borderline inferences. In examples, the system observes that two posts have a high drift in the height parameter and thus, factorizes that based on the height attribute/parameter that at least the taller post is tall and/or the smaller post is small based on the high height drift and/or entropic orientation. Further, the system may determine the entropy and/or drift on a well-informed orientation between at least one other (well informed) known object, anchor and/or semantic identity and further factorizes the inferences related to the posts.

In some examples, the system infers that either John is tall and/or Jane is short due to high entropy in height between Does at an endpoint. Further, as the system comprises at least one well-informed (e.g. the system/user has high expertise in the particular theme/parameter/attribute) anchor (e.g. DeLorean) in the observing view it may determine the drift and/or entropy between the anchor and objects, groups and/or semantic identities; it is observed though, that while an entanglement with a standard DeLorean may determine a less confused and/or more coherent entanglement (or be associated with a well-informed anchor), a DeLorean with a lift kit may determine a less coherent entanglement (or be associated with a less informed anchor) and thus, the inferences in regard to drifts between anchor, John/Jane/Does may be factorized less expertly, with more doubt and/or comprising more superposition.

In further examples, a sensor or device recognizes and/or publishes its capabilities based on its own inferred expertise in an environment and/or observing view; further, a collaborator or supervisor factorizes an initial impression on the expertise and/or trust of the sensor or device are to be trusted based on further expertise inferences of itself and/or on the flux network while further comparing it with the publisher's. The system may be biased to index and/or factorize the initial impression stronger than subsequent factorizations. As such, subsequent factorization indexing may be decayed.

Based on the number of objects and/or location endpoints of contained into a container the system infers the semantic identity for the container. As such, the system infers that an unlabeled container comprising cans of soda and a can of brake fluid is a hazardously factorized pack of soda; if the number of cans of soda and/or brake fluid is the same the system may be in superposition on whether the semantic identity (leadership) is associated with soda or with brake fluid while the hazardous inference is highly factorized. It is to be observed that based on the placement of the cans and/or further container, groupings, environment and/or supervisor inferences the system may reduce the superposition.

The system may implement document lifecycle workflows (e.g. approval, sign etc.) wherein documents and/or associated artifacts are gated and/or diffused (between collaborators). In some examples, a sale contract between Jane and a DeLorean buyer may not be allowed to transition a link and/or flux/stream from/to an insurance/brokerage provider unless both parties executed the contract. As soon as the parties executed the contract, the contract document may be allowed and/or diffused from/to the insurance/brokerage provider.

It is to be understood that an activity (e.g. the execution/non-execution of a contract etc.) and/or readiness may comprise and/or consist of signing (and/or generation/storage/transmission of an (e)signature), approval/non-approval (e.g. via a button/link click and/or a non-click (within a semantic time) etc.). Alternatively, or in addition, the approval/non-approval of (inputted) activities may comprise authenticating, signing (and/or generation/storage/transmission of an signature and/or credential (based on a approver/non-approver user input)) and/or approval/non-approval (e.g. via a button/link click and/or a non-click (within a semantic time) etc.).

Approvals and/or (required) asset (e.g. BOM) hierarchies may be associated with endpoints, users and/or supervisors in a hierarchical manner. The BOM hierarchies and/or associated semantics (identities) may compose. An operator and/or supervisor may elect to publish and/or allow the publishing and/or diffusion of particular themes, semantic groups, identities and/or (associated) activities. In some examples, the hierarchy may be associated with an endpoint supervisor hierarchy; alternatively, or in addition, it may be associated with flux and/or device operator hierarchy; alternatively, or in addition, it may be associated with a staff and/or management hierarchy. As such, when generating a review and/or an approval activity, a user/administrator may specify the required semantic identities of the reviewers/approvers/authenticated/signatories in an exclusive (e.g. all required for completing the review/approval activity), non-exclusive (some required) and/or ordered/non-ordered (e.g. the reviews, signatures and/or approvals must be done in a particular order). Alternatively, or in addition, the system generates, sequences and/or orders the approval lists based on factorizing indicators of the signatures (e.g. localized at endpoints) and/or associated semantic identities; in some examples, a hazard indicator is used and/or (further) (non) affirmativeness of having/not-having them signed by particular identities. In further examples, if an activity is not completed (e.g. within a (semantic) time) then the activity is deemed as non-completed and/or expired and/or further (associated) semantics inferred.

The system may determine the speed and/or frequency of a semantic route; in further examples, the speed and/or frequency of a semantic route is compared and/or composed with the speed and/or frequency of another semantic route. Such comparisons may be based on semantic time (management), strike/error, semantic analysis and/or semantic wave conditioning.

In some examples, the system uses such techniques to determine the speed, orientation and/or frequency of artifacts moving between endpoints (towards affirmative/goal/safety (endpoints) and/or away from non-affirmative/hazard (endpoints)); further, the system may determine indexing of the errors and/or based on the errors.

In some examples, the system determines that a person is running due to endpoints mapped to legs being determined at endpoints in a "fast", "faster" and/or more frequent manner than "slower" intrinsic walking. Further, the system determines that an increased frequency than intrinsic (e.g. walking) is/may be related with having/achieving a goal/safety, avoiding a hazard and/or further minimizing an error. In similar ways, the system may treat changes of orientations wherein a change of orientation is seen as having/achieving a goal/safety, avoiding a hazard and/or further minimizing an error towards a more frequent and/or affirmatively factorized endpoint/route and/or away form a non-affirmatively factorized endpoint/route. Further, such inferences may be coupled at other's artifacts mapped endpoints/routes; in an example, the "running" inferences may be further affirmatively factorized based on the movement, speed, frequency and/or mapping of the person's arms to various endpoints/routes.

The system may be comprise virtualized computing environments. In some examples, the system may encompass computing cloud environments comprising virtual machines and/or containers which virtualize and/or allow (multiuser, multi-tenant, multi process and/or multi-application etc.) shared access of computer hardware and/or operating system resources, libraries and/or signals whether implemented in software and/or hardware. Some examples may include Parallels Workstation, Parallels Desktop for Mac, VirtualBox, Virtual Iron, Oracle VM, Virtual PC, Virtual Server, Hyper-V, VMware Workstation, VMware Server (discontinued, formerly called CSX Server), VMware ESXi, QEMU, Adeos, Mac-on-Linux, Win4BSD, Win4Lin Pro, Docker, Solaris Containers, OpenVZ, Linux-VServer, LXC, AIX Workload Partitions and others.

We mentioned that particular semantic inferences may be associated and/or computed with/within a (certain) semantic budget and thus, such information is inferred, passed and/or conveyed to a (resource) hypervisor and/or (by a) semantic unit that may allocate and/or semantic route to the necessary resources in order to process the data within budgets.

The system may gain more coherence and/or precision due to increased localization in the semantic field and/or within factorization intervals. In some examples, the factorization interval is expressed as a strike and/or optimal (entropic/entropy) value and/or endpoint and further by an (entropy/entropic) error value and/or endpoints from the optimal value and/or endpoint. In some examples, the gain/loss in coherence and/or precision is associated with semantic artifacts at various levels of the semantic memory hierarchy.

The system may have a goal to increase coherency and/or precision (e.g. by error minimization towards the strike value) and thus, may use semantic artifacts and/or allocate/reallocate resources accordingly; however, after a certain point and/or endpoint adding resources and/or (hierarchical) artifacts would not significantly reduce error and/or increase coherency.

The goal towards a strike value may encompass gain/loss semantic analysis based on semantic factorization. As such the error may be affirmatively/non-affirmatively factorized.

We mentioned that, during semantic inference, methods, models (e.g. statistical, probabilistic, machine learning etc.), initialization parameters and/or architectures (e.g. ResNet, LSTM, RNN etc.) may be factorized, indexed and/or further applied in a potential (likeable) factorized order based on at least one of their semantic identities; further, the results (e.g. confidence, probabilities and/or classification attributes) be further factorized based on circumstances.

As mentioned in previous paragraphs such inferences may run in serial and/or parallel and further comprise and/or be semantic fusion-ed. The system may apply such techniques based on (imaging and/or video artifacts at) various resolutions, hues and/or zoom levels (e.g. of a camera and/or sensor); in further examples, such techniques may be associated and/or further enhanced by filtering of the (sensor/data) inputs.

The system may use dissatisfaction, concern and/or stress factors when a (goal/activity) projection is highly drifted from the actual and the (projected) reward is very low. When available budget projections are low and/or unsatisfactory the system may filter non-goal related semantic identities and/or associated leadership semantic attributes; further, the system may filter goal related non-leadership semantic attributes.

Capabilities, units, modules, posts, agents and/or fluxes may be factorized on indicators such as support, reliability, stability and/or importance. Such indicators may be (factorized) based on the (factorization of) consequences (e.g. risk of not attaining a goal etc.) of unreliability and/or lack of support and/or stability of the capability and/or artifact; further, it may be (factorized) based on the consequences (e.g. risk of not attaining a goal etc.) of not being able to exercise support and/or its projected activities/goals.

Further, the system may infer the likeability and/or non-likeability of a capability potentially based on interests (at endpoints). Alternatively, or in addition, it may infer the likeability and/or non-likeability of interests (at endpoints).

In some examples, the system may project budget support for particular activities and/or goals. Alternatively, or in addition, may project (affirmative/non-affirmative) resonance support (e.g. comprising affirmative vs non-affirmative capabilities, interests, semantic groups, disputed possession etc.) etc.

As mentioned, hazard and/or safe indicators may be factorized and/or assigned to/for goals. In similar fashion, the system assigns hazard/safe indicators to budget/resonance support.

The system may apply such techniques (based) on (imaging and/or video artifacts at) various resolutions, hues and/or zoom levels (e.g. of a camera and/or sensor); in further examples, such techniques may be associated and/or further enhanced by filtering (in hardware and/or software) of the (sensor/data) inputs. Further, the system may comprise goals to follow particular semantic identities and/or semantic attributes (and thus, the system may further identify the semantic identities having associated the semantic attributes). In examples, the goal may be associated with "FOLLOW YELLOW DELOREANS UNTIL JOHN ARRIVES OR A RED ONE APPEARS" and thus, the system may adjust the sensor parameters (e.g. zoom/hue of a camera to zoom in/out on the DeLoreans and/or further allow/ingest yellow and red hues while filtering others) to follow the goal.

The system may perform factorization and/or index the entropy of semantics based on the error value and/or the drift from a strike value. In further examples, the system may factorize a semantic attribute (associated with a semantic identity) and determines its error from a strike value and further uses the error to index and/or factorize (the entropy) of the semantic identity and/or further semantic attributes and/or further groups.

The system may seek to project coherent inferences and/or error minimization using semantic hierarchies and/or artifacts with minimum budgets. In some examples, the system determines high localization and coherency based on such inferences. However, this approach may prove to be error prone and/or determining high incoherency (at the same level semantic hierarchies) when using different level semantic hierarchies and/or artifacts. Thus, the system may seek to optimally increase the budgets instead of always using minimal budgets.

In further examples, the system may have threads and/or units handling inferences with minimal budgets and/or further with increased (indexed) budgets. Such threads, units and/or inferences may rim in serial and/or parallel and the system may select the inferences based on the available budgets (e.g. for low and/or indexed budgets it select the minimal and/or indexed budget inferences etc.).

We mentioned that the system may detect (affirmatively/non-affirmatively) manipulation of doors, windows and/or other ingress/egress dividers by detecting attempts of/and/or openings and/or closings of doors/windows/dividers. In some examples, the opening and/or closing is detected based on the movement direction of endpoints mapped to a lock and/or handle and/or sequences of movement (e.g. comprising up, down, left, right, entry, exit and/or other movements) of the door handle artifacts through field mapped endpoints/links. In further examples, the system knows that the door is CLOSED and detects sequences of UP and/or DOWN movement of the door handle and/or movement and/or change of color of the door lock (e.g. from closed to open direction and/or color). Further, the lock and/or handle may be associated with goals and/or activities of keeping divided areas/volumes/artifacts/endpoints secure, safe (from one another), lock/unlock, controlling access/ingress/egress etc.

In some examples, in order to ensure and/or steer to likeable/non-hazardous circumstances the system infers and/or ensures that the divided areas/volumes/artifacts/endpoints are sealed (through divider artifacts) and/or that eventual diffusions and/or leakages may take place in a non-hazardous, likeable, reasonable and/or resonant manner. In further examples, the system infers that the divider is not properly positioned and/or cannot (expertly) handle the diffusion and/or leaks of agents (e.g. due to size, fabric, composition etc.).

We mentioned that the system may route hazards and/or other conditions. In further examples, the system ensures and/or routes proper and/or likeable conditions (e.g. ventilation), agents and/or supplies to areas, endpoints and/or further (mapped) entities (at endpoints).

The system may infer malfunctions at an endpoint (and/or associated semantic, endpoint, container and/or object hierarchy) based on high entropic positioning, directions and/or orientations of inferred semantics and/or conditions at the endpoint and/or related with an object (at the endpoint) in rapport with its goal and/or purpose. As mentioned, the system may infer malfunctions at a manhole based on the manhole obturation, (inferred condition) diffusion orientation, speed, factorizations and/or/of (increased/decreased/stationary) conditions (e.g. pooling of water) within a mapped area; further, it is to be understood that increased/decreased/stationary may be associated with orientations and/or (associated) semantics related to sensing, parameters, indicators, factors and/or diffusion.

In other examples, the system infers that (posts') barrier/banding, divider and/or (a) mask positioning (e.g. on an area, on a face etc.) is highly entropic with blocking diffusion of hazardous agents, particles and/or interactions and thus, not exerting its purpose and/or goal expertly in the posted and/or positioned configuration and/or (required) coverage. As such, a divider/mask positioning may be high entropic with the goal of blocking diffusion of the blurred areas (e.g. doesn't blur or protect as per goal).

In some examples the system may comprise semantic fluxes generating ingress/egress to/from drawers, cabinets, bins, boxes, crates, containers, vehicles, vessels, buildings, storages and/or other container (relationship) capable objects.

As mentioned in previous examples, the posts may be deployed in various configurations, groups and/or architectures. In some examples, they are deployed by algorithms, analytics and/or analysis processed at computers residing in a remote/local cloud, cloudlets, posts themselves and/or collaborative (flux/stream) environments.

In some examples, at least two posts (form a segment of a path and) are delimiting the non-allowable, non-likeable and/or hazardous areas and thus, enforcing a guiding path.

Figure 38A:
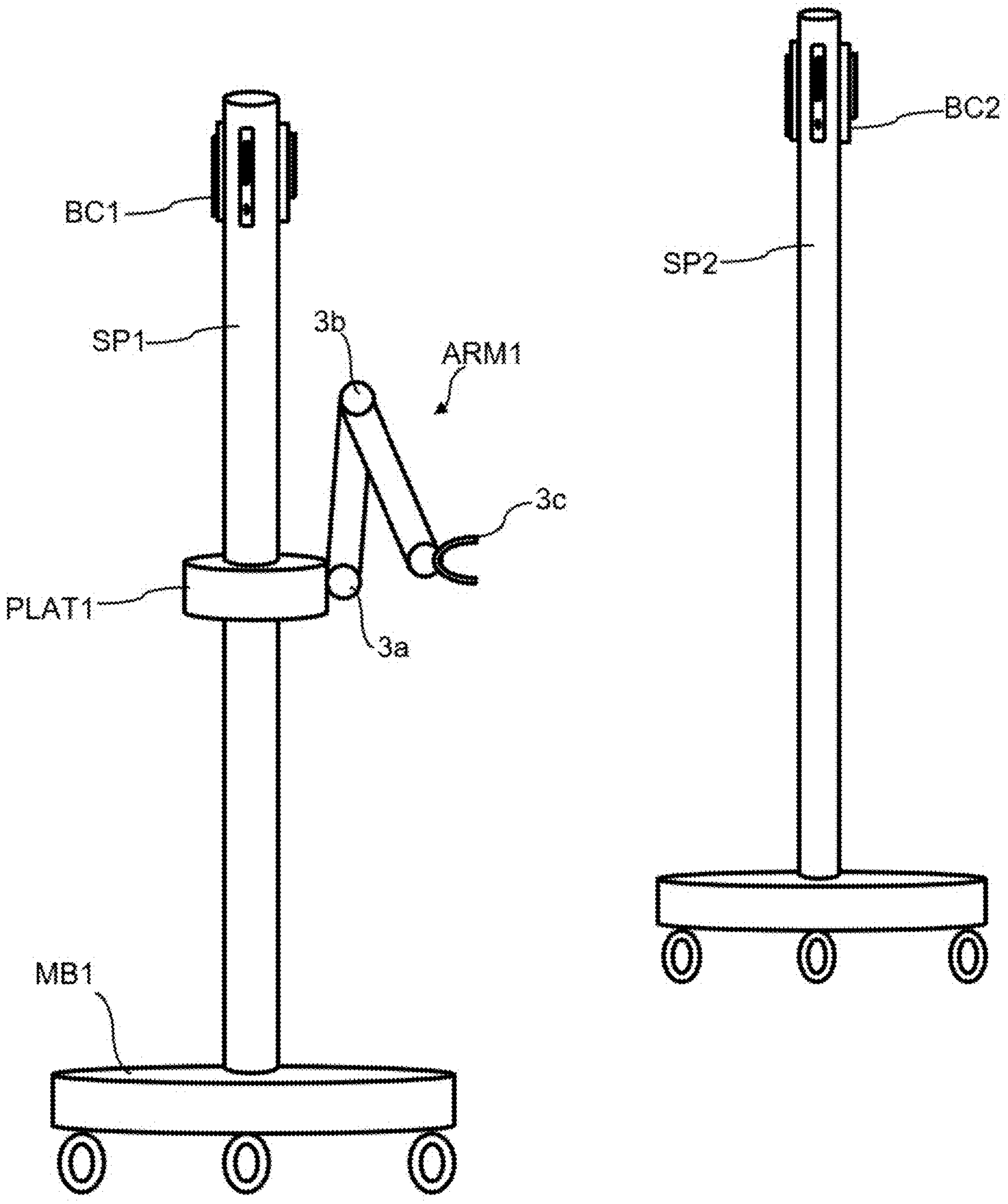
FIG. 38A is an alternate view of a pair of semantic posts for a robotic post system.
Figure 38B:
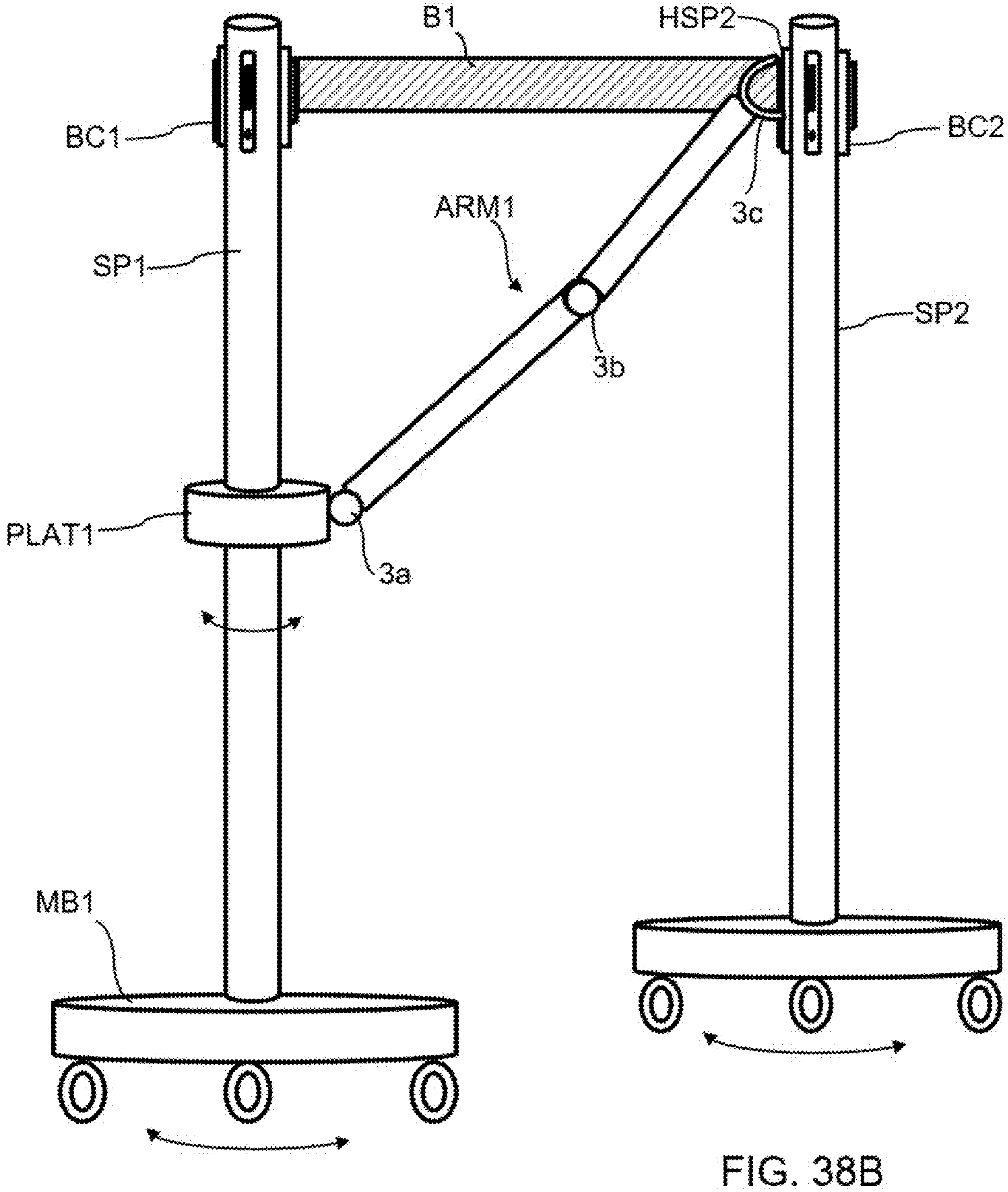
FIG. 38B is an alternate view of a pair of semantic posts for a robotic post system.
Figure 38C:
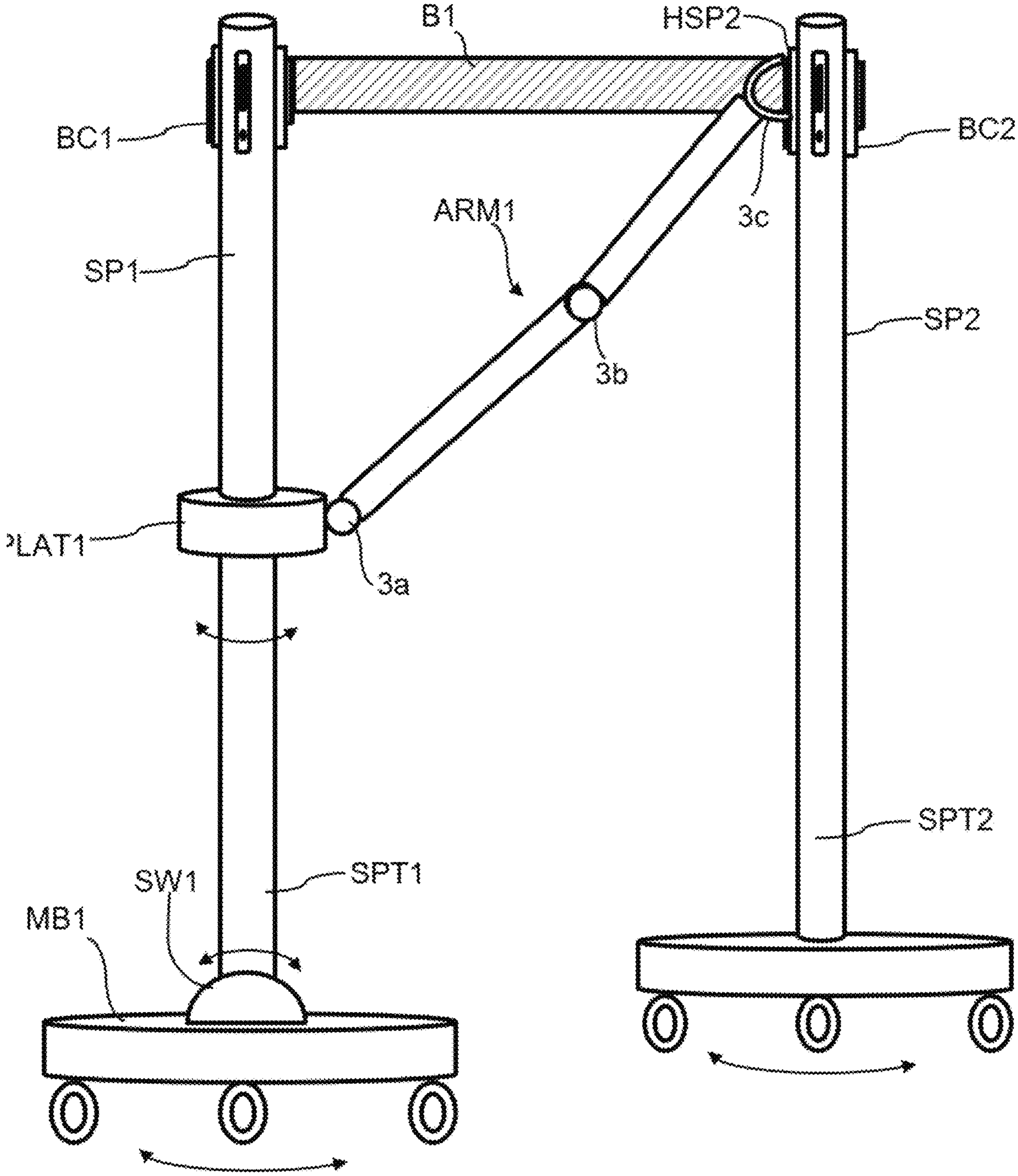
FIG. 38C is an alternate view of a pair of semantic posts for a robotic post system.

A further embodiment of a smart semantic posts configuration is illustrated in FIGS. 38A-C, and in the corresponding block diagram of FIG. 39D, in which it should be understood that the illustrated posts and system may include the features and details described above in addition to the specific features described with reference to these views. The semantic post SP1 includes a moving base MB1 (illustrated with a plurality of casters or wheels), one or more arms ARM1 capable of moving in multiple degrees of freedom, and an optional rotating component PLAT1 (which, in the illustrated version, is mounted for rotation about a vertical axis extending through the center of the post SP1). In this example, the rotating component, or rotary mount, may be a motorized pivoting attachment which further supports the arm (ARM1) which is attached to it. The post may include connectors such as lockable band components and/or modules (BC1) comprising bands (B1) having hooking/locking terminators (such as HT1, illustrated in partial cutaway view showing the upper end of a semantic post SPI in FIGS. 39A and B but described above); further the post may have hooks/locks (HSP1, HSP2, described above) for accommodating hooking/locking terminators of the lockable bands.

In some examples, module PLAT1 comprises a rotary electrical motor for rotating an arm support component. In further examples, PLAT1 comprises a rotary encoder for determining the rotational position of the arm support component on the trunk (e.g. SPT1, SPT2), shafts and/or associated components, the rotary position being defined and determinable with respect to a reference point such as a circumferential position on the post or on its base MB1.

The lockable band module (e.g. BC1) may comprise a retraction mechanism (e.g. spring-ed, latch-able and/or motorized) allowing its bands to retract once not connected and/or grasped. Further, it may comprise a locking mechanism allowing it to lock its bands and/or their movement (e.g. denying extension and/or retraction). In some examples, the retraction and locking mechanism are fusion-ed and/or served by common components (e.g. (rotary) (latch-able) (spring) (electrical) (motor) assemblies ensures retraction and/or locking; (lockable/latched) (prestressed) power springs which may be electrically released/unlocked for retraction).

The semantic posts' components and/or modules may be attached to a trunk (e.g. SPT1, SPT2, see FIG. 38C). The trunk may be circular, parallelepiped and/or any other shape and may be fusion-ed to the moving base (e.g. MB1, MB2) or be attached to the moving base through a joint, swivel and/or lock (e.g. SW1 in FIG. 38C) which may be electrically motorized and/or actuated. In some embodiments, a traverse section and/or slice through a trunk's portion (e.g. SPTB1) close and/or fusion-ed to the moving base (e.g. closer than 2" and/or 10% from the total length of the trunk) has an area no more than between 30-40% and no less than 2-5% from the area of the moving base facing (e.g. MBF1, MBF2) to which is attached to.

The ARM1 may comprise a gripper (3*c*) capable of grasping, holding and/or releasing the lockable band BC1 and/or its components. Further the ARM1 may comprise other (swiveling) joints (e.g. 3*a*, 3*b*) to allow segments of the arm between such joints to pivot, bend, or rotate at the joint.

It is to be understood that all robotic joints, swivels and/or locks presented in this application may be electrically motorized and/or actuated. I some examples, they may comprise rotary electrical motors. Further, they may comprise rotational encoders for measuring rotational positioning, speed, orientation and/or other rotational parameters/characteristics. The motion may be tracked and controlled by a controller, which may be a semantic controller, such as described above.

A rotational module and/or motor may comprise position and/or proximity sensors comprising electromagnetic, photoelectric, magnetic, inductive, capacitive components for detecting proximity and/or further rotation positioning (of the motor, shaft and/or in comparison with the trunk, banding module etc.). The lockable bands and/or modules (BC1) may optionally rotate around and/or centered on the (post's) (centered) vertical axis.

In further examples, such as FIG. 38C, the semantic post's trunk (e.g. SPT1) may be attached to the moving base (e.g. MB1) through a joint and/or swivel (e.g. SW1). It is to be understood that while in the example the swivel (SW1) is attached to the base and the trunk (of SP1), in other examples the swivel may be attached to and/or join two segments (e.g. superior and inferior) of a post trunk without being attached to the base. The system may use the joint and/or swivel to further move, position (e.g. to endpoints) and/or posture the (superior segment of the) trunks (longitudinally and/or its vertical and/or horizontal axes) and thus, (augment the) position (of the) posts' modules attached to the trunk in desirable and/or optimal (e.g. for the (projected) activities, circumstances etc.) positions, endpoints and/or postures.

Alternatively, and/or in addition, to the swiveling mechanism a post's trunk may comprise a rotating trunk mechanism and/or joint which joins segments of the trunk and enables the trunk's segments (e.g. superior and/or inferior) to rotate in rapport with one another and thus, allowing the positioning of the components and/or modules attached and/or comprised in the segments. It is to be understood that the rotating trunk mechanism may comprise similar components such as module PLAT1; it may comprise joints and/or other mechanical components allowing the rotational movement to occur. PLAT1, the rotating trunk mechanism and/or joint may comprise sensors, actuators, transducers, motors, encoders and/or any other components such as specified in this application.

The swivels/joints may allow a post to position itself to ensure support and/or mobility on various surfaces and/or ground. As an example, in an embodiment which may partially resemble the one in FIG. 41B, at least one wheel/pod may be attached to a holder (e.g. positioned and/or comprised in a similar module such as and/or instead the BC1 (module)) and/or comprised into a (powered) wheel/pod module. As such, when the post swivels towards a surface (e.g. wall, ground, platform etc.) the wheel(s)/pod(s) at the top of the post (module) make(s) contact with the surface and further ensures support, traction and/or mobility in a plurality of directions.

A post may comprise or not a rotating trunk. The rotating trunk may comprise one or more segments.

A post may comprise or not a swiveling trunk. The swiveling trunk may comprise one or more segments.

A post may comprise or not a manipulation arm.

A post may comprise or not a swiveling/rotating trunk. The swiveling/rotating trunk may comprise in some cases at least two segments (e.g. superior and inferior) joined by a swivel; in further examples, the trunk may comprise more than two segments (e.g. a superior segment and at least two inferior; they may be joined by a superior swivel/joint and at least one inferior swivel/joint) joined by swivels/joints. In further examples, the swiveling/rotating trunk comprises one segment attached by the swivel/joint to a post's base.

Figure 39A:
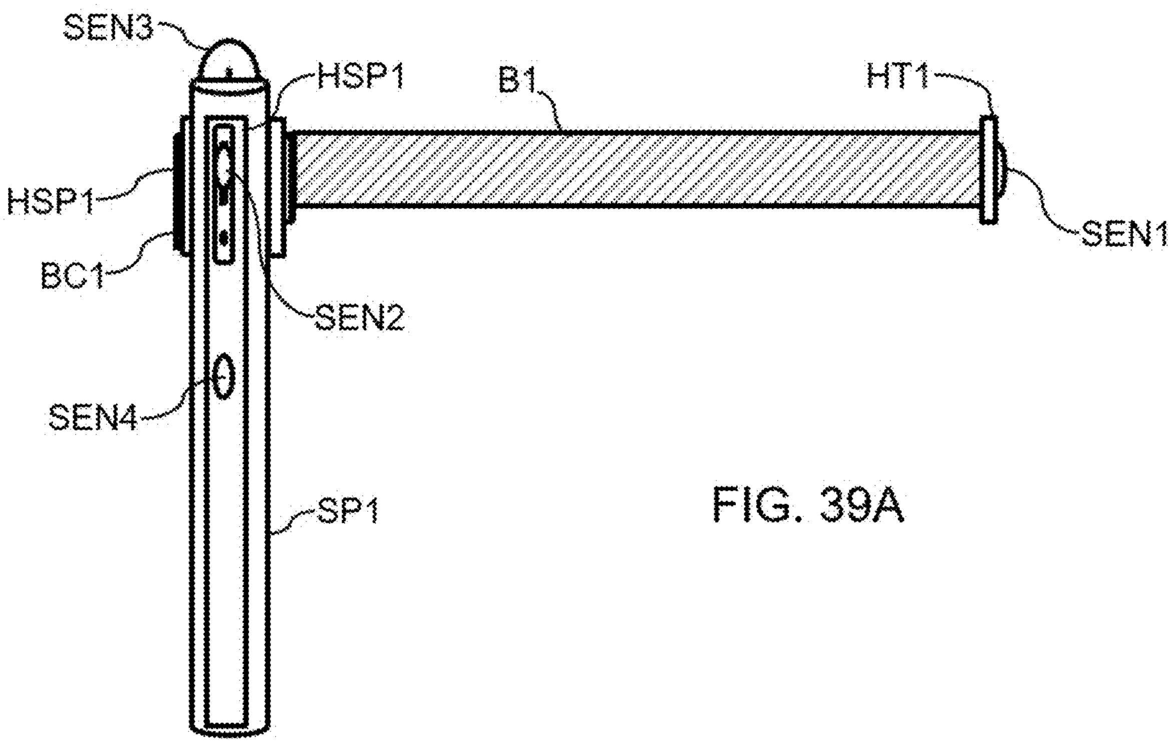
FIG. 39A is a close-up view of an upper portion of a semantic post.
Figure 39B:
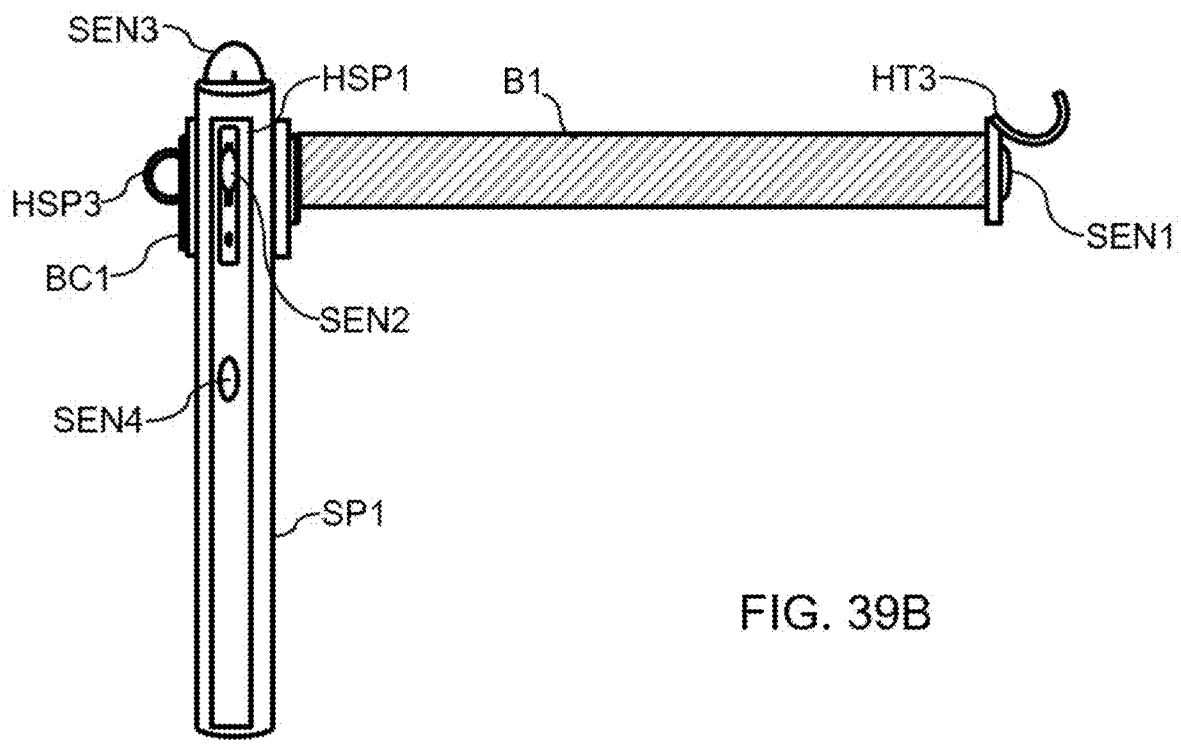
FIG. 39B is a close-up view of an alternate upper portion of a semantic post, incorporating a hook.

In some examples, the hooking/locking terminators HT1 have sensors (e.g. accelerometer/electromagnetic/infrared/optical/camera etc.) embedded and/or attached in/to them (e.g. such as SEN1 depicted in FIGS. 39A and B); it is to be understood that while SEN1 and SEN2 are depicted in FIGS. 39A and B as a single entity they may comprise, in some cases. a plurality of sensors, arrays and/or sensing modalities; further, there may be multiple entities such as SEN1 embedded and/or positioned/installed on HT1; in further examples, sensor SEN2 is attached and/or embedded on a post's lock. Alternatively, or in addition, such sensor devices and/or elements may be attached to any other component of the exemplified post (e.g. BC1, PLAT1, MB1 etc.). The terminator illustrated in FIG. 39A is the same as that shown in FIG. 39B except that the version of FIG. 39B includes a hook HT3.

As one post guides a band towards a lock the system uses sensors such as SEN1 and/or SEN2 to detect positioning, endpoints, perform analysis on the sensor inputs, position the bands, posts, arms and/or swivels and/or further realize the interconnection and form segments and/or further exclusion zones and/or guiding paths.

A semantic post may comprise sensors for detecting sound and/or ultrasound waves. Further, a semantic post may incorporate microphones for providing voice augmentation and/or alerts to people, objects and/or other posts around the post. In further example, ultrasound emitters/sensors may be used to emit ultrasound waves/signals which when received by an ultrasound sensor and/or further interpreted are used to align and/or orient components of a post and/or posts themselves.

The system may use ultrasound, optical, radio, infrared and/or other electromagnetic modality emitters and/or receivers (e.g. EM/R1, EM/R2) to align and/or orient components of a post and/or the posts' themselves. In an example, each post SP1 and SP2 comprises an optical/laser/infrared/rf emitter and/or receiver (e.g. EM/R1, EM/R2); in order to connect the bands to SP2, SP1 emits photons and/or radiation towards SP2 which rotates in such a way to receive the photons and/or radiation in an optimal manner; thus, if the emitter at SP1 is aligned with SP1's arm and/or terminator (e.g. HT1) and the receiver at SP2 is aligned with a (receiving) hook (e.g. HSP1, HSP2) then the system may be able to guide the emitter post (and/or its arm and/or band terminator etc.) towards the receiver post (and/or its arm and/or band terminator etc.) in a known and/or optimal manner and/or trajectory; further, the system may use the alignment to calibrate the posts to a known positional and/or endpoint mapping between the posts and/or their further components and thus use such mappings to achieve the interconnection.

It is to be understood that the sensors may comprise at least one detecting and/or capturing element and/or transducer; in addition, the sensors may comprise any of a (micro)controller, processor, semantic unit, FPGA, GPU and/or further memory and/or communication components.

In an example, in order to connect SP1 with SP2 via a banding component the system projects inferences in regard to the positions of SP1 and SP2 in such a way that ARM1 is able to grasp and extend the band B1 and hook and/or channel the termination HT1 in hook HSP2 of post SP2. It is to be understood that prior and/or in the process of grasping and/or extending band B1 and/or connecting it to hook HSP2 via termination HT1 the system may rotate and/or pivot the PLAT1 and/or posts (SP1, SP2) in such a way that the arm ARM1 vertical and/or horizontal axis/axes align/s with HT1 and/or HSP2 and thus, the connection would be easily achievable by ARM1 grasping termination HT1, (almost) (linearly) extending and connecting it to HSP2.

Figure 47A:
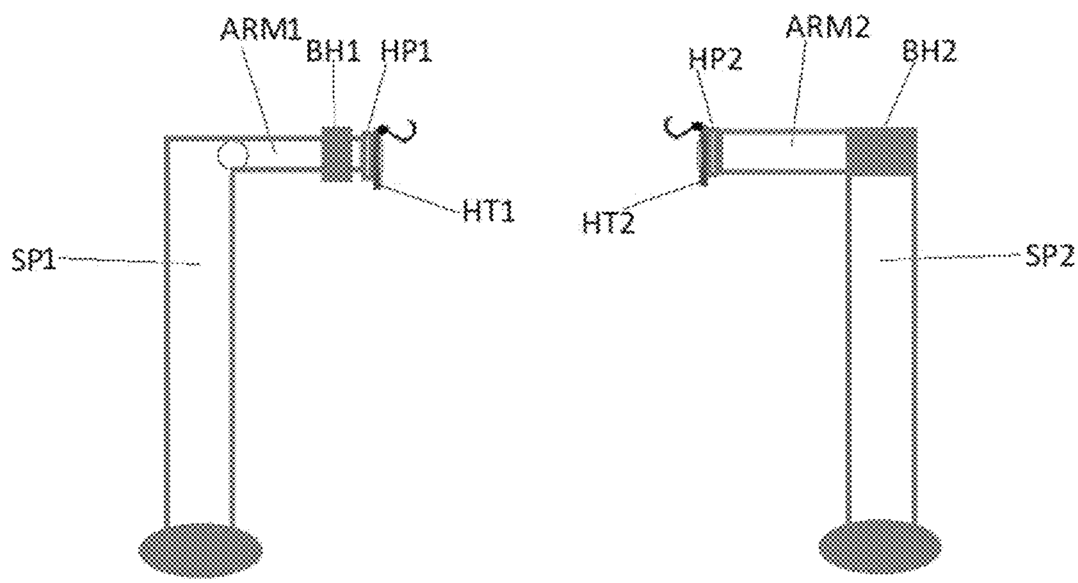
FIG. 47A is a front elevational view of a pair of posts with lockable bands.

In further examples, such as in FIGS. 47A and B, at least one of the SP1 and SP2 (each) comprise at least one arm (e.g. ARM1/ARM2 which may have at least one joint such as J1 allowing the arm to move/swivel) which have attached, holds, guides and/or channels (e.g. through rails, grooves, channels, profiles such as channel BCH1 delimited by (profiles) BCHD etc.) (each) one (roll of a) lockable band hold by BH1/BH2. It is to be understood that the channel BCH1 may enclose and hide channeled lockable band B 1; alternatively, or in addition, the band B1 is (partially) visible in channel BCH1 and/or between delimiter profiles BCHD. The termination and/or hook/latch of the lockable band (e.g. HT1/HT2 and/or H1/H2) coincides, is hold/locked (e.g. by a holder profile HP1/HP2 at the arm's end which holds the band terminator and allows the band to slide through and extend once connected and/or paired etc.) or is (slide-able) attached to the arm's end (e.g. in the position and/or instead of a gripper). In an example, in order to connect, SP1 and/or SP2 control/s the at least one arm to position its end and thus, the band termination and/or hook/latch of the lockable band to the connecting termination and/or hook/latch (of the connecting post and/or lockable band); once connected the lockable bands may extend by being unlocked, unrolled and/or slide out through the holding grooves, channels and/or holder profiles (e.g. such as BH1, BCH1 and/or HP1); further, once extended (and/or disconnected), the lockable bands may retract, rollback and/or slide in to the original position and/or onto a holder (e.g. BH1/BH2) (at an arm's end); further, once a band completely retracts and/or rolls-back the band's terminator (HT1) is hold, locked and/or impeded of sliding further down the arm and/or rolling back with the band by the holder profile (e.g. HP1/HP2) at the arm's end. It is to be understood that a post may control its arm and/or the connecting party/post arm and/or hook/latches. As mentioned, in some examples, the hook latches may comprise ELOCKS and/or electromagnets. Further, the holder profiles (e.g. HP1/HP2) at an arm's end may comprise latches and/or electromagnets for locking/unlocking the bands' terminators (e.g. HT1/HT2) (which may comprise the pairing latch and/or electromagnet).

Figure 47B:
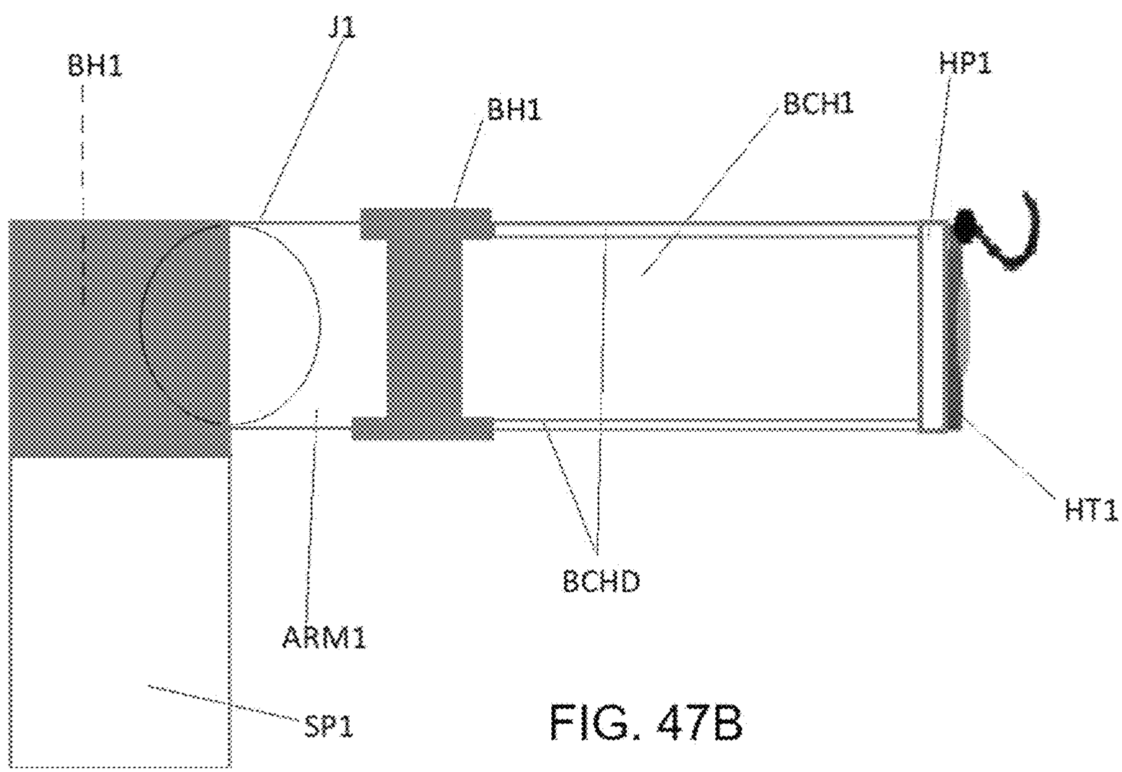
FIG. 47B is a close-up view of an upper portion of a post with a lockable band.

FIG. 47B further depicts potential arrangements of BH1 such as on the arm ARM1 (in black) or on the trunk (e.g. such as the depicted gray module pointed via the BH1 dashed line). Alternatively, or in addition, BH1 may be attached to a post's trunk (via securable latches, hooks etc.). Alternatively, or in addition, BH1 may be manufactured to/within a post's trunk. Alternatively, or in addition, BH1 may extend and/or be comprised along (a large portion of) a post's trunk.

The lockable bands may have a variety of shapes and/or forms. In some examples they resemble a rope (e.g. for easier manipulation and/or guiding along channels and/or grooves of an arm). In further examples, the lockable bands may resemble/comprise a film, net, mesh, sheet and/or further barricades. Further, terminators, hooks and/or latches (e.g. such as HT1/HT2 and/or H1/H2) may be connected along those barricades. Thus, in some examples, hooks resemble curved (in one or more directions) (metal) stripes terminally and vertically (parallel with the post's axis) attached/fitted to the barricade. Alternatively, or in addition, a hook comprises one (composite) stripe having hook bends in two directions opposite to the other. Alternatively, or in addition, the hook comprises two (joined) stripes each bend in a direction opposite to the other. Thus, by having a hook capable of connecting from multiple orientations (e.g. left/right, /up/down etc.) enable flexibility on connecting the posts and do not require different types of terminators to be matched for connecting the barriers.

A hook may comprise (composite) multiple bends and/or be capable of connecting from multiple orientations (e.g. left/right/up/down/front/back etc.).

In some examples, a band holder is positioned and/or attached (as a module) to/in/at/on a post's trunk (e.g. such as BH2 attached and/or comprised on/in SP2's trunk in FIG. 47A). Alternatively, or in addition, a band holder may pe positioned and/or attached to/in/at/on a post's arm (including the arm's end) (e.g. such as BH1 attached and/or comprised on/in SP1's arm ARM1 in FIG. 47A).

Figure 47C:
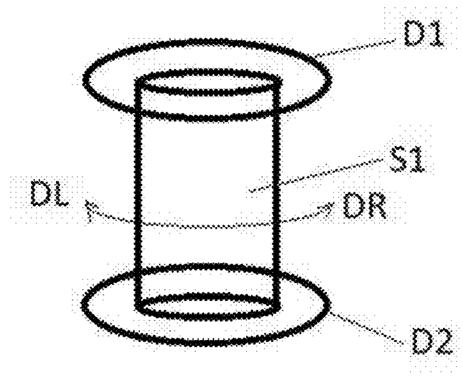
FIG. 47C is an illustration of a preferred band holder for a post with lockable band.

A band holder further depicted in FIG. 47C may comprise a roll support (e.g. such as S1) and delimiters (e.g. such as D1 and D2) and/or/which further channels and/or tracks for rolling/unrolling (around S1) and/or holding the (roll of) band optimally. Further, a band holder and/or its roll support comprises a spinner mechanism for supporting the roll movements including rolling/unrolling and/or further band extension/retraction. A band holder may be attached to a post's trunk (via securable latches, hooks etc. supporting and/or attached to delimiters such as D1/D2). Alternatively, or in addition, a band holder may be manufactured to/within a post's trunk. Alternatively, or in addition, a band holder may extend and/or be comprised along (a large portion of) a post's trunk.

A spinner mechanism may comprise extension/retraction and/or rotation/spinner components. In some examples, the functionality of such components is implemented mechanically (e.g. through rods, pins, (helicoidal) springs etc.) and/or electrically (e.g. through electrical motors). In further examples, the band's holder (spinner) rotation is (variably) damped. The damping may occur mechanically (e.g. via variable spring rates etc.), electrically and/or through other means (e.g. through electrorheological (ER) and/or magnetorheological (MR) fluids in and/or around the holder (spinner)); in some examples, a spinner may comprise channels, groves and/or blades which enable rotation damping through (ER/MR) fluids which change viscosity based on an applied electric and/or magnetic field controlled through an applied voltage and/or current.

Figure 47D:
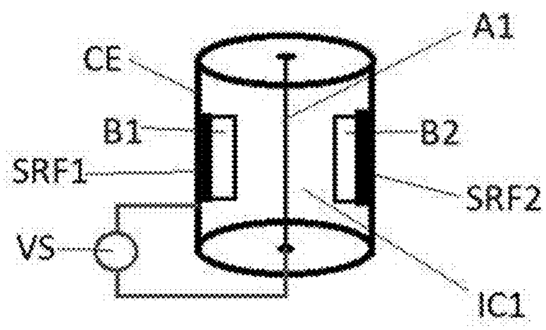
FIG. 47D illustrates a preferred spinner mechanism for a band holder.

FIG. 47D exemplifies a spinner mechanism, wherein the spinner comprises a roller shell CE which may spin around a rod/shaft/axle (profile) A1. The spinner comprises blades B1 and B2; while in the example B1 and B2 are depicted as attached to the roller shell CE it is to be understood that alternatively, or in addition, they may be attached to A1.

Blades may be attached to CE and/or A1 via components such as SRF1-SRF2 which may comprise at least one rod, axle, shaft, latch, lock, actuator, coil and/or spring.

Figure 47E:
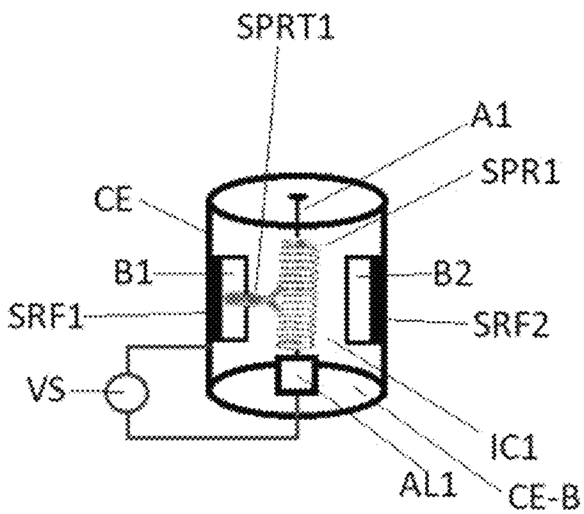
FIG. 47E illustrates a spinner mechanism including a spring.

In further examples, A1 may comprise and/or have attached (helicoidal) spring (s)/coils (e.g. such as SPR1 in FIG. 47E) which keep the roller/band tensioned and/or help it roll back around the (roll) support and/or (within) band holder. The (terminations of) spring (s)/coils (e.g. such as termination and/or connector/link SPRT1) may be attached to blades such as B1 and/or B2.

While the depicted examples may show SPR1 as exterior to A1 is it to be understood that in other examples SPR1 and/or SPRT1 is/are contained by A1; alternatively, or in addition, A1 (shell) may comprise and/or be fusion-ed with the blades B1 and B2 and/or further with CE.

While in some examples A1 may be fixed, in other examples it may comprise an exterior shell which rotate around the interior rod/shaft/axle, its spring/coil and/or its axis. Blades B1 and/or B2 may be attached and/or fusion-ed to A1's exterior shell.

Figure 47F:
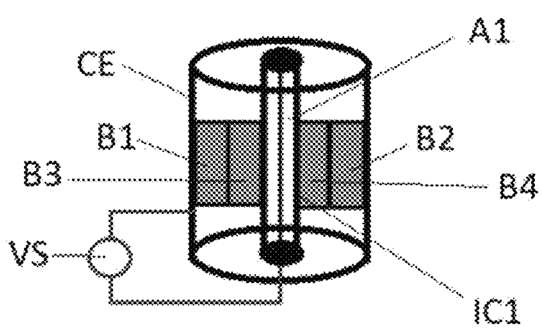
FIG. 47F illustrates a spinner mechanism including a plurality of blades.

FIG. 47F shows and embodiment where additional blades B3 and B4 are fusion-ed to the exterior shell of A1 which may comprise a helicoidal spring/coil such as SPR1 (attached to A1's rod/shaft/axle) and/or an electrical motor—not depicted—coupled and/or comprising A1's vertical rotating rod/shaft/axle.

Figure 47G:
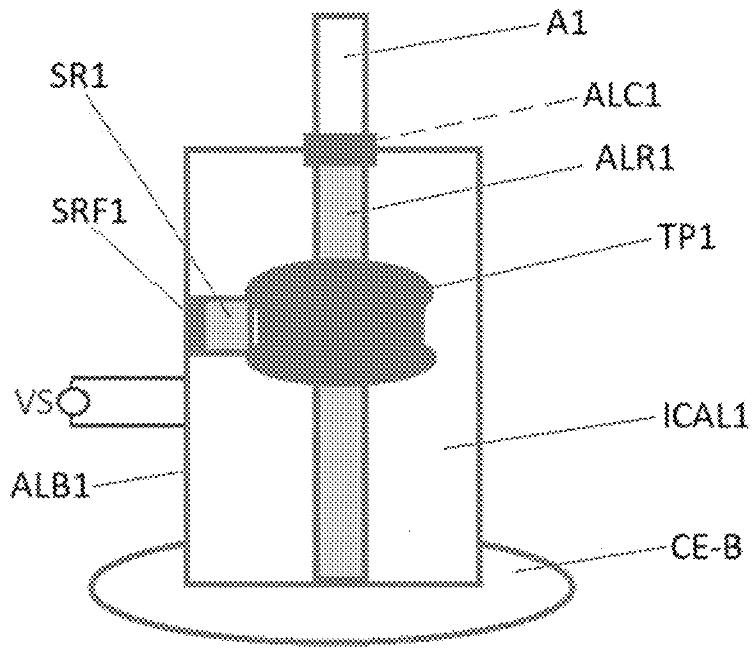
FIG. 47G illustrates a preferred lock for a lockable band.

In further examples, pairs and/or groups of blades such as B1,B3 and B2,B4 may be fusion-ed; further, they may rotate with or without A1 and/or be attached to A1, CE and/or ALB1 of FIG. 47G. Blades B1-B4 may be attached via components such as and/or similar SRF1/SRF2.

In some examples, the fluid cavity in FIG. 47F may not encompass the whole interior volume IC1 but instead only a/the volume controlled and/or comprising the blades (B1-B4) (e.g. such as marked in gray in FIG. 47F).

The system may control blades B1-B4 based on semantic gating and/or flow analysis. In an example, the system adjusts the blades to lock together and/or close all gaps (e.g. such as depicted in FIG. 47F where the gaps between B1-B3 and B2-B4 are closed) thus, blocking the flow of fluid within the fluid cavity and thus, blocking the rotation movement of the spinner/roller. In other examples, the system adjusts the gaps to control the rotation speed and/or damping.

A blade may comprise (adjustable) holes and/or profiles which may allow (when adjusted) for (variable) damping and/or speed of movement through a fluid. Alternatively, or in addition, blades angle may be adjusted and/or locked/unlocked (e.g. through a/the latch/lock/actuator embedded in SRF1/SRF2).

The interior volume IC1 of the spinner mechanism may be filled with a fluid. In some examples, the fluid is an ER/MR fluid and/or (further) comprising oils and/or electromagnetic sensitive particles.

In some examples, the roller shell CE may comprise and/or function as an electrode of the first polarity while A1 may comprise and/or function as an electrode of an opposite polarity with both electrodes connected to an electrical source such as VS; the electrical source may produce/provide a continuous or alternate current/voltage. Alternatively, or in addition, CE and/or A1 may comprise and/or function as electromagnets through embedded coils which may have terminations coupled to source VS.

In further examples, the rotation movement of the blades within the coils may generate electric/magnetic fields and/or further currents/voltages which may be further rectified, directed and/or stored within the batteries.

It is to be understood that the source VS may be or not be a separate component; further, it may represent and/or be connected and/or coupled to a post's electrical power supply and/or bus. In some examples, VS may comprise a transformer, stabilizer, rheostat and/or any other components needed to adjust and/or control the supplied and/or IN/OUT voltage/current/power. In further examples, VS is (coupled to) a wireless harvesting unit and/or energy storage.

Once a voltage/current is applied (via VS) the ER/MR fluid within volume IC1 may change viscosity and thus, enabling the blades B1, B2, B3, B4 (and hence CE, A1) to move/rotate with various speeds and/or damping factors due to the variable friction and/or opposite forces encountered while moving through the fluid and/or volume. Further, such damping factors may compensate, counter-act and/or augment the forces exercised by the (compressed) spring/coil.

The terminations of blades such as B1-B4 may comprise locking and/or sealing profiles and/or components (e.g. for joining, locking, fastening and/or sealing the blades (together)).

The axle (profile) A1 may comprise and/or be attached to a lock (e.g. such as AL1 in FIG. 47E) which impedes rotation of the roller and/or A1 in at least one direction.

In some examples, lock AL1 is attached to the roller shell (CE) and/or roller shell base (CE-B).

Figure 47H:
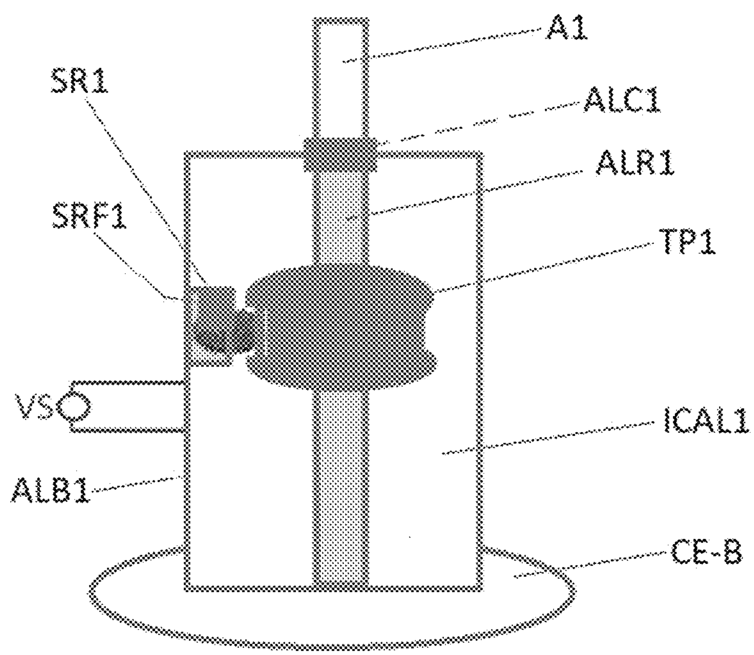
FIG. 47H illustrates an alternate preferred lock for a lockable band.

Lock AL1, such as depicted in FIG. 47G-H, may comprise a toothed profile/wheel/sprocket (e.g. TP1) attached/coupled to a center rod/shaft/axle/profile ALR1 (which is, coincides and/or is coupled/linked to A1) and a stopper (e.g. SR1) attached (directly or indirectly) to the structure and/or body of AL1 (ALB1).

In some examples, center rod/shaft/axle/profile ALR1 is coupled to A1 though profiles, linkages and/or couplings (e.g. such as ALC1). Alternatively, or in addition, ALR1 is part of A1 and ALC1 guides A1 within ALL It is to be understood that due to linkage/coupling between A1 and ALR1 when one rotates the other one rotates as well. While in examples, A1 and ALR1 linkage, drive and/or direct coupling enables rotation in the same direction, in other examples, A1 and ALR1 linkage, drive and/or indirect coupling may enable them to rotate in different directions.

In further examples, a linkage, drive and/or coupling (e.g. such ALC1) may comprise at least one bushing, bearing, sprocket, gear, pulley, flywheel, belt and/or cam.

AL1 comprises and/or has attached a toothed/hole/edged profile/wheel/sprocket (e.g. TP1) and/or at least blocking/locking stopper (e.g. SR1) which—as guided, tensed, positioned, pushed, locked and/or actuated—blocks/unblocks (on) at least one profile's/wheel's tooth/hole/edge—e.g. slides, falls, protrudes, catches, locks and/or blocks (on) at least one tooth/hole/edge (at a time of extension rotation); the stopper SR1 may be slide-able (e.g. to slide between teeth during rotation), tensioned by at least one spring/coil and/or actuated by at least one electromagnet and/or piezo component (e.g. comprised by SRF1). Alternatively, or in addition, the stopper SR1 may comprise a toothed profile/wheel/sprocket/cam, shaft and/or chain which is mechanically coupled (e.g. such as in FIG. 47H) with TP1; as such, when SRF1 is commanded/actuated it may enable/allow/disable/block the rotation of the SR1's profile/wheel/sprocket, shaft and/or chain and thus, transmitting the motion command to TP1; SRF1 may control/block/allow the rotation of SR1's profile/wheel/sprocket/shaft/chain in a variety of ways including an electrical motor, electromagnet, locks/latches/rods/blades and/or other components and/or actuation modalities some which are explained throughout the application.

In an example, A1 (and thus, ALR1) rotates towards band extension which generates (compressive) tension in SPR1; further, AL1 blocks A1/ALR1 from rotating for retraction unless AL1 is instructed to unblock and/or deactivate (e.g. via actuating and/or releasing SR1 from TP1 via SRF1).

AL1 locks A1/ALR1 through the stopper SR1—comprising SRF1 which fastens SR1 to AL1 structure and/or (further) may comprise a latch/lock/actuator and/or a helicoidal spring/coil mechanism (similar to SPR1 in A1)—which blocks (on) the toothed profile/wheel/sprocket TP1; during activities such as band deployment/retraction the stopper SR1 is released and/or moved away (e.g. via unlocking/unblocking/releasing/actuating the latch/lock/actuator (within) SRF1) from the toothed profile/wheel/sprocket TP1 and thus, allowing for (retraction) movement.

In some examples, tooths (e.g. of TP1) and/or stoppers (e.g. SR1) may comprise/have blade, spike, rod and/or similar profiles. As such, it is to be understood that they may be used interchangeably. Further, they may be setup and/or adjusted in various profiles and/or angles (e.g. for allowing stopper SR1 to slide IN/OUT teeth and/or TP1).

The interior volume ICAL1 of AL1 may be filled with a fluid (similarly as IC1). In some examples, the fluid is an ER/MR fluid and/or (further) comprising oils and/or electromagnetic sensitive particles. The rotation movement of TP1 may be damped by the fluid which may exercise a force on the (adjustable) teeth/blades.

The lock may be further connected to an electrical source such as VS for actuating SRF1, adjust teeth/blades (position/direction/gaps/holes/openings) and/or for creating the fields needed to change the viscosity of the ER/MR fluid.

The electrical source VS may be (coupled to) a (rectified) wireless module/circuit which harvests energy from the environment. In some examples, the module/circuit may be serial/parallel (inductive-capacitive) resonant. The module/circuit may be configured for inductive (near field) and/or electromagnetic (far field) coupling to be powered and/or communicate wirelessly with a/another device.

In some examples, the wireless module/circuit front-end consists of an antenna connected through a matching circuit to a rectifier (e.g. such as a charge pump driving a regulator). The regulator then powers an energy storage and/or other components such as a micro controller/processor, memory, sensors, chips, units and/or devices.

In some examples, source VS may comprise and/or be connected to a energy storage/battery while in other examples, source VS is a pure harvester; further, in other examples, source VS may comprise and/or be connected to both a harvester and/or energy storage/battery.

Further, the wireless module/circuit may be comprised and/or be connected in/to a wireless transceiver (and/or transmitter and/or receiver), modulators, units and/or frontend to transmit/receive/modulate/encrypt (modulated/encrypted) data/signals from/to the memory and/or micro controller/processor which may be used to control the lock/release of AL1/SRF1/SRF2. As exemplified throughout the application a multitude of protocols may be used to modulate and/or communicate data.

The power provided to electromagnets incorporated in AL1/SRF1/SRF2 may be provided through a harvesting frontend of the wireless module/circuit. In an example, such as FIG. 48 the wireless module/circuit TRUD embedded in a door lock (e.g. DL1) harvest and/or provide energy to actuate the electromagnets and/or further identify/authenticate a user (e.g. via RFID/NFC, Bluetooth, 3GPP, IEEE 802 etc.). As such, when the user wireless device TRUU and/or embedded application approaches and/or presents a/an (stored/embedded) credential (e.g. by particular location, proximity and/or contact with the door lock and/or RF unit), a (resonant) wireless signal is generated from TRUU and/or SP3/TRU3/SP4/TRU4 to power the robotic lock (through TRUD) and thus, further locks/actuators (e.g. such as AL1/SRF1/SRF2) of the door cylinder.

The door lock may comprise at least one memory coupled to at least one (internal) microprocessor/microcontroller. The memory may store a plurality of (received/provisioned) credentials and/or access control rules. Credentials may be of any type specified in this application including keys, identities, biometric data/files etc. In some cases, the biometric data/files comprise images and/or models of ((leadership) artifacts associated with) fingerprints, facial features and/or other biometric identification capture. A user presented authentication/credential (data) is captured by the sensors and compared by the processor with the stored credentials/authentication (data) in order to authenticate the user.

The lock memory may be provisioned with and/or store a plurality of access and/or authentication sequences and/or semantic routes and/or (associated/comprised/comprising) semantic times. In examples, the lock processor doesn't authenticate (a fingerprint of) (and/or allow access of) a user once it detects PAPER POSSESED BY THE USER (JOHN), PAPER PRESENTED TO SENSOR (BY (THE) (USER) (JOHN)), FINGERPRINT DETECTED, ((USER) (JOHN) FINGERPRINT AUTHENTICATED) and/or similar. In other examples, the system doesn't authenticate and/or allow access of a user/artifact which is detected as being controlled/maneuvered by a hostile person (e.g. HOSTILE PERSON DETECTED, DENIED PERSON CONTROLS THE/AN ALLOWED PERSON etc.). In some examples, the inferences related with such semantic routes and/or times may be based on data from lock sensors, infrastructure/post sensing and/or flux/stream.

In other examples, the semantic routes may be associated with positioning and/or (further) diffusion. Thus, a semantic route may be JOHN IS IN FRONT AND/OR LEFT OF THE DENIED PERSON, NO OTHER PERSON BETWEEN JOHN AND THE DENIED PERSON, JOHN DIDN'T CROSS THE DIVIDER, NO OTHER PERSON AROUND (AND/OR BEFORE JOHN). It is to be observed that the "other person" may be based on high entropy inference in rapport with John (as a person) and the "denied person".

It is to be understood that while a person user has been exemplified, in other cases a user may be substituted and/or associated with other artifacts including items, posts, vehicles and/or associated/related devices.

As explained, the semantic routes may comprise and/or be associated semantic identities; in some examples, the user selects the semantic identities from a predefined list (or options) and/or (associated) user interface control. In further examples, the user (partially) specifies the semantic routes without the semantic identities (selection) at a first time; the semantic identities selection may take place before and/or after the first time. In case that the semantic identities are specified at later time, placeholders and/or other delimiters/indicators may be added to a semantic route in place and/or around the missing/required/to be specified semantic identities. In further examples, the semantic route comprises delimiters (e.g. ( ) (%1, %2 and/or %3), (@1 @2 @3), { }, {& & &}, [ ], [* * *] etc.) which may delimit the semantic identities once specified (e.g. (John, Jane and Recycling Co.), {Does and Recycling Co.} etc.).

It is to be understood that while a person user has been exemplified, in other cases a user may be substituted and/or associated with other artifacts including items, posts, vehicles and/or associated/related devices.

Figure 48:
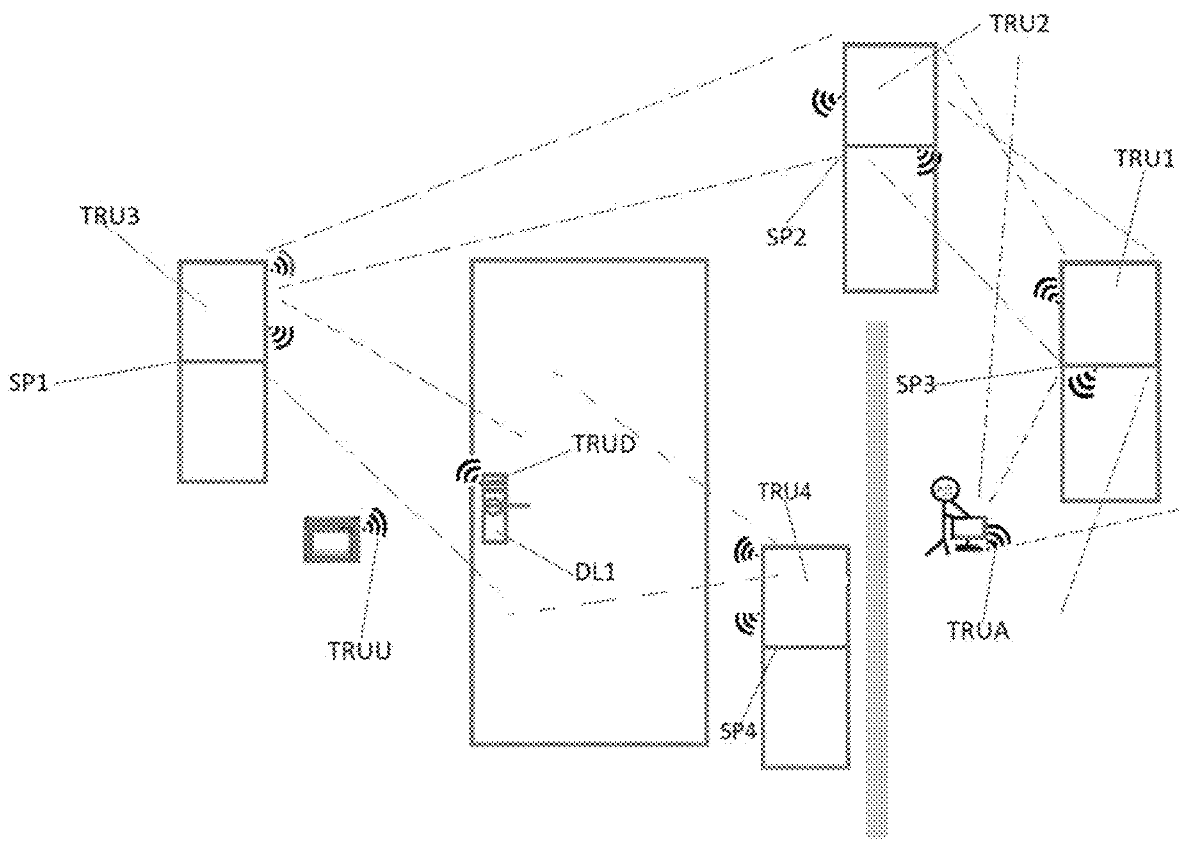
FIG. 48 is a representative illustration of a wireless module embedded in a door lock to harvest and/or provide energy to actuate electromagnets or identify/authenticate a user.

Access credentials and/or rules may be distributed to the door locks through a post infrastructure comprising posts such as SP1-SP4 comprising wireless units TRU1-TRU4 such as in FIG. 48.

As depicted, each unit adjusts at least one antenna field of view and/or radiation patterns to encompass the next endpoint (s) and/or group (s) in the network for beaming transmit/receive and/or further activities.

The administrator indicates and the system further transmits wirelessly (e.g. via TRUA) the data, credentials and/or the rules to TRUD via a route comprising TRUA, SP1, SP2, SP3, TRUD. In further examples, the system selects and/or infers a route based on the semantics determined and/or indicated for endpoints associated with TRUA, SP1, SP2, SP3, TRUD; as such, the system is able to apply semantic routing and/or other semantic analysis techniques such as explained in this application. The post wireless infrastructure is configured and/or deployed to direct and/or provide power to the door units when required as projected. In some examples, the system detects (e.g. via a camera and/or optical sensor) that a user approaches (and/or swipes TRUU to TRUD) and thus, it may direct and/or adjust wireless signals (power/polarization) from TRU3 and/or TRU4 towards TRUD and/or TRUU to provide (additional) power to be harvested by their embedded harvesting and/or resonant components/circuits. As such, in addition to harvesting wireless power from TRUU, TRUD may harvest wireless power from the wireless infrastructure; in some examples, the harvested and/or provided wireless power is allocated and/or associated with activities and/or capabilities budgets.

While wireless power transfer has been exemplified between TRUA, TRUU, TRUD and/or TRU1-4 it is to be understood that other modalities such as ultrasonic, acoustic and/or further sympathetic resonance may be employed, potentially coupled with piezo generators/harvesters.

Figure 54A:
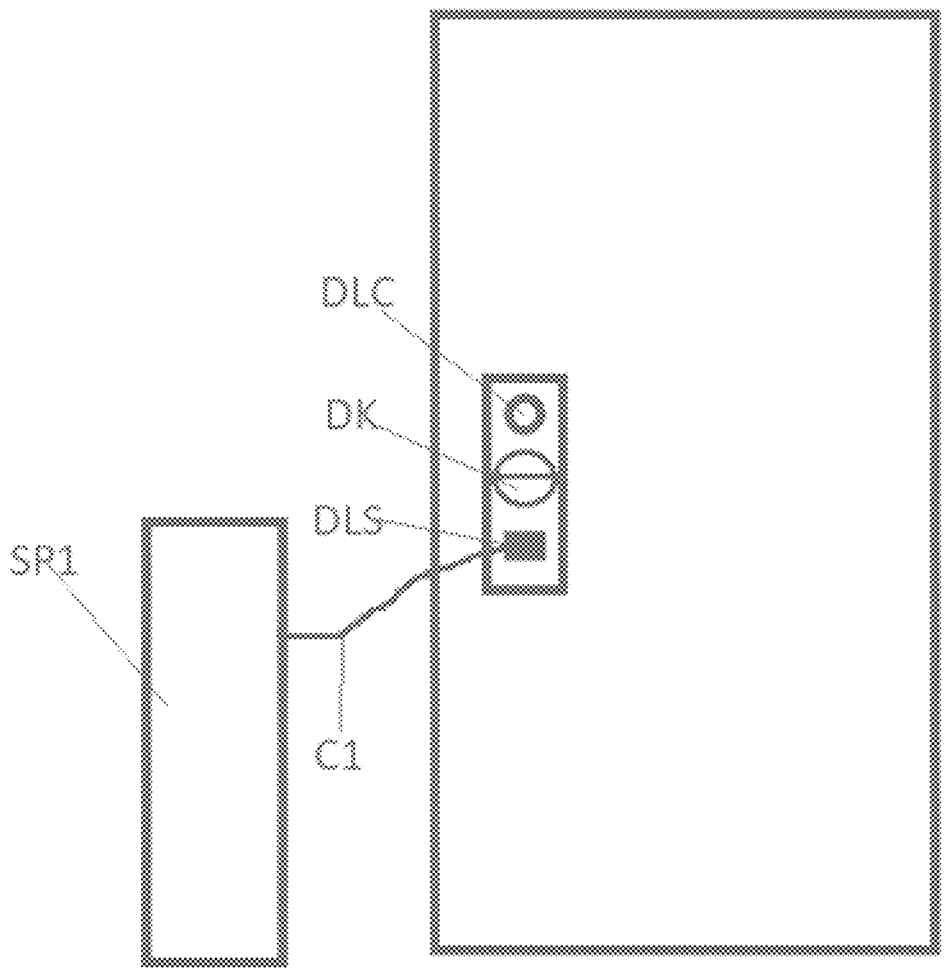
FIG. 54A is a front elevational view of a preferred door having a lock and a camera.
Figure 54B:
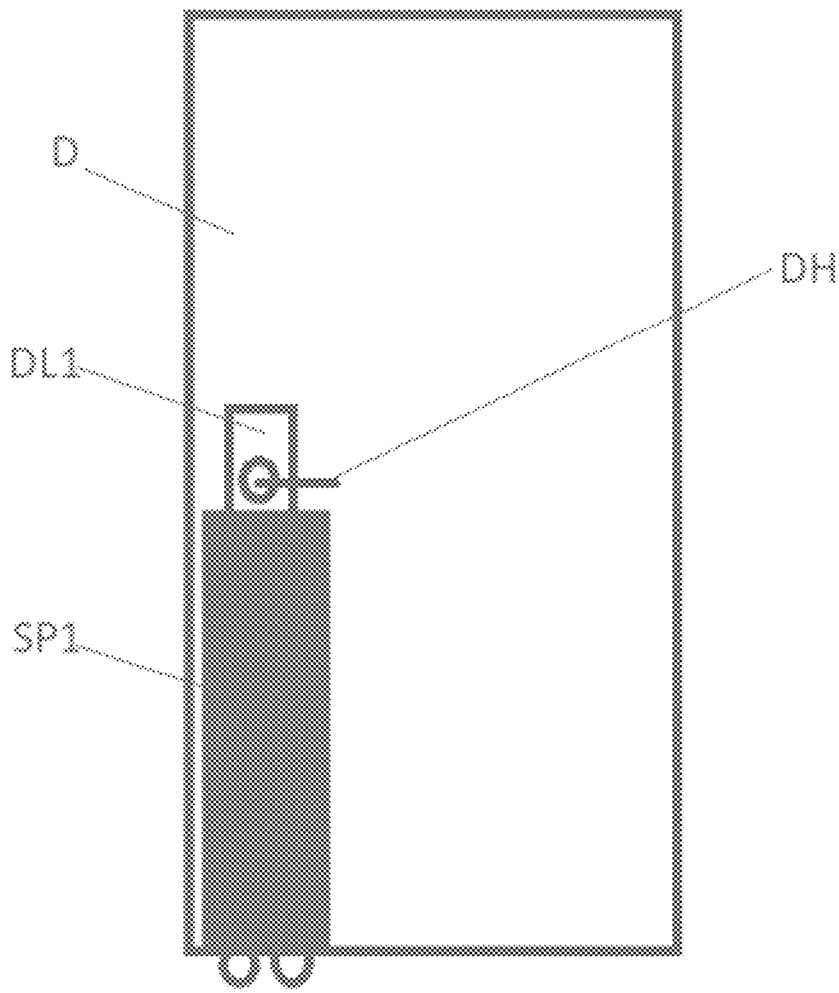
FIG. 54B is a front elevational view of a preferred door having wheels.

A door lock may comprise at least one camera (e.g. such as DLC in FIG. 54A). Alternatively, or in addition, it may comprise other/additional sensing/sensors and/or semantic units. In some examples, such sensors may be used to capture, detect, identify and/or authenticate biometric data.

Such cameras and/or (further) sensors may be used for (multi-factor) authentication and/or credential reading (e.g. comprising biometrics, optical, bar/QR code, RF etc.). The system (and/or door lock processor) may detect that a user is approaching and thus, it may direct and/or harvest sufficient/likeable power to allow (credential) reading, identification and/or authentication/verification.

By inferring the circumstances and/or sequence of events the door lock may be made more secure. In examples, a door lock processor and/or system detects that a person approaches the door lock (camera/sensor) and further that the person presents a picture (e.g. of a fingerprint, face etc.) for authentication; thus, the person is denied access and/or (lock (s) and/or endpoints') supervisors augmented on an/the attempted breach. Furthermore, if the circumstances of detecting the biometric authentication are non-affirmatively factorized and/or inconclusive/superposed (e.g. due to obturations, lack of power etc.) then the lock may not authenticate the presented credential/person, denies access and/or further augments/challenges supervisors which may take further action (e.g. allow/deny the access, ask for more identification, apply countermeasure etc.). Alternatively, or in addition, the assessment of circumstances comprises (inferring affirmative/non-affirmative factorizations) following and/or resembling (e.g. based on semantic drift, time etc.) particular (stored/provisioned) (affirmative/non-affirmative and/or allowable/not-allowable) semantic routes and/or protocols.

An example of door cylinders comprising spinners/locks and attached/linked to bolts B, B1, B2 are further presented in FIG. 49A-D and FIG. 50.

Figure 51A:
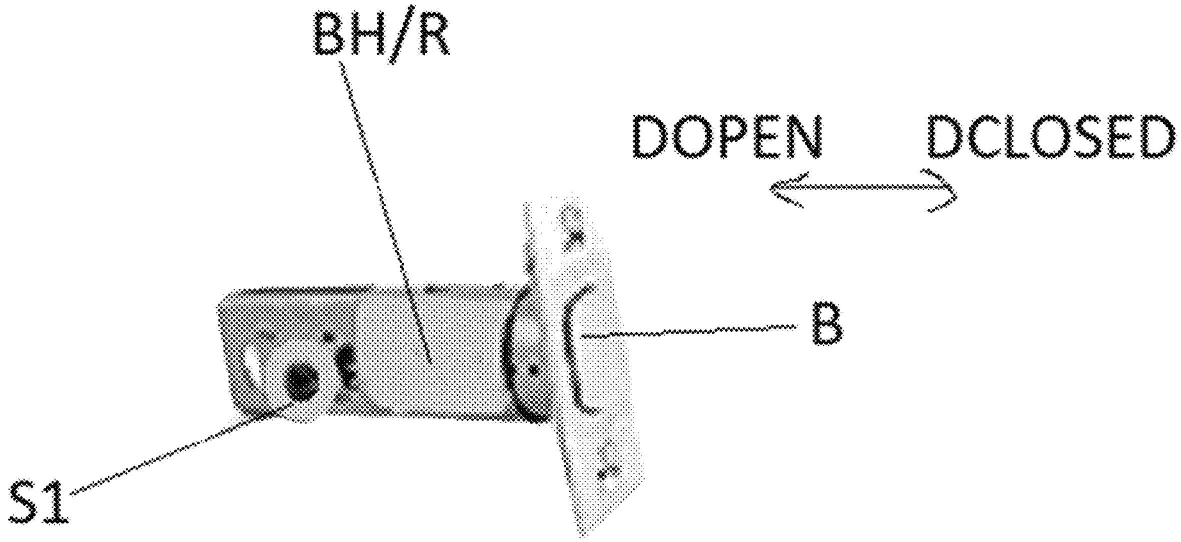
FIG. 51A is a perspective view of a linearly moveable bolt in a retracted position.
Figure 51B:
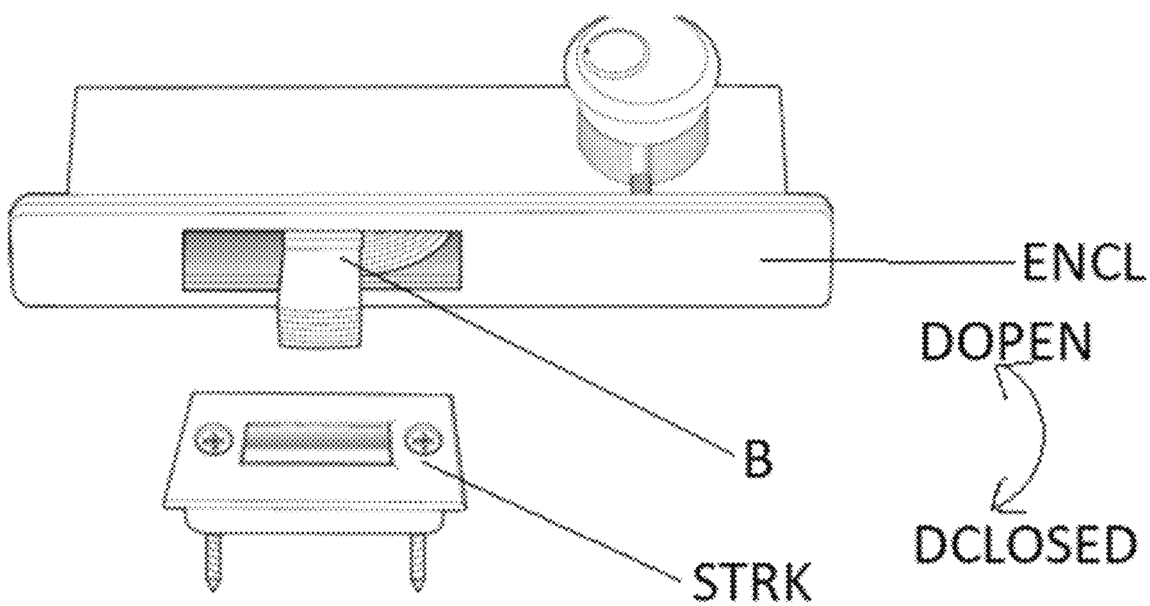
FIG. 51B is a perspective view of a pivoting or swinging bolt in an extended position.

In further examples, bolts such as B in FIG. 51B are (circularly) swinging between directions DOPEN and DCLOSED and/or IN/OUT of the lock enclosure ENCL and/or OUT/IN of a strike such as STRK. In other examples, the bolts are moving linearly between deployed (DCLOSED) and retracted (DOPEN) positions such as in FIG. 51A (e.g. helped by the manipulation of a rail and/or cam by the door lock cylinder attached and/or comprising a spinner).

A bolt B is attached and/or manipulated by a bolt rail and/or cam (comprised within) BH/R (1-2). In some examples, the bolt B is a deadbolt wherein when in deployed or retracted position B is locked in place by a safety (profile) comprised in BH/R (1-2) (e.g. such as B1 in FIG. 50). Thus, the spinner engagement shell CE may also be (relatively) secured by the engagement of the safety profile.

In some examples, BH/R (1-2) comprises a lever tumbler lock for safety that uses a set of levers to deny the bolt from moving in the lock. In some embodiments, lifting a tumbler above a certain height will allow the safety (lever) to be unlocked and the bolt to slide. As such, the spinner engagement shell CE may comprise and/or be attached to at least one (multi-level) manipulation lever profile and/or (multi disk/wheel/shaft) cam which manipulate (e.g. up/down) the tumbler (s) when rotated. In further examples, each level and/or (eccentric) disk/wheel/shaft of the manipulation lever and/or cam is used to manipulate and/or unlock at least one tumbler.

In other examples, the bolt is a latch bolt (e.g. such as B2 in FIG. 50) and/or deadlatch (having a guard bolt). In addition, the bolt may be spring loaded.

In some examples the lock comprises a piezoelectric harvester. As such, the harvester may be linked to the power source/storage VS.

Alternatively, or in addition, door lock power is generated by moving (e.g. up/down, rotate etc.) the door handle and/or knob (e.g. by a user/person, by a post etc.). In some examples, a (door) post manipulates the door handle and/or the knob to generate energy to the door lock and/or based on particular goals and/or semantic times (e.g. until green light, (lock/post) battery to 50% etc.).

The movement of the door handle and/or knob may act against a piezo element which generates electrical currents/voltages to be harvested and/or stored.

Alternatively, or in addition, the movement of the door handle and/or knob move a plunger and/or coil relatively to each other and generates currents/voltage through electromagnetic induction.

Alternatively, or in addition, the door lock may function at least partially as an alternator (or generator) for generating AC/DC voltages/currents which is then rectified and/or transformed to (constant/non-fluctuating) DC voltages/currents. As such, the movement of the door handle and/or knob engage a rotating magnet (e.g. rotor—comprised and/or attached to the axle or axial profile) which turns within a stationary set of conductors wound in coils on an iron core (e.g. stator—comprised and/or attached to the shell CE).

The rotating magnetic field by the movement of rotor induces an AC voltage in the stator windings.

Alternatively, the magnetic field is generated by the stator (e.g. shell engagement CE) and the current is generated in the coils of the rotor (e.g. the axial profile) while being manipulated.

The alternator/generator may comprise a commutator such as comprising split rings to keep the generated current for changing direction (DC current).

In further examples, the door handle manipulation determines a back and forth (half) partial rotation of the axial profile/rotor and hence the orientation/direction of the generated current in the rotor/stator is preserved (DC current).

A voltage rectifier is employed to rectify the generated (AC/DC) voltage. Further, a voltage stabilizer/regulator may be employed to stabilize the generated current.

A (plunger's/rotor's/stator's) magnetic field may be produced by permanent magnets, or by a field coil electromagnet.

In examples, the axial profile comprises a rotor winding which allows control of the lock's/alternator's generated voltage by varying the current in the rotor field winding.

Alternatively, or in addition, the rotor axial profile comprises a permanent magnet and the generated voltage/current varies directly with the speed of manipulation.

A voltage regulator may be employed to keep output voltage constant. If the output voltage from the stationary armature coils drops (e.g, due to position and/or speed of the rotor manipulation, due to an increase in demand etc.), more current is fed into the rotating field coils through the voltage regulator. This increases the magnetic field around the field coils which induces a greater voltage in the armature coils and hence the output voltage is brought back up to its original value.

The user manipulates the door handle and/or knob until sufficient power is generated to engage the lock.

The door lock may comprise a power indicator indicating the power level and/or status. In some examples, the door lock may show a first color light (e.g. green) if is capable of engaging/disengaging and/or a second color light if is not (e.g. red). Additionally, it may show a third color light (e.g. orange) if is between charged (green) and discharged (red).

The bolt rail and/or cam and/or bolt may be attached, linked and/or manipulated by the spinner engagement shell (e.g. CE of S1); the spinner engagement shell can be engaged and/or coupled with the axial profile and/or TP1 via (bolt/rod/blade/profile) SR1 through actuator SRF1. In some examples, as previously presented, SR1 may comprise a cam and/or a toothed profile (including a wheel) which may rotate and be further locked/unlocked through actuator SRF1 (e.g. such as in FIG. 49C). In further examples SRF1 has, comprises and/or is attached to a stopper profile configured to provide support to SR1 and to stop rotational movement in one direction when engaged. Alternatively, or in addition, the stopper may be attached and/or fabricated into CE (e.g. STPR_CE (2) in FIG. 49E).

SRF1 and/or (its) stopper profile may have and/or encompass a variety of shapes. In some examples, while disengaged SRF1 and/or (its) stopper does not (significantly) protrude and/or be observable within S1 but instead follows the interior shape of CE. In other examples, at least the part and/or the section of SRF1 and/or (its) stopper which is within the interior of S1 and CE have very smooth (non-angled, non/slight curvature) contours. As such, the threat of physical manipulation or breach of the lock by manipulating CE and/or SR1 through SRF1 and/or (its) stopper when disengaged is practically non-existent.

The spinner profile may comprise an engagement wheel EW for engaging TP1 with shell (CE) as depicted in FIG. 47H. In some examples, when the door lock is disengaged EW spins freely and thus, not engaging CE; when the door lock is engaged EW is locked by and/or within SRF1 and thus, any rotational movement of A1 (and/or linked DH1/DK1) is transmitted to CE.

The spinner engagement shell may rotate within a circular holder profile and/or groove and/or bearing/bushing within the door lock.

The door lock is engaged when the spinner engagement shell is coupled and/or engaged with the axial profile and/or TP1; further, the door lock is disengaged when the spinner engagement shell is uncoupled and/or disengaged with the axial profile and/or TP1. As such, the lock provides secure locking capabilities when disengaged (due to the disengagement of the bolt from the door handle, knobs and/or other manipulation profiles).

Axles (e.g. such as A1) of spinners (e.g. such as S1, S2) may be supported by (e.g. on a profile such ALC1 in FIG. 47G-H) and/or rotate within lock's exterior shell and/or (attached/fabricated) faceplate (s) (such as FP1-FP3) and further be attached to a door handle (e.g. DH1), door knob (e.g. DK1) and/or other door/bolt open/close user accessible manipulators. Further, such axles and/or axial profiles may comprise springs and/or dampers (e.g. such as in FIG. 47D-I) which ensure a potential recoil and/or damping of the door handle/knob to an original position once engaged and/or manipulated out of the original (resting) position.

Axles and/or spinner shells may rotate on bearings and/or bushings (e.g. positioned/supported on faceplate (s) etc.). It is to be understood that in some embodiments the faceplate (s) is/are part of the lock's shell and/or body; alternatively, or in addition, the faceplate (s) are fabricated profiles within/of the door lock designed to accommodate (the bearings/bushings of/for the) spinner axles and/or shells and/or their further rotation; even further, the faceplate (s) may be attached (instead of fabricated) profiles within/on the door lock (shell). As such, the term "faceplate" may be used to indicate lock components configured to support a spinner axle and/or shell (rotational movement) including (comprised and/or supporting and/or associated) bearings and/or bushings.

Figure 51C:
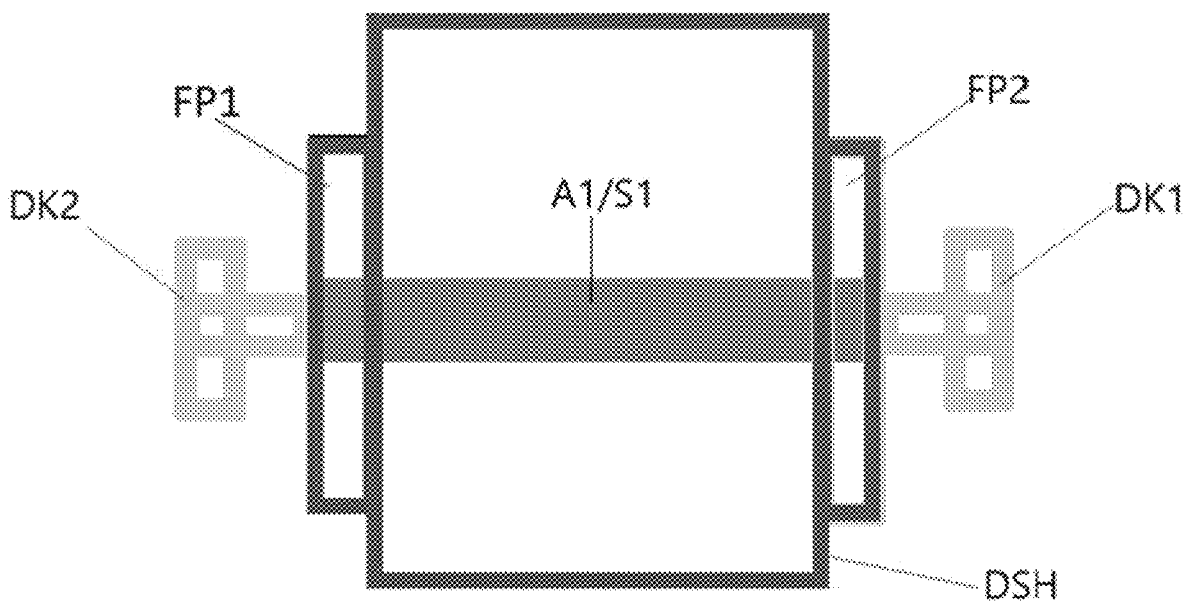
FIG. 51C is representative illustration of an axle/spinner supported by an exterior shell of a lock and/or faceplates.

An example of an axle/spinner (A1/S1) supported between the lock's exterior shell (DSH) and/or faceplates (FP1/FP2) is depicted in FIG. 51C; the axle A1 may have attached doorknobs such as DK1/DK2, door handles (e.g. DH1) and/or other manipulation components and/or profiles. In some examples, the spinners' shell (e.g. such as S1/CE) may not be supported and/or attached to (attached) exterior faceplates for security reasons in order to impede physical access to it and thus, rogue manipulation of bolts; instead, they are supported (on/by faceplates embedded) in the door lock in such a way to make them hardly accessible in case of an unauthorized breach attempt. Thus, in some examples, the axle/axial profile and/or the spinner shell may be supported on different faceplates while in other examples they may be supported on the same faceplate (s). While the faceplates have been depicted as protruding and/or attached to the lock's exterior shell it is to be understood that they may be part of the lock's (exterior) shell (e.g. not protruding and/or fabricated/forged into the shell).

While in the depicted examples the manipulation components have been drawn as being potential distinctive in shape (e.g. such as the depicted door handle (DH1) and/or the depicted door knobs (DK1/DK2)) it is to be understood that they may be used interchangeably. As such, a door handle can be used interchangeably with a doorknob and/or other manipulation components and/or vice-versa.

When not engaged by SRF1, through the linkage with CE via SR1, the axle A1 and thus, DH1/DK1 move freely without causing any manipulation or action against a bolt B (1-2). When engaged, the manipulation of DH1/DK1 causes the rotational movement of axle A1 and thus CE which transmits the action to the bolt rail, profile and/or further to the bolt.

As previously presented, in some examples, the actuator SRF1 may lock/unlock (instead and/or in addition to SR1) a cam toothed profile (and/or wheel) (such as in FIG. 47H) which during the lock disengagement rotates freely and during engagement is locked by SRF1 to provide a coupling between spinner engagement shell CE and axial profile TP1.

In some examples, such as comprising linear bolt B of FIG. 51A the rotational motion of CE is transformed in linear motion by (bolt) rails and/or profiles.

When not engaged, profile SR1 may be positioned within a stopper STPR profile embedded in the door and/or lock. In some examples, STPR is an opening and/or profile within a door's interior. Further, SR1 may move in the disengaged position to STPR through an opening or hole within CE accommodating its movement between engaged/disengaged positions and/or IN/OUT S1/TP1 and/or OUT/IN STPR.

TP1 may be attached and/or incorporated (e.g. fabricated/forged) to/into/as an axial profile and/or vice-versa.

Profile SR1, STPR and/or TP1 may incorporate magnetic materials in order to allow attraction/repelling magnetic fields between SR1-TP1 and/or SR1-STPR. Alternatively, or in addition they may incorporate coils and/or other components which generate (variable) (attraction/repelling) magnetic fields when a voltage is applied. In an example, at unlock and/or engagement TP1 generates an attraction field for SR1 and/or STPR generates a repelling field for SR1. Alternatively, or in addition, SR1 generates variable attraction/repelling fields towards TP1 and/or STPR based on similar circumstances; it is to be understood that the magnetic field polarity may be switchable (e.g. by switching the applied voltage to the coils and/or by changing the direction of electrical current flowing within the embedded coils etc.).

While for each spinner one stopper STPR and/or actuated profile SRF1/SR1 has been depicted it is to be understood that in other examples each spinner may comprise and/or be associated with multiple stoppers and/or actuated profiles. Further, while the stopper and/or actuated profile has been depicted in particular orientations, positioning and/or movement it is to be understood that alternate orientations, positioning and/or movement are possible.

In some examples, stopper STPR can be and/or is flipped (e.g. fixed by design and/or actuated) and/or provide blocking capabilities from alternate directions and/or orientations. Alternatively, or in addition, stopper STPR can have various other profiles (e.g. such as comprising a blocker groove STPRG, a toothed cam profile etc.) and/or rotate around an axle such as STPRA in FIG. 52.

Figure 52:
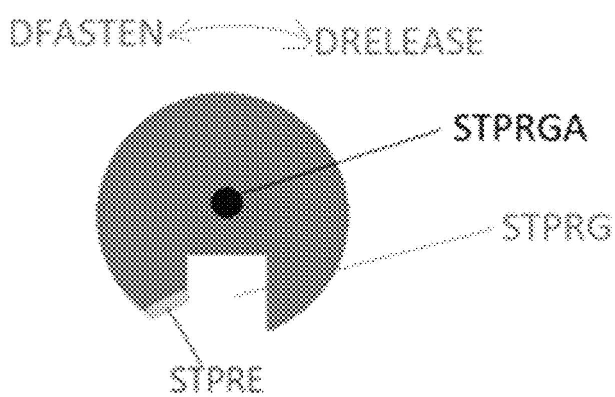
FIG. 52 is a plan view of a preferred stopper.

In FIG. 52, the depicted stopper comprises a groove STPRG designed to accommodate and/or lock profiles such as SR1. Further, in additional examples, when the lock is disengaged, the stopper may rotate to direction DFASTEN to further secure and/or block SR1 (e.g. via contact with the edge (profile) STPRE); similarly, when the lock is to be engaged the stopper may be actuated to rotate in direction DRELEASE to release SR1 from STPRG and to contact and engage TP1.

The spinner engagement shell may be supported and rotate within a circular holder profile and/or groove and/or bearing/bushing (fabricated/forged/attached) within the door lock. Alternatively, or in addition, it may be attached, linked and/or fastened on the bolt rail and/or profile.

The spinner engagement shell CE may be also blocked (e.g. when disengaged) and/or unblocked (e.g. when engaged) through plungers (e.g. of electromagnets, piezo actuators) which deploy/retract in/out profiles, grooves and/or holes within CE and/or its holder profile. As such, when the lock is disengaged a plunger is actuated and/or falls in CE and/or its holder profile thus, blocking/locking CE on the holder profile; when the lock is engaged, the plunger is actuated and/or falls out of CE and/or its holder profile and thus, unlocking CE and the holder profile. Further, CE is unblocked before SR1 engages and is blocked after SR1 disengages; as such, the applied voltage to the CE's blocking actuators and/or SRF1 may be delayed accordingly. The actuators may be attached to CE and/or holder profiles.

Figure 50:
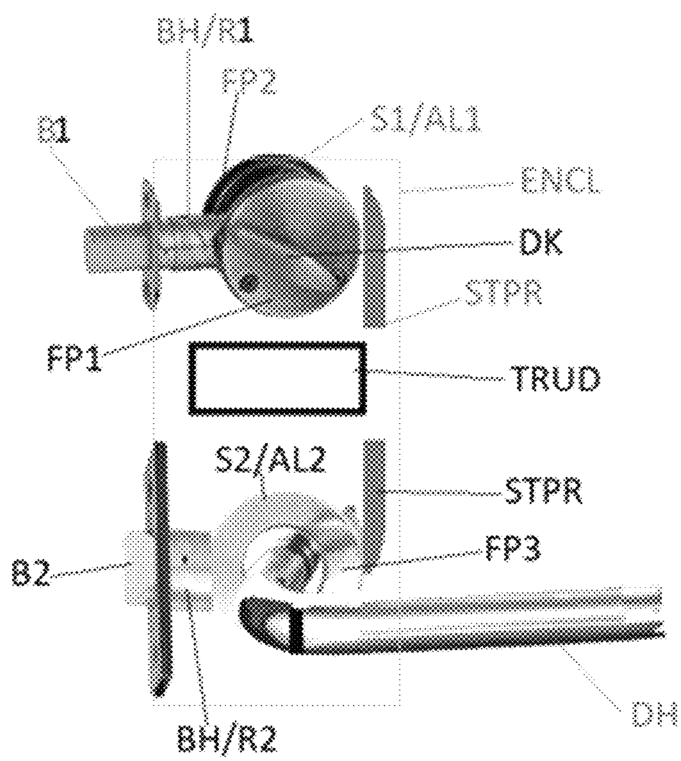
FIG. 50 is a representative illustration of an enclosure having a spinner attached to a knob and bolt, with another spinner attached to a handle and bolt.

In FIG. 50, enclosure ENCL comprises a spinner S1 attached/linked to knob DK1 and bolt B1 and spinner S2 attached/linked to handle DL and bolt B2. Spinners S1 and S2 may lock/unlock DK1 and DH1 at the same time; alternatively, or in addition, they may comprise a common power source and may lock independently based on the available power budgets.

The profile SR1 may move via rotational movement (e.g. around and/or by SRF1) and/or translational movement (e.g. through and/or by SRF1). Further, SRF1 may comprise a rail and/or lock profile to guide, hold and/or lock SR1 and accommodate such movements. Further, SRF1 may comprise damping components and/or capabilities. In some examples, SRF1 resembles, at least partially, a spinner.

The movement of SR1 out of S1 to STPR during disengagement may ensure further safety against attempts to manipulate the spinner engagement shell and bolts when disengaged.

As exemplified, the actuation components may comprise coils/electromagnets and/or piezo components. In some examples, the magnetic poles and/or fields are variable and controlled through a variable applied voltage to the coils/electromagnets and/or piezo components. As such, they may be actuated to the corresponding direction associated with engagement (e.g. associated with a first polarity, voltage, field and/or current direction) or disengagement (e.g. associated with a second polarity, voltage, field and/or current direction opposite or high entropic with the first).

Figure 53A:
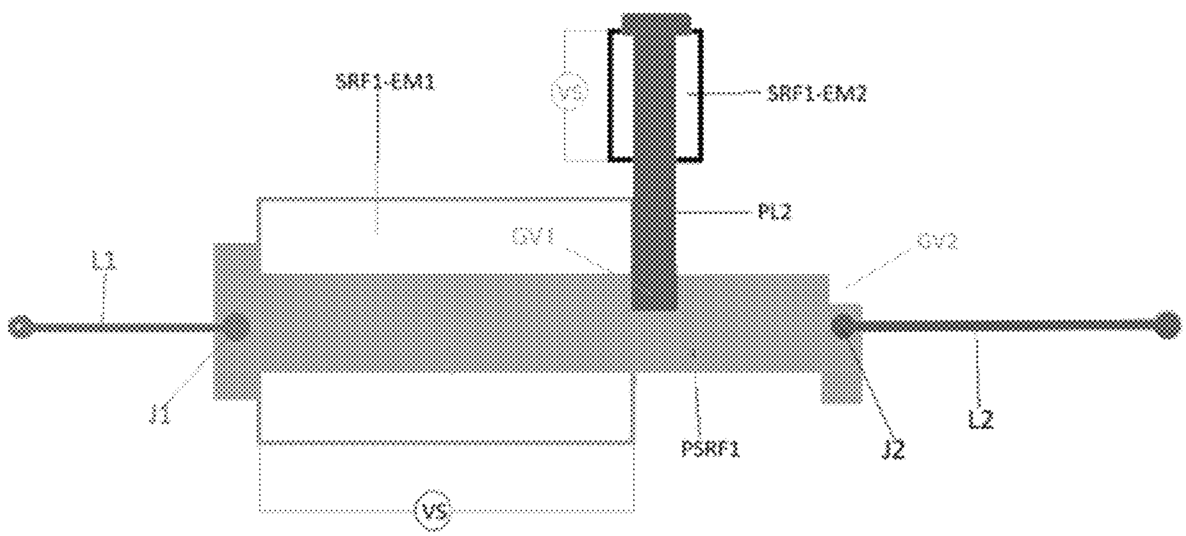
FIG. 53A is a view of a preferred pin-lockable actuator.
Figure 53B:
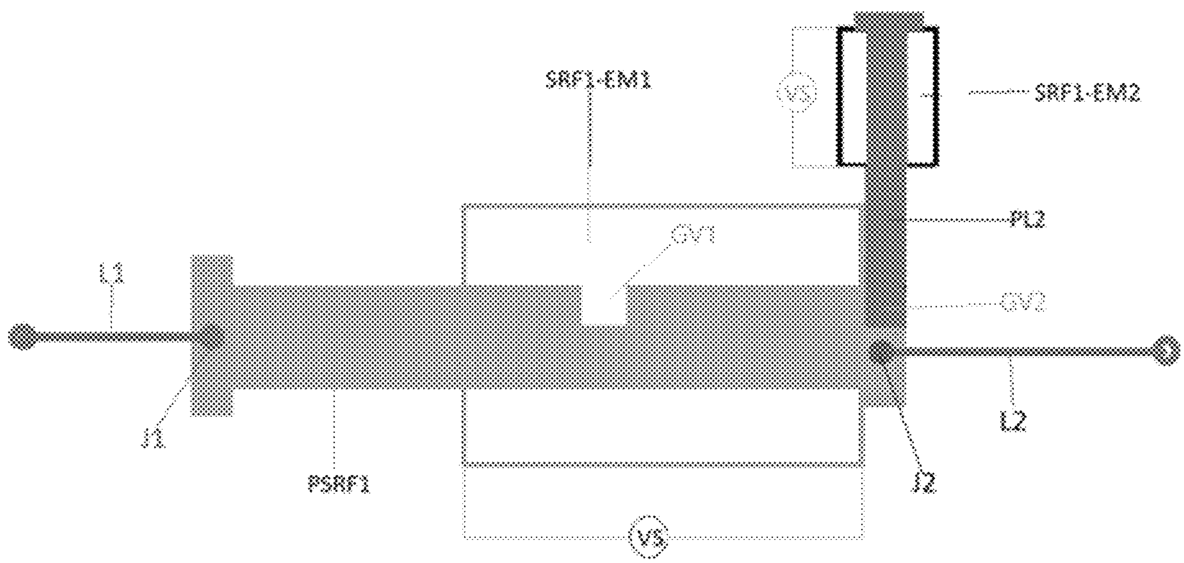
FIG. 53B is a view of an alternate pin-lockable actuator.

The actuators (profiles) (e.g. such as SRF1 and/or SR1) may be (pin) lockable at a first and/or at a second position (e.g. corresponding to groove GV1 and GV2 in FIG. 53A-B). Further, they may move bidirectionally (e.g. such as bidirectional movement of PSRF1 in FIG. 53A-B) between the first position and the second position and/or vice-versa. The changing in direction may be based on applying an opposite and/or high entropic polarity voltage to the electromagnets/coils and/or piezo components.

In some examples, such as depicted in FIG. 53A-B, while moving to a corresponding engaged/disengaged position the actuators (profiles) are (pin) locked in place (e.g. through a pin locking actuator (profile) such as electromagnet/plunger SRF1-EM2/PL2). FIG. 53A depicts the pin lock (plunger) PL2 is in a first position (e.g. disengaged or engaged) corresponding to a groove GV1 in (plunger) PSRF1 while the FIG. 53B depicts the pin lock PL2 in the second position (e.g. engaged or disengaged) corresponding to a groove GV2 in PSRF1; to move between the first and the second position a voltage (e.g. through a source VS) is applied to the locking electromagnet/coil SRF1-EM2 which retracts locking pin PL2 (e.g. e.g. by upward movement) from groove GV1 allowing the pin PSRF1 to move to the second position (e.g. by a/an (slightly delayed) applied voltage to electromagnet/coil SRF1-EM1); while reaching the second position (e.g. grove GV2) PL2 is actuated and/or falls in GV2 and thus, blocking/locking PSRF1 to the second position. Similarly with the movement between the first position (e.g. corresponding to PL2 in GV1) and the second position (e.g. corresponding to PL2 in GV2) and by applying an opposite polarity voltage, PSRF1 may move and/or be locked between the second position and the first position.

In some examples, the applied voltage between the time when is applied to SRF1-EM2 and the time when is applied to SRF-1-EM1 is delayed by a delay timer (circuit). Further, the voltage may be provided by a semantic unit.

The actuator pin PSRF1 may actuate and/or be linked to other SRF1 and/or SR1 components (e.g. through the joint J1/J2, link profiles L1/L2 etc.). Further, J1/J2/L1/L2 may help translate the linear movement of PSRF1 to other types of movements (e.g. circular, rotational etc.).

The plungers and/or further links L1/L2 may actuate cams, wheels and/or other mechanical components designed to translate the movement from SRF1 to SR1.

Profile TP1 may comprise at least one groove, cavity, hole, hook, tooth and/or edge designed to catch SR1. In an example, during engagement, SR1 protrudes/hooks through/between grooves/cavities/holes/hooks/teeth fabricated/attached within TP1 and catches and/or contacts an edge (of a/the groove/cavity/hole/tooth/hook) (when the door handle and/or knob and hence the axial profile is rotated). At disengagement, SR1 retracts/unhooks from within the groove/cavity/hole/hook/teeth and/or disconnect from the edges and thus, allowing the axial profile to move freely.

SR1 moves in particular orientations, trajectories and/or shapes. While in the depicted examples, SR1 may comprise a rotational, linear and/or translational movement, in other examples it may comprise any combination of motions and/or trajectories. In some examples, SR1 comprises a hook/latch and thus, during engagement and/or disengagement is actuated to move on multiple axis in order for the SR1's hook/latch to catch TP1. Alternatively, or in addition, TP1 comprises a hook/latch and/or SR1 catches/secures the hook/latch. In further examples, the hook/latch is an ELOCK type which allow locking/unlocking and/or engagement/disengagement based on access control.

Figure 49A:
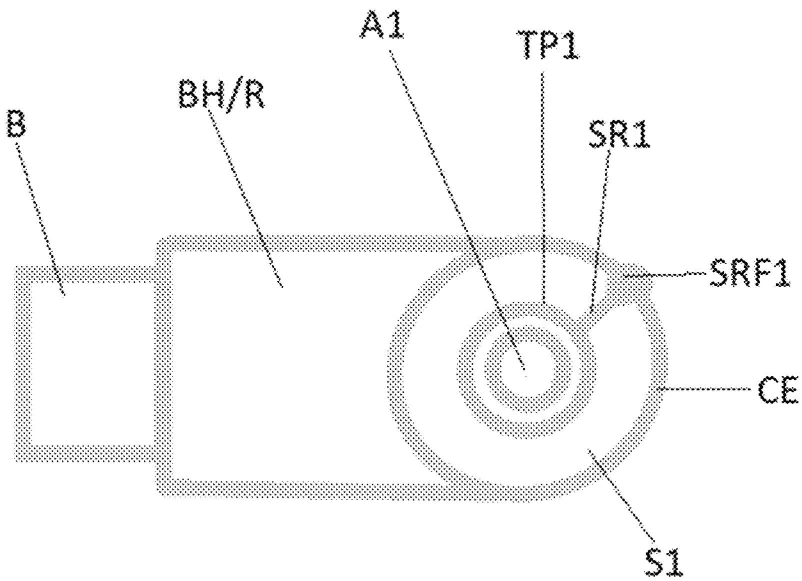
FIG. 49A is a preferred example of a door cylinder having a spinner/lock attached or linked to a bolt.
Figure 49B:
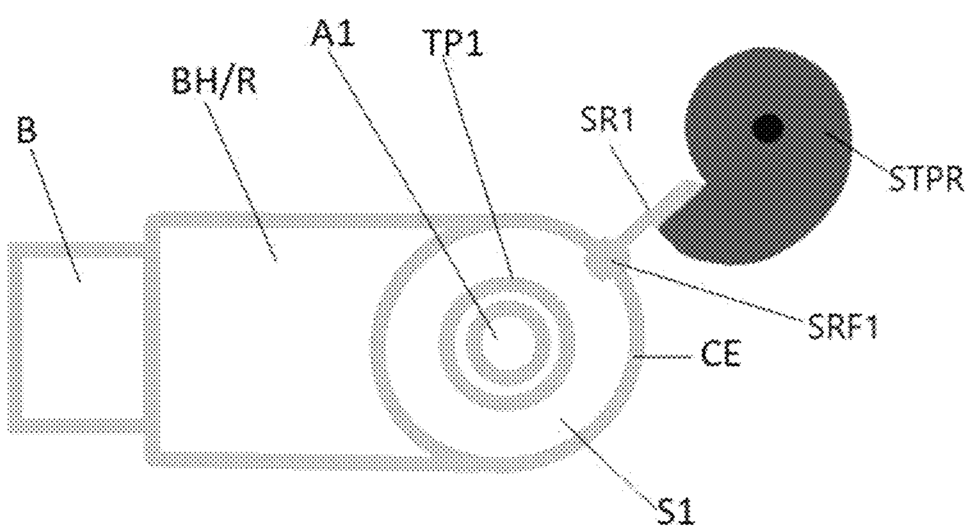
FIG. 49B is an alternate example of a door cylinder having a spinner/lock attached or linked to a bolt.
Figure 49C:
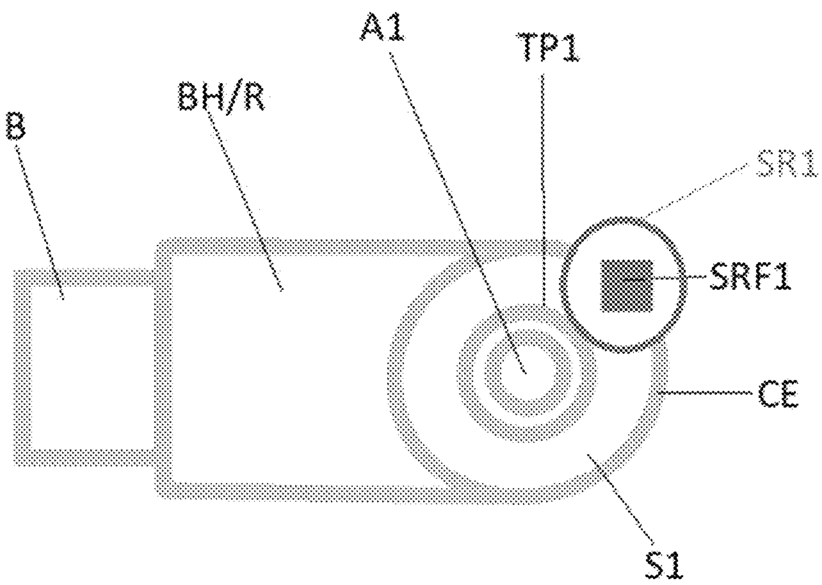
FIG. 49C is another alternate example of a door cylinder having a spinner/lock attached or linked to a bolt.

As mentioned, in some examples, SR1 comprises a cam toothed profile which may rotate around its axis (e.g. such as in FIG. 49C). As such the cam toothed profile may be locked/unlocked through similar modalities presented for SR1. SR1 (axle) and/or SRF1 may be attached to the spinner engagement shell CE.

Figure 49D:
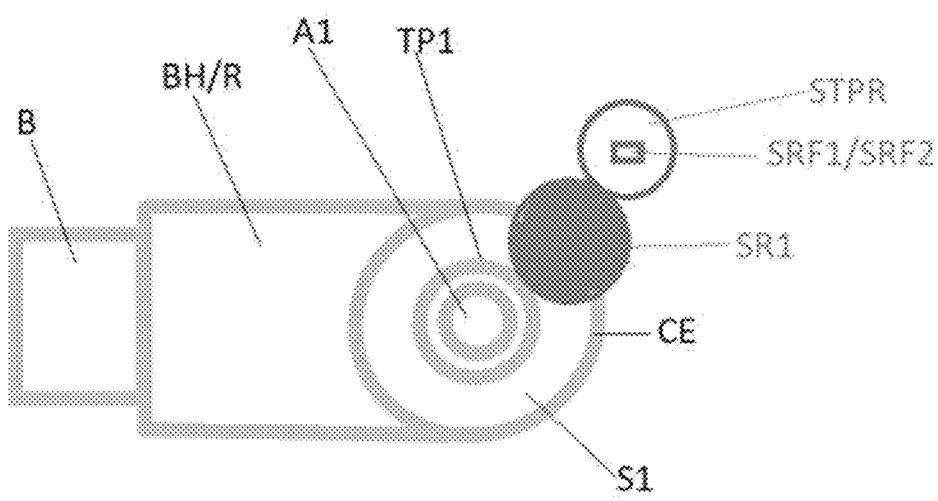
FIG. 49D is another alternate example of a door cylinder having a spinner/lock attached or linked to a bolt.

In some examples, SR1 comprises an axle (profile) which is blocked by a plunger of an electromagnet such as SRF1-EM2; in other examples, the SR1 profile is blocked by the plunger (e.g. through insertion into a groove, friction etc.). In even further examples, SR1 is blocked by a (toothed) (wheel/cam) stopper STPR further, being locked/unlocked through a latch such as SRF1/SRF2 such as depicted in FIG. 49D.

When blocked, SR1 determines coupled movement between the spinner engagement shell CE and the axial profile (TP1) and thus, lock engagement; when unblocked, SR1 determines uncoupled movement between the spinner engagement shell CE and the axial profile (TP1) and thus, the lock is disengaged.

SR1 and/or SRF1 may be resting and/or locked in either engaged and/or disengaged mode and may switch between modes when commanded.

In alternate embodiments, the axial profile TP1 comprises at least one actuator/profile SRF1/SR1 for engaging with CE. Alternatively, or in addition, TP1 may comprise actuated sections which extend (e.g. by a plunger at a first position and/or spring) and engage with CE and/or retract (e.g. by a plunger at a second position and/or spring) and disengage with CE.

Electromagnets may have attached and/or comprise springs for further plunger manipulation. In some examples, springs are encasing and/or are deployed on plungers ensuring additional force (when tensioned) for retraction and/or extension of plungers.

A door lock may comprise at least one processing device and/or components such a micro controller/processor, a memory and/or other IO components. Alternatively, or in addition, it may comprise semantic units.

A door lock may comprise at least one camera (e.g. such as DLC in FIG. 54A). Alternatively, or in addition, it may comprise additional sensing/sensors and/or semantic units.

In some examples, the system detects through a measured current at and/or around electromagnets EM1/EM2 that plungers didn't deploy and/or retract as commanded. In an example, the microprocessor commands SRF1-EM2 to retract and thus, unblocking the plunger PSRF1 of EM1; however, the system may determine (e.g. based on currents and/or fields measured at and/or around SRF1-EM2 coil) that SRF1-EM2 didn't retract as commanded and thus, it doesn't command EM1 and/or further PSRF1. Similarly, the system may detect that EM 1's plunger didn't move as commanded. As such, the system may issue alerts and/or request/challenge to be provided with additional power.

Figure 49E:
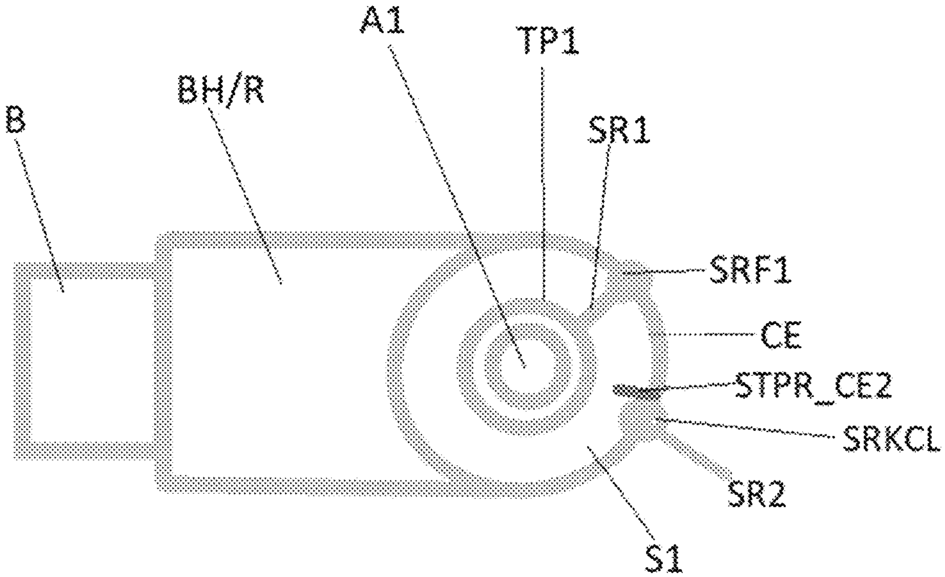
FIG. 49E is another alternate example of a door cylinder having a spinner/lock attached or linked to a bolt.

In some embodiments, the door lock may encompass a physical keyed cylinder and/or knob which manipulates at least one additional engagement profile similar with SR1 (e.g. such as SR2 in FIG. 49E which is linked and/or can be moved by the keyed cylinder via SRKCL). As such, the keyed cylinder and/or knob may be used as a safety mechanism to engage the lock (e.g. via SRKCL and further SR2) when there is no sufficient power available and/or actuator/profile SRF1/SR1 malfunctions. Further, such safety may be used in emergency and/or hazardous circumstances.

In further examples, engagement profiles (e.g. SRKCL/SR2) and/or spinner components may be linked and/or manipulated via crash bars. Alternatively, or in addition, crash bars may rotate the spinner (components) and/or manipulate the bolt to unlock and/or open the door.

A door lock may comprise augmentation devices such as a (LED/OLED/LCD/TFT) (touch) screen, a speaker/microphone and/or other similar devices.

A door lock may comprise an energy storage comprising batteries, supercapacitors and/or a variety of other storage components. Further, it may store energy received through the antenna and/or harvesting (resonant) inductive/electromagnetic (frontend) circuit.

A door lock may comprise a charging (input/IN and/or output/OUT) socket/outlet (e.g. such as DLS in FIG. 54A) coupled to the energy storage.

The required and/or additional energy may be provided to a door lock through a post which couples to the door lock. While the energy may be provided by (a) wireless (mesh) (e.g. such as in FIG. 48 wherein the posts may provide/beam energy to the lock and/or other posts to power the lock), alternatively, or in addition the post may physically couple to the lock and/or door (e.g. such as SP1 in FIG. 54A-B). While in FIG. 54A SP1 may be static and couple to the door lock socket DLS (through depicted cable/plug C1 thought in other embodiments the cable C1 may be missing), alternatively, or in addition, SP1 may be attached and/or attach (e.g. by a user, by itself, through a plug, hook/claws/cams, latch, C1, vacuum (or suction) pods/cups, maglocks etc.) and/or move with the door DL such as in FIG. 54B—as such, besides charging and situational awareness SP1 may provide additional blocking capabilities to the door DL and further enforce access. While in FIG. 54B SP1 has been presented as having wheels to move with the door DL, in other examples, the wheels may be missing or retracted and thus SP1 moves with the door D by simply being attached to it (e.g. through actuated suction pods/cups—not depicted). Alternatively, or in addition, stabilization panels and/or (support) pods are deployed (on the ground) to support, fasten and/or lock at least one post on the ground and thus, impede its movement and further the movement of the attached door.

A (door) attachable post (or cart) is a robotic post (or cart) comprising attachable modules and/or means to physically attach and/or detach with (or to/from) a door and/or lock.

While in the presented embodiment an attachable post is attachable to a door and/or lock in other embodiments an attachable post may be attached to other assets and/or objects.

An attachable post may comprise the (optimal/likeable/factorized) attachment capabilities and/or means (e.g. pods/cups/maglock/sliders/claws etc.) on comprised modules and/or (semantic) groups thereof. Such attachable modules and/or groups may enable the attachment/detachment of the post.

An attachable post may comprise multiple attachable modules and/or facets to secure the post from multiple angles and to multiple supports. In an example, a post is secured to a door through a first facet (of a first module) and is further secured to the door jamb through a second facet (of a/the first/second module) configured at 90 degrees and/or perpendicular to the first facet. Alternatively, or in addition, a post is secured on a door sill (e.g. by retracting its wheels and/or deploying (suction) pods/cups etc.).

In an example, facets are the sides of clipping module 6 (see FIG. 4); as such, the clip 25 and the attachment point 26 are on separate facets amongst the six lateral facets of module 6. Alternatively, or in addition, the facets are at the top and/or bottom of a module (e.g. such as for attaching to a ceiling, floor, support, chassis etc.).

At times, an attachable robotic post may detach, at least partially, from comprised (door) attached modules and/or groups. Further, once detached, the robotic post may relocate (via the mobility base, copter module etc.) and/or position for achieving particular goals and/or performing activities. In other examples, only at least a first (subset/group of) module (s) is/are attached to the door while a second (subset/group of) module (s) is/are attached to the door jamb (and/or jamb-less structure); thus, when the door is locked, the first module/subset/group locks and/or latches with the second module/subset/group. It is to be understood that the latching between/of the first module/subset/group and/or (of) the second module/subset/group may be achieved by locking/latching on a central post (e.g. such as Post 9 on FIG. 7 attached to at least one of the first and second module/subset/group); alternatively, or in addition it may be achieved by module interlocking.

Alternatively, or in addition, in case of double doors, a (post) member/portion/component of a (composable) post may be attached to the first door while another to the second door. Similarly, for doors encased/joined/adjacent, at least partially, on a jamb-less structures, a (post) member/portion/component of a (composable) post may be attached to the door while another to the jamb-less structure. Similarly, for doors encased/joined/adjacent, at least partially, on a door jamb, a (post) member/portion/component of a (composable) post may be attached to the door while another to the door jamb.

In further examples, a/an (attachable) (composable) robotic post may split and/or reconfigure (as per inference) in two or more robotic posts comprising separate (groups of) modules and/or robotic posts whether attached/attachable or not.

In some examples, actuated vacuum/suction pods (or cups) may be utilized. As such, the actuators may be used to position the vacuum/suction pods/cups and/or further regulate the pressure and/or vacuum within the pods/cups. It is to be understood that pods and cups may be used interchangeably.

In further examples, a door attachable post attaches to a door (lock) by at least one electromagnetic lock or maglock (e.g. having an electromagnet on the post and an armature plate on the door (lock) and/or vice-versa). The maglock components may be part of a (distinct) post module.

In other examples, a door attachable post attaches to a door through a slider (e.g. such as a (lockable) bolt an/or plunger comprised by a post module) and which protrudes through a catcher (e.g. attached and/or comprised by a door) and locks; alternatively, the catcher is attached to the post and the slider is attached to the door. In some examples, the bolt and/or plunger and/or catcher have a special hooking/catching profile to catch edges while locked. In other examples, the bolt and/or plunger slide linearly into the catcher and lock.

In further examples, the lock security module and/or the door attachable post attaches to the door lock and/or to the door by a set of actuated hooks/claws/cams which are actuated (e.g. by a lockable plunger) in/out of a catcher (within the door (lock) (enclosure)). It is to be understood that the catcher may secure only the particular shaped tips and/or teeth of hooks/claws/cams.

In the presented examples, the catcher (s) and/or components of the maglock may be attached and/or fabricated in a lock's faceplate (and/or enclosure).

A post may move, position and/or adjust the elevation of its modules (e.g. plugs, door handle holder/locks etc.) before attaching to a door and/or door lock.

Similarly, a post may adjust its (modules) positioning for optimal (wireless) energy transfer and/or for locking/unlocking purposes.

The wireless energy transfer may comprise (resonant) electromagnetic induction in near field and/or far field. As such, (arrays of) (reasonably/likeably) (resonant) coil and/or element antennas and/or associated circuits (e.g. for (resonant) electromagnetic/magnetic coupling and/or voltage/current rectification and/or voltage/current stabilization) may be employed.

In some examples, SP1 (superior part) and/or its modules (e.g. (wheeled/non-wheeled) base and/or wheels, lifting/lowering module etc.) and/or arms are positioned (e.g. extended/lowered) such as it blocks the movement of door handle DH in particular positions, orientations and/or at particular semantic times. In an example, in FIG. 54B, the door handle DH downward movement may be blocked by the superior part of SP1. In further examples, a post may use an attached arm to control the movement of the door handle as per access control rules.

In further examples, SP1 comprises a dedicated lock handle attaching, encompassing, manipulating and/or blocking module which when attached and/or positioned over/against a lock handle and/or knob controls their movement (in particular orientations). In an example, in FIG. 54C, the (post) lock security module (PDSM)—attached to the post SP1 and/or door/lock—secures the lock handle (DL) of DL1; while in the depicted example PDSM secures (e.g. by securely encompassing it, blocking it etc.) only a portion of the lock (e.g. such as a handle), in other examples it may secure the entire lock (e.g. by securely encompassing it and/or blocking the handle). As such, the post may be instructed to manipulate the handle/knob and/or allow a user to manipulate the handle/knob based on access control. In further examples, the post and/or lock security module is positioned to impede the access to and/or the movement of the handle/knob based on access control.

Figure 54C:
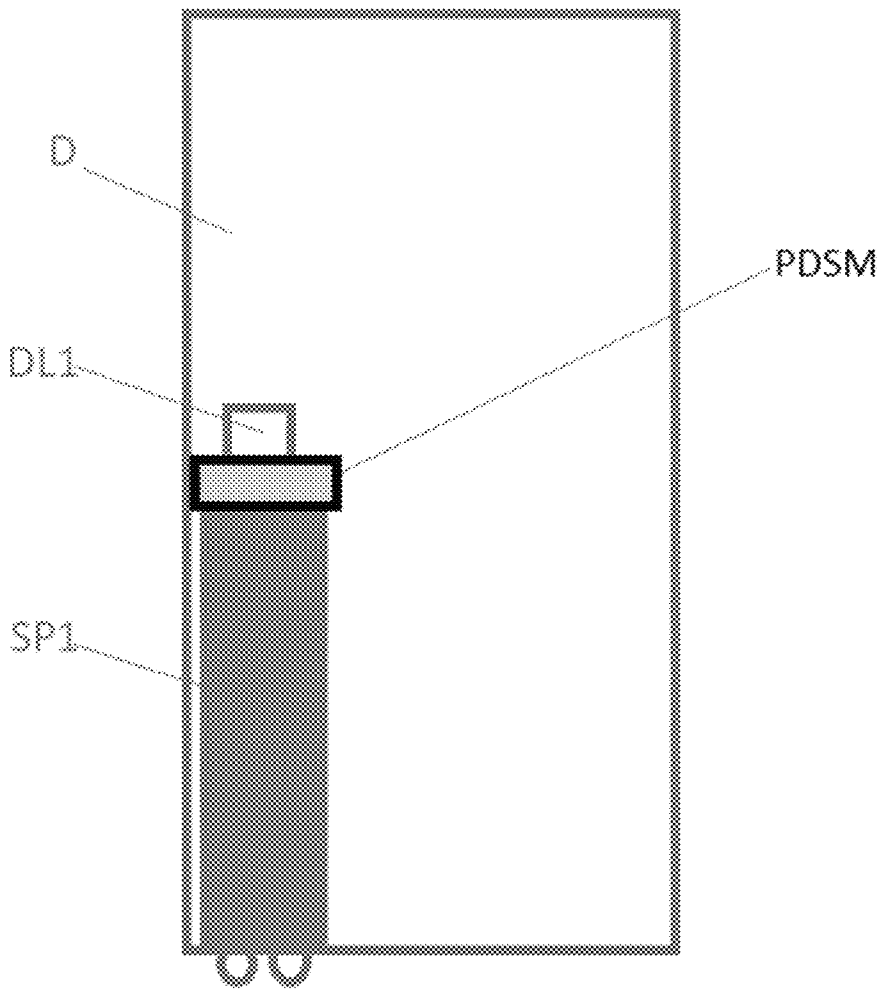
FIG. 54C is a front elevational view of a preferred door being secured by a lock security module attached to a post.

In some embodiments, the (post) lock security module is positioned and impedes the access to the door handle/knob by securely encompassing it (e.g. such as PDSM in FIG. 54C). Alternatively, or in addition, the lock security module links, attaches and/or supports the handle and/or knob (and/or allow/deny particular movements and/or orientations) with or without encompassing it. In further examples, the post may use counter measures and/or perform augmentation based on circumstances.

An/A (door) attachable post comprising a lock security module may attach the lock security module to a door (lock) at a first time and detach from the door (lock) and/or the lock security module at a second time to perform activities (e.g. such as charging). While in some examples the door lock may be robotic, in other examples the door lock is of other types and/or capabilities including regular keyed/non-keyed (cylinder based), knobbed/not-knobbed, lever (less) etc.; in addition, a door lock may be or not be semantic flux capable.

A lock security module (e.g. such PDSM) may couple with a keyed (door) lock and/or cylinder. As such, the PDSM may comprise a holder, gripper, arm and/or latch for holding, manipulating and/or securing the physical key which may be (or not) inserted into the (door) cylinder (at semantic times). In some examples, the key is always inserted into the (door) cylinder and manipulated by PDSM to lock/unlock based on access control; alternatively, or in addition, the key is manipulated IN/OUT of the (door) cylinder.

In other embodiments, the (door) lock has a lever (instead of a knob) which when manipulated up/down may lock/unlock (or vice-versa). As such, the holder, gripper, arm and/or latch of PDSM may further manipulate such lever based on access control.

In examples, SP1 may leave PDSM attached to the door (lock) and physically detach from it in order to perform (other) (scheduled/non-scheduled) activities. In some examples, SP1 determines that the (power) budgets are low (e.g. of (stored) energy/battery) and thus, it physically and/or communicatively/wirelessly detach from the door (lock) and/or PDSM (attached to the door (lock)) and moves at a charging endpoint and/or to receive power from another post (e.g. SP2). Further, once the power budgets are (likeably) restored SP1 moves back and physically and/or communicatively/wirelessly attaches to PDSM and/or door (lock). It is to be understood that while SP1 and/or the door (lock) and/or PDSM may be physically detached they may still be coupled (e.g. for communication, for energy transfer) through a connecting cable and/or through wireless.

In some examples, a PDSM is a separate module and/or a standalone device; alternatively, or in addition, it may connect to a post for various purposes such as explained in this application.

A PDSM may comprise sensors and/or actuators in order to monitor a lock, perform activities and/or apply counter-measures. In some examples, a PDSM comprises a pressure sensor which monitors the pressure/force applied to a door handle/knob. As such, based on the configuration, once pressure is detected and/or changing in a (likeable/non-likeable) direction the PDSM/post/system may augment the user/supervisor/operator and/or apply measures/counter-measures.

In some examples, a PDSM is attached to an interior side of a door to control a (regular) door lever; as pressure is sensed (e.g. as the lever is manipulated and/or pressured from the outside door lever/knob) the PDSM/post/system may augment a user/supervisor/operator and/or apply (likeable) measures/counter-measures.

It is to be understood that in examples, PDSM may remain attached to the door (lock). As such, PDSM may comprise attachment means and/or is coupled to modules which may comprise attachment means and provide support. Further, (such) modules and/or PDSM may comprise electrical power storage/supply and/or are/is coupled with electrical power storage/supply modules to ensure operation.

Figure 54D:
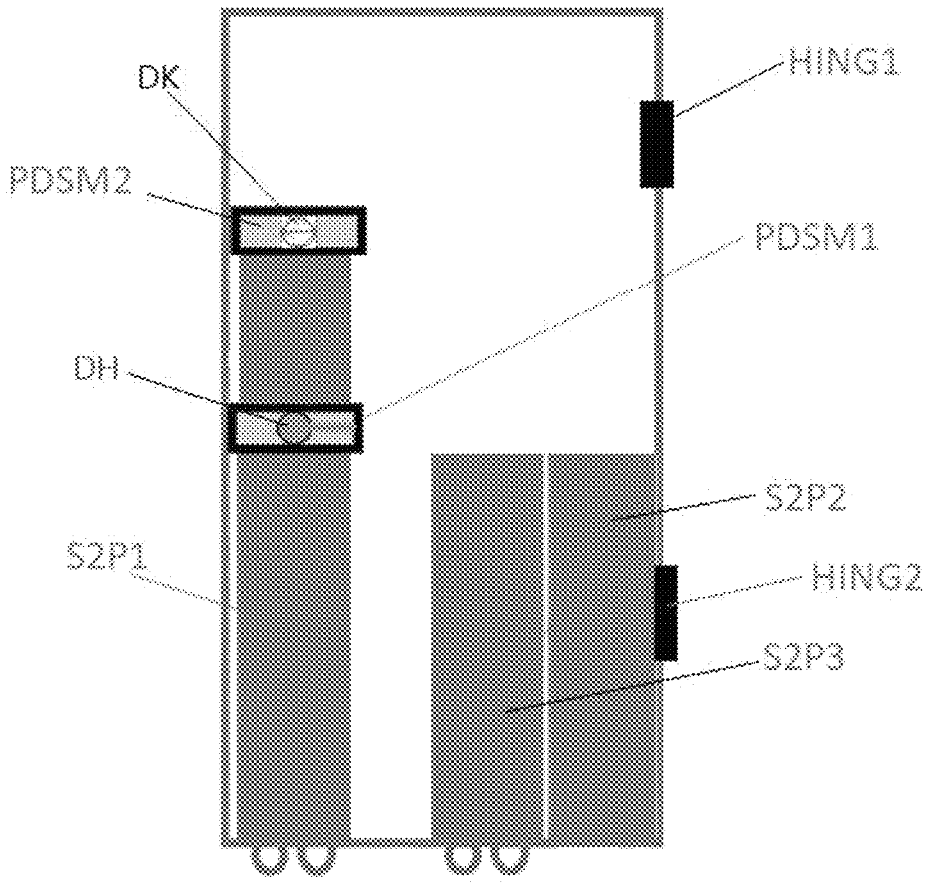
FIG. 54D is a front elevational view of an alternate preferred door and lock security module with a plurality of posts.
Figure 55A:
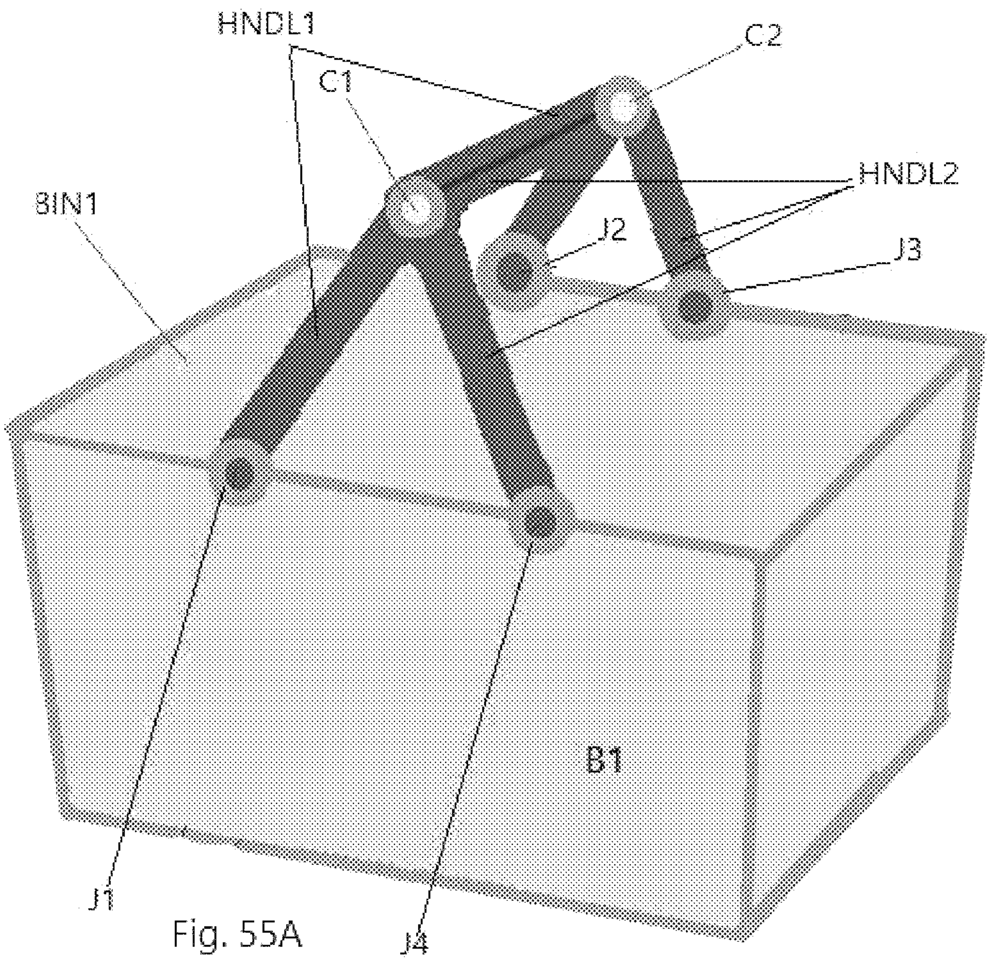
FIG. 55A is a perspective view of a smart basket.
Figure 55B:
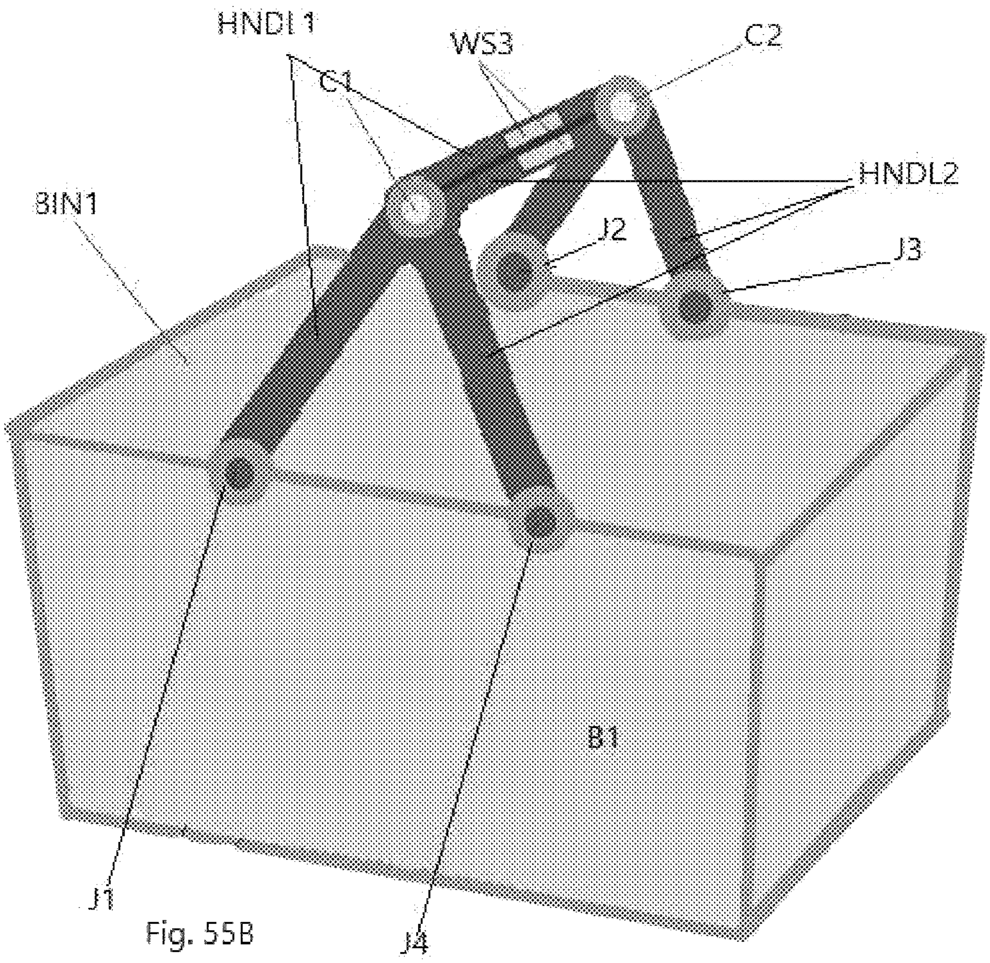
FIG. 55B is a perspective view of a smart basket.
Figure 55C:
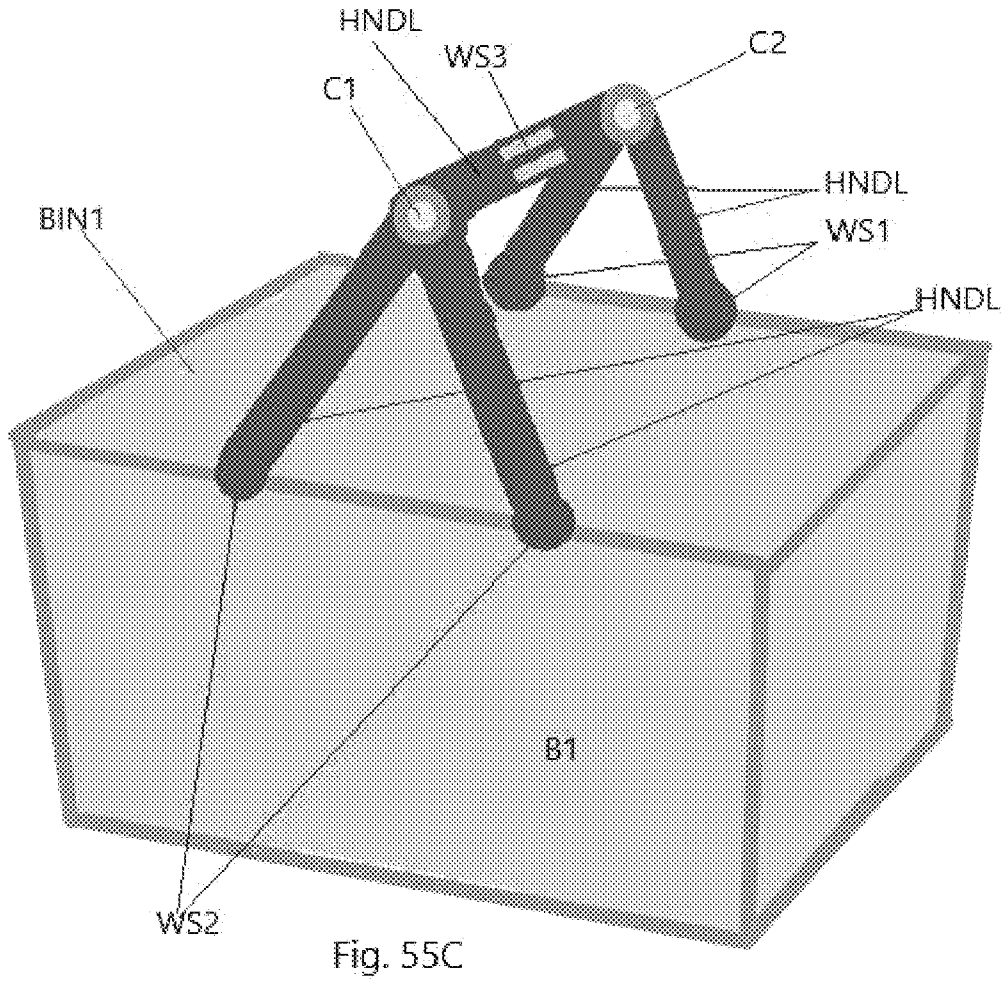
FIG. 55C is a perspective view of a smart basket.
Figure 55D:
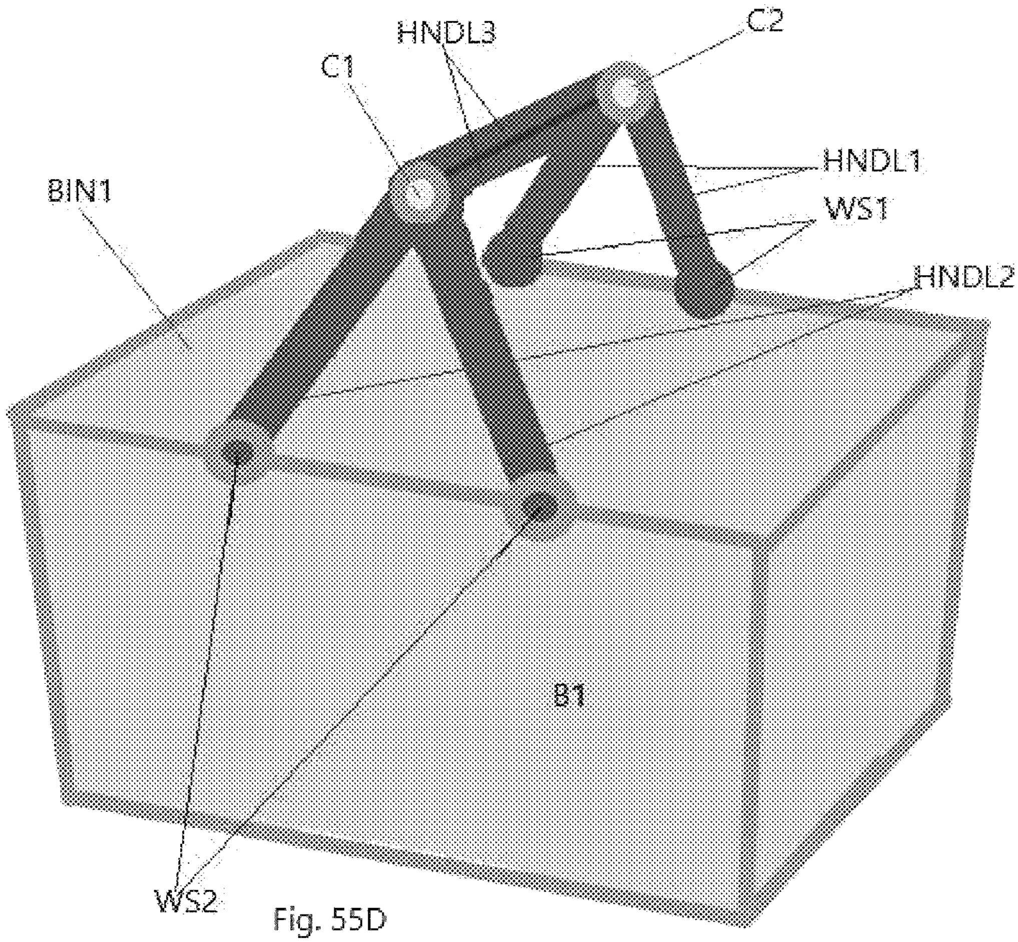
FIG. 55D is a perspective view of a smart basket.

In further examples, such as depicted in FIG. 54D, a PDSM (such as either or both of PDSM1-PDSM2) component/device/group comprises at least a spinner such as S1 attached to a lever/knob such as DHP/DKP. In spite and/or instead of being attached to a bolt and/or bolt rail (e.g. such as depicted in FIG. 49A-E), the spinner transfers/transmits its rotational movement, rotates and/or manipulates (by comprising and/or being attached, linked to, connected) an enclosure/claw/holder/pouch/container configured to encompass, tighten, embrace, hold and/or manipulate a door's handle/knob and/or a key in a door's key cylinder. As such, when a PDSM lever/knob DHP/DKP is manipulated, the movement may be transmitted (e.g. when S1 engaged) or not transmitted (e.g. when S1 disengaged) to the attached/linked/connected door's handle/knob and/or the key. As such the PDSM acts as diffusion agent enforcing access control and/or diffusion between the divided endpoints.

A PDSM may be a standalone/separate device and/or (semantic) group thereof attached to at least one (door) lock and/or cylinder for implementing access control.

A PDSM may comprise a tablet, projector and/or display surface and/or other (touch) displays. Alternatively, or in addition, a PDSM may comprise a keypad. Alternatively, or in addition, a PDSM may comprise microphones, micropads and/or other (pressure/piezo) sensors. Further, the system may display on the display surface challenges, questions and/or hints to verify the identity of a person, device and/or artifact. Responses to challenges may pe provided via the keypad, touch, voice etc.

In some examples, the (door) locks/cylinders/PDSM may be on the same door or on separate doors; further, multiple PDSMs may form a semantic group.

For the purpose of this application a PDSM may be considered a (robotic) device on its own.

In some examples, a PDSM may be attached to a door and/or door lock via fasteners such as screws, bolts, nuts etc. Alternatively, or in addition, it may be attached by any other coupling/attachment components and/or techniques such as explained throughout the application (e.g. pods, maglocks, plungers etc.).

A post may secure and/or be coupled/linked to multiple (keyed, lever, knob etc.) (door) locks; as such, the post may comprise multiple security locks such PDSM1 and PSDM2 in FIG. 54D. Further, a door, barrier and/or entrance may be secured by multiple (attached) posts (e.g. such as post S2P1, S2P2 and S2P3 in FIG. 54D). In some examples, S2P2 and S2P3 couple and/or form a composite post.

A post (e.g. such as S2P2 in FIG. 54D) is attached to the door jamb, frame and/or support and/or further blocking, encapsulating and/or protecting the door hinges (e.g. such as HING2); further, a post may be attached to the door frame, door jamb and/or support on either side of a door; alternatively, or in addition, there is at least one post blocking a/each side of the door.

The (physical and/or communicative) coupling and/or attachment between a (door) (robotic) lock and a (door/lock attachable) post may follow similar techniques such as explained for post/cart to post/cart, post/cart to infrastructure, post/cart to secured asset, post/cart to device, ELOCKs and/or other (physical and/or communicative) connection techniques such as explained within this application.

Further, a robotic lock may be considered and/or substituted for a robotic post for all processing, communication, sensing, synchronization, coupling/decoupling, attachment/detachment with (another) robotic post and/or all other purposes such as explained in this application.

The attachment couplings and/or techniques between a door/lock and an attachable post/module may be employed for post-to-post/post-to-module/module-to-post/module-to-module coupling, decoupling, splitting and/or composition.

A (connecting) post may connect to a door lock (micro controller/processor) by techniques explained throughout the application. Once connected, the post may intermediate interactions between a user and the door lock. In some examples, the post authenticates and/or interacts with a user and instructs the door lock to engage/disengage based on access control rules.

A connecting post may provision access control credentials and/or rules to the door lock. The connecting post may position itself to connect wirelessly and/or wired to the door lock. In further examples, the post is uploaded with (such) data at an endpoint and transports the data to another endpoint which can ensure (secure/non-leaking) post's communication and/or connection with the door lock. In some examples, the determination whether the communication is secure or not is based on leakage type inferences at and/or between endpoints. In similar ways, the posts communication infrastructure such as depicted in FIG. 48 may transmit the data from the administrator/user to the door lock; as such, the posts may move to receive and/or to transmit/relay data in an optimal (secure) manner.

In further embodiments, at least one post (e.g. SP1) receives (access control) data from a user device (e.g. TRUA, TRUU) and further moves, connects and/or positions itself to transmit/transfer such data to the door lock DL1 and/or other posts in an optimal secure manner and/or within semantic times (as projected by the system and/or through the (post) communication infrastructure).

In further examples, SP1 comprises and/or applies counter measures for (projected) threats (e.g. spray a hostile intruder).

In some examples, a post may be manually coupled to the lock by a user and/or automatically couple to the lock (e.g. through a socket and/or cable, by arm manipulation etc.). In further examples, the socket may be securable and/or latchable (e.g. though actuators/profiles such as SR1/SRF1/EM1/EM2).

Figure 47I:
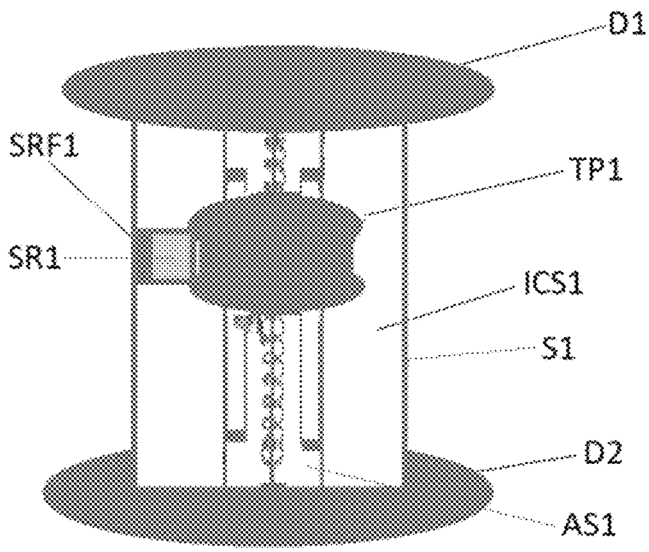
FIG. 47I is an illustration of an alternate preferred band holder for a post with lockable band.

In a further example of a band holder, such as depicted in FIG. 47I, the roll support 51 resembles the structure of AL1 depicted in FIG. 47G. In addition, the center axle profile ALR1 of FIG. 47G is replaced in FIG. 47I with AS1 which comprises the ensemble depicted in FIG. 47 D/E/F (with the exception of AL1 because the AL1 functionality is now implemented in the band holder (roll) support such as depicted in FIG. 47I).

As with IC1 and ICAL1, the interior cavity ICS1 may be filled with a (ER/MR) fluid with properties controlled through an applied voltage/current.

Latches/lock/actuators such as those embedded in SRF1-SRF2 may be controlled based on access control and/or semantic (flow) analysis. In some examples, a post allows/blocks the extension/retraction of the bands based on detected credentials and/or inferred semantic identities. In further examples, SP1 adjusts the speed/damping of band holder rotation based on a variety of factors and/or through communication with SP2.

While in the depicted examples the connected posts comprise at least one armed (such as comprising a robotic arm) post (SP1) in other examples the posts may not be armed and instead are connected by an armed post (e.g. unarmed posts SP2 and SP3 are connected by armed post SP1). In such examples, the armed post grasps the connecting bands and/or their terminators (e.g. of SP2) and drive, connect, hook and/or channel them to the hooks of SP3.

In some examples, HT1 and/or HSP2 may comprise electro/magnets and be joined through a magnetic field between electromagnets and further holding HT1 and HSP2 together. The system may control electromagnets through an electric voltage and/or current which may be semantically modulated.

The system may use (onboard/offboard) sensors (e.g. optical, camera, accelerometer etc.) to detect potential tilting of posts (axes) and/or further hooks, locks and/or channels (axes) and thus, adjusting the tilting of the hooking/locking terminators (axes) so that they can be connected and/or channeled in an optimal manner.

In some examples, for connection and/or disconnection, ARM1 slides and/or channels termination HT1 (IN/OUT) through (channel and/or holder) H2 in a downward and/or upward maneuver; in other examples, ARM1 hooks/unhooks termination HT1 to HSP2 in a direct connect motion wherein termination HT1 and HSP2 comprise a latching mechanism. In some examples, HT1 comprises a channel and H2 a groove; in other examples, HT1 comprises a groove and H2 a channel; further, (in other examples) HT1 and/or H2 comprise hooks and/or locks.

While in the previous examples, ARM1 of SP1 manipulates the band B1 of SP1 towards SP2, in other examples, ARM1 may manipulate band B2 of SP2 towards SP1 and lock it via HT2 to H1 on post SP1.

In examples where at least one of the posts comprise a swiveling trunk, the trunk and/or its parts (e.g. superior part) may be positioned towards the other post and/or its trunk (segments) for interconnection of the bands.

Figure 39C:
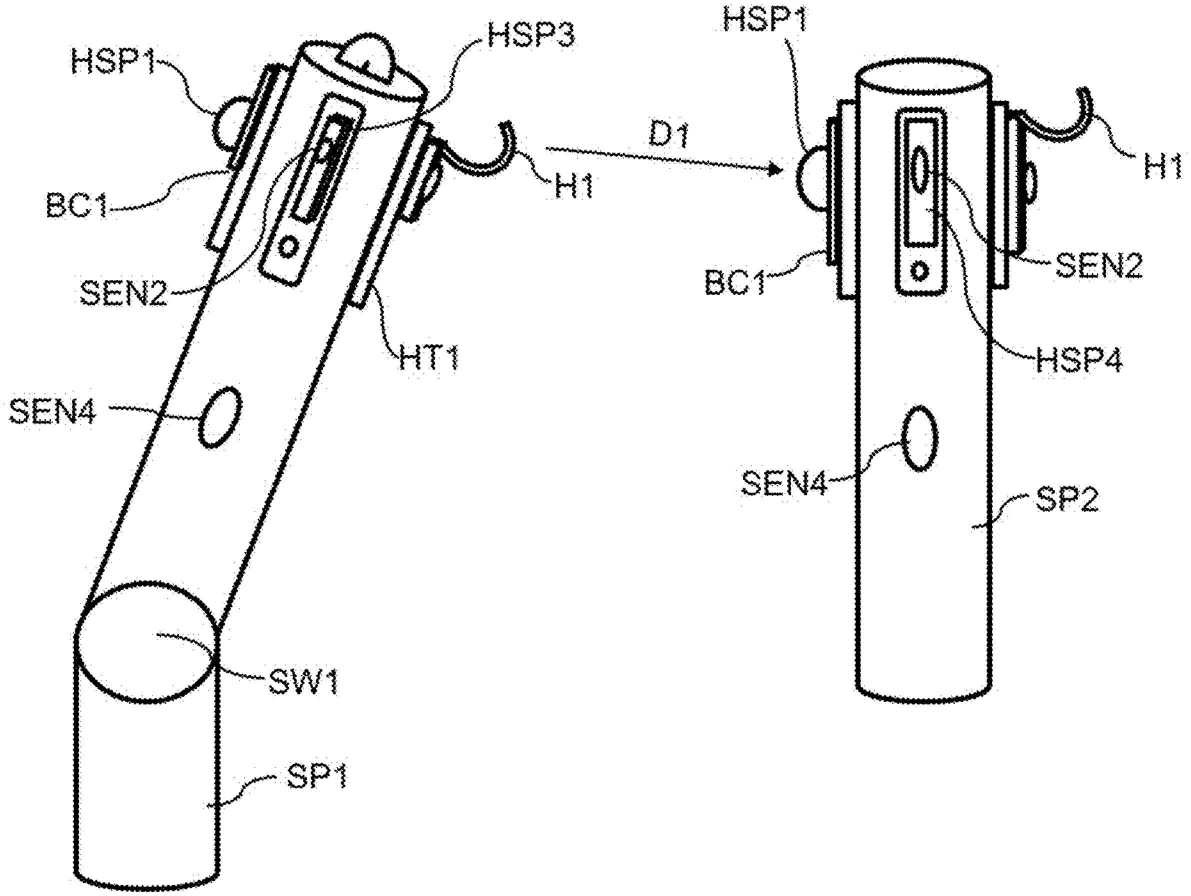
FIG. 39C is an exemplary view of a first semantic post and a second semantic post in the process of connecting a hook of a lockable band.
Figure 39D:
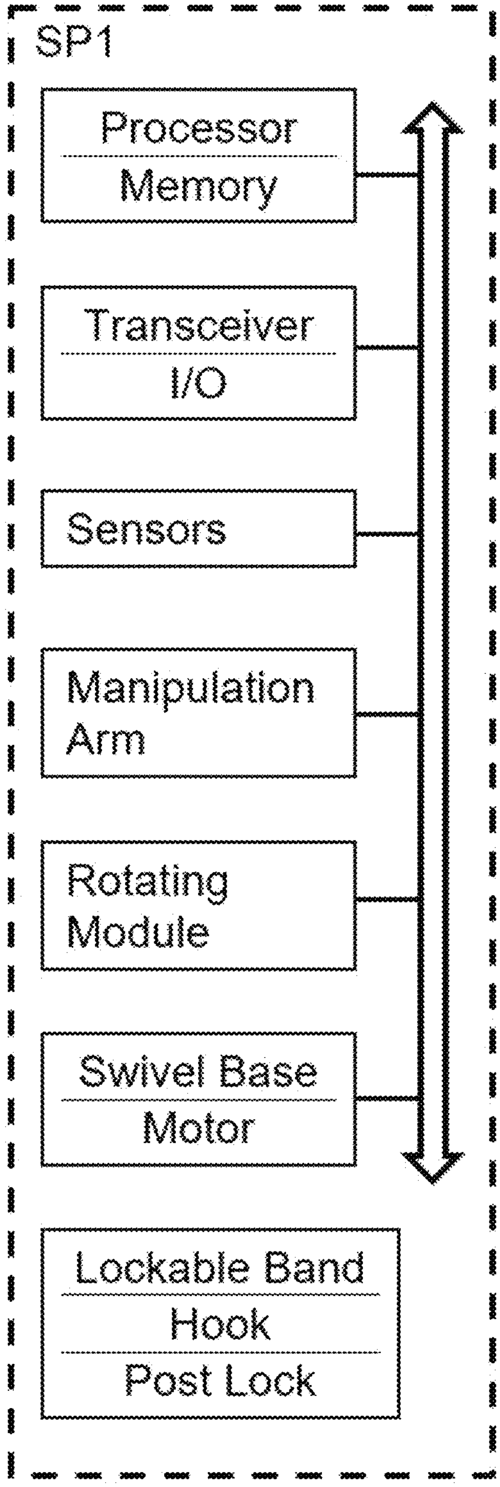
FIG. 39D is a block diagram of a preferred semantic post.

In an example, in FIG. 39C, post SP1 comprises (motorized) swivel SW1 which allows its superior part of the trunk to swivel towards post SP2. Further, the swiveling may stop once the hook H1 of SP1, moving on direction D1, is retained and/or secured on ring lock HSP1 of SP2; further, in order to couple and/or retain the hook-ring connection the post SP1 and/or SP2 may move using the moving base (e.g. the hook H1 of SP1 is inserted/protruding through ring HSP1 of SP2 using a lateral movement of post/trunk SP1 and/or SP2). Once the retaining occurs, the superior part of SP1 may swivel in the opposite direction (e.g. of D1) away from post SP2 and thus, extending the band which is terminated by HT1 of SP1 and comprising hook H1 of SP1; in some examples, the post SP1 swivels in the opposite direction of D1 until it reaches the default intrinsic position of having the inferior and superior segments aligned.

Similarly, the disconnection may occur when the swiveling of the superior part of SP1 towards SP2 allows unhooking and/or unlocking of the hook H1 of SP1 from ring lock HSP1 of SP2. Alternatively, or in addition, the ring lock HSP1 of SP2 may comprise a disengagement mechanism which allow it to free and/or unlock hook H1 of SP1.

It is to be understood that while in the presented embodiments (e.g. FIG. 39C) the band terminator (e.g. HT1 of SP1) comprises a hook (e.g. H1 of HT1 of SP1) and the post lock (e.g. HSP1 of SP2) comprises a ring, in other examples, the band terminator may comprise a ring and the post lock comprises a hook. As such, hooks H1 may be substituted for rings HSP1 and vice-versa with the interconnection mechanism being similar.

In further examples, post SP2 can swivel towards SP1 in order to connect its ring lock HSP1 to hook H1 of HT1 of SP1.

While in the presented embodiment in FIG. 39C only the post SP1 comprises a swivel (e.g. SW1) it is to be understood that in other similar embodiments the post SP2 may comprise a swivel in a similar configuration such as of SP1. Thus, during interconnection/disconnection, in addition of SP1 trunk tilting/swiveling towards SP2, SP2 trunk may also tilt/swivel towards SP1.

During interconnection/disconnection (goals) the posts may position and/or move towards and/or away from each other to realize projected goals.

Similar embodiments and/or configurations of posts such in FIG. 38A B C may be used to form robotic pallets. However, in such cases additional modules and/or components may be required at the posts; in some examples, the post moving base and/or trunk may comprise and/or have attached a component and/or module (e.g. supporting arms, tray and/or profile etc.) for supporting (a portion and/or a corner of) the cargo and/or product pallet in place. In such cases, the bands (e.g. B1, B2) are keeping and/or locking the cargo and/or pallet in place (e.g. on the supporting arms, trays and/or profiles); thus, once extended and connected the system may not allow the bands to extend or retract anymore by locking them within/at the lockable band module (e.g. BC1). Prior to unloading the cargo and/or product pallet the system may unlock the bands within the lockable band module.

In other embodiments, the lockable band module (BC1) may be substituted for other modules such as air blowers, recipients, storages, cans and/or other modules. Thus, the system may use the robotic arm to manipulate, load, unload, charge, recharge and/or feed such modules as per circumstances, goals and/or purpose.

In further examples, the lockable band module can be substituted for a tablet, computer and/or RF/ID/NFC reader. As mentioned, the system may position such devices for optimal reading, access, data entry, touching swiping and/or proximity by a user and/or (further) devices/posts. In some examples, the devices are installed on a moveable arm at the top of the post wherein the moveable arm positions the devices to desired positions and/or orientations; in further examples, such optimal/desired positioning is augmented by post positioning. Alternatively, and/or in addition, a module's post arm (e.g. ARM1) grasps, holds and/or moves the device from a holder on the post to the desired positions and/or orientations and/or further back. It is to be understood that the optimal positions and/or orientations are determined by transmitted, received and/or learned (user) preferences and/or profiles.

As explained previously, the system may detect gripping and/or holding based on gripper and/or holding capable artifacts (e.g. fingers, gripper etc.) and/or endpoints encompassing and/or obturating the object and/or associated endpoints.

Further examples of posts are presented in FIG. 41A-B. The posts are depicted for a use case which comprises handling and/or pulling the luggage LGG1. As it can be observed LGG1 is a wheeled luggage having at least one handle HNDL.

In FIG. 41A (showing a post as in FIG. 39A), post SP1 swivels towards HNDL (e.g. on direction D1) in order to secure the hook H1 to the handle HNDL The swiveling may be remotely controlled, or may be performed in a manner such as described above with respect to the lockable bands, in which on-board processors and sensors at the post determine the location, position, and orientation of a piece of luggage and its handle so that the post may swivel and attach its hook. While the picture comprises the superior part of post SP1 comprising swivel SW2, it is understood that SP1 may comprise additional swivels (e.g. such as SW1 in FIG. 41B) which allow the post to optimize the center of gravity, base of support and/or posture while manipulating and/or pulling the luggage.

Figure 43:
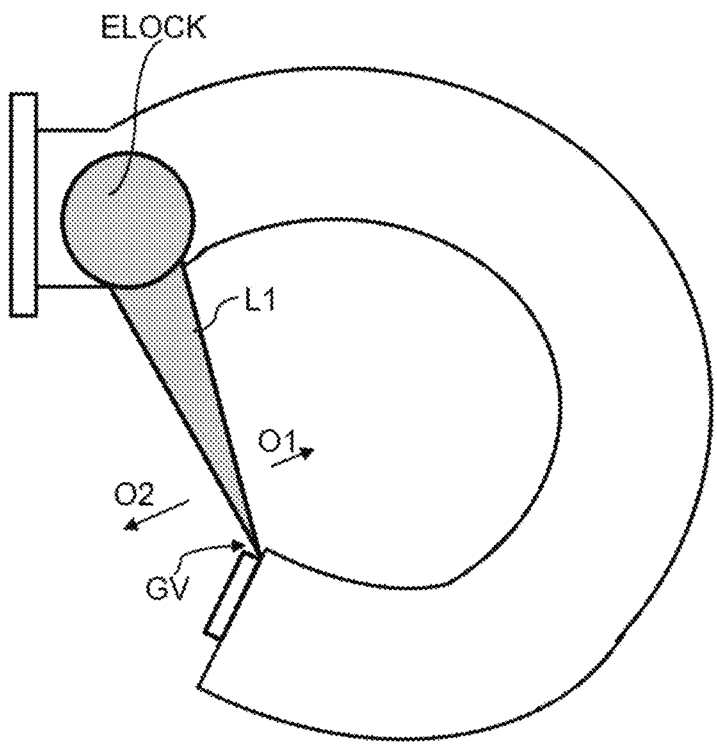
FIG. 43 is a close-up view of a preferred lockable hook.

An example of a hook is presented in FIG. 43, which in this case is a securable hook. As depicted, the hook may comprise a latch L1 which may be spring-loaded or otherwise biased to a secured or locked position such as the position as illustrated in FIG. 43, and which may be moved to an unlocked position in which it pivots generally about the location of the ELOCK and in the direction of the arrow indicated at O1, opposite the locking direction indicated as O2. The securable hook may be locked or released through a lock ELOCK. In some examples, the ELOCK comprises an electromagnet, electric, servo, worm drive, magnetic and/or other electromechanical components which may be communicatively coupled to a processor unit via electrical wires, optical link, embedded wireless module and/or any other communication link. For example, the hook/ELOCK may be a part of a post (module/panel) such as SPI as illustrated in the block diagram of FIG. 39D, except that the Hook as illustrated in FIG. 39D may also be connected to the processor such as via the communications bus or by other wired or wireless link.

ELOCK may comprise a bolt. Further, the force from a piezo component and/or lock allows or blocks the movement of the bolt and thus, electronically locks or unlocks the ELOCK.

In examples, once hooked, the luggage handle is secured by locking latch L1 through ELOCK. In one version, at the time of locking or securing, a user is identified as being associated with the luggage by providing applicable credentials identifying the user or a claim to the luggage. This may be provided by operation of a smart phone or other remote device in communication with the robotic post, or may be provided by a sensor such as SEN2 mounted to the post, which will scan a bar code, QR code, or other indicator on a user's mobile device or on a claim ticket presented by the user for such scanning. The memory onboard the robotic post receives the code as an identification of the authorized claimant.

Alternatively, or in addition, the luggage and/or its owner, supervisor and/or operator agent is identified via an attached optical (e.g. bar, QR etc.) code and/or radio frequency tag.

A post may be associated with an operator/supervisor agent which may be or not the same as the luggage's/asset's operator/supervisor agent. In case that the operator/supervisor agents are different, access control rules based on the operator/supervisor agents, their supervised luggage/assets and/or associate groups may be applied during luggage/asset manipulation (at particular endpoints). In an example, operator/supervisor agent A has rights to manipulate (at an endpoint and/or in particular circumstances) luggage/assets (semantic identities) assigned to operator/supervisor agent B (and/or associated groups) but not C.

Once at the destination, a corresponding (or the same) authorized credential is presented (e.g. an NFC, RF, optical authorization/code) and is read by the sensor such as SEN2 or otherwise in the manner as described above (such as by remote transmission over a mobile device), and the processor may send a command to unlock ELOCK or otherwise release the latch L1 and thus, allowing the handle HNDL to be unsecured and removed from the hook. In the example, the latch L1 may retract (e.g. in order to unblock, clear a block/stop groove and/or allow swiveling) and/or swivel in the directions O1 or O2 which may be mapped to semantics such as IN, OUT, RELEASED, UNLOCK etc.; further, the movement, orientations and/or semantics may be determined based on a sensor/sensing/actuation at ELOCK.

In FIG. 41B, the depicted post SP1 is an armed post (as in FIG. 38C) which uses its arm to grip the handle HNDL in order to pull and/or manipulate luggage LGG1. In addition, SP1 may comprise swivel SW1 which allows the post to optimize the center of gravity, base of support and/or posture while manipulating the luggage. While the presented examples depict posts maneuvering to hook and/or grip on the handle HNDL of luggage LGG1 it is to be understood that alternatively, or in addition, the handle HNDL can be positioned and/or secured on hook H1 or gripper 3*c* by a user and/or another post. Alternatively, or in addition, the latch L1 may be blocked by a piezo groove (not depicted, potentially positioned instead and/or where the static groove and/or terminator GV in FIG. 43 is) which, when commanded, locks/unlocks latch L1.

Gripper 3*c* may securely hold and/or encompass the handle HNDL and/or further release it and thus, applying access control to the luggage LGG1.

In other embodiments such as in FIG. 41C-F, a post may comprise at least one (holding) hook and/or arm which connects, holds and/or secures a (carried) (item) container and/or (item) carrier (e.g. luggage, (smart) bag, (shopping) basket and/or any other container) (having at least one hook/handle); further, the container and/or carrier may (comprise and/or have (interior/exterior/divider) manufactured/attached hooks (or T/L shaped bars and/or associated profiles etc.) to) accommodate and/or hold other containers and/or carriers in a hierarchical manner (e.g. IH1 stores/holds a (Jane's) purse/bag and/or (the purse/bag stores) (further) (John's) bag/wallet etc.); some embodiments are depicted in FIG. 41G-H.

For all the purposes in the application, a bag/basket; carrier/container (e.g. such as depicted in FIG. 41G-H) may comprise and/or implement, at least partially, the components and/or functionality of a smart basket/bag/container (e.g. such as depicted in FIG. 55A-D). Further, a bag/basket/container may be substituted with/for a smart bag/basket/container (and vice-versa).

For all the purposes in the application, a smart basket/bag/container may be substituted by/for a robotic device.

A smart container may (communicatively and/or physically) couple with a carrier/post as is (detected) positioned on a carrier. Such couplings may entail any coupling techniques such as described in this application.

In further examples, when a smart container is on a carrier/post the sensors and/or processing of (sensing) data may be supervised/distributed by/between the smart container (processor) and/or carrier/post (processor) as per (endpoint) rules, laws, goals, budgets, fluxes and/or (further) grouping and/or (flux) coupling/bargaining.

As mentioned throughout the application the system may project, infer and/or factorize the likeability/resonance of a (composed) semantic (identity); based on such likeability the system may apply access control and/or allow/disallow coupling, holding, possession, carrying, diffusion, in/out the containers and/or (further) manipulations and/or movements (at endpoints).

Handover of containers may be based on handover of (their) carriers and/or vice versa. Alternatively, or in addition, the handover may take place as per (endpoint) rules, laws, goals and/or budgets.

A post may comprise at least one (additional) manipulation arm (e.g. such ARM1) which manipulates the item containers and/or further (contained/carried/possessed) articles/items IN/OUT of the item containers; alternatively, or in addition, the arm may hold, secure and/or lock a handle of the item container (e.g. such as ARM1 holds/secures a second handle of a two handle bag wherein the first handle is hold/secured by H1/ELOCK1/ARM2). It is to be observed that the manipulation arm (e.g. ARM1) (base) (joints) is/are positioned above the (holding) hooks (e.g. H1, ELOCK1) and/or arms (e.g. ARM2) (modules) thus, allowing the manipulation IN/OUT to/of the (bag/basket/luggage) container. While not depicted, it is to be understood that the posts may comprise (additional) swivels and/or joints.

Hooks and/or latches may be attached (to/by) and/or positioned by arms (e.g. such as ELOCK1 being attached to ARM2 in FIG. 41E) and/or (hooking/locking/latching) terminators (e.g. such as HT1).

In some examples, when the terminator is extensible (e.g. when attached to a band/rope etc.), the (band) terminator is supported to the post and/or (associated) spinner module via a terminator support (e.g. such as TS1 in FIG. 41D). The terminators and/or their support may slide (up/down/left/right/around) the post's trunk and/or a module attached to the trunk.

In some examples, the terminator and/or its support is actuated, slide-able (e.g. within/on a groove, toothed rails, spinner etc.) and/or lockable (e.g. to block it to a particular position/endpoint via a plunger, pin, toothed wheel, spinner, claw etc.). Alternatively, or in addition, as explained throughout the application the terminator is attached to an extensible/retractable band/rope.

A hook, terminator and/or its support may be coupled to (or attached to or comprise) at least one pressure and/or weight sensor. Thus, in some examples, the system is able to measure the pressure/weight of the attached/secured items. When referring to pressure/weight sensing associated with a hook, terminator and/or support it is to be understood that it/they may encompass and/or refer to such pressure and/or weight sensors.

In some examples, the pressure/weight sensor is comprised and/or attached to a band and/or spinner. Alternatively, or in addition, is attached to the support and/or post (module). Alternatively, or in addition, is embedded into a terminator.

When referring to weight/pressure sensing associated with a hook, terminator and/or support it is to be understood that it/they may encompass and/or refer to such (exemplified) (coupled) pressure and/or weight sensors.

When referring to a terminator it is to be understood that it may encompass its support (components and/or functionality) and/or its extensibility/retractability (components and/or functionality). Further, when referring to a (securable) hook it is to be understood that it may also comprise the attached terminator.

A terminator (support) may be slide-able and/or lockable via (embedded) actuators, latches (e.g. comprising electromagnets, plungers, claws, toothed wheels/rails, combinations etc.) and/or manually by a user. In some examples, the support slides and is locked into a position before starting an activity and/or to complete an activity.

Posts may comprise support holders (e.g. such as SH1-SH3 and/or P1-P3) (modules). Further, as explained throughout the application they may comprise a variety of sensors whether coupled/attached/embedded to/into a module/trunk and/or embedded into arms, terminators, latched, hooks and/or (other) connecting elements.

Support holders (e.g. such as SH1-SH3, P1-P3) may be part of post attachable modules and/or components. In some examples, they may attach through latches and/or connect to a post via an attached module. The role and/or functionality of such holders is to support, secure and/or to latch the item containers (e.g. such as IH1, IH2). The support holders may rotate and/or slide (up/down/left/right/around) a post's trunk and/or with/within a post's module.

Support holders (modules) may be attached to a post's trunk via (actuated) terminators (e.g. such as HT1 and/or TS1). Alternatively, or in addition, they may attach on a post's column and/or inter-lock with other modules. When referring to a support holder it is to be understood that it may include a coupled/attached terminator.

A support holder may be extensible, telescopic and/or comprise extensible/telescopic parts and/or components. Further, they may comprise sensors to detect proximity, contact and/or pressure with/by/of items (e.g. such IH1, IH2). In an example (such as FIG. 41C), once an item (e.g. such as IH1) is secured into a hook (e.g. such as ELOCK1), the support holders (e.g. such as SH1-SH3, P1-P3) may expand/retract/rotate and/or adjust their position (up/down/left/right) and provide (likeable) support to the item. Alternatively, or in addition, a post may adjust hooks' positions to ensure (likeable) support, pressure and/or positioning of the item; it is to be observed that the hooks position may be adjusted in a variety of ways including adjusting the position of an arm (e.g. such as ARM2 in FIG. 41E), adjusting the position of a base of an arm (e.g. such as BA/BCA) and/or adjusting the position of a terminator (e.g. such as HT1/TS1). Alternatively, or an addition, an arm may grasp and adjust the position of a terminator. It is to be observed that an arm may rotate around a post's trunk in a variety of ways including being rotated by and with its base (such as BA/BCA), rotating within the base (e.g. by an actuator and/or motor such as ROJT); alternatively, or in addition, the arms may have variety of degrees of freedom and they may rotate and/or move in any other orientations based on (other) existing linkages, joints and/or actuators.

A post's arm (including its base (e.g. such as BA/BCA)), hooks, hook terminators (e.g. such as HT1/TS1) and/or support holders may comprise a pressure/weight sensor which enables the weight measurement of the hold and/or manipulated item container and/or carried items going IN/OUT the item container).

In further examples, the support holders may comprise various profiles and/or shapes to provide support for the item container; such profiles and/or shapes may further comprise (adjustable) (actuated) holding components. In some examples, they comprise side delimiters and/or holder profiles to encompass and/or further secure the item container (e.g. such as CLW1-CLW3 in FIG. 41F). The delimiters may be adjusted to further enclose/secure the item container from moving sideways and/or outwards the post. Sensors comprised/coupled into/to delimiters may detect proximity and/or contact with the item container and/or for semantic inference. It is to be understood that in some examples, the delimiters are positioned for denying the movement of the containers in undesirable directions/orientations and they in themselves do not securely hold and/or grip the container and/or apply excessive pressure on the container (to avoid contained items and/or container damage). Further, the pressure and/or grip may be adjusted based on the contained items, container, endpoint and/or (further) (associated) (composed) semantic identities and/or (associated) goals. In further examples, where a/an (authenticated) user/supervisor/operator may want to access the contents of the container (e.g. such as need to unzip, open and/or release a luggage cover), the grips/claws may be released as per indications and/or access control).

A camera (e.g. such as dome camera DCAM in FIG. 41C) may be installed above the holders, containers and/or arms. Alternatively, or in addition, the camera rotates with an arm (e.g. such as ARM1 rotating with the BCA in FIG. 41C). Alternatively, or in addition, a camera is embedded and/or attached to an arm (e.g. such as ACAM attached to ARM1 in FIG. 41E).

The posts may comprise and/or be connected to augmentation capabilities (e.g. display, microphones, mobile devices, ear buds etc.). In some examples, they are connected to (additional) (mobile/user/supervisor/operator) devices based on techniques explained throughout the application. The smart baskets/bags may receive and/or infer indications based on sensing, flux and/or (further) (user/supervisor/operator) (mobile/post) devices.

Further, a post may be connected to fluxes and/or databases which provide further data for augmentation. In examples, a post is used to carry a (tagged) luggage. As such, the post weighs the luggage and based on a received (ticketing) (airline) data, determines whether it complies with the weight requirements and/or whether/where is allowed/disallowed. Further, a post may comprise and/or connect to payment capabilities in order to allow a user to pay any additional (weight/ticketing) fees.

In some examples, ticketing/profile data is provided (by the user) via a ticket bar code scan, RFID/NFC, wireless (rf/infrared/optical) interfaces/transceivers, mobile devices and/or other techniques explained in the application. Alternatively, or in addition, the ticketing/profile data is determined based on a baggage tag/device carried/attached-to the luggage. Alternatively, or in addition, a post may comprise printing capabilities for printing a luggage tag and/or further attach it to the luggage (e.g. via an arm).

While in some examples, the ticketing may refer to a travel/airline ticket it is to be understood that the ticketing may be interpreted and/or coupled with any other ticket use cases presented throughput the application; as previously explained, in some examples, a ticket may be associated with orders, events etc.

Posts may be used to carry/transfer goods/luggage/belongings within/between agents, facilities, airlines, airports and/or logistic hubs. In some examples, "a post carrying Doe's luggage" (or S2P2) boards to an agent asset (e.g. airplane, facility operator truck etc.) at a first (facility/hub) endpoint and unloads to a second (facility/hub) endpoint. Further, the post may transfer to various endpoints—e.g, meeting/indicated with/by Does, with/by the temporary supervisor (such as a facility/hub/airline endpoint/flux (asset/person/supervisor/operator) etc.); (further) loading/unloading/storage end points. Alternatively, or in addition, the post (S2P2) unloads the luggage to an endpoint and/or (handovers it) to an agent (asset) and/or temporary supervisor; further, while at a destination endpoint the agent (asset) handovers the luggage to the/another post (S2P2/S3P4) which further, carries the luggage as per goals. In some examples, the handover is based on semantics and/or further data recorded about the supervisor/owner/post (identification) into a memory, storage and/or database and/or further ticket data. Further, such data may be stored by a device attached/carried/coupled to/by the luggage wireless tag and/or mobile device, (user/supervisor) mobile device attached to an attached wireless tag etc.) and/or by an operator/carrier/supervisor/owner device and/or (further) database.

A (composite) post and/or robotic device may comprise multiple trunks. As depicted in FIG. 41I, the depicted (composite) post comprises two trunks; while the depicted post is composite (e.g. formed from adjoining two posts) it is to be understood that unless a post is described as composite it may also be possible for a single post and/or robotic device to comprise multiple trunks.

The composite post in FIG. 41F is joined through latching via latch L1 of the support holders P1 and P3; the latch L1 may be comprised by P1, P3 and/or be distributed between P1 and P3. Alternatively, or in addition, (other) support holders and/or modules may be adjoined and/latched based on techniques such as explained throughout the application. It is to be observed that the item container IH3 is supported (although joined) by hooks, locks and/or support holders from two different posts; as such, in some embodiments, the weight of IH3 and/or the items going IN/OUT IH3 and/or further comprised/stored containers is calculated based on values from multiple pressure/weight sensors (e.g. such as embedded in ARM2, H1, P1 and/or P3) comprised by different joined posts. In some examples, the weight is calculated by adding the weight values measured based on sensors at ARM2/H1, H1 and P1/P3; further, because P1 and P3 are securely joined, IH3 may exercise similar pressure on both and thus, their sensors may measure the same condition and or weight. As explained throughout the application, such values may be further based on further (flux) factorizations (e.g. of risk, hazard, likeability etc.).

In some examples, support holders (such as P1-P3) are foldable. As such, they comprise a joint attachment (to the trunk and/or module) which allows a support holder to fold/retract/swivel (e.g. along and/or parallel to the trunk) and/or unfold/deploy/swivel (e.g. to the depicted position). Further in examples, when folded/retracted, support holders such as P1-P2 may resemble support holders such as SH 1-SH2 and vice-versa (when deployed SH1-SE12 may resemble P1-P2); it is to be understood that the support holders may comprise and/or attach via a (swiveling) joint (such as SW1/SW2 in FIG. not depicted) which enable them to swivel to fold/unfold.

It is to be observed that the system determines which items go IN/OUT based on sensing. The sensing may be associated with onboard/off-board/infrastructure sensors and/or devices. Further, the system detects conditions based on semantic fusion. In some examples, based on the weight, pressure and/or piezoelectric sensors the system detects which/that items and/or quantities are added/extracted to/from and/or IN/OUT the smart bag/basket/container.

As mentioned, a container and/or carrier may (comprise and/or have (interior/exterior/on divider) manufactured/attached hooks and/or locks and/or T/L shaped bars and/or similar (composite) profiles to accommodate and/or hold other item containers and/or carriers in a hierarchical manner (e.g. in FIG. 47G IH3 stores/holds/contains a store bag such as depicted in FIG. 47H; the bag is hold by hooks IH3H1 and IH3H2 attached/comprised to/by IH3). It is to be understood, that in some examples, IH1/IH2/IH3 may be substituted with bags similar and/or such as depicted in FIG. 47H; while FIG. 47H depicts a (store) bag/purse it is to be understood that in other embodiments other types of (smart) bags and/or containers may be used. In some examples, a (storage/container) box may be used; further, the (storage/container) box may not be attached to any hooks but instead being supported from underneath by support holders.

For all the purposes in the application, a bag/basket/carrier/container (e.g. such as depicted in FIG. 41H) may comprise and/or implement, at least partially, the components and/or functionality of a smart basket/bag/container (e.g. such as depicted in FIG. 55A-D). Further, a bag/basket/container may be substituted with/for a smart bag/basket/container and/or vice-versa.

A container may comprise and/or be substituted with/for a (smart) bag, basket, bin, carrier or similar and vice-versa (a (smart) bag, basket, bin, carrier or similar may comprise and/or be substituted with/for a container).

The posts may comprise (trunk) joints for balancing the base of support. Further, they may encompass tongue and groove attachments/components/profiles for (physical) connection between posts and/or support holders; once connected, the tongue and groove may be locked/latched (e.g. via plungers, electromagnets etc.).

As explained, the terminators may be slide-able attached to a post's trunk. In some examples, hooks/locks may be extended as required to connect/disconnect. In further examples, a hook is extended and attached to a cart/luggage/bag (handle, hook etc.); once attached, the terminator (e.g. attached to a band/spinner) may retract and pull the cart/luggage towards the post on a support holder (e.g. such as P3); alternatively, or in addition, the support holder (P3) is lowered to allow the loading of the cart/luggage and raised once the loading is complete/likeable and/or before the post starts moving; alternatively, or in addition, the terminator is adjusted (e.g. by retracting/raising a connecting band and/or its support) to maintain the cart/luggage fastened to the post. At unload similar opposite activities may be performed such as the terminator's connecting band is released and/or the support lowered to allow unloading from the platform (P3).

In further examples, once the item container/luggage is hooked/loaded, the support holders (and/or coupled terminators) such as SH1-SH3 are adjusted (e.g. slide up/down and/or extend/retract) to support the cart/luggage as per goals and/or into a particular (likeable) position and/or orientation (e.g. vertical, slanted 15 degrees, to avoid the spill of a carried item, to avoid a risk/hazard to a carried item, to avoid the risk/hazard to a by-passer etc.). As such, they slide up/down and/or are extended/retracted until the pressure reaches a particular threshold and/or further semantics are inferred.

In further examples, the likeable position and/or orientation (adjustment) is based on the likeability factorization associated with the carried items by the item container/luggage. Alternatively, or in addition, they may be based on an indication from a user/owner/supervisor. Alternatively, or in addition, they may be based on likeability factorizations associated with by-passers, supervisors, endpoints and/or further inferences etc.

The support holders and/or holders/terminators/hooks may slide up or down by being actuated (under the control of a processor) and/or manually adjustable. In some examples, a post detects that a person is pulling a (two/four) wheeled shopping cart and further that it positions the shopping cart towards the post. As such, the post may adjust the support holders to accommodate the loading and/or hooking of the shopping cart; in some examples, the post lowers/elevates support holders (e.g. such as P3 and/or HT1/H1 in FIG. 41E, such as P1/P2 and/or TS1 in FIG. 41D) by actuation in order to (allow) loading of the cart and/or further hooking of its handle. Alternatively, or in addition, the support holders are enabled to (e.g. by being unlocked, unblocked and/or freely to move) being adjusted manually by a user. Further, once (likeably) supporting the cart, the support holders, terminators and/or hooks may be further adjusted as per goals and/or activities (e.g. they are elevated/lowered (e.g. to enable (optimized) movement/loading/unloading), blocked and/or locked to secure the cart). Once requested to unlock, a post may cause and/or allow the activities to be performed (in a similar opposite order) to release the cart. While HT1 and TS1 have been depicted as distinct components it is to be understood that in some embodiments (e.g. such as HT1 not extendable etc.) they may be fused. Thus, when referring to one of HT1 or TS 1 it may automatically imply the other.

In embodiments with item containers having multiple handles (e.g. such as (shopping) bags having a handle on each side, luggage with multiple handles etc.) a securable hook may secure only one handle at a time; alternatively, or in addition, each securable hook of the post may secure a different handle; alternatively, or in addition, a securable hook secures a subset of the handles or all handles.

In examples, a user instructs post SP1 to carry the luggage LGG1 to particular locations, destinations (e.g. storage, gate, exit, coffee store etc.) and/or meeting points (based on semantic times). This instruction may be provided via a user interface on the post, or by a remote interface such as a smart phone application in communication with the post (for example, over a server). As such, the handle HNDL is hooked to hook/gripper H1/3c and further, the post may adjust its position and/or center of gravity by adjusting the swivels SW1 and/or SW2.

In some examples, post SP1 secures luggage LGG1 by hook/gripper H1/3c and un-secures it only in particular circumstances and/or only in the presence of particular users and/or other posts (at particular endpoints). As such, unauthorized users and/or posts may not be allowed to unsecure the handle HNDL of the luggage.

A post may guard luggage by monitoring it through the on-board sensors and/or further collaborators and inform/augment a user/owner/supervisor about particular safety and/or hazardous circumstances based on user preferences and/or indications. Further, the post may take evasive, alarm and/or preserve safety goals if breaches (e.g. having high entropy etc.) of the safety (goals) are inferred.

In the presence of authorized users or other posts the handle HNDL may be unsecured by the post (SP1) from hook/gripper H1/3c. It is to be understood that a post (e.g. SP1) may recognize the authorized/unauthorized users through localization, endpoint presence, NFC, optically and/or using any other techniques presented in this application.

It is to be understood that the posts may be deployed indoor and/or outdoor based on their capabilities. In some examples, the posts are deployed indoor and/or outdoor to delimitate working zone areas; as such, the posts may comprise various augmentation capabilities suitable for vehicles, drivers, passengers and pedestrians such as optical components, lights, optical panels, tablets, wireless communications and/or any other components presented in this application. In further examples, the posts may be deployed at one endpoint and move to their designated and/or inferred positions and/or endpoints; further, the posts may continuously redeploy to desired endpoints and/or locations. Once the activity is finished the posts may move to collection and/or storage endpoints. In some examples, such deployable posts may comprise minimal components such as a moving base, trunk, sensing and/or signaling components; in other examples, they may comprise other components and/or modules such as presented in this application.

In similar ways with the presented embodiments for luggage, the posts may handle (shopping) carts, strollers and/or other objects possessing a handle and/or a handling component. In some embodiments the physical environment can be coupled with a virtual environment. Further, the handling component may be a component and/or interface allowing manipulation of various artifacts including physical, virtual and/or computerized.

In other examples, groups of posts may connect into a (composable) divider/gate configurations such as in FIG. 42. The posts S9P6-S9P8 form a gated exit/entry barrier comprising Gate1 and Gate2 which each comprise two panels (e.g. P1 and P2 divided/joined by Div1 or Div2); the panels are attached to the corresponding post's locks which may swivel in at least one direction around the post. It is to be understood that the locks (e.g. some/all of L1-L6) may comprise a (securable and/or lockable/block-able) hinge allowing (one part of) the lock to swivel and/or further block to deny swiveling as per access control commands; further, swiveling direction may be associated with open/close, in/out (e.g. from/to areas divided by the composable dividers/barriers) and/or other semantics; if the locks/panels are enabled to swivel in both directions around the post then the associated semantics of one direction may be in a high (entangled) entropy with the associated semantics of the other direction.

In some examples, the locks L1-L6 may resemble the spinners and/or holders depicted in FIG. 47A-I. As such, the axle profile A1 may be comprised, be fastened and/or be attached to the depicted pass-through lines/profiles/rods/shafts and further, to (profiles/rods/shafts in) the posts; in some examples, the axle profile A1 is coupled to the post 9 from FIG. 7. The exterior shell CE and/or D1-D2 may be attached, linked and/or hold the gates' panels.

Spinners/holders may be comprised by the posts (including intermediate posts such as IP1 and IP2). As such, a spinner/holder may function as lockable hinge swiveling around and/or with axle profile A1 which may be further directly or indirectly fastened and/or attached to the posts.

The posts move in position to implement access control between two regions divided by the composite gate and/or divider panels. Further, the positions of the posts may be determined based on an optimal (e.g. maximum, average etc.) distance allowable between divider panels P1 and P2 and/or a maximum/optimal allowable width for dividers/joins Div1 and/or Div2; alternatively, or in addition, the system may determine a total width for the composite gate. The maximum/optimal distance or length is determined based on particular sizes (e.g. lengths, widths, heights etc.) of the objects projected to pass and/or diffuse between the first region and the second region divided by the composite gate. In examples, a composite gate enforcing people access may be configured to allow a maximum of 4 inches width for Div1, Div2 and/or between P1 and P2 which deny, the passing and/or diffusion of people access through the composite gate dividers; in further examples, the system may determine the divider and/or gate width based on agents and/or (any) semantic identities projected to pass/not-pass and/or diffuse/not-diffuse through the divider/s.

In further embodiments, a post's panel (e.g. such as P1) (physically) connects, contacts (for support) and/or latches to a trunk and/or attached terminators/latches/supports of another post (e.g. S9P1—not depicted).

The gated regions and/or related endpoints may be associated with fluxes, supervisors and/or further specified interests.

In examples, a user and/or supervisor indicates an interest at a comprised endpoint and the (semantic) (post) gating may control the access and/or diffusion of a servicing and/or flow agent to the endpoint.

In further examples, a user and/or supervisor may have and/or be allowed access to a (system's) user interface, display, application and/or device to specify its interests at endpoints; further, those interests may be available and/or allowed (at endpoints) based on supervisory interests and/or rules (e.g. law of the land; allowable activities, semantics, semantic times etc.). A user and/or supervisor may use and/or be identified based on various sensing comprising optical, sound, voice, radiofrequency and/or any other techniques some of which are presented throughout the application.

Figure 44A:
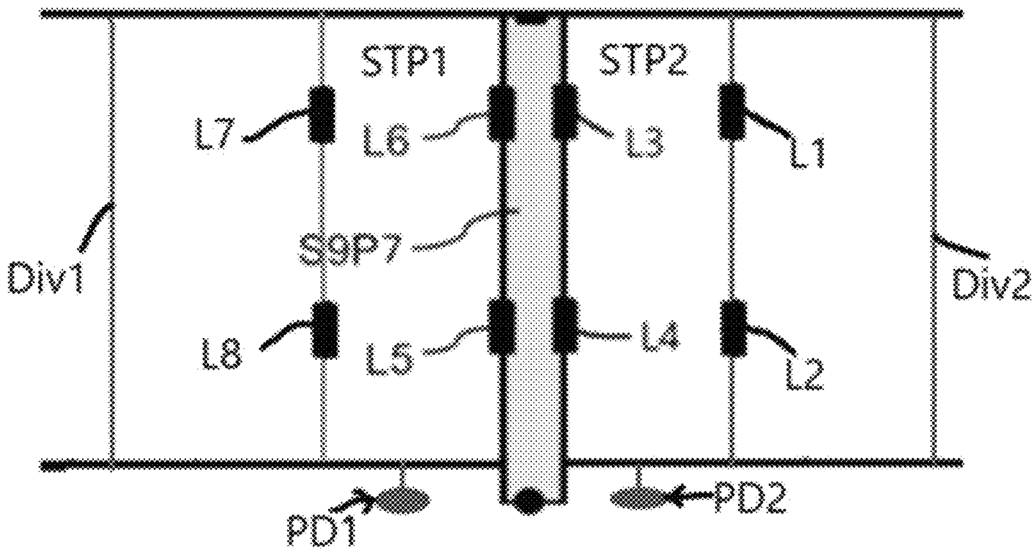
FIG. 44A is a preferred representation of a robotic gate and panel implementation.

In some embodiments, the divider panels comprise and/or are attached to stabilization panels (e.g. STP1, STP2) such as depicted in FIG. 44A. The stabilization panels ensure additional support (e.g. on the ground, wall, structure etc.) for the panels and/or attaching post. In some examples, the stabilization panels comprise pods (e.g. PD1, PD2) which may be positioned and/or supported on the ground. Further, the stabilization panels may be attached to the trunk and/or divider panels via locks, latches and/or other comprising holders (e.g. L1-L8).

Figure 44B:
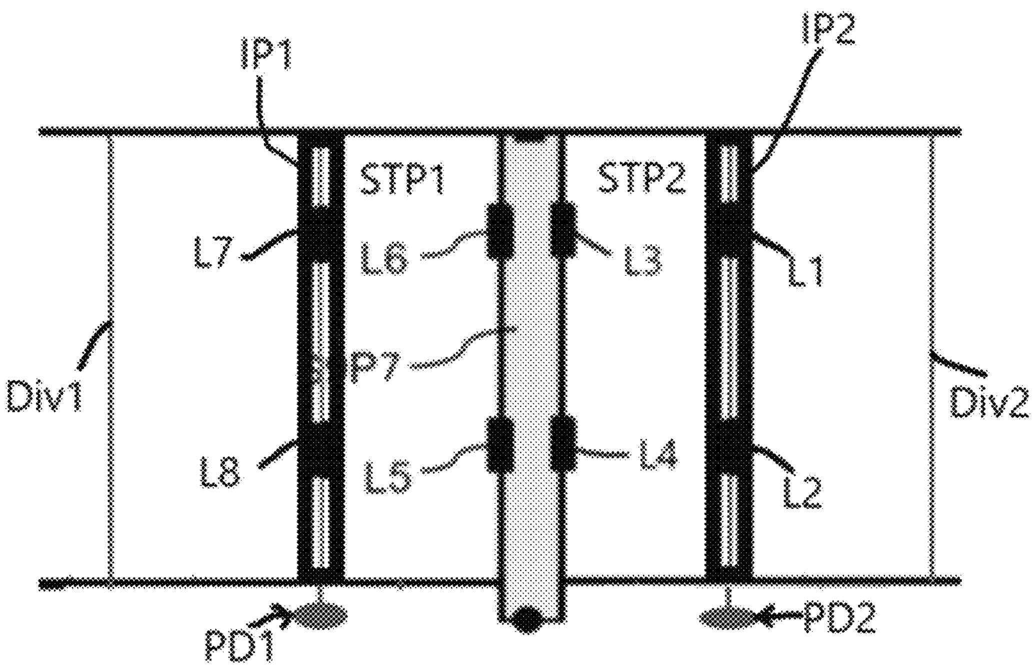
FIG. 44B is an alternate preferred representation of a robotic gate and panel implementation.

In further embodiments such as in FIG. 44B, the divider panels and the stabilization panels are hold and/or connected by intermediate components and/or posts such as IP1 and IP2. Such intermediate components/posts may comprise actuators, locks, latches, electric motors and/or further components allowing the panels to deploy, swivel and/or open/close. Further, they may comprise stabilization pods (e.g. PD1, PD2).

A post may lower, raise, fold and/or extend its panels (e.g. at latches L1-L8 and/or intermediate posts IP1-IP2). In some examples, the panels may be folded while in storage, in transport, moving and/or at semantic times. The panels may be extended to implement the gating capability. The panels may be lowered or raised to activate or deactivate the additional support capability (e.g. through the pods, hooks and/or latches attached to the stabilization panels, mobility base).

While in some examples, Div1 and/or Div2 are purely gaps or joins, in other examples they may be materialized through latches, hooks and/or other components attached, latched, hooked and/or secured to divider panels P1 and/or P2. As such, a divider panel (e.g. P1) may comprise components and/or capabilities of a latch/hook/lock while the other panel (e.g. P2) may comprise additional/complementary components and/or capabilities of a latch/hook/lock. Thus, by joining the divider panels the system realizes a complete, functional and/or ready latch/hook/lock composable capability at/of the Div1 or Div2.

The gate dividers may be positioned on/around and/or associated with physical dividers. In some examples, the system may want to physically enforce/control traffic stop lines at an intersection, ingress, egress, working areas, parking, waiting lines etc. In further examples, the enforcement is associated with a divider which may be circumstantial (e.g. the dividing capability is determined/enforced/activated/deactivated/enabled/disabled based on semantic times) and further is associated with affirmative/non-affirmative access/actions/activities—e.g. a lane at a traffic intersection has a stop line or the crossing lane boundary as a circumstantial divider; as the traffic may be controlled (e.g. by a traffic light, person) the dividing capability is circumstantial wherein is affirmative to pass/breach in some circumstances (e.g. green signal, emergency) or non-affirmative (e.g. high entropic signals such as red signal, hazards etc.). Similarly, the system may determine circumstantial dividers for various spaces and/or regions including work areas, parking, hazardous zones, clean zones etc.

Circumstantial dividers determine circumstantial semantics (attributes) (of objects) at areas, zones and/or endpoints (e.g. affirmative/non-affirmative actions/activities/breaches/presence, high entropic with the purpose of the circumstantial divider and/or divided). Circumstantial presence semantics may be based on high entanglement entropy (e.g. allowed/not-allowed, welcomed/not-welcomed, likeable/not-likeable, likely/not-likely, intruder/non-intruder etc.).

In some examples, a securable hinge comprises a component such as an ELOCK (from FIG. 43).

The posts within the (composable) divider/gate may implement access control and/or gating through Gate1 and Gate2.

In order to form the (composable) divider/gate, the posts may move into position, brake, lock (e.g. the wheels, locks, arms, hooks etc.) and/or hook/grip to support elements (e.g. post S9P8 uses ARM1 to grip/fasten (bands) to fastener (FAST) of a wall (WALL)).

In other examples, ARM1 holds, grips and/or affixes to the wall a fastener, sticker, hook and/or support component which (when coupled to the wall) allows the post and/or further (composable) gate to be supported on/by the wall.

In some examples, the gate panels may be, but not limited to, polycarbonate sheets, glass and/or plastics; in other examples, they may comprise any other materials. While in the examples in FIG. 42 the composable gate comprises two gates (e.g. Gate1 and Gate 2) it is to be understood that in other examples either gate can be missing and instead a continuous panel be present (e.g. Div1 or Div2 missing).

Panels (at the trunk and/or divider) may be secured and/or attached through securable latches, hinges, locks and/or hooks (e.g. such ELOCK hook in FIG. 43).

The panels may be locked/unlocked at the dividers (e.g. Div1/Div2) wherein at least one of the two divided panels comprises a latch/lock/hook/ELOCK (not depicted in FIG. 42).

Alternatively, or in addition, the panels may be locked/unlocked at the latches, hinges, locks and/or hooks attached at the trunk.

While single posts have been presented in FIG. 42, it is to be understood that in other embodiments the posts may be composable (e.g. post S9P7 may comprise one or more posts).

It is to be understood that the term "system" used in this disclosure may take various embodiments based on the contexts as disclosed. In some examples, "system" may represent, but not limited to, a post, a semantic cloud, broker, agent, a composable system, a semantic engine, a semantic networked system, a semantic memory, a semantic unit, chip, modulator, controller, mesh, sensor, I/O device, display, actuator, electronic block, component, semantic computer, mobile device, robotic device, sound device, ultrasound device, optical device, generator, appliance, point of sale, wearable, robotic enclosure, robotic support and any combination thereof.

Further, any functionality implemented in hardware may be implemented in software and vice-versa. Also, functionalities implemented in hardware may be implemented by a variety of hardware components, devices, computers, networks, clouds and configurations.

For the purpose of (analog/digital) (sensor/flux/stream) (I/O) (network/bus/interface/memory) (data) processing and/or inference, when mentioning a processor, microprocessor, microcontroller it is to be understood that it may comprise and/or be substituted for a plurality of such processing components and/or processing cores whether physical and/or virtualized. Similarly, when mentioning a memory it is to be understood that it may comprise and/or be substituted for a plurality of memory and/or storage components whether volatile and/or non-volatile and/or physical and/or virtualized.

A computer system may encompass at least one processor/microprocessor/microcontroller and/or at least one memory; alternatively, or in addition, it may encompass at least one semantic unit. Further, a computer system may encompass multiple computer systems.

The application describes multiple embodiments of robotic devices. It is to be understood that any component and/or functionality from one embodiment may be applied to any other embodiments.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

I claim:

1. A robotic post system, comprising:

a first composable post having a first post structure, a first processor and a first memory accessible by the first processor, the first composable post incorporating at least a first set of one or more pairable latches;

a second composable post having a second post structure, a second processor and a second memory accessible by the second processor, the second composable post incorporating at least a second set of one or more pairable latches;

a third composable post having a third post structure, a third processor and a third memory accessible by the third processor, the third composable post incorporating at least a third set of one or more pairable latches;

wherein a first pairable latch from among the first set of one or more pairable latches is configured to couple and lock with a second pairable latch from among the second set of one or more pairable latches at a first time, and further a third pairable latch from among the third set of one or more pairable latches is configured to couple and lock with a fourth pairable latch from among the second set of one or more pairable latches at a second time;

whereby the first composable post, the second composable post and the third composable post are configured to form a composed surface supported, at least partially, by the first post, the second post and the third post.

2. The robotic post system of claim 1, wherein the second composable post further comprises a rotating module supported by the second composable post, the second pairable latch being connected to the rotating module, the rotating module being configured to rotate about an axis to secure the second pairable latch with the first pairable latch.

3. The robotic post system of claim 2, wherein second composable post further comprises at least one second post sensor in communication with the second processor, the second processor further being configured to determine a location of the first pairable latch and to cause the rotating module to rotate to secure the second pairable latch with the first pairable latch.

4. The robotic post system of claim 1, wherein second composable post further comprises a second post movable base and at least one second post sensor in communication with the second processor, the second processor further being configured to determine a location of the first pairable latch and to cause the second post movable base to move to secure the second pairable latch with the first pairable latch.

5. The robotic post system of claim 4, wherein the second composable post is rotatable on the second post movable base to secure the second pairable latch with the first pairable latch.

6. The robotic post system of claim 1, wherein first composable post further comprises a first post movable base and at least one first post sensor in communication with the first processor, the first processor further being configured to determine a location of the second pairable latch and to cause the first post movable base to move to position the first pairable latch to secure with the second pairable latch.

7. The robotic post system of claim 1, wherein the composed surface is a composed display surface.

8. The robotic post system of claim 1, wherein the composed surface is a support surface.

9. The robotic post system of claim 8, wherein the composed surface is a table-top surface.

10. The robotic post system of claim 8, wherein the composed surface is a seat surface.

11. The robotic post system of claim 1, wherein the composed surface is a generative surface.

12. The robotic post system of claim 1, wherein the composed surface is a sensor surface.

13. The robotic post system of claim 1, wherein the composed surface is a communication antenna surface.

14. A robotic post system, comprising:

a first composable post having a first processor, a first memory accessible by the first processor, and at least a first set of one or more pairable latches;

a second composable post having a second processor, a second memory accessible by the second processor, and at least a second set of one or more pairable latches;

a third composable post having a third processor, a third memory accessible by the third processor, and at least a third set of one or more pairable latches;

wherein a first pairable latch from among the first set of one or more pairable latches is configured to, under control of the first processor, lock with a second pairable latch from among the second set of one or more pairable latches at a first time; and wherein a third pairable latch from among the third set of one or more pairable latches is configured to, under control of the third processor, lock with a fourth pairable latch from among the second set of one or more pairable latches at a second time;

whereby the first composable post, the second composable post and the third composable post combine to form a contiguous composed surface.

15. The robotic post system of claim 14, wherein the second composable post further comprises a rotating module supported by the second composable post, the second pairable latch being connected to the rotating module, the rotating module being configured, under control of the second processor, to rotate about an axis to secure the second pairable latch with the first pairable latch.

16. The robotic post system of claim 15, wherein second composable post further comprises at least one sensor in communication with the second processor, the second processor further being configured to determine a location of the first pairable latch based on an input from the sensor, and to cause the rotating module to rotate to secure the second pairable latch with the first pairable latch.

17. The robotic post system of claim 14, wherein second composable post further comprises a second post movable base and at least one second post sensor in communication with the second processor, the second processor further being configured to determine a location of the first pairable latch based on an input from the at least one second post sensor and to cause the second post movable base to move the second pairable latch toward the first pairable latch and to cause the second pairable latch to lock with the first pairable latch.

18. The robotic post system of claim 17, wherein the second composable post is rotatable on the second post movable base to secure the second pairable latch with the first pairable latch.

19. The robotic post system of claim 14, wherein first composable post further comprises a first post movable base and at least one first post sensor in communication with the first processor, the first processor further being configured to determine a location of the second pairable latch based on an input from the at least one first post sensor, and to cause the first post movable base to move to position the first pairable latch adjacent the second pairable latch, whereby the first pairable latch is securable to the second pairable latch.

20. The robotic post system of claim 14, wherein the composed surface is a composed display surface.

21. The robotic post system of claim 14, wherein the composed surface is a support surface.

22. The robotic post system of claim 14, wherein the composed surface is a table-top surface.

23. The robotic post system of claim 14, wherein the composed surface is a seat surface.

24. The robotic post system of claim 14, wherein the composed surface is a generative surface.

25. The robotic post system of claim 14, wherein the composed surface is a sensor surface.

26. The robotic post system of claim 14, wherein the composed surface is a communication antenna surface.

27. A robotic post system, comprising:

a first composable post having a first post structure, a first processor, a first memory accessible by the first processor, and a first composable surface carried on the first post structure, the first composable surface incorporating at least one of a first tongue or a first groove;

a second composable post having a second post structure, a second processor, a second memory accessible by the second processor, and a second composable surface carried on the second post structure, the second composable surface incorporating at least one of a second tongue or a second groove;

a third composable post having a third post structure, a third processor, a third memory accessible by the third processor, and a third composable surface carried on the third post structure, the third composable surface incorporating at least one of a third tongue or a third groove;

wherein at least one of either the first processor or the second processor is configured to couple the first composable surface and the second composable surface at a first time, and further wherein at least one of either the second processor or the third processor is configured to couple the third composable surface and the second composable surface at a second time;

whereby the first composable post, the second composable post and the third composable post are configured to form a composed surface comprising the first composable surface, the second composable surface and the third composable surface, wherein the composed surface is supported, at least partially, by the first post, the second post and the third post.

28. The robotic post system of claim 27, wherein the second composable post further comprises a rotating module supported by the second composable post, the second pairable latch being connected to the rotating module, the rotating module being configured to rotate about an axis to fasten the second composable surface with the first composable surface.

29. The robotic post system of claim 28, wherein second composable post further comprises at least one second post sensor in communication with the second processor, the second processor further being configured to determine a location of the first composable surface and to cause the rotating module to rotate to fasten the second composable surface with the first composable surface.

30. The robotic post system of claim 27, wherein second composable post further comprises a second post movable base and at least one second post sensor in communication with the second processor, the second processor further being configured to determine a location of the first composable surface and to cause the second composable post to move to fasten the second composable surface with the first composable surface.

31. The robotic post system of claim 30, wherein the second composable post is rotatable on the second post movable base to fasten the second composable surface with the first composable surface.

32. The robotic post system of claim 27, wherein first composable post further comprises a first post movable base and at least one first post sensor in communication with the first processor, the first processor further being configured to determine a location of the second composable surface and to cause the first post movable base to move to position the first composable surface to fasten with the second composable surface.

33. The robotic post system of claim 27, wherein the composed surface is a composed display surface.

34. The robotic post system of claim 27, wherein the composed surface is a support surface.

35. The robotic post system of claim 27, wherein the composed surface is a table-top surface.

36. The robotic post system of claim 27, wherein the composed surface is a seat surface.

37. The robotic post system of claim 27, wherein the composed surface is a generative surface.

38. The robotic post system of claim 27, wherein the composed surface is a sensor surface.

39. The robotic post system of claim 27, wherein the composed surface is a communication antenna surface.

40. The robotic post system of claim 39, wherein at least two of the first composable surface, the second composable surface and the third composable surface are further connected to one another.

* * * * *